US009432298B1

(12) United States Patent
Smith

(10) Patent No.: US 9,432,298 B1
(45) Date of Patent: Aug. 30, 2016

(54) SYSTEM, METHOD, AND COMPUTER PROGRAM PRODUCT FOR IMPROVING MEMORY SYSTEMS

(71) Applicant: P4TENTS1, LLC, Wilmington, DE (US)

(72) Inventor: Michael S Smith, Palo Alto, CA (US)

(73) Assignee: P4TENTS1, LLC, Wilmington, DE (US)

( * ) Notice: Subject to any disclaimer, the term of this patent is extended or adjusted under 35 U.S.C. 154(b) by 39 days.

(21) Appl. No.: 13/710,411

(22) Filed: Dec. 10, 2012

Related U.S. Application Data

(60) Provisional application No. 61/569,107, filed on Dec. 9, 2011, provisional application No. 61/580,300, filed on Dec. 26, 2011, provisional application No. 61/585,640, filed on Jan. 11, 2012, provisional application No. 61/602,034, filed on Feb. 22, 2012, provisional application No. 61/608,085, filed on Mar. 7, 2012, provisional application No. 61/635,834, filed on Apr. 19, 2012, provisional application No. 61/647,492, filed on May 15, 2012, provisional application No. 61/665,301, filed on Jun. 27, 2012, provisional application No. 61/673,192, filed on Jul. 18, 2012, provisional application No. 61/679,720, filed on Aug. 4, 2012, provisional application No. 61/698,690, filed on Sep. 9, 2012, provisional application No. 61/714,154, filed on Oct. 15, 2012.

(51) Int. Cl.
*H04L 12/801* (2013.01)
*H04L 12/861* (2013.01)

(52) U.S. Cl.
CPC ........... *H04L 47/34* (2013.01); *H04L 49/9057* (2013.01)

(58) Field of Classification Search
None
See application file for complete search history.

(56) References Cited

U.S. PATENT DOCUMENTS

| | | | |
|---|---|---|---|
| 5,283,877 | A | 2/1994 | Gastinel et al. |
| 5,299,313 | A | 3/1994 | Petersen et al. |
| 5,465,056 | A | 11/1995 | Hsieh et al. |
| 5,559,971 | A | 9/1996 | Hsieh et al. |
| 5,561,622 | A | 10/1996 | Bertin et al. |
| 5,625,780 | A | 4/1997 | Hsieh et al. |
| 5,710,550 | A | 1/1998 | Hsieh et al. |
| 5,877,987 | A | 3/1999 | Merritt |
| 5,940,596 | A | 8/1999 | Rajan et al. |
| 6,055,202 | A | 4/2000 | Merritt |

(Continued)

FOREIGN PATENT DOCUMENTS

| | | |
|---|---|---|
| EP | 1374073 | 3/2011 |
| EP | 2363858 | 9/2011 |

(Continued)

OTHER PUBLICATIONS

Resnick, Dave. "Memory for Exascale and HMC: Hybrid Memory Cube." Sandia Nat'l Labs. No. 2011-5219P. Jul. 8, 2011.*

(Continued)

*Primary Examiner* — Otis L Thompson, Jr.
(74) *Attorney, Agent, or Firm* — Patrick E. Caldwell, Esq.; The Caldwell Firm, LLC

(57) ABSTRACT

A system, method, and computer program product are provided for a memory system. The system includes a first semiconductor platform including at least one first circuit, and at least one additional semiconductor platform stacked with the first semiconductor platform and including at least one additional circuit.

19 Claims, 160 Drawing Sheets

(56) References Cited

U.S. PATENT DOCUMENTS 6,151,644 A 11/2000 Wu
6,163,834 A 12/2000 Garcia et al.
6,208,545 B1 3/2001 Leedy et al.
6,208,644 B1 3/2001 Pannell et al.
6,317,352 B1 11/2001 Halbert et al.
6,442,644 B1 8/2002 Gustavson et al.
6,507,581 B1 1/2003 Sgammato
6,563,224 B2 5/2003 Leedy
6,591,394 B2 7/2003 Lee et al.
6,639,309 B2 10/2003 Wallace
6,711,043 B2 3/2004 Friedman et al.
6,718,422 B1 4/2004 Kelley et al.
6,725,314 B1 4/2004 Dong et al.
6,797,538 B2 9/2004 Wallace
6,848,177 B2 2/2005 Swan et al.
6,950,898 B2 9/2005 Merritt et al.
6,970,968 B1 11/2005 Holman
6,977,930 B1 12/2005 Epps et al.
7,069,361 B2 6/2006 Owen et al.
7,093,066 B2 8/2006 Klein
7,136,958 B2 11/2006 Jeddeloh
7,193,239 B2 3/2007 Leedy
7,212,422 B2 5/2007 Koide
7,274,710 B2 9/2007 Cummings et al.
7,283,557 B2 10/2007 Cummings et al.
7,379,316 B2 5/2008 Rajan
7,402,897 B2 7/2008 Leedy
7,417,908 B2 8/2008 Ogawa et al.
7,429,781 B2 9/2008 Wallace
7,435,636 B1 10/2008 Hanafi
7,466,577 B2 12/2008 Sekiguchi et al.
7,474,004 B2 1/2009 Leedy
7,502,881 B1 3/2009 Davis
7,504,732 B2 3/2009 Leedy
7,558,096 B2 7/2009 Ikeda
7,558,130 B2 7/2009 Grunzke
7,598,607 B2 10/2009 Chung et al.
7,602,630 B2 10/2009 Janzen
7,612,436 B1 11/2009 Lee et al.
7,613,882 B1 11/2009 Akkawi et al.
7,622,365 B2 11/2009 Parekh
7,660,952 B2 2/2010 Allen et al.
7,698,498 B2 4/2010 Lakshmanamurthy et al.
7,730,254 B2 6/2010 Risse
7,764,564 B2 7/2010 Salto et al.
7,764,565 B2 7/2010 Faue
7,796,446 B2 9/2010 Ruckerbauer et al.
7,855,931 B2 12/2010 LaBerge et al.
7,872,892 B2 1/2011 MacWilliams et al.
7,894,230 B2 2/2011 Kim
7,965,530 B2 6/2011 Han et al.
7,969,810 B2 6/2011 Keeth et al.
7,978,721 B2 7/2011 Jeddeloh et al.
7,979,616 B2 7/2011 Bravo et al.
7,990,171 B2 8/2011 Chung et al.
8,010,866 B2 8/2011 LaBerge et al.
8,031,505 B2 10/2011 Kang et al.
8,093,702 B2 1/2012 Lua et al.
8,103,928 B2 1/2012 Hargan
8,106,491 B2 1/2012 Corisis et al.
8,106,520 B2 1/2012 Keeth et al.
8,111,534 B2 2/2012 Walker
8,115,291 B2 2/2012 Baek et al.
8,120,044 B2 2/2012 Cho et al.
8,127,185 B2 2/2012 Jeddeloh
8,127,204 B2 2/2012 Hargan
8,130,527 B2 3/2012 Keeth
8,134,378 B2 3/2012 Keeth
8,143,710 B2 3/2012 Cho
8,148,763 B2 4/2012 Kim et al.
8,148,807 B2 4/2012 Lee et al.
8,158,967 B2 4/2012 Tang et al.
8,169,841 B2 5/2012 Johnson et al.
8,173,507 B2 5/2012 Lim et al.
8,174,105 B2 5/2012 Kwang et al.
8,174,115 B2 5/2012 Chung
8,187,901 B2 5/2012 Sheen
8,193,646 B2 6/2012 Wood et al.
8,756,486 B2 6/2014 LaBerge et al.
2001/0048616 A1* 12/2001 Ayukawa et al. ............ 365/200
2002/0062402 A1 5/2002 Regnier et al.
2002/0095512 A1* 7/2002 Rana et al. .................. 709/232
2002/0129315 A1 9/2002 Onvural et al.
2004/0168101 A1 8/2004 Kubo
2004/0177208 A1 9/2004 Merritt et al.
2004/0237023 A1 11/2004 Takahashi et al.
2005/0050255 A1 3/2005 Jeddeloh
2005/0125590 A1 6/2005 Li et al.
2007/0098001 A1 5/2007 Thomas
2007/0130397 A1 6/2007 Tsu
2008/0082763 A1 4/2008 Rajan et al.
2008/0143379 A1 6/2008 Norman
2008/0272478 A1 11/2008 Anderson et al.
2008/0290435 A1 11/2008 Oliver et al.
2008/0298113 A1 12/2008 Liu et al.
2008/0308946 A1 12/2008 Pratt
2009/0014876 A1 1/2009 Youn et al.
2009/0026600 A1 1/2009 Koon et al.
2009/0039492 A1 2/2009 Kang et al.
2009/0045489 A1 2/2009 Koon et al.
2009/0052218 A1 2/2009 Kang
2009/0055621 A1 2/2009 Nakanishi et al.
2009/0065948 A1 3/2009 Wang
2009/0067256 A1 3/2009 Bhattacharyya et al.
2009/0085225 A1 4/2009 Park
2009/0085608 A1 4/2009 Alzheimer
2009/0090950 A1 4/2009 Forbes et al.
2009/0091962 A1 4/2009 Chung et al.
2009/0127668 A1 5/2009 Choi
2009/0128991 A1 5/2009 Mauritzon
2009/0166846 A1 7/2009 Pratt et al.
2009/0180257 A1 7/2009 Park et al.
2009/0197394 A1 8/2009 Parekh
2009/0206431 A1 8/2009 Bolken et al.
2009/0216939 A1 8/2009 Smith et al.
2009/0224822 A1 9/2009 Alzheimer et al.
2009/0237970 A1 9/2009 Chung
2009/0255705 A1 10/2009 Pratt
2009/0261457 A1 10/2009 Pratt
2009/0300314 A1 12/2009 Laberge et al.
2009/0300444 A1 12/2009 Jeddeloh
2009/0302484 A1 12/2009 Lee et al.
2009/0309142 A1 12/2009 Akram
2009/0319703 A1 12/2009 Chung
2009/0321861 A1 12/2009 Oliver et al.
2009/0321947 A1 12/2009 Pratt
2009/0323206 A1 12/2009 Oliver et al.
2010/0011146 A1 1/2010 Saghi
2010/0020585 A1 1/2010 Rajan
2010/0128548 A1 5/2010 Okahiro
2010/0272117 A1 10/2010 Wu et al.
2010/0314772 A1 12/2010 Lee
2011/0004729 A1 1/2011 Akkawi et al.
2011/0035529 A1 2/2011 Wang et al.
2011/0044085 A1 2/2011 Hinrichs
2011/0050320 A1 3/2011 Gillingham
2011/0060888 A1 3/2011 Keeth et al.
2011/0079923 A1 4/2011 Suh
2011/0096584 A1 4/2011 Nakaoka et al.
2011/0103121 A1 5/2011 Osakabe
2011/0138087 A1 6/2011 Chung
2011/0147946 A1 6/2011 Lee et al.
2011/0149493 A1 6/2011 Kwon et al.
2011/0156232 A1 6/2011 Youn et al.
2011/0176280 A1 7/2011 Lee
2011/0187007 A1 8/2011 Haba et al.
2011/0194326 A1 8/2011 Nakanishi et al.
2011/0201154 A1 8/2011 Shibata et al.
2011/0228582 A1 9/2011 Park et al.
2011/0233676 A1 9/2011 Or-Back et al.
2011/0241185 A1 10/2011 Koester et al.
2011/0242870 A1 10/2011 Oh et al.
2011/0246746 A1 10/2011 Keeth et al.
2011/0264858 A1 10/2011 Jeddeloh et al.

(56) References Cited

U.S. PATENT DOCUMENTS

| | | | | |
|---|---|---|---|---|
| 2011/0271158 | A1 | 11/2011 | Jeddeloh | |
| 2011/0272820 | A1 | 11/2011 | Lee et al. | |
| 2012/0018871 | A1 | 1/2012 | Lee et al. | |
| 2012/0037878 | A1 | 2/2012 | Liu | |
| 2012/0038045 | A1 | 2/2012 | Lee | |
| 2012/0060364 | A1 | 3/2012 | Hargan | |
| 2012/0063194 | A1 | 3/2012 | Baek et al. | |
| 2012/0069647 | A1 | 3/2012 | Kramer et al. | |
| 2012/0070973 | A1 | 3/2012 | Sandhu et al. | |
| 2012/0074584 | A1 | 3/2012 | Lee et al. | |
| 2012/0074586 | A1 | 3/2012 | Seo | |
| 2012/0077314 | A1 | 3/2012 | Park et al. | |
| 2012/0126883 | A1 | 5/2012 | Juengling | |
| 2012/0127685 | A1 | 5/2012 | Corisis et al. | |
| 2012/0135567 | A1 | 5/2012 | Akram et al. | |
| 2012/0135569 | A1 | 5/2012 | Corisis | |
| 2012/0138927 | A1 | 6/2012 | Kang | |
| 2012/0140583 | A1 | 6/2012 | Chung | |
| 2013/0010552 | A1 | 1/2013 | Jeddeloh | |
| 2013/0031364 | A1* | 1/2013 | Glew et al. | 713/162 |
| 2013/0159812 | A1* | 6/2013 | Loh et al. | 714/758 |
| 2014/0040698 | A1* | 2/2014 | Loh et al. | 714/758 |
| 2014/0043172 | A1* | 2/2014 | Manobianco et al. | 73/170.16 |
| 2014/0082234 | A1* | 3/2014 | Gopalakrishnan et al. | 710/52 |
| 2014/0085983 | A1* | 3/2014 | Hosono | 365/185.17 |
| 2014/0119091 | A1* | 5/2014 | You et al. | 365/72 |
| 2014/0176187 | A1* | 6/2014 | Jayasena et al. | 326/39 |
| 2014/0181458 | A1* | 6/2014 | Loh et al. | 711/206 |
| 2014/0201309 | A1* | 7/2014 | Dalai et al. | 709/213 |

FOREIGN PATENT DOCUMENTS

| | | |
|---|---|---|
| WO | 99/35579 | 7/1999 |
| WO | 2010002561 | 3/2010 |
| WO | 2011100444 | 8/2011 |
| WO | 2011126893 | 10/2011 |

OTHER PUBLICATIONS

Zhang, Wangyuan & Li, Tao. "Exploring Phase Change Memory and 3D Die-Stacking for Power/Thermal Friendly, Fast and Durable Memory Architectures." IEEE, 18th Int'l Conf. on Parallel Architectures & Compilation Techniques [PACT '09], Sep. 12-16, 2009.*

Micron, "1Gb_DDR3_SDRAM," Micron Technology, 2006, pp. 1-196.

Micron, "2, 4, 8Gb: x8/x16 Multiplexed NAND Flash Memory," Micron Technology, 2004, pp. 1-57.

Pawlowski, J. Thomas, "Memory Performance Tutorial Hot Chips 16," Micron Technology Inc., Aug. 2004, pp. 1-81.

Micron, "General DDR SDRAM Functionality," Micron Technology, 2001, pp. 1-11.

Micron, "QuadDie DDR3 SDRAM, 8Gb: x4, x8 1.5V QuadDie DDR3 SDRAM," Micron Technologies, 2011.

Gross, Joseph G., "High-Performance DRAM System Design Constraints and Considerations," Thesis, University of Maryland, 2010, pp. 1-175.

Keeth, Brent, "A Novel Architecture for Advanced High Density Dynamic Random Access Memories," Thesis, University of Idaho, May 1996, pp. 1-70.

Johnson, James B., "Application of an Asynchronous FIFO in a DRAM Data Path," Thesis, University of Idaho, Dec. 2002, pp. 1-103.

Cevrero, Alesandro et al., "Using 3D Integration Technology to Realize Multi-Context FPGAS," Field Programmable Logic and Applications, 2009. FPL 2009. International Conference on, Sep. 2009, pp. 1-4.

Hynix, "1Gb DDR3 SDRAM," Hynix Semiconductor, Rev. 1.1 Jul. 2010, pp. 1-32.

Keeth, Brent et al., "DRAM Circuit Design: A Tutorial," IEEE Press, pp. 1-167.

Elpida, "Introduction to GDDRS SGRAM, User's Manual" Elpida, Mar. 2010, pp. 1-24.

Gaydadjiev, Georgi, "Energy Reduction Techniques for Main Memory," Chalmers University of Technology, Mar. 26, 2012, pp. 1-13.

Cortina Systems et al., Interlaken Protocol Definition,: Cortina Sytems and Cisco Systems, Revision 1.2 Oct. 7, 2008, pp. 1-52.

Jedec, "DDR4 Mini Workshop," Server Memory Forum 2011, Global Standards for the Microelectronics Industry, 2011, pp. 1-14.

Davis, Brian T., "Modern DRAM Memory Systems," Advanced Computer Architecture Laboratory, University of Michigan, Apr. 24, 2000, pp. 1-38.

Qimonda, "Qimonda GDDR5—White Paper," Qimonda, Aug. 2007,.

"Problem 16.1," Docstoc.com., Feb. 8, 2010, pp. 1-25.

Rapidio, "RapidIO Interconnect Specification Annex 1: Software/System Bring Up Specification," RapidIO Trade Association, Rev 2.2, Jun. 2011, pp. 1-62.

Rapidio, "RapidIO Interconnect Specification Annex 2: Software/System Bring Up Specification," RapidIO Trade Association, Rev 2.2, Jun. 2011, pp. 1-72.

Rapidio, "RapidIO Interconnect Specification Part1: Input/Output Logical Specification," RapidIO Trade Association, Rev 2.2, Jun. 2011, pp. 1-62.

Rapidio, "RapidIO Interconnect Specification Part2: Message Passing Logical Specification," RapidIO Trade Association, Rev 2.2, Jun. 2011, pp. 1-50.

Rapidio, "RapidIO Interconnect Specification Part3: Common Transport Specification," RapidIO Trade Association, Rev 2.2, Jun. 2011, pp. 1-32.

Rapidio, "RapidIO Interconnect Specification Part4: Physical Layer 8/16 LP-LVDS Specification," RapidIO Trade Association, Rev 2.2, Jun. 2011, pp. 1-170.

Rapidio, "RapidIO Interconnect Specification Part5: Globally Shared Memory Logical Specification," RapidIO Trade Association, Rev 2.2, Jun. 2011, pp. 1-116.

Rapidio, "RapidIO Interconnect Specification Part6: LP-Serial Physical Layer Specification," RapidIO Trade Association, Rev 2.2, Jun. 2011, pp. 1-364.

Rapidio, "RapidIO Interconnect Specification Part7: System and Device Inter-operability Specification," RapidIO Trade Association, Rev 2.2, Jun. 2011, pp. 1-70.

Rapidio, "RapidIO Interconnect Specification Part8: Error Management Extensions Specification," RapidIO Trade Association, Rev 2.2, Jun. 2011, pp. 1-48.

Rapidio, "RapidIO Interconnect Specification Part9: Flow Control Logical Layer Extensions Specification," RapidIO Trade Association, Rev 2.2, Jun. 2011, pp. 1-38.

Rapidio, "RapidIO Interconnect Specification Part10: Data Streaming Logical Specification," RapidIO Trade Association, Rev 2.2, Jun. 2011, pp. 1-62.

Rapidio, "RapidIO Interconnect Specification Part11: Multicast Extensions Specification," RapidIO Trade Association, Rev 2.2, Jun. 2011, pp. 1-50.

Rapidio, "RapidIO Interconnect Specification Part12: Virtual Output Queueing Extensions Specification," RapidIO Trade Association, Rev 2.2, Jun. 2011, pp. 1-26.

USPTO, "Notice of Allowance and Fee(s) Due, U.S. Appl. No. 12/166,814," Dorsey & Whitney LLP-IP, Jun. 6, 2012, pp. 1-238.

USPTO, "Office Communication, U.S. Appl. No. 12/166,871," Dorsey & Whitney LLP-IP, May 16, 2012, pp. 1-291.

USPTO, "Issue Notification, U.S. Appl. No. 12/238,720," Volentine & Whitt PLLC, Nov. 9, 2010, pp. 1-248.

Altera, "AN 570: Implementing the 40G/100G Ethernet Protocol in Stratix IV Devices," Altera Corporation, Sep. 2011, pp. 1-18.

Altera, "Altera Transceiver Phy IP Core User Guide," Altera Corporation, Jun. 2012, pp. 1-312.

Altera, "AN 610: Implementing Deterministic Latency for CPRI and OBSAI Protocols in Altera Devices," Altera corporation, Jul. 2010, pp. 1-18.

Altera, "External Memory Interface Handbook vol. 1: Altera Memory Solution Overview and Design Flow," Altera Corporation, Jun. 2012, pp. 1-764.

(56) References Cited

OTHER PUBLICATIONS

Altera, "Altera Interlaken IP Throughput Measurement Reference Design for Stratix Devices," Altera Corporation, Feb. 2012, pp. 1-33.
Altera," AN 573: Implementing the Interlaken Protocol in Stratix IV Transceivers," Altera Corporation, Dec. 2009, pp. 1-14.
Altera, "Interlaken MegaCore Function Parameter Selection Worksheet," Altera Corporation, 2010, pp. 1-12.
Altera, "Implementing the CPRI Protocol using the Deterministic Latency Transceiver PHY IP Core," Altera Corporation, Jan. 2012, pp. 1-16.
Altera, "SerialLite 2 Protocol Reference Manual," Altera Corporation, Version 1.0, Oct. 2005, pp. 1-84.
Northwest Logic, "Mobile DDR SDRAM Controller Core," Northwest Logic Proprietary, 2006, pp. 1-1.
Altera, "PCI Express High Performance Reference Design," Altera Corporation, Aug. 2010, pp. 1-22.
Altera, "PCI Express to External Memory Reference Design," Altera Corporation, May 2011, pp. 1-30.
Altera, "Stratix V Hard IP for PCI Express User Guide," Altera Corporation, Jun. 2012, pp. 1-232.
Altera, "SerialLite Protocol Overview," Altera Corporation, Ver 1.1, Jul. 2004, pp. 1-15.
Altera, "Transceiver Architecture in Stratix IV Devices," Altera Corporation, Dec. 2011, pp. 1-228.
Altera, "Stratix 2 GX Architecture," Altera Corporation, Oct. 2007, pp. 1-148.
Altera, "Stratix IV Device Handbook vol. 3," Altera Corporation, Dec. 2011, pp. 1-126.
Davidson, Allan, "Stratix V User Guide Lite," Altera Corporation, 2011, pp. 1-18.
Altera, "Stratix V Device Handbook vol. 2: Transceivers," Altera Corporation, Jun. 2012, pp. 1-206.
Altera, " Transceiver Architecture in Stratix V Devices," Altera Corporation, vol. 2, Jun. 2012, pp. 1-46.
Altera, "Transceiver Configurations in Stratix V Devices," Altera Corporation, Jun. 2012, pp. 1-82.
Altera, "Transceiver Protocol Configuration in Arria V Devices," Altera Corporation, Jun. 2012, pp. 1-30.
Altera, "40- and 100-Gbps Ethernet MAC and PHY, MegaCore Function User Guide," Altera Corporation, 2012, pp. 1-114.
Altera, "Interlaken MegaCore Function User Guide," Altera Corporation, Jun. 2012, pp. 1-90.
Altera, "IP Compiler for PCI Express User Guide," Altera Corporation, May 2011, pp. 1-402.
Altera, "RapidIO MegaCore Function User Guide," Altera Corporation, Jun. 2012, pp. 1-226.
Altera, "SerialLite 2 MegaCore Function User Guide," Altera Corporation, Feb. 2011, pp. 1-110.
Altera, "Using 10-Gbps Transceivers in 40G/100G Applications," Version 1.4, Altera Corporation, Sep. 2011, pp. 1-9.
Altera, "Boosting System Performance with External Memory Solutions," Altera Corporation, Jun. 2010, pp. 1-7.
Altera, "Enhancing Robust SEU Mitigation with 28-nm FPGAs," Altera Corporations, Jul. 2010, pp. 1-8.
Altera, "Overcome Copper Limits with Optical Interfaces," Altera Corporation, Apr. 2011, pp. 1-9.
Altera, "Using External Memory Interfaces to Achieve Efficient High-Speed Memory Solutions," Altera Corporation, Nov. 2011, pp. 1-9.
Li, Peng Mike et al., "Transferring High-Speed Data over Long Distances with Combined FPGA and Multichannel Optical Modules," Avago Technologies, Mar. 21, 2012, pp. 1-7.
Altera, "Altera Transceiver Phy IP Core, User Guide," Altera Corporation, Jun. 2012, pp. 1-312.
Nystrom, Mika et al., "A Pipelined Asynchronous Cache System," Caltech, pp. 1-10.
Lines, Andrew Matthew, "Pipelined Asynchronous Circuits," Thesis, Caltech, Jun. 1995, pp. 1-37.
Beerel, Peter A. et al., "Proteus, Automated Design of GHz Asynchronous Circuits," Async, Grenoble, France, May 2010, pp. 1-40.
Greengerg, Marc, "DDR4: Double the speed, double the latency? Make sure your system can handle next-generation DRAM," chipestimate.com, Nov. 22, 2011.
Daniluk, Grzeforz et al., "White Rabbit: Sub-Nanosecond Synchronization for Embedded Systems," Proceedings of the 43rd Annual Precise Time and Time Interval Systems and Applications Meeting, Nov. 2011, pp. 1-15.
Gustlin, Mark et al., "Interlaken Technology: New-Generation Packet Interconnect Protocol," Cisco Systems Inc., Cortina Systems Inc., Silicon Logic Engineering Inc., Mar. 8, 2007, pp. 1-16.
Cisco, "Cut-Through an Store-and-Forward Ethernet Switching for Low-Latency Environments," Cisco Systems, 2008, p. 1-13.
Verma, Saurabh et al., "Understanding Clock domain crossing issues," EE Times-India, Dec. 2007, pp. 1-7.
Lines, Andrew, "The Vortex: A Superscalar Asynchronous Processor," FULCRUM Microsystems, 2007, pp. 1-24.
Cummings, Uri, "AdvancedTCA: Increasing Design Flexibility with Switched Interconnects," FULCRUM Microsystems, 2004, pp. 1-46.
Pintaske, Juergen, "NEXUX: An on-chip connection for maximum throughput," FULCRUM Microsystems, Aug. 3, 2003, pp. 1-7.
Lines, Andrew, "An Asynchronous SoC Interconnect," Fulcrum Microsystems, pp. 1-23.
Cummings, Uri, "Terabit Clockless Crossbar Switch in 130nm," FULCRUM Microsystems, pp. 1-28.
Lines, Andrew, "Nexus: An Asynchronous Crossbar interconnect for Synchronous System-on-Chip Designs," High Performance Interconnects, 2003. Proceedings. 11th Symposium on, Aug. 2003, pp. 1-9.
FULCRUM, "Latency Measurement, In Data Center Switching Equipment," White Paper, Fulcrum Microsystems, Mar. 2011, pp. 1-5.
FULCRUM, "FocalPoint Memory Efficiency, Non-blocking Fabric Architecture," White Paper, FULCRUM Microsystems, May 2009, pp. 1-7.
FULCRUM, "FocalPoint 2, A 300nS, 240 Gb/s switch/router," FULCRUM Microsystems, 2003, pp. 1-11.
Beerel, Peter A., "Industrial Experiences Pioneering Asynchronous Commercial Design," FULCRUM Microsystems, pp. 1-35.
Lines, Andrew, "The Vortex: A Superscalar Asynchronous Processor," Fulcrum Microsystems, Asynchronous Circuits and Systems, 2007. ASYNC 2007. 13th IEEE International Symposium on, Mar. 2007, pp. 1-10.
Cummings, Uri, "Asynchronous Logic in PivotPoint: A Commercial Switch SoC," Fulcrum Microsystems, 2004, pp. 1-35.
Lee, Gary, "An Advanced Switch Memory Architecture," Fulcrum Microsystems, May 2010, pp. 1-8.
Haque, Imran S. et al., "Hard Data on Soft Errors: A Large-Scale Assessment of Real-World Error Rates in GPGPU," 10th IEEE/ACM International Conference on Cluster, Cloud and Grid Computing, 2010, pp. 1-6.
Holden, Brian et al., "Latency analysis of Major chip-to-chip interconnects," PMC-Sierra Inc., Feb. 16, 2005, pp. 1-2.
Holden, Brian, "Latency Comparison Between HyperTransport and PCI-Express in Communications Systems," White Paper, Hyper Transport Consortium, Nov. 17, 2006, pp. 1-11.
Litz, Heiner et al., "A HyperTransport Network Interface Controller for Ultra-low Latency Message Transfers," HyperTransport Consortium, Feb. 13, 2008, pp. 1-9.
Idt, "48 Lane 12 port PCIe Gen3 System Interconnect Switch," Integrated Device Technology, 2011, pp. 1-1.
Walker, Rick et al., "64b/66b Coding update," IEEE 802.3ae, Mar. 6, 2000, pp. 1-19.
Panda, Dhabaleswar K., "Overview of InfiniBand Architecture," Ohio State University, 2010, pp. 1-9.
Intel, "Intel 6400/6402 Advanced Memory Buffer," Datasheet, Intel, Oct. 2006, pp. 1-250.
Coleman, James et al., "Hardware Level IO Benchmarking of PCI Express," Intel Corporation, Dec. 2008, pp. 1-28.

(56) References Cited

OTHER PUBLICATIONS

Keller, Perry et al., "Understanding the New Bit Error Rate DRAM Timing Specifications," Jedec, Server Memory Forum, 2011, pp. 1-10.
JEDEC, "FBDIMM: Architecture and Protocol," JEDEC Solid State Technology Association, Jan. 2007, pp. 1-128.
Lattice, "PCI Express," Lattice Semiconductor Corporation, User's Guide, Oct. 2005, pp. 1-16.
Maxim, "Jitter in Digital Communication Systems, Part 2," Maxim integrated Products, Revision 1, Apr. 2008, pp. 1-7.
"Transmit Logic Details," oohoo.org, pp. 1-23.
Dzatko, Dave, "PCI Express Pipe Overview," MindShare Inc., Mar. 2004, pp. 1-15.
Jedec, "JEXD204B, An early look at the third-generation high speed serial interface for data converters," NXP Semiconductors, Aug. 2011, pp. 1-8.
Slogsnat, David et al., "A Versatile, Low Latency HyperTransport Core," Proceedings of the 2007 ACM/SIGDA 15th international symposium on Field programmable gate arrays, 2007, pp. 1-8.
Xlinx, "Virtex-5 Integrated PCI Express Block Plus—Debugging Guide for Link Training Issues," Xilinx Answer 42368, Jul. 19, 2011, pp. 1-38.
Budruk, Ravi et al., "PCI Express System Architecture," PC System Architecture Series, MindShare Inc., 2003, pp. 1-1106.
PCIExpress, "PCI Express Base Specification Revision 3.0," PCI Express, Nov. 10, 2010, pp. 1-860.
Budriuk, Ravi, "PCI Express Basics," PCI-SIG, MindShare Inc., 2007, pp. 1-40.
Sharma, Debendra Das, "PCIe 3.0 PHY Logical Layer Requirements," PCI-SIG, PCIe Technology Seminar, pp. 1-28.
Wagh, Mahesh, "PCIe 3.0 PHY Logical Layer," PCI Express, PCI Technology Seminar, 2008, pp. 1-30.
Wagh, Mahesh, "PCIe 3.0/2.1 Protocol Updates," PCI-SIG, PCIe Technology Seminar, 2009, pp. 1-61.
Getty, Gordon, "PCIe 2.0 Link Layer Test Concepts," PCI-SIG Developers Conference, 2008, pp. 1-29.
Puri, Jitendra, "Common Pitfalls in PCIe 2.0 Migration," PCI-SIG, 2007, pp. 1-43.
Caruk, Gord, "Reliable Data Transmission Features of PCI Express," PCI Express, PCI-SIG, 2007, pp. 1-18.
Intel, "PHY Interface for the PCI Express Architecture, PCI Express 3.0," Revision 0.5, Intel Corporation, Aug. 2008, pp. 1-45.
Intel, "PHY Interface for the PCI Express Architecture," Version 1.00, Intel Corporation, Jun. 19, 2003, pp. 1-31.
PCI Express, "PCI Express XpressRich Core, Reference Manual," Version 2.1.0, PLDA, Jun. 2008, pp. 1-187.
Regula, Jack, "Overcoming Latency in PCIe Systems Using PLX," PLX Technology.
PLX, "PCI Express Packet Latency Matters," PLX Technology, Version 1.0, Jan. 15, 2007, pp. 1-3.
Cadence Design Systems, "Preliminary DFI DDR PHY Interface," DIF 3.1 Specification, Cadence Design Systems Inc., May 19. 2012, pp. 1-147.
Maliniak, Lisa, "PCI Express and the PHY(sical) Journey to Gen 3," May 13, 2009, pp. 1-5.
Rosenblum, Mendel, "Low Latency RPC in RAMCloud," RAMClour RPC, Apr. 12, 2011, pp. 1-15.
Reilly, Matt et al., "A Network Fabric for Scalable Multiprocessors Systems," SiCortex Inc., High Performance Interconnects, 2008. HOTI '08. 16th IEEE Symposium on, Aug. 2008, pp. 1-24.
Kelly, Rick, "IP Solutions for Synchronizing Signals that Cross Clocks Domains," Synopsys, Jan. 2009, pp. 1-22.
Texas Instruments, "XIO3130 Data Manual," Texas Instruments incorporated, May 2007, pp. 1-142.
Khan, Asad et al., "Reference Modeling Techniques for Efficient Verification of a PCI Express Switch," PCI Express, PCI-SIG, Texas Instruments, 2006, pp. 1-57.
Devashish, Paul, "Tundra, Semiconductor: Developing Wireless Base Stations, in MicroTCA Systems with RapidIO AMCs," Tundra Confidential, Nov. 2008, pp. 1-43.
Lines, Andrew, "Asynchronous Interconnect for Synchronous SoC Design," Micro, IEEE (vol. 24 , Issue: 1 ), Feb. 2004, pp. 1-10.
Pontes, Julian et al., "Hermes-A-An Asynchronous NoC Router with Distributed Routing," Integrated Circuit and System Design. Power and Timing Modeling, Optimization, and Simulation, 2011, pp. 1-10.
Jacob, Bruce, et al., "Memory Systems, Cache, DRAM, Disk," Elsevier Inc., 2008, pp. 1-1017.
Jacob, Bruce et al., "FB Dlmm's," Reference: "Memory Systems: Cache, DRAM, Disk,", School of Computing, University of Utah,.
Ganesh, Brinda et al., "Fully-Buffered DIMM Memory Architectures: Understanding Mechanisms, Overheads and Scaling," Proceedings of the 2007 IEEE 13th International Symposium on High Performance Computer Architecture, 2007, pp. 1-12.
Intel, "Intel Fully Buffered DIMM Specification Addendum," Intel Confidential, Revision 0.9, Mar. 21, 2006, pp. 1-36.
Koop, Matthew J. "Memory Scalability Evaluation of the Next-Generation Intel Bensley Platform with InfiniBand," High-Performance Interconnects, 14th IEEE Symposium on, Aug. 2006, pp. 1-6.
Dobkin, Rostislav (Reuven), "Asynchronous NoC Router," Technion—Israel Institute of Technology, Feb. 2008, pp. 1-47.
Horak, Michael N. et al., "A Low-Overhead Asynchronous Interconnection Network for GALS Chip Multiprocessors," Computer-Aided Design of Integrated Circuits and Systems, IEEE Transactions on (vol. 30, Issue: 4 ), Mar. 22, 2011, pp. 1-8.
Sheibanyrad, Abbas, "Asynchronous Implementation of a Distributed network-on-chip," Thesis, University of Pierre et Marie Curie, 2008, pp. 1-193.
Beerel, Peter A., "Industrial Experiences, Pioneering Asynchronous Commercial Design," Fulcrum Microsystems, Feb. 2000, pp. 1-35.
Loi, Igor et al., "An Efficient Distributed Memory Interface for Many-Core Platform with 3D Stacked DRAM," Design, Automation & Test in Europe Conference & Exhibition, 2010, pp. 1-6.
Benner, Alan, "Optical Interconnect for HPC, Short-Distance High-Density Interconnects," OIDA Roadmapping Workshop, 2010, pp. 1-31.
Facchini, Marco et al., "System-level Power/performance Evaluation of 3D stacked DRAMs for Mobile Applications," Design, Automation & Test in Europe Conference & Exhibition, Apr. 2009, pp. 1-6.
Cortina, "Cortina Systems CS3472 24-Port Gigabit Ethernet Line Rate MAC," Cortina Systems, 2007, pp. 1-3.
Gustlin, Mark et al., "Interlaken Technology: New-Generation Packet Interconnect Protocol," White Paper, Cisco Systems Inc., Cortina Systems Inc., Silicon Logic Engineering Inc., Mar. 8, 2007, pp. 1-16.
Altera, "Transceiver Configurations in Stratix V Devices," Altera Corporation, Feb. 2012, pp. 1-70.
Altera, "Altera Transceiver PHY IP Core, User Guide," Altera Corporation, Mar. 2012, pp. 1-230.
Ganga, Ilango, "Chief Editor's Report," Intel, IEEE P802.3ba Task Force, May 2008, pp. 1-240.
Batten, Christopher et al., "Building Manycore Processor-to-DRAM Networks with Monolithic Silicon Photonics," High Performance Interconnects, 2008. HOTI '08. 16th IEEE Symposium on, Aug. 2008, pp. 1-10.
Chang, Yin-Jung, "Optical Interconnects for In-Plane High-Speed Signal Distribution at 10Gb/s: Analysis and Demonstration," Dissertation, Georgia Institute of Technology, Dec. 2006, pp. 1-169.
Hadke, Amit, "Design and Evaluation of an Optical CPU-DRAM Interconnect," Thesis, University of California, 2009, pp. 1-90.
Hynix, "DDDR3+ SDRAM Devices Operation," Hynix, pp. 1-154.
Hynix, "1Gb DDR3 SDRAM," Hynix, Jul. 2010, pp. 1-32.
Lewis, Dave, "SerDes Architectures and Applications," National Semiconductor Corporation, DesignCon 2004, pp. 1-14.
Keeth, Brent et al., "DRAM Circuit Design: A Tutorial," John Wiley and Sons, 2011, pp. 1-167.
Sun, Hongbin et al., "3D Dram Design and Application to 3D Multicore Systems," IC Design and Test, IEEE 2009, pp. 1-12.
Gadydadjiev, Georgi, "Energy Reduction Techniques for Main Memory," Computer Science and Engineering Chalmers University of Technology, Mar. 26, 2012, pp. 1-13.

(56) References Cited

OTHER PUBLICATIONS

Benner, A. F. et al., "Exploitation of Optical Interconnects in Future Server Architectures," IBM Journal of Research and Development, 2005, pp. 1-26.
Open Silicon, "Hybrid Memory Cube Controller IP Core," Product Brief HMC-1010, Open Silicon, Apr. 2012, pp. 1-2.
Woo, Dong Hyuk et al., "And Optimized 3D-Stacked Memory Architecture by Exploiting Excessive, High-Density TSV Bandwidth," High Performance Computer Architecture (HPCA), 2010 IEEE 16th International Symposium on, Jan. 2010, pp. 1-12.
Altera, "Transceiver Architecture in Stratix V Devices," Altera Corporation, Stratix V Device Handbook, Feb. 2012, pp. 1-54.
Altera, "Altera Interlaken IP Throughtput Measurement References Design for Stratix Devices," Altera Corporation, Feb. 2012, pp. 1-33.
Cortina et al., "Interlaken Protocol Definition," A Joint Specification of Cortina Systems and Cisco Sytems, Revision 1.2, Oct. 7, 2008, pp. 1-52.
"Interlaken MegaCore Function Parameter Selection Worksheet, For Throughput and User Clock Frequency Calculation" pp. 1-12.
Jedec, "DDR4 Mini Workshop," Server memory Forum 2011, pp. 1-14.
Raj, Kannan et al., "'Macrochip; Computer Systems Enabled by Silicon Photonic Interconnects," Proc. of SPIE vol. 7607, Feb. 15, 2010, pp. 1-16.
Mountain, David J., "An ACS View of the Current Exascale Efforts," National Security Agency, 2011, pp. 1-30.
Young, Ian A. et al., "Optical I/O Technology for Tera-Scale Computing," IEEE Journal of Solid-State Circuits, vol. 45, No. 1, Jan. 2010, pp. 1-14.
Dong, Xiangyu et al., System-Level Cost Analysis and Design Exploration for Three-Dimensional Integrated Circuits (3D ICs), Design Automation Conference, 2009. ASP-DAC 2009. Asia and South Pacific, Jan. 2009, pp. 1-8.
Weis, Christian et al., "3D Integrated DRAM Subsystem Optimization," Submitted for Review to Transactions on Computer-Aided Design of Integrated Circuits and Systems, Mar. 15, 2012, pp. 1-12.
Shafai, Farhad, "Technical Feasibility of 100G Designs," Sarance Technologies, Apr. 2007, pp. 1-11.
Achronix, "Speedster22i HD FPGA," Achronix Semiconductor Corporation, Apr. 26, 2012, pp. 1-134.
Xilinx, "Virtex-5 FPGA RocketIO GTX Transceiver User Guide," Xilinx, Oct. 30, 2009, pp. 1-387.
Pasca, Vladimir et al., "CSL: Configurable Fault Tolerant Serial Links for Inter-die Communication in 3D Systems," Springer Science+Business Media, LLC 2011, Dec. 17, 2010, pp. 1-14.
Micron, "1Gb: x4, x8, x16 DDR3 SDRAM," Micron, 2006, pp. 1-196.
Loi, Igor et al., "An Efficient distributed memory interface for Many-Core Platform with 3D stacked DRAM," Design, Automation & Test in Europe Conference & Exhibition (Date), Mar. 2010, pp. 1-6.
Kannan, Sukeshwar et al., "Fault Modeling and Multi-Tone Dither Scheme for Testing 3D TSV Defects," Springer Science+Business Media, LLC 2011, Jan. 6, 2011, pp. 1-13.
Noia, Brandon et al., " Optimization Methods for Post-Bond Testing of 3D Stacked ICs," Springer Science+Business Media, LLC 2011, Jan. 26, 2011, pp. 1-18.
Pawlowski, J. Thomas, "Memory Performance Tutorial," Micron Technology, Hot Chips, Aug. 2004, pp. 1-81.
Ahn, Jung Ho et al., "Multicore DIMM: an Energy Efficient Memory Module with independently Controlled DRAMs," Computer Architecture Letters (vol. 8, Issue: 1), Nov. 2008, pp. 1-4.
Gupta, Pankaj et al., "Designing and Implementing a Fast Crossbar Scheduler," Micro, IEEE (vol. 19, Issue: 1), Jan. 1999, pp. 1-9.
Ware, Frederick A. et al., "Improving Power and Data Efficiency with Threaded Memory Modules," Computer Design, 2006. ICCD 2006. International Conference on, Oct. 2007, pp. 1-8.
Pak, Jun So et al., "Electrical Characterization of Trough Silicon Via (TSV) depending on Structural and Material Parameters based on 3D Full Wave Simulation," Electronic Materials and Packaging, 2007. EMAP 2007. International Conference on, Nov. 2007, pp. 1-6.
Kang, Uksong et al., "8Gb 3D DDR3 DRAM Using Through-Silicon-Via Technology," IEEE International Solid-State Circuits Conference, 2009, pp. 1-3.
Wang, Huandong et al., "An Enhanced HyperTransport Controller with Cache Coherence Support for Multiple-CMP," IEEE International Conference on Networking, Architecture, and Storage, 2009, pp. 1-4.
Chou, Yung-Fa et al., "Memory Repair by Die Stacking with Through Silicon Vias," IEEE International Workshop on Memory Technology, Design, and Testing, 2009, pp. 1-6.
Kang, Uksong et al., "8Gb 3-D DDR3 DRAM Using Through-Silicon-Via Technology," IEEE Journal of Solid-State Circuits, vol. 45, No. 1, Jan. 2010, pp. 1-9.
Lee, Chang J00 et al., "Improving Memory Bank-Level Parallelism in the Presence of Prefetching," Proceedings of the 42nd Annual IEEE/ACM International Symposium on Microarchitecture, 2009, pp. 1-10.
Van Der Plas, Geert et al., "Design Issues and Considerations for Low-Cost 3D TSV IC Technology," IEEE International Solid-State Circuits Conference, 2010, pp. 1-3.
Lee, Sang-Yun et al., "3D IC Architecture for High Density Memories," Memory Workshop (IMW), 2010 IEEE International, May 2010, pp. 1-6.
Dukovic, J. et al., "Through-Silicon-Via Technology for 3D Integration," Memory Workshop (IMW), 2010 IEEE International, May 2010, pp. 1-2.
Chou, Yung-Fa, "Yield Enhancement by Bad-Die Recycling and Stacking With Though-Silicon Vias," IEEE Transactions on Very Large Scale Integration (VLSI) Systems, vol. 19, No. 8, Aug. 2011, pp. 1-11.
Ono, K. et al., "1-Tbyte/s 1-Gbit DRAM Architecture with Micro-pipelined 16-DRAM Cores, 8-ns Cycle Array and 16-Gbit/s 3D Interconnect for High Throughput Computing," 2010 Symposium on VLSI Circuits/Technical Digest of Technical Papers, 2010, pp. 1-2.
Fang, Kun et al., "Heterogeneous Mini-Rank: Adaptive, Power-Efficient Memory Architecture," 39th International Conference on Parallel Processing, 2010, pp. 1-9.
Zhang, Tao et al., "A Customized Design of DRAM Controller for On-Chip 3D DRAM Stacking," Custom Integrated Circuits Conference (CICC), 2010 IEEE, Sep. 2010, pp. 1-4.
Jiang, Li et al., "Yield Enhancement for 3D-Stacked memory by Redundancy Sharing across Dies," Computer-Aided Design (ICCAD), 2010 IEEE/ACM International Conference on, Nov. 2010, pp. 1-5.
Jiang, Li et al., "Modeling TSV Open Defects in 3D-Stacked DRAM," Test Conference (ITC), 2010 IEEE International, Nov. 2010, pp. 1-9.
Chung, Kee-Wei et al., "3D Stacking DRAM using TSV Technology and Microbump Interconnect," Microsystems Packaging Assembly and Circuits Technology Conference (Impact), 2010 5th International, Oct. 2010, pp. 1-4.
Sekiguchi, Tomonori, "1-Tbyte/s 1-Gbit DRAM Architecture Using 3-D Interconnect for High-Throughput Computing," IEEE Journal of Solid-State Circuits, vol. 46, No. 4, Apr. 2011, pp. 1-10.
Xie, Jing et al., "3D Memory Stacking for Fast Checkpointing/Restore Applications," 3D Systems Integration Conference (3DIC), 2010 IEEE International, Nov. 2010, pp. 1-6.
Choi, Hyojin et al., "Memory Access Pattern-Aware DRAM Performance Model for Multi-Core Systems," Performance Analysis of Systems and Software (ISPASS), 2011 IEEE International Symposium on, Apr. 2011, pp. 1-10.
Weis, Christian et al., "Design Space Exploration for 3D-Stacked DRAMs," Design, Automation & Test in Europe Conference & Exhibition, 2011, pp. 1-6.
Singh, Eshan, "Exploiting Rotational Symmetries for improved Stacked Yields in W2W 3D-SICs," 29th IEEE VLSI Test Symposium, 2011, pp. 1-6.
Lung, Chiao-Ling, et al., "Fault-Tolerant 3D Clock Network," Design Automation Conference (DAC), 2011 48th ACM/EDAC/IEEE, Jun. 2011, pp. 1-7.

(56) References Cited

OTHER PUBLICATIONS

Golz, John et al., "3D Stackable 32nm High-K/Metal Gate SOI Embedded DRAM Prototype," VLSI Circuits (VLSIC), 2011 Symposium on, Jun. 2011, pp. 1-2.
Woo, Dong Hyuk et al., "Heterogeneous Die Stacking of SRAM Row Cache and 3-D DRAM: An Empirical Design Evaluation," Circuits and Systems (MWSCAS), 2011 IEEE 54th International Midwest Symposium on, Aug. 2011, pp. 1-4.
Inoue, Koji et al., "3D Implemented SRAM/DRAM Hybrid Cache Architecture for High-performance and Low Power Consumption," Circuits and Systems (MWSCAS), 2011 IEEE 54th International Midwest Symposium on, Aug. 2011, pp. 1-4.
Oh, Dan et al., "Statistical Link Analysis and In-Situ Characterization of High-Speed Memory Bus in 3D Package Systems," Electromagnetic Compatibility (EMC), 2011 IEEE International Symposium on, Aug. 2011, pp. 1-6.
Mutlu, Onur et al., "Stall-Time Fair Memory Access Scheduling for Chip Multiprocessors," 40th IEEE/ACM International Symposium on Microarchitecture, pp. 1-13.
Crisp, R. et al., "Performance Enhancement for Multi-Die DRAM Packages," SolidState Technology, pp. 1-4.
Yamauchi, Tadaaki et al., "The Hierarchical Multi-Bank DRAM: A High-Performance Architecture for Memory Integrated with Processors," Advanced Research in VLSI, 1997. Proceedings., Seventeenth Conference on, Sep. 1997, pp. 1-17.
Beamer, Scott et al., "Re-Architecting DRAM Memory Systems with Monolithically Integrated Silicon Photonics," Proceedings of the 37th annual international symposium on Computer architecture, 2010, pp. 1-12.
HP "Memory Technology Evolution: An Overview of System Memory Tehnologies," Technology grief, 96$^{th}$ edition, pp. 1-19.
Elpida, "New Features of DDR3 Sdram," Elpida Memory inc., Users Manual, 2009, pp. 1-18.
Yoo, Seung-Moon et al., "FlexRAM Architecture Design Parameters," University of Illinois at Urbana-Champaign, Center for Supercomputing Research and Development Technical Report 1584, Oct. 2000, pp. 1-14.
Olukotun, Kunle, "Lecture 13: Main Memory and Virtual Memory," Stanford Univeristy, Nov. 9, 1998, pp. 1-16.
Loh, Gabriel H. et al., "Efficiently Enabling Conventional Block Sizes for Very Large Die-Stacked DRAM Caches," Proceedings of the 44th Annual IEEE/ACM International Symposium on Microarchitecture, Dec. 7, 2011, pp. 1-11.
Wang, Linda, "A Performance Study of Chip Multiprocessors with Integrated DRAM," Thesis, Queen's University, Oct. 2001, pp. 1-124.
Thomadakis, Michael E., "The Architecture of the Nehalem Processor and Nehalem-EP SMP Platforms," Texas A&M University, Mar. 17, 2011, pp. 1-49.
Bergman, Keren et al., "Let There Be Light! The Future of Memory Systems is Photonics and 3D Stacking," Proceedings of the 2011 ACM SIGPLAN Workshop on Memory Systems Performance and Correctness, 2011, pp. 1-6.
Hsieh, Ang-Chih et al., "TSV Redundancy: Architecture and Design Issues in 3D IC," Design, Automation & Test in Europe Conference & Exhibition, 2010, pp. 1-6.
Udipi, Aniruddha N. et al., "Rethinking DRAM Design and Organization for Energy-Constrained Multi-Cores," Proceedings of the 37th annual international symposium on Computer architecture, 2010, pp. 1-12.
Ware, Frederick A. et al., "Improving Power and Data Efficiency with Threaded Memory Modules," Computer Design, 2006, ICCD 2006. International Conference on, 2006, pp. 1-8.
Levinthal, David, "Performance Analysis Guide for intel Core i7 Processor and Intel Xeon 5500 Processors," Performance Analysis Guide, Intel Corporation, 2009, pp. 1-72.
Maddox, Robert A. et al., "Weaving High Performance Multiprocessor Fabric," Intel, Digital Edition of selected Intel Press books, 2009, pp. 1-328.
Ipek, Engin et al., "Self-Optimizing Memory Controllers: A Reinforcement Learning Approach," Computer Architecture, 2008. ISCA '08. 35th International Symposium on, Jun. 2008, pp. 1-12.
"DRAM Technology," Baidu.com, pp. 1-29.
Harvard, Qawi, "Wide I/O DRAM Architecture Utilizing Proximity Communication," Thesis Defense, Boise State University, Oct. 8, 2009, pp. 1-34.
Johnson, Sally Cole, "Next up for 3D ICs: Wide I/O," 3D Packaging, Issue 17, Nov. 2010, pp. 1-5.
Microsoft, "Main Memory Technology Direction," WinHEC, 2007, pp. 1-36.
Verma, S.K. et al., "Encoding Schemes for Reduction of Power Dissipation, Crosstalk and Delay in VLSI Interconnects: A Review," International J. Of Recent Trends in Engineering and Technology, vol. 3, No. 4, May 2010, pp. 1-6.
Lee, Kangmin et al., "SILENT: Serialized Low Energy Transmission Coding for On-Chip Interconnection Networks," Computer Aided Design, 2004. ICCAD-2004. IEEE/ACM International Conference on, Nov. 2004, pp. 1-4.
Micron, "DDR3 SDRAM 1Gb," Micron, 2006, pp. 1-196.
Micron, "DDR3 SDRAM 2Gb," Micron, 2006, pp. 1-210.
Coleman, James et al., "Hardware Level IO Benchmarking of PCI Express," Intel, Dec. 2008, pp. 1-28.
Gustlin, Mark et al., "Interlaken Technology: New-Generation Packet Interconnect Protocol," Cisco Systems, Mar. 8, 2007, pp. 1-16.
Mraze, Korby et al., "Enabling OTN Switching over Packet/Cell Fabrics," PMC-Sierra inc., Issue No. 1: Dec. 2011, pp. 1-23.
Safai, Farhad et al., "How to design an Interlaken to SPI-4.3 bridge," eetimes.com, Apr. 30, 2007, pp. 1-6.
Maskit, Daniel, "A Compiler Algorithm for Managing Asynchronous Memory Read Completion," California Institute of Technology, 1996, pp. 1-24.
Altera, "An 573: Implementing the Interlaken Protocol in Stratix IV Transceivers," Altera, Jun. 2009, pp. 1-14.
Castonguay, Ami et al., "Architecture of a HyperTransport Tunnel," Circuits and Systems, 2006. ISCAS 2006. Proceedings. 2006 IEEE International Symposium on, May 2006, pp. 1-4.
Buch, Kaushal et al, "Performance Enhancements in System Packet Interface (SPI) 4.2 IP Core," IP 07 Conference-Ahmedabad India, 2007, pp. 1-5.
PCI-SIG, "Performances of PCI Express Devices—A case Study," PCI Express, 2005, pp. 1-31.
Sandhu, Gurtej, "DRAM Scaling and Bandwidth Challenges," Micron Technologies, 2010, pp. 1-23.
Duato, Jose, "HyperTransport Technology Tutorial," Hot Chips Symposium, Aug. 23, 2009, pp. 1-87.
Pawlowski, J. Thomas, "Hybrid Memory Cube (HMC)," Micron Technology Inc., Hot Chips 23, pp. 1-24.
Hauger, Simon et al., "Packet Processing at 100Gbps and Beyond—Challenges and Perspectives," Photonic Networks, 2009 ITG Symposium on, May 2009, pp. 1-10.
Hypertransport Consortium, "HyperTransport I/O Technology Comparison With Traditional and Emerging I/O Technologies," White Paper, HTC_WP04, HyperTransport Technology Consortium, Rev. 001, Jun. 2004, pp. 1-24.
Hypertransport Consortium, "HyperTransport I/O Technology DirectPacket Specification," White Paper, HTC_WP03, HyperTransport Technology Consortium, Rev. 001, Jun. 2004, pp. 1-20.
Hypertransport Consortium, "HTX—PCI Express Compared, How and Why HyperTransport HTX Proves Best Choice for Compute-Intensive Applications," HyperTransport Consortium, Feb. 3, 2008, pp. 1-17.
Hypertransport Tech Consortium, " HyperTransport I/O Link Specification," Hypertransport Technology Consortium, Revision 2.00b Draft2, Mar. 24, 2005, pp. 1-325.
Anderson, Don et al., "HyperTransport System Architecture," MindShare Inc., 2003, pp. 1-586.
Rapidio, "RapidIO, PCI Express and Gigabit Ethernet Comparison," RapidIO Trade Association, 2005, pp. 1-36.
Rockfish Technology, "Interlaken Verification IP," Vermillion BFM, Rockfish Technology, 2008, pp. 1-2.

(56) References Cited

OTHER PUBLICATIONS

Interlaken Alliance, "Clarifications to the Interlaken Protocol Definition Revision 1.1," Interlaken Alliance, Jun. 11, 2008, pp. 1-13.
Interlaken Alliance, "Interlaken Interoperability Recommendations," Interlaken Alliance, Revision 1.6, Oct. 11, 2011, pp. 1-24.
Interlaken Alliance, "Interlaken Look-Aside Protocol Definition," Interlaken Alliance, Revision 1.0, May 16, 2008, pp. 1-14.
Nsys, "Interlaken nVS," nSys, nSys verification Suite, 2010, pp. 1-4.
Cortina et al., "Interlaken Protocol Definition, A joint Specification of Cortina Systems and Cisco Systems," Cortina Systems and Cisco Systems, Revision 1.2, Oct. 7, 2008, 2008, pp. 1-52.
Interlaken Alliance, "Interlaken Retransmit Extension Protocol Definition," Interlaken Alliance, Revision 1.1 Sep. 26, 2011, pp. 1-13.
Holden, Brian, "Latency Comparison Between HyperTransport and PCI-Express in Communications Systems," HyperTransport Consortium, White Paper, Nov. 17, 2006, pp. 1-11.
Bruning, Ulrich, "Achieving Low Latency with HyperTransport," Universitat Heidelberg, 2009, pp. 1-40.
Hristea, Cristina Ana Maria, "Miro Benchmarks for Multiprocessor Memory Hierarchy Performance," Massachusetts Institute of Technology, May 1997, pp. 1-69.
Open Silicon, "Interlaken ASIC IP Core," Open Silicon, pp. 1-2.
PCI-SIG, "Performance of PCI Expres Devices—a case study," PCI-SIG, 2005, pp. 1-31.
Lowe, Mike, "PCI-X Mode 2 to HyperTransport Bridge," PCI-SIG Developers Conference, 2004, pp. 1-27.
Maddox, Robert A. et al., "Weaving High Performance Multiprocessor Fabric," Intel Corporation, 2009, pp. 1-328.
Doerfler, Douglas W., "An Analysis of HyperTransport and Seastar Data Rates on Red Storm," Sandia Report, Sandia National Laboratories, Aug. 2005, pp. 1-9.
Sarance Technologies, "Interlaken Protocol FPGA IP Core," Sarance Technologies Inc., 2008, pp. 1-2.
Shafai, Farhad et al., "How to Design an Interlaken, SPI-4.2 Bridge," EETimes.com, May, 30, 2007, pp. 1-6.
Shafai, Farhad, "Technical Feasibility of 100G Designs," Sarance Technologies, IEE HSSG, Apr. 2007, pp. 1-11.
Hollis, Tim, "Modeling and Simulation Challenges in 3D-Memories," Micron Technologies Inc., Feb. 7, 2011, pp. 1-17.
Maddox, Robert A. et al., "Weaving High Performance Multiprocessor Fabric," Intel Technologies, 2009, pp. 1-328.
Katevenis, Manolis et al., "Variable Packet Size Buffered Crossbar (CICW) Switches," Communications, 2004 IEEE International Conference on (vol. 2), Jun. 2004, pp. 1-8.
Goldhammer, Alex et al., "Understanding Performance of PCI Express Systems," XILINX, White Paper: Virtex-4 and Virtex-5 FPGAs, Sep. 4, 2008, pp. 1-18.
Dai, J. G. 'Jim' et al., "The thoughput of data switches with and without speedup," Georgia Institute of Technology, 2000, pp. 1-9.
Micron, "DDR3 SDRAM, 1Gb: x4, x8, x16 DDR3 SDRAM Feartures," Micron Technologies, 2006, pp. 1-210.
Wagh, Mahesh, "PCLe 3.0/2.1 Protocol Updates," PCI Express, PCI SIG, 2009, slides 1-61.
Hsieh, Ang-Chih et al., "TSV Redundancy: Architecture and Design Issues in 3D IC," Design, Automation & Test in Europe Conference & Exhibition (Date), 2010, pp. 1-6.
Johnson, Sally Cole et al., "Secrecy shrouds 3D silicon interposer development," 3D Packaging, Aug. 2010, pp. 1-3.
Wagh, Mahesh, "PCIe Protocol Extensions," Intel Corporation, PCI Express, PCI SIG, 2007, pp. 1-43.
Greshishchev, Yuriy M., "survey of High-Speed Serial Technologies," T10 SAS-2 WG meeting, Houston, PMC-Sierra Inc. May, 26, 2005, pp. 1-29.
Loi, Igor et al., "An efficient distributed memory interface for Many-Core Platforms with 3D stacked DRAM," University of Bologna, Mar. 8, 2010, pp. 1-6.
Facchini, Marco et al., "System-level Power/performance Evaluation of 3D stacked DRAMs for Mobile Applications," Design, Automation & Test in Europe Conference & Exhibition, 2009, pp. 1-6.
Ganesh, Brinda et al., "Fully-Buffered DIMM Memory Architectures: Understanding Mechanisms, Overheads and Scaling," IEEE, University of Maryland, 2007, pp. 1-12.
Koopman, Philip, "Main Memory Architecture," Carnegie Mellon University, Oct. 19, 1998, pp. 1-17.
Rixner, Scott et al., "Memory Access Scheduling," Computer Systems Laboratory, Stanford University, 2003 pp. 1-11.
Black, Bryan et al., "Die Stacking (3D) Microarchitecture," 39th International Symposium on Microarchitecture, Dec. 2006, pp. 1-11.
Iyer, Sundar, "Load Balancing and Parallelism for the Internet," Dissertation, Department of Computer Science, Stanford University, Jul. 2008, pp. 1-436.
Loh, Gabriel H., "3D-Stacled Memory Architectures for Multi-Core Processors," 35th ACM/IEEE International Conference on Computer Architecture, Jun. 2008, pp. 1-14.
Zheng, Hongzhong et al., "Decoupled DIMM: Building High-Bandwidth Memory System Using Low-Speed DRAM Devices," 36th annual international ymposium on Computer architecture, Jun. 20, 2009, pp. 1-12.
Zheng, Hongzhong et al., "Mini-Rank: Adaptive DRAM Architecture for Improving Memory Power Efficiency," Microarchitecture, 2008. Micro-41. 2008 41st IEEE/ACM International Symposium on, 2008, pp. 1-12.
Deng, Qingyuan et al., "MemScale: Active Low-Power Modes for Main Memory," Rutgers University, 2011, pp. 1-14.
Hur, Ibrahim et al., "Adaptive History-Based Memory Schedulers," 37th International Symposium on Microarchitecture, 2004, pp. 1-12.
Zhang, Wangyuan, "Exploring Phase change Memory and 3D Die-Stacking for Power/Thermal Friendly, Fast and Durable Memory Architectures," University of Florida, 2009, pp. 1-12.
Ahn, Jung Ho et al., "Multicore DIMM: an Energy Efficient Memory Module with Independently Controlled DRAMs," IEEE Computer Architecture Letters, Oct. 31, 2008, pp. 1-4.
Leverich, Jacob et al., "Comparative Evaluation of Memory Models for chip Multiprocessors," Stanford University, Nov. 2008, pp. 1-30.
Ahn, Jung Ho et al., "Future Scaling of Processor-Memory Interfaces," High Performance Computing Networking, Storage and Analysis, Proceedings of the Conference on, Aug. 6, 2009 pp. 1-12.
Zhang, Tao et al., "A Customized Design of DRAM Controller for On-Chip 3D DRAM Stacking," Custom Integrated Circuits Conference (CICC), 2010 IEEE, 2010, pp. 1-4.
Sungwoo Choo, Seongil O. et al., "Exploring Energy-Efficient DRAM Array Organizations," Seoul National University, 2011, pp. 1-4.
Akesson, Benny et al., "Architectures and Modeling of Predictable Memory Controllers for Improved System Integration," Eindhoven University of Technology, Mar. 2011, pp. 1-6.
Vogelsang, Thomas, "Understanding the Energy Consumption of DRAMs," Rambus, Dec. 7, 2010, pp. 1-25.
Garcia-Vidal, Jorge et al., "A DRAM/SRAM Memory Scheme for Fast Packet Buffers," IEEE Transactions on Computers, vol. 55, No. 5, May 2006, pp. 1-15.
Diop, Mamadou D. et al., "Electrical Characterization of annular Through Silicon Vias for a reconfigurable Wafer-sized Circuit Board," Electrical Performance of Electronic Packaging and Systems (EPEPS), 2010 IEEE 19th Conference on, 2010, pp. 1-4.
USPTO, "Office Communication Concerning U.S. Appl. No. 11/253,870," Patterson and Sheridan L.L.P., Apr. 15, 2010, pp. 1-447.
USPTO, "Notice of Allowance and Fee(s) Due, for U.S. Appl. No. 11/611,263," Anglehard et al., Sep. 22, 2011, pp. 1-464.
USPTO, "Office Communication for U.S. Appl. No. 12/171,383," LNG/LSI Customer, Dec. 21, 2010, pp. 1-87.
USPTO, "Issue Notification for U.S. Appl. No. 12/454,064," Law Office of Monica H Choi, Oct. 4, 2011, pp. 1-303.

(56) References Cited

OTHER PUBLICATIONS

Wu, Joyce H. "Through-Substrate Interconnects for 3-D Integration and RF Systems," Massachusetts Institute of Technology, Feb. 2007, pp. 1-132.
Advanced Micto Devices, "AMD64 Architecture Programmer's Manual vol. 1: Application Programming," Publication No. 24592, Sep. 2011, pp. 1-386.
Advanced Micto Devices, "AMD64 Architecture Programmer's Manual vol. 2: System Programming," Publication No. 24593, Sep. 2011, pp. 1-612.
Proquest LLC., "UMI Microform Apendix A," Load Balancing and Parallelism for the Internet, 2008, pp. 1-4.
Yamauchi, Tadaaki et al., "The Hierarchical Multi-Bank DRAN: A High-Performance Architecture for Memory Integrated with Processors," Advanced Research in VLSI, 1997. Proceedings., Seventeenth Conference on, Sep. 1997, pp. 1-17.
"DRAM," Oct. 6, 2009, pp. 1-104.
"DRAM," Sep. 27, 2010, pp. 2010.
Sudan, Kshitij et al., "Micro-Pages: Increasing DRAM Efficiency with Locality-Aware Data Placement," University of Utah School of Computing, 2010, pp. 1-12.
Mutschler, Ann Steffora, "Bigger Pipes, New Priorities," System-Level Design Community, 2011, pp. 1-6.
Altera Corporation, "Serial Standards Quick Reference Guide," 2009, pp. 1-2.
Bassett, Daniel G. et al., "Viral Page Placement Guided by DRAM Locality and Latency," http://mercury.pr.erau.edu/, Jul. 2011, pp. 1-7.
Chien, Lung-Sheng, "RAM (Random Access Memory)," pp. 1-110.
Grange, Matt et al., "Exploration of Through Silicon Via Interconnect Parasitics for 3-Dimensional Integrated Circuits," Workshop Notes, Design, Automation and Test in Europe, 2009, pp. 1-4.
Micron, "DDR3 Power, Estimates, Affect of Bandwidth, and Comparisons to DDR2," Micron Technologies, Apr. 12. 2007, pp. 1-29.
Eli, "Down to the TLP: How PCI Express Devices Talk (part 1)," My Tech Bolg, Mar. 12, 2011, pp. 1-21.
Eli, "Down to the TLP: How PCI Express Devices Talk (part 2)," My Teck Blog, Mar. 13, 2011, pp. 1-11.
Sun, Hongbin et al., "3D DRAM Design and Application to 3D Multicore Systems," IEEE Design & Test of Computers, 2009, pp. 1-12.
Semicon, "High-Speed Multi-Die DRAM Packages Fabricated Using Wire-Bond Infrastructure," Semicon, Europa 2011, pp. 1-20.
Samsung, "1Gb F-die DDR3 SDRAM, 78FBGA with Lead-Free and Halogen-Free (RoHS Compliant),"Samsung Electronics, Dec. 2009, pp. 1-59.
Dutoit, Denis et al., "3D Technologies: some Perspectives for Memory Interconnect and Controller," Codes+ISSS: Special session on memory controllers Taipei, Oct. 10, 2011, pp. 1-24.
Bapat, Ojas A., "Design of DDR2 Interface for Tezzaron TSC8200A," Submitted to North Carolina State University, 2010, pp. 1-72.
Weerasekera, Roshan, "System Interconnection Design Trade-offs in Three-Dimensional (3-D) Integrated Circuits," Doctoral Thesis Stockholm Sweden, 2008, pp. 1-192.
Chillara, Krishna C. et al., "Robust Signaling Techniques for Through Silicon Via Bundles," Thesis, University of Massachusetts Amherst, 2010, pp. 1-4.
Hynix, "1Gb DDR3 SDRAM Lead-Free & Halogen-Free (RoHS Compliant)," Hynix Semiconductor, Jan. 2011, pp. 1-172.
Ajanovic, Jasmin, "PCI Express 3.0 Overview," Intel corp. Aug. 23, 2009, pp. 1-61.
Nagaraj, Dheemanth et al., "Westmere-EX: A 20 Thread Server Cup," Hot chips, 2010, pp. 1-18.
Ando, Hisa "Hot Chips 23," Sep. 13, 2011, pp. 1-3.
Kabra, Mayank et al. "Fast Buffer Memory with Deterministic Packet Departures," University of California, Aug. 2006, pp. 1-26.
Liu, Song et al., "Hardware/Software Techniques for DRAM Thermal Management," 17th IEEE International Symposium on High Performance Computer Architecture (HPCA), 2011, pp. 1-11.
Woo, Dong Hyuk et al., "An Optimized 3D-Stacked Memory Architecture by Exploiting Excessive, High-Density TSV Bandwidth," Georgia Institute of Technology, Jan. 2010, pp. 1-12.
Ganesh, Brinda et al., "Fully-Buffered DIMM Memory Architectures: Understanding Mechanisms, Overheads and Scaling," University of Maryland, 2007, pp. 1-12.
Yun, Woojin et al., "Thermal-Aware Energy Minimization of 3D-Stacked L3 Cache with Error Rate Limitation," Circuits and Systems (ISCAS), 2011 IEEE International Symposium on, 2011, pp. 1-4.
Xie, Jing et al., "3D memory stacking for fast checkpointing/restore applications." IEEE Xplore Digital Library, Nov. 2010, pp. 1-1.
Chung, Kee-Wei et al., "3Dstacking DRAM using TSV technology and microbump interconnect," IEEE Xplore Digital Library, Oct. 2010, pp. 1-1.
Kang, Uksong et all., "8 Gb 3-D DDR3 DRAM Using Through-Silicon-Via Technology," IEEE Xplore Digital Library Jan. 2010, pp. 1-1.
Zhang, Tao et al., "A customized design of DRAM controller for on-chip 3D DRAM stacking," IEEE Xplore Digital Library, Sep. 2010, pp. 1-1.
Van Der Plas, G. et al., "Design issues and considerations for low-cost 3D TSV IC technology," IEEE Xplore Digital Library, Feb. 2010, pp. 1-1.
Weis, C. et al., "Design space exploration for 3D-stacked DRAMs," IEEE Xplore Digital Library, Mar. 2011, pp. 1-1.
Pak, Jun So et al., "Electrical characterization of trough silicon via (TSV) depending on structural and material parameters based on 3D full wave simulation," IEEE Xplore Digital Library, Nov. 2007, pp. 1-1.
Singh, E. et al., "Exploiting rotational symmetries for improved stacked yields in W2W 3D-SICs," IEEE Xplore Digital Library, May 2011, pp. 1-1.
Fang, Kun et al., "Heterogeneous Mini-rank: Adaptive, Power-Efficient Memory Architecture," IEEE Xplore Digital Library, Sep. 2010, pp. 1-1.
Chang, Joo Lee et al., "Improving memory Bank-Level Parallelism in the presence of prefetching," IEEE Xplore Digital Library, Dec. 2009, pp. 1-1.
Uksong, Kang et al., "8Gb 3D DDR3 DRAM using through-silicon-via technology," IEEE Xplore Digital Library, Feb. 2009, pp. 1-1.
Hyojin, Choi et al., "Memory access pattern-aware DRAM performance model for multi-core systems," IEEE Xplore Digital Library, Apr. 2011, pp. 1-1.
Yung-Fa, Chou et al., "Memory Repair by Die Stacking with through Silicon Vias," IEEE Xplore Digital Library, Sep. 2009, pp. 1-1.
Li, Jiang et al., "Modeling TSV open defects in 3D-stacked DRAM," IEEE Xplore Digital Library, Nov. 2010, pp. 1-1.
Yung-Fa, Chou et al., "Yield Enhancement by Bad-Die Recycling and Stacking With Though-Silicon Vias," IEEE Xplore Digital Library, Aug. 2011, pp. 1-1.
Garrou, "IFTLE 38 . . .of Memory Cubes and Ivy Bridges—more 3D and TSV," ElectroIQ, 2011, pp. 1-2.
Garrou, "IFTLE 49 Mentor 3D-IC Test Strategy; GSA Memory Conf," ElectroIQ, 2011, pp. 1-4.
Garrou, "IFTLE 74 The Micron Memory Cube Consortium," ElectroIQ, 2011, pp. 1-3.
Garrou, "IFTLE 76: Advanced Packaging at IMAPS 2011, recent 3D announcements," ElectroIQ, 2011, pp. 1-3.
Garrou, Phil, "3D Integration Entering 2011," I-Micronews, 2007, pp. 1-3.
Yole Development "Micron/Samsung TSV stacked memory collaboration: a closer look," I-Micronews, 2007, pp. 1-3.
Yole Development, "Micron reveals "Hyper Memory Cube" 3DIC Technology," I-Micronews, 2007 pp. 1-2.
Yole Development, "New Samsung 8GB DDR3 module utilizes 3D TSV technology," I-Micronews, 2007, pp. 1-2.
Yole Development, "Samsung develops 32GB RDIMM using 3D TSV technology," I-Micronews, 2007, pp. 1-2.
Yole Development, "Samsung develops mobile DRAM with wide I/O interface using 50 nanometer process technology," I-Micronews, 2007, pp. 1-2.

(56) References Cited

OTHER PUBLICATIONS

Yole Development, "Samsung presents new 3D TSV Packaging Roadmap," I-Micronews, 2007, pp. 1-3.
Yole Development, "Samsung Wide IO Memory for Mobile Products—A Deeper Look," I-Micronews, 2007, pp. 1-2.
Interlaken Alliance, "Interlaken Interoperability Reommendations," Interlaken Interoperability Recommendations Revision 1.6, Oct. 11, 2011, pp. 1-24.
Interlaken Alliance, "Interlaken Look-Aside Protocol Definition," Interlaken Look-Aside Protocol Definition Revision 1.0, May 16, 2008, pp. 1-14.
Cortina Sytems Inc. et al., "Interlaken Protocol Definition," A joint Specification of Cortina Systems and Cisco Systems, Interlaken Protocol Definition Revision 1.2, Oct. 7, 2008, pp. 1-52.
Interlaken Alliance, "Interlaken Retransmit Extension Protocol Definition," Interlaken Retransmit Extension Revision 1.1, Sep. 26, 2011, pp. 1-13.
Weerasekera, Roshan et al., "On Signalling Over Through-Silicon Via (TSV) Interconnects in 3-D Integrated Circuits," Design, Automation & Test in Europe Conference & Exhibition, Mar. 2010, pp. 1-4.
Mutlu, Onur et al., "Parallelism-Aware Batch Scheduling: Enhancing both Performance and Fairness of Shared DRAM Systems," Microsoft Research, 2008, pp. 1-12.
Udipi, Aniruddha N. et al., "Rethinking DRAM Design and Organization for Energy-Constrained Multi-Cores," University of Utah, 2010, pp. 1-12.
Udipi, Aniruddha N. et al., "Combining Memory and a Controller with Photonics through 3D-Stacking to Enable Scalable and Energy-Efficient Systems," University of Utah, 2011, pp. 1-12.
Yoon, Dow Hyun et al., "Adaptive Granularity Memory Systems: A Tradeoff between Storage Efficiency and Throughput," University of Texas, Electrical and computer Engineering Dept., 2011, pp. 1-12.
Crisp, Richard, "High Performance Multi-Die DRAM Packaging for High-Speed Server Applications using Dual Face Down Architecture with Wirebond Assembly Infrastructure," Invensas, Oct. 12, 2011, pp. 1-68.
Prince, Betty, "Central Texas Section IEEE, SSCS, ISSCC 2011 memory Overview," Memory Strategies International, 2011, pp. 1-28.
McElrea, Simon, "Near Term Solutions for 3D Memory Stacking (DRAM)," Invensas Corporation, 2011, pp. 1-20.
Gerke, David et al., "NASA 2009 Body of Knowledge (BoK): Through-Silicon Via Technology," Jet Propulsion Laboratory, California Institute of Technology, Nov. 2009, pp. 1-40.
Xie, Yuan, "Cost/Architecture/Application Implications for 3D Stacking Technology," The Pennsylvania State University, 2011, pp. 1-40.
Klein, Dean, "Challenges in Energy-Efficient Memory Architecture," Micron Technology, Inc., Feb. 2009, pp. 1-22.
McGill University, "Router Architectures," School of Computer Science, 2005, pp. 1-11.
Lee, Chang Joo et al., "Improving Memory Bank-Level Parallelism in the Presence of Prefetching," University of Texas at Austin, Dec. 16, 2009, pp. 1-10.
Iyer, Sundar, "Load-Balancing and Parallelism for the Internet," Stanford University Oral Examination, Feb. 18, 2003, pp. 1-46.
Zicores.Com "Multi-ported Memory Controller-Arbiter," MEM_ARBITER, 2009, pp. 1-5.
Ferreira, Kurt et al., "Exploring memory Management Strategies in Catamount," Cray User Group Conference Helsinki Finland, May 2008, pp. 1-13.
David, Howard et al., "Memory Power Management via Dynamic Voltage/Frequency Scaling," Association for Computing Machinery, Jun. 14, 2011, pp. 1-10.
Garrou, Philip, "Perspectives From the Leading Edge," PFTLE 122 3-D IC at the IEEE ISSCC, Mar. 12, 2010, pp. 1-13.
Mohammed, Ilyas, "Memory Packaging challenges and Approaches for the Portable Client and Cloud Computing," Invensas, Jul. 2011, pp. 1-100.
Hur, Ibrahim et al., "Adaptive History-Based Memory Schedulers," University of Texas at Austin, Dec. 4, 2004.
Appleton, Steve, "Winter Analyst Conference," Micron, Feb. 21, 2011, pp. 1-100.
Malviya, Dinesh et al., "Module Threading Technique to Improve DRAM Power and Performance," Rambus Chip Technologies, 2011, pp. 1-8.
Wilipedia, "MOESI protocol," Wikipedia, Sep. 27, 2011, pp. 1-2.
Mosys, "Bandwidth Engine IC, 2.75G Accesses/sec, 576Mb w/10G Serial I/O + ALUs" Product Brief, 2011, pp. 1-2.
Li, Yiran et al., "Exploiting Three-Dimensional (3D) memory Stacking to improve Image Data Access Efficiency for Motion Estimation Accelerators," Science Direct, 2010, pp. 1-10.
Woo, Dong Hyuk et al., "Heterogeneous die Stacking of SRAM Row Cache and 3-D DRAM" An Empirical Design Evaluation, Circuits and Systems (MWSCAS), 2011 IEEE 54th International Midwest Symposium on, Aug. 2011, pp. 1-4.
Kim, Dongki et al., "A Network Congestion-Aware Memory Controller," Embedded System Architecture Lab, POSTECH, May 2010, pp. 1-20.
Wassal, Amr G. et al., "Novel 3D Memory-Centric NoC Architecture for Transaction-Based SoC Applications," Electronics, Communications and Photonics Conference (SIECPC), 2011 Saudi International, Apr. 2011, pp. 1-5.
Nanya, "1Gb DDR3 SDRAM A-Die," Rev 1.2, Jan. 2009, pp. 1-106.
Dong, Xiangyu et al., "Simple but Effective Heterogeneous Main Memory with On-Chip Memory Controller Support," High Performance Computing, Networking, Storage and Analysis (SC), 2010 International Conference for, 2010, pp. 1-11.
Ebrahimi, Eiman et al., "Parallel Applications Memory Scheduling," Proceedings of the 44th Annual IEEE/ACM International Symposium on Microarchitecture, 2011, pp. 1-12.
Budruk, Ravi et al., "PCI Express System Architecture," Mindshare Brining Life to Knowledge, PC System Architecture Series, 2003, pp. 1-222.
Lee, Chang Joo et al., "Prefetch-Aware Memory Controllers," IEEE transactions on Computers, vol. 60, No. 10, Oct. 2011, pp. 1-25.
Deen, Mueez et al., "When the Chips are Down: Tiny Tech. Propelling Market Expansion," Samsung, Media and Analyst Event, pp. 1-14.
Rambus, "Module Threading," Rambus Technology, 2011, pp. 1-3.
Kanter, David, "The Common System Interface: Intel's Future Interconnect," Real World Technologies, Aug. 28, 2007, pp. 1-4.
Sandia, "Memory for Exascale and . . . Micron's new Memory component is called HMC: Hybrid Memory Cube," Jul. 8, 2011, pp. 1-9.
Rixner, Scott, "Memory Controller Optimizations for Web servers," Rice University, Dec. 4, 2004, pp. 1-12.
Rojas-Cessa, Roberto, "High-Performance Round-Robin Arbitration Schemes for Input-Crosspoint Buffered Switches," High Performance Switching and Routing, 2004. HPSR. 2004 Workshop on, 2004, pp. 1-5.
Sangki, Hong, "3D Subper-Via for Memory Applications," Tezzaron Semiconductor Corporation, Micro-Systems Packaging Initiative (MSPI) Packaging Workshop 2007, pp. 1-35.
Schauss, Gerd, "Samsung Memory Solution for HPC," Energy-Aware High Performance Computing, Sep. 8, 2011, pp. 1-27.
Kant, Krishna, "A Control Scheme for Batching DRAM Requests to Improve Power Efficiency," George Mason University, Jun. 7, 2011, pp. 1-2.
Anthony, Sebastian, "Single-Chip DIMM Offers low-power replacement for sticks of RAM," ExtremeTech, Sep. 7, 2011, pp. 1-4.
Hur, Ibrahim et al., "Adaptive History-Based Memory Schedulers," IBM Austin, University of Texas, Dec. 2004, pp. 1-29.
Iyer, Sundar, "Load Balancing and Parallelism for the Internet." Dissertation, Stanford University, Jul. 2008, pp. 1-418.
Intel, "The Architecture of the Intel QuickPath Interconnect," Dr. Dobbs, 2009, pp. 1-13.

(56) References Cited

OTHER PUBLICATIONS

Nasr, Rami Marwan et al., "FBSIM and the Fully Buffered DIMM Memory System Architecture," Thesis, University of Maryland, 2005, pp. 1-138.
Ganesh, Brinda et al., "Understanding and Optimizing High-Speed Serial Memory System Architectures," Dissertation, University of Maryland, 2007, pp. 1-235.
Wang, David Tawei, "Modern DRAM Memory Systems: Performance Analysis and a High Performance, Power-Constrained DRAM Scheduling Algorithm," Dissertation, University of Maryland, 2005, pp. 1-248.
Agrawal, Banit et al., "High-Bandwidth Network Memory System Through Virtual Pipelines," IEEE/ACM Transactions on Networking, vol. 17, No. 4, Aug. 2009, pp. 1-13.
Zhang, Zhao et al., "A Permutation-based p. Interleaving Scheme to Reduce Row-buffer Conflicts and Exploit Data Locality," Microarchitecture, 2000. Micro-33. Proceedings. 33rd Annual IEEE/ACM International Symposium on, 2000, pp. 1-10.
Zhu, Zhichun et al., "Fine-grain Priority Scheduling on Multichannel Memory System," 8th International Symposium on High Performance Computer Architecture (HPCA-8), 2002, pp. 1-10.
Zheng, Hongzhong et al., "Mini-Rank: Adaptive DRAM Architecture for Improving Memory Power Efficiency," Microarchitecture, 2008. MICRO-41. 2008 41st IEEE/ACM International Symposium on, Nov. 2008, pp. 1-12.
Yoon, Hangin et al., "Row Buffer Locality-Aware Data Placement in Hybrid Memories," Safari Technical Report No. 2011-005, Sep. 5, 2011, pp. 1-17.
Intel Corporation, "PHY Interface for the PCI Express and USB 3.0 Architectures," Intel, 2009, pp. 1-48.
Kim, Jung-Sik et al., "A 1.2V 12.8GB/s 2Gb mobile Wide-I/O DRAM with 4x128 I/Os using TSV-based stacking," IEEE Xplore Digital Library, Feb. 2011, pp. 1-1.
Vardaman, E. Jan, "Applications for TSV and Issues for Adoption," TechSearch International, Inc. 2008, pp. 1-29.
Leibson, Steve, "Want to Know More About the Micron Hybrid Memory Cube (HMC)? How About its Terabit/sec Data Rate?," EDA360 Insider, Aug. 22, 2011, pp. 1-6.
Sperling, Ed, "Widening the Channels," EECatalog, May 17, 2011, pp. 1-3.
Kilbuck, Kevin, "Microsoft WinHEC," 2007, slides 1-36.
Donnay, Beth et al., "Common Electrical I/O, Building for the New Future," Optical Internetworking Forum, oiforum.com, pp. 1-6.
Yole Developpement, "Market Trends for 3d Stacking," Yole Developpement, Jun. 2007, pp. 1-28.
Ghosh, Mrinmoy et al., "Smart Refresh: An Enhanced Memory Controller Design for Reducing Energy in Conventional and 3D Die-Stacked DRAMs," Georgia Tech Dec. 2007, pp. 1-24.
Wehrle, Klaus, "Network Drivers," staroceans.org, pp. 1-19.
Hur, Ibrahim et al., "A Comprehensive Approach to DRAM Power Management," High Performance Computer Architecture, 2008. HPCA 2008. IEEE 14th International Symposium on, 2008 pp. 1-12.
Kumar, Amit et al., "Express Virtual Channels: Towards the Ideal Interconnection Fabric," University of California, Berkeley, 2007, pp. 1-12.
Antony, Joseph et al., "Exploring Thread and Memory Placement on NUMA Architectures: Solaris and Linux, UltraSPARC/FirePlane and Opteron/HyperTransport," Australian National University, High Performance Computing—HiPC, 2006, pp. 1-15.
Loh, Gabriel H., "Extending the Effectiveness of 3D-Stacked DRAM Caches with and Adaptive Multi-Queue Policy," Georgia Institute of Tech, Proceedings of the 42nd Annual IEEE/ACM International Symposium on Microarchitecture, Dec. 12, 2009, pp. 1-12.
"Direct Memory Access," maklunux.net, pp. 1-17.
Roberts, Eric, "Heap-Stack Diagrams," Stanford University, handout #25, Apr. 24, 2009, pp. 1-6.
Dally, William J. et al., "Route Packets, Not Wires: On-Chip Interconnection Networks," Stanford University, Design Automation Conference, 2001. Proceedings, 2001, pp. 1-6.
Carrier, "Weathermaker 8000—58WAV Gas Furnace," Carrier Corporation, 2001, pp. 1-2.
Carrier, "58ZAV Weathermaker 8000 Delux High-Efficiency Downflow/Horizontal Gas Furnace," Carrier Corporation, 1994, pp. 1-8.
Robertshaw, "Silicon Nitride Ignitors, 41-400N Series," Invensys plc., 2009, pp. 1-4.
Micron, "Designing for High-Density DDR2 Memory," Micron, 2005, pp. 1-10.
Kerr, Gregory, "Dissecting a Small InfiniBand Application Using the Verbs API," Northeastern University, May 24, 2011.
Chandrasekar, Karthik, "Improved Power Modeling of DDR SDRAMs," Digital System Design (DSD), 2011 14th Euromicro Conference on, Sep. 2011, pp. 1-10.
Intel, "Intel Xeon Processor E7 Family Uncore Performance Monitoring Programming Guide," Intel Corporation, Reference Number: 325294-001, Apr. 2011.
Duato, Jose et al., "Interconnection Networks, an Engineering Approach," 2003.
Peter Bannon, "EV7 Technology," HP Invent, 2003, pp. 1-75.
Akesson Benny, "An analytical model for a memory controller offering hard-real-time guarantees," Lund University, May 31, 2005.
Bohacik, Pavel et al., "MPC5121e Serial Peripheral Interface (SPI)," Freescale Semiconductor inc., 2009, pp. 1-38.
Liu Song, et al., "Flikker: Saving DRAM Refresh-power through critical Data Partitioning," Proceedings of the sixteenth international conference on Architectural support for programming languages and operating systems, 2011, pp. 1-12.
Coburn, Joel et al., "NV-Heaps: Making Persistent Objects Fast and Safe with Next-Generation, Non-Volatile Memories," University of California, 2011, pp. 1-13.
Cadence, "Clock Domain Crossing," Cadence, 2004, pp. 1-15.
Wikipedia, "Circular Buffer," Wikipedia, Dec. 27, 2011, pp. 1-16.
Krewell, Kevin, "Alpha EV7 Processor: A High-Performance Tradition Continues," In-StatMDR, Apr. 5, 2002, pp. 1-11.
Venkatesan, Ravi K. et al., "Retention-Aware Placement in DRAM (RAPID): Software Methods for Quasi-Non-Volatile DRAM," High-Performance Computer Architecture, 2006. The Twelfth International Symposium on, 2006, pp. 1-11.
Lu, Yen-Wen, "Computer Systems Laboratory," Stanford University, Department of Electrical Engineering, Technical Report No. CSL-TR-96-699, Jul. 1996, pp. 1-182.
Wu, Xiaoxia et al., "Cost-driven 3D Integration with Interconnect Layers," Proceedings of the 47th Design Automation Conference, 2010, pp. 1-6.
Lewis, David, "SerDes Architectures and Applications," DesignCon, Dave Lewis, National Semiconductor Corporation, 2004, pp. 1-14.
Guelah, Patrick, "Communicating with DMA Engines," Dec. 3, 2009, pp. 1-7.
National Semiconductor Corporation, "DP8390 Network Interface Controller: An Introductory Guide," May 1993, pp. 1-8.
Micron, "Various Methods of DRAM Refresh," Micron, 1999, pp. 1-4.
Sun, Hongbin et al., "3D DRAM Design and Application to 3D Application to 3D Multicore Systems," Design & Test of Computers, IEEE (vol. 26, Issue: 5), 2009, pp. 1-12.
Bhat, Balasubramanya et al., "Making DRAM Refresh predictable," NC State University, Real-Time Systems (ECRTS), 2010 22nd Euromicro Conference on, 2010, pp. 1-10.
Wilen, Adam H. et al., "Introduction to PCI Express, A Hardware and Software Developer's Guide," Intel Corporation, 2003, pp. 1-10.
Gross, Joseph G., "High-Performance DRAM System Design Constraints and Considerations," University of Mayland Thesis, 2010, pp. 1-175.
Scott, Steve et al., "The BlackWidow High-Radix Clos Network," 33rd International Symposium on Computer Architecture, 2006, pp. 1-12.

(56) References Cited

OTHER PUBLICATIONS

Sinha, Prokash, "Notes on High-performance NDIS Miniport-NIC Design," NDIS.com. Oct. 23, 2010, pp. 1-18.
Mattos, Paul J., "IBM Blue Logic PCI Express IP Solution," IBM May 13, 2003, pp. 1-26.
Intel, "Virtualization Technology for Directed I/O," Intel, Feb. 2011, pp. 1-152.
Yalamanchili, Sudhakar, "Interconnection Networks," Georgia Tech, 2003, pp. 1-40.
Intel, "Accelerating High-Speed Networking with Intel I/O Acceleration technology," Intel, 2006, pp. 1-8.
Intel, "Integrated Network Acceleration Features," Intel, Microsoft, 2008, pp. 1-12.
Wilkerson, Chris et al., "Reducing Cache Power with Low-Cost, Multi-bit Error-Correcting Codes," University of Wisconsin-Madison, Jun. 23, 2010, pp. 1-11.
Bock, Santiago et al., "Analyzing the Impact of Useless Write-Backs on the Endurance and Energy Consumption of PCM Main Memory," Performance Analysis of Systems and Software (ISPASS), 2011 IEEE International Symposium on, 2011, pp. 1-10.
Intel, "Intel Itanium Processor 9300 Series Reference Manual for Software Development and Optimization," Intel, Mar. 2010, pp. 1-276.
Azimi Mani, et al., "Flexible and Adaptive On-Chip Interconnects for Tera-Scale Architectures," Intel Technology Journal, 2009, pp. 1-18.
Stuecheli, Jeffery et al., "Elastic Refresh: Techniques to Mitigate Refresh Penalties in High Density Memory," Microarchitecture (MICRO), 2010 43rd Annual IEEE/ACM International Symposium on, 2010, pp. 1-10.
Larry Smith, "3D Enablement Center," Semantech, 2009, pp. 1-18.
Binkert, Nathan, "EE282 Lecture 9 Advanced I/O," Stanford University, 2010, pp. 1-29.
Lupon, Marc et al., "A Dynamically Adaptable Hardware Transactional Memory," Microarchitecture (MICRO), 2010 43rd Annual IEEE/ACM International Symposium on, 2010, pp. 1-12.
Wu, Cheng-Wen, "RAM Fault Models and Test Algorithms," National Tsing Hua University, 2003, pp. 1-57.
Sonics, "MemMax 2.0 Multi-threaded DRAM Access Scheduler DataSheet," Sonics, 2003, pp. 1-6.
Stuecheli, Jeffery, "Elastic Refresh: Techniques to Mitigate Refresh Penalties in High Density Memory," University of Texas at Austin, Dec. 7, 2010, pp. 1-21.
Kim, Jangwoo et al., "Multi-bit Error Tolerant Caches Using Two-Dimensional Error Coding," Proceedings of the $40^{th}$ Annual ACM/IEEE International Symposium on Microarchitecture (MICRO-40), 2007, pp. 1-13.
Kim, John, "Low-Cost Router Microarchitecture for On-Chip Networks," Microarchitecture, 2009. MICRO-42. 42nd Annual IEEE/ACM International Symposium on, 2009, pp. 1-12.
Ghosh, Mrinmoy et al., "Smart Refresh: An Enhanced Memory Controller Design for Reducing Energy in Conventional and 3D Die-Stacked DRAMs," Microarchitecture, 2007. MICRO 2007. 40th Annual IEEE/ACM International Symposium on, 2007, pp. 1-12.
Mullins, Robert et al., "Low-Latency Virtual-Channel Routers for On-Chip Networks," University of Cambridge, Mar. 2005, pp. 1-10.
Mutlu, Onur et al., "Parallelism—Aware Batch Scheduling, enhancing both Performance and Fairness of Shared DRAM Systems," Microsoft Research, 2008, pp. 1-36.
"Multi-Core Systems" pp. 1-30.
Thomadakis, Michael E., "The Architecture of the Nehalem Processor and Nehalem-EP SMP Platforms," Texas A&M University, Mar. 17, 2011.
Kaminski, Patryk, "NUMA aware heap memory manager," 2009, pp. 1-16.
Carrier, "Induced-Combustion Gas Furnace," Carrier Incorporated, 2000 pp. 1-12.
Hill, Mark, "On-Chip Networks," Morgan and claypool, 2009, pp. 1-141.
Bloom, Burton H., "Space/Time Trade-offs in Hash Coding with Allowable Errors," Communications of the ACM, Jul. 1, 1970, pp. 1-5.
Budruk, Ravi et al., "PCI Express System Architecture, $9^{th}$ pringin" Mindshare, 2003, pp. 1-222.
Budruk, Ravi et al., "PCI Express System Architecture, $2^{nd}$ printing" Mindshare, 2003, pp. 1-222.
Synopsys, "Designware PCI Express Endpoint Controller," Synopsys Inc., 2003, pp. 1-160.
PCI Express, "Base Specification," PCI-SIG, Mar. 28, 2005, pp. 1-508.
PCI Express, "Base Specification, revision" PCI-SIG, Mar. 15, 2004, pp. 1-508.
PCI Express, "Base Specification, revision" PCI-SIG, Apr. 15, 2003, pp. 1-508.
Ajanovic, Jasmin, "PCI Express Protocol Overview Part 1," PCI Express, 2002, pp. 1-59.
Levinthal David, "Performance Analysis Guide for Intel Core i7 Processor and Intel Xeon 5500 Processors," Performance Analysis Guide, 2009, pp. 1-72.
"PHY Interface for the PCI Express Architecture," Intel Corporation, 2007, pp. 1-38.
Li, Yanjing et al., "Power Utilization Techniques with Links of Interconnection Networks," PennState Univeristy, pp. 1-11.
Akesson, Benny et al., "Predator: A Predictable Sdram Memory Controller," Hardware/Software Codesign and System Synthesis (CODES+ISSS), 2007 5th IEEE/ACM/IFIP International Conference on, Oct. 2007, pp. 1-6.
Akesson, Benny, "Predictable and Composable System-on-Chip Memory Controllers," Feb. 24, 2010, pp. 1-244.
James, William et al., "Principles and practices of Interconnection Networks," Wlsevier Inc., 2004, pp. 1-581.
"QuickBooks Online Import Guide," bestagentbusiness.wikispaces.com, Nov. 2, 2011, pp. 1-3.
Intel "Overview of Intel Quickpath Interconnect System Initialization," Techonline.com, 2009, pp. 1-13.
Intel "QuickData Technology Software Guide for Linux," Intel, May 2008, pp. 1-7.
Safranek, Robert et al., "Intel QuickPath Interconnect Overview," Intel, 2009, pp. 1-26.
Raghuraman, Arvind, "Walking, Marching and Galloping Patterns for Memory Tests," VLSI Testin—Term Paper, pp. 1-8.
Riedel, Mark et al., "Fault Coverage Analysis of RAM Test Algorithms," Ramflt, May 1995 pp. 1-20.
Ayala, Alejandro, "Dynamic Interconnection Networks: The Crossbar Switch," University of Ottawa, pp. 1-4.
Deri, Luca, "Improving Passive Packet Capture: Beyond Device Polling," University of Pisa, 2003, pp. 1-12.
Dandamudi, Sivarama P., "Reducing Run Queue Contention in Shared Memory Multiprocessors," Computer (vol. 30, Issue: 3), 1997, pp. 1-8.
Kane, Lerie et al., "Take the Lead with Jasper Forest, the Future Intel Xeon Processor for Embedded and Storage," Intel, Jul. 27, 2009, pp. 1-32.
Schroeder, Bianca et al., "DRAM Errors in the Wild: A Large-Scale Field Study," University of Toronto, Jul. 19, 2009, pp. 1-12.
Intel, "Intel 64 and IA-32 Architectures Software Developer's Manual, System Programming Guide, Part 2," Intel, Jun. 2015, pp. 1-554.
Minh, Chi Cao, "Designing an Effective Hybrid Transactional Memory System," Dissertation at Stanford University, pp. 1-148.
Wu, Wenji et al., "Linux Kernel Issues in End Host Systems," US-LHC End-to-End Networking Meeting Fermi National Accelerator Lab, 2006, pp. 1-24.
"The JEDEC "DDR4" Using the TSV and "3DS" a clearer overview of memory technology," Investor Village, Nov. 7, 2011 pp. 1-8.
Titos-Gil, Ruben et al., "ZEBRA: A Data-Centric, Hybrid-Policy Hardware Transactional Memory Design," Proceedings of the international conference on Supercomputing, May 31, 2011, pp. 1-10.
Titos Gil, Jose Ruben, "Tecnicas Hardware para Sistemas de Memoria Transaccional de Alto Rendimiento en Precesadores Multinucleo," Proceedings of the international conference on Supercomputing, Sep. 2011, pp. 1-230.

(56) References Cited

OTHER PUBLICATIONS

Ramadan, Hany E. et al., "MetaTM/TxLinus: Transactional Memory for an Operating System," Micro, IEEE (vol. 28, Issue: 1), 2008, pp. 1-10.
Intel Corporation, "The Uncore: A Modular Approach to Feeding the High-Performance Cores," Intel Corporation, 2011, pp. 1-23.
"Weak Memory Models are a Strong Reminder for Programmers to use Synchronization Primitives" NYU Poytechnic School of Engineering, pp. 1-3.
Couch, Forrest, "Xcell Journal," Issue 50, Xilinx, 2004, pp. 1-116.
Intel, "Intel Xeon Processor E7-8800/4800/2800 Product Families," Intel, Apr. 2011, pp. 1-50.
Lee, Kangmin et al., "A Distributed Crossbar Switch Scheduler for On-Chip Networks," Custom Integrated Circuits Conference, 2003. Proceedings of the IEEE, Sep. 2003, pp. 1-4.
Olesinski, Wladek et al., "Simple Fairness Protocols for Daisy Chain Interconnects," High Performance Interconnects, 2009. HOTI 2009. 17th IEEE Symposium on, Aug. 2009, pp. 1-9.
Eddington, Chris, "InfiniBridege: An Integrated InfiniBand Switch and Channel Adapter," Mellanox Technologies inc., 2001, pp. 1-22.
Seifert, Friedrich et al., "Reliably Locking System V Shared Memory for User Level Communication in Linux," Cluster Computing, 2001. Proceedings. 2001 IEEE International Conference on, Oct. 11, 2001, pp. 1-8.
Boughton, G. Andrew, "Arctic Routing Chip," Laboratory for Computer Science, Massachusetts Institute of Technology, Mar. 7, 1994, pp. 1-10.
Shao, Jun et al., "The Bit-reversal SDRAM Address Mapping," Michigan Technological University, SCOPES '05 Proceedings of the 2005 workshop on Software and compilers for embedded systems, Sep. 29, 2005, pp. 1-8.
Delgado-Frias, Jose G. et al., A VLSI Crossbar Switch with Wrapped Wave Frond Arbitration, IEEE Transactions on Circuits and Systems-I: Fundamental Theory and Applications, vol. 50, No. 1, Jan. 2003, pp. 1-7.
Micron, "TN-04-54: High-Speed DRAM Controller Design Introduction," Micron, 2008, pp. 1-25.
Micron, "TN-47-16 Designing for High-Density DDR2 Memory Introduction," Micron technologies, 2005, pp. 1-10.
Mhamdi, Lotfi et al., "MCBF: A High-Performance Scheduling Algorithm for Buffered Crossbar Switches," IEEE Communications Letters, vol. 7, No. 9, Sep. 2003, pp. 1-3.
Mhamdi, Lotfi et al., "High-performance switching based on buffered crossbar fabrics," Science Direct, Jul. 28, 2004, pp. 1-15.
Intel, "Intel® 6400/6402 Advanced Memory Buffer," Intel, Oct. 2006, pp. 250.
AMD, "Bios and kernel Developer's Guide (BKDG) for AMD Family 11h Processors," advanced Micro Devices, AMD Family 11h Processor BKDG, Jul. 7, 2008, pp. 1-265.
AMD, "BBIOS and Kernel Developer's Guide (BKDG) for AMF Family 15h Models 00h-0Fh Processors," Advanced Micro Devices, BKDG for AMD Family 15h Models 00h-0Fh Processors, Nov. 14, 2011, pp. 1-628.
USPTO, "Issue Notification for U.S. Appl. No. 12/429,310," Mosaid Technologies Incorporated, Feb. 22, 2011, pp. 1-181.
Ranjit, Neethu, "Infiniband, CS 708 Seminar," college of Engineering Kottarakkara, Oct. 16, 2008, pp. 1-44.
Cswitch, "CS90 Configurable Switch Array Family," Switch, Oct. 24, 2008, pp. 1-20.
Chrysos, Nikos et al., "Practical High-throughput Crossbar Scheduling," Published by the IEEE Computer Society, 2009, pp. 1-14.
Amd, "AMD-751 System Controller data Sheet," Publication # 21910, Mar. 2000, pp. 1-236.
Waldecker, Brian, "AMD Quad Core Processor Overview," AMD, Jul. 30, 2007 pp. 1-25.
AMD, "AMD Opteron Processors," AMD, Sep. 5, 2010, slides 1-36.
Conway, Pat et al., "The AMD Opteron Northbridge Architecture," IEEE Computer Society, 2000 pp. 1-12.
Tamir, Yuval et al., "Symmetric Crossbar Arbiters for VLSI Communication switches," IEEE Transactions on Parallel and Distributed systems, vol. 4, No. 1, 1999, pp. 1-15.
Turner, Jonathan et al., "Architectural Choices in Large Scale ARM Switches," Washington University, May 1, 1997, pp. 1-28.
Bentley, Bob, "Simulation-driven verification," Intel, Design Automation Summer School, 2009, pp. 1-23.
Waldecker, Brian, "Architecture of the AMD Quad Core CPUs," AMD, Apr. 13, 2009, pp. 1-34.
HP, "Using Infiniband for a Scalable Compute Infrastructure," Technology Brief, 4th edition, 2010, pp. 1-12.
Wikipedia, "Cache coherence," Wikipedia Nov. 28, 2011, pp. 1-2.
Beeraka, Parag, "Maintaining Cache Coherency with AMD Opteron Processors using FPGA's," AMD, Feb. 11, 2009, pp. 1-28.
Wikipedia, "Clos network," Wikipedia, Dec. 14, 2011, pp. 1-5.
Mellor-Crummey, John, "Parallel Computing Platforms, Network Topologies," Rice University Comp 422, Feb. 17, 2011, pp. 1-49.
PG_MediaWiki "CSC/ECE 506 Spring 2011/ch8 mc," PG_MediaWiki, Apr. 17, 2011, pp. 1-10.
I-Cube, "IQ Family Data Sheet," I-Cube, Jan. 1999, 1-30.
"IQ Family Architecture," IQ, Jan. 1997, pp. 1-57.
Litz, Heiner Hannes, "Improving the Scalability of High Performance Computer Systems," Universitat Mannheim, 2010, pp. 1-196.
Becker, Daniel U. et al., "Allocator implementations for network-on-Chip Routers," High Performance Computing Networking, Storage and Analysis, Proceedings of the Conference on, Nov. 2009, pp. 1-12.
Jerger, Natalie Enright et al., "Virtual Circuit Tree Multicasting: A Case for On-Chip Hardwar Multicast Support," Jun. 2008, pp. 1-12.
Shin, Eung S. "Automated Generation of Round-robin Arbitration and Crossbar Switch Logic," Georgia Institute of Technology, Dec. 2, 2004, pp. slides 1-63.
Suato, J. et al., "Extending HyperTransport Protocol for Improved Scalability," Feb. 9, 2009, pp. 1-37.
Wikipedia, "Fully Buffered DIMM," Wikipedia, Sep. 9, 2011, pp. 1-4.
Conway, Pat et al., "The AMD Opteron CMP NorthBridge Architecture: Now and in the Future," AMD, Aug. 2006, pp. 1-30.
Safranek, Robert, "Intel QuickPath Interconnect Overview," Intel, 2009, pp. 1-27.
Hypertransport Consortium, "HyperTransport High Node Count System-Wide Resource-Sharing," HyperTransport Consortium, 2010, pp. 1-24.
Duato, J. et al., "Scalable Computing: Why and How," HyperTransport Consortium, Mar. 7, 2010, pp. 1-14.
Aggarwal, Nidhi et al., "Power-Efficient DRAM Speculation," High Performance Computer Architecture, 2008. HPCA 2008. IEEE 14th International Symposium on, 2008, pp. 1-12.
Tang, Dan et al., "DMA Cache: Using On-Chip Storage to Architecturally Separate I/O Data from CPU Data for Improving I/O Performance," High Performance Computer Architecture (HPCA), 2010 IEEE 16th International Symposium on, Jan. 2010, pp. 1-12.
Yoshigoe, K. et al., "A Parallel-Polled Virtual Output Queued Switch with a Buffered Crossbar," University of South Florida, High Performance Switching and Routing, 2001 IEEE Workshop on, May 2001, pp. 1-5.
Olesinski, Wladek et al., "PWWFA: The Parallel Wrapped Wave Front Arbiter for Large Switches," IEEE Workshop on High Performance Switching and Routing, New York, May 30-Jun. 1, 2007, pp. 1-6.
Hypertransport Consortium, "HyperTransport I/O Link Specification," HyperTransport Technology Consortium, Jun. 5, 2010, pp. 1-443.
Holden, Brian et al., "HyperTransport 3.1 Interconnect Technology," MindShare Technology Series, Mindshare Press, 2008, pp. 1-30.
Spratt, Rick, "HyperTransport Error Management," Sun Microsystems Inc., Platform Conference, 2001, pp. 1-30.
Hypertransport Consortium, "HyperTransport Technology, The Potimized Board-level Architecture," Hypertransport Consortium, Apr. 2004.

(56) References Cited

OTHER PUBLICATIONS

Hypertransport Technology Consortium, "HyperTransport I/O Lind Specification," HyperTransport Technology Consortium, Mar. 24, 2005 pp. 1-325.
Sartori, Gabriele, "HyperTransport Technology Overview and Consortium Announcement," AMD, Platform Conference, 2001, pp. 1-19.
Budrik, Ravi et al., "HyperTransport Technology: A Tutorial," Platform Conference, Mindshare, Platform Conference 2002, pp. 1-64.
Anderson Don et al., "HyperTransport System Architecture," MindShare Inc., 2003, pp. 1-586.
Hurt, James et al., "Design and implementation of High-Speed Symmetric Crossbar Schedulers," University of California, Communications, 1999. ICC '99. 1999 IEEE International Conference on (vol. 3), Jun. 1999.
Bhagwan, Ranjita et al., "Design of a High-Speed Packet Switch with Fine-Grained Quality-of-Service Guarantees," Communications, 2000. ICC 2000. 2000 IEEE International Conference on, Jun. 2000, pp. 1-5.
Wang, Huangon et al., "An Enhanced HyperTransport Controller with Cache Coherence Support for Multiple-CMP," IEEE Xplore Digital Library, Jul. 2009, pp. 1-1.
Chuang, Shang-Tse et al., "Practical Algorithms for Performance Guarantees in Buffered Crossbars," INFOCOM2005. 24th Annual Joint Conference of the IEEE Computer and Communications Societies. Proceedings IEEE (vol. 2), Nov. 25, 2008, pp. 1-11.
Grun, Paul, "Introduction to InfiniBand for End Users," InfiniBand Trade Association, 2010, pp. 1-54.
Yoshigoe, Kenji et al., "The RR/RR CICQ Switch: Hardware Design for 10-Gbps Link Speed," Performance, Computing, and Communications Conference, 2003. Conference Proceedings of the 2003 IEEE International, Apr. 2003, pp. 1-5.
Jedec, "FBDIMM Specification: High Speed Differencial PTP Link at 1.5 V," JEDEC Standard, Mar. 2008, pp. 1-68.
Jedec, "FBDIMM Advanced Memory Buffer (AMB)," JEDEC Standard, Mar. 2009, pp. 1-198.
Jedec, "FBDIMM Specification: DDR2 SDRAM Fully Buffered DIMM (FBDIMM) Design Specification," Jedec Standard, Mar. 2007, pp. 1-129.
Ros, Alberto et al., "Overcoming the Scalability Constraints of Coherence Protocols of Commodity Systems," 2011, pp. 1-6.
Advanced Micro Devices, "HyperTransport Technology I/O Link, A High-Bandwidth I/O Architecture," Advanced Micro Devices inc., HyperTransport Technology I/O Link, Jul. 20, 2011, pp. 1-25.
Advanced Micro Devices, "AMD Eight-Generation Processor Architecture," AMD Eighth-Generation Processor Architecture, Oct. 16, 2001, pp. 1-10.
Koontz, Michael, "Comparison of High Performance Northbridge Architectures in Multiprocessor Servers," George Mason University, Apr. 16, 2008, pp. 1-37.
Yoshigoe, Kenji et al., "Design and Evaluation of the Combined Input and Crossbar Queued (CICQ) Switch," Dissertation, University of South Florida, Aug. 9, 2004, pp. 1-173.
IBM, "Cell Architecture," IBM, Jun. 4, 2006, pp. 1-43.
Minkenberg, Cyriel et al., "Low-Latency Pipelined Crossbar Arbitration," Global Telecommunications Conference, 2004. GLOBECOM '04. IEEE (vol. 2), 2005, pp. 1-7.
"Memory Controller References," 2005, pp. 1-1.
Ghosh, Mrinmoy et al., "Smart Refresh: An Enhanced Memory controller design for Reducing Energy in Conventional and 3D Die-Stacked DRAMs," Microarchitecture, 2007. MICRO 2007. 40th Annual IEEE/ACM International Symposium on, Dec. 2007, pp. 1-12.
Kaseridis, Dimitris et al., "Minimalist Open-page. A DRAM Page-mode Scheduling Policy for the Many-core Era," University of Texas at Austin, 2011, pp. 1-12.
Numascale, "Numaconnect True Shared Memory for Clusters," Numascale, Oct. 2010, pp. 1-28.
Conway, Pat et al., "Cache Hierarchy and Memory Subsystem of the AMD Opteron Processor," Published by the IEEE Computer Society, 2010, pp. 1-14.
Chang, Cheng-Shang, "Load Balanced Birkhoff-von Newmann Switches, Part 2: Multi-Stage Buffering," National Tsing Hua University, 2001, pp. 1-18.
Lowe, Mike, PCI-X Mode 2 to Hyper Transport Bridge, AMD, PCI-SIG, 2004, pp. 1-27.
Ayala, Alejandro, "Dynamic interconnection networks: the crossbar switch," uOttawa School for Electrical Engineering and Computer Science, pp. 1-4.
Ros Alberto et al., "EMC: Extending Magny-Cours Coherence for Large-Scale Servers," High Performance Computing (HiPC), 2010 International Conference on, Dec. 2010, pp. 1-10.
McKeown, Nick et al., "The Tiny Tera: A Packet Switch Core," Stanford University, 1995 pp. 1-13.
Eadline, Douglas, "SMP Redux: You Can Have it All," Numascale, 2010, pp. 1-8.
Heirich, Alan et al., "ServerNet-2: a Reliable Interconnect for Scalable High Performance Cluster Computing," Penn State, Sep. 21, 1998, pp. 1-24.
Galles, Mike, "Spider: A High-Speed Network Interconnect," Silicon Graphics Computer Systems, IEEE Micro, 1997, pp. 1-6.
Texas Intruments, "TMS320DM646x DMSoC DDR2 Memory Controller," Texas Intruments, Mar. 2011, pp. 1-52.
Spratt, Rick, "HyperTransport Error Management," Sun Microsystems, Platform Conference, 2001, pp. 1-30.
Scott, Steven L. et al., "The Cray T3E Network: Adaptive Routing in a High Performance 3D Torus," Cray Research Inc., Aug. 1996, pp. 1-10.
Intel Corp, "The Architecture of the Intel QuickPath Interconnect," Dr. Dobbs, 2009, pp. 1-13.
Intel Technology Group, "The Feeding of High-performance Processor Cores-Quickpath Interconnects and the New I/O Hubs," Intel Technology Journal, 2010, pp. 1-18.
Micron, "TN-47-21: FBDIMM—Channel Utilization (Bandwidth and Power)," Micron, 2006, pp. 1-23.
Zheng, Hongzhong et al., "Decoupled DIMM: Building High-Bandwidth Memory System Using Low-Speed DRAM Devices," Proceedings of the 36th annual international symposium on Computer architecture, Jun. 20, 2009, pp. 1-12.
Vernon, Mary K. et al., "Fairness Analysis of Multiprocessor Bus Arbitration Protocols," Computer Science Technical Report #744, Sep. 1988.
Suh, Taeweon "Integration and Evaluation of Cache Coherence Protocols for Multiprocessor SOCS," Thesis, Georgia Institute of Technology, Dec. 2006, pp. 1-153.
Xilinx, "Spartan-6 FPGA Memory Controller," User Guide, XILINX Aug. 9. 2010, pp. 1-66.
Intel, "The Uncore: A Modular Approach to Feeding the High-Performance Cores," 2011, pp. 1-23.
Gopalakrishnan, Ganesh, "Some Unusual Micropipeline Circuits," University of Utah Department of Computer Science, University of Utah, Dec. 11, 1993, pp. 1-17.
Shojania, Hassan, "Virtual Interface Architecture (VIA)," 2003, pp. 1-40.
Froning, Holger et al., "1$^{st}$ International Workshop on HyperTransport Research and Applications," Feb. 12, 2009, pp. 1-10.
Froning, Holger et al., "1$^{st}$ International Workshop on HyperTransport Research and Applications 2," Feb. 12, 2009, pp. 1-10.
Duato, J. et al., "Extending HyperTransport Protocol for Improved Scalability," First International Workshop on HyperTransport Research and Applications, First International Workshop on HyperTransport Research and Applications (WHTRA2009), Feb. 12, 2009, pp. 1-8.
Altera, "The Evolution of High-Speed Transceiver Technology," Altera, Nov. 2002, pp. 1-15.
Kagan, Michael, "10 Virtualization with InfiniBand," Mellanox Technologies, Apr. 2005, pp. 1-18.

* cited by examiner

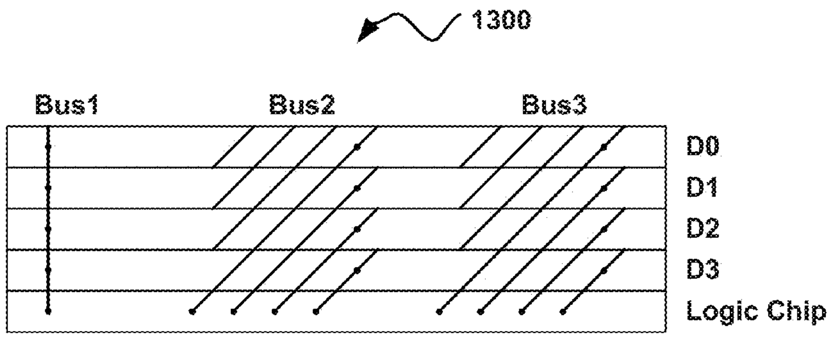
(a)
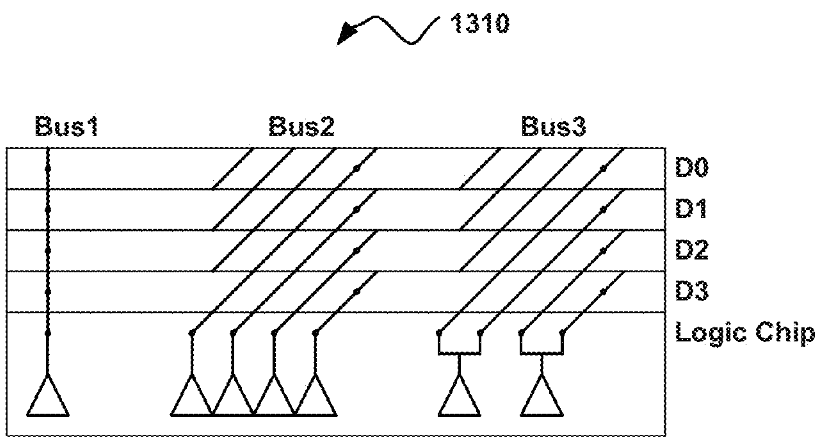
(b)
FIGURE 13

| | C1 | R1 | C2 | R2 |
|---|---|---|---|---|
| Thread 1 Read 1.0 | T1R1.0 | 1 | T1R1.0 | 1 |
| Thread 1 Write 1.0 | T1W1.0 | 2 | T1W1.1 | 2 |
| | T2W1.0 | 3 | T1W1.0 | 2 |
| | T1W1.1 | 2 | T2W1.0 | 3 |
| | T2W2.0 | 3 | T2W2.0 | 3 |
| | T2W2.1 | 3 | T2W2.1 | 3 |
| | T2W2.1 | 3 | T2W2.1 | 3 |

Reorder

Command Stream 1 — Resource Stream 1 — Command Stream 2 — Resource Stream 2

| Tx Stream | | Rx Stream | |
|---|---|---|---|
| ID | Request | ID | Response |
| 1 | Transaction 1.1 Operation 1.1 | | |
| 2 | Write 1.1 | | |
| 3 | Transaction 1.1 Operation 1.2 | | |
| 4 | Write 1.2 | | |
| 5 | Read 1.1 | 5 | Read 1.1 Completion |
| 6 | Write 1.3 | | |
| 7 | Transaction 2.1 Operation 1.1 | 3 | Transaction 1.1 Completion |
| | | 2 | Write 1.1 Completion |

| ID | Request | Subregions |
|---|---|---|
| 1 | Read | 0, 16, 32, 48 |
| 2 | Write | 4, 20, 36, 52 |
| 3 | Read | 5, 21, 37, 53 |
| 4 | Write | 1, 17, 33, 49 |
| 5 | Write | 1, 17, 33, 49 |

23-600

Read Request

| | | | |
|---|---|---|---|
| 00 | HeaderRTx.0 | HeaderRTx.1 | 15 |
| 16 | HeaderRTx.2 | HeaderRTx.3 | 31 |
| 32 | AddressR.0 | AddressR.1 | 47 |
| 48 | AddressR.2 | AddressR.3 | 63 |
| 64 | AddressR.4 | AddressR.5 | 79 |
| 80 | AddressR.6 | AddressR.7 | 95 |
| 96 | CRCRTx.0 | CRCRTx.1 | 111 |
| 112 | CRCRTx.2 | CRCRTx.3 | 127 |

FIGURE 23-6A 23-620

Read Response

| | | | |
|---|---|---|---|
| 00 | HeaderRRx.0 | HeaderRRx.1 | 15 |
| 16 | HeaderRRx.2 | HeaderRRx.3 | 31 |
| 32 | HeaderRRx.4 | HeaderRRx.5 | 47 |
| 48 | HeaderRRx.6 | HeaderRRx.7 | 63 |
| 64 | HeaderRRx.8 | HeaderRRx.9 | 79 |
| 80 | HeaderRRx.10 | HeaderRRx.11 | 95 |
| 96 | DataR.0 | DataR.1 | 111 |
| | ⋮ | | |
| 350 | DataR.30 | DataR.31 | 351 |
| 366 | CRCRRx.0 | CRCRRx.1 | 381 |
| 382 | CRCRRx.2 | CRCRRx.3 | 383 |

FIGURE 23-6B 23-640

Write Request

| | | | |
|---|---|---|---|
| 00 | HeaderW.0 | HeaderW.1 | 15 |
| 16 | HeaderW.2 | HeaderW.3 | 31 |
| 32 | AddressW.4 | AddressW.5 | 47 |
| 48 | AddressW.6 | AddressW.7 | 63 |
| 64 | AddressW.8 | AddressW.9 | 79 |
| 80 | AddressW.10 | AddressW.11 | 95 |
| 96 | DataW.0 | DataW.1 | 111 |
| | ⋮ | | |
| 350 | DataW.30 | DataW.31 | 351 |
| 366 | CRCW.0 | CRCW.1 | 381 |
| 382 | CRCW.2 | CRCW.3 | 383 |

FIGURE 23-6C 23-800

Read/Write Request

| | | | |
|---|---|---|---|
| 00 | HeaderRW | AddressRW.0.1 | 15 |
| 16 | AddressRW.1.1 | AddressRW.2.1 | 31 |
| 32 | AddressRW.3.1 | AddressRW.0.2 | 47 |
| 48 | AddressRW.1.2 | AddressRW.2.2 | 63 |
| 64 | AddressRW.3.2 | CRCRW | 79 |

Read Response

| | | | |
|---|---|---|---|
| 00 | HeaderRRx | DataR.0 | 15 |
| 16 | DataR.1 | DataR.2 | 31 |
| 32 | DataR.3 | DataR.4 | 47 |
| 48 | DataR.5 | DataR.6 | 63 |
| 64 | DataR.7 | CRCRRx | 79 |

Write Data Request

| | | | |
|---|---|---|---|
| 00 | HeaderW | DataW.0 | 15 |
| 16 | DataW.1 | DataW.2 | 31 |
| 32 | DataW.3 | DataW.4 | 47 |
| 48 | DataW.4 | DataW.6 | 63 |
| 64 | DataW.7 | CRCW | 79 |

| | | | | | | | | |
|---|---|---|---|---|---|---|---|---|
| 00 | 00 | 01 | 01 | 02 | 02 | 03 | 03 | time slot t0 |
| 04 | 04 | 05 | 05 | 06 | 06 | 07 | 07 | t1 |
| 08 | 08 | 09 | 09 | 10 | 10 | 11 | 11 | t2 |
| 12 | 12 | 13 | 13 | 14 | 14 | 15 | 15 | t3 |
| 00 | 00 | 01 | 01 | 02 | 02 | 03 | 03 | t4 |
| 04 | 04 | 05 | 05 | 06 | 06 | 07 | 07 | t5 |
| 08 | 08 | 09 | 09 | 10 | 10 | 11 | 11 | t6 |
| 12 | 12 | 13 | 13 | 14 | 14 | 15 | 15 | t7 |

⋮

| FIFO A | FIFO B |
|---|---|
| 0001 | 0010 |
| 0011 | 1000 |
| 1001 | 0110 |
| 1101 | |

SYSTEM, METHOD, AND COMPUTER PROGRAM PRODUCT FOR IMPROVING MEMORY SYSTEMS

RELATED APPLICATIONS

The present application claims priority to U.S. Provisional Application No. 61/569,107, titled "SYSTEM, METHOD, AND COMPUTER PROGRAM PRODUCT FOR IMPROVING MEMORY SYSTEMS," filed Dec. 9, 2011, U.S. Provisional Application No. 61/580,300, titled "SYSTEM, METHOD, AND COMPUTER PROGRAM PRODUCT FOR IMPROVING MEMORY SYSTEMS," filed Dec. 26, 2011, U.S. Provisional Application No. 61/585,640, titled "SYSTEM, METHOD, AND COMPUTER PROGRAM PRODUCT FOR IMPROVING MEMORY SYSTEMS," filed Jan. 11, 2012, U.S. Provisional Application No. 61/602,034, titled "SYSTEM, METHOD, AND COMPUTER PROGRAM PRODUCT FOR IMPROVING MEMORY SYSTEMS," filed Feb. 22, 2012, U.S. Provisional Application No. 61/608,085, titled "SYSTEM, METHOD, AND COMPUTER PROGRAM PRODUCT FOR IMPROVING MEMORY SYSTEMS," filed Mar. 7, 2012, U.S. Provisional Application No. 61/635,834, titled "SYSTEM, METHOD, AND COMPUTER PROGRAM PRODUCT FOR IMPROVING MEMORY SYSTEMS," filed Apr. 19, 2012, U.S. Provisional Application No. 61/647,492, titled "SYSTEM, METHOD, AND COMPUTER PROGRAM PRODUCT FOR CONFIGURING A SYSTEM ASSOCIATED WITH MEMORY," filed May 15, 2012, U.S. Provisional Application No. 61/665,301, titled "SYSTEM, METHOD, AND COMPUTER PROGRAM PRODUCT FOR ROUTING PACKETS OF DATA," filed Jun. 27, 2012, U.S. Provisional Application No. 61/673,192, titled "SYSTEM, METHOD, AND COMPUTER PROGRAM PRODUCT FOR REDUCING A LATENCY ASSOCIATED WITH A MEMORY SYSTEM," filed Jul. 18, 2012, U.S. Provisional Application No. 61/679,720, titled "SYSTEM, METHOD, AND COMPUTER PROGRAM PRODUCT FOR PROVIDING CONFIGURABLE COMMUNICATION PATHS TO MEMORY PORTIONS DURING OPERATION," filed Aug. 4, 2012, U.S. Provisional Application No. 61/698,690, titled "SYSTEM, METHOD, AND COMPUTER PROGRAM PRODUCT FOR TRANSFORMING A PLURALITY OF COMMANDS OR PACKETS IN CONNECTION WITH AT LEAST ONE MEMORY," filed Sep. 9, 2012, and U.S. Provisional Application No. 61/714,154, titled "SYSTEM, METHOD, AND COMPUTER PROGRAM PRODUCT FOR CONTROLLING A REFRESH ASSOCIATED WITH A MEMORY," filed Oct. 15, 2012, all of which are incorporated herein by reference in their entirety for all purposes.

CROSS-REFERENCE TO RELATED APPLICATIONS

This application comprises a plurality of sections. Each section corresponds to (e.g. be derived from, be related to, etc.) one or more provisional applications, for example. If any definitions (e.g. specialized terms, examples, data, information, etc.) from any section may conflict with any other section for any purpose (e.g. prosecution, claim support, claim interpretation, claim construction, etc.), then the definitions in each section shall apply to that section.

FIELD OF THE INVENTION AND BACKGROUND

Embodiments in the present disclosure generally relate to improvements in the field of memory systems.

BRIEF SUMMARY

A system, method, and computer program product are provided for a memory system. The system includes a first semiconductor platform including at least one first circuit, and at least one additional semiconductor platform stacked with the first semiconductor platform and including at least one additional circuit.

BRIEF DESCRIPTION OF THE SEVERAL VIEWS OF THE DRAWINGS

So that the features of various embodiments of the present invention can be understood, a more detailed description, briefly summarized above, may be had by reference to various embodiments, some of which are illustrated in the accompanying drawings. It is to be noted, however, that the accompanying drawings illustrate only embodiments and are therefore not to be considered limiting of the scope of the various embodiments of the invention, for the embodiment (s) may admit to other effective embodiments. The following detailed description makes reference to the accompanying drawings that are now briefly described.

FIG. 19-2 shows a flexible I/O circuit system, in accordance with another embodiment.

FIG. 19-3 shows a TSV matching system, in accordance with another embodiment.

FIG. 19-4 shows a dynamic sparing system, in accordance with another embodiment.

FIG. 19-5 shows a subbank access system, in accordance with another embodiment.

FIG. 19-6 shows a crossbar system, in accordance with another embodiment.

FIG. 19-7 shows a flexible memory controller crossbar, in accordance with another embodiment.

FIG. 19-8 shows a basic packet format system, in accordance with another embodiment.

FIG. 19-9 shows a basic logic chip algorithm, in accordance with another embodiment.

FIG. 19-10 shows a basic address field format for a memory system protocol, in accordance with another embodiment.

FIG. 19-11 shows an address expansion system, in accordance with another embodiment.

FIG. 19-12 shows an address elevation system, in accordance with another embodiment.

FIG. 19-13 shows a basic logic chip datapath for a logic chip in a stacked memory package, in accordance with another embodiment.

FIG. 19-14 shows a stacked memory chip data protection system for a stacked memory chip in a stacked memory package, in accordance with another embodiment.

FIG. 19-15 shows a power management system for a stacked memory package, in accordance with another embodiment.

FIG. 20-1 shows an apparatus including a plurality of semiconductor platforms, in accordance with one embodiment.

FIG. 20-2 shows a stacked memory system using cache hints, in accordance with another embodiment.

FIG. 20-3 shows a test system for a stacked memory package, in accordance with another embodiment.

FIG. 20-4 shows a temperature measurement system for a stacked memory package, in accordance with another embodiment.

FIG. 20-5 shows a SMBus system for a stacked memory package, in accordance with another embodiment.

FIG. 20-6 shows a command interleave system for a memory subsystem using stacked memory chips, in accordance with another embodiment.

FIG. 20-7 shows a resource priority system for a stacked memory system, in accordance with another embodiment.

FIG. 20-8 shows a memory region assignment system, in accordance with another embodiment.

FIG. 20-9 shows a transactional memory system for stacked memory system, in accordance with another embodiment.

FIG. 20-10 shows a buffer IO system for stacked memory devices, in accordance with another embodiment.

FIG. 20-11 shows a Direct Memory Access (DMA) system for stacked memory devices, in accordance with another embodiment.

FIG. 20-12 shows a copy engine for a stacked memory device, in accordance with another embodiment.

FIG. 20-13 shows a flush system for a stacked memory device, in accordance with another embodiment.

FIG. 20-14 shows a power management system for a stacked memory package, in accordance with another embodiment.

FIG. 20-15 shows a data merging system for a stacked memory package, in accordance with another embodiment.

FIG. 20-16 shows a hot plug system for a memory system using stacked memory packages, in accordance with another embodiment.

FIG. 20-17 shows a compression system for a stacked memory package, in accordance with another embodiment.

FIG. 20-18 shows a data cleaning system for a stacked memory package, in accordance with another embodiment.

FIG. 20-19 shows a refresh system for a stacked memory package, in accordance with another embodiment.

FIG. 20-20 shows a power management system for a stacked memory system, in accordance with another embodiment.

FIG. 20-21 shows a data hardening system for a stacked memory system, in accordance with another embodiment.

FIG. 21-1 shows a multi-class memory apparatus 1A-100, in accordance with one embodiment.

FIG. 21-2 shows a stacked memory chip system, in accordance with another embodiment.

FIG. 21-3 shows a computer system using stacked memory chips, in accordance with another embodiment.

FIG. 21-4 shows a stacked memory package system using chip-scale packaging, in accordance with another embodiment.

FIG. 21-5 shows a stacked memory package system using package in package technology, in accordance with another embodiment.

FIG. 21-6 shows a stacked memory package system using spacer technology, in accordance with another embodiment.

FIG. 21-7 shows a stacked memory package 700 comprising a logic chip 746 and a plurality of stacked memory chips 712, in accordance with another embodiment.

FIG. 21-8 shows a stacked memory package architecture, in accordance with another embodiment.

FIG. 21-9 shows a data IO architecture for a stacked memory package, in accordance with another embodiment.

FIG. 21-10 shows a TSV architecture for a stacked memory chip, in accordance with another embodiment.

FIG. 21-11 shows various data bus architectures for a stacked memory chip, in accordance with another embodiment.

FIG. 21-12 shows a stacked memory package architecture, in accordance with another embodiment.

FIG. 21-13 shows a stacked memory package architecture, in accordance with another embodiment.

FIG. 21-14 shows a stacked memory package architecture, in accordance with another embodiment.

FIG. 21-15 shows a stacked memory package architecture, in accordance with another embodiment.

FIG. 22-1 shows a memory apparatus, in accordance with one embodiment.

FIG. 22-2A shows an orientation controlled die connection system, in accordance with another embodiment.

FIG. 22-2B shows a redundant connection system, in accordance with another embodiment.

FIG. 22-2C shows a spare connection system, in accordance with another embodiment.

FIG. 22-3 shows a coding and transform system, in accordance with another embodiment.

FIG. 22-4 shows a paging system, in accordance with another embodiment.

FIG. 22-5 shows a shared page system, in accordance with another embodiment.

FIG. 22-6 shows a hybrid memory cache, in accordance with another embodiment.

FIG. 22-7 shows a memory location control system, in accordance with another embodiment.

FIG. 22-8 shows a stacked memory package architecture, in accordance with another embodiment.

FIG. 22-9 shows a heterogeneous memory cache system, in accordance with another embodiment.

FIG. 22-10 shows a configurable memory subsystem, in accordance with another embodiment.

FIG. 22-11 shows a stacked memory package architecture, in accordance with another embodiment.

FIG. 22-12 shows a memory system architecture with DMA, in accordance with another embodiment.

FIG. 22-13 shows a wide IO memory architecture, in accordance with another embodiment.

FIG. 23-1 shows an apparatus, in accordance with one embodiment.

FIG. 23-2 shows a memory system with multiple stacked memory packages, in accordance with one embodiment.

FIG. 23-3 shows a stacked memory package, in accordance with another embodiment.

FIG. 23-4 shows a memory system using stacked memory packages, in accordance with one embodiment.

FIG. 23-5 shows a stacked memory package, in accordance with another embodiment.

FIG. 23-6A shows a basic packet format system for a read request, in accordance with another embodiment.

FIG. 23-6B shows a basic packet format system for a read response, in accordance with another embodiment.

FIG. 23-6C shows a basic packet format system for a write request, in accordance with another embodiment.

FIG. 23-6D shows a graph of total channel data efficiency for a stacked memory package system, in accordance with another embodiment.

FIG. 23-7 shows a basic packet format system for a write request with read request, in accordance with another embodiment.

FIG. 23-8 shows a basic packet format system, in accordance with another embodiment.

FIG. 24-1 shows an apparatus, in accordance with one embodiment.

FIG. 24-2 shows a stacked memory package comprising a logic chip and a plurality of stacked memory chips, in accordance with another embodiment.

FIG. 24-3 shows a stacked memory package architecture, in accordance with another embodiment.

FIG. 24-4 shows a data IO architecture for a stacked memory package, in accordance with another embodiment.

FIG. 24-5 shows a TSV architecture for a stacked memory chip, in accordance with another embodiment.

FIG. 24-6 shows a die connection system, in accordance with another embodiment.

FIG. 25-1 shows an apparatus, in accordance with one embodiment.

FIG. 25-2 shows a stacked memory package, in accordance with one embodiment.

FIG. 25-3 shows a stacked memory package architecture, in accordance with one embodiment.

FIG. 25-4 shows a stacked memory package architecture, in accordance with one embodiment.

FIG. 25-5 shows a stacked memory package architecture, in accordance with one embodiment.

FIG. 25-6 shows a portion of a stacked memory package architecture, in accordance with one embodiment.

FIG. 25-7 shows a portion of a stacked memory package architecture, in accordance with one embodiment.

FIG. 25-8 shows a stacked memory package architecture, in accordance with one embodiment.

FIG. 25-9 shows a stacked memory package architecture, in accordance with one embodiment.

FIG. 25-10A shows a stacked memory package datapath, in accordance with one embodiment.

FIG. 25-10B shows a stacked memory package architecture, in accordance with one embodiment.

FIG. 25-10C shows a stacked memory package architecture, in accordance with one embodiment.

FIG. 25-10D shows a latency chart for a stacked memory package, in accordance with one embodiment.

FIG. 25-11 shows a stacked memory package datapath, in accordance with one embodiment.

FIG. 25-12 shows a memory system using virtual channels, in accordance with one embodiment.

FIG. 25-13 shows a memory error correction scheme, in accordance with one embodiment.

FIG. 25-14 shows a stacked memory package using DBI bit for parity, in accordance with one embodiment.

FIG. 25-15 shows a method of stacked memory package manufacture, in accordance with one embodiment.

FIG. 25-16 shows a system for stacked memory chip identification, in accordance with one embodiment.

FIG. 25-17 shows a memory bus mode configuration system, in accordance with one embodiment.

FIG. 25-18 shows a memory bus merging system, in accordance with one embodiment.

FIG. 26-1 shows an apparatus, in accordance with one embodiment.

FIG. 26-2 shows a memory system network, in accordance with one embodiment.

FIG. 26-3 shows a data transmission scheme, in accordance with one embodiment.

FIG. 26-4 shows a receiver (Rx) datapath, in accordance with one embodiment.

FIG. 26-5 shows a transmitter (Tx) datapath, in accordance with one embodiment.

FIG. 26-6 shows a receiver datapath, in accordance with one embodiment.

Figure 7:
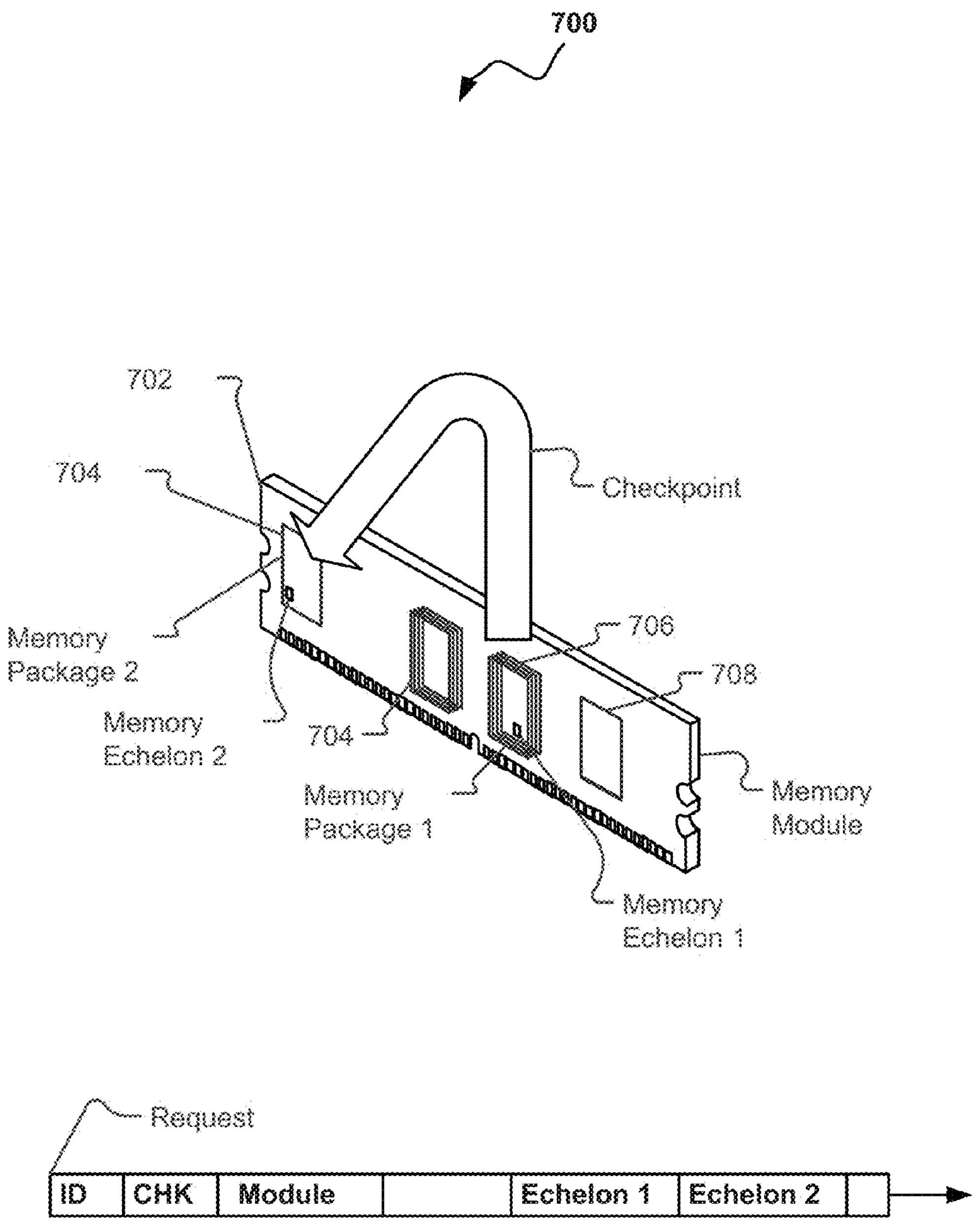
FIG. 7 shows a memory system using stacked memory packages, in accordance with another embodiment.
Figures 1, 26:
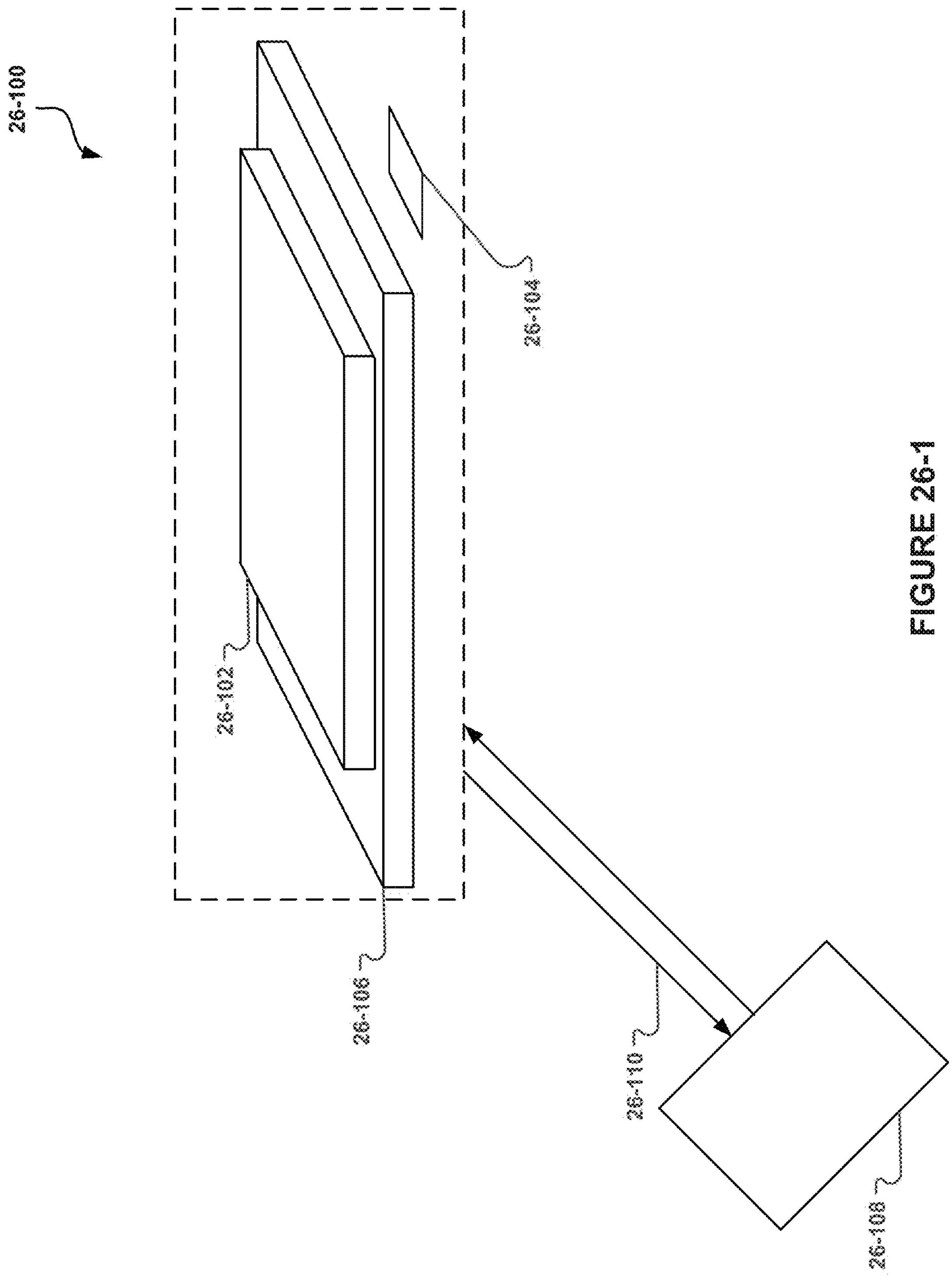
Figures 2, 26:
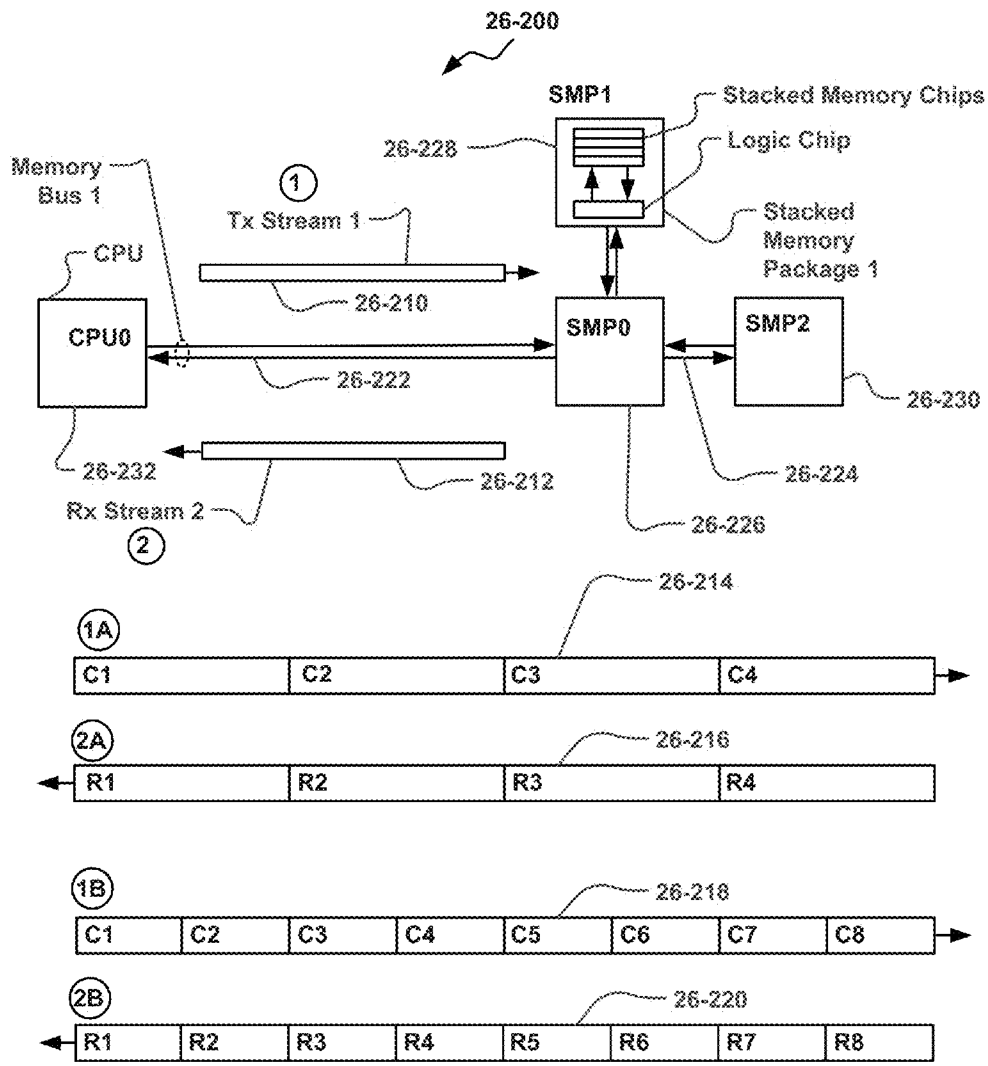
Figures 3, 26:
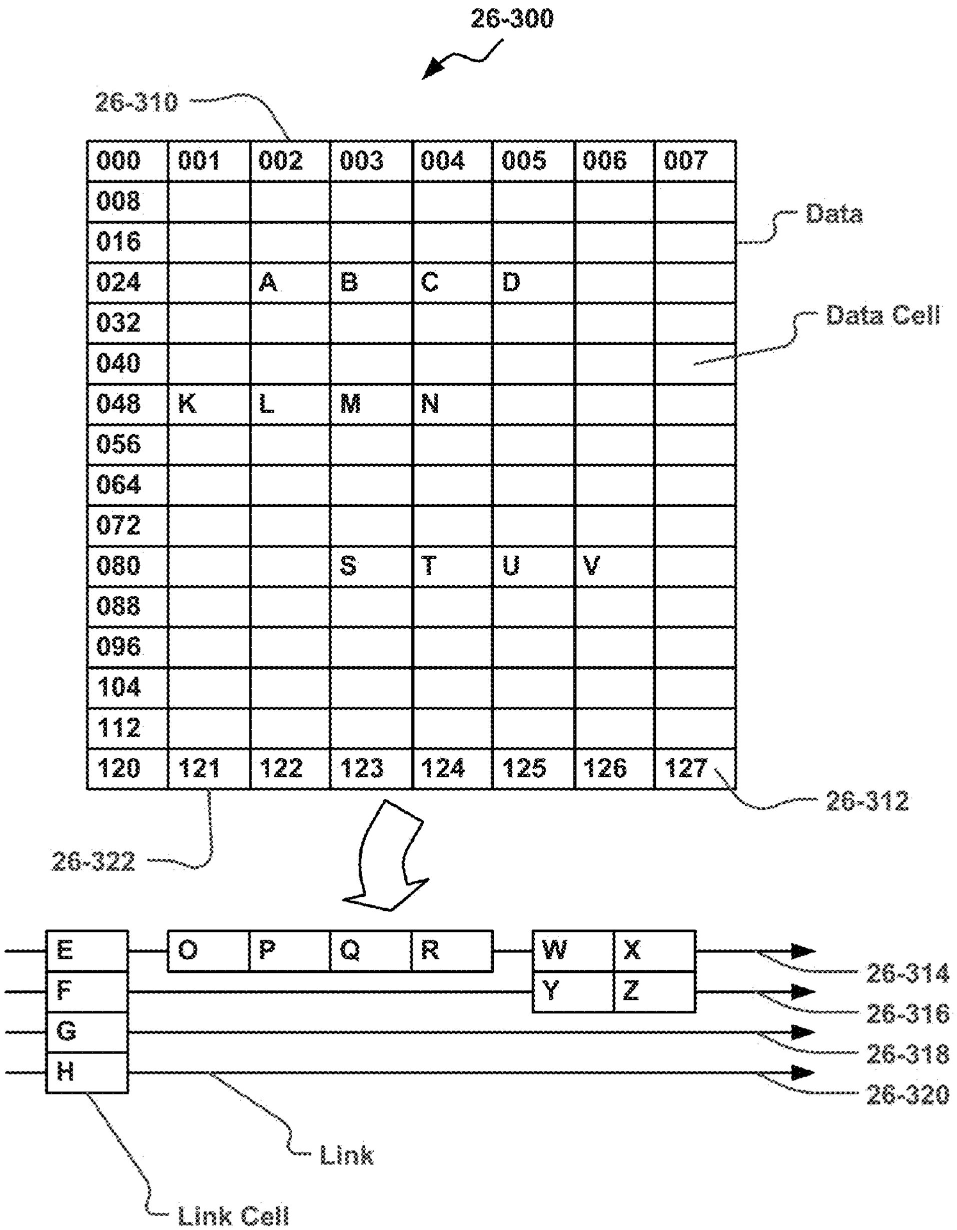
Figures 4, 26:
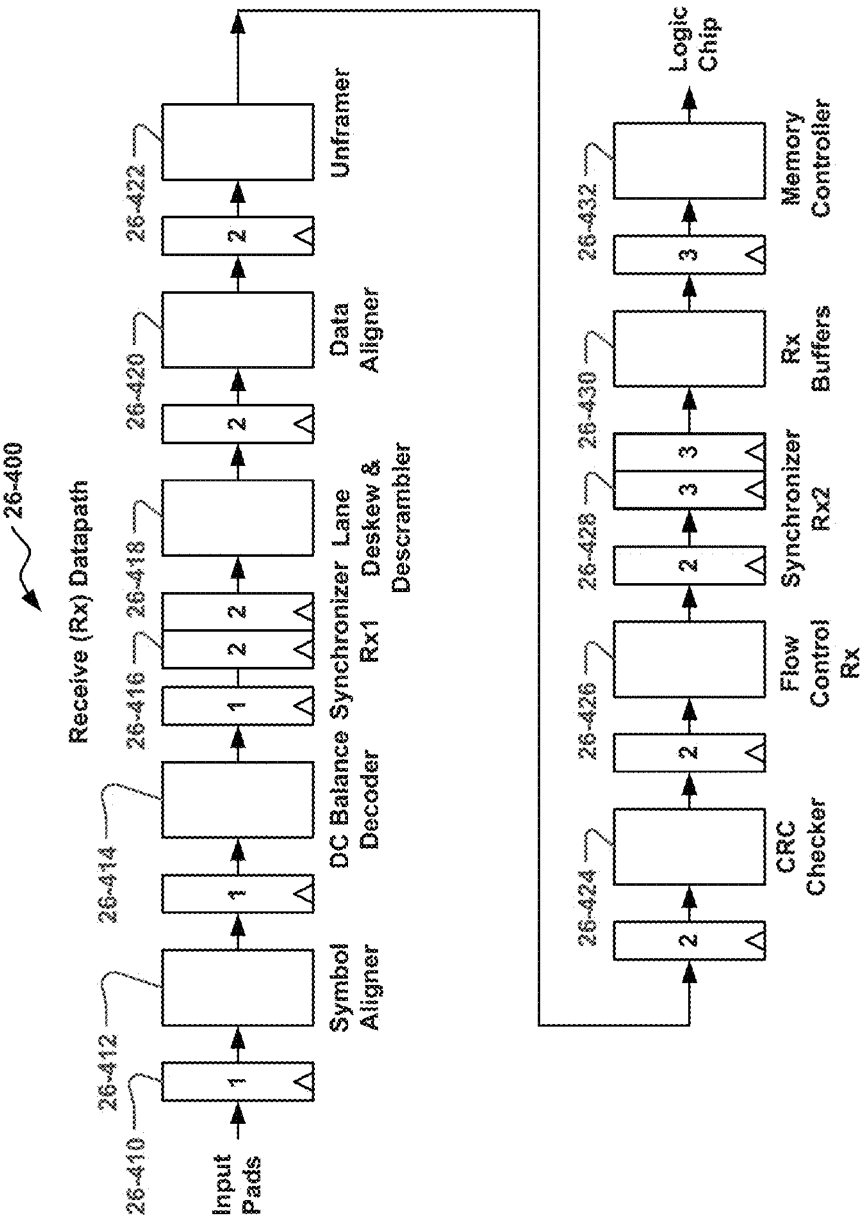
Figures 5, 26:
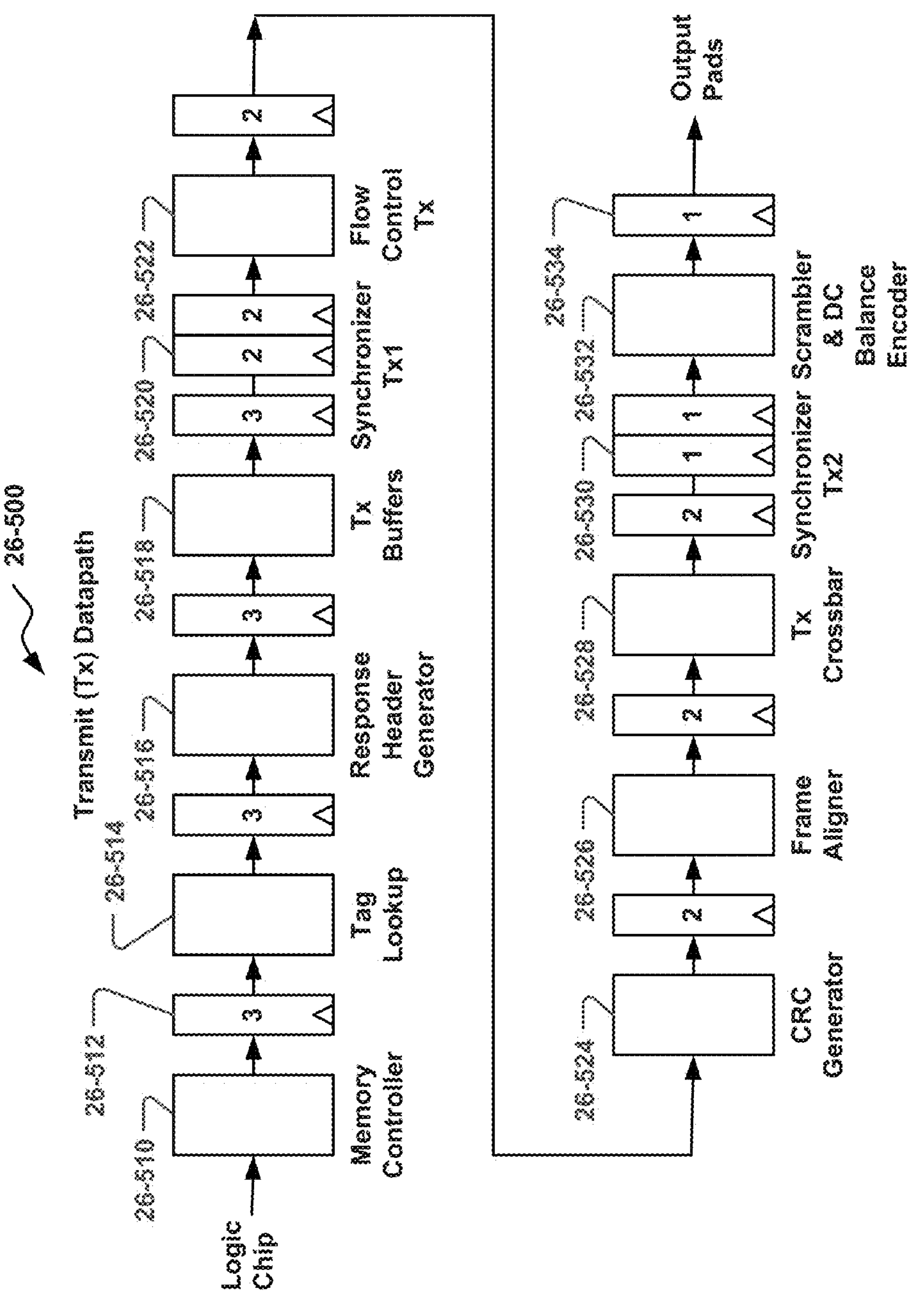
Figures 6, 26:
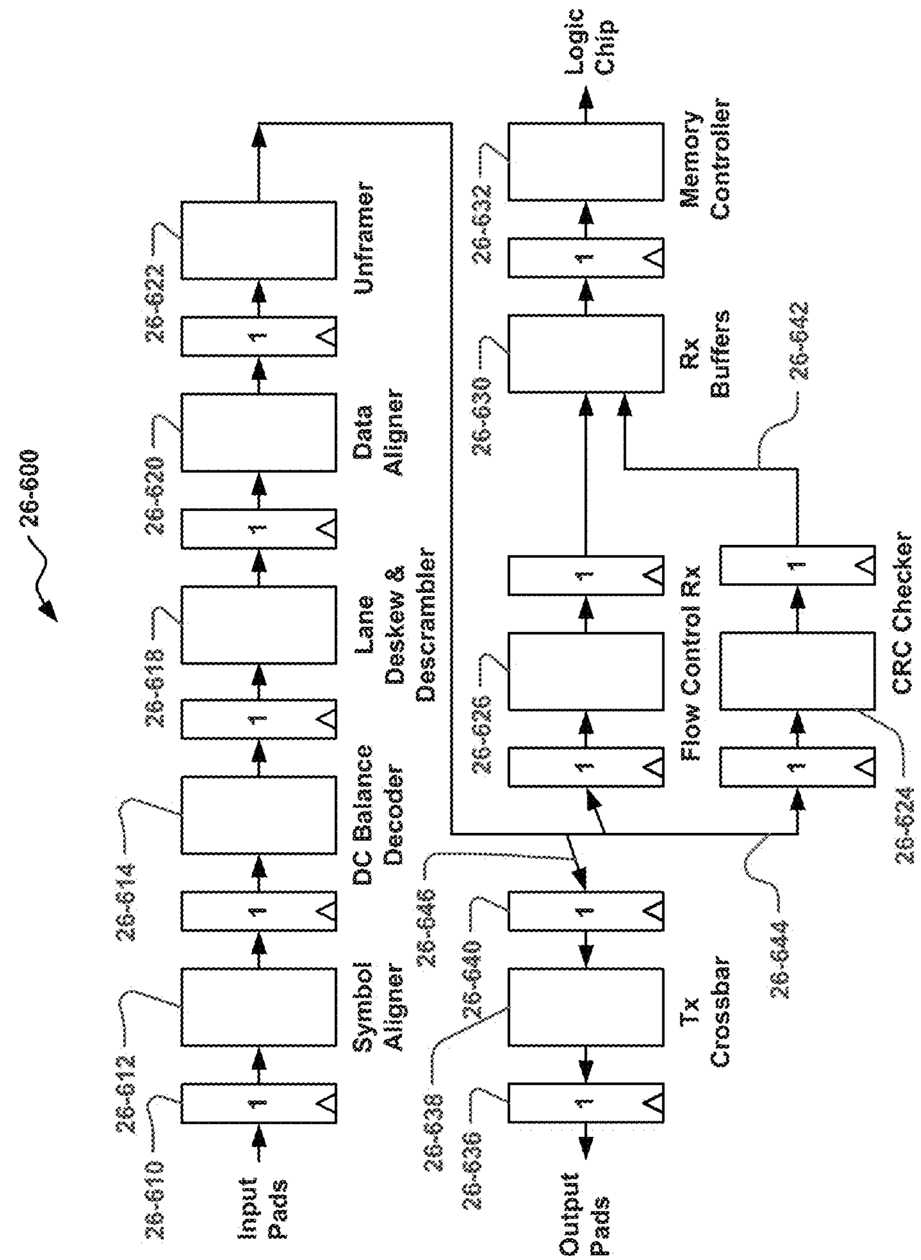
Figures 7, 26:
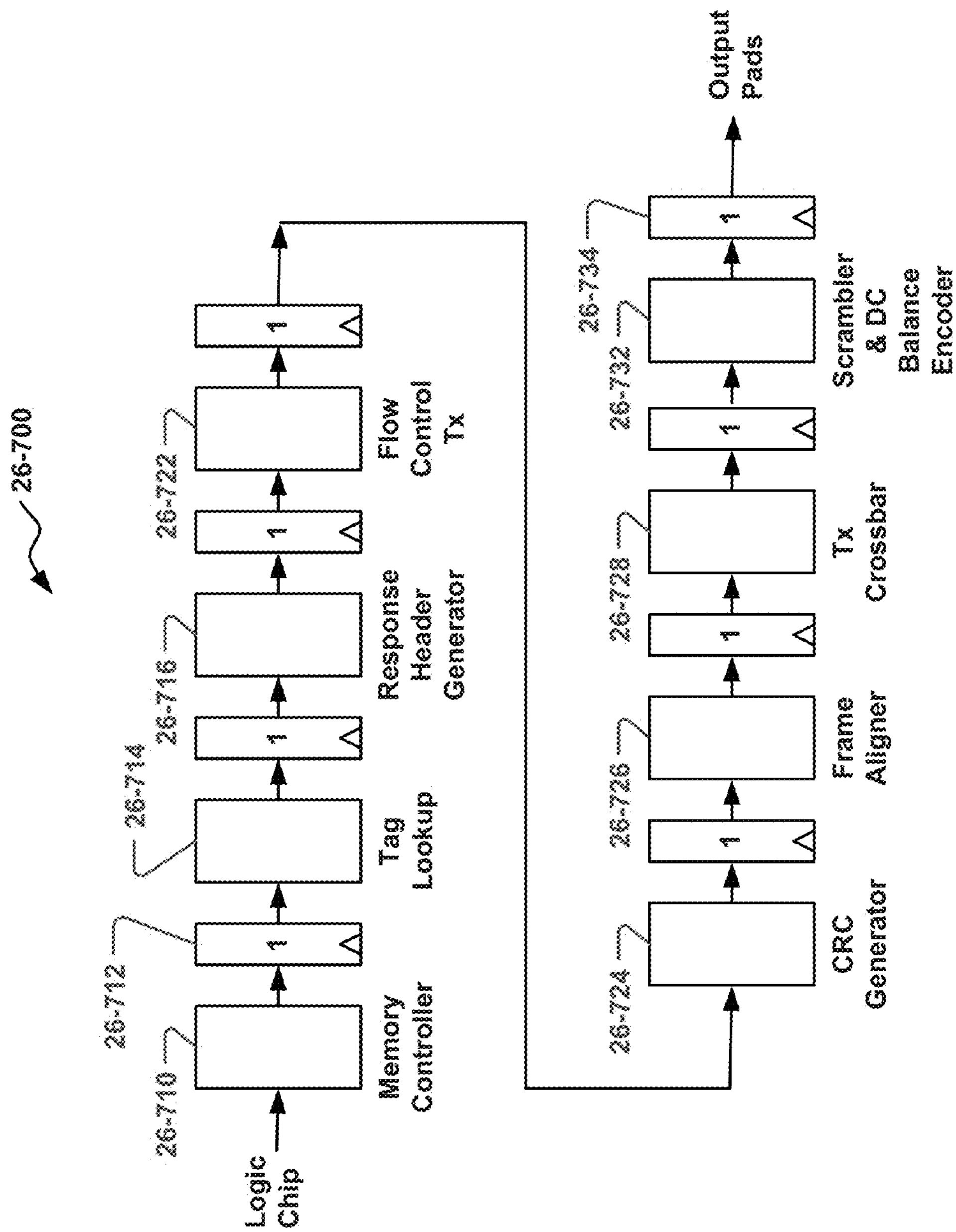
Figures 8, 26:
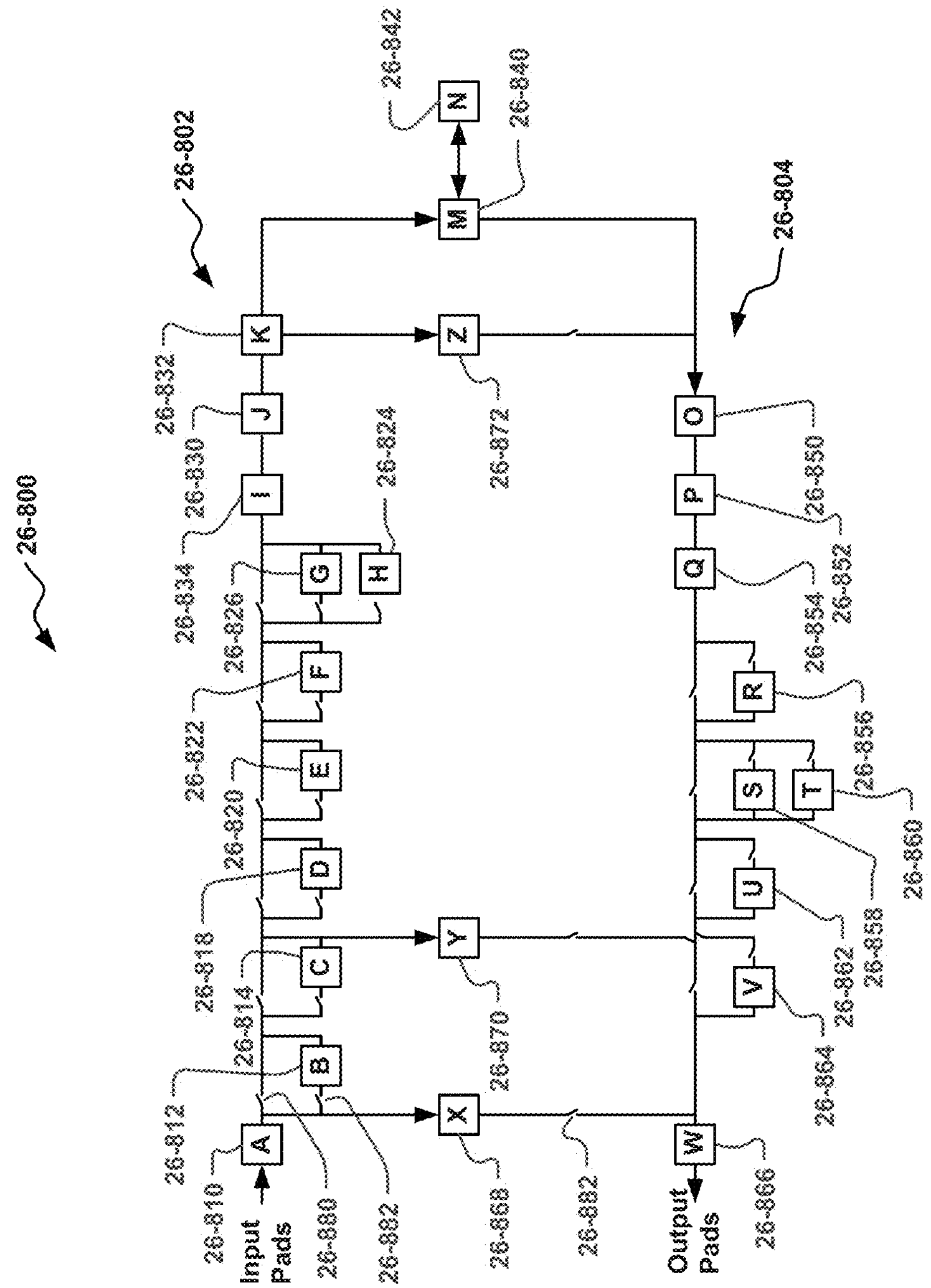
Figures 9, 26:
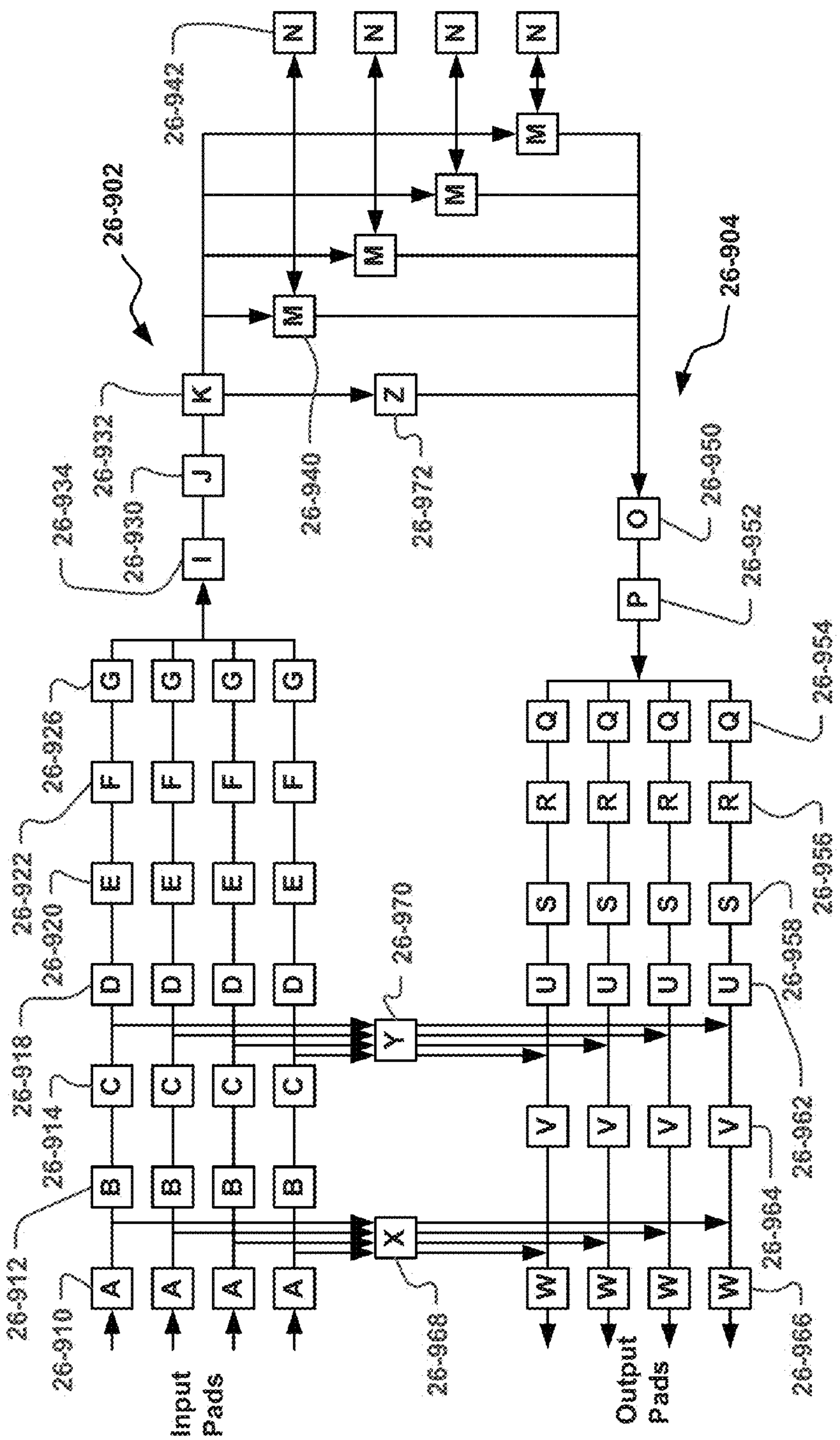

FIG. 26-7 shows a transmitter datapath, in accordance with one embodiment.

Figure 8:
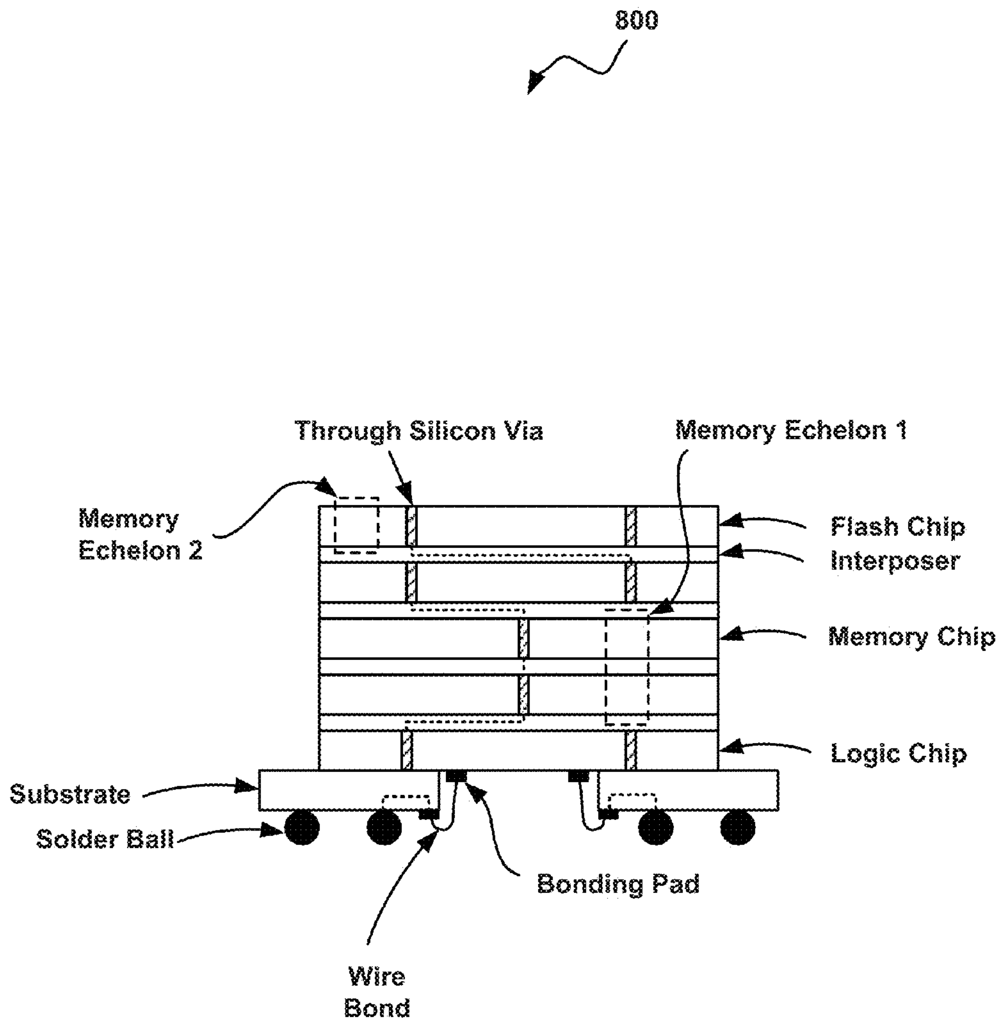
FIG. 8 shows a memory system using a stacked memory package, in accordance with another embodiment.

FIG. 26-8 shows a stacked memory package datapath, in accordance with one embodiment.

Figure 9:
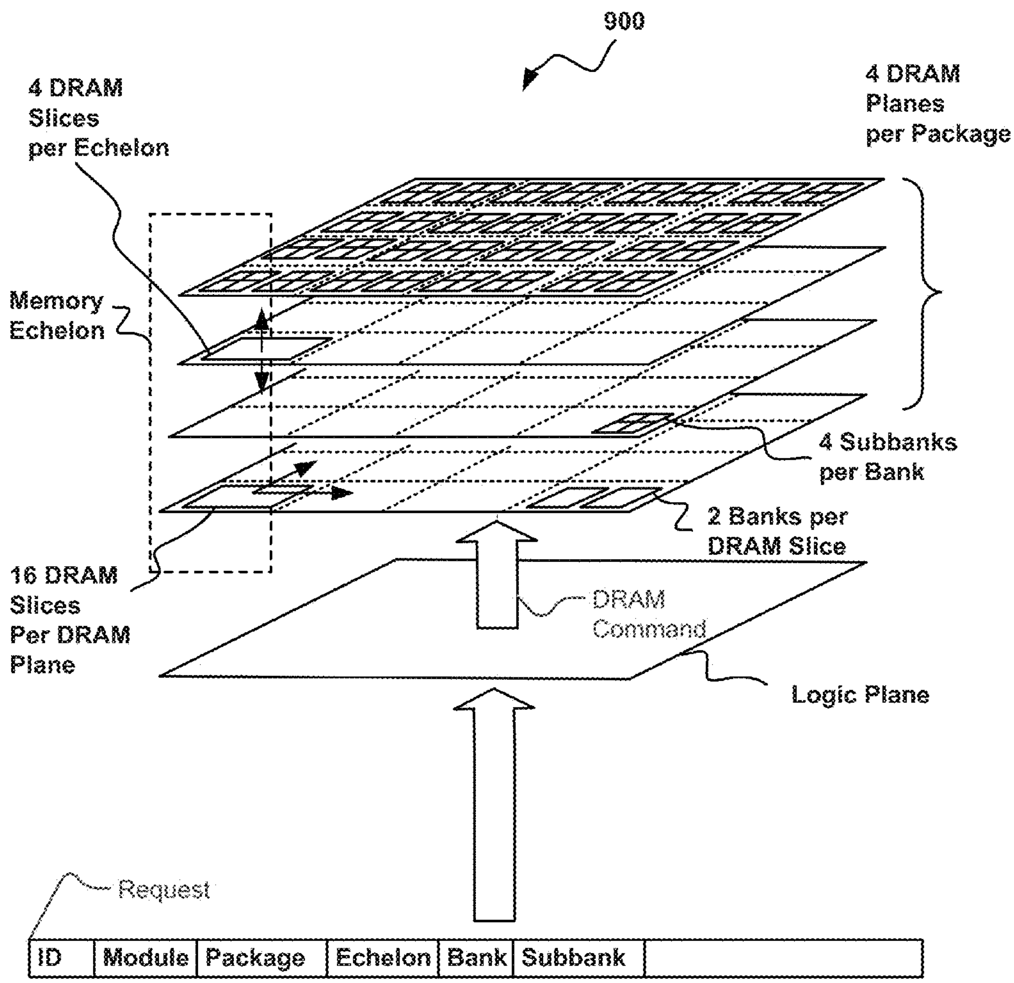
FIG. 9 shows a stacked memory package, in accordance with another embodiment.

FIG. 26-9 shows a stacked memory package datapath, in accordance with one embodiment.

Figure 1A:
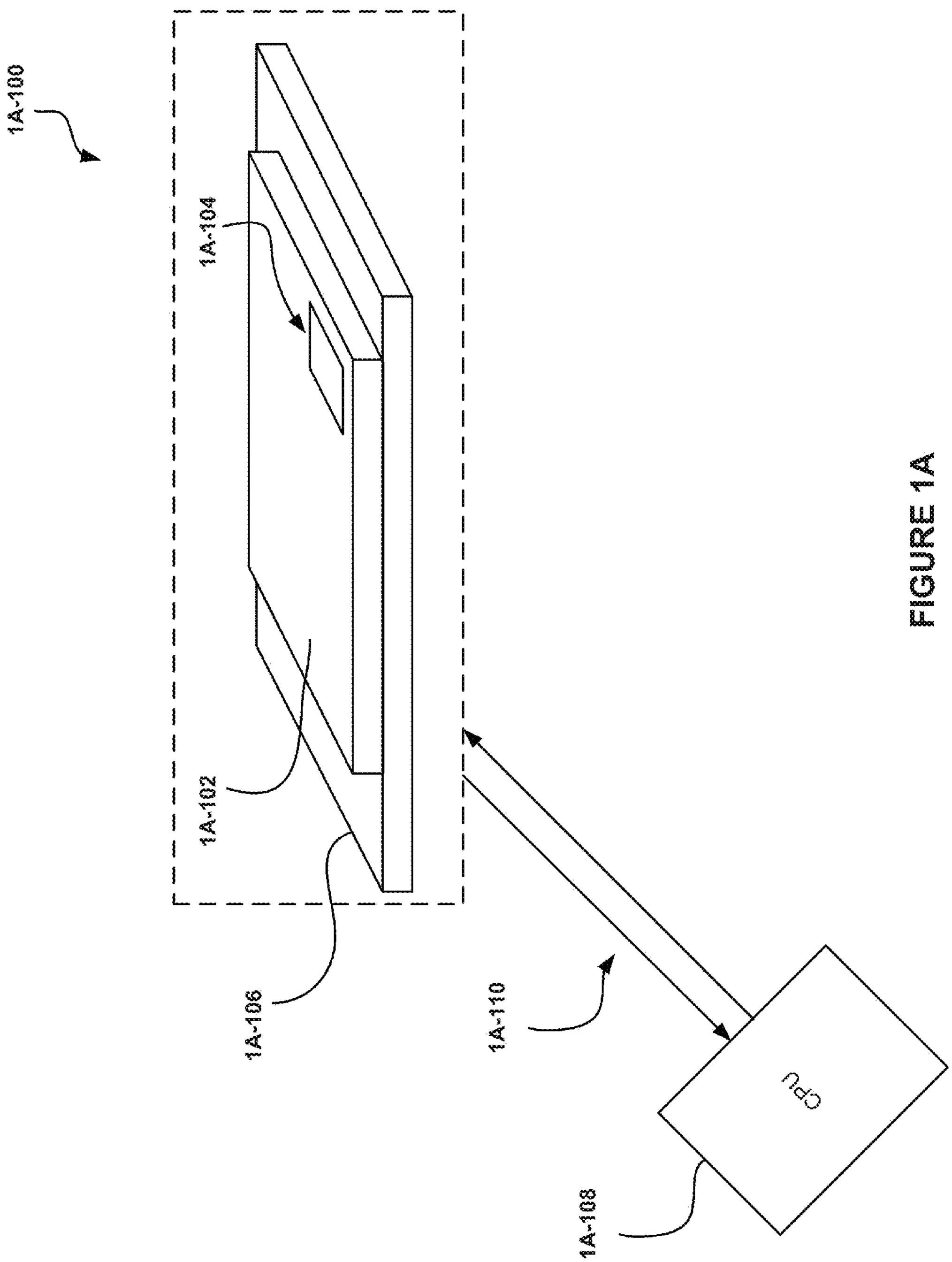
FIG. 1A shows an apparatus including a plurality of semiconductor platforms, in accordance with one embodiment.
Figures 1A, 27:
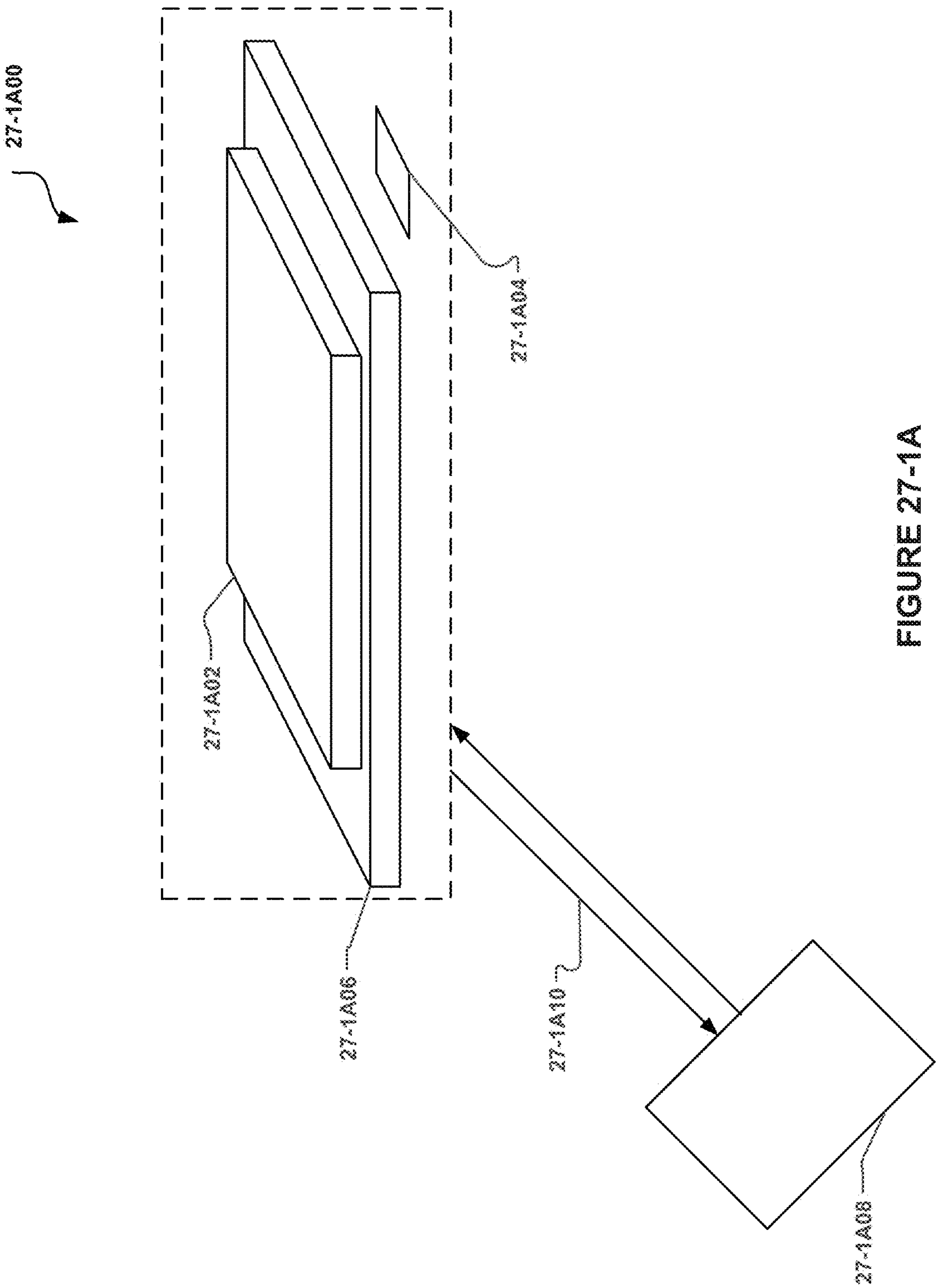
Figures 1B, 27:
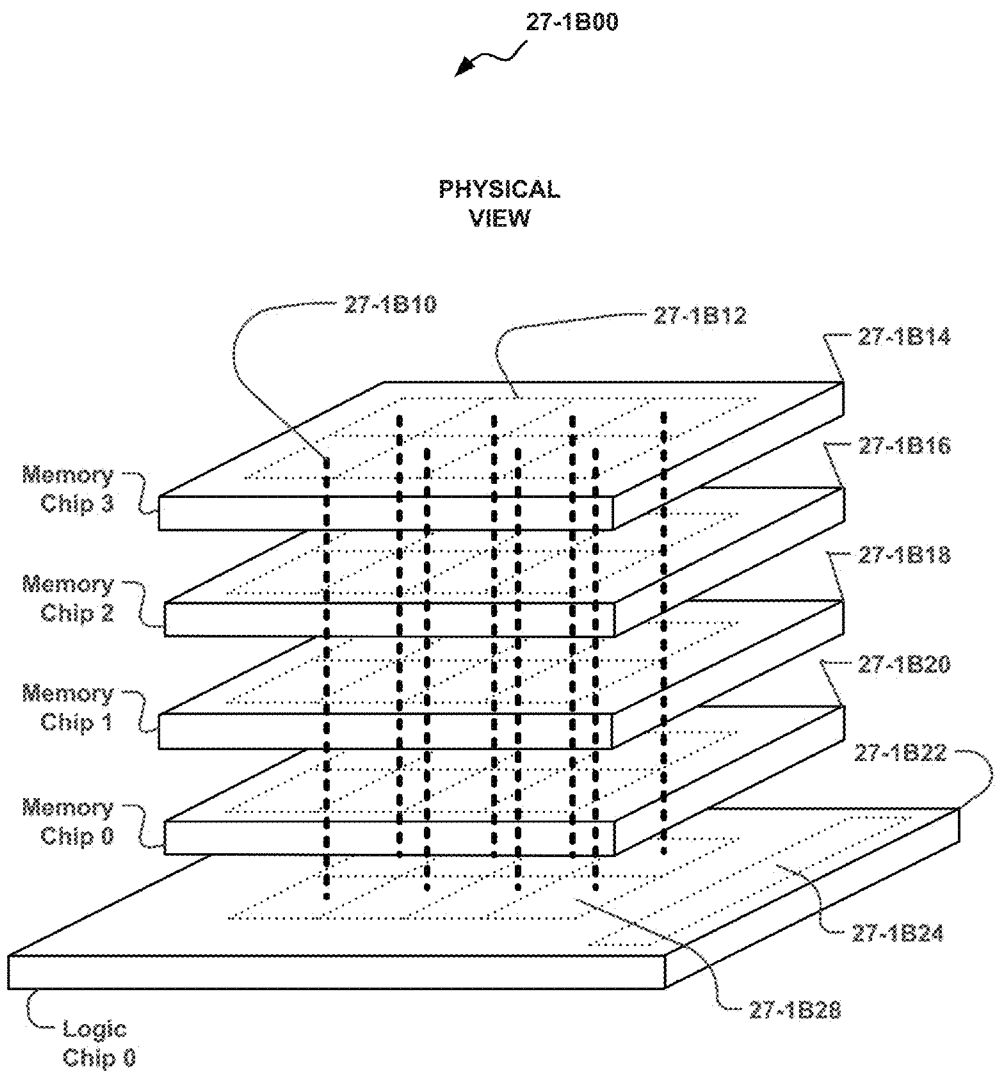

FIG. 27-1A shows an apparatus, in accordance with one embodiment.

Figure 1B:
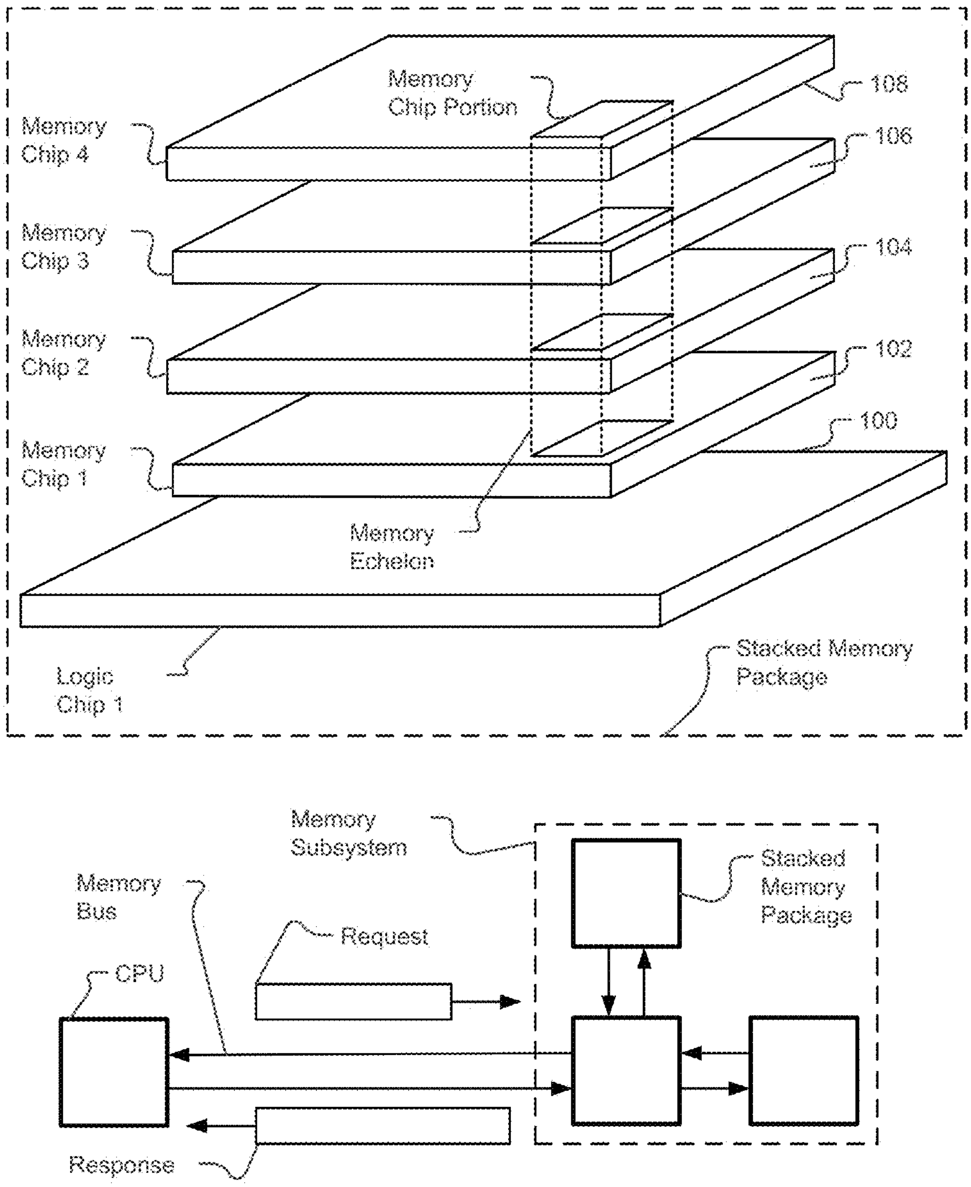
FIG. 1B shows a memory system with multiple stacked memory packages, in accordance with one embodiment.

FIG. 27-1B shows a physical view of a stacked memory package, in accordance with one embodiment.

Figures 1C, 27:
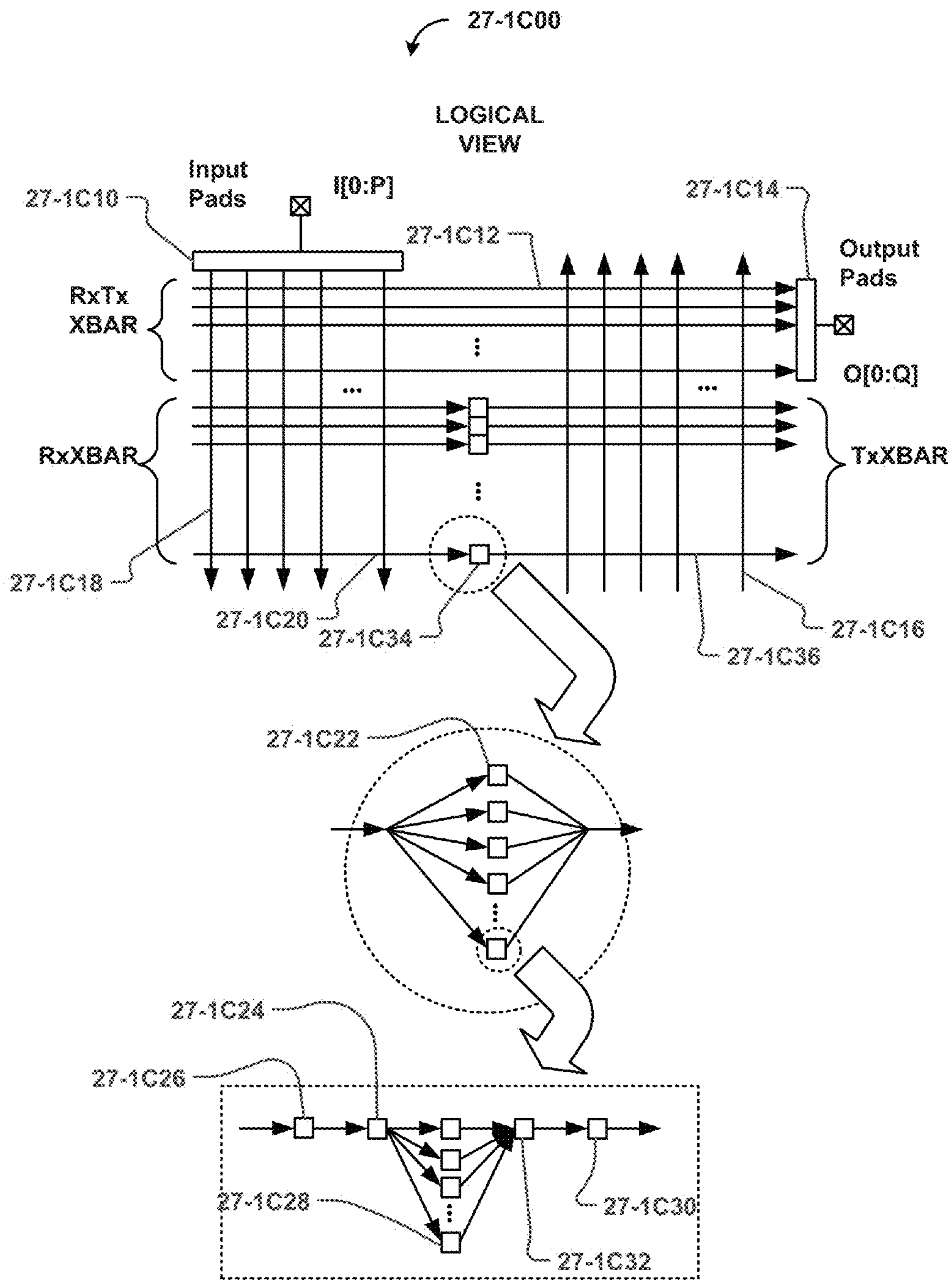

FIG. 27-1C shows a logical view of a stacked memory package, in accordance with one embodiment.

Figures 1D, 27:
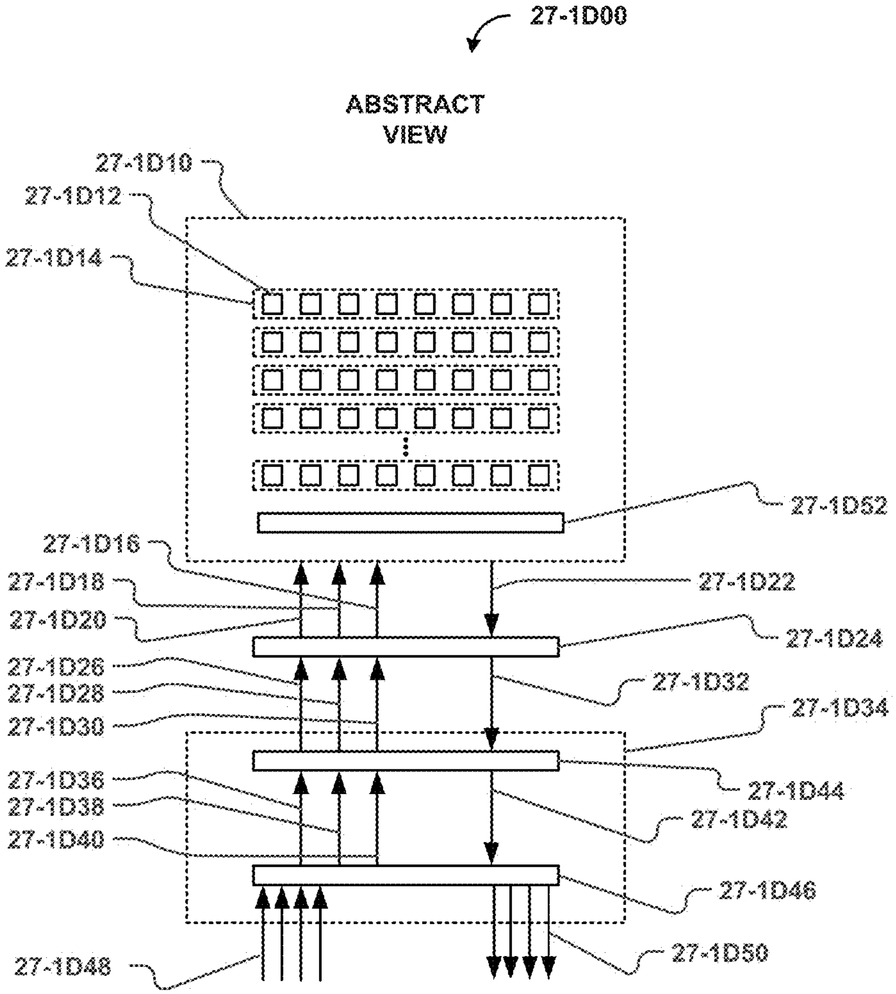
Figures 2, 27:
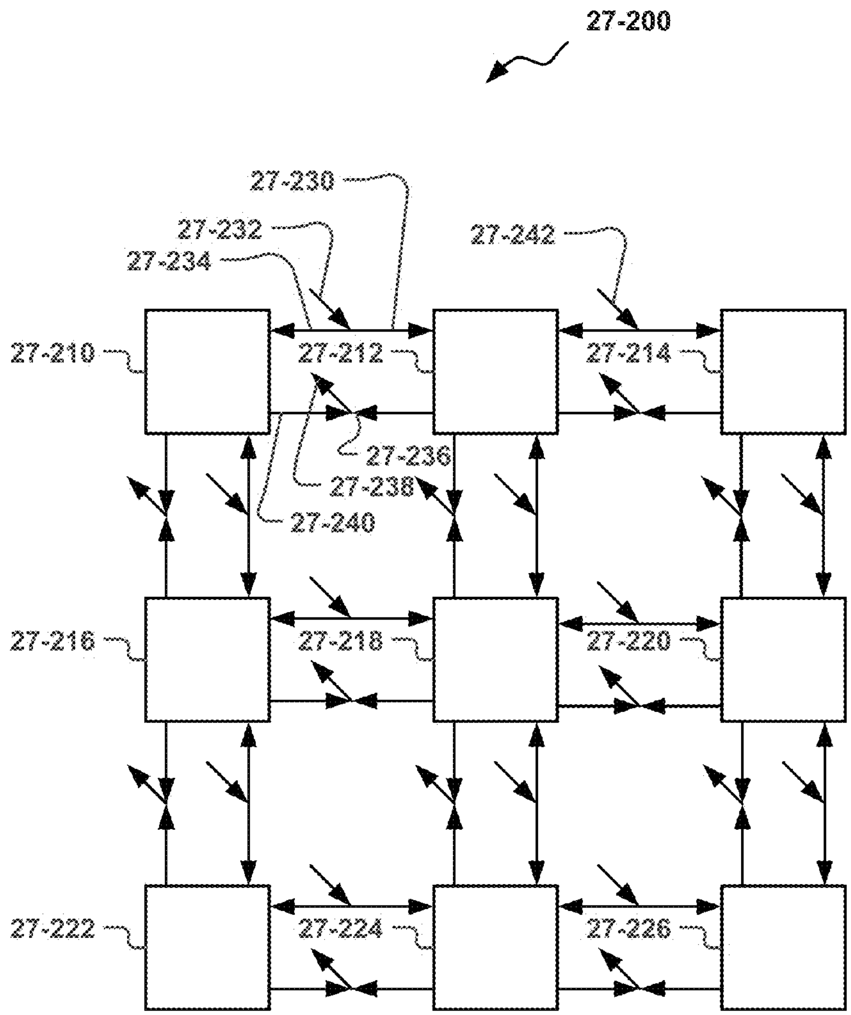
Figures 3, 27:
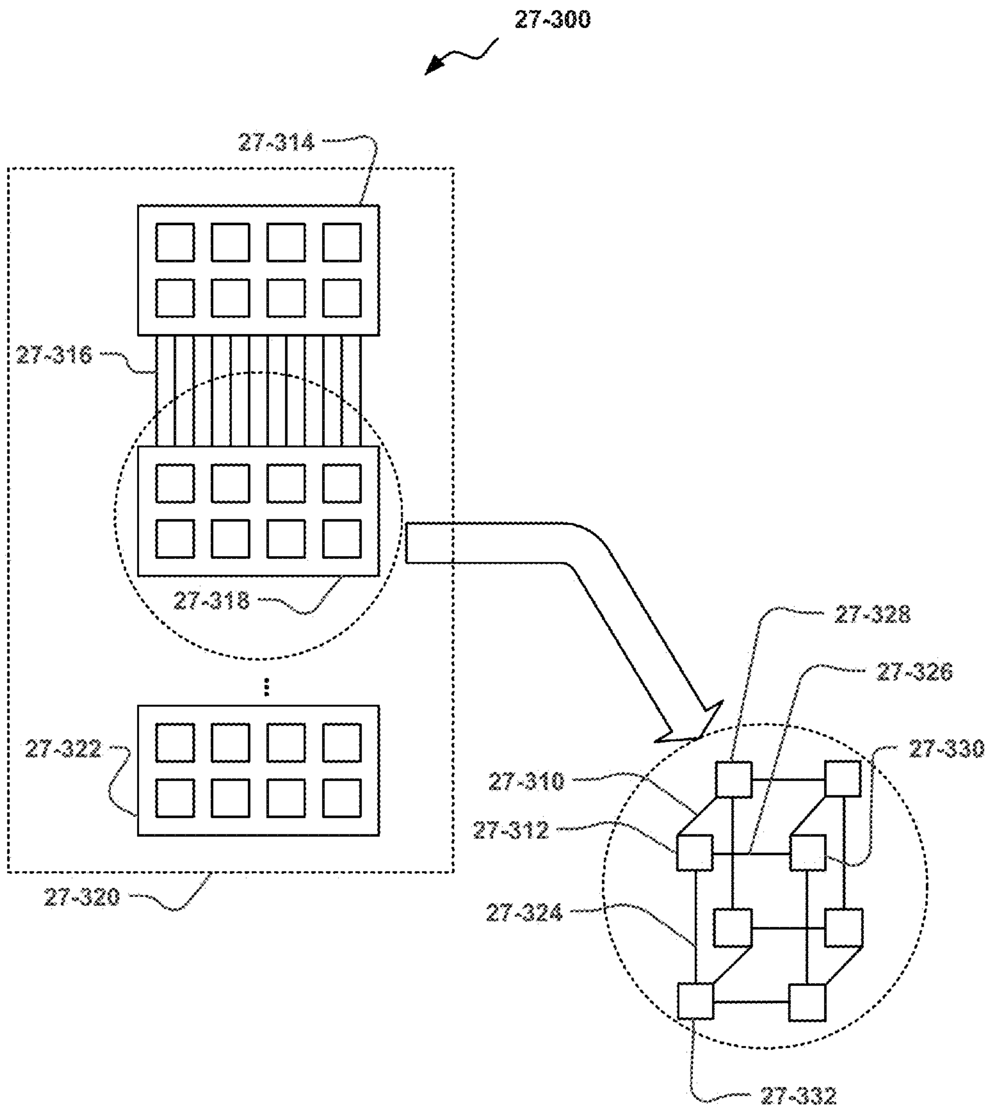
Figures 4, 27:
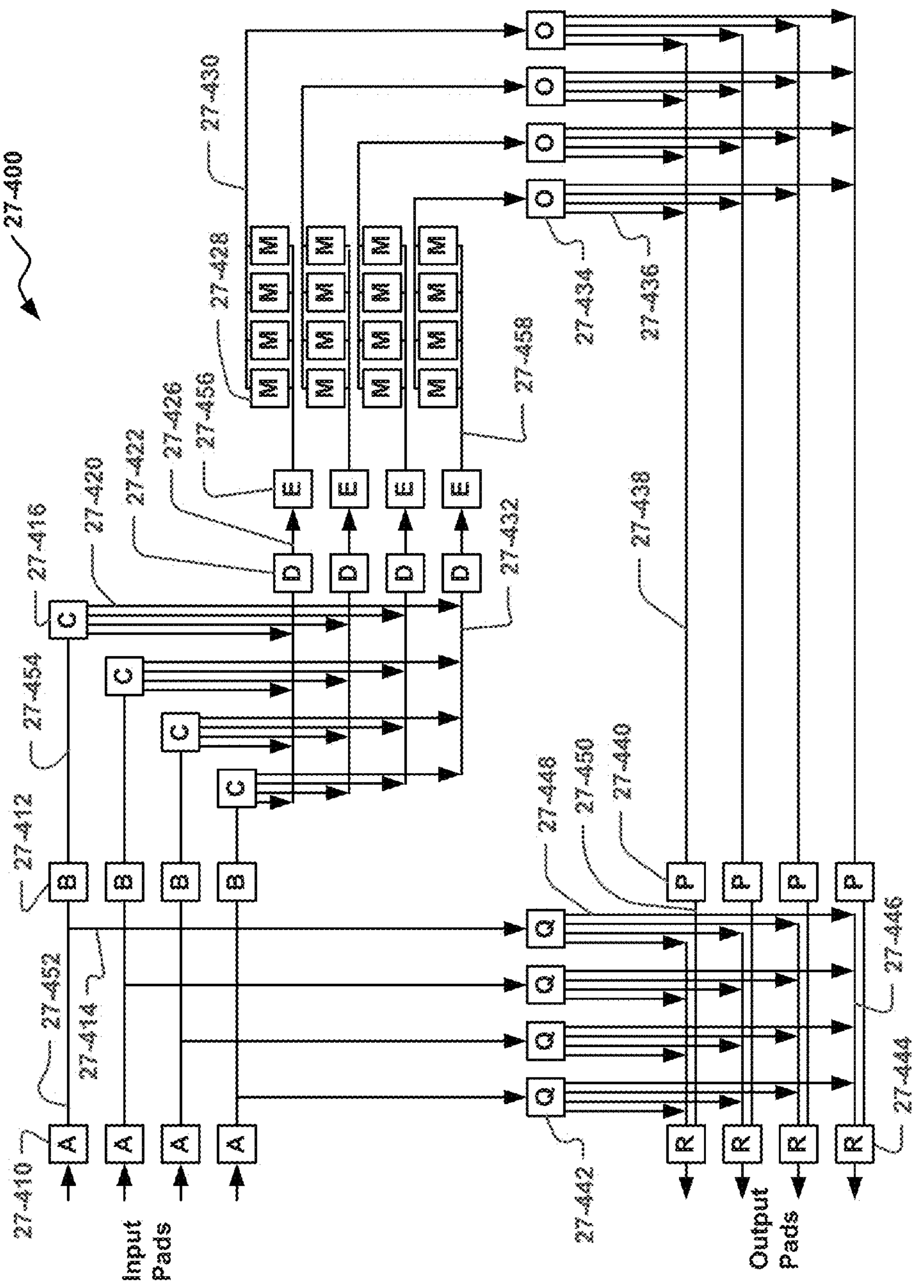
Figures 5, 27:
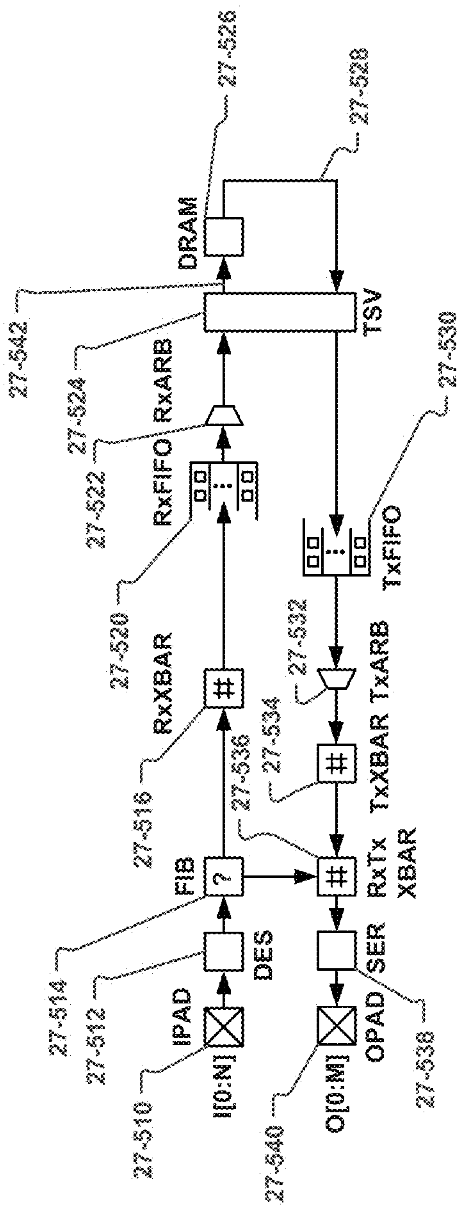
Figures 6, 27:
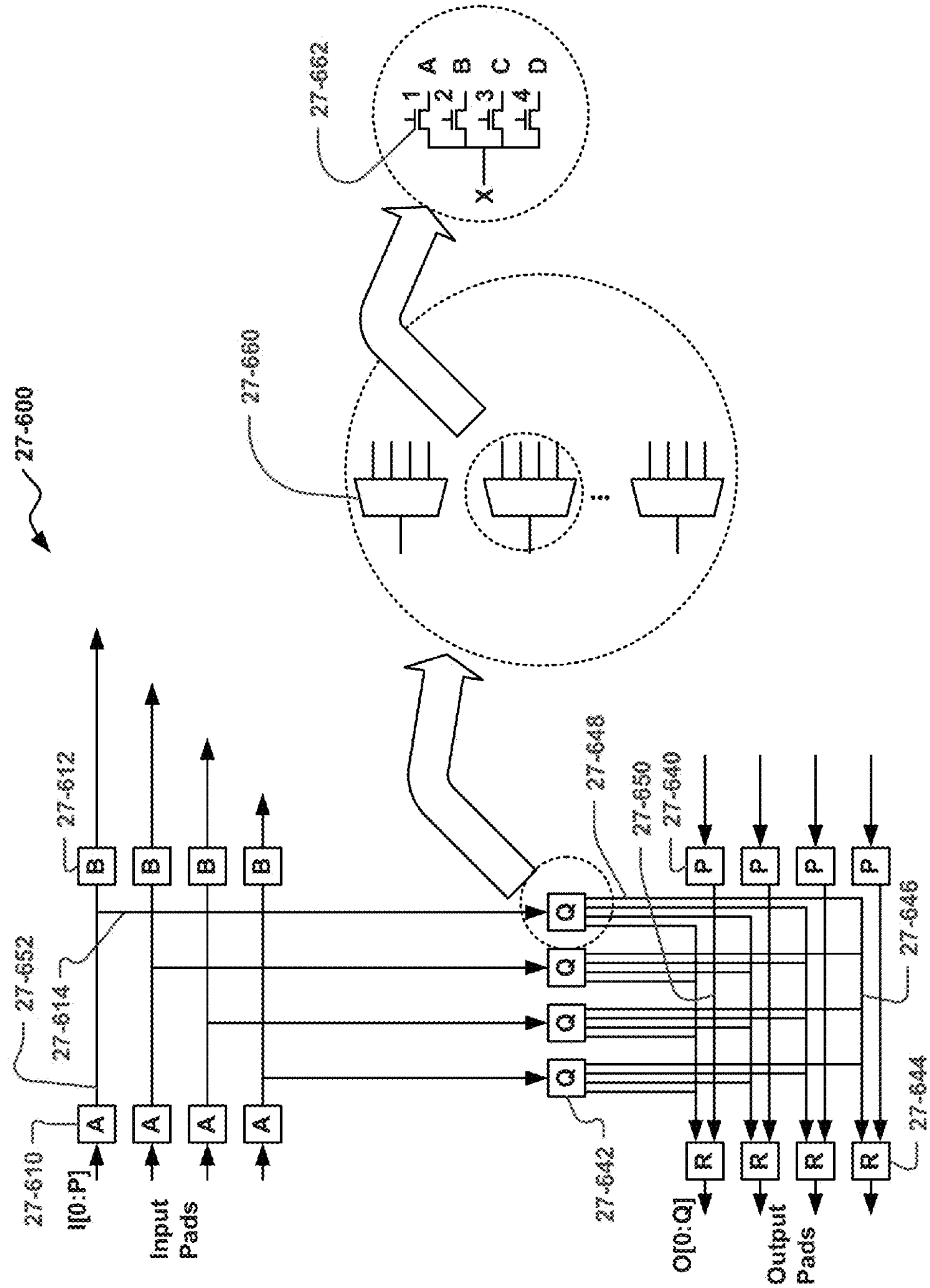
Figures 7, 27:
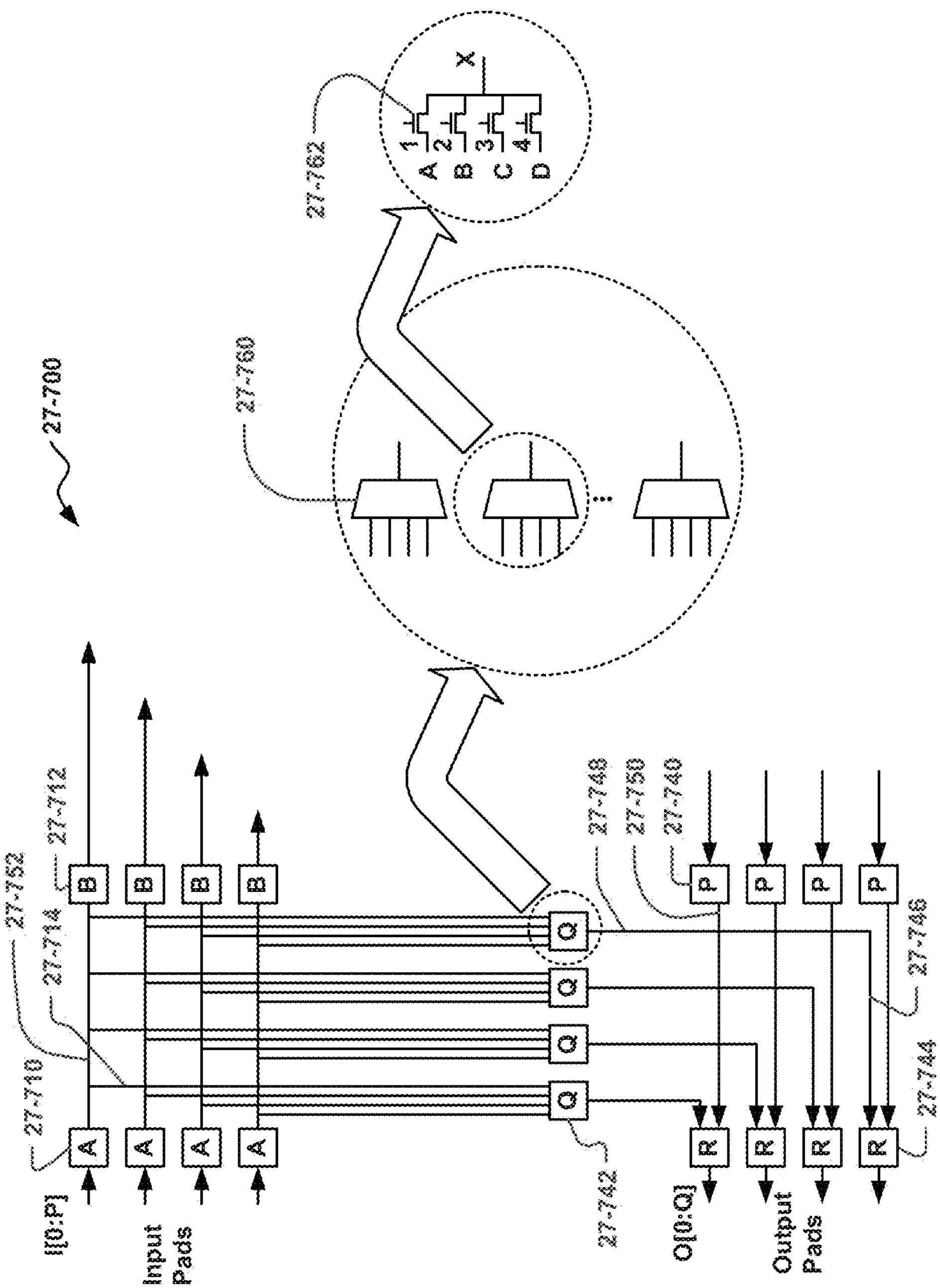
Figures 8, 27:
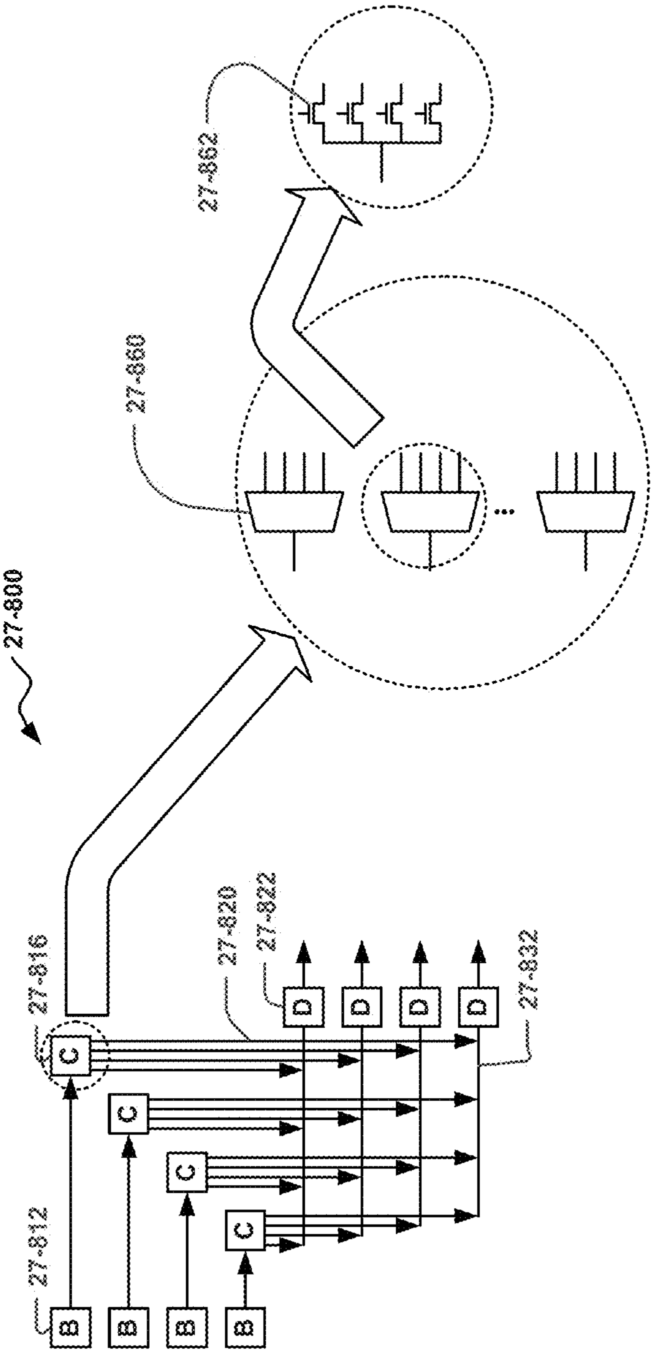
Figures 9, 27:
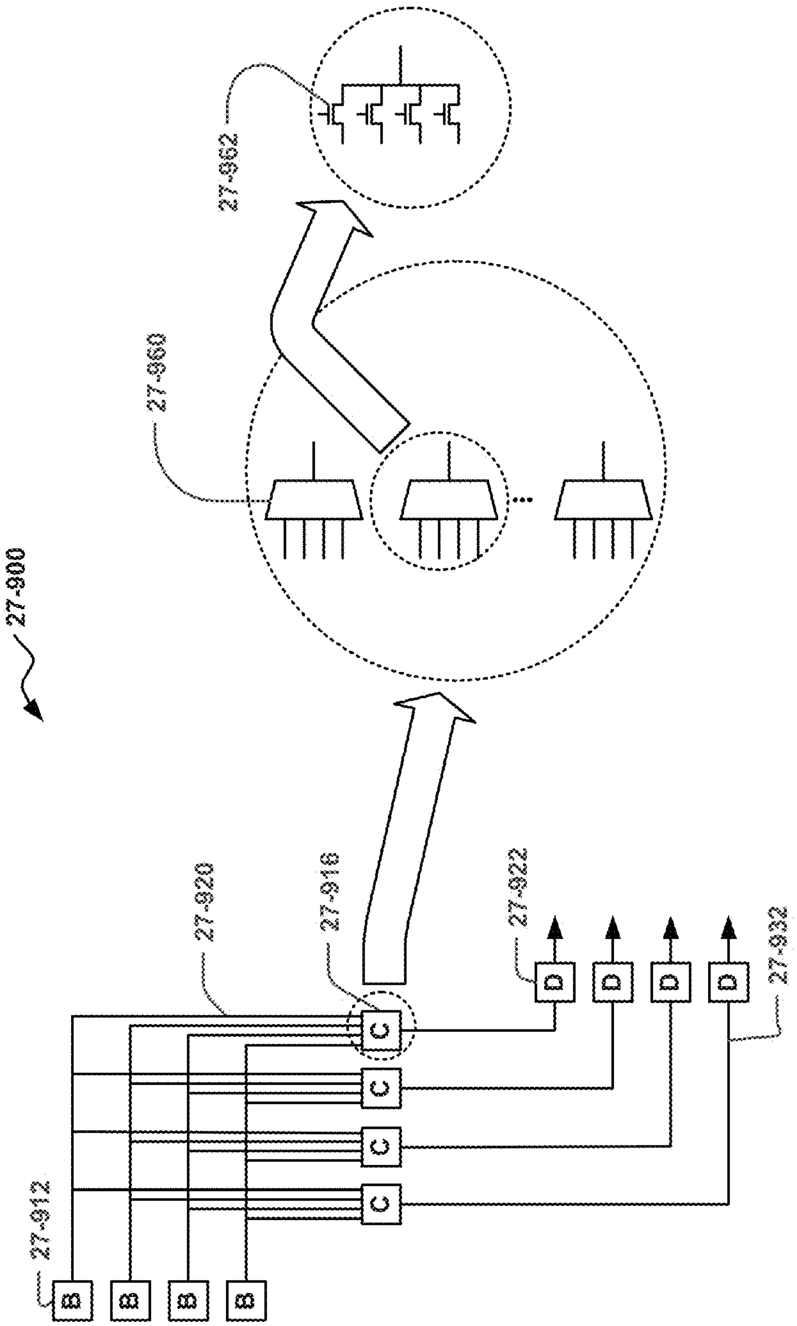
Figures 10, 27:
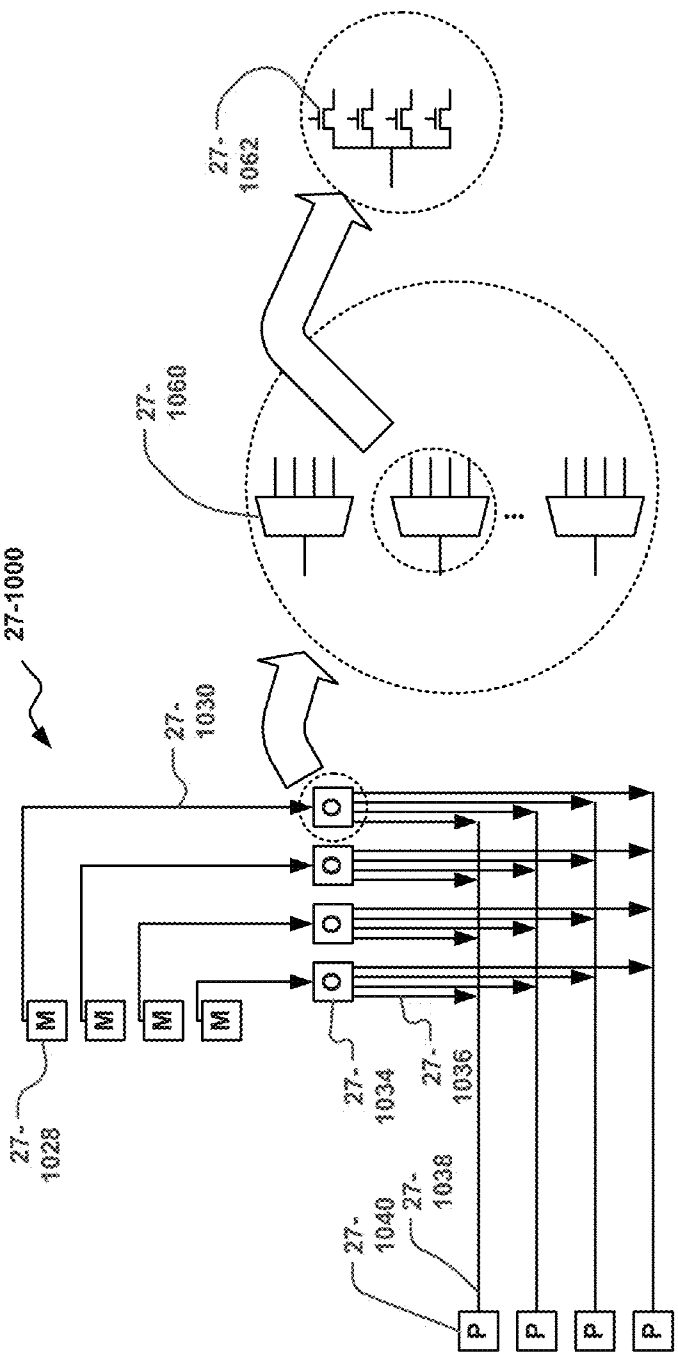
Figures 11, 27:
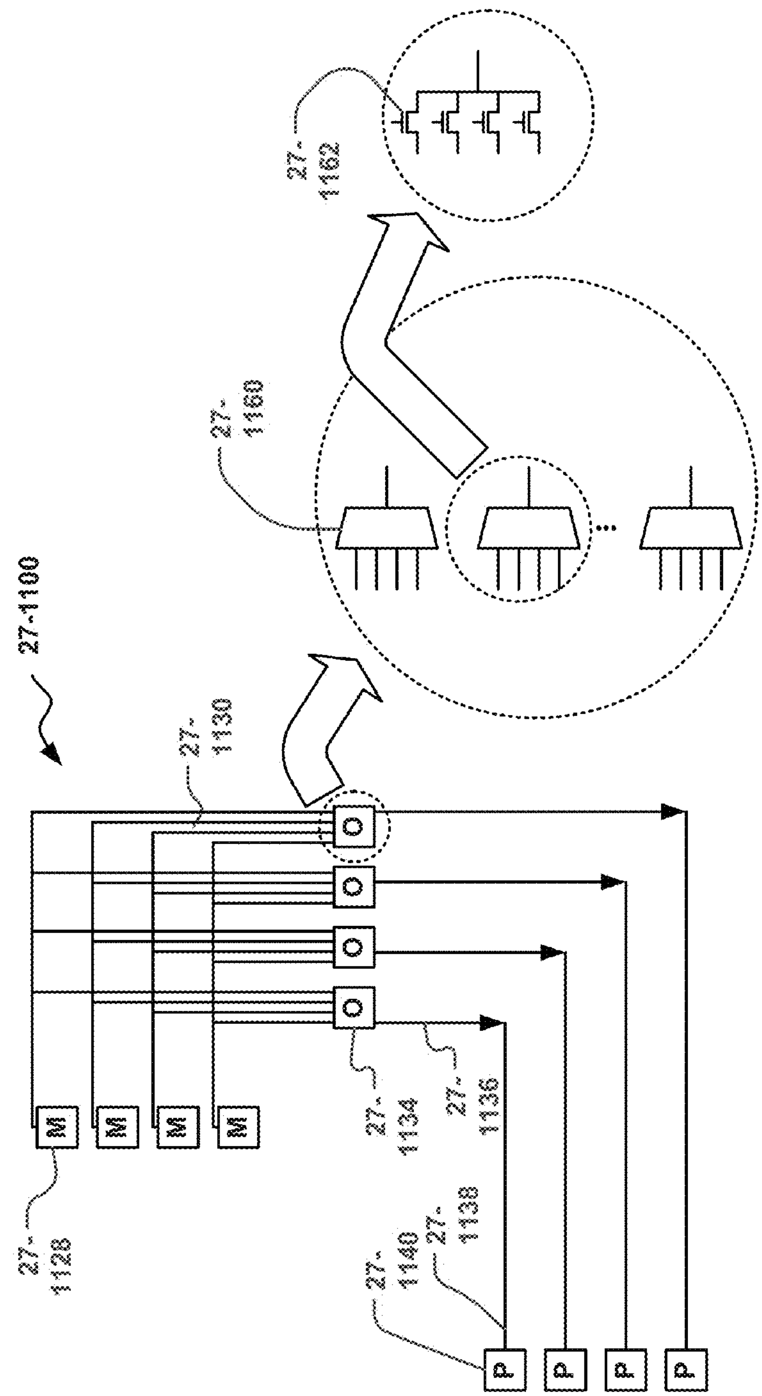
Figures 12, 27:
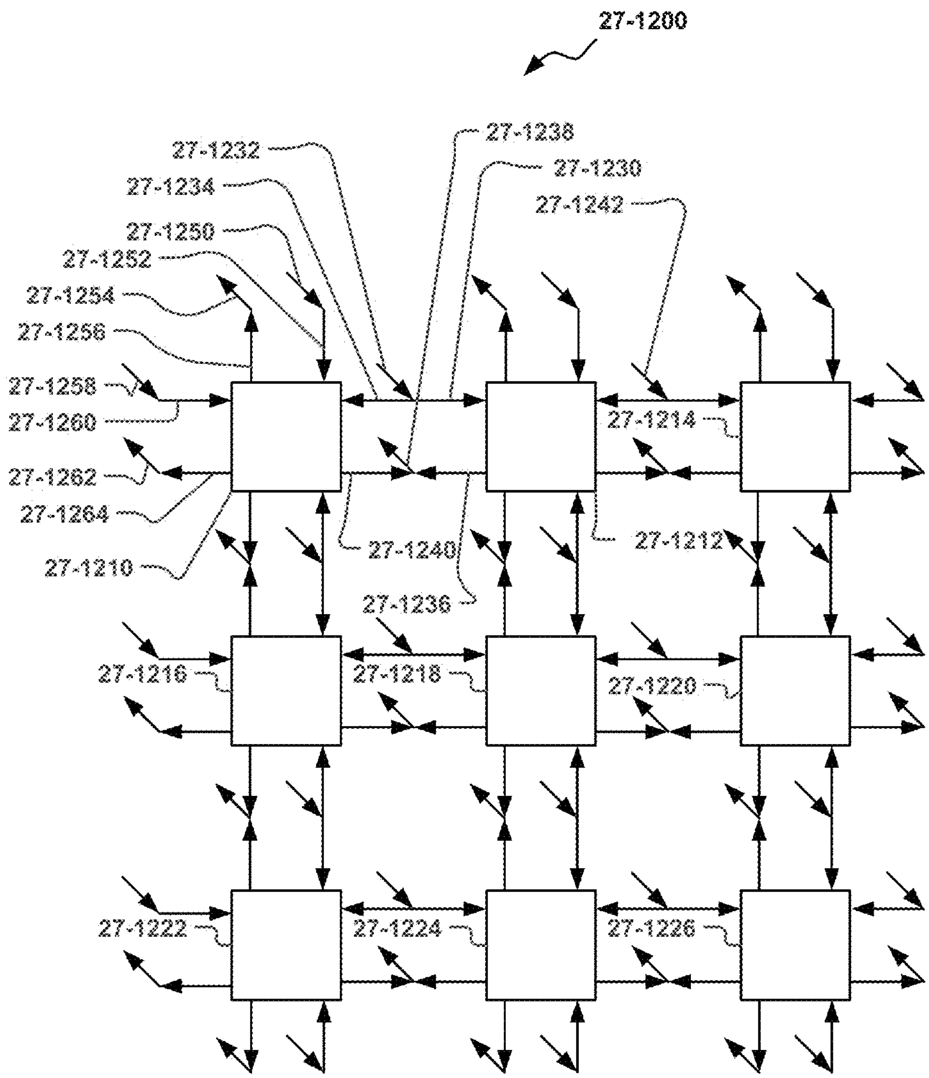
Figures 13, 27:
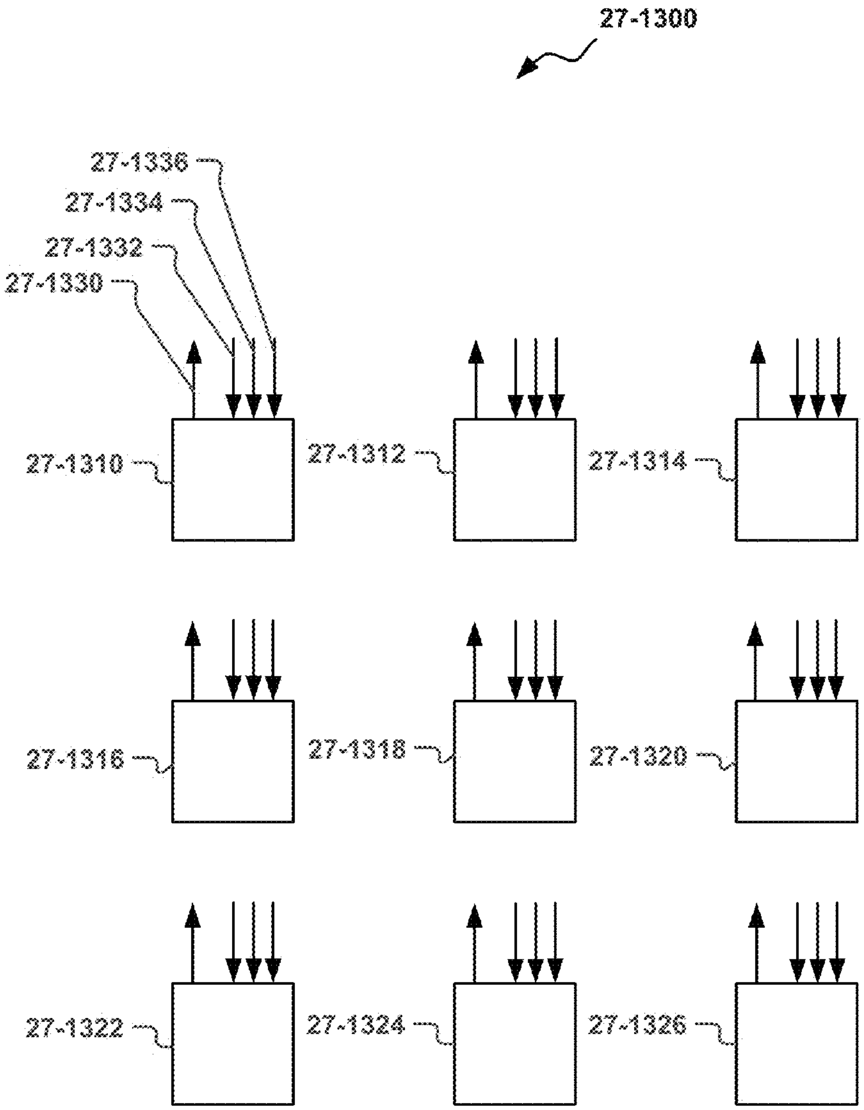
Figures 14, 27:
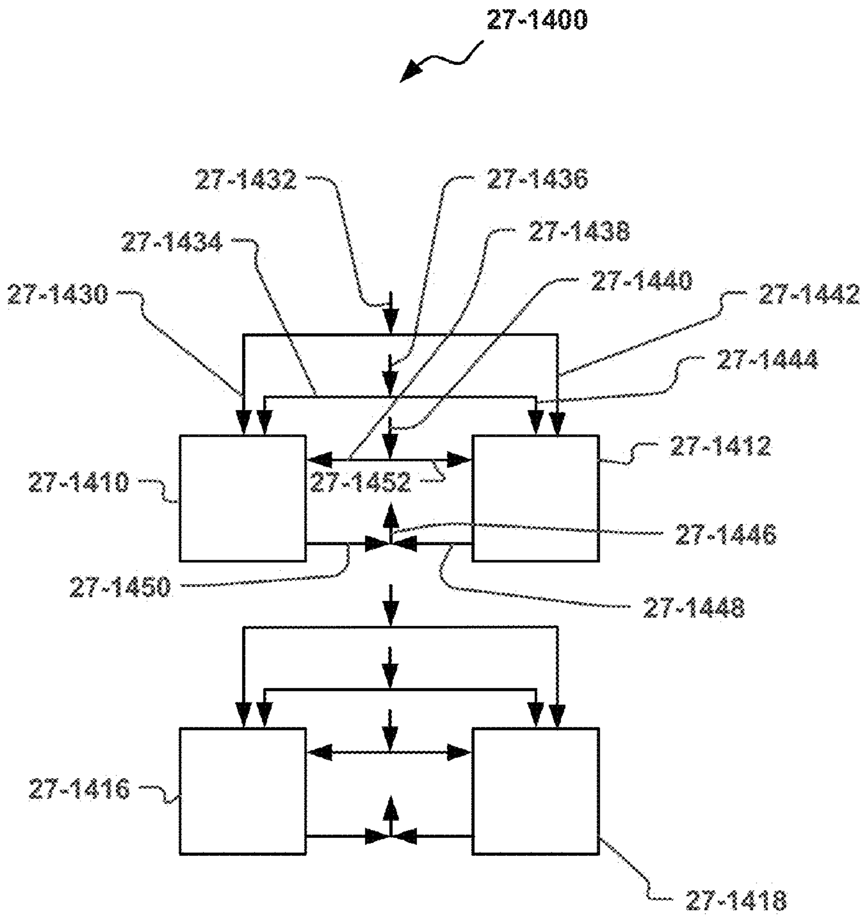
Figures 15, 27:
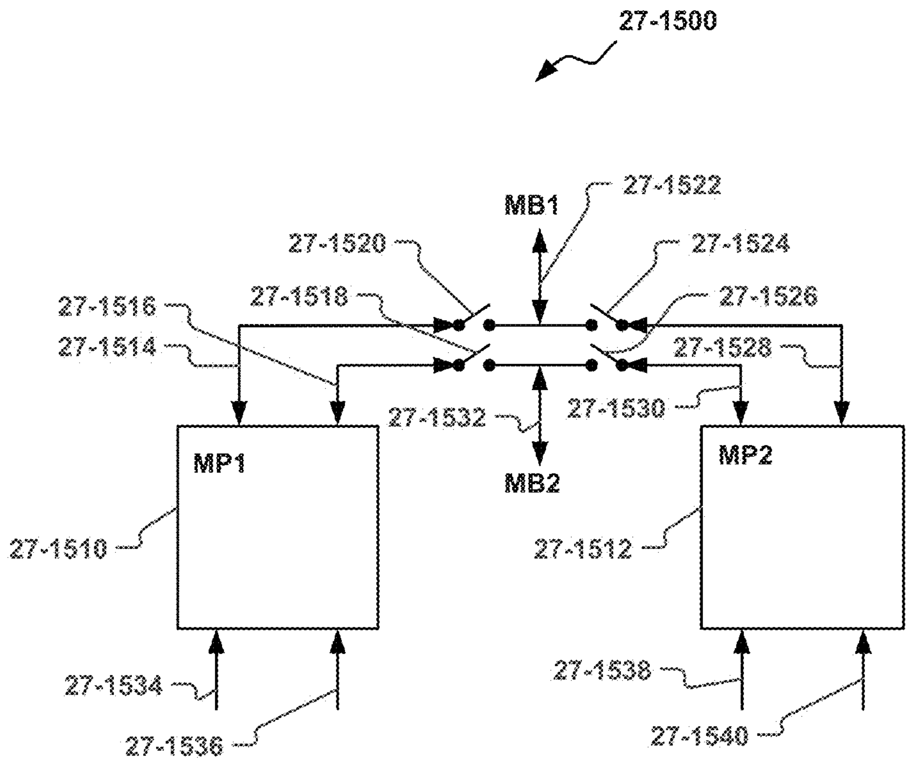
Figures 16, 27:
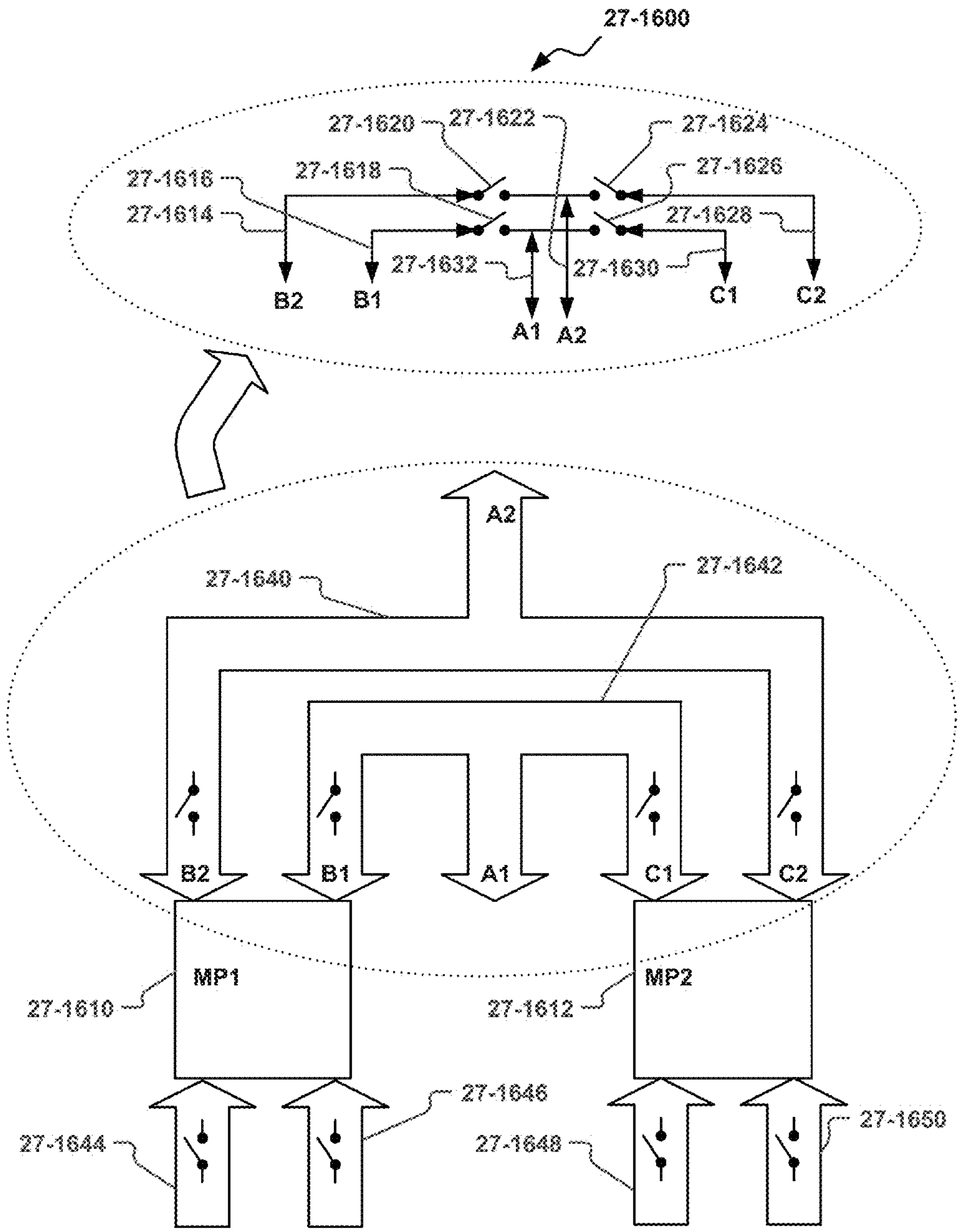

FIG. 27-1D shows an abstract view of a stacked memory package, in accordance with one embodiment.

Figure 2:
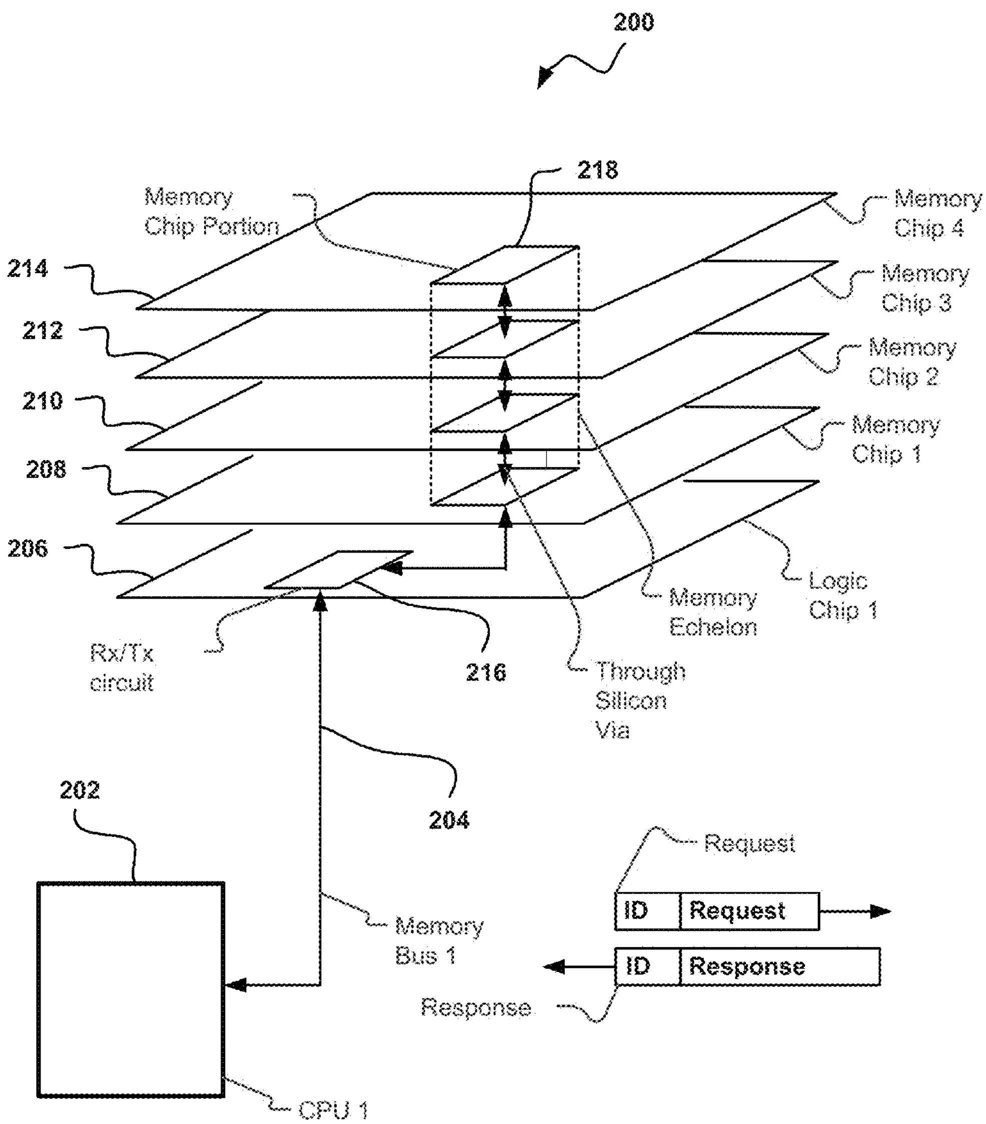
FIG. 2 shows a stacked memory package, in accordance with another embodiment.

FIG. 27-2 shows a stacked memory chip interconnect network, in accordance with one embodiment.

Figure 3:
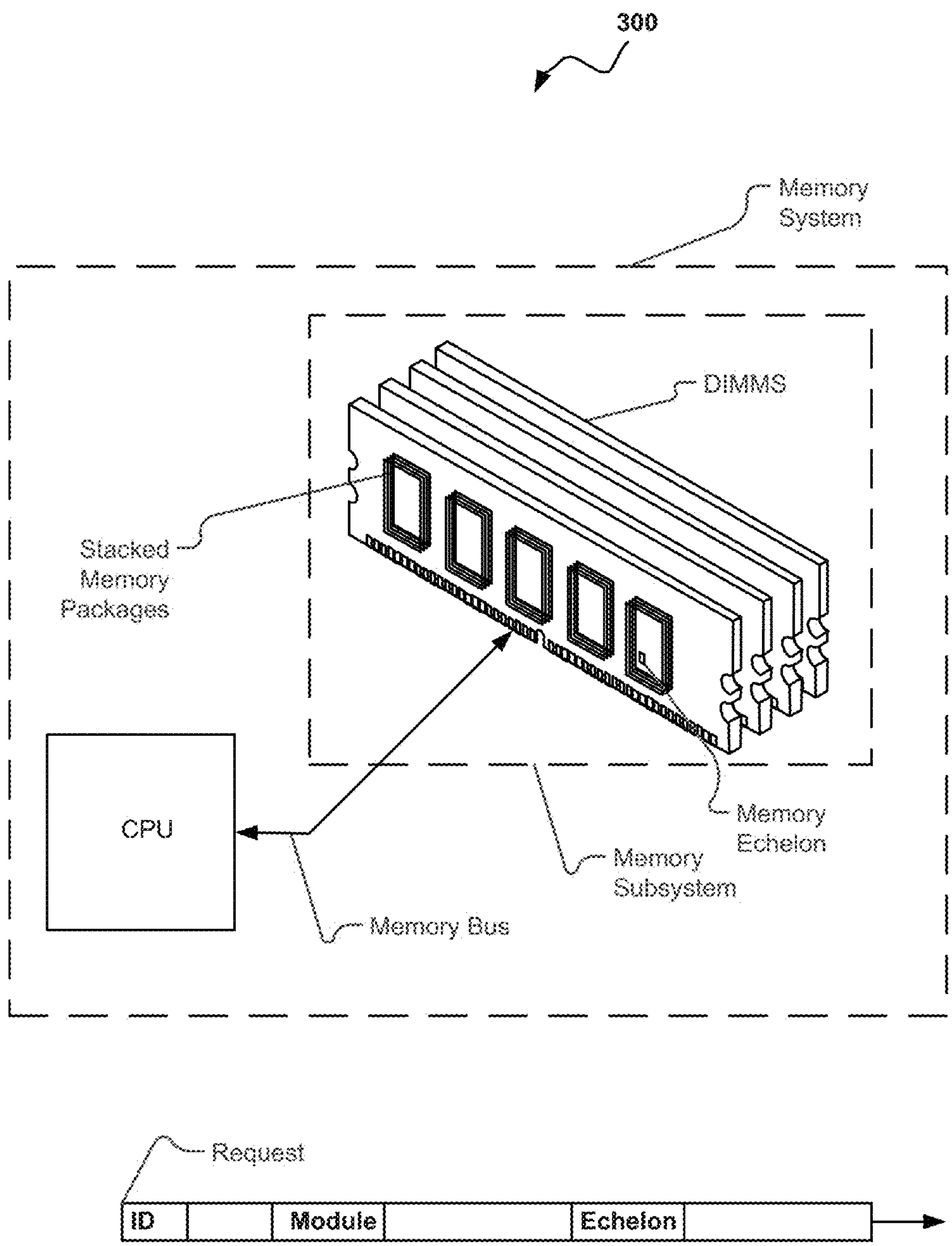
FIG. 3 shows an apparatus using a memory system with DIMMs using stacked memory packages, in accordance with another embodiment.

FIG. 27-3 shows a stacked memory package architecture, in accordance with one embodiment.

Figure 4:
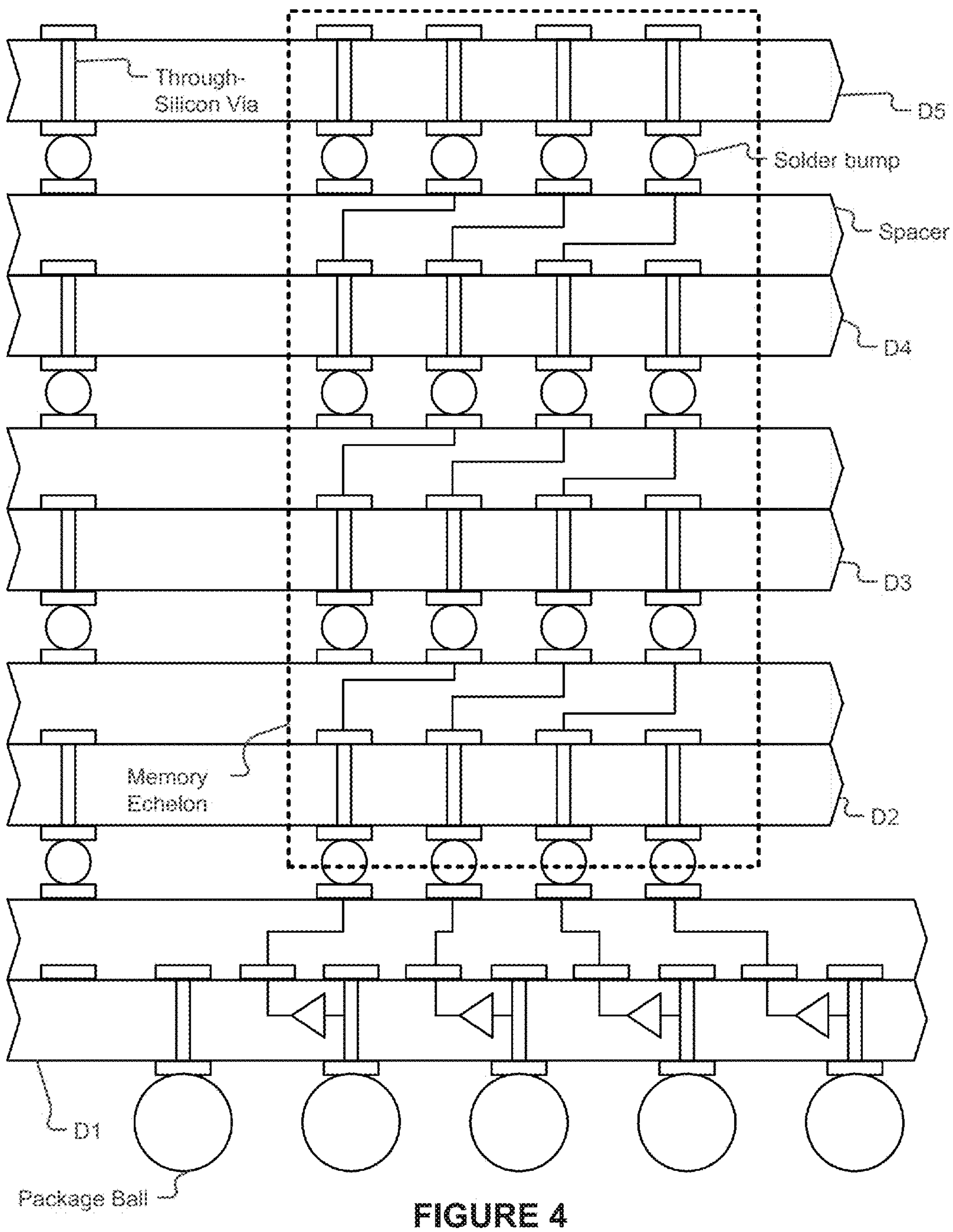
FIG. 4 shows a stacked memory package, in accordance with another embodiment.

FIG. 27-4 shows a stacked memory package architecture, in accordance with one embodiment.

Figure 5:
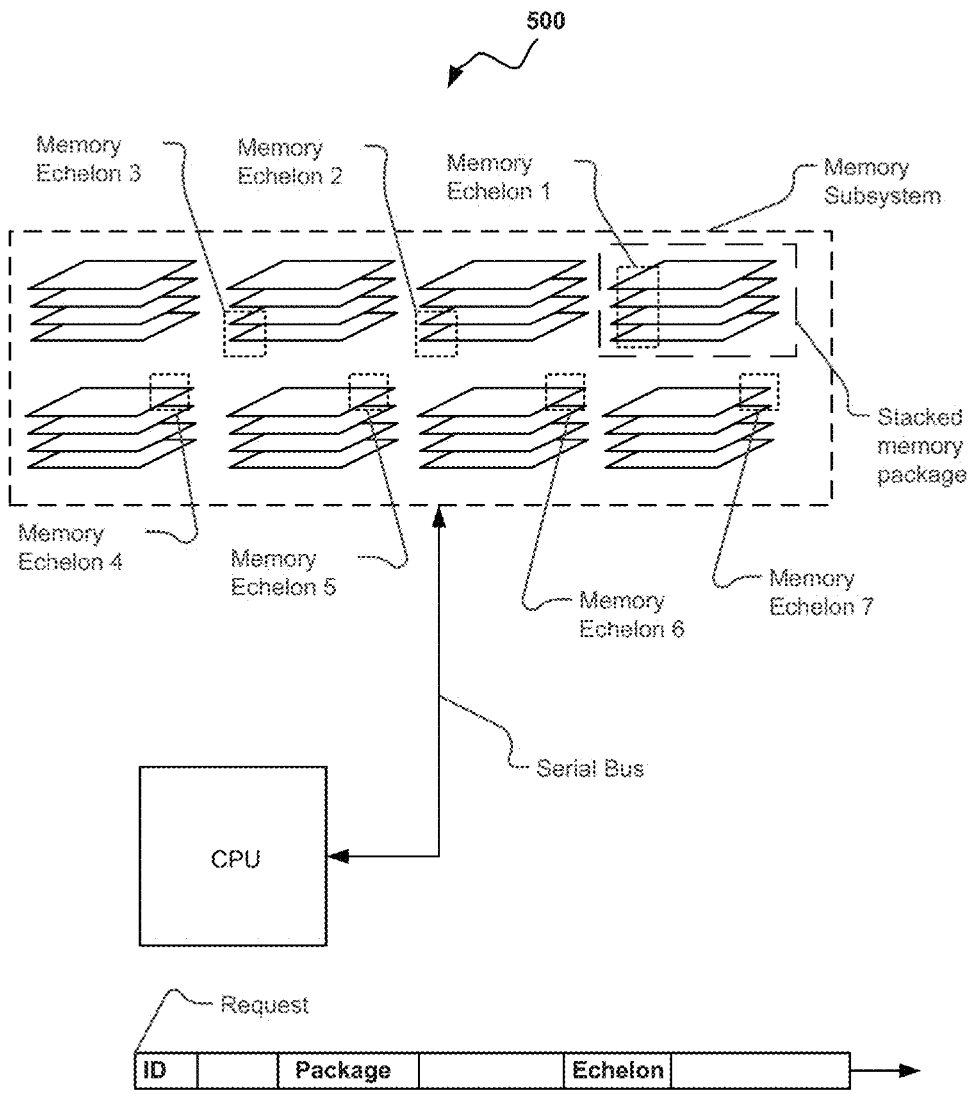
FIG. 5 shows a memory system using stacked memory packages, in accordance with another embodiment.

FIG. 27-5 shows a stacked memory package architecture, in accordance with one embodiment.

Figure 6:
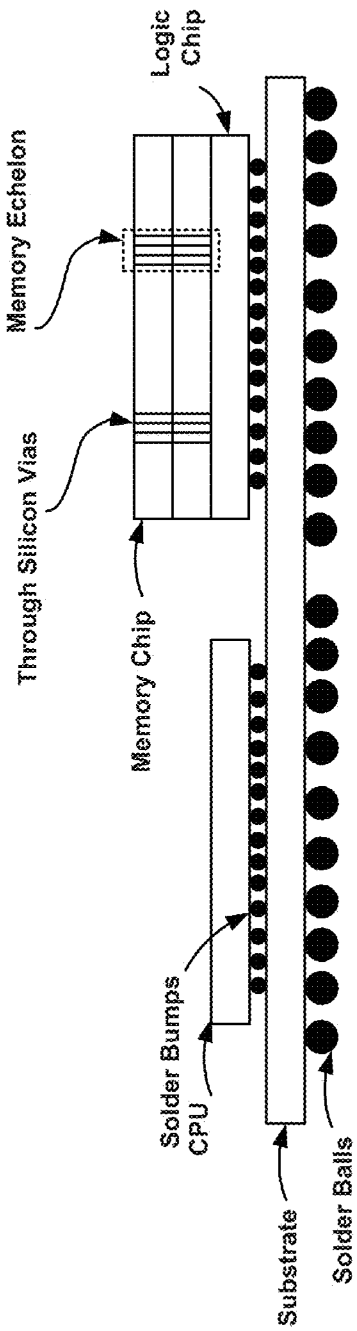
FIG. 6 shows a memory system using stacked memory packages, in accordance with another embodiment.

FIG. 27-6 shows a receive datapath, in accordance with one embodiment.

FIG. 27-7 shows a receive datapath, in accordance with one embodiment.

FIG. 27-8 shows a receive datapath, in accordance with one embodiment.

FIG. 27-9 shows a receive datapath, in accordance with one embodiment.

Figure 10:
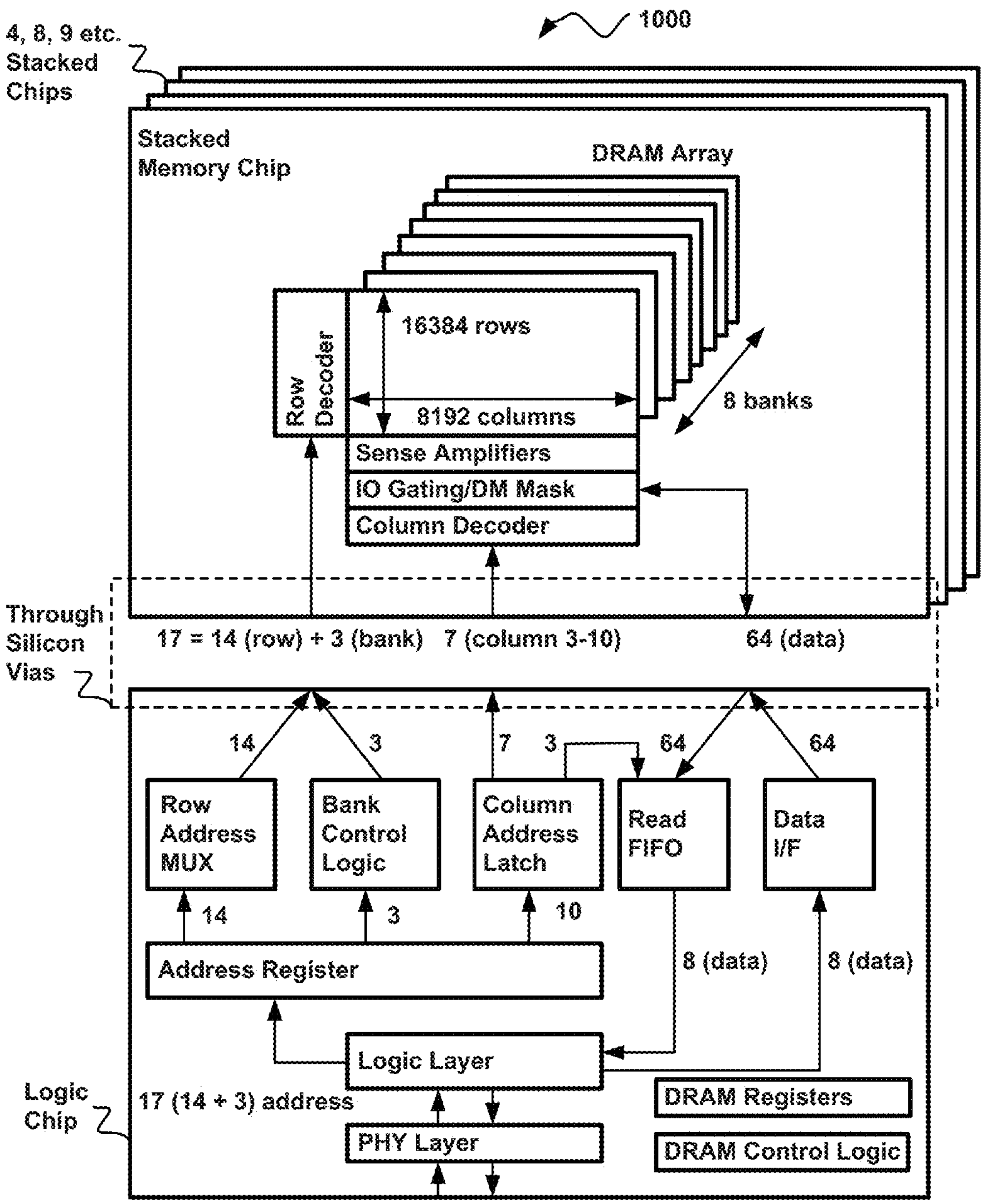
FIG. 10 shows a stacked memory package comprising a logic chip and a plurality of stacked memory chips, in accordance with another embodiment.

FIG. 27-10 shows a receive datapath, in accordance with one embodiment.

Figure 11:
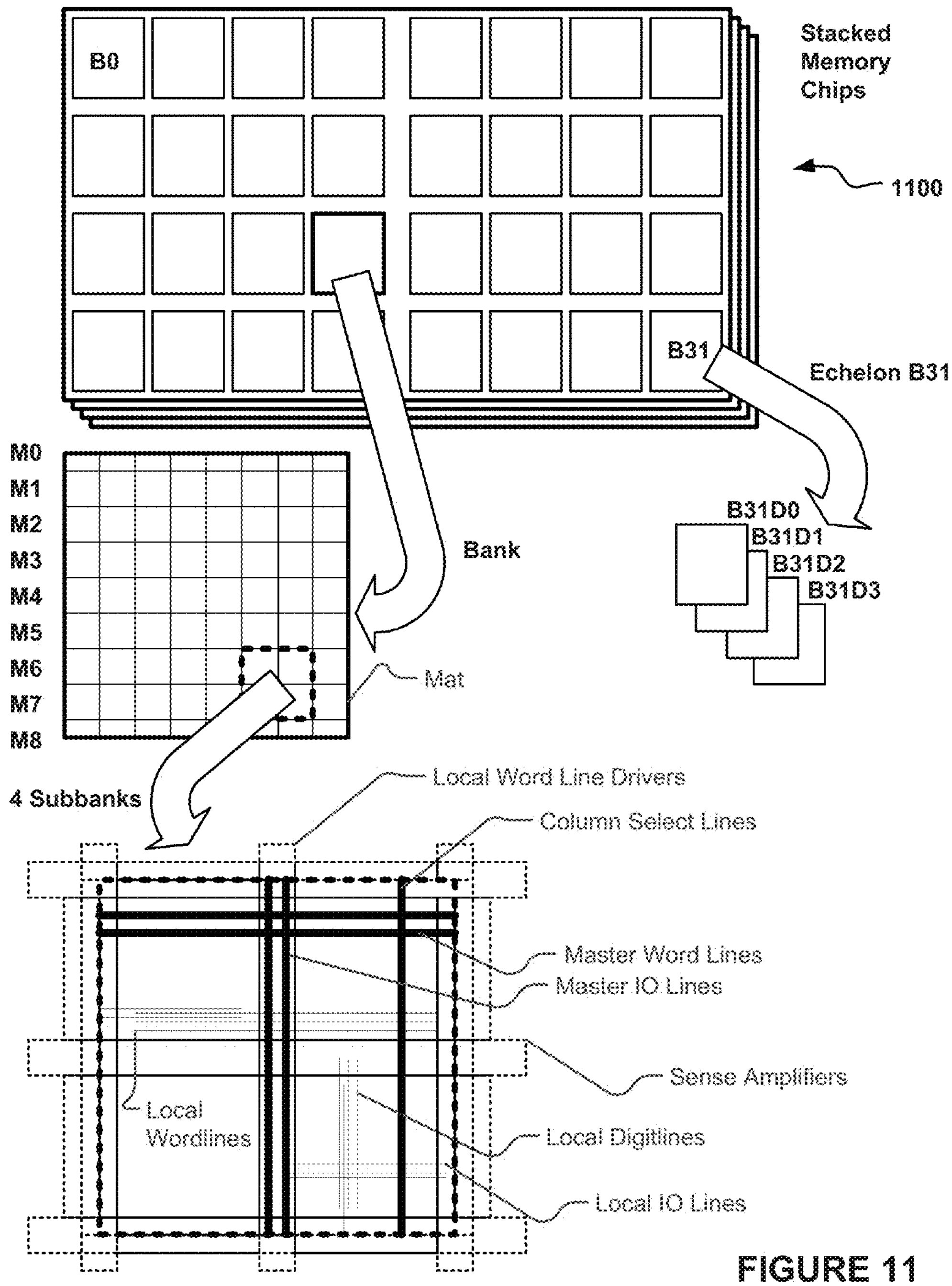
FIG. 11 shows a stacked memory chip, in accordance with another embodiment.

FIG. 27-11 shows a transmit datapath, in accordance with one embodiment.

Figure 12:
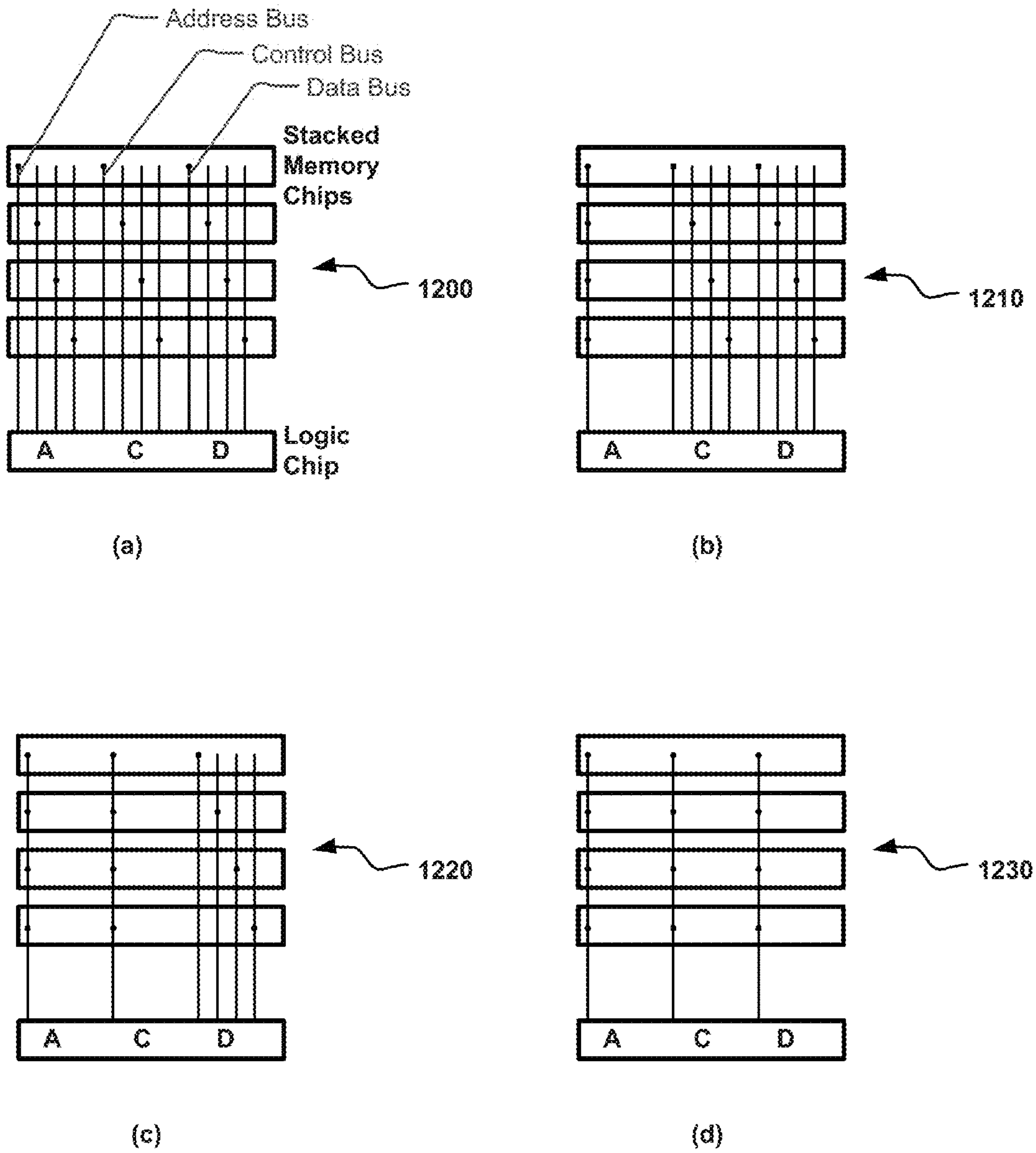
FIG. 12 shows a logic chip connected to stacked memory chips, in accordance with another embodiment.

FIG. 27-12 shows a memory chip interconnect network, in accordance with one embodiment.

Figures 1, 19:
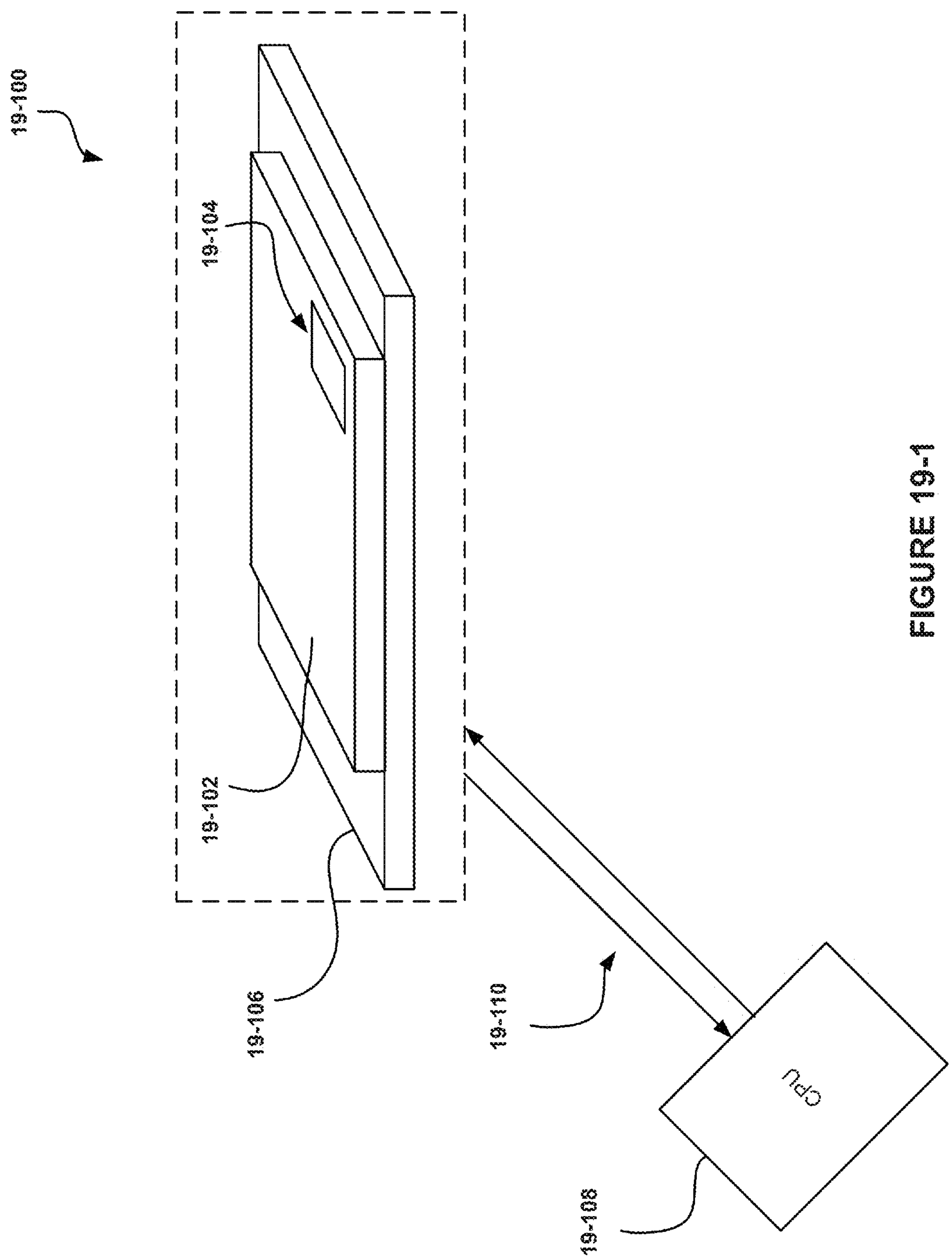
FIG. 19-1 shows an apparatus including a plurality of semiconductor platforms, in accordance with one embodiment.
Figures 2, 19:
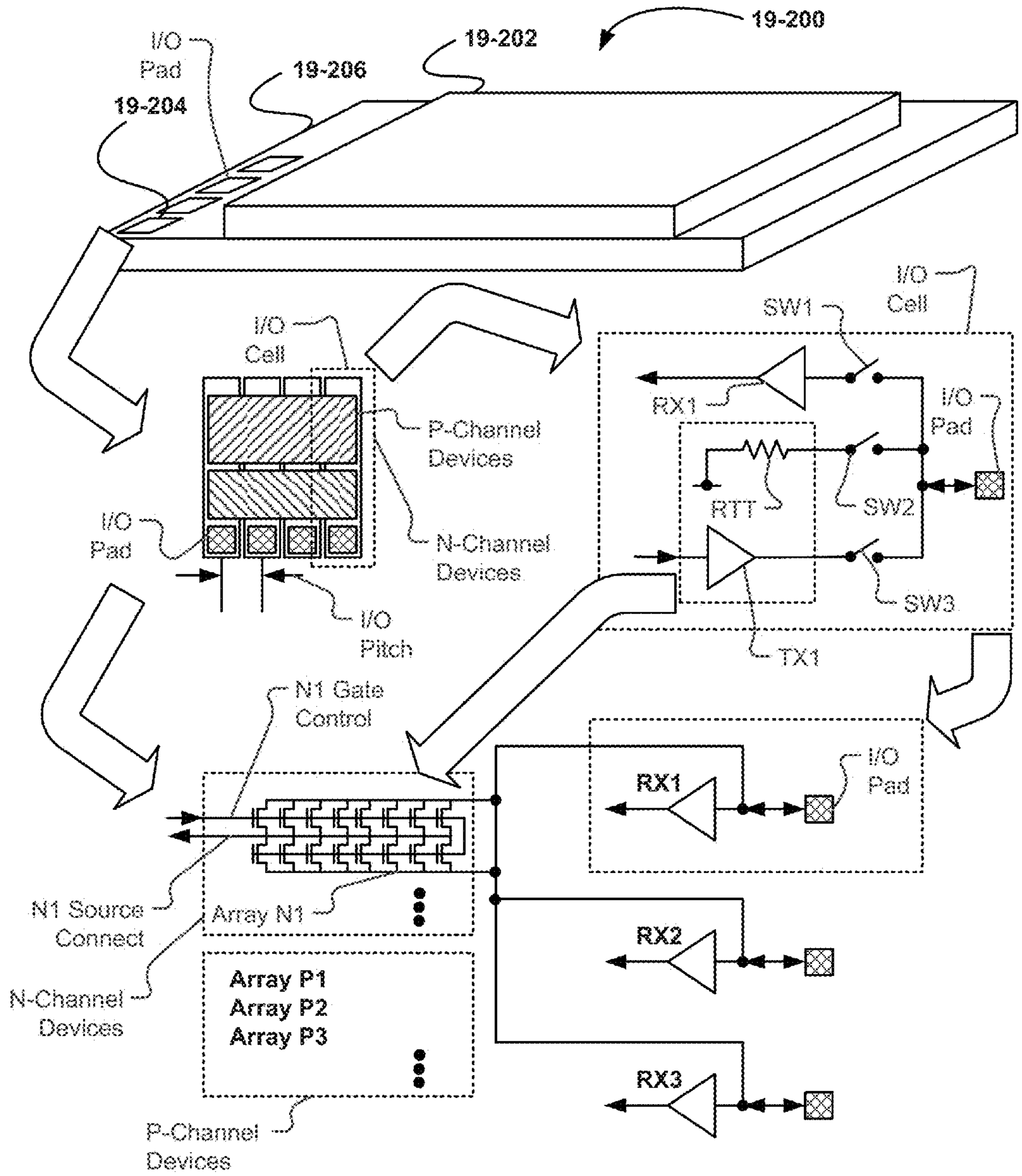
Figures 3, 19:
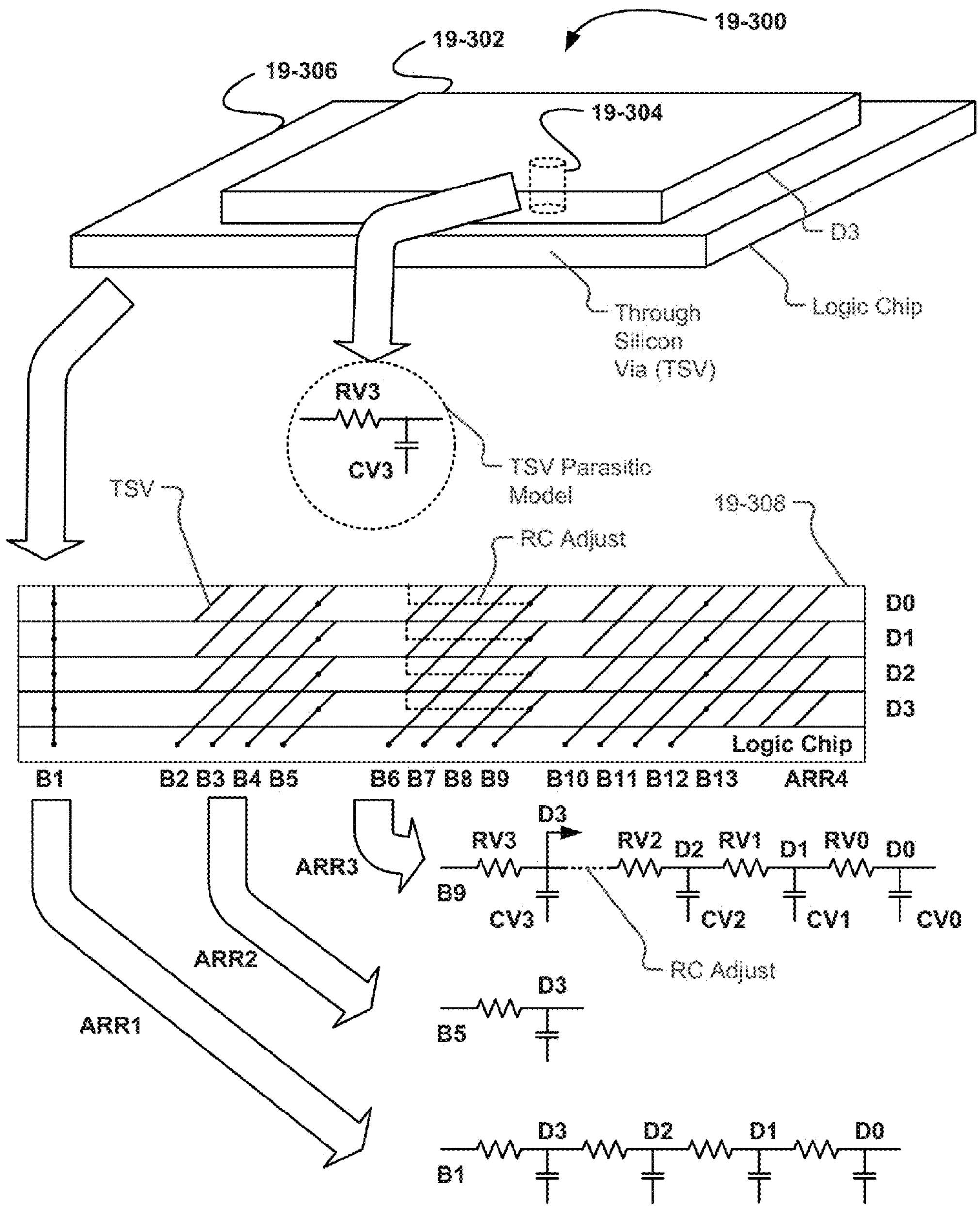
Figures 4, 19:
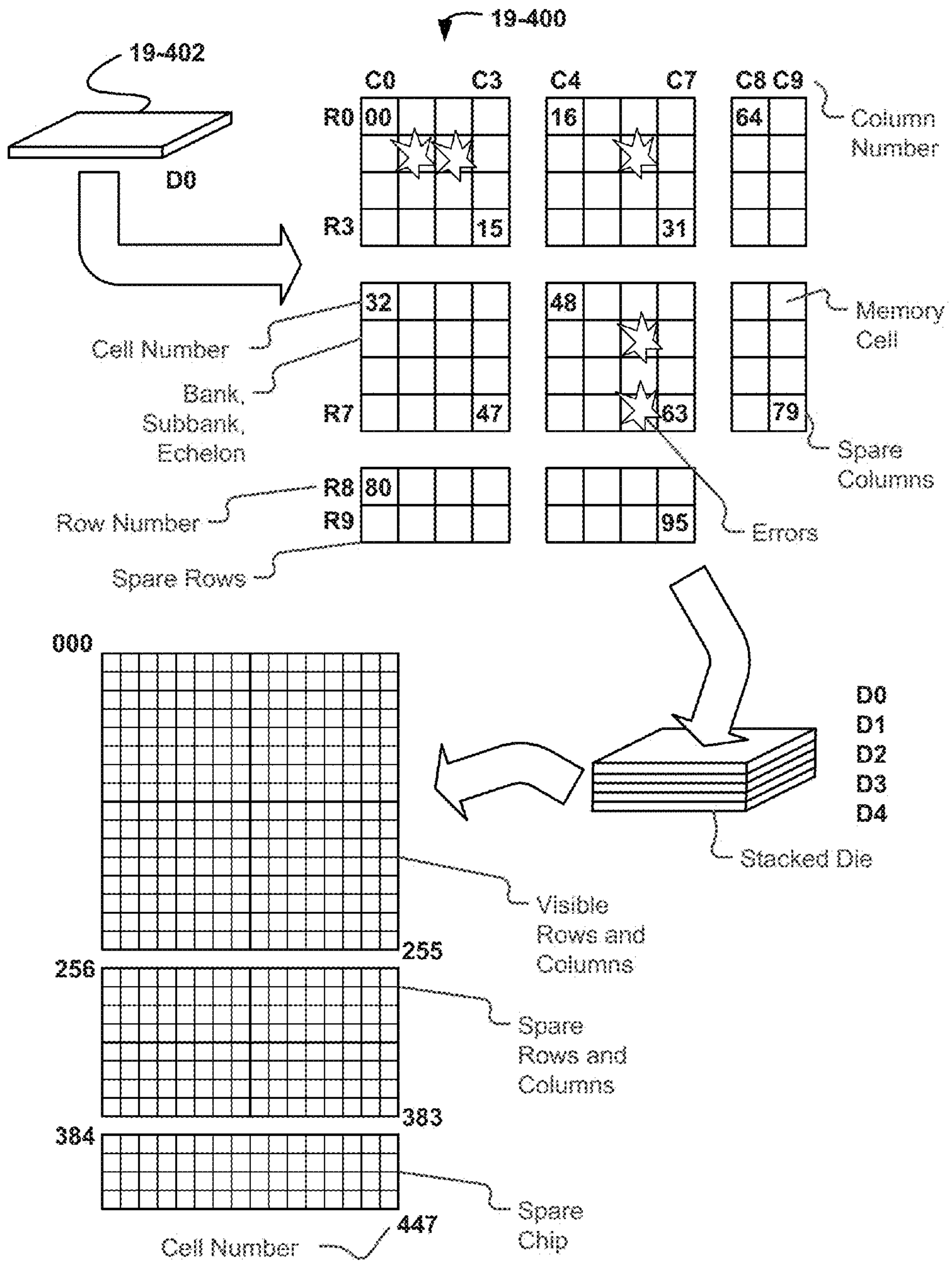
Figures 5, 19:
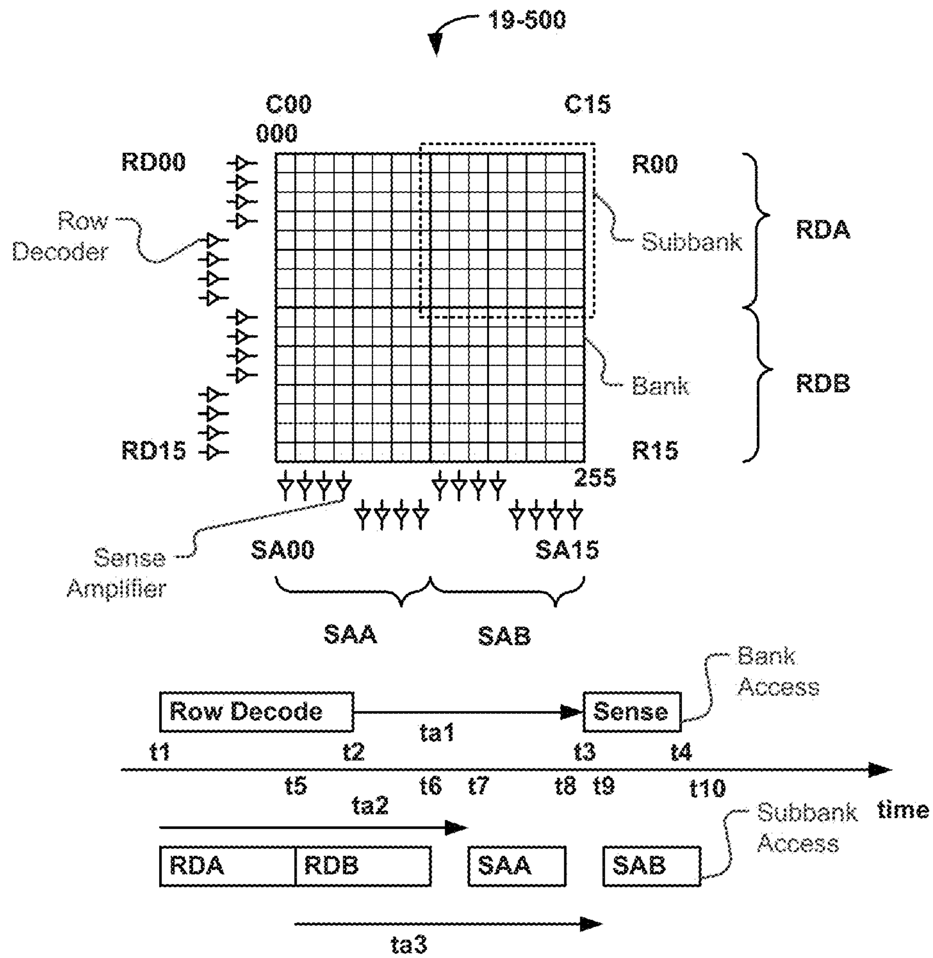
Figures 6, 19:
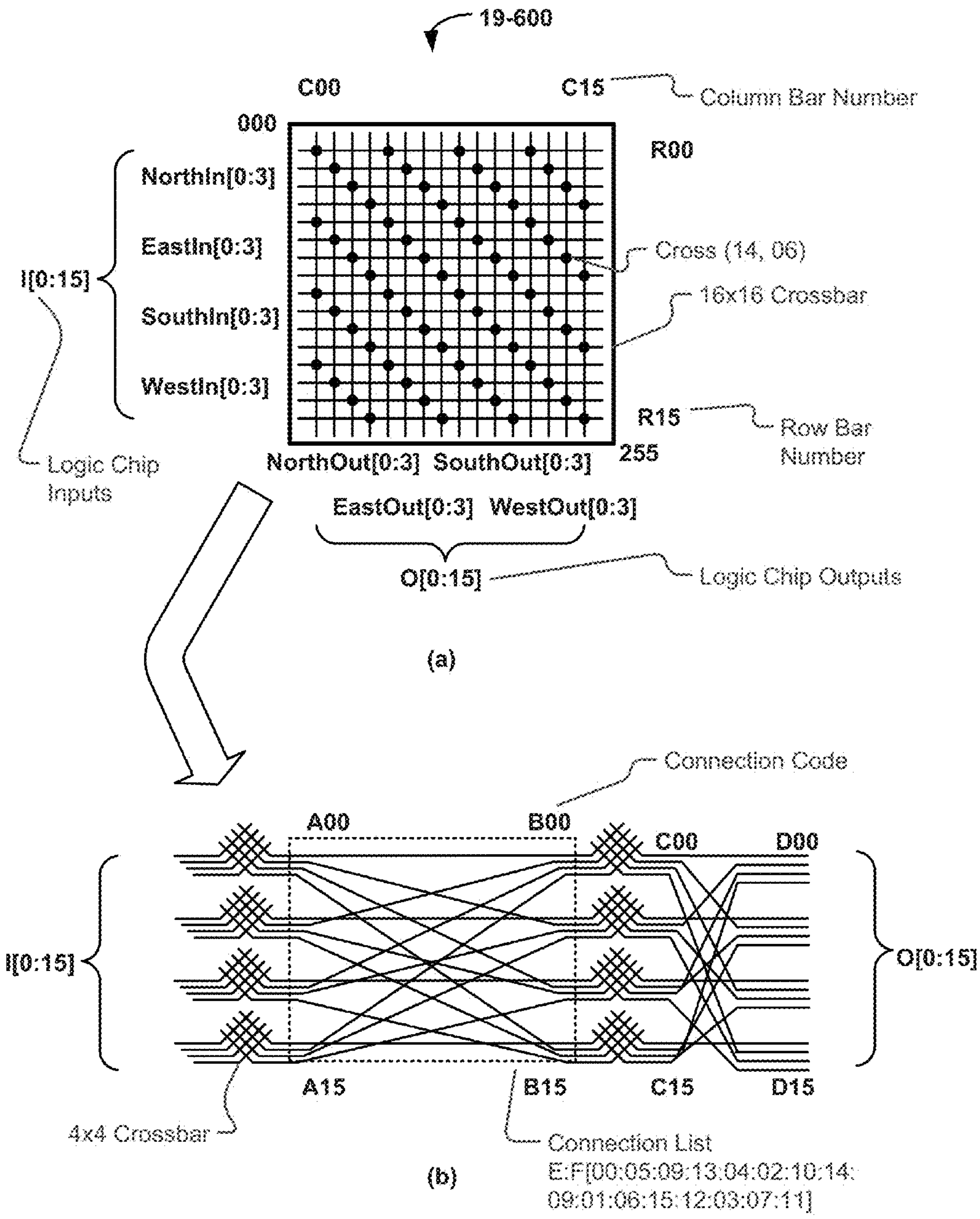
Figures 7, 19:
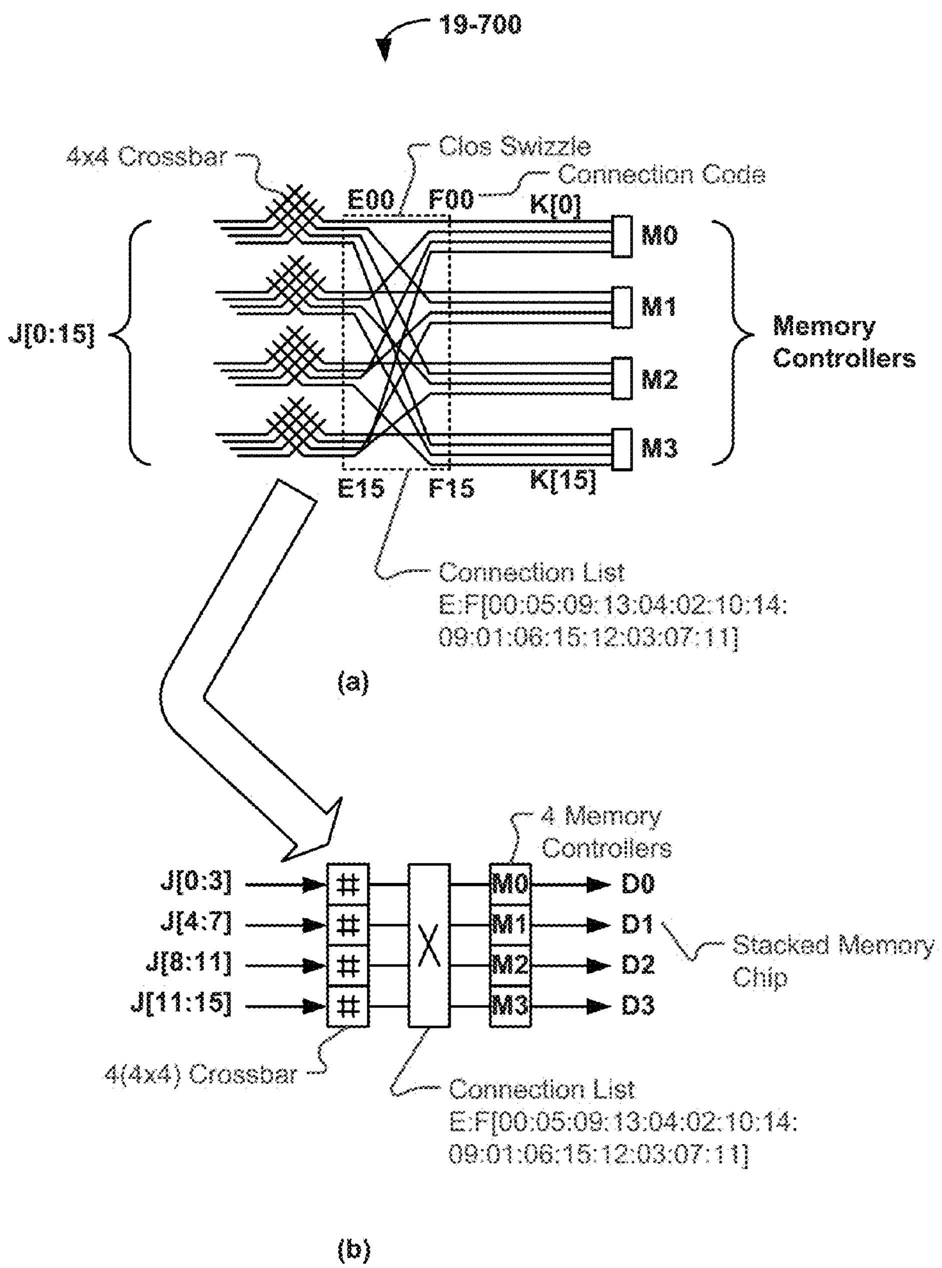
Figures 8, 19:
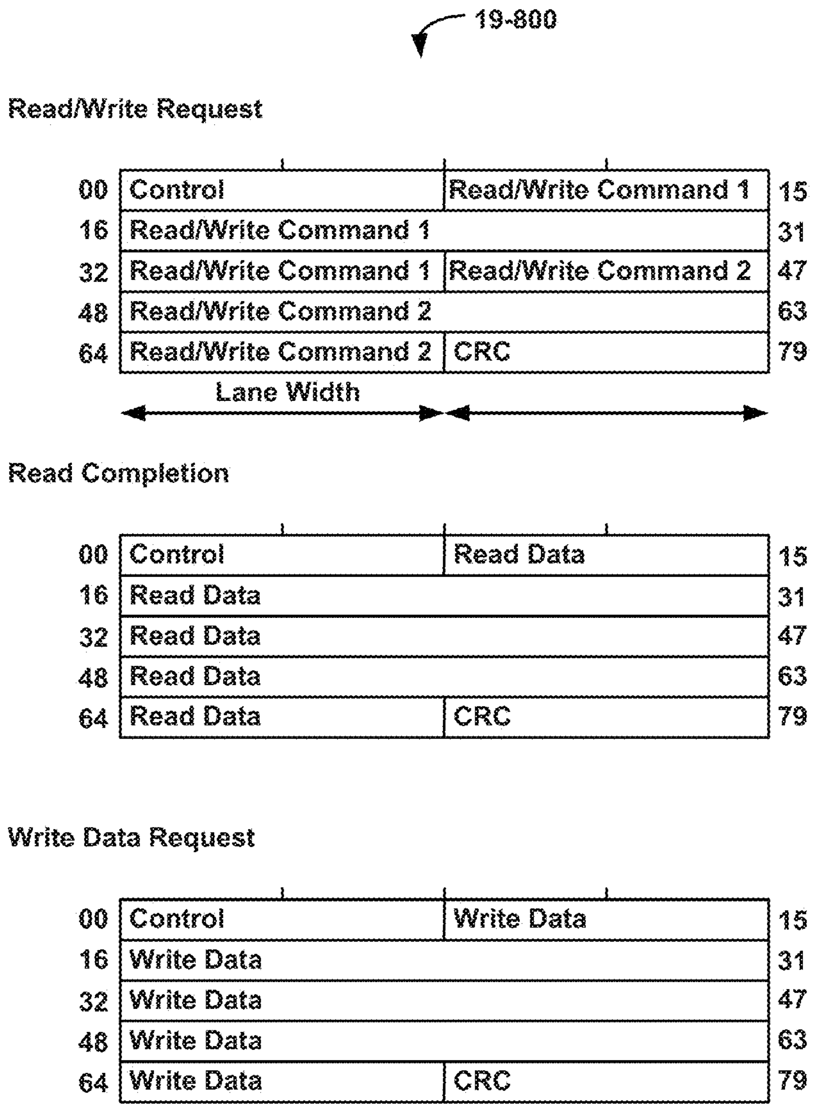
Figures 9, 19:
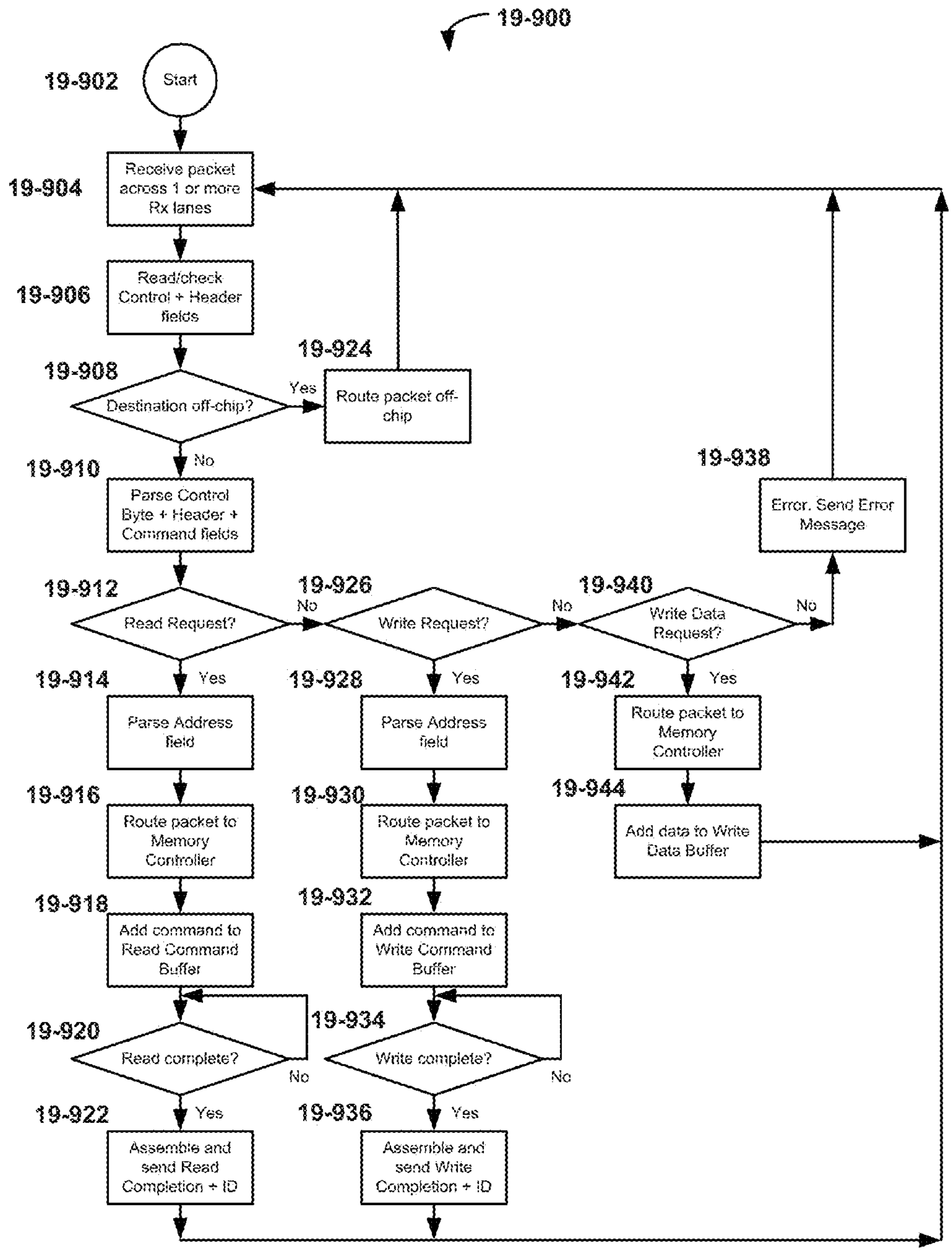
Figures 10, 19:
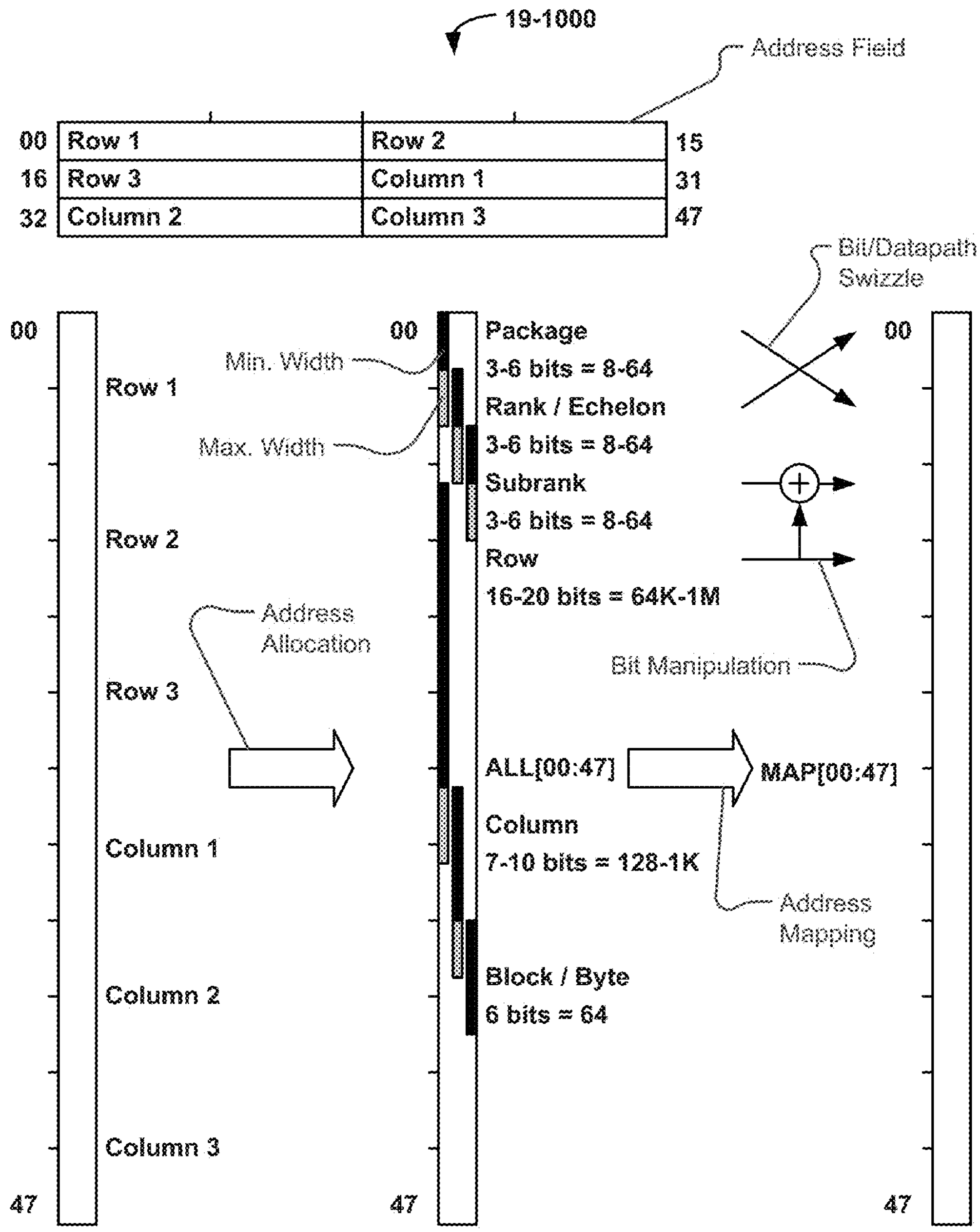
Figures 11, 19:
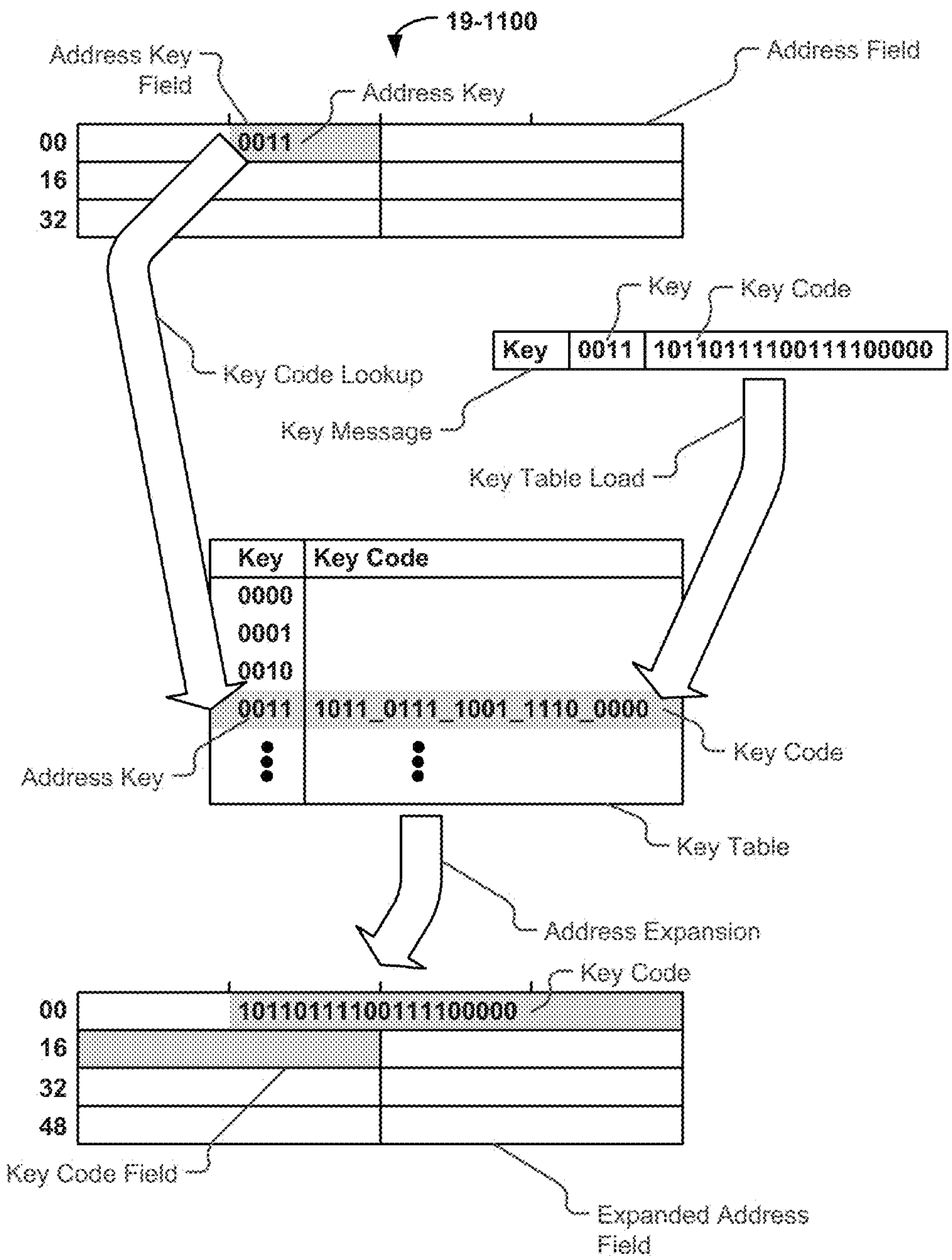
Figures 12, 19:
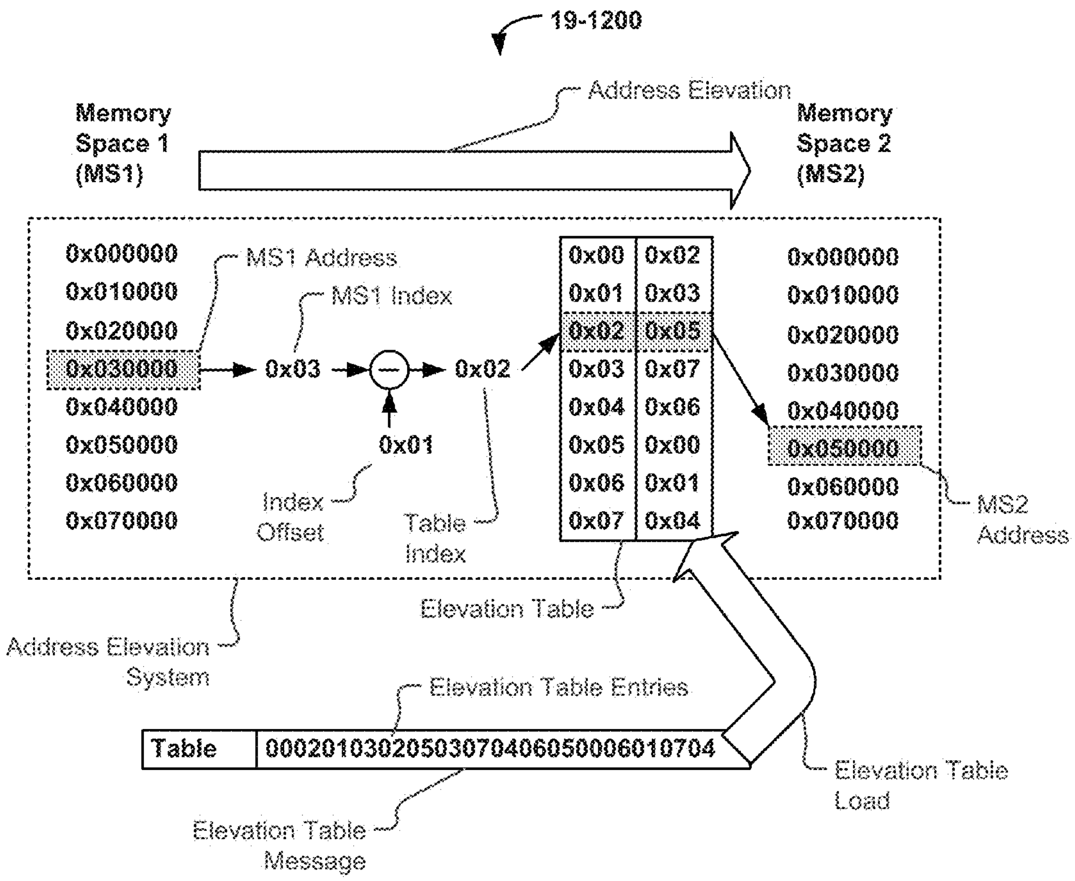
Figures 13, 19:
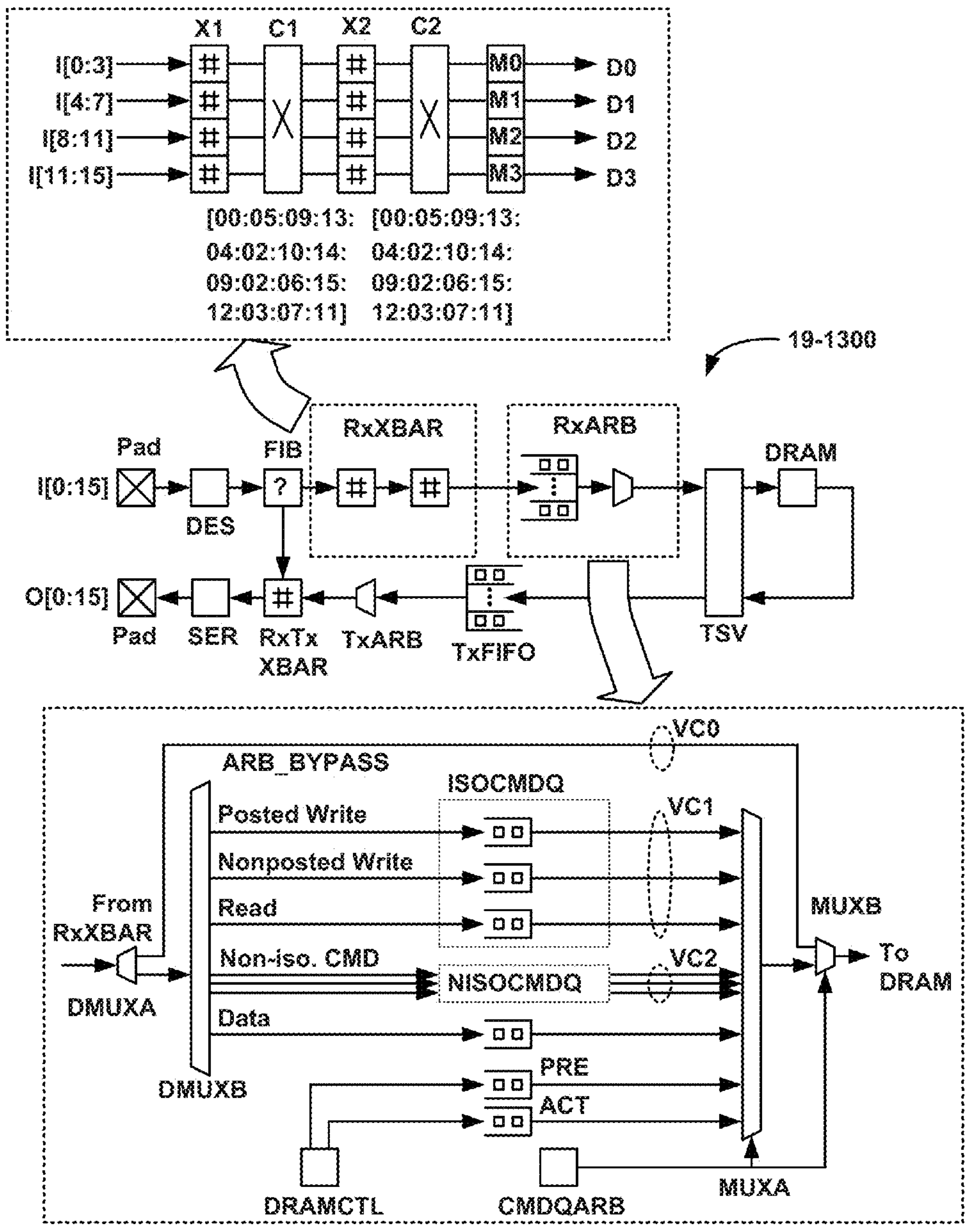
FIG. 13 shows a logic chip connected to stacked memory chips, in accordance with another embodiment.
Figures 14, 19:
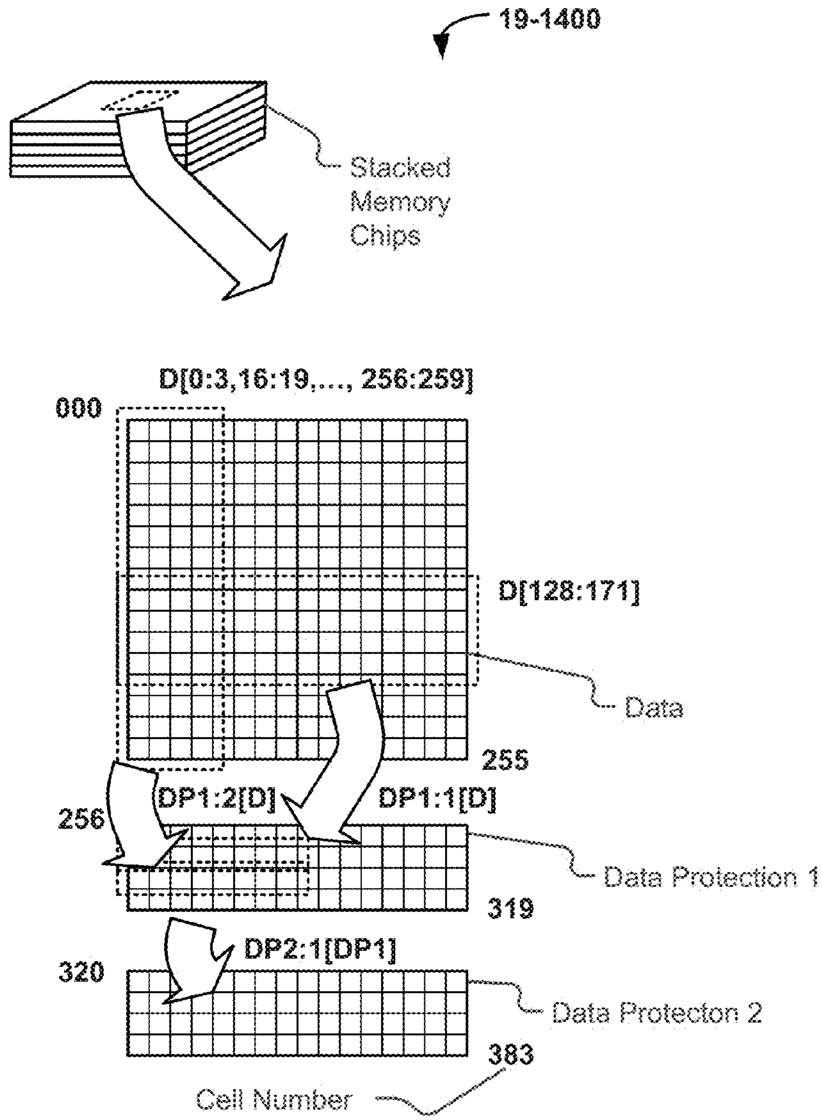
Figures 15, 19:
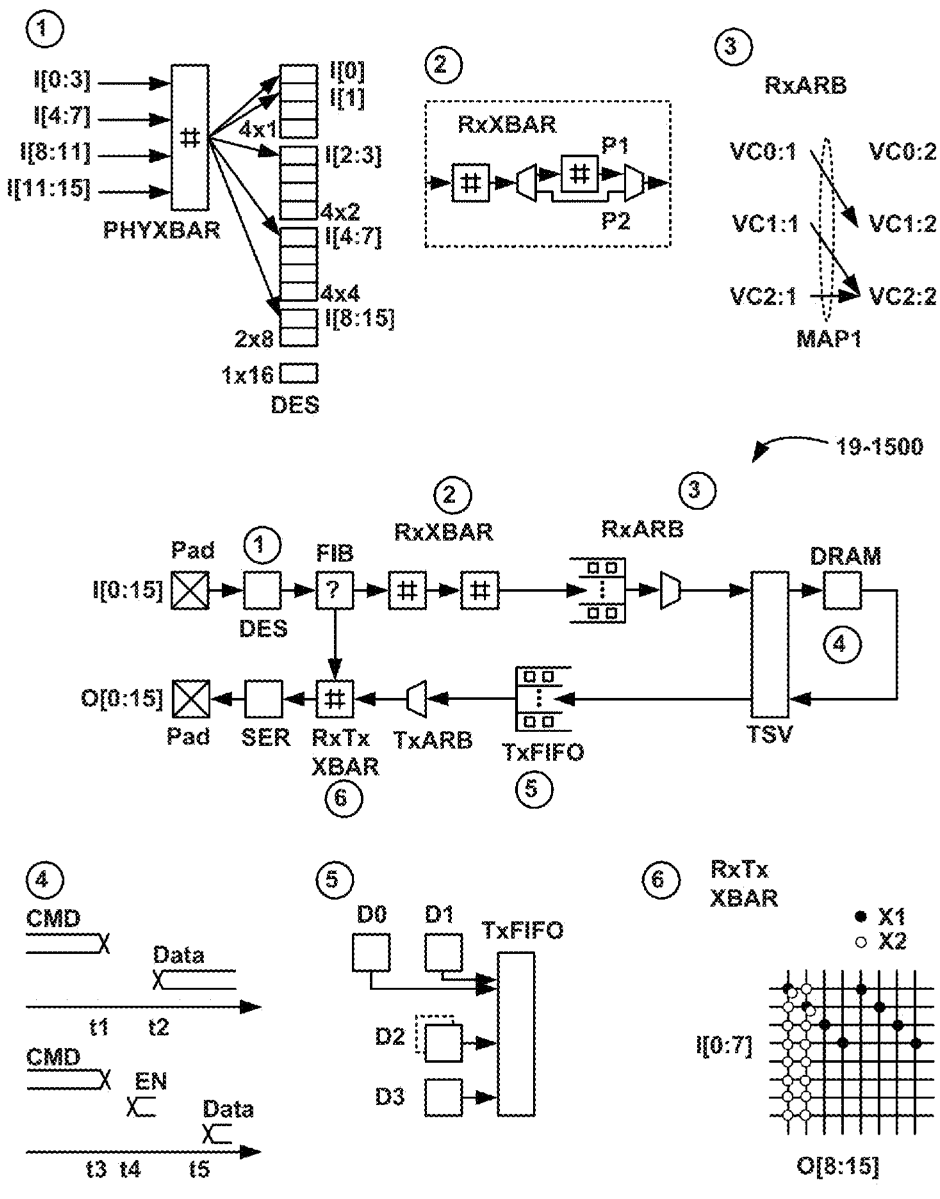

FIG. 27-13 shows a memory chip interconnect network, in accordance with one embodiment.

Figure 14:
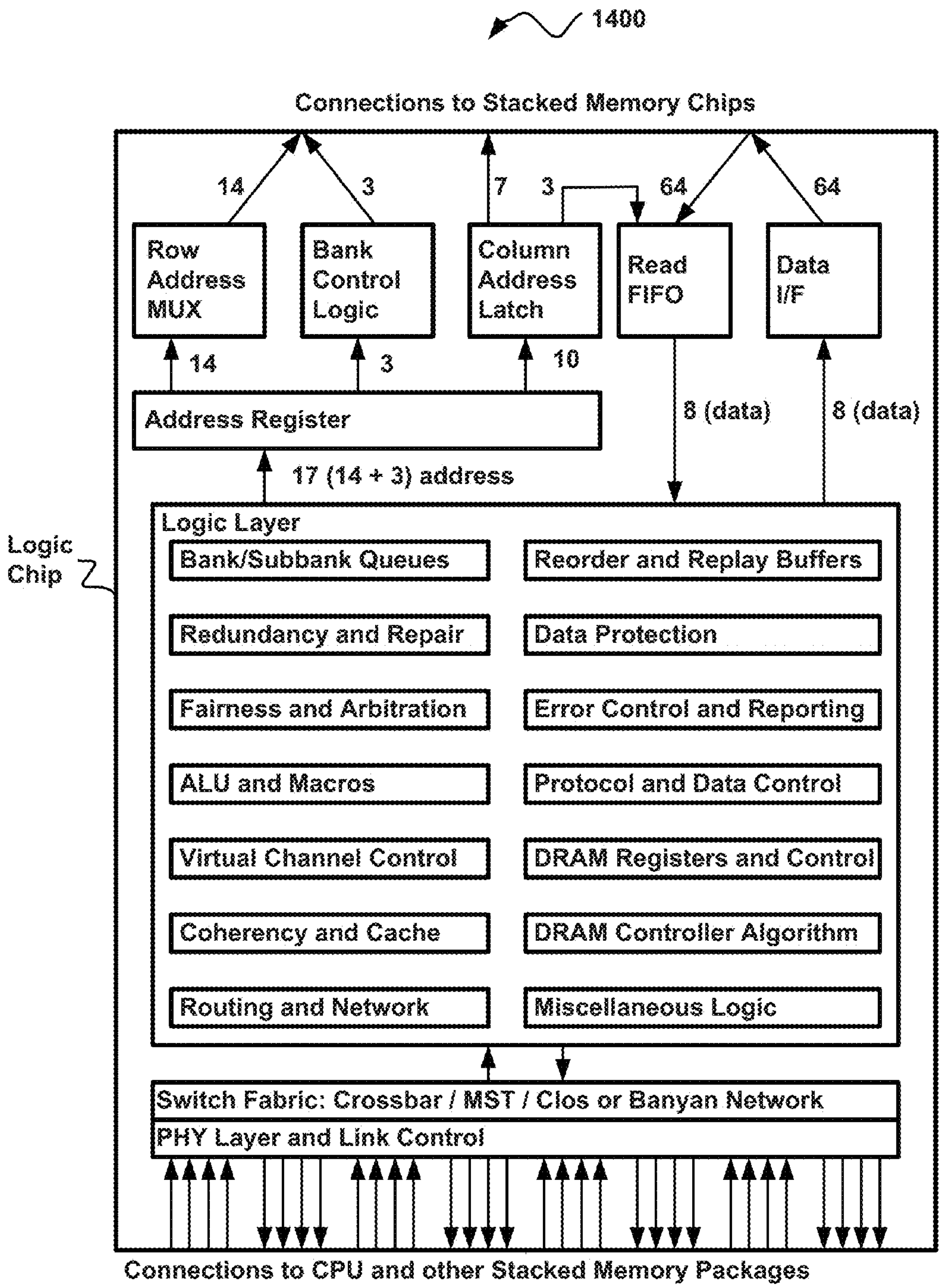
FIG. 14 shows a logic chip for use with stacked memory chips in a stacked memory chip package, in accordance with another embodiment.

FIG. 27-14 shows a memory chip interconnect network, in accordance with one embodiment.

Figure 15:
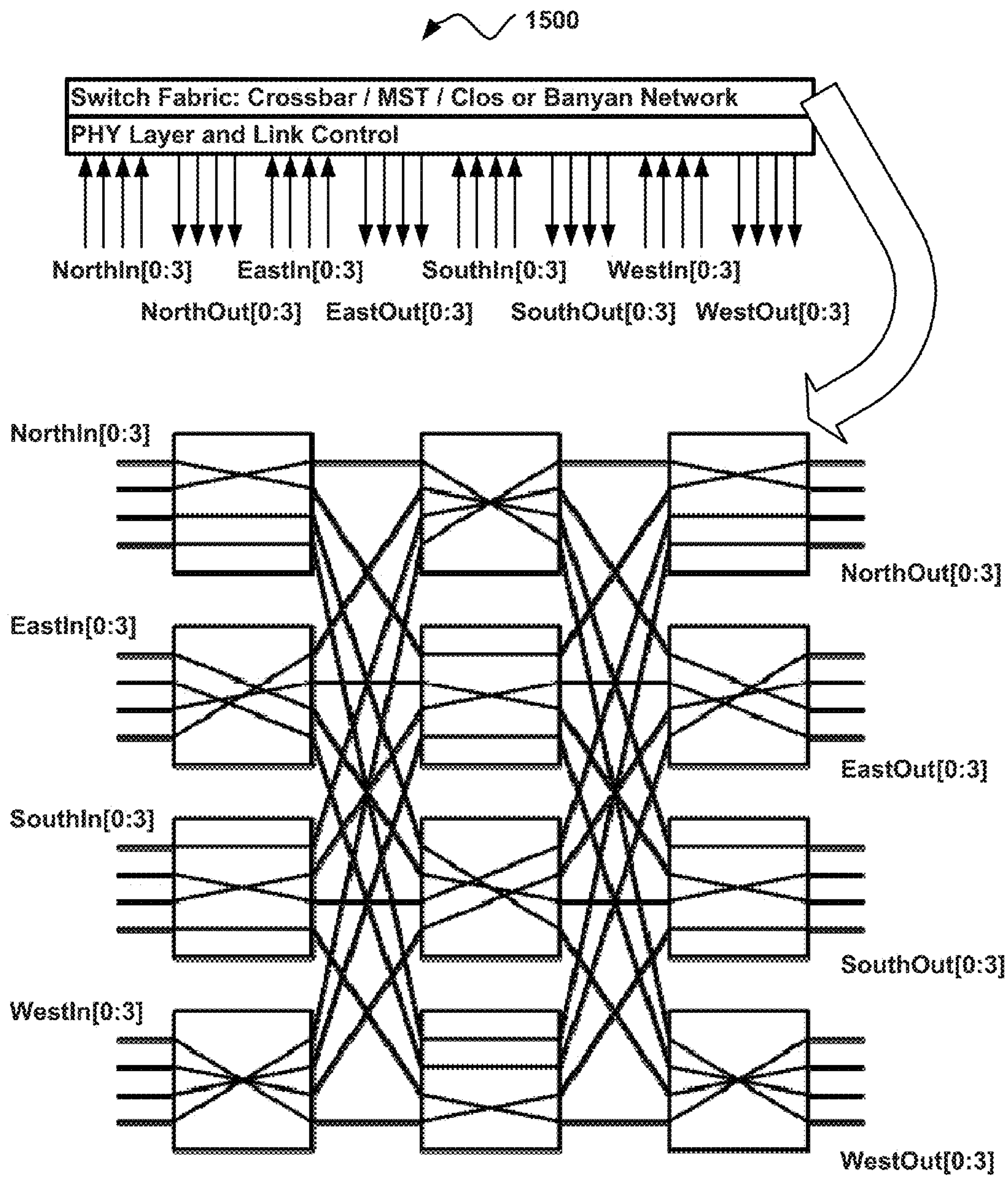
FIG. 15 shows the switch fabric for a logic chip for use with stacked memory chips in a stacked memory chip package, in accordance with another embodiment.

FIG. 27-15 shows a memory chip interconnect network, in accordance with one embodiment.

Figure 16:
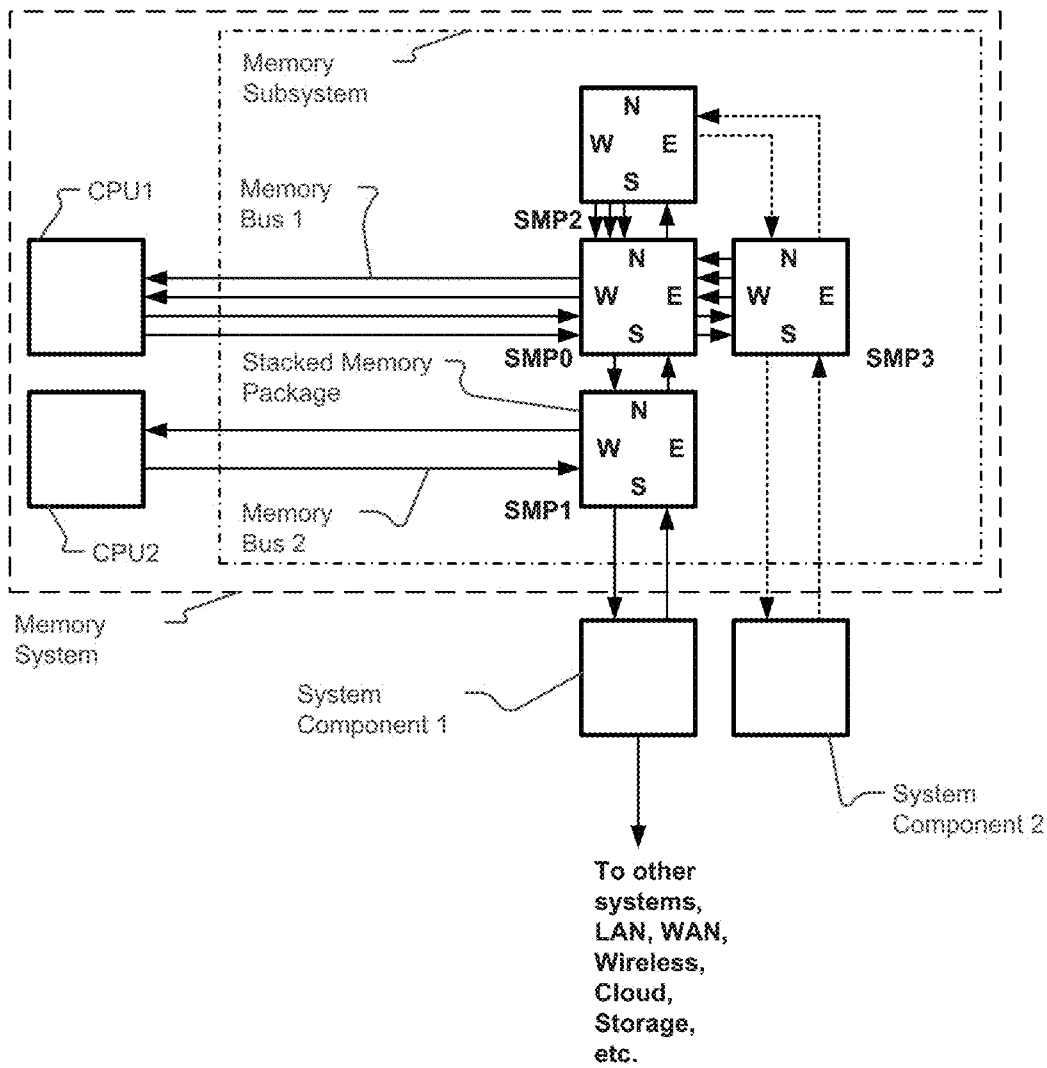
FIG. 16 shows a memory system comprising stacked memory chip packages, in accordance with another embodiment.

FIG. 27-16 shows a memory chip interconnect network, in accordance with one embodiment.

Figures 1, 28:
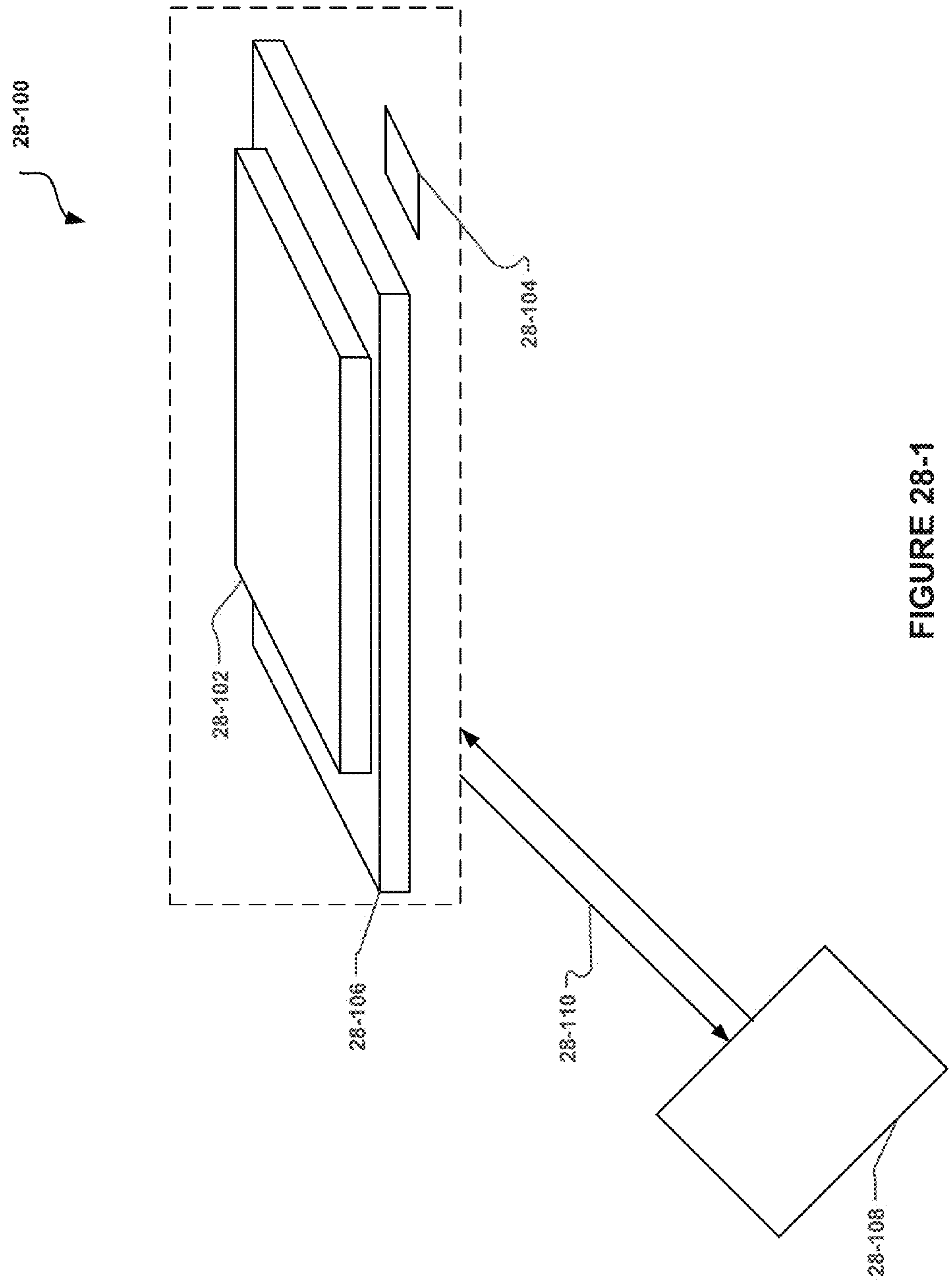
Figures 2, 28:
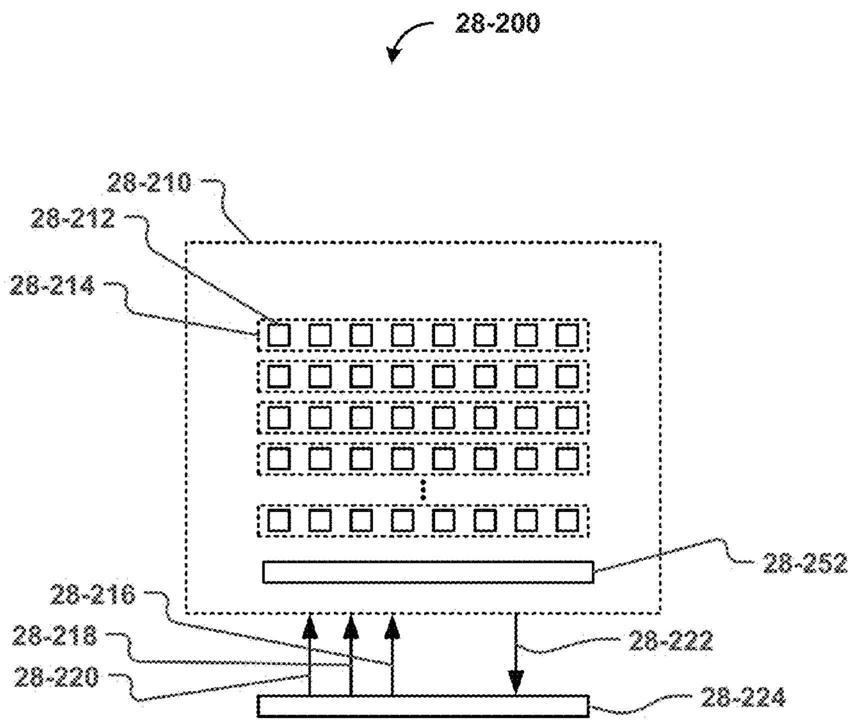
Figures 3, 28:
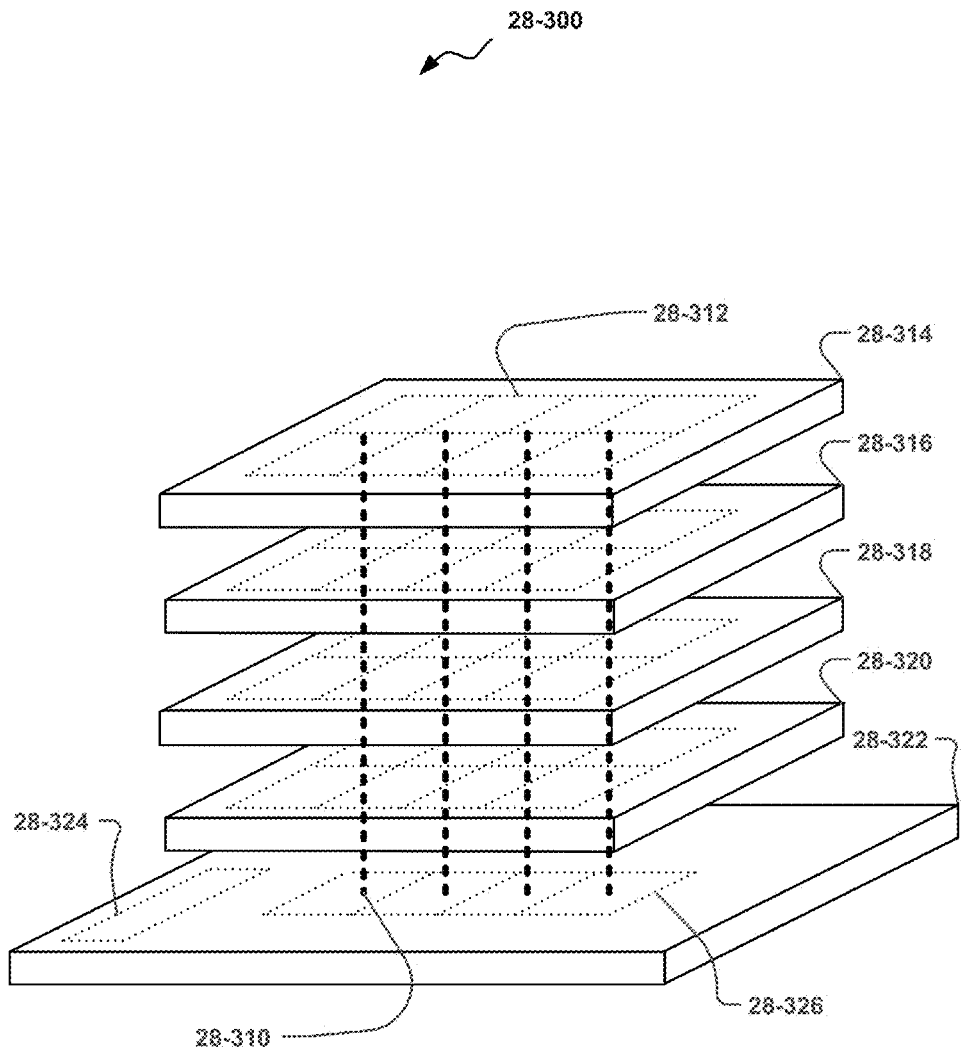
Figures 4, 28:
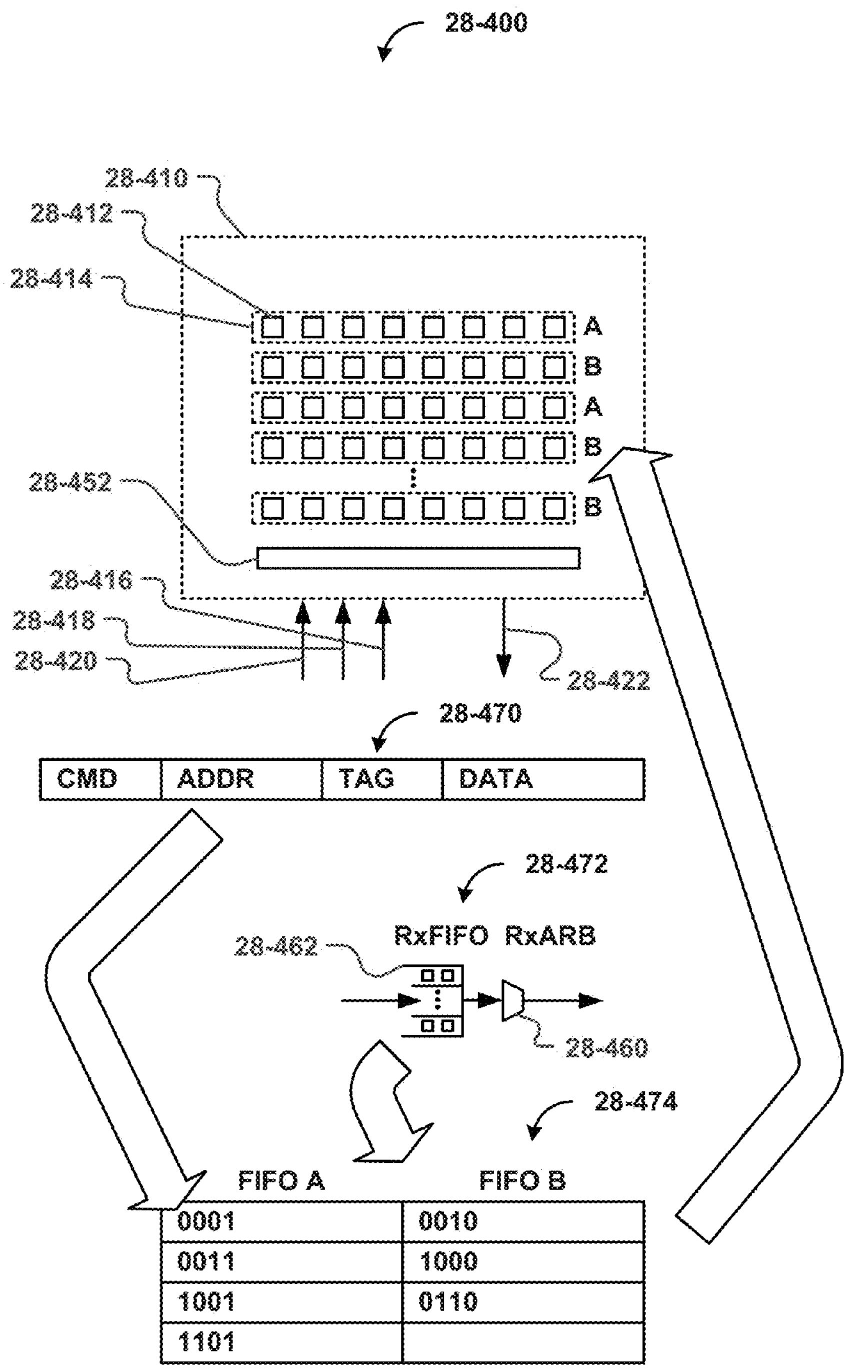
Figures 5, 28:
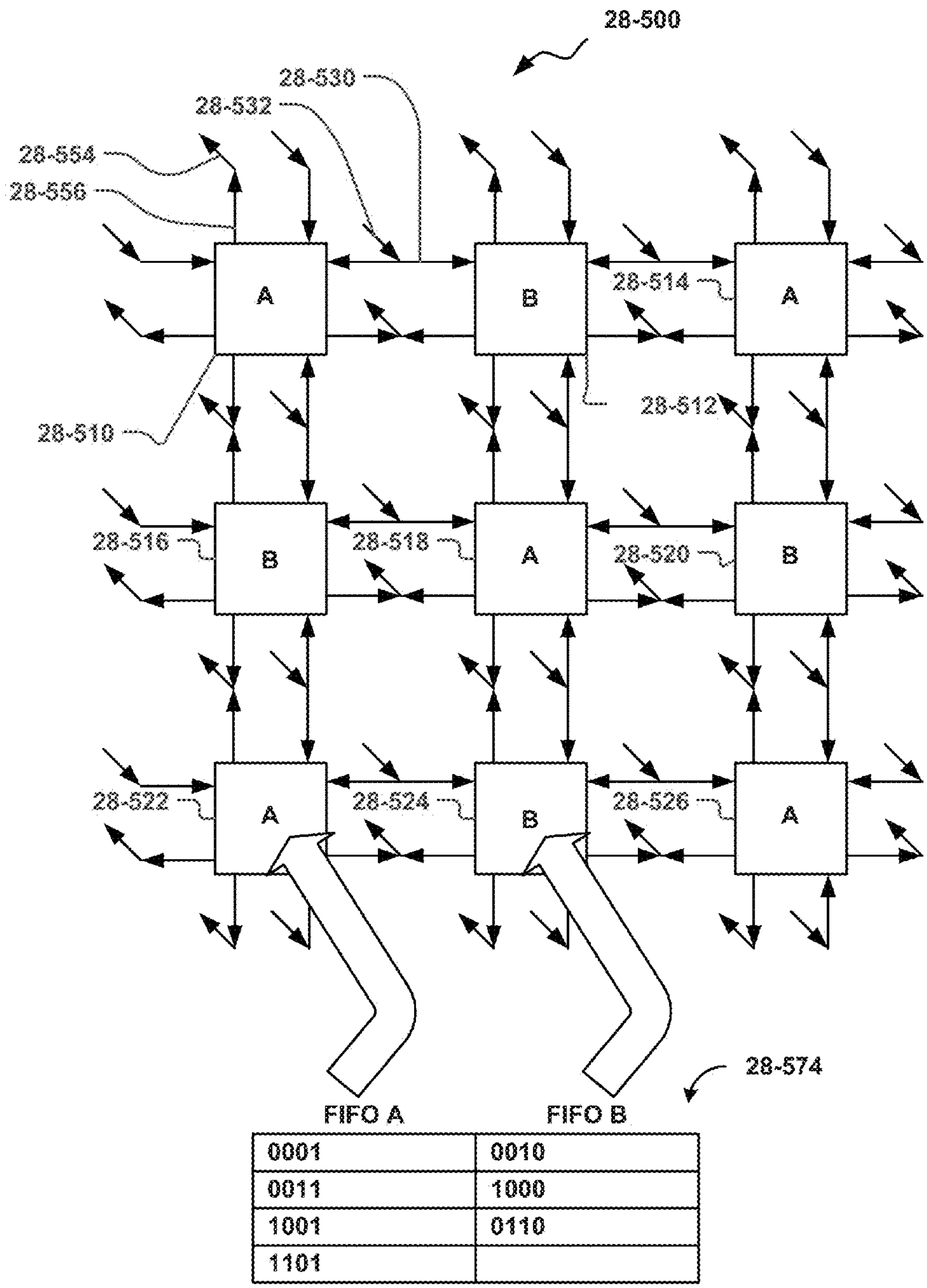
Figures 6, 28:
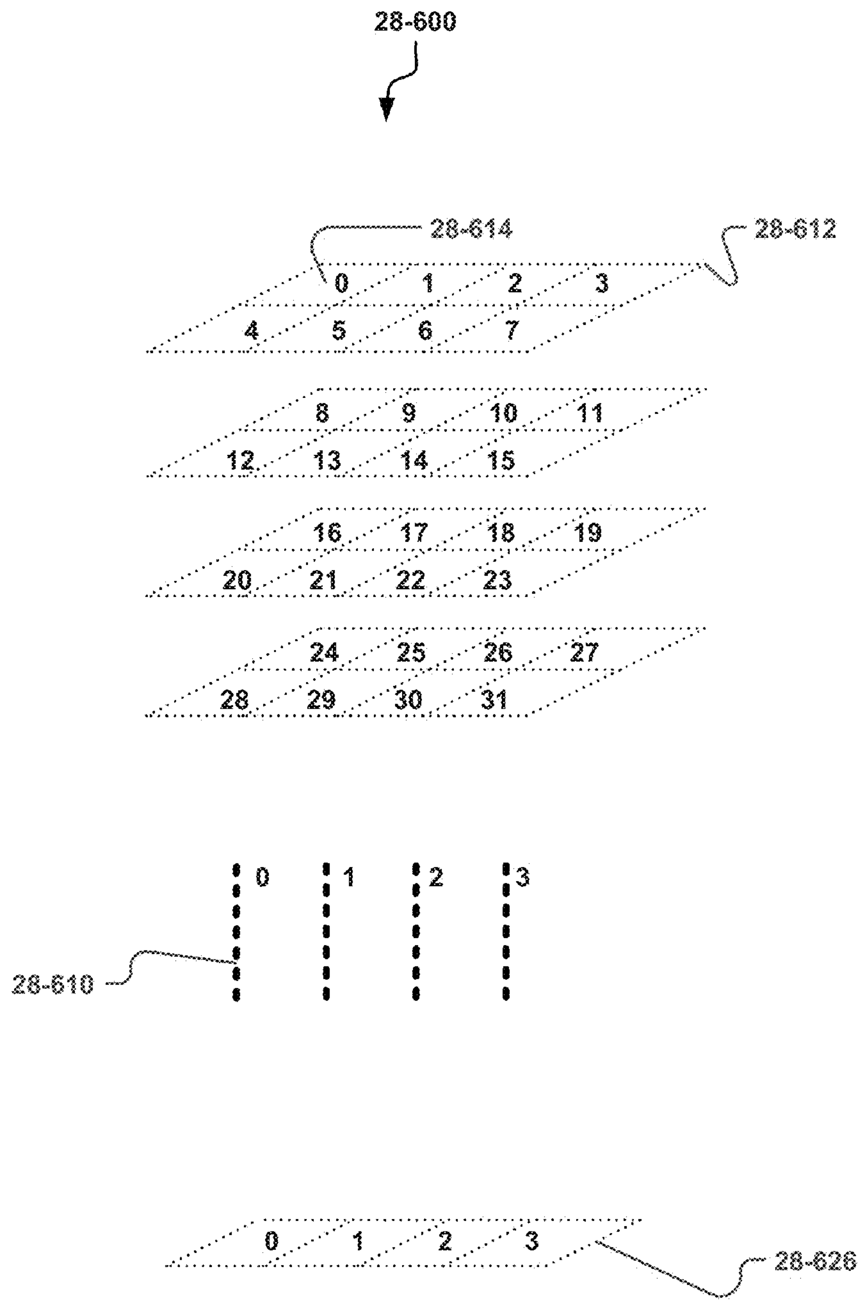

FIG. 28-1 shows an apparatus, in accordance with one embodiment.

FIG. 28-2 shows a stacked memory package, in accordance with one embodiment.

FIG. 28-3 shows a physical view of a stacked memory package, in accordance with one embodiment.

FIG. 28-4 shows a stacked memory package architecture, in accordance with one embodiment.

FIG. 28-5 shows a stacked memory package architecture, in accordance with one embodiment.

FIG. 28-6 shows a stacked memory package architecture, in accordance with one embodiment.

Figures 1, 29:
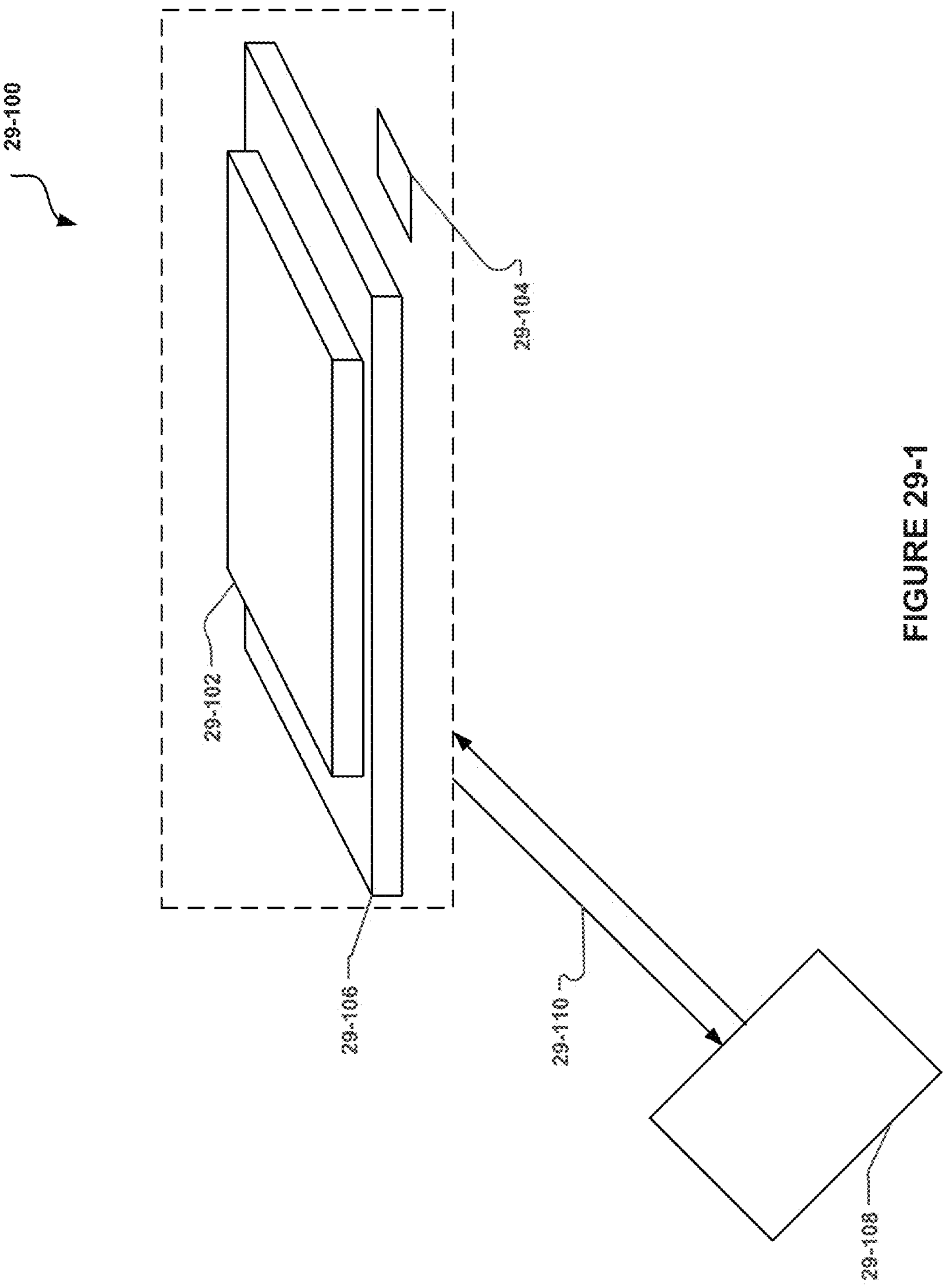
Figures 2, 29:
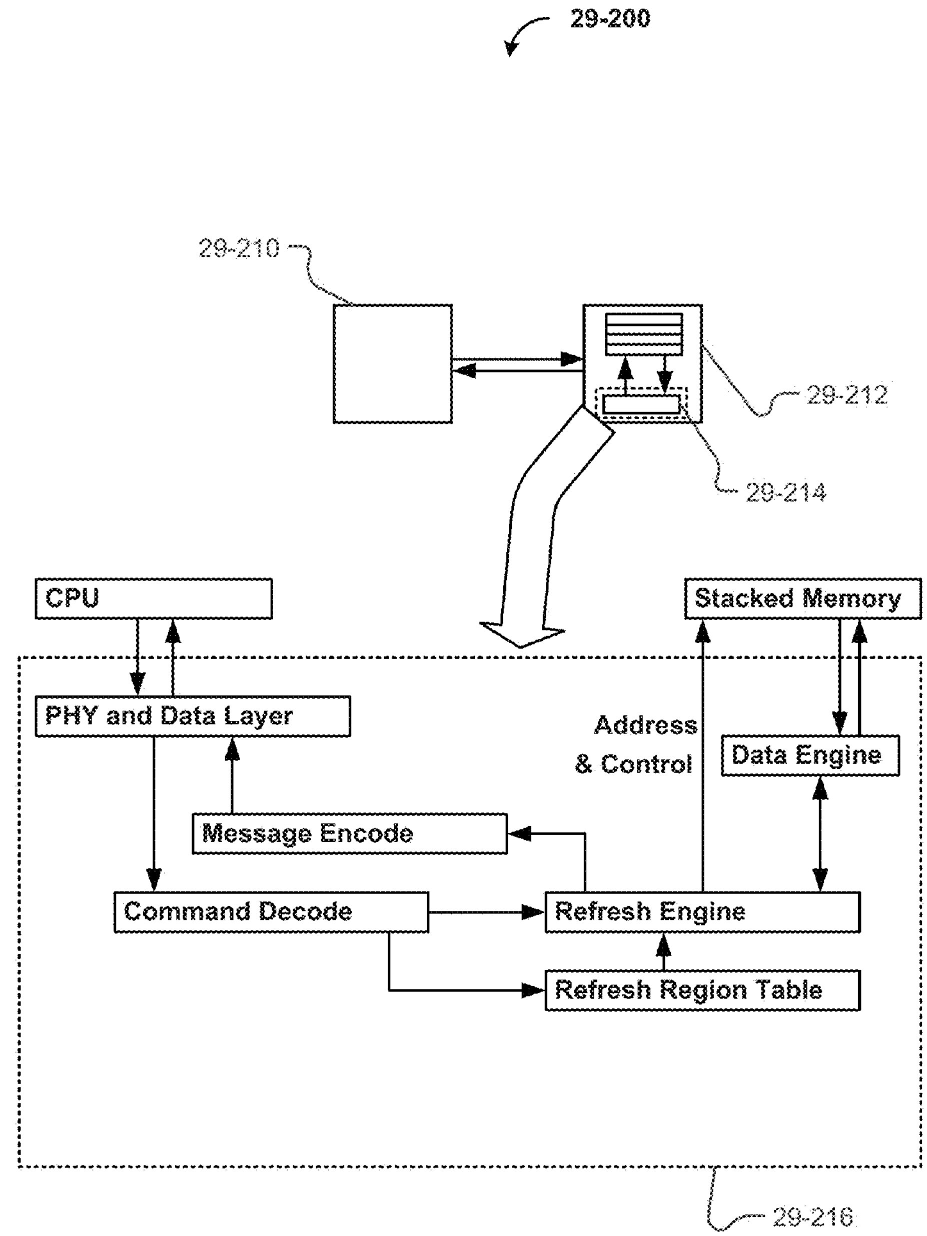

FIG. 29-1 shows an apparatus for controlling a refresh associated with a memory, in accordance with one embodiment.

FIG. 29-2 shows a refresh system for a stacked memory package, in accordance with one embodiment.

While one or more of the various embodiments of the invention is susceptible to various modifications, combinations, and alternative forms, various embodiments thereof are shown by way of example in the drawings and will herein be described in detail. It should be understood, however, that the accompanying drawings and detailed description are not intended to limit the embodiment(s) to the particular form disclosed, but on the contrary, the intention is to cover all modifications, combinations, equivalents and alternatives falling within the spirit and scope of the various embodiments of the present invention as defined by the relevant claims.

DETAILED DESCRIPTION

Section I

The present section corresponds to U.S. Provisional Application No. 61/569,107, titled "SYSTEM, METHOD, AND COMPUTER PROGRAM PRODUCT FOR IMPROVING MEMORY SYSTEMS," filed Dec. 9, 2011, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

In this description there may be multiple figures that depict similar structures with similar parts or components. Thus, as an example, to avoid confusion an Object in FIG. 1 may be labeled "Object (1)" and a similar, but not identical, Object in FIG. 2 is labeled "Object (2)", etc. Again, it should be noted that use of such convention, by itself, should not be construed as somehow limiting such terms: beyond any given definition, and/or to any specific embodiments disclosed herein, etc.

In the following detailed description and in the accompanying drawings, specific terminology and images are used in order to provide a thorough understanding. In some instances, the terminology and images may imply specific details that are not required to practice all embodiments. Similarly, the embodiments described and illustrated are representative and should not be construed as precise representations, as there are prospective variations on what is disclosed that may be obvious to someone with skill in the art. Thus this disclosure is not limited to the specific embodiments described and shown but embraces all prospective variations that fall within its scope. For brevity, not all steps may be detailed, where such details will be known to someone with skill in the art having benefit of this disclosure.

Memory devices with improved performance are required with every new product generation and every new technology node. However, the design of memory modules such as DIMMs becomes increasingly difficult with increasing clock frequency and increasing CPU bandwidth requirements yet lower power, lower voltage, and increasingly tight space constraints. The increasing gap between CPU demands and the performance that memory modules can provide is often called the "memory wall". Hence, memory modules with improved performance are needed to overcome these limitations.

Memory devices (e.g. memory modules, memory circuits, memory integrated circuits, etc.) may be used in many applications (e.g. computer systems, calculators, cellular phones, etc.). The packaging (e.g. grouping, mounting, assembly, etc.) of memory devices may vary between these different applications. A memory module may use a common packaging method that may use a small circuit board (e.g. PCB, raw card, card, etc.) often comprised of random access memory (RAM) circuits on one or both sides of the memory module with signal and/or power pins on one or both sides of the circuit board. A dual in-line memory module (DIMM) may comprise one or more memory packages (e.g. memory circuits, etc.). DIMMs have electrical contacts (e.g. signal pins, power pins, connection pins, etc.) on each side (e.g. edge etc.) of the module. DIMMs may be mounted (e.g. coupled etc.) to a printed circuit board (PCB) (e.g. motherboard, mainboard, baseboard, chassis, planar, etc.). DIMMs may be designed for use in computer system applications (e.g. cell phones, portable devices, hand-held devices, consumer electronics, TVs, automotive electronics, embedded electronics, lap tops, personal computers, workstations, servers, storage devices, networking devices, network switches, network routers, etc.). In other embodiments different and various form factors may be used (e.g. cartridge, card, cassette, etc.).

Example embodiments described in this disclosure may include computer system(s) with one or more central processor units (CPU) and possibly one or more I/O unit(s) coupled to one or more memory systems that contain one or more memory controllers and memory devices. In example embodiments, the memory system(s) may include one or more memory controllers (e.g. portion(s) of chipset(s), portion(s) of CPU(s), etc.). In example embodiments the memory system(s) may include one or more physical memory array(s) with a plurality of memory circuits for storing information (e.g. data, instructions, state, etc.).

The plurality of memory circuits in memory system(s) may be connected directly to the memory controller(s) and/or indirectly coupled to the memory controller(s) through one or more other intermediate circuits (or intermediate devices e.g. hub devices, switches, buffer chips, buffers, register chips, registers, receivers, designated receivers, transmitters, drivers, designated drivers, re-drive circuits, circuits on other memory packages, etc.).

Intermediate circuits may be connected to the memory controller(s) through one or more bus structures (e.g. a multi-drop bus, point-to-point bus, networks, etc.) and which may further include cascade connection(s) to one or more additional intermediate circuits, memory packages, and/or bus(es). Memory access requests may be transmitted from the memory controller(s) through the bus structure(s). In response to receiving the memory access requests, the memory devices may store write data or provide read data. Read data may be transmitted through the bus structure(s) back to the memory controller(s) or to or through other components (e.g. other memory packages, etc.).

In various embodiments, the memory controller(s) may be integrated together with one or more CPU(s) (e.g. processor chips, multi-core die, CPU complex, etc.) and/or supporting logic (e.g. buffer, logic chip, etc.); packaged in a discrete chip (e.g. chipset, controller, memory controller, memory fanout device, memory switch, hub, memory matrix chip, northbridge, etc.); included in a multi-chip carrier with the one or more CPU(s) and/or supporting logic and/or memory chips; included in a stacked memory package; combinations of these; or packaged in various alternative forms that match the system, the application and/or the environment and/or other system requirements. Any of these solutions may or may not employ one or more bus structures (e.g. multidrop, multiplexed, point-to-point, serial, parallel, narrow and/or high-speed links, networks, etc.) to connect to one or more CPU(s), memory controller(s), intermediate circuits, other circuits and/or devices, memory devices, memory packages, stacked memory packages, etc.

A memory bus may be constructed using multi-drop connections and/or using point-to-point connections (e.g. to intermediate circuits, to receivers, etc.) on the memory modules. The downstream portion of the memory controller interface and/or memory bus, the downstream memory bus, may include command, address, write data, control and/or other (e.g. operational, initialization, status, error, reset, clocking, strobe, enable, termination, etc.) signals being sent to the memory modules (e.g. the intermediate circuits, memory circuits, receiver circuits, etc.). Any intermediate circuit may forward the signals to the subsequent circuit(s) or process the signals (e.g. receive, interpret, alter, modify, perform logical operations, merge signals, combine signals, transform, store, re-drive, etc.) if it is determined to target a downstream circuit; re-drive some or all of the signals without first modifying the signals to determine the intended receiver; or perform a subset or combination of these options etc.

The upstream portion of the memory bus, the upstream memory bus, returns signals from the memory modules (e.g. requested read data, error, status other operational information, etc.) and these signals may be forwarded to any subsequent intermediate circuit via bypass and/or switch circuitry or be processed (e.g. received, interpreted and re-driven if it is determined to target an upstream or downstream hub device and/or memory controller in the CPU or CPU complex; be re-driven in part or in total without first interpreting the information to determine the intended recipient; or perform a subset or combination of these options etc.).

In different memory technologies portions of the upstream and downstream bus may be separate, combined, or multiplexed; and any buses may be unidirectional (one direction only) or bidirectional (e.g. switched between upstream and downstream, use bidirectional signaling, etc.). Thus, for example, in JEDEC standard DDR (e.g. DDR, DDR2, DDR3, DDR4, etc.) SDRAM memory technologies part of the address and part of the command bus are combined (or may be considered to be combined), row address and column address may be time-multiplexed on the address bus, and read/write data may use a bidirectional bus.

In alternate embodiments, a point-to-point bus may include one or more switches or other bypass mechanism that results in the bus information being directed to one of two or more possible intermediate circuits during downstream communication (communication passing from the memory controller to a intermediate circuit on a memory module), as well as directing upstream information (communication from an intermediate circuit on a memory module to the memory controller), possibly by way of one or more upstream intermediate circuits.

In some embodiments the memory system may include one or more intermediate circuits (e.g. on one or more memory modules etc.) connected to the memory controller via a cascade interconnect memory bus, however other memory structures may be implemented (e.g. point-to-point bus, a multi-drop memory bus, shared bus, etc.). Depending on the constraints (e.g. signaling methods used, the intended operating frequencies, space, power, cost, and other constraints, etc.) various alternate bus structures may be used. A point-to-point bus may provide the optimal performance in systems requiring high-speed interconnections, due to the reduced signal degradation compared to bus structures having branched signal lines, switch devices, or stubs. However, when used in systems requiring communication with multiple devices or subsystems, a point-to-point or other similar bus may often result in significant added system cost (e.g. component cost, board area, increased system power, etc.) and may reduce the potential memory density due to the need for intermediate devices (e.g. buffers, re-drive circuits, etc.). Functions and performance similar to that of a point-to-point bus may be obtained by using switch devices. Switch devices and other similar solutions may offer advantages (e.g. increased memory packaging density, lower power, etc.) while retaining many of the characteristics of a point-to-point bus. Multi-drop bus solutions may provide an alternate solution, and though often limited to a lower operating frequency may offer a cost and/or performance advantage for many applications. Optical bus solutions may permit increased frequency and bandwidth, either in point-to-point or multi-drop applications, but may incur cost and/or space impacts.

Although not necessarily shown in all the figures, the memory modules and/or intermediate devices may also include one or more separate control (e.g. command distribution, information retrieval, data gathering, reporting mechanism, signaling mechanism, register read/write, configuration, etc.) buses (e.g. a presence detect bus, an 12C bus, an SMBus, combinations of these and other buses or signals, etc.) that may be used for one or more purposes including the determination of the device and/or memory module attributes (generally after power-up), the reporting of fault or other status information to part(s) of the system, calibration, temperature monitoring, the configuration of device(s) and/or memory subsystem(s) after power-up or during normal operation or for other purposes. Depending on the control bus characteristics, the control bus(es) might also provide a means by which the valid completion of operations could be reported by devices and/or memory module(s) to the memory controller(s), or the identification of failures occurring during the execution of the main memory controller requests, etc. The separate control buses may be physically separate or electrically and/or logically combined (e.g. by multiplexing, time multiplexing, shared signals, etc.) with other memory buses.

As used herein the term buffer (e.g. buffer device, buffer circuit, buffer chip, etc.) refers to an electronic circuit that may include temporary storage, logic etc. and may receive signals at one rate (e.g. frequency, etc.) and deliver signals at another rate. In some embodiments, a buffer is a device that may also provide compatibility between two signals (e.g. changing voltage levels or current capability, changing logic function, etc.).

As used herein, hub is a device containing multiple ports that may be capable of being connected to several other devices. The term hub is sometimes used interchangeably with the term buffer. A port is a portion of an interface that serves an I/O function (e.g. a port may be used for sending and receiving data, address, and control information over one of the point-to-point links, or buses). A hub may be a central device that connects several systems, subsystems, or networks together. A passive hub may simply forward messages, while an active hub (e.g. repeater, amplifier, etc.) may also modify the stream of data which otherwise would deteriorate over a distance. The term hub, as used herein, refers to a hub that may include logic (hardware and/or software) for performing logic functions.

As used herein, the term bus refers to one of the sets of conductors (e.g. signals, wires, traces, and printed circuit board traces or connections in an integrated circuit) connecting two or more functional units in a computer. The data bus, address bus and control signals may also be referred to together as constituting a single bus. A bus may include a plurality of signal lines (or signals), each signal line having two or more connection points that form a main transmission line that electrically connects two or more transceivers, transmitters and/or receivers. The term bus is contrasted with the term channel that may include one or more buses or sets of buses.

As used herein, the term channel (e.g. memory channel etc.) refers to an interface between a memory controller (e.g. a portion of processor, CPU, etc.) and one of one or more memory subsystem(s). A channel may thus include one or more buses (of any form in any topology) and one or more intermediate circuits.

As used herein, the term daisy chain (e.g. daisy chain bus etc.) refers to a bus wiring structure in which, for example, device (e.g. unit, structure, circuit, block, etc.) A is wired to device B, device B is wired to device C, etc. In some embodiments the last device may be wired to a resistor, terminator, or other termination circuit etc. In alternative embodiments any or all of the devices may be wired to a resistor, terminator, or other termination circuit etc. In a daisy chain bus, all devices may receive identical signals or, in contrast to a simple bus, each device may modify (e.g. change, alter, transform, etc.) one or more signals before passing them on.

A cascade (e.g. cascade interconnect, etc.) as used herein refers to a succession of devices (e.g. stages, units, or a collection of interconnected networking devices, typically hubs or intermediate circuits, etc.) in which the hubs or intermediate circuits operate as logical repeater(s), permitting for example data to be merged and/or concentrated into an existing data stream or flow on one or more buses.

As used herein, the term point-to-point bus and/or link refers to one or a plurality of signal lines that may each include one or more termination circuits. In a point-to-point bus and/or link, each signal line has two transceiver connection points, with each transceiver connection point coupled to transmitter circuits, receiver circuits or transceiver circuits.

As used herein, a signal (or line, signal line, etc.) refers to one or more electrical conductors or optical carriers, generally configured as a single carrier or as two or more carriers, in a twisted, parallel, or concentric arrangement, used to transport at least one logical signal. A logical signal may be multiplexed with one or more other logical signals generally using a single physical signal but logical signal(s) may also be multiplexed using more than one physical signal.

As used herein, memory devices are generally defined as integrated circuits that are composed primarily of memory (e.g. data storage, etc.) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access memory and related memories that store information in the form of electrical, optical, magnetic, chemical, biological, combinations of these or other means. Dynamic memory device types may include, but are not limited to, FPM DRAMs (Fast Page Mode Dynamic Random Access Memories), EDO (Extended Data Out) DRAMs, BEDO (Burst EDO) DRAMs, SDR (Single Data Rate) Synchronous DRAMs (SDRAMs), DDR (Double Data Rate) Synchronous DRAMs, DDR2, DDR3, DDR4, or any of the expected follow-on memory devices and related memory technologies such as Graphics RAMs (e.g. GDDR, etc.), Video RAMs, LP RAM (Low Power DRAMs) which may often be based on the fundamental functions, features and/or interfaces found on related DRAMs.

Memory devices may include chips (e.g. die, integrated circuits, etc.) and/or single or multi-chip packages (MCPs)

or multi-die packages (e.g. including package-on-package (PoP), etc.) of various types, assemblies, forms, and configurations. In multi-chip packages, the memory devices may be packaged with other device types (e.g. other memory devices, logic chips, CPUs, hubs, buffers, intermediate devices, analog devices, programmable devices, etc.) and may also include passive devices (e.g. resistors, capacitors, inductors, etc.). These multi-chip packages etc. may include cooling enhancements (e.g. an integrated heat sink, heat slug, fluids, gases, micromachined structures, micropipes, capillaries, etc.) that may be further attached to the carrier and/or another nearby carrier and/or other heat removal and/or cooling system.

Although not necessarily shown in all the figures, memory module support devices (e.g. buffer(s), buffer circuit(s), buffer chip(s), register(s), intermediate circuit(s), power supply regulation, hub(s), re-driver(s), PLL(s), DLL(s), non-volatile memory, SRAM, DRAM, logic circuits, analog circuits, digital circuits, diodes, switches, LEDs, crystals, active components, passive components, combinations of these and other circuits, etc.) may be comprised of multiple separate chips (e.g. die, dice, integrated circuits, etc.) and/or components, may be combined as multiple separate chips onto one or more substrates, may be combined into a single package (e.g. using die stacking, multi-chip packaging, etc.) or even integrated onto a single device based on tradeoffs such as: technology, power, space, weight, size, cost, performance, combinations of these, etc.

One or more of the various passive devices (e.g. resistors, capacitors, inductors, etc.) may be integrated into the support chip packages, or into the substrate, board, PCB, raw card etc, based on tradeoffs such as: technology, power, space, cost, weight, etc. These packages etc. may include an integrated heat sink or other cooling enhancements (e.g. such as those described above, etc.) that may be further attached to the carrier and/or another nearby carrier and/or other heat removal and/or cooling system.

Memory devices, intermediate devices and circuits, hubs, buffers, registers, clock devices, passives and other memory support devices etc. and/or other components may be attached (e.g. coupled, connected, etc.) to the memory subsystem and/or other component(s) via various methods including multi-chip packaging (MCP), chip-scale packaging, stacked packages, interposers, redistribution layers (RDLs), solder bumps and bumped package technologies, 3D packaging, solder interconnects, conductive adhesives, socket structures, pressure contacts, electrical/mechanical/magnetic/optical coupling, wireless proximity, combinations of these, and/or other methods that enable communication between two or more devices (e.g. via electrical, optical, wireless, or alternate means, etc.).

The one or more memory modules (or memory subsystems) and/or other components/devices may be electrically/optically/wireless etc. connected to the memory system, CPU complex, computer system or other system environment via one or more methods such as multi-chip packaging, chip-scale packaging, 3D packaging, soldered interconnects, connectors, pressure contacts, conductive adhesives, optical interconnects, combinations of these, and other communication and/or power delivery methods (including but not limited to those described above).

Connector systems may include mating connectors (e.g. male/female, etc.), conductive contacts and/or pins on one carrier mating with a male or female connector, optical connections, pressure contacts (often in conjunction with a retaining and/or closure mechanism) and/or one or more of various other communication and power delivery methods. The interconnection(s) may be disposed along one or more edges (e.g. sides, faces, etc.) of the memory assembly (e.g. DIMM, die, package, card, assembly, structure, etc.) and/or placed a distance from an edge of the memory subsystem (or portion of the memory subsystem, etc.) depending on such application requirements as ease of upgrade, ease of repair, available space and/or volume, heat transfer constraints, component size and shape and other related physical, electrical, optical, visual/physical access, requirements and constraints, etc. Electrical interconnections on a memory module are often referred to as pads, contacts, pins, connection pins, tabs, etc. Electrical interconnections on a connector are often referred to as contacts, pins, etc.

As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices together with any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry. The memory modules described herein may also be referred to as memory subsystems because they include one or more memory device(s), register(s), hub(s) or similar devices.

The integrity, reliability, availability, serviceability, performance etc. of the communication path, the data storage contents, and all functional operations associated with each element of a memory system or memory subsystem may be improved by using one or more fault detection and/or correction methods. Any or all of the various elements of a memory system or memory subsystem may include error detection and/or correction methods such as CRC (cyclic redundancy code, or cyclic redundancy check), ECC (error-correcting code), EDC (error detecting code, or error detection and correction), LDPC (low-density parity check), parity, checksum or other encoding/decoding methods and combinations of coding methods suited for this purpose. Further reliability enhancements may include operation retry (e.g. repeat, re-send, replay, etc.) to overcome intermittent or other faults such as those associated with the transfer of information, the use of one or more alternate, stand-by, or replacement communication paths (e.g. bus, via, path, trace, etc.) to replace failing paths and/or lines, complement and/or re-complement techniques or alternate methods used in computer, communication, and related systems.

The use of bus termination is common in order to meet performance requirements on buses that form transmission lines, such as point-to-point links, multi-drop buses, etc. Bus termination methods include the use of one or more devices (e.g. resistors, capacitors, inductors, transistors, other active devices, etc. or any combinations and connections thereof, serial and/or parallel, etc.) with these devices connected (e.g. directly coupled, capacitive coupled, AC connection, DC connection, etc.) between the signal line and one or more termination lines or points (e.g. a power supply voltage, ground, a termination voltage, another signal, combinations of these, etc.). The bus termination device(s) may be part of one or more passive or active bus termination structure(s), may be static and/or dynamic, may include forward and/or reverse termination, and bus termination may reside (e.g. placed, located, attached, etc.) in one or more positions (e.g.

at either or both ends of a transmission line, at fixed locations, at junctions, distributed, etc.) electrically and/or physically along one or more of the signal lines, and/or as part of the transmitting and/or receiving device(s). More than one termination device may be used for example if the signal line comprises a number of series connected signal or transmission lines (e.g. in daisy chain and/or cascade configuration(s), etc.) with different characteristic impedances.

The bus termination(s) may be configured (e.g. selected, adjusted, altered, set, etc.) in a fixed or variable relationship to the impedance of the transmission line(s) (often but not necessarily equal to the transmission line(s) characteristic impedance), or configured via one or more alternate approach(es) to maximize performance (e.g. the useable frequency, operating margins, error rates, reliability or related attributes/metrics, combinations of these, etc.) within design constraints (e.g. cost, space, power, weight, size, performance, speed, latency, bandwidth, reliability, other constraints, combinations of these, etc.).

Additional functions that may reside local to the memory subsystem and/or hub device, buffer, etc. may include data, control, write and/or read buffers (e.g. registers, FIFOs, LIFOs, etc), data and/or control arbitration, command reordering, command retiming, one or more levels of memory cache, local pre-fetch logic, data encryption and/or decryption, data compression and/or decompression, data packing functions, protocol (e.g. command, data, format, etc.) translation, protocol checking, channel prioritization control, link-layer functions (e.g. coding, encoding, scrambling, decoding, etc.), link and/or channel characterization, command prioritization logic, voltage and/or level translation, error detection and/or correction circuitry, RAS features and functions, RAS control functions, repair circuits, data scrubbing, test circuits, self-test circuits and functions, diagnostic functions, debug functions, local power management circuitry and/or reporting, power-down functions, hot-plug functions, operational and/or status registers, initialization circuitry, reset functions, voltage control and/or monitoring, clock frequency control, link speed control, link width control, link direction control, link topology control, link error rate control, instruction format control, instruction decode, bandwidth control (e.g. virtual channel control, credit control, score boarding, etc.), performance monitoring and/or control, one or more co-processors, arithmetic functions, macro functions, software assist functions, move/copy functions, pointer arithmetic functions, counter (e.g. increment, decrement, etc.) circuits, programmable functions, data manipulation (e.g. graphics, etc.), search engine(s), virus detection, access control, security functions, memory and cache coherence functions (e.g. MESI, MOESI, MESIF, directory-assisted snooping (DAS), etc.), other functions that may have previously resided in other memory subsystems or other systems (e.g. CPU, GPU, FPGA, etc.), combinations of these, etc. By placing one or more functions local (e.g. electrically close, logically close, physically close, within, etc.) to the memory subsystem, added performance may be obtained as related to the specific function, often while making use of unused circuits or making more efficient use of circuits within the subsystem.

Memory subsystem support device(s) may be directly attached to the same assembly (e.g. substrate, interposer, redistribution layer (RDL), base, board, package, structure, etc.) onto which the memory device(s) are attached (e.g. mounted, connected, etc.) to a separate substrate (e.g. interposer, spacer, layer, etc.) also produced using one or more of various materials (e.g. plastic, silicon, ceramic, etc.) that include communication paths (e.g. electrical, optical, etc.) to functionally interconnect the support device(s) to the memory device(s) and/or to other elements of the memory or computer system.

Transfer of information (e.g. using packets, bus, signals, wires, etc.) along a bus, (e.g. channel, link, cable, etc.) may be completed using one or more of many signaling options. These signaling options may include such methods as single-ended, differential, time-multiplexed, encoded, optical, combinations of these or other approaches, etc. with electrical signaling further including such methods as voltage or current signaling using either single or multi-level approaches. Signals may also be modulated using such methods as time or frequency, multiplexing, non-return to zero (NRZ), phase shift keying (PSK), amplitude modulation, combinations of these, and others with or without coding, scrambling, etc. Voltage levels may be expected to continue to decrease, with 1.8V, 1.5V, 1.35V, 1.2V, 1V and lower power and/or signal voltages of the integrated circuits.

One or more timing (e.g. clocking, synchronization, etc.) methods may be used within the memory system, including synchronous clocking, global clocking, source-synchronous clocking, encoded clocking, or combinations of these and/or other clocking and/or synchronization methods, (e.g. self-timed, asynchronous, etc.), etc. The clock signaling or other timing scheme may be identical to that of the signal lines, or may use one of the listed or alternate techniques that are more suited to the planned clock frequency or frequencies, and the number of clocks planned within the various systems and subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the memory subsystem, or may be based on a clock that is derived from the clock related to the signal(s) being transferred to and from the memory subsystem (e.g. such as that associated with an encoded clock, etc.). Alternately, a clock may be used for the signal(s) transferred to the memory subsystem, and a separate clock for signal(s) sourced from one (or more) of the memory subsystems. The clocks may operate at the same or frequency multiple (or sub-multiple, fraction, etc.) of the communication or functional (e.g. effective, etc.) frequency, and may be edge-aligned, center-aligned or otherwise placed and/or aligned in an alternate timing position relative to the signal(s).

Signals coupled to the memory subsystem(s) include address, command, control, and data, coding (e.g. parity, ECC, etc.), as well as other signals associated with requesting or reporting status (e.g. retry, replay, etc.) and/or error conditions (e.g. parity error, coding error, data transmission error, etc.), resetting the memory, completing memory or logic initialization and other functional, configuration or related information, etc.

Signals may be coupled using methods that may be consistent with normal memory device interface specifications (generally parallel in nature, e.g. DDR2, DDR3, etc.), or the signals may be encoded into a packet structure (generally serial in nature, e.g. FB-DIMM, etc.), for example, to increase communication bandwidth and/or enable the memory subsystem to operate independently of the memory technology by converting the signals to/from the format required by the memory device(s).

The terminology used herein is for the purpose of describing particular embodiments only and is not intended to be limiting of the invention. As used herein, the singular forms (e.g. a, an, the, etc.) are intended to include the plural forms as well, unless the context clearly indicates otherwise.

The terms comprises and/or comprising, when used in this specification, specify the presence of stated features, integers, steps, operations, elements, and/or components, but do not preclude the presence or addition of one or more other features, integers, steps, operations, elements, components, and/or groups thereof.

In the following description and claims, the terms include and comprise, along with their derivatives, may be used, and are intended to be treated as synonyms for each other.

In the following description and claims, the terms coupled and connected may be used, along with their derivatives. It should be understood that these terms are not necessarily intended as synonyms for each other. For example, connected may be used to indicate that two or more elements are in direct physical or electrical contact with each other. Further, coupled may be used to indicate that that two or more elements are in direct or indirect physical or electrical contact. For example, coupled may be used to indicate that that two or more elements are not in direct contact with each other, but the two or more elements still cooperate or interact with each other.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a circuit, component, module or system. Furthermore, aspects of the present invention may take the form of a computer program product embodied in one or more computer readable medium(s) having computer readable program code embodied thereon.

FIG. 1A

FIG. 1A shows an apparatus 1A-100 including a plurality of semiconductor platforms, in accordance with one embodiment. As an option, the system may be implemented in the context of the architecture and environment of any subsequent Figure(s). Of course, however, the system may be implemented in any desired environment.

As shown, the apparatus 1A-100 includes a first semiconductor platform 1A-102 including at least one memory circuit 1A-104. Additionally, the apparatus 1A-100 includes a second semiconductor platform 1A-106 stacked with the first semiconductor platform 1A-102. The second semiconductor platform 1A-106 includes a logic circuit (not shown) that is in communication with the at least one memory circuit 1A-104 of the first semiconductor platform 1A-102. Furthermore, the second semiconductor platform 1A-106 is operable to cooperate with a separate central processing unit 1A-108, and may include at least one memory controller (not shown) operable to control the at least one memory circuit 1A-102.

The memory circuit 1A-104 may be in communication with the memory circuit 1A-104 of the first semiconductor platform 1A-102 in a variety of ways. For example, in one embodiment, the memory circuit 1A-104 may be communicatively coupled to the logic circuit utilizing at least one through-silicon via (TSV).

In various embodiments, the memory circuit 1A-104 may include, but is not limited to, dynamic random access memory (DRAM), synchronous DRAM (SDRAM), double data rate synchronous DRAM (DDR SDRAM, DDR2 SDRAM, DDR3 SDRAM, DDR4 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), ZRAM (e.g. SOI RAM, Capacitor-less RAM, etc.), Phase Change RAM (PRAM or PCRAM, chalcogenide RAM, etc.), Magnetic RAM (MRAM), Field Write MRAM, Spin Torque Transfer (STT) MRAM, Memristor RAM, Racetrack memory, Millipede memory, Ferroelectric RAM (FeRAM), Resistor RAM (RRAM), Conductive-Bridging RAM (CBRAM), Silicon-Oxide-Nitride-Oxide-Silicon (SONOS) RAM, Twin-Transistor RAM (TTRAM), Thyristor-RAM (T-RAM), combinations of these and/or any other memory technology or similar data storage technology.

Further, in various embodiments, the first semiconductor platform 1A-102 may include one or more types of non-volatile memory technology (e.g. FeRAM, MRAM, PRAM, etc.) and/or one or more types of volatile memory technology (e.g. SRAM, T-RAM, Z-RAM, TTRAM, etc.). In one embodiment, the first semiconductor platform 1A-102 may include a standard (e.g. JEDEC DDR3 SDRAM, etc.) die.

In one embodiment, the first semiconductor platform 1A-102 may use a standard memory technology (e.g. JEDEC DDR3, JEDEC DDR4, etc.) but may be included on a non-standard die (e.g. the die is non-standardized, the die is not sold separately as a memory component, etc.). Additionally, in one embodiment, the first semiconductor platform 1A-102 may be a logic semiconductor platform (e.g. logic chip, buffer chip, etc.).

In various embodiments, the first semiconductor platform 1A-102 and the second semiconductor platform 1A-106 may form a system comprising at least one of a three-dimensional integrated circuit, a wafer-on-wafer device, a monolithic device, a die-on-wafer device, a die-on-die device, a three-dimensional package, or a three-dimensional package. In one embodiment, and as shown in FIG. 1A, the first semiconductor platform 1A-102 may be positioned above the second semiconductor platform 1A-106.

In another embodiment, the first semiconductor platform 1A-102 may be positioned beneath the second semiconductor platform 1A-106. Furthermore, in one embodiment, the first semiconductor platform 1A-102 may be in direct physical contact with the second semiconductor platform 1A-106.

In one embodiment, the first semiconductor platform 1A-102 may be stacked with the second semiconductor platform 1A-106 with at least one layer of material therebetween. The material may include any type of material including, but not limited to, silicon, germanium, gallium arsenide, silicon carbide, and/or any other material. In one embodiment, the first semiconductor platform 1A-102 and the second semiconductor platform 1A-106 may include separate integrated circuits.

Further, in one embodiment, the logic circuit may operable to cooperate with the separate central processing unit 1A-108 utilizing a bus 1A-110. In one embodiment, the logic circuit may operable to cooperate with the separate central processing unit 1A-108 utilizing a split transaction bus. In the context of the of the present description, a split-transaction bus refers to a bus configured such that when a CPU places a memory request on the bus, that CPU may immediately release the bus, such that other entities may use the bus while the memory request is pending. When the memory request is complete, the memory module involved may then acquire the bus, place the result on the bus (e.g. the read value in the case of a read request, an acknowledgment in the case of a write request, etc.), and possibly also place on the bus the ID number of the CPU that had made the request.

In one embodiment, the apparatus 1A-100 may include more semiconductor platforms than shown in FIG. 1A. For example, in one embodiment, the apparatus 1A-100 may include a third semiconductor platform and a fourth semiconductor platform, each stacked with the first semiconductor platform 1A-102 and each including at least one memory circuit under the control of the memory controller of the logic circuit of the second semiconductor platform 1A-106 (e.g. see FIG. 1B, etc.).

In one embodiment, the first semiconductor platform 1A-102, the third semiconductor platform, and the fourth semiconductor platform may collectively include a plurality of aligned memory echelons under the control of the memory controller of the logic circuit of the second semiconductor platform 1A-106. Further, in one embodiment, the logic circuit may be operable to cooperate with the separate central processing unit 1A-108 by receiving requests from the separate central processing unit 1A-108 (e.g. read requests, write requests, etc.) and sending responses to the separate central processing unit 1A-108 (e.g. responses to read requests, responses to write requests, etc.).

In one embodiment, the requests and/or responses may be each uniquely identified with an identifier. For example, in one embodiment, the requests and/or responses may be each uniquely identified with an identifier that is included therewith.

Furthermore, the requests may identify and/or specify various components associated with the semiconductor platforms. For example, in one embodiment, the requests may each identify at least one of the memory echelon. Additionally, in one embodiment, the requests may each identify at least one of the memory module.

In one embodiment, different semiconductor platforms may be associated with different memory types. For example, in one embodiment, the apparatus 1A-100 may include a third semiconductor platform stacked with the first semiconductor platform 1A-102 and include at least one memory circuit under the control of the at least one memory controller of the logic circuit of the second semiconductor platform 1A-106, where the first semiconductor platform 1A-102 includes, at least in part, a first memory type and the third semiconductor platform includes, at least in part, a second memory type different from the first memory type.

Further, in one embodiment, the at least one memory integrated circuit 1A-104 may be logically divided into a plurality of subbanks each including a plurality of portions of a bank. Still yet, in various embodiments, the logic circuit may include one or more of the following functional modules: bank queues, subbank queues, a redundancy or repair module, a fairness or arbitration module, an arithmetic logic unit or macro module, a virtual channel control module, a coherency or cache module, a routing or network module, reorder or replay buffers, a data protection module, an error control and reporting module, a protocol and data control module, DRAM registers and control module, and/or a DRAM controller algorithm module.

The logic circuit may be in communication with the memory circuit 1A-104 of the first semiconductor platform 1A-102 in a variety of ways. For example, in one embodiment, the logic circuit may be in communication with the memory circuit 1A-104 of the first semiconductor platform 1A-102 via at least one address bus, at least one control bus, and/or at least one data bus.

Furthermore, in one embodiment, the apparatus may include a third semiconductor platform and a fourth semiconductor platform each stacked with the first semiconductor platform 1A-102 and each may include at least one memory circuit under the control of the at least one memory controller of the logic circuit of the second semiconductor platform 1A-106. The logic circuit may be in communication with the at least one memory circuit 1A-104 of the first semiconductor platform 1A-102, the at least one memory circuit of the third semiconductor platform, and the at least one memory circuit of the fourth semiconductor platform, via at least one address bus, at least one control bus, and/or at least one data bus.

In one embodiment, at least one of the address bus, the control bus, or the data bus may be configured such that the logic circuit is operable to drive each of the at least one memory circuit 1A-104 of the first semiconductor platform 1A-102, the at least one memory circuit of the third semiconductor platform, and the at least one memory circuit of the fourth semiconductor platform, both together and independently in any combination; and the at least one memory circuit of the first semiconductor platform, the at least one memory circuit of the third semiconductor platform, and the at least one memory circuit of the fourth semiconductor platform, may be configured to be identical for facilitating a manufacturing thereof.

In one embodiment, the logic circuit of the second semiconductor platform 1A-106 may not be a central processing unit. For example, in various embodiments, the logic circuit may lack one or more components and/or functionally that is associated with or included with a central processing unit. As an example, in various embodiments, the logic circuit may not be capable of performing one or more of the basic arithmetical, logical, and input/output operations of a computer system, that a CPU would normally perform. As another example, in one embodiment, the logic circuit may lack an arithmetic logic unit (ALU), which typically performs arithmetic and logical operations for a CPU. As another example, in one embodiment, the logic circuit may lack a control unit (CU) that typically allows a CPU to extract instructions from memory, decode the instructions, and execute the instructions (e.g. calling on the ALU when necessary, etc.).

More illustrative information will now be set forth regarding various optional architectures and features with which the foregoing techniques discussed in the context of any of the present or previous figure(s) may or may not be implemented, per the desires of the user. For instance, various optional examples and/or options associated with the first semiconductor platform 1A-102, the memory circuit 1A-104, the second semiconductor platform 1A-106, and/or other optional features have been and will be set forth in the context of a variety of possible embodiments. It should be strongly noted, however, that such information is set forth for illustrative purposes and should not be construed as limiting in any manner. Any of such features may be optionally incorporated with or without the inclusion of other features described.

FIG. 1B

FIG. 1B shows a memory system with multiple stacked memory packages, in accordance with one embodiment. As an option, the system may be implemented in the context of the architecture and environment of the previous figure or any subsequent Figure(s). Of course, however, the system may be implemented in any desired environment.

In FIG. 1B, the CPU is connected to one or more stacked memory packages using one or more memory buses.

In one embodiment, a single CPU may be connected to a single stacked memory package.

In one embodiment, one or more CPUs may be connected to one or more stacked memory packages.

In one embodiment, one or more stacked memory packages may be connected together in a memory subsystem network.

In FIG. 1B a memory read is performed by sending (e.g. transmitting from CPU to stacked memory package, etc.) a read request. The read data is returned in a read response. The read request may be forwarded (e.g. routed, buffered, etc.) between memory packages. The read response may be forwarded between memory packages.

In FIG. 1B a memory write is performed by sending (e.g. transmitting from stacked memory package, etc.) a write request. The write response (e.g. completion, notification, etc.), if any, originates from the target memory package. The write response may be forwarded between memory packages.

In contrast to current memory system a request and response may be asynchronous (e.g. split, separated, variable latency, etc.).

In FIG. 1B, the stacked memory package includes a first semiconductor platform. Additionally, the system includes at least one additional semiconductor platform stacked with the first semiconductor platform.

In the context of the present description, a semiconductor platform refers to any platform including one or more substrates of one or more semiconducting material (e.g. silicon, germanium, gallium arsenide, silicon carbide, etc.). Additionally, in various embodiments, the system may include any number of semiconductor platforms (e.g. 2, 3, 4, etc.).

In one embodiment, at least one of the first semiconductor platform or the additional semiconductor platform may include a memory semiconductor platform. The memory semiconductor platform may include any type of memory semiconductor platform (e.g. memory technology, etc.) such as random access memory (RAM) or dynamic random access memory (DRAM), etc.

In one embodiment, as shown in FIG. 1B, the first semiconductor platform may be a logic chip (Logic Chip 1, LC1). In FIG. 1B the additional semiconductor platforms are memory chips (Memory Chip 1, Memory Chip 2, Memory Chip 3, Memory Chip 4). In FIG. 1B the logic chip is used to access data stored in one or more portions on the memory chips. In FIG. 1B the portions of the memory chips are arranged (e.g. connected, coupled, etc.) so that a group of the portions may be accessed by LC1 as a memory echelon.

As used herein a memory echelon is used to represent (e.g. denote, is defined as, etc.) a grouping of memory circuits. Other terms (e.g. bank, rank, etc.) have been avoided for such a grouping because of possible confusion. A memory echelon may correspond to a bank or rank (e.g. SDRAM bank, SDRAM rank, etc.), but need not (and typically does not, and in general does not). Typically a memory echelon is composed of portions on different memory die and spans all the memory die in a stacked package, but need not. For example, in an 8-die stack, one memory echelon (ME1) may comprise portions in dies 1-4 and another memory echelon (ME2) may comprise portions in dies 5-8. Or, for example, one memory echelon (ME1) may comprise portions in dies 1,3,5,7 (e.g. die 1 is on the bottom of the stack, die 8 is the top of the stack, etc.) and another memory echelon ME2 comprise portions in dies 2,4,6,8, etc. In general there may be any number of memory echelons and any arrangement of memory echelons in a stacked die package (including fractions of an echelon, where an echelon may span more than one memory package for example).

In one embodiment, the memory technology may take any form including, but not limited to, synchronous DRAM (SDRAM), double data rate synchronous DRAM (DDR SDRAM, DDR2 SDRAM, DDR3 SDRAM, DDR4 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), ZRAM (e.g. SOI RAM, Capacitor-less RAM, etc.), Phase Change RAM (PRAM or PCRAM, chalcogenide RAM, etc.), Magnetic RAM (MRAM), Field Write MRAM, Spin Torque Transfer (STT) MRAM, Memristor RAM, Racetrack memory, Millipede memory, Ferroelectric RAM (FeRAM), Resistor RAM (RRAM), Conductive-Bridging RAM (CBRAM), Silicon-Oxide-Nitride-Oxide-Silicon (SONOS) RAM, Twin-Transistor RAM (TTRAM), Thyristor-RAM (T-RAM), combinations of these and/or any other memory technology or similar data storage technology.

In one embodiment, the memory semiconductor platform may include one or more types of non-volatile memory technology (e.g. FeRAM, MRAM, PRAM, etc.) and/or one or more types of volatile memory technology (e.g. SRAM, T-RAM, Z-RAM, TTRAM, etc.).

In one embodiment, the memory semiconductor platform may be a standard (e.g. JEDEC DDR3 SDRAM, etc.) die.

In one embodiment, the memory semiconductor platform may use a standard memory technology (e.g. JEDEC DDR3, JEDEC DDR4, etc.) but included on a non-standard die (e.g. the die is non-standardized, the die is not sold separately as a memory component, etc.).

In one embodiment, the first semiconductor platform may be a logic semiconductor platform (e.g. logic chip, buffer chip, etc.).

In one embodiment, there may be more than one logic semiconductor platform.

In one embodiment, the first semiconductor platform may use a different process technology than the one or more additional semiconductor platforms. For example the logic semiconductor platform may use a logic technology (e.g. 45 nm, bulk CMOS, etc.) while the memory semiconductor platform(s) may use a DRAM technology (e.g. 22 nm, etc.).

In one embodiment, the memory semiconductor platform may include combinations of a first type of memory technology (e.g. non-volatile memory such as FeRAM, MRAM, and PRAM, etc.) and/or another type of memory technology (e.g. volatile memory such as SRAM, T-RAM, Z-RAM, and TTRAM, etc.).

In one embodiment, the system may include at least one of a three-dimensional integrated circuit, a wafer-on-wafer device, a monolithic device, a die-on-wafer device, a die-on-die device, a three-dimensional package, and a three-dimensional package.

In one embodiment, the additional semiconductor platform(s) may be in a variety of positions with respect to the first semiconductor platform. For example, in one embodiment, the additional semiconductor platform may be positioned above the first semiconductor platform. In another embodiment, the additional semiconductor platform may be positioned beneath the first semiconductor platform. In still another embodiment, the additional semiconductor platform may be positioned to the side of the first semiconductor platform.

Further, in one embodiment, the additional semiconductor platform may be in direct physical contact with the first semiconductor platform. In another embodiment, the additional semiconductor platform may be stacked with the first semiconductor platform with at least one layer of material therebetween. In other words, in various embodiments, the additional semiconductor platform may or may not be physically touching the first semiconductor platform.

In various embodiments, the number of semiconductor platforms utilized in the stack may depend on the height of the semiconductor platform and the application of the memory stack. For example, in one embodiment, a total height of the stack, including the memory circuits, a package substrate, and logic layer may be less than 0.5 centimeters. In another embodiment, a total height of the stack, including the memory circuits, a package substrate, and logic layer may be less than 0.4 centimeters. In another embodiment, a total height of the stack, including the memory circuits, a package substrate, and logic layer may be less than 0.3 centimeters. In another embodiment, a total height of the stack, including the memory circuits, a package substrate, and logic layer may be less than 0.2 centimeters. In another embodiment, a total height of the stack, including the memory circuits, a package substrate, and logic layer may be less than 0.1 centimeters. In another embodiment, a total height of the stack, including the memory circuits, a package substrate, and logic layer may be less than 0.4 centimeters and greater than 0.05 centimeters. In another embodiment, a total height of the stack, including the memory circuits, a package substrate, and logic layer may be less than 0.05 centimeters but greater than 0.01 centimeters. In another embodiment, a total height of the stack, including the memory circuits, a package substrate, and logic layer may be less than or equal to 1 centimeter and greater than or equal to 0.5 centimeters. In one embodiment, the stack may be sized to be utilized in a mobile phone. In another embodiment, the stack may be sized to be utilized in a tablet computer. In another embodiment, the stack may be sized to be utilized in a computer. In another embodiment, the stack may be sized to be utilized in a mobile device. In another embodiment, the stack may be sized to be utilized in a peripheral device.

More illustrative information will now be set forth regarding various optional architectures and features with which the foregoing techniques discussed in the context of any of the present or previous figure(s) may or may not be implemented, per the desires of the user. For instance, various optional examples and/or options associated with the configuration of the system, the platforms, and/or other optional features have been and will be set forth in the context of a variety of possible embodiments. It should be strongly noted, however, that such information is set forth for illustrative purposes and should not be construed as limiting in any manner. Any of such features may be optionally incorporated with or without the inclusion of other features described.

FIG. 2

Stacked Memory Package

FIG. 2 shows a stacked memory package, in accordance with another embodiment. As an option, the system may be implemented in the context of the architecture and environment of any previous and/or subsequent Figure(s). Of course, however, the system may be implemented in any desired environment.

In FIG. 2 the CPU (CPU 1) is connected to the logic chip (Logic Chip 1, LC1) via a memory bus (Memory Bus 1, MB1). LC1 is coupled to four memory chips (Memory Chip 1 (MC!), Memory Chip 2 (MC2), Memory Chip 3 (MC3), Memory Chip 4 (MC4)).

In one embodiment the memory bus MB1 may be a high-speed serial bus.

In FIG. 2 the MB1 is shown for simplicity as bidirectional. MB1 may be a multi-lane serial link. MB1 may be comprised of two groups of unidirectional buses. For example there may be one bus (part of MB1) that transmits data from CPU 1 to LC1 that includes one or more lanes; there may be a second bus (also part of MB1) that transmits data from LC1 to CPU 1 that includes one or more lanes.

A lane is normally used to transmit a bit of information. In some buses a lane may be considered to include both transmit and receive signals (e.g. lane 0 transmit and lane 0 receive, etc.). This is the definition of lane used by the PCI-SIG for PCI Express for example and the definition that is used here. In some buses (e.g. Intel QPI, etc.) a lane may be considered as just a transmit signal or just a receive signal. In most high-speed serial links data is transmitted using differential signals. Thus a lane may be considered to consist of 2 wires (one pair, transmit or receive, as in Intel QPI) or 4 wires (2 pairs, transmit and receive, as in PCI Express). As used herein a lane consists of 4 wires (2 pairs, transmit and receive).

In FIG. 2 LC1 includes receive/transmit circuit (Rx/Tx circuit). The Rx/Tx circuit communicates (e.g. is coupled, etc.) to four portions of the memory chips called a memory echelon.

In FIG. 2 MC1, MC2 and MC3 are coupled using through-silicon vias (TSVs).

In one embodiment, the portion of a memory chip that forms part of an echelon may be a bank (e.g. DRAM bank, etc.).

In one embodiment, there may be any number of memory chip portions in a memory echelon.

In one embodiment, the portion of a memory chip that forms part of an echelon may be a subset of a bank.

In FIG. 2 the request includes an identification (ID) (e.g. serial number, sequence number, tag, etc.) that uniquely identifies each request. In FIG. 2 the response includes an ID that identifies each response. In FIG. 2 each logic chip is responsible for handling the requests and responses. The ID for each response will match the ID for each request. In this way the requestor (e.g. CPU, etc.) may match responses with requests. In this way the responses may be allowed to be out-of-order (i.e. arrive in a different order than sent, etc.).

For example the CPU may issue two read requests RQ1 and RQ2. RQ1 may be issued before RQ2 in time. RQ1 may have ID 01. RQ2 may have ID 02. The memory packages may return read data in read responses RR1 and RR2. RR1 may be the read response for RQ1. RR2 may be the read response for RQ2. RR1 may contain ID 01. RR2 may contain ID 02. The read responses may arrive at the CPU in order, that is RR1 arrives before RR2. This is always the case with conventional memory systems. However in FIG. 2, RR2 may arrive at the CPU before RR1, that is to say out-of-order. The CPU may examine the IDs in read responses, for example RR1 and RR2, in order to determine which responses belong to which requests.

As an option, the stacked memory package may be implemented in the context of the architecture and environment of the previous Figure and/or any subsequent Figure(s). Of course, however, the stacked memory package may be implemented in the context of any desired environment.

FIG. 3

FIG. 3 shows an apparatus using a memory system with DIMMs using stacked memory packages, in accordance with another embodiment. As an option, the apparatus may be implemented in the context of the architecture and environment of the previous Figure and/or any subsequent Figure(s). Of course, however, the apparatus may be implemented in the context of any desired environment.

In FIG. 3 each stacked memory package may contain a structure such as that shown in FIG. 2.

In FIG. 3 a memory echelon is located on a single stacked memory package.

In one embodiment, the one or more memory chips in a stacked memory package may take any form and use any type of memory technology.

In one embodiment, the one or more memory chips may use the same or different memory technology or memory technologies.

In one embodiment, the one or more memory chips may use more than one memory technology on a chip.

In one embodiment, the one or more DIMMs may take any form including, but not limited to, an small-outline DIMM (SO-DIMM), unbuffered DIMM (UDIMM), registered DIMM (RDIMM), load-reduced DIMM (LR-DIMM), or any other form of mounting, packaging, assembly, etc.

FIG. 4

FIG. 4 shows a stacked memory package, in accordance with another embodiment. As an option, the system of FIG. 4 may be implemented in the context of the architecture and environment of the previous Figures and/or any subsequent Figure(s). Of course, however, the system of FIG. 4 may be implemented in the context of any desired environment.

FIG. 4 shows a stack of four memory chips (D2, D3, D4, D5) and a single logic chip (D1).

In FIG. 4, D1 is at the bottom of the stack and is connected to package balls.

In FIG. 4 the chips (D1, D2, D3, D4, D5) are coupled using spacers, solder bumps and through-silicon vias (TSVs).

In one embodiment the chips are coupled using spacers but may be coupled using any means (e.g. intermediate substrates, interposers, redistribution layers (RDLs), etc.).

In one embodiment the chips are coupled using through-silicon vias (TSVs). Other through-chip (e.g. through substrate, etc.) or other chip coupling technology may be used (e.g. Vertical Circuits, conductive strips, etc.).

In one embodiment the chips are coupled using solder bumps. Other chip-to-chip stacking and/or chip connection technology may be used (e.g. C4, microconnect, pillars, micropillars, etc.)

In FIG. 4 a memory echelon comprises portions of memory circuits on D2, D3, D4, D5.

In FIG. 4 a memory echelon is connected using TSVs, solder bumps, and spacers such that a D1 package ball, is coupled to a portion of the echelon on D2. The equivalent portion of the echelon on D3 is coupled to a different D1 package ball, and so on for D4 and D5. In FIG. 4 the wiring arrangements and circuit placements on each memory chip are identical. The zig-zag (e.g. stitched, jagged, offset, diagonal, etc.) wiring of the spacers allows each memory chip to be identical.

A square TSV of width 5 micron and height 50 micron has a resistance of about 50 milliOhm. A square TSV of width 5 micron and height 50 micron has a capacitance of about 50 fF. The TSV inductance is about 0.5 pH per micron of TSV length.

The parasitic elements and properties of TSVs are such that it may be advantageous to use stacked memory packages rather than to couple memory packages using printed circuit board techniques. Using TSVs may allow many more connections between logic chip(s) and stacked memory chips than is possible using PCB technology alone. The increased number of connections allows increased (e.g. improved, higher, better, etc.) memory system and memory subsystem performance (e.g. increased bandwidth, finer granularity of access, combinations of these and other factors, etc.).

FIG. 5

FIG. 5 shows a memory system using stacked memory packages, in accordance with another embodiment. As an option, the system of FIG. 5 may be implemented in the context of the architecture and environment of the previous Figures and/or any subsequent Figure(s). Of course, however, the system of FIG. 5 may be implemented in the context of any desired environment.

In FIG. 5 several different constructions (e.g. architectures, arrangements, topologies, structure, etc.) for an echelon are shown.

In FIG. 5 memory echelon 1 (ME1) is contained in a single stacked memory package and spans (e.g. consists of, comprises, is built from, etc.) all four memory chips in a single stacked memory package.

In FIG. 5 memory echelon 2 (ME2) is contained in a one stacked memory package and memory echelon 3 (ME3) is contained in a different stacked package. In FIG. 5 Me2 and Me3 span two memory chips. In FIG. 5 ME2 and ME3 may be combined to form a larger echelon, a super-echelon.

In FIG. 5 memory echelon 4 through memory echelon 7 (ME4, ME5, ME6, ME7) are each contained in a single stacked memory package. In FIG. 5 ME4-ME7 span a single memory chip. In FIG. 5 ME4-ME7 may be combined to form a super-echelon.

In one embodiment memory super-echelons may contain memory super-echelons (e.g. memory echelons may be nested any number of layers (e.g. tiers, levels, etc.) deep, etc.).

In FIG. 5 the connections between CPU and stacked memory packages are not shown explicitly.

In one embodiment the connections between CPU and stacked memory packages may be as shown, for example, in FIG. 1B. Each stacked memory package may have a logic chip that may connect (e.g. couple, communicate, etc.) with neighboring stacked memory package(s). One or more logic chips may connect to the CPU.

In one embodiment the connections between CPU and stacked memory packages may be through intermediate buffer chips.

In one embodiment the connections between CPU and stacked memory packages may use memory modules, as shown for example in FIG. 3.

In one embodiment the connections between CPU and stacked memory packages may use a substrate (e.g. the CPU and stacked memory packages may use the same package, etc.).

Further details of these and other embodiments, including details of connections between CPU and stacked memory packages (e.g. networks, connectivity, coupling, topology, module structures, physical arrangements, etc.) are described herein in subsequent figures and accompanying text.

FIG. 6

FIG. 6 shows a memory system using stacked memory packages, in accordance with another embodiment. As an option, the system of FIG. 6 may be implemented in the context of the architecture and environment of the previous Figures and/or any subsequent Figure(s). Of course, however, the system of FIG. 6 may be implemented in the context of any desired environment.

In FIG. 6 the CPU and stacked memory package are assembled on a common substrate.

FIG. 7

FIG. 7 shows a memory system using stacked memory packages, in accordance with another embodiment. As an option, the system of FIG. 7 may be implemented in the context of the architecture and environment of the previous Figures and/or any subsequent Figure(s). Of course, however, the system of FIG. 7 may be implemented in the context of any desired environment.

In FIG. 7 the memory module (MM) may contain memory package 1 (MP1) and memory package 2 (MP2).

In FIG. 7 memory package 1 may be a stacked memory package and may contain memory echelon 1. In FIG. 7 memory package 1 may contain multiple volatile memory chips (e.g. DRAM memory chips, etc.).

In FIG. 7 memory package 2 may contain memory echelon 2. In FIG. 7 memory package 2 may be a non-volatile memory (e.g. NAND flash, etc.).

In FIG. 7 the memory module may act to checkpoint (e.g. copy, preserve, store, back-up, etc.) the contents of volatile memory in MP1 in MP2. The checkpoint may occur for only selected echelons.

FIG. 8

FIG. 8 shows a memory system using a stacked memory package, in accordance with another embodiment. As an option, the system of FIG. 8 may be implemented in the context of the architecture and environment of the previous Figures and/or any subsequent Figure(s). Of course, however, the system of FIG. 8 may be implemented in the context of any desired environment.

In FIG. 8 the stacked memory package contains two memory chips and two flash chips. In FIG. 8 one flash memory chip is used to checkpoint one or more memory echelons in the stacked memory chips. In FIG. 8 a separate flash chip may be used together with the memory chips to form a hybrid memory system (e.g. non-homogeneous, mixed technology, etc.).

FIG. 9

FIG. 9 shows a stacked memory package, in accordance with another embodiment. As an option, the system of FIG. 9 may be implemented in the context of the architecture and environment of the previous Figures and/or any subsequent Figure(s). Of course, however, the system of FIG. 9 may be implemented in the context of any desired environment.

In FIG. 9 the stacked memory package contains four memory chips. In FIG. 9 each memory chip is a DRAM. Each DRAM is a DRAM plane.

In FIG. 9 there is a single logic chip. The logic chip forms a logic plane.

In FIG. 9 each DRAM is subdivided into portions. The portions are slices, banks, and subbanks.

A memory echelon is composed of portions, called DRAM slices. There may be one DRAM slice per echelon on each DRAM plane. The DRAM slices may be vertically aligned (using the wiring of FIG. 4 for example) but need not be aligned.

In FIG. 9 each memory echelon contains 4 DRAM slices.

In FIG. 9 each DRAM slice contains 2 banks.

In FIG. 9 each bank contains 4 subbanks.

In FIG. 9 each memory echelon contains 4 DRAM slices, 8 banks, 32 subbanks.

In FIG. 9 each DRAM plane contains 16 DRAM slices, 32 banks, 128 subbanks.

In FIG. 9 each stacked memory package contains 4 DRAM planes, 64 DRAM slices, 512 banks, 2048 subbanks.

There may be any number and arrangement of DRAM planes, banks, subbanks, slices and echelons. For example, using a stacked memory package with 8 memory chips, 8 memory planes, 32 banks per plane, and 16 subbanks per bank, a stacked memory package may have 8×32×16 addressable subbanks or 4096 subbanks per stacked memory package.

FIG. 10

FIG. 10 shows a stacked memory package comprising a logic chip and a plurality of stacked memory chips, in accordance with another embodiment. As an option, the system of FIG. 10 may be implemented in the context of the architecture and environment of the previous Figures and/or any subsequent Figure(s). Of course, however, the system of FIG. 10 may be implemented in the context of any desired environment.

In one embodiment of stacked memory package comprising a logic chip and a plurality of stacked memory chips the stacked memory chip is constructed to be similar (e.g. compatible with, etc.) to the architecture of a standard JEDEC DDR memory chip.

A JEDEC standard DDR (e.g. DDR, DDR2, DDR3, etc.) SDRAM (e.g. JEDEC standard memory device, etc.) operates as follows. An ACT (activate) command selects a bank and row address (selected row). Data stored in memory cells in the selected row is transferred from a bank (also bank array, mat array, array, etc.) into sense amplifiers. A page is the amount of data transferred from the bank to the sense amplifiers. There are eight banks in a DDR3 DRAM. Each bank contains its own sense amplifiers and may be activated separately. The DRAM is in the active state when one or more banks has data stored in the sense amplifiers. The data remains in the sense amplifiers until a PRE (precharge) command to the bank restores the data to the cells in the bank. In the active state the DRAM can perform READs and WRITEs. A READ command column address selects a subset of data (column data) stored in the sense amplifiers. The column data is driven through I/O gating to the read latch and multiplexed to the output drivers. The process for a WRITE is similar with data moving in the opposite direction.

| A 1 Gbit (128 Mb × 8) DDR3 device has the following properties: | |
|---|---|
| Memory bits | 1 Gbit = 16384 × 8192 × 8 = 134217728 × 8 = 1073741824 bits |
| Banks | 8 |
| Bank address | 3 bits BA0 BA1 BA2 |
| Rows per bank | 16384 |
| Columns per bank | 8192 |
| Bits per bank | 16384 × 128 × 64 = 16384 × 8192 = 134217728 |
| Address bus | 14 bits A0-A13 2^14 = 16K = 16384 |
| Column address | 10 bits A0-A19 2^10 = 1K = 1024 |
| Row address | 14 bits A0-A13 2^14 = 16K = 16384 |
| Page size | 1 kB = 1024 bytes = 8 kbits = 8192 bits |

The physical layout of a bank may not correspond to the logical layout or the logical appearance of a bank. Thus, for example, a bank may comprise 9 mats (or subarrays, etc.) organized in 9 rows (M0-M8) (e.g. strips, stripes, in the x-direction, parallel to the column decoder, parallel to the local IO lines (LIOs, also datalines), local and master wordlines, etc.). There may be 8 rows of sense amps (SA0-SA8) located (e.g. running parallel to, etc.) between mats, with each sense amp row located (e.g. sandwiched, between, etc.) between two mats. Mats may be further divided into submats (also sections, etc.). For example into two (upper and lower submats), four, or eight sections, etc. Mats M0 and M8 (e.g. top and bottom, end mats, etc.) may be half the size of mats M1-M7 since they may only have sense amps on one side. The upper bits of a row address may be used to select the mat (e.g. A11-A13 for 9 mats, with two mats (e.g. M0, M8) always being selected concurrently). Other bank organizations may use 17 mats and 4 address bits, etc.

The above properties do not take into consideration any redundancy and/or repair schemes. The organization of mats and submats may be at least partially determined by the redundancy and/or repair scheme used. Redundant circuits (e.g. decoders, sense amps, etc.) and redundant memory cells may be allocated to a mat, submat, etc. or may be shared between mats, submats, etc. Thus the physical numbers of circuits, connections, memory cells, etc. may be different from the logical numbers above.

In FIG. 10 stacked memory package comprises single logic chip and four stacked memory chips. Any number of memory chips may be used depending on the limits of stacking technology, cost, size, yield, system requirement(s), manufacturability, etc.

For example, in one embodiment, 8 stacked memory chips may be used to emulate (e.g. replicate, approximate, simulate, replace, be equivalent, etc.) a standard 64-bit wide DIMM.

For example, in one embodiment, 9 stacked memory chips may be used to emulate a standard 72-bit wide ECC protected DIMM.

For example, in one embodiment, 9 stacked memory chips may be used to provide a spare stacked memory chip. The failure (e.g. due to failed memory bits, failed circuits or other components, faulty wiring and/or traces, intermittent connections, poor solder of other connections, manufacturing defect(s), marginal test results, infant mortality, excessive errors, design flaws, etc.) of a stacked memory chips may be detected (e.g. in production, at start-up, during self-test, at run time, etc.). The failed stacked memory chip may be mapped out (e.g. replaced, bypassed, eliminated, substituted, re-wired, etc.) or otherwise repaired (e.g. using spare circuits on the failed chip, using spare circuits on other stacked memory chips, etc.). The result may be a stacked memory package with a logical capacity of 8 stacked memory chips, but using more than 8 (e.g. 9, etc.) physical stacked memory chips.

In one embodiment, a stacked memory package may be designed with 9 stacked memory chips to perform the function of a high reliability memory subsystem (e.g. for use in a datacenter server etc.). Such a high reliability memory subsystem may use 8 stacked memory chips for data and 1 stacked memory chip for data protection (e.g. ECC, SECDED coding, RAID, data copy, data copies, checkpoint copy, etc.). In production those stacked memory packages with all 9 stacked memory chips determined to be working (e.g. through production test, production sort, etc.) may be sold at a premium as being protected memory subsystems (e.g. ECC protected modules, ECC protected DIMMs, etc.). Those stacked memory packages with only 8 stacked memory chips determined to be working may be configured (e.g. re-wired, etc.) to be sold as non-protected memory systems (e.g. for use in consumer goods, desktop PCs, etc.). Of course, any number of stacked memory chips may be used for data and/or data protection and/or spare(s).

In one embodiment a total of 10 stacked memory chips may be used with 8 stacked memory chips used for data, 2 stacked memory chips used for data protection and/or spare, etc.

Of course a whole stacked memory chip need not be used for a spare or data protection function.

In one embodiment a total of 9 stacked memory chips may be used, with half of one stacked memory chip set aside as a spare and half of one stacked memory chip set aside for data, spare, data protection, etc. Of course any number (including fractions etc.) of stacked memory chips in a stacked memory package may be used for data, spare, data protection etc.

Of course more than one portion (e.g. logical portion, physical portion, part, section, division, unit, subunit, array, mat, subarray, slice, etc.) of one or more stacked memory chips may also be used.

In one embodiment one or more echelons of a stacked memory package may be used for data, data protection, and/or spare.

Of course not all of a portion (e.g. less than the entire, a fraction of, a subset of, etc.) of a stacked memory chip has to be used for data, data protection, spare, etc.

In one embodiment one or more portions of a stacked memory package may be used for data, data protection and/or spare, where portion may be a part or one or more of the following: bank, a subbank, echelon, rank, other logical unit, other physical unit, combination of these, etc.

Of course not all the functions need be contained in a single stacked memory package.

In one embodiment one or more portions of a first stacked memory package may be used together with one or more portions of a second stacked memory package to perform one or more of the following functions: spare, data storage, data protection.

In FIG. 10 the stacked memory chip contains a DRAM array that is similar to the core (e.g. central portion, memory cell array portion, etc.) of a SDRAM memory device. In FIG. 10 almost all of the support circuits and control are located on the logic chip. In FIG. 10 the logic chip and stacked memory chips are connected (e.g. coupled, etc.) using through silicon vias.

The partitioning of logic between the logic chip and stacked memory chips may be made in many ways depending on silicon area, function required, number of TSVs that can be reliably manufactured, TSV size, packaging restrictions, etc. In FIG. 10 a partitioning is shown that may require about 17+7+64 or 88 signals TSVs for each memory chip. This number is an estimate only. Control signals (e.g. CS, CKE, other standard control signals, or other equivalent control signals, etc.) have not been shown or accounted for in FIG. 10 for example. In addition this number assumes all signals shown in FIG. 10 are routed to each stacked memory chip. Also power delivery through TSVs has not been included in the count. Typically it may be required to use a large number of TSVs for power delivery for example.

In one embodiment, it may be decided that not all stacked memory chips are accessed independently, in which case some, all or most of the signals may be carried on a multidrop bus between the logic chip and stacked memory chips. In this case, there may only be about 100 signal TSVs between the logic chip and the stacked memory chips.

In one embodiment, it may be decided that all stacked memory chips are to be accessed independently. In this case, with 8 stacked memory chips, there may be about 800 signal TSVs between the logic chip and the stacked memory chips.

In one embodiment, it may be decided (e.g. due to protocol constraints, system design, system requirements, space, size, power, manufacturability, yield, etc.) that some signals are routed to all stacked memory chips (e.g. together, using a multidrop bus, etc.); some signals are routed to each stacked memory chip separately (e.g. using a private bus, a parallel connection); some signals are routed to a subset (e.g. one or more, groups, pairs, other subsets, etc.) of the stacked memory chips. In this case, with 8 stacked memory chips, there may be between about 100 and about 800 signal TSVs between the logic chip and the stacked memory chips depending on the configuration of buses and wiring used.

In one embodiment a different partitioning (e.g. circuit design, architecture, system design, etc.) may be used such that, for example, the number of TSVs or other connections etc. may be reduced (e.g. connections for buses, signals, power, etc.). For example, the read FIFO and/or data interface are shown integrated with the logic chip in FIG. 10. If the read FIFO and/or data interface are moved to the stacked memory chips the data bus width between the logic chip and the stacked memory chips may be reduced, for example to 8. In this case the number of signal TSVs may be reduced to 17+10+8=35 (e.g. again considering connections to one stacked memory chip only, or that all signals are connected to all stacked memory chips on multidrop busses, etc.). Notice that in moving the read FIFO from the logic chip to the stacked memory chips we need to transmit an extra 3 bits of the column address from the logic chip to the stacked memory chips. Thus we have saved some TSVs but added others. This type of trade-off is typical in such a system design. Thus the exact numbers and types of connections may vary with system requirements (e.g. cost, time (as technology changes and improves, etc.), space, power, reliability, etc.).

In one embodiment the bus structure(s) (e.g. shared data bus, shared control bus, shared address bus, etc.) may be varied to improve features (e.g. increase the system flexibility, increase market size, improve data access rates, increase bandwidth, reduce latency, improve reliability, etc.) at the cost of increased connection complexity (e.g. increased TSV count, increased space complexity, increased chip wiring, etc.).

In one embodiment the access (e.g. data access pattern, request format, etc.) granularity (e.g. the size and number of banks, or other portions of each stacked memory chip, etc.) may be varied. For example, by using a shared data bus and shared address bus the signal TSV count may be reduced. In this manner the access granularity may be increased. For example, in FIG. 10 a memory echelon comprises one bank (from eight on each stacked memory chip) in each of the eight stacked memory chips. Thus an echelon is 8 banks (a DRAM slice is thus a bank in this case). There are thus eight memory echelons. By reducing the TSV signal count (e.g. by using shared buses, moving logic from logic chip to stacked memory chips, etc.) we can use extra TSVs to vary the access granularity. For example we can use a subbank to form the echelon, reducing the echelon size and increasing the number of echelons in the system. If there are two subbanks in a bank, we would double the number of memory echelons, etc.

Manufacturing limits (e.g. yield, practical constraints, etc.) for TSV etch and via fill determine the TSV size. A TSV requires the silicon substrate to be thinned to a thickness of 100 micron or less. With a practical TSV aspect ratio (e.g. height:width) of 10:1 or lower, the TSV size may be about 5 microns if the substrate is thinned to about 50 micron. As manufacturing improves the number of TSVs may be increased. An increased number of TSVs may allow more flexibility in the architecture of both logic chips and stacked memory chips.

Further details of these and other embodiments, including details of connections between the logic chip and stacked memory packages (e.g. bus types, bus sharing, etc.) are described herein in subsequent figures and accompanying text.

FIG. 11

FIG. 11 shows a stacked memory chip, in accordance with another embodiment. As an option, the system of FIG. 11 may be implemented in the context of the architecture and environment of the previous Figures and/or any subsequent Figure(s). Of course, however, the system of FIG. 11 may be implemented in the context of any desired environment.

In FIG. 11 the stacked memory chip comprises 32 banks.

In FIG. 11 an exploded diagram shows a bank that comprises 9 rows (also called stripes, strips, etc.) of mats (M0-M8) (also called sections, subarrays, etc.).

In FIG. 11 the bank comprises 64 subbanks.

In FIG. 11 an echelon comprises 4 banks on 4 stacked memory chips. Thus for example echelon B31 comprises bank 31 on the top stacked memory chip (D0), B31D0 as well as B31D1, B31D2, B31D3. Note that an echelon does not have to be formed from an entire bank. Echelons may also comprise groups of subbanks.

In FIG. 11 an exploded diagram shows 4 subbanks and the arrangements of: local wordline drivers, column select lines, master word lines, master IO lines, sense amplifiers, local digitlines (also known as local bitlines, etc.), local IO lines (also known as local datalines, etc.), local wordlines.

In one embodiment groups (e.g. 1, 4, 8, 16, 32, 64, etc.) of subbanks may be used to form part of a memory echelon. This in effect increase the number of banks. Thus, for example, a stacked memory chip with 4 banks, with each bank containing 4 subbanks that may be independently accessed, is effectively equivalent to a stacked memory chip with 16 banks, etc.

In one embodiment groups of subbanks may share resources. Normally to permit independent access to subbanks requires the addition of extra column decoders and IO circuits. For example in going from 4 subbank (or 4 bank) access to 8 subbank (or 8 bank) access, the number and area of column decoders and IO circuits double. For example a 4-bank memory chip may use 50% of the die area for memory cells and 50% overhead for sense amplifiers, row and column decoders, wiring and IO circuits. Of the 50% overhead, 10% may be for column decoders and IO circuits. In going from 4 to 16 banks, column decoder and IO circuit overhead may increases from 10% to 40% of the original die area. In going from 4 to 32 banks, column decoder and IO circuit overhead may increases from 10% to 80% of the original die area. This overhead may be greatly reduced by sharing resources. Since the column decoders and IO circuits are only used for part of an access they may be shared. In order to do this the control logic in the logic chip must schedule accesses so that access conflicts between shared resources are avoided.

In one embodiment, the control logic in the logic chip may track, for example, the sense amplifiers required by each access to a bank or subbank that share resources and either re-schedule, re-order, or delay accesses to avoid conflicts (e.g. contentions, etc.).

FIG. 12

FIG. 12 shows a logic chip connected to stacked memory chips, in accordance with another embodiment. As an option, the system of FIG. 12 may be implemented in the context of the architecture and environment of the previous Figures and/or any subsequent Figure(s). Of course, however, the system of FIG. 12 may be implemented in the context of any desired environment.

FIG. 12 shows 4 stacked memory chips connected (e.g. coupled, etc.) to a single logic chip. Typically connections between stacked memory chips and one or more logic chips may be made using TSVs, spacers, and solder bumps (as shown for example in FIG. 4). Other connection and coupling methods may be used to connect (e.g. join, stack, assemble, couple, aggregate, bond, etc.) stacked memory chips and one or more logic chips.

In FIG. 12 three buses are shown: address bus (which may comprise row, column, banks addresses, etc.), control bus (which may comprise CK, CKE, other standard control signals, other non-standard control signals, combinations of these and/or other control signals, etc.), data bus (e.g. a bidirectional bus, two unidirectional buses (read and write), etc.). These may be the main (e.g. majority of signals, etc.) signal buses, though there may be other buses, signals, groups of signals, etc. The power and ground connections are not shown.

In one embodiment the power and/or ground may be shared between all chips.

In one embodiment each stacked memory chip may have separate (e.g. unique, not shared, individual, etc.) power and/or ground connections.

In one embodiment there may be multiple power connections (e.g. VDD, reference voltages, boosted voltages, back-bias voltages, quiet voltages for DLLs (e.g. VDDQ, etc.), reference currents, reference resistor connections, decoupling capacitance, other passive components, combinations of these, etc.).

In FIG. 12 (*a*) each stacked memory chip connects to the logic chip using a private (e.g. not shared, not multiplexed with other chips, point-to-point, etc.) bus. Note that in FIG. 12 (*a*) the private bus may still be a multiplexed bus (or other complex bus type using packets, shared between signals, shared between row address and column address, etc.) but in FIG. 12 (*a*) is not necessarily shared between stacked memory chips.

In FIG. 12 (*b*) the control bus and data bus of each stacked memory connects to the logic chip using a private bus. In FIG. 12 (*b*) the address bus of each stacked memory connects to the logic chip using a shared (e.g. multidrop, dotted, multiplexed, etc.) bus.

In FIG. 12 (*c*) the data bus of each stacked memory connects to the logic chip using a private bus. In FIG. 12 (*b*) the address bus and control bus of each stacked memory connects to the logic chip using a shared bus.

In FIG. 12 (*d*) the address bus (label A) and control bus (label C) and data bus (label D) of each stacked memory chip connects to the logic chip using a shared bus.

In FIG. 12 (*a*)-(*d*) note that a dot on the bus represent a connection to that stacked memory chip.

In FIGS. 12 (*a*), (*b*), (*c*) note that it appears that each stacked memory chip has a different pattern of connections (e.g. a different dot wiring pattern, etc.). In practice it may be desirable to have every stacked memory chip be exactly the same (e.g. use the same wiring pattern, same TSV pattern, same connection scheme, same spacer, etc.). In such a case the mechanism (e.g. method, system, architecture, etc.) of FIG. 4 may be used (e.g. a stitched, zig-zag, jogged, etc. wiring pattern). The wiring of FIG. 4 and the wiring scheme shown in FIGS. 12 (*a*), (*b*), (*c*) are logically compatible (e.g. equivalent, produce the same electrical connections, etc.).

In one embodiment the sharing of buses between multiple stacked memory chips may create potential conflicts (e.g. bus collisions, contention, resource collisions, resource starvation, protocol violations, etc.). In such cases the logic chip is able to re-schedule (re-time, re-order, etc.) access to avoid such conflicts.

In one embodiment the use of shared buses reduces the numbers of TSVs required. Reducing the number of TSVs may help improve manufacturability and may increase yield, thus reducing cost, etc.

In one embodiment, the use of private buses may increase the bandwidth of memory access, reduce the probability of conflicts, eliminate protocol violations, etc.

Of course variations of the schemes (e.g. permutations, combinations, subsets, other similar schemes, etc.) shown in FIG. 12 are possible.

For example in one embodiment using a stacked memory package with 8 chips, one set of four memory chips may used one shared control bus and a second set of four memory chips may use a second shared control bus, etc.

For example in one embodiment some control signals may be shared and some control signals may be private, etc.

FIG. 13

FIG. 13 shows a logic chip connected to stacked memory chips, in accordance with another embodiment. As an option, the system of FIG. 13 may be implemented in the context of the architecture and environment of the previous Figures and/or any subsequent Figure(s). Of course, however, the system of FIG. 13 may be implemented in the context of any desired environment.

FIG. 13 shows 4 stacked memory chips (D0, D1, D2, D3) connected (e.g. coupled, etc.) to a single logic chip. Typically connections are made using TSVs, spacers, and solder bumps (as shown for example in FIG. 4). Other connection and coupling methods may be used.

In FIG. 13 (*a*) three buses are shown: Bus1, Bus2, Bus3.

Note that in FIGS. 13(*a*) and (*b*) the buses may be of any type. The wires shown may be: (1) single wires (e.g. for discrete control signals such as CK, CKE, CS, or other equivalent control signals etc.); (2) bundles of wires (e.g. a bundle of control signals each using a distinct wire (e.g. trace, path, conductors, etc.); (3) a bus (e.g. group of related signals, data bus, address bus, etc.) with each signal in the bus occupying a single wire; (3) a multiplexed bus (e.g. column address and row address multiplexed onto a single address bus, etc.); (4) a shared bus (e.g. used at time t1 for one purpose, used at time t2 for a different purpose, etc.); (5) a packet bus (e.g. data, address and/or command, request(s), response(s), encapsulated in packets, etc.); (6) any other type of communication bus or protocol; (7) changeable in form and/or topology (e.g. programmable, used as general-purpose, switched-purpose, etc.); (8) any combinations of these, etc.

In FIG. 13 (*a*) it should be noted that all stacked memory chips have the same physical and electrical wiring pattern. FIG. 13 (*a*) is logically equivalent to the connection pattern shown in FIG. 12 (*b*) (e.g. with Bus1 in FIG. 13 (*a*) equivalent to the address bus in FIG. 12(*b*); with Bus2 in FIG. 13 (*a*) equivalent to the control bus in FIG. 12(*b*); with Bus3 in FIG. 13 (*a*) equivalent to the data bus in FIG. 12(*b*), etc.).

In FIG. 13 (*b*) the wiring pattern for D0-D3 is identical to FIG. 13 (*a*). In FIG. 13 (*b*) a technique (e.g. method, architecture, etc.) is shown to connect pairs of stacked memory chips to a bus. For example, in FIG. 13 (*b*) Bus 3 connects two pairs: a first part of Bus3 (e.g. portion, bundle, section, etc.) connects D0 and D1 while a second part of Bus 3 connects D2 and D3. In FIG. 13 (*b*) all 3 buses are shown as being driven by the logic chip. Of course the buses may be unidirectional from the logic chip (e.g. driven by the logic chip etc.), unidirectional to the logic chip (driven by one or more stacked memory chips, etc.), bidirectional to/from the logic chip, or use any other form of coupling between any number of the logic chip(s) and/or stacked memory chip(s), etc.

In one embodiment the schemes shown in FIG. 13 may also be employed to connect power (e.g. VDD, VDDQ, VREF, VDLL, GND, other supply and/or reference voltages, currents, etc.) to any permutation and combination of logic chip(s) and/or stacked memory chips. For example it may be required (e.g. necessary, desirable, convenient, etc.) for various design reasons (e.g. TSV resistance, power supply noise, circuit location(s), etc.) to connect a first power supply VDD1 from the logic chip to stacked memory chips D0 and D1 and a second separate power supply VDD2 from the logic chip to D2 and D3. In such a case a wiring scheme similar to that shown in FIG. 13 (*b*) for Bus3 may be used, etc.

In one embodiment the wiring arrangement(s) (e.g. architecture, scheme, connections, etc.) between logic chip(s) and/or stacked memory chips may be fixed.

In one embodiment the wiring arrangements may be variable (e.g. programmable, changed, altered, modified, etc.). For example, depending on the arrangement of banks, subbanks, echelons etc. it may be desirable to change wiring (e.g. chip routing, bus functions, etc.) and/or memory system or memory subsystem configurations (e.g. change the size of an echelon, change the memory chip wiring topology, time-share buses, etc.). Wiring may be changed in a programmable fashion using switches (e.g. pass transistors, logic gates, transmission gates, pass gates, etc.).

In one embodiment the switching of wiring configurations (e.g. changing connections, changing chip and/or circuit coupling(s), changing bus function(s), etc.) may be done at system initialization (e.g. once only, at start-up, at configuration time, etc.).

In one embodiment the switching of wiring configurations may be performed at run time (e.g. in response to changing workloads, to save power, to switch between performance and low-power modes, to respond to failures in chips and/or other components or circuits, on user command, on BIOS command, on program command, on CPU command, etc.).

FIG. 14

FIG. 14 shows a logic chip for use with stacked memory chips in a stacked memory chip package, in accordance with another embodiment. As an option, the system of FIG. 14 may be implemented in the context of the architecture and environment of the previous Figures and/or any subsequent Figure(s). Of course, however, the system of FIG. 14 may be implemented in the context of any desired environment.

In FIG. 14 the logic layer of the logic chip may contain the following functional blocks: (1) bank/subbank queues; (2) redundancy and repair; (3) fairness and arbitration; (4) ALU and macros; (5) virtual channel control; (6) coherency and cache; (7) routing and network; (8) reorder and replay buffers; (9) data protection; (10) error control and reporting; (11) protocol and data control; (12) DRAM registers and control; (13) DRAM controller algorithm; (14) miscellaneous logic.

In FIG. 14 the logic chip may contain a PHY layer and link layer control.

In FIG. 14 the logic chip may contain a switch fabric (e.g. one or more crossbar switches, a minimum spanning tree (MST), a Clos network, a banyan network, crossover switch, matrix switch, nonblocking network or switch, Benes network, multi-stage interconnection network, multi-path network, single path network, time division fabric, space division fabric, recirculating network, hypercube network, Strowger switch, Batcher network, Batcher-Banyan switching system, fat tree network, omega network, delta network switching system, fully interconnected fabric, hierarchical combinations of these, nested combinations of these, linear (e.g. series and/or parallel connections, etc.) combinations of these, and combinations of any of these and/or other networks, etc.).

In FIG. 14 the PHY layer is coupled to one or more CPUs and/or one or more stacked memory packages. In FIG. 14 the serial links are shown as 8 sets of 4 arrows. An arrow directed into the PHY layer represents an Rx signal (e.g. a pair of differential signals, etc.). An arrow directed out of the PHY represents Tx signal. Since a lane is defined herein to represent the wires used for both Tx and Rx FIG. 14 shows 4 sets of 4 lanes.

In one embodiment the logic chip links may be built using one or more high-speed serial links that may use dedicated unidirectional couples of serial (1-bit) point-to-point connections or lanes.

In one embodiment the logic chip links may use a bus-based system where all the devices share the same bidirectional bus (e.g. a 32-bit or 64-bit parallel bus, etc.).

In one embodiment the serial high-speed links may use one or more layered protocols. The protocols may consist of a transaction layer, a data link layer, and a physical layer. The data link layer may include a media access control (MAC) sublayer. The physical layer (also known as PHY, etc.) may include logical and electrical sublayers. The PHY logical-sublayer may contain a physical coding sublayer (PCS). The layered protocol terms may follow (e.g. may be defined by, may be described by, etc.) the IEEE 802 networking protocol model.

In one embodiment the logic chip high-speed serial links may use a standard PHY. For example, the logic chip may use the same PHY that is used by PCI Express. The PHY specification for PCI Express (and high-speed USB) is published by Intel as the PHY Interface for PCI Express (PIPE). The PIPE specification covers (e.g. specifies, defines, describes, etc.) the MAC and PCS functional partitioning and the interface between these two sublayers. The PIPE specification covers the physical media attachment (PMA) layer (e.g. including the serializer/deserializer (SerDes), other analog IO circuits, etc.).

In one embodiment the logic chip high-speed serial links may use a non-standard PHY. For example market or technical considerations may require the use of a proprietary PHY design or a PHY based on a modified standard, etc.

Other suitable PHY standards may include the Cisco/Cortina Interlaken PHY, or the MoSys CEI-11 PHY.

In one embodiment each lane of a logic chip may use a high-speed electrical digital signaling system that may run at very high speeds (e.g. over inexpensive twisted-pair copper cables, PCB, chip wiring, etc.). For example, the electrical signaling may be a standard (e.g. Low-Voltage Differential Signaling (LVDS), Current Mode Logic (CML), etc.) or non-standard (e.g. proprietary, derived or modified from a standard, standard but with lower voltage or current, etc.). For example the digital signaling system may consist of two unidirectional pairs operating at 2.525 Gbit/s. Transmit and receive may use separate differential pairs, for a total of 4 data wires per lane. A connection between any two devices is a link, and consists of 1 or more lanes. Logic chips may support single-lane link (known as a ×1 link) at minimum. Logic chips may optionally support wider links composed of 2, 4, 8, 12, 16, or 32 lanes, etc.

In one embodiment the lanes of the logic chip high-speed serial links may be grouped. For example the logic chip shown in FIG. 14 may have 4 ports (e.g. North, East, South, West, etc.). Of course the logic chip may have any number of ports.

In one embodiment the logic chip of a stacked memory package may be configured to have one or more ports, with each port having one or more high-speed serial link lanes.

In one embodiment the lanes within each port may be combined. Thus for example, the logic chip shown in FIG. 14 may have a total of 16 lanes (represented by the 32 arrows). As is shown in FIG. 14 the lanes are grouped as if the logic chip had 4 ports with 4 lanes in each port. Using logic in the PHY layer lanes may be combined, for example, such that the logic chip appears to have 1 port of 16 lanes. Alternatively the logic chip may be configured to have 2 ports of 8 lanes, etc. The ports do not have to be equal in size. Thus, for example, the logic chip may be configured to have a 1 port of 12 lanes and 2 ports of 2 lanes, etc.

In one embodiment the logic chip may use asymmetric links. For example, in the PIPE and PCI Express specifications the links are symmetrical (e.g. equal number of transmit and receive wires in a link, etc.). The restriction to symmetrical links may be removed by using switching and gating logic in the logic chip and asymmetric links may be employed. The use of asymmetric links may be advantageous in the case that there is much more read traffic than write for example. Since we have decided to use the definition of a lane from PCI Express and PCI Express uses symmetric lanes (equal numbers of Tx and Rx wires) we need to be careful in our use of the term lane in an asymmetric link. Instead we can describe the logic chip functionality in terms of Tx and Rx wires. It should be noted that the Tx and Rx wire function is as seen at the logic chip. Since every Rx wire at the logic chip corresponds to a Tx wire at the remote transmitter we must be careful not to confuse Tx and Rx wire counts at the receiver and transmitter. Of course when we consider both receiver and transmitter every Rx wire (as seen at the receiver) has a corresponding Tx wire (as seen at the transmitter).

In one embodiment the logic chip may be configured to use any combinations (e.g. numbers, permutations, combinations, etc.) of Tx and Rx wires to form one or more links where the number of Tx wires is not necessarily the same as the number of Rx wires. For example a link may use 2 Tx wires (e.g. if we use differential signaling, two wires carries one signal, etc.) and 4 Rx wires, etc. Thus for example the logic chip shown in FIG. 14 has 4 ports with 4 lanes each, 16 lanes with 4 wires per lane, or 64 wires. The logic chip shown in FIG. 14 thus has 32 Rx wires and 32 Tx wires. These wires may be allocated to links in any way desired. For example we may have the following set of links: (1) Link 1 with 16 Rx wires/12 Tx wires; (2) Link 2 with 6 Rx wires/8 Tx wires; (3) Link 3 with 6 Rx wires/8 Tx wires; (4) Link 4 with 4 Rx wires/4 Tx wires. Not all Tx and/or Rx wires need be used and even though a logic chip may be capable of supporting up to 4 ports (e.g. due to switch fabric restrictions, etc.) not all ports need be used.

Of course depending on the technology of the PHY layer it may be possible to swap the function of Tx and Rx wires. For example the logic chip of FIG. 14 has equal numbers of Rx and Tx wires. In some situations it may be desirable to change one or more Tx wires to Rx wires or vice versa. Thus for example it may be desirable to have a single stacked memory package with a very high read bandwidth. In such a situation the logic chip shown in FIG. 14 may be configured, for example, to have 56 Tx wires and 8 Rx wires.

In one embodiment the logic chip may be configured to use any combinations (e.g. numbers, permutations, combinations, etc.) of one or more PHY wires to form one or more serial links comprising a first plurality of Tx wires and a second plurality of Rx wires where the number of the first plurality of Tx wires may be different from the second plurality of Rx wires.

Of course since the memory system typically operates as a split transaction system and is capable of handling variable latency it is possible to change PHY allocation (e.g. wire allocation to Tx and Rx, lane configuration, etc.) at run time. Normally PHY configuration may be set at initialization based on BIOS etc. Depending on use (e.g. traffic pattern, system use, type of application programs, power consumption, sleep mode, changing workloads, component failures, etc.) it may be decided to reconfigure one or more links at run time. The decision may be made by CPU, by the logic chip, by the system user (e.g. programmer, operator, administrator, datacenter management software, etc.), by BIOS etc. The logic chip may present an API to the CPU specifying registers etc. that may be modified in order to change PHY configuration(s). The CPU may signal one or more stacked memory packages in the memory subsystem by using command requests. The CPU may send one or more command requests to change one or more link configurations. The memory system may briefly halt or redirect traffic while links are reconfigured. It may be required to initialize a link using training etc.

In one embodiment the logic chip PHY configuration may be changed at initialization, start-up or at run time.

The data link layer of the logic chip may use the same set of specifications as used for the PHY (if a standard PHY is used) or may use a custom design. Alternatively, since the PHY layer and higher layers are deliberately designed (e.g. layered, etc.) to be largely independent, different standards may be used for the PHY and data link layers.

Suitable standards, at least as a basis for the link layer design, may be PCI Express, MoSys GigaChip Interface (an open serial protocol), Cisco/Cortina Interlaken, etc.

In one embodiment, the data link layer of the logic chip may perform one or more of the following functions for the high-speed serial links: (1) sequence the transaction layer packets (TLPs, also requests, etc.) that are generated by the transaction layer; (2) may optionally ensure reliable delivery of TLPs between two endpoints via an acknowledgement protocol (e.g. ACK and NAK signaling, ACK and NAK messages, etc.) that may explicitly requires replay of invalid (e.g. unacknowledged, bad, corrupted, lost, etc.) TLPs; (3) may optionally initialize and manage flow control credits (e.g. to ensure fairness, for bandwidth control, etc.); (4) combinations of these, etc.

In one embodiment, for each transmitted packet (e.g. request, response, forwarded packet, etc.) the data link layer may generate a ID (e.g. sequence number, set of numbers, codes, etc.) that is a unique identifier (e.g. number (s), sequence(s), time-stamp(s), etc.), as shown for example in FIG. 2. The ID may be changed (e.g. different, incremented, decremented, unique hash, add one, count up, generated, etc.) for each outgoing TLP. The ID may serve as a unique identification field for each transmitted TLP and may be used to uniquely identify a TLP in a system (or in a set of systems, network of system, etc.). The ID may be inserted into an outgoing TLP (e.g. in the header, etc.). A check code (e.g. 32-bit cyclic redundancy check code, link CRC (LCRC), other check code, combinations of check codes, etc.) may also be inserted (e.g. appended to the end, etc.) into each outgoing TLP.

In one embodiment, every received TLP check code (e.g. LCRC, etc.) and ID (e.g. sequence number, etc.) may be validated in the receiver link layer. If either the check code validation fails (indicating a data error), or the sequence-number validation fails (e.g. out of range, non-consecutive, etc.), then the invalid TLP, as well as any TLPs received after the bad TLP, may be considered invalid and may be discarded (e.g. dropped, deleted, ignored, etc.). On receipt of an invalid TLP the receiver may send a negative acknowledgement message (NAK) with the ID of the invalid TLP. On receipt of an invalid TLP the receiver may request retransmission of all TLPs forward (e.g. including and following, etc.) of the invalid ID. If the received TLP passes the check code validation check and has a valid ID, the TLP may be considered as valid. On receipt of a valid TLP the link receiver may change the ID (which may thus be used to track the last received valid TLP) and may forward the valid TLP to the receiver transaction layer. On receipt of a valid TLP the link receiver may send an ACK message to the remote transmitter. An ACK may indicate a valid TLP was received (and thus, by extension, all TLPs with previous IDs (e.g. lower value IDs if IDs are incremented (higher if decremented, etc.), preceding TLPs, lower sequence number, earlier timestamps, etc.).

In one embodiment, if the transmitter receives a NAK message, or does not receive an acknowledgement (e.g. NAK or ACK, etc.) before a timeout period expires, the transmitter may retransmit all TLPs that lack acknowledgement (ACK). The timeout period may be programmable. The link-layer of the logic chip thus may present a reliable connection to the transaction layer, since the transmission protocol described may ensure reliable delivery of TLPs over an unreliable medium.

In one embodiment, the data-link layer may also generate and consume data link layer packets (DLLPs). The ACK and NAK messages may be communicated via DLLPs. The DLLPs may also be used to carry other information (e.g. flow control credit information, power management messages, flow control credit information, etc.) on behalf of the transaction layer.

In one embodiment, the number of in-flight, unacknowledged TLPs on a link may be limited by two factors: (1) the size of the transmit replay buffer (which may store a copy of all transmitted TLPs until they the receiver ACKs them); (2) the flow control credits that may be issued by the receiver to a transmitter. It may be required that all receivers issue a minimum number of credits to guarantee a link allows sending at least certain types of TLPs.

In one embodiment, the logic chip and high-speed serial links in the memory subsystem (as shown, for example, in FIG. 1) may typically implement split transactions (transactions with request and response separated in time). The link may also allow for variable latency (the amount of time between request and response). The link may also allow for out-of-order transactions (while ordering may be imposed as required to support coherence, data validity, atomic operations, etc.).

In one embodiment, the logic chip high-speed serial link may use credit-based flow control. A receiver (e.g. in the memory system, also known as a consumer, etc.) that contains a high-speed link (e.g. CPU or stacked memory package, etc.) may advertise an initial amount of credit for each receive buffer in the receiver transaction layer. A transmitter (also known as producer, etc.) may send TLPs to the receiver and may count the number of credits each TLP consumes. The transmitter may only transmit a TLP when doing so does not make its consumed credit count exceed a credit limit. When the receiver completes processing the TLP (e.g. from the receiver buffer, etc.), the receiver signals a return of credits to the transmitter. The transmitter may increase the credit limit by the restored amount. The credit counters may be modular counters, and the comparison of consumed credits to credit limit may requires modular arithmetic. One advantage of credit-based flow control in a memory system may be that the latency of credit return does not affect performance, provided that a credit limit is not exceeded. Typically each receiver and transmitter may be designed with adequate buffer sizes so that the credit limit may not be exceeded.

In one embodiment, the logic chip may use wait states or handshake-based transfer protocols.

In one embodiment, a logic chip and stacked memory package using a standard PIPE PHY layer may support a data rate of 250 MB/s in each direction, per lane based on the physical signaling rate (2.5 Gbaud) divided by the encoding overhead (10 bits per byte.) Thus, for example, a 16 lane link is theoretically capable of 16×250 MB/s=4 GB/s in each direction. Bandwidths may depend on usable data payload rate. The usable data payload rate may depend on the traffic profile (e.g. mix of reads and writes, etc.). The traffic profile in a typical memory system may be a function of software applications etc.

In one embodiment, in common with other high data rate serial interconnect systems, the logic chip serial links may have a protocol and processing overhead due to data protection (e.g. CRC, acknowledgement messages, etc.). Efficiencies of greater than 95% of the PIPE raw data rate may be possible for long continuous unidirectional data transfers in a memory system (such as long contiguous reads based on a low number of request, or a single request, etc.). Flexibility of the PHY layer or even the ability to change or modify the PHY layer at run time may help increase efficiency.

Next are described various features of the logic layer of the logic chip.

Bank/Subbank Queues.

The logic layer of a logic chip may contain queues for commands directed at each DRAM or memory system portion (e.g. a bank, subbank, rank, echelon, etc.).

Redundancy and Repair;

The logic layer of a logic chip may contain logic that may be operable to provide memory (e.g. data storage, etc.) redundancy. The logic layer of a logic chip may contain logic that may be operable to perform repairs (e.g. of failed memory, failed components, etc.). Redundancy may be provided by using extra (e.g. spare, etc.) portions of memory in one or more stacked memory chips. Redundancy may be provided by using memory (e.g. eDRAM, DRAM, SRAM, other memory etc.) on one or more logic chips. For example, it may be detected (e.g. at initialization, at start-up, during self-test, at run time using error counters, etc.) that one or more components (e.g. memory cells, logic, links, connections, etc.) in the memory system, stacked memory package(s), stacked memory chip(s), logic chip(s), etc. is in one or more failure modes (e.g. has failed, is likely to fail, is prone to failure, is exposed to failure, exhibits signs or warnings of failure, produces errors, exceeds an error or other monitored threshold, is worn out, has reduced performance or exhibits other signs, fails one or more tests, etc.). In this case the logic layer of the logic chip may act to substitute (e.g. swap, insert, replace, repair, etc.) the failed or failing component(s). For example, a stacked memory chip may show repeated ECC failures on one address or group of addresses. In this case the logic layer of the logic chip may use one or more look-up tables (LUTs) to insert replacement memory. The logic layer may insert the bad address(es) in a LUT. Each time an access is made a check is made to see if the address is in a LUT. If the address is present in the LUT the logic layer may direct access to an alternate addressor spare memory. For example the data to be accessed may be stored in another part of the first LUT or in a separate second LUT. For example the first LUT may point to one or more alternate addresses in the stacked memory chips, etc. The first LUT and second LUT may use different technology. For example it may be advantageous for the first LUT to be small but provide very high-speed lookups. For example it may be advantageous for the second LUT to be larger but denser than the first LUT. For example the first LUT may be high-speed SRAM etc. and the second LUT may be embedded DRAM etc.

In one embodiment the logic layer of the logic chip may use one or more LUTs to provide memory redundancy.

In one embodiment the logic layer of the logic chip may use one or more LUTs to provide memory repair.

The repairs may be made in a static fashion. For example at the time of manufacture. Thus stacked memory chips may be assembled with spare components (e.g. parts, etc.) at various levels. For example, there may be spare memory chips in the stack (e.g. a stacked memory package may contain 9 chips with one being a spare, etc.). For example there may be spare banks in each stacked memory chip (e.g. 9 banks with one being a spare, etc.). For example there may be spare sense amplifiers, spare column decoders, spare row decoders, etc. At manufacturing time a stacked memory package may be tested and one or more components may need to be repaired (e.g. replaced, bypassed, mapped out, switched out, etc.). Typically this may be done by using fuses (e.g. antifuse, other permanent fuse technology, etc.) on a memory chip. In a stacked memory package, a logic chip may be operable to cooperate with one or more stacked memory chips to complete a repair. For example, the logic chip may be capable of self-testing the stacked memory chips. For example the logic chip may be capable of operating fuse and fuse logic (e.g. programming fuses, blowing fuses, etc.). Fuses may be located on the logic chip and/or stacked memory chips. For example, the logic chip may use non-volatile logic (e.g. flash, NVRAM, etc.) to store locations that need repair, store configuration and repair information, or act as and/or with logic switches to switch out bad or failed logic, components and/or or memory and switch in replacement logic, components, and/or spare components or memory.

The repairs may be made in a dynamic fashion (e.g. at run time, etc.). If one or more failure modes (e.g. as previously described, other modes, etc.) is detected the logic layer of the logic chip may perform one or more repair algorithms. For example, it may appear that a bank of logic is about to fail because an excessive number of ECC errors has been detected in that bank. The logic layer of the logic chip may proactively start to copy the data in the failing bank to a spare bank. When the copy is complete the logic may switch out the failing bank and replace the failing bank with a spare.

In one embodiment the logic chip may be operable to use a LUT to substitute one or more spare addresses at any time (e.g. manufacture, start-up, initialization, run time, during or after self-test, etc.). For example the logic chip LUT may contain two fields IN and OUT. The field IN may be two bits wide. The field OUT may be 3 bits wide. The stacked memory chip that exhibits signs of failure may have 4 banks. These four banks may correspond to IN[00], IN[01], IN[10], IN[11]. In normal operation a 2-bit part of the input memory address forms an input to the LUT. The output of the LUT normally asserts OUT[000] if IN[00] is asserted, OUT[011] if IN[11] is asserted, etc. The stacked memory chip may have 2 spare banks that correspond to (e.g. are connected to, are enabled by, etc.) OUT[100] and OUT[101]. Suppose the failing bank corresponds to IN[11] and OUT[011]. When the logic chip is ready to switch in the first spare bank it updates the LUT so that the LUT now asserts OUT[100] rather than OUT[011] when IN[11] is asserted etc.

The repair logic and/or other repair components (e.g. LUTs, spare memory, spare components, fuses, etc.) may be located on one or more logic chips; may be located on one or more stacked memory chips; may be located in one or more CPUs (e.g. software and/or firmware and/or hardware to control repair etc.); may be located on one or more substrates (e.g. fuses, passive components etc. may be placed on a substrate, interposer, spacer, RDL, etc.); may be located on or in a combination of these (e.g. part(s) on one chip or device, part(s) on other chip(s) or device(s), etc); or located anywhere in any components of the memory system, etc.

There may be multiple levels of repair and/or replacement etc. For example a memory bank may be replaced/repaired, a memory echelon may be replaced/repaired, or an entire memory chip may be replaced/repaired. Part(s) of the logic chip may also be redundant and replaced and/or repaired. Part(s) of the interconnects (e.g. spacer, RDL, interposer, packaging, etc.) may be redundant and used for replace or repair functions. Part(s) of the interconnects may also be replaced or repaired. Any of these operations may be performed in a static fashion (e.g. static manner; using a static algorithm; while the chip(s), package(s), and/or system is non-operational; at manufacture time; etc.) and/or dynamic fashion (e.g. live, at run time, while the system is in operation, etc.).

Repair and/or replacement may be programmable. For example, the CPU may monitor the behavior of the memory system. If a CPU detects one or more failure modes (e.g. as previously described, other modes, etc.) the CPU may instruct (e.g. via messages, etc.) one or more logic chips to perform repair operation(s) etc. The CPU may be programmed to perform such repairs when a programmed error threshold is reached. The logic chips may also monitor the behavior of the memory system (e.g. monitor their own (e.g. same package, etc.) stacked memory chips; monitor themselves; monitor other memory chips; monitor stacked memory chips in one or more stacked memory packages; monitor other logic chips; monitor interconnect, links, packages, etc.). The CPU may program the algorithm (e.g. method, logic, etc.) that each logic chip uses for repair and/or replacement. For example, the CPU may program each logic chip to replace a bank once 100 correctable ECC errors have occurred on that bank, etc.

Fairness and Arbitration

In one embodiment the logic layer of each logic chip may have arbiters that decide which packets, commands, etc. in various queues are serviced (e.g. moved, received, operated on, examined, transferred, transmitted, manipulated, etc.) in which order. This process is arbitration. The logic layer of each logic chip may receive packets and commands (e.g. reads, writes, completions, messages, advertisements, errors, control packets, etc.) from various sources. It may be advantageous that the logic layer of each logic chip handle such requests, perform such operations etc. in a fair manner. Fair may mean for example that the CPU may issue a number of read commands to multiple addresses and each read command is treated in an equal fashion by the system so that for example one memory address range does not exhibit different performance (e.g. substantially different performance, statistically biased behavior, unfair advantage, etc.). This process is called fairness.

Note that fair and fairness may not necessarily mean equal. For example the logic layer may implement one or more priorities to different classes of packet, command, request, message etc. The logic layer may also implement one or more virtual channels. For example, a high-priority virtual channel may be assigned for use by real-time memory accesses (e.g. for video, emergency, etc.). For example certain classes of message may be less important (or more important, etc.) than certain commands, etc. In this case the memory system network may implement (e.g. impose, associate, attach, etc.) priority the use in-band signaling (e.g. priority stored in packet headers, etc.) or out of band signaling (priorities assigned to virtual channels, classes of packets, etc.) or other means. In this case fairness may correspond (e.g. equate to, result in, etc.) to each request, command etc. receiving the fair (e.g. assigned, fixed, pro rata, etc.) proportion of bandwidth, resources, etc. according to the priority scheme.

In one embodiment the logic layer of the logic chip may employ one or more arbitration schemes (e.g. methods, algorithms, etc.) to ensure fairness. For example, a crosspoint switch may use one or more (e.g. combination of, etc.): a weight-based scheme, priority based scheme, round robin scheme, timestamp based, etc. For example, the logic chip may use a crossbar for the PHY layer; may use simple (e.g. one packet, etc.) crosspoint buffers with input VQs; and may use a round-robin arbitration scheme with credit-based flow control to provide close to 100% efficiency for uniform traffic.

In one embodiment the logic layer of a logic chip may perform fairness and arbitration in the one or more memory controllers that contain one or more logic queues assigned to one or more stacked memory chips.

In one embodiment the logic chip memory controller(s) may make advantageous use of buffer content (e.g. pen pages in one or more stacked memory chips, logic chip cache, row buffers, other buffer or caches, etc.).

In one embodiment the logic chip memory controller(s) may make advantageous use of the currently active resources (e.g. open row, rank, echelon, banks, subbank, data bus direction, etc.) to improve performance.

In one embodiment the logic chip memory controller(s) may be programmed (e.g. parameters changed, logic modified, algorithms modified, etc.) by the CPU etc. Memory controller parameters etc. that may be changed include, but are not limited to the following: internal banks in each stacked memory chip; internal subbanks in each bank in each stacked memory chip; number of memory chips per stacked memory package; number of stacked memory packages per memory channel; number of ranks per channel; number of stacked memory chips in an echelon; size of an echelon, size of each stacked memory chip; size of a bank; size of a subbank; memory address pattern (e.g. which memory address bits map to which channel, which stacked memory package, which memory chip, which bank, which subbank, which rank, which echelon, etc.), number of entries in each bank queue (e.g. bank queue depth, etc.), number of entries in each subbank queue (e.g. subbank queue depth, etc.), stacked memory chip parameters (e.g. tRC, tRCD, tFAW, etc.), other timing parameters (e.g. rank-rank turnaround, refresh period, etc.).

ALU and Macro Engines

In one embodiment the logic chip may contain one or more compute processors (e.g. ALU, macro engine, Turing machine, etc.).

For example, it may be advantageous to provide the logic chip with various compute resources. For example, the CPU may perform the following steps: fetch a counter variable stored in the memory system as data from a memory address (possibly involving a fetch of 256 bits or more depending on cache size and word lengths, possibly requiring the opening of a new page etc.); (2) increment the counter; (3) store the modified variable back in main memory (possibly to an already closed page, thus incurring extra latency etc.). One or more macro engines in the logic chip may be programmed (e.g. by packet, message, request, etc.) to increment the counter directly in memory thus reducing latency (e.g. time to complete the increment operation, etc.) and power (e.g. by saving operation of PHY and link layers, etc.). Other uses of the macro engine etc. may include, but are not limited to, one or more of the following (either directly (e.g. self-contained, in cooperation with other logic on the logic chip, etc.) or indirectly in cooperation with other system components, etc.); to perform pointer arithmetic; move or copy blocks of memory (e.g. perform CPU software bcopy( ) functions, etc.); be operable to aid in direct memory access (DMA) operations (e.g. increment address counters, etc.); compress data in memory or in requests (e.g. gzip, 7z, etc.) or expand data; scan data (e.g. for virus, programmable (e.g. by packet, message, etc.) or preprogrammed patterns, etc.); compute hash values (e.g. MD5, etc.); implement automatic packet or data counters; read/write counters; error counting; perform semaphore operations; perform atomic load and/or store operations; perform memory indirection operations; be operable to aid in providing or directly provide transactional memory; compute memory offsets; perform memory array functions; perform matrix operations; implement counters for self-test; perform or be operable to perform or aid in performing self-test operations (e.g. walking ones tests, etc.); compute latency or other parameters to be sent to the CPU or other logic chips; perform search functions; create metadata (e.g. indexes, etc.); analyze memory data; track memory use; perform prefetch or other optimizations; calculate refresh periods; perform temperature throttling calculations or other calculations related to temperature; handle cache policies (e.g. manage dirty bits, write-through cache policy, write-back cache policy, etc.); manage priority queues; perform memory RAID operations; perform error checking (e.g. CRC, ECC, SECDED, etc.); perform error encoding (e.g. ECC, Huffman, LDPC, etc.); perform error decoding; or enable; perform or be operable to perform any other system operation that requires programmed or programmable calculations; etc.

In one embodiment the one or more macro engine(s) may be programmable using high-level instruction codes (e.g. increment this address, etc.) etc. and/or low-level (e.g. microcode, machine instructions, etc.) sent in messages and/or requests.

In one embodiment the logic chip may contain stored program memory (e.g. in volatile memory (e.g. SRAM, eDRAM, etc.) or in non-volatile memory (e.g. flash, NVRAM, etc.). Stored program code may be moved between non-volatile memory and volatile memory to improve execution speed. Program code and/or data may also be cached by the logic chip using fast on-chip memory, etc. Programs and algorithms may be sent to the logic chip and stored at start-up, during initialization, at run time or at any time during the memory system operation. Operations may be performed on data contained in one or more requests, already stored in memory, data read from memory as a result of a request or command (e.g. memory read, etc.), data stored in memory (e.g. in one or more stacked memory chips (e.g. data, register data, etc.); in memory or register data etc. on a logic chip; etc.) as a result of a request or command (e.g. memory system write, configuration write, memory chip register modification, logic chip register modification, etc.), or combinations of these, etc.

Virtual Channel Control

In one embodiment the memory system may use one or more virtual channels (VCs). Examples of protocols that use VCs include InfiniBand and PCI Express. The logic chip may support one or more VCs per lane. A VC may be (e.g. correspond to, equate to, be equivalent to, appear as, etc.) an independently controlled communication session in a single lane. Each session may have different QoS definitions (e.g. properties, parameters, settings, etc.). The QoS information may be carried by a Traffic Class (TC) field (e.g. attribute, descriptor, etc.) in a packet (e.g. in a packet header, etc.). As the packet travels though the memory system network (e.g. logic chip switch fabric, arbiter, etc.) at each switch, link endpoint, etc. the TC information may be interpreted and one or more transport policies applied. The TC field in the packet header may be comprised of one or more bits representing one or more different TCs. Each TC may be mapped to a VC and may be used to manage priority (e.g. transaction priority, packet priority, etc.) on a given link and/or path. For example the TC may remain fixed for any given transaction but the VC may be changed from link to link.

Coherency and Cache

In one embodiment the memory system may ensure memory coherence when one or more caches are present in the memory system and may employ a cache coherence protocol (or coherent protocol).

An example of a cache coherence protocol is the Intel QuickPath Interconnect (QPI). The Intel QPI uses the well-known MESI protocol for cache coherence, but adds a new state labeled Forward (F) to allow fast transfers of shared data. Thus the Intel QPI cache coherence protocol may also be described as using a MESIF protocol.

In one embodiment, the memory system may contain one or more CPUs coupled to the system interconnect through a high performance cache. The CPU may thus appear to the memory system as a caching agent. A memory system may have one or more caching agents.

In one embodiment, one or more memory controllers may provide access to the memory in the memory system. The memory system may be used to store information (e.g. programs, data, etc.). A memory system may have one or more memory controllers (e.g. in each logic chip in each stacked memory package, etc.). Each memory controller may cover (e.g. handle, control, be responsible for, etc.) a unique portion (e.g. part of address range, etc.) of the total system memory address range. For example, if there are two memory controllers in the system, then each memory controller may control one half of the entire addressable system memory, etc. The addresses controlled by each controller may be unique and not overlap with another controller. A portion of the memory controller may form a home agent function for a range of memory addresses. A system may have at least one home agent per memory controller. Some system components in the memory system may be responsible for (e.g. capable of, etc.) connecting to one or more input/output subsystems (e.g. storage, networking, etc.). These system components are referred to as I/O agents. One or more components in the memory system may be responsible for providing access to the code (e.g. BIOS, etc.) required for booting up (e.g. initializing, etc.) the system. These components are called firmware agents (e.g. EFI, etc.).

Depending upon the function that a given component is intended to perform, the component may contain one or more caching agents, home agents, and/or I/O agents. A CPU may contain at least one home agent and at least one caching agent (as well as the processor cores and cache structures, etc.)

In one embodiment messages may be added to the data link layer to support a cache coherence protocol. For example the logic chip may use one or more, but not limited to, the following message classes at the link layer: Home (HOM), Data Response (DRS), Non-Data Response (NDR), Snoop (SNP), Non-Coherent Standard (NCS), and Non-Coherent Bypass (NCB). A group of cache coherence message classes may be used together as a collection separately from other messages and message classes in the memory system network. The collection of cache coherence message classes may be assigned to one or more Virtual Networks (VNs).

Cache coherence management may be distributed to all the home agents and cache agents within the system. Cache coherence snooping may be initiated by the caching agents that request data, and this mechanism is called source snooping. This method may be best suited to small memory systems that may require the lowest latency to access the data in system memory. Larger systems may be designed to use home agents to issue snoops. This method is called the home snooped coherence mechanism. The home snooped coherence mechanism may be further enhanced by adding a filter or directory in the home agent (e.g. directory-assisted snooping (DAS), etc.). A filter or directory may that help reduce the cache coherence traffic across the links.

In one embodiment the logic chip may contain a filter and/or directory operable to participate in a cache coherent protocol. In one embodiment the cache coherent protocol may be one of: MESI, MESIF, MOESI. In one embodiment the cache coherent protocol may include directory-assisted snooping.

Routing and Network

In one embodiment the logic chip may contain logic that operates at the physical layer, the data link layer (or link layer), the network layer, and/or other layers (e.g. in the OSI model, etc.). For example, the logic chip may perform one or more of the following functions (but not limited to the following functions): performing physical layer functions (e.g. transmit, receive, encapsulation, decapsulation, modulation, demodulation, line coding, line decoding, bit synchronization, flow control, equalization, training, pulse shaping, signal processing, forward error correction (FEC), bit interleaving, error checking, retry, etc.); performing data link layer functions (e.g. inspecting incoming packets; extracting those packets (commands, requests, etc.) that are intended for the stacked memory chips and/or the logic chip; routing and/or forwarding those packets destined for other nodes using RIB and/or FIB; etc.); performing network functions (e.g. QoS, routing, re-assembly, error reporting, network discovery, etc.).

Reorder and Replay Buffers

In one embodiment the logic chip may contain logic and/or storage (e.g. memory, registers, etc.) to perform reordering of packets, commands, requests etc. For example the logic chip may receive read request with ID 1 for memory address 0x010 followed later in time by read request with ID 2 for memory address 0x020. The memory controller may know that address 0x020 is busy or that it may otherwise be faster to reorder the request and perform transaction ID 2 before transaction ID 1 (e.g. out of order, etc.). The memory controller may then form a completion with the requested data from 0x020 and ID 2 before it forms a completion with data from 0x010 and ID 1. The requestor may receive the completions out of order, that is the requestor may receive completion with ID2 before it receives the completion with ID 1. The requestor may associate requests with completions using the ID.

In one embodiment the logic chip may contain logic and/or storage (e.g. memory, registers, etc.) that are operable to act as one or more replay buffers to perform replay of packets, commands, requests etc. For example, if an error occurs (e.g. is detected, is created, etc.) in the logic chip the logic chip may request the command, packet, request etc. to be retransmitted. Similarly the CPU, another logic chip, other system component, etc. as a receiver may detect one or more errors in a transmission (e.g. packet, command, request, completion, message, advertisement, etc.) originating at (e.g. from, etc.) the logic chip. If the receiver detects an error, the receiver may request the logic chip (e.g. the transmitter, etc.) to replay the transmission. The logic chip may therefore store all transmissions in one or more replay buffers that may be used to replay transmissions.

Data Protection

In one embodiment the logic chip may provide continuous data protection on all data and control paths. For example in memory system it may be important that when errors occur they are detected. It may not always be possible to recover from all errors but it is often worse for an error to occur and go undetected, a silent error. Thus it may be advantageous for the logic chip to provide protection (e.g. CRC, ECC, parity, etc.) on all data and control paths.

Error Control and Reporting

In one embodiment the logic chip may provide means to monitor errors and report errors.

In one embodiment the logic chip may perform error checking in a programmable manner.

For example, it may be advantageous to change (e.g. modify, alter, etc.) the error coding used in various stages (e.g. paths, logic blocks, memory on the logic chip, other data storage (registers, eDRAM, etc.), stacked memory chips, etc.). For example, error coding used in the stacked memory chips may be changed from simple parity (e.g. XOR, etc.) to ECC (e.g. SECDED, etc.). Data protection may not be (and typically is not) limited to the stacked memory chips. For example a first data error protection and detection scheme used on memory (e.g. eDRAM, SRAM, etc.) on the logic chip may offer lower latency (e.g. be easier and faster to detect, compute, etc.) but decreased protection (e.g. may only cover 1 bit error etc.); a second data error protection and detection scheme may offer greater protection (e.g. be able to correct multiple bit errors, etc.) but require longer than the first scheme to compute. It may be advantageous for the logic chip to switch (e.g. autonomously as a result of error rate, by CPU command, etc.) between a first and second data protection scheme. Protocol and data control In one embodiment the logic chip may provide network and protocol functions (e.g. network discovery, network initialization, network and link maintenance and control, link changes, etc.).

In one embodiment the logic chip may provide data control functions and associated control functions (e.g. resource allocation and arbitration, fairness control, data MUXing and DEMUXing, handling of ID and other packet header fields, control plane functions, etc.)

DRAM Registers and Control

In one embodiment the logic chip may provide access to (e.g. read, etc.) and control of (e.g. write, etc.) all registers (e.g. mode registers, etc.) in the stacked memory chips.

In one embodiment the logic chip may provide access to (e.g. read, etc.) and control of (e.g. write, etc.) all registers that may control functions in the logic chip.

(13) DRAM Controller Algorithm

In one embodiment the logic chip may provide one or more memory controllers that control one or more stacked memory chips. The memory controller parameters (e.g. timing parameters, etc.) as well as the algorithms, methods, tuning controls, hints, metrics, etc. may be programmable and may be changed (e.g. modified, altered, tuned, etc.). The changes may be made by the logic chip, by one or more CPUs, by other logic chips in the memory system, remotely (e.g. via network, etc.), or by combinations of these. The changes may be made using messages, requests, commands, packets etc.

Miscellaneous Logic

In one embodiment the logic chip may provide miscellaneous logic to perform one or more of the following functions (but not limited to the following functions): interface and link characterization (e.g. using PRBS, etc.); providing mixed-technology (e.g. hybrid, etc.) memory (e.g. using DRAM and NAND in stacked memory chips, etc.); providing parallel access to one or more memory areas as ping-pong buffers (e.g. keeping track of the latest write, etc.); adjusting the PHY layer organization (e.g. using pools of CMOS devices to be allocated among link transceivers when changing link configurations, etc.); changing data link layer formats (e.g. formats and fields of packet, transaction, command, request, completion, etc.)

FIG. 15

FIG. 15 shows the switch fabric for a logic chip for use with stacked memory chips in a stacked memory chip package, in accordance with another embodiment. As an option, the system of FIG. 15 may be implemented in the context of the architecture and environment of the previous Figures and/or any subsequent Figure(s). Of course, however, the system of FIG. 15 may be implemented in the context of any desired environment.

In FIG. 15 the portion of a logic chip that supports flexible configuration of the PHY layer is shown. In this figure only the interconnection of the PHY ports are shown.

In FIG. 15 the logic chip initially has 4 ports: North, East, South, West. Each port initially has input wires (e.g. NorthIn, etc.) and output wires (e.g. NorthOut, etc.). In FIG. 15 each arrow represent two wires that for example may carry a single differential high-speed serial signal. In FIG. 15 each port initially has 16 wires: 8 input wires and 8 output wires.

Although, as described in some embodiments the wires may be flexibly allocated between lanes, links and ports it may be helpful to think of the wires as belong to distinct ports though they need not do so.

In FIG. 15 the PHY ports are joined using a nonblocking minimum spanning tree (MST). This type of switch architecture may be best suited to a logic chip that always has the same number of input and outputs for example.

In one embodiment the logic chip may use any form of switch or connection fabric to route input PHY ports and output PHY ports.

FIG. 16 shows a memory system comprising stacked memory chip packages, in accordance with another embodiment. As an option, the system of FIG. 16 may be implemented in the context of the architecture and environment of the previous Figures and/or any subsequent Figure(s). Of course, however, the system of FIG. 16 may be implemented in the context of any desired environment.

In FIG. 16 there are 3 CPUs: CPU1 and CPU2.

In FIG. 16 there are 4 stacked memory packages: SMP0, SMP1, SMP2, SMP3.

In FIG. 16 there are 2 system components: System Component 1 (SC1), System Component 2 (SC2).

In FIG. 16 CPU1 is connected to SMP0 via Memory Bus 1 (MB1).

In FIG. 16 CPU2 is connected to SMP1 via Memory Bus 2 (MB2).

In FIG. 16 the memory subsystem comprises SMP0, SMP1, SMP2, SMP3.

In FIG. 16 the stacked memory packages may each have 4 ports (as shown for example in FIG. 14). FIG. 16 illustrates the various ways in which stacked memory packages may be coupled in order to communicate with each other and the rest of the system.

In FIG. 16 SMP0 is configured as follows: the North port is configured to use 6 Rx wires/2 Tx wires; the East port is configured to use 6 Rx wires/4 Tx wires; the South port is configured to use 2 Rx wires/2 Tx wires; the West port is configured to use 4 Rx wires/4 Tx wires. In FIG. 16 SMP0 thus uses 6+6+2+4=18 Tx wires and 2+4+2+4=12 Rx wires, or 30 wires in total. SMP0 may thus be either: (1) a chip with 36 or more wires configured with a switch that uses equal numbers of Rx and Tx wires (and thus some Rx wires would be unused); (2) a chip with 30 or more wires that has complete flexibility in Rx and Tx wire configuration; (3) a chip such as that shown in FIG. 14 with enough capacity on each port that may use a fixed lane configuration for example (and thus some lanes remain unused). FIG. 16 is not necessarily meant to represent a typical memory system configuration but rather illustrate the flexibility and nature of a memory systems that may be constructed using stacked memory chips as described herein.

In FIG. 16 the link (e.g. high-speed serial connections, etc.) between SMP2 and SMP3 is shown as dotted. This indicates that: (1) the connections are present (e.g. traces connect the two stacked memory packages, etc.) but due to configuration (e.g. resources used elsewhere due to a configuration change, etc.) the link is not currently active. For example deactivation of links on the West port of SMP3 may allow reactivation of the link on the North port. Such a link configuration change may be made at run time for example, as previously described.

In one embodiment links between stacked memory packages and/or CPU and/or other system components may be activated and deactivated at run time.

In FIG. 16 the two CPUs may maintain memory coherence in the memory system and/or the entire system. As shown in FIG. 14 the logic chips in each stacked memory package may be capable of maintaining coherence using a cache coherency protocol (e.g. using MESI protocol, MOESI protocol, directory-assisted snooping (DAS), etc.).

In one embodiment the logic chip of a stacked memory package maintains cache coherency in a memory system.

In FIG. 16 there are two system components, SC1 and SC2, connected to the memory subsystem. SC1 may be a network interface for example (e.g. Ethernet card, wireless interface, switch, etc.). SC2 may be a storage device, another type of memory, another system, multiple devices or systems, etc. Such system components may be permanently attached or pluggable (e.g. before start-up, hot pluggable, etc.).

In one embodiment one or more system components may be operable to be coupled to one or more stacked memory packages.

In FIG. 16 routing of transactions (e.g. requests, responses, messages, etc.) between network nodes (e.g. CPUs, stacked memory packages, system components, etc.) may be performed using one or more routing protocols.

A routing protocol may be used to exchange routing information within a network. In a small network such as that typically found in a memory system, the simplest and most efficient routing protocol may be an interior gateway protocol (IGP). IGPs may be divided into two general categories: (1) distance-vector (DV) routing protocols; (2) link-state routing protocols.

Examples of DV routing protocols used in the Internet are: Routing Information Protocol (RIP), Interior Gateway Routing Protocol (IGRP), Enhanced Interior Gateway Routing Protocol (EIGRP). A DV routing protocol may use the Bellman-Ford algorithm. In a distance-vector routing protocol, each node (e.g. router, switch, etc.) may possess information about the full network topology. A node advertises (e.g. using advertisements, messages, etc.) a distance value (DV) from itself to other nodes. A node may receive similar advertisements from other nodes. Using the routing advertisements each node may construct (e.g. populate, create, build, etc.) one or more routing tables and associated data structures, etc. One or more routing tables may be stored in each logic chip (e.g. in embedded DRAM, SRAM, flip-flops, registers, attached stacked memory chips, etc.). In the next advertisement cycle, a node may advertise updated information from its routing table(s). The process may continue until the routing tables of each node converge to stable values.

Examples of link-state routing protocols used in the Internet are: Open Shortest Path First (OSPF), Intermediate System to Intermediate System (IS-IS). In a link-state routing protocol each node may possess information about the complete network topology. Each node may then independently calculate the best next hop from itself to every possible destination in the network using local information of the topology. The collection of the best next hops may be used to form a routing table. In a link-state protocol, the only information passed between the nodes may be information used to construct the connectivity maps.

A hybrid routing protocols may have both the features of DV routing protocols and link-state routing protocols. An example of a hybrid routing protocol is Enhanced Interior Gateway Routing Protocol (EIGRP).

In one embodiment the logic chip may use a routing protocol to construct one or more routing tables stored in the logic chip. The routing protocol may be a distance-vector routing protocol, a link-state routing protocol, a hybrid routing protocol, or another type of routing protocol.

The choice of routing protocol may be influenced by the design of the memory system with respect to network failures (e.g. logic chip failures, repair and replacement algorithms used, etc.).

In one embodiment it may be advantageous to designate (e.g. assign, elect, etc.) one or more master nodes that keep one or more copies of one or more routing tables and structures that hold all the required routing information for each node to make routing decisions. The master routing information may be propagated (e.g. using messages, etc.) to all nodes in the network. For example, in the memory system network of FIG. 16 CPU 1 may be the master node. At start-up CPU 1 may create the routing information. For example CPU 1 may use a network discovery protocol and broadcast discovery messages to establish the number, type, and connection of nodes.

One example of a network discovery protocol used in the Internet is the Neighbor Discovery Protocol (NDP). NDP operates at the link layer and may perform address auto configuration of nodes, discovery of nodes, determining the link layer addresses of nodes, duplicate address detection, address prefix discovery, and may maintain reachability information about the paths to other active neighbor nodes. NDP includes Neighbor Unreachability Detection (NUD) that may improve robustness of delivery in the presence of failing nodes and/or links, or nodes that may move (e.g. removed, hot-plugged etc.). NDP defines and uses five different ICMP packet types to perform functions. The NDP protocol and/or NDP packet types may be used as defined or modified to be used specifically in a memory system network. The network discovery packet types used in a memory system network may include one or more of the following: Solicitation, Advertisement, Neighbor Solicitation, Neighbor Advertisement, Redirect.

When the master node has established the number, type, and connection of nodes etc. the master node may create network information including network topology, routing information, routing tables, forwarding tables, etc. The organization of master nodes may include primary master nodes, secondary master nodes, etc. For example in FIG. 16 CPU 1 may be designated as the primary master node and CPU 2 may be designated as the secondary master node. In the event of a failure (e.g. permanent, temporary, etc.) in or around CPU 1, the primary maser node may no longer be able to perform the functions required to maintain routing tables, etc. In this case the secondary master node CPU 2 may assume the role of master node. CPU1 and CPU2 may monitor each other by exchange of messages etc.

In one embodiment the memory system network may use one or more master nodes to create routing information.

In one embodiment there may be a plurality of master nodes in the memory system network that monitor each other. The plurality of master nodes may be ranked as primary, secondary, tertiary, etc. The primary master node may perform master node functions unless there is a failure in which case the secondary master node takes over as primary master node. If the secondary master node fails, the tertiary master node may take over, etc.

A routing table (also known as Routing Information Base (RIB), etc.) may be one or more data tables or data structures, etc. stored in a node (e.g. CPU, logic chip, system component, etc.) of the memory system network that may list the routes to particular network destinations, and in some cases, metrics (e.g. distances, cost, etc.) associated with the routes. A routing table in a node may contain information about the topology of the network immediately around that node. The construction of routing tables may be performed by one or more routing protocols.

In one embodiment the logic chip in a stacked memory package may contain routing information stored in one or more data structures (e.g. routing table, forwarding table, etc.). The data structures may be stored in on-chip memory (e.g. embedded DRAM (eDRAM), SRAM, CAM, etc.) and/or off-chip memory (e.g. in stacked memory chips, etc.).

The memory system network may use packet (e.g. message, transaction, etc.) forwarding to transmit (e.g. relay, transfer, etc.) packets etc. between nodes. In hop-by-hop routing, each routing table lists, for all reachable destinations, the address of the next node along the path to the destination: The next node along the path is the next hop. The algorithm to relay packets to their destination is thus to deliver the packet to the next hop. The algorithm may assume that the routing tables are consistent at each node, The routing table may include, but is not limited to, one or more of the following information fields: the Destination Network ID (DNID) (e.g. if there is more than one network, etc.); Route Cost (RC) (e.g. the cost or metric of the path on which the packet is to be sent, etc.); Next Hop (NH) (e.g. the address of the next node to which the packet is to be sent on the way to its final destination, etc.); Quality of Service (QOS) associated with the route (e.g. virtual channel to be used, priority, etc.); Filter Information (FI) (e.g. filtering criteria, access lists, etc. that may be associated with the route, etc.); Interface (IF) (e.g. such as link0 for the first lane or link or wire pair, etc, link1 for the second, etc.).

In one embodiment the memory system network may use hop-by-hop routing.

In one embodiment it may be advantageous for the memory system network to use static routing, where routes through the memory system network are described by fixed paths (e.g. static, etc.). For example, a static routing protocol may be simple and thus easier and most inexpensive to implement.

In one embodiment it may be advantageous for the memory system network to use adaptive routing. Examples of adaptive routing protocols used in the Internet include: RIP, OSPF, IS-IS, IGRP, EIGRP. Such protocols may be adopted as is or modified for use in a memory system network. Adaptive routing may enable the memory system network to alter a path that a route takes through the memory system network. Paths in the memory system network may be changed in response to (e.g. as a result of, etc.) a change in the memory system network (e.g. node failures, link failure, link activation, link deactivation, link change, etc.). Adaptive routing may allow for the memory system network to route around node failures (e.g. loss of a node, loss of one or more connections between nodes, etc.) as long as other paths are available.

In one embodiment it may be advantageous to use a combination of static routing (e.g. for next hop information, etc.) and adaptive routing (e.g. for link structures, etc.).

In FIG. 16 SMP0, SMP2 and SMP3 may form a physical ring (e.g. a circular connection, etc.) if SMP3 is connected to SMP2 (e.g. using the link connection shown as dotted, etc.). The memory system network may use rings, trees, meshes, star, double rings, or any network topology. If the network topology is allowed to contain physical rings then the routing protocol may be chosen to allow one or more logical loops in the network.

A logical loop (switching loop, or bridge loop) occurs in a network when there is more than one path (at Layer 2, the data link layer, in the OSI model) between two endpoints. For example a logical loop occurs if there are multiple connections between two network nodes or two ports on the same node connected to each other, etc. If the data link layer header does not support a time to live (TTL) field, a packet (e.g. frame, etc.) that is sent into a looped network topology may endlessly loop.

A physical network topology that contains physical rings and logical loops (e.g. switching loops, bridge loops, etc.) may be necessary for reliability. A logical loop-free logical topology may be created by choice of protocol (e.g. spanning tree protocol (STP), etc.). For example, STP may allow the memory system network to include spare (e.g. redundant, etc.) links to provide increased reliability (e.g. automatic backup paths if an active link fails, etc.) without introducing logical loops, or the need for manual enabling/disabling of the spare links.

In one embodiment the memory system network may use rings, trees, meshes, star, double rings, or any network topology.

In one embodiment the memory network may use a protocol that avoids logical loops in a network that may contain physical rings.

In one embodiment it may be advantageous to minimize the latency (e.g. delay, forwarding delay, etc.) to forward packets from one node to the next. For example the logic chip, CPU or other system components etc. may use optimizations to reduce the latency. For example, the routing tables may not be used directly for packet forwarding. The routing tables may be used to generate the information for a smaller forwarding table. A forwarding table may contain only the routes that are chosen by the routing algorithm as preferred (e.g. optimized, lowest latency, fastest, most reliable, currently available, currently activated, lowest cost by a metric, etc.) routes for packet forwarding. The forwarding table may be stored in an format (e.g. compressed format, pre-compiled format, etc.) that is optimized for hardware storage and/or speed of lookup.

The use of a separate routing table and forwarding table may be used to separate a Control Plane (CP) function of the routing table from the Forwarding Plane (FP) function of the forwarding table. The separation of control and forwarding (e.g. separation of FP and CP, etc.) may provide increased performance (e.g. lower forwarding latency, etc.).

One or more forwarding tables (or forwarding information base (FIB), etc.) may be used in each logic chip etc. to quickly find the proper exit interface to which the input interface should send a packet to be transmitted by the node. FIBs may be optimized for fast lookup of destination addresses. FIBs may be maintained (e.g. kept, etc.) in one-to-one correspondence with the RIBs. RIBs may then be separately optimized for efficient updating by the memory system network routing protocols and other control plane methods. The RIBs and FIBs may contain the full set of routes learned by the node.

FIBs in each logic chip may be implemented using fast hardware lookup mechanisms (e.g. ternary content addressable memory (TCAM), CAM, DRAM, eDRAM, SRAM, etc.).

FIG. 17

Figure 17:
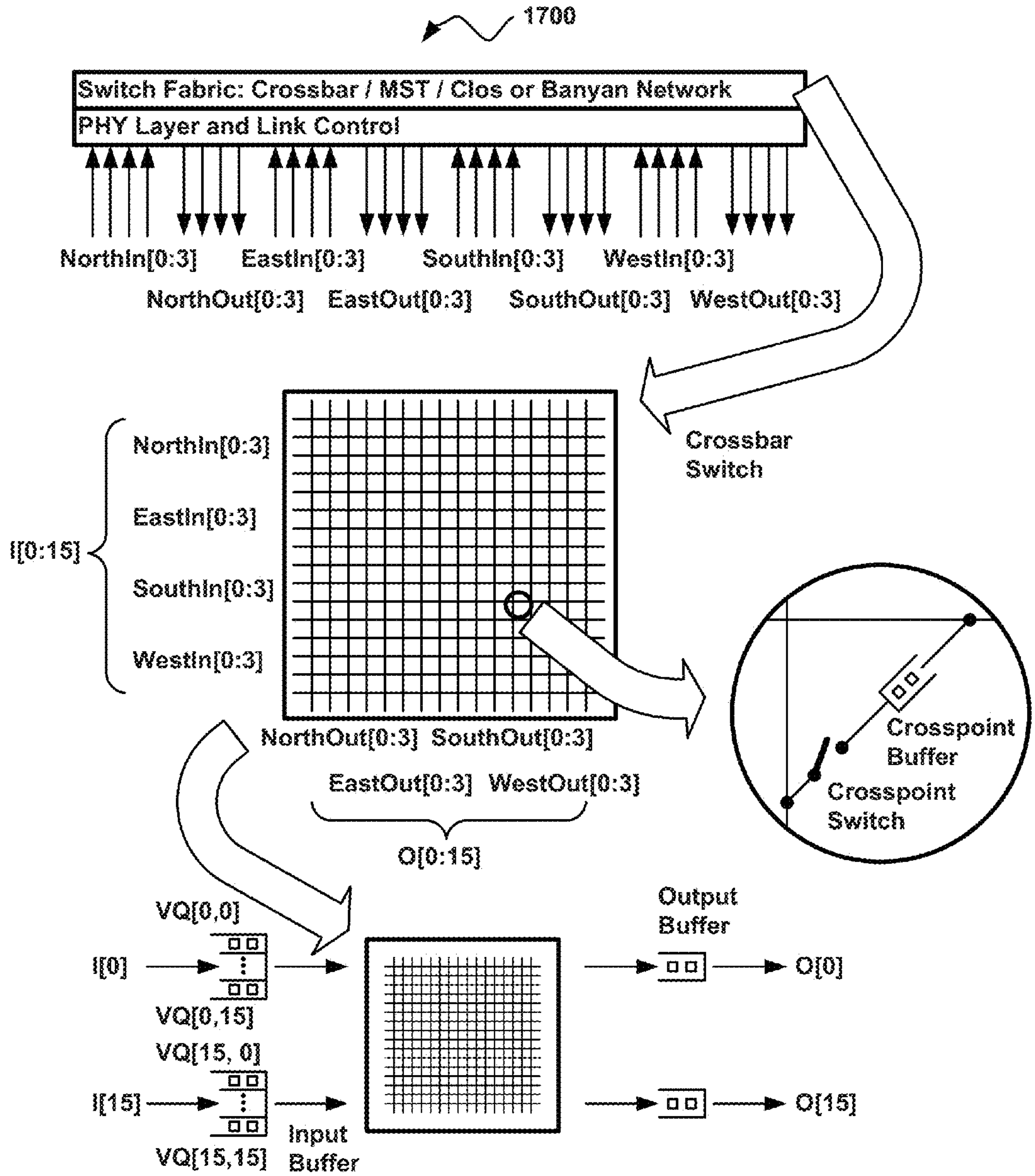
FIG. 17 shows a crossbar switch fabric for a logic chip for use with stacked memory chips in a stacked memory chip package, in accordance with another embodiment.

FIG. 17 shows a crossbar switch fabric for a logic chip for use with stacked memory chips in a stacked memory chip package, in accordance with another embodiment. As an option, the system of FIG. 17 may be implemented in the context of the architecture and environment of the previous Figures and/or any subsequent Figure(s). Of course, however, the system of FIG. 17 may be implemented in the context of any desired environment.

In FIG. 17 the portion of a logic chip that supports flexible configuration of the PHY layer is shown. In this figure only the interconnection of the PHY ports are shown.

In one embodiment the inputs and outputs of a logic chip may be connected to a crossbar switch.

In FIG. 17 the inputs are connected to a fully connected crossbar switch. The switch matrix may consist of switches and optionally crosspoint buffers connected to each switch.

In FIG. 17 the inputs are connected to input buffers that comprise one or more virtual queues. For example input NorthIn[0] or I[0] may be connected to virtual queues VQ[0, 0] through VQ[0, 15]. Virtual queue VQ[j, k] may hold packets arriving at input j that are destined (e.g. intended, etc.) for output k, etc.

In FIG. 17 assume that the packets arrive at the inputs at the beginning of time slots. In FIG. 17 the switching of inputs to outputs may occur using one or more scheduling cycles. In the first part of scheduling cycle a matching algorithm may selects a matching between inputs j and outputs k. In the second part of a scheduling cycle packets are transferred (e.g. moved, etc.) from inputs j to outputs k. The speedup factor s is the number of scheduling cycles per time slot. If s is greater than 1 then the outputs may also be buffered, as shown in FIG. 17.

In an N×N crossbar switch such as that shown in FIG. 17 a crossbar with input buffers only may be an input queued (IQ) switch; a crossbar with output buffers only may be an output-queued (OQ) switch; a crossbar with input buffer and output buffers may be a combined input queued and output-queued (CIOQ) switch. An IQ switch may use buffers with bandwidth at up to twice the line rate. An IQ switch may operate at about 60% efficiency (e.g. due to head of line (HOL) blocking, etc.) with random packet traffic and packet destinations, etc. An OQ switch may use buffers with bandwidth of greater than N−1 line rate, which may require very high operating speeds for high-speed links. A CIOQ switch using virtual queues may be more efficient than an IQ or an OQ switch and may, for example, eliminate HOL blocking.

In one embodiment the logic chip may use a crossbar switch that is an IQ switch, and OQ switch, or a CIOQ switch.

In normal operation the switch shown in FIG. 17 may connect one input to one output (e.g. unicast, packet unicast, etc.). In order to perform certain tasks (e.g. network discovery, network maintenance, link changes, message broadcast, etc.) it may be required to connect an input to more than one output (e.g. multicast, packet multicast, etc.).

A switch that may support unicast and multicast may maintain two types of queues: (1) unicast packets are stored in VQs; (2) and multicast packets are stored in one or more separate multicast queues. By closing (e.g. connecting, shorting, etc.) multiple crosspoint switches on one input line simultaneously (e.g. together, at the same time or nearly the same time, etc.) the crossbar switch may perform packet replication and multicast within the switch fabric. At the beginning of each time slot, the scheduling algorithm may decide the crosspoint switches to close.

Similar mechanisms to provide for both unicast and multicast support may be used with other switch and routing architectures such as that shown in FIG. 15 for example.

In one embodiment the logic chip may use a switch (e.g. crossbar, switch matrix, routing structure (tree, network, etc.), or other routing mechanism, etc.) that supports unicast and/or multicast.

FIG. 18

Figure 18:
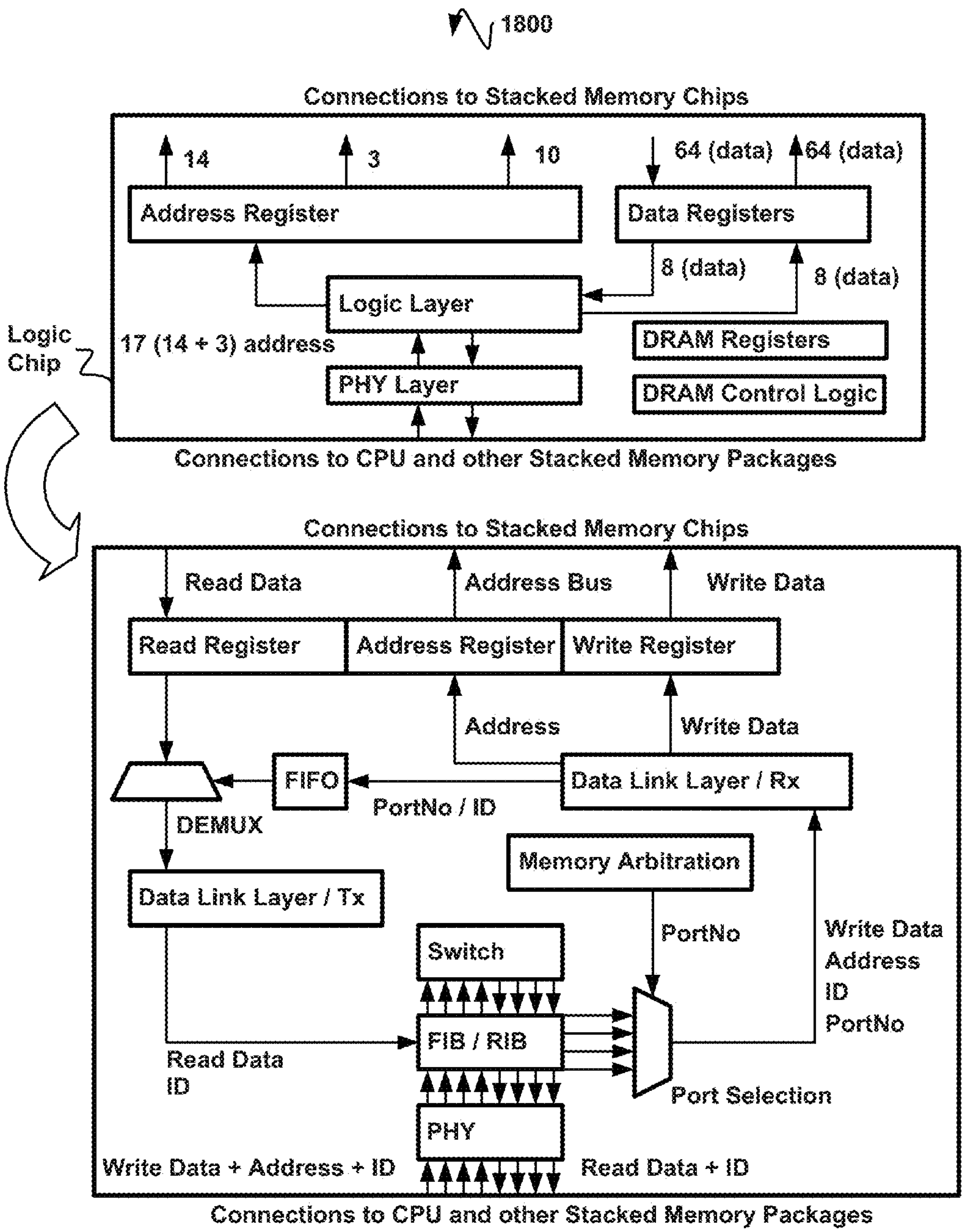
FIG. 18 shows part of a logic chip for use with stacked memory chips in a stacked memory chip package, in accordance with another embodiment.

FIG. 18 shows part of a logic chip for use with stacked memory chips in a stacked memory chip package, in accordance with another embodiment. As an option, the system of FIG. 18 may be implemented in the context of the architecture and environment of the previous Figures and/or any subsequent Figure(s). Of course, however, the system of FIG. 18 may be implemented in the context of any desired environment.

In FIG. 18 the logic chip contains (but is not limited to) the following functional blocks: read register, address register, write register, DEMUX, FIFO, data link layer/Rx, data link layer/Tx, memory arbitration, switch, FIB/RIB, port selection, PHY.

In FIG. 18 the PHY block may be responsible for transmitting and receiving packets on the high-speed serial interconnect links to one or more CPUs and one or more stacked memory packages.

In FIG. 18 the PHY block has four input ports and four output ports. In FIG. 18 the PHY block is connected to a block that maintains FIB and RIB information. The FIB/RIB block extracts incoming packets from the PHY block that are destined for the logic chip and passes the packets to the port selection block. The FIB/RIB block injects read data and transaction ID from the data link layer/Tx block into the PHY block.

The FIB/RIB block passes incoming packets that require forwarding to the switch block where they are routed to the correct outgoing link via the FIB/RIB block (e.g. using information from the FIB/RIB tables etc.) to the PHY block.

The memory arbitration block picks (e.g. assigns, chooses, etc.) a port number, PortNo (e.g. one of the four PHY ports in the chip shown in FIG. 18, but in general the port may be a link or wire pair etc.). The port selection block receives the PortNo and selects (e.g. DEMUXes, etc.) the write data, address data, transaction ID along with any other packet information from the corresponding port (e.g. port corresponding to PortNo, etc.). The write data, address data, transaction ID and other packet information is passed with PortNo to the data link layer/Rx.

The data link layer/Rx block processes the packet information at the OSI data link layer (e.g. error checking, etc.). The data link layer/Rx block passes write data and address data to the write register and address register respectively. The PortNo and ID fields are passed to the FIFO block.

The FIFO block holds the ID information from successive read requests that is used to match the read data returned from the stacked memory devices to the incoming read requests. The FIFO block controls the DEMUX block.

The DEMUX block passes the correct read data with associated ID to the FIB/RIB block.

The read register block, address register block, write register block are shown in more detail with their associated logic and data widths in FIG. 14.

Of course other architectures, algorithms, circuits, logic structures, data structures etc. may be used to perform the same, similar, or equivalent functions shown in FIG. 18.

The capabilities of the present invention may be implemented in software, firmware, hardware or some combination thereof.

As one example, one or more aspects of the present invention may be included in an article of manufacture (e.g. one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; and U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section II

The present section corresponds to U.S. Provisional Application No. 61/580,300, titled "SYSTEM, METHOD, AND COMPUTER PROGRAM PRODUCT FOR IMPROVING MEMORY SYSTEMS," filed Dec. 26, 2011, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

In this description there may be multiple figures that depict similar structures with similar parts or components. Thus, as an example, to avoid confusion an Object in FIG. 19-1 may be labeled "Object (1)" and a similar, but not identical, Object in FIG. 19-2 is labeled "Object (2)", etc. Again, it should be noted that use of such convention, by itself, should not be construed as somehow limiting such terms: beyond any given definition, and/or to any specific embodiments disclosed herein, etc.

In the following detailed description and in the accompanying drawings, specific terminology and images are used in order to provide a thorough understanding. In some instances, the terminology and images may imply specific details that are not required to practice all embodiments. Similarly, the embodiments described and illustrated are representative and should not be construed as precise representations, as there are prospective variations on what is disclosed that may be obvious to someone with skill in the art. Thus this disclosure is not limited to the specific embodiments described and shown but embraces all prospective variations that fall within its scope. For brevity, not all steps may be detailed, where such details will be known to someone with skill in the art having benefit of this disclosure.

Memory devices with improved performance are required with every new product generation and every new technology node. However, the design of memory modules such as DIMMs becomes increasingly difficult with increasing clock frequency and increasing CPU bandwidth requirements yet lower power, lower voltage, and increasingly tight space constraints. The increasing gap between CPU demands and the performance that memory modules can provide is often called the "memory wall". Hence, memory modules with improved performance are needed to overcome these limitations.

Memory devices (e.g. memory modules, memory circuits, memory integrated circuits, etc.) may be used in many applications (e.g. computer systems, calculators, cellular phones, etc.). The packaging (e.g. grouping, mounting, assembly, etc.) of memory devices may vary between these different applications. A memory module may use a common packaging method that may use a small circuit board (e.g. PCB, raw card, card, etc.) often comprised of random access memory (RAM) circuits on one or both sides of the memory module with signal and/or power pins on one or both sides of the circuit board. A dual in-line memory module (DIMM) may comprise one or more memory packages (e.g. memory circuits, etc.). DIMMs have electrical contacts (e.g. signal pins, power pins, connection pins, etc.) on each side (e.g. edge etc.) of the module. DIMMs may be mounted (e.g. coupled etc.) to a printed circuit board (PCB) (e.g. motherboard, mainboard, baseboard, chassis, planar, etc.). DIMMs may be designed for use in computer system applications (e.g. cell phones, portable devices, hand-held devices, consumer electronics, TVs, automotive electronics, embedded electronics, lap tops, personal computers, workstations, servers, storage devices, networking devices, network switches, network routers, etc.). In other embodiments different and various form factors may be used (e.g. cartridge, card, cassette, etc.).

Example embodiments described in this disclosure may include computer system(s) with one or more central processor units (CPU) and possibly one or more I/O unit(s) coupled to one or more memory systems that contain one or more memory controllers and memory devices. In example embodiments, the memory system(s) may include one or more memory controllers (e.g. portion(s) of chipset(s), portion(s) of CPU(s), etc.). In example embodiments the memory system(s) may include one or more physical memory array(s) with a plurality of memory circuits for storing information (e.g. data, instructions, state, etc.).

The plurality of memory circuits in memory system(s) may be connected directly to the memory controller(s) and/or indirectly coupled to the memory controller(s) through one or more other intermediate circuits (or intermediate devices e.g. hub devices, switches, buffer chips, buffers, register chips, registers, receivers, designated receivers, transmitters, drivers, designated drivers, re-drive circuits, circuits on other memory packages, etc.).

Intermediate circuits may be connected to the memory controller(s) through one or more bus structures (e.g. a multi-drop bus, point-to-point bus, networks, etc.) and which may further include cascade connection(s) to one or more additional intermediate circuits, memory packages, and/or bus(es). Memory access requests may be transmitted from the memory controller(s) through the bus structure(s). In response to receiving the memory access requests, the memory devices may store write data or provide read data. Read data may be transmitted through the bus structure(s) back to the memory controller(s) or to or through other components (e.g. other memory packages, etc.).

In various embodiments, the memory controller(s) may be integrated together with one or more CPU(s) (e.g. processor chips, multi-core die, CPU complex, etc.) and/or supporting logic (e.g. buffer, logic chip, etc.); packaged in a discrete chip (e.g. chipset, controller, memory controller, memory fanout device, memory switch, hub, memory matrix chip, northbridge, etc.); included in a multi-chip carrier with the one or more CPU(s) and/or supporting logic and/or memory chips; included in a stacked memory package; combinations of these; or packaged in various alternative forms that match the system, the application and/or the environment and/or other system requirements. Any of these solutions may or may not employ one or more bus structures (e.g. multidrop, multiplexed, point-to-point, serial, parallel, narrow and/or high-speed links, networks, etc.) to connect to one or more CPU(s), memory controller(s), intermediate circuits, other circuits and/or devices, memory devices, memory packages, stacked memory packages, etc.

A memory bus may be constructed using multi-drop connections and/or using point-to-point connections (e.g. to intermediate circuits, to receivers, etc.) on the memory modules. The downstream portion of the memory controller interface and/or memory bus, the downstream memory bus, may include command, address, write data, control and/or other (e.g. operational, initialization, status, error, reset, clocking, strobe, enable, termination, etc.) signals being sent to the memory modules (e.g. the intermediate circuits, memory circuits, receiver circuits, etc.). Any intermediate circuit may forward the signals to the subsequent circuit(s) or process the signals (e.g. receive, interpret, alter, modify, perform logical operations, merge signals, combine signals, transform, store, re-drive, etc.) if it is determined to target a downstream circuit; re-drive some or all of the signals without first modifying the signals to determine the intended receiver; or perform a subset or combination of these options etc.

The upstream portion of the memory bus, the upstream memory bus, returns signals from the memory modules (e.g. requested read data, error, status other operational information, etc.) and these signals may be forwarded to any subsequent intermediate circuit via bypass and/or switch circuitry or be processed (e.g. received, interpreted and re-driven if it is determined to target an upstream or downstream hub device and/or memory controller in the CPU or CPU complex; be re-driven in part or in total without first interpreting the information to determine the intended recipient; or perform a subset or combination of these options etc.).

In different memory technologies portions of the upstream and downstream bus may be separate, combined, or multiplexed; and any buses may be unidirectional (one direction only) or bidirectional (e.g. switched between upstream and downstream, use bidirectional signaling, etc.). Thus, for example, in JEDEC standard DDR (e.g. DDR, DDR2, DDR3, DDR4, etc.) SDRAM memory technologies part of the address and part of the command bus are combined (or may be considered to be combined), row address and column address may be time-multiplexed on the address bus, and read/write data may use a bidirectional bus.

In alternate embodiments, a point-to-point bus may include one or more switches or other bypass mechanism that results in the bus information being directed to one of two or more possible intermediate circuits during downstream communication (communication passing from the memory controller to a intermediate circuit on a memory module), as well as directing upstream information (communication from an intermediate circuit on a memory module to the memory controller), possibly by way of one or more upstream intermediate circuits.

In some embodiments, the memory system may include one or more intermediate circuits (e.g. on one or more memory modules etc.) connected to the memory controller via a cascade interconnect memory bus, however, other memory structures may be implemented (e.g. point-to-point bus, a multi-drop memory bus, shared bus, etc.). Depending on the constraints (e.g. signaling methods used, the intended operating frequencies, space, power, cost, and other constraints, etc.) various alternate bus structures may be used. A point-to-point bus may provide the optimal performance in systems requiring high-speed interconnections, due to the reduced signal degradation compared to bus structures having branched signal lines, switch devices, or stubs. However, when used in systems requiring communication with multiple devices or subsystems, a point-to-point or other similar bus may often result in significant added system cost (e.g. component cost, board area, increased system power, etc.) and may reduce the potential memory density due to the need for intermediate devices (e.g. buffers, re-drive circuits, etc.). Functions and performance similar to that of a point-to-point bus may be obtained by using switch devices. Switch devices and other similar solutions may offer advantages (e.g. increased memory packaging density, lower power, etc.) while retaining many of the characteristics of a point-to-point bus. Multi-drop bus solutions may provide an alternate solution, and though often limited to a lower operating frequency may offer a cost and/or performance advantage for many applications. Optical bus solutions may permit increased frequency and bandwidth, either in point-to-point or multi-drop applications, but may incur cost and/or space impacts.

Although not necessarily shown in all the figures, the memory modules and/or intermediate devices may also include one or more separate control (e.g. command distribution, information retrieval, data gathering, reporting mechanism, signaling mechanism, register read/write, configuration, etc.) buses (e.g. a presence detect bus, an 12C bus, an SMBus, combinations of these and other buses or signals, etc.) that may be used for one or more purposes including the determination of the device and/or memory module attributes (generally after power-up), the reporting of fault or other status information to part(s) of the system, calibration, temperature monitoring, the configuration of device(s) and/or memory subsystem(s) after power-up or during normal operation or for other purposes. Depending on the control bus characteristics, the control bus(es) might also provide a means by which the valid completion of operations could be reported by devices and/or memory module(s) to the memory controller(s), or the identification of failures occurring during the execution of the main memory controller requests, etc. The separate control buses may be physically separate or electrically and/or logically combined (e.g. by multiplexing, time multiplexing, shared signals, etc.) with other memory buses.

As used herein the term buffer (e.g. buffer device, buffer circuit, buffer chip, etc.) refers to an electronic circuit that may include temporary storage, logic etc. and may receive signals at one rate (e.g. frequency, etc.) and deliver signals at another rate. In some embodiments, a buffer is a device that may also provide compatibility between two signals (e.g. changing voltage levels or current capability, changing logic function, etc.).

As used herein, hub is a device containing multiple ports that may be capable of being connected to several other devices. The term hub is sometimes used interchangeably with the term buffer. A port is a portion of an interface that serves an I/O function (e.g. a port may be used for sending and receiving data, address, and control information over one of the point-to-point links, or buses). A hub may be a central device that connects several systems, subsystems, or networks together. A passive hub may simply forward messages, while an active hub (e.g. repeater, amplifier, etc.) may also modify the stream of data which otherwise would deteriorate over a distance. The term hub, as used herein, refers to a hub that may include logic (hardware and/or software) for performing logic functions.

As used herein, the term bus refers to one of the sets of conductors (e.g. signals, wires, traces, and printed circuit board traces or connections in an integrated circuit) connecting two or more functional units in a computer. The data bus, address bus and control signals may also be referred to together as constituting a single bus. A bus may include a plurality of signal lines (or signals), each signal line having two or more connection points that form a main transmission line that electrically connects two or more transceivers, transmitters and/or receivers. The term bus is contrasted with the term channel that may include one or more buses or sets of buses.

As used herein, the term channel (e.g. memory channel etc.) refers to an interface between a memory controller (e.g.

a portion of processor, CPU, etc.) and one of one or more memory subsystem(s). A channel may thus include one or more buses (of any form in any topology) and one or more intermediate circuits.

As used herein, the term daisy chain (e.g. daisy chain bus etc.) refers to a bus wiring structure in which, for example, device (e.g. unit, structure, circuit, block, etc.) A is wired to device B, device B is wired to device C, etc. In some embodiments the last device may be wired to a resistor, terminator, or other termination circuit etc. In alternative embodiments any or all of the devices may be wired to a resistor, terminator, or other termination circuit etc. In a daisy chain bus, all devices may receive identical signals or, in contrast to a simple bus, each device may modify (e.g. change, alter, transform, etc.) one or more signals before passing them on.

A cascade (e.g. cascade interconnect, etc.) as used herein refers to a succession of devices (e.g. stages, units, or a collection of interconnected networking devices, typically hubs or intermediate circuits, etc.) in which the hubs or intermediate circuits operate as logical repeater(s), permitting for example, data to be merged and/or concentrated into an existing data stream or flow on one or more buses.

As used herein, the term point-to-point bus and/or link refers to one or a plurality of signal lines that may each include one or more termination circuits. In a point-to-point bus and/or link, each signal line has two transceiver connection points, with each transceiver connection point coupled to transmitter circuits, receiver circuits or transceiver circuits.

As used herein, a signal (or line, signal line, etc.) refers to one or more electrical conductors or optical carriers, generally configured as a single carrier or as two or more carriers, in a twisted, parallel, or concentric arrangement, used to transport at least one logical signal. A logical signal may be multiplexed with one or more other logical signals generally using a single physical signal but logical signal(s) may also be multiplexed using more than one physical signal.

As used herein, memory devices are generally defined as integrated circuits that are composed primarily of memory (e.g. data storage, etc.) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access memory and related memories that store information in the form of electrical, optical, magnetic, chemical, biological, combinations of these or other means. Dynamic memory device types may include, but are not limited to, FPM DRAMs (Fast Page Mode Dynamic Random Access Memories), EDO (Extended Data Out) DRAMs, BEDO (Burst EDO) DRAMs, SDR (Single Data Rate) Synchronous DRAMs (SDRAMs), DDR (Double Data Rate) Synchronous DRAMs, DDR2, DDR3, DDR4, or any of the expected follow-on memory devices and related memory technologies such as Graphics RAMs (e.g. GDDR, etc.), Video RAMs, LP RAM (Low Power DRAMs) which may often be based on the fundamental functions, features and/or interfaces found on related DRAMs.

Memory devices may include chips (e.g. die, integrated circuits, etc.) and/or single or multi-chip packages (MCPs) or multi-die packages (e.g. including package-on-package (PoP), etc.) of various types, assemblies, forms, and configurations. In multi-chip packages, the memory devices may be packaged with other device types (e.g. other memory devices, logic chips, CPUs, hubs, buffers, intermediate devices, analog devices, programmable devices, etc.) and may also include passive devices (e.g. resistors, capacitors, inductors, etc.). These multi-chip packages etc. may include cooling enhancements (e.g. an integrated heat sink, heat slug, fluids, gases, micromachined structures, micropipes, capillaries, etc.) that may be further attached to the carrier and/or another nearby carrier and/or other heat removal and/or cooling system.

Although not necessarily shown in all the figures, memory module support devices (e.g. buffer(s), buffer circuit(s), buffer chip(s), register(s), intermediate circuit(s), power supply regulation, hub(s), re-driver(s), PLL(s), DLL(s), non-volatile memory, SRAM, DRAM, logic circuits, analog circuits, digital circuits, diodes, switches, LEDs, crystals, active components, passive components, combinations of these and other circuits, etc.) may be comprised of multiple separate chips (e.g. die, dice, integrated circuits, etc.) and/or components, may be combined as multiple separate chips onto one or more substrates, may be combined into a single package (e.g. using die stacking, multi-chip packaging, etc.) or even integrated onto a single device based on tradeoffs such as: technology, power, space, weight, size, cost, performance, combinations of these, etc.

One or more of the various passive devices (e.g. resistors, capacitors, inductors, etc.) may be integrated into the support chip packages, or into the substrate, board, PCB, raw card etc, based on tradeoffs such as: technology, power, space, cost, weight, etc. These packages etc. may include an integrated heat sink or other cooling enhancements (e.g. such as those described above, etc.) that may be further attached to the carrier and/or another nearby carrier and/or other heat removal and/or cooling system.

Memory devices, intermediate devices and circuits, hubs, buffers, registers, clock devices, passives and other memory support devices etc. and/or other components may be attached (e.g. coupled, connected, etc.) to the memory subsystem and/or other component(s) via various methods including multi-chip packaging (MCP), chip-scale packaging, stacked packages, interposers, redistribution layers (RDLs), solder bumps and bumped package technologies, 3D packaging, solder interconnects, conductive adhesives, socket structures, pressure contacts, electrical/mechanical/magnetic/optical coupling, wireless proximity, combinations of these, and/or other methods that enable communication between two or more devices (e.g. via electrical, optical, wireless, or alternate means, etc.).

The one or more memory modules (or memory subsystems) and/or other components/devices may be electrically/optically/wireless etc. connected to the memory system, CPU complex, computer system or other system environment via one or more methods such as multi-chip packaging, chip-scale packaging, 3D packaging, soldered interconnects, connectors, pressure contacts, conductive adhesives, optical interconnects, combinations of these, and other communication and/or power delivery methods (including but not limited to those described above).

Connector systems may include mating connectors (e.g. male/female, etc.), conductive contacts and/or pins on one carrier mating with a male or female connector, optical connections, pressure contacts (often in conjunction with a retaining and/or closure mechanism) and/or one or more of various other communication and power delivery methods. The interconnection(s) may be disposed along one or more edges (e.g. sides, faces, etc.) of the memory assembly (e.g. DIMM, die, package, card, assembly, structure, etc.) and/or placed a distance from an edge of the memory subsystem (or portion of the memory subsystem, etc.) depending on such application requirements as ease of upgrade, ease of repair, available space and/or volume, heat transfer constraints, component size and shape and other related physical, electrical, optical, visual/physical access, requirements and constraints, etc. Electrical interconnections on a memory module are often referred to as pads, contacts, pins, connection pins, tabs, etc. Electrical interconnections on a connector are often referred to as contacts, pins, etc.

As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices together with any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry. The memory modules described herein may also be referred to as memory subsystems because they include one or more memory device(s), register(s), hub(s) or similar devices.

The integrity, reliability, availability, serviceability, performance etc. of the communication path, the data storage contents, and all functional operations associated with each element of a memory system or memory subsystem may be improved by using one or more fault detection and/or correction methods. Any or all of the various elements of a memory system or memory subsystem may include error detection and/or correction methods such as CRC (cyclic redundancy code, or cyclic redundancy check), ECC (error-correcting code), EDC (error detecting code, or error detection and correction), LDPC (low-density parity check), parity, checksum or other encoding/decoding methods and combinations of coding methods suited for this purpose. Further reliability enhancements may include operation retry (e.g. repeat, re-send, replay, etc.) to overcome intermittent or other faults such as those associated with the transfer of information, the use of one or more alternate, stand-by, or replacement communication paths (e.g. bus, via, path, trace, etc.) to replace failing paths and/or lines, complement and/or re-complement techniques or alternate methods used in computer, communication, and related systems.

The use of bus termination is common in order to meet performance requirements on buses that form transmission lines, such as point-to-point links, multi-drop buses, etc. Bus termination methods include the use of one or more devices (e.g. resistors, capacitors, inductors, transistors, other active devices, etc. or any combinations and connections thereof, serial and/or parallel, etc.) with these devices connected (e.g. directly coupled, capacitive coupled, AC connection, DC connection, etc.) between the signal line and one or more termination lines or points (e.g. a power supply voltage, ground, a termination voltage, another signal, combinations of these, etc.). The bus termination device(s) may be part of one or more passive or active bus termination structure(s), may be static and/or dynamic, may include forward and/or reverse termination, and bus termination may reside (e.g. placed, located, attached, etc.) in one or more positions (e.g. at either or both ends of a transmission line, at fixed locations, at junctions, distributed, etc.) electrically and/or physically along one or more of the signal lines, and/or as part of the transmitting and/or receiving device(s). More than one termination device may be used for example, if the signal line comprises a number of series connected signal or transmission lines (e.g. in daisy chain and/or cascade configuration(s), etc.) with different characteristic impedances.

The bus termination(s) may be configured (e.g. selected, adjusted, altered, set, etc.) in a fixed or variable relationship to the impedance of the transmission line(s) (often but not necessarily equal to the transmission line(s) characteristic impedance), or configured via one or more alternate approach(es) to maximize performance (e.g. the useable frequency, operating margins, error rates, reliability or related attributes/metrics, combinations of these, etc.) within design constraints (e.g. cost, space, power, weight, size, performance, speed, latency, bandwidth, reliability, other constraints, combinations of these, etc.).

Additional functions that may reside local to the memory subsystem and/or hub device, buffer, etc. may include data, control, write and/or read buffers (e.g. registers, FIFOs, LIFOs, etc), data and/or control arbitration, command reordering, command retiming, one or more levels of memory cache, local pre-fetch logic, data encryption and/or decryption, data compression and/or decompression, data packing functions, protocol (e.g. command, data, format, etc.) translation, protocol checking, channel prioritization control, link-layer functions (e.g. coding, encoding, scrambling, decoding, etc.), link and/or channel characterization, command prioritization logic, voltage and/or level translation, error detection and/or correction circuitry, RAS features and functions, RAS control functions, repair circuits, data scrubbing, test circuits, self-test circuits and functions, diagnostic functions, debug functions, local power management circuitry and/or reporting, power-down functions, hot-plug functions, operational and/or status registers, initialization circuitry, reset functions, voltage control and/or monitoring, clock frequency control, link speed control, link width control, link direction control, link topology control, link error rate control, instruction format control, instruction decode, bandwidth control (e.g. virtual channel control, credit control, score boarding, etc.), performance monitoring and/or control, one or more co-processors, arithmetic functions, macro functions, software assist functions, move/copy functions, pointer arithmetic functions, counter (e.g. increment, decrement, etc.) circuits, programmable functions, data manipulation (e.g. graphics, etc.), search engine(s), virus detection, access control, security functions, memory and cache coherence functions (e.g. MESI, MOESI, MESIF, directory-assisted snooping (DAS), etc.), other functions that may have previously resided in other memory subsystems or other systems (e.g. CPU, GPU, FPGA, etc.), combinations of these, etc. By placing one or more functions local (e.g. electrically close, logically close, physically close, within, etc.) to the memory subsystem, added performance may be obtained as related to the specific function, often while making use of unused circuits or making more efficient use of circuits within the subsystem.

Memory subsystem support device(s) may be directly attached to the same assembly (e.g. substrate, interposer, redistribution layer (RDL), base, board, package, structure, etc.) onto which the memory device(s) are attached (e.g. mounted, connected, etc.) to a separate substrate (e.g. interposer, spacer, layer, etc.) also produced using one or more of various materials (e.g. plastic, silicon, ceramic, etc.) that include communication paths (e.g. electrical, optical, etc.) to functionally interconnect the support device(s) to the memory device(s) and/or to other elements of the memory or computer system.

Transfer of information (e.g. using packets, bus, signals, wires, etc.) along a bus, (e.g. channel, link, cable, etc.) may be completed using one or more of many signaling options. These signaling options may include such methods as single-ended, differential, time-multiplexed, encoded, optical, combinations of these or other approaches, etc. with electrical signaling further including such methods as voltage or current signaling using either single or multi-level approaches. Signals may also be modulated using such methods as time or frequency, multiplexing, non-return to zero (NRZ), phase shift keying (PSK), amplitude modulation, combinations of these, and others with or without coding, scrambling, etc. Voltage levels may be expected to continue to decrease, with 1.8V, 1.5V, 1.35V, 1.2V, 1V and lower power and/or signal voltages of the integrated circuits.

One or more timing (e.g. clocking, synchronization, etc.) methods may be used within the memory system, including synchronous clocking, global clocking, source-synchronous clocking, encoded clocking, or combinations of these and/or other clocking and/or synchronization methods, (e.g. self-timed, asynchronous, etc.), etc. The clock signaling or other timing scheme may be identical to that of the signal lines, or may use one of the listed or alternate techniques that are more suited to the planned clock frequency or frequencies, and the number of clocks planned within the various systems and subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the memory subsystem, or may be based on a clock that is derived from the clock related to the signal(s) being transferred to and from the memory subsystem (e.g. such as that associated with an encoded clock, etc.). Alternately, a clock may be used for the signal(s) transferred to the memory subsystem, and a separate clock for signal(s) sourced from one (or more) of the memory subsystems. The clocks may operate at the same or frequency multiple (or sub-multiple, fraction, etc.) of the communication or functional (e.g. effective, etc.) frequency, and may be edge-aligned, center-aligned or otherwise placed and/or aligned in an alternate timing position relative to the signal(s).

Signals coupled to the memory subsystem(s) include address, command, control, and data, coding (e.g. parity, ECC, etc.), as well as other signals associated with requesting or reporting status (e.g. retry, replay, etc.) and/or error conditions (e.g. parity error, coding error, data transmission error, etc.), resetting the memory, completing memory or logic initialization and other functional, configuration or related information, etc.

Signals may be coupled using methods that may be consistent with normal memory device interface specifications (generally parallel in nature, e.g. DDR2, DDR3, etc.), or the signals may be encoded into a packet structure (generally serial in nature, e.g. FB-DIMM, etc.), for example, to increase communication bandwidth and/or enable the memory subsystem to operate independently of the memory technology by converting the signals to/from the format required by the memory device(s).

The terminology used herein is for the purpose of describing particular embodiments only and is not intended to be limiting of the various embodiments of the invention. As used herein, the singular forms (e.g. a, an, the, etc.) are intended to include the plural forms as well, unless the context clearly indicates otherwise.

The terms comprises and/or comprising, when used in this specification, specify the presence of stated features, integers, steps, operations, elements, and/or components, but do not preclude the presence or addition of one or more other features, integers, steps, operations, elements, components, and/or groups thereof.

In the following description and claims, the terms include and comprise, along with their derivatives, may be used, and are intended to be treated as synonyms for each other.

In the following description and claims, the terms coupled and connected may be used, along with their derivatives. It should be understood that these terms are not necessarily intended as synonyms for each other. For example, connected may be used to indicate that two or more elements are in direct physical or electrical contact with each other. Further, coupled may be used to indicate that that two or more elements are in direct or indirect physical or electrical contact. For example, coupled may be used to indicate that that two or more elements are not in direct contact with each other, but the two or more elements still cooperate or interact with each other.

The corresponding structures, materials, acts, and equivalents of all means or step plus function elements in the claims below are intended to include any structure, material, or act for performing the function in combination with other claimed elements as specifically claimed. The description of the various embodiments of the present invention has been presented for purposes of illustration and description, but is not intended to be exhaustive or limited to the various embodiments of the invention in the form disclosed. Many modifications and variations will be apparent to those of ordinary skill in the art without departing from the scope and spirit of the various embodiments of the invention. The embodiment(s) was chosen and described in order to best explain the principles of the invention and the practical application, and to enable others of ordinary skill in the art to understand the various embodiments of the invention for various embodiments with various modifications as are suited to the particular use contemplated.

As will be appreciated by one skilled in the art, aspects of the various embodiments of the present invention may be embodied as a system, method or computer program product. Accordingly, aspects of the various embodiments of the present invention may take the form of an entirely hardware embodiment, an entirely software embodiment (including firmware, resident software, micro-code, etc.) or an embodiment combining software and hardware aspects that may all generally be referred to herein as a circuit, component, module or system. Furthermore, aspects of the various embodiments of the present invention may take the form of a computer program product embodied in one or more computer readable medium(s) having computer readable program code embodied thereon.

FIG. 19-1

FIG. 19-1 shows an apparatus 19-100 including a plurality of semiconductor platforms, in accordance with one embodiment. As an option, the apparatus may be implemented in the context of the architecture and environment of any subsequent Figure(s). Of course, however, the apparatus may be implemented in any desired environment.

As shown, the apparatus 19-100 includes a first semiconductor platform 19-102 including at least one memory circuit 19-104. Additionally, the apparatus 19-100 includes a second semiconductor platform 19-106 stacked with the first semiconductor platform 19-102. The second semiconductor platform 19-106 includes a logic circuit (not shown) that is in communication with the at least one memory circuit 19-104 of the first semiconductor platform 19-102. Furthermore, the second semiconductor platform 19-106 is operable to cooperate with a separate central processing unit 19-108, and may include at least one memory controller (not shown) operable to control the at least one memory circuit 19-102.

The memory circuit 19-104 may be in communication with the memory circuit 19-104 of the first semiconductor platform 19-102 in a variety of ways. For example, in one embodiment, the memory circuit 19-104 may be communicatively coupled to the logic circuit utilizing at least one through-silicon via (TSV).

In various embodiments, the memory circuit 19-104 may include, but is not limited to, dynamic random access memory (DRAM), synchronous DRAM (SDRAM), double data rate synchronous DRAM (DDR SDRAM, DDR2 SDRAM, DDR3 SDRAM, DDR4 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), ZRAM (e.g. SOI RAM, Capacitor-less RAM, etc.), Phase Change RAM (PRAM or PCRAM, chalcogenide RAM, etc.), Magnetic RAM (MRAM), Field Write MRAM, Spin Torque Transfer (STT) MRAM, Memristor RAM, Racetrack memory, Millipede memory, Ferroelectric RAM (FeRAM), Resistor RAM (RRAM), Conductive-Bridging RAM (CBRAM), Silicon-Oxide-Nitride-Oxide-Silicon (SONOS) RAM, Twin-Transistor RAM (TTRAM), Thyristor-RAM (T-RAM), combinations of these and/or any other memory technology or similar data storage technology.

Further, in various embodiments, the first semiconductor platform 19-102 may include one or more types of non-volatile memory technology (e.g. FeRAM, MRAM, PRAM, etc.) and/or one or more types of volatile memory technology (e.g. SRAM, T-RAM, Z-RAM, TTRAM, etc.). In one embodiment, the first semiconductor platform 19-102 may include a standard (e.g. JEDEC DDR3 SDRAM, etc.) die.

In one embodiment, the first semiconductor platform 19-102 may use a standard memory technology (e.g. JEDEC DDR3, JEDEC DDR4, etc.) but may be included on a non-standard die (e.g. the die is non-standardized, the die is not sold separately as a memory component, etc.). Additionally, in one embodiment, the first semiconductor platform 19-102 may be a logic semiconductor platform (e.g. logic chip, buffer chip, etc.).

In various embodiments, the first semiconductor platform 19-102 and the second semiconductor platform 19-106 may form a system comprising at least one of a three-dimensional integrated circuit, a wafer-on-wafer device, a monolithic device, a die-on-wafer device, a die-on-die device, a three-dimensional package, or a three-dimensional package. In one embodiment, and as shown in FIG. 19-1, the first semiconductor platform 19-102 may be positioned above the second semiconductor platform 19-106.

In another embodiment, the first semiconductor platform 19-102 may be positioned beneath the second semiconductor platform 19-106. Furthermore, in one embodiment, the first semiconductor platform 19-102 may be in direct physical contact with the second semiconductor platform 19-106.

In one embodiment, the first semiconductor platform 19-102 may be stacked with the second semiconductor platform 19-106 with at least one layer of material therebetween. The material may include any type of material including, but not limited to, silicon, germanium, gallium arsenide, silicon carbide, and/or any other material. In one embodiment, the first semiconductor platform 19-102 and the second semiconductor platform 1A-106 may include separate integrated circuits.

Further, in one embodiment, the logic circuit may operable to cooperate with the separate central processing unit 19-108 utilizing a bus 19-110. In one embodiment, the logic circuit may operable to cooperate with the separate central processing unit 19-108 utilizing a split transaction bus. In the context of the of the present description, a split-transaction bus refers to a bus configured such that when a CPU places a memory request on the bus, that CPU may immediately release the bus, such that other entities may use the bus while the memory request is pending. When the memory request is complete, the memory module involved may then acquire the bus, place the result on the bus (e.g. the read value in the case of a read request, an acknowledgment in the case of a write request, etc.), and possibly also place on the bus the ID number of the CPU that had made the request.

In one embodiment, the apparatus 19-100 may include more semiconductor platforms than shown in FIG. 19-1. For example, in one embodiment, the apparatus 19-100 may include a third semiconductor platform and a fourth semiconductor platform, each stacked with the first semiconductor platform 19-102 and each including at least one memory circuit under the control of the memory controller of the logic circuit of the second semiconductor platform 19-106 (e.g. see FIG. 1B, etc.).

In one embodiment, the first semiconductor platform 19-102, the third semiconductor platform, and the fourth semiconductor platform may collectively include a plurality of aligned memory echelons under the control of the memory controller of the logic circuit of the second semiconductor platform 19-106. Further, in one embodiment, the logic circuit may be operable to cooperate with the separate central processing unit 19-108 by receiving requests from the separate central processing unit 19-108 (e.g. read requests, write requests, etc.) and sending responses to the separate central processing unit 19-108 (e.g. responses to read requests, responses to write requests, etc.).

In one embodiment, the requests and/or responses may be each uniquely identified with an identifier. For example, in one embodiment, the requests and/or responses may be each uniquely identified with an identifier that is included therewith.

Furthermore, the requests may identify and/or specify various components associated with the semiconductor platforms. For example, in one embodiment, the requests may each identify at least one of the memory echelon. Additionally, in one embodiment, the requests may each identify at least one of the memory module.

In one embodiment, different semiconductor platforms may be associated with different memory types. For example, in one embodiment, the apparatus 19-100 may include a third semiconductor platform stacked with the first semiconductor platform 19-102 and include at least one memory circuit under the control of the at least one memory controller of the logic circuit of the second semiconductor platform 19-106, where the first semiconductor platform 19-102 includes, at least in part, a first memory type and the third semiconductor platform includes, at least in part, a second memory type different from the first memory type.

Further, in one embodiment, the at least one memory integrated circuit 1A-104 may be logically divided into a plurality of subbanks each including a plurality of portions of a bank. Still yet, in various embodiments, the logic circuit may include one or more of the following functional modules: bank queues, subbank queues, a redundancy or repair module, a fairness or arbitration module, an arithmetic logic unit or macro module, a virtual channel control module, a coherency or cache module, a routing or network module, reorder or replay buffers, a data protection module, an error control and reporting module, a protocol and data control module, DRAM registers and control module, and/or a DRAM controller algorithm module.

The logic circuit may be in communication with the memory circuit 19-104 of the first semiconductor platform 19-102 in a variety of ways. For example, in one embodiment, the logic circuit may be in communication with the memory circuit 19-104 of the first semiconductor platform 19-102 via at least one address bus, at least one control bus, and/or at least one data bus.

Furthermore, in one embodiment, the apparatus may include a third semiconductor platform and a fourth semiconductor platform each stacked with the first semiconductor platform 19-102 and each may include at least one memory circuit under the control of the at least one memory controller of the logic circuit of the second semiconductor platform 19-106. The logic circuit may be in communication with the at least one memory circuit 19-104 of the first semiconductor platform 19-102, the at least one memory circuit of the third semiconductor platform, and the at least one memory circuit of the fourth semiconductor platform, via at least one address bus, at least one control bus, and/or at least one data bus.

In one embodiment, at least one of the address bus, the control bus, or the data bus may be configured such that the logic circuit is operable to drive each of the at least one memory circuit 19-104 of the first semiconductor platform 19-102, the at least one memory circuit of the third semiconductor platform, and the at least one memory circuit of the fourth semiconductor platform, both together and independently in any combination; and the at least one memory circuit of the first semiconductor platform, the at least one memory circuit of the third semiconductor platform, and the at least one memory circuit of the fourth semiconductor platform, may be configured to be identical for facilitating a manufacturing thereof.

In one embodiment, the logic circuit of the second semiconductor platform 19-106 may not be a central processing unit. For example, in various embodiments, the logic circuit may lack one or more components and/or functionally that is associated with or included with a central processing unit. As an example, in various embodiments, the logic circuit may not be capable of performing one or more of the basic arithmetical, logical, and input/output operations of a computer system, that a CPU would normally perform. As another example, in one embodiment, the logic circuit may lack an arithmetic logic unit (ALU), which typically performs arithmetic and logical operations for a CPU. As another example, in one embodiment, the logic circuit may lack a control unit (CU) that typically allows a CPU to extract instructions from memory, decode the instructions, and execute the instructions (e.g. calling on the ALU when necessary, etc.).

More illustrative information will now be set forth regarding various optional architectures and features with which the foregoing techniques discussed in the context of any of the present or previous figure(s) may or may not be implemented, per the desires of the user. For instance, various optional examples and/or options associated with the first semiconductor platform 19-102, the memory circuit 19-104, the second semiconductor platform 19-106, and/or other optional features have been and will be set forth in the context of a variety of possible embodiments. It should be strongly noted, however, that such information is set forth for illustrative purposes and should not be construed as limiting in any manner. Any of such features may be optionally incorporated with or without the inclusion of other features described.

FIG. 19-2

Flexible I/O Circuit System

FIG. 19-2 shows a flexible I/O circuit system, in accordance with another embodiment. As an option, the system may be implemented in the context of the architecture and environment of any previous and/or subsequent Figure(s). Of course, however, the system may be implemented in any desired environment.

In FIG. 19-2, the flexible I/O circuit system 19-200 may be part of one or more semiconductor chips (e.g. integrated circuit, semiconductor platform, die, substrate, etc.).

In FIG. 19-2, the flexible I/O system may comprise one or more elements (e.g. macro, cell, block, circuit, etc.) arranged (e.g. including, comprising, connected to, etc.) as one or more I/O pads 19-204.

In one embodiment, the I/O pad may be a metal region (e.g. pad, square, rectangle, landing area, contact region, bonding pad, landing site, wire-bonding region, micro-interconnect area, part of TSV, etc.) inside an I/O cell.

In one embodiment, the I/O pad may be an I/O cell that includes a metal pad or other contact area, etc.

In one embodiment, the logic chip 19-206 may be attached to one or more stacked memory chips 19-202.

In FIG. 19-2, the I/O pad 204 is contained (e.g. is part of, is a subset of, is a component of, etc.) in the I/O cell.

In FIG. 19-2, the I/O cell contains a number (e.g. plurality, multiple, arrangement, stack, group, collection, array, matrix, etc.) of p-channel devices and/or a number of n-channel devices.

In one embodiment, an I/O cell may contain both n-channel and p-channel devices.

In one embodiment, the relative area (e.g. die area, silicon area, gate area, active area, functional (e.g. electrical, etc.) area, transistor area, etc.) of n-channel devices to p-channel devices may be adjusted according to the drive capability of the devices. The transistor drive capability (e.g. mA per micron of gate length, IDsat, etc.) may be dependent on factors such as the carrier (e.g. electron, hole, etc.) mobility, transistor efficiency, threshold voltage, device structure (e.g. surface channel, buried channel, etc.), gate thickness, gate dielectric, device shape (e.g. planar, finFET, etc.), semiconductor type, lattice strain, ballistic limit, quantum effects, velocity saturation, desired and/or required rise-time and/or fall-time, etc. For example, if the electron mobility is roughly (e.g. approximately, almost, of the order of, etc.) twice that of the hole mobility, then the p-channel area may be roughly twice the n-channel area.

In one embodiment, a region (e.g. area, collection, group, etc.) of n-channel devices and a region of p-channel devices may be assigned (e.g. allocated, shared, designated for use by, etc.) an I/O pad.

In one embodiment, the I/O pad may be in a separate cell (e.g. circuit partition, block, etc.) from the n-channel and p-channel devices.

In FIG. 19-2, the I/O cell comprises the number of n-channel and number of p-channel connected and arranged to form one or more circuit components.

In FIG. 19-2, the I/O cell circuit (e.g. each, a single I/O cell circuit, etc.) components include (but are not limited to) a receiver (e.g. RX1, etc.), a termination resistor (e.g. RTT, etc.), a transmitter (e.g. TX1, etc.), and a number (e.g. one or more, etc.) of control switches (e.g. SW1, SW2, SW3, etc.).

In FIG. 19-2, the I/O cell circuit forms a bidirectional (e.g. capable of transmit and receive, etc.) I/O circuit.

Typically an I/O cell circuit may use large (e.g. high-drive, low resistance, large gate area, etc.) drive transistors in one or more output stages of a transmitter. Typically an I/O cell circuit may use large resistive structures to form one or more termination resistors.

In one embodiment, the I/O cell circuit may be part of a logic chip that is part of a stacked memory package. In such an embodiment it may be advantageous to allow each I/O cell circuit to be flexible (e.g. may be reconfigured, may be adjusted, may have properties that may be changed, etc.). In order to allow the I/O cell circuit to be flexible it may be advantageous to share transistors between different functions. For example, the large n-channel devices and large p-channel devices used in the transmitter drivers may also be used to form resistive structures used for termination resistance.

It is possible to share devices because the I/O cell circuit is either transmitting or receiving but not both at the same time. Sharing devices in this manner may allow I/O circuit cells to be smaller, I/O pads to be placed closer to each other, etc. By reducing the area used for each I/O cell it may be possible to achieve increased flexibility at the system level. For example, the logic chip may have a more flexible arrangement of high-speed links, etc. Sharing devices in this manner may allow increased flexibility in power management by increasing or reducing the number of devices (e.g. n-channel and/or p-channel devices, etc.) used as driver transistors etc. For example, a larger number of devices may be used when a higher frequency is required, etc. For example, a smaller number of devices may be used when a lower power is required, etc.

Devices may also be shared between I/O cells (e.g. transferred between circuits, reconfigured, moved electrically, disconnected and reconnected, etc.). For example, if one high-speed link is configured (e.g. changed, modified, altered, etc.) with different properties (e.g. to run at a higher speed, run at higher drive strength, etc.) devices (e.g. one or more devices, portions of a device array, regions of devices, etc.) may be borrowed (e.g. moved, reconfigured, reconnected, exchanged, etc.) from adjacent I/O cells, etc. An overall reduction in I/O cell area may allow increased operating frequency of one or more I/O cells by decreasing the inter-cell wiring and thus reducing the parasitic capacitance(s) (e.g. for high-speed clock and data signals, etc.).

In FIG. 19-2, the switches SW1, SW2, SW3 etc. act to control the connection of the circuit components. For example, when the I/O cell is configured (e.g. activated, enabled, etc.) as a receiver the switches SW2 and SW3 may be closed (e.g. conducting, etc.) and switch SW1 may be open (e.g. non-conducting, etc.). For example, when the I/O cell is configured as a transmitter the switches SW2 and SW3 may be open and switch SW1 may be closed.

In FIG. 19-2, the n-channel devices comprise one or more arrays (e.g. N1, N2, etc.). In FIG. 19-2, the p-channel devices comprise one or more arrays (e.g. P1, P2, etc.).

In FIG. 19-2, the n-channel devices (e.g. one or more of the arrays N1, N2, etc.) may be operable to be connected to an I/O pad as n-channel driver transistors that are part of transmitter TX1, etc. In FIG. 19-2, the p-channel devices may be operable to be connected to an I/O pad as p-channel driver transistors that are part of transmitter TX1, etc. In FIG. 19-2, the n-channel devices (e.g. one or more of the arrays N1, N2, etc.) may be operable to be connected to an I/O pad as one or more terminations resistors, or as part (e.g. portion, subset, etc.) of one or more termination resistors (e.g. RTT, etc.), etc. In FIG. 19-2, the p-channel devices (e.g. one or more of the arrays P1, P2, etc.) may be operable to be connected to an I/O pad as one or more terminations resistors, or as part (e.g. portion, subset, etc.) of one or more termination resistors (e.g. RTT, etc.), etc.

In FIG. 19-2, the functions of the n-channel devices (e.g. as driver transistors, as termination resistors, etc.) may be controlled by signals (e.g. N1 source connect, N1 gate control, etc.). For example, if the device array N1 is configured (e.g. using switches, etc.) to be part of the driver transistor structure for TX1 the N1 source connect may be connected (e.g. attached, coupled, etc.) to ground (e.g. negative supply, other fixed potential etc.) and the N1 gate control connected to a logic signal (e.g. output signal, etc.). For example, if the device array N1 is part of the termination resistor RTT the N1 source connect may be connected to ground and the N1 gate control connected to a reference voltage (e.g. voltage bias, controlled level, etc.). The reference voltage may be chosen (e.g. fixed, adjusted, controlled, varied, in a feedback loop, etc.) so that the device resistance (e.g. of device array N1, etc.) is fixed or variable and thus the termination resistance RTT may be a controlled (e.g. variable, fixed or nearly fixed value, etc.) impedance (e.g. real or complex impedance, etc.) and/or resistance (e.g. 50 Ohms, matched to transmission line impedance, etc.).

In FIG. 19-2, the p-channel devices and device array(s) may be controlled (e.g. operated, configured, etc.) in a similar fashion to the n-channel devices using signals (e.g. (e.g. P1 source connect, P1 gate control, etc.).

In FIG. 19-2, switches SW1, SW2, SW3 may be as shown (e.g. physically and/or logically, etc.) or their logical (e.g. electrical, electronic, etc.) function(s) may be part of (e.g. inherent to, logically equivalent to, subsumed by, etc.) the functions of the n-channel devices and/or p-channel devices and their associated control circuits and signals.

In one embodiment, the flexible I/O circuit system may be used by one or more logic chips in a stacked memory package.

In one embodiment, the flexible I/O circuit system may be used to vary the electrical properties of one or more I/O cells in one or more logic chips of a stacked memory package.

In one embodiment, the flexible I/O circuit system may be used to vary the I/O cell drive strength(s) and/or termination resistance(s) or portion(s) of termination resistance(s) of one or more I/O cells in one or more logic chips of a stacked memory package.

In one embodiment, the flexible I/O circuit system may be used to allow power management of one or more I/O cells in one or more logic chips of a stacked memory package.

In one embodiment, the flexible I/O circuit system may be used to reduce the area used by a plurality of I/O cells by sharing one or more transistors or portion(s) of one or more transistors between one or more I/O cells in one or more logic chips of a stacked memory package.

In one embodiment, the reduced area of one or more flexible I/O circuit system(s) may be used to increase the operating frequency of the I/O cells by reducing parasitic capacitance in one or more logic chips of a stacked memory package.

In one embodiment, the flexible I/O circuit system may be used to exchange (e.g. swap, etc.) transistor between one or more I/O cells in one or more logic chips of a stacked memory package.

In one embodiment, the flexible I/O circuit system may be used to alter (e.g. change, modify, configure) one or more transistors in one or more I/O cells in one or more logic chips of a stacked memory package.

In one embodiment, the flexible I/O circuit system may be used to alter the rise-time(s) and/or fall-time(s) of one or more I/O cells in one or more logic chips of a stacked memory package.

In one embodiment, the flexible I/O circuit system may be used to alter the termination resistance of one or more I/O cells in one or more logic chips of a stacked memory package.

In one embodiment, the flexible I/O circuit system may be used to alter the I/O configuration (e.g. number of lanes, size of lanes, number of links, frequency of lanes and/or links, power of lanes and/or links, latency of lanes and/or links, directions of lanes and/or links, grouping of lanes and/or links, number of transmitters, number of receivers, etc.) of one or more logic chips in a stacked memory package.

As an option, the system may be implemented in the context of the architecture and environment of any previous Figure(s) and/or any subsequent Figure(s). Of course, however, the system may be implemented in the context of any desired environment.

FIG. 19-3

TSV Matching System

FIG. 19-3 shows a TSV matching system, in accordance with another embodiment. As an option, the system may be implemented in the context of the architecture and environment of any previous and/or subsequent Figure(s). Of course, however, the system may be implemented in any desired environment.

In FIG. 19-3, the TSV matching system 19-300 may comprise a plurality of chips (e.g. semiconductor platforms, dies, substrates, etc.). In FIG. 19-3, the TSV matching system may comprise a logic chip 19-306 and one or more stacked memory chips 19-302, etc. In FIG. 19-3, the plurality of chips may be connected by one or more through-silicon vias (TSVs) 19-304 used for connection and/or coupling (e.g. buses, via chains, etc.) of signals, power, etc.

In FIG. 19-3, the TSV 19-304 may be represented (e.g. modeled, etc.) by an equivalent circuit (e.g. lumped model, parasitic model, etc.) that comprises the parasitic (e.g. unwanted, undesired, etc.) circuit elements RV3 and CV3. In FIG. 19-3, the resistance RV3 represents the equivalent series resistance of the TSV 19-304. In FIG. 19-3, the capacitance CV3 represents the equivalent capacitance (e.g. to ground etc.) of TSV 19-304.

In FIG. 19-3, a stacked memory package 19-308 may comprise a logic chip and a number of stacked memory chips (e.g. D0, D1, D2, D3, etc.). In FIG. 19-3, the stacked memory chips D0-D3 are connected (e.g. coupled, etc.) using buses B1-B13. In FIG. 19-3, the buses B1-B13 use TSVs to connect each chip. In FIG. 19-3, the buses and TSVs that connect each chip are represented as lines (e.g. vertical, diagonal, etc.) and the connections of a bus to a chip are represented as solid dots. Thus, for example, where there is no (e.g. an absence, etc.) of a dot on a vertical or diagonal line that means that that chip is not connected to the bus. Thus for example, in FIG. 19-3, bus B2 connects the logic chip to stacked memory chip D0, but stacked memory chips D1, D2, D3 are not connected to bus B2.

In FIG. 19-3, bus B1 uses an arrangement (e.g. structure, architecture, physical layout, etc.) of TSVs called ARR1. In FIG. 19-3, buses B2-B5 uses an arrangement of TSVs called ARR2. In FIG. 19-3, buses B6-B9 uses an arrangement of TSVs called ARR3. In FIG. 19-3, buses B10-B13 uses an arrangement of TSVs called ARR4.

In FIG. 19-3, each bus may be represented (e.g. modeled, is equivalent to, etc.) an equivalent circuit comprised of one or more circuit elements (e.g. resistors, capacitors, inductors, etc.). For example, in FIG. 19-3, bus B1 may be represented by an equivalent circuit representing the TSVs in stacked memory chips D0, D1, D2, D3. For example, in FIG. 19-3, bus B1 may be represented by an equivalent circuit comprising four resistors and four capacitors.

In FIG. 19-3, buses B2-B5 (arrangement ARR2) are used to separately (e.g. individually, not shared, etc.) connect the logic chip to stacked memory chips D0, D1, D2, D3 (respectively). In FIG. 19-3, buses B2-B5, associated wiring, and TSVs have been arranged so that each die D0-D3 is identical (e.g. uses an identical pattern of wires, TSVs, etc.). For manufacturing and cost reasons it may be important that each of the stacked memory chips in a stacked memory package are identical. However, it may be seen from FIG. 19-3 that buses B2, B3, B4, B5 do not have the same equivalent circuits. Thus for example, bus B5 may have only one TSV (e.g. through D3) while bus B2 may have 4 TSVs (e.g. through D3, D2, D1, D0). In FIG. 19-3, buses B2-B5 may be used to drive logic signals from the logic chip to the stacked memory chips D0-D3. In FIG. 19-3, because buses B2-B5 do not have the same physical structure their electrical properties may differ. Thus for example, In FIG. 19-3, bus B2 may have a longer propagation delay (e.g. latency, etc.) and/or lower frequency capability (e.g. higher parasitic impedances, etc.) than, for example, bus B5.

In FIG. 19-3, buses B6-B9 (arrangement ARR3) are constructed (e.g. wired, laid out, shaped, etc.) so as to reduce (e.g. alter, ameliorate, dampen, etc.) the difference in electrical properties or match electrical properties between different buses. In FIG. 19-3, each of buses B6-B9 is shown as two portions. In FIG. 19-3, bus B8 for example, has a first portion that connects logic chip to stacked memory chip D2 through stacked memory chip D3 (but making no electrical connection to circuits on D3). In FIG. 19-3, bus B8 has a second portion that connects D2, D1, D0 (but makes no electrical connection to circuits on any other chip). In FIG. 19-3, a dotted line is shown between the first and second portions of each bus. In FIG. 19-3, for example, bus B8 has a dotted line that connects the first and second portions of bus B8. In FIG. 19-3, the dotted line represents wiring (e.g. connection, trace, metal line, etc.) on a stacked memory chip. For example, in Figure bus B8 uses wiring on stacked memory chip D2 to connect the first and second portions of bus B8. The wiring in each of buses B6-B9 that joins bus portions is referred to as RC adjust. The value of RC adjust may be used to match the electrical properties of buses that use TSVs.

In FIG. 19-3, the equivalent circuit for bus B9 for example, comprises resistances RV3 (TSV through D3), RV2, RV1, RV0 and CV3 (TSV through D3), CV2, CV1, CV0. In FIG. 19-3, the RC adjust for bus B9 for example, appears electrically between RV3 and RV2. In FIG. 19-3, the connection to the stacked memory chip D3 for bus B9 is located between RV3 and RV2.

In FIG. 19-3, the RC adjust for bus B8 appears electrically between RV2 and RV1. In FIG. 19-3, the connection to the stacked memory chip D3 for bus B9 is located between RV2 and RV1.

In FIG. 19-3, the RC adjust for bus B7 appears electrically between RV1 and RV0. In FIG. 19-3, the connection to the stacked memory chip D3 for bus B9 is located between RV1 and RV0.

In FIG. 19-3, the RC adjust for bus B6 appears electrically after RV0. In FIG. 19-3, the connection to the stacked memory chip for bus B6 is located between RV3 and RV2.

In FIG. 19-3, the electrical properties (e.g. timing, impedance, etc.) of buses B6-B9 (arrangement ARR3) may be more closely matched than buses B2-B5 (arrangement ARR2). For example, the total parasitic capacitance of buses B6-B9 are equal with each bus having total parasitic capacitance of (CV3+CV2+CV1+CV0). The parasitic capacitance of bus B2 is (CV3+CV2+CV1+CV0), of bus B3 is (CV3+CV2+CV1), of bus B4 is (CV3+CV2), of bus B5 is CV3.

Note that when a bus is referred to as matched (or match properties of a bus, etc.), it means that the electrical properties of one conductor in a bus are matched to one or more other conductors in that bus (e.g. the properties of X[0] may be matched with X[1}, etc.). Of course, conductors may also be matched between different buses (e.g. signal X[0] in bus X may be matched with signal Y[1] in bus Y, etc.). TSV matching as used herein means that buses that may use one or more TSVs may be matched.

The matching may be improved by using RC adjust. For example, the logic connections (e.g. take off points, taps, etc.) are different (e.g. at different locations on the equivalent circuit, etc.) for each of buses B6-B9. By controlling the value of RC adjust (e.g. adjusting, designing different values at manufacture, controlling values during operation, etc.) the timing (e.g. delay properties, propagation delay, transmission line delay, etc.) between each bus may be matched (e.g. brought closer together in value, equalized, made nearly equal, etc.) even though the logical connection points on each bus may be different. This may be seen for example, by imagining that the impedance of RC adjust (e.g. equivalent resistance and/or equivalent capacitance, etc.) is so much larger than a TSV that the TSV equivalent circuit elements are negligible in comparison with RC adjust. In this case the electrical circuit equivalents for buses B6-B9 become identical (or nearly identical, identical in the limit, etc.). Implementations may choose a trade-off between the added impedance of RC adjust and the degree matching required (e.g. amount of matching, equalization required, etc.).

In FIG. 19-3, buses B10-B13 (arrangement ARR4) show an alternative method to perform TSV matching. The arrangement shown for buses B6-B9 (arrangement ARR3) may be viewed as a folded version (e.g. compressed, mirrored, etc.) of the arrangement ARR4. Although no RC adjust segments are shown in the arrangement ARR4, such RC adjust segments may be used in arrangement ARR4. Arrangement ARR3 may be more compact (e.g. smaller area, smaller silicon volume, etc.) than arrangement ARR4 for a small number of buses. For a large number of buses (e.g. large numbers of connections and/or large numbers of stacked chips, etc.), the RC adjust segments in arrangement ARR3 may be longer than may be possible using arrangement ARR4 and so ARR4 may be preferred in some situations. For large buses the difference in area required between arrangement ARR3 and arrangement ARR4 may become smaller.

The selection of TSV matching method may also depend on, for example, TSV properties. Thus, for example, if TSV series resistance is very low (e.g. 1 Ohm or less) then the use of the RC adjust technique described may not be needed. To see this imagine that the TSV resistance is zero. Then either ARR3 (with no RC adjust) or ARR4 will match buses almost equally with respect to parasitic capacitance.

In some cases TSVs may be co-axial with shielding. The use of co-axial TSVs may be used to reduce parasitic capacitance between bus conductors for example. Without co-axial TSVs, arrangement ARR4 may be preferred as it may more closely match capacitance between conductors than arrangement ARR3 for example. With co-axial TSVs, ARR3 may be preferred as the difference in parasitic capacitance between conductors may be reduced, etc.

In FIG. 19-3, inductive parasitic elements have not be shown. Such inductive elements may be modeled in a similar way to parasitic capacitance. TSV matching, as described above, may also be used to match inductive elements.

In FIG. 19-3, several particular arrangements of buses using TSVs are shown. Buses may be made up of any type of coupling and/or connection in addition to TSVs (e.g. paths, signal traces, PCB traces, conductors, micro-interconnect, solder balls, C4 balls, solder bumps, bumps, via chains, via connections, other buses, combinations of these, etc.). Of course TSV matching methods, techniques, and systems employing these may be used for any arrangement of buses using TSVs.

In one embodiment, TSV matching may be used in a system that uses one or more stacked semiconductor platforms to match one or more properties (e.g. electrical properties, physical properties, length, parasitic components, parasitic capacitance, parasitic resistance, parasitic inductance, transmission line impedance, signal delay, etc.) between two or more conductors (e.g. traces, via chains, signal paths, other microinterconnect technology, combinations of these, etc.) in one or more buses (e.g. groups or sets of conductors, etc.) that use one or more TSVs to connect the stacked semiconductor platforms.

In one embodiment, TSV matching may use one or more RC adjust segments to match one or more properties between two or more conductors of one or more buses that use one or more TSVs.

In a stacked memory package the power delivery system (e.g. connection of power, ground, and/or reference signals, etc.) may be challenging (e.g. difficult, require optimized wiring, etc.) due to the large transient currents (e.g. during refresh, etc.) and high frequencies involved (e.g. challenging signal integrity, etc.).

In one embodiment, TSV matching may be used for power, ground, and/or reference signals (e.g. VDD, VREF, GND, etc.).

As an option, the system may be implemented in the context of the architecture and environment of any previous Figure(s) and/or any subsequent Figure(s). Of course, however, the system may be implemented in the context of any desired environment.

FIG. 4

Dynamic Sparing

FIG. 19-4 shows a dynamic sparing system, in accordance with another embodiment. As an option, the system may be implemented in the context of the architecture and environment of any previous and/or subsequent Figure(s). Of course, however, the system may be implemented in any desired environment.

In FIG. 19-4, the dynamic sparing system 19-400 may comprise one or more chips 19-402 (e.g. semiconductor platform, die, ICs, etc.). In FIG. 19-4, the chip 19-402 may be a stacked memory chip D0. In FIG. 19-4, the stacked memory chip D0 may be stacked with other stacked die (e.g. memory chips, etc.). In FIG. 19-4, stacked memory chips D0, D1, D2, D3, D4 may be part of a stacked memory package. In FIG. 19-4, the stacked memory package may also include other chips (e.g. a logic chip, other memory chips, other types of memory chips, etc.) that are not shown for clarity of explanation here.

In a stacked memory package it may be difficult to ensure that all stacked memory chips are working correctly before assembly is complete. It may therefore be advantageous to have method(s) to increase the yield (e.g. number of working devices, etc.) of stacked memory packages.

FIG. 19-4 depicts a system that may be used to improve the yield of stacked memory packages by using dynamic sparing.

In FIG. 19-4, stacked memory chip D0 comprises 4 banks. In FIG. 19-4, for example, (and using small numbers for illustrative purposes) bank 0 may comprise memory cells labeled 00-15, bank 1 comprises memory cells labeled 16-31, etc. Typically a memory chip may contain millions or billions of memory cells. In FIG. 19-4, each bank is arranged in columns and rows. In FIG. 19-4, there are 2 spare columns C8, C9. In FIG. 19-4, there are 2 spare rows R8, R9. In FIG. 19-4, memory cells that have errors or are otherwise designated faulty are marked. For example, cells 05 and 06 in row R1 and columns C1 and C2 are marked.

For example, errors may be detected by the memory chip and/or logic chip in a stacked memory package. The errors may be detected using coding schemes (e.g. parity, ECC, SECDED, CRC, etc.).

In FIG. 19-4, column C1, rows R0-R3 may be replaced (e.g. repaired, dynamically spared, dynamically replaced, etc.) by using spare column C8, rows R0-R3. Different arrangements of spare rows and columns and their possible uses are possible. For example, it may be possible to replace 2 columns in bank 0 or replace 2 columns in bank 1 or replace 1 column in bank 0 and replace 1 column in bank 1, etc. There may be a limit to bad columns and/or rows that may be replaced. For example, in FIG. 19-4, if there are more than two bad columns in any of banks 0-1 it may not be possible to replace a third column.

The numbers of spare rows and columns and the organization (e.g. architecture, placement, connections, etc.) of the replacement circuits may be chosen using knowledge of the errors and failure rates of the memory devices. For example, if it is know that columns are more likely to fail than rows the numbers of spare columns may be increased, etc. In a stacked memory package there may be many causes of failures. For examples failures may occur as a result of infant mortality, transistor failure(s) (wear out, etc.) may occur in any of the memory circuits, interconnect and/or TSVs may fail, etc. Thus memory sparing may be used to repair or replace failure, incipient failure, etc. of any circuit, collection of circuits, interconnect, TSVs, etc.

In FIG. 19-4, each memory chip has spare rows and columns. In FIG. 19-4, the stacked memory package has a spare memory chip. In FIG. 19-4, for example, D4 may be designated as a spare memory chip.

In FIG. 19-4, the behavior of memory cells may be monitored during operation (e.g. by a logic chip in a stacked memory package, etc.). As errors are detected the failing or failed memory cells may be marked. For example, the location(s) of marked memory cells may be stored (e.g. by a logic chip in a stacked memory package, etc.). The marked memory cells may be scheduled for replacement.

Replacement may follow a hierarchy. Thus for example, In FIG. 19-4, five memory cells in D0 may be marked (at successive times t1, t2, t3, t4, t5) in the order 05, 06, 54, 62, 22. At time t1 memory cell 05 may be replaced by C8/R0-R3. At time t2 memory cell 06 may be replaced by C9/R0-R3. At time t3 memory cell 54 may be replaced by R8/C4-C7. At time t4 memory cell 62 may be replaced by R9/C4-C7. When memory cell 22 is marked there may be no spare rows or spare columns available on D0. For example, it may not be possible to use still available D0 spares (columns) C8/R4-R7, C9/R4-R7 and (rows) R8/C0-C3, R9/C0-C3 to replace memory cells in bank 1. In FIG. 19-4, after memory cell 22 is marked spare chip D4 may now be scheduled to replace D0.

Replacement may involve copying data from one or more portions of a stacked memory chip (e.g. rows, columns, banks, echelon, a chip, other portion(s), etc.).

Spare elements may be organized in a logically flexible fashion. In FIG. 19-4, the stacked memory package may be organized such that memory cells 000-255 (e.g. distributed across 4 stacked memory chips D0-D3) may be visible (e.g. to the CPU, etc.). The spare rows and spare columns of D0-D3 are logically grouped (e.g. collected, organized, virtually assembled, etc.) in memory cells 256-383.

In FIG. 19-4, after memory cell 22 in D0 is marked a spare row or column from another stacked memory chip (D1, D2, D3) may be scheduled as a replacement. This dynamic sparing across stacked memory chips is possible if spare (row and column) memory cells 256-383 are logically organized as an invisible portion of the memory space (e.g. visible to one or more logic chips in a stacked memory package but invisible to the CPU, etc.) but controlled by the stacked memory package. In FIG. 19-4, there may still be limitations on the use of memory space 256-383 for spares (e.g. regions corresponding to spare rows may not be used as direct replacements for spare columns, etc.).

In one embodiment, groups of portions of memory chips may be used as spares. Thus for example, one or more groups of spare columns from one or more stacked memory chips and/or one or more groups of spare rows from one or more stacked memory chips may be used to create a spare bank or portion(s) of one or more spare banks or other portions (e.g. echelon, subbank, rank, etc.) possibly being a portion of a larger portion (e.g. rank, stacked memory chip, stacked memory package, etc.) of a memory subsystem, etc. For example, In FIG. 19-4, the 128 spare memory cells 256-383 may be used to replace up to 2 stacked memory chips of 64 memory cells each. For example, In FIG. 19-4, the spare stacked memory chip comprising memory cells 384-447 may be used to replace a failed stacked memory chip, or may be used to replace one or more echelons, one or more banks, one or more subbanks, one or more rows, one or more columns, combinations of these, etc.

In one embodiment, dynamic sparing (e.g. during run time, during operation, during system initialization and/or configuration, etc.) may be used together with static sparing (e.g. at manufacture, during test, at system start-up and/or initialization, etc.).

As an option, the system may be implemented in the context of the architecture and environment of any previous Figure(s) and/or any subsequent Figure(s). Of course, however, the system may be implemented in the context of any desired environment.

FIG. 19-5

Subbank Access System

FIG. 19-5 shows a subbank access system, in accordance with another embodiment. As an option, the system may be implemented in the context of the architecture and environment of any previous and/or subsequent Figure(s). Of course, however, the system may be implemented in any desired environment.

In FIG. 19-5, the subbank access system 19-500 comprises a bank of a memory chip. In FIG. 19-5, the memory chip may be a stacked memory chip that is part of a stacked memory package, but need not be.

In FIG. 19-5, the bank comprises 255 memory cells. In FIG. 19-5, the bank comprises 4 subbanks. In FIG. 19-5, each subbank comprises 64 memory cells. FIG. 19-5 does not show any spare rows and/or columns and/or any other spare memory cells that may be present but that are not shown for reasons of clarity of explanation.

In FIG. 19-5, the bank comprises 16 row decoders RD00-RD15. In FIG. 19-5, the bank comprises 16 sense amplifiers SA00-SA15.

In FIG. 19-5, the row decoders RD00-RD15 are subdivided into two groups (e.g. collections, portions, subsets, etc.) RDA and RDB. Each of RDA and RDB corresponds (e.g. is connected to, are coupled to, etc.) a subbank.

In FIG. 19-5, the sense amplifiers SA00-SA15 are subdivided into two groups (e.g. collections, portions, subsets, etc.) SAA and SAB. Each of SAA and SAB corresponds (e.g. is connected to, are coupled to, etc.) a subbank.

In FIG. 19-5, the subbank access system allows the access to portions of a memory that are smaller than a bank.

In FIG. 19-5, the access (e.g. read command, etc.) to data stored in a bank follows a sequence of events. In FIG. 19-5, the access (e.g. timing, events, operations, flow, etc.) has been greatly simplified to show the main events and operations that allow subbank access. In FIG. 19-5, the bank access may start (e.g. commences, is triggered, etc.) at t1 with a row decode operation. The row decode operation may complete (e.g. finish, settle, etc.) at t2. A time ta1 (e.g. timing parameter, combination of timing restrictions and/or parameters, etc.) may then be required (e.g. to elapse, to pass, etc.) before the sense operation may start at t3. Time ta1 may in turn consist of one or more other operations in the memory circuits, etc. The sense operation may complete at t4. Data (from an entire row of the bank) may then be read from the sense amplifiers SA00-SA15.

In FIG. 19-5, the subbank access may start at t1. In FIG. 19-5, the first subbank access operation uses the subset RDA of row decoders. Because there are 8 row decoders in RDA (e.g. the subset RDA of row decodes is smaller than the 16 row decoders in the entire bank) the RDA row decode operation may finish at t5 which is earlier than t2 (e.g. t2−t1>t5−t1, etc.). In FIG. 19-5, once the RDA row decode operation has finished at t5 a new RDB row decode operation may start. The RDB row decode operation may finish at t6 (e.g. t6−t5 is approximately equal to t5−t1, etc.). In FIG. 19-5, at t7 a time ta2 has passed since the start of the RDA operation. Time ta2 (for subbank access) may be approximately equal (e.g. of the same order, to within 10 percent, etc.) to ta1 the time required between the end of a row decode operation and a sense operation (for bank access). Thus at time t7 a sense operation SAA for subbank access may start. In FIG. 19-5, at t8 the sense operation SAA finishes. Data (from the subbank) may then be read from sense amplifiers SA00-SA07. In FIG. 19-5, at t9 a time ta3 has passed. Time ta3 (for subrank access) may be substantially equal (e.g. very nearly, within a few percent, etc.) to ta2 and approximately equal to ta1. Thus at time t9 a sense operation SAB for subbank access may start. In FIG. 19-5, at t10 the sense operation SAA finishes. Data (from the subbank) may then be read from sense amplifiers SA08-SA15.

In FIG. 19-5, the timing is for illustrative purposes only and has been simplified for ease of explanation. In FIG. 19-5, the absolute times of events and operations and relative timing of events and operations may vary. For example, t10 may be greater (as shown in FIG. 19-5) or less than t4, etc.

The subbank access system shown In FIG. 19-5, allows access to regions (e.g. sections, blocks, portions, etc.) that are smaller than a bank. Such access may be advantageous in modern memory systems where many threads and many processes act to produce a random pattern of memory access. In a memory system each unit (e.g. lock, section, partition, portion, etc.) of a memory that is able to respond to a memory request is called a responder. Increasing the number of responders in a memory chip and in a memory system may improve the random memory access performance.

The subbank access system has been described using data access in terms of reads. A similar mechanism (e.g. method, algorithm, architecture, etc.) may be used for writes where data is driven onto the sense amplifiers and onto the memory cells instead of being read from the sense amplifiers.

As an option, the system may be implemented in the context of the architecture and environment of any previous Figure(s) and/or any subsequent Figure(s). Of course, however, the system may be implemented in the context of any desired environment.

FIG. 19-6

Improved Flexible Crossbar Systems

FIG. 19-6 shows a crossbar system, in accordance with another embodiment. As an option, the system may be implemented in the context of the architecture and environment of any previous and/or subsequent Figure(s). Of course, however, the system may be implemented in any desired environment.

In FIG. 19-6, the crossbar system 19-600 comprises input I[0:15] and output O[0:15]. In FIG. 19-6, the input I[0:15] and output O[0:15] may correspond (e.g. represent, etc.) the inputs and outputs of one or more logic chips in a stacked memory package, but need not be. In FIG. 19-6, there may be additional inputs and outputs (e.g. operable to be coupled to stacked memory chips, etc.) that are not shown in order to increase the clarity of explanation.

In a logic chip that is part of a stacked memory package it may be required to connect a number of high-speed input lanes (e.g. receive pairs, receiver lanes, etc.) to a number of output lanes in a programmable fashion but with high speed (e.g. low latency, low delay, etc.).

In one embodiment, of a logic chip for a stacked memory package, the crossbar that connects inputs to outputs (as shown In FIG. 19-6, for example) may be separate from any crossbar or similar device (e.g. component, circuits, etc.) used to route logic chip inputs to the memory controller inputs (e.g. commands, write data, etc.) and/or memory controller outputs (e.g. read data, etc.) to the logic chip outputs. For clarity, the crossbar that connects inputs to outputs (as shown In FIG. 19-6, for example) y be referred to as the input/output crossbar or Rx/Tx crossbar, for example.

FIG. 19-6(*a*) shows a 16×16 crossbar. In FIG. 19-6(*a*) the crossbar comprises 16 column bars, C00-C15. In FIG. 19-6(*a*) the crossbar comprises 16 row bars, R00-R15. In FIG. 19-6(*a*) at the intersection of each row bar and column bar there is a potential connection point. In FIG. 19-6(*a*) the connection points are labeled 000-255. In FIG. 19-6(*a*) the 16×16 crossbar contains 256 potential connections. Thus for example, in FIG. 19-6(*a*) the potential connection point at the intersection of column bar 14 and row bar 06 is labeled as cross (14, 06) or potential connection point 110=[16*(06+1)−(16−(14+1))−1].

In a logic chip for a stacked memory package it may not be necessary to connect all possible combinations of inputs and outputs. Thus for example, in FIG. 19-6(*a*), possible connections (e.g. connections that can be made by hardware, etc.) are shown by solid dots (e.g. at cross (14, 06) etc.) and may be a subset of all potential connections (e.g. that could be made in a crossbar but are not wired to be made, etc.). Thus for example, in FIG. 19-6(*a*) there are four solid dots on each row bar. There are thus 64 solid dots that represent possible connections out of the 256 potential connections.

In FIG. 19-6(*a*) the solid dots have been chosen such that, for example, NorthIn[0] may connect to NorthOut[0], EastOut[0], SouthOut[0], WestOut[0], etc. This type of connectivity may be all that is required to interconnect four links (North, East, South, West, etc.) each of 4 transmit lanes (e.g. pairs) and 4 receive lanes.

By reducing the hardware needed to make 256 connections to the hardware needed to make 64 connections the crossbar may be made more compact (e.g. reduced silicon area, reduced wiring etc.) and therefore may be faster and may consume less power.

The patterns of dots in the crossbar may be viewed as the possible connection matrix. In FIG. 19-6(*a*) the connection matrix possesses symmetry with respect to the North, East, South and West inputs and outputs. Such a symmetry need not be present. For example, it may be advantageous to increase the vertical network flow and thus increase the connectivity of North/South inputs and outputs. In such a case for example, it may be advantageous to add to the 4 (North/North) cross points 000, 017, 034, 051 by including the 12 cross points 001, 002, 003, 016, 018, 019, 032, 033, 035, 048, 049, 050 in (North/North) column bars C00-C03/row bars R00-R03 and equivalent 12 (South/South) cross points in column bars C08. In addition the possible connection matrix need not be square, that is the number of inputs need not equal the number of outputs.

Of course the same type of improvements to crossbar structures by using a carefully constructed reduced connection matrix and architecture may be used for any number of inputs, outputs, links, lanes, inputs and outputs.

In one embodiment, a reduced N×M crossbar may be used to interconnect N inputs and M outputs of the logic chip in a stacked memory package. The cross points of the reduced crossbar may be selected as a possible connection matrix to allow interconnection of a first set of lanes within a first link to corresponding second set of lanes within a second link.

In FIG. 19-6(*b*) a 16×16 crossbar is constructed from a set (e.g. group, collection, etc.) of smaller crossbars. In FIG. 19-6(*b*) there are two stages (e.g. similarly placed columns, groups, assemblies, etc.) of crossbars. In FIG. 19-6(*b*) the stages are connected using networks of interconnect. By using carefully constructed networks of interconnect between the stages of smaller crossbars it is possible to create a fully connected (e.g. all potential connections are used as possible connections, etc.) large crossbar from stages of smaller fully connected smaller crossbars.

For example, a Clos network may contain one or more stages (e.g. multi-stage network, multi-stage switch, multi-staged device, staged network, etc.). A Clos network may be defined by three integers n, m, and r. In a Clos network n may represent the number of sources (e.g. signals, etc.) that may feed each of r ingress stage (e.g. first stage, etc.) crossbars. Each ingress stage crossbar may have m outlets (e.g. outputs, etc.), and there may be m middle stage crossbars. There may be exactly one connection between each ingress stage crossbar and each middle stage crossbar. There may be r egress stage (e.g. last stage, etc.) crossbars, each may have m inputs and n outputs. Each middle stage crossbar may be connected exactly once to each egress stage crossbar. Thus, the ingress stage may have r crossbars, each of which may have n inputs and m outputs. The middle stage may have m crossbars, each of which may have r inputs and r outputs. The egress stage may have r crossbars, each of which may have m inputs and n outputs.

A nonblocking minimal spanning switch that may be equivalent to a fully connected 16×16 crossbar may be made from a 3-stage Clos network with n=4, m=4, r=4. Thus 12 fully connected 4×4 crossbars may be required to construct a fully connected 16×16 crossbar. The 12 fully connected 4×4 crossbars contain 192=16*12 potential and possible connection points.

A nonblocking minimal spanning switch may consume less space than a 16×16 crossbar and thus may be easy to construct (e.g. silicon layout, etc.), faster and consume less power.

However, with the observation that less than full interconnectivity is required on some or all lanes and/or links, it is possible to construct staged networks that improve upon, for example, the nonblocking minimal spanning switch.

In FIG. 19-6(*b*) the 16×16 crossbar is constructed from 2 sets of four 4×4 crossbars. In FIG. 19-6(*b*) the 4×4 crossbars each have 16 potential connection points. Thus four 4×4 crossbars have 64 potential connection points. This number of potential connection points (64) is less than a nonblocking minimal spanning switch (192), and less than a fully interconnected 16×16 crossbar (256).

The network interconnect between stages may be defined using connection codes. Thus for example, in FIG. 19-6(*b*), the connection between the first stage of 4×4 crossbars and the second stage of 4×4 crossbars consists of a set (e.g. connection list, etc.) of 16 ordered 2-tuples e.g. (A00, B00) etc. Since the first element of each 2-tuple is strictly ordered (e.g. A00, A01, A02, . . . , A015) the connection list(s) may be reduced to an ordered list of 16 elements (e.g. B00, B05, B09, . . . ) or B[00, 05, 09, . . . ]. In FIG. 19-6(*b*) there are two connection lists: a first connection list L1 between the first crossbar stage and the second crossbar stage; and a second connection list L2 between the second crossbar stage and the outputs.

In FIG. 19-6(*b*) the first connection list L1 is B[00: 05: 09: 13: 04: 02: 10: 14: 09: 01: 06: 15: 12: 03: 07: 11]. In FIG. 6(*b*) the second connection list L2 is D[00: 05: 09: 13: 04: 02: 10: 14: 09: 01: 06: 15: 12: 03: 07: 11]. Further optimizations (e.g. improvements, etc.) of the crossbar network layout in FIG. 6(*b*) etc. may be possible by recognizing permutations that may be made in the connection list(s). For example, connections to B00, B01, B02, B03 are equivalent (e.g. may be swapped and the electrical function of the network remains unchanged, etc.). Also connections to A00, A01, A02, A03 may be permuted. For example, it may be said that {B00, B01, B02, B03} forms a connection swap set for the first connection list L1. In FIG. 6(*b*) L1 has the following connection swap sets: {A00, A01, A02, A03}, {A04, A05, A06, A07}, {A08, A09, A10, A11}, {A12, A13, A14, A15}, {B00, B01, B02, B03}, {B04, B05, B06, B07}, {B08, B09, B10, B11}, {B12, B13, B14, B15}. This means that 4-tuples in the connection list L1 may also be permuted without change of function. Thus in the list B[00: 05: 09: 13: 04: 02: 10: 14: 09: 01: 06: 15: 12: 03: 07: 11], for example, the elements 00, 01, 02, 03 may be permuted etc.

Typically CAD tools that may perform automated layout and routing of circuits allow the user to enter such permutation lists (e.g. equivalent pins, etc.). The use of the flexibility in routing provided by optimized staged network designs such as that shown in FIG. 19-6(*b*) may allow layout to be more compact and allow the CAD tools to obtain better timing convergence (e.g. faster, less spread in timing between inputs and outputs, etc.).

Optimizations may also be made in the connection list L2. In FIG. 19-6(*b*) D00 is connected to O[0] etc. The logical use of outputs O[0] to O[15] (each of which may represent a wire pair, etc.) may depend on the particular design, configuration, use etc. of the link(s). For example, outputs O[0:3] (e.g. 4 wire pairs) may be regarded as a set of lanes (e.g. transmit or receive, etc.) that form part of a link or may form an entire link. If O[0] is logically equivalent to O[1] then D00 and D01 may be swapped (e.g. interchanged, are equivalent, etc.), and so on for other outputs, etc. Even if, for example, O[0], O[1], O[2], O[4] are used together to form a link, it may still be possible to swap O[0], O[1], O[2], O[4] providing the PHY and link layers can handle the interchanging of lanes (transmit or receive) within a link.

Thus, for example, L2 may have connection swap sets {C00, C01, C02, C03}, {C04, C05, C06, C07}, {C08, C09, C10, C11}, {D12, D13, D14, D15}, {D00, D01, D02, D03}, {D04, D05, D06, D07}, {D08, D09, D10, D11}, {D12, D13, D14, D15}. An engineering (e.g. architectural, design, etc.) trade off may thus be made between adding potential complexity in the PHY and/or link logical layers versus the benefits that may be achieved by adding further flexibility in the routing of optimized staged network designs such as that shown in FIG. 19-6(*b*).

In one embodiment, an optimized staged network may be used to interconnect N inputs and M outputs of the logic chip in a stacked memory package. The optimized staged network may use crossbars smaller than P×P where P<min(N, M).

In one embodiment, the optimized staged network may be routed using connection swap sets (e.g. equivalent pins, equivalent pin lists, etc.).

As an option, the system may be implemented in the context of the architecture and environment of any previous Figure(s) and/or any subsequent Figure(s). Of course, however, the system may be implemented in the context of any desired environment.

FIG. 19-7

Flexible Memory Controller Crossbar System

FIG. 19-7 shows a flexible memory controller crossbar, in accordance with another embodiment. As an option, the system may be implemented in the context of the architecture and environment of any previous and/or subsequent Figure(s). Of course, however, the system may be implemented in any desired environment.

In FIG. 19-7, the flexible memory controller crossbar system 19-700 comprises one or more crossbars coupled to one or more memory controllers using one or more networks of interconnect. In FIG. 19-7(*a*) there are four 4×4 crossbars, but any number, type and size of crossbar(s) may be used depending on the interconnectivity required. In FIG. 19-7(*a*) the crossbars may be fully connected but need not be. In FIG. 19-7(*a*) there is a single network of interconnect between the first crossbar stage and the memory controllers but any number of networks of interconnects may be used depending, for example, on the number of crossbar stages. In FIG. 19-7(*a*) there are four groups (e.g. sets, etc.) of four inputs comprising I[0:15] though any number and arrangement(s) of inputs may be used. In FIG. 19-7(*a*) there are 4 memory controllers with 4 inputs each, though any number of memory controller with any number of inputs may be used. In FIG. 19-7(*a*) the number of inputs to the first crossbar stage (16) is equal the number of inputs to the memory controllers (16), though they need not be equal.

In FIG. 19-7(*a*) the first crossbar stage is connected to the memory controllers using a network of interconnects. In FIG. 19-7(*a*) the network of interconnect is labeled as Clos swizzle, since the interconnect pattern is related to the more general class of Clos networks as described previously, and a swizzle is a common term used in VLSI datapath engineering for a rearrangement of signal wires in a datapath.

In FIG. 19-7(*a*) the connection list L1 for the network of interconnects is F[00: 05: 09: 13: 04: 02: 10: 14: 09: 01: 06: 15: 12: 03: 07: 11]. As described previously pin equivalents may be used to both simplify and improve the performance of the routing and circuits. Note that the crossbar system shown in FIG. 19-7(*a*) is similar but not the same as the crossbar system shown in FIG. 19-6(*b*). The crossbar system shown in FIG. 19-7(*a*) is smaller and thus may be faster (e.g. lower latency, etc.) and/or with other advantages (e.g. lower power, smaller area, etc.) than the crossbar system shown in FIG. 19-6(*b*). The trade off between systems such as that shown in FIG. 19-6(*b*) and FIG. 19-7(*a*) is the flexibility in interconnection of the system components. For example, in FIG. 19-7(*a*) only one signal from the set of signals I[0], I[1], I[2], I[3] may be routed to memory controller M0, etc.

In one embodiment, of a logic chip for a stacked memory package, the memory controller crossbar (as shown in FIG. 19-7(*a*) for example) may be separate from the crossbar used to route inputs to outputs (the input/output crossbar or Rx/Tx crossbar, as shown In FIG. 19-6, for example). In such an embodiment the two crossbar systems may be optimized separately. Thus for example, the memory controller crossbar may be smaller and faster, as shown in FIG. 19-7(*a*) for example. The Rx/Tx crossbar, as shown In FIG. 19-6, for example, may be larger but have more flexible interconnectivity.

Other combinations and variations of crossbar design may be used for both the Rx/Tx crossbar and memory controller crossbar.

In one embodiment, a single crossbar may be used to perform the functions of input/output crossbar and memory controller crossbar.

In FIG. 19-6, input(s) (logic chip inputs, considered as a single bus or collection of signals on a bus) are shown as I[0:15] and output(s) (logic chip outputs) are shown as O[0:15]. In FIG. 19-7(*a*) input(s) are shown as J[0:15] and output(s) as K[0:15]. If a single crossbar is used to perform the functions of input/output crossbar and memory controller crossbar then inputs I[0:15] may correspond to inputs J[0:15]. A single crossbar may then have 16 outputs (logic chip outputs) corresponding to O[0:15] and 16 outputs (memory controller inputs) corresponding to K[0:15]. In such a design it may be easier to reduce the size of the crossbar by limiting the flexibility of the high-speed serial link structures. For example, inputs I[0], I[1], I[2], I[3] may always required to be treated as a bundle (e.g. group, set, etc.) and used as one link. In this case after the deserializer and deframing in the PHY and link layers there may be a single wide datapath containing the serial information transferred on the bundle I[0], I[1], I[2], I[3]. If the same is done for I[4:7], I[8:11], I[12:15] then there are 4 wide datapaths that may be handled by a larger number of much smaller crossbars.

Combinations of these approaches may be used. For example, in order to ensure speed of packet forwarding between stacked memory packages the Rx/Tx crossbar may perform switching close to the PHY layer, possibly without deframing for example. If the routing information is contained in an easily accessible manner in packet headers, lookup in the FIB may be performed quickly and the packet(s) immediately routed to the correct output on the crossbar. The memory crossbar may perform switching at a different ISO layer. For example, the memory controller crossbar may perform switching after deframing or even later in the data flow.

In one embodiment, of a logic chip for a stacked memory package, the memory controller crossbar may perform switching after deframing.

In one embodiment, of a logic chip for a stacked memory package, the input/output crossbar may perform switching before deframing.

In one embodiment, of a logic chip for a stacked memory package, the width of the crossbars may not be same width as the logic chip inputs and outputs.

As another example of decoupling the physical crossbar (e.g. crossbar size(s), type(s), number(s), interconnects(s), etc.) from logical switching, the use of limits on the lane and/or link use may be coupled with the use of virtual channels (VCs). Thus for example, the logic chip input I[0:15] may be split to (e.g. considered or treated as, etc.) four bundles: I[0:3] (e.g. this may be referred to as bundle BUN0), I[4:7] (bundle BUN1), I[8:11] (bundle BUN2), I[12:15] (bundle BUN3). These four bundles BUN0-BUN3 may contain information transmitted within four VCs (VC0-VC1). Thus bundle BUN0 may be a single wide datapath containing VC0-VC3. Bundles B1, B2, B3 may also contain VC0-VC3 but need not. The original signal I[0] may then be mapped to VC0, I[1] to VC1, and so on for I[0:3]. BUN0-BUN3 may then be switched using a smaller crossbar but information on the original input signals are maintained. Thus for example, the input I[0:15] may correspond to 16 individual receiver (as seen by the logic chip) lanes, with each lane holding commands destined for any of the logic chip outputs (e.g. any of 16 outputs, a subset of the 16 outputs, etc. and possibly depending on the output lane configuration, etc.) or any memory controller on the memory package. The bundle(s) may be demultiplexed, for example, at the memory controller arbiter and VCs used to restore priority etc. to the original inputs I[0:15].

In FIG. 19-7(*b*) an alternative representation for the flexible memory controller crossbar uses datapath symbols for common datapath circuit blocks (e.g. crossbar, swizzle, etc.). Such datapath symbols and/or notation may be used in other Figure(s) herein where such use may simplify the explanations and may improve clarity of the architecture(s).

Thus for example, in FIG. 19-7(*b*) the signal shown as J[0:3] may be considered to be a bundle of 4 signals using 4 wires. In this case, each of the 4 crossbars in FIG. 19-7(*b*) are 4×4. However, the signal shown as J[0:3] may be changed to be a time-multiplexed serial signal (e.g. one wire or one wire pair) or a wide datapath signal (e.g. 64 bits, 128 bits, 256 bits, etc.).

In one embodiment, J[0:15] may be converted to a collection (e.g. bundle, etc.) of wide datapath buses. For example, the logic chip may convert J[0:3] to a first 64 bit bus BUS0, and similarly J[4:7] to a second bus BUS1, J[8:11] to BUS2, J[12:15] to BUS3. The four 4×4 crossbars shown in FIG. 19-7(*b*) may then become four 64-bit buses that may be flexibly connected by the logic chip to the four memory controllers M0-M4. This may be done in the logic chips using a number of crossbars or by other methods. For example, the four 64-bit buses may form inputs to a large register file (e.g. flip-flops, etc.) or SRAM that may form the storage elements(s) (e.g. queues, etc.) of one or more arbiters for the four memory controllers. More details of these and other possible implementations are described below.

Thus it may be seen that the crossbar systems shown In FIG. 19-6, and FIG. 19-7 may represent the switching functions (e.g. describe the physical and logical architecture, designs, etc.) that may be performed by a logic chip in a stacked memory package.

In one embodiment, the switching functions of a logic chip of a stacked memory package may act to couple (e.g. connect, switch, etc.) each logic chip input to one or more logic chip outputs.

In one embodiment, the switching functions of a logic chip of a stacked memory package may act to couple each logic chip input to one or more memory controllers.

In one embodiment, the switching functions of a logic chip of a stacked memory package may act to couple each memory controller output to one or more logic chip outputs.

The crossbar systems, as shown In FIG. 19-6, and FIG. 19-7, may also represent optimizations that may improve the performance of such switching function(s).

In one embodiment, the switching functions of a logic chip of a stacked memory package may be optimized depending on restrictions placed on one or more logic chip inputs and/or one or more logic chip outputs.

The datapath representations of the crossbar systems may be used to further optimize the logical functions of such system components (e.g. decoupled from the physical representation(s), etc.). For example, the logical functions represented by the datapath elements in FIG. 19-7(*b*) may correspond to a collection of buses, crossbars, networks of interconnect etc. However, an optimized physical implementation may be different in physical form (e.g. may not necessarily use crossbars, etc.) even though the physical implementation performs exactly the same logical function(s).

In one embodiment, the switching functions of a logic chip of a stacked memory package may be optimized by merging one or more pluralities of logic chip inputs into one or more signal bundles (e.g. subsets of logic chip inputs, etc.).

In one embodiment, one or more of the signal bundles may contain one or more virtual channels.

In one embodiment, the switching functions of a logic chip of a stacked memory package may be optimized by merging one or more pluralities of logic chip inputs into one or more datapath buses.

In one embodiment, one or more of the datapath buses may be merged with one or more arbiters in one or more memory controllers on the logic chip.

As an option, the system may be implemented in the context of the architecture and environment of any previous Figure(s) and/or any subsequent Figure(s). Of course, however, the system may be implemented in the context of any desired environment.

FIG. 19-8

Basic Packet Format System

FIG. 19-8 shows a basic packet format system, in accordance with another embodiment. As an option, the system may be implemented in the context of the architecture and environment of any previous and/or subsequent Figure(s). Of course, however, the system may be implemented in any desired environment.

In FIG. 19-8, the basic packet format system 19-800 comprises three commands (e.g. command formats, packet formats, etc.): read/write request; read completion; write data request. The packet format system may also be called a command set, command structure, protocol structure, protocol architecture, etc.

In FIG. 19-8, the commands and command formats have been simplified to provide a base level of commands (e.g. simple possible formats, simple possible commands, etc.). The base level of commands (e.g. base level command set, etc.) allow us to describe the basic operation of the system. The base level of commands provides minimum level of functionality for system operation. The base level of commands allows clarity of system explanation. The base level of commands allows us to more easily explain added features and functionality.

In one embodiment, of a stacked memory package, the base level commands (e.g. base level command set, etc.) and field widths may be as shown in FIG. 19-8. In FIG. 19-8, the base level of commands have fixed packet length of 80 bits (bits 00-79). In FIG. 8, the lane width (transmit lane and receive lane width) is 8 bits. In FIG. 19-8, the data protection scheme (e.g. error encoding, etc.) is shown as CRC and is 8 bits. In FIG. 19-8, the control field (e.g. header, etc.) width is 8 bits. In FIG. 19-8, the read/write command length is 32 bits (with two read/write commands per packet as shown). Note that a read/write command (e.g. in the format for a memory controller, etc.) is inside (e.g. contained by, carried by, etc.) a read/write command packet. In FIG. 19-8, the read data field width is 64 bits (note the packet returned as a result of a read command is a response). In FIG. 19-8, the write data field width is 64 bits.

FIG. 19-8 does not show any message or other control packets (e.g. flow control, error message, etc.).

All command sets typically contain a set of basic information. For example, one set of basic information may be considered to comprise (but not limited to): (1) posted transactions (e.g. without completion expected) or non-posted transactions (e.g. completion expected); (2) header information and data information; (3) direction (transmit/request or receive/completion). Thus the pieces of information in a basic command set would comprise (but not limited to): posted request header (PH), posted request data (PD), non-posted request header (NPH), non-posted request data (NPD), completion header (CPLH), completion data (CPLD). These 6 pieces of information are used, for example, in the PCI Express protocol.

In the base level commands set shown In FIG. 19-8, for example, it has been chosen to split PH/PD (at least partially, with some information in the read/write request and some in the write data request) in the case of the read/write request used with (possibly one or more) write data request(s) (and possibly also split NPH/NPD depending on whether the write semantics of the protocol include posted and non-posted write commands). In the base level commands set shown In FIG. 19-8, it has been chosen to combine CPLH/CPLD in the read completion format.

In one embodiment, of a stacked memory package, the command set may use message and control packets in addition to the base level command set.

In FIG. 19-8, it has been chosen and shown one particular base command set. Of course many other variations (e.g. changes, alternatives, modifications, etc.) are possible (e.g. for a base command set and for more advanced command sets possibly built on the base commands set, etc.) and some of these variations will be described in more detail herein and below. For example, variations in the command set may include (but are not limited to) the following: (1) there may be a single read or write command in the read/write packet; (2) there may be separate packet formats for read and for write requests/commands; (3) the header field may be (and typically is) more complex, including sub-fields (e.g. for routing, control, flow control, errors handling, etc.); (4) a packet ID (e.g. tag, sequence number, etc.) may be part of the header or control field or a separate field; (5) the packet length may be variable (e.g. denoted, marked, etc. by packet length field, etc.); (6) the packet lengths may be one of one or more fixed but different lengths depending on a packet type etc; (7) the command set may follow (e.g. adhere to, be part of, be compatible with, be compliant with, etc.) an existing standard (e.g. PCI-E (e.g. Gen1, Gen2, Gen3, etc.), QPI, HyperTransport (e.g. HT 3.0 etc.), RapidIO, Interlaken, InfiniBand, Ethernet (e.g. 802.3 etc.), CEI, or other similar protocols with associated command sets, packet formats, etc.); (8) the command set may be an extension (e.g. superset, modification, etc.) of a standard protocol; (9) the command set may follow a layered protocol (e.g. IEEE 802.3 etc. with multiple layers (e.g. OSI layers, etc.) and thus have fields within fields (e.g. nested fields, nested protocols (e.g. TCP over IP, etc.), nested packets, etc.); (10) data protection may have multiple components (e.g. multiple levels, etc. with CRC and/or other protection scheme(s) at the PHY layer, possibly with other protection scheme(s) at one or more of the data layer, link layer, data link layer, transaction layer, network layer, transport layer, higher layer(s), and/or other layer(s), etc.); (11) there may be more packets and commands including (but not limited to): memory read request, memory write request, IO read request, IO write request, configuration read request, configuration write request, message with data, message without data, completion with data, completion without data, etc; (12) the header field may be different for each command/request/response/message type etc; (13) a write request may contain write data or the write command may be separate from write data (as shown In FIG. 19-8, for example), etc; (13) commands may be posted (e.g. without completion expected) or non-posted (e.g. completion expected); (14) packets (e.g. packet classes, types of packets, layers of packets, etc.) may be subdivided (e.g. into data link layer packets (DLLPs) and transaction layer packets (TLPs), etc.); (15) framing etc. information may be added to packets at the PHY layer (and is not shown for example, in FIG. 19-8); (16) information contained within the basic command set may be split (e.g. partitioned, apportioned, distributed, etc.) in different ways (e.g. in different packets, grouped together in different ways etc.); (17) the number and length of fields within each packet may vary (e.g. read/write command field length may be greater than 32 bits in order to accommodate 64-bit addresses etc.).

Note also that FIG. 19-8 defines the format of the packets but does not necessarily completely define the semantics (e.g. protocol semantics, protocol use, etc.) of how they are used. Though formats (e.g. command formats, packet formats, fields, etc.) are relatively easily to define formally (e.g. definitively, in a normalized fashion, etc), it is harder to formally define semantics. With a simple basic command set, it is possible to define a simple base set of semantics (indeed the semantics may be implicit (e.g. inherent, obvious, etc.) with the base commands such as that shown in FIG. 19-8, for example). The semantics (e.g. protocol semantics, etc.) may be described using one or more flow diagrams herein and below.

As an option, the system may be implemented in the context of the architecture and environment of any previous Figure(s) and/or any subsequent Figure(s). Of course, however, the system may be implemented in the context of any desired environment.

FIG. 19-9

Basic Logic Chip Algorithm

FIG. 19-9 shows a basic logic chip algorithm, in accordance with another embodiment. As an option, the algorithm may be implemented in the context of the architecture and environment of any previous and/or subsequent Figure(s). Of course, however, the algorithm may be implemented in any desired environment.

In one embodiment, the logic chip in a stacked memory package may perform (e.g. execute, contain logic that performs, etc.) the basic logic chip algorithm 19-900 in FIG. 19-9.

In FIG. 19-9, the basic logic chip algorithm 19-900 comprises steps 19-902-19-944. The basic logic chip algorithm may be implemented using a logic chip or portion(s) of a logic chip in a stacked memory package for example.

Step 19-902: The algorithm starts when the logic chip is active (e.g. powered on, after start-up, configuration, initialization, etc.) and is in a mode (e.g. operation mode, operating mode, etc.) capable of receiving packets (e.g. PHY level signals, etc.) on one or more inputs. A starting step (Step 19-902) is shown in FIG. 19-9. An ending step is not shown In FIG. 19-9, but typically will occur when a fatal system or logic chip error occurs, the system is powered-off or placed into one or more modes where the logic chip is not capable of receiving or no longer processes input signals, etc.

Step 19-904: the logic chip receives signals on the logic chip input(s). The input packets may be spread across one or more receive (Rx) lanes. Logic (typically at the PHY layer) may perform one or more logic operations (e.g. decode, descramble, deframe, deserialize, etc.) on one or more packets in order to retrieve information from the packet.

Step 19-906: Each received (e.g. received by the PHY layer in the logic chip, etc.) packet may contain information required and used by one or more logic layers in the logic chip in order to route (e.g. forward, etc.) one or more received packets. For example, the packets may contain (but are not limited to contain) one or more of the pieces of information shown in the basic command set of FIG. 19-8. For example, the logic chip may be operable to extract (e.g. read, parse, etc.) the control field shown in each packet format In FIG. 19-8, (e.g. 8-bits control filed, control byte, etc.). The control field may also form part of the header field or be the header field for each packet. Thus in step 19-906 the logic chip reads the control fields and header fields for each packet. The logic chip may also perform some error checking (e.g. fields legally formatted, fields content within legal ranges, packet(s) pass PHY layer CRC check, etc.).

Step 19-908: the logic chip may then check (e.g. inspect, compare, lookup, etc.) the header and/or control fields in the packet for information that determines whether the packet is destined for the stacked memory package containing the logic chip or whether the packet is destined for another stacked memory package and/or other device or system component. The information may be in the form of an address or part of an address etc.

Step 19-910: if the packet is intended for further processing on the logic chip, the logic chip may then parse (e.g. read, extract, etc.) further into the packet structure (e.g. read more fields, deeper into the packet, inside nested fields, etc.). For example, the logic chip may read the command field(s) in the packet. From the control and/or header together with the command field etc. the type and nature of request etc. may be determined.

Step 19-912: if the packet is a read request, the packet may be passed to the read path.

Step 19-914: as the first step in the read path the logic chip may extract the address field. Note that the basic command set shown In FIG. 19-8, includes the possibility that there may be more than one read command in a read/write request. For ease of explanation, FIG. 19-9 shows only the flow for a single read command in a read/write request. If there are two read commands (or two commands of any type, etc.) in a request then the appropriate steps described here (e.g. in the read path, write path, etc.) may be repeated until all commands in a request have been processed.

Step 19-916: the packet with read command(s) may be routed (either in framed or deframed format etc.) to the correct (e.g. appropriate, matching, corresponding, etc.) memory controller. The correct memory controller may be determined using a read address field (not explicitly shown in FIG. 19-8) as part of the read/write command (e.g. part of read/write command 1/2/3 etc. in FIG. 19-8, etc.). The logic chip may use a lookup table for example, to determine which memory controller is associated with memory address ranges. A check on legal address ranges may be performed at this step. The packet may be routed to the correct memory controller using a crossbar or equivalent functionality etc. as described herein.

Step 19-918: the read command may be added to a read command buffer (e.g. queue, FIFO, register file, SRAM, etc.). At this point the priority of the read may be extracted (e.g. from priority field(s) contained in the read command(s) (not shown explicitly in FIG. 19-8), or from VC fields that may be part of the control field, etc.).

Step 19-920: this step is shown as a loop to indicate that while the read is completing other steps may be performed in parallel with a read request.

Step 19-922: the data returned from the memory (e.g. read completion data, etc.) may be stored in a buffer along with other fields. For example, the control field of the read request may contain a unique identification number ID (not shown explicitly in FIG. 19-8). The ID field may be stored with the read completion data so that the requester may associate the completion with the request. The packet may then transmitted by the logic chip (e.g. sent, queued for transmission, etc.).

Step 19-924: if the packet is not intended for the stacked memory package containing the logic chip, the packet is routed (e.g. switched using a crossbar, etc.) and forwarded on the correct lanes and link towards the correct destination. The logic chip may use a FIB for example, to determine the correct routing path.

Step 19-926: if the packet is a write request, the packet(s) may be passed to the write path.

Step 19-928: as the first step in the write path the logic chip may extract the address field. Note that the basic command set shown In FIG. 8, includes the possibility that there may be more than one write command in a read/write request. For ease of explanation, FIG. 19-9 shows only the flow for a single write command in a read/write request. If there are two write commands (or two commands of any type, etc.) in a request then the appropriate steps described here (e.g. in the read path, write path, etc.) may be repeated until all commands in a request have been processed.

Step 19-930: the packet with write command(s) may be routed to the correct memory controller. The correct memory controller may be determined using a write address field as part of the read/write command. The logic chip may use a lookup table for example, to determine which memory controller is associated with memory address ranges. A check on legal address ranges and/or permissions etc. may be performed at this step. The packet may be routed to the correct memory controller using a crossbar or equivalent functionality etc. as described herein.

Step 19-932: the write command may be added to a write command buffer (e.g. queue, FIFO, register file, SRAM, etc.). At this point the priority of the write may be extracted (e.g. from priority field(s) contained in the read command(s) (not shown explicitly in FIG. 19-8), or from VC fields that may be part of the control field, etc.).

Step 19-934: this step is shown as a loop to indicate that while the write is completing other steps may be performed in parallel with write request(s).

Step 19-936: if part of the protocol (e.g. command set, etc.) a write completion containing status and an acknowledgement that the write(s) has/have completed may be created and sent. FIG. 19-8 does not show a write completion in the basic commands set. For example, the control field of the write request may contain a unique identification number ID. The ID field may be stored with the write completion so that the requester may associate the completion with the request. The packet may then transmitted by the logic chip (e.g. sent, queued for transmission, etc.).

Step 19-940: if the packet is a write data request, the packet(s) are passed to the write data path.

Step 19-942: the packet with write data may be routed to the correct memory controller and/or data queue. Since the address is separate from data in the basic command set shown In FIG. 19-8, the logic chip may use the ID to associate the data packets with the correct memory controller.

Step 19-944: the packet is added to the write data buffer (e.g. queue, etc.). The basic command set of FIG. 19-8 may allow for more than one write data request to be associated with a write request (e.g. a single write request may write n×64 bits using n write data requests, etc.). Thus once step 944 is complete the algorithm may loop back to step 19-904 where more write data request packets may be received.

Step 19-938: if the packet is not one of the recognized types (e.g. no legal control field, etc.) then an error message may be sent. An error message may use a separate packet format (FIG. 19-8 does not show an error message as part of the basic command set). An error message may also be sent by using an error code in a completion packet.

Of course, as was described with reference to the basic command set shown in FIG. 19-8, there are many possible variations on the format of the commands and packets. For each variation in command set the semantics of the protocol may also vary. Thus the algorithm described here may be subject to variation also.

As an option, the algorithm may be implemented in the context of the architecture and environment of any previous Figure(s) and/or any subsequent Figure(s). Of course, however, the system may be implemented in the context of any desired environment.

FIG. 19-10

Basic Address Field Format

FIG. 19-10 shows a basic address field format for a memory system protocol, in accordance with another embodiment. As an option, the basic address field format may be implemented in the context of the architecture and environment of any previous and/or subsequent Figure(s). Of course, however, the basic address field format may be implemented in any desired environment.

The basic address field format 19-1000 shown In FIG. 19-10, may be used as part of the protocol used to communicate between system components (e.g. CPU, logic chips, etc.) in a memory system that uses stacked memory packages.

The basic address field format v1000 shown In Figure v10, may be part of the read/write command field shown for example, in FIG. 19-8.

In FIG. 19-10, the address field may be 48 bits long. Of course the address field may be any length. In FIG. 19-10, the address field may be viewed as having a row portion (24 bits) and a column portion (24 bits). Of course the address field may have any number of portions of any size. In FIG. 19-10, the row portion may be viewed as having 3 equal 8-bit portions: row 1, row 2, and row 3. In FIG. 19-10, the column portion may be viewed as having 3 equal 8-bit portions: column 1, column 2, and column 3.

FIG. 19-10 shows an address allocation scheme for the basic address field format. The address allocation scheme assigns (e.g. apportions, allocates, designates, etc.) portions (e.g. subfields, etc.) of the 48-bit address space to various functions. For example, In FIG. 19-10, it may be seen that the functions may include (but are not limited to) the following subfields: (1) package (e.g. which stacked memory package does this address belong to, etc? (2) rank/echelon (e.g. which rank, if ranks are used as in a conventional DIMM-based memory subsystem, does this address belong to? or which echelon (as defined herein) does this address belong to? (3) subrank (e.g. which subrank does this address belong to? if subranks are used to further subdivide bank access in one or more memory chips in one or more stacked memory packages, etc; (4) row (e.g. which row address on a stacked memory chip (e.g. DRAM, etc.) does this address belong to? (5) column (e.g. which column address on a stacked memory chip does this address belong to? (6) block/byte (e.g. which block or byte (for 8-bit etc. access) does this address belong to?

Note that In FIG. 19-10, the address allocation scheme shows two bars for each function. The solid bar represents a typical minimum length required for that field and its function. For example, the package field may be a minimum of 3 bits which corresponds to the ability to uniquely address up to 8 stacked memory packages. The shaded bar represents a typical maximum length required for that field and its function. The maximum value is typically a practical one, limited by practical sizes of packet lengths that will determine protocol efficiency etc. For example, the practical maximum length for the package field may be 6 bits (as shown in FIG. 19-10). A package field length of 6 bits corresponds to the ability to uniquely address up to 64 stacked memory packages. The other fields and their length ranges may be determined in a similar fashion and examples are shown in FIG. 19-10.

Note that if all the minimum field lengths are added in the example address allocation shown in FIG. 19-10, an address field length of: 3 (package)+3 (rank/echelon)+3 (subrank)+16 (row)+7 (column)+6 (block/byte)=38 bits is the result. If all the minimum field lengths are added in the example address allocation shown in FIG. 19-10, an address field length of: 6 (package)+6 (rank/echelon)+6 (subrank)+20 (row)+10 (column)+6 (block/byte)=54 bits is the result. The choice of address field length may be based on such factors as (but not limited to): protocol efficiency, memory subsystem size, memory subsystem organization, packet parsing logic, logic chip complexity, memory technology (e.g. DRAM, NAND, etc.), JEDEC standard address assignments, etc.

Figure v10 shows an address mapping scheme for the basic address field format. In order to maximize the performance (e.g. maximize speed, maximize bandwidth, minimize latency, etc.) of a memory system it may be important to minimize contention (e.g. the time(s) that memory is unavailable due to overhead activity, etc.). Contention may often occur in a memory chip (e.g. DRAM etc.) when data is not available to be read (e.g. not in a row buffer etc.) and/or resources are gated (e.g. busy, occupied, etc.) and/or or operations (e.g. PRE, ACT, etc.) must be performed before a read or write operation may be completed. For example, access to different pages in the same bank cause row-buffer contention (e.g. row buffer conflict, etc.).

Contention in a memory device (e.g. SDRAM etc.) and memory subsystem may be reduced by careful choice of the ordering and use of address subfields within the address field. For example, some address bits (e.g. AB1) in a system address field (e.g. from a CPU etc.) may change more frequently than others (e.g. AB2). If address bit AB2 is assigned in an address mapping scheme to part of a bank address then the bank addressed in a DRAM may not change very frequently causing frequent row-buffer contention and reducing bandwidth and memory subsystem performance. Conversely if AB1 is assigned as part of a bank address then memory subsystem performance may be increased.

In FIG. 19-10, the address bits that are allocated may be referred to as ALL[0:47] and the bits that are mapped may be referred to as MAP[0:47]. Thus address mapping defines the map (e.g. function(s), etc.) that maps ALL to MAP. In FIG. 19-10, an address mapping scheme may include (but is not limited to) the following types of address mapping (e.g. manipulation, transformation, changing, etc.): (1) bits and fields may be translated or moved (e.g. a 3-bit package field allocated as ALL[00:02] may be moved from bits 00-02 to bits 45-47, thus the mapped package field is MAP[45:47], etc; (3) bits and fields may be reversed and/or swizzled (e.g. a 3-bit package field in ALL [00:02] may be manipulated so that package field bit 0 maps to bit 1, bit 1 maps to bit 2, bit 2 maps to bit 0; thus ALL[00] maps to MAP[01], ALL[01] maps to MAP[02], ALL[02] maps to MAP[00], which is equivalent to a datapath swizzle, etc.); (3) bits and fields may be logically manipulated (e.g. subrank bit 0 at ALL[05] may be logical OR'd with row bit 0 at ALL[08] to create subrank bit 0 at MAP[05], etc; (4) fields may be split and moved; (5) combinations of these operations, etc.

In one embodiment, address mapping may be performed by the logic chip in a stacked memory package.

In one embodiment, address mapping may be programmed by the CPU.

In one embodiment, address mapping may be changed during operation.

As an option, the basic address field format may be implemented in the context of the architecture and environment of any previous Figure(s) and/or any subsequent Figure(s). Of course, however, the system may be implemented in the context of any desired environment.

FIG. 19-11

Address Expansion System

FIG. 19-11 shows an address expansion system, in accordance with another embodiment. As an option, the address expansion system may be implemented in the context of the architecture and environment of any previous and/or subsequent Figure(s). Of course, however, the address expansion system may be implemented in any desired environment.

The address expansion system 19-1100 In FIG. 19-11, comprises an address field, a key table, an expanded address field. In FIG. 19-11, the address field is shown as 48 bits in length, but may be any length. In FIG. 19-11, the expanded address field is shown as 56 bits, but may be any length (and may depend on the address expansion algorithm used and the length of the address field). In FIG. 19-11, the key table may be any size and may depend on the address expansion algorithm used.

In one embodiment, the expanded address field may be used to address one or more of the memory controllers on a logic chip in a stacked memory package.

In one embodiment, the address field may be part of a packet, with the packet format using the basic command set shown In FIG. 19-8, for example.

In one embodiment, the key table may be stored on a logic chip in a stacked memory package.

In one embodiment, the key table may be stored in one or more CPUs.

In one embodiment, the address expansion algorithm may be performed (e.g. executed, etc.) by a logic chip in a stacked memory package.

In one embodiment, the address expansion algorithm may be an addition to the basic logic chip algorithm as shown In FIG. 19-9, for example.

In FIG. 19-10, the address expansion algorithm acts to expand (e.g. augment, add, map, transform, etc.) the address field supplied for example, to a logic chip in a stacked memory package. An address key may be stored in the address key field which may be part of (or may be the entire part of) the address field. The expansion algorithm may use the address key field to lookup an address key stored in a key table. Associated with each address key in the key table may be a key code. The key code may be substituted for the address key by the logic chip.

For example, in FIG. 19-10, the address key is 0011, a 4-bit field. The logic chip looks up 0011 in the key table and retrieves (e.g. extracts, fetches, etc.) the key code 10110111100111100000 (a 16-bit field). The key code is inserted in the expanded address field and thus a 4-bit address (the address key) has effectively been expanded using address expansion to a 16-bit address.

In one embodiment, the address key may be part of an address field.

In one embodiment, the address key may form the entire address field.

In one embodiment, the key code may be part of the expanded address field.

In one embodiment, the key code may for the entire expanded address field.

In one embodiment, the CPU may load the key table at start-up.

In one embodiment, the CPU may use one or more key messages to load the key table.

In one embodiment, the key table may be updated during operation by the CPU.

In one embodiment, the address keys and key codes may be generated by the logic chip.

In one embodiment, the logic chip may use one or more key messages to exchange the key table information with one or more other system components (e.g. CPU, etc.).

In one embodiment, the address keys and key codes may be variable lengths.

In one embodiment, multiple key tables may be used.

In one embodiment, nested key tables may be used.

In one embodiment, the logic chip may perform one or more logical and/or arithmetic operations on the address key and/or key code.

In one embodiment, the logic chip may transform, manipulate or otherwise change the address key and/or key code.

In one embodiment, the address key and/or key code may be encrypted.

In one embodiment, the logic chip may encrypt and/or decrypt the address key and/or key code.

In one embodiment, the address key and/or key code may use a hash function (e.g. MD5 etc.).

Address expansion may be used to address memory in a memory subsystem that may be beyond the address range (e.g. exceed the range, etc.) of the address field(s) in the command set. For example, the basic command set shown In FIG. 19-8, has a read/write command field of 32 bits in the read/write request. It may be advantageous in some system to keep the address fields as small as possible (for protocol efficiency, etc.). However, it may be desired to support memory subsystem that require very large address ranges (e.g. very large address space, etc.). Thus for example, consider a hybrid memory subsystem that may comprise a mix of SDRAM and NAND flash. Such a memory subsystem may be capable of storing a petabyte (PB) or more of data. Addressing such a memory subsystem using a direct address scheme may require an address field of over 50 bits. However, it may be that only a small portion of the memory subsystem uses SDRAM. SDRAM access times (e.g. read access, write access, etc.) are typically much faster (e.g. less time, etc.) than NAND flash access times. Thus one address scheme may use direct addressing for the SDRAM portion of the hybrid memory subsystem and address expansion (from for example, 32 bits to 50 or more bits) for the NAND flash portion of the hybrid memory subsystem. The extra latency involved in performing the address expansion to enable the NAND flash access may be much smaller than the NAND flash device access times.

In one embodiment, the expanded address field may correspond to predefined regions of memory in the memory subsystem.

In one embodiment, the CPU may define the predefined regions of memory in the memory subsystem.

In one embodiment, the logic chip in a stacked memory package may define the predefined regions of memory in the memory subsystem.

In one embodiment, the predefined regions of regions of memory in the memory subsystem may be used for one or more virtual machines (VMs).

In one embodiment, the predefined regions of regions of memory in the memory subsystem may be used for one or more classes of memory access (e.g. real-time access, low priority access, protected access, etc.).

In one embodiment, the predefined regions of regions of memory in the memory subsystem may correspond (e.g. point to, equate to, be resolved as, etc.) different types of memory technology (e.g. NAND flash, SDRAM, etc.).

In one embodiment, the key table may contain additional fields that may be used by the logic chip to store state, data etc. and control such functions as protection of memory, access permissions, metadata, access statistics (e.g. access frequency, hot files and data, etc.), error tracking, cache hints, cache functions (e.g. dirty bits, etc.), combinations of these, etc.

As an option, the address expansion system may be implemented in the context of the architecture and environment of any previous Figure(s) and/or any subsequent Figure(s). Of course, however, the address expansion system may be implemented in the context of any desired environment.

FIG. 19-12

Address Elevation System

FIG. 19-12 shows an address elevation system, in accordance with another embodiment. As an option, the address elevation system may be implemented in the context of the architecture and environment of any previous and/or subsequent Figure(s). Of course, however, the address elevation system may be implemented in any desired environment.

In FIG. 19-12, the address elevation system 19-1200 modifies (e.g. maps, translates, adjusts, recalculates, etc.) from a first memory space (MS1) to a second memory space (MS2). A memory space may be a range of addresses in a memory system.

Address elevation may be used in a variety of ways in systems with, for example, a large memory space provided by one or more stacked memory packages. For example, two systems may wish to communicate and exchange information using a shared memory space.

In FIG. 19-12, a first memory space MS1 may be used to provide (e.g. create, calculate, etc.) a first index. Thus for example, in FIG. 19-12, MS1 address 0x030000 corresponds (e.g. creates, is used to create, etc.) MS1 index 0x03. An index offset may then be used to calculate a table index. Thus for example, in FIG. 19-12, index offset 0x01 is subtracted from MS1 index 0x03 to form table index 0x02. The table index may then be used to lookup an MS2 address in an elevation table. Thus for example, in FIG. 19-12, table index 0x02 is used to lookup (e.g. match, corresponds to, points to, etc.) MS2 address 0x05000.

For example, a system may contain two machines (e.g. two CPU systems, two servers, a phone and desktop PC, a server and an IO device, etc.). Assume the first machine is MA and the second machine is MB. Suppose MA wishes to send data to MB. The memory space MS1 may belong to MA and the memory space MS2 may belong to MB. Machine MA may send machine MB a command C1 (e.g. C1 write request, etc.) that may contain an address field (C1 address field) that may be located (e.g. corresponds to, refers to, etc.) in the address space MS1. Machine MA may be connected (e.g. coupled, etc.) to MB via the memory system of MB for example. Thus command C1 may be received, for example, by one or more logic chips on one or more stacked memory packages in the memory subsystem of MB. The correct logic chip may then perform address elevation to modify (e.g. change, map, adjust, etc.) the address from the address space MS1 (that of machine MA) to the address space MS2 (that of machine MB).

In FIG. 19-12, the elevation table may be loaded using, for example, one or more messages that may contain one or more elevation table entries.

In one embodiment, the CPU may load the elevation table(s).

In one embodiment, the memory space (e.g. MS1, MS2, or MS1 and MS2, etc.) may be the entire memory subsystem and/or memory system.

In one embodiment, the memory space may be one or more parts or (e.g. portions, regions, areas, spaces, etc.) of the memory subsystem.

In one embodiment, the memory space may be the sum (e.g. aggregate, union, collection, etc.) of one or more parts of several memory subsystems. For example, the memory space may be distributed among several systems that are coupled, connected, etc. The systems may be local (e.g. in the same datacenter, in the same rack, etc.) or may be remote (e.g. connected datacenters, mobile phone, etc.).

In one embodiment, there may be more than two memory spaces. For example, there may be three memory spaces: MS1, MS2, and MS3. A first address elevation step may be applied between MS1 and MS2, and a second address elevation step may be applied between MS2 and MS3 for example. Of course any combination of address elevation steps between various memory spaces may be applied.

In one embodiment, one or more address elevation steps may be applied in combination with other address manipulations. For example, address translation may be applied in conjunction with (e.g. together with, as well as, etc.) address elevation.

In one embodiment, one or more functions of the address elevation system may be part of the logic chip in a stacked memory package. For example, MS1 may be the memory space as seen by (e.g. used by, employed by, visible to, etc.) one or more CPUs in a system, and MS2 may be the memory space as present in one or more stacked memory packages.

Separate memory spaces and regions may be maintained in a memory system

As an option, the address elevation system may be implemented in the context of the architecture and environment of any previous Figure(s) and/or any subsequent Figure(s). Of course, however, the address elevation system may be implemented in the context of any desired environment.

FIG. 19-13

Basic Logic Chip Datapath

FIG. 19-13 shows a basic logic chip datapath for a logic chip in a stacked memory package, in accordance with another embodiment. As an option, the basic logic chip datapath may be implemented in the context of the architecture and environment of any previous and/or subsequent Figure(s). Of course, however, the basic logic chip datapath may be implemented in any desired environment.

In FIG. 19-13, the basic logic chip datapath 19-1300 comprises a high-level block diagram of the major components in a logic chip in a stacked memory package. In FIG. 19-13, the basic logic chip datapath 19-1300 comprises (but is not limited to) the following labeled blocks (e.g. elements, circuits, functions, etc.): (1) Pad: the IO pads may couple to high-speed serial links between one or more stacked memory packages in a memory system and one or more CPUs, etc; (2) SER: the serializer may convert data on a wide bus to a narrow high-speed link; (3) DES; the deserializer that may convert data on a narrow high-speed link to a wide bus (the combination of serializer and deserializer may be the PHY layer, usually called SERDES); FIB: the forwarding information base (e.g. forwarding table, etc.) may be used to quickly route (e.g. forward, etc.) incoming packets; (4) RxTxXBAR: the receive/transmit crossbar may be used to route packets between memory system components (e.g. between stacked memory packages, between stacked memory packages and CPU, etc.); (5) RxXBAR: the receive crossbar may be used to route packets intended for the stacked memory package to one or more memory controllers; (6) RxARB: the receive arbiter may contain queues (e.g. FIFOs, register files, SRAM, etc.) for the different types of memory commands and may be responsible for deciding the order (e.g. priority, etc.) that commands are presented to the memory chips; (7) TSV: the through-silicon vias connect the logic chip(s) and the stacked memory chip(s) (e.g. DRAM, SDRAM, NAND flash, etc.); (8) TxFIFO: the transmit arbiter may queue read completions (e.g. data from the DRAM as a result of one or more read requests, etc.) and other packets and/or packet data (e.g. messages, completions, errors, etc.) to be transmitted from the logic chip; (9) TxARB: the transmit arbiter may decide the order in which packets, packet data etc. are transmitted.

In one embodiment, one or more of the functions of the SER, DES, and RxTxXBAR blocks may be combined so that packets may be forwarded as fast as possible without, for example, completing disassembly (e.g. deframing, decapsulation, etc.) of incoming packets before they are sent out again on another link interface, for example.

In one embodiment, one or more of the functions of the RxTxXBAR and RxXBAR blocks may be combined (e.g. merged, overlap, subsumed, etc.).

In one embodiment, one or more of the functions of the TxFIFO, TxARB, RxTxXBAR may be combined.

In FIG. 19-13, the RxXBAR block is shown as a datapath. FIG. 19-13 shows one possible implementation corresponding to an architecture in which the 16 inputs are treated as separate channels. FIG. 19-13 uses the same nomenclature, symbols and blocks as shown, for example, In FIG. 19-6, and FIG. 19-7. As shown In FIG. 19-6, and FIG. 19-7, for example, and as described in the text accompanying these and other figures, other variations are possible. For example, the functions of RxXBAR (or logically equivalent functions etc.) may be combined with the FIB and/or RxTXXBAR blocks for example. Alternatively the functions of RxXBAR (or logically equivalent functions etc.) may be combined with one or more of the functions (or logically equivalent functions etc.) of RxARB.

In FIG. 19-13, the RxXBAR may comprise two crossbar stages. Note that the crossbar shown in parts of FIG. 19-7 (FIG. 19-7(*b*) for example, which may perform a similar logical function to RxXBAR) may comprise a single stage. Thus the RxXBAR crossbar shown In FIG. 19-13, may have more interconnectivity, for example, than the crossbar shown in FIG. 19-7. A crossbar with higher connectivity may be used for example, when it is desired to treat each of the receive lanes (e.g. wire pairs (I[0], I[1], . . . etc.) as individual channels.

In FIG. 19-13, the RxARB block is shown as a datapath. In FIG. 19-13, the RxARB block may contain (but is not limited to) the following blocks and/or functions: (1) DMUXA: the demultiplexer may take requests (e.g. read request, write request, commands, etc.) from the RxXBAR block and split them into priority queues etc; (2) DMUXB: the demultiplexer may take requests from DMUXA and split them by request type; (3) ISOCMDQ: the isochronous command queue may store those commands (e.g. requests, etc.) that correspond to isochronous operations (e.g. real-time, video, etc.); (4) NISOCMDQ: the non-isochronous command queue may store those commands that are not isochronous; (5) DRAMCTL: the DRAM controller may generate commands for the DRAM (e.g. precharge (PRE), activate (ACT), refresh, power down, etc.); (6) MUXA: the multiplexer may combine (e.g. arbitrate between, select according to fairness algorithm, etc.) command and data queues (e.g. isochronous and non-isochronous commands, write data, etc.); MUXB: the multiplexer may combine commands with different priorities (e.g. in different virtual channels, etc.); (7) CMDQARB: the command queue arbiter may be responsible for selecting (e.g. in round-robin fashion, using other fairness algorithm(s), etc.) the order of commands to be sent (e.g. transmitted, presented, etc.) to the DRAM.

In FIG. 19-13, one possible arrangement of commands and priorities has been shown. Other variations are possible.

For example, In FIG. 19-13, commands have been separated to isochronous and non-isochronous. The associated datapaths may be referred to as the isochronous channel (ISO) and non-isochronous channel (NISO). The ISO channel may be used for memory commands associated with processes that require real-time responses or higher priority (e.g. playing video, etc.). The command set may include a flag (e.g. bit field, etc.) in the read request, write request, etc. For example, there may be a bit in the control field in the basic command set shown In FIG. 19-8, that when set (e.g. set equal to 1, etc.) corresponds to ISO commands.

For example, In FIG. 19-13, commands have been separated into three virtual channels: VC0, VC1, VC2. In FIG. 19-13, VC0 corresponds to the highest priority. The function of blocks between DMUXB and MUXA perform arbitration of the ISO and NISO channels. Commands in VC0 bypass (using ARB_BYPASS) the arbitration functions of DMUXB through MUXA. In FIG. 19-13, the ISO commands are assigned to VC1. In FIG. 19-13, the NISO commands are assigned to VC2.

In one embodiment, all commands (e.g. requests, etc.) may be divided into one or more virtual channels.

In one embodiment, all virtual channels may use the same datapath.

In one embodiment, a bypass path may be used for the highest priority traffic (e.g. in order to avoid slower arbitration stages, etc.).

In one embodiment, isochronous traffic may be assigned to one or more virtual channels.

In one embodiment, non-isochronous traffic may be assigned to one or more virtual channels.

FIG. 19-13 shows the functional behavior of the major blocks in a logic chip for a stacked memory package using an example datapath. Other variations are possible that may perform the same or similar or equivalent logic functions but that use different physical components or different logical interconnections of components. For example, the crossbars shown may be merged with one or more other logic blocks and/or functions, etc. For example, the crossbar functions may be located in different positions than that shown In FIG. 19-13, but perform the same logic function (e.g. have the same purpose, result in an equivalent effect, etc.), etc. For example, the crossbars may have different size and constructions depending on the size and types of inputs (e.g. number of links and/or lanes, pairing of links, organization of links and/or lanes, etc.). As an option, the basic logic chip datapath may be implemented in the context of the architecture and environment of any previous Figure(s) and/or any subsequent Figure(s). Of course, however, the basic logic chip datapath may be implemented in the context of any desired environment.

FIG. 19-14

Stacked Memory Chip Data Protection System

FIG. 19-14 shows a stacked memory chip data protection system for a stacked memory chip in a stacked memory package, in accordance with another embodiment. As an option, the stacked memory chip data protection system may be implemented in the context of the architecture and environment of any previous and/or subsequent Figure(s). Of course, however, the stacked memory chip data protection system may be implemented in any desired environment.

In FIG. 19-14, the stacked memory chip data protection system 19-1400 may be operable to provide one or more methods (e.g. systems, schemes, algorithms, etc.) of data protection.

In FIG. 19-14, the stacked memory chip data protection system 19-19-1400 may comprise one or more stacked memory chips. In FIG. 19-14, the memory address space corresponding to the stacked memory chips may be represented as a collection (e.g. group, etc.) of memory cells. In FIG. 19-14, there are 384 memory cells numbered 000 to 383.

In one embodiment, the stacked memory package protection system may operate on a single contiguous memory address range. For example, In FIG. 19-14, the memory protection scheme operates over memory cells 000-255.

In one embodiment, the stacked memory package protection system may operate on one or more memory address ranges.

In FIG. 19-14, memory cells 256 to 319 are assigned to data protection 1 (DP1). In FIG. 19-14, memory cells 320 to 383 are assigned to data protection 2 (DP2).

In FIG. 19-14, the 64 bits of data in cells 128 to 171 is D[128:171]. Data stored in D[128:171] is protected by a first data protection function DP1:1[D] and stored in 8 bits D[272:279]. In FIG. 19-14, the 64 bits of data in stored in D[0:3,16:19, . . . , 256:259] is protected by a second data protection function DP1:2[D] and stored in 8 bits D[288, 295]. Thus area DP1 provides the first and second levels of data protection. Any memory cell in the area D[000:255] is protected by DP1:1 and DP1:2. For example, DP1:1 and DP1:2 may be 64-bit to 72-bit SECDED functions, etc. Of course any number of error detection and/or error correction functions may be used. Of course any type(s) of error correction and/or error detection functions may be used (e.g. ECC, SECDED, Hamming, CRC, MD5, etc.).

In FIG. 19-14, the 64 bits of data protection information DP1 in cells 256 to 319 is protected by a third data protection function DP2:1[DP1] and stored in DP2 in 64 bits D[320:383]. For example, DP2:1 may be a simple copy. Thus area DP2 provides a third level of data protection. Of course any number of levels of data protection may be used.

In one embodiment, the calculation of protection data may be performed by one or more logic chips that are part of one or more stacked memory packages.

In one embodiment, the detection of data errors may be performed by one or more logic chips that are part of one or more stacked memory packages.

In one embodiment, the type, areas, functions, levels of data protection may be changed during operation.

In one embodiment, the detection of one or more data errors using one or more data protection schemes in a stacked memory package may result in the scheduling of one or more repair operations. For example, the dynamic sparing system shown In FIG. 19-4, and described in the accompanying text may be used effectively with the stacked memory chip data protection system of FIG. 19-14.

As an option, the stacked memory chip data protection system may be implemented in the context of the architecture and environment of any previous Figure(s) and/or any subsequent Figure(s). Of course, however, the stacked memory chip data protection system may be implemented in the context of any desired environment.

FIG. 19-15

Power Management System

FIG. 19-15 shows a power management system for a stacked memory package, in accordance with another embodiment. As an option, the power management system may be implemented in the context of the architecture and environment of any previous and/or subsequent Figure(s). Of course, however, the power management system may be implemented in any desired environment.

FIG. 19-15 shows the functions of a stacked memory package (including one or more logic chips and one or more stacked memory chips, etc.). FIG. 19-15 shows a similar architecture to that shown In FIG. 19-13, and as described in the text accompanying FIG. 19-13. FIG. 19-15 uses the same symbols, nomenclature, blocks, circuits, functions etc. as described elsewhere herein.

In FIG. 19-15, the power management system 19-1500 comprises 6 areas (e.g. circuits, functions, blocks, etc.) whose operations (e.g. functions, behavior, properties, etc.) may be power managed.

In FIG. 19-15, the DES block is part of the PHY layer that may include or be a part of one or more of the following blocks: IO pads, SERDES, IO macros, etc. In FIG. 19-15, the DES blocks are connected to a crossbar PHYXBAR. In FIG. 19-15, there are 15 DES blocks: four ×1 DES blocks, four ×2 DES blocks, two ×8 DES blocks, one ×16 DES block. In FIG. 19-15, the 16 receive pairs I[0:15] are inputs to the PHYXBAR block, The outputs of the PHYXBAR block connect the inputs I[0:15] to the DES blocks as follows: (1) I[0] and I[1] connect to two (of the four total) ×1 DES blocks; (2) I[2:3] treated as a pair of wire pairs (e.g. 4 wires) connect to one of the ×2 DES blocks; (3) I[4:7] treated as four wire pairs (e.g. 8 wires) connect to one of the ×4 DES blocks; (4) I[8:15] treated as eight wire pairs (e.g. 16 wires) connect to one of the ×8 DES blocks.

In FIG. 19-15, by constructing the DES block (and thus PHY layer) as a group (e.g. collection, etc.) of variably sized receiver (and transmitter) blocks the power may be managed. Thus for example, if a full bandwidth mode is required all inputs (16 wire pairs) may be connected to the ×16 DES block. If a low power mode is required only I[0] may be connected to one of the ×1 DES blocks.

In FIG. 19-15, one particular arrangement of DES blocks has been shown (e.g. four ×1, four ×2, four ×4, two ×8, 1×16). Of course any number and arrangements of DES blocks may be used.

In FIG. 19-15, only the DES blocks have been shown in detail. A similar architecture (e.g. structure, circuits, etc.) may be used for the SER blocks.

In FIG. 19-15, the DES blocks have been shown as separate (e.g. the four ×1 blocks have been shown as separate from the ×2, ×4, ×8, and ×16 blocks, etc.). In practice it may be possible to share much (e.g. most, the majority, etc.) of circuits between DES blocks. Thus, for example, the ×16 DES block may be viewed as effectively comprising sixteen ×1 blocks. The sixteen ×1 blocks may then be grouped (e.g. assembled, connected, configured, reconfigured, etc.) to form combinations of ×1, ×2, ×4, ×8 and ×16 blocks (subject to the limitation that the sum (e.g. aggregation, total, etc.) of the blocks is equivalent to no more than a ×16, etc.).

In FIG. 19-15, the RxXBAR is shown as comprising two stages. The detailed view of the RxXBAR crossbar In FIG. 19-15, has been simplified to show the datapth as one large path (e.g. one large bus, etc.) at this point. Of course other variations are possible (as shown In FIG. 19-13, for example). In the detailed view of the RxXBAR In FIG. 19-15, there are two paths shown: P1, P2. In FIG. 19-15, P2 may be a bypass path. The bypass path P2 may be activated (e.g. connected using a MUX/DEMUX etc.) when it is desired to achieve lower latency and/or save power by bypassing one or more crossbars. The trade off may be that the interconnectivity (e.g. numbers, types, permutations of connections, etc.) may be reduced when path P2 is used, etc.

In FIG. 19-15, the RxARB is shown as comprising three virtual channels (VCs): VC0, VC1, VC2. In FIG. 19-15, the inputs to the RxARB are VC0:1, VC1:1, VC2:1. In FIG. 19-15, the outputs from the RxARB are VC0:2, VC1:2, VC2:2. In order to save power the number of VCs may be reduced. Thus for example, as shown in FIG. 19-15, VC0:1 may be mapped (e.g. connected, etc.) to VC1:2; and both VC1:1 and VC2:1 may be mapped to VC2:2. This may allow VC0 to be shut down for example, (i.e. disabled, place in low power state, disconnected, etc.). Of course other mappings and/or connections are possible. Of course other paths, channels, and/or architectures may be used (e.g. ISO and NISO channels, bypass paths, etc.). VC mapping and/or other types/forms of channel mapping may also be used to configure latency, performance, bandwidth, response times, etc. in addition to use for power management.

In FIG. 19-15, the DRAM is shown with two alternative timing diagrams. In the first timing diagram a command CMD (e.g. read request) at time t1 is followed by a response Data (e.g. read completion, etc.) at time t2. In FIG. 19-15, this may correspond to normal (e.g. non power-managed, etc.) behavior (e.g. normal functions, operation, etc.). In the second timing diagram the command CMD at t3 is followed by an enable signal EN at t4. For example, this second timing diagram may correspond to a power-managed state. In one or more power-managed states the logic chip may, for example, place one or more stacked memory chips (e.g. DRAM, etc.) in a power-managed state (e.g. CKE registered low, precharge power-down, active power-down/slow exit, active power-down/fast exit, sleep, etc.). In a power-managed state the DRAM may not respond within the same time as if the DRAM is not in a power-managed state. If one or more DRAMs is in one or more of the power-managed states it may be required to assert one or more enable signals (e.g. CKE, select, control, enable, etc.) to change the DRAM state(s) (e.g. wake up, power up, change state, change mode, etc.). In FIG. 19-15, one or more such enable signals may be asserted at time t4. In FIG. 19-15, assertion of EN at t4 is followed by a response Data (e.g. read completion, etc.) at time t5. Typically t2−t1>t5−t3. Thus, for example, the logic chip in a stacked memory package may place one or more DRAMs in one or more power-managed states to save power.

In one embodiment, the logic chip may reorder commands to perform power management.

In one embodiment, the logic chip may assert CKE to perform power management.

In FIG. 19-15, the TxFIFO is shown connected to DRAM memory chips D0, D1, D2, D3. In FIG. 19-15, the connections between D0, D1, D2, D3 and the TxFIFO have been drawn in such a way as to schematically represent different modes of connection. For example, in a high-power, high-bandwidth mode of connection DRAM D0 and D1 may simultaneously (e.g. together, at the same time, at nearly the same time, etc.) send (e.g. transmit, provide, supply, connect, etc.) read data to the TxFIFO. For example, D0 may send 64 bits of data in 10 ns to the TxFIFO in parallel D1 may send 64 bits of data in the same time period (e.g. 128 bits per 10 ns). For example, in a low-power mode D2 may send 64 bits in 10 ns and then in the following 10 ns send another 64 bits (128 bits per 20 ns). Other variations are possible. For example, banks and/or subbanks and/or echelons etc. need only be accessed when ready to send more than one chunk of data (e.g. more than one access may be chained, etc.). For example, clock speeds and data rates may be modulated (e.g. changed, divided, multiplied, increased, decreased, etc.) to achieve the same or similar effects to data transfer as that described, etc. For example, the same or similar techniques may be used in the read path (e.g. RxARB, etc.).

In FIG. 19-15, the RxTxXBAR is shown in detail as an 8×8 portion of a larger crossbar (e.g. the 16×16 crossbar shown In FIG. 19-6, and as described in the text accompanying that figure may be suitable, etc.). In FIG. 19-15, the inputs to the RxTxXBAR are shown as I[0:7] and the outputs as O[8:15]. The 8×8 crossbar shown In FIG. 19-15, may thus represent the upper right-hand quadrant of a 16×16 crossbar. In FIG. 19-15, there are two patterns shown for possible connection points. The solid dots represent (possibly part of) connection point set X1. The hollow dots represent (possibly part of) connection point set X2. Connection sets X1 and X2 may provide different interconnectivity options (e.g. number of connections, possible permutations of connections, increased directionality of connections, lower power paths, etc.).

In one embodiment, connections sets (e.g. X1, X2, etc.) may be programmed by the system.

In one embodiment, one or more crossbars or logic structures that perform an equivalent function to a crossbar etc. may use connection sets.

In one embodiment, connections sets may be used for power management.

In one embodiment, connection sets may be used to alter connectivity in a part of the system outside the crossbar or outside the equivalent crossbar function.

In one embodiment, connections sets may be used in conjunction with dynamic configuration of one or more PHY layers blocks (e.g. SERDES, SER, DES, etc.).

In one embodiment, one or more connections sets may be used with dynamic sparing. For example, if a spare stacked memory chip is to be brought into use (e.g. scheduled to be used as a result of error(s), etc.) a different connection set may be employed for one or more of the crossbars (or equivalent functions) in one or more of the logic chip(s) in a stacked memory package.

In FIG. 19-15, the power management system applied to the major blocks in a basic logic chip datapath and collection of stacked memory chips. Other variations are possible. For example, the power-management techniques described may be combined into one or more power modes. Thus an aggressive power mode (e.g. hibernate etc.) may apply all or nearly all power saving techniques etc. while a minimal power saving mode (e.g. snooze, etc.) may only apply the least aggressive power saving techniques etc.

As an option, the power management system may be implemented in the context of the architecture and environment of any previous Figure(s) and/or any subsequent Figure(s). Of course, however, the power management system may be implemented in the context of any desired environment.

The capabilities of the various embodiments of the present invention may be implemented in software, firmware, hardware or some combination thereof.

As one example, one or more aspects of the various embodiments of the present invention may be included in an article of manufacture (e.g. one or more computer program products) having, for instance, computer usable media. The media has embodied therein, for instance, computer readable program code means for providing and facilitating the capabilities of the various embodiments of the present invention. The article of manufacture can be included as a part of a computer system or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; and U.S. Provisional Application No. 61/569,107, filed Dec. 9, 2011, titled "SYSTEM, METHOD, AND COMPUTER PROGRAM PRODUCT FOR IMPROVING MEMORY SYSTEMS". Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section III

The present section corresponds to U.S. Provisional Application No. 61/585,640, titled "SYSTEM, METHOD, AND COMPUTER PROGRAM PRODUCT FOR IMPROVING MEMORY SYSTEMS," filed Jan. 11, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

Figures 1, 20:
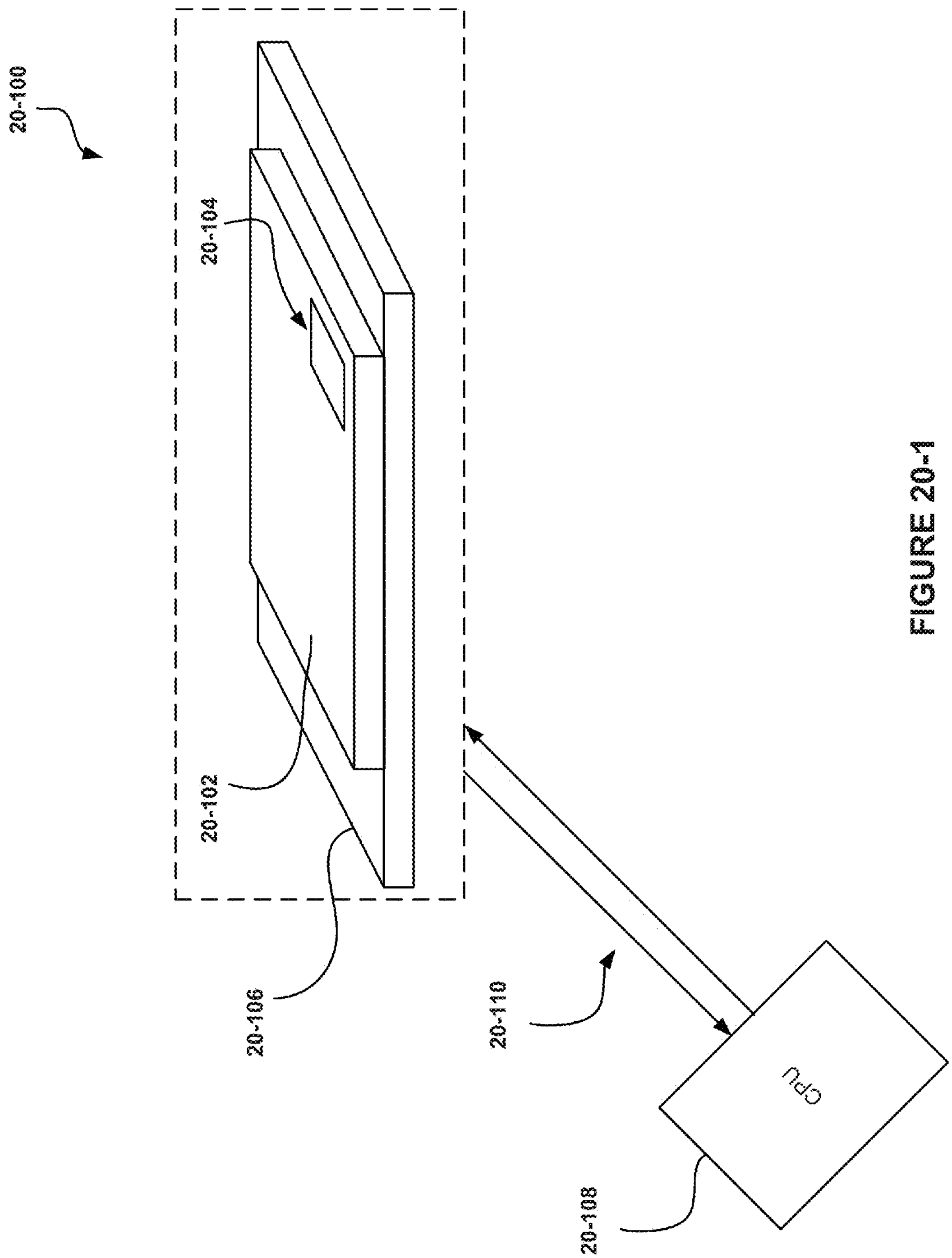
Figures 2, 20:
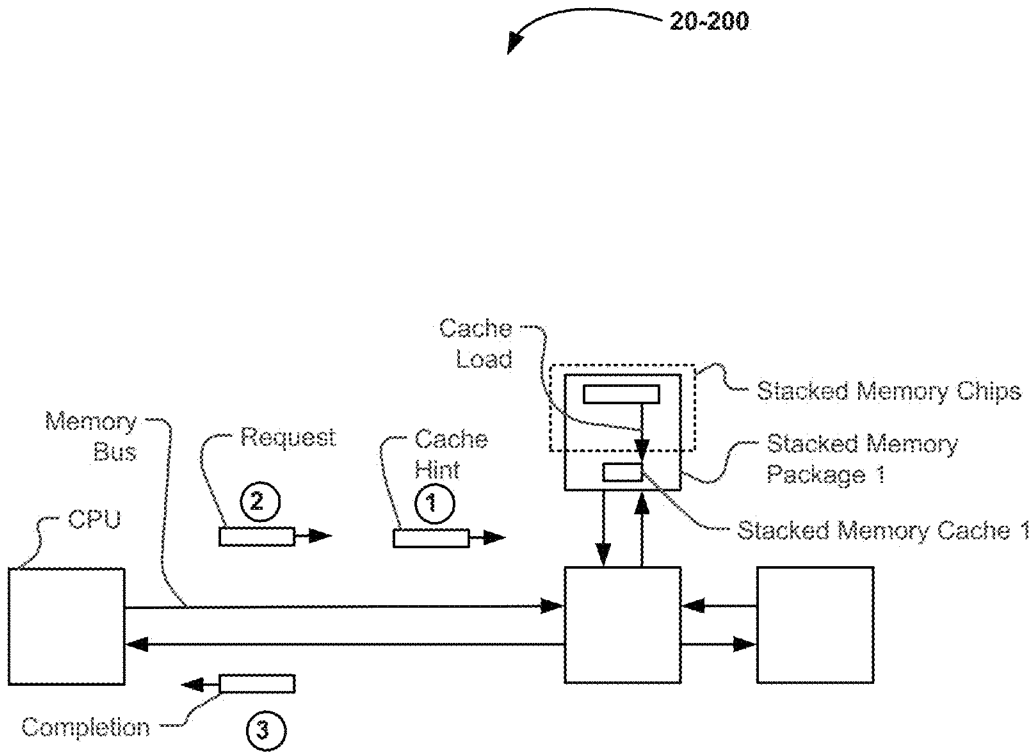
Figures 3, 20:
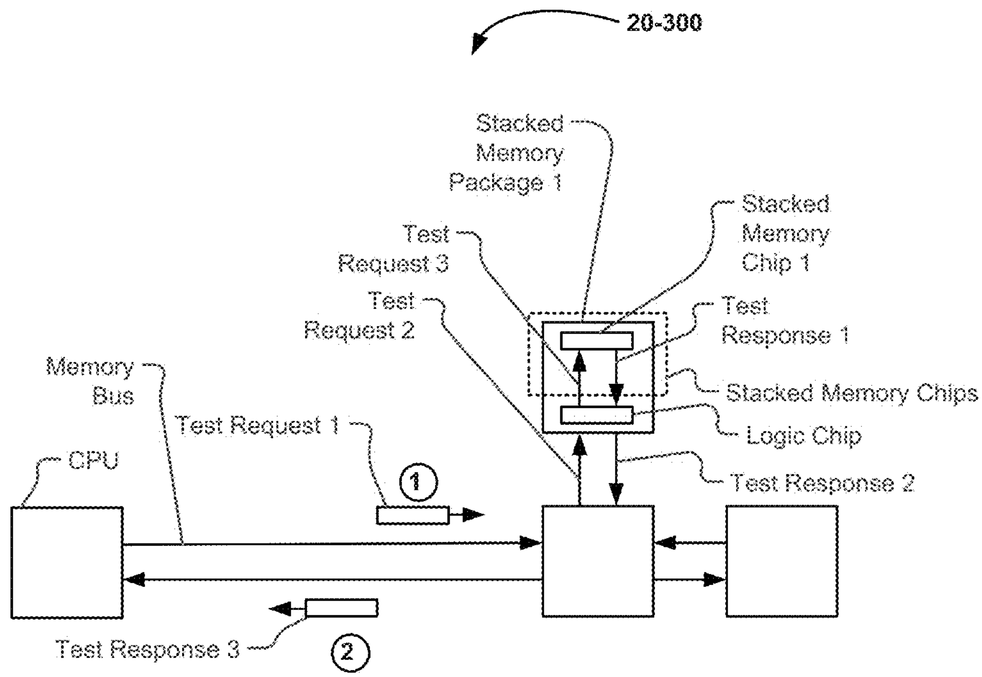
Figures 4, 20:
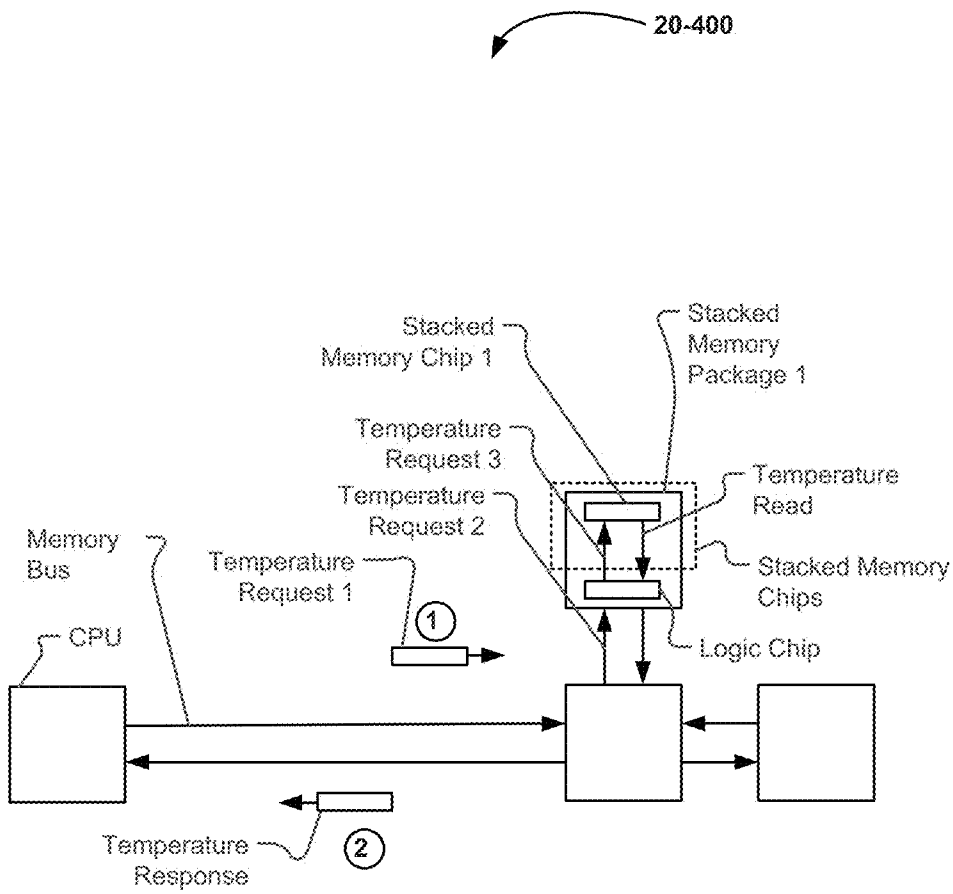
Figures 5, 20:
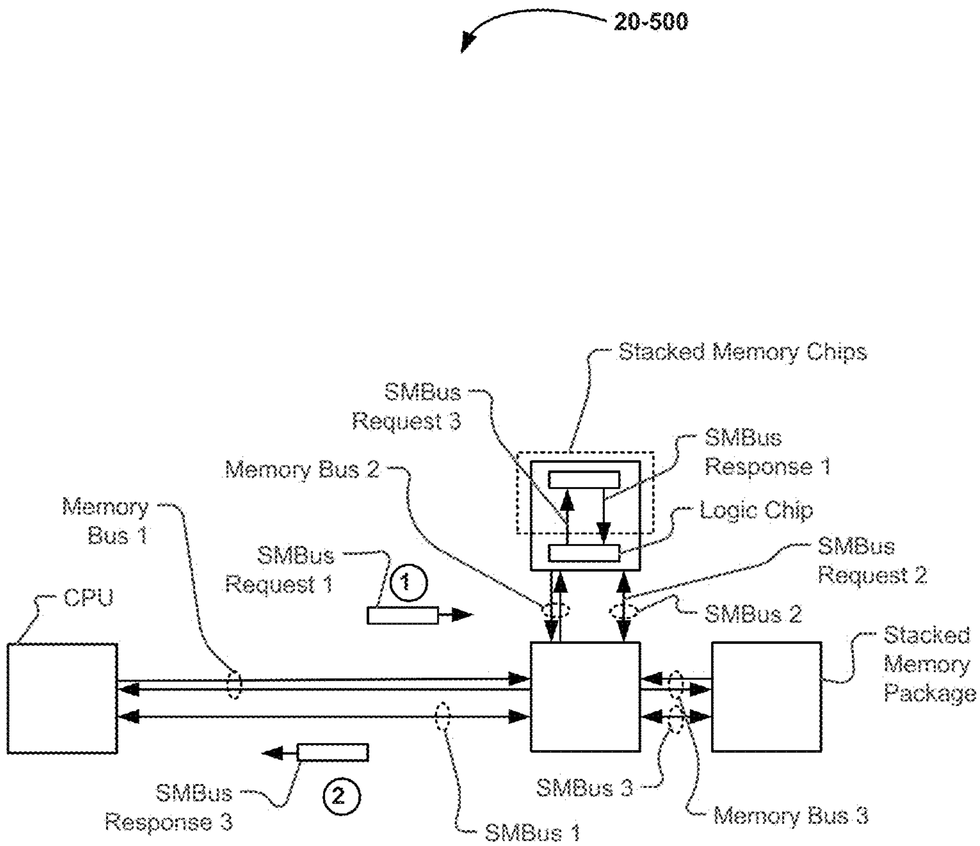
Figures 6, 20:
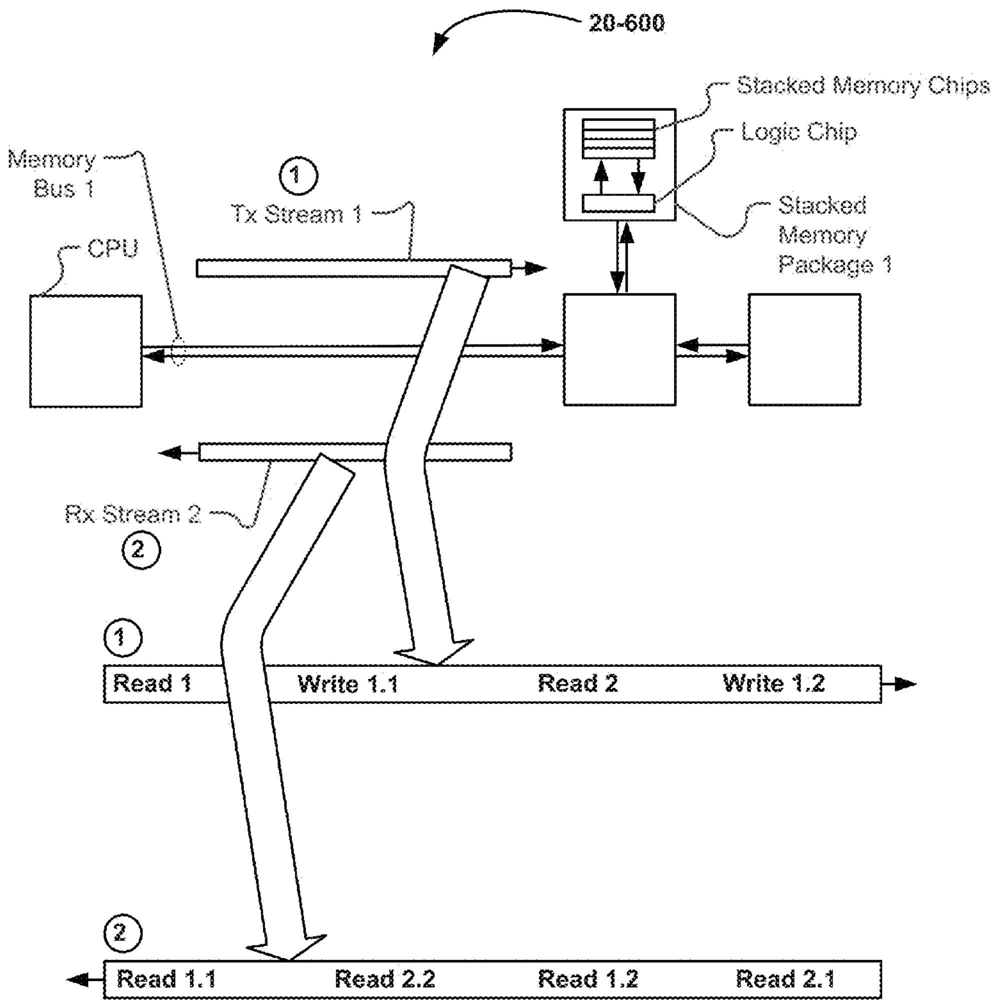
Figures 7, 20:
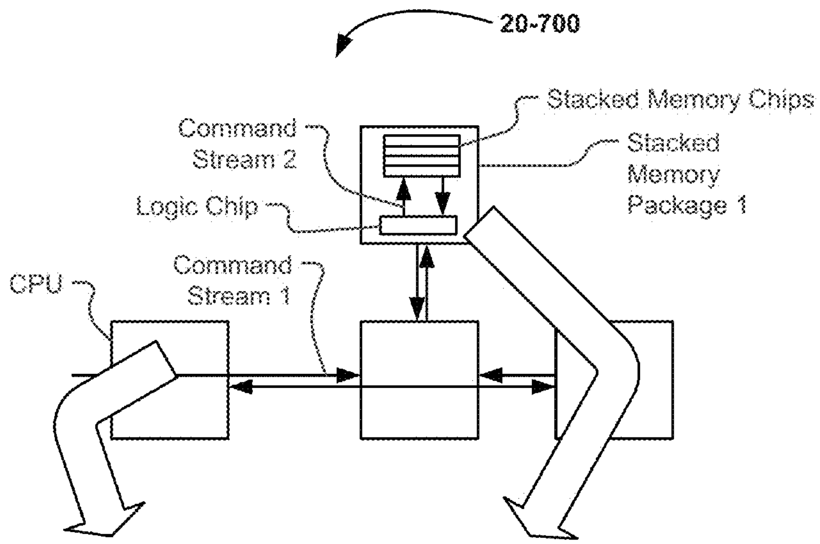
Figures 8, 20:
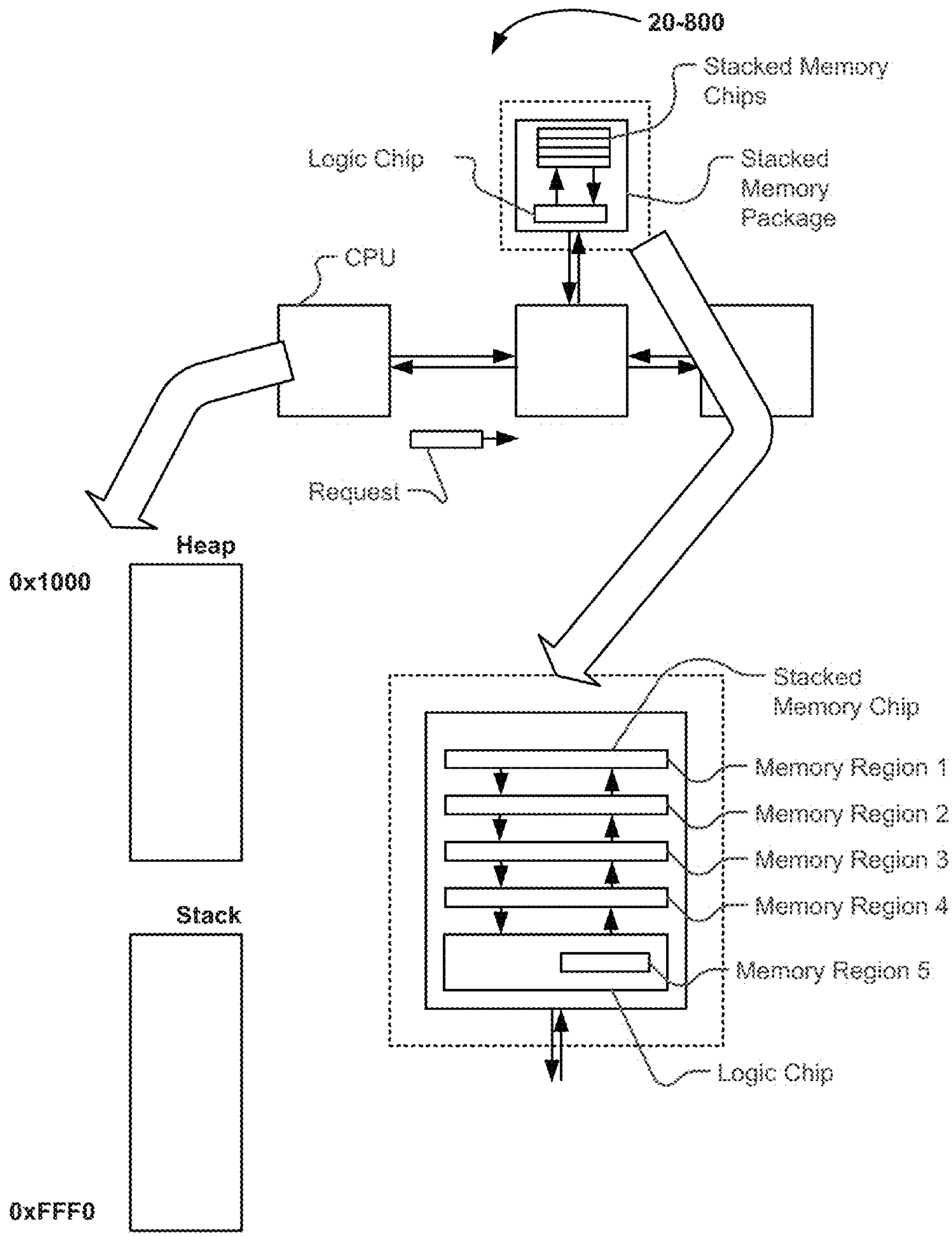
Figures 9, 20:
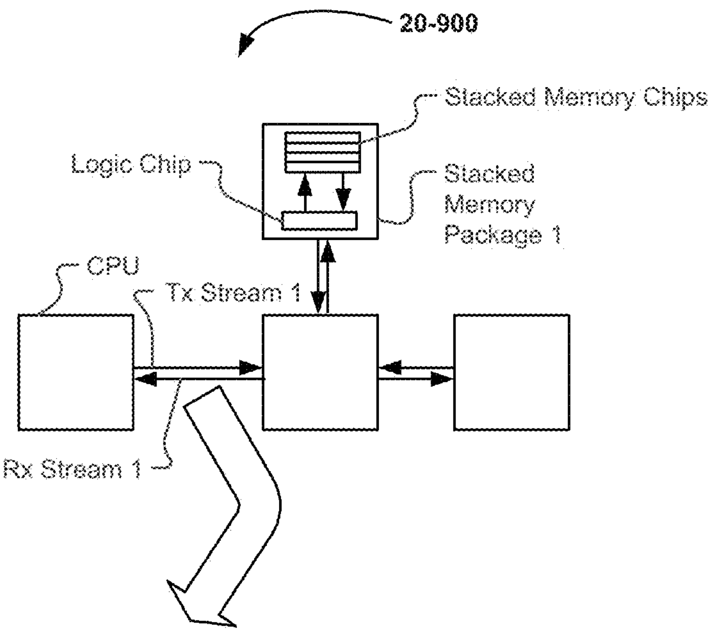
Figures 10, 20:
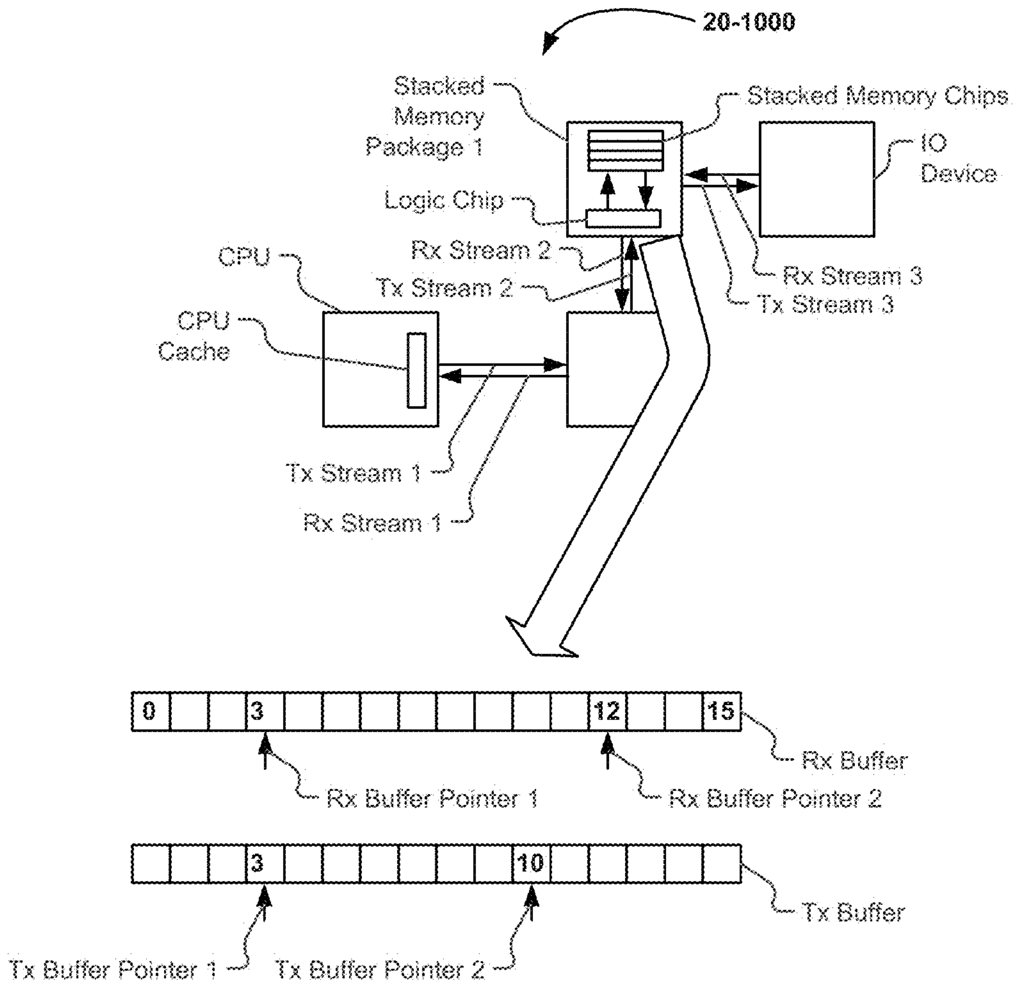
Figures 11, 20:
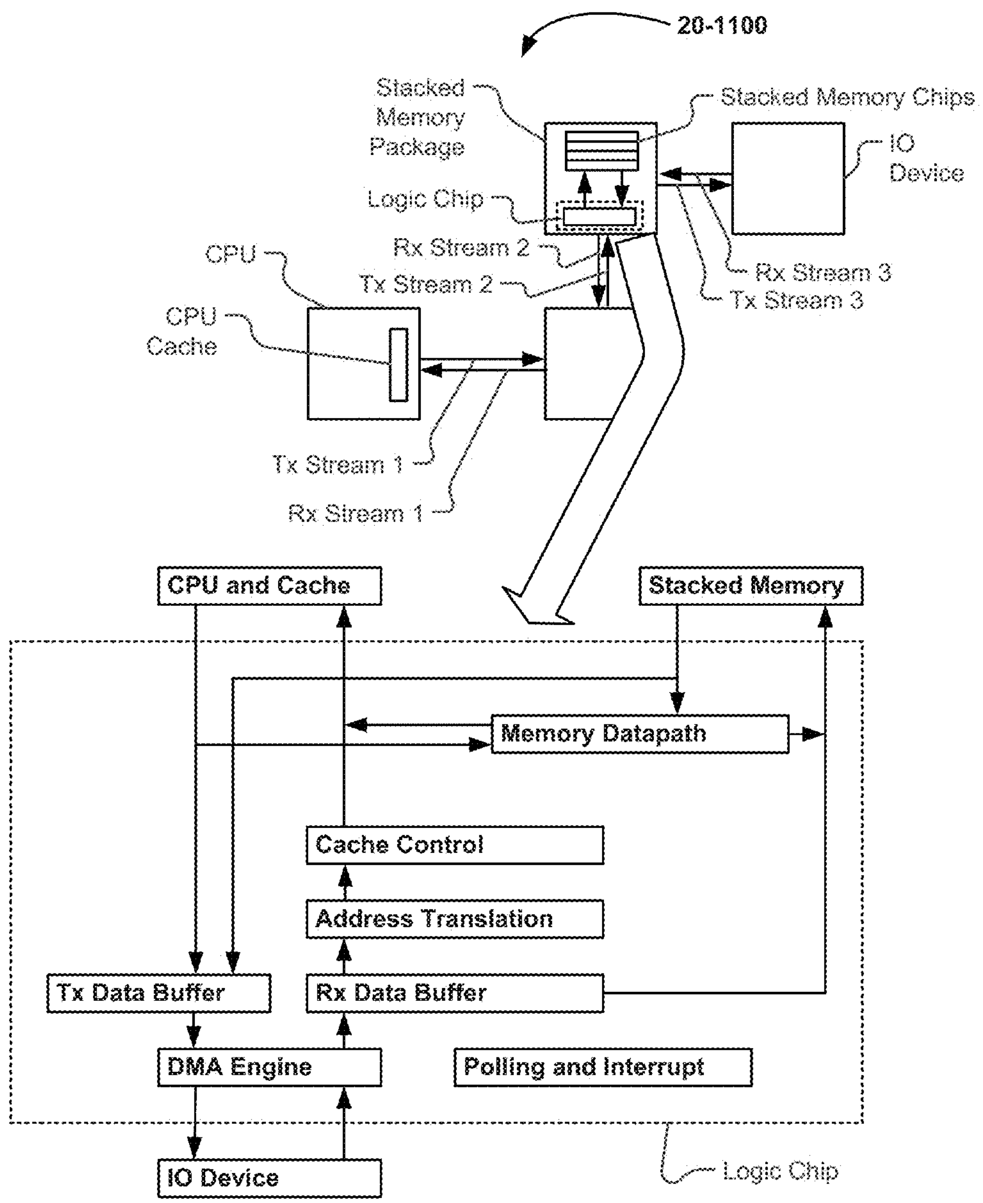
Figures 12, 20:
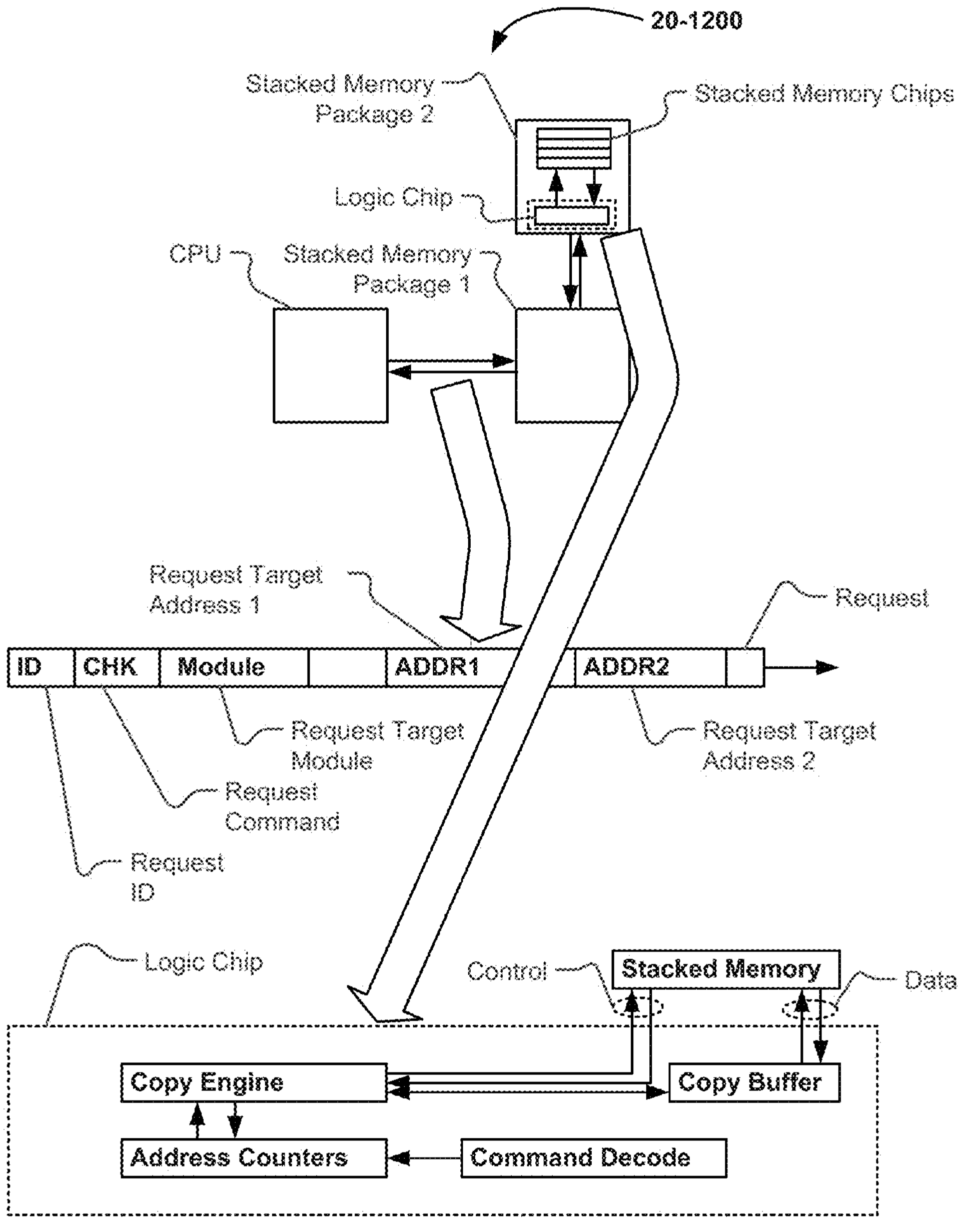
Figures 13, 20:
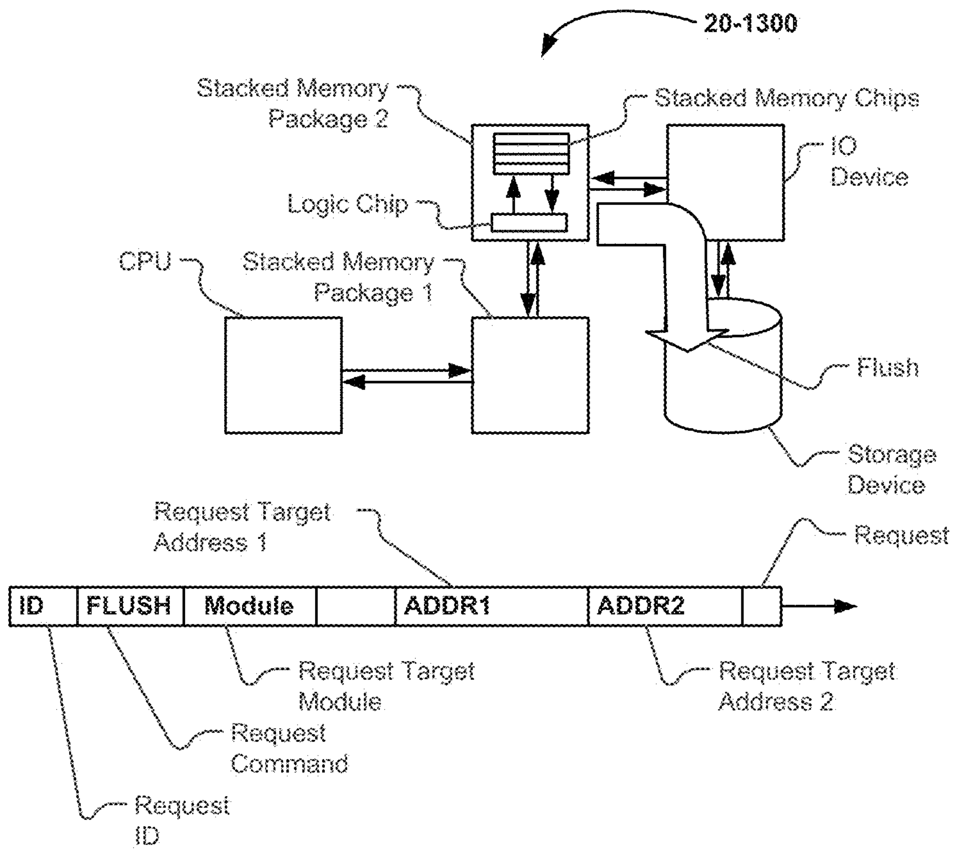
Figures 14, 20:
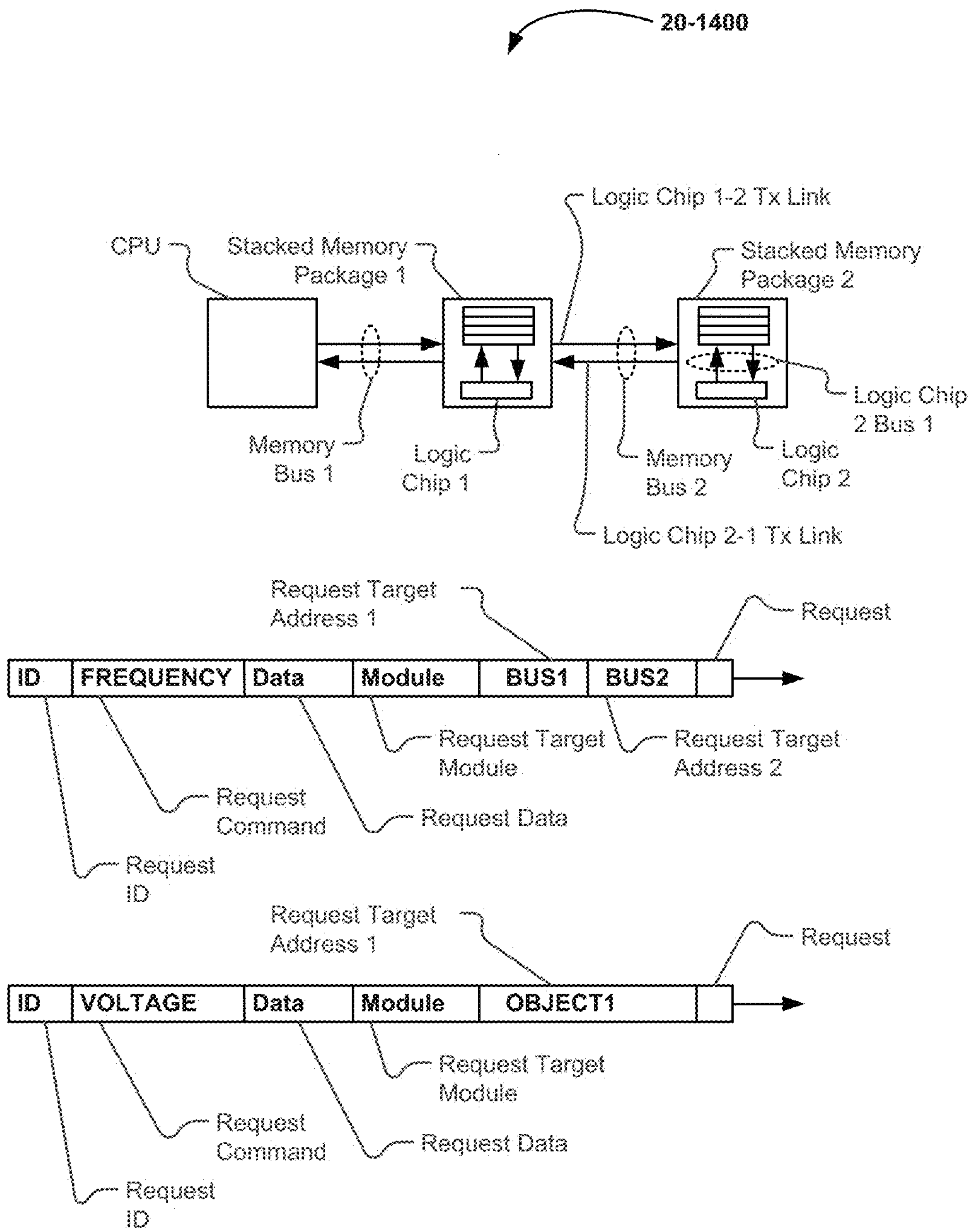
Figures 15, 20:
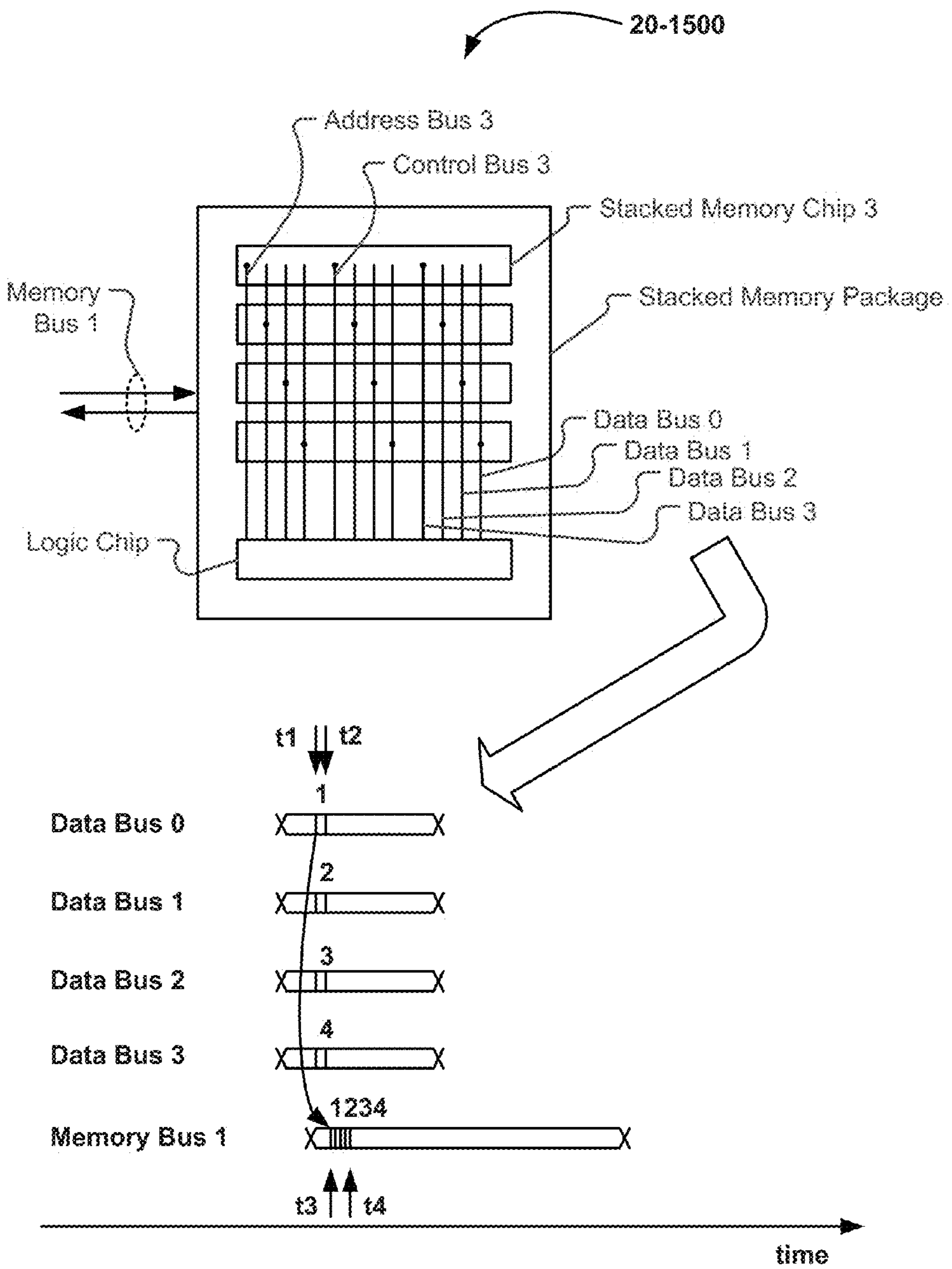
Figures 16, 20:
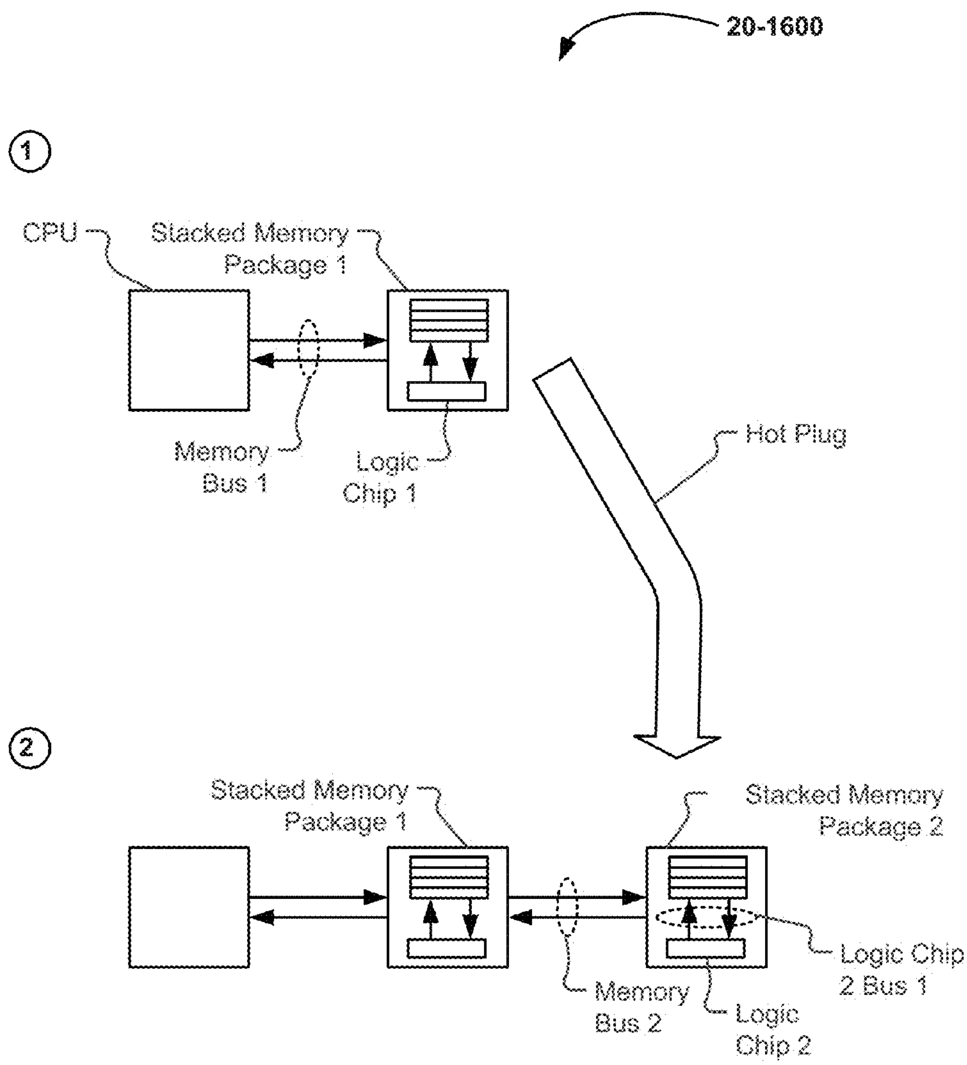
Figures 17, 20:
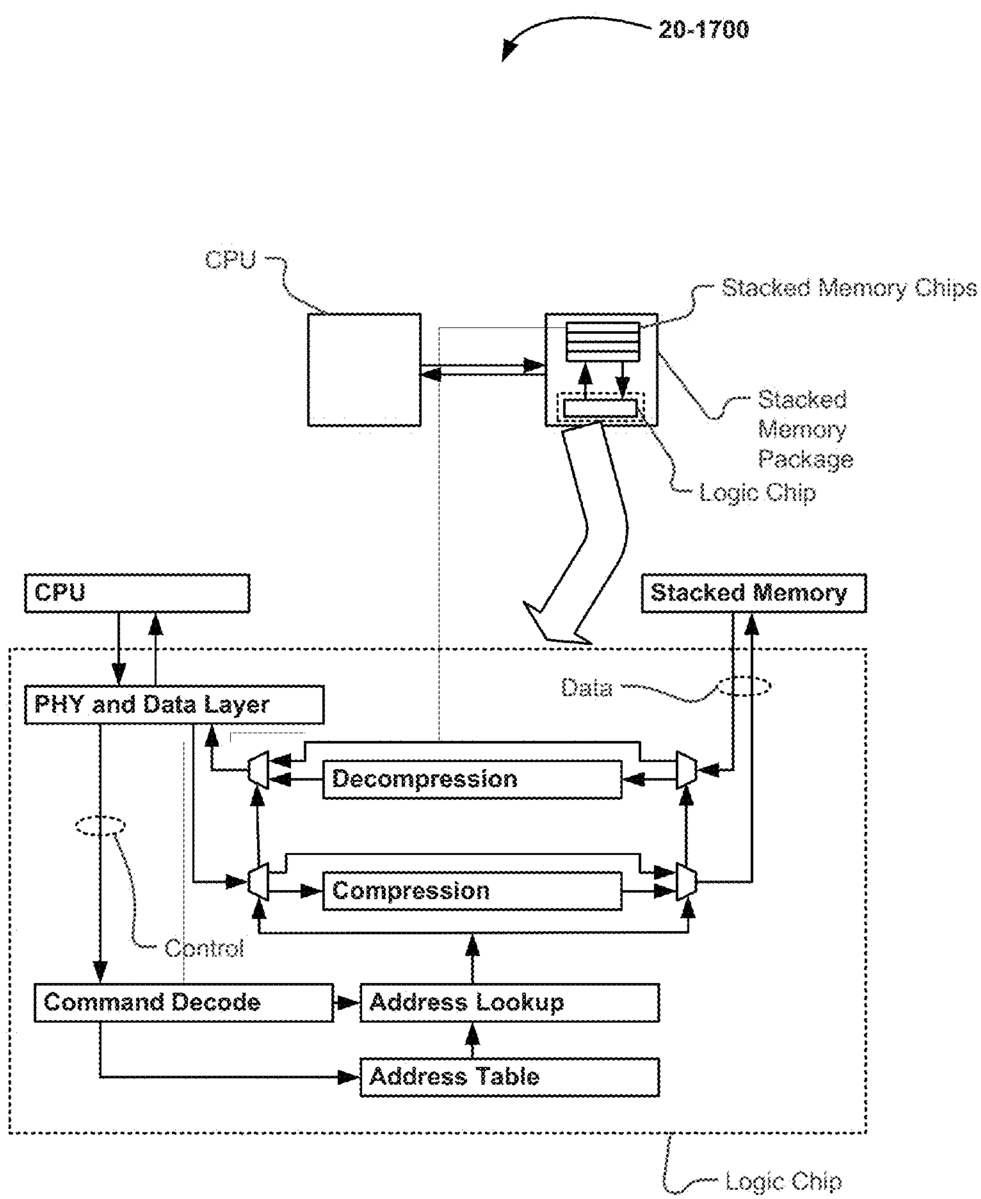
Figures 18, 20:
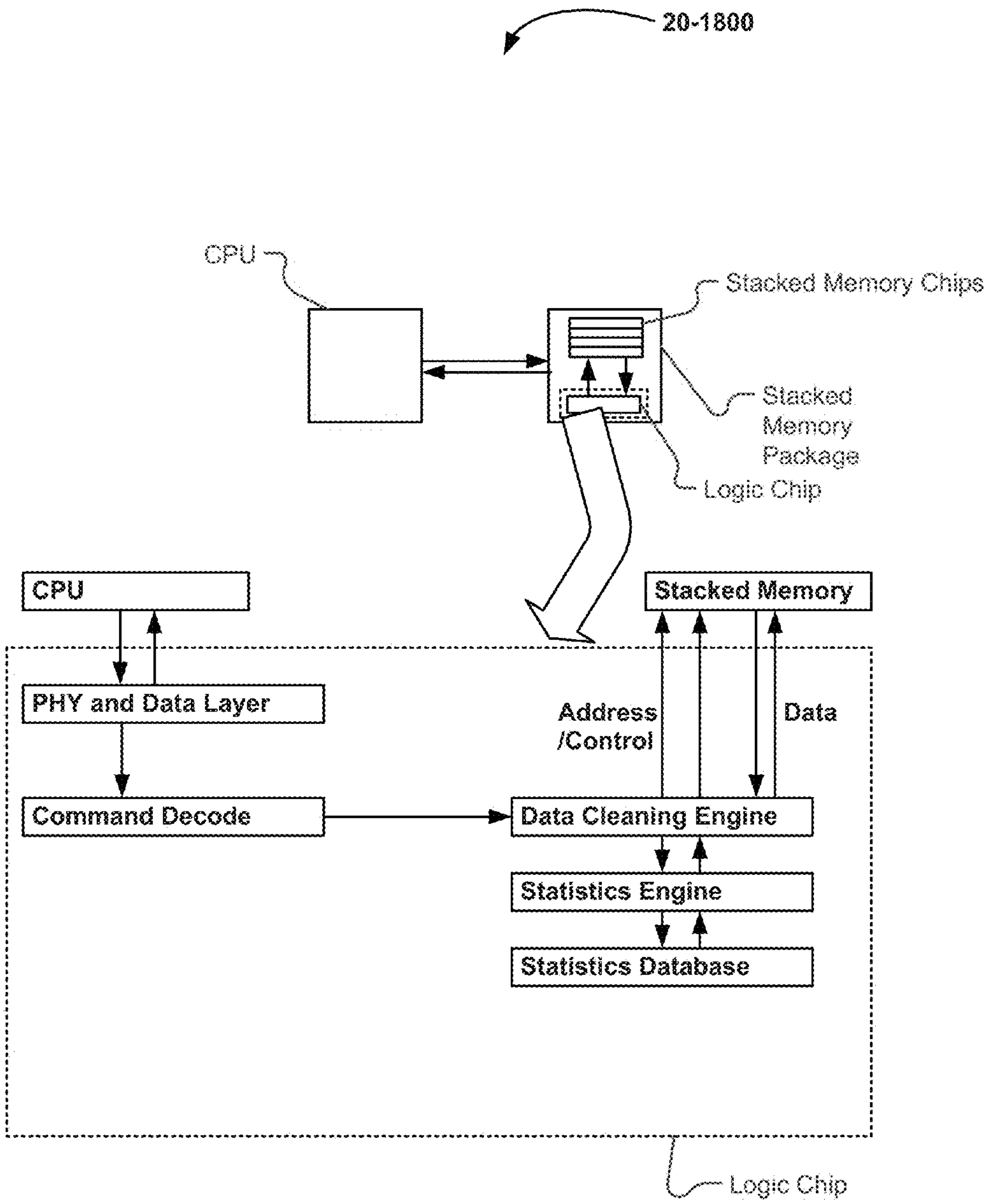
Figures 19, 20:
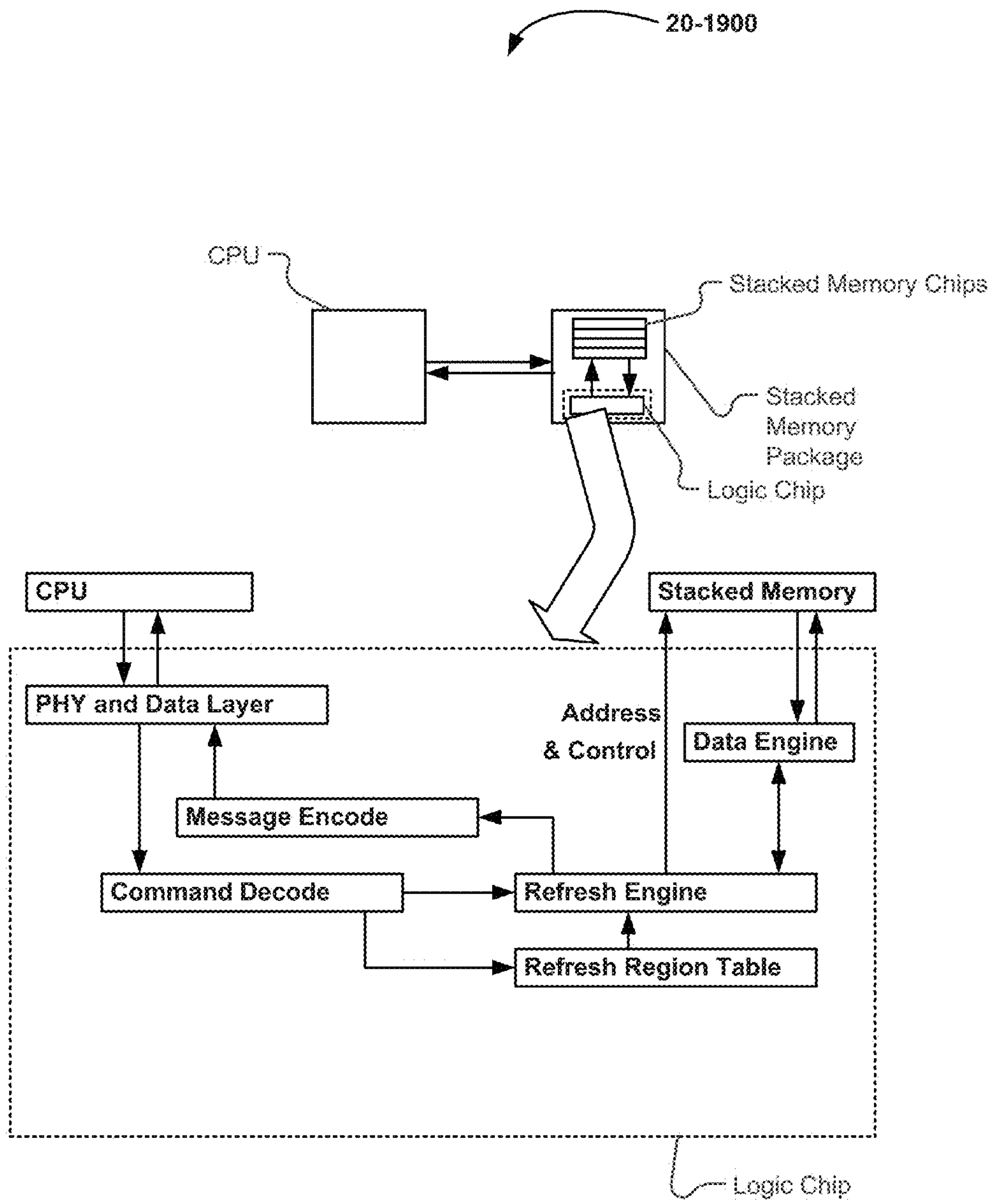
Figure 20:
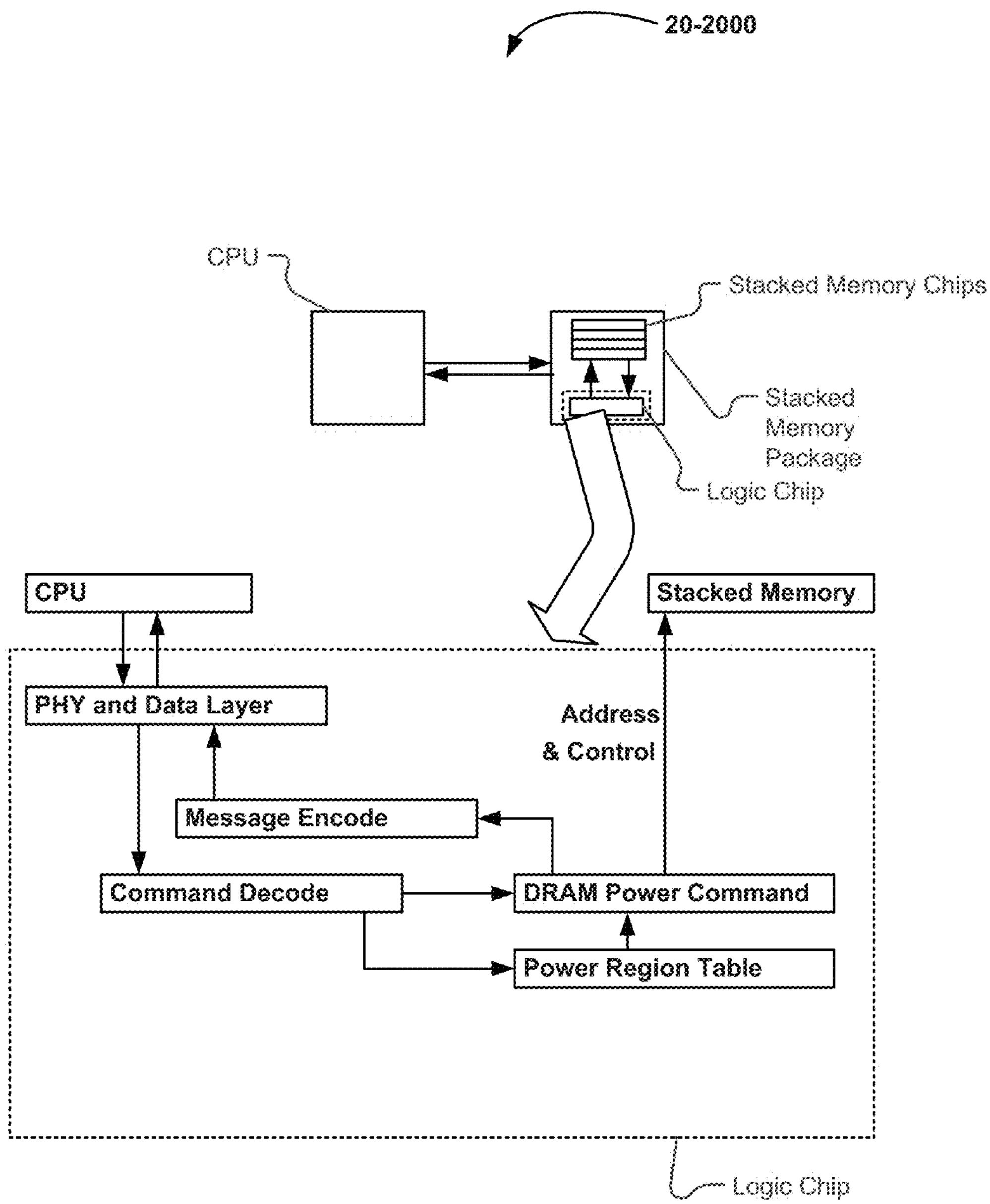

In this description there may be multiple figures that depict similar structures with similar parts or components. Thus, as an example, to avoid confusion an Object in FIG. 20-1 may be labeled "Object (1)" and a similar, but not identical, Object in FIG. 20-2 is labeled "Object (2)", etc. Again, it should be noted that use of such convention, by itself, should not be construed as somehow limiting such terms: beyond any given definition, and/or to any specific embodiments disclosed herein, etc.

In the following detailed description and in the accompanying drawings, specific terminology and images are used in order to provide a thorough understanding. In some instances, the terminology and images may imply specific details that are not required to practice all embodiments. Similarly, the embodiments described and illustrated are representative and should not be construed as precise representations, as there are prospective variations on what is disclosed that may be obvious to someone with skill in the art. Thus this disclosure is not limited to the specific embodiments described and shown but embraces all prospective variations that fall within its scope. For brevity, not all steps may be detailed, where such details will be known to someone with skill in the art having benefit of this disclosure.

Memory devices with improved performance are required with every new product generation and every new technology node. However, the design of memory modules such as DIMMs becomes increasingly difficult with increasing clock frequency and increasing CPU bandwidth requirements yet lower power, lower voltage, and increasingly tight space constraints. The increasing gap between CPU demands and the performance that memory modules can provide is often called the "memory wall". Hence, memory modules with improved performance are needed to overcome these limitations.

Memory devices (e.g. memory modules, memory circuits, memory integrated circuits, etc.) may be used in many applications (e.g. computer systems, calculators, cellular phones, etc.). The packaging (e.g. grouping, mounting, assembly, etc.) of memory devices may vary between these different applications. A memory module may use a common packaging method that may use a small circuit board (e.g. PCB, raw card, card, etc.) often comprised of random access memory (RAM) circuits on one or both sides of the memory module with signal and/or power pins on one or both sides of the circuit board. A dual in-line memory module (DIMM) may comprise one or more memory packages (e.g. memory circuits, etc.). DIMMs have electrical contacts (e.g. signal pins, power pins, connection pins, etc.) on each side (e.g. edge etc.) of the module. DIMMs may be mounted (e.g. coupled etc.) to a printed circuit board (PCB) (e.g. motherboard, mainboard, baseboard, chassis, planar, etc.). DIMMs may be designed for use in computer system applications (e.g. cell phones, portable devices, hand-held devices, consumer electronics, TVs, automotive electronics, embedded electronics, lap tops, personal computers, workstations, servers, storage devices, networking devices, network switches, network routers, etc.). In other embodiments different and various form factors may be used (e.g. cartridge, card, cassette, etc.).

Example embodiments described in this disclosure may include computer system(s) with one or more central processor units (CPU) and possibly one or more I/O unit(s) coupled to one or more memory systems that contain one or more memory controllers and memory devices. In example embodiments, the memory system(s) may include one or more memory controllers (e.g. portion(s) of chipset(s), portion(s) of CPU(s), etc.). In example embodiments the memory system(s) may include one or more physical memory array(s) with a plurality of memory circuits for storing information (e.g. data, instructions, state, etc.).

The plurality of memory circuits in memory system(s) may be connected directly to the memory controller(s) and/or indirectly coupled to the memory controller(s) through one or more other intermediate circuits (or intermediate devices e.g. hub devices, switches, buffer chips, buffers, register chips, registers, receivers, designated receivers, transmitters, drivers, designated drivers, re-drive circuits, circuits on other memory packages, etc.).

Intermediate circuits may be connected to the memory controller(s) through one or more bus structures (e.g. a multi-drop bus, point-to-point bus, networks, etc.) and which may further include cascade connection(s) to one or more additional intermediate circuits, memory packages, and/or bus(es). Memory access requests may be transmitted from the memory controller(s) through the bus structure(s). In response to receiving the memory access requests, the memory devices may store write data or provide read data. Read data may be transmitted through the bus structure(s) back to the memory controller(s) or to or through other components (e.g. other memory packages, etc.).

In various embodiments, the memory controller(s) may be integrated together with one or more CPU(s) (e.g. processor chips, multi-core die, CPU complex, etc.) and/or supporting logic (e.g. buffer, logic chip, etc.); packaged in a discrete chip (e.g. chipset, controller, memory controller, memory fanout device, memory switch, hub, memory matrix chip, northbridge, etc.); included in a multi-chip carrier with the one or more CPU(s) and/or supporting logic and/or memory chips; included in a stacked memory package; combinations of these; or packaged in various alternative forms that match the system, the application and/or the environment and/or other system requirements. Any of these solutions may or may not employ one or more bus structures (e.g. multidrop, multiplexed, point-to-point, serial, parallel, narrow and/or high-speed links, networks, etc.) to connect to one or more CPU(s), memory controller(s), intermediate circuits, other circuits and/or devices, memory devices, memory packages, stacked memory packages, etc.

A memory bus may be constructed using multi-drop connections and/or using point-to-point connections (e.g. to intermediate circuits, to receivers, etc.) on the memory modules. The downstream portion of the memory controller interface and/or memory bus, the downstream memory bus, may include command, address, write data, control and/or other (e.g. operational, initialization, status, error, reset, clocking, strobe, enable, termination, etc.) signals being sent to the memory modules (e.g. the intermediate circuits, memory circuits, receiver circuits, etc.). Any intermediate circuit may forward the signals to the subsequent circuit(s) or process the signals (e.g. receive, interpret, alter, modify, perform logical operations, merge signals, combine signals, transform, store, re-drive, etc.) if it is determined to target a downstream circuit; re-drive some or all of the signals without first modifying the signals to determine the intended receiver; or perform a subset or combination of these options etc.

The upstream portion of the memory bus, the upstream memory bus, returns signals from the memory modules (e.g. requested read data, error, status other operational information, etc.) and these signals may be forwarded to any subsequent intermediate circuit via bypass and/or switch circuitry or be processed (e.g. received, interpreted and re-driven if it is determined to target an upstream or downstream hub device and/or memory controller in the CPU or CPU complex; be re-driven in part or in total without first interpreting the information to determine the intended recipient; or perform a subset or combination of these options etc.).

In different memory technologies portions of the upstream and downstream bus may be separate, combined, or multiplexed; and any buses may be unidirectional (one direction only) or bidirectional (e.g. switched between upstream and downstream, use bidirectional signaling, etc.). Thus, for example, in JEDEC standard DDR (e.g. DDR, DDR2, DDR3, DDR4, etc.) SDRAM memory technologies part of the address and part of the command bus are combined (or may be considered to be combined), row address and column address may be time-multiplexed on the address bus, and read/write data may use a bidirectional bus.

In alternate embodiments, a point-to-point bus may include one or more switches or other bypass mechanism that results in the bus information being directed to one of two or more possible intermediate circuits during downstream communication (communication passing from the memory controller to a intermediate circuit on a memory module), as well as directing upstream information (communication from an intermediate circuit on a memory module to the memory controller), possibly by way of one or more upstream intermediate circuits.

In some embodiments, the memory system may include one or more intermediate circuits (e.g. on one or more memory modules etc.) connected to the memory controller via a cascade interconnect memory bus, however, other memory structures may be implemented (e.g. point-to-point bus, a multi-drop memory bus, shared bus, etc.). Depending on the constraints (e.g. signaling methods used, the intended operating frequencies, space, power, cost, and other constraints, etc.) various alternate bus structures may be used. A point-to-point bus may provide the optimal performance in systems requiring high-speed interconnections, due to the reduced signal degradation compared to bus structures having branched signal lines, switch devices, or stubs. However, when used in systems requiring communication with multiple devices or subsystems, a point-to-point or other similar bus may often result in significant added system cost (e.g. component cost, board area, increased system power, etc.) and may reduce the potential memory density due to the need for intermediate devices (e.g. buffers, re-drive circuits, etc.). Functions and performance similar to that of a point-to-point bus may be obtained by using switch devices. Switch devices and other similar solutions may offer advantages (e.g. increased memory packaging density, lower power, etc.) while retaining many of the characteristics of a point-to-point bus. Multi-drop bus solutions may provide an alternate solution, and though often limited to a lower operating frequency may offer a cost and/or performance advantage for many applications. Optical bus solutions may permit increased frequency and bandwidth, either in point-to-point or multi-drop applications, but may incur cost and/or space impacts.

Although not necessarily shown in all the figures, the memory modules and/or intermediate devices may also include one or more separate control (e.g. command distribution, information retrieval, data gathering, reporting mechanism, signaling mechanism, register read/write, configuration, etc.) buses (e.g. a presence detect bus, an 12C bus, an SMBus, combinations of these and other buses or signals, etc.) that may be used for one or more purposes including the determination of the device and/or memory module attributes (generally after power-up), the reporting of fault or other status information to part(s) of the system, calibration, temperature monitoring, the configuration of device(s) and/or memory subsystem(s) after power-up or during normal operation or for other purposes. Depending on the control bus characteristics, the control bus(es) might also provide a means by which the valid completion of operations could be reported by devices and/or memory module(s) to the memory controller(s), or the identification of failures occurring during the execution of the main memory controller requests, etc. The separate control buses may be physically separate or electrically and/or logically combined (e.g. by multiplexing, time multiplexing, shared signals, etc.) with other memory buses.

As used herein the term buffer (e.g. buffer device, buffer circuit, buffer chip, etc.) refers to an electronic circuit that may include temporary storage, logic etc. and may receive signals at one rate (e.g. frequency, etc.) and deliver signals at another rate. In some embodiments, a buffer is a device that may also provide compatibility between two signals (e.g. changing voltage levels or current capability, changing logic function, etc.).

As used herein, hub is a device containing multiple ports that may be capable of being connected to several other devices. The term hub is sometimes used interchangeably with the term buffer. A port is a portion of an interface that serves an I/O function (e.g. a port may be used for sending and receiving data, address, and control information over one of the point-to-point links, or buses). A hub may be a central device that connects several systems, subsystems, or networks together. A passive hub may simply forward messages, while an active hub (e.g. repeater, amplifier, etc.) may also modify the stream of data which otherwise would deteriorate over a distance. The term hub, as used herein, refers to a hub that may include logic (hardware and/or software) for performing logic functions.

As used herein, the term bus refers to one of the sets of conductors (e.g. signals, wires, traces, and printed circuit board traces or connections in an integrated circuit) connecting two or more functional units in a computer. The data bus, address bus and control signals may also be referred to together as constituting a single bus. A bus may include a plurality of signal lines (or signals), each signal line having two or more connection points that form a main transmission line that electrically connects two or more transceivers, transmitters and/or receivers. The term bus is contrasted with the term channel that may include one or more buses or sets of buses.

As used herein, the term channel (e.g. memory channel etc.) refers to an interface between a memory controller (e.g. a portion of processor, CPU, etc.) and one of one or more memory subsystem(s). A channel may thus include one or more buses (of any form in any topology) and one or more intermediate circuits.

As used herein, the term daisy chain (e.g. daisy chain bus etc.) refers to a bus wiring structure in which, for example, device (e.g. unit, structure, circuit, block, etc.) A is wired to device B, device B is wired to device C, etc. In some embodiments the last device may be wired to a resistor, terminator, or other termination circuit etc. In alternative embodiments any or all of the devices may be wired to a resistor, terminator, or other termination circuit etc. In a daisy chain bus, all devices may receive identical signals or, in contrast to a simple bus, each device may modify (e.g. change, alter, transform, etc.) one or more signals before passing them on.

A cascade (e.g. cascade interconnect, etc.) as used herein refers to a succession of devices (e.g. stages, units, or a collection of interconnected networking devices, typically hubs or intermediate circuits, etc.) in which the hubs or intermediate circuits operate as logical repeater(s), permitting for example, data to be merged and/or concentrated into an existing data stream or flow on one or more buses.

As used herein, the term point-to-point bus and/or link refers to one or a plurality of signal lines that may each include one or more termination circuits. In a point-to-point bus and/or link, each signal line has two transceiver connection points, with each transceiver connection point coupled to transmitter circuits, receiver circuits or transceiver circuits.

As used herein, a signal (or line, signal line, etc.) refers to one or more electrical conductors or optical carriers, generally configured as a single carrier or as two or more carriers, in a twisted, parallel, or concentric arrangement, used to transport at least one logical signal. A logical signal may be multiplexed with one or more other logical signals generally using a single physical signal but logical signal(s) may also be multiplexed using more than one physical signal.

As used herein, memory devices are generally defined as integrated circuits that are composed primarily of memory (e.g. data storage, etc.) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access memory and related memories that store information in the form of electrical, optical, magnetic, chemical, biological, combinations of these or other means. Dynamic memory device types may include, but are not limited to, FPM DRAMs (Fast Page Mode Dynamic Random Access Memories), EDO (Extended Data Out) DRAMs, BEDO (Burst EDO) DRAMs, SDR (Single Data Rate) Synchronous DRAMs (SDRAMs), DDR (Double Data Rate) Synchronous DRAMs, DDR2, DDR3, DDR4, or any of the expected follow-on memory devices and related memory technologies such as Graphics RAMs (e.g. GDDR, etc.), Video RAMs, LP RAM (Low Power DRAMs) which may often be based on the fundamental functions, features and/or interfaces found on related DRAMs.

Memory devices may include chips (e.g. die, integrated circuits, etc.) and/or single or multi-chip packages (MCPs) or multi-die packages (e.g. including package-on-package (PoP), etc.) of various types, assemblies, forms, and configurations. In multi-chip packages, the memory devices may be packaged with other device types (e.g. other memory devices, logic chips, CPUs, hubs, buffers, intermediate devices, analog devices, programmable devices, etc.) and may also include passive devices (e.g. resistors, capacitors, inductors, etc.). These multi-chip packages etc. may include cooling enhancements (e.g. an integrated heat sink, heat slug, fluids, gases, micromachined structures, micropipes, capillaries, etc.) that may be further attached to the carrier and/or another nearby carrier and/or other heat removal and/or cooling system.

Although not necessarily shown in all the figures, memory module support devices (e.g. buffer(s), buffer circuit(s), buffer chip(s), register(s), intermediate circuit(s), power supply regulation, hub(s), re-driver(s), PLL(s), DLL(s), non-volatile memory, SRAM, DRAM, logic circuits, analog circuits, digital circuits, diodes, switches, LEDs, crystals, active components, passive components, combinations of these and other circuits, etc.) may be comprised of multiple separate chips (e.g. die, dice, integrated circuits, etc.) and/or components, may be combined as multiple separate chips onto one or more substrates, may be combined into a single package (e.g. using die stacking, multi-chip packaging, etc.) or even integrated onto a single device based on tradeoffs such as: technology, power, space, weight, size, cost, performance, combinations of these, etc.

One or more of the various passive devices (e.g. resistors, capacitors, inductors, etc.) may be integrated into the support chip packages, or into the substrate, board, PCB, raw card etc, based on tradeoffs such as: technology, power, space, cost, weight, etc. These packages etc. may include an integrated heat sink or other cooling enhancements (e.g. such as those described above, etc.) that may be further attached to the carrier and/or another nearby carrier and/or other heat removal and/or cooling system.

Memory devices, intermediate devices and circuits, hubs, buffers, registers, clock devices, passives and other memory support devices etc. and/or other components may be attached (e.g. coupled, connected, etc.) to the memory subsystem and/or other component(s) via various methods including multi-chip packaging (MCP), chip-scale packaging, stacked packages, interposers, redistribution layers (RDLs), solder bumps and bumped package technologies, 3D packaging, solder interconnects, conductive adhesives, socket structures, pressure contacts, electrical/mechanical/magnetic/optical coupling, wireless proximity, combinations of these, and/or other methods that enable communication between two or more devices (e.g. via electrical, optical, wireless, or alternate means, etc.).

The one or more memory modules (or memory subsystems) and/or other components/devices may be electrically/optically/wireless etc. connected to the memory system, CPU complex, computer system or other system environment via one or more methods such as multi-chip packaging, chip-scale packaging, 3D packaging, soldered interconnects, connectors, pressure contacts, conductive adhesives, optical interconnects, combinations of these, and other communication and/or power delivery methods (including but not limited to those described above).

Connector systems may include mating connectors (e.g. male/female, etc.), conductive contacts and/or pins on one carrier mating with a male or female connector, optical connections, pressure contacts (often in conjunction with a retaining and/or closure mechanism) and/or one or more of various other communication and power delivery methods. The interconnection(s) may be disposed along one or more edges (e.g. sides, faces, etc.) of the memory assembly (e.g. DIMM, die, package, card, assembly, structure, etc.) and/or placed a distance from an edge of the memory subsystem (or portion of the memory subsystem, etc.) depending on such application requirements as ease of upgrade, ease of repair, available space and/or volume, heat transfer constraints, component size and shape and other related physical, electrical, optical, visual/physical access, requirements and constraints, etc. Electrical interconnections on a memory module are often referred to as pads, contacts, pins, connection pins, tabs, etc. Electrical interconnections on a connector are often referred to as contacts, pins, etc.

As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices together with any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry. The memory modules described herein may also be referred to as memory subsystems because they include one or more memory device(s), register(s), hub(s) or similar devices.

The integrity, reliability, availability, serviceability, performance etc. of the communication path, the data storage contents, and all functional operations associated with each element of a memory system or memory subsystem may be improved by using one or more fault detection and/or correction methods. Any or all of the various elements of a memory system or memory subsystem may include error detection and/or correction methods such as CRC (cyclic redundancy code, or cyclic redundancy check), ECC (error-correcting code), EDC (error detecting code, or error detection and correction), LDPC (low-density parity check), parity, checksum or other encoding/decoding methods and combinations of coding methods suited for this purpose. Further reliability enhancements may include operation retry (e.g. repeat, re-send, replay, etc.) to overcome intermittent or other faults such as those associated with the transfer of information, the use of one or more alternate, stand-by, or replacement communication paths (e.g. bus, via, path, trace, etc.) to replace failing paths and/or lines, complement and/or re-complement techniques or alternate methods used in computer, communication, and related systems.

The use of bus termination is common in order to meet performance requirements on buses that form transmission lines, such as point-to-point links, multi-drop buses, etc. Bus termination methods include the use of one or more devices (e.g. resistors, capacitors, inductors, transistors, other active devices, etc. or any combinations and connections thereof, serial and/or parallel, etc.) with these devices connected (e.g. directly coupled, capacitive coupled, AC connection, DC connection, etc.) between the signal line and one or more termination lines or points (e.g. a power supply voltage, ground, a termination voltage, another signal, combinations of these, etc.). The bus termination device(s) may be part of one or more passive or active bus termination structure(s), may be static and/or dynamic, may include forward and/or reverse termination, and bus termination may reside (e.g. placed, located, attached, etc.) in one or more positions (e.g. at either or both ends of a transmission line, at fixed locations, at junctions, distributed, etc.) electrically and/or physically along one or more of the signal lines, and/or as part of the transmitting and/or receiving device(s). More than one termination device may be used for example, if the signal line comprises a number of series connected signal or transmission lines (e.g. in daisy chain and/or cascade configuration(s), etc.) with different characteristic impedances.

The bus termination(s) may be configured (e.g. selected, adjusted, altered, set, etc.) in a fixed or variable relationship to the impedance of the transmission line(s) (often but not necessarily equal to the transmission line(s) characteristic impedance), or configured via one or more alternate approach(es) to maximize performance (e.g. the useable frequency, operating margins, error rates, reliability or related attributes/metrics, combinations of these, etc.) within design constraints (e.g. cost, space, power, weight, size, performance, speed, latency, bandwidth, reliability, other constraints, combinations of these, etc.).

Additional functions that may reside local to the memory subsystem and/or hub device, buffer, etc. may include data, control, write and/or read buffers (e.g. registers, FIFOs, LIFOs, etc), data and/or control arbitration, command reordering, command retiming, one or more levels of memory cache, local pre-fetch logic, data encryption and/or decryption, data compression and/or decompression, data packing functions, protocol (e.g. command, data, format, etc.) translation, protocol checking, channel prioritization control, link-layer functions (e.g. coding, encoding, scrambling, decoding, etc.), link and/or channel characterization, command prioritization logic, voltage and/or level translation, error detection and/or correction circuitry, RAS features and functions, RAS control functions, repair circuits, data scrubbing, test circuits, self-test circuits and functions, diagnostic functions, debug functions, local power management circuitry and/or reporting, power-down functions, hot-plug functions, operational and/or status registers, initialization circuitry, reset functions, voltage control and/or monitoring, clock frequency control, link speed control, link width control, link direction control, link topology control, link error rate control, instruction format control, instruction decode, bandwidth control (e.g. virtual channel control, credit control, score boarding, etc.), performance monitoring and/or control, one or more co-processors, arithmetic functions, macro functions, software assist functions, move/copy functions, pointer arithmetic functions, counter (e.g. increment, decrement, etc.) circuits, programmable functions, data manipulation (e.g. graphics, etc.), search engine(s), virus detection, access control, security functions, memory and cache coherence functions (e.g. MESI, MOESI, MESIF, directory-assisted snooping (DAS), etc.), other functions that may have previously resided in other memory subsystems or other systems (e.g. CPU, GPU, FPGA, etc.), combinations of these, etc. By placing one or more functions local (e.g. electrically close, logically close, physically close, within, etc.) to the memory subsystem, added performance may be obtained as related to the specific function, often while making use of unused circuits or making more efficient use of circuits within the subsystem.

Memory subsystem support device(s) may be directly attached to the same assembly (e.g. substrate, interposer, redistribution layer (RDL), base, board, package, structure, etc.) onto which the memory device(s) are attached (e.g. mounted, connected, etc.) to a separate substrate (e.g. interposer, spacer, layer, etc.) also produced using one or more of various materials (e.g. plastic, silicon, ceramic, etc.) that include communication paths (e.g. electrical, optical, etc.) to functionally interconnect the support device(s) to the memory device(s) and/or to other elements of the memory or computer system.

Transfer of information (e.g. using packets, bus, signals, wires, etc.) along a bus, (e.g. channel, link, cable, etc.) may be completed using one or more of many signaling options. These signaling options may include such methods as single-ended, differential, time-multiplexed, encoded, optical, combinations of these or other approaches, etc. with electrical signaling further including such methods as voltage or current signaling using either single or multi-level approaches. Signals may also be modulated using such methods as time or frequency, multiplexing, non-return to zero (NRZ), phase shift keying (PSK), amplitude modulation, combinations of these, and others with or without coding, scrambling, etc. Voltage levels may be expected to continue to decrease, with 1.8V, 1.5V, 1.35V, 1.2V, 1V and lower power and/or signal voltages of the integrated circuits.

One or more timing (e.g. clocking, synchronization, etc.) methods may be used within the memory system, including synchronous clocking, global clocking, source-synchronous clocking, encoded clocking, or combinations of these and/or other clocking and/or synchronization methods, (e.g. self-timed, asynchronous, etc.), etc. The clock signaling or other timing scheme may be identical to that of the signal lines, or may use one of the listed or alternate techniques that are more suited to the planned clock frequency or frequencies, and the number of clocks planned within the various systems and subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the memory subsystem, or may be based on a clock that is derived from the clock related to the signal(s) being transferred to and from the memory subsystem (e.g. such as that associated with an encoded clock, etc.). Alternately, a clock may be used for the signal(s) transferred to the memory subsystem, and a separate clock for signal(s) sourced from one (or more) of the memory subsystems. The clocks may operate at the same or frequency multiple (or sub-multiple, fraction, etc.) of the communication or functional (e.g. effective, etc.) frequency, and may be edge-aligned, center-aligned or otherwise placed and/or aligned in an alternate timing position relative to the signal(s).

Signals coupled to the memory subsystem(s) include address, command, control, and data, coding (e.g. parity, ECC, etc.), as well as other signals associated with requesting or reporting status (e.g. retry, replay, etc.) and/or error conditions (e.g. parity error, coding error, data transmission error, etc.), resetting the memory, completing memory or logic initialization and other functional, configuration or related information, etc.

Signals may be coupled using methods that may be consistent with normal memory device interface specifications (generally parallel in nature, e.g. DDR2, DDR3, etc.), or the signals may be encoded into a packet structure (generally serial in nature, e.g. FB-DIMM, etc.), for example, to increase communication bandwidth and/or enable the memory subsystem to operate independently of the memory technology by converting the signals to/from the format required by the memory device(s). The terminology used herein is for the purpose of describing particular embodiments only and is not intended to be limiting of the various embodiments of the invention. As used herein, the singular forms (e.g. a, an, the, etc.) are intended to include the plural forms as well, unless the context clearly indicates otherwise.

The terms comprises and/or comprising, when used in this specification, specify the presence of stated features, integers, steps, operations, elements, and/or components, but do not preclude the presence or addition of one or more other features, integers, steps, operations, elements, components, and/or groups thereof.

In the following description and claims, the terms include and comprise, along with their derivatives, may be used, and are intended to be treated as synonyms for each other.

In the following description and claims, the terms coupled and connected may be used, along with their derivatives. It should be understood that these terms are not necessarily intended as synonyms for each other. For example, connected may be used to indicate that two or more elements are in direct physical or electrical contact with each other. Further, coupled may be used to indicate that that two or more elements are in direct or indirect physical or electrical contact. For example, coupled may be used to indicate that that two or more elements are not in direct contact with each other, but the two or more elements still cooperate or interact with each other.

The corresponding structures, materials, acts, and equivalents of all means or step plus function elements in the claims below are intended to include any structure, material, or act for performing the function in combination with other claimed elements as specifically claimed. The description of the various embodiments of the present invention has been presented for purposes of illustration and description, but is not intended to be exhaustive or limited to the various embodiments of the invention in the form disclosed. Many modifications and variations will be apparent to those of ordinary skill in the art without departing from the scope and spirit of the various embodiments of the invention. The embodiment(s) was chosen and described in order to best explain the principles of the invention and the practical application, and to enable others of ordinary skill in the art to understand the various embodiments of the invention for various embodiments with various modifications as are suited to the particular use contemplated.

As will be appreciated by one skilled in the art, aspects of the various embodiments of the present invention may be embodied as a system, method or computer program product. Accordingly, aspects of the various embodiments of the present invention may take the form of an entirely hardware embodiment, an entirely software embodiment (including firmware, resident software, micro-code, etc.) or an embodiment combining software and hardware aspects that may all generally be referred to herein as a circuit, component, module or system. Furthermore, aspects of the various embodiments of the present invention may take the form of a computer program product embodied in one or more computer readable medium(s) having computer readable program code embodied thereon.

FIG. 20-1

FIG. 20-1 shows an apparatus 20-100 including a plurality of semiconductor platforms, in accordance with one embodiment. As an option, the apparatus may be implemented in the context of the architecture and environment of any subsequent Figure(s). Of course, however, the apparatus may be implemented in any desired environment.

As shown, the apparatus 20-100 includes a first semiconductor platform 20-102 including at least one memory circuit 20-104. Additionally, the apparatus 20-100 includes a second semiconductor platform 20-106 stacked with the first semiconductor platform 20-102. The second semiconductor platform 20-106 includes a logic circuit (not shown) that is in communication with the at least one memory circuit 20-104 of the first semiconductor platform 20-102. Furthermore, the second semiconductor platform 20-106 is operable to cooperate with a separate central processing unit 20-108, and may include at least one memory controller (not shown) operable to control the at least one memory circuit 20-102.

The memory circuit 20-104 may be in communication with the memory circuit 20-104 of the first semiconductor platform 20-102 in a variety of ways. For example, in one embodiment, the memory circuit 20-104 may be communicatively coupled to the logic circuit utilizing at least one through-silicon via (TSV).

In various embodiments, the memory circuit 20-104 may include, but is not limited to, dynamic random access memory (DRAM), synchronous DRAM (SDRAM), double data rate synchronous DRAM (DDR SDRAM, DDR2 SDRAM, DDR3 SDRAM, DDR4 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), ZRAM (e.g. SOI RAM, Capacitor-less RAM, etc.), Phase Change RAM (PRAM or PCRAM, chalcogenide RAM, etc.), Magnetic RAM (MRAM), Field Write MRAM, Spin Torque Transfer (STT) MRAM, Memristor RAM, Racetrack memory, Millipede memory, Ferroelectric RAM (FeRAM), Resistor RAM (RRAM), Conductive-Bridging RAM (CBRAM), Silicon-Oxide-Nitride-Oxide-Silicon (SONOS) RAM, Twin-Transistor RAM (TTRAM), Thyristor-RAM (T-RAM), combinations of these and/or any other memory technology or similar data storage technology.

Further, in various embodiments, the first semiconductor platform 20-102 may include one or more types of non-volatile memory technology (e.g. FeRAM, MRAM, PRAM, etc.) and/or one or more types of volatile memory technology (e.g. SRAM, T-RAM, Z-RAM, TTRAM, etc.). In one embodiment, the first semiconductor platform 20-102 may include a standard (e.g. JEDEC DDR3 SDRAM, etc.) die.

In one embodiment, the first semiconductor platform 20-102 may use a standard memory technology (e.g. JEDEC DDR3, JEDEC DDR4, etc.) but may be included on a non-standard die (e.g. the die is non-standardized, the die is not sold separately as a memory component, etc.). Additionally, in one embodiment, the first semiconductor platform 20-102 may be a logic semiconductor platform (e.g. logic chip, buffer chip, etc.).

In various embodiments, the first semiconductor platform 20-102 and the second semiconductor platform 20-106 may form a system comprising at least one of a three-dimensional integrated circuit, a wafer-on-wafer device, a monolithic device, a die-on-wafer device, a die-on-die device, a three-dimensional package, or a three-dimensional package. In one embodiment, and as shown in FIG. 20-1, the first semiconductor platform 20-102 may be positioned above the second semiconductor platform 20-106.

In another embodiment, the first semiconductor platform 20-102 may be positioned beneath the second semiconductor platform 20-106. Furthermore, in one embodiment, the first semiconductor platform 20-102 may be in direct physical contact with the second semiconductor platform 20-106.

In one embodiment, the first semiconductor platform 20-102 may be stacked with the second semiconductor platform 20-106 with at least one layer of material therebetween. The material may include any type of material including, but not limited to, silicon, germanium, gallium arsenide, silicon carbide, and/or any other material. In one embodiment, the first semiconductor platform 20-102 and the second semiconductor platform 20-106 may include separate integrated circuits.

Further, in one embodiment, the logic circuit may operable to cooperate with the separate central processing unit 20-108 utilizing a bus 20-110. In one embodiment, the logic circuit may operable to cooperate with the separate central processing unit 20-108 utilizing a split transaction bus. In the context of the of the present description, a split-transaction bus refers to a bus configured such that when a CPU places a memory request on the bus, that CPU may immediately release the bus, such that other entities may use the bus while the memory request is pending. When the memory request is complete, the memory module involved may then acquire the bus, place the result on the bus (e.g. the read value in the case of a read request, an acknowledgment in the case of a write request, etc.), and possibly also place on the bus the ID number of the CPU that had made the request.

In one embodiment, the apparatus 20-100 may include more semiconductor platforms than shown in FIG. 20-1. For example, in one embodiment, the apparatus 20-100 may include a third semiconductor platform and a fourth semiconductor platform, each stacked with the first semiconductor platform 20-102 and each including at least one memory circuit under the control of the memory controller of the logic circuit of the second semiconductor platform 20-106 (e.g. see FIG. 1B, etc.).

In one embodiment, the first semiconductor platform 20-102, the third semiconductor platform, and the fourth semiconductor platform may collectively include a plurality of aligned memory echelons under the control of the memory controller of the logic circuit of the second semiconductor platform 20-106. Further, in one embodiment, the logic circuit may be operable to cooperate with the separate central processing unit 20-108 by receiving requests from the separate central processing unit 20-108 (e.g. read requests, write requests, etc.) and sending responses to the separate central processing unit 20-108 (e.g. responses to read requests, responses to write requests, etc.).

In one embodiment, the requests and/or responses may be each uniquely identified with an identifier. For example, in one embodiment, the requests and/or responses may be each uniquely identified with an identifier that is included therewith.

Furthermore, the requests may identify and/or specify various components associated with the semiconductor platforms. For example, in one embodiment, the requests may each identify at least one of the memory echelon. Additionally, in one embodiment, the requests may each identify at least one of the memory module.

In one embodiment, different semiconductor platforms may be associated with different memory types. For example, in one embodiment, the apparatus 20-100 may include a third semiconductor platform stacked with the first semiconductor platform 20-102 and include at least one memory circuit under the control of the at least one memory controller of the logic circuit of the second semiconductor platform 20-106, where the first semiconductor platform 20-102 includes, at least in part, a first memory type and the third semiconductor platform includes, at least in part, a second memory type different from the first memory type.

Further, in one embodiment, the at least one memory integrated circuit 20-104 may be logically divided into a plurality of subbanks each including a plurality of portions of a bank. Still yet, in various embodiments, the logic circuit may include one or more of the following functional modules: bank queues, subbank queues, a redundancy or repair module, a fairness or arbitration module, an arithmetic logic unit or macro module, a virtual channel control module, a coherency or cache module, a routing or network module, reorder or replay buffers, a data protection module, an error control and reporting module, a protocol and data control module, DRAM registers and control module, and/or a DRAM controller algorithm module.

The logic circuit may be in communication with the memory circuit 20-104 of the first semiconductor platform 20-102 in a variety of ways. For example, in one embodiment, the logic circuit may be in communication with the memory circuit 20-104 of the first semiconductor platform 20-102 via at least one address bus, at least one control bus, and/or at least one data bus.

Furthermore, in one embodiment, the apparatus may include a third semiconductor platform and a fourth semiconductor platform each stacked with the first semiconductor platform 20-102 and each may include at least one memory circuit under the control of the at least one memory controller of the logic circuit of the second semiconductor platform 20-106. The logic circuit may be in communication with the at least one memory circuit 20-104 of the first semiconductor platform 20-102, the at least one memory circuit of the third semiconductor platform, and the at least one memory circuit of the fourth semiconductor platform, via at least one address bus, at least one control bus, and/or at least one data bus.

In one embodiment, at least one of the address bus, the control bus, or the data bus may be configured such that the logic circuit is operable to drive each of the at least one memory circuit 20-104 of the first semiconductor platform 20-102, the at least one memory circuit of the third semiconductor platform, and the at least one memory circuit of the fourth semiconductor platform, both together and independently in any combination; and the at least one memory circuit of the first semiconductor platform, the at least one memory circuit of the third semiconductor platform, and the at least one memory circuit of the fourth semiconductor platform, may be configured to be identical for facilitating a manufacturing thereof.

In one embodiment, the logic circuit of the second semiconductor platform 20-106 may not be a central processing unit. For example, in various embodiments, the logic circuit may lack one or more components and/or functionally that is associated with or included with a central processing unit. As an example, in various embodiments, the logic circuit may not be capable of performing one or more of the basic arithmetical, logical, and input/output operations of a computer system that a CPU would normally perform. As another example, in one embodiment, the logic circuit may lack an arithmetic logic unit (ALU), which typically performs arithmetic and logical operations for a CPU. As another example, in one embodiment, the logic circuit may lack a control unit (CU) that typically allows a CPU to extract instructions from memory, decode the instructions, and execute the instructions (e.g. calling on the ALU when necessary, etc.).

More illustrative information will now be set forth regarding various optional architectures and features with which the foregoing techniques discussed in the context of any of the present or previous figure(s) may or may not be implemented, per the desires of the user. For instance, various optional examples and/or options associated with the first semiconductor platform 20-102, the memory circuit 20-104, the second semiconductor platform 20-106, and/or other optional features have been and will be set forth in the context of a variety of possible embodiments. It should be strongly noted, however, that such information is set forth for illustrative purposes and should not be construed as limiting in any manner. Any of such features may be optionally incorporated with or without the inclusion of other features described.

FIG. 20-2

Stacked Memory System Using Cache Hints

FIG. 20-2 shows a stacked memory system using cache hints, in accordance with another embodiment. As an option, the stacked memory system may be implemented in the context of the architecture and environment of any previous and/or subsequent Figure(s). Of course, however, the stacked memory system may be implemented in any desired environment.

In FIG. 20-2 the stacked memory system using cache hints 20-200 comprises one or more stacked memory packages. In FIG. 20-2 the one or more stacked memory packages may include stacked memory package 1. In FIG. 20-2 stacked memory package 1 may include a stacked memory cache 1.

In one embodiment a stacked memory cache may be located on (e.g. fabricated with, a part of, etc.) a logic chip in (e.g. mounted in, assembled with, a part of, etc.) a stacked memory package.

In one embodiment the stacked memory cache may be located on one or more stacked memory chips in a stacked memory package.

In FIG. 20-2 the stacked memory package 1 may receive one or more commands (e.g. requests, messages, etc.) with one or more cache hints.

For example, a cache hint may instruct a logic chip in a stacked memory package to load one or more addresses from one or more stacked memory chips into the stacked memory cache.

In one embodiment a cache hint may contain information to be stored as local state in a stacked memory package.

In one embodiment the stacked memory cache may contain data from the local stacked memory package.

In one embodiment the stacked memory cache may contain data from one or more remote stacked memory packages.

In one embodiment the stacked memory cache may perform a pre-emptive load from one or more stacked memory chips.

For example, one or more cache hints may be used to load (e.g. pre-emptive load, preload, etc.) a stacked memory cache in advance of a system access (e.g. CPU read, etc.). Such a pre-emptive cache load may be more efficient than a memory prefetch from the CPU. For example, in FIG. 20-2 a cache hint (label 1) is sent by the CPU to stacked memory package 1. The cache hint may contain data (e.g. fields, data, information, etc.) that correspond to system addresses ADDR1 and ADDR2. The cache hint may cause (e.g. using the logic chip in a stacked memory package, etc.) system memory addresses ADDR1-ADDR2 to be loaded into the stacked memory cache 1 in stacked memory package 1. In FIG. 20-2 a request (label 2) is sent by the CPU directed at (e.g. targeted at, routed to, etc.) stacked memory package 1. Normally (e.g. without the presence of cache hints, etc.) the request might require an access (e.g. read, etc.) to one or more stacked memory chips in stacked memory package 1. However when request (label 2) is received by the stacked memory package 1 it recognizes that the request may be satisfied using the stacked memory cache 1. The access to the stacked memory cache 1 may be much faster than access to the one or more stacked memory chips. The completion (e.g. response, etc.) (label 3) contains the requested data (e.g. requested by the request (label 2), etc.).

In one embodiment the stacked memory cache may perform a pre-emptive load from one or more stacked memory chips in advance of one or more stacked memory chip refresh operations.

For example, a pre-emptive cache load may be performed in advance of a memory refresh that is scheduled by a stacked memory package. Such a pre-emptive cache load may thus effectively hide the refresh period (e.g. from the CPU, etc.).

For example, a stacked memory package may inform the CPU etc. that a refresh operation is about to occur (e.g. through a message, through a known pattern of refresh, through a table of refresh timings, using communication between CPU and one or more memory packages, or other means, etc.). As a result of knowing when or approximately when a refresh event is to occur, the CPU etc. may send one or more cache hints to the stacked memory package.

In one embodiment the stacked memory cache may perform a pre-emptive load from one or more stacked memory chips in advance of one or more stacked memory chip operations.

For example, the CPU or other system component (e.g. IO device, other stacked memory package, logic chip on one or more stacked memory packages, memory controller(s), etc.) may change (e.g. wish to change, need to change, etc.) one or more properties (e.g. perform one or more operations, perform one or more commands, etc.) of one or more stacked memory chips (e.g. change bus frequency, bus voltage, circuit configuration, spare circuit configuration, spare memory organization, repair, memory organization, link configuration, etc.). For this or other reason, one or more portions of one or more stacked memory chips (e.g. configuration, memory chip registers, memory chip control circuits, memory chip addresses, etc.) may become unavailable (e.g. unable to be read, unable to be written, unable to be changed, etc.). For example, the CPU may wish to send a message MSG2 to a stacked memory package to change the bus frequency of stacked memory chip SMC1. Thus the CPU may first send a message MSG1 with a cache hint to load a portion or portions of SMC1 to the stacked memory cache.

For example, the CPU may wish to change on or more properties of a logic chip in a stacked memory package. The operation (e.g. command, etc.) to be performed on the logic chip may require that (e.g. demand that, result in, etc.) one or more portions of the logic chip and/or one or more portions of one or more stacked memory chips are unavailable for a period of time. The same method of sending one or more cache hints may be used to provide an alternative target (e.g. source, destination, etc.) while an operation (e.g. command, change of properties, etc.) is performed.

In one embodiment the stacked memory cache may be used a read cache.

For example, the cache may only be used to hide refresh or allow system changes while continuing with reads, etc. For example, the stacked memory cache may contain data or state (e.g. registers, etc.) from one or more stacked memory chips and/or logic chips.

In one embodiment the stacked memory cache may be used a read and/or write cache.

For example, the stacked memory cache may contain data (e.g. write data, register data, configuration data, state, messages, commands, packets, etc.) intended for one or more stacked memory chips and/or logic chips. The stacked memory cache may be used to hide the effects of operations (e.g. commands, messages, internal operations, etc.) on one or more stacked memory chips and/or one or more logic chips. Data may be written to the intended target (e.g. logic chip, stacked memory chip, etc.) independently of the operation (e.g. asynchronously, after the operation is completed, as the operation is performed, pipelined with the operation, etc.).

In one embodiment the stacked memory cache may store information intended for one or more remote stacked memory packages.

For example, the CPU etc. may wish to change on or more properties of a stacked memory package (e.g. perform an operation, etc.). During that operation the stacked memory package may be unable to respond normally (e.g. as it does when not performing the operation, etc.). In this case one or more remote (e.g. not in the stacked memory package on which the operation is being performed, etc.) stacked memory caches may act to store data (e.g. buffer, save, etc.) data (e.g. commands, packets, messages, etc.). Data may be written to the intended target when it is once again available (e.g. able to respond normally, etc.). Such a scheme may be particularly useful for memory system management (e.g. link changes, link configuration changes, lane configuration, lane direction changes, bus frequency changes, link frequency changes, link speed changes, link property changes, link state changes, failover events, circuit reconfiguration, memory repair operations, circuit repair, error handling, error recovery, system diagnostics, system testing, hot swap events, system management, system configuration, system reconfiguration, voltage change, power state changes, subsystem power up events, subsystem power down events, power management, sleep state events, sleep state exit operations, hot plug events, checkpoint operations, flush operations, etc.).

As an option, the stacked memory system may be implemented in the context of the architecture and environment of any previous Figure(s) and/or any subsequent Figure(s). Of course, however, the stacked memory system may be implemented in the context of any desired environment.

FIG. 20-3

Test System for a Stacked Memory Package

FIG. 20-3 shows a test system for a stacked memory package, in accordance with another embodiment. As an option, the test system for a stacked memory package may be implemented in the context of the architecture and environment of any previous and/or subsequent Figure(s). Of course, however, the test system for a stacked memory package may be implemented in any desired environment.

FIG. 20-3 shows a test system for a stacked memory package 300 that comprises a test request (test request 1) sent by the CPU etc to stacked memory package 1. In FIG. 20-3 the test request 1 may be forwarded by one or more stacked memory packages (if present) e.g. as test request 2, etc. In FIG. 20-3 the test request 2 may be translated (e.g. operated on, transformed, changed, modified, split, joined, separated, altered, etc.) and one or more portions forwarded (e.g. sent, transmitted, etc.) as test request 3 to one or more stacked memory chips in the stacked memory package 1. In FIG. 20-3 stacked memory chip 1 may respond to test request 3 with test response 1. In FIG. 20-3 the logic chip may translate (e.g. interpret, change, modify, etc.) test response 1 and one or more portions may be forwarded as test response 2. In FIG. 20-3 the test response 2 may be forwarded by one or more stacked memory packages (if present) e.g. as test response 3, etc. In FIG. 20-3 a test response (test response 3) may be received by the CPU etc.

In one embodiment the logic chip in a stacked memory package may contain a built-in self-test (BIST) engine.

For example the logic chip in a stacked memory package may contain one or more BIST engines that may test one or more stacked memory chips in the stacked memory package.

For example a BIST engine may generate one or more algorithmic patterns (e.g. testing methods, etc.) that may test one or more sequences of addresses using one or more operations for each address. Such algorithmic patterns and/or testing methods may include (but are not limited to) one or more and/or combinations of one or more and/or derivatives of one or more of the following: walking ones, walking zeros, checkerboard, moving inversions, random, block move, marching patterns, galloping patterns, sliding patterns, butterfly algorithms, surround disturb (SD), zero-one patterns, modified algorithmic test sequences (MATS), march X, march Y, march C, march C−, extended march C−, MATS−F, MATS++, MSCAN, GALPAT, WALPAT, MOVI, march etc.

In one embodiment the BIST engine may be controlled (e.g. triggered, started, stopped, programmed, altered, modified, etc.) by one or more external commands and/or events (e.g. CPU messages, at start-up, during initialization, etc.).

In one embodiment a BIST engine may be controlled (e.g. triggered, started, stopped, modified, etc.) by one or more internal commands and/or events (e.g. logic chip signals, at start-up, during initialization, etc.). For example, the logic chip may detect one or more errors (e.g. error conditions, error modes, failures, fault conditions, etc.) and request a BIST engine perform one or more tests (e.g. self-test, checks, etc.) of one or more portions of the stacked memory package (e.g. one or more stacked memory chips, one or more buses or other interconnect, one or more portions of the logic chips, etc.).

In one embodiment a BIST engine may be operable to test one or more portions of the stacked memory package and/or logical and physical connections to one or more remote stacked memory packages or other system components.

For example a BIST engine may test the high-speed serial links between stacked memory packages and/or the stacked memory packages and one or more CPUs or other system components.

For example, a BIST engine may test the TSVs and other parts or portions of the connect between one or more logic chips and one or more stacked memory chips in a stacked memory package.

For example, a BIST engine may test for (but are not limited to) one or more or combinations of one or more of the following: memory functional faults, memory cell faults, dynamic faults (e.g. recovery faults, disturb faults, retention faults, leakage faults, etc.), circuit faults (e.g. decoder faults, sense amplifier faults, etc.).

In one embodiment a BIST engine may be used to characterize (e.g. measure, evaluate, diagnose, test, probe, etc.) the performance (e.g. response, electrical properties, delay, speed, error rate, etc.) of one or more components (e.g. logic chip, stacked memory chips, etc.) of the stacked memory package.

For example, a BIST engine may be used to characterize the data retention times of cells within portions of one or more stacked memory chips.

As a result of characterizing the data retention times the system (e.g. CPU, logic chip, etc.) may adjust the properties (e.g. refresh periods, data protection scheme, repair scheme, etc.) of one or more portions of the stacked memory chips.

For example, a BIST engine may characterize the performance (e.g. frequency response, error rate, etc.) of the high-speed serial links between one or more memory packages and/or CPUs etc. As a result of characterizing the high-speed serial links the system may adjust the properties (e.g. speed, error protection, data rate, clock speed, etc.) of one or more links.

Of course the stacked memory package may contain any test system or portions of test systems that may be useful for improving the performance, reliability, serviceability etc. of a memory system. These test systems may be controlled either by the system (CPU, etc.) or by the logic in each stacked memory package (e.g. logic chip, stacked memory chips, etc.) or by a combination of both, etc.

The control of such test system(s) may use commands (e.g. packets, requests, responses, JTAG commands, etc.) or may use logic signals (e.g. in-band, sideband, separate, multiplexed, encoded, JTAG signals, etc.).

The control of such test system(s) may be self-contained (e.g. autonomous, internal, within the stacked memory package, etc.), may be external (e.g. by one or more system components remote from (e.g. external to, outside, etc.) the stacked memory package, etc.), or may be a combination of both.

The location of such test systems may be local (e.g. each stacked memory package has its own test system(s), etc.) or distributed (e.g. multiple stacked memory packages and other system components act cooperatively, share parts or portions of test systems, etc.).

The use of such test systems may be for (but not limited to): in-circuit test (e.g. during operation, at run time, etc.); manufacturing test (e.g. during or after assembly of a stacked memory package etc.); diagnostic testing (e.g. during system bring-up, post-mortem analysis, system calibration, subsystem testing, memory test, etc.).

As an option, the test system for a stacked memory package may be implemented in the context of the architecture and environment of any previous Figure(s) and/or any subsequent Figure(s). Of course, however, the test system for a stacked memory package may be implemented in the context of any desired environment.

FIG. 20-4

Temperature Measurement System for a Stacked Memory Package

FIG. 20-4 shows a temperature measurement system for a stacked memory package, in accordance with another embodiment. As an option, the temperature measurement system for a stacked memory package may be implemented in the context of the architecture and environment of any previous and/or subsequent Figure(s). Of course, however, the temperature measurement system for a stacked memory package may be implemented in any desired environment.

In FIG. 20-4, the temperature measurement system for a stacked memory package 20-400 comprises a temperature request (temperature request 1) sent by the CPU etc to stacked memory package 1. In FIG. 20-3 the temperature request 1 may be forwarded by one or more stacked memory packages (if present) e.g. as temperature request 2, etc. In FIG. 20-3 the temperature request 2 may be translated (e.g. operated on, transformed, changed, modified, split, joined, separated, altered, etc.) and portions forwarded (e.g. sent, transmitted, etc.) as temperature request 3 to one or more stacked memory chips in the stacked memory package 1. In FIG. 20-3 stacked memory chip 1 may respond to temperature request 3 with temperature response 1. In FIG. 20-3 the logic chip may translate (e.g. interpret, change, modify, etc.) temperature response 1 and portions forwarded as temperature response 2. In FIG. 20-3 the temperature response 2 may be forwarded by one or more stacked memory packages (if present) e.g. as temperature response 3, etc. In FIG. 20-3 a temperature response (temperature response 3) may be received by the CPU etc.

In one embodiment, a temperature request and/or response may be sent using commands (e.g. messages, etc.) on the memory bus (as shown in FIG. 20-4).

In one embodiment, a temperature request and/or response may be sent using commands (e.g. messages, etc.) separate from the memory bus (e.g. not shown in FIG. 20-4) using a different means (e.g. SMBus, separate control bus, sideband signals, out-of-band messaging, etc.).

For example, the system may send a temperature request to a stacked memory package 1. The temperature request may include data (e.g. fields, information, codes, etc.) that indicate the CPU wants to read the temperature of stacked memory chip 1. As a result of receiving the temperature response, the CPU may, for example, alter (e.g. increase, decrease, etc.) the refresh properties (e.g. refresh interval, refresh period, refresh timing, refresh pattern, refresh sequence(s), etc.) of stacked memory chip 1.

Of course the information conveyed to the system need not be temperature directly. For example, the temperature information may be conveyed as a code or codes. For example the temperature information may be conveyed indirectly, as data retention (e.g. hold time, etc.) time measurement(s), as required refresh time(s), or other calculated and/or encoded parameter(s), etc.

Of course, more than one temperature reading may be requested and/or conveyed in a response, etc. For example the information returned in a response may include (but is not limited to) average, maximum, mean, minimum, moving average, variations, deviations, trends, other statistics, etc. For example, the temperatures of more than one chip (e.g. more than one memory chip, including the logic chip(s), etc.) may be reported. For example the temperatures of more than one location on each chip or chips may be reported, etc. For example, the temperature of the package, case or other assembly part or portion(s) may be reported, etc.

Of course other information (e.g. apart from temperature, etc.) may also be requested and/or conveyed in a response, etc.

Of course a request may not be required. For example, a stacked memory package may send out temperature or other system information periodically (either pre-programmed, programmed by system command at a certain frequency, etc.). For example, a stacked memory package may send out information when a trigger (e.g. condition, criterion, criteria, combination of criteria, etc.) is met (e.g. temperature alarm, error alarm, other alarm or alert/notification, etc.). The trigger(s) and/or information required may be pre-programmed (e.g. built-in, programmed at start-up, initialization, etc.) or programmed during operation (e.g. by command, message, etc.).

As an option, the temperature measurement system for a stacked memory package may be implemented in the context of the architecture and environment of any previous Figure(s) and/or any subsequent Figure(s). Of course, however, the temperature measurement system for a stacked memory package may be implemented in the context of any desired environment.

FIG. 20-5

SMBus System for a Stacked Memory Package

FIG. 20-5 shows a SMBus system for a stacked memory package, in accordance with another embodiment. As an option, the system for a stacked memory package may be implemented in the context of the architecture and environment of any previous and/or subsequent Figure(s). Of course, however, the system for a stacked memory package may be implemented in any desired environment.

The System Management Bus (SMBus, SMB) may be a simple (typically single-ended two-wire) bus used for simple (e.g. low overhead, lightweight, low-speed, etc.) communication. An SMBus may be used on computer motherboards for example to communicate with the power supply, battery, DIMMs, temperature sensors, fan control, fan sensors, voltage sensors, chassis switches, clock chips, add-in cards, etc. The SMBus is derived from (e.g. related to, etc.) the I2C serial bus protocol. Using an SMBus a device may provide manufacturer information, model number, part number, may save state (e.g. for a suspend, sleep event etc.), report errors, accept control parameters, return status, etc.

In FIG. 20-5 the SMBus system for a stacked memory package 20-500 comprises an SMBus request (SMBus request 1) sent by the CPU etc. on SMBus 1 to stacked memory package 1. In FIG. 20-5 the SMBus request 1 may be forwarded on SMBus 2 by one or more stacked memory packages (if present) e.g. as SMBus request 2, etc. In FIG. 20-5 the SMBus request 2 may be translated (e.g. operated on, transformed, changed, modified, split, joined, separated, altered, etc.) and portions forwarded (e.g. sent, transmitted, etc.) as SMBus request 3 to one or more stacked memory chips in the stacked memory package 1. In FIG. 20-5 stacked memory chip 1 may respond to SMBus request 3 with SMBus response 1. In FIG. 20-5 the logic chip may translate (e.g. interpret, change, modify, etc.) SMBus response 1 and portions forwarded as SMBus response 2. In FIG. 20-5 the SMBus response 2 may be forwarded by one or more stacked memory packages (if present) e.g. as SMBus response 3, etc. In FIG. 20-5 an SMBus response (temperature response 3) may be received by the CPU etc.

Of course SMBus 1 may be separate from or part of Memory Bus 1 (e.g. multiplexed, time multiplexed, encoded, etc.). Similarly SMBus 2, SMBus 3, etc. may be separate from or part of other buses, bus systems or interconnection (e.g. high-speed serial links, etc.).

In one embodiment the SMBus may use a separate physical connection (e.g. separate wires, separate connections, separate links, etc.) from the memory bus but may share logic (e.g. ACK/NACK logic, protocol logic, address resolution logic, time-out counters, error checking, alerts, etc.) with memory bus logic on one or more logic chips in a stacked memory package.

In one embodiment the SMBus logic and associated functions (e.g. temperature measurement, parameter read/write, etc.) may function (e.g. operate, etc.) at start-up etc. (e.g. initialization, power-up, power state or other system change events, etc.) before the memory high-speed serial links are functional (e.g. before they are configured, etc.). For example, the SMBus or equivalent connections may be used to provide information to the system in order to enable the higher performance serial links etc. to be initialized (e.g. configured, etc.).

Of course the SMBus connections (e.g. connections shown in FIG. 20-5 as SMBus, etc.) do not have to be SMBus connections or use the SMBus protocol. For example separate (e.g. sideband, out of band, etc.) signals or separate bus system(s) (e.g. using SMBus, non-SMBus, or both SMBus and non-SMbus, etc.) may be used to exchange (e.g. read and/or write, etc.) information between one or more stacked memory chips and/or other system components (e.g. CPU, etc.) before high-speed or other communication links are operational.

For example, such a bus system may be used where information such as link type, lane size, bus frequency etc. must be exchanged between system components at start-up etc.

For example, such a bus system may be used to provide one or more system components (e.g. CPU, etc.) with information about the stacked memory package(s) including (but not limited to) the following: size of stacked memory chips; number of stacked memory chips; type of stacked memory chip; organization of stacked memory chips (e.g. data width, ranks, banks, echelons, etc.); timing parameters of stacked memory chips; refresh parameters of stacked memory chips; frequency characteristics of stacked memory chips; etc. Such information may be stored, for example, in non-volatile memory (e.g. on the logic chip, as a separate system component, etc.).

As an option, the system for a stacked memory package may be implemented in the context of the architecture and environment of any previous Figure(s) and/or any subsequent Figure(s). Of course, however, the system for a stacked memory package may be implemented in the context of any desired environment.

FIG. 20-6

Command Interleave System for a Memory Subsystem

FIG. 20-6 shows a command interleave system for a memory subsystem using stacked memory chips, in accordance with another embodiment. As an option, the command interleave system may be implemented in the context of the architecture and environment of any previous and/or subsequent Figure(s). Of course, however, the command interleave system may be implemented in any desired environment.

In FIG. 20-6 the command interleave system 20-600 may comprise a sequence of commands sent by a CPU etc. to a stacked memory package. In FIG. 20-6 the sequence of requests (e.g. commands, etc.) in Tx stream 1 may be directed at stacked memory package 1. In FIG. 20-6 the example sequence of requests in Tx stream 1 may comprise the following: Read 1, a first read; Write 1.1, a first write with a first part of the write data; Read 2, a second read; Write 1.2, the second part of the write data for the first write. Notice that the Read 2 request is interleaved (e.g. inserted, included, embedded, etc.) between two parts of another request (Write 1.1 and Write 1.2).

In FIG. 20-6 the Rx stream 2 may consist of completions corresponding to the requests in Tx stream 1. For example, completions Read 1.1 and Read 1.2 may be responses to request Read 1; completions Read 2.1 and Read 2.2 may be responses to request Read 2. Notice that completion Read 2.2, for example, is interleaved between completions Read 1.1 and Read 1.2. Similarly completion Read 1.2 is interleaved between completions Read 2.2 and Read 2.1. Notice also that completions Read 2.2 and 2.1 are out-of-order. A unique request identification (e.g. ID, etc.) and completion sequence number (e.g. tag, etc.) may be used by the receiver to re-order the completions (e.g. packets, etc.).

In one embodiment of a memory subsystem using stacked memory packages requests may be interleaved.

In one embodiment of a memory subsystem using stacked memory packages completions may be out-of-order.

For example, the request packet length may be fixed at a length that optimizes performance (e.g. maximizes bandwidth, maximizes protocol efficiency, minimizes latency, etc.). However, it may be possible for one long request (e.g. a write request with a large amount of data, etc.) to prevent (e.g. starve, block, etc.) other requests from being serviced (e.g. read requests, etc.). By splitting large requests and using interleaving a memory system may avoid such blocking behavior.

As an option, the command interleave system may be implemented in the context of the architecture and environment of any previous Figure(s) and/or any subsequent Figure(s). Of course, however, the command interleave system may be implemented in the context of any desired environment.

FIG. 20-7

Resource Priority System for a Stacked Memory System

FIG. 20-7 shows a resource priority system for a stacked memory system, in accordance with another embodiment. As an option, the resource priority system for a stacked memory system may be implemented in the context of the architecture and environment of any previous and/or subsequent Figure(s). Of course, however, the resource priority system for a stacked memory system may be implemented in any desired environment.

In FIG. 20-7 the resource priority system 20-700 for stacked memory system comprises a command stream (command stream 1) that comprises a sequence of commands (e.g. transactions, requests, etc.). In FIG. 20-7 command stream 1 is directed (e.g. intended, targeted, routed, etc.) to stacked memory package 1. In FIG. 20-7 the logic chip in stacked memory package 1 converts (e.g. translates, modifies, changes, etc.) command stream 1 to command stream 2. In FIG. 20-7 command stream 2 is directed to one or more stacked memory chips in stacked memory package 1. In FIG. 20-7 each command in command stream 1 may require (e.g. may use, may be directed at, may make use of, etc.) one or more resources. In FIG. 20-7 a table is shown of the command streams and the resources required by each command stream. In FIG. 20-7 the resources required are shown as resource streams. In FIG. 20-7 a table is shown of commands in command stream 1 (command stream 1, under heading C1); resources required by command stream 1 (resource stream 1, under heading R1); commands in command stream 2 (command stream 2, under heading C2); resources required by command stream 2 (resource stream 2, under heading R2). For example, in FIG. 20-7 the first command (e.g. transaction, request, etc.) in command stream 1 is shown as T1R1.0. This command may be a read request from a CPU thread for example (e.g. generated by a particular CPU process, stream, warp, core, or equivalent, etc.). In FIG. 20-7 command T1R1.0 may be a read request from thread 1. In FIG. 20-7 command T1R1.0 may require resource 1.

In one embodiment the logic chip in a stacked memory package may be operable to modify one or more command streams according to one or more resources used by the one or more command streams.

For example, in FIG. 20-7 command stream 2 may be reordered so that commands from threads are grouped together. This may make accesses to memory addresses that are closer together (e.g. from a single thread, etc.) be grouped together and thus decrease contention and increase access speed, for example. For example, in FIG. 20-7 the resources may correspond to portions of the stacked memory chips (e.g. echelons, banks, ranks, subbanks, etc.).

Of course any resource in the memory system may be used (e.g. tracked, allocated, mapped, etc.). For example, different regions (e.g. portions, parts, etc.) of the stacked memory package may be in various sleep or other states (e.g. power managed, powered off, powered down, low-power, low frequency, etc.). If requests (e.g. commands, transactions, etc.) that require access to the regions are grouped together it may be possible to keep regions in powered down states for longer periods of time etc. in order to save power etc.

Of course the modification(s) to the command stream(s) may involve tracking more than one resource etc. For example commands may be ordered depending on the CPU thread, virtual channel (VC) used, and memory region required, etc.

Resources and/or constraints or other limits etc. that may be tracked may include (but are not limited to): command types (e.g. reads, writes, etc.); high-speed serial links; link capacity; traffic priority; power (e.g. battery power, power limits, etc.); timing constraints (e.g. latency, time-outs, etc.); logic chip 10 resources; CPU 10 and/or other resources; stacked memory package spare circuits; memory regions in the memory subsystem; flow control resources; buffers; crossbars; queues; virtual channels; virtual output channels; priority encoders; arbitration circuits; other logic chip circuits and/or resources; CPU cache(s); logic chip cache(s);

local cache; remote cache; IO devices and/or their components; scratch-pad memory; different types of memory in the memory subsystem; stacked memory packages; combinations of these and/or other resources, constraints, limits, etc.

Command stream modification may include (but is not limited to) the following: reordering of one or more commands, merging of one or more commands, splitting one or more commands, interleaving one or more commands of a first set of commands with one or more commands of a second set of commands; modifying one or more commands (e.g. changing one or more fields, data, information, addresses, etc.); creating one or more commands; retiming of one or more commands; inserting one or more commands; deleting one or more commands, etc.

As an option, the resource priority system for a stacked memory system may be implemented in the context of the architecture and environment of any previous Figure(s) and/or any subsequent Figure(s). Of course, however, the resource priority system for a stacked memory system may be implemented in the context of any desired environment.

FIG. 20-8

Memory Region Assignment System

FIG. 20-8 shows a memory region assignment system, in accordance with another embodiment. As an option, the memory region assignment system may be implemented in the context of the architecture and environment of any previous and/or subsequent Figure(s). Of course, however, the memory region assignment system may be implemented in any desired environment.

In FIG. 20-8 the memory region assignment system 20-800 comprises a stacked memory package containing one or more stacked memory chips. In FIG. 20-8 the stacked memory package comprises (e.g. is divided, may be divided, may be considered to contain, etc.) one or more memory regions. In FIG. 20-8 each memory region may correspond to (e.g. comprise, be made of, be constructed from, etc.) one or more (but not limited to) of the following: individual stacked memory chips; parts and/or portions and/or groups of portions of stacked memory chips (e.g. banks, subbanks, echelons, ranks, or groups of these etc.); memory located on one or more logic chips in the stacked memory package (e.g. SRAM, eDRAM, SDRAM, NAND flash, etc.); combinations of these, etc. For example, in FIG. 20-8 memory regions 1-4 may correspond to 4 stacked memory chips and memory region 5 may correspond to SRAM located on the logic chip, etc. The memory regions in the stacked memory package(s) may correspond to physical parts (e.g. portions, assemblies, packages, die, chips, physical boundaries, etc.) but need not. For example a stacked memory chip may be divided into one or more regions based on memory address etc. Thus memory regions may be considered to be either based on physical or logical boundaries or both.

Memory regions may not necessarily have the same physical properties. Thus for example, in FIG. 20-8, memory regions 1-4 may be SDRAM and memory region 5 may be SRAM. Thus in FIG. 20-8 for example, memory region 5 may have a much faster access time than memory regions 1-4.

In one embodiment a logic chip may map one or more portions of system memory space to one or more portions of one or more memory regions in one or more stacked memory packages.

For example the memory space of a CPU may be divided into two parts as shown in FIG. 20-8: a heap and a stack. The heap and stack may have different access patterns etc. For example the stack may have a more frequent and more random access pattern than the heap etc. It may thus be advantageous to map one or more parts (e.g. portions, areas, etc.) of system memory space to one or more memory regions. For example in FIG. 20-8 it may be advantageous to map the stack to memory region 5 and the heap to memory regions 1-4, etc.

Of course any mapping may be chosen (e.g. used, employed, imposed, created, etc.) between one or more portions of system memory space and portions of one or more memory regions.

For example in FIG. 20-8 the stack may be mapped to memory region 6 and memory region 4. A cache system may be employed (such as that shown in FIG. 2 for example) that may allow memory region 6 to be used as a cache for stack access to memory region 4, etc.

In one embodiment the memory regions may be dynamic.

For example, in FIG. 20-8 memory region 5 may be mapped from the heap and the stack. During a first phase (e.g. period, time, etc.) of operation the heap may be mapped to memory region 5 (and the stack mapped to another memory region). During a second phase of operation the mapping may be switched (e.g. changed, altered, reconfigured, etc.) so that the stack is mapped to memory region 5, etc. Switching memory regions may involve copy operations (e.g. block copy, page copy, etc.), cache invalidation, etc.

In one embodiment one or more memory regions may be copies.

For example in FIG. 20-8 memory region 4 may be maintained as a copy of memory region 5 (e.g. in the background, as a shadow, using log and/or transaction file(s), etc.). Thus for example, when it is required to dynamically switch memory region 5 to another memory region mapping (as described above for heap and stack for example), memory region 5 may be released and reused (e.g. repurposed, etc.).

Memory mapping to one or more memory regions may be achieved using one or more fields in the command set. For example, in FIG. 20-8, the requests may use one or more virtual channels. For example each virtual channel may map to one or more memory regions. The virtual channel to memory region mapping may be held by the logic chip and/or CPU. The virtual channel to memory region mapping may be established at start-up (e.g. initialization, boot time, power up, etc.) and/or programmed and/or reprogrammed (e.g. modified, altered, updated, etc.) at run time (e.g. during operation, during test and/or diagnostics, in sleep or other system states, etc.).

Of course any partitioning (e.g. subdivision, allocation, assignment, etc.) of system memory space may be used to map to one or more memory regions. For example the memory space may be divided according to CPU socket, to CPU core, to process, to user, to virtual machine, to IO device, etc.

As an option, the memory region assignment system may be implemented in the context of the architecture and environment of any previous Figure(s) and/or any subsequent Figure(s). Of course, however, the memory region assignment system may be implemented in the context of any desired environment.

FIG. 20-9

Transactional Memory System for Stacked Memory System

FIG. 20-9 shows a transactional memory system for stacked memory system, in accordance with another embodiment. As an option, the transactional memory system for stacked memory system may be implemented in the context of the architecture and environment of any previous and/or subsequent Figure(s). Of course, however, the transactional memory system for stacked memory system may be implemented in any desired environment.

In FIG. 20-9 the transactional memory system for stacked memory system 20-900 comprises one or more stacked memory packages; one or more Tx streams; one or more Rx streams. In FIG. 20-9 Tx stream 1 is routed (e.g. directed to, targeted at, etc.) stacked memory package 1. In FIG. 20-9 Rx stream 1 is the response stream (e.g. completions, read data, etc.) from stacked memory package 1. In FIG. 20-9 the Tx stream contains sequence of requests (e.g. transactions, commands, read request, write request, etc.). In FIG. 20-9 each of the requests in Tx stream 1 has an associated (e.g. corresponding, unique, identification, etc.) ID field. Thus for example in FIG. 20-9 the first request is transaction 1.1 operation 1.1 and has an ID of 1, etc. In FIG. 20-9 requests may be divided into one or more request categories. For example a first category of request may comprise read requests and write requests. For example a second category of requests may be transaction requests. There may be differences between request categories. For example one or more transaction category requests may be required to be completed as a group of operations or not completed at all. For example in FIG. 20-9 request ID 1 is a transaction category request (transaction 1.1 operation 1.1) that is a first request of a group (transaction 1) of transaction category requests. The second (and final or last) transaction category request for transaction 1 is transaction category request ID 3 (transaction 1.1 operation 1.2). For example it may be required that transaction 1.1 operation 1.1 must be completed and transaction 1.1 operation 1.2 must be completed as a group of transactions. If either transaction 1.1 operation 1.1 or transaction 1.1 operation 1.2 cannot be completed then neither should be completed (e.g. one or more operations may need to be reversed, etc.).

In one embodiment the request stream may include one or more request categories.

In one embodiment the request categories may include one or more transaction categories.

In one embodiment a transaction category may comprise one or more operations to be performed as transactions.

In one embodiment a group of operations to be performed as a transaction may be required to be completed as a group.

In one embodiment if one or more operations in a transaction are not completed then none of the operations are completed.

For example, in FIG. 20-9 the Rx stream may contain responses. The response with ID 5 is a read completion for request ID 5 (read 1.1). The response with ID 3 is a transaction completion for request ID 1 and request ID 3 completed as a group (e.g. group of two, pair, etc.) of operations (e.g. transaction 1.1 operation 1.1 and transaction 1.1 and operation 1.2). The response with ID 2 is a write completion for request ID2 (write 1.1). Note that completions may be out of order. Note that write requests may be posted (e.g. without completions, etc.). Note that read completions may be split (e.g. more than one read completion for each read request, etc.). Note that completions may be interleaved. Note that not all completions for all requests are shown in FIG. 20-9 (e.g. any completions for request ID 4, request ID 6, request ID 7 are not shown, etc.).

As an option, the transactional memory system for stacked memory system may be implemented in the context of the architecture and environment of any previous Figure(s) and/or any subsequent Figure(s). Of course, however, the transactional memory system for stacked memory system may be implemented in the context of any desired environment.

FIG. 20-10

Buffer IO System for Stacked Memory Devices

FIG. 20-10 shows a buffer IO system for stacked memory devices, in accordance with another embodiment. As an option, the buffer 10 system for stacked memory devices may be implemented in the context of the architecture and environment of any previous and/or subsequent Figure(s). Of course, however, the buffer IO system for stacked memory devices may be implemented in any desired environment.

In FIG. 20-10 the buffer IO system for stacked memory devices 20-1000 comprises a memory subsystem including one or more stacked memory packages (e.g. stacked memory devices, stacked memory assemblies, etc.) and one or more IO devices. In FIG. 20-10 a stacked memory package (stacked memory package 1) may be connected (e.g. coupled, linked, etc.) to one or more devices. In FIG. 20-10 stacked memory package 1 may be connected to one or more other stacked memory packages. In FIG. 20-10 stacked memory package 1 is connected to an IO device using Tx stream 3 and Rx stream 3 for example.

In one embodiment an IO buffer system comprising one or more IO buffers may be located in the logic chip of a stacked memory package in a memory system using stacked memory devices.

In one embodiment an IO buffer system comprising one or more IO buffers may be located in an IO device of a memory system using stacked memory devices.

For example, in FIG. 20-10 there are two buffers: Rx buffer, Tx buffer. For each buffer there may be one or more pointers (e.g. labels, flags, indexes, indicators, references, etc.). A pointer may act as a reference to a location (e.g. cell, address, store, etc.) in a buffer. For example, in FIG. 20-10 each buffer may have two pointers. In FIG. 20-10 the Rx buffer has 16 storage locations. In FIG. 20-10 Rx buffer pointer 1 points to location 3 and Rx buffer pointer 2 points to location 12. In FIG. 20-10 for example Rx buffer pointer 1 may point to the start of data and Rx buffer pointer 2 may point to the end of data. In FIG. 20-10 the buffers may be circular (e.g. ring, continuous, etc.) buffers so that once a pointer reaches the end location (location 15) the pointer wraps around to point to the start of the buffer (location 0).

In one embodiment one or more IO buffers may be ring buffers.

In one embodiment the IO ring buffers may be part of the logic chip in a stacked memory package.

For example the ring buffers may be part of one or more logic blocks in the logic chip of a stacked memory package including (but not limited to) one or more of the following logic blocks: PHY layer, data link layer, RxXBAR, RXARB, RxTxXBAR, TXARB, TxFIFO, etc.

As an option, the buffer IO system for stacked memory devices may be implemented in the context of the architecture and environment of any previous Figure(s) and/or any subsequent Figure(s). Of course, however, the buffer IO system for stacked memory devices may be implemented in the context of any desired environment.

FIG. 20-11

Direct Memory Access (DMA) System for Stacked Memory Devices

FIG. 20-11 shows a Direct Memory Access (DMA) system for stacked memory devices, in accordance with another embodiment. As an option, the DMA system for stacked memory devices may be implemented in the context of the architecture and environment of any previous and/or subsequent Figure(s). Of course, however, the DMA system for stacked memory devices may be implemented in any desired environment.

In FIG. 20-11 the DMA system for stacked memory devices may comprise a memory system including one or more stacked memory packages and one or more IO devices. In FIG. 20-11 the logic chip of a stacked memory package may include (but is not limited to) one or more of the following logic blocks: Tx data buffer, DMA engine, Rx data buffer, address translation, cache control, polling and interrupt, memory data path.

In one embodiment the logic chip of a stacked memory package may include a direct memory access system.

For example, in FIG. 20-11 the IO device may be operable to be coupled to a DMA engine. The DMA engine may be responsible for loading and storing address information. The address information may include a list of addresses where information is to be fetched from (e.g. read from, received from, etc.) an IO device for example. The address information may include a list of addresses where information is to be stored in (e.g. sent to, transmitted to, etc.) an IO device for example. The address information may be in the form of addresses of one or more blocks (e.g. contiguous blocks(s), address range(s), etc.) or may be in the form of one or more series of smaller blocks (e.g. scatter-gather list(s), memory descriptor list(s) (MDL), etc.).

For example in FIG. 20-11 the IO device may transfer IO data using the DMA engine to one or more Rx data buffers. The Rx data buffers may be circular buffers or ring buffers as described for example in FIG. 20-10 and the accompanying text. For example in FIG. 20-11 the IO device may receive IO data from one or more Tx data buffers. The Tx data buffers may be circular buffers or ring buffers as described for example in FIG. 20-10 and the accompanying text.

For example in FIG. 20-11 the Rx data buffer may forward IO data to the stacked memory. For example in FIG. 20-11 the Rx data buffer may forward data to the CPU and/or CPU cache (e.g. using direct cache injection (DCI), etc.) via the address translation and the cache control logic blocks. For example in FIG. 20-11 the IO data may bypass one or more portions of the memory data path. In FIG. 20-11 the address translation logic block may translate addresses from the IO space of the IO device to the memory space of CPU etc. In FIG. 20-11 the cache control logic block may handle (e.g. using messages, etc.) the cache coherency of the CPU memory space and CPU cache(s) as part of the IO system control function(s) etc.

For example in FIG. 20-11 the polling and interrupt logic block may be responsible for controlling the mode of memory access control between one or more (but not limited to) the following: polling (e.g. continuous status queries, etc.); interrupt (e.g. raising, asserting etc. system interrupt(s), etc.); DMA (e.g. automated continuous incremental address access, etc.); combinations of these and/or other memory access means, etc.

As an option, the DMA system for stacked memory devices may be implemented in the context of the architecture and environment of any previous Figure(s) and/or any subsequent Figure(s). Of course, however, the DMA system for stacked memory devices may be implemented in the context of any desired environment.

FIG. 20-12

Copy Engine for a Stacked Memory Device

FIG. 20-12 shows a copy engine for a stacked memory device, in accordance with another embodiment. As an option, the copy engine for a stacked memory device may be implemented in the context of the architecture and environment of any previous and/or subsequent Figure(s). Of course, however, the copy engine for a stacked memory device may be implemented in any desired environment.

In FIG. 20-12 the copy engine for a stacked memory device may comprise a logic chip in a stacked memory package that may include one or more of each of the following circuit blocks and/or functions (but limited to the following): copy engine, address counters, command decode, copy buffer, etc.

In FIG. 20-12 a request may be received from the CPU etc. The request may contain one or more of each of the following information (e.g. data, fields, parameters, etc.) but is not limited to the following: ID (e.g. request ID, tag, identification, etc.); CHK (e.g. copy command, command code, command field, instruction, etc.); Module (e.g. target module identification, target stacked memory package number, etc.); ADDR1 (e.g. a first address, pointer, list(s), MDL, scatter-gather list(s), source list(s), etc.); ADDR2 (e.g. a second address, list(s), destination address(es), destination list(s), etc.), etc.

In one embodiment the logic chip in a stacked memory package may contain one or more copy engines.

In FIG. 20-12 the copy engine may receive a copy request (e.g. copy, checkpoint (CHK), backup, mirror, etc.) and copy a range (e.g. block, blocks, areas, part(s), portion(s), etc.) of addresses from a first location or set of locations to a second location or set of locations, etc.

For example in a memory system it may be required to checkpoint a range of addresses (e.g. data, information, etc.) stored in volatile memory to a range of addresses stored in non-volatile memory. The CPU may issue a request including a copy command (e.g. checkpoint (CHK), etc.) with a first address range ADDR1 and a second address range ADDR2. The logic chip in a stacked memory package may receive the request and may decode the command. The logic chip may then perform the copy using one or more copy engines etc.

For example in FIG. 20-12 the stacked memory package may receive a request. The stacked memory package may determine that the request is targeted to (e.g. routed to, intended for, the target is, etc.) itself. The determination may be made by using the target module field in the request and/or by decoding, checking etc. one or more address fields etc. In FIG. 20-12 the command decode block may receive the copy command and decode the copy command field as CHK or checkpoint etc. The command decode block may then transfer (e.g. load, store, route, pass, etc.) one or more parts and/or portions of the ADDR1, ADDR2, etc. fields in the copy request to one or more address counters.

In one embodiment a copy command may consist of one or more copy requests.

In FIG. 20-11 the address counters may be used by the copy engine to access one or more regions (e.g. areas, address ranges, parts, portions, etc.) of one or more stacked memory chips and/or other storage on the logic chip and/or other storage on one or more remote stacked memory packages and/or other remote storage (e.g. IO devices, other system components, CPUs, CPU cores, CPU cache(s), buffer(s), other memory system components, other memory subsystem components, remote stacked memory packages, remote logic chips, etc.), combinations of these and other storage locations, etc.

In FIG. 20-11 the copy engine may use one or more copy buffers located on the logic chip (as shown in FIG. 20-11) or located on one or more of the stacked memory chips (not shown in FIG. 20-11) and/or both and/or using other storage, buffer, memory etc.

For example, the copy engine may perform copies between a first stacked memory chip in a stacked memory package and a second memory chip in a stacked memory package. For example, the copy engine may perform copies between a first part or one or more portion(s) of a first stacked memory chip in a stacked memory package and a second part or one or more portion(s) of the first memory chip in a stacked memory package. For example, the copy engine may perform copies between a first stacked memory package and a second stacked memory package. For example, the copy engine may perform copies between a stacked memory package and a system component that is not a stacked memory package (e.g. CPU, IO device, etc.). For example, the copy engine may perform copies between a first type of stacked memory chip (e.g. volatile memory, etc.) in a first stacked memory package and a second type (e.g. nonvolatile memory, etc.) of memory chip in the first stacked memory package. For example, the copy engine may perform copies between a first type of stacked memory chip (e.g. volatile memory, etc.) in a first stacked memory package and a second type (e.g. nonvolatile memory, etc.) of memory chip in a second stacked memory package.

As an option, the copy engine for a stacked memory device may be implemented in the context of the architecture and environment of any previous Figure(s) and/or any subsequent Figure(s). Of course, however, the copy engine for a stacked memory device may be implemented in the context of any desired environment.

FIG. 20-13

Flush System for a Stacked Memory Device

FIG. 20-13 shows a flush system for a stacked memory device, in accordance with another embodiment. As an option, the flush system for a stacked memory device may be implemented in the context of the architecture and environment of any previous and/or subsequent Figure(s). Of course, however, the flush system for a stacked memory device may be implemented in any desired environment.

In FIG. 20-13 the flush system for a stacked memory device comprises one or more stacked memory packages in a memory system and one or more IO devices. In FIG. 20-13 the flush system for a stacked memory device may also include a storage device (e.g. rotating disk, SSD, tape, nonvolatile storage, NAND flash, solid-state storage, non-volatile memory, battery-backed storage, optical storage, etc.).

In FIG. 20-13 a request may be received from the CPU etc. The request may contain one or more of each of the following information (e.g. data, fields, parameters, etc.) but is not limited to the following: ID (e.g. request ID, tag, identification, etc.); FLUSH (e.g. flush command, command code, command field, instruction, etc.); Module (e.g. target module identification, target stacked memory package number, etc.); ADDR1 (e.g. a first address, pointer, list, MDL, scatter-gather list, etc.); ADDR2 (e.g. a second address, list, etc.), etc.

In one embodiment the logic chip in a stacked memory package may contain a flush system.

In one embodiment the flush system may be used to flush volatile data to nonvolatile storage.

In FIG. 20-13 the logic chip may receive a flush request (e.g. flush, backup, write-through, etc.) and flush (e.g. write, copy, transfer, mirror, write-through, etc.) a range (e.g. block, blocks, areas, part(s), portion(s), etc.) of addresses from a first location or set of locations to a second location or set of locations, etc.

For example in a memory system it may be required to commit (e.g. write permanently, give assurance that data is stored permanently, etc.) a range of addresses (e.g. data, information, etc.) stored in volatile memory to a range of addresses stored in non-volatile memory. The data to be flushed may for example be stored in one or more caches in the memory system. The CPU may issue one or more requests including one or more flush commands. A flush command may contain (but not necessarily contain) address information (e.g. parameters, arguments, etc.) for the flush command. The address information may for example include a first address range ADDR1 (e.g. source, etc.) and a second address range ADDR2 (e.g. target, destination, etc.). The logic chip in a stacked memory package may receive the flush request and may decode the flush command. The logic chip may then perform the flush operation(s). The flush operation(s) may be completed for example using one or more copy engines, such as those described in FIG. 20-12 and the accompanying text.

For example in FIG. 20-13 the stacked memory package may receive a request. The stacked memory package may determine that the request is targeted to (e.g. routed to, intended for, the target is, etc.) itself. The determination may be made by using the target module field in the request and/or by decoding, checking etc. one or more address fields etc. The logic chip may then determine that the request is a flush request etc.

As an option, the flush system for a stacked memory device may be implemented in the context of the architecture and environment of any previous Figure(s) and/or any subsequent Figure(s). Of course, however, the flush system for a stacked memory device may be implemented in the context of any desired environment.

FIG. 20-14

Power Management System for a Stacked Memory Package

FIG. 20-14 shows a power management system for a stacked memory package, in accordance with another embodiment. As an option, the power management system for a stacked memory package may be implemented in the context of the architecture and environment of any previous and/or subsequent Figure(s). Of course, however, the power management system for a stacked memory package may be implemented in any desired environment.

In FIG. 20-14 the power management system for a stacked memory package 20-1400 may comprise one or more stacked memory packages in a memory system. The stacked memory packages may be operable to be managed (e.g. power managed, otherwise managed, etc.). For example, in FIG. 20-14 the CPU or other system component may alter (e.g. change, modify, configure, program, reprogram, reconfigure, etc.) one or more properties of the one or more stacked memory packages. For example, the frequency of one or more buses (e.g. links, lanes, high-speed serial links, connections, external connections, internal buses, clock frequencies, network on chip operating frequencies, signal rates, etc.) may be altered. For example the power consumptions (e.g. voltage supply, current draw, resistance, drive strength, termination resistance, operating power, duty cycle, etc.) of one or more system components may be altered etc.

In one embodiment a memory system using one or more stacked memory packages may be managed. In one embodiment the memory system management system may include management systems on one or more stacked memory packages. In one embodiment the memory system management system may be operable to alter one or more properties of one or more stacked memory packages. In one embodiment a stacked memory package may include a management system.

In one embodiment the management system of a stacked memory package may be operable to alter one or more system properties. In one embodiment the system properties of a stacked memory package that may be managed may include power. In one embodiment the managed system properties of a memory system using one or more stacked memory packages may include circuit frequency. In one embodiment the managed circuit frequency may include bus frequency.

In one embodiment the managed circuit frequency may include clock frequency. In one embodiment the managed system properties of a memory system using one or more stacked memory packages may include one or more circuit supply voltages. In one embodiment the managed system properties of a memory system using one or more stacked memory packages may include one or more circuit termination resistances.

In one embodiment the managed system properties of a memory system using one or more stacked memory packages may include one or more circuit currents. In one embodiment the managed system properties of a memory system using one or more stacked memory packages may include one or more circuit configurations.

In FIG. 20-14 a request may be received from the CPU etc. The request may be a FREQUENCY request. The FREQUENCY request may be intended to change (e.g. update, modify, alter, increase, decrease, reprogram, etc.) the frequency (e.g. clock frequency, bus frequency, combinations of these etc.) of one or more circuits (e.g. components, buses, links, buffers, etc.) in one or more logic chips, one or more stacked memory packages, etc.

The FREQUENCY request may contain one or more of each of the following information (e.g. data, fields, parameters, etc.) but is not limited to the following: ID (e.g. request ID, tag, identification, etc.); FREQUENCY (e.g. change frequency command, command code, command field, instruction, etc.); Data (e.g. frequency, frequency code, frequency identification, frequency multipliers (e.g. 2×, 3×, etc.), index to a table, tables(s) of values, pointer to a value, combinations of these, sets of these, etc.); Module (e.g. target module identification, target stacked memory package number, etc.); BUS1 (e.g. a first bus identification field, list, code, etc.); BUS2 (e.g. a second bus field, list, etc.), etc.

For example in FIG. 20-14 the stacked memory package may receive a request. The stacked memory package may determine that the request is targeted to (e.g. routed to, intended for, the target is, etc.) itself. The determination may be made by using the target module field in the request and/or by decoding, checking etc. one or more address fields etc. The logic chip may then determine that the request is a frequency change request etc.

In FIG. 20-14 the frequency of a bus (e.g. high-sped serial link(s), lane(s), SMBus, other bus, combinations of busses, etc.) that may connect two or more components (e.g. CPU to stacked memory package, stacked memory package to stacked memory package, stacked memory package to IO device, etc.) may be changed in a number of ways. For example, a frequency change request may be sent to each of the transmitters. Thus, for example, in FIG. 20-14 a first frequency change request may be sent to logic chip 1 to change the frequency of logic chip 1-2 Tx link and a second frequency change request may be sent to logic chip 2 to change the frequency of logic chip 2-1 Tx link etc.

For example, in FIG. 20-14 the data traffic (e.g. requests, responses, messages, etc.) between two or more system components may be controlled (e.g. stopped, halted, paused, stalled, etc.) when a change in the properties of one or more connections between the two or more system components is made. For example, in FIG. 20-14 if the connections between two or more system components use multiple links, multiple lanes, configurable links and/or lanes etc. then the width (e.g. number, pairing, etc.) of lanes, links etc. may be modified separately. Thus for example a connection C1 between system component A and system component B may use a link K1 with four lanes L1-L4. System component A and system component B may be CPUs, stacked memory packages, IO devices etc. It may be desired to change the frequency of connection C1. A first method may stop or pause data traffic on connection C1 as described above. A second method may reconfigure lanes L1-L4 separately. For example first all traffic may be diverted to lanes L1-L2, then lanes L3-L4 may be changed in frequency (e.g. reconfigured, otherwise changed, etc.), then all traffic diverted to lanes L3-L4, then lanes L1-L2 may be changed in frequency (or otherwise reconfigured, etc.), then all traffic diverted to lanes L1-L4 etc.

In FIG. 20-14 a request may be received from the CPU etc. The request may be a VOLTAGE request. The VOLTAGE request may be intended to change (e.g. update, modify, alter, increase, decrease, reprogram, etc.) one or more supply voltages (e.g. reference voltage(s), termination voltage(s), bias voltage(s), back-bias voltages, programming voltages, precharge voltages, emphasis voltages, preemphasis voltages, VDD, VCC, supply voltage(s), combinations of these etc.) of one or more circuits (e.g. components, buses, links, buffers, receivers, drivers, memory circuits, chips, die, subcircuits, circuit blocks, IO circuits, IO transceivers, controllers, decoders, reference generators, back-bias generators, etc.) in one or more logic chips, one or more stacked memory packages, etc.

Of course changes in system properties are not limited to change and/or management of frequency and/or voltage. Of course any parameter (e.g. number, code, current, resistance, capacitance, inductance, encoded value, index, combinations of these, etc.) may be included in a system a management command. Of course any number, type and form of system management command(s) may be used.

In FIG. 20-14 the VOLTAGE request may contain one or more of each of the following information (e.g. data, fields, parameters, etc.) but is not limited to the following: ID (e.g. request ID, tag, identification, etc.); VOLTAGE (e.g. change voltage command, command code, command field, instruction, etc.); Data (e.g. voltage(s), voltage code(s), voltage identification, index to voltage table(s), etc.); Module (e.g. target module identification, target stacked memory package number, etc.); BUS1 (e.g. a first bus identification field, list, code, etc.); BUS2 (e.g. a second bus field, list, etc.), etc.

For example in FIG. 20-14 the stacked memory package may receive a request. The stacked memory package may determine that the request is targeted to (e.g. routed to, intended for, the target is, etc.) itself. The determination may be made by using the target module field in the request and/or by decoding, checking etc. one or more address fields etc. The logic chip may then determine that the request is a voltage change request etc.

For example in FIG. 20-14 the voltages or other properties of one or more system components, circuits within system components, subcircuits, circuits and/or chips within packages, circuits connecting two or more system components etc. may be changed in a number of ways. For example circuits may be stopped, paused, switched off, disconnected, reconfigured, placed in sleep state(s), etc. For example circuits may be partially reconfigured (e.g. voltages, frequency, other properties, etc. changed) so that part(s), portion(s), branches, subcircuits, etc. may be reconfigured while remaining parts etc. continue to perform (e.g. operate, function, execute, etc.). In this fashion, following a method or methods such as that described above for a bus frequency change, circuit(s) may be partially configured or partially reconfigured in successive parts (e.g. sets, groups, subsets, etc.) so that the circuit(s) and/or block(s) etc. remain functional (e.g. continues to function, operate, execute, connect, etc.) during configuration and/or reconfiguration etc.

As an option, the power management system for a stacked memory package may be implemented in the context of the architecture and environment of any previous Figure(s) and/or any subsequent Figure(s). Of course, however, the power management system for a stacked memory package may be implemented in the context of any desired environment.

FIG. 20-15

Data Merging System for a Stacked Memory Package

FIG. 20-15 shows a data merging system for a stacked memory package, in accordance with another embodiment. As an option, the data merging system for a stacked memory package may be implemented in the context of the architecture and environment of any previous and/or subsequent Figure(s). Of course, however, the data merging system for a stacked memory package may be implemented in any desired environment.

In FIG. 20-15 the data merging system for a stacked memory package 20-1500 may comprise one or more circuits in a stacked memory package that may be operable to combine two or more streams of data from one or more stacked memory chips.

For example in FIG. 20-15 each memory chip in a stacked memory package may have one or more buses. For example in FIG. 20-15 each memory chip has one or more of each of the following bus types (but is not limited to the following bus types; for example supply and reference signals and/or busses are not shown in FIG. 20-15 etc.): address bus (e.g. may be a separate bus, may be merged or multiplexed with one or more other bus types, etc.); control bus (e.g. a collection of control and/or enable etc. signals such as CS, CKE, etc; may be a series of separate control signals; may include one or more signals that are also part(s) of other buses etc.); data bus (e.g. a bidirectional bus, two or more separate unidirectional buses, may be a multiplexed bus, etc.).

In FIG. 20-15 each stacked memory chip bus has been shown as separately connected to the logic chip in the stacked memory package. Each bus may be separate (as shown in FIG. 20-15) or multiplexed between stacked memory chips (e.g. dotted, wired-OR, shared, etc.). The sharing of buses may be determined for example by the protocol used (e.g. some JEDEC standard DDR protocols may cause one or more bus collisions (e.g. contention, etc.) when certain buses are shared, etc.).

In FIG. 20-15 the logic chip may be connected to each stacked memory chip using data bus 0, data bus 1, data bus 2, and data bus 3. In FIG. 20-15 a portion of a read operation is shown. In FIG. 20-15 data may be read from stacked memory chip 3 onto data bus 3. In FIG. 20-15 the data (with label 1) may appear on (e.g. is loaded onto, is driven onto, is connected to, etc.) data bus 0 at time t1 and is present on (e.g. driven onto, loaded onto, valid, etc.) data bus 0 until time t2. In FIG. 20-15 data from one or more other sources (e.g. stacked memory chips; regions, portions, parts etc. of stacked memory chips; combinations of these; etc.) may also be present on data bus 1, data bus 2, data bus 3. In FIG. 20-15 each stacked memory chip has a separate data bus, but this need not be the case. For example each stacked memory chip may have more than one data bus etc. In FIG. 20-15 data from data bus 0, data bus 1, data bus 2, data bus 3 is merged (e.g. combined, multiplexed, etc.) onto memory bus 1. In FIG. 20-15 data from data bus 0 (label 1) is merged with data from data bus 1 (label 2) and with data from data bus 2 (label 3) and with data from data bus 3 (label 4) such that the merged data is placed on memory bus 1 in the order 1, 2, 3, 4. Of course any order of merging may be used. In FIG. 20-15 the data is merged onto memory bus 1 so that data is present from time t3 until time t4. Note that time period (t4−t3) need not necessarily be equal to time period 4×(t2−t1). For example bus memory bus 1 may run at twice the frequency of data bus 0, data bus 1, data bus 2, and data bus 3. In that case the time period (t4−t3) may be 2×(t2−t1) for example. Note that data bus 0, data bus 1, data bus 2, data bus 3 do not necessarily have to run at the same frequency (or even use the same protocol, signaling scheme, etc.). Note that memory bus 1 may be a high-speed serial link that may be composed of multiple lanes. Thus for example the signals shown in FIG. 20-15 for memory bus 1 may be split across several parts or portions of a high-speed bus etc. Of course any number, type (e.g. serial, parallel, point to point, multidrop, serial, split transaction, etc.), style (e.g. single-data rate, double-data rate, etc.), direction (e.g. bidirectional, unidirectional, etc.), or manner of data bus(es) or combinations of data buses, connections, links, lanes, signals, couplings, etc. may be used for merging.

In FIG. 20-15 the merge unit of information shown for example on data bus 0 between time t1 and time t2 (with label 1) may be any number of bits of data. For example in a stacked memory package that uses SDRAM as stacked memory chips it may be advantageous to use the burst length, multiple of the burst length, submultiple (e.g. fraction, integer fraction, 0.5, etc.) of the burst length as the merge unit of information. Of course the merge unit of information may be any length. The merge unit(s) of information need not be uniform and/or constant (e.g. the merge unit of information may be different between data bus 0 and data bus 1, etc; the merge unit(s) of information may vary with time, configuration, etc; the merge unit(s) of information may be changed during operation (e.g. be managed by a system such as that shown in FIG. 20-14, etc.); the merge unit(s) of information may vary by command (e.g. burst read, burst chop, etc.); or may be combinations of these factors, etc.).

As an option, the data merging system for a stacked memory package may be implemented in the context of the architecture and environment of any previous Figure(s) and/or any subsequent Figure(s). Of course, however, the data merging system for a stacked memory package may be implemented in the context of any desired environment.

FIG. 20-16

Hot Plug System for a Memory System Using Stacked Memory Packages

FIG. 20-16 shows a hot plug system for a memory system using stacked memory packages, in accordance with another embodiment. As an option, the hot plug system for a memory system using stacked memory packages may be implemented in the context of the architecture and environment of any previous and/or subsequent Figure(s). Of course, however, the hot plug system for a memory system using stacked memory packages may be implemented in any desired environment.

In FIG. 20-16 the hot plug system for a memory system using stacked memory packages 20-1600 may comprise one or more stacked memory packages that may be inserted (e.g. hot plugged, attached, coupled, connected, plugged in, added, combinations of these, etc.) and/or removed (e.g. detached, uncoupled, disconnected, combinations of these, etc.) during system operation (e.g. while the system is hot, while the system is executing, while the system is running, combinations of these, etc.).

In FIG. 20-16 stacked memory package 2 may be hot-plugged into the memory system. The memory system may be alerted to the presence of stacked memory package 2 by several means. For example a power signal (e.g. supply voltage, logic signal hard-wired to a power supply, combinations of these, etc.) may be applied to stacked memory package 1 when stacked memory package 2 is hot-plugged. For example a signal on a sideband bus (e.g. SMBus as shown in FIG. 20-5 and the accompanying text, other sideband signals, logic signals, combinations of these, etc.) may be used to indicate the presence of a hot-plugged stacked memory package. For example the user may indicate (e.g. initiate, request, combinations of these, etc.) a hot-plug event using an indicator (e.g. a switch, a push button, a lever connected to an electrical switch, a logic signal driven by a console application or other software, combinations of these, etc.).

Of course the stacked memory chip that is hot-plugged into the memory system may take several forms. For example, additional memory may be hot plugged into the memory system by adding additional memory chips in various package and/or assembly and/or module forms. The added memory chips may be separately packaged together with a logic chip. The added memory chips may be separately packaged without a logic chip and may share, for example, the logic functions on one or more logic chips on one or more existing stacked memory packages.

For example, additional memory may be added as one or more stacked memory packages that are added to empty sockets on a mother board. For example, additional memory may be added as one or more stacked memory packages that are added to sockets on an existing stacked memory package. For example, additional memory may be added as one or more stacked memory packages that are added to empty sockets on a module (e.g. DIMM, SIMM, other module or card, combinations of these, etc.) and/or other similar modular and/or other mechanical and/or electrical assembly containing one or more stacked memory packages.

Stacked memory may be added as one or more brick-like components that may snap and/or otherwise connect and/or may be coupled together into larger assemblies etc. The components may be coupled and/or connected using a variety of means including (but not limited to) one or more of the following: electrical connectors (e.g. plug and socket, land-grid array, pogo pins, card and socket, male/female, etc.); optical connectors (e.g. optical fibers, optical couplers, optical waveguides and connectors, etc.); wireless or other non-contact or close proximity coupling (e.g. near-field communication, inductive coupling (e.g. using primarily magnetic fields, H field, etc.), capacitive coupling (e.g. using primarily electric fields, E fields, etc.); wireless coupling (e.g. using both electric and magnetic fields, etc.); using evanescent wave modes of coupling; combinations of these and/or other coupling/connecting means; etc.).

In FIG. 20-16 hot removal may follow the reverse procedure or similar procedure for hot coupling. For example, a warning (e.g. hot removal, removal, etc.) signal may generated (e.g. by removal of one or more power signals, by pressing of a button, triggered by a mechanical interlock switch, triggered by staged insertion of a card into a socket, by a timed or other staged sequence of logic and/or power signal connection(s), etc.). For example, a removal signal may trigger graceful (e.g. controlled, failsafe, staged, ordered, etc.) shutdown of physical and/or logical connections (e.g. buses, signals, links, operations, commands, etc.) between the hot removal component and the rest of the memory subsystem. For example one or more logic chips, in one or more stacked memory packages and/or other system components, and acting separately or in combination (e.g. cooperatively, etc.), may act or be operable to perform graceful shutdown, For example, one or more indicators (e.g. red LED, other LED or lamp, audio signal, logic signal, combinations of these, etc.) may be used to indicate to the user that hot removal is not ready (e.g. not permitted, not currently possible without error, not currently available, combinations of these, etc.). For example, one or more actions and/or events (e.g. user actions, operator actions, system actions, software signals, logic signals, combinations of these, etc.) may be used to request hot removal (e.g. mechanical switch, lever, electrical signal, pushbutton, combinations of these, etc.). For example, one or more indicators (e.g. green LED, other LED or lamp, audio signal, logic signal, combinations of these, etc.) may be used to indicate to the user that hot removal may be completed (e.g. is ready, may be performed, is allowed, combinations of these, etc.). For example, one or more signals that may control, signal or otherwise indicate or be used as indicators may use an SMBus or other similar control bus, as described in FIG. 20-5 and the accompanying text.

Of course hot plug and hot removal may not require physical (e.g. mechanical, visible, etc.) operations and/or user interventions (e.g. a user pushing buttons, removing components, etc.). For example, the system (e.g. a user, autonomously, etc.) may decide to disconnect (e.g. hot remove, hot disconnect, etc.) one or more system components (e.g. CPUs, stacked memory packages, IO devices, etc.) during operation (e.g. faulty component, etc.). For example, the system may decide to disconnect one or more system components during operation to save power, etc. For example the system may perform start-up and/or initialization by gradually (e.g. sequentially, one after another, in a staged fashion, in a controlled fashion, etc.) adding one or more stacked memory packages and/or other connected system components (e.g. CPUs, IO devices, etc.) using one or more procedures and/or methods either substantially similar to hot plug/remove methods described above, or using portions of the methods described above, or using the same methods described above.

As an option, the hot plug system for a memory system using stacked memory packages may be implemented in the context of the architecture and environment of any previous Figure(s) and/or any subsequent Figure(s). Of course, however, the hot plug system for a memory system using stacked memory packages may be implemented in the context of any desired environment.

FIG. 20-17

Compression System for a Stacked Memory Package

FIG. 20-17 shows a compression system for a stacked memory package, in accordance with another embodiment. As an option, the compression system for a stacked memory package may be implemented in the context of the architecture and environment of any previous and/or subsequent Figure(s). Of course, however, the compression system for a stacked memory package may be implemented in any desired environment.

In FIG. 20-17 the compression system for a stacked memory package 20-1700 may comprise one or more stacked memory packages in a memory system.

In FIG. 20-17 the compression system for a stacked memory package 20-1700 may comprise one or more circuits in one or more stacked memory packages that may be operable to compress and/or decompress one or more streams of data from one or more stacked memory chips and/or other storage/memory.

In FIG. 20-17 the compression system for a stacked memory package 20-1700 may comprise a logic chip in a stacked memory package that may include one or more of each of the following circuit blocks and/or functions (but not limited to the following): PHY and data layer, command decode, decompression, compression, address lookup, address table, etc.

In one embodiment the logic chip in a stacked memory package may be operable to compress data.

In one embodiment the logic chip in a stacked memory package may be operable to decompress data.

For example, in FIG. 20-17 the CPU may send data to one or more stacked memory packages. In FIG. 20-17 the PHY and data layer circuit block(s) may provide one or more fields (e.g. command code, command field, address(es), other packet data and/or information, etc.) to the command decode block. The command decode block may then provide a signal to the compression and decompression blocks that may determine whether data is to be compressed and/or decompressed. For example, in FIG. 20-17 the command decode block may provide one or more addresses to the address lookup block. In FIG. 20-17 the address lookup block may lookup (e.g. index, point to, chain to, etc.) one or more address tables. In FIG. 20-17 the address tables may contain one or more addresses and/or one or more address ranges (e.g. regions, areas, portions, parts, etc.) of the memory system. In FIG. 20-17 the one or more areas of the memory system in the one or more address tables may correspond to areas that are to be compressed/decompressed (e.g. a flag or other indicator for compressed regions, for not compressed regions, or both, etc.). For example, the address tables may be loaded (e.g. stored, created, updated, modified, programmed, etc.) at start-up and/or during operation using one or more messages from the CPU, using an SMBus or other control bus such as that shown in FIG. 20-5 for example, using combinations of these and/or other methods, etc.

Of course any mechanism (e.g. method, procedure, algorithm, etc.) may be used to decide which parts, portions, areas, etc. of memory may be compressed and/or decompressed. Of course all of the data stored in one or more stacked memory chips may be compressed and/or decompressed. Of course some data may be written to one or more stacked memory chips as already compressed. For example, in some cases the CPU (or other system component, IO device, etc.) may perform part of or all of the compression and/or decompression steps and/or any other operations on one or more data streams.

For example, the CPU may send some (e.g. part of a data stream, portions of a data stream, some (e.g. one or more, etc.) packets, some data streams, some virtual channels, some addresses, etc.) data to the one or more stacked memory packages that may be already compressed. For example the CPU may read (e.g. using particular commands, using one or more virtual channels, etc.) data that is stored as compressed data in memory, etc. For example, the stacked memory packages may perform further compression and/or decompression steps and/or other operations on data that may already be compressed (e.g. nested compression, etc.).

Of course the operation(s) on the data streams may be more than simple compression/decompression etc. For example the operations performed may include (but are not limited to) one or more of the following: encoding (e.g. video, audio, etc.); decoding (e.g. video, audio, etc.); virus or other scanning (e.g. pattern matching, virtual code execution, etc.); searching; indexing; hashing (e.g. creation of hashes, MD5 hashing, etc.); filtering (e.g. Bloom filters, other key lookup operations, etc.); metadata creation; tagging; combinations of these and other operations; etc.

In FIG. 20-17 the PHY and data layer may provide data to the compression circuit block. The compression circuit block may be bypassed according to signal(s) from the address lookup block.

In FIG. 20-17 the PHY and data layer may receive data from the decompression circuit block. The decompression circuit block may be bypassed according to signal(s) from the address lookup block.

As an option, the compression system for a stacked memory package may be implemented in the context of the architecture and environment of any previous Figure(s) and/or any subsequent Figure(s). Of course, however, the compression system for a stacked memory package may be implemented in the context of any desired environment.

FIG. 20-18

Data Cleaning System for a Stacked Memory Package

FIG. 20-18 shows a data cleaning system for a stacked memory package, in accordance with another embodiment. As an option, the compression system for a stacked memory package may be implemented in the context of the architecture and environment of any previous and/or subsequent Figure(s). Of course, however, the compression system for a stacked memory package may be implemented in any desired environment.

In FIG. 20-18 the data cleaning system for a stacked memory package 20-1800 may comprise one or more stacked memory packages in a memory system.

In FIG. 20-18 the data cleaning system for a stacked memory package 20-1800 may comprise one or more circuits in one or more stacked memory packages that may be operable to clean data stored in one or more stacked memory chips and/or other storage/memory.

In FIG. 20-18 the data cleaning system for a stacked memory package 20-1800 may comprise a logic chip in a stacked memory package that may include one or more of each of the following circuit blocks and/or functions (but not limited to the following): PHY and data layer, command decode, data cleaning engine, statistics engine, statistics database, etc.

In one embodiment the logic chip in a stacked memory package may be operable to clean data.

In one embodiment cleaning data may include reading stored data, checking the stored data against one or more data protection keys and correcting the stored data if any error has occurred.

In one embodiment cleaning data may include reading data, checking the data against one or more data protection keys and signaling an error if data cannot be corrected.

For example, in FIG. 20-18 the CPU or other system component may send one or more commands to one or more stacked memory packages. In FIG. 20-18 the PHY and data layer circuit block(s) may provide one or more fields (e.g.

command code, command field, address(es), other packet data and/or information, etc.) to the command decode circuit block. In FIG. 20-18 the command decode circuit block may be operable to control (e.g. program, provide parameters to, direct, operate, etc.) one or more data cleaning engines.

In FIG. 20-18 a data cleaning engine may be operable to autonomously (e.g. on its own, without CPU or other intervention, etc.) clean (e.g. remove errors, discover errors, etc.) data stored in one or more stacked memory chips and/or other memory/storage.

Of course any means may be used to control the operation of the one or more data cleaning engines. For example, the data cleaning engines may be controlled (e.g. modified, programmed, etc.) at start-up and/or during operation using one or more commands and/or messages from the CPU, using an SMBus or other control bus such as that shown in FIG. 20-5 for example, using combinations of these and/or other methods, etc.

In FIG. 20-18 the data cleaning engine may read stored data from one or more of the stacked memory chips and compute one or more data protection keys (e.g. hash codes, ECC codes, other codes, nested codes, combinations of these with other codes, functions of these and other codes, etc.). In FIG. 20-18 the data cleaning engine may read one or more data protection keys from the stacked memory chips. In FIG. 20-18 the data cleaning engine may then compare the computed data protection key(s) with the stored data protection key(s).

For example, in FIG. 20-18 if the stored data protection key(s) do not match the computed data protection key(s) then operations (e.g. correction functions, parity operations, etc.) may be performed to correct the stored data and/or protection key(s). In FIG. 20-18 the data cleaning engine may then write the corrected data and/or data protection key(s) back to the one or more stacked memory chips.

For example, if more than a threshold (e.g. programmed, etc.) number of errors have occurred then the data cleaning engine may write the corrected data back to a different area, part, portion etc. of the stacked memory chips and/or to a different stacked memory chip and/or schedule a repair (as described herein).

In FIG. 20-18 the data cleaning engine may be connected to a statistics engine. In FIG. 20-18 the statistics engine may be connected to a statistics database. In FIG. 20-18 the statistics engine and statistics database may be operable to control (e.g. program, provide parameters to, update, etc.) the data cleaning engine.

For example, the data cleaning engine may provide information to the statistics engine on the number, nature etc. of data errors and/or data protection key errors as well as the addresses, area, part or portions etc. of the stacked memory chips in which errors have occurred. The statistics engine may save (e.g. store, load, update, etc.) this information in the statistics database. The statistics engine may provide summary and/or decision information to the data cleaning engine.

For example, if a certain number of errors have occurred in one part or portion of a stacked memory chip, the data protection scheme may be altered (e.g. the strength of the data protection key may be increased, the number of data protection keys increased, the type of data protection key changed, etc.). The strength of one or more data protection keys may be a measure of the number and type of errors that a data protection key may be used to detect and/or correct. Thus a stronger data protection key may, for example, be able to detect and/or correct a larger number of data errors, etc.

In one embodiment, data protection keys may be stored in one or more stacked memory chips.

In one embodiment, data protection keys may be stored on one or more logic chips in one or more stacked memory packages.

In one embodiment one or more data cleaning engines may create and store one or more data protection keys.

In one embodiment one or more CPUs may create and store one or more data protection keys in one or more stacked memory chips.

In one embodiment the data protection keys may be ECC codes, MD5 hash codes, or any other codes and/or combinations of codes.

In one embodiment the CPU may compute a first part or portions of one or more data protection keys and one or more data cleaning engines may compute a second part or portions of the one or more data protection keys.

For example the data cleaning engine may read from successive memory addresses in a first direction (e.g. by incrementing column address etc.) in one or more memory chips and compute one or more first data protection keys. For example the data cleaning engine may read from successive memory addresses in a second direction (e.g. by incrementing row address etc.) in one or more memory chips and compute one or more second data protection keys. For example by using first and second data protection keys the data cleaning engine may detect and/or may correct one or more data errors.

For example if the stored data protection key(s) do not match the computed data protection key(s) then the data cleaning engine may flag one or more data errors and/or data protection key errors (e.g. by sending a message to the CPU, by using an SMBus, etc.). For example the flag may indicate whether the one or more data errors and/or data protection key errors may be corrected or not.

Of course any mechanism (e.g. method, procedure, algorithm, etc.) may be used to decide which parts, portions, areas, etc. of memory may be cleaned and/or protected. Of course all of the data stored in one or more stacked memory chips may be cleaned.

As an option, the data cleaning system for a stacked memory package may be implemented in the context of the architecture and environment of any previous Figure(s) and/or any subsequent Figure(s). Of course, however, the data cleaning system for a stacked memory package may be implemented in the context of any desired environment.

FIG. 20-19

Refresh System for a Stacked Memory Package

FIG. 20-19 shows a refresh system for a stacked memory package, in accordance with another embodiment. As an option, the refresh system for a stacked memory package may be implemented in the context of the architecture and environment of any previous and/or subsequent Figure(s). Of course, however, the refresh system for a stacked memory package may be implemented in any desired environment.

In FIG. 20-19 the refresh system for a stacked memory package 20-1900 may comprise one or more stacked memory packages in a memory system.

In FIG. 20-19 the refresh system for a stacked memory package 20-1900 may comprise one or more circuits in one or more stacked memory packages that may be operable to refresh data stored in one or more stacked memory chips and/or other storage/memory.

In FIG. 20-19 the refresh system for a stacked memory package 20-1900 may comprise a logic chip in a stacked memory package that may include one or more of each of the following circuit blocks and/or functions (but not limited to the following): PHY and data layer, command decode, message encode, refresh engine, refresh region table, data engine, etc.

In one embodiment the logic chip in a stacked memory package may be operable to refresh data.

In one embodiment the logic chip in a stacked memory package may comprise a refresh engine.

In one embodiment the refresh engine may be programmed by the CPU.

In one embodiment the logic chip in a stacked memory package may comprise a data engine.

In one embodiment the data engine may be operable to measure retention time.

In one embodiment the measurement of retention time may be used to control the refresh engine.

In one embodiment the refresh period used by a refresh engine may vary depending on the measured retention time of one or more portions of one or more stacked memory chips.

In one embodiment the refresh engine may refresh only areas of one or more stacked memory chips that are in use.

In one embodiment the refresh engine may not refresh one or more areas of one or more stacked memory chips that contain fixed values.

In one embodiment the refresh engine may be programmed to refresh one or more areas of one or more stacked memory chips.

In one embodiment the refresh engine may inform the CPU or other system component of refresh information.

In one embodiment the refresh information may include refresh period for one or more areas of one or more stacked memory chips, intended target for next N refresh operations, etc.

In one embodiment the CPU or other system component may adjust refresh properties (e.g. timing of refresh commands, refresh period, etc.) based on information received from one or more refresh engines.

For example, in FIG. 20-19 the CPU or other system component may send one or more commands to one or more stacked memory packages. In FIG. 20-19 the PHY and data layer circuit block(s) may provide one or more fields (e.g. command code, command field, address(es), other packet data and/or information, etc.) to the command decode circuit block. In FIG. 20-19 the command decode circuit block may be operable to control (e.g. program, provide parameters to, direct, operate, etc.) one or more refresh engines. In FIG. 20-19 the command decode circuit block may be operable to control (e.g. program, provide parameters to, direct, operate, etc.) one or more refresh region tables. In FIG. 20-19 the command decode circuit block may be operable to control (e.g. program, provide parameters to, direct, operate, etc.) one or more data engines.

For example, in FIG. 20-19 one or more data engines may write to and read from one or more areas of one or more stacked memory chips. By, for example, varying the time between writing data and reading data (or by other programmed measurement means, etc.) the data engines may discover (e.g. measure, calculate, infer, etc.) the data retention time and/or other properties (e.g. error behavior, timing, voltage sensitivity, etc.) of the memory cells in the one or more areas of one or more stacked memory chips. The data engine may provide (e.g. supply, send, etc.) such data retention time and other information to one or more refresh engines. The one or more refresh engines may vary their function(s) and/or behavior (e.g. refresh period, refresh frequency, refresh algorithm, refresh algorithm parameter(s), areas of memory to be refreshed, order of memory areas refreshed, refresh priority, refresh timing, type of refresh (e.g. self-refresh, etc.), combinations of these, etc.) according to the supplied data retention time and/or other information, for example.

Of course such measured information (e.g. error behavior, voltage sensitivity, etc.) may be supplied to other circuits and/or circuit blocks and functions of one or more logic chips of one or more stacked memory packages.

For example in FIG. 20-19 the logic chip may track which parts or portions of the stacked memory chips may be in use (e.g. by using the data engine and/or refresh engine and/or other components (not shown in FIG. 20-19, etc.), or combinations of these, etc.). For example the logic chip etc. may track which portions of the stacked memory chips may contain all zeros or all ones. This information may be stored for example in the refresh region table. Thus, for example, regions of the stacked memory chips that store all zero's may not be refreshed as frequently as other regions or may not need to be refreshed at all.

For example in FIG. 20-19 the logic chip may track (e.g. by using the command decode circuit block, data engine and/or refresh engine and/or other components (not shown in FIG. 20-19, etc.), or combinations of these, etc.) which parts or portions of the stacked memory chips have a certain importance (e.g. which data streams are using which virtual channels(s), by virtue of special command codes, etc.). This information may be stored for example in the refresh region table. Thus, for example, regions of the stacked memory chips that store information that may be important (e.g. indicated by the CPU as important, use high priority VCs, etc.) may be refreshed more often or in a different manner than other regions, etc. Thus, for example, regions of the stacked memory chips that are less important (e.g. correspond to video data that may not suffer from data corruption, etc.) may be refreshed less often, may be refreshed in a different manner, etc.

Of course any criteria may be used to alter the refresh properties (e.g. refresh period, refresh regions, refresh timing, refresh order, refresh priority, etc.). For example criteria may include (but are not limited to) one or more of the following: power; temperature; timing; sleep states; signal integrity; combinations of these and other criteria; etc.

For example one or more refresh properties may be programmed by the CPU or other system components (e.g. by using commands, data fields, messages, etc.). For example one or more refresh properties may be decided by the refresh engine and/or data engine and/or other logic chip circuit blocks(s), etc.

For example, the CPU may program regions of stacked memory chips and their refresh properties by sending one or more commands (e.g. messages, requests, etc.) to one or more stacked memory packages. The command decode circuit block may thus, for example, load (e.g. store, update, program, etc.) one or more refresh region tables.

In one embodiment a refresh engine may signal (e.g. using one or more messages, etc.), the CPU or other system components etc.

For example a CPU may adjust refresh schedules, scheduling or timing of one or more refresh signals based on information received from one or more logic chips on one or more stacked memory packages. For example in FIG. 20-19 the refresh engine may pass information including refresh properties (e.g. refresh period, refresh priority, retention time, refresh timing, refresh targets, etc.) to the message encode circuit block etc. In FIG. 19 the message encode block may encapsulate (e.g. insert, place, locate, encode, etc.) information into one or more messages (e.g. responses, completions, etc.) and send these to the PHY and data layer block(s) for transmission (e.g. to the CPU, to other system components, etc.).

As an option, the refresh system for a stacked memory package may be implemented in the context of the architecture and environment of any previous Figure(s) and/or any subsequent Figure(s). Of course, however, the refresh system for a stacked memory package may be implemented in the context of any desired environment.

FIG. 20-20

Power Management System for a Stacked Memory System

FIG. 20-20 shows a power management system for a stacked memory system, in accordance with another embodiment. As an option, the power management system for a stacked memory system may be implemented in the context of the architecture and environment of any previous and/or subsequent Figure(s). Of course, however, the power management system for a stacked memory system may be implemented in any desired environment.

In FIG. 20-20 the power management system for a stacked memory system 2000 may comprise one or more stacked memory packages in a memory system.

In FIG. 20-20 the power management system for a stacked memory system 20-2000 may comprise one or more circuits in one or more stacked memory packages that may be operable to manage power in one or more logic chips and/or stacked memory chips and/or other system components in a stacked memory system.

In FIG. 20-20 the power management system for a stacked memory system 20-2000 may comprise a logic chip in a stacked memory package that may include one or more of each of the following circuit blocks and/or functions (but not limited to the following): PHY and data layer, command decode, message encode, DRAM power command, power region table, etc.

In one embodiment the logic chip in a stacked memory package may be operable to manage power in the stacked memory package.

In one embodiment the logic chip in a stacked memory package may be operable to manage power in one or more stacked memory chips in the stacked memory package.

In one embodiment the logic chip in a stacked memory package may be operable to manage power in one or more regions of one or more stacked memory chips in the stacked memory package.

In one embodiment the logic chip in a stacked memory package may be operable to send power management information to one or more CPUs in a stacked memory system.

In one embodiment the logic chip in a stacked memory package may be operable to issue one or more DRAM power management commands to one or more stacked memory chips in the stacked memory package.

For example, in FIG. 20-20 the CPU or other system component may send one or more commands to one or more stacked memory packages. In FIG. 20-20 the PHY and data layer circuit block(s) may provide one or more fields (e.g. command code, command field, command payload, address(es), other packet data and/or information, etc.) to the command decode circuit block. In FIG. 20-20 the command decode circuit block may be operable to control (e.g. program, provide parameters to, direct, operate, etc.) one or more DRAM power command circuit block(s). In FIG. 20-20 the command decode circuit block may be operable to control (e.g. program, provide parameters to, update, load, configure, etc.) one or more power region tables.

For example, in FIG. 20-20 one or more DRAM power command circuit blocks may issue one or more power management commands (e.g. CKE power down, chip select, IO enable/disable, precharge power down, active power down, fast exit power down, slow exit power down, DLL off mode, subrank power down, enable/disable circuit block(s), enable/disable subcircuits on one or portions (e.g. rank, bank, subbank, echelon, etc.) of one or more stacked memory chips, voltage change, frequency change, etc.). In FIG. 20-20 power management commands may be issued to one or more stacked memory chips using one or more address and/or control signals.

For example, in FIG. 20-20 the power consumed by the stacked memory chips, portions or regions of the stacked memory chips, or components/blocks on the logic chip etc. may be more aggressively managed or less aggressively managed (e.g. depth of power management states altered, length of power management periods or modes changed, types of power management states changed, etc.) according to the contents (e.g. information, fields, tags, flags, etc.) of a power region table, register settings, commands received, etc.

Of course any DRAM power commands may be used. Of course any power management signals may be issued depending on the number and type of memory chips used (e.g. DRAM, eDRAM, SDRAM, DDR2 SDRAM, DDR3 SDRAM, future JEDEC standard SDRAM, derivatives of JEDEC standard SDRAM, other volatile semiconductor memory types, NAND flash, other nonvolatile memory types, etc.). Of course power management signals may also be applied to one or more logic blocks/circuits, memory, storage, IO circuits, high-speed serial links, buses, etc. on the logic chip itself.

For example, in FIG. 20-20 the power region table may include information as to which regions, areas, parts etc. of which stacked memory chips may be power managed.

For example in FIG. 20-20 the CPU may send commands (e.g. requests, read requests, write requests, etc.). For some commands there may be a delay (e.g. additional delay, additional latency, etc.) while areas (e.g. regions, portions, etc.) of one or more stacked memory chips are accessed (e.g. some regions may be in one or more power down states, etc.). For example, in FIG. 20 the power region table may contain information on which regions may or may not be placed in various power down states according to whether an additional access latency is allowable (e.g. acceptable, permitted, programmed, etc.).

For example, in FIG. 20-20 the DRAM power command circuit block may be operable to send power management information to the CPU or other system component. For example, in FIG. 20-20 the DRAM power command circuit block may send information to the message encode block for example. In FIG. 20-20 the message encode block may encapsulate (e.g. insert, place, locate, encode, etc.) information into one or more messages (e.g. responses, completions, etc.) and send these to the PHY and data layer block(s) for transmission (e.g. to the CPU, to other system components, etc.).

For example the DRAM power command circuit block may send information on current power management states, current scheduling of power management states, content of the power region table, current power consumption estimates, etc.

As an option, the power management system for a stacked memory system may be implemented in the context of the architecture and environment of any previous Figure(s) and/or any subsequent Figure(s). Of course, however, the power management system for a stacked memory system may be implemented in the context of any desired environment.

FIG. 20-21

Data Hardening System for a Stacked Memory System

Figures 20, 21:
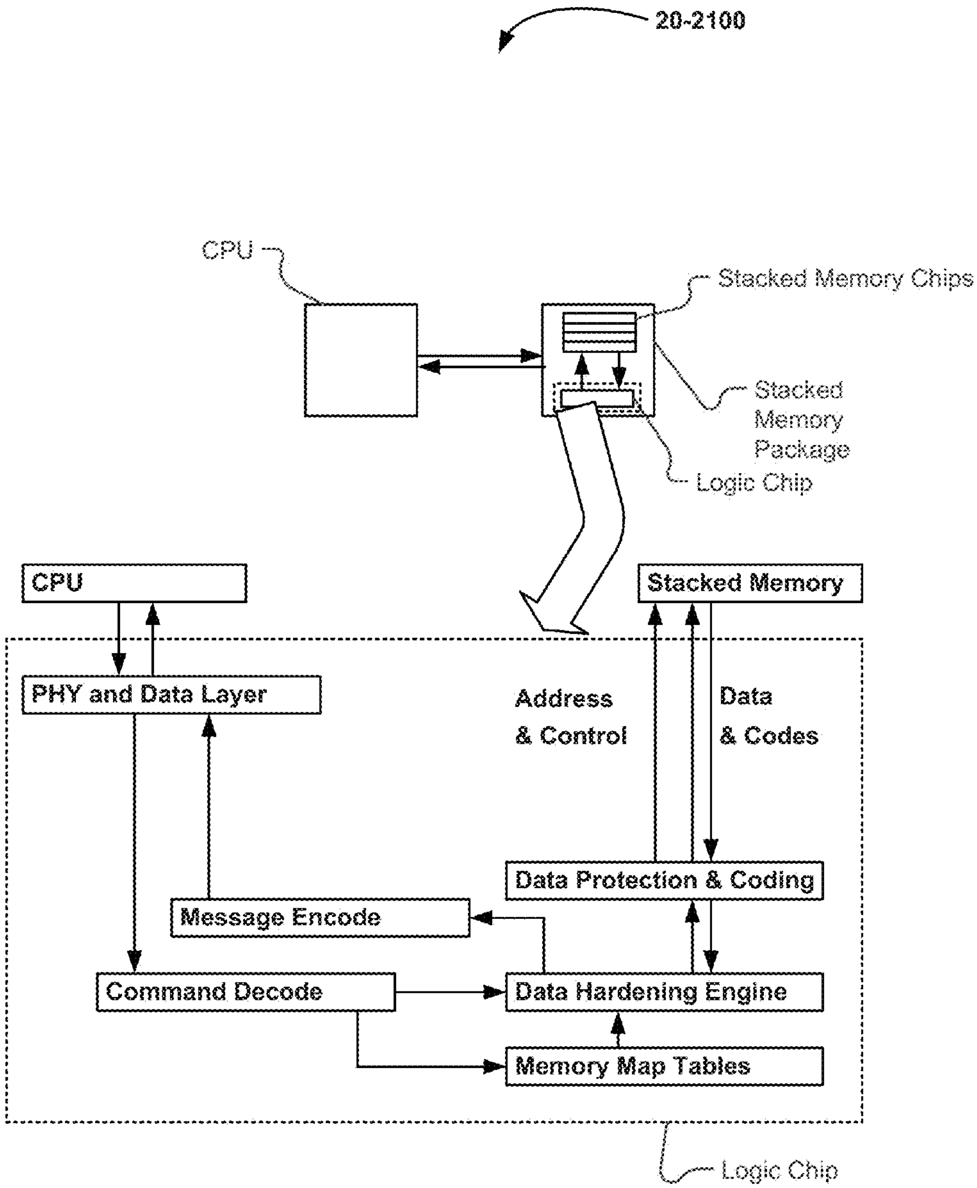
Figures 1, 21:
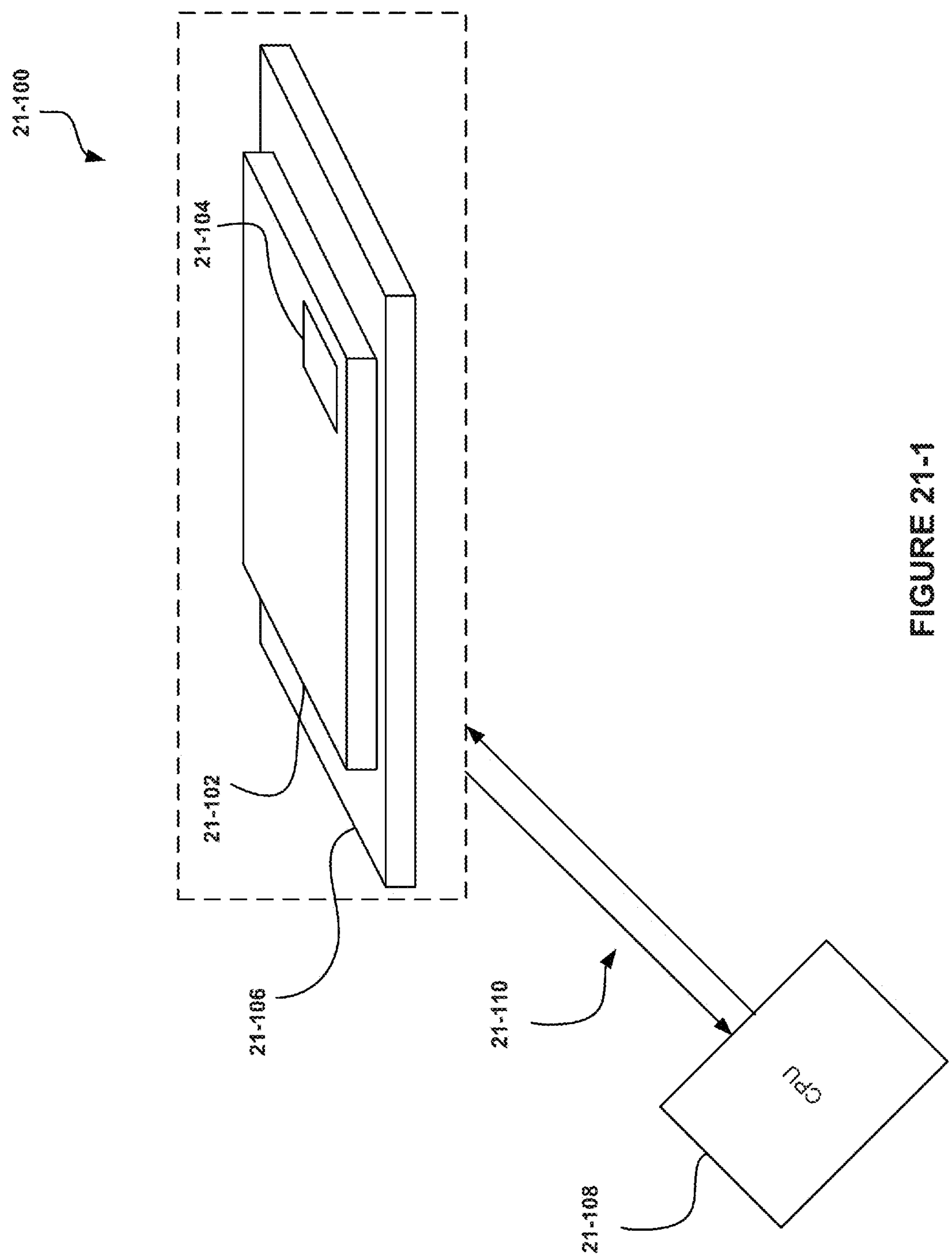
Figures 2, 21:
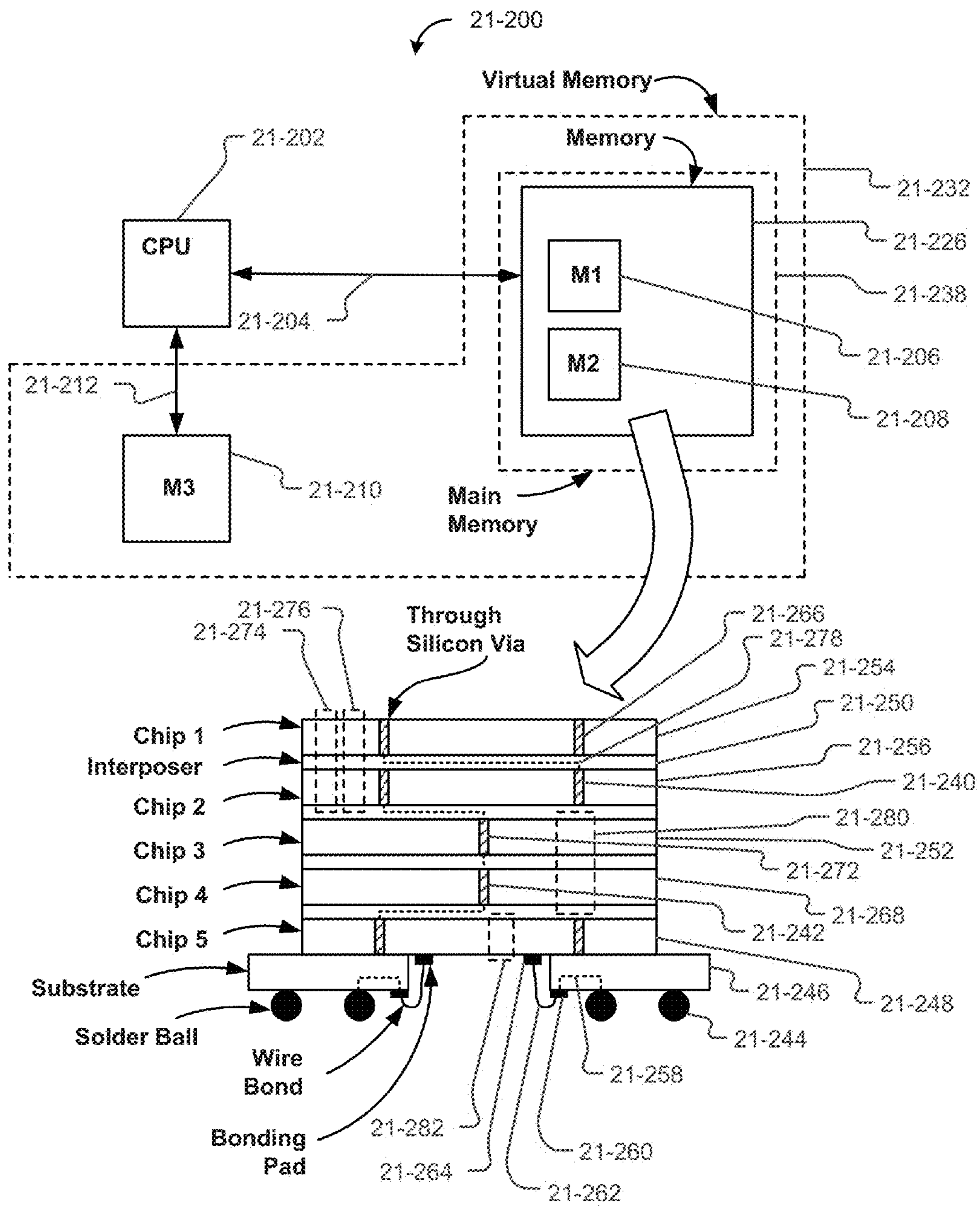
Figures 3, 21:
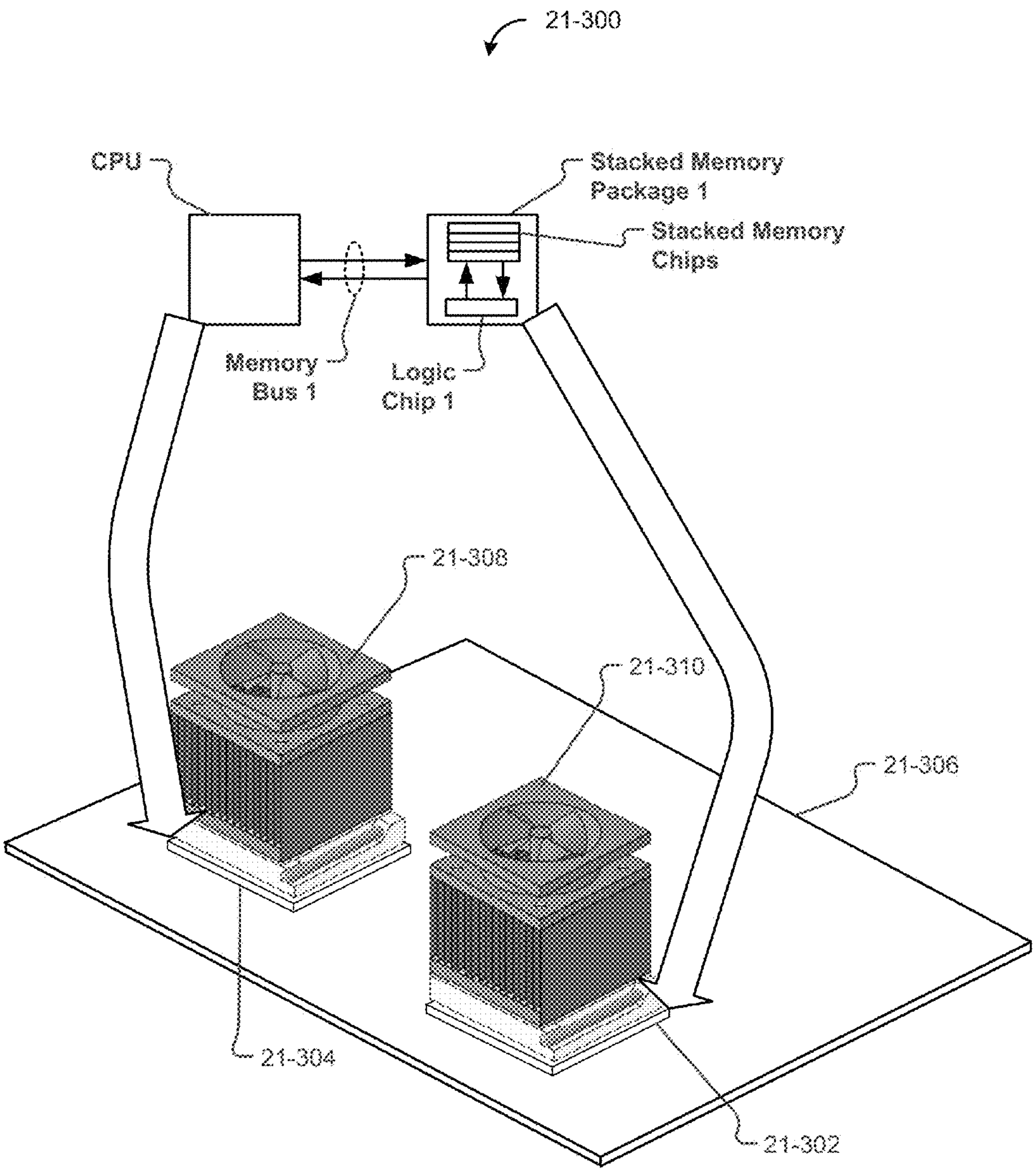
Figures 4, 21:
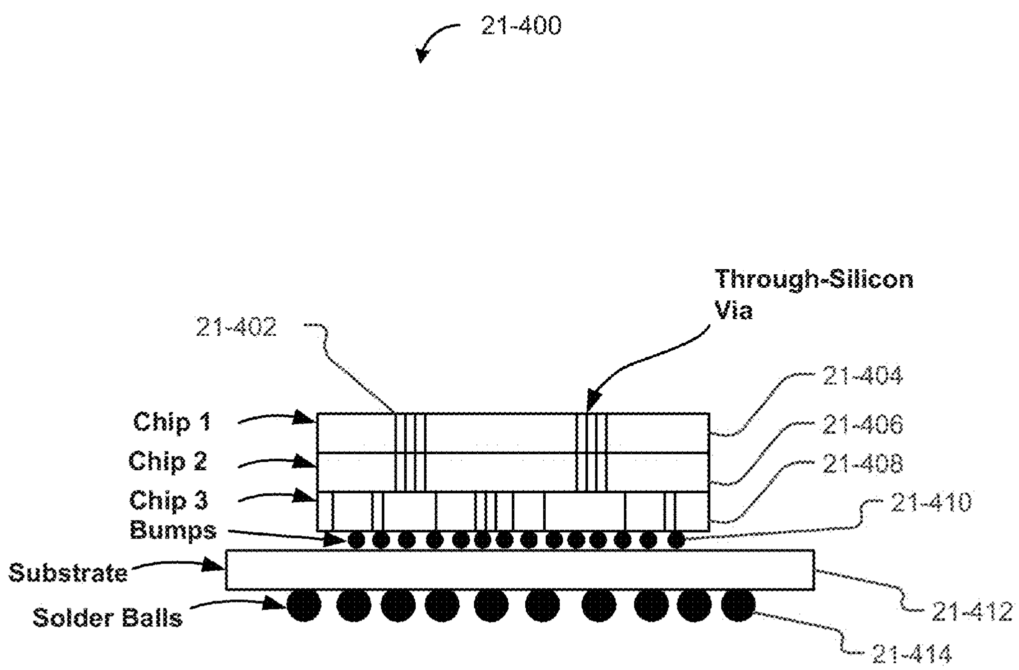
Figures 5, 21:
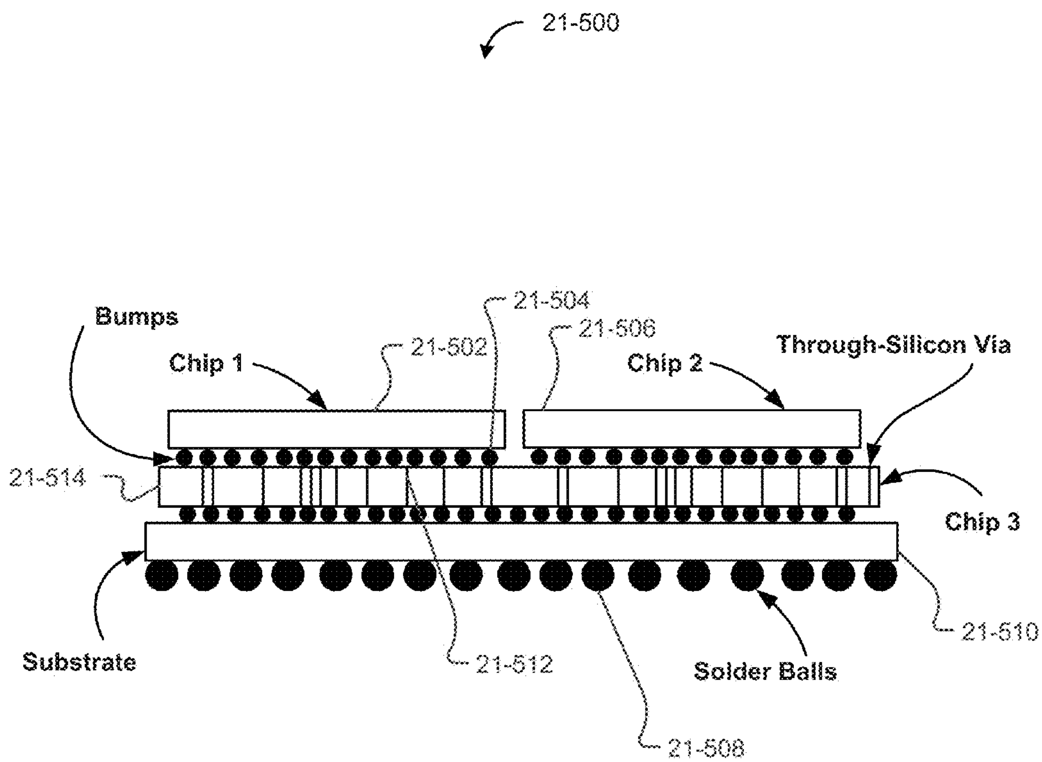
Figures 6, 21:
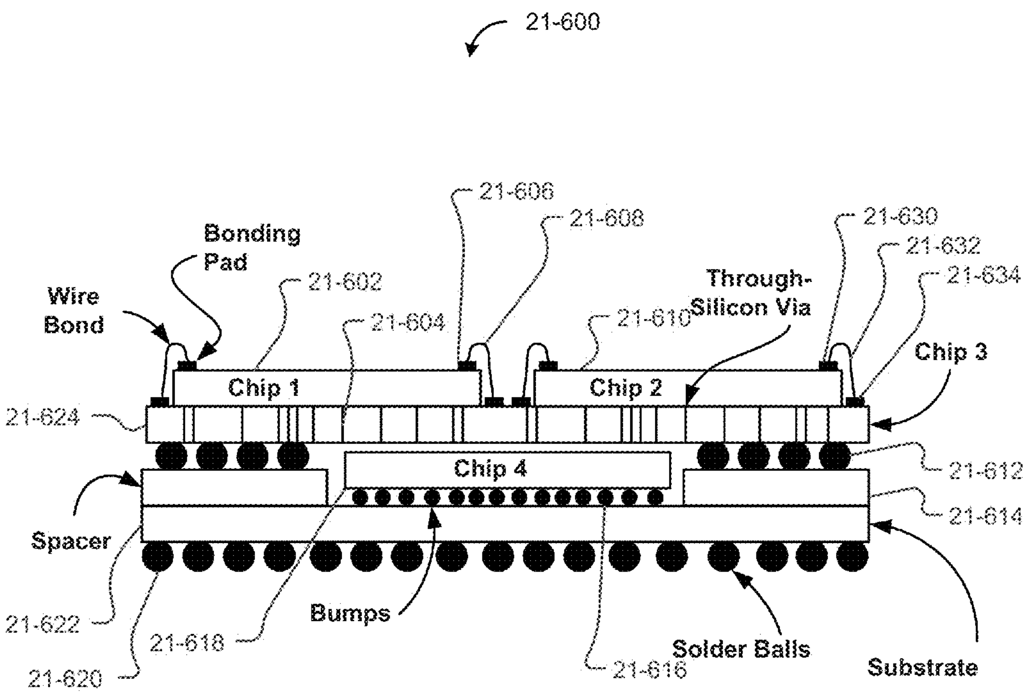
Figures 7, 21:
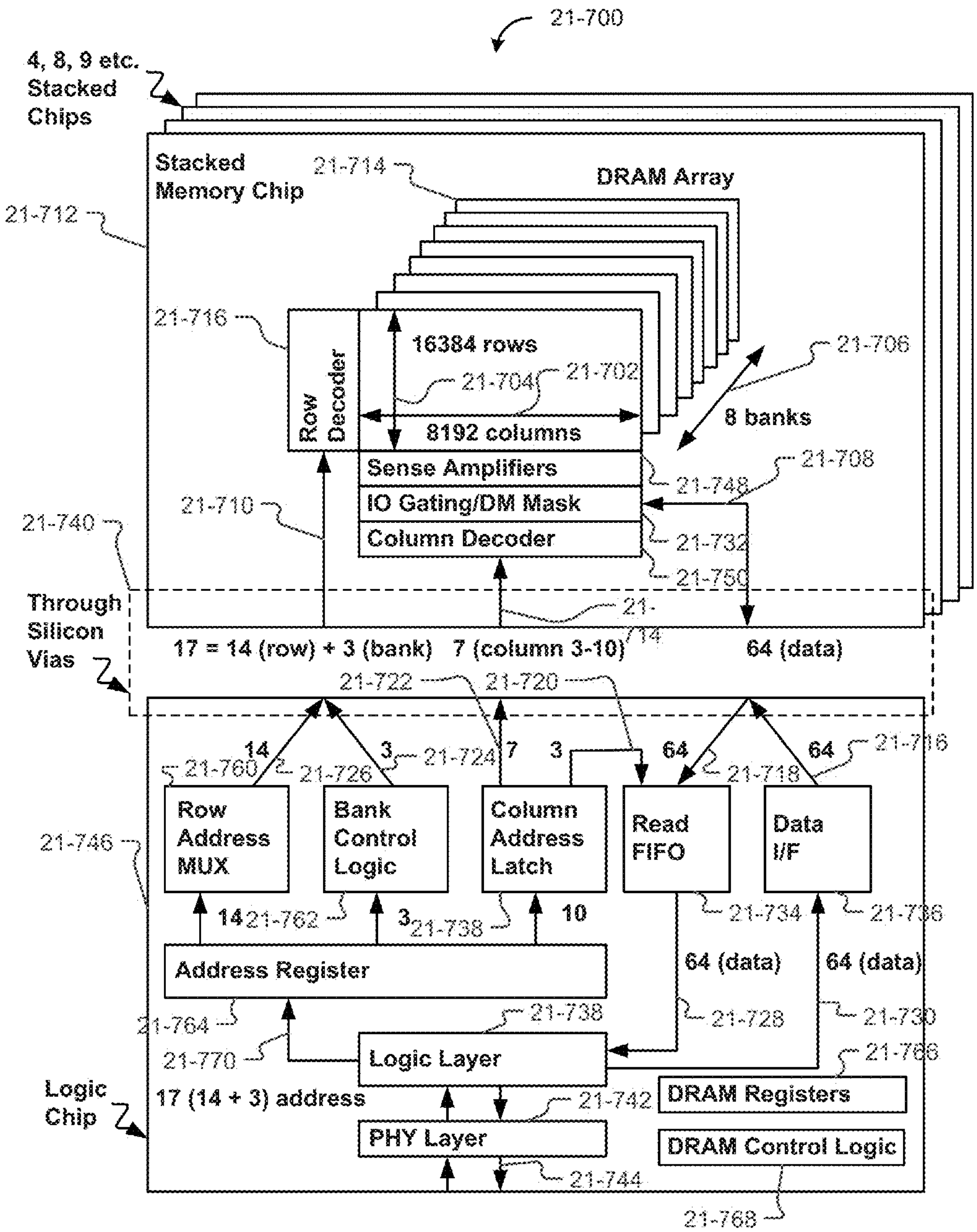
Figures 8, 21:
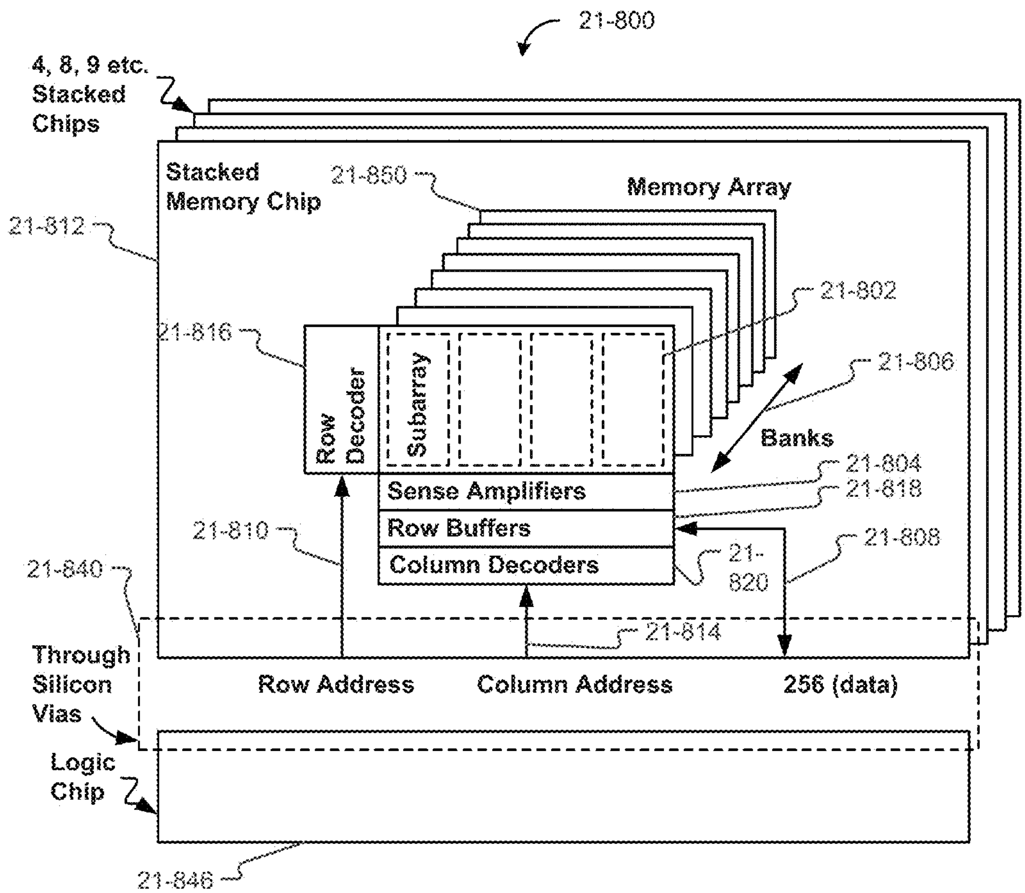
Figures 9, 21:
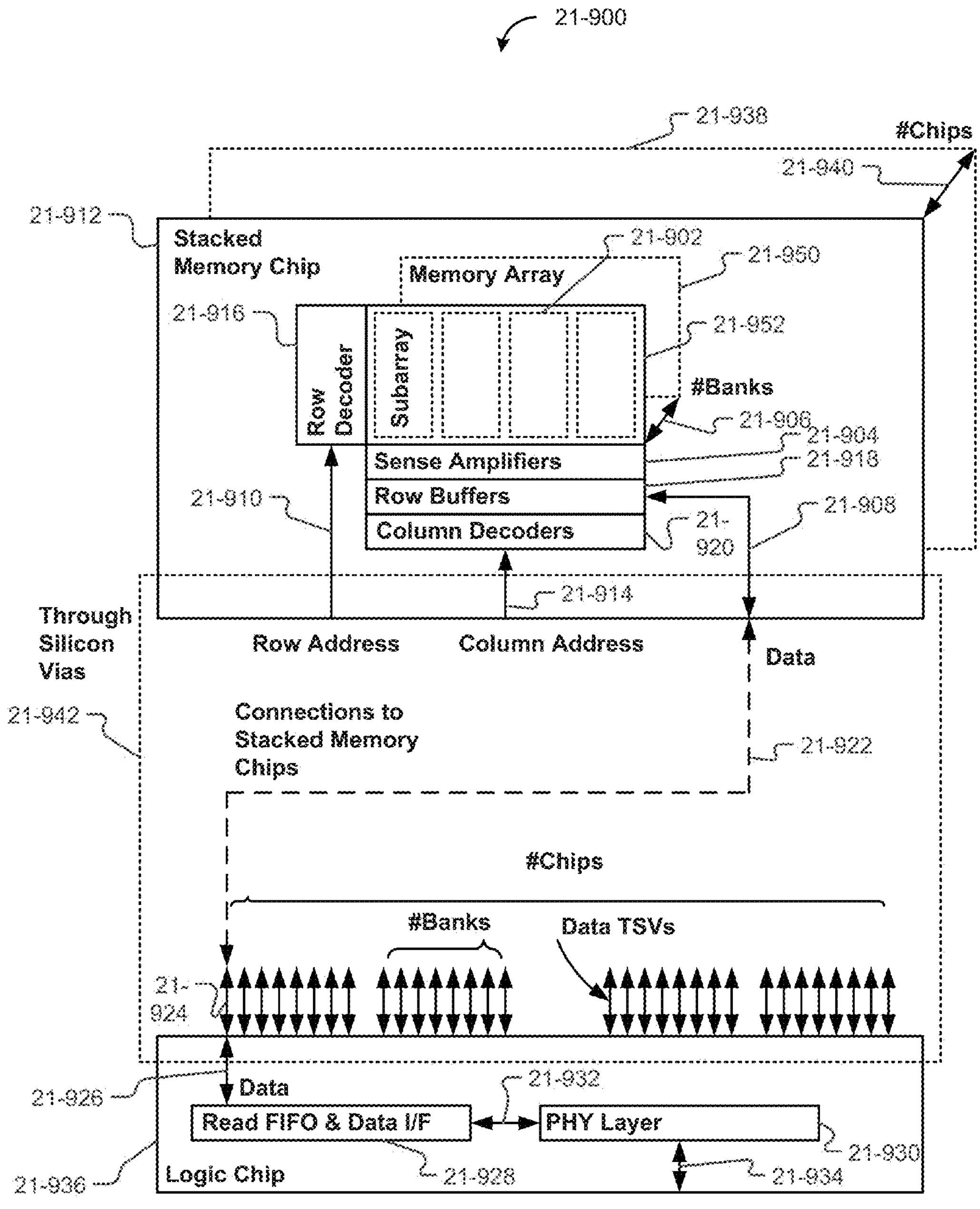
Figures 10, 21:
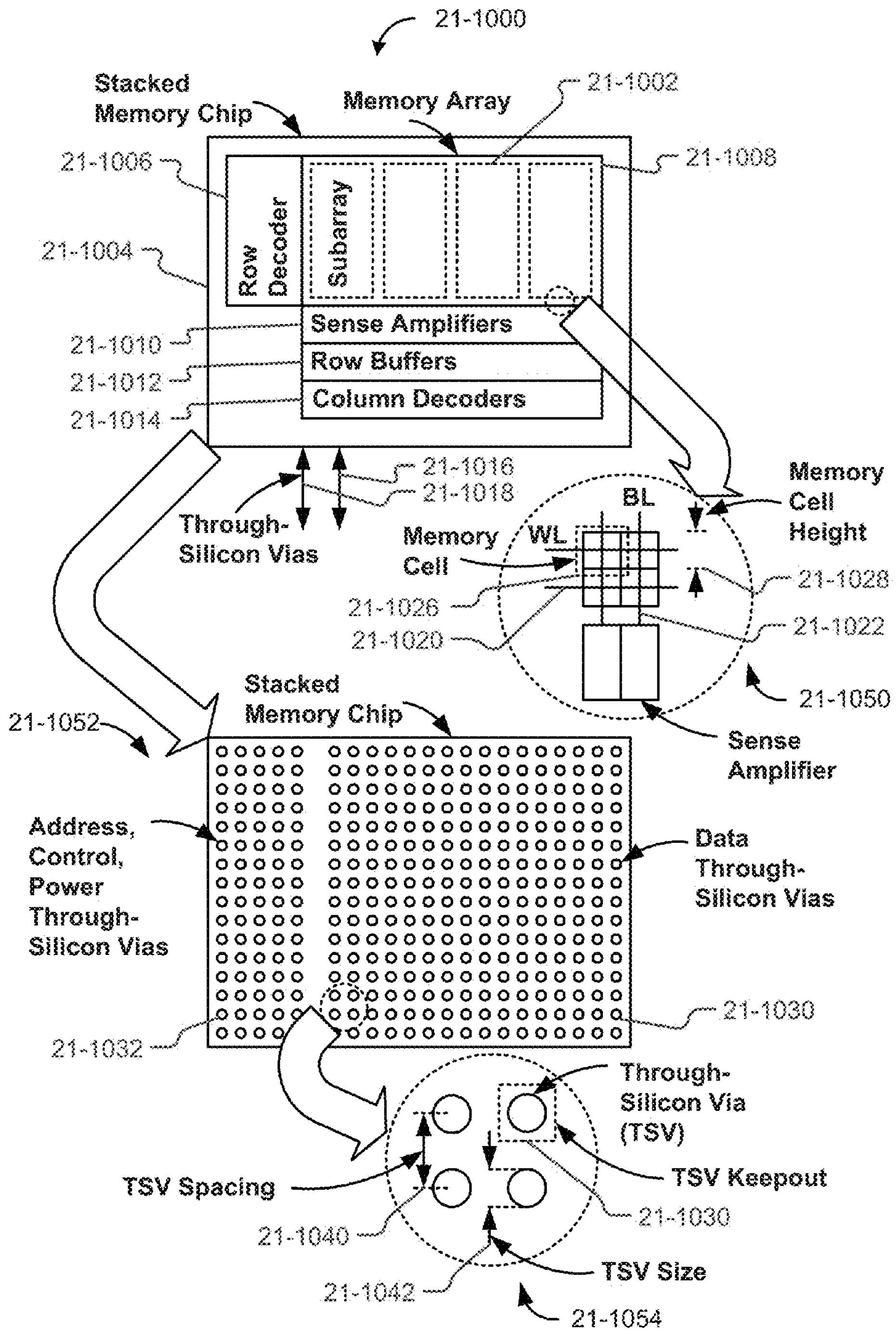
Figures 11, 21:
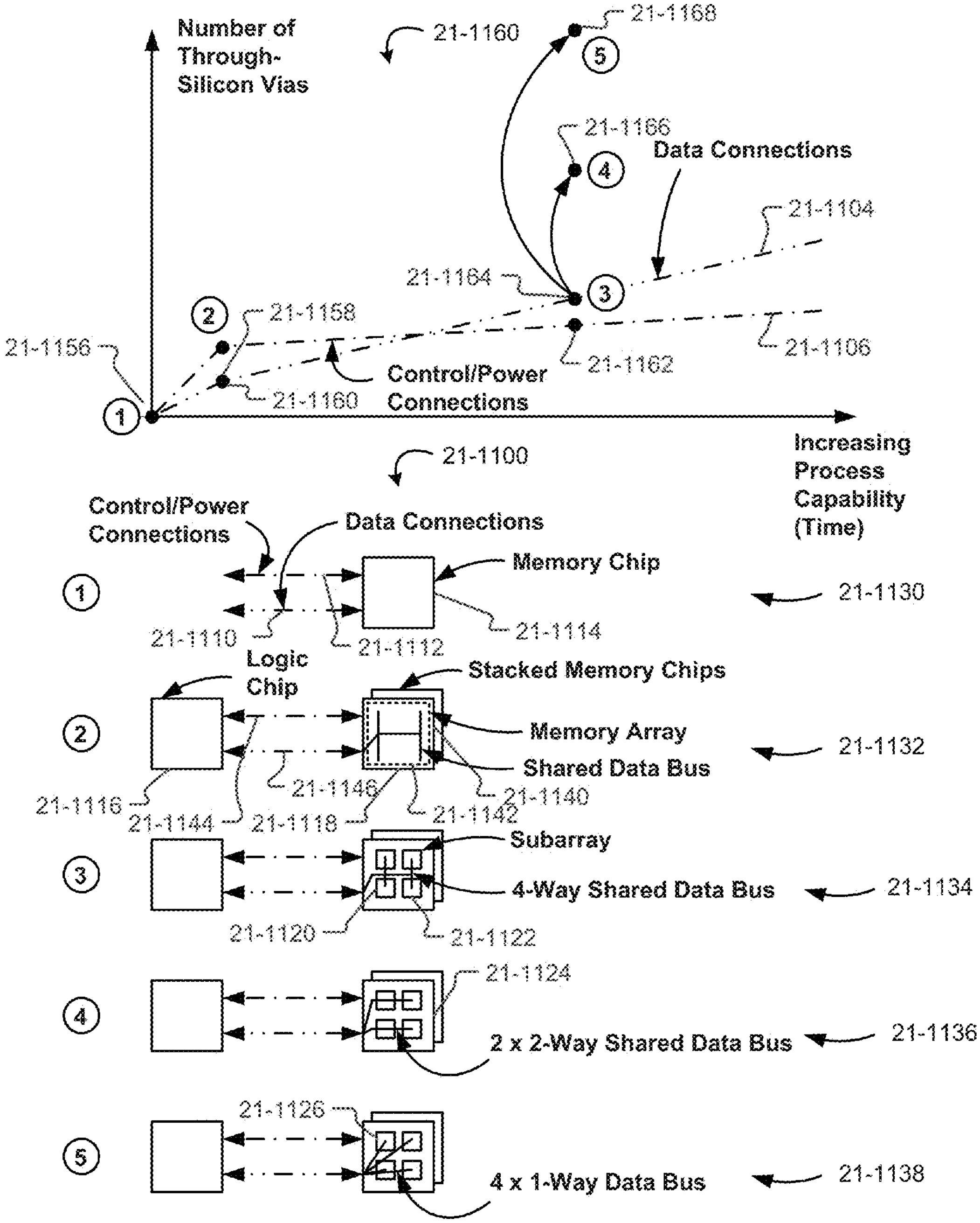
Figures 12, 21:
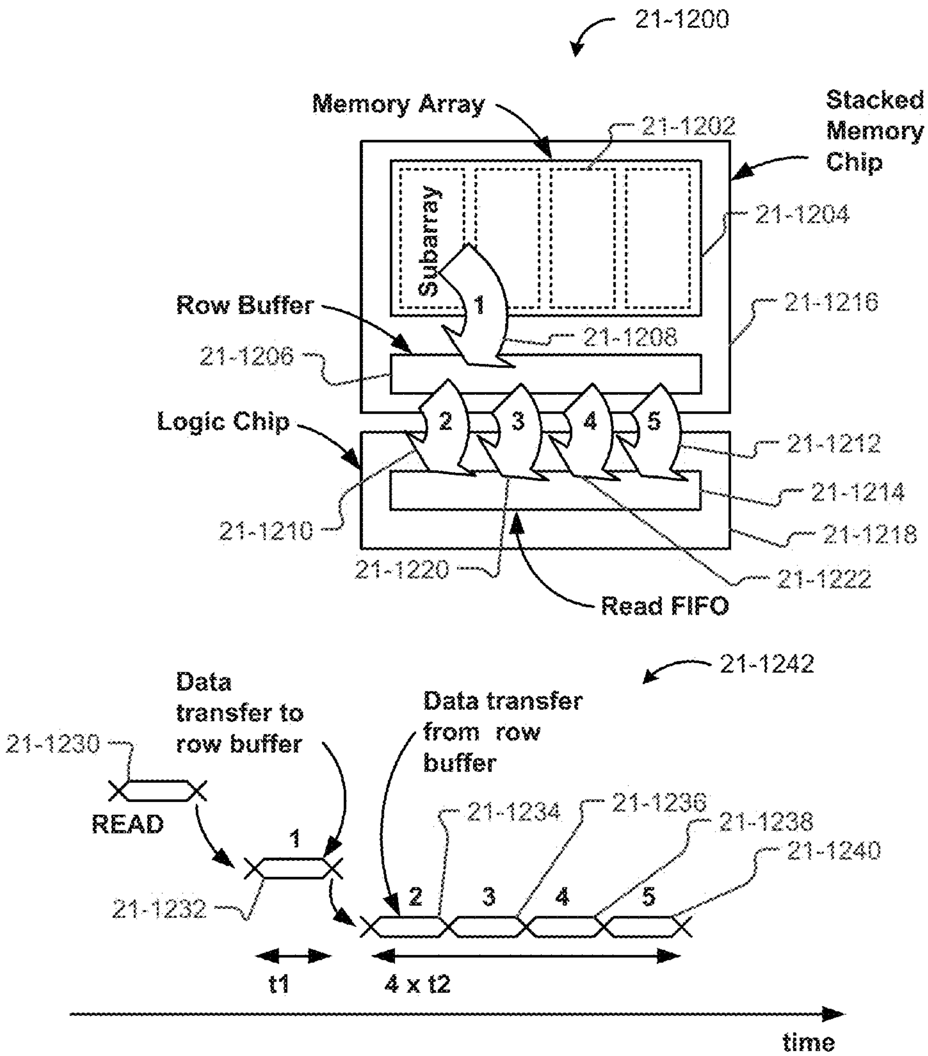
Figures 13, 21:
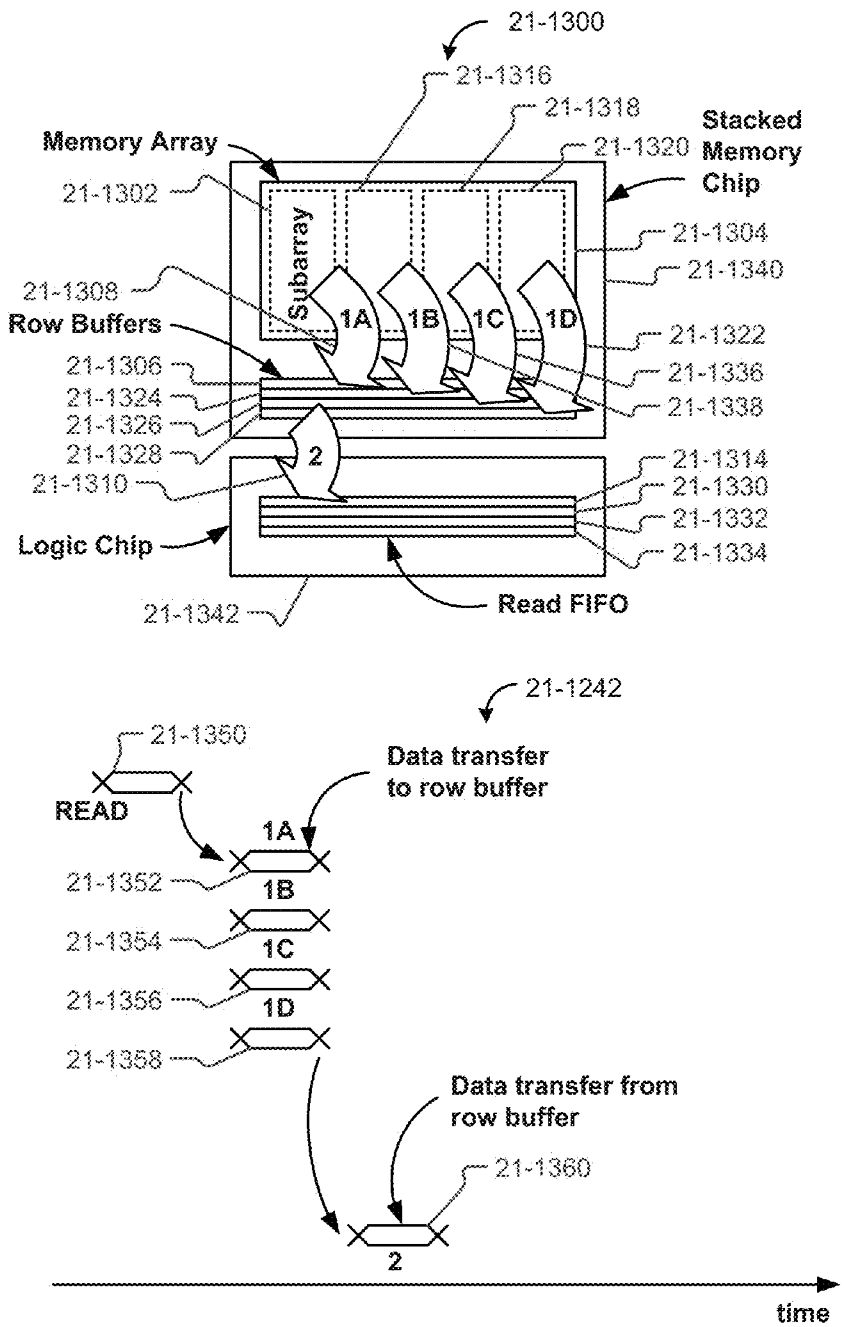
Figures 14, 21:
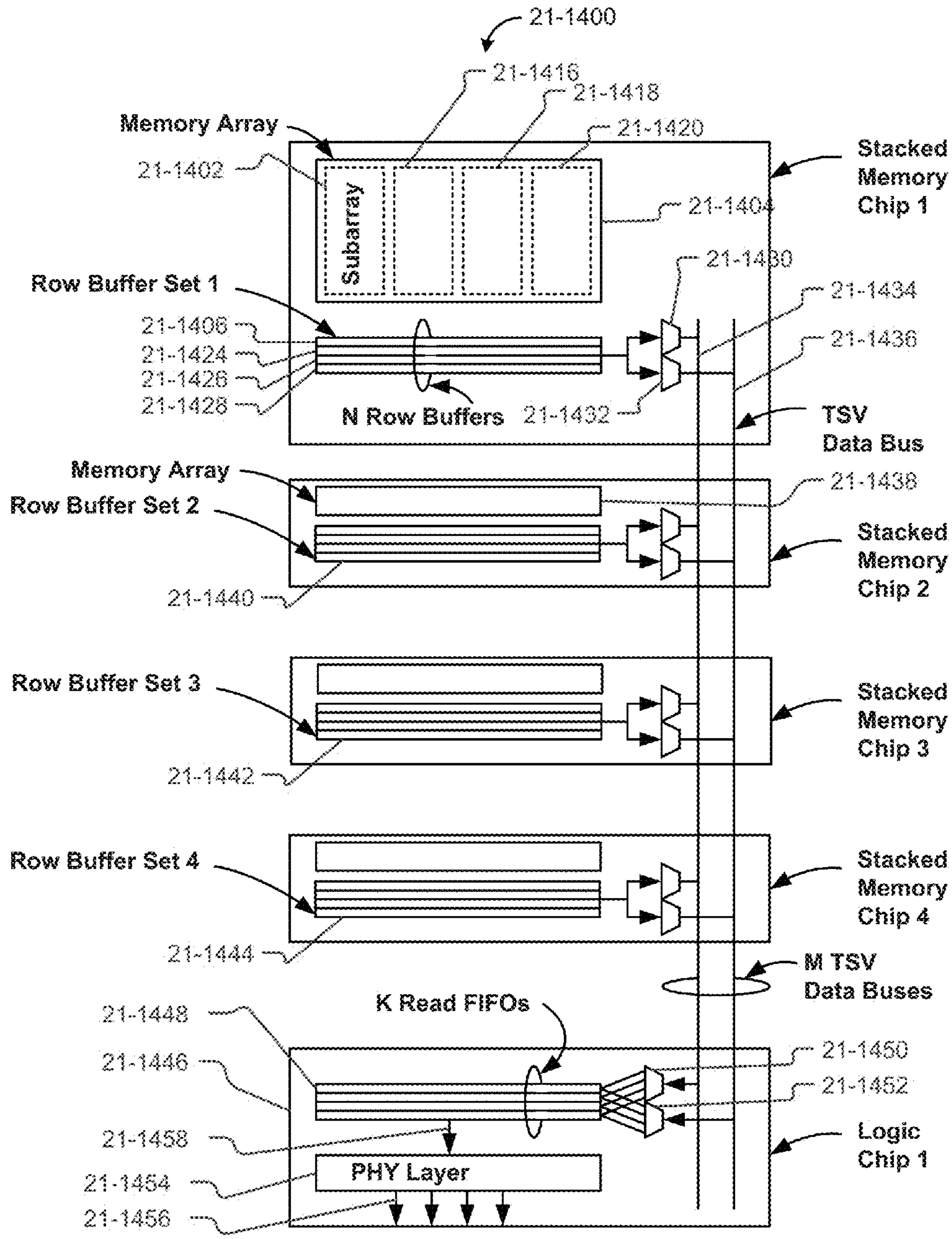
Figures 15, 21:
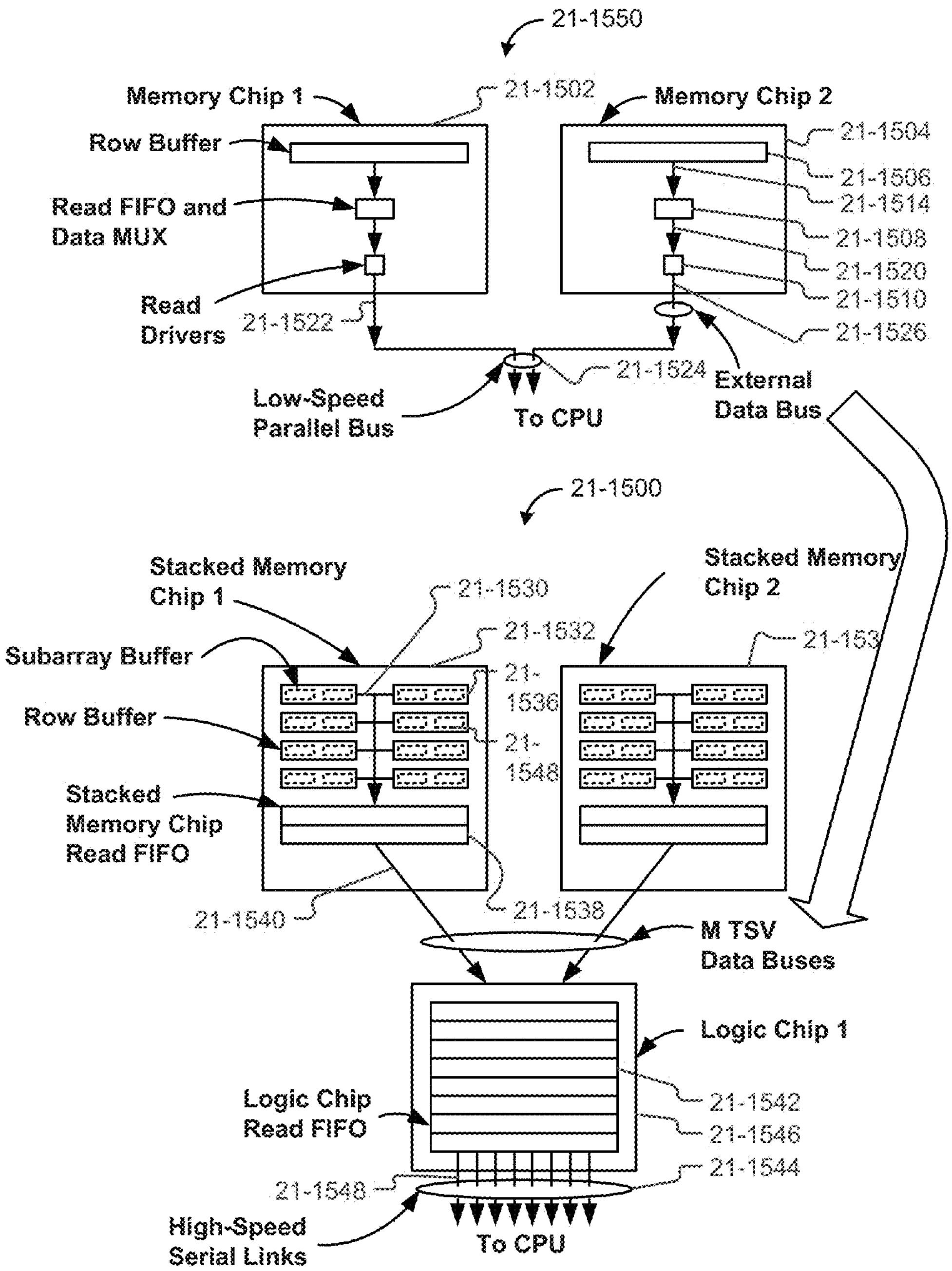

FIG. 20-21 shows a data hardening system for a stacked memory system, in accordance with another embodiment. As an option, the data hardening system for a stacked memory system may be implemented in the context of the architecture and environment of any previous and/or subsequent Figure(s). Of course, however, the data hardening system for a stacked memory system may be implemented in any desired environment.

In FIG. 20-21 the power data hardening system for a stacked memory system 20-2100 may comprise one or more stacked memory packages in a memory system.

In FIG. 20-21 data hardening system for a stacked memory system 20-2100 may comprise one or more circuits in one or more stacked memory packages that may be operable to harden data in one or more logic chips and/or stacked memory chips and/or other system components in a stacked memory system.

In FIG. 20-21 data hardening system for a stacked memory system 20-2100 may comprise a logic chip in a stacked memory package that may include one or more of each of the following circuit blocks and/or functions (but not limited to the following): PHY and data layer, command decode, message encode, data protection & coding, data hardening engine, memory map tables, etc.

In one embodiment the logic chip in a stacked memory package may be operable to harden data in one or more stacked memory chips.

In one embodiment the data hardening may be performed by one or more data hardening engines.

In one embodiment the data hardening engine may increase data protection as a result of increasing error rate.

In one embodiment the data hardening engine may increase data protection as a result of one or more received commands.

In one embodiment the data hardening engine may increase data protection as a result of changed conditions (e.g. reduced power supply voltage, increased temperatures, reduced signal integrity, etc.).

In one embodiment the data hardening engine may increase or decrease data protection.

In one embodiment the data hardening engine may be operable to control one or more data protection and coding circuit blocks.

In one embodiment the data protection and coding circuit block may be operable to add, alter, modify, change, update, remove, etc. codes and other data protection schemes to stored data in one or more stacked memory chips.

For example, in FIG. 20-21 the CPU or other system component may send one or more commands to one or more stacked memory packages. In FIG. 20-21 the PHY and data layer circuit block(s) may provide one or more fields (e.g. command code, command field, address(es), other packet data and/or information, etc.) to the command decode circuit block. In FIG. 20-21 the command decode circuit block may be operable to control (e.g. program, provide parameters to, direct, operate, etc.) one or more data hardening engines. In FIG. 20-21 the command decode circuit block may be operable to control (e.g. program, provide parameters to, update, load, configure, etc.) one or more memory map tables.

For example, in FIG. 20-21 one or more data protection and coding blocks may be operable to add (e.g. insert, create, calculate, etc.) one or more codes (e.g. parity, ECC, SECDED codes, hash codes, Reed-Solomon codes, LDPC codes, Hamming codes, other error correction and/or error detection codes, nested codes, combinations of these and other codes, etc.) to the data stored in one or more stacked memory chips. Of course similar data protection schemes may be applied to other memory and/or storage on the logic chip for example. Of course different data protections schemes (e.g. different codes, combinations of codes, etc.) may be applied to different parts, regions, areas etc. of the stacked memory chips. Of course different data protections schemes may be applied to different types of stacked memory chips (e.g. volatile memory, nonvolatile memory, NAND flash, SDRAM, eDRAM, etc.).

For example, in FIG. 20-21 the data hardening engine may be operable to read stored data from one or more of the stacked memory chips and compute one or more data protection keys (e.g. hash codes, ECC codes, other codes, nested codes, combinations of these with other codes, functions of these and other codes, etc.). In FIG. 20-21 the data hardening engine may read one or more data protection keys from the stacked memory chips. In FIG. 20-21 the data hardening engine may then compare the computed data protection key(s) with the stored data protection key(s). As a result of the comparison the data hardening engine may find errors that may be corrected. In general it is found that once errors have occurred in a region or regions of memory they may be more likely to occur in future. Thus, as a further result of finding errors, the data hardening engine may change data protection (e.g. increase data protection, alter the data protection scheme, etc.) and thus harden the data against further possible errors that may occur in the future.

For example in FIG. 20-21 the data hardening engine may track, for example using data in one or more memory map tables, how long data may have been stored in one or more regions of one or more stacked memory chips. The data hardening engine may also track the number of read/write cycles, etc. Of course any parameter involving the data stored in one or more regions of one or more stacked memory chips may be tracked. In general it is found that solid-state memory (e.g. NAND flash, particularly MLC NAND flash, etc.) may wear out with increasing age and/or large numbers of read/write cycles, etc. Thus, for example, the data hardening engine may; as a result of data stored in a memory map table, information received in a command (e.g. from CPU or other system component, etc.), or otherwise; change, alter, modify etc. one or more data protection schemes.

For example, in FIG. 20-21 the data hardening circuit block (or other circuit block(s) etc.) may be operable to send data hardening and/or related information to the CPU or other system component. For example, in FIG. 20-21 the data hardening circuit block may send information to the message encode block for example. In FIG. 20-21 the message encode block may encapsulate (e.g. insert, place, locate, encode, etc.) information into one or more messages (e.g. responses, completions, etc.) and send these to the PHY and data layer block(s) for transmission (e.g. to the CPU, to other system components, etc.).

As an option, the data hardening system for a stacked memory system may be implemented in the context of the architecture and environment of any previous Figure(s) and/or any subsequent Figure(s). Of course, however, the data hardening system for a stacked memory system may be implemented in the context of any desired environment. The capabilities of the various embodiments of the present invention may be implemented in software, firmware, hardware or some combination thereof.

As one example, one or more aspects of the various embodiments of the present invention may be included in an article of manufacture (e.g. one or more computer program products) having, for instance, computer usable media. The media has embodied therein, for instance, computer readable program code means for providing and facilitating the capabilities of the various embodiments of the present invention. The article of manufacture can be included as a part of a computer system or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; and U.S. Provisional Application No. 61/580,300, filed Dec. 26, 2011, titled "SYSTEM, METHOD, AND COMPUTER PROGRAM PRODUCT FOR IMPROVING MEMORY SYSTEMS." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section IV

The present section corresponds to U.S. Provisional Application No. 61/602,034, titled "SYSTEM, METHOD, AND COMPUTER PROGRAM PRODUCT FOR IMPROVING MEMORY SYSTEMS," filed Feb. 22, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS."

FIG. 21-1

FIG. 21-1 shows a multi-class memory apparatus 21-100, in accordance with one embodiment. As an option, the apparatus 21-100 may be implemented in the context of any subsequent Figure(s). Of course, however, the apparatus 21-100 may be implemented in the context of any desired environment.

As shown, the apparatus 21-100 includes a first semiconductor platform 21-102 including a first memory 21-104 of a first memory class. Additionally, the apparatus 21-100 includes a second semiconductor platform 21-108 stacked with the first semiconductor platform 21-102. The second semiconductor platform 21-108 includes a second memory 21-106 of a second memory class. Furthermore, in one embodiment, there may be connections (not shown) that are in communication with the first memory 21-104 and pass through the second semiconductor platform 21-108.

In one embodiment, the apparatus 21-100 may include a physical memory sub-system. In the context of the present description, physical memory refers to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, MRAM, PRAM, etc.), a solid-state disk (SSD) or other disk, magnetic media, and/or any other physical memory that meets the above definition.

Additionally, in various embodiments, the physical memory sub-system may include a monolithic memory circuit, a semiconductor die, a chip, a packaged memory circuit, or any other type of tangible memory circuit. In one embodiment, the apparatus 21-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory 21-104 or the second memory 21-106 may include RAM (e.g. DRAM, SRAM, etc.) and the other one of the first memory 21-104 or the second memory 21-106 may include NAND flash. In another embodiment, one of the first memory 21-104 or the second memory 21-106 may include RAM (e.g. DRAM, SRAM, etc.) and the other one of the first memory 21-104 or the second memory 21-106 may include NOR flash. Of course, in various embodiments, any number (e.g. 2, 3, 4, 5, 6, 7, 8, 9, or more, etc.) of combinations of memory classes may be utilized.

In one embodiment, the connections that are in communication with the first memory 21-104 and pass through the second semiconductor platform 21-108 may be formed utilizing through-silicon via (TSV) technology. Additionally, in one embodiment, the connections may be communicatively coupled to the second memory 21-106.

For example, in one embodiment, the second memory 21-106 may be communicatively coupled to the first memory 21-104. In the context of the present description, being communicatively coupled refers to being coupled in any way that functions to allow any type of signal (e.g. a data signal, an electric signal, etc.) to be communicated between the communicatively coupled items. In one embodiment, the second memory 21-106 may be communicatively coupled to the first memory 21-104 via direct contact (e.g. a direct connection, etc.) between the two memories. Of course, being communicatively coupled may also refer to indirect connections, connections with intermediate connections therebetween, etc. In another embodiment, the second memory 21-106 may be communicatively coupled to the first memory 21-104 via a bus. In one embodiment, the second memory 21-106 may be communicatively coupled to the first memory 21-104 utilizing a through-silicon via.

As another option, the communicative coupling may include a connection via a buffer device. In one embodiment, the buffer device may be part of the apparatus 21-100. In another embodiment, the buffer device may be separate from the apparatus 21-100.

Further, in one embodiment, at least one additional semiconductor platform (not shown) may be stacked with the first semiconductor platform 21-102 and the second semiconductor platform 21-108. In this case, in one embodiment, the additional semiconductor may include a third memory of at least one of the first memory class or the second memory class. In another embodiment, the at least one additional semiconductor includes a third memory of a third memory class.

In one embodiment, the additional semiconductor platform may be positioned between the first semiconductor platform 21-102 and the second semiconductor platform 21-108. In another embodiment, the at least one additional semiconductor platform may be positioned above the first semiconductor platform 21-102 and the second semiconductor platform 21-108. Further, in one embodiment, the additional semiconductor platform may be in communication with at least one of the first semiconductor platform 21-102 and/or the second semiconductor platform 21-102 utilizing wire bond technology.

Additionally, in one embodiment, the additional semiconductor platform may include a logic circuit. In this case, in one embodiment, the logic circuit may be in communication with at least one of the first memory 21-104 or the second memory 21-106. In one embodiment, at least one of the first memory 21-104 or the second memory 21-106 may include a plurality of sub-arrays in communication via shared data bus.

Furthermore, in one embodiment, the logic circuit may be in communication with at least one of the first memory 21-104 or the second memory 21-106 utilizing through-silicon via technology. In one embodiment, the logic circuit and the first memory 21-104 of the first semiconductor platform 21-102 may be in communication via a buffer. In this case, in one embodiment, the buffer may include a row buffer.

In operation, in one embodiment, a first data transfer between the first memory 21-104 and the buffer may prompt a plurality of additional data transfers between the buffer and the logic circuit. In various embodiments, data transfers between the first memory 21-104 and the buffer and between the buffer and the logic circuit may include serial data transfers and/or parallel data transfers. In one embodiment, the apparatus 21-100 may include a plurality of multiplexers and a plurality of de-multiplexers for facilitating data transfers between the first memory and the buffer and between the buffer and the logic circuit.

Further, in one embodiment, the apparatus 21-100 may be configured such that the first memory 21-104 and the second memory 21-106 are capable of receiving instructions via a single memory bus 21-110. The memory bus 21-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, etc; I/O protocols such as PCI, PCI-E, HyperTransport, InfiniBand, QPI, etc; networking protocols such as Ethernet, TCP/IP, iSCSI, etc; storage protocols such as NFS, SAMBA, SAS, SATA, FC, etc; and other protocols (e.g. wireless, optical, etc.); etc.).

In one embodiment, the apparatus 21-100 may include a three-dimensional integrated circuit. In one embodiment, the first semiconductor platform 21-102 and the second semiconductor platform 21-108 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 21-100 may include a three-dimensional integrated circuit that is a wafer-on-wafer device. In this case, a first wafer of the wafer-on-wafer device may include the first memory 21-104 of the first memory class, and a second wafer of the wafer-on-wafer device may include the second memory 21-106 of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 21-102 and the second semiconductor platform 21-108 together may include a three-dimensional integrated circuit that is a wafer-on-wafer device.

In another embodiment, the apparatus 21-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 21-102 and the second semiconductor platform 21-106 together may include a three-dimensional integrated circuit that is a monolithic device.

In another embodiment, the apparatus 21-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 21-102 and the second semiconductor platform 21-108 together may include a three-dimensional integrated circuit that is a die-on-wafer device.

In yet another embodiment, the apparatus 21-100 may include a three-dimensional integrated circuit that is a die-on-die device. In the context of the present description, a die-on-die device refers to a device including two or more aligned dies in a die-on-die configuration. In one embodiment, the first semiconductor platform 21-102 and the second semiconductor platform 21-108 together may include a three-dimensional integrated circuit that is a die-on-die device.

Additionally, in one embodiment, the apparatus 21-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 21-100 may be configured such that the first memory 21-104 and the second memory 21-106 are capable of receiving instructions from a device 21-112 via the single memory bus 1A-110. In one embodiment, the device 21-110 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.).

Further, in one embodiment, the apparatus 21-100 may include at least one heat sink stacked with the first semiconductor platform and the second semiconductor platform. The heat sink may include any type of heat sink made of any appropriate material. Additionally, in one embodiment, the apparatus 21-100 may include at least one adapter platform stacked with the first semiconductor platform 21-102 and the second semiconductor platform 21-108.

More illustrative information will now be set forth regarding various optional architectures and features with which the foregoing techniques discussed in the context of any of the figure(s) may or may not be implemented, per the desires of the user. For instance, various optional examples and/or options associated with the configuration/operation of the apparatus 21-100, the configuration/operation of the first and second memories 21-104 and 21-106, the configuration/operation of the memory bus 21-110, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc. which may or may not be incorporated in the various embodiments disclosed herein.

FIG. 21-2

Stacked Memory Chip System

FIG. 21-2 shows a stacked memory chip system, in accordance with another embodiment.

In FIG. 21-2, stacked memory chip system 21-200 includes a CPU 21-202 coupled to memory 21-226 using memory bus 21-204. In FIG. 21-2 memory 21-226 comprises two memory classes: memory class 1 21-206 and memory class 2 21-208. In one embodiment, for example, memory class 1 may be DRAM and memory class 2 may be NAND flash. In FIG. 21-2, CPU 21-202 is also coupled to memory class 3 21-21-210 using I/O bus 21-212. In one embodiment, for example, memory class 3 may be a disk, hard drive, storage system, RAID array, solid-state disk, flash memory, etc. In FIG. 21-2, memory class 1 21-206 (M1), memory class 2 21-208 (M2) and memory class 3 21-234 (M3) together form virtual memory (VMy) 21-232. In FIG. 21-2, memory class 1 21-206 and memory class 2 21-208 form the main memory 21-238. In one embodiment, for example, memory class 3 21-234 may contain a page file. In FIG. 21-2, memory class 3 is not shown as being part of main memory (but in other embodiments it may be).

The use of two or more regions (e.g. arrays, subarrays, parts, portions, groups, blocks, chips, die, memory types, memory technologies, etc.) as two or memory classes that may have different properties (e.g. physical, logical, parameters, etc.) may be useful for example in designing larger (e.g. higher memory capacity, etc.), cheaper, faster, lower power memory systems.

In one embodiment for example memory class 1 and memory class 2 may use the same memory technology (e.g. SDRAM, NAND flash, etc.) but operate with different parameters, etc. Thus for example memory class 1 may be kept active at all times while memory class 2 may be allowed to enter one or more power-down states, etc. Such an arrangement may reduce the power consumed by a dense stacked memory package system. In another example memory class 1 and memory class 2 may use the same memory technology (e.g. SDRAM, etc.) but operate at different supply voltages (and thus potentially different latencies, operating frequencies, etc.). In another example memory class 1 and memory class 2 may use the same memory technology (e.g. SDRAM, etc.) but the distinction (e.g. difference, assignment, partitioning, etc.) between memory class 1 and memory class 2 may be dynamic (e.g. changing, configurable, programmable, etc.) rather than static (e.g. fixed, etc.).

In one embodiment memory classes may themselves comprise (or be considered to comprise, etc.) of different memory technologies or the same memory technology with different parameters. Thus for example in FIG. 21-2, a first portion (or portions) of memory class 2 may comprise SDRAM using ×4 memory organization and a second portion (or portions) of memory class 2 may comprise SDRAM using ×8 organization, etc. In one embodiment, such an arrangement may be implemented when the memory system is upgradeable for example and SDRAM with ×4 organization is cheaper than SDRAM with ×8 organization.

In one embodiment memory classes may be reassigned. Thus for example in FIG. 21-2 one or more portions of memory assigned to memory class 2 may be reassigned (e.g. logically moved, reconfigured, etc.) to memory class 3. Note that in this case the reassignment also results in a change in the bus used for access. Note also that as explained above memory class 2 and memory class 3 do not have to use the same type of memory technology in order for memory to be reassigned between classes (but they may use the same memory technology). In another example the parameters of the memory may be altered in a move or reassignment. Thus for example if a portion (or portions) of SDRAM is reassigned from memory class 2 to memory class 3 the operating voltage may be lowered (latency increased, power reduced, etc.) and/or the power-down behavior and/or other operating parameters etc. may be modified, etc. In one embodiment, the use of a logic chip or logic function in one or more stacked memory packages may be implemented when dynamic class modification (e.g. reassignment, etc.) is used. Thus, for example, a logic chip may perform the logical reassignment of memory, circuits, buses, supply voltages, operating frequencies, etc.

In one embodiment the dynamic behavior of memory classes may be programmed directly by one or more CPUs in a system (e.g. using commands at startup or at run time, etc.) or may be managed autonomously or semi-autonomously by the memory system for example. For example modification (e.g. reassignment, parameter changes, etc.) to one or more memory classes may result (e.g. a consequence of, follow from, be triggered by, etc.) from link changes between one or more CPUs and the memory system (e.g. number of links, speed of links, link configuration, etc.). Of course any changes in the system (e.g. power, failure, operating conditions, operator intervention, system performance, etc.) may be used to trigger class modification or may trigger class modification.

In one embodiment the memory bus 21-204 may be a split transaction bus (e.g. bus based on separate request and reply, command and response, etc.). In one embodiment, using a split transaction bus may be implemented when memory class 1 and memory class 2 have different properties (e.g. timing, logical properties and/or behavior, etc.). For example, memory class 1 may be SDRAM with a latency of the order of 10 ns. For example memory class 2 may be NAND flash with a latency of the order of 10 microseconds. In FIG. 21-2 the CPU may issue a memory request for data (e.g. a read command, data request, etc.) using a single memory bus to main memory that may comprise more than one type of memory (e.g. more than one class of memory, etc.). In FIG. 21-2 the data may, for example, reside (e.g. be stored, be located, etc.) in memory class 1 or memory class 2 (or in some cases memory class 1 and memory class 2). If the data resides in memory class 1 the memory system (e.g. main memory, etc.) may return data (e.g. provide a read completion, a read response, etc.) with a delay (e.g. time from the initial request, etc.) of the order of the latency of memory class 1 (e.g. with SDRAM latency, roughly 10 ns, etc.). If the data resides only in memory class 2 the memory may return data with a delay of the order of the latency of memory class 2 (e.g. with NAND flash latency, roughly 10 microseconds, etc.). Thus a split transaction bus may allow response with variable latency. Of course any bus (for example I/O bus 212) may be present in a system using multiple memory technologies, multiple stacked memory packages, multiple memory classes etc. be a split transaction bus.

Thus the use of two or more memory classes may be utilized to provide larger, cheaper, faster, better performing memory systems. The design of memory systems using two or more memory classes may use one or more stacked memory packages in which one or more memory technologies may be combined with one or more other chips (e.g. CPU, logic chip, buffer, interface chip, etc.).

In one embodiment the stacked memory chip system 21-200 may comprise two or more (e.g. a stack, assembly, group, etc.) chips (e.g. chip 1 21-254, chip 2 21-256, chip 3 21-252, chip 4 21-268, chip 5 21-248, etc.).

In one embodiment the stacked memory chip system 21-200 comprising two or more chips may be assembled (e.g. packaged, joined, etc.) in a single package, multiple packages, combinations of packages, etc.

In one embodiment of stacked memory chip system 21-200 comprising two or more chips, the two or more chips may be coupled (e.g. assembled, packaged, joined, connected, etc.) using one or more interposers 21-250 and through-silicon vias 21-266. The one or more interposers may comprise interconnections 21-278 (e.g. traces, wires, coupled, connected, etc.). Of course any coupling system may be used (e.g. using interposers, redistribution layers (RDL), package-on-package (PoP), package in package (PiP), combinations of one or more of these, etc.).

In one embodiment stacked memory chip system 21-200 the two or more chips may be coupled to a substrate 21-246 (e.g. ceramic, silicon, etc.). Of course any type (e.g. material, etc.) of substrate and physical form of substrate (e.g. with a slot as shown in FIG. 21-2, without a slot, etc.) may be used. In FIG. 21-2 the substrate has a slot (e.g. hole, slit, etc.) through which wire bonds may be used (e.g. connected, formed, attached, etc.). Use of a slot in the substrate may for example help to reduce the length of wire bonds. Reducing the length of the wire bonds may help to increase the operating frequency of the stacked memory chip system.

In one embodiment the chip at the bottom of the stack may be face down (e.g. active transistor layers face down, etc.). In FIG. 21-2 chip 5 at the bottom of the stack is coupled to the substrate using through-silicon vias. In FIG. 21-2 chip 5 comprises one or more bonding pads 21-264. In FIG. 21-2 the bonding pads on chip 5 are connected to one or more bonding pads 21-260 on the substrate using one or more wire bonds 21-262. The substrate may comprise one or more solder balls 21-244 that may couple to a PCB etc. The substrate may couple one or more solder balls to one or more bonding pads using traces 21-258, etc. In one embodiment, a substrate with wire bonds may be utilized for cost reasons. For example wire bonding may be cheaper than alternatives (e.g. flip-chip, micro balls, etc.). Wire bonding may also be compatible with existing test equipment and/or assembly equipment, etc. Of course the stacked chips may be face up, face down, combinations of face up and face down, etc.).

In one embodiment (not shown in FIG. 21-2) there may be more than one substrate. For example a second substrate may be attached (e.g. coupled, connected, mounted, etc.) at the top of the stacked memory package. In one embodiment, such an arrangement may be utilized to allow power connections at the bottom of the stack (where large connections used for power may also be used to remove heat to a PCB, etc.) and with high-speed signal connections primarily using the top of the stack. Of course in some situations, power signals may be at the top of the stack (e.g. close to a heatsink, etc.) and high-speed signals may be at the bottom of the stack, etc.

In FIG. 21-2 chip 1 and chip 2 may be (e.g. form, belong to, correspond to, may comprise, etc.) memory class 1, with chip 3 and chip 4 being memory class 2. In FIG. 21-2 chip 5 may be a logic chip (e.g. interface chip, buffer chip, etc.). In FIG. 2 for example chip 1 and chip 2 may be SDRAM. In FIG. 21-2 for example chip 3 and chip 4 may be NAND flash.

In one embodiment memory class 1 may comprise any number of chips. Of course memory class 2 (or any memory class, etc.) may also comprise any number of chips. For example one or more of chips 1-5 may also include more than one memory class. Thus for example chip 1 may comprise one or more portions that belong to memory class 1 and one or more portions that comprise memory class 2. In FIG. 21-2 memory class 1 may comprise one or more portions of chip 1 and one or more portions of chip 2. In FIG. 21-2 memory class 2 may comprise one or more portions of chip 3 and one or more portions of chip 4. For example, as shown in FIG. 21-2, memory class 1 may include portions 21-274 and 21-276 of chip 1 and chip 2. For example portion 21-274 may be an echelon (e.g. vertical slice, portion(s), etc.) of a stack of SDRAM memory chips. Of course portions 21-274, 21-276, etc. may be any portions of one or more chips of any type of memory technology (e.g. echelon (as defined herein), bank, rank, row, column, plane, page, block, mat, array, subarray, sector, etc.). For example, as shown in FIG. 21-2, memory class 2 may include portion 21-280 of chip 3 and chip 4. For example portion 21-280 may comprise two portions of NAND flash (e.g. NAND flash pages, NAND flash planes, etc.) one from chip 3 and one from chip 4. Of course portion 21-280 may be any portions of one or more chips.

In one embodiment memory class 2 may comprise one or more portions 21-282 of one or more logic chips. For example chip 1, chip 2, chip 3 and chip 4 may be SDRAM chips (e.g. memory class 1, etc.) and chip 5 may be a logic chip that also includes NAND flash (e.g. memory class 2, etc.). Of course any arrangement of one or more memory classes may be used on two or more stacked memory chips in a stacked memory package.

In one embodiment memory class 3 may also be integrated (e.g. assembled, coupled, etc.) with memory class 1 and memory class 2. For example in FIG. 21-2, chip 1 and chip 2 may be fast memory (e.g. lowest latency, etc.) and form (e.g. provide, act as, be configured as, etc.) memory class 1; chip 3 and chip 4 may be medium speed memory and form memory class 2; chip 5 may be a logic chip and include low speed memory used as memory class 3, etc. Of course any memory class may use memory technology of any speed, latency, etc.

In one embodiment CPU 202 may also be integrated (e.g. assembled, coupled, etc.) with memory class 1, memory class 2 (and also possibly memory class 3, etc.). For example in FIG. 21-2, chip 1 and chip 2 may form (e.g. provide, act as, be configured as, etc.) memory class 1; chip 3 and chip 4 may form memory class 2; chip 5 may be a CPU chip (possibly containing multiple CPU cores, etc.) and may contain a logic chip function to interface with chip 1, chip 2, chip 3, chip 4 (and may also include memory that may used as memory class 3, etc.). Of course the partitioning (e.g. division, allocation, separation, construction, assignment, etc.) of memory classes between chips may be performed in any way.

Of course the system of FIG. 21-2 may also be used with a stacked memory package that may use a single type of memory chip (e.g. one memory class, etc.) or to build (e.g. assemble, construct, etc.) a stacked memory package that may be compatible with a single memory chip type, etc. Such a system, for example with the structure of FIG. 21-2 (e.g. stacked memory chips on a wire bond substrate, etc.), may be implemented when using a stacked memory package with existing process (e.g. assembly, test, etc.) flows (e.g. used for non-stacked memory chips using wire bonds, etc.). For example in FIG. 21-2: chip 1, chip 2, chip 3, chip 4 may be SDRAM memory chips and chip 5 may be a logic chip. In FIG. 21-2, substrate 21-246 may be compatible with (e.g. same size, similar pinout, pin compatible, a superset of, a subset of, equivalent to, etc.) existing DRAM memory packages and/or footprints and/or pinouts (e.g. JEDEC standard, industry standard, proprietary packages, etc), extensions of existing (e.g. standard, etc.) packages, footprints, pinouts, etc.

Thus the use of memory classes (as shown in FIG. 21-2) may offer another tool for memory systems and memory subsystems design and may be implemented for memory systems using stacked memory packages (constructed as shown in FIG. 21-2 for example). Of course many other uses for memory classes are possible and the construction (e.g. assembly, packaging, arrangement, etc.) of the stacked memory package may take different forms from that shown in FIG. 21-2. Other possible packages, assemblies and constructions may be shown in both previous and subsequent Figures and may depend on system design parameters including (but not limited to) the following: cost, power, space, performance (e.g. memory speed, bus speed, etc), memory size (e.g. capacity), memory technology (e.g. SDRAM, NAND flash, etc.), packaging technology (e.g. wirebond, TSV, CSP, BGA, etc.), package pitch (e.g. less than 1 mm, greater than 1 mm, etc.), PCB technology, etc.

As an option, the stacked memory chip system may be implemented in the context of the architecture and environment of any previous Figure(s) and/or any subsequent Figure(s). Of course, however, the stacked memory chip system may be implemented in the context of any desired environment.

FIG. 21-3

Computer System Using Stacked Memory Chips

FIG. 21-3 shows a computer system using stacked memory chips, in accordance with another embodiment.

In FIG. 21-3 the computer system using stacked memory chips 21-300 comprises a CPU (only one CPU is shown in FIG. 21-3) coupled to one or more stacked memory packages (only one stacked memory package is shown in FIG. 21-3). In FIG. 21-3 the stacked memory packages comprise one or more stacked memory chips (four stacked memory chips are shown in FIG. 21-3) and one or more logic chips (only one logic chip is shown in FIG. 21-3).

In one embodiment the stacked memory package 21-302 may be cooled by a heatsink assembly 21-310. In one embodiment the CPU 21-304 may be cooled by a heatsink assembly 21-308. The CPU(s), stacked memory package(s) and heatsink(s) may be mounted on one or more carriers (e.g. motherboard, mainboard, printed-circuit board (PCB), etc.) 21-306.

For example, a stacked memory package may contain 2, 4, 8 etc. SDRAM chips. In a typical computer system comprising one or more DIMMs that use discrete (e.g. separate, multiple, etc.) SDRAM chips, a DIMM may comprise 8, 16, or 32 etc. (or multiples of 9 rather than 8 if the DIMMs include ECC error protection, etc.) SDRAM packages. For example, a DIMM using 32 discrete SDRAM packages may dissipate more than 10 W. It is possible that a stacked memory package may consume a similar power but in a smaller form factor than a standard DIMM embodiment (e.g. a typical DIMM measures 133 mm long by 30 mm high by 3-5 mm wide (thick), etc.). A stacked memory package may use a similar form factor (e.g. package, substrate, module, etc.) to a CPU (e.g. 2-3 cm on a side, several mm thick, etc.) and may dissipate similar power. In order to dissipate this amount of power the CPU and one or more stacked memory packages may use similar heatsink assemblies (as shown in FIG. 21-2).

In one embodiment the CPU and stacked memory packages may share one or more heatsink assemblies (e.g. stacked memory package and CPU use a single heatsink, etc.). In one embodiment, a shared heatsink may be utilized if a single stacked memory package is used in a system for example.

In one embodiment the stacked memory package may be co-located on the mainboard with the CPU (e.g. located together, packaged together, mounted together, mounted one on top of the other, in the same package, in the same module or assembly, etc.). When CPU and stacked memory package are located together, in one embodiment, a single heatsink may be utilized (e.g. to reduce cost(s), to couple stacked memory package and CPU, improve cooling, etc.).

In one embodiment one or more CPUs may be used with one or more stacked memory packages. For example, in one embodiment, one stacked memory package may be used per CPU. In this case the stacked memory package may be co-located with a CPU. In this case the CPU and stacked memory package may share a heatsink.

Of course any number of CPUs may be used with any number of stacked memory packages and any number of heatsinks. The CPUs and stacked memory packages may be mounted on a single PCB (e.g. motherboard, mainboard, etc.) or one or more stacked memory packages may be mounted on one or more memory subassemblies (memory cards, memory modules, memory carriers, etc.). The one or more memory subassemblies may be removable, plugged, hot plugged, swappable, upgradeable, expandable, etc.

In one embodiment there may be more than one type of stacked memory package in a system. For example one type of stacked memory package may be intended to be co-located with a CPU (e.g. used as near memory, as in physically and/or electrically close to the CPU, etc.) and a second type of stacked memory package may be used as far memory (e.g. located separately from the CPU, further away physically and/or electrically than near memory, etc.).

As an option, the computer system using stacked memory chips may be implemented in the context of the architecture and environment of any previous Figure(s) and/or any subsequent Figure(s). Of course, however, the computer system using stacked memory chips may be implemented in the context of any desired environment.

FIG. 21-4

Stacked Memory Package System Using Chip-Scale Packaging

FIG. 21-4 shows a stacked memory package system using chip-scale packaging, in accordance with another embodiment.

In FIG. 21-4 the stacked memory package system using chip-scale packaging comprises two or more stacked chips assembled (e.g. coupled, joined, connected, etc.) as a chip scale package. Generally the definition of a chip scale package (CSP) refers to a package that is roughly the same size as the silicon die (e.g. chip, integrated circuit, etc.). Typically a package may be considered to be a CSP when the package size is between 1.0 and 1.2 times the size of the die. For example in FIG. 21-2 chip 1 21-404, chip 2 21-406, chip 3 21-408 may be assembled together (e.g. using interposer(s) (not shown), RDL(s), through-silicon vias 21-402, etc.) and then bumped (e.g. bumps 21-410 may be added). The combination of chip 1, chip 2, chip 3 and bumps may be considered a CSP (although the term chip scale packaging is sometimes reserved for single die packages). For example the combination of chip 1, chip 2, chip 3 and bumps may be considered a microBGA (which may be considered a form of CSP). The CSP may then be mounted on a substrate 21-412 with solder balls 21-414.

In one embodiment the stacked memory package system using chip-scale packaging may contain one or more stacked memory chips and one or more logic chips. For example, in FIG. 21-4 chip 1 and chip 2 may be SDRAM memory chips and chip 3 may be a logic chip that acts as an interface chip, buffer etc. In one embodiment, such a system may be utilized when 2, 4, 8, 16 or more memory chips are stacked and the stacked memory package is intended for use as far memory (e.g. memory that is separate from CPU(s), etc.).

In one embodiment the stacked memory package system using chip-scale packaging may comprise one or more stacked memory chips and one or more CPUs. For example, in FIG. 21-4 chip 1 and chip 2 may be SDRAM memory chips and chip 3 may be a CPU chip (e.g. possibly with multiple CPU cores, etc. In one embodiment, such a system may be utilized if the stacked memory package is intended for use as near memory (e.g. memory that is co-located with one or more CPU(s), for wide I/O memory, etc.).

In one embodiment more than one type of memory chip may be used. For example in FIG. 21-4 chip 1 may be memory of a first type (e.g. SDRAM, etc.) and chip 2 may be memory of a second type (e.g. NAND flash, etc.).

In one embodiment the substrate 21-412 may be used as a carrier that transforms connections on a first scale of bumps 21-410 (e.g. fine pitch bumps, bumps at a pitch of 1 mm or less, etc.) to connections on a second (e.g. larger, etc.) scale of solder balls 21-414 (e.g. pitch of greater than 1 mm etc.). For example it may be technically possible and economically effective to construct the chip scale package of chip 1, chip 2, chip 3, and bumps 21-410. However it may not be technically possible or economically effective to assemble the chip scale package directly in a system. For example a cell phone PCB may not be able to support (e.g. technically, for cost reasons, etc.) the fine pitch required to connect directly to bumps 21-410. For example, different carriers (e.g. substrate 21-412, etc.) but with the same stacked memory package CSP may be used in different systems (e.g. cell phone, computer system, networking equipment, etc.).

In one embodiment an extra layer (or layers) of material may be added to the stacked memory package (e.g. between die and substrate, etc.) to match the coefficient(s) of expansion of the CSP and PCB on which the CSP is mounted for example (not shown in FIG. 21-4). The material may, for example, be an elastic material (e.g. rubber, elastomer, polymer, croslinked polymer, amorphous polymer, polyisoprene, polybutadiene, polyurethane, combinations of these and/or other materials generally with low Young's modulus and high yield strain, etc.).

As an option, the stacked memory package system using chip-scale packaging may be implemented in the context of the architecture and environment of any previous Figure(s) and/or any subsequent Figure(s). Of course, however, the stacked memory package system using chip-scale packaging may be implemented in the context of any desired environment.

FIG. 21-5

Stacked Memory Package System Using Package in Package Technology

FIG. 21-5 shows a stacked memory package system using package in package technology, in accordance with another embodiment.

In FIG. 21-5 the stacked memory package system using package in package (PiP) technology comprises chip 1 21-502, chip 2 21-506, chip 3 21-514, substrate 21-510. The system shown in FIG. 21-5 may allow the use of a stacked memory package but without requiring the memory chips to use through-silicon via technology. For example, in FIG. 21-5, chip 1 and chip 2 may be SDRAM memory chips (e.g. without through silicon vias). Chip 1 and chip 2 are bumped (e.g. use bumps or micro bumps 21-504, use CSP, etc.) and are mounted on chip 3. In FIG. 21-5 chip 3 may be face up or face down for example. In FIG. 21-5 chip 3 uses through silicon vias. In FIG. 21-5 chip 3 may be a logic chip (e.g. interface chip, buffer, etc.) for example or may be a CPU (possibly with multiple CPU cores, etc.). In FIG. 21-5 chip 1, chip 2, chip 3 are then mounted (e.g. coupled, assembled, packaged, etc.) on substrate 510 with solder balls 21-508. For example, in one embodiment, the system shown in FIG. 21-5 may be utilized if chip 3 is a CPU and chip 1 and chip 2 are memory chips that have wide (e.g. 512 bits, etc.) memory buses (e.g. wide I/O, etc.).

Of course combinations of cost-effective, low technology structure(s) using wire bonding for example (e.g. FIG. 21-2, etc.) may be used with denser CSP technology (e.g. FIG. 21-4, etc.) and/or with PiP technology (e.g. FIG. 21-5, etc.) and/or other packaging technologies (e.g. package on package (PoP), flip-chip, wafer scale packaging (WSP), multichip module (MCM), area array, built up multilayer (BUM), interposers, RDLs, spacers, etc.).

As an option, the stacked memory package system using package in package technology may be implemented in the context of the architecture and environment of any previous Figure(s) and/or any subsequent Figure(s). Of course, however, the stacked memory package system using package in package technology may be implemented in the context of any desired environment.

FIG. 21-6

Stacked Memory Package System Using Spacer Technology

FIG. 21-6 shows a stacked memory package system using spacer technology, in accordance with another embodiment.

In FIG. 21-6 the stacked memory package system using spacer technology comprises chip 1 21-602, chip 2 21-610, chip 3 21-624, chip 4 21-618, substrate 21-622, spacer 21-614. In FIG. 21-6 chip 1 and chip 2 are mounted (e.g. assembled, coupled, connected, etc.) to chip 3 using one or more wire bonds 21-632 to connect one or more bonding pads 21-630 to one or more bonding pads 21-634. In FIG. 21-6 chip 3 is mounted to spacer 21-614 using solder balls 21-612. In FIG. 21-6 chip 4 is mounted to substrate 21-622 using bumps 21-616. In FIG. 21-6 spacer 21-614 connects (e.g. couples, etc.) chip 3 and substrate. In FIG. 21-6 chip 3 and chip 4 may be coupled via spacer and substrate. In FIG. 21-6 chip 1 (and chip 2) may be coupled to chip 3 (and chip 4) via through silicon vias 21-604. In FIG. 21-6 chip 3 may be mounted face up or face down. Of course other similar arrangements (e.g. assembly, packaging, mounting, bonding, stacking, carriers, spacers, interposers, RDLs, etc.) may be used to couple chip 1, chip 2, chip 3, chip 4. Of course different numbers of chips may be used and assembled, etc.

In one embodiment, the system of FIG. 21-6 may be utilized if chip 1 and chip 2 cannot support (e.g. technically because of process limitations etc, economically because of process costs, yield, etc.) through-silicon via technology. For example chip 1 and chip 2 may be SDRAM memory chips, chip 3 may be a CPU chip (possibly with multiple CPU cores), chip 4 may be a NAND flash chip, etc. For example, chip 1 and chip 2 may be NAND flash chips, chip 3 may be a SDRAM chip, chip 4 may be a logic and/or CPU chip, etc.

Of course combinations of cost-effective, low technology structure(s) using wire bonding for example (e.g. FIG. 21-2, etc.) may be used with denser CSP technology (e.g. FIG. 21-4, etc.) and/or with PiP technology (e.g. FIG. 21-5, etc.) and/or spacer technology (e.g. FIG. 21-6, etc.) and/or other packaging technologies (e.g. package on package (PoP), flip-chip, wafer scale packaging (WSP), multichip module (MCM), area array, built up multilayer (BUM), etc.).

As an option, the stacked memory package system using spacer technology may be implemented in the context of the architecture and environment of any previous Figure(s) and/or any subsequent Figure(s). Of course, however, the stacked memory package system using spacer technology may be implemented in the context of any desired environment.

FIG. 21-7

Stacked Memory Package Comprising a Logic Chip and a Plurality of Stacked Memory Chips FIG. 21-7 shows a stacked memory package 21-700 comprising a logic chip v746 and a plurality of stacked memory chips 21-712, in accordance with another embodiment. In FIG. 21-7 each of the plurality of stacked memory chips 21-712 may comprise a DRAM array 21-714. Of course any type of memory may equally be used (e.g. SDRAM, NAND flash, PCRAM, etc.). In FIG. 21-7 each of the DRAM arrays may comprise one or more banks, for example the stacked memory chips in FIG. 21-7 comprise 8 banks 21-706. In FIG. 21-7 each of the banks may comprise a row decoder 21-716, sense amplifiers 21-748, IO gating/DM mask logic 21-732, column decoder 21-750. In FIG. 21-7 each bank may comprise 16384 rows 21-704 and 8192 columns 21-702. In FIG. 21-7 each stacked memory chip may be connected (e.g. coupled, etc.) to the logic chip using through-silicon vias (TSVs) 21-740. In FIG. 21-7 the row decoder is coupled to the row address MUX 21-760 and bank control logic 21-762 via bus 21-710 (width 17 bits). In FIG. 21-7 bus 21-710 is split in the logic chip and comprises bus 21-724 (width 3 bits) connected to the bank control logic 21-762 and bus 21-726 (width 14 bits) connected to the row address MUX 21-760. In FIG. 7 the column decoder is connected to the column address latch 21-738 via bus 21-722 (width 7 bits). In FIG. 21-7 the IO gating/DM mask logic is connected to the logic chip via bus 21-708 (width 64 bits bidirectional). In the logic chip bus 21-708 is split to bus 21-718 (width 64 bits unidirectional) connected to the read FIFO and bus 21-716 (width 64 bits unidirectional) connected to the data I/F (data interface). In FIG. 21-7 bus 21-720 (width 3 bits) connects the column address latch and the read FIFO. In FIG. 21-7 the read FIFO is connected to the logic layer 21-738 via bus 21-728 (width 64 bits). In FIG. 21-7 the data I/F is connected to the logic layer via bus 21-730 (width 64 bits). In FIG. 21-7 the logic layer is connected to the address register 21-764 via bus 21-770 (width 17 bits). In FIG. 21-7 the logic layer is connected to the PHY layer 21-742. In FIG. 21-7 the PHY layer 21-742 transmits and receives data, control signals etc. on high-speed links 21-744 to CPU(s) and possibly other stacked memory packages. In FIG. 21-7 other logic blocks may include (but are not limited to) DRAM register 21-766, DRAM control logic 21-768, etc.

In one embodiment of stacked memory package comprising a logic chip and a plurality of stacked memory chips a first-generation stacked memory chip may be based on the architecture of a standard (e.g. using a non-stacked memory package without logic chip, etc.) JEDEC DDR SDRAM memory chip. Such a design may allow the learning and process flow (manufacture, testing, assembly, etc.) of previous standard memory chips to be applied to the design of a stacked memory package with a logic chip such as shown in FIG. 21-7. As technology and process advances (e.g. through-silicon via (TSV) technology, a major technology component of stacked memory packages) subsequent generations of stacked memory packages may take advantage, for example, of increased TSV density, etc. Other figures and accompanying text may describe subsequent generations (e.g. designs, architectures, etc.) of stacked memory packages based on features from FIG. 21-7 for example. One area of the design that may change as TSV technology advances are the TSV connections 21-740 in FIG. 21-7. For example, as TSV density increases (e.g. through process advances, etc.) the number of TSV connections between the memory chips and logic chip(s) may increase.

For example, in a JEDEC standard DDR (e.g. DDR, DDR2, DDR3, etc.) SDRAM part (e.g. JEDEC standard memory device, etc.) the number of connections external to each discrete (e.g. non-stacked memory chips, no logic chip, etc.) memory package is limited. For example a 1Gbit DDR3 SDRAM part in a JEDEC standard FBGA package may have from 78 (8 mm×11.5 mm package) to 96 (9 mm×15.5 mm package) ball connections. In a 78-ball FBGA package for a 1Gbit ×8 DDR3 SDRAM part there are: 8 data connections (DQ); 32 power supply and reference connections (VDD, VSS, VDDQ, VSSQ, VREFDQ); 7 unused connections (NC due to wiring restrictions, spares for other organizations); 31 address and control connections. Thus in an embodiment involving a standard JEDEC DDR3 SDRAM part (which we refer to below as an SDRAM part, as opposed to the stacked memory package shown for example in FIG. 21-7) only 8 connections from 78 possible package connections (less than 10%) are available to carry data. Ignoring ECC data correction a typical DIMM used in a computer system may use eight such SDRAM parts to provide 8×8 bits or 64 bits of data. Because of such pin (e.g. signal, connection, etc.) limitations (e.g. limited package connections, etc.) the storage and retrieval of data in a standard DIMM using standard SDRAM parts may be quite wasteful of energy. Not only is the storage and retrieval of data to/from each SDRAM part wasteful (as will be described in more detail below) but the assembly of several SDRAM parts (e.g. discrete memory packages, etc.) on a DIMM (or module, PCB, etc.) increases the size of the memory system components (e.g. DIMMs etc.) and reduces the maximum possible operating frequency, reducing (or limiting, etc.) the performance of a memory system using SDRAM parts in discrete memory packages. One objective of the stacked memory package of FIG. 21-7 and derivative designs (e.g. subsequent generation architectures described herein, etc.) may be to reduce the energy wasted in storing/retrieving data and/or increase the speed (e.g. rate, operating frequency, etc.) of data storage/retrieval.

Energy may be wasted in an embodiment involving a standard SDRAM part because large numbers of data bits are moved (e.g. retrieved, stored, coupled, etc.) from the memory array (e.g. where data is stored) in order to connect to (e.g. provide in a read, receive in a write, etc.) a small number of data bits (e.g. 8 in a standard DIMM, etc.) at the IO (e.g. input/output, external package connections, etc). The explanation that follows uses a standard 1Gbit (e.g. 1073741824 bits) SDRAM part as a reference example. The 1Gbit standard SDRAM part is organized as 128 Mb×8 (e.g. 134217728×8). There are 8 banks in a 1Gbit SDRAM part and thus each bank stores (e.g. holds, etc.) 134217728 bits. The Ser. No. 13/421,7728 bits stored in each bank are stored as an array of 16384×8192 bits. Each bank is divided into rows and columns. There are 16384 rows and 8192 columns in each bank. Each row thus stores 8192 bits (8 k bits, 1 kB). A row of data is also called a page (as in memory page), with a memory page corresponding to a unit of memory used by a CPU. A page in a standard SDRAM part may not be equal to a page stored in a standard DIMM (consisting of multiple SDRAM parts) and as used by a CPU. For example a standard SDRAM part may have a page size of 1 kB (or 2 kB for some capacities), but a CPU (using these standard SDRAM parts in a memory system in one or more standard DIMMs) may use a page size of 4 kB (or even multiple page sizes). Herein the term page size may typically refer to the page size of a stacked memory chip (which may typically be the row size).

When data is read from an SDRAM part first an ACT (activate) command selects a bank and row address (the selected row). All 8192 data bits (a page of 1 kB) stored in the memory cells in the selected row are transferred from the bank into sense amplifiers. A read command containing a column address selects a 64-bit subset (called column data) of the 8192 bits of data stored in the sense amplifiers. There are 128 subsets of 64-bit column data in a row requiring log(2) 128=7 column address lines. The 64-bit column data is driven through IO gating and DM mask logic to the read latch (or read FIFO) and data MUX. The data MUX selects the required 8 bits of output data from the 64-bit column data requiring a further 3 column address lines. From the data MUX the 8-bit output data are connected to the I/O circuits and output drivers. The process for a write command is similar with 8 bits of input data moving in the opposite direction from the I/O circuits, through the data interface circuit, to the IO gating and DM masking circuit, to the sense amplifiers in order to be stored in a row of 8192 bits.

Thus a read command requesting 64 data bits from an RDIMM using standard SDRAM parts results in 8192 bits being loaded from each of 9 SDRAM parts (in a rank with 1 SDRAM part used for ECC). Therefore in an RDIMM using standard SDRAM parts a read command results in 64/(8192×9) or about 0.087% of the data bits read from the memory arrays in the SDRAM parts being used as data bits returned to the CPU. We can say that the data efficiency of a standard RDIMM using standard SDRAM parts is 0.087%. We will define this data efficiency measure as DE1 (both to distinguish DE1 from other measures of data efficiency we may use and to distinguish DE1 from measure of efficiency used elsewhere that may be different in definition).

Data Efficiency DE1=(number of IO bits)/(number of bits moved to/from memory array)

This low data efficiency DE1 has been a property of standard SDRAM parts and standard DIMMs for several generations, at least through the DDR, DDR2, and DDR3 generations of SDRAM. In a stacked memory package (such as shown in FIG. 21-7), depending primarily on how the buses between memory arrays and the I/O circuits are architected, the data efficiency DE1 may be considerably higher than standard SDRAM parts and standard DIMMs, even approaching 100% in some cases, e.g. over two order of magnitude higher than standard SDRAM parts or standard DIMMs. In the architecture of the stacked memory package illustrated in FIG. 21-7 the data efficiency will be shown to be higher than a standard DIMM, but other stacked memory package architectures (shown elsewhere herein) may be shown to have even higher DE1 data efficiencies than that of the architecture shown in FIG. 21-7. In FIG. 21-7 we have left much of the architecture of the stacked memory chips as similar to a standard SDRAM part as possible to illustrate the changes in architecture that may improve the DE1 data efficiency for example.

In FIG. 21-7 the stacked memory package may comprise a single logic chip and four stacked memory chips. Of course any number of stacked memory chips may be used depending on the limits of stacking technology, cost, size, yield, system requirement(s), manufacturability, etc. In the stacked memory package of FIG. 21-7, in order to both simplify the explanation and compare, contrast, and highlight the differences in architecture and design from an embodiment involving a standard SDRAM part, the sizes and numbers of most of the components (e.g. parts; portions; circuits; array sizes; circuit block sizes; data, control, address and other bus widths; etc.) in each stacked memory chip as far as possible have been kept the same as those corresponding (e.g. equivalent, with same or similar function, etc.) components in the example 1Gbit standard SDRAM part described above. Also in FIG. 21-7, as far as possible the circuit functions, terms, nomenclature, and names etc. used in a standard SDRAM part have also been kept as the same or similar in the stacked memory package, stacked memory chip, and logic chip architectures.

Of course any size, type, design, number etc. of circuits, circuit blocks, memory cells arrays, buses, etc. may be used in any stacked memory chip in a stacked memory package such as shown in FIG. 21-7. For example, in one embodiment, 8 stacked memory chips may be used to emulate (e.g. replicate, approximate, simulate, replace, be equivalent to, etc.) a standard 64-bit wide DIMM (or 9 stacked memory chips may be used to emulate an RDIMM with ECC, etc.). For example, additional (e.g. one or more, or portions of one or more, etc.) stacked memory chip capacity may be used to provide one or more (or portions of one or more) spare stacked memory chips. The resulting architecture may be a stacked memory package with a logical capacity of a first number of stacked memory chips, but using a second number (possibly equal or greater than the first number) of physical stacked memory chips.

In FIG. 21-7 a stacked memory chip may contain a DRAM array (or other type of memory etc.) that is similar to the core (e.g. central portion, memory cell array portion, etc.) of a 1Gbit SDRAM memory device. In FIG. 21-7 the support circuits, control circuits, and I/O circuits (e.g. those circuits and circuit portions that are not memory cells or directly connected to memory cells, etc.) may be located on the logic chip. In FIG. 21-7 the logic chip and stacked memory chips may be connected (e.g. logically connected, coupled, etc.) using through silicon vias (TSVs) or other means.

The partitioning (e.g. separation, division, apportionment, assignment, etc) of logic, logic functions, etc. between the logic chip and stacked memory chips may be made in many ways depending, for example, on factors that may include (but are not limited to) the following: cost, yield, power, size (e.g. memory capacity), space, silicon area, function required, number of TSVs that can be reliably manufactured, TSV size and spacing, packaging restrictions, etc. The numbers and types of connections, including TSV or other connections, may vary with system requirements (e.g. cost, time (as manufacturing and process technology changes and improves, etc.), space, power, reliability, etc.).

In FIG. 21-7 a partitioning is shown with the read FIFO and/or data interface integrated with (e.g. included with, part of, etc.) the logic chip. In FIG. 21-7 the width of the data bus between memory array and sense amplifiers is the same as a 1Gbit standard SDRAM part, or 8192 bits (e.g. stacked memory chip page size is 1 kB). In FIG. 21-7 the width of the data bus between the sense amplifiers and the read FIFO (in the read data path) is the same as a 1 Gb standard SDRAM part, or 64 bits. In FIG. 21-7 the width of the data bus between the read FIFO and the I/O circuits (e.g. logic layer 21-738 and PHY layer 21-742) is 64 bits. Thus the stacked memory package of FIG. 21-7 may deliver 64 bits of data from a single DRAM array using a row size of 8192 bits. This may correspond to a DE1 data efficiency of 64/8192 or 0.78% (compared to 0.087% DE1 of a standard DIMM, an improvement of almost an order of magnitude).

In one embodiment the access (e.g. data access pattern, request format, etc.) granularity (e.g. the size and number of banks, or other portions of each stacked memory chip, etc.) may be varied. For example, by using a shared data bus and shared address bus the signal TSV count (e.g. number of TSVs assigned to data, etc) may be reduced. In this manner the access granularity may be increased. For example, in FIG. 21-7 a memory echelon may comprise one bank (from eight on each stacked memory chip) in each of the eight stacked memory chips. Thus an echelon may be 8 banks (a DRAM slice is thus a bank in this case). There may thus be eight memory echelons. By reducing the TSV signal count (e.g. by using shared buses, moving logic from logic chip to stacked memory chips, etc.) we may use extra TSVs to vary the access granularity. For example we may use a subbank to form the echelon, thus reducing the echelon size and increasing the number of echelons in the system. If there are two subbanks in a bank, we may double the number of memory echelons, etc.

Manufacturing limits (e.g. yield, practical constraints, etc.) for TSV etch and via fill may determine the TSV size. A TSV process may, in one embodiment, require the silicon substrate (e.g. memory die, etc.) to be thinned to a thickness of 100 micron or less. With a practical TSV aspect ratio (e.g. defined as TSV height:TSV width, with TSV height being the depth of the TSV (e.g. through the silicon) and width being the dimension of both sides of the assumed square TSV as seen from above) of 10:1 or lower, the TSV size may be about 5 microns if the substrate is thinned to about 50 micron. As manufacturing skill, process knowledge etc. improves the size and spacing of TSVs may be reduced and number of TSVs possible in a stacked memory package may be increased. An increased number of TSVs may allow more flexibility in the architecture of both logic chips and stacked memory chips in stacked memory packages. Several different representative architectures for stacked memory packages (some based on that shown in FIG. 21-7) are shown herein. Some of these architectures, for example, may exploit increases in the number of TSVs to further increase DE1 data efficiency above that of the architecture shown in FIG. 21-7.

As an option, the stacked memory package of FIG. 21-7 may be implemented in the context of the architecture and environment of the previous Figures and/or any subsequent Figure(s). Of course, however, the stacked memory package of FIG. 7 may be implemented in the context of any desired environment.

FIG. 21-8

Stacked Memory Package Architecture

FIG. 21-8 shows a stacked memory package architecture, in accordance with another embodiment.

In FIG. 21-8 the stacked memory package architecture 21-800 comprises four stacked memory chips 21-812 and a logic chip 21-846. The logic chip and stacked memory chips are connected via TSVs 21-840. In FIG. 21-8 each of the plurality of stacked memory chips 21-812 may comprise one or more memory arrays 21-850. In FIG. 21-8 each of the memory arrays may comprise one or more banks. For example the stacked memory chips in FIG. 21-8 may comprise one memory array that comprise 8 banks 21-806. In FIG. 21-8 the banks may be divided into subarrays 21-802. In FIG. 21-8 each bank contains 4 subarrays but any number of subarrays may be used (including extra or spare subarrays for repair purposes, etc.). Of course any type of memory technology (e.g. NAND flash, PCRAM, etc.) and/or memory array organization may equally be used for the memory arrays. In FIG. 21-8 each of the banks may comprise a row decoder 21-816, sense amplifiers 21-804, row buffers 21-818, column decoders 21-820. In FIG. 21-8 the row decoder is coupled to the row address bus 21-810. In FIG. 21-8 the column decoders are connected to the column address bus 21-814. In FIG. 21-8 the row buffers are connected to the logic chip via bus 21-808 (width 256 bits bidirectional). In FIG. 21-8 the logic chip architecture may be similar to that shown in FIG. 21-7 with the exception that the data bus width of the architecture shown in FIG. 21-8 is 256 bits (compared to 64 bits in FIG. 21-7). In FIG. 21-8 the width of bus 21-814 may depend on the number of columns and number of subarrays. For example if there are no subarrays then the bus width may be the same as a standard SDRAM part (with the same bank size). For example if there are four subarrays in each bank (as shown in FIG. 21-8) then log(2) 4 or 2 extra bits may be added to the bus. In FIG. 21-8 the width of bus 21-810 may depend on the number of rows and may, for example, be the same as a standard SDRAM part (with the same bank size). In FIG. 21-8 the bank addressing is not shown explicitly but may be similar to that shown in FIG. 21-7 for example (and thus bank addressing may be considered to be part of the row address in FIG. 21-8 for example).

In FIG. 21-8 the number of TSVs that may be used for control and address signals may be approximately the same as is shown in FIG. 21-7 for example. In FIG. 21-8 the number of TSVs used for data may be up to 256 for each of the 4 stacked memory chips, or 4×256=1024. In a stacked memory package with 8 stacked memory chips using the architecture of FIG. 21-8, there may thus be up to 2048 TSVs for data. A typical SDRAM die area may be 30 mm^2 (square mm) or 30×10"6 micron^2 (square micron). For example a typical 1 Gb DD3 SDRAM in a 48 nm process may be 28.6 mm^2. For a 5 micron TSV (e.g. a square TSV 5 microns on each side, etc) it may be possible to locate a TSV in a 20 micron×20 micron square (400 micron^2) pattern (e.g. one TSV per 400 micron^2). A 30 mm^2 die may thus theoretically support (e.g. may be feasible, may be practical, etc.) up to 30×10^6/400 or 75,000 TSVs. Although the TSV size may not be a fundamental limitation in an architecture such as shown in FIG. 21-8 there may be other factors to consider. For example 10,000 TSVs (a reasonable number for an architecture using 256-bit datapaths such as FIG. 21-8 when including power and ground, redundancy, etc.) would consume 10^4×(5×5) micron^2 or 2.5×10^6 micron^2 for the TSVs alone. This calculation ignores any keepout areas (e.g. keepout zone (KOZ), keepout area (KOA), etc.) around the TSV where it may not be possible to place active circuits for example. The TSV area of 2.5×10^6 micron^2 would thus be 2.5/30 or 8.3% of the 30×10^6 micron^2 die area in the above example. When considering (e.g. including, factoring in, etc.) keepout areas and layout inefficiency introduced by the TSVs the die area occupied by TSVs (or associated with, consumed by, etc) may be 20% of the die area, which may be an unacceptably high figure (e.g. due to cost, competitive architectures, yield, package size, etc). The memory cell area of a typical 1 Gb DD3 SDRAM in a 48 nm process may be 0.014 micron^2. Thus 1Gbit of memory cells (or 1073741824 memory cells excluding overhead for redundancy, spares, etc.) corresponds to Ser. No. 10/737,41824×0.14 or 15032385 micron^2. This memory cell area is 15032385/30×10^6 or almost exactly 50% of a 30×10^6 micron^2 memory die. It may be difficult to place TSVs inside the memory cell arrays (e.g. banks; subbanks if present; subarrays if present; etc). Thus given the area available to TSVs may be less than 50% of the memory die area, the above analysis of TSV use may still be optimistic.

Thus, considering the above analysis, the architecture of a stacked memory package may depend on (e.g. may be dictated by, may be determined by, etc) factors that may include (but are not limited to) the following: TSV size, TSV keepout area(s), number of TSVs, yield of TSVs, etc. For this reason a first-generation stacked memory package may resemble (e.g. use, employ, follow, be similar to, etc.) the architecture shown in FIG. 21-7 (e.g. with a relatively few number of TSVs). As TSV process technology matures, TSV sizes and keepout areas reduce, and yield of TSVs increase, etc. it may be possible to increase the number of TSVs and move to an architecture that resembles FIG. 21-8, and so on.

The architecture of FIG. 21-8 may have a DE1 data efficiency of 256/8192 or 2.8% if the row width is 8192 bits. In FIG. 8 however we may divide the bank into several subarrays. If there are 4 subarrays in a bank then a read command may result in fetching 0.25 (e.g. ¼) of the 8192 bits in a bank row, or 2048 bits. Using 4 subarrays the DE1 data efficiency of the architecture shown in FIG. 21-8 may then be increased (by a factor of 4, equal to the number of subarrays) to 256/2048 or 12.5%. A similar scheme to that used with subarrays for the read path may be used with subarrays for the write path making the improved DE1 data efficiency (e.g. relative to standard SDRAM parts) of the architecture shown in FIG. 21-8 equal for both reads and writes.

Of course different or any numbers of subarrays may be used in a stacked memory package architecture based on FIG. 21-8. Of course different or any data bus widths may be employed in a stacked memory package architecture based on FIG. 21-8. In one embodiment, for example, the subarray row width may be equal to the data path width (from subarray to IO) then DE1 data efficiency may be 100%. For example in one embodiment there may be 8 subarrays in a 8192 column bank that may match a data bus width of 8192/8 or 1024 bits. If the stacked memory package in such an embodiment can support a data bus width of 1024 (e.g. is technically possible, is cost effective, including TSV yield, etc.), then DE1 data efficiency may be 100%.

The design considerations associated with the architecture illustrated in FIG. 21-8 (with variations in architecture such as those described and discussed above, etc.) may include (but are not limited to) one or more of the following factors: (1) increased numbers of subarrays may decrease the areal efficiency; (2) the use of subarrays may change the design of memory array peripheral circuits (e.g. row and column decoders, IO gating/DM mask logic, sense amplifiers, etc.); (3) large data bus widths may, in one embodiment, require increased numbers of TSVs and thus may, in one embodiment, reduce yield and decrease die area efficiency; (4) large data bus widths may, in one embodiment, require high-speed serial IO to reduce any added latency of a narrow high-speed link versus a wide parallel bus. In various embodiments, DE1 data efficiency from 0.087% to 100% may be achieved. Thus, as an option, one may or may not choose to move from architectures such as that shown in FIG. 21-7 (e.g. first generation architecture, etc.) to that shown in FIG. 21-8 (e.g. second generation architecture etc.) to other architectures (e.g. based on those of FIGS. 21-7 and 21-8, etc.) including those that are shown elsewhere herein.

The trend in standard SDRAM design is to increase the number of banks, rows, and columns and to increase the row and/or page size with increasing memory capacity. This trend may drive standard SDRAM parts to the use of subarrays.

For a stacked memory package, such as shown in FIG. 21-8, and assuming all stacked memory chips have the same structure, then the memory capacity (MC) of the stacked memory package is given by the following expressions. We have kept the terms and nomenclature consistent with a standard SDRAM part (except for the number of stacked chips, which is zero for a standard SDRAM part without stacking).

$$\text{Memory Capacity(MC)} = \text{Stacked Chips} \times \text{Banks} \times \text{Rows} \times \text{Columns}$$

Stacked Chips=j, where j=4, 8, 16 etc. (j=1 corresponds to a standard SDRAM part)

Banks=2k̂, where k=bank address bits

Rows=2m̂, where m=row address bits

Columns=2n̂×log(2) Organization, where n=column address bits

Organization=w, where w=4, 8, 16 (industry standard values)

For example, for a 1Gbit ×8 DDR3 SDRAM: k=3, m=14, n=10, w=8. MC=1Gbit=1073741824=2ˆ30. Note organization (the term used above to describe data path width in the memory array) may also be used to describe the rows×columns×bits structure of an SDRAM (e.g. a 1Gbit SDRAM may be said to have organization 16 Meg×8×8 banks, etc.), but we have avoided the use of the term bits (or data path width) to denote the ×4, ×8, or ×16 part of organization to avoid any confusion. Note that the use of subarrays or the number of subarrays for example may not affect the overall memory capacity but may well affect other properties of a stacked memory package, stacked memory chip (or standard SDRAM part that may use subarrays). For example, for the architecture shown in FIG. 21-8 (e.g. with j=4 and other parameters the same as the standard 1Gbit SDRAM part), then memory capacity MC=4Gbit.

An increase in memory capacity may, in one embodiment, require increasing one or more of bank, row, column sizes or number of stacked memory chips. Increasing the column address width (increasing the row length and/or page size) may increase the activation current (e.g. current consumed during an ACT command). Increasing the row address (increasing column height) may increase the refresh overhead (e.g. refresh time, refresh period, etc.) and refresh power. Increasing the bank address (increasing number of banks) increases the power and increases complexity of handling bank access (e.g. tFAW limits access to multiple banks in a rolling time window, etc.). Thus difficulties in increasing bank, row or column sizes may drive standard SDRAM parts towards the use of subarrays for example. Increasing the number of stacked memory chips may be primarily limited by yield (e.g. manufacturing yield, etc.). Yield may be primarily limited by yield of the TSV process. A secondary limiting factor may be power dissipation in the small form factor of the stacked memory package.

In one embodiment, subarrays may be used to increase DE1 data efficiency is to increase the data bus width to match the row length and/or page size. A large data bus width may require a large number of TSVs. Of course other technologies may be used in addition to TSVs or instead of TSVs, etc. For example optical vias (e.g. using polymer, fluid, transparent vias, etc) or other connection (e.g. wireless, magnetic or other proximity, induction, capacitive, near-field RF, NFC, chemical, nanotube, biological, etc) technologies (e.g. to logically couple and connect signals between stacked memory chips and logic chip(s), etc) may be used in architectures based on FIG. 21-8, for example, or in any other architectures shown herein. Of course combinations of technologies may be used, for example using TSVs for power (e.g. VDD, GND, etc) and optical vias for logical signaling, etc.

As an option, the stacked memory package architecture may be implemented in the context of the architecture and environment of any previous Figure(s) and/or any subsequent Figure(s). Of course, however, the stacked memory package architecture may be implemented in the context of any desired environment.

FIG. 21-9

Data IO Architecture for a Stacked Memory Package

FIG. 21-9 shows a data IO architecture for a stacked memory package, in accordance with another embodiment.

In FIG. 21-9 the data IO architecture comprises one or more stacked memory chips from the top (of the stack) stacked memory chip 21-912 through to the bottom (of the stack) stacked memory chip 21-938 (in FIG. 21-9 the number of chips is variable, #Chips 21-940), and one or more logic chips 21-936 (only one logic chip is shown in FIG. 21-9, but any number may be used).

In FIG. 21-9, the logic chip and stacked memory chips may be connected via TSVs 21-942 or other means (e.g. optical, capacitive, near-field RF, etc.). In FIG. 21-9 each of the plurality of stacked memory chips may comprise one or more memory arrays 21-940. In FIG. 21-9 each of the memory arrays may comprise one or more banks. In FIG. 21-9 the number of banks is variable, #Banks 21-906. In FIG. 9 the banks may be divided into one or more subarrays 21-902. In FIG. 21-9 each bank may contain 4 subarrays, but any number of subarrays may be used (including extra or spare subarrays for repair purposes, etc.). Of course any type of memory technology (e.g. NAND flash, PCRAM, etc.)

and/or memory array organization (e.g. partitioning, layout, structure, etc.) may equally be used for any portion(s) of any the memory arrays. In FIG. 21-9 each of the banks may comprise a row decoder 21-916, sense amplifiers 21-904, row buffers 21-918, column decoders 21-920. In FIG. 21-9 the row decoder may be coupled to the row address bus 21-910. In FIG. 21-9 the column decoder(s) may be connected to the column address bus 21-914. In FIG. 219 the row buffer(s) are connected to the logic chip via bus 21-922 (bidirectional, with width that may be varied (e.g. programmed, controlled, etc) or vary by architecture, etc). In FIG. 21-9 the logic chip architecture may be similar to that shown in FIG. 21-7 and in FIG. 21-8 for example, including those portions not shown in FIG. 21-9. In FIG. 21-9 the width of bus 21-914 may depend on the number of columns and number of subarrays. For example if there are no subarrays then the bus width may be the same as a standard SDRAM part (with the same bank size). For example if there are four subarrays in each bank (as shown in FIG. 21-9) then log(2) 4 or 2 extra bits may be added to the bus. In FIG. 21-9 the width of bus 21-910 may depend on the number of rows and may, for example, be the same as a standard SDRAM part (with the same bank size). In FIG. 21-9 the bank addressing is not shown explicitly but may be similar to that shown in FIG. 21-7 and in FIG. 21-8 for example (and bank addressing may be considered to be part of the row address in FIG. 21-9 for example).

In FIG. 21-9 the connections that may carry data between the stacked memory chips and the logic chip(s) is shown in more detail. In FIG. 21-9 the data bus between each bank and the logic chip is shown as separate (e.g. each bank has a dedicated bidirectional data bus, etc). For example in FIG. 21-9 bus 21-922 may carry 8, 256, or 1024 etc. (e.g. any number) data bits between the logic chip and bank 21-952. In FIG. 21-9 the array of TSVs dedicated to data is shown as data TSVs 21-924. In FIG. 21-9 the data TSVs may be connected to one or more data buses 21-926 inside the logic chip and coupled to the read FIFO (e.g. on the read path) and data I/F logic (e.g. on the write path) 21-928. The read FIFO and data I/F logic may be coupled to the PHY layer 21-930 via one or more buses 21-932. The PHY layer may be coupled to one or more high-speed serial links 21-934 (or other connections, bus technologies, IO technologies, etc.) that may be operable to be coupled to CPU(s) and/or other stacked memory packages, other devices or components, etc.

As an option, the data IO architecture may be implemented in the context of the architecture and environment of any previous Figure(s) and/or any subsequent Figure(s). Of course, however, the data IO architecture may be implemented in the context of any desired environment.

FIG. 21-10

TSV Architecture for a Stacked Memory Chip

FIG. 21-10 shows a TSV architecture for a stacked memory chip, in accordance with another embodiment.

In FIG. 21-10 the TSV architecture for a stacked memory chip 1000 comprises a stacked memory chip 21-1004 with one or more arrays of through-silicon vias (TSVs).

FIG. 21-10 includes a detailed view 21-1052 of the one or more TSV arrays. For example in FIG. 21-10 a first array of TSVs may be dedicated for data, TSV array 21-1030. For example in FIG. 21-10 a second array of TSVs may be dedicated for address, control, power (TSV array 21-1032). Of course any number of TSV arrays may be used in the TSV architecture. Of course any arrangement of TSVs may be used in the TSV architecture (e.g. power TSVs may be interspersed with data TSVs etc.). The arrangements of TSVs shown in FIG. 21-10 have been simplified (e.g. made regular, partitioned separately, shown separately, etc) to the simplify explanation of the TSV architecture. For example to allow for improved signal integrity (e.g. lower noise, reduced inductance, better return path, etc), in one embodiment, one or more power (e.g. VDD and/or VSS) TSV connections (or VDD and/or VSS connections by other means) may be included in close physical proximity to each signal TSV (e.g. power TSVs and/or other power connections interspersed, intermingled, with signal TSVs etc).

In FIG. 21-10 each stacked memory chip may comprise one or more memory arrays 1008. Each memory array may comprise one or more banks. In FIG. 21-10 only one memory array with only one bank is shown for clarity and simplicity of explanation, but any number of memory arrays and/or banks may be used. In practice multiple memory arrays with multiple banks may be used (see for example the architectures of FIG. 21-7, FIG. 21-8, and FIG. 21-9 that show multiple bank architectures for the stacked memory chip).

In FIG. 21-10 the memory array and/or bank may comprise two basic types of circuits or two basic types of circuit areas. The first circuit type or circuit area may correspond to an array of memory cells 21-1026. Memory cells are typically packed (e.g. placed, layout, etc) in a dense array as shown in FIG. 21-10 in the detailed view 21-1050 of four adjacent memory cells. The second type of circuits or circuit areas may correspond to memory cell support circuits (e.g. peripheral circuits, ancillary circuits, auxiliary circuits, etc.) that act to control or otherwise interact etc. with the memory cells. In FIG. 21-10 the support circuits may include (but are not limited to) the following: row decoder 21-1006, sense amplifiers 21-1010, row buffers 21-1012, column decoders 21-1014.

In FIG. 21-10 the memory array and/or bank may be divided into one or more subarrays 21-1002. Each subarray may have one or more dedicated support circuits or may share support circuits with other subarrays. For example a subarray may have a dedicated row buffer allowing one subarray to be operated (e.g. read performed, write performed, etc) independently of other subarrays.

In FIG. 21-10 connections between the stacked memory chip and the logic chip may be implemented using one or more buses. For example in FIG. 21-10 bus 21-1016 may use TSVs to connect (e.g. couple, transmit, etc) address, control, power through (e.g. using, via, etc) TSV array 21-1032. For example in FIG. 21-10 bus 21-1018 may use TSVs to connect data through TSV array 21-1030.

In FIG. 21-10 the memory cell may comprise (e.g. may use, may be designed to, may follow, etc) a 4F2, 6F2 or other basic memory cell architecture (e.g. design, layout, structure, etc). In FIG. 21-10 the memory cell may use a 4F2 architecture. The 4F2 architecture may place a memory cell at every intersection of a wordline 21-1020 and bitline 21-1022. In FIG. 21-10 the memory cell may comprise a square layout with memory cell height (MCH) 21-1028 (with memory cell height thus equal to memory cell width).

FIG. 21-10 includes a detailed view 21-1054 of four TSVs. In FIG. 21-10 the TSV size 21-1042 may correspond to a round shape (e.g. circular shape, in which case size may be the TSV diameter, etc) or square shape (e.g. size is height and width, etc) as the drawn through-silicon via hole size. In FIG. 21-10 the TSV keepout (or keepout area KOA, keepout zone KOZ, etc) may be larger than the TSV size. The TSV keepout may restrict the type of circuits (e.g. active transistors, metal layers, metal layer vias, passive components, diffusion, polysilicon, other circuit and semiconductor process structures, etc) that may be placed near the TSV. Typically we may assume that nothing else may be placed (e.g. located, drawn in layout, etc) within a certain keepout area KOA around each TSV. In FIG. 21-10 the TSV spacing (TS, shown in FIG. 21-10 as center-center spacing) may restrict the areal density of TSVs (e.g. TSVs per unit area, etc).

The areas of various circuits and areas of TSV arrays may be calculated using the following expressions.

DMC=Die area for memory cells=MC×MCH×MCH

MC=Memory Capacity (of each stacked memory chip) in bits (number of logically visible memory cells on die e.g. excluding spares etc)

MCH=Memory Cell Height

MCH×MCH=4×F^2 (2×F×2×F) for a 4F2 memory cell architecture

F=Feature size or process node, e.g. 48 nm, 32 nm, etc.

DSC=Die area for support circuits=DA(Die area)−DMC(Die area for memory cells)

TKA=TSV KOA area=#TSVs×KOA

#TSVS=#Data TSVs+#Other TSVs

#Other TSVS=TSVs for address, control, power, etc.

As an option, the TSV architecture for a stacked memory chip may be implemented in the context of the architecture and environment of any previous Figure(s) and/or any subsequent Figure(s). Of course, however, the TSV architecture for a stacked memory chip may be implemented in the context of any desired environment.

FIG. 21-11

Data Bus Architectures for a Stacked Memory Chip

FIG. 21-11 shows various data bus architectures for a stacked memory chip, in accordance with another embodiment.

In FIG. 21-11 each of the data bus architecture embodiments for a stacked memory chip 21-1100 comprises one or more logic chips 21-1116 coupled to one or more stacked memory chips 21-1118. Of course, other embodiments are contemplated without any such logic chips 21-1116. In FIG. 21-11 there are 21-4 representative possible architectures for the data bus architecture for a stacked memory chip. In FIG. 21-11 data bus architecture 21-1132 (corresponding to label 2 in FIG. 21-11) may use a shared data bus 21-1142. In FIG. 21-11 data bus architecture 21-1134 (corresponding to label 3 in FIG. 21-11) may use a 4-way shared data bus 21-1122. In FIG. 21-11 data bus architecture 21-1136 (corresponding to label 4 in FIG. 21-11) may use a 2×2-way shared data bus 21-1124. In FIG. 21-11 data bus architecture 21-1138 (corresponding to label 4 in FIG. 21-11) may use a 4×1-way shared data bus 21-1126. For comparison and for reference, architecture 21-1130 in FIG. 21-11 (corresponding to label 1) shows a standard SDRAM part (per one possible embodiment) with a single memory chip 21-1114. In FIG. 21-11 memory chip 21-1114 may be connected to a CPU using multiple buses and other connections. For example in FIG. 21-11 control/power connections 21-1112 may connect power (VDD), ground (VSS), other reference voltages etc. as well as control signals (e.g. address, strobe, termination control, clock, enables, etc.).

In FIG. 21-11 the stacked memory chips may comprise one or more memory arrays 21-1140 (in FIG. 21-11 only one memory array is shown in each stacked memory chip for simplicity and clarity of explanation, but any number of memory arrays may be used). Each memory array may comprise one or more banks. In FIG. 21-11 only one memory array with one bank is shown for simplicity and clarity of explanation. In practice multiple memory arrays with multiple banks may be used (see for example the architectures of FIG. 21-7, FIG. 21-8 and FIG. 21-9 that show multiple bank architectures for a stacked memory chip).

In FIG. 21-11 the memory arrays may contain one or more subarrays 21-1122. For example the subarrays may be part of a bank. In FIG. 21-11 for example architecture 21-1134 (label 3) shows a stacked memory chip containing a single memory array with one bank that may contain 4 subarrays. Of course any number of subarrays may be used in the stacked memory chip architecture. The number of data buses may then be adjusted accordingly. For example if there are 8 subarrays then an architecture based on architecture 21-1134 (label 3) may use an 8-way shared data bus, etc.

In FIG. 21-11 logic chips may be connected (e.g. logically connected, coupled, etc) to one or more stacked memory chips using multiple buses and other connections. For example in FIG. 21-11 architecture 21-1132 (label 2) illustrates that the logic chip may couple control/power connections to one or more stacked memory chips using bus 21-1144 (shown as a dash-dot line). For example in FIG. 21-11 architecture 21-1132 (label 2) also shows that the logic chip may couple data connections to one or more stacked memory chips using bus 21-1146 (shown as a dash-dot-dot line). In FIG. 21-11 the buses and other connections between logic chip(s) and stacked memory chips have been simplified for clarity. For example bus 21-1144 may comprise many separate signals (e.g. power (VDD), ground (VSS), other reference voltages etc, control signals (e.g. address bus, strobe, termination control, clock, enables, etc.), and other signals, etc) rather than a single-purpose bus (e.g. a bus with all signals being alike, of the same type, etc). Thus bus 21-1144 (and corresponding buses in other architectures in FIG. 21-11 may be considered a group of signals or bundle of signals, etc). In FIG. 21-11 in order to provide clarity and to allow comparison with standard SDRAM embodiments the same representation (e.g. dash-dot and dash-dot-dot lines) has been used for the buses coupled to the 4 stacked memory chip architectures as has been used for architecture 21-1130 for the standard SDRAM part.

In FIG. 21-11 a graph 21-1160 shows the properties of the architectures illustrated in FIG. 21-11. In FIG. 21-11 the graph shows the number of TSVs (on the y-axis) that may optionally be required for each architecture illustrated in FIG. 21-11. In FIG. 21-11 one line 21-1106 displayed on the graph shows the number of TSVs that may optionally be required for control/power connections (with the dash-dot line on the graph corresponding to the dash-dot line of the bus representation in each of the architectures of FIG. 21-11). In the graph shown in FIG. 21-11 one line 21-1104 displayed on the graph shows the number of TSVs that may optionally be required for data connections (with the dash-dot-dot line corresponding to the bus representation in each of the architectures). The graph shown in FIG. 21-11 shows the number of TSVs for each architecture as a function of increasing process capability (x-axis). As process capability for TSVs increases (e.g. matures, improves, is developed, is refined, etc) the number of TSVs that may be used on a stacked memory chip may increase (e.g. TSV size may be reduced, TSV keepout area may be reduced, TSV yield may increase, etc). In the graph shown in FIG. 21-11 the increasing process capability (x-axis) may thus also represent increasing time.

In FIG. 21-11 each of the stacked memory package architectures shown may represent a point in time or a point of increasing process capability (e.g. for stacked memory chip technology, stacked memory package technology etc). In FIG. 21-11 the graph may represent (e.g. depict, diagram, illustrate, etc) these points in time. In the graph shown in FIG. 21-11 architecture 21-1130 (label 1) represents a standard SDRAM part that contains no TSVs as a reference point and thus is represented by point 21-1156 on graph (at the origin). For example in FIG. 21-11 architecture 21-1132 (label 2) may represent an architecture that may be regarded as a first-generation design and that may use a small number of TSVs and may be represented by two points: a first point 21-1158 (for the number of TSVs that may be required for power/control connections) and by a second point 21-1160 (for the number of TSVs that may be required for the data connections). For example in FIG. 21-11 architecture 21-1134 (label 3) may represent an architecture that may be regarded as a second-generation design and that may use a larger number of TSVs and may be represented by point 21-1162 (for the number of TSVs that may be required for power/control connections) and by point 21-1164 (for the number of TSVs that may be required for the data connections). Note that between architecture 21-1132 (label 2) and architecture 21-1134 (label 3) the number of TSVs that may be required for power/control connections may increase slightly (the graph in FIG. 21-11 for example shows a roughly 20% increase in TSVs from point 21-1158 to point 21-1162). The slight increase in TSVs that may be required for power/control connections may be due to increased numbers of address and control lines, increased numbers of power signals etc. (typically relatively small increases) In FIG. 21-11 the number of TSVs that may be required for data connections may increase significantly between architecture 21-1132 (label 2) and architecture 21-1134 (label 3). The graph in FIG. 21-11 for example shows a roughly 350% increase in TSVs that may be required for data connections from point 21-1160 (architecture 21-1132, label 2) to point 21-1164 (architecture 21-1134, label 3).

We may look at the graph in FIG. 21-11 with a slightly different view. The slope of line 21-1104 (corresponding to the number of TSVs that may be required for data connections) versus the slope of line 21-1106 (corresponding to the number of TSVs that may be required for power/control connections) may allow decisions to be made about the architecture best suited to a stacked memory chip at any point in time (that is at any level of technology, process capability etc.). For example if the slope of line 21-1104 (corresponding to the number of TSVs that may be required for data connections) is steep for a given architecture (or family of architectures, style of bus, etc) then that architecture may generally be viewed as requiring more advanced process capability (e.g. more aggressive design, etc).

In FIG. 21-11 for example architecture 21-1136 (label 4) may be similar to architecture 21-1134 (label 3) as regards the number of TSVs that may be required for power/control connections. Thus in the graph in FIG. 21-11 point 21-1162 (corresponding to the number of TSVs that may be required for power/control connections) may represent both architecture 21-1134 (label 3) and architecture 21-1136 (label 4). In FIG. 21-11 architecture 21-1136 (label 4) may require approximately twice the number of TSVs for data connections than architecture 21-1134 (label 3). Thus in the graph in FIG. 21-11 point 21-1166 (corresponding to the number of TSVs that may be required for data connections for architecture 21-1136, label 4) may be higher than point 21-1164 (corresponding to the number of TSVs that may be required for data connections for architecture 21-1134, label 3). Thus for example an engineer may use FIG. 21-11 to judge whether architecture 21-1134 (label 3) or architecture 21-1136 (label 4) is more suited at a given point in time and/or for a given process capability etc.

Similarly in FIG. 21-11 architecture 21-1138 (label 5) may be compared to architecture 21-1134 (label 3) and architecture 21-1132 (label 2) at a fixed point in time. Thus for example data point 21-1168 (corresponding to the number of TSVs that may be required for data connections for architecture 21-1138, label 5) may be yet higher still than corresponding points for architecture 21-1134 (label 3) and architecture 21-1132 (label 2). An engineer may for example calculate (e.g. using equations presented herein) the number of TSVs that may be implemented within a given die area for given process capability and/or at a given point in time. The engineer may then use a graph such as that shown in FIG. 21-11 in order to decide between architectures including those based, for example, on those shown in FIG. 21-11.

As an option, the data bus architectures for a stacked memory chip may be implemented in the context of the architecture and environment of any previous Figure(s) and/or any subsequent Figure(s). Of course, however, the data bus architectures for a stacked memory chip may be implemented in the context of any desired environment.

FIG. 21-12

Stacked Memory Package Architecture

FIG. 21-12 shows a stacked memory package architecture, in accordance with another embodiment.

In FIG. 21-12 the stacked memory package 21-1200 may comprise one or more stacked memory chips 21-1216 (one stacked memory chip is shown in FIG. 21-12, but any number of stacked memory chips may be used) and one or more logic chips 21-1218 (one logic chip is shown in FIG. 21-12, but any number of logic chips may be used). The stacked memory chips and logic chips may be coupled for example using TSVs (not shown in FIG. 21-12 but may be as shown in the package examples of FIGS. 2, 4, 5, 6 and with connections as illustrated, for example, in FIGS. 7, 8, 9, 10) or coupled by other means.

The architecture of the stacked memory chip and architecture of the logic chip, as shown in FIG. 21-12 and described below, may be applied in several ways. For example, in one embodiment, the memory chip does not have to be stacked (e.g. stacked with other memory chips etc); for example the memory chip may be integrated with the logic chip to form a discrete memory part. For the purposes of this description that follows, however, we may continue to describe the architecture of FIG. 21-12 as applied to a stacked memory chip and a separate logic chip, with both being parts of a stacked memory package.

In FIG. 21-12 the stacked memory chip may comprise one or more memory arrays 21-1204 (one memory array is shown in FIG. 21-12, but any number of memory arrays may be used). Each memory array may comprise one or more banks (banks are not shown in FIG. 21-12 for the purpose of simplification and clarity of explanation, but a multibank structure may be used as in, for example, the architectures illustrated in FIGS. 21-7, 21-8, 21-9). In FIG. 21-12 the memory array 21-1204 may be considered as a single bank. Each memory array and/or bank may comprise one or more subarrays 21-1202 (four subarrays are shown in FIG. 21-12, but any number of subarrays may be used). In one embodiment subarrays may be nested (e.g. a subarray may contain a sub-subarray in a hierarchical structure of any depth, etc.), but that is not shown in FIG. 21-12 for simplicity and clarity of explanation. Associated with (e.g. corresponding with, connected with, coupled to, etc) each memory array and/or bank may be one or more row buffers 21-1206 (one row buffer is shown in FIG. 21-12, but any number of row buffers may be used). The row buffer(s) are typically coupled to one or more sense amplifiers (sense amplifiers are not shown in FIG. 21-12, but may be connected and used as shown for example in FIGS. 21-7, 21-8, 21-9, 21-10). Typically one bit of a row buffer may correspond (e.g. connect to, be coupled to, etc) to one column (of memory cells) in the memory array and/or bank and/or subarray. For example, if there are no subarrays present in the architecture of the stacked memory chip, then the row buffer may span the width of a bank (e.g. hold a page of data, etc). In this case there may be one row buffer per bank (and/or memory array etc) and if there is a single bank in the memory array (as shown in FIG. 21-12) there may be just one row buffer. Of course any number of row buffers may be used. If subarrays are present (four subarrays are shown in FIG. 21-12, but any number of subarrays may be used) the subarrays may each have (e.g. be connected to, be coupled to, etc) their own row buffer that may be capable of independent operation (e.g. read, write, etc.) from the other subarray row buffers. Thus in FIG. 21-12, for example, one architectural option may be to have four row buffers, one for each subarray. The row buffer(s) may be used to hold data for both read operations and write operations.

In FIG. 21-12 each logic chip may have one or more read FIFOs 21-1214 (one read FIFO is shown in FIG. 21-12, but any number of read FIFOs may be used). The read FIFOs may be used to hold data for read operations. The write path is not shown in FIG. 21-12 but may be similar to that shown, for example, in FIG. 7 and include a data I/F circuit. The data I/F circuit may essentially perform a similar function to the read FIFO but operating in the reverse direction (e.g. the read FIFO may buffer and operate on data flowing from the memory array while the data I/F circuit may buffer and operate on data flowing to the memory array, etc). The row buffers in one or more stacked memory chips may be electrically connected (e.g. coupled, etc) to the read FIFO in one or more logic chips (e.g. connected using, for example, TSVs or other means in the case of a stacked memory package design).

In FIG. 21-12 the connection(s) and data transfer between memory array(s) and row buffer(s) are shown diagrammatically as an arrow 21-1208 (with label 1). In FIG. 21-12 the connection(s) and data transfers between row buffer(s) and read FIFO(s) are shown diagrammatically as multiple arrows, for example arrow 21-1210 (with label 2). The arrows in FIG. 21-12 may represent the transfer of data and the direction of data transfer between circuit elements (e.g. blocks, functions, etc) that may be performed in a number of ways according to different embodiments or different versions of the stacked memory package architecture. For example in FIG. 21-12, arrow 21-1210 (label 2) may be a parallel bus (e.g. 8-bit, 64-bit, 256-bit wide bus, etc), or a serial link, or some other form of bus and/or connection etc. Examples of different connections that may be used will be described below. In FIG. 21-12, arrow 21-1208 (label 1) may represent a connection between the sense amplifiers and row buffer(s) that is normally very close (e.g. the sense amplifiers and row buffers are typically in close physical proximity or part of the same circuit block, etc). The connection represented by arrow 21-1208 (label 1) is typically bidirectional (e.g. the same connection used for both read path and write path, etc) though only the read functionality is shown in FIG. 21-12 (e.g. FIG. 21-12 shows data flowing from sense amplifiers in the memory array and/or bank and/or subarray to the row buffer(s), etc). In FIG. 21-12 the arrow 21-1208 (label 1) has been used to illustrate the fact that connections may be made to a bank or a subarray (or a subarray within a subarray etc). Thus the amount of data transferred between the memory array and row buffer(s) may be varied in different versions of the architecture shown in FIG. 21-12. For example, in one embodiment based on the architecture of FIG. 21-12, the memory array (and thus the single bank in the memory array, as shown in FIG. 21-12) may be 8192 bits wide (e.g. use a page size of 1 kB). The bank may contain 4 subarrays, as shown in FIG. 21-12, and each subarray may be 8192/4 or 2048 bits wide. The arrow 21-1208 may represent a transfer of 2048 bits (e.g. a transfer of less than a page). Such a sub-page row buffer transfer may lead to greater DE1 data efficiency (with DE1 data efficiency being as defined and described previously).

Data efficiency DE1 was previously defined in terms of data transfers, and the DE1 metric essentially measures data movement to/from the memory core that is wasted (e.g. a 1 kB page of 8192 bits is moved to/from the memory array but only 8 bits are used for 10, etc). In FIG. 21-12 arrow 21-1208 that may represent a data transfer is labeled with the numeral 1 to signify that this data transfer is the first step in a multi-stage operation to transfer data, for example, from the memory array of a stacked memory chip to the IO circuits of the logic chip. Data transfer may occur in two directions (to the memory array for writes, and from the memory array for reads), but in the following description we will focus on the read direction. The operations, circuits, buses and other functions required for the write path (and write direction data transfers etc.) may be similar to the read path (and read direction data transfers etc), and thus the write path may use similar techniques to those described herein for the read path. In FIG. 21-12, the first stage of data transfer may be the transfer of data from memory array (e.g. sense amplifiers) to the row buffer(s). In FIG. 21-12, the second stage of data transfer may be the transfer of data from the row buffer(s) to the read FIFO (for the read path). In FIG. 21-12, the third stage of data transfer may be the transfer of data from the read FIFO to the IO circuits. In FIG. 21-12, the fourth stage of data transfer may be the transfer of data from the IO circuits to the external 10 (e.g. high-speed serial links, etc). In FIG. 21-12, each stage of data transfer may comprise multiple steps (e.g. in time). In FIG. 21-12, each stage of data transfer may involve (e.g. incur, demand, require, result in, etc) inefficiency as further explained below.

In FIG. 21-12, the data transfer represented by arrow 21-1208 (label 1) is the first (and may be the only) step of the first stage of data transfer A standard SDRAM part transfers a page of data from the memory to the row buffer (first stage of data transfer) but transfers less than a page from row buffer to read FIFO. Typical numbers for a standard SDRAM part may involve (e.g. require, use, etc) a first stage data transfer of 8192 bits (1 kB page size) from memory array to row buffer (e.g. data transfer first stage) and a second stage data transfer of 64 bits from row buffer to read FIFO (data transfer second stage). Thus we may define a data efficiency between first stage data transfer and second stage data transfer, DE2.

Data Efficiency DE2=(number of bits transferred from memory array to row buffer)/(number of bits transferred from row buffer to read FIFO)

In this example DE2 data efficiency for a standard SDRAM part (1 kB page size) may be 64/8192 or 0.78125%. The DE2 efficiency of a DIMM (non-ECC) using standard SDRAM parts is the same at 0.78125% (e.g. 8 SDRAM parts may transfer 8192 bits each to 8 sets of row buffers, one row buffer per SDRAM part, and then 8 sets of 64 bits are transferred to 8 sets of read FIFOs, one read FIFO per SDRAM part). The DE2 efficiency of an RDIMM (including ECC) using 9 standard SDRAM parts is 8/9×0.78125%

The third and following stages (if any) of data transfer in a stacked memory package architecture are not shown in FIG. 21-12, but other stages and other data transfer operations may be present (e.g. between read FIFOs and IO circuits). In a standard SDRAM part the third stage data transfer may for example involve a transfer of 8 bits from a read FIFO to the IO circuits. Thus we may define a data efficiency between second stage data transfer and third stage data transfer, DE3.

Data Efficiency DE3=(number of bits transferred from row buffer to read FIFO)/(number of bits transferred from read FIFO to IO circuits)

Continuing the example above of an embodiment involving a standard SDRAM part, for the purpose of later comparison with stacked memory package architectures, the DE3 data efficiency of a standard SDRAM part may be 8/64 or 12.5%. We may similarly define DE4, etc. in the case of stacked memory package architectures that involve more data transfers and/or data transfer stages that may follow a third stage data transfer.

We may compute the data efficiency DE1 as the product of the individual stage data efficiencies. Therefore, for the standard SDRAM part with three stages of data transfer, data efficiency DE1=DE2×DE3, and thus data efficiency DE1 is 0.0078125×0.0125=8/8192 or 0.098% for a standard SDRAM part (or roughly equal to the earlier computed DE1 data efficiency of 0.087% for an RDIMM using SDRAM parts; in fact 0.087%=8/9×0.098% accounting for the fact that read 9 SDRAM parts to fetch 8 SDRAM parts worth of data, with the ninth SDRAM part being used for data protection and not data). We may use the same nomenclature that we have just introduced and described for staged data transfers and for data efficiency metrics DE2, DE3 etc. in conjunction with stacked memory chip architectures in order that we may compare and contrast stacked memory package performance with similar performance metrics for embodiments involving standard SDRAM parts.

In FIG. 21-12 the data transfer represented by arrow 21-1208 (label 1) typically may occur at the operating frequency of the memory array (e.g. array core, memory cell circuits, etc) that may be 100-200 MHz. Such operating frequencies have remained relatively constant over several generations of standard SDRAM parts and are not expected to change substantially in future generations because of limitations of the memory array design and manufacturing process (e.g. RC delays of bitlines and wordlines, etc). For example a standard SDR DRAM part may operate at a core frequency of 133 MHz, a standard DDR SDRAM part may operate at a core frequency of 133 MHz, a standard DDR2 SDRAM part may operate at a core frequency of 133 MHz, a standard DDR3 SDRAM part may operate at a core frequency of 200 MHz. The relatively slow memory array operating speed or operating frequency (e.g. slow compared to the external data rate or frequency) may be hidden by pre-fetching data (e.g. DDR2 prefetches 4 bits of data, effectively multiplying operating speed by 4, DDR3 prefetches 8 bits of data, effectively multiplying operating speed by 8, and this trend is expected to continue to higher levels of prefetch in future generations of standard SDRAM parts). For example in a standard DDR2 SDRAM part the external clock frequency may be 266 MHz operating at a double data rate (DDR, data on both clock edges) thus achieving an external data rate of 533 Mbps. In a standard SDRAM part a prefetch results in moving more data than required. Thus for example a standard SDRAM part may transfer 64 bits of data from the row buffer to the read FIFO (e.g. for an 8*n* prefetch where n=8 in a ×8 standard SDRAM part), but only 8 bits of this data may be required for a read request from the CPU (because 8 SDRAM parts are read on a standard DIMM (9 for an RDIMM) that may provide 64 bits of data in total).

In one embodiment of a stacked memory package using the architecture of FIG. 21-12 for example a 64-bit read request from the CPU may be satisfied by one memory array and/or one bank and/or one subarray. The architecture of FIG. 21-12 may result in much larger efficiencies (e.g. data efficiency, power efficiency, etc.). In the architecture illustrated in FIG. 21-12 the data transfer between memory array and row buffer may be less than the row size and may thus improve data efficiencies. Such an architecture using sub-row data transfers may imply the use of subarrays. For example in FIG. 21-12 a 64-bit read request from a CPU may result in 256 bits of data being transferred (e.g. fetched, read, moved, etc) from the memory array of a stacked memory chip. For a bank with a row length (e.g. page size) of 8192 bits (e.g. 1 kB page size) the architecture of FIG. 21-12 may use 8192/256 or 32 subarrays (of course only 4 subarrays are shown in FIG. 21-12 for simplification and clarity of explanation, but any number of subarrays may be used and still follow the architecture shown in FIG. 21-12). The 256-bit data transfer from memory array to row buffer may correspond to arrow 21-1208 (label 1) in FIG. 21-12 and may represent a first stage data transfer. The DE2 data efficiency for this architecture may thus be 64/256 or 25% (much greater than the earlier computed DE2 efficiency of 0.78125% for a standard SDRAM part or that of a DIMM using standard SDRAM parts). The DE3 data efficiency for this architecture may thus be 64/64 or 100% (since 64 bits may be transferred from row buffer to read FIFO and then to the IO circuits in order to satisfy a 64-bit read request). The DE1 data efficiency (e.g. overall data efficiency) for this particular embodiment of the general architecture illustrated in FIG. 21-12 may thus be 0.25×1.0=25% (much greater than the earlier computed DE1 efficiency of 0.098% for a standard SDRAM part or that of a DIMM using standard SDRAM parts). Additionally, the current embodiment of a stacked memory package architecture may require only one stacked memory chip to be activated (e.g. selected, used, in operation, woken up, removed from power-down mode(s), etc) for a read command (or for a write command) instead of 8 standard SDRAM parts (or 9 parts including ECC) that must be activated in a conventional standard DIMM (or RDIMM) design. Thus power efficiency may be approximately an order of magnitude higher (e.g. power consumed may be an order of magnitude lower, etc) for a stacked memory package using this architectural embodiment than for a conventional standard DIMM using standard SDRAM parts. The exact power savings of this architectural embodiment may depend, for example, on the relative power overhead of IO circuits and other required peripheral circuits to the read path (and for writes, the write path) power consumption etc. Of course any size of data transfer may be used at any data transfer stage in any embodiment of a stacked memory package architecture. Of course any size and/or number of subarrays may also be used in any stacked memory package architecture.

In one embodiment of a stacked memory package architecture based on FIG. 21-12 a single stacked memory chip may be used to satisfy a read request. For example a 64-bit read request (e.g. from a CPU) may result in 8192 bits (e.g. 1 kB page size, the same as a standard SDRAM part) of data being transferred from the memory array of a stacked memory chip. This 8192-bit data transfer may correspond to arrow 21-1208 (label 1) in FIG. 21-12 and may represent a first stage data transfer. This particular architectural embodiment based on FIG. 21-12 may use banks with no subarrays for example. The DE2 data efficiency for this architectural embodiment of a stacked memory package may thus be 64/8192 or 0.78% (equal to the earlier computed DE2 efficiency of 0.78% for a standard SDRAM part). The DE3 data efficiency for this architecture may be 64/64 or 100% (since 64 bits may be transferred from a row buffer to a 64-bit read FIFO and then to the IO circuits in order to satisfy a 64-bit read request). The DE1 data efficiency (e.g. overall data efficiency) for this particular embodiment of the general architecture illustrated in FIG. 21-12 may thus be 0.78%×1.0=0.78% (much greater than the earlier computed DE1 efficiency of 0.098% for a standard SDRAM part or that of a DIMM using standard SDRAM parts). This particular embodiment of a stacked memory package architecture based on FIG. 21-12 may, in one optional embodiment, require only one stacked memory chip to be activated (e.g. selected, used, in operation, etc) for a read (or write) instead of 8 (or 9 including ECC) standard SDRAM parts that must be activated in a standard DIMM (or RDIMM) design. Thus the power efficiency of this particular embodiment of the stacked memory package architecture shown in FIG. 21-12 may be much higher (e.g. power consumed may be much lower, etc) than for a DIMM using standard SDRAM parts. The exact power savings of this embodiment may depend, for example, on relative power overhead of IO circuits and other required peripheral circuits to the read path power consumption etc. in one embodiment, such an architectural embodiment (using a 1 kB page size, the same as a standard SDRAM part, and with no subarrays) may be implemented such that the stacked memory chip design and/or logic chip design may re-use (e.g. copy, inherit, borrow, follow, etc) many parts (e.g. portions, circuit blocks, components, circuit designs, layout, etc) from one or more portions of a standard SDRAM part. Such design re-use that may be possible in this particular architectural embodiment of the general architecture shown in FIG. 21-12 may greatly reduce costs (e.g. for design, for manufacture, for testing, etc) for example.

In one embodiment of a stacked memory package architecture based on FIG. 21-12 more than one stacked memory chip may be used to satisfy a read request (or write request). For example a 64-bit read request from a CPU may result in 8192 bits of data (e.g. 1 kB page size, the same as a standard SDRAM part) being transferred from the memory array of a first stacked memory chip and 8192 bits of data being transferred from the memory array of a second stacked memory chip. Each 8192-bit data transfer may correspond to arrow 21-1208 (label 1) in FIG. 21-12 and represents a first stage data transfer. The DE2 data efficiency for this architecture may thus be 64/(2×8192) or 0.39% (half the DE2 efficiency of standard SDRAM parts). The DE3 data efficiency for this architecture may be 64/64 (computed for both parts together) or 32/32 (computed for each part separately) or 100% (since 64 bits may be transferred from 2 row buffers (one on each stacked memory chip) to either one 64-bit read FIFO or two 32-bit read FIFOs and then to the IO circuits in order to satisfy a 64-bit read request). The DE1 data efficiency (e.g. overall data efficiency) for this particular embodiment of the general architecture illustrated in FIG. 21-12 may thus be 0.78%×1.0=0.78% (much greater than the earlier computed DE1 efficiency of 0.098% for a standard SDRAM part or that of a DIMM using standard SDRAM parts). This type of architecture may be implemented, for example, if it is desired to reduce the number of connections in a stacked memory package between each stacked memory chip and one or more logic chips. For example in this particular embodiment we may reduce the number of data connections (e.g. TSVs etc) from 64 to each stacked memory chip (if we use a single stacked memory chip to satisfy a 64-bit request—either a read request or a write request) to 32 to each memory chip (if we use 2 stacked memory chips to satisfy a request). In various embodiments, subarrays may be used to further increase DE2 data efficiency (and thus DE1 data efficiency) as described above (e.g. the first stage data transfer from more than one stacked memory chip may be less than the row size, etc).

In one embodiment of a stacked memory package architecture based on FIG. 21-12 one or more of the data transfers may be time multiplexed. For example in FIG. 21-12 the data transfer from row buffer to logic chip (e.g. second stage data transfer) may be performed in more than one step, and each step may be separated in time. For example in FIG. 21-12 four steps are shown and will be explained in greater detail below. This particular architectural variant of the general architecture represented in FIG. 21-12 may be implemented, for example, to reduce the number of TSVs (or other connection means) used to communicate (e.g. connect, couple, etc) data between each stacked memory chip and the logic chip(s). For example the use of four time-multiplexed steps may reduce by a factor of four the numbers of TSVs required for a data bus between each stacked memory chip and a logic chip. Of course the data transfers (in any architecture) do not have to use a time-multiplexed scheme and the architecture of FIG. 21-12 may use any number of steps (including one, e.g. a single step) to transfer data at any stage (including second stage data transfer).

In FIG. 21-12, the use of a time-multiplexed (e.g. time shared, packet, serialized, etc) bus is illustrated in the timing diagram 21-1242. For example, suppose a 64-bit read request (signal event 21-1230) results in 256 bits being transferred from a subarray to a row buffer (e.g. first stage data transfer), represented in the architectural diagram of FIG. 21-12 by arrow 21-1208 (label 1) and shown in the timing diagram as signal event 21-1232 (with corresponding label 1). Note that this particular architectural embodiment need not use subarrays; for example this architecture may also use a standard row size (e.g. 1 kB page size, 2 kB page size, etc.) without subarrays. In fact any row size, number of subarrays, data transfer sizes, etc. may be used. In this particular architectural embodiment the 256 bits that are in the row buffer (e.g. as a result of the first stage data transfer) may be transferred to the read FIFO in multiple steps. In FIG. 21-12 for example four steps are shown. The first step may be represented by arrow 21-1210 (label 2) and signal event 21-1234; the second step may be represented by arrow 21-1220 (label 3) and signal event 21-1236; the third step may be represented by arrow 21-1222 (label 4) and signal event 21-1238; the fourth step may be represented by arrow 21-1212 (label 5) and signal event 21-1240. Each of the four steps may transfer 64 bits. Of course it make take longer to transfer 256 bits of data in four steps using a time-multiplexed bus than to transfer 256 bits in a single step using a direct (e.g. not time-multiplexed) bus that is 4 times wider. However the operating frequency of the memory array is relatively low (e.g. 100-200 MHz for example, as explained above) and the smaller (e.g. fewer connections than required by an equivalent capacity direct bus) time-multiplexed data bus may be operated at a relatively higher frequency (e.g.

higher than the memory array operating frequency) to compensate for any delay caused by (e.g. introduced by, caused by, etc) time-multiplexing. Operating the time-multiplexed bus at a relatively higher frequency may be made easier by the fact that one end of the bus is operated by (e.g. handled by, connected to, etc) a logic chip. The logic chip may use a process that is better suited to high-speed operation (e.g. higher cutoff frequency transistors, lower delay logic gates, etc.) than the process used by a stacked memory chip (which may be the same or similar to the semiconductor manufacturing process used for a standard SDRAM part and that may typically be limited by p-channel transistors with poor high-speed characteristics etc). Thus, by relatively higher speed of operation, the time-multiplexed bus may appear transparent (e.g. appear as if it were a wider direct bus of the same capacity). For example, in FIG. 21-12 the time taken to complete the first stage data transfer is shown as t1 (which may correspond to the length of signal event 21-1232), and the time taken to complete the second stage data transfer is shown as 4×t2 (where t2 may correspond, for example, to the length of signal event 21-1234). Thus, for example, by reducing t2 (e.g. by increasing the operating frequency of the second stage data transfer) the length of time to complete the second stage data transfer may be made equal (or less) than the time used (as a basis for reference) by a standard SDRAM part.

Further, in one embodiment, based on the architecture of FIG. 21-12 a time-multiplexed bus may be implemented by gating the transfer steps. For example if it is known that only 64 bits are to be read, then steps 3, 4, 5 may be gated (e.g. stopped, stalled, not started, eliminated, etc). Such gating has the effect of allowing a programmable data efficiency. For example, using the same above architectural example, if 256 bits are transferred from the memory array (to the row buffer) and 256 bits transferred (using a time-multiplexed bus, but without any gating) from the row buffer (to the read FIFO), then data efficiency DE2 is 256/256 or 100%. If 64 bits are then transferred from the read FIFO to the IO, data efficiency DE3 is 64/256 or 25%. Suppose now we gate data transfer (second stage) steps 3, 4, 5. Now data efficiency DE2 is 64/256 or 25% and data efficiency DE3 is 64/64 or 100%. Programming the data efficiency of each data transfer stage may be utilized, for example, in order to save power. A stage that operates at a lower data efficiency may operate at lower power (e.g. less data to move). Even though the overall (e.g. data efficiency DE1) data efficiency of both gated and non-gated transfers is the same the distribution of data efficiencies (and thus the distribution of power efficiencies) may be programmed (e.g. changed, altered, adjusted, optimized, etc) by gating. In one embodiment, gating may be implemented for the selection (e.g. granularization, subsetting, masking, extraction, etc) of data from a subarray or bank. For example suppose (e.g. for design reasons, layout, space, circuit design, etc) it is difficult to create a bank, subarray etc. smaller than a certain size. For the purposes of illustration, assume that we have subarrays of 1024 bits, but that we may have wished (for data efficiency, power efficiency, some other reasons, etc) to use subarrays of 256 bits. Then typically 1024 bits will be transferred to/from the memory array to/from a row buffer on a read/write operation. Suppose we use a four-step data transfer (as illustrated in FIG. 11) for the second stage data transfer between row buffer and read FIFO (or data I/F for write). Then we may consider that there are 4 groups of 64 bits that make up the 256 bit data transfer. Using column address information we may select (e.g. by a similar gating means as just described, etc) the first group, and/or second group, and/or third group, and/or fourth group (e.g. a subset, or more than one subset, etc) of 64 bits in the time-multiplexed 256-bit data transfer. Such a scheme may allow us to obtain a more granular (hence granularization) or finer access (read or write) to a coarser bank or subarray architecture.

Of course the data transfer sizes (of any or all stages, e.g. first stage data transfer, second stage data transfer, third stage data transfer, etc) of any architecture based on FIG. 21-12 (or any other architecture described herein) may be determined (e.g. calculated, expressed, etc) as a function and/or functions of data efficiency (e.g. DE1 data efficiency, DE2 data efficiency, DE3 data efficiency, etc). The numbers, types, sizes, properties and other design aspects of memory array, banks, subarrays (if any), row buffer(s), read FIFOs (read path), data I/F circuits (write path), IO circuits, other circuits and blocks, etc. of architectures based, for example, on FIG. 21-12 may thus be determined (e.g. calculated, designed, etc) from the data transfer sizes. Of course the data transfer apparatus and/or methods and/or means (of any or all stages, e.g. first stage data transfer, second stage data transfer, third stage data transfer, etc) of any architecture based on FIG. 21-12 (or any other architecture described herein) may be of any type (e.g. high-speed serial, packet, parallel bus, time multiplexed, etc.). The architecture of the read path will typically be similar to the architecture of the write path, but it need not be. For example data transfer sizes, data transfer methods, etc. may be individually tailored (in any architecture described herein) for the read path and for the write path.

As an option, the stacked memory package architecture of FIG. 21-12 may be implemented in the context of the architecture and environment of any previous Figure(s) and/or any subsequent Figure(s). Of course, however, the stacked memory package architecture may be implemented in the context of any desired environment.

FIG. 21-13

Stacked Memory Package Architecture

FIG. 21-13 shows a stacked memory package architecture, in accordance with another embodiment.

In FIG. 21-13 the stacked memory package 21-1300 comprises one or more stacked memory chips 21-1340 (one is shown in FIG. 21-13) and one or more logic chips 21-1342 (one is shown in FIG. 21-13). The stacked memory chips and logic chips may be coupled for example using TSVs (not shown in FIG. 21-13 but may be as shown in the package examples of FIGS. 21-2, 21-4, 21-5, 21-6 and with connections as illustrated, for example, in FIGS. 21-7, 21-8, 21-9, 21-10).

The architecture of the stacked memory chip and logic chip shown in FIG. 21-13 and described below may be applied in several ways. For example, in one embodiment, the memory chip does not have to be stacked with other memory chips, the memory chip may be integrated with the logic chip to form a discrete memory part for example. For the purposes of this description however we will continue to describe the architecture of FIG. 21-13 as applied to a stacked memory chip and separate logic chip with both being parts of a stacked memory package.

In FIG. 21-13 the stacked memory chip may comprise one or more memory arrays 21-1304 (one memory array is shown in FIG. 21-13). Each memory array may comprise one or more banks (banks are not shown in FIG. 21-13 but a multibank structure may be as shown in, for example, FIGS. 21-7, 21-8, 21-9). In FIG. 21-13 the memory array 21-1304 could be considered as a single bank. Each memory array and/or bank may comprise one or more subarrays 21-1302 (four subarrays are shown in FIG. 21-13). In one embodiment subarrays may be nested (e.g. a subarray may contain a sub-subarray in a hierarchical structure of any depth, etc.), but that is not shown in FIG. 21-13 for simplicity of explanation. Associated with (e.g. corresponding with, connected with, coupled to, etc) each memory array and/or bank may be one or more row buffers 21-1306 (four row buffers are shown in FIG. 21-13). The row buffer(s) are typically coupled to one or more sense amplifiers (sense amplifiers are not shown in FIG. 21-13, but may be as shown for example in FIGS. 21-7, 21-8, 21-9, 21-10). Typically one bit of a row buffer may correspond to a column in the memory array and/or bank and/or subarray. For example if there are no subarrays present in the architecture then the row buffer may span the width of a bank (e.g. hold a page of data, etc). Thus there is one buffer per bank and if there is a single bank in the memory array (as shown in FIG. 21-13) there may be one row buffer. If subarrays are present (four subarrays are shown in FIG. 21-13) the subarrays may each have their own row buffer that may be capable of independent operation (e.g. read, write, etc.) from the other subarray row buffers.

In FIG. 21-13 the subarrays may also be operable to operate concurrently. Thus for example in one embodiment, data may be transferred from a first subarray to a first row buffer at the same time (e.g. simultaneously, contemporaneously, nearly the same time, overlapping times, pipelined with, etc) with data transfer from a second subarray to a second row buffer, etc. Thus in FIG. 21-13 one option may be to have four row buffers, with one row buffer for (e.g. associated with, capable of being coupled to, connected with, etc) each subarray. The row buffer(s) may be used to hold data for both read operations and write operations.

In FIG. 21-13 each logic chip may have one or more read FIFOs 21-1314 (four read FIFOs are shown in FIG. 21-13, but any number may be used). The read FIFOs may be used to hold data for read operations. The write path is not shown in FIG. 21-13 but may be similar to that shown, for example, in FIG. 21-7 where the data I/F circuit essentially performs a similar function to the read FIFO but operating in the reverse direction (e.g. the read FIFO may buffer and operate on data flowing from the memory array while the data I/F may buffer and operate on data flowing to the memory array, etc). The row buffers in one or more stacked memory chips may be electrically connected (e.g. coupled, etc) to the read FIFO in one or more logic chips (e.g. using for example TSVs in the case of a stacked memory package design).

In one embodiment based on the architecture of FIG. 21-13 the number of read FIFOs may be equal to the number of row buffers. In such an embodiment each row buffer may be associated with (e.g. capable of being coupled to, connected with, etc) a read FIFO.

In one embodiment based on the architecture of FIG. 21-13 the number of read FIFOs may be different from the number of row buffers. In such an embodiment the connections (e.g. coupling, logical interconnect, signal interconnect, etc) between read FIFOs and row buffers may be programmable (e.g. controlled, programmed, altered, changed, configured at start-up, configured at run-time, etc) either by the CPU(s) or autonomously or semi-autonomously (e.g. under control of algorithms etc) by one or more stacked memory packages. For example as a result of performance measurements all or part (e.g. portion or portions etc) of one or more read FIFOs associated with one or more memory arrays and/or banks and/or subarrays may be re-assigned. Thus, by this or similar method, one or more read FIFOs may effectively be changed in length and/or connection and/or other properties changed, etc. Similarly electrical connections, other logical connection properties, etc. between one or more read FIFOs and other circuits (e.g. IO circuits etc.) may be programmable, etc.

In FIG. 21-13 the connection(s) between sense amplifiers (e.g. in the memory array(s) and/or bank(s) and/or subarray(s) etc) and the row buffers are shown diagrammatically as arrows, for example 21-1308 (label 1A). In FIG. 21-13 the connection(s) between row buffers and read FIFOs is shown diagrammatically as an arrow 21-1310 (label 2). The arrows in FIG. 21-13 represent transfer of data between circuit elements (e.g. blocks, functions, etc) that may be performed in a number of ways. For example arrow 21-1310 (label 2) may be a parallel bus (e.g. 8-bit, 64-bit, 256-bit wide bus, etc), time multiplexed, a serial link etc. In FIG. 21-13 arrow 21-1308 (label 1A), for example, may represent a connection between the sense amplifiers and row buffers that is normally very close (e.g. the sense amplifiers and row buffers are typically in close physical proximity or part of the same circuit block, etc). The connection between the sense amplifiers and row buffers represented, for example, by arrow 21-1308 (label 1A) may typically be bidirectional (e.g. the same connection used for both read and write paths, etc) though only the read functionality is shown in FIG. 21-13. In FIG. 21-13 data is shown flowing (e.g. transferred, moving, etc) from sense amplifiers (e.g. in the memory array and/or bank and/or subarray etc) to the row buffers. In FIG. 12 the arrow 21-1308 (label 1A), for example, has been used to illustrate the fact that connections may be made to a bank or a subarray (or a subarray within a subarray etc). Thus the amount of data transferred between the memory array and row buffers may be varied in different versions (e.g. versions, alternatives, etc) of the architecture shown in FIG. 21-13. For example, in one embodiment based on the architecture of FIG. 21-13, the memory array (and thus the single bank in the memory array, as shown in FIG. 21-13) may be 8192 bits wide (e.g. page size 1 kB). The bank may contain 4 subarrays, as shown in FIG. 21-13, each 2048 bits wide (but any number of subarrays of any size etc. may be used). In FIG. 21-13

In FIG. 21-13 the subarrays may be operable to operate (e.g. function, run, etc) concurrently (e.g. at the same time, nearly the same time, etc). Thus for example in FIG. 21-13 a first data transfer from a first subarray to a first row buffer may occur at the same time as (or overlap, etc) a second data transfer from a second subarray to a second row buffer, etc. Thus in FIG. 21-13 the first stage transfer may comprise four steps, with the four steps occurring at the same time (or overlapping in time, etc). For example, in FIG. 21-13 the arrow 21-1308 (label 1A) may represent the first step, a first data transfer of 8192/4 or 2048 bits (e.g. a transfer of less than a page, a sub-page data transfer, etc); the arrow 21-1338 (label 1B) may represent the second step, a second data transfer of 2048 bits; the arrow 21-1336 (label 1C) may represent the third step, a third data transfer of 2048 bits; the arrow 21-1322 (label 1D) may represent the fourth step, a fourth data transfer of 2048 bits. Of course any size of data transfers may be used, any number of data transfers may be used, and any number steps may be used (including one step). The sub-page data transfers may lead to greater DE1 data efficiency (as defined and described previously).

In one embodiment the techniques illustrated in the architecture of FIG. 21-12 (for example time multiplexed data transfers) may be combined with the techniques illustrated in the architecture of FIG. 21-13 (e.g. parallel data transfers). For example 16 row buffers may transfer data to 16 read FIFOs using 16 steps (e.g. 1A, 1B, 1C, 1D, 2A, 2B, 2C, 2D, 3A, 3B, 3C, 3D, 4A, 4B, 4C, 4D) with steps being time multiplexed (e.g. 1A, 2A, 3A, 4A) and steps being in parallel (e.g. 1A, 1B, 1C, 1D). Such an implementation may for example reduce the number of TSVs required in a stacked memory package for data transfers by a factor of 4/16 or 0.25.

As an option, the stacked memory package architecture of FIG. 21-13 may be implemented in the context of the architecture and environment of any previous Figure(s) and/or any subsequent Figure(s). Of course, however, the stacked memory package architecture of FIG. 21-13 may be implemented in the context of any desired environment.

FIG. 21-14

Stacked Memory Package Architecture

FIG. 21-14 shows a stacked memory package architecture, in accordance with another embodiment.

In FIG. 21-14 the stacked memory package architecture 21-1400 comprises a plurality of stacked memory chips (FIG. 21-14 shows four stacked memory chips, but any number may be used) and one or more logic chips (one logic chip is shown in FIG. 21-14, but any number may be used). Each stacked memory chip may comprise one or more memory arrays 21-1404 (FIG. 21-14 shows one memory array, but any number may be used). Each memory array may comprise one or more portions. In FIG. 21-14 the memory array contains 4 subarrays, e.g. subarray 21-1402, but any type of portion or number of portions may be used, including a first type of portion within a second type of portion (e.g. nested blocks, nested circuits, etc). For example the memory array portions may comprise one or more banks and the one or more banks may contain one or more subarrays etc. In FIG. 21-14, each stacked memory chip may further comprise one or more row buffer sets (one row buffer set is shown in FIG. 21-14, but any number of row buffer sets may be used). Each row buffer set may comprise one or more row buffers, e.g. row buffer 21-1406. In FIG. 21-14 each row buffer set comprises 4 row buffers but any number of row buffers may be used. The number of row buffers in a row buffer set may be equal to the number of subarrays. In FIG. 21-14, each stacked memory chip may be connected (e.g. logically connected, coupled, in communication with, etc) to one or more stacked memory chips and a logic chip using one or more TSV data buses, e.g. TSV data bus 21-1434. In FIG. 21-14, each stacked memory chip may further comprise one or more MUXes, e.g. MUX 21-1432 that may connect a row buffer to a TSV data bus. The logic chip may comprise one or more read FIFOs, e.g. read FIFO 21-1448. The logic chip may further comprise one or more de-MUXes, e.g. de-MUX 21-1450, that may connect a TSV data bus to one or more read FIFOs. The logic chip may further comprise a PHY layer. The PHY layer may be coupled to the one or more read FIFOs using bus 21-1458. The PHY layer may be operable to be coupled to external components (e.g. CPU, one or more stacked memory packages, other system components, etc) via high-speed serial links, e.g. high-speed link 21-1456, or other means (e.g. parallel bus, optical links, etc).

Note that in FIG. 21-14 only the read path has been shown in detail. The TSV data buses may be bidirectional and used for both read path and write path for example. The techniques described below to concentrate read data onto one or more TSV buses and deconcentrate data from one or more TSV buses may also be used for write data. In the case of the write path the same row buffer sets and row buffers used for read data may be used to store (e.g. hold, latch, etc) write data. In the case of the write path the functions of the read FIFOs used for holding and operating on read data may essentially be replaced by data I/F circuits used to hold and operate on write data, as shown for example in FIG. 21-7.

Note that in FIG. 21-14 the connections between memory array(s) and row buffer sets have not been shown explicitly, but may be similar to that shown in (and may employ any of the techniques and methods associated with) the architectures of FIG. 21-7, FIG. 21-6, FIG. 21-9, and may use for example the connection methods of FIG. 21-12 and/or FIG. 21-13.

In FIG. 21-14 the MUX circuits may act to concentrate (e.g. multiplex, combine, etc) data signals onto the TSV data bus. Thus for example, in FIG. 21-14 N row buffers may be multiplexed onto M TSV data buses. Multiplexing may be achieved in a number of ways.

The MUX operations in FIG. 21-14 may be performed in several ways. For example, the one or more MUXes in each stacked memory chip in FIG. 21-14 may map the row buffers to TSV data buses. In one embodiment based on FIG. 21-14, the 4 row buffers in stacked memory chip 1 (e.g. N=4) may be mapped onto 2 TSV data buses (e.g. M=2). For example, in FIG. 21-14, at time t1 a first portion of row buffer 21-1406 (or possibly all of the row buffer) may be driven onto TSV data bus 21-1434 by MUX 21-1430; at the same time t1 (e.g. or nearly the same time) a first portion of row buffer 21-1424 (or possibly all of the row buffer) may be driven onto TSV data bus 21-1436 by MUX 21-1432; at time t2 a first portion of row buffer 21-1426 (or possibly all of the row buffer) may be driven onto TSV data bus 21-1434 by MUX 21-1430; at the same time t2 a first portion of row buffer 21-1428 (or possibly all of the row buffer) may be driven onto TSV data bus 21-1436 by MUX 21-1432. This process may then be repeated as necessary (e.g. until all row buffer contents have been transferred etc), driving complete (e.g. all of the row buffers) row buffers (or portions of row buffers e.g. if time multiplexing within a row buffer is used etc) possibly in a time-multiplexed fashion (e.g. alternating between row buffers, switching between row buffers) onto the TSV data buses. The 2 de-MUXes (e.g. de-MUX 21-1450 and de-MUX 21-1452) may reverse this process and extract (e.g. de-MUX, recover, etc.) the multiplexed row buffer data from stacked memory chip 1 into the read FIFOs.

The de-MUX operations in FIG. 21-14 may be performed in several ways. For example, the one or more de-MUXes in each stacked memory chip in FIG. 21-14 may map the TSV data buses to one or more read FIFOs. In one embodiment, a simple de-MUX mapping may be used that may exactly reverse the MUX operation, but other schemes may be used. For example data may be merged so that 4 row buffers (N=4) in stacked memory chip 1 may always (e.g. fixed, hard-wired, etc) be mapped to 2 read FIFOs. Thus for example row buffer 21-1406 and row buffer 21-1424 may be combined into read FIFO 21-1448 etc.

The MUX and de-MUX operations in FIG. 21-14 may be programmable. In one embodiment, the MUX and/or de-MUX mapping may be programmable (e.g. changed at start-up, changed at run time, etc). Programming may be in response to: (1) system configuration (e.g. by CPU, as a result of determining the number and/or type of stacked memory packages and/or stacked memory chips etc); (2) system performance (e.g. bottlenecks detected by the CPU and/or logic chips, virtual memory channel priorities, etc); (3) system testing to determine the number of functional TSV data buses (e.g. either at manufacture, at system start-up, or during operation when a failure occurs, etc); (4) combinations of these and/or other triggers and/or events.

In the architecture of FIG. 21-14 the TSV data buses may be shared between all stacked memory chips (though this need not be the case, various possible architectures that may share in a different manner will be discussed below). Thus in FIG. 21-14 stacked memory chip 2, for example, may be assigned one or more of the TSV data bus resources (e.g. may be assigned TSV data bus 134 and/or TSV data bus 21-1436, etc) at time t2 instead of stacked memory chip 1. For example in one bus resource allocation scheme, the bus resources may be shared in a round-robin fashion. Thus for example, stacked memory chip 1 may be assigned both TSV data buses at time t1, stacked memory chip 2 may be assigned both TSV data buses at time t2, stacked memory chip 3 may be assigned both TSV data buses at time t3, stacked memory chip 4 may be assigned both TSV data buses at time t4 and this bus allocation process may then repeat (e.g. in round-robin fashion, using cyclic assignment, etc). Using such a bus allocation process may result in each stacked memory chip having a fixed share of bus resources and may result in each stacked memory chip having an equal share of bus resources.

In one embodiment based on the architecture of FIG. 21-14, one or more (including all) stacked memory chips and/or the logic chip may arbitrate for shared bus resources. For example we may apply arbitration to allocate the TSV data buses and TSV data bus resources that may be shared between all stacked memory chips (FIG. 21-14 shows all stacked memory chips sharing TSV buses, though this need not be the case). In one embodiment the logic chip may be responsible for receiving and/or generating one or more TSV data bus requests and receiving and/or granting one or more TSV bus resources using one or more arbitration schemes. Of course, the arbitration scheme or arbitration schemes may be performed by the logic chip, by one or more of the stacked memory chips, or by a combination of the logic chip and one or more (or all) of the stacked memory chips. The arbitration schemes used may include one or more (but not limited to) the following: weighted round-robin (WRR); fair arbitration; fixed priority arbitration; credit based arbitration; latency based arbitration; fair bandwidth arbitration; pure rotation; fair rotation; slack based arbitration; a mix and/or combination of any of these schemes and/or other well-known arbitration schemes, well-known arbitration algorithms, well-know arbitration methods; etc. In one embodiment, an arbitration scheme that ensures equal overall bandwidth while minimizing latency to (for writes) and from (for reads) each stacked memory chip, and/or the addressable portions of each stacked memory chip (e.g. subarrays, banks, etc) may be implemented. In one embodiment such arbitration schemes, arbitration algorithms, arbitration methods, etc. may be programmable, either at start-up or at run time, by a CPU or CPUs, by one or more of the stacked logic packages, or by other system components etc.

In the architecture of FIG. 21-14 the TSV data buses are shown in the mode (e.g. configuration, setting, etc) of being used for the read path (or read channel etc). The TSV data buses may be also used for the write path (e.g. one or more, including all, of the TSV data buses may be bidirectional). In one embodiment based on FIG. 21-14 one TSV data bus (for example TSV data bus 21-1434) may be dedicated (e.g. used exclusively, etc) to the read path (e.g. as shown in FIG. 21-14) and one TSV data bus (for example TSV data bus 21-1436) may be used for the write path (instead of being used for the read channel as is shown in FIG. 21-14). Of course any number of TSV data buses may be used between read channel and write channel and may be allocated in any combination (e.g. fixed, variable, programmable, etc). Thus, for example, in one embodiment based on FIG. 21-14 a first group of one or more TSV data buses may be allocated for the read channel and/or a second group of one or more of the TSV data buses may be allocated for the write channel. Such an architecture may be implemented, for example, when memory traffic is asymmetric (e.g. unequal, biased, weighted more towards read than writes, weighted more toward writes than reads, etc). In the case, for example, that read traffic is heavier (e.g. more read data transfers, more read commands, etc) than write traffic (either known at start-up for a particular machine type, known at start-up by configuration, known at start-up by application use or type, determined at run time by measurement, etc) then more resources (e.g. TSV data bus resources, other bus resources, other circuits, etc) may be allocated to the read channel (e.g. through modification of arbitration schemes, through logic reconfiguration, etc). Of course any weighting scheme, resource allocation scheme or method, or combinations of schemes and/or methods may be used in such an architecture.

In one embodiment based on the architecture of FIG. 21-14, one or more (including all) of the TSV data buses and/or other resources may be switched between read channel and write channel. For example the logic chip may assign data bus resources (e.g. as a bus master etc) and/or other resources for the write channel based, for example, on incoming and/or pending write requests (e.g. in the data I/F circuits, as shown in FIG. 21-7 for example). For example the logic chip may then receive one or more bus resource requests and/or other resource requests from one or more stacked memory chips that may be ready to transfer data. For example the logic chip may then grant one or more stacked memory chips one or more free TSV data buses or other resources, etc.

In the architecture of FIG. 21-14 the TSV data buses are shown as shared between all stacked memory chips, but this need not be the case for all architectures based on FIG. 21-14. For example, in one architecture based on FIG. 21-14 one or more (including all) stacked memory chips may have one or more dedicated TSV data buses (e.g. buses making a connection between one stacked memory chip and the logic chip, point-to-point buses, etc). Each of these one or more dedicated TSV data buses may be used, for example, in any fashion just described. For example, in one embodiment one or more of the dedicated TSV data buses may be used exclusively for the read path or exclusively for the write path. If all of the TSV data buses are dedicated (in which case there would be at least four TSV data buses for the architecture shown in FIG. 21-14 with four stacked memory chips) then any arbitration required may be simplified. For example each stacked memory chip in an architecture based on FIG. 21-14 may have one dedicated TSV data bus. For example there may be 4 subarrays and 4 row buffers (N=4) in each stacked memory chip (as is shown in FIG. 21-14). In this case each stacked memory chip may time-multiplex four data transfers (one for each of the four row buffers in each stacked memory chip) onto a single dedicated TSV data bus belonging to each stacked memory chip, for example. Of course there may be any number of stacked memory chips, any number of dedicated TSV data buses, any number of subarrays (or banks, or other portions of the one or more memory arrays on each stacked memory chip), any method described of using the dedicated TSV data buses for the read path and the write path, and any of the described methods of data transfer may be used.

For example, in one architecture based on FIG. 21-14 each stacked memory chip may share one or more (including all) TSV data buses (e.g. buses making a connection between one or more stacked memory chips and the logic chip, multidrop buses, etc). For example there may be two shared TSV buses in an architecture based on FIG. 21-14. In this example a first shared data bus may be shared between stacked memory chip 1 and stacked memory chip 2; and a second shared data bus may be shared between stacked memory chip 3 and stacked memory chip 4. Of course there may be any number of stacked memory chips, any number of shared TSV data buses, any number of subarrays (or banks, or other portions of the one or more memory arrays on each stacked memory chip) using one or more shared data buses, any method described of using the shared TSV data buses for the read path and the write path, and any of the described methods of data transfer may be used.

Of course combinations of the architectures based on FIG. 21-14 and described herein may be used. For example a first group of TSV data buses on one or more stacked memory chips may be dedicated (to a stacked memory chip, to a subarray, to a portion of a memory array, to a row buffer, etc) and a second group of the TSV data buses on the one or more stacked memory chips may be shared (between one or more stacked memory chips, between one or more subarrays, between one or more portions of a memory array, between or more row buffers, etc). For example some of the TSV data buses may be bidirectional (e.g. used for both the read path and the write path) and some of the TSV data buses may be unidirectional (e.g. used for the read path or used for the write path).

As an option, the stacked memory package architecture of FIG. 21-14 may be implemented in the context of the architecture and environment of any previous Figure(s) and/or any subsequent Figure(s). Of course, however, the stacked memory package architecture of FIG. 21-14 may be implemented in the context of any desired environment.

FIG. 21-15

Stacked Memory Package Architecture

FIG. 21-15 shows a stacked memory package architecture, in accordance with another embodiment.

In FIG. 21-15 the stacked memory package architecture 21-1500 comprises stacked memory chip 1 21-1532, stacked memory chip 2 21-1534, logic chip 1 21-1546, in accordance with one embodiment. Any number of stacked memory chips and/or logic chips may be used.

Each stacked memory chip may comprise one or more row buffers, e.g. row buffer 21-1536. Each row buffer may contain one or more subarray buffers, e.g. subarray buffer 21-1548. In FIG. 21-15 each stacked memory chip may comprise 8 row buffers but any number of row buffers may be used. In FIG. 21-15 each row buffer may comprise 2 subarray buffers but a row buffer may comprise any number of subarray buffers (including zero subarray buffers, e.g. subarray buffers need not be used). In FIG. 21-15 each stacked memory chip may comprise one or more stacked memory chip read FIFOs, e.g. stacked memory chip read FIFO 21-1538. In FIG. 21-15 each stacked memory chip may contain two stacked memory chip read FIFOs, but any number of stacked memory chip read FIFOs may be used. In FIG. 21-15 the row buffers and/or subarray buffers may be coupled via a bus, e.g. bus 21-1530, to one or more of the one or more stacked memory chip read FIFOs. In FIG. 21-15 a single bus is depicted as coupling all row buffers and/or subarray buffers to the one or more stacked memory chip read FIFOs; but any number of buses and/or any arrangement of buses (e.g. shared, non-shared, multiple buses, etc.) and/or any type of bus etc. may be used to connect the row buffers and/or subarray buffers with the stacked memory chip read FIFOs.

In FIG. 21-15, each stacked memory chip may be connected (e.g. logically connected, coupled, in communication with, etc) to the logic chip using one or more TSV data buses, e.g. TSV data bus 21-1540. The logic chip may comprise one or more logic chip read FIFOs, e.g. logic chip read FIFO 21-1542. In FIG. 21-15 each logic chip may contain eight logic chip read FIFOs, but any number of logic chip read FIFOs may be used. The logic chip may further comprise one or more high-speed serial links, e.g. high-speed serial link 21-1548, operable to be coupled to one or more CPUs, one or more stacked memory packages, one or more other system components, etc.

In FIG. 21-15, data may be transferred (from memory) to one or more subarray buffers as a result, for example, of a read request and as previously described herein as a first stage data transfer (e.g. as described for example in connection with the architecture of FIG. 21-12). For example the CPU may issue a read request for a cache line of 64 bytes, or 256 bits (a typical size for a CPU cache line and typical of the read requests from a CPU). In the architecture of FIG. 21-15 each subarray may provide 256 bits of data on a read request (for any read command). Thus for example the CPU read request may result in the transfer of 256 bits of data to subarray buffer 21-1536, with data efficiency DE2 of 100%. The second stage data transfer of 256 bits may use bus 21-1540 and stacked memory chip FIFO 21-1538, with data efficiency DE3 of 100%. A third stage data transfer of 256 bits may use bus 21-1540 and logic chip read FIFO 21-1542, with data efficiency DE4 of 100%. A fourth stage data transfer of 256 bits may place the read request response of 256 bits (the requested cache line) on high-speed serial link 21-1548 with data efficiency DE5 of 100%. The data efficiency DE1 of the architecture based on FIG. 21-15 is thus DE2×DE3×DE4×DE5=100%. In FIG. 21-15, multiple read requests and/or write request (with each request corresponding to a complete cache line and/or multiple cache lines) may be completed simultaneously. The number of simultaneous read/write operations that may be performed using the architecture shown in FIG. 21-15 may depend on, for example, the following factors: (1) the number of independent subarrays; (2) the bandwidth and other properties (e.g. number of buses, type of bus, number of subarrays per bus, etc.) of the buses connecting the subarrays with the stacked memory chip read FIFOs (and, for the write path, the stacked memory chip data I/F, which is not shown in FIG. 21-15 but may be present); (3) the number of, size of, etc. the stacked memory chip read FIFOs; (4) the number (M) of TSV data buses; (5) the type of TSV data bus (shared dedicated, etc); (6) the number and size of logic chip read FIFOs; (7) the number of, speed of, etc high-speed serial links.

For comparison with the stacked memory package architecture shown in the embodiment of FIG. 21-15 (see 21-1500), in another embodiment, a cache line read of 256 bits from SDRAM parts may use a system similar to memory system 21-1550. 8 bits may be read from each device on each clock edge in bursts 8 bits long. Thus 8 read commands are required (compared with one read command for the stacked memory package architecture 21-1500 of FIG. 21-15). The 8 burst read commands (for 8 bursts of 64 bits each for a BL8 SDRAM part, e.g. DDR3) are distributed to eight ×8 SDRAM parts (e.g. on a DIMM). Memory system 21-1550 contains only two parts (and thus could be considered for example a DIMM with only two parts), but the operation of one of the parts is the same whether a DIMM contains 2 or 8 SDRAM parts (or 9 parts in the case of an RDIMM). Memory chip 2 21-1504 may have a row buffer 21-1506 that is 2 kB or 16384 bits in size (e.g. a DDR3 SDRAM part). SDRAM bus 21-1514 is typically 64 bits wide. The SDRAM read FIFO and data MUX 21-1508 may typically hold 64 bits. The SDRAM bus 21-1520 is 8 bits wide for a ×8 SDRAM part. The read drivers drive 8 IO pins for a ×8 SDRAM part. The SDRAM bus (the DQ or data bus) is 8 bits for a ×8 SDRAM part. Thus, in one possible embodiment shown, for each one of the 8 read commands required from a standard SDRAM, the data efficiency DE2=64/16384=0.39%; data efficiency DE3=8/64=12.5%; and data efficiency DE1=DE2×DE3=0.049%. One could also consider the data efficiency of the entire burst of reads from an SDRAM part as DE1(burst)=64/16384=0.39% (compared to 100% for the stacked memory package architecture 21-1500 of FIG. 21-15).

As an option, the stacked memory package architecture of FIG. 21-15 may be implemented in the context of the architecture and environment of any previous Figure(s) and/or any subsequent Figure(s). Of course, however, the stacked memory package architecture of FIG. 21-15 may be implemented in the context of any desired environment.

As one example, one or more aspects of the various embodiments of the present invention may be included in an article of manufacture (e.g. one or more computer program products) having, for instance, computer usable media. The media has embodied therein, for instance, computer readable program code means for providing and facilitating the capabilities of the various embodiments of the present invention. The article of manufacture can be included as a part of a computer system or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; and U.S. Provisional Application No. 61/581,918, filed Jan. 13, 2012, titled "USER INTERFACE SYSTEM, METHOD, AND COMPUTER PROGRAM PRODUCT." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section V

The present section corresponds to U.S. Provisional Application No. 61/608,085, titled "SYSTEM, METHOD, AND COMPUTER PROGRAM PRODUCT FOR IMPROVING MEMORY SYSTEMS," filed Mar. 7, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS."

FIG. 22-1

Figures 1, 22:
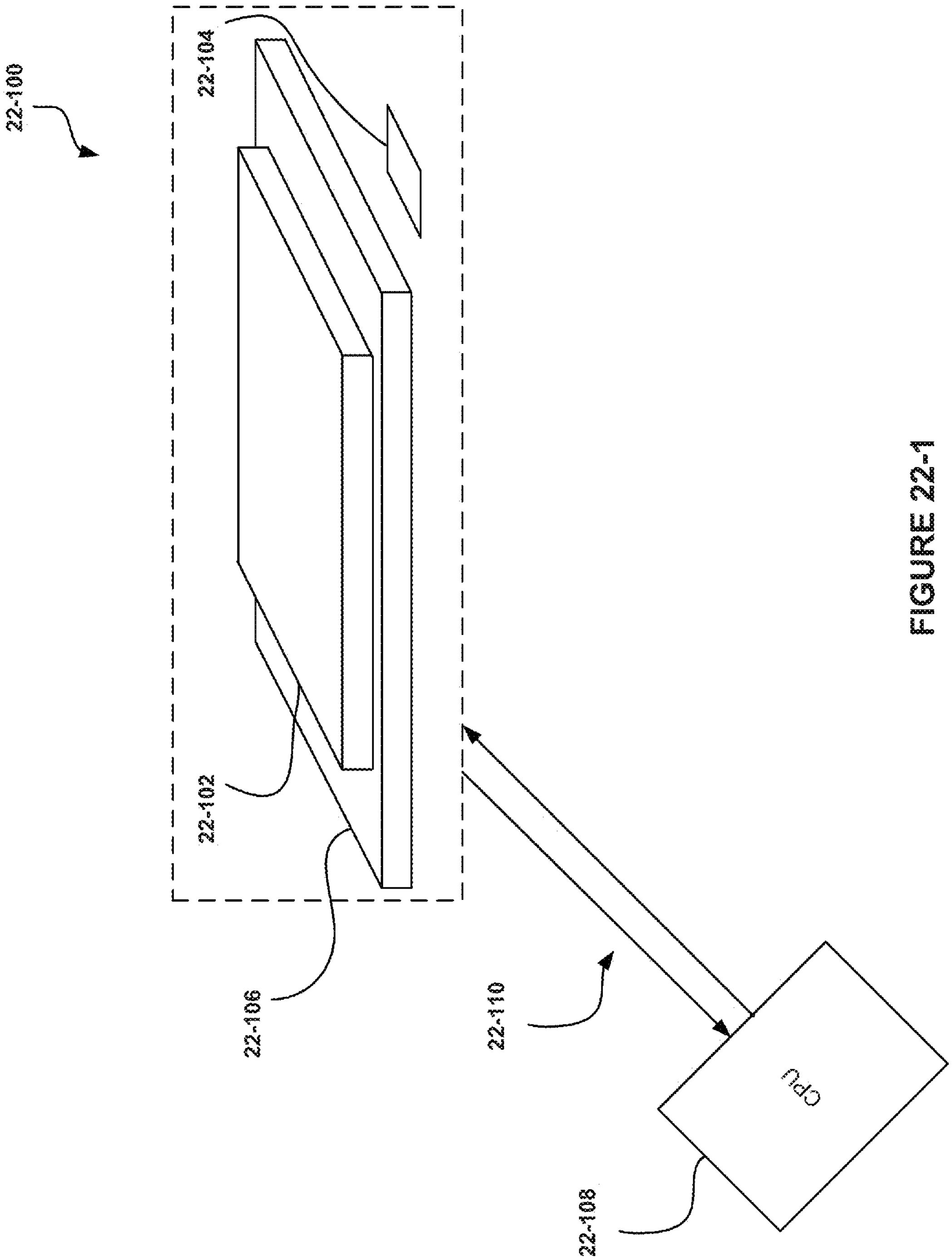

FIG. 22-1 shows a memory apparatus 22-100, in accordance with one embodiment. As an option, the apparatus 22-100 may be implemented in the context of any subsequent Figure(s). Of course, however, the apparatus 22-100 may be implemented in the context of any desired environment.

It should be noted that a variety of optional architectures, capabilities, and/or features will now be set forth in the context of a variety of embodiments in connection with a description of FIG. 22-1. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 22-100 includes a first semiconductor platform 22-102 including a first memory. Additionally, the apparatus 22-100 includes a second semiconductor platform 22-106 stacked with the first semiconductor platform 22-102. Such second semiconductor platform 22-106 may include a second memory. As an option, the first memory may be of a first memory class. Additionally, the second memory may be of a second memory class.

In another unillustrated embodiment, a plurality of stacks may be provided, at least one of which includes the first semiconductor platform 22-102 including a first memory of a first memory class, and at least another one which includes the second semiconductor platform 22-106 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments.

In another embodiment, the apparatus 22-100 may include a physical memory sub-system. In the context of the present description, physical memory refers to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, MRAM, PRAM, etc.), a solid-state disk (SSD) or other disk, magnetic media, and/or any other physical memory that meets the above definition.

Additionally, in various embodiments, the physical memory sub-system may include a monolithic memory circuit, a semiconductor die, a chip, a packaged memory circuit, or any other type of tangible memory circuit. In one embodiment, the apparatus 22-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 22-106. Such connections that are in communication with the first memory and pass through the second semiconductor platform 22-106 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing a TSV.

As another option, the communicative coupling may include a connection via a buffer device. In one embodiment, the buffer device may be part of the apparatus 22-100. In another embodiment, the buffer device may be separate from the apparatus 22-100.

Further, in one embodiment, at least one additional semiconductor platform (not shown) may be stacked with the first semiconductor platform 22-102 and the second semiconductor platform 22-106. In this case, in one embodiment, the additional semiconductor may include a third memory of at least one of the first memory class or the second memory class, and/or any other additional circuitry. In another embodiment, the at least one additional semiconductor includes a third memory of a third memory class.

In one embodiment, the additional semiconductor platform may be positioned between the first semiconductor platform 22-102 and the second semiconductor platform 22-106. In another embodiment, the at least one additional semiconductor platform may be positioned above the first semiconductor platform 22-102 and the second semiconductor platform 22-106. Further, in one embodiment, the additional semiconductor platform may be in communication with at least one of the first semiconductor platform 22-102 and/or the second semiconductor platform 22-102 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 22-102 may be in communication via a buffer. In this case, in one embodiment, the buffer may include a row buffer.

Further, in one embodiment, the apparatus 22-100 may be configured such that the first memory and the second memory are capable of receiving instructions via a single memory bus 22-110. The memory bus 22-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, etc; I/O protocols such as PCI, PCI-E, HyperTransport, InfiniBand, QPI, etc; networking protocols such as Ethernet, TCP/IP, iSCSI, etc; storage protocols such as NFS, SAMBA, SAS, SATA, FC, etc; and other protocols (e.g. wireless, optical, etc.); etc.). Of course, other embodiments are contemplated with multiple memory buses.

In one embodiment, the apparatus 22-100 may include a three-dimensional integrated circuit. In one embodiment, the first semiconductor platform 22-102 and the second semiconductor platform 22-106 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 22-100 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 22-102 and the second semiconductor platform 22-106 together may include a three-dimensional integrated circuit that is a wafer-on-wafer device.

In another embodiment, the apparatus 22-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 22-102 and the second semiconductor platform 22-106 together may include a three-dimensional integrated circuit that is a monolithic device.

In another embodiment, the apparatus 22-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 22-102 and the second semiconductor platform 22-106 together may include a three-dimensional integrated circuit that is a die-on-wafer device.

In yet another embodiment, the apparatus 22-100 may include a three-dimensional integrated circuit that is a die-on-die device. In the context of the present description, a die-on-die device refers to a device including two or more aligned dies in a die-on-die configuration. In one embodiment, the first semiconductor platform 22-102 and the second semiconductor platform 22-106 together may include a three-dimensional integrated circuit that is a die-on-die device.

Additionally, in one embodiment, the apparatus 22-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 22-100 may be configured such that the first memory and the second memory are capable of receiving instructions from a device 22-108 via the single memory bus 22-110. In one embodiment, the device 22-108 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.).

In the context of the following description, optional additional circuitry 22-104 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 22-104 is shown generically in connection with the apparatus 22-100, it should be strongly noted that any such additional circuitry 22-104 may be positioned in any components (e.g. the first semiconductor platform 22-102, the second semiconductor platform 22-106, the processing unit 22-108, an unillustrated logic unit or any other unit described herein, a separate unillustrated component that may or may not be stacked with any of the other components illustrated, a combination thereof, etc.).

In one embodiment, the second semiconductor platform 22-106 may be stacked with the first semiconductor platform 22-102 in a manner that the second semiconductor platform 22-106 is rotated about an axis (not shown) with respect to the first semiconductor platform 22-102. A decision to effect such rotation may be accomplished during a design, manufacture, testing and/or any other phase of implementing the apparatus 22-100, utilizing any desired techniques (e.g. computer-aided design software, semiconductor manufacturing/testing equipment, etc.). Still yet, the aforementioned may be accomplished about any desired axis including, but not limited a x-axis, y-axis, z-axis (or any other axis or combination thereof, for that matter). As an option, the second semiconductor platform 22-106 may be rotated about an axis with respect to the first semiconductor for changing a collective functionality of the apparatus. In another embodiment, such collective functionality of the apparatus may be changed based on the rotation. In one possible embodiment, the second semiconductor platform 22-106 may be capable of performing a first function with a rotation of a first amount (e.g. 90 degrees, 180 degrees, 270 degrees, etc.) and a second function with a rotation of a second amount different than the first amount. More illustrative information will be set forth regarding various optional architectures, capabilities, and/or features with which the present embodiment(s) may or may not be implemented during the description of the embodiments shown in subsequent figures (e.g. see, for example, FIG. 22-2A, etc.). It should be strongly noted that subsequent embodiment information is set forth for illustrative purposes and should not be construed as limiting in any manner, since any of such features may be optionally incorporated with or without the inclusion of other features described.

In another embodiment, a signal may be received at a plurality of semiconductor platforms (e.g. 22-102, 22-106, etc.). In one embodiment, such signal may include a test signal. In response to the signal, a failed component of at least one of the semiconductor platforms may be reacted to. In the context of the present description, the failed component may involve any failure of any aspect of the at least one semiconductor platform. For example, in one embodiment, the failed component may include at least one aspect of a TSV (e.g. a connection thereto, etc.). Even still, the aforementioned reaction may involve any action that is carried out in response to the response to the signal, in connection with the failed component. In one possible embodiment, the reacting may include connecting the at least one of the semiconductor platform to at least one spare bus (e.g. which may, for example, be implemented using a spare TSV, etc.). In one embodiment, this may circumvent a failed connection with a particular TSV. In the context of the present description, the spare TSV may refer to any TSV that is capable of having an adaptable purpose to accommodate a need therefor.

In another embodiment, a failure of a component of at least one semiconductor platform stacked with at least one other semiconductor platform may simply be used in any desired manner, to identify the at least one semiconductor platform. Such identification may be for absolutely any purpose (e.g. reacting to the failure, subsequent addressing the at least one semiconductor platform, etc.). More illustrative information will be set forth regarding various optional architectures, capabilities, and/or features with which the present embodiment(s) may or may not be implemented during the description of the embodiments shown in subsequent figures (e.g. see, for example, FIG. 22-2B, etc.). It should be strongly noted that subsequent embodiment information is set forth for illustrative purposes and should not be construed as limiting in any manner, since any of such features may be optionally incorporated with or without the inclusion of other features described.

In still another embodiment, the aforementioned additional circuitry 22-104 may or may not include a chain of a plurality of links. In the context of the present description, the links may include anything is capable connecting two electrical points. For example, in one embodiment, the links may be implemented utilizing a plurality of switches. Also in the context of the present description, the chain may refer to any collection of the links, etc. Such additional circuitry 22-104 may be further operable for configuring usage of a plurality of TSVs, utilizing the chain. Such usage may refer to usage of any aspect of an apparatus that involves the TSVs. For example, in one embodiment, the usage of the plurality of TSVs may be configured for tailoring electrical properties. Still yet, in another embodiment, the usage of the plurality of TSVs may be configured for utilizing at least one spare TSV. More illustrative information will be set forth regarding various optional architectures, capabilities, and/or features with which the present embodiment(s) may or may not be implemented during the description of the embodiments shown in subsequent figures (e.g. see, for example, FIG. 22-2C, etc.). It should be strongly noted that subsequent embodiment information is set forth for illustrative purposes and should not be construed as limiting in any manner, since any of such features may be optionally incorporated with or without the inclusion of other features described.

In still yet another embodiment, the additional circuitry 22-104 may or may not include an ability to change a signal among a plurality of forms. Specifically, in such embodiment, a first change may be performed on a signal to a first form. Still yet, a second change may be performed on the signal from the first form to a second form. In the context of the present description, the aforementioned change may be of any type including, but not limited to a transformation, coding, encoding, encrypting, ciphering, a manipulation, and/or any other change, for that matter. Still yet, in various embodiments, the first form and/or the second form may include a parallel format and/or a serial format. In use, the second form may be optimized by the first change. Such optimization may apply to any aspect of the second form (e.g. format, operating characteristics, underlying architecture, usage thereof, and/or any other aspect or combination thereof, for that matter). In one embodiment, for instance, the second form may be optimized by the first change by minimizing signal interference, optimizing data protection, minimizing power consumption, and/or minimizing logic complexity. More illustrative information will be set forth regarding various optional architectures, capabilities, and/or features with which the present embodiment(s) may or may not be implemented during the description of the embodiments shown in subsequent figures (e.g. see, for example, FIG. 22-3, etc.). It should be strongly noted that subsequent embodiment information is set forth for illustrative purposes and should not be construed as limiting in any manner, since any of such features may be optionally incorporated with or without the inclusion of other features described.

In even still yet another embodiment, the additional circuitry 22-104 may or may not include paging circuitry operable to be coupled to a processing unit, for accessing pages of memory in the first semiconductor platform 22-102 and/or second semiconductor platform 22-106. In the context of the present description, the paging circuitry may include any circuitry capable of at least one aspect of page access in memory. In various embodiments, the paging circuitry may include, but is not limited to a translation look-aside buffer, a page table, and/or any other circuitry that meets the above definition. More illustrative information will be set forth regarding various optional architectures, capabilities, and/or features with which the present embodiment(s) may or may not be implemented during the description of the embodiments shown in subsequent figures (e.g. see, for example, FIG. 22-4, etc.). It should be strongly noted that subsequent embodiment information is set forth for illustrative purposes and should not be construed as limiting in any manner, since any of such features may be optionally incorporated with or without the inclusion of other features described.

In still yet even another embodiment, the additional circuitry 22-104 may or may not include caching circuitry operable to be coupled to a processing unit, for caching data in association with the first semiconductor platform 22-102 and/or second semiconductor platform 22-106. In the context of the present description, the caching circuitry may include any circuitry capable of at least one aspect of caching data. In various embodiments, the paging circuitry may include, but is not limited to one or more caches and/or any other circuitry that meets the above definition. As mentioned earlier, in various optional embodiments, the first semiconductor platform 22-102 and second semiconductor platform 22-106 may include different memory classes. Still yet, in another optional embodiment, a processing unit (e.g. CPU, etc.) may be operable to be stacked with the first semiconductor platform 22-102. More illustrative information will be set forth regarding various optional architectures, capabilities, and/or features with which the present embodiment(s) may or may not be implemented during the description of the embodiments shown in subsequent figures (e.g. see, for example, FIGS. 22-6 and 22-9, etc.). It should be strongly noted that subsequent embodiment information is set forth for illustrative purposes and should not be construed as limiting in any manner, since any of such features may be optionally incorporated with or without the inclusion of other features described.

In other embodiments, the additional circuitry 22-104 may or may not include circuitry for sharing virtual memory pages. As an option, such virtual memory page sharing circuitry may or may not be implemented in the context of the first semiconductor platform 22-102 and the second semiconductor platform 22-106 which respectively include the first and second memories. Still yet, in another optional embodiment that was described earlier, the virtual memory page sharing circuitry may be a component of a third second semiconductor platform (not shown) that is stacked with the first semiconductor platform 22-102 and the second semiconductor platform 22-106. As an additional option, the additional circuitry 22-104 may further include circuitry for tracking changes made to the virtual memory pages. In one embodiment, such tracking may reduce an amount of memory space that is used in association with the virtual memory page sharing. More illustrative information will be set forth regarding various optional architectures, capabilities, and/or features with which the present embodiment(s) may or may not be implemented during the description of the embodiments shown in subsequent figures (e.g. see, for example, FIG. 22-5, etc.). It should be strongly noted that subsequent embodiment information is set forth for illustrative purposes and should not be construed as limiting in any manner, since any of such features may be optionally incorporated with or without the inclusion of other features described.

In another embodiment, the additional circuitry 22-104 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiment, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 22-104 capable of receiving (and/or sending) the data operation request. More illustrative information will be set forth regarding various optional architectures, capabilities, and/or features with which the present embodiment(s) may or may not be implemented during the description of the embodiments shown in subsequent figures (e.g. see, for example, FIG. 22-7, etc.). It should be strongly noted that subsequent embodiment information is set forth for illustrative purposes and should not be construed as limiting in any manner, since any of such features may be optionally incorporated with or without the inclusion of other features described.

In yet another embodiment, regions and sub-regions of any of the memory described herein may be arranged to optimize one or more parallel operations in association with the memory. More illustrative information will be set forth regarding various optional architectures, capabilities, and/or features with which the present embodiment(s) may or may not be implemented during the description of the embodiments shown in subsequent figures (e.g. see, for example, FIGS. 22-11-22-13, etc.). It should be strongly noted that subsequent embodiment information is set forth for illustrative purposes and should not be construed as limiting in any manner, since any of such features may be optionally incorporated with or without the inclusion of other features described.

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate with the memory system to allow for any of the foregoing optional architectures, capabilities, and/or features. For that matter, further embodiments are contemplated where a single semiconductor platform (e.g.

22-102, 22-160, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

More illustrative information will now be set forth regarding various optional architectures, capabilities, and/or features with which the foregoing techniques discussed in the context of any of the figure(s) may or may not be implemented, per the desires of the user. For instance, various optional examples and/or options associated with the configuration/operation of the apparatus 22-100, the configuration/operation of the first and second memories, the configuration/operation of the memory bus 22-110, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc. which may or may not be incorporated in the various embodiments disclosed herein.

FIG. 22-2A

Figures 2A, 22:
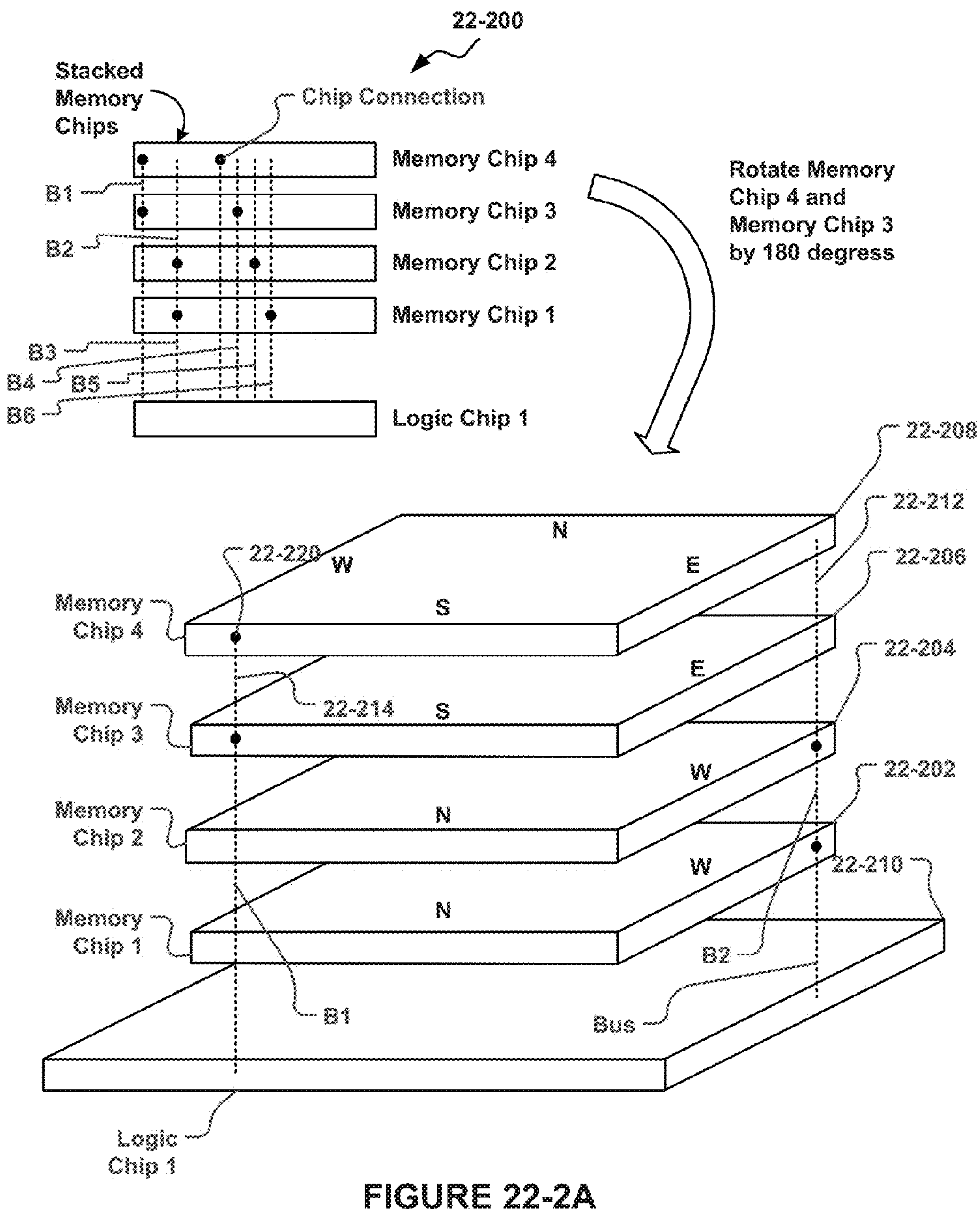

FIG. 22-2A shows an orientation controlled die connection system, in accordance with another embodiment.

In FIG. 22-2A, the orientation controlled die connection system 22-200 may comprise one or more stacked die (e.g. one or more stacked memory chips and one or more logic chips, other silicon die, ICs, etc.). In FIG. 22-2A, the one or more die may comprise one or more stacked memory chips and a logic chip, though any number of memory chips and/or logic chips may be used. In FIG. 22-2A the one or more stacked die comprising one or more stacked memory chips and one or more logic chips may be connected (e.g. coupled, etc.) by one or more columns of TSVs (e.g. TSV bus, pillars, path, buses, wires, connectors, etc.) or by using other connections mechanisms (e.g. optical, proximity, etc.).

In FIG. 22-2A a bus may be represented by a dashed line. In FIG. 22-2A, a solid dot (e.g. connection dot, logical dot, etc.) on a bus (e.g. at the intersection of a bus dashed line and chip, etc.) may represent a connection (e.g. electrical connection, physical connection, signal coupling, signal path, logical path, etc.) from that bus to the logic chip (e.g. to circuits on the logic chip, etc.). Each bus may connect (e.g. logically couple, etc.) two or more chips. In FIG. 22-2A, bus B1 22-214 for example may connect logic chip 1 22-210 to memory chip 3 22-206 and memory chip 4 22-208 (e.g. with the bus passing through memory chip 1 and memory chip 2, but not necessarily connecting to any circuits on memory chip 1 and memory chip 2). Thus, in FIG. 22-2A, the connection between bus B1 and memory chip 4 is represented by connection dot 22-220. In FIG. 22-2A, bus B2 22-212 for example may connect logic chip 1 22-210 to memory chip 1 22-202 and memory chip 2 22-204. In FIG. 22-2A, buses B1 and B2 may be shared buses (e.g. they connect the logic chip to more than one memory chip). In FIG. 22-2A, buses B3, B4, B5, B6 may be dedicated buses (e.g. they may connect the logic chip to only one memory chip, etc.).

In FIG. 22-2A bus B1 and bus B2 may be data buses with bus B1 shared between memory chip 3 and memory chip 4 and with bus B2 shared between memory chip 1 and memory chip 2, etc. In one embodiment, a bus that connects all memory chips may be fully shared bus. In another embodiment, a bus that connects less than all of the memory chips may be a partially shared bus. Thus in FIG. 22-2A for example, bus B1 may be a partially shared bus and bus B2 may be a partially shared buses. In one embodiment, buses (e.g. connecting one or more stacked chips, etc.) may be shared, partially shared, fully shared, dedicated, or combinations of these, etc.

In one embodiment buses (e.g. data buses (e.g. DQ, DQn, DQ1, etc.), and/or address buses (A1, A2, etc.), and/or control buses (e.g. CLK, CKE, CS, etc.), and/or any other signals, bundles of signals, groups of signals, etc.) of one or more memory chips may be shared, partially shared, fully shared, dedicated, or combinations of these.

In one embodiment all memory chips may be identical (e.g. identical manufacturing process, identical masks, single tooling, universal patterning, all layers identical, all connections identical, etc.) or substantially identical (e.g. identical with the exception of minor differences including, but not limited to unique identifiers, minor circuitry differences, etc.). In FIG. 22-2A the four memory chips are stacked on a single logic chip with orientations of the four memory chips (e.g. represented by N (North), E (East), S (south), W (West), etc.) as shown. In FIG. 22-2A memory chip 3 and memory chip 4 are rotated (e.g. changed orientation, etc.) with respect to memory chip 1 and memory chip 2. In FIG. 22-2A the orientation change (e.g. of memory chip 3 and of memory chip 4, etc.) is 180 degrees (e.g. half turn, etc.), but any orientation change may be used. For example chips may be rotated through any angle, rotated about any axis, mounted upside down, combinations of these, etc. In FIG. 22-2A, for example, the effect (e.g. result, etc.) of the orientation change is to allow all four memory chips to be identical, but to be logically connected in a different fashion (e.g. in a different manner, with different shared bus connections, etc.). Thus, in FIG. 22-2A, the connections between one or more chips may be controlled (e.g. transformed, altered, tailored, customized, changed, etc.) by changing one or more orientations of one or more chips.

In one embodiment the orientation and/or stacking and/or number of chips stacked may be changed (e.g. altered, tailored, etc.) during the manufacturing process as a result of testing die. For example, circuits in the NE corner of memory chip 3 and memory chip 4 may be found to be defective during manufacture (e.g. at wafer test, etc.). In that case these chips may be rotated as shown for example in FIG. 2A so that only the through connection is used (e.g. vertical connection between die).

In one embodiment the orientation controlled die connection system may be used together with redundant TSVs or other mechanisms of switching in spare circuits, connections, etc.

In one embodiment the orientation controlled die connection system may be used with staggered TSVs, zig-zag connections, interposers, interlayer dielectrics, substrates, RDLs, etc. in order to use identical die (e.g. using identical masks, single tooling, universal patterning, etc.) for example.

In one embodiment the orientation controlled die connection system may be used for stacked chips other than stacked memory chips and logic chips (e.g. stacked memory chips on one or more CPU chips; chips stacked with GPU chip(s); stacked NAND flash chips possibly with other chips (e.g. flash controller(s), bandwidth concentrator chip(s), etc.); optical and image sensors (camera chips and/or analog chips and/or logic chips, etc.); FPGAs and/or other programmable chips and/or memory chips; other stacked die assemblies; combinations of these and other chips; etc.).

In one embodiment the orientation controlled die connection system may be used with connections technologies other than TSVs (e.g. optical, wireless, capacitive, inductive, proximity, etc.).

In one embodiment the orientation controlled die connection system may be used with connection technologies other than vertical die stacking (e.g. proximity, flexible substrates, PCB, tape assemblies, etc.).

In one embodiment the orientation controlled die connection system may be used with physical and/or electrical platforms other than silicon die (e.g. with packages, package arrays, ball arrays, BGA, LGA, CSP, POP, PIP, modules, submodules, other assemblies, etc.) or including a mix of assembly types (e.g. one or more silicon die with one or more packages, etc.).

As an option, the orientation controlled die connection system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the orientation controlled die connection system may be implemented in the context of any desired environment.

FIG. 22-2B

Figures 2B, 22:
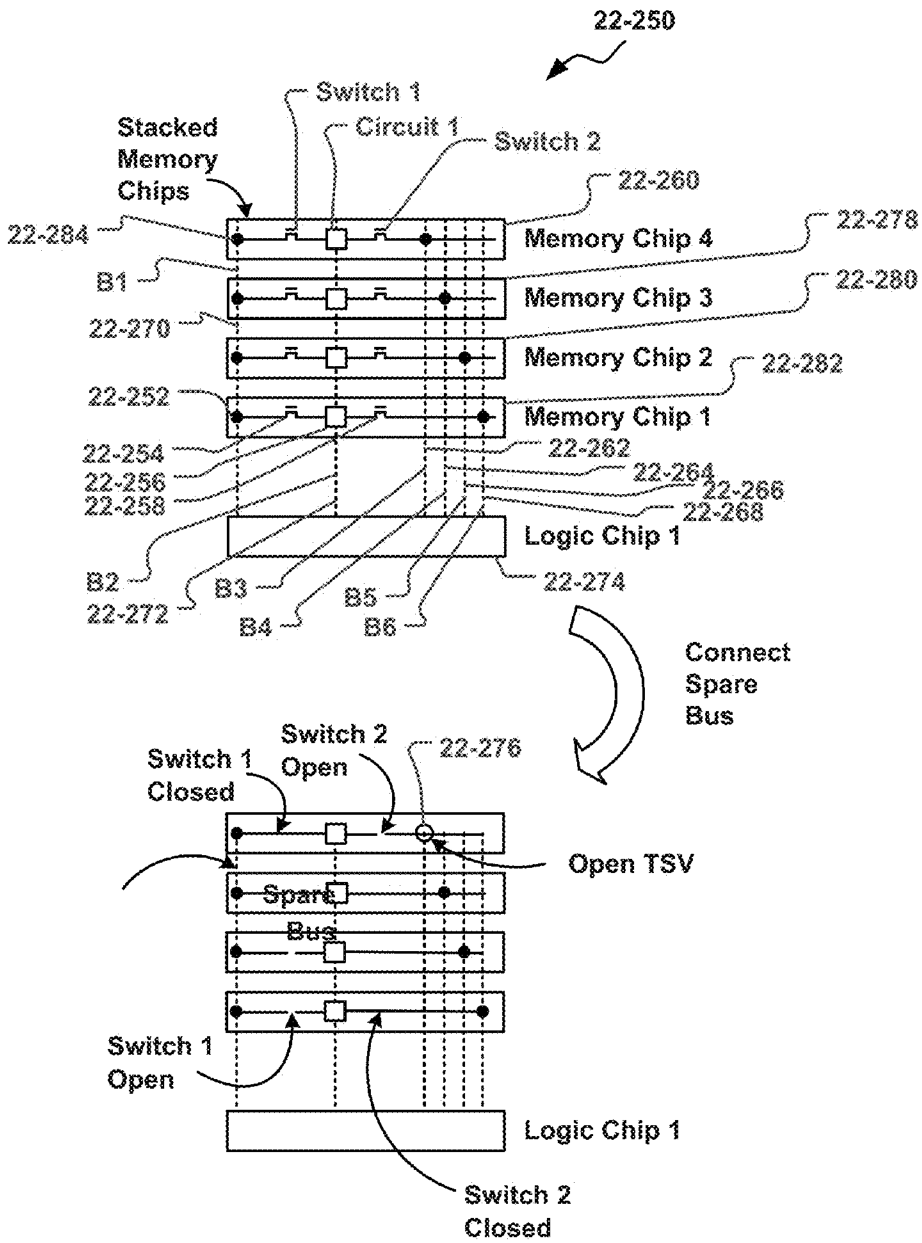

FIG. 22-2B shows a redundant connection system, in accordance with another embodiment.

In FIG. 22-2B, the redundant connection system 22-250 may comprise one or more stacked die. In FIG. 22-2B, the one or more stacked die may comprise one or more stacked memory chips and one or more logic chips. In FIG. 22-2B four stacked memory chips are shown although any number may be used. In FIG. 22-2B one logic chip is shown although any number may be used. In FIG. 22-2B each stacked memory chip of the one or more stacked memory chips may comprise a first switch, switch 1 22-254, a second switch, switch 2 22-258, and a first circuit, circuit 1 22-256. In FIG. 22-2B the first switch and second switch are shown diagrammatically as an nMOS transistor, but any form of switch may be used (e.g. fuse, pass gate, etc.). In FIG. 22-2B the switches are driven (e.g. gate electrode, etc.) by one or more circuits that may not be shown in FIG. 22-2B but whose function (e.g. operation, mode, setting, etc.) is described herein. In FIG. 22-2B the first circuits in each memory chip may be connected to a bus, bus B2 22-272, that may connect the first circuits in each memory chip to the logic chip.

In FIG. 22-2B the one or more stacked die comprising one or more stacked memory chips and one or more logic chips may be connected (e.g. coupled, etc.) by one or more columns of TSVs (e.g. TSV bus, pillars, path, buses, wires, connectors, etc.) or by using other connections mechanisms (e.g. optical, proximity, etc.). In FIG. 22-2B a bus may be represented by a dashed line. In FIG. 22-2B, a solid dot (e.g. connection dot, logical dot, etc.) on a bus (e.g. at the intersection of a bus dashed line and chip, etc.) may represent a connection (e.g. electrical connection, physical connection, signal coupling, signal path, logical path, etc.) from that bus to the logic chip (e.g. to circuits on the logic chip, etc.). Each bus may connect (e.g. logically couple, etc.) two or more chips. In FIG. 22-2B, bus B1 22-270 for example may connect logic chip 1 22-274 to memory chip 1 22-282, memory chip 2 22-280, memory chip 3 22-278, memory chip 4 22-260 (e.g. a shared bus, shared between memory chip 1, memory chip 2, memory chip 3, memory chip 4). Thus, in FIG. 22-2B, the connection between bus B1 and memory chip 4 is represented by connection dot 22-284.

In FIG. 22-2B the bus B1 may act as a spare bus (e.g. redundant bus, etc.). In FIG. 22-2B one or more TSVs (or other related connections, paths, circuits, etc.) may be open or otherwise faulty (e.g. manufacturing failure, process fault, fail to connect, electrically faulty, broken, mis-aligned, high resistance, stuck, shorted, etc.). In the case that a faulty connection may be replaced using one or more spare buses.

In one embodiment a spare connection may be used to replace a faulty connection. For example, in FIG. 22-2B the logic chip may be instructed (e.g. by internal program command, by an external test circuit, JTAG, etc.) to perform a test of connections, and/or paths, and/or circuits, etc. For example, in FIG. 2B the initial state before testing switch 2 is closed (e.g. default position, start-up position, etc.) on each memory chip. For example, in FIG. 22-2B the initial state before testing switch 1 is closed (e.g. default position, start-up position, etc.) on each memory chip. For example, in FIG. 22-2B the logic chip may apply (e.g. transmit, etc.) a first test signal to bus B6 22-268. The first test signal may be transmitted (e.g. coupled, connected, passed, etc.) through bus B6, through switch 2 (which is closed) on memory chip 1, to circuit 1 on memory chip 1.

Circuit 1 on memory chip 1 may respond to the first test signal and transmit a response (e.g. success indication, acknowledge, ACK, etc.) to the logic chip on bus B2. The correct reception of the response may allow the logic chip to determine that one or more electrical paths (e.g. logic chip to memory chip 1, to switch 1 on memory chip 1, to circuit 1 on memory chip 1) may be complete (e.g. conductive, good, operational, logically conducting, logically coupled, etc.).

In FIG. 22-2B the logic chip may apply the first test signal (e.g. the same type of test signal as applied to bus B6) to bus B3 22-262. Of course the first test signal applied to each bus may be of a different (e.g. unique, coded, labeled, etc.) type (e.g. in order to distinguish test modes; distinguish test signals; operate with shared, fully shared, or partially shared buses; etc.). Thus in one embodiment, one or more first test signals may be used. The first test signal applied to bus B3 may be transmitted through bus B3 but, as shown in FIG. 22-2B, the connection between bus B3 and memory chip 4 may be broken (e.g. open TSV or some other fault, etc.).

Circuit 1 on memory chip 1 may not respond to the first test signal and thus circuit 1 on memory chip 1 may not transmit a response (or may transmit a failure indication, timeout, negative acknowledge, NACK, NAK, if otherwise instructed that a test is in progress, etc.) to the logic chip on bus B2. The missing response, failure response, or otherwise incorrect reception of the response may allow the logic chip to determine that one or more electrical paths may be faulty (e.g. non-conductive, bad, non-operational, logically non-conducting, not logically coupled, etc.).

In FIG. 22-2B the logic chip may now apply a second test signal to bus B6 that may affect the opening of switch 1 on memory chip 1 (e.g. by using circuit 1 on memory chip 1 or by using other circuit or circuits not shown, etc.). Similarly by using bus B5 the logic chip may open switch 1 on memory chip 2. Similarly by using bus B4 the logic chip may open switch 1 on memory chip 3. In FIG. 22-2B the logic chip may apply the second test signal to bus B3.

Also in FIG. 22-2B, because the connection between bus B3 and memory chip 4 is faulty, the switch 1 on memory chip 4 may remain closed. Of course the second test signal applied to each bus may be of a different (e.g. unique, coded, labeled, etc.) type (e.g. in order to distinguish test modes; distinguish test signals; operate with shared, fully shared, or partially shared buses; etc.). In FIG. 22-2B the effect is to connect bus B1 as a replacement for bus B3.

Other variations are possible. In one embodiment the logic chip may use bus B1 (used as a spare bus as a replacement for faulty bus B3) to open switch 2 on memory chip 4. A possible effect may be to isolate one or more faulty components (e.g. circuits, paths, TSVs, etc.) either on or connected to faulty bus B3. In one embodiment the use and function of the first circuit may be modified (e.g. changed, altered, eliminated, etc.). For example, in one embodiment the response to the one or more first test signals may be received on bus B1, potentially eliminating the need for bus B2, etc.

In one embodiment the number, type, function, etc. of spare (e.g. redundant) buses may be modified according to the yield characteristics, process statistics, testing, etc. of circuit components, packages, etc. For example, a failure rate (e.g. yield, etc.) of TSVs may be 0.001 (e.g. one failure per 1000) and a bus system (e.g. a group or collection of related buses, etc.) may require 8 TSVs on each of 8 memory chips (e.g. a total of 64 TSVs required to be functional). Such a bus system may use two spare buses, for example.

In one embodiment spare buses may be used interchangeably between different bus systems. For example a spare bus may be used to replace a broken address bus or a broken data bus.

In one embodiment the redundant connection system may be used with staggered TSVs, zig-zag connections, interposers, RDLs, etc. in order to use identical die for example.

In one embodiment the redundant connection system may be used for stacked chips other than stacked memory chips and logic chips (e.g. stacked memory on a CPU chip, other stacked die assemblies, etc.).

In one embodiment the redundant connection system may be used with connections technologies other than TSVs (e.g. optical, wireless, capacitive, inductive, proximity, etc.).

In one embodiment the redundant connection system may be used with connection technologies other than vertical die stacking (e.g. proximity, flexible substrates, PCB, tape assemblies, etc.).

In one embodiment the redundant connection system may be used with physical and/or electrical platforms other than silicon die (e.g. with packages, package arrays, ball arrays, BGA, LGA, CSP, POP, PIP, modules, submodules, other assemblies, etc.) or including a mix of assembly types (e.g. one or more silicon die with one or more packages, etc.).

In one embodiment a redundant connection system may be used with a shared bus. For example in FIG. 22-2B bus B3 may be a shared bus or partially shared bus (thus B3 may for example replace the functions of buses B3, B4, B5, B6). Suppose initially (or at the beginning of test mode, etc.) all switches 1 are closed and all switches 2 are open (e.g. by default, by programming, by start-up register settings etc.).

In one embodiment, the logic chip may signal (via shared bus B3) all switches 2 to be closed. Suppose the TSV corresponding to the connection between bus B3 and memory chip 4 is open (or the connection otherwise faulty etc.), as shown in FIG. 2B. As TSV on memory chip 4 bus B3 is faulty then switch 2 on memory chip 4 may remain open causing bus B3 to be disconnected from memory chip 4. The logic chip may signal (via shared bus B3) all switches 1 to be opened. As TSV on memory chip 4 bus B3 is faulty then switch 1 on memory chip 4 will remain closed causing the spare bus to be switched in to replace bus B3 for memory chip 4.

As an option, the redundant connection system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the redundant connection system may be implemented in the context of any desired environment.

FIG. 22-2C

Figures 2C, 22:
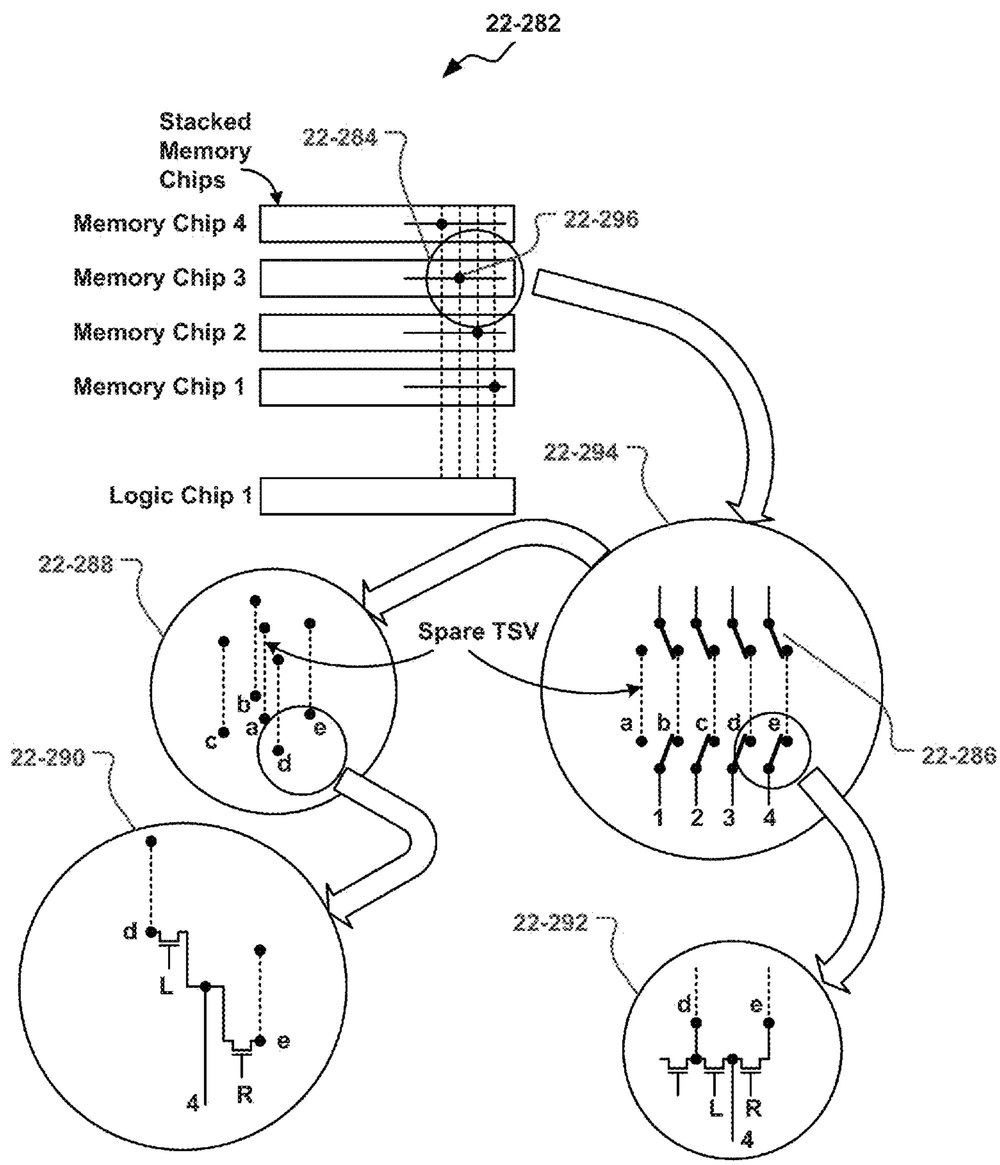
Figures 3, 22:
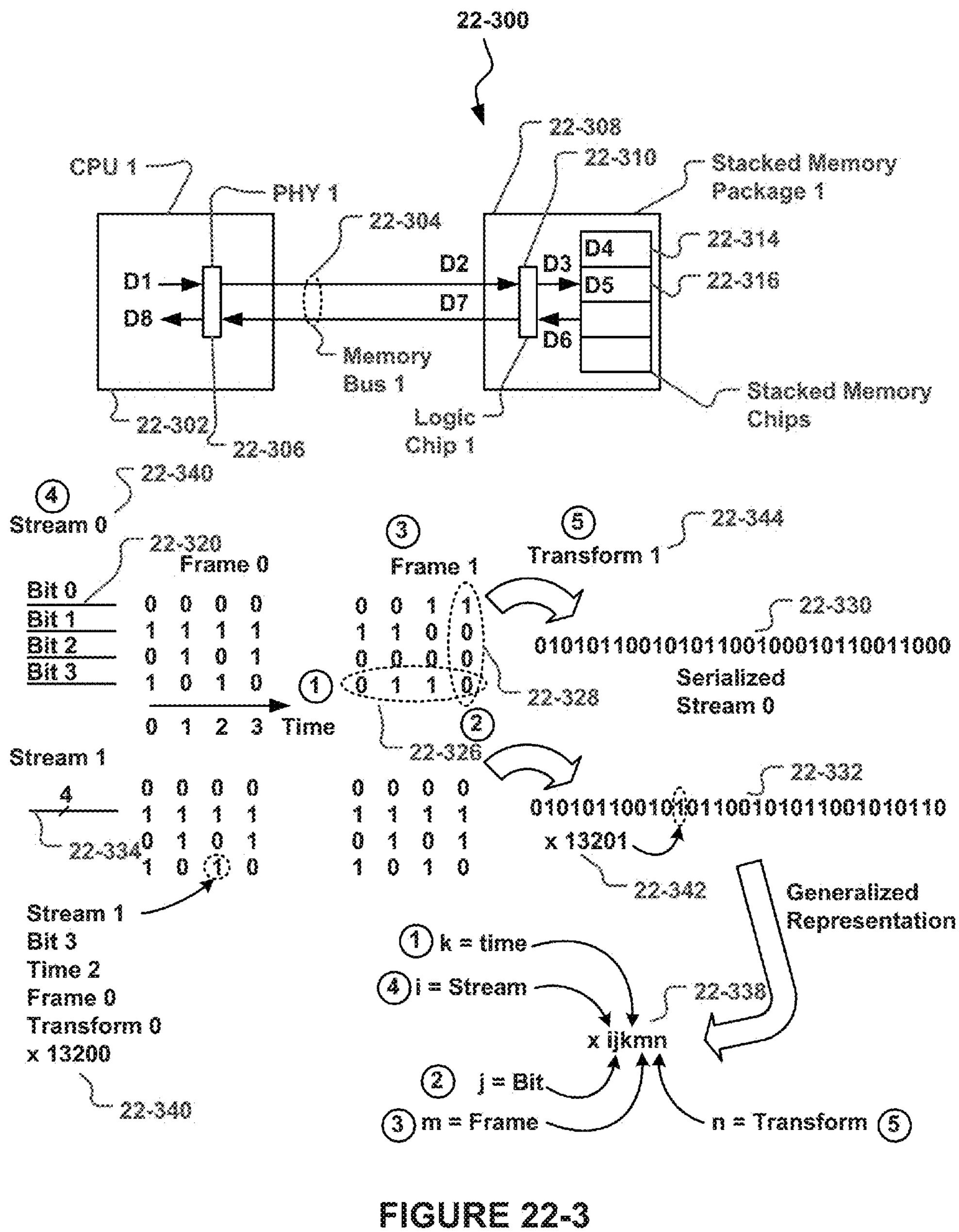
Figures 4, 22:
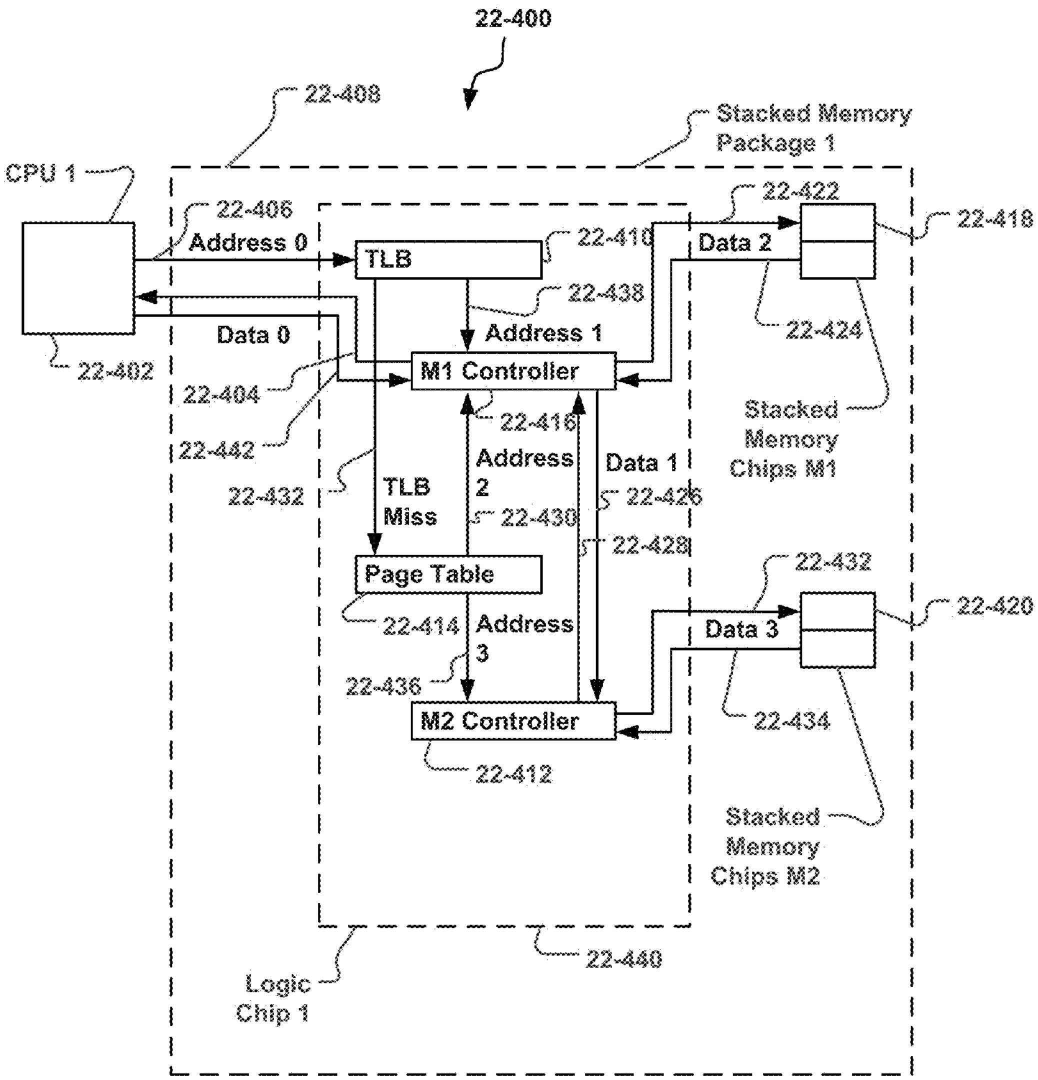
Figures 5, 22:
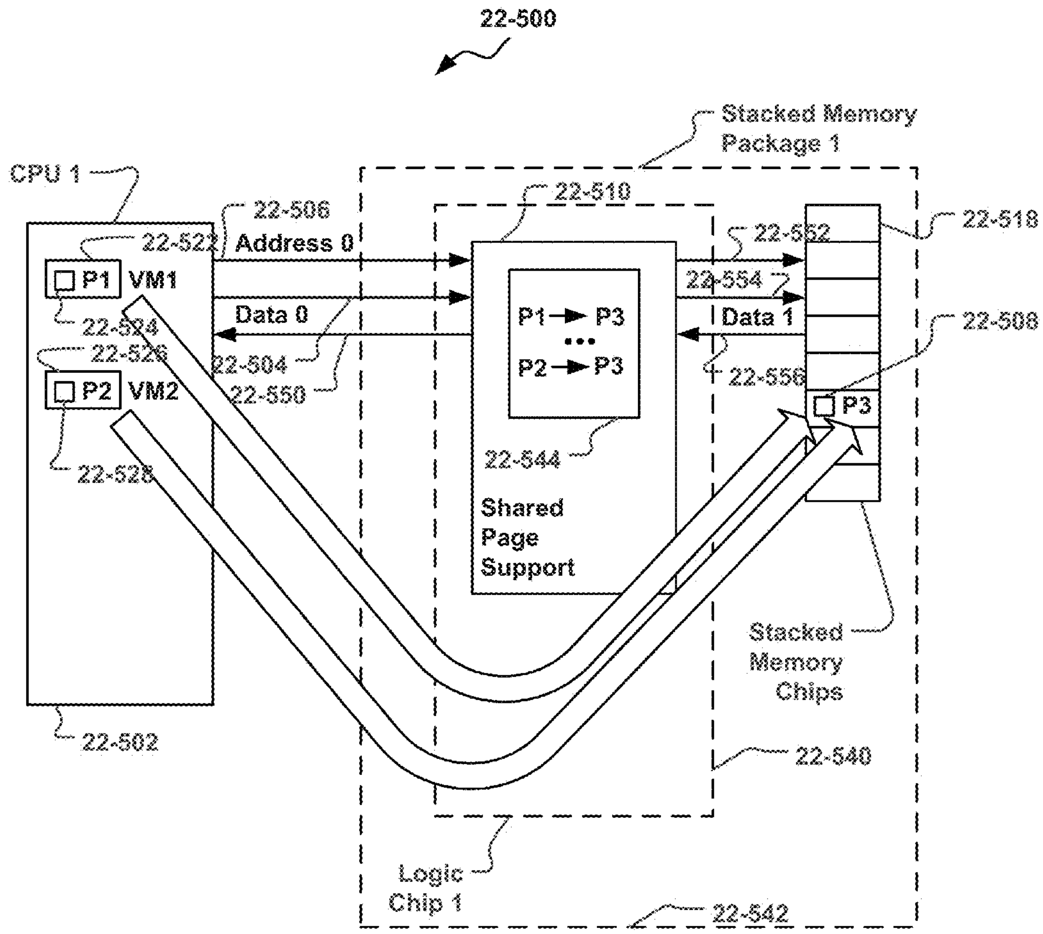
Figures 6, 22:
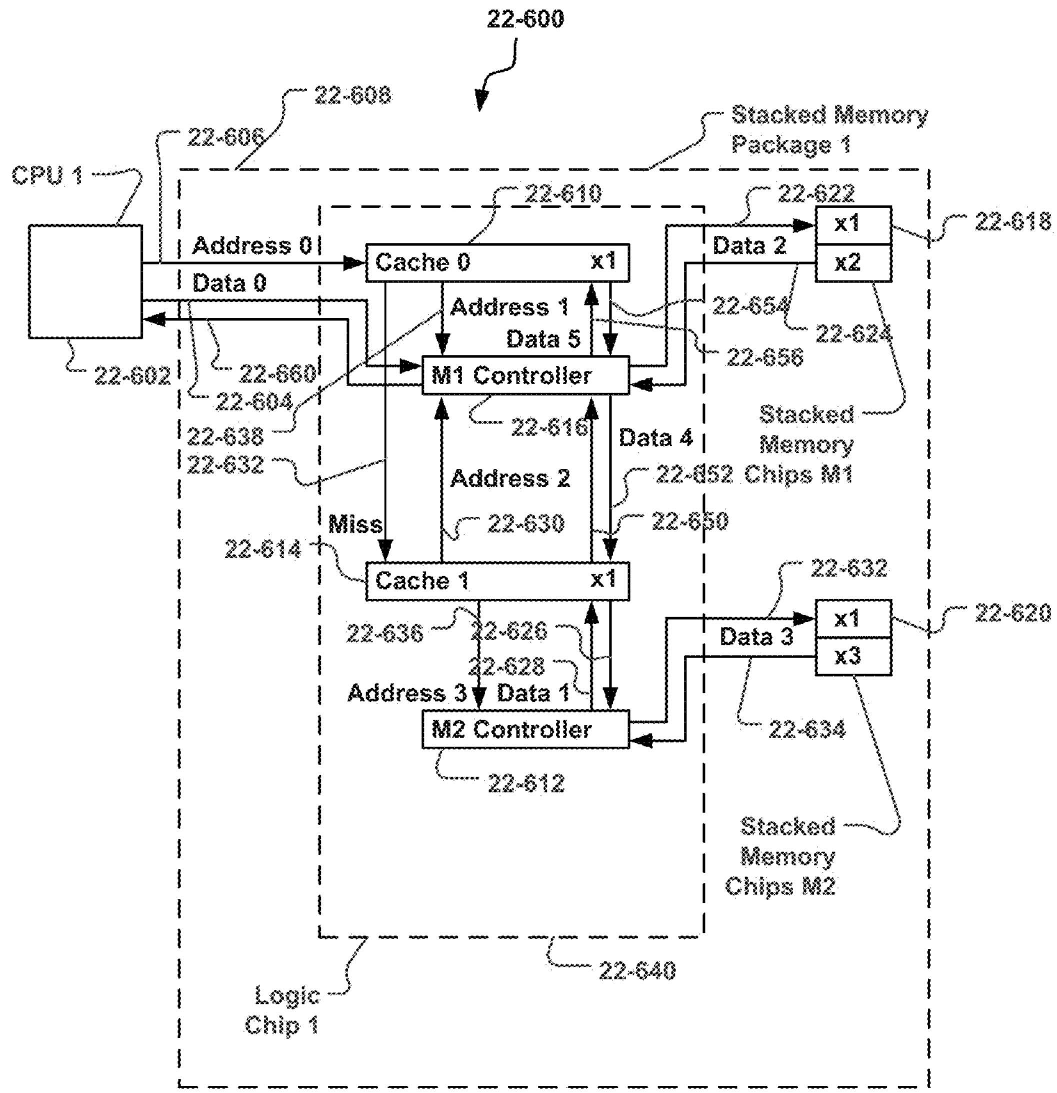
Figures 7, 22:
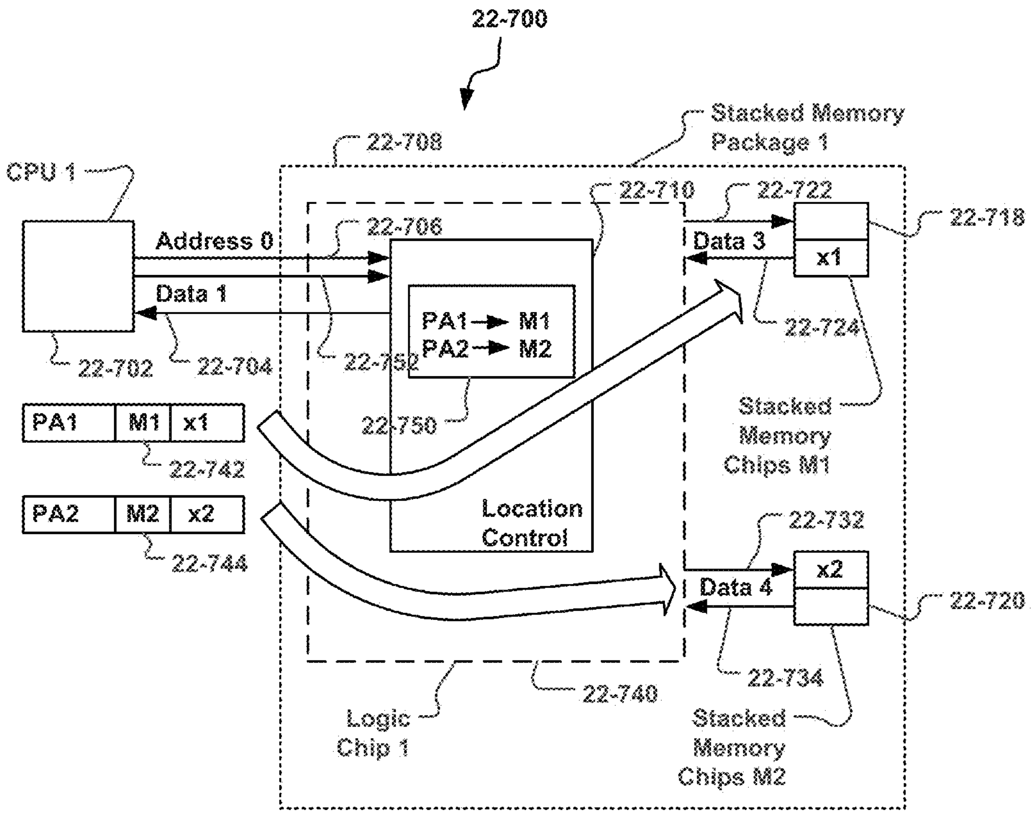
Figures 8, 22:
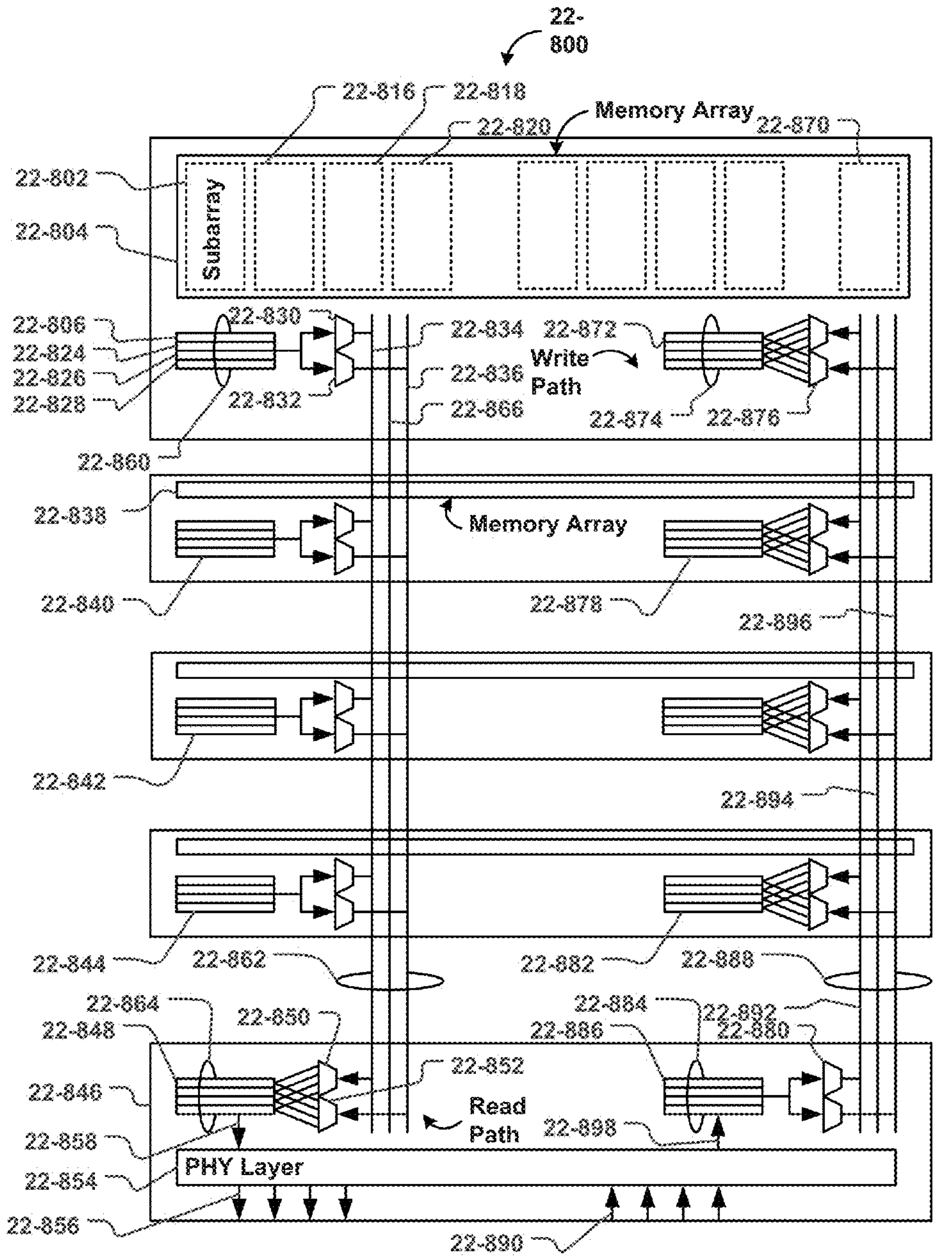
Figures 9, 22:
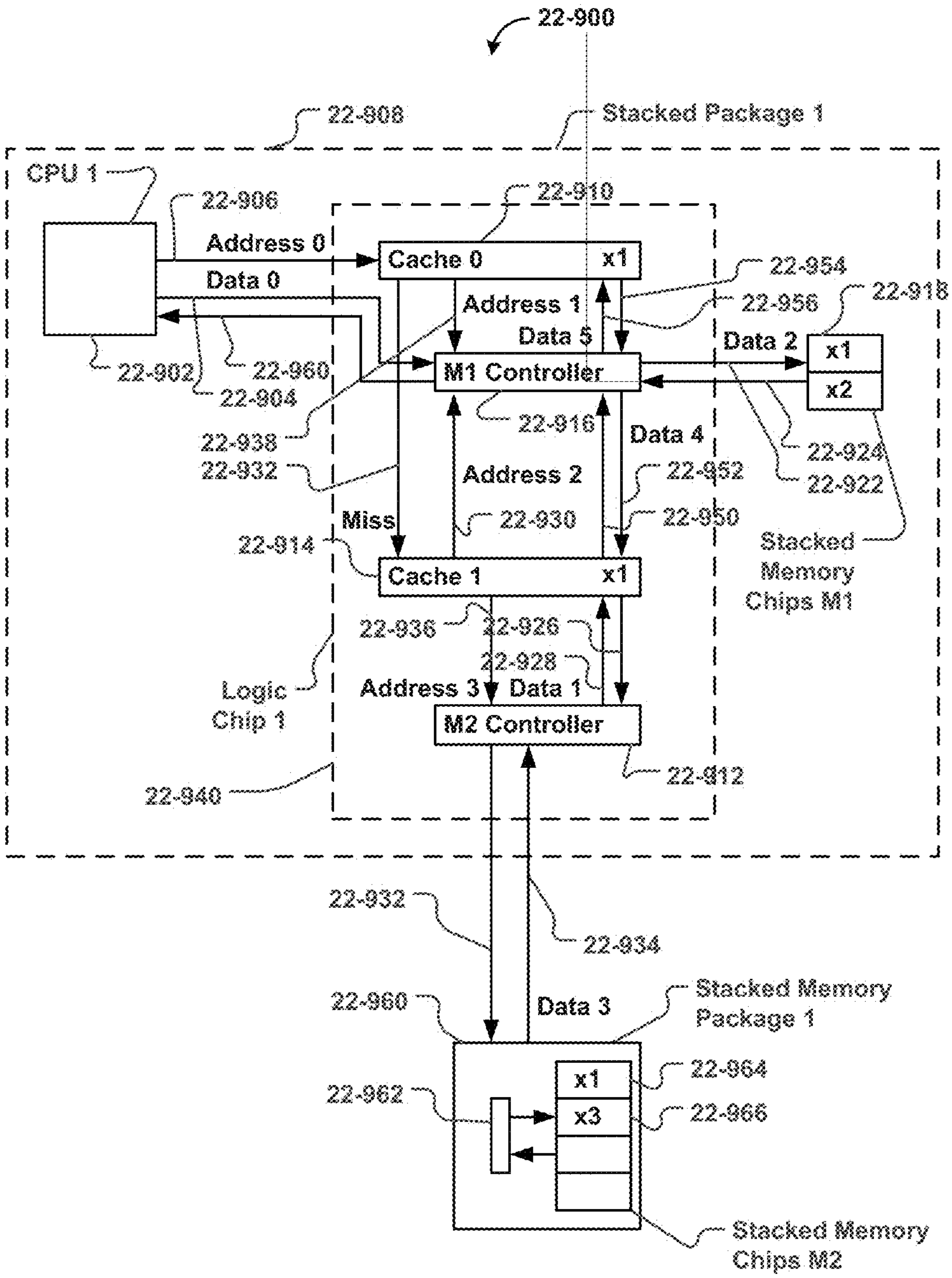
Figures 10, 22:
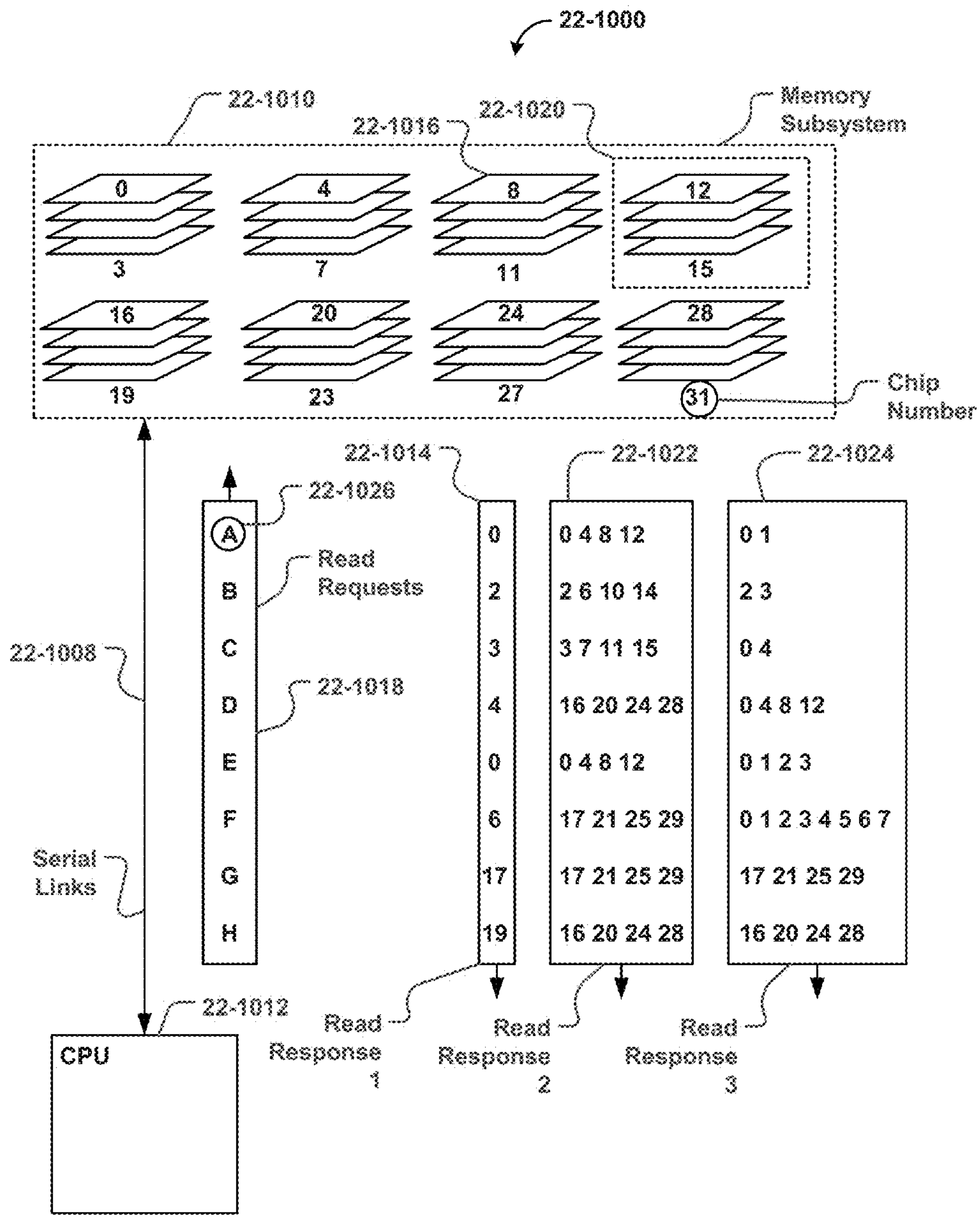
Figures 11, 22:
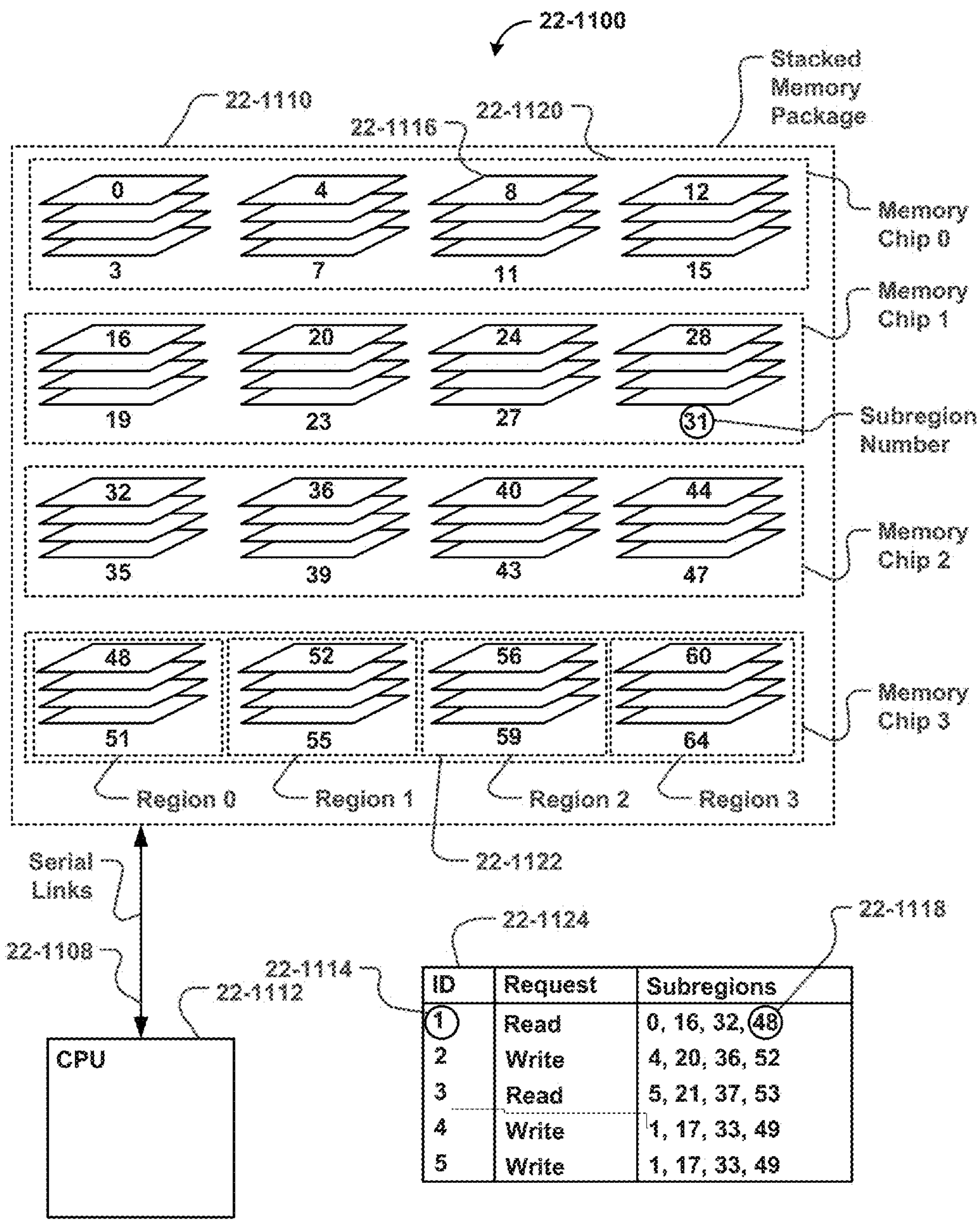
Figures 12, 22:
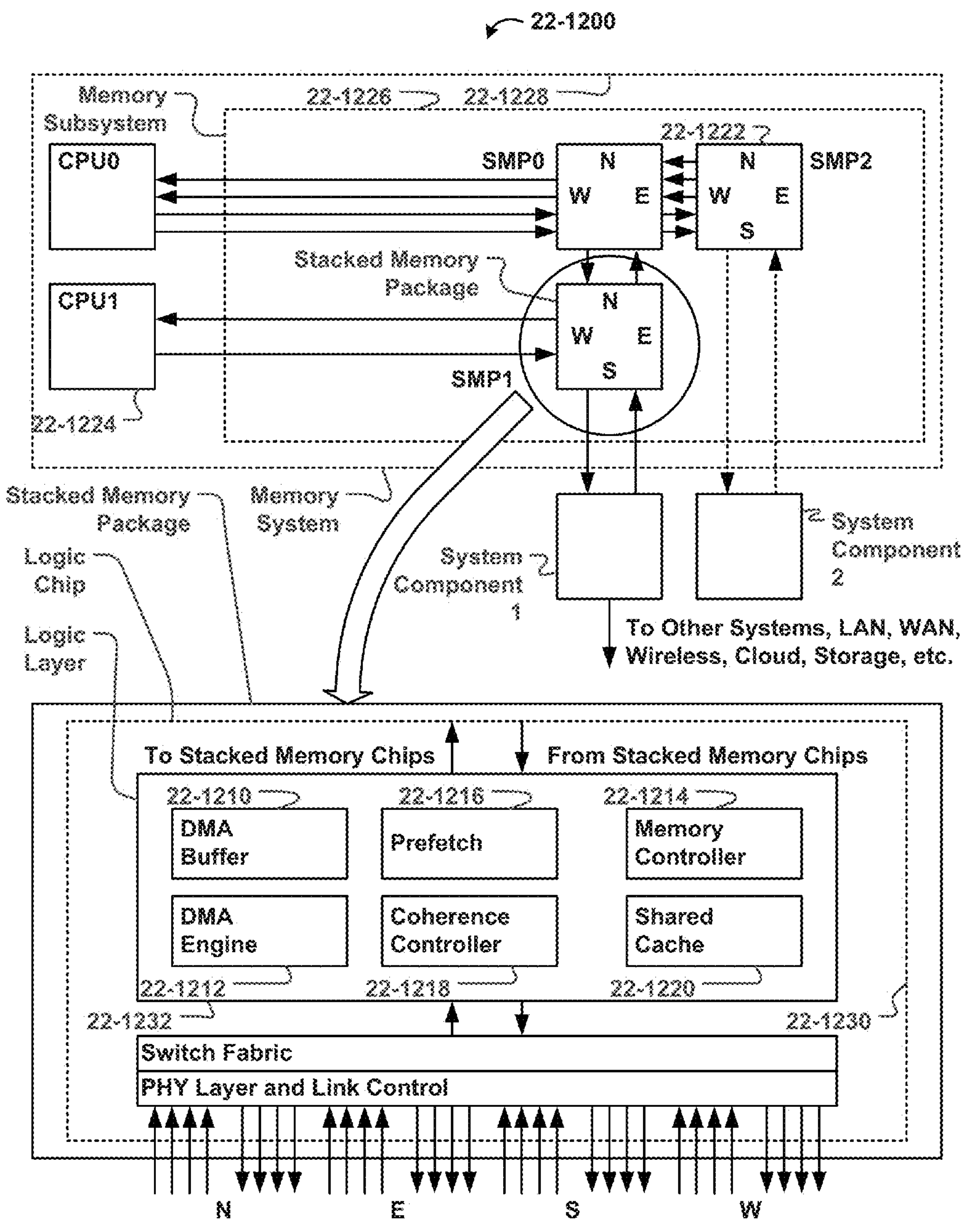
Figures 13, 22:
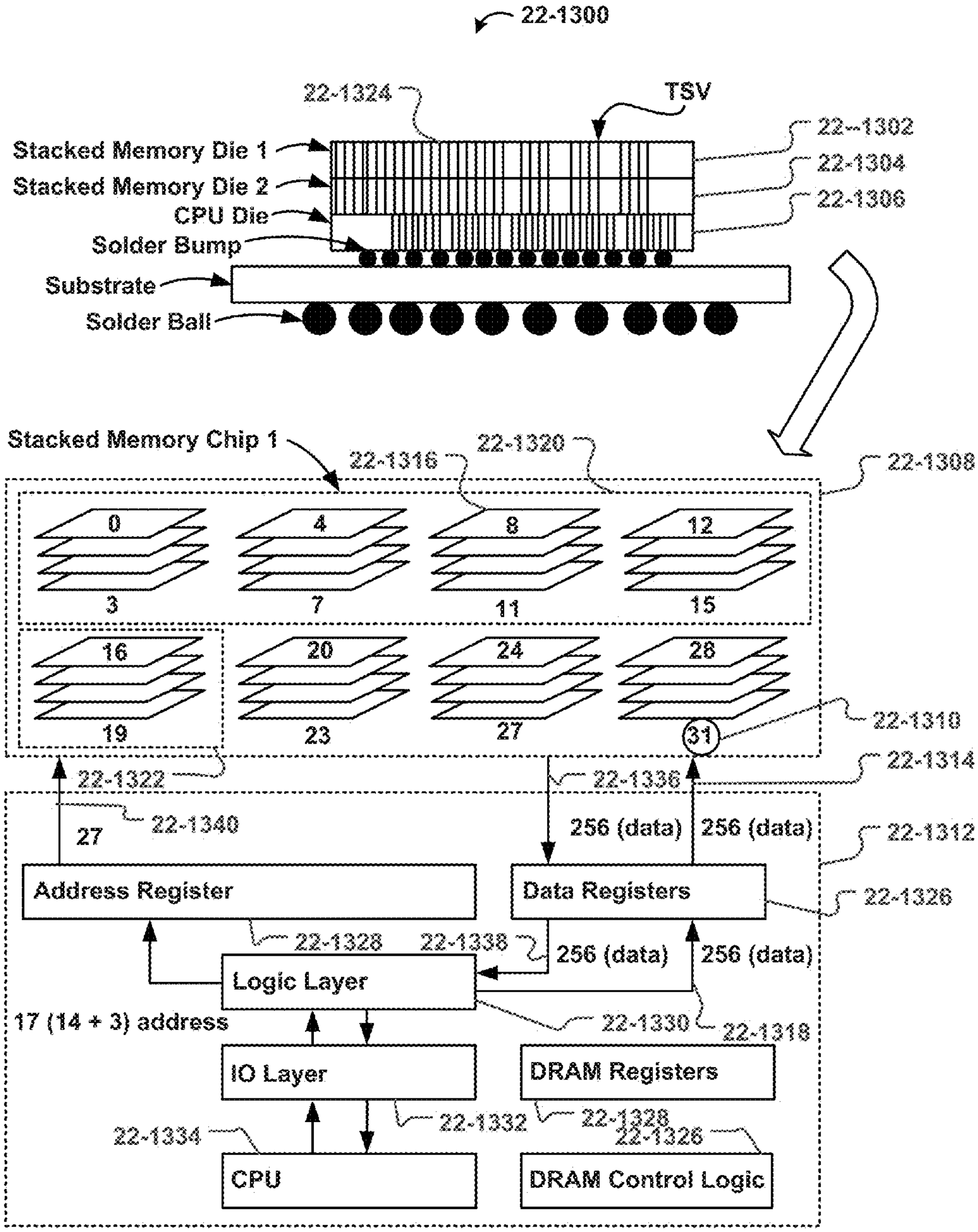

FIG. 22-2C shows a spare connection system, in accordance with another embodiment.

In FIG. 22-2C, the spare connection system 22-282 may comprise one or more stacked die. In FIG. 22-2C, the one or more stacked die may comprise one or more stacked memory chips and one or more logic chips. In FIG. 22-2C four stacked memory chips are shown although any number may be used. In FIG. 22-2C one logic chip is shown although any number may be used. In FIG. 22-2C the one or more stacked die that may comprise one or more stacked memory chips and one or more logic chips may be connected (e.g. coupled, etc.) by one or more columns of TSVs (e.g. TSV bus, pillars, path, buses, wires, connectors, etc.) or by using other connections mechanisms (e.g. optical, proximity, etc.). In FIG. 22-2C a bus (e.g. group of wires, collection of signals, etc.) or part of a bus (e.g. signal on a bus, wire, connection path, etc.) may be represented by a dashed line.

As shown in FIG. 22-2C, view 22-284 (circled) shows 4 TSVs (four dashed lines) that may be part of memory chip 3. In FIG. 22-2C view 22-284, a solid dot (e.g. connection dot, logical dot, etc.) on a bus (e.g. at the intersection of a bus dashed line and chip, etc.) may represent a connection (e.g. electrical connection, physical connection, signal coupling, signal path, logical path, etc.) from that bus to the logic chip (e.g. to one or more circuits on the logic chip, etc.) using a TSV (or multiple TSVs for a collection of connections, etc.) or connection(s) to TSV(s). Each bus may connect (e.g. logically couple, etc.) two or more chips. Thus, in FIG. 22-2C view 22-284, the connection between TSV and memory chip 3 may be represented by connection dot 22-296.

In one embodiment a spare TSV (e.g. redundant TSV, extra TSV, replacement TSV, etc.) may be used to replace a faulty (e.g. broken, open, high resistance, etc.) TSV. For example, in FIG. 22-2C one or more TSVs may act as spare TSVs. In FIG. 22-2C one or more TSVs (or other related connections, paths, circuits, etc.) may be determined (e.g. by test etc.) to be open or otherwise faulty (e.g. a manufacturing failure, process fault, fail to connect, bad connection, logical open, logical short, electrically faulty, broken, mis-aligned, high resistance, stuck, stuck-at fault, open fault, shorted, etc.). In the case that a faulty connection may be replaced using one or more spare TSVs.

In FIG. 22-2C detailed view 22-294 shows how a spare TSV (labeled TSV a, for example) may be used to replace (e.g. repair, substitute for, be swapped for, etc.) a broken connection. In FIG. 22-2C detailed view 22-294 each TSV may be connected to switches 22-286. The bus connections (or lines, wires etc. labeled 1, 2, 3, 4) may be connected to the switches. The switches may be (e.g. perform, be equivalent to, etc.) a single-pole changeover function (single-pole double throw, SPDT, etc.) as shown, but any switch type and/or equivalent logical function to drive the switches may be used. The connections as shown in FIG. 22-2C view 22-294 connect lines 1, 2, 3, 4 through TSVs b, c, d, e. Suppose TSV c fails (or connection related to TSV c fails, etc.) or TSV c (or a connection using or requiring TSV c, etc.) is tested and is faulty, etc. Switches connected to lines 1, 2, 3, 4 may be changed (e.g. configured, altered, switches thrown, etc.) so that line 1 uses TSV a (a connection to the spare TSV, a new connection), line 2 uses TSV b (a changed connection), line 3 uses TSV d (an unchanged connection), line 4 uses TSV e (an unchanged connection). Switches may be controlled by any mechanisms. For example a JTAG test chain may be used to control the switches in one embodiment.

In one embodiment the TSVs may be arranged in a matrix (e.g. pattern, layout, regular arrangement, etc.) to provide connection redundancy. A repeating base cell (e.g. a primitive or Wigner-Seitz cell in a crystal, a tiling pattern, etc. or the like) may be used to construct (e.g. reproduce, generate, etc.) the matrix. For example in FIG. 22-2C view 22-288 a base cell of 5 TSVs is shown. For example the center column (e.g. center position, center structure, etc.) in the base cell may be used as the spare TSV (shown labeled as TSV a in FIG. 22-2C view 22-288).

In a large system using stacked die (e.g. a stacked memory package, one or more groups of stacked memory packages, etc.) there may be many thousands or more TSVs. The TSVs may be arranged in a matrix (e.g. lattice, regular die layout, regular XY spacing, grid arrangement, etc.) for example to simplify manufacturing and improve yield, as an option. Different matrix or lattice arrangements may be used to provide different properties (e.g. redundancy, control crosstalk, minimize resistance, minimize parasitic capacitance, etc.).

For example the matrix pattern shown in FIG. 22-2C view 22-288 may be used to provide 20% (1 in 5) connection redundancy. Although the pattern in shown in FIG. 22-2C view 22-288 is 2-dimensional, an embodiment is contemplated wherein a repeating pattern of 5 TSVs with one spare TSV in the center a body-centered base cell (drawing a parallel to a 3-dimensional body-centered cubic or BCC crystal pattern).

Other matrix patterns using base cells with spare TSVs may be used that may follow, for example, regular 2D and 3D structures. For example a 3×3 base cell using 9 TSVs and having 1 spare TSV in the center of the base cell may be called a face-centered base cell (analogous to an FCC crystal), etc. Such an FCC base cell may have 1 in 9 or 11% connection redundancy. The base cell and matrix may be altered to give a required connection redundancy.

The physical layout (e.g. spacing, nearest neighbor, etc.) properties of a TSV matrix may also be designed using (e.g. based on, derived from, etc.) the properties of associated crystals (using sphere packing etc.). Thus for example to minimize inductive crosstalk between TSVs in a TSV matrix the position of the spare TSVs (which may be mostly unused) and relative positions of signal carrying TSVs may be determined based on the spacing of atoms in crystals using similar base cell structures. Thus, for example in one embodiment, a base cell may use a hexagonal close packed structure (HCP) with 6 TSVs surrounding a spare TSV in a hexagonal pattern.

Rather than use the 3D Bravais lattice structures (e.g. BCC, FCC, HCP, etc.), one embodiment may employ one of the five 2D lattice structures: (1) rhombic lattice (also centered rectangular lattice, isosceles triangular lattice) with symmetry (using wallpaper group notation) cmm and using evenly spaced rows of evenly spaced points, with the rows alternatingly shifted one half spacing (e.g. symmetrically staggered rows); (2) hexagonal lattice (also equilateral triangular lattice) with symmetry p6m; (3) square lattice with symmetry p4m; (4) rectangular lattice (also primitive rectangular lattice) with symmetry pmm; (5) a parallelogram lattice (also oblique lattice) with symmetry p2 (asymmetrically staggered rows). The number and positions of spare TSVs may be varied in each of these lattices or patterns for example to give the level of redundancy required, and/or electrical properties required, etc.

In one embodiment one or more chains of switches may be used to link (e.g. join, couple, logically connect, etc.) connections in order to provide connection redundancy. For example FIG. 22-2C view 22-292 shows a detailed view of a possible implementation of the SPDT switches 22-286 shown in FIG. 22-2C view 22-294. In FIG. 22-2C view 22-292 the switches may be implemented as a chain (e.g. string, line, collection of links, etc.) of MOS devices. For example, in FIG. 22-2C view 22-292, if line 4 is to be connected to TSV d then signal L may be asserted. For example, in FIG. 22-2C view 22-292, if line 4 is to be connected to TSV e then signal R may be asserted. Of course any type and number of devices may be used as a switch or switches to program the connections (e.g. nMOS, pMOS, fuse(s), passive device(s), active device(s), transistor(s), mechanical switch, optical switch, transmission gate, etc.) and drive or assert signals such as L and R. In FIG. 22-2C, a single link in the chain may be viewed as the two devices (with gate connections L and R) connected to line 4 and to TSVs d and e in FIG. 22-2C view 22-292, but a link may have any number of devices etc.

In one embodiment the links and chains may be arranged to optimize one or more of: parasitic capacitance, parasitic resistance, signal crosstalk, layout area, layout complexity. For example in FIG. 22-2C view 22-290 one link in a chain of switches is shown between TSV e and TSV d. One possible chain of links could be a, b, c, d, e. This chain a, b, c, d, e may be a linear chain of 4 links (e.g. link 1 connects TSV a to TSV b, link 2 connects TSV b to TSV c, link 3 connects TSV c to TSV d, link 4 connects TSV d to TSV e).

Other arrangements of chains and links are possible that may optimize one or more properties of the connections. For example, one embodiment may increase connectivity over a simple linear chain. In one option n TSVs may use up to $n(n-1)/2$ links in a fully connected network. In one option a star, cross, mesh, or combinations of these and/or other networks or patterns of chains and links may be used.

For example in FIG. 22-2C view 22-288, an embodiment is shown that uses link 1 to connect TSV a to TSV b, link 2 to connect TSV a to TSV c, link 3 to connect TSV a to TSV d, link 4 to connect TSV a to TSV e. Such a link pattern may, for example, reduce the parasitic loading on TSVs b, c, d, e with respect to the loading on the spare TSV a. For example if TSV a (with associated larger parasitic capacitance than other TSVs) needs to be used as a spare then bus frequency may be changed or some other reconfiguration performed to adjust the system properties accordingly.

Other such similar patterns of links and chains may be used to tailor connectivity, level of redundancy, layout complexity, electrical properties (e.g. parasitic elements, etc.), and other factors. As a result of using spare TSVs, and/or spare connections and/or other spare components the system may be reconfigured and/or adapted as and if necessary as described elsewhere herein in this specification, and, for example, FIG. 2 of U.S. Provisional Application No. 61/602,034, filed Feb. 22, 2012 which is formally incorporated herein by reference hereinbelow and hereinafter referenced as "61/602,034", FIG. 13 in 61/602,034, FIG. 5 of U.S. Provisional Application No. 61/585,640, filed Jan. 31, 2012 which is formally incorporated herein by reference hereinbelow and hereinafter referenced as "61/585,640", FIG. 8 of 61/585,640, FIG. 14 of 61/585,640, FIG. 20 of 61/585,640, FIG. 21 of 61/585,640, FIG. 2 of U.S. Provisional Application No. 61/580,300, filed Dec. 26, 2011 which is formally incorporated herein by reference hereinbelow and hereinafter referenced as "61/580,300", FIG. 15 of 61/580,300, FIG. 10 of U.S. Provisional Application No. 61/569,107, filed Dec. 9, 2011 which is formally incorporated herein by reference hereinbelow and hereinafter referenced as "61/569,107", FIG. 14 of 61/569,107, FIG. 16 of 61/569,107, FIG. 43 of U.S. Provisional Application No. 61/472,558, filed Apr. 6, 2011 which is formally incorporated herein by reference hereinbelow and hereinafter referenced as "61/472,558", as well as (but not limited to) the accompanying text descriptions of these figures.

As an option, the spare connection system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the spare connection system may be implemented in the context of any desired environment.

FIG. 22-3

FIG. 22-3 shows a coding and transform system, in accordance with another embodiment. The coding and transform system may be used, for example, to minimize power, minimize crosstalk and other types of signal interference, maximize operating speeds, provide memory protection, and other functions as described herein.

In FIG. 22-3, the coding and transform system 22-300 may comprise a system that may comprise one or more CPUs 22-302 and one or more stacked memory packages 22-308. In FIG. 22-3 the CPU may be connected to the stacked memory package using memory bus 22-304. In FIG. 22-3 one CPU is shown, but any number may be used. In FIG. 22-3 one stacked memory package is shown, but any number may be used. In FIG. 22-3 one memory bus is shown, but any number may be used.

Also in FIG. 22-3 the stacked memory package may comprise one or more stacked memory chips and one or more logic chips. In FIG. 22-3 one logic chip is shown, but any number may be used. In FIG. 22-3 four stacked memory chips are shown, but any number may be used.

With continued reference to FIG. 22-3 the signals originating from the CPU are shown as D1. These signals D1 may be bus encoded (e.g. 16-bit bus, 64-bit bus, etc.), combinations (e.g. groups, bundles, etc.) of signals, serial signals, packets, or combinations of these, etc. The signals D1 may be address signals, control, signals, data signals, or combinations of these and/or any other signals.

In use, the signals D1 may be transmitted to (e.g. towards, etc.) the memory system that may comprise one or more stacked memory packages for example. In FIG. 22-3, the signals D1 may be connected to a PHY, PHY 1 22-306, that may transmit signals D1 over one or more high-speed serial links for example. In FIG. 22-3 the PHY 1 may change (e.g. transform, code, encode, encrypt, cipher, otherwise manipulate, etc.) signals D1 from one form (e.g. parallel bus, etc.) to another form in signals D2. The logic chip may transform signals D2 to signals D3. The stacked memory packages may transform signals D3 to signals D4 and signals D5.

In FIG. 22-3 the signals D1, D2, D3, D4, D5 may comprise the write path (for data and address) and the address path for read. The data path for read may comprise the signals D6, D7 and D8. In FIG. 22-3 the signals D2 for example may be in different forms for address, data, and control etc. though one form has been shown for simplicity. Thus a group of signals, shown as D1 etc., does not necessarily mean that all signals in that group are encoded etc. in the same way (e.g. using the same transform, same coding, same representation, same transmission method, etc.).

In one embodiment the coding may be used to provide security in a memory system. In FIG. 22-3 the memory chips are shown as transforming (or encoding, coding, etc.) signals D3 to signals D4 and signals D5. In one embodiment the logic chip may perform the coding.

In one embodiment the logic chip and one or more stacked memory chips may perform the encoding. In one embodiment the CPU may perform the encoding. In one embodiment one or more of the following may perform the encoding: CPU(s), stacked memory chip(s), logic chip(s), software, etc. In FIG. 22-3 the stacked memory chip 22-314 is shown as storing encoded signals D4. In FIG. 22-3 the stacked memory chip 316 is shown as storing encoded signals D5.

In one embodiment each stacked memory chip may use a different encoding (e.g. using different algorithm, different cipher key, etc.). For example encoding may be used as a protection mechanism (e.g. for security, anti-hacking, privacy, etc.). A first process in CPU 1 may access memory chip 22-314 and may be able to read (e.g. decode, access, etc.) signals D4 (e.g. by hardware in logic chip, in the CPU, or software, or using a combination of these etc.) stored in memory chip 22-314. For example, the first process (thread, program, etc.) in CPU 1 may try to incorrectly (e.g. by sabotage, by virus, by program error, etc.) attempt to access memory chip 22-316 when the first process is only authorized (e.g. allowed, permitted, enabled, etc.) to access memory chip 22-314. The data content (e.g. information, pages, bits, etc.) stored in memory chip 22-316 may be encoded as signals D5 which may be unreadable by the first process. Of course in one embodiment coded signals may be stored in any region (e.g. portion, portions, section, slice, bank, rank, echelon, chip or chips, etc.) of one or more stacked memory chips. In one embodiment, the type of coding, the size of the coded regions, keys used, etc. may be changed under program control, by the CPU(s), by the logic chip(s), by the stacked memory package(s), or by combinations of these etc.

In one embodiment the encoding may be used to minimize signal interference. For example in FIG. 22-3 signals D1 may comprise one or more streams (e.g. bitstreams, message streams, signal streams, etc.). For example in FIG. 22-3 signals D1 may comprise a data bus. As shown in FIG. 22-3 the stream D1 may comprise stream 0 and stream 1. In FIG. 22-3 stream 0 may comprise a 4-bit bus comprising bit 0, bit 1, bit 2, bit 3. In FIG. 3 stream 1 may comprise a 4-bit bus comprising bit 0, bit 1, bit 2, bit 3. In FIG. 22-3 stream 0 conveys 16 bits of information in a single frame. In FIG. 22-3 frame 0 of stream 0 comprises bits 0101 at time 0, bits 0110 at time 1, bits 0101 at time 2, bits 0110 at time 3. In FIG. 22-3 stream 1 conveys 16 bits of information in a single frame. In FIG. 22-3 frame 1 of stream 0 comprises bits 0100 at time 0, bits 0101 at time 1, bits 1001 at time 2, bits 1000 at time 3.

Signals D1 may be transformed for example to signals D2 for transmission over one or more high-speed serial links. For example in FIG. 22-3 signals D1 are transformed to signals D2. In FIG. 22-3 parallel stream 0 and parallel stream 1 are transformed to two serial streams. In FIG. 22-3 each bit is transformed in succession, then each time, then each frame. In FIG. 22-3 the data content in a stream may be represented by xijkmn, where i is the stream, j is the bit, k is the time, m is the frame, n is the transform. Thus for example in FIG. 22-3 x 13200 corresponds to stream 1, bit 3, time 2, frame 0, transform 1 and is transformed into x13201 in the serial stream (twelfth bit position in serial stream 1). Other types of transformation from parallel (bus) representations to serial (bus) representations are possible.

In one embodiment signals D1 may be encoded to minimize signal interference on the bus(es) carrying signals D1. For example signals D1 may be encoded to minimize the number of bit transitions (e.g. number of signals that change from 0 to 1, or that change from 1 to 0) from time 0 to time 1, etc. Such encoding may, for example, minimize transitions between x ijkmn and x ij(k−1)mn.

In one embodiment signals D1 may be encoded to minimize signal interference on the bus(es) carrying signals D2. For example in FIG. 22-3, signals D1 may be coded as (transform 0, parallel bus and signals D2 coded as transform 1, serial bus. In order to minimize signal interference on the bus(es) carrying signals D2 (e.g. high-speed serial links, etc.), one embodiment may minimize transitions between x ijkmn and x i(j+1)kmn. Thus, in order to minimize interference on signals D2 bus (e.g. memory bus 22-304, etc.) various embodiments may encode signals D1 to minimize transitions between x ijkmn and x i(j+1)kmn.

In one embodiment signals D1 and D2 may be encoded to jointly minimize interference on buses carrying signals D1 and D2. Thus, for example, coding D1 may be selected to jointly minimize transitions between x ijkmn and x i(j+1)(k+1)mn. This may act to simplify the PHY 1 logic (and thus increase the speed, reduce the power, decrease the silicon area, etc.) that performs the transform from D1 to D2.

Of course such joint optimization may be applied across any combination (including all) signal transforms present in a system. For example optimization may be performed across signals D1, D2, D3; or across signals D6, D7, D8; or across signals D1, D2, D3, D4, etc.

Of course such optimizations may be performed for reasons other than minimizing signal interference. For example in one embodiment data stored in one or more stacked memory chips may need to be protected (e.g. using ECC or some other data parity or data protection coding scheme, etc.). For example optimizing the coding D1, D2, D3 or optimizing the transforms D1 to D2, D2 to D3, D3 to D4, etc. may optimize data protection, and/or minimize power consumed by the memory system, and/or minimize logic complexity (e.g. in the CPU, in the logic chip, in the stacked memory chip(s), etc.), and/or optimize one or more other aspects of system performance.

As an option, the coding and transform system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the coding and transform system may be implemented in the context of any desired environment.

FIG. 22-4

FIG. 22-4 shows a paging system, in accordance with another embodiment.

In FIG. 22-4, the paging system 22-400 may comprise a system that may comprise one or more CPUs 22-402 and one or more stacked memory packages 22-408. In FIG. 22-4 one CPU is shown, but any number may be used. In FIG. 22-4 one stacked memory package is shown, but any number may be used. In FIG. 22-4 the stacked memory package may comprise one or more stacked memory chips 22-418 of type M1, one or more memory chips 22-420 of type M2, and one or more logic chips 22-440. In FIG. 22-4 one logic chip is shown, but any number may be used. In FIG. 22-4 four stacked memory chips are shown, but any number of any number of types may be used.

In one embodiment the logic chip 1 may comprise a paging system (e.g. demand paging system, etc.). In FIG. 22-4 the paging system may comprise (but is not limited to) the following paging system components: a translation lookaside buffer (TLB) 22-410, an M1 controller 22-416, a page table 22-414, an M2 controller 22-412. The paging system components may be coupled by the following components (but are not limited to): address 0 bus 22-406, data 0 bus (read) 22-404, data 0 bus (write) 22-442, TLB miss 22-432, address 1 bus 22-438, address 2 bus 22-430, address 3 bus 22-436, data 1 bus (to m1 controller) 22-428, data 1 bus (to m2 controller) 22-426, data 2 bus (read) 22-424, data 2 bus (write) 22-422, data 3 bus (read) 22-434, data 3 bus (write) 22-432.

In one embodiment the pages may be stored in one or more stacked memory chips of type M2. For example memory type M1 may be DRAM and memory type M2 may be NAND flash. Of course any type of memory may be used, in different embodiments.

Of course the TLB and/or page table and/or other logic/data structures, etc. may be stored on the logic chip (e.g. as embedded DRAM, eDRAM, SRAM, etc.) and/or any portions or portions of one or more stacked memory chips (of any type). Thus for example all or part of the page table may be stored in one or more stacked memory chips of type M1 (which may for example be fast access DRAM).

As an option, the paging system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the paging system may be implemented in the context of any desired environment.

FIG. 22-5

FIG. 22-5 shows a shared page system, in accordance with another embodiment.

In FIG. 22-5, the shared page system 22-500 may comprise a system that may comprise one or more CPUs 22-502 and one or more stacked memory packages 22-542. In FIG. 22-5 one CPU is shown, but any number may be used. In FIG. 22-5 one stacked memory package is shown, but any number may be used. In FIG. 22-5 the stacked memory package may comprise one or more stacked memory chips 22-518 and one or more logic chips 22-540. In FIG. 22-5 one logic chip is shown, but any number may be used. In FIG. 22-5 eight stacked memory chips are shown, but any number of any number of types may be used.

In FIG. 22-5 the CPU may execute (e.g. run, contain, etc.) one or more virtual machines (VMs). Each VM may access one or more memory pages. The memory pages may be stored in the system memory using one or more stacked memory chips in one or more stacked memory packages.

In one embodiment the shared page system may be operable to share pages between one or more virtual machines. For example in FIG. 22-5 CPU 1 may contain two VMs: VM1 22-522 and VM2 22-526. Each VM may have access to its own memory pages. For example VM1 may access memory page P1 22-524 and VM2 may access memory page P2 22-528. Memory page P1 and memory page P2 may be identical (or nearly identical etc.). For example P1 and P2 may be part of a common OS (e.g. Windows Server, Linux, etc.) being run on both VMs. In FIG. 22-5 data stored in one or more stacked memory chips as memory page P3 may be shared by VM1 and VM2.

In one embodiment the logic chip in a stacked memory package may be operable to share memory pages. For example, in FIG. 22-5 the logic chip may contain and maintain (e.g. create, update, modify, alter, etc.) a map 22-544 (e.g. table, data structure, logic structure, etc.) as part of shared page support logic 22-540. In FIG. 22-5 the map may contain links between VM memory pages (e.g. P1, P2, etc.) and the locations, status (e.g. dirty, etc.), modifications, changes, of the shared memory page(s) (e.g. P3 etc.).

As an option, the shared page system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the shared page system may be implemented in the context of any desired environment.

FIG. 22-6

FIG. 22-6 shows a hybrid memory cache, in accordance with another embodiment.

In FIG. 22-6, the hybrid memory cache 22-600 may comprise a system that may comprise one or more CPUs 22-602 and one or more stacked memory packages 22-608. In FIG. 22-6 one CPU is shown, but any number may be used. In FIG. 22-6 one stacked memory package is shown, but any number may be used. In FIG. 22-6 the stacked memory package may comprise one or more stacked memory chips 22-618 of type M1, one or more memory chips 22-620 of type M2, and one or more logic chips 22-640. In FIG. 22-6 one logic chip is shown, but any number may be used. In FIG. 22-6 four stacked memory chips are shown, but any number of any number of types may be used.

In one embodiment the logic chip 1 may be operable to perform one or more cache functions for one or more types of stacked memory chips. In FIG. 22-6 the cache system may comprise (but is not limited to) the following cache system components: a cache 0 22-610, an M1 controller 22-616, a cache 1 22-614, an M2 controller 22-612. The cache system components may be coupled by the following components (but are not limited to): address 0 bus 22-606, data 0 bus (read) 22-604, data 0 bus (write) 22-660, miss 22-632, address 1 bus 22-638, address 2 bus 22-630, address 3 bus 22-636, data 4 bus (to m1 controller) 22-650, data 1 bus (to m2 controller) 22-652, data 2 bus (read) 22-624, data 2 bus (write) 22-622, data 3 bus (read) 22-634, data 3 bus (write) 22-632.

In one embodiment memory type M1 may be DRAM and memory type M2 may be NAND flash. Of course any type of memory may be used, in different embodiments.

Of course the cache structures (cache 0, cache 1, etc.) and/or other logic/data structures, etc. may be stored on the logic chip (e.g. as embedded DRAM, eDRAM, SRAM, etc.) and/or any portions or portions of one or more stacked memory chips (of any type). Thus for example all or part of the cache 1 structure(s) may be stored in one or more stacked memory chips of type M1 (which may for example be fast access DRAM).

As an option, the hybrid memory cache may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the hybrid memory cache may be implemented in the context of any desired environment.

FIG. 22-7

FIG. 22-7 shows a memory location control system, in accordance with another embodiment.

In FIG. 22-7, the memory location control system 22-700 may comprise a system that may comprise one or more CPUs 22-702 and one or more stacked memory packages 22-708. In FIG. 22-6 one CPU is shown, but any number may be used. In FIG. 22-7 one stacked memory package is shown, but any number may be used. In FIG. 22-7 the stacked memory package may comprise one or more stacked memory chips 22-718 of type M1, one or more memory chips 22-720 of type M2, and one or more logic chips 22-740. In FIG. 22-7 one logic chip is shown, but any number may be used. In FIG. 22-7 four stacked memory chips are shown, but any number of any number of types may be used.

In one embodiment the logic chip 1 may be operable to perform one or more memory location control functions for one or more types of stacked memory chips. In FIG. 22-7 for example the CPU may issue a write request 22-742 that may contain (but is not limited to) physical address PA1, memory type M1, data x1. In FIG. 22-7 the logic chip 1 may maintain a map 22-750 that associates physical address PA1 with memory type M1. In FIG. 22-7 data x1 may be stored in one or more portions of one or more memory chips of type M1. In FIG. 22-7 for example the CPU may issue a write request 22-744 that may contain (but is not limited to) physical address PA2, memory type M2, data x2. In FIG. 22-7 data x2 may be stored in one or more portions of one or more memory chips of type M2.

In one embodiment the CPU may issue request that contain only addresses and the logic chip may create and maintain association between memory addresses and memory type.

In one embodiment the stacked memory package may contain two different types (e.g. classes, etc.) of memory. For example type M1 may be relatively small capacity but fast access DRAM and type M2 may be large capacity but relatively slower access NAND flash. The CPU may then request storage in fast (type M1) memory or slow (type M2) memory.

In one embodiment the memory type M1 and memory type M2 may be the same type of memory but handled in different ways. For example memory type M1 may be DRAM that is never put to sleep or powered down etc., while memory type M2 may be DRAM (possibly of the same type as memory M1) that is aggressively power managed etc.

Of course any number and types of memory may be used, in different embodiments.

Memory types may also correspond to a portion or portions of memory. For example memory type M1 may be DRAM that is organized by echelons while memory type M2 is memory (possibly of the same type as memory M1) that does not have echelons, etc.

As an option, the memory location control system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the memory location control system may be implemented in the context of any desired environment.

FIG. 22-8

FIG. 22-8 shows a stacked memory package architecture, in accordance with another embodiment.

In FIG. 22-8, the stacked memory package architecture 22-800 may comprise one or more stacked memory chips (FIG. 22-8 shows four stacked memory chips, but any number may be used) and one or more logic chips (one logic chip is shown in FIG. 22-8, but any number may be used). Each stacked memory chip may comprise one or more memory arrays 22-804 (FIG. 22-8 shows one memory array, but any number may be used). Each memory array may comprise one or more portions. In FIG. 22-8 the memory array may contain 9 subarrays, e.g. subarray 22-802, but any type of portion or number of portions may be used, including a first type of portion within a second type of portion (e.g. nested blocks, nested circuits, nested arrays, nested subarrays, etc.). For example memory array 22-870 may be used a spare or for data protection (e.g. ECC, etc.). For example the memory array portions may comprise one or more banks and the one or more banks may contain one or more subarrays, etc. In one embodiment, the portions or a group of portions etc. may comprise an echelon as described elsewhere herein in this specification, in 61/569,107, 61/580,300, 61/585,640, 61/602,034, all incorporated by reference, and, for example, FIG. 1B of 61/569,107, as well as (but not limited to) the accompanying text descriptions of this figure.

In FIG. 22-8 the connections between stacked memory chips and the logic chip may be described in terms of the read path and the write path. In FIG. 8 the read path and write path are shown as being largely separate between PHY and memory array, but part or portions of the read path and write path may be combined.

In FIG. 22-8, the read path of each stacked memory chip may comprise one or more row buffer sets 22-860 (one row buffer set is shown in FIG. 22-8, but any number of row buffer sets may be used). Each row buffer set may comprise one or more row buffers, e.g. row buffer 22-806. In FIG. 22-8 each row buffer set may comprise 4 row buffers, but any number of row buffers may be used.

For example, in one embodiment, the number of row buffers in a row buffer set may be equal to the number of subarrays in a memory array. In FIG. 8, each stacked memory chip may be connected (e.g. logically connected, coupled, in communication with, etc.) to one or more stacked memory chips and a logic chip using one or more data buses, e.g. read data bus 22-834. In FIG. 22-8 one or more spare buses may be used (e.g. spare bus 22-866). In FIG. 22-8 the read data buses and/or other buses and signals may use TSVs to connect stacked chips, but any connection technology (or technologies) and/or coupling technology (or technologies) may be used to logically couple signals between chips (e.g. optical, wireless, proximity, capacitive coupling, inductive coupling, combinations of these and/or other coupling or interconnect technologies, etc.).

In FIG. 22-8, the read path in each stacked memory chip may further comprise one or more MUXes, e.g. MUX 22-832 that may connect a row buffer to a read data bus. The read path in the logic chip may comprise one or more read FIFOs, e.g. read FIFO 22-848. The read path in the logic chip may further comprise one or more de-MUXes, e.g. de-MUX 22-850, that may connect a read data bus to one or more read FIFOs.

The logic chip may further comprise a PHY layer. The PHY layer may be coupled to the one or more read FIFOs using bus 22-858. The PHY layer may be operable to be coupled to external components (e.g. CPU, one or more stacked memory packages, other system components, etc.) via high-speed serial links, e.g. high-speed serial link 22-856, or other mechanisms (e.g. parallel bus, optical links, etc.).

In FIG. 22-8, the write path of each stacked memory chip may comprise one or more write buffer sets 22-874. In one embodiment the numbers of row buffers in a row buffer set may be equal to the number of write buffers in a write buffer set. For example in FIG. 22-8 there are four row buffers in a row buffer set and there are four write buffers in a write buffer set.

In one embodiment the row buffers and write buffers may be shared (e.g. row buffer 22-806 and write buffer 22-872 may be a single buffer shared for read path and write path, etc.). If the row buffers and write buffers are shared, the number of row buffers and write buffers need not be equal (but the numbers may be equal). In the case the number of row buffers and write buffers are unequal then either some row buffers may not be shared (if there are more moiré row buffers than write buffers for example) or some write buffers may not be shared (if there are more write buffers than row buffers for example).

Alternatively, in one embodiment, a pool of buffers may be used and allocated (e.g. altered, modified, changed, possibly at run time, dynamically allocated, etc.) between the read path and write path (e.g. at configuration (at start-up or at run time, etc.), depending on read/write traffic balance, as a result of failure or fault detection, etc.). In FIG. 22-8, each stacked memory chip may be connected (e.g. logically connected, coupled, in communication with, etc.) to one or more stacked memory chips and a logic chip using one or more data buses, e.g. write data bus 22-892. In FIG. 22-8 one or more spare buses may be used (e.g. spare bus 22-894). In FIG. 22-8 the write data buses and/or other buses and signals may use TSVs to connect stacked memory chips, but any connection technology may be used to logically couple signals between stacked memory chips.

Also in FIG. 22-8, the write path in each stacked memory chip may further comprise one or more de-MUXes, e.g. de-MUX 22-876 that may connect a write data bus to one or more write buffers. The write path in the logic chip may comprise one or more write FIFOs (e.g. write latches, write registers, write queues, etc.), e.g. write FIFO 22-886. The write path in the logic chip may further comprise one or more MUXes, e.g. MUX 22-880, that may connect a write FIFO to a write data bus.

The PHY layer may be coupled to the one or more write FIFOs using bus 22-898. The PHY layer may be operable to be coupled to external components (e.g. CPU, one or more stacked memory packages, other system components, etc.) via high-speed serial links, e.g. high-speed link 22-890, or other mechanisms (e.g. parallel bus, optical links, etc.).

In one embodiment the data buses may be bidirectional and used for both read path and write path for example. The techniques described herein to concentrate read data onto one or more buses and deconcentrate (e.g. expand, de-MUX, etc.) data from one or more buses may also be used for write data, the write data path and write data buses. Of course the techniques described herein may also be used for other buses (e.g. address bus, control bus, other collection of signals, etc.).

Note that in FIG. 22-8 the connections between memory array(s) and row buffer sets and the connections between memory array(s) and write buffer sets have not been shown explicitly, but may use or be similar to that shown in (and may employ any of the techniques and methods associated with) the architectures described and shown elsewhere herein in this specification, in the specifications incorporated by reference, and, for example, FIG. 12 of 61/602,034, FIG. 13 of U.S. Provisional 61/602,034, as well as (but not limited to) the accompanying text descriptions of these figures.

The MUX operations in FIG. 22-8 may be performed in several ways as described elsewhere herein in this specification, and, for example, FIG. 22-12 of 61/602,034, FIG. 13 of 61/602,034, as well as (but not limited to) the accompanying text descriptions of these figures . . . . The de-MUX operations in FIG. 22-8 may be performed in several ways as described elsewhere herein in this specification, and, for example, FIG. 12 of 61/602,034, FIG. 13 of 61/602,034, as well as (but not limited to) the accompanying text descriptions of these figures . . . . The MUX and de-MUX operations in FIG. 22-8 may be programmable as described elsewhere herein in this specification, and, for example, FIG. 12 of 61/602,034, FIG. 13 of 61/602,034, as well as (but not limited to) the accompanying text descriptions of these figures . . . . In the architecture of FIG. 22-8 the data buses may be shared between all stacked memory chips (though this need not be the case, various possible architectures that may share in a different manner are discussed herein).

In one embodiment based on the architecture of FIG. 22-8, one or more (including all) stacked memory chips and/or the logic chip may arbitrate for shared bus resources. For example, various embodiments may apply arbitration to allocate the data buses and data bus resources that may be shared between all stacked memory chips. In one embodiment the logic chip may be responsible for receiving and/or generating one or more data bus requests and receiving and/or granting one or more bus resources using one or more arbitration schemes. Of course, the arbitration scheme or arbitration schemes may be performed by the logic chip, by one or more of the stacked memory chips, or by a combination of the logic chip and one or more (or all) of the stacked memory chips. The arbitration schemes used may include one or more of the schemes described elsewhere herein in this specification, in the specifications incorporated by reference, and, for example, FIG. 14 of 61/602,034, FIG. 13 of 61/580,300, FIG. 14 of 61/569,107, as well as (but not limited to) the accompanying text descriptions of these figures.

In the architecture of FIG. 22-8 any number of data buses may be used between read channel and write channel and may be allocated in any combination (e.g. fixed, variable, programmable, etc.). Thus, for example, in one embodiment based on FIG. 8 a first group of one or more data buses may be allocated for the read channel and/or a second group of one or more of the data buses may be allocated for the write channel. Such an architecture may be implemented, for example, when memory traffic is asymmetric (e.g. unequal, biased, weighted more towards read than writes, weighted more toward writes than reads, etc.).

In the case, for example, that read traffic is heavier (e.g. more read data transfers, more read commands, etc.) than write traffic (traffic characteristics may either be known at start-up for a particular machine type, known at start-up by configuration, known at start-up by application use or type, determined at run time by measurement, or known by other mechanisms, etc.) then more resources (e.g. data bus resources, other bus resources, other circuits, etc.) may be allocated to the read channel (e.g. through modification of arbitration schemes, through logic reconfiguration, etc.). Of course any weighting scheme, resource allocation scheme or method, or combinations of schemes and/or methods may be used in such an architecture.

In the architecture shown in FIG. 22-8 the write path as shown focuses on the write data path. The address path is not shown, but may use the same structure and techniques as described above for the write data path, for example or may use or be similar to that shown in (and may employ any of the techniques and methods associated with) the architectures described and shown elsewhere herein in this specification, in the specifications incorporated by reference, and, for example, FIG. 12 of 61/602,034, FIG. 13 of 61/602,034, as well as (but not limited to) the accompanying text descriptions of these figures.

In one embodiment based on the architecture of FIG. 22-8, one or more (including all) of the data buses and/or other buses (e.g. address bus, termination control, ODT, etc.) and/or bus resources may be switched (e.g. between read channel and write channel, between chips and/or portion(s) of chips, etc.). For example the logic chip may assign data or other bus resources (e.g. as a bus master etc.) and/or other resources for the write channel based, for example, on incoming and/or pending write requests (e.g. in the data I/F circuits, as shown in FIG. 22-8 for example). The logic chip may then receive one or more bus resource requests and/or other resource requests from one or more stacked memory chips that may be ready to transfer data. Further, the logic chip may then grant one or more stacked memory chips one or more free buses or other resources, etc. For example the logic chip (in isolation, separately and/or in combination with any other parts of the system, etc.) may reconfigure, modify, or change buses or bus properties (e.g. frequency, arbiter priority, width, type, etc.) as a result of system changes (e.g. reconfiguration, change in link number and/or width, change in memory subsystem configuration or mode (described elsewhere herein in this specification, and for example FIG. 22-10 as well as (but not limited to) the accompanying text descriptions of this figure), detection of fault or failure conditions, combinations of these and/or other system changes, etc.).

In the architecture of FIG. 22-8 the data buses are shown as shared between all stacked memory chips, but this need not be the case for all architectures based on FIG. 22-8. For example, in one architecture based on FIG. 22-8 one or more (including all) stacked memory chips may have one or more dedicated data buses (e.g. buses making a connection between one stacked memory chip and the logic chip, point-to-point buses, etc.). Each of these one or more dedicated data buses may be used, for example, in any fashion just described. For example, in one embodiment one or more of the dedicated data buses may be used exclusively for the read path or exclusively for the write path. Of course there may be any number of stacked memory chips, any number of dedicated or shared data or other buses, any number of subarrays (or banks, or other portions of the one or more memory arrays on each stacked memory chip), any method described herein of using the dedicated data buses for the read path and the write path, and any of the methods of data transfer described herein may be used.

Of course combinations of the architectures based on FIG. 22-8 and described herein may be used. For example a first group of buses on one or more stacked memory chips may be dedicated (to a stacked memory chip, to a subarray, to a portion of a memory array, to a row buffer, etc.) and a second group of the buses on the one or more stacked memory chips may be shared (between one or more stacked memory chips, between one or more subarrays, between one or more portions of a memory array, between or more row buffers, etc.). For example some of the buses may be bidirectional (e.g. used for both the read data path and the write data path) and some of the buses may be unidirectional (e.g. used for the read data path or used for the write data path).

As an option, the stacked memory package architecture may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the stacked memory package architecture may be implemented in the context of any desired environment.

FIG. 22-9

FIG. 22-9 shows a heterogeneous memory cache system, in accordance with another embodiment.

In FIG. 22-9, the heterogeneous memory cache system 22-900 may comprise a system that may comprise a stacked package 22-908 and one or more stacked memory packages 22-980. The stacked package may comprise one or more CPUs 22-902 and one or more first stacked memory chips 22-918 of memory type M1. In FIG. 22-9 one CPU is shown, but any number may be used. In FIG. 22-9 one stacked package is shown, but any number may be used. In FIG. 22-9 the stacked memory package may comprise one or more stacked memory chips 22-918 of type M1 and one or more first logic chips 22-940. In FIG. 22-9 one first logic chip is shown, but any number may be used. In FIG. 22-9 two first stacked memory chips are shown, but any number of any number of types may be used. The one or more stacked memory packages may comprise one or more second stacked memory chips of memory type M2 (e.g. 22-964) and one or more second logic chips 22-962. In FIG. 22-9 one second logic chip is shown, but any number may be used. In FIG. 22-9 four second stacked memory chips are shown, but any number may be used.

In one embodiment the first logic chip 1 may be operable to perform one or more cache functions for the memory system, including the one or more types of stacked memory chips. In FIG. 22-9 the cache system may comprise (but is not limited to) the following cache system components: a cache 0 22-910, an M1 controller 22-916, a cache 1 22-914, an M2 controller 22-912. The cache system components may be coupled by the following components (but are not limited to): address 0 bus 22-906, data 0 bus (read) 22-904, data 0 bus (write) 22-960, miss 22-932, address 1 bus 22-938, address 2 bus 22-930, address 3 bus 22-936, data 4 bus (to m1 controller) 22-950, data 1 bus (to m2 controller) 22-952, data 2 bus (read) 22-924, data 2 bus (write) 22-922, data 3 bus (read) 22-934, data 3 bus (write) 22-932.

In one embodiment memory type M1 may be SRAM and memory type M2 may be DRAM. Of course any type of memory may be used, in a variety of embodiments.

In one embodiment memory type M1 may be DRAM and memory type M2 may be DRAM of the same or different technology to M1. Of course any type of memory may be used, in a variety of embodiments.

In one embodiment memory type M1 may be DRAM and memory type M2 may be NAND flash. Of course any type of memory may be used, in a variety of embodiments.

In one embodiment stacked memory package 1 may contain more than one type (e.g. class, memory class, memory technology, memory type, etc.) of memory as described elsewhere herein in this specification, in the specifications incorporated by reference, and, for example, FIG. 1A of 61/472,558, FIG. 1B of 61/472,558, as well as (but not limited to) the accompanying text descriptions of these figures.

Of course the cache structures (cache 0, cache 1, etc.) and/or other logic/data structures, etc. may be stored on the first logic chip (e.g. as embedded DRAM, eDRAM, SRAM, etc.) and/or any portions or portions of one or more stacked memory chips (of any type). Thus for example all or part of the cache 1 structure(s) may be stored in one or more first stacked memory chips of type M1 (which may for example be fast access DRAM).

As an option, the heterogeneous memory cache system may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the heterogeneous memory cache system may be implemented in the context of any desired environment.

FIG. 22-10

FIG. 22-10 shows a configurable memory subsystem, in accordance with another embodiment.

In FIG. 22-10, the configurable memory subsystem 22-1000 may comprise one or more memory subsystems 22-1010 and one or more CPUs 22-22-1012. The CPU(s) may be connected to the one or more memory subsystems via high-speed serial links 22-1008, but any connection method (e.g. bus, etc.) may be used. In FIG. 22-10 one memory subsystem is shown, but any number may be used. In FIG. 22-10 one CPU is shown but any number may be used. The memory subsystem may comprise one or more memory packages. The stacked memory packages may comprise one or more memory chips 22-1016. The memory chips may be stacked (e.g. grouped, vertically connected, etc.). For example, in one embodiment based on FIG. 10 the memory chips may be arranged in one or more stacked memory packages 22-1020 (e.g. the memory subsystem may contain 8 packages in the example architecture shown in FIG. 22-10). For example, in one embodiment based on FIG. 22-10 the memory subsystem may use a single package (e.g. one package may contain 32 chips in the example architecture shown in FIG. 22-10). Other arrangements of chips and packages in the memory subsystem are possible with any number of chips being used in any number of packages. Each memory chip in the memory subsystem may have a unique chip number as shown in FIG. 22-10.

In FIG. 22-10 the CPU may issue a series (e.g. set, group, collection, etc.) of read requests 22-1018 (read commands, etc.). For example in FIG. 22-10 there may be 8 read requests listed (A-H). Each individual read request 22-1026 (label A for example at the head of the read request list in FIG. 22-10) may correspond to a request for data at a physical address in the memory subsystem. In FIG. 22-10 the 3 sets of read responses are shown for 3 cases: read response 1 22-1014, read response 2 22-1022, read response 3 22-1024. Each of the read response sets (e.g. read response 1, read response 2, read response 3) shown in FIG. 22-10 contains (e.g. lists, shows, etc.) 8 read responses, one read response for each of the 8 read requests A-H. These 3 cases (e.g. read response 1, read response 2, read response 3) may correspond to 3 modes (e.g. architectures, configurations, settings, etc.) of operation. Each set of read responses may correspond to the set of read requests. The numbers in each read response set may correspond to the source of data (the chip number) for that request. Thus for example in FIG. 22-10 for the read response 1 case, the read request A (the first read request) may be satisfied (in the first read response) by chip number 19 (as shown by the number 19 at the head of the read responses).

In one embodiment a mode may correspond to any configuration (e.g. arrangement, modification, architecture, setting) of one or more parts of the memory subsystem (e.g. memory chip, part(s) of one or more memory chips, logic chip(s), stacked memory package(s), etc.). Thus, for example, in addition to changing the form (e.g. type, format, appearance, characteristics, etc.) of a read response, a change in mode may also result in change of write response behavior or change in any other behavior (e.g. link speeds and number, data path characteristics, IO characteristics, logic behavior, arbitration settings, data priorities, coding and/or decoding, security settings, data channel behavior, termination, protocol settings, timing behavior, register settings, etc.).

In one embodiment the portions of the memory subsystem that may correspond to a physical address (e.g. the region of memory where data stored at a physical address is located) may be configurable. The memory subsystem may first be configured to respond as shown for read response 1. Thus for example in FIG. 22-10, in the case of read response 1, a single memory chip may be accessed for each read request. Thus in FIG. 22-10, in the case of read response 1, read request A may be satisfied by chip number 19, read request B may be satisfied by chip number 17, read request C may be satisfied by chip number 6, and so on. Suppose for example that each read request is for 64 bits, then each memory chip in the case of read response 1 may return 64 bits.

The memory subsystem may be secondly be configured to respond as shown for read response 2. Thus for example in FIG. 22-10, in the case of read response 2, four memory chips may be accessed for each read request. Thus in FIG. 22-10, in the case of read response 2, read request A may be satisfied by chip numbers 16, 20, 24, 28; read request B may be satisfied by chip numbers 17, 21, 25, 29; read request C may be satisfied by chip numbers 17, 21, 25, 29; and so on. Each memory chip may return 64/4 or 16 bits.

The memory subsystem may be thirdly configured to respond as shown for read response 3. Thus for example in FIG. 22-10, in the case of read response 3, a varying (e.g. variable, changing, configurable, dynamic, etc.) number of memory chips may be accessed for each read request. Thus in FIG. 22-10, in the case of read response 3, read request A may be satisfied by 4 chips with chip numbers 16, 20, 24, 28; read request B may be satisfied by 4 chips with chip numbers 17, 21, 25, 29; read request C may be satisfied by 8 chips with chip numbers 0, 1, 2, 3, 4, 5, 6, 7; and so on. In this case the number of bits returned by each chip may be variable.

Note that as shown in FIG. 22-10 the configuration of the response granularity may be such that, for example, chip 0 may respond by itself, as one of a pair, etc. Thus, for example in FIG. 22-10, in the case of read response 3, read request C may be satisfied by chip 0 together with chips 1-7 (8 chips in total), but also read request D may be satisfied by chip 0 together with chips 1-3 (4 chips in total). Thus the response granularity of chip 0 may be variable. Of course the memory subsystem may be configured to respond (e.g. behave, operate, function, etc.) in any way in a fashion similar to that just described for read response 1, read response 2, read response 3.

In FIG. 22-10, shown is an embodiment focused on the read behavior of the memory system. Of course the write behavior may mirror (e.g. follow, correspond to, be matched to, etc.) the read behavior. Thus for example if data is written to memory chip 0 and 1 as a result of a write command to memory address X, a corresponding read command that requests data at memory address X may also read from chip 0 and 1.

In one embodiment the response granularity may be fixed. Thus for example, in one embodiment, the modes of operation may be restricted such that chips always return the same number of bits. Thus for example, in one embodiment, the modes of operation may be restricted such that the number of chips that respond to a request is fixed.

In one embodiment the response granularity may be variable. Thus for example the number of bits supplied by each chip may vary by read request or command (as shown in FIG. 22-10 read response 3 for example).

In one embodiment the memory subsystem or one or more portions of the memory subsystem may operate in different memory subsystem modes. For example in FIG. 22-10, an embodiment is shown that refers to operation corresponding to read response 1 as memory subsystem mode 1 and operation corresponding to read response 2 as memory subsystem mode 2. For example, the CPU may program the memory subsystem to operate in such a way that memory chips 0-15 may operate in memory subsystem mode 1 and memory chips 16-32 may operate in memory subsystem mode 2. Of course any number of memory subsystem modes and/or any type of memory subsystem modes may be used.

In one embodiment the memory subsystem or one or more portions of the memory subsystem (e.g. a stacked memory package, one or more memory chips in a stacked memory package, etc.) may be programmed at start-up to operate in a memory subsystem mode. The programming (e.g. configuration, etc.) of the memory subsystem may be performed by the CPU(s) in the system, and/or logic chip(s) in one or more stacked memory packages (not shown in FIG. 22-10, but shown elsewhere herein in this specification, for example FIG. 22-1A, in the specifications incorporated by reference, and, for example, FIG. 2 of 61/602,034, FIG. 4 of 61/602,034, as well as (but not limited to) the accompanying text descriptions of these figures), and/or software, and/or firmware.

A memory subsystem mode may apply to both read operations (e.g. read commands, read requests, etc.), write operations (e.g. write commands, etc.), control operations or similar commands (e.g. precharge, activate, power-down, etc.), and any other operations (e.g. test, special commands, etc.) associated with memory chips etc. in the memory subsystem (e.g. modes may also apply for register reads, calibration, etc.).

In one embodiment the CPU may request a memory subsystem mode on write. For example the CPU may issue a write request or write command that may specify a mode of memory subsystem operation (e.g. a mode corresponding to read response 1, 2, or 3 as shown in FIG. 22-10 or other similar modes etc.).

In one embodiment the CPU and/or memory subsystem may reserve (e.g. configure, tailor, modify, arrange, etc.) one or more portions of the memory system (e.g. certain address range, etc.) to operate in different memory subsystem modes.

In one embodiment the memory subsystem may advertise (e.g. through configuration at start-up, by special register read commands, through BIOS, by SMBus, etc.) supported memory subsystem modes (e.g. modes that the memory subsystem is capable of supporting, etc.).

In one embodiment the memory subsystem mode may be programmed as a function of the write or other command(s). For example writes of 64 bits may be performed in mode 1, while writes of greater than 64 bits (128 bits, 256 bits, etc.) may be performed in mode 2 etc.

In one embodiment the configuration (e.g. memory subsystem mode(s), etc.) of the memory subsystem may be fixed at start-up. For example the CPU may program one or more aspects of the architecture of the memory subsystem (e.g. memory subsystem mode(s), etc.). For example one or more logic chips (not shown in FIG. 22-10) may program the architecture, and/or may control the programming of the architecture, and/or may form all or part of configuration control of the architecture of the memory subsystem. For example the CPU(s) and/or logic chip(s) and/or software and/or firmware may be used to configure the memory subsystem. For example, in one embodiment the logic chip(s) may be located in one or more memory packages. Of course a logic chip that may be part of memory subsystem configuration control may be placed anywhere in the system.

In one embodiment the configuration of the memory subsystem (e.g. memory subsystem mode(s), etc.) may be dynamically altered (e.g. dynamically configured, at run time, at start-up, after start-up, etc.). For example the CPU may switch (e.g. change, alter, modify, tailor, optimize, etc.) one or more portions (or the entire memory subsystem, or one or more stacked memory packages, or a group of portions, or one or more groups of portions, etc.) of the memory system between memory subsystem modes. Further, one or more memory chips and/or logic chips (not shown in FIG. 22-10) may be reconfigured (bus widths expanded or contracted, bus resource requests altered, etc.) as a result of changing modes (statically or dynamically, etc.). Still yet, one or more logic chips (not shown in FIG. 22-10) in one or more memory packages may optionally be reconfigured (links width(s) changed; circuit operating frequency changed; bus width(s) changed; shared or other bus configurations altered; bus resources changed; signal, virtual channel, channel priority changed; etc.).

In one embodiment the responding portions of the memory subsystem may be configured. For example in memory subsystem mode 2 of operation, as shown in FIG. 22-10, the responding portions may be horizontal slices (e.g. chips 0, 4, 8, 12 form a horizontal slice, etc.). Chips 0, 4, 8, 12 may be in separate memory packages for example. This may be referred to as mode 2A of operation. In mode 2B of operation the memory system (or part of the memory system) may be configured to use vertical slices for example. For example in FIG. 22-10 in mode 2B chips 0, 1, 2, 3 (a vertical slice) may be programmed to respond instead of chips 0, 4, 8, 12. Chips 0, 1, 2, 3 may be in the same memory package for example. Other modes are possible, in different embodiments. For example mode 2C may program chips 0, 4, 1, 5 to respond (e.g. two chips in each of two packages, etc.).

In one embodiment the programmed portions of a memory subsystem may be banks, subarrays, mats, arrays, slices, chips, or any other portion or group of portions or groups of portions of a memory device. For example in FIG. 22-10 the portions of the memory subsystem labeled as chips may be subarrays. The chip numbers may correspond to the subarray number within a memory chip (and the subarray may be part of a bank, and the bank may be part of a memory chip). For example in FIG. 22-10 the portions of the memory subsystem labeled as chips may be two memory chips, and the two memory chips together may act as a single memory chip in certain modes (e.g. as a virtual chip, etc.). Thus the architecture shown in FIG. 22-10 should be viewed as general (e.g. flexible, broad, non-specific, etc.). For example the regions of the memory subsystem in FIG. 22-10 shown and labeled as memory chips may be any part, portion, portions, groups of portion(s) of one or more memory chips.

Configuring memory subsystem modes or switching memory subsystem modes or mixing memory subsystem modes may be used to control speed, power and/or other attributes of a memory subsystem. For example, configuring the memory subsystem so that most data may be retrieved from a single chip may allow most of the memory subsystem to be put in a deep power down mode or even switched off. For example, configuring the memory subsystem so that most data may be retrieved from a large number of chips may increase the speed of operation. Further, in one embodiment, configuring the memory subsystem so that most data request may be retrieved from a single chip may allow a CPU running multiple threads to operate in an efficient manner by reducing contention between memory chips or portions of the memory chips (e.g. bank conflicts, array conflicts, bus conflicts, etc.). For example, configuring the memory subsystem so that most data may be retrieved from a large number of chips may allow a CPU running a small number of threads to operate in an efficient manner.

To this end, regions and/or sub-regions of any of the memory described herein may be arranged to optimize one or more parallel operations in association with the memory. While the foregoing embodiment is described as being configurable, it should be strongly noted that additional embodiments are contemplated whereby one (i.e. single) or more (i.e. combination) of the configurable configurations that are set forth above (or are possible via the aforementioned configurability) may be used in isolation without any configurability (i.e. in a single configuration/fixed manner, etc.) or using only a portion of configurability.

As an option, the configurable memory subsystem may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the configurable memory subsystem may be implemented in the context of any desired environment.

FIG. 22-11

FIG. 22-11 shows a stacked memory package architecture, in accordance with another embodiment.

In FIG. 22-11, the stacked memory package architecture 22-1100 may comprise one or more stacked memory packages 22-1110 and one or more CPUs 22-1112. The CPU(s) may be connected to the one or more memory packages via one or more high-speed serial links 22-1108, but any connection method (e.g. bus, etc.) may be used. In FIG. 22-11, the CPU(s) and stacked memory package may be in separate packages (in the case that there are more than one stacked memory package this may typically be the case, but not necessarily) or the CPU and stacked memory package(s) may be in the same package (this may typically be the case if there is one stacked memory package, but not necessarily). Such an integrated CPU and stacked memory package configuration (e.g. CPU(s) and one or more stacked memory chips, etc.) may be used with any embodiment or architecture described herein for example.

Also in FIG. 22-11 one stacked memory package is shown, but any number may be used. In FIG. 22-11 one CPU is shown but any number may be used. The stacked memory packages may comprise one or more memory chips 22-1120. The memory chips may be stacked (e.g. grouped, vertically connected, etc.), but need not be (e.g. memory chips may be assembled on a planar and packaged, or groups of memory chips may be stacked and assembled on a planar, some memory chips may be stacked and some unstacked, etc.). For example, in one embodiment based on FIG. 22-11 the stacked memory package may contain 4 memory chips, but any number may be used. Other arrangements of memory chips, stacked memory packages, and/or other chips and/or other packages in the memory subsystem are possible with any number of chips being used in any number of packages. Each memory chip in the stacked memory package may have a unique chip number as shown in FIG. 22-11.

As shown in FIG. 22-11 each memory chip may comprise one or more regions 22-1122 (e.g. portions, parts, subcircuits, blocks, arrays, banks, ranks, mats, echelons, etc.). As shown in FIG. 22-11 each memory chip may contain 4 regions, but any number may be used. As shown in FIG. 22-11 each region may be assigned a number (e.g. region 0, region 1, region 2, region 3). Thus the chip number and region number may uniquely identify a region in a stacked memory package. As also shown in FIG. 22-11 each region may comprise one or more subregions 22-1116 (e.g. subarrays, subbanks, etc.). Still yet, as shown in FIG. 22-11 each region may contain 4 subregions, but any number of subregions may be used. As further shown in FIG. 22-11 each subregion may be assigned a unique number (e.g. 1-64 in FIG. 22-11). Thus the subregion number may uniquely identify a subregion within a stacked memory package. Each stacked memory package may also contain (or be coupled to, etc) one or more logic (e.g. buffer(s), buffer chip(s), etc.) chips (not shown in FIG. 22-11, but may be as shown elsewhere herein in this specification, for example FIG. 2A, in the specifications incorporated by reference, and, for example, FIG. 7C of U.S. Provisional Application No. 61/502,100, filed Jun. 28, 2011 which is formally incorporated herein by reference hereinbelow and hereinafter referenced as "61/502,100", FIG. 1B of 61/569,107, FIG. 7 of 61/602,034, as well as (but not limited to) the accompanying text descriptions of these figures).

The hierarchy of packages, chips, regions, and subregions may be different in various embodiments. Thus for example in one embodiment a region may be a bank with a subregion being a subarray (or sub-bank etc.). Thus for example in one embodiment a region may be a memory array (e.g. a memory chip, etc.) with a subregion being a bank. Therefore in FIG. 22-11 (and other related architectures described elsewhere herein in this specification, for example FIG. 22-10 and FIG. 22-13, as well as in the specifications incorporated by reference) the use of region and/or subregion does not necessarily imply any particular component, part, or portion(s) of a memory chip.

As shown in FIG. 22-11 the CPU may issue a series (e.g. set, group, collection, etc.) of requests 22-1124 (read requests, read commands, write requests, write commands, etc.). For example in FIG. 22-11 there may be 5 requests listed (1-5). Each individual read request 22-1114 (label 1 for example at the head of the request list in FIG. 22-11) may correspond to a request to read or write data at a physical address in the memory subsystem. Each request may have a unique identification (ID) number (tag, sequence, etc.), shown as 1-5 for the five example requests in FIG. 22-11.

Depending on the stacked memory package configuration and memory subsystem modes (as described elsewhere herein in this specification, and for example FIG. 22-10 as well as (but not limited to) the accompanying text descriptions of this figure) various optimizations may be performed to improve the performance of stacked memory package architectures based, for example, on FIG. 22-11.

For example, in one embodiment, regions may be constructed (e.g. circuits designed, circuits replicated, resources pipelined, buses separated, etc.) so that two regions on the same chip may be operated (e.g. read operations, write operations, etc.) independently (e.g. two operations may proceed in parallel without interference, etc.) or nearly independently (e.g. two operations may proceed in parallel with minimal interference, may be pipelined together, etc.).

For example, in one embodiment, subregions may be constructed (e.g. circuits designed, circuits replicated, resources pipelined, buses separated, etc.) so that two subregions on the same chip may be operated (e.g. read operations, write operations, etc.) independently (e.g. two operations may proceed in parallel without interference, etc.) or nearly independently (e.g. two operations may proceed in parallel with minimal interference, may be pipelined together, etc.). Typically, since there are more subregions than regions (e.g. subregions exist at a level of finer granularity than regions, etc.), there may be more restrictions (e.g. timing restrictions, resource restrictions, etc.) on using subregions in parallel than there may be on using regions in parallel.

For example, in FIG. 22-11 the first request with ID=1 is addressed to 4 subregions 0, 16, 32, 48. These 4 subregions represent a vertical slice in the architecture shown in FIG. 22-11. Each of the subregions 0 (in memory chip 0), 16 (in memory chip 1), 32 (in memory chip 2), 48 (in memory chip 3) is in a different stacked memory chip. Such a vertical slice may correspond for example to an echelon, as described elsewhere herein in this specification, in 61/569,107, 61/580, 300, 61/585,640, 61/602,034, all incorporated by reference, and, for example, FIG. 1B of 61/569,107, as well as (but not limited to) the accompanying text descriptions of this figure.

Request ID=2 corresponds to (e.g. uses, requires, accesses, etc.) subregions 4, 20, 36, 52 and may be performed independently (e.g. in parallel, pipelined with, overlapping with, etc.) of request ID=1 at the region level, since the subregions are located in different regions (request ID=1 uses region 0 and request ID=2 uses region 1). This overlapping operation at the region level may result in increased performance.

Request ID=3 corresponds to subregions 5, 21, 37, 53 and may be performed independently of request ID=2 at the subregion level, but may not necessarily be performed independently of request ID=2 at the region level because request ID=2 and ID=3 use the same regions (region 1). This overlapping operation at the subregion level may result in increased performance.

Request ID=4 corresponds to subregions 1, 17, 33, 49 and may be performed independently of request ID=3 and request ID=2 at the region level, but may not necessarily be performed independently of request ID=1 at the region level because request ID=4 and ID=1 use the same regions (region 1). However enough time may have passed between request ID=1 and request ID=4 for some overlap of operations to be permitted at the region level that could not be performed (for example) between request ID=2 and request ID=3. This limited overlapping operation at the region level may result in increased performance.

Request ID=5 corresponds to subregions 1, 17, 33, 49 and overlaps request ID=4 to such an extent that they may be combined. Such an action may be performed for example by a feedforward path in the memory chip (or in a logic chip or buffer chip etc, not shown in FIG. 22-11 but as shown elsewhere herein in this specification, for example FIG. 22-2A, in the specifications incorporated by reference, and, for example, FIG. 7C of 61/502,100, FIG. 1B of 61/569,107, FIG. 7 of 61/602,034, as well as (but not limited to) the accompanying text descriptions of these figures). The feedforward path may, for example, stall or cancel the operation associated with request ID=4 and replace it with request ID=5. Other optimizations may now be seen to be possible using the flexible architecture of FIG. 22-11 with the use of region and subregion partitioning. Such optimizations may include (but are not limited to) parallel operation (similar to or as described above), command and/or request reordering, command or request combining (similar to or as described above), pipelining, etc.

One embodiment may be based on a combination for example of the architecture illustrated in FIG. 22-11 and that is described in the accompanying text together with the configurable memory subsystem illustrated in FIG. 22-10 and that is described in the accompanying text. For example in FIG. 22-11 the region accessed by a memory request may be a vertical slice or echelon (e.g. subregions 0, 16, 32, 48). This may correspond, for example, to a first mode, memory subsystem mode 1, of operation.

A second mode, memory subsystem mode 2, of operation may correspond, for example, to a change of echelon. For example in memory subsystem mode 2 an echelon may correspond to a horizontal slice (e.g. subregions 0, 4, 8, 12). A third memory subsystem mode 3 of operation may correspond to an echelon of subregions 0, 4, 1, 3 (which is neither a purely horizontal slice or a purely vertical slice) being four subregions from two regions (two subregions from each region). Such adjustments (e.g. changes, modifications, reconfiguration, etc.) in configuration (e.g. circuits, buses, architecture, resources, etc.) may allow power savings (by reducing the number of chips that are selected per operation, etc.), and/or increased performance (by allowing more operations to be performed in parallel, etc.), and/or other system and memory subsystem benefits.

As an option, the stacked memory package architecture may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the stacked memory package architecture may be implemented in the context of any desired environment.

FIG. 22-12

FIG. 22-12 shows a memory system architecture with DMA, in accordance with another embodiment.

In FIG. 22-12, the memory system architecture with DMA 22-1200 may comprise one or more CPUs, for example CPU0 and CPU1, but any number of CPUs may be used and any CPU may contain multiple cores, possibly of different types, etc. In FIG. 22-12, the memory system architecture with DMA may comprise one or more stacked memory packages 22-1222. In FIG. 22-12 the memory system 22-1228 may be considered to consist of CPUs plus all memory (e.g. memory in all stacked memory packages, etc.). In FIG. 22-12 the memory subsystem 22-1226 may be considered to consist of all memory external to the CPUs (e.g. memory in all stacked memory packages, etc.). In FIG. 22-12 there are 3 stacked memory packages: SMP0, SMP1, SMP2, but any number of stacked memory packages may be used. One or more of the stacked memory packages may be integrated (e.g. packaged with, integrated with, stacked with, co-located with, mounted with, assembled with, etc.) one or more of the CPUs. One or more of the stacked memory packages may contain one or more logic chips 22-1230. For example, stacked memory packages may be manufactured in two forms: a first form of stacked memory package containing one or more logic chips of a first type (e.g. a smart form of stacked memory package, an intelligent form of stacked memory package, a master stacked memory package, etc.) and a second form of stacked memory package containing any number (e.g. zero, one or more) logic chips of a second type (e.g. a dumb form of stacked memory package, slave stacked memory package, etc.).

In FIG. 22-12 there are 2 system components: System Component 1 (SC1), System Component 2 (SC2). In FIG. 22-12 the stacked memory packages may each have 4 ports (with labels North (N), East (E), South (S), West (W), etc.) using high-speed serial links or other forms of communication etc. FIG. 22-12 illustrates the various ways in which stacked memory packages may be coupled in order to communicate with each other and the rest of the system and other system components (e.g. LAN, WAN, wireless, cloud, storage, networking, etc.). FIG. 22-12 is not necessarily meant to represent a fixed, particular, or typical memory system configuration but rather illustrate the flexibility and nature of memory systems that may be constructed using stacked memory chips as described herein.

In FIG. 22-12 the two CPUs and/or logic chips in each stacked memory package may maintain memory coherence in the memory system and/or the entire system. For example, the logic chips in each stacked memory package may be capable of maintaining coherence using a cache coherency protocol (e.g. using MESI protocol, MOESI protocol, directory-assisted snooping (DAS), etc.).

In FIG. 22-12 there are two system components, SC1 and SC2, connected to the memory subsystem. SC1 may be a network interface for example (e.g. Ethernet card, wireless interface, switch, etc.). SC2 may be a storage device, another type of memory, another system, multiple devices or systems, etc. Such system components may be permanently attached or pluggable (e.g. before start-up, hot pluggable, etc.).

In FIG. 22-12 routing of transactions (e.g. requests, responses, messages, etc.) between network nodes (e.g. CPUs, stacked memory packages, system components, etc.) may be performed using one or more routing protocols as described elsewhere herein in this specification, in the specifications incorporated by reference, and, for example, FIG. 16 of 61/569,107, as well as (but not limited to) the accompanying text descriptions of this figure.

In one embodiment it may be an option to designate (e.g. assign, elect, etc.) one or more master nodes that keep one or more copies of one or more tables and structures that hold all the required coherence information. The coherence information may be propagated (e.g. using messages, etc.) to all nodes in the network. For example, in the memory system network of FIG. 22-12 CPU0 may be the master node.

In one embodiment there may be a plurality of master nodes in the memory system network that monitor each other. The plurality of master nodes may be ranked as primary, secondary, tertiary, etc. The primary master node may perform master node functions unless there is a failure in which case the secondary master node takes over as primary master node. If the secondary master node fails, the tertiary master node may take over, etc.

In one embodiment the logic chip in a stacked memory package may contain coherence information stored in one or more data structures. The data structures may be stored in on-chip memory (e.g. embedded DRAM (eDRAM), SRAM, CAM, etc.) and/or off-chip memory (e.g. in stacked memory chips, etc.).

In FIG. 22-12 the logic chip may comprise one or more direct memory access (DMA) functions. In FIG. 22-12 the logic chip may comprise a logic layer 22-1232. The logic layer may comprise (but is not limited to) the following circuit blocks and/or functions: DMA buffer 22-1210, DMA engine 22-1212, prefetch 22-1216, coherence control 22-1218, memory controller 22-1214, shared cache 22-1220.

In FIG. 22-12 the DMA engine may be capable (e.g. operable to perform, etc.) DMA operations between one or more system components (e.g. system component 1, systems or peripherals etc. attached to one or more system components (e.g. storage, etc.), other stacked memory packages, or other system components). For example the DMA engine may perform peer-peer DMA operations. As an example of peer-peer DMA suppose a high-speed data device (e.g. high-speed image capture card, video camera, etc.) may be attached to (or part of, etc.) system component 1 and a high-speed storage device (e.g. SSD, solid-state memory, RAID array, etc.) may be attached to (or part of, etc.) system component 2, etc. In one embodiment, the DMA engine may be capable of controlling DMA operations between the high-speed data device and the high-speed storage device as peer-peer DMA. Of course any device, card, instrument, data source, storage device, networking device, mobile device, electronic device, etc. may be supported for DMA operations.

In one embodiment, the DMA engine may be capable of supporting DMA between one or more stacked memory packages. For example a DMA engine in SMP1 may be operable to support DMA between SMP1 and SMP0 and/or SMP2 (local package DMA). The DMA engine in SMP1 may be operable to perform DMA between SMP0 and SMP2 (remote package DMA). In one embodiment the DMA engine may support peer-peer DMA, and/or local package DMA, and/or remote package DMA by generating requests (e.g. messages, commands, etc.) and managing responses as described herein. For example, in one embodiment, the DMA engine may mimic (e.g. mirror, copy, emulate, etc.) the behavior (as described herein) of the CPU interaction (e.g. messages, commands, responses, error handling, etc.) with the memory system.

In one embodiment, the DMA engine and/or DMA function may include (e.g. be coupled to, comprise, communicate with, connected to, etc.) one or more DMA buffers. The DMA buffers may comprise on-chip (e.g. on the logic chip) memory (e.g. embedded DRAM (eDRAM), NAND flash, SRAM, CAM, etc.) and/or off-chip memory (e.g. in one or more stacked memory chips (local or remote), etc.). The DMA buffers may be used to buffer high-speed transfers from local and/or remote sources and/or buffer transfers to local and/or remote sources. For example the DMA buffer may be used to buffer a video stream to prevent stuttering or frame loss. For example the DMA buffer may be used to store information transmitted over a long latency network to allow retransmission in the event of packet loss etc. In one embodiment, the DMA buffers may be static in size and assigned at start-up or during operation. In one embodiment, the DMA buffers may be dynamically sized during operation. DMA buffer size may be controlled by the CPU and/or under program control and/or controlled locally by the logic chip.

In one embodiment, the DMA engine and/or DMA function may include one or more prefetchers. In one embodiment, the prefetcher may prefetch (e.g. speculatively fetch, retrieve, read, etc.) data based on known DMA addresses (e.g. based on one or more DMA commands that may include one or more address ranges, or series of ranges in a descriptor list, MDL, etc.). In one embodiment, the prefetcher may prefetch based on address pattern recognition (e.g. strides, Markov model, etc.). In one embodiment, the prefetcher may prefetch data based on data type, data recognition, data status, metadata, etc. (e.g. aggressively prefetch based on DMA of video content, hot data, etc.).

In one embodiment, the DMA engine and/or DMA function may include one or more coherence controllers. In one embodiment, the coherence controller may be operable to maintain memory coherence in the memory system using a coherence protocol. For example the coherence controller may use a MOESI protocol and track modified, owned, exclusive, shared, invalid states. In one embodiment, the logic chip, DMA engine and coherence controller may support a number of coherence protocols (e.g. MOESI, MESI, etc.) and the coherence protocol may be selected at start-up (by the CPU etc.).

In one embodiment, the DMA engine and/or DMA function may include one or more shared caches. For example a shared cache may be shared between the memory controller (e.g. responsible for performing CPU initiated memory operations etc.) and DMA engine (responsible for performing local memory operations etc.). In one embodiment the logic chip may contain one or more memory controllers that are used for both CPU initiated memory operations (e.g. read, write, etc.) and for DMA operations (e.g. peer-peer, local package DMA, remote package DMA, etc.). In one embodiment the logic chip may contain one or more memory controllers that are dedicated (or may be configured as dedicated, statically or dynamically, etc.) to DMA function(s). The shared cache may comprise on-chip (e.g. on the logic chip) memory (e.g. embedded DRAM (eDRAM), NAND flash, SRAM, CAM, etc.) and/or off-chip memory (e.g. in one or more stacked memory chips (local or remote), etc.).

As an option, the memory system architecture with DMA may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the memory system architecture with DMA may be implemented in the context of any desired environment.

FIG. 22-13

FIG. 22-13 shows a wide IO memory architecture, in accordance with another embodiment.

In FIG. 22-13, the wide IO memory architecture 22-1300 may comprise one or more stacked memory chip die 22-1302 coupled to one or more CPU die 22-1306. In FIG. 22-13 two stacked memory die are shown (22-1302 and 22-1304), but any number may be sued. In FIG. 22-13 one CPU is shown but any number may be used. The CPU die may contain any number of cores, etc. In FIG. 22-13 the stacked memory die and CPU die may be coupled using one or more TSVs, but any coupling technology may be used (e.g. proximity, capacitive coupling, optical coupling, inductive coupling, combinations of these and/or other coupling technologies, etc.).

Each stacked memory chip may contain one or more subregions (e.g. groups of memory circuits, blocks, subcircuits, arrays, subarrays, etc.) 22-1316. In FIG. 22-13 stacked memory chip 1 22-1320 may comprise 16 subregions organized as four groups of four, but any number of subregions and any arrangement of subregions may be used. In FIG. 22-13 the subregions may be grouped to form one or more regions 22-1322.

In FIG. 22-13 stacked memory chip 1 and stacked memory chip 2 contain the same number of regions and subregions and the same arrangement of regions and subregions but may contain different numbers of regions and subregions and different arrangements of regions and subregions. Also in FIG. 22-13 stacked memory chip 1 and stacked memory chip 2 may form the memory subsystem 22-1308 (e.g. comprise the memory portion of the memory subsystem, etc.) for the CPU die.

In FIG. 22-13 the CPU die may comprise the following circuits (e.g. functions, functional blocks, etc.), but is not limited to the following: address register 22-1328, data registers 22-1326, logic layer 22-1330, io layer 22-1332, CPU 22-1334, DRAM (or other memory technology, etc.) registers 22-1328, DRAM (or other memory technology, etc.) control logic 22-1326.

In FIG. 22-13 the width of the data path from CPU to the memory subsystem may be 256 bits, but any width may be used. In FIG. 22-13 the width of the data path to the CPU from the memory subsystem may be 256 bits, but any width may be used. The data path widths, for example, may depend on the number of TSVs 22-1324 that may be constructed on the memory die and the CPU die. In FIG. 22-13 the width of the data path from the data registers to the logic layer may be 256 bits, but any width may be used. In FIG. 22-13 the width of the data path to the data registers from the logic layer may be 256 bits, but any width may be used. The data path widths from the data register to the memory subsystem may be the same as the data paths widths from the data registers to the logic layer (as shown, for example, in FIG. 22-13) but each data path may have a different size (e.g. width, number of bits, etc.). In FIG. 22-13 the width of the address path from the address register to the memory subsystem may be 27 bits, but any width may be used (e.g. depending on the number of stacked memory chips, the capacity of the stacked memory chips, the number of regions, the number of subregions, the arrangement of regions, the arrangement of subregions, etc.).

Depending on the stacked memory chip configuration and memory subsystem modes (as described elsewhere herein in this specification, and for example FIG. 22-10 as well as (but not limited to) the accompanying text descriptions of this figure) various optimizations may be performed to improve the performance of wide IO memory architectures based, for example, on FIG. 22-13.

For example, in one embodiment, subregions and/or regions may be constructed (e.g. circuits designed, circuits replicated, resources pipelined, buses separated, etc.) so that two regions (possibly including on the same chip) may be operated (e.g. read operations, write operations, etc.) independently (e.g. two operations may proceed in parallel without interference, etc.) or nearly independently (e.g. two operations may proceed in parallel with minimal interference, may be pipelined together, etc.).

In one embodiment, for example, in FIG. 22-13 a first request may be addressed to subregions 0, 1, 2, 3, 16, 17, 18, 19. These 8 subregions may represent a vertical slice in the architecture shown in FIG. 22-13. Four of the subregions may be in memory chip 1 and four of the subregions may be in memory chip 2. Such a vertical slice may comprise two regions, one in stacked memory chip 1 and one in stacked memory chip 2. Such a vertical slice may correspond for example to an echelon, as described elsewhere herein in this specification, in 61/569,107, 61/580,300, 61/585,640, 61/602,034, all incorporated by reference, and, for example, FIG. 1B of 61/569,107, as well as (but not limited to) the accompanying text descriptions of this figure. In this example the echelon may comprise 256 bits, with 32 bits from each subregion and 128 bits from each region. A second request may corresponds to (e.g. uses, requires, accesses, etc.) subregions 4, 5, 6, 7, 20, 21, 22, 23 and may be performed independently (e.g. in parallel, pipelined with, overlapping with, etc.) of the first request since the first request and second request correspond to (e.g. use, require, address, etc.) different regions. This overlapping operation at the region level may result in increased performance. In one embodiment, access to subregions 4, 5, 6, 7 for example may be pipelined at the subregion level (if completely parallel operation is not possible at the subregion level). In one embodiment access to subregions 4, 5, 6, 7 for example may be completed in parallel at the subregion level if completely parallel operation is possible at the subregion level. This overlapping operation at the subregion level may result in increased performance.

In one embodiment, for example, in FIG. 22-13 a first request may be addressed to regions 0, 4, 8, 12, 16, 20, 24, 28. These 8 regions may represent two horizontal slices in the architecture shown in FIG. 22-13. Four of the subregions may be in memory chip 1 and four of the subregions may be in memory chip 2. Such a set of horizontal slices may correspond for example to an echelon, as described elsewhere herein in this specification, in 61/569,107, 61/580,300, 61/585,640, 61/602,034, all incorporated by reference, and, for example, FIG. 1B of 61/569,107, as well as (but not limited to) the accompanying text descriptions of this figure (but may be different from the particular format of the echelon in the example described previously). In this example the echelon may comprise 256 bits, with 32 bits from each region. A second request may corresponds to (e.g. uses, requires, accesses, etc.) regions 3, 7, 11, 15, 19, 23, 27, 31. In one embodiment, the second request may be pipelined with the first request. For example access to subregion 0 for the first request may be pipelined with access to subregion 3 for the second request. This overlapping operation at the subregion level may result in increased performance.

Two example have shown an echelon formed from a vertical slice (8 subregions, 2 regions) and two horizontal slices (8 subregions, 8 regions). However other arrangements are possible. For example an echelon may correspond to subregions 0, 4, 1,5, 16, 20, 17, 21 (4 horizontal slices, 8 subregions, 4 regions, etc.). Thus it may be seen that any number of regions and subregions may be used to form an echelon or other portion, and/or portions, and/or group of portions, and/or groups of portions of one or more stacked memory chips in the memory subsystem.

Other optimizations may now be seen to be possible using the flexible architecture of FIG. 22-13 with the use of region and subregion partitioning. Such optimizations may include (but are not limited to) parallel operation (similar to or as described above), command and/or request reordering, command or request combining (similar to or as described above), pipelining, etc.

One embodiment may be based on a combination for example of the architecture illustrated in FIG. 22-13 and that is described in the accompanying text together with the configurable memory subsystem illustrated in FIG. 22-10 and that is described in the accompanying text. For example in FIG. 22-13 the region accessed by a memory request may be a vertical slice or echelon. This may correspond, for example, to a first mode, memory subsystem mode 1, of operation.

A second mode, memory subsystem mode 2, of operation may correspond, for example, to a change of echelon. For example in memory subsystem mode 2 an echelon may correspond to a horizontal slice.

A third memory subsystem mode 3 of operation may correspond to an echelon that is neither a purely horizontal slice or a purely vertical slice. Such adjustments (e.g. changes, modifications, reconfiguration, etc.) in configuration (e.g. circuits, buses, architecture, resources, etc.) may allow power savings (by reducing the number of chips that are selected per operation, etc.), and/or increased performance (by allowing more operations to be performed in parallel, etc.), and/or other system and memory subsystem benefits.

As an option, the wide IO memory architecture may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the wide IO memory architecture may be implemented in the context of any desired environment.

As one example, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled “Multiple class memory systems”; U.S. Provisional Application No. 61/502,100, filed Jun. 28, 2011, titled “SYSTEM, METHOD, AND COMPUTER PROGRAM PRODUCT FOR IMPROVING MEMORY SYSTEMS”; U.S. Provisional Application No. 61/515,835, filed Aug. 5, 2011, titled “STORAGE SYSTEMS”; U.S. Provisional Application No. 61/566,577, filed Dec. 2, 2011, titled “IMPROVED MOBILE DEVICES”; U.S. Provisional Application No. 61/470,336, filed Mar. 31, 2011, titled “SYSTEM, METHOD, AND COMPUTER PROGRAM PRODUCT FOR UTILIZING IMAGE RECOGNITION TO PERFORM AN ACTION”; U.S. Provisional Application No. 61/470,391, filed Mar. 31, 2011, titled “SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE”; U.S. Provisional Application No. 61/569,213, filed Dec. 9, 2011, titled “SYSTEM, METHOD, AND COMPUTER PROGRAM PRODUCT FOR MODIFYING CONTENT”; U.S. Provisional Application No. 61/569,107, filed Dec. 9, 2011, titled “SYSTEM, METHOD, AND COMPUTER PROGRAM PRODUCT FOR IMPROVING MEMORY SYSTEMS”; U.S. Provisional Application No. 61/580,300, filed Dec. 26, 2011, titled “SYSTEM, METHOD, AND COMPUTER PROGRAM PRODUCT FOR IMPROVING MEMORY SYSTEMS”; U.S. Provisional Application No. 61/585,640, filed Jan. 31, 2012, titled “SYSTEM, METHOD, AND COMPUTER PROGRAM PRODUCT FOR IMPROVING MEMORY SYSTEMS”; U.S. Provisional Application No. 61/581,918, filed Jan. 13, 2012, titled “USER INTERFACE SYSTEM, METHOD, AND COMPUTER PROGRAM PRODUCT”; and U.S. Provisional Application No. 61/602,034, filed Feb. 22, 2012, titled “SYSTEM, METHOD, AND COMPUTER PROGRAM PRODUCT FOR IMPROVING MEMORY SYS- TEMS". Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section VI

The present section corresponds to U.S. Provisional Application No. 61/635,834, titled "SYSTEM, METHOD, AND COMPUTER PROGRAM PRODUCT FOR IMPROVING MEMORY SYSTEMS," filed Apr. 19, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS," which is incorporated herein by reference in its entirety.

Example embodiments described herein may include computer system(s) with one or more central processor units (CPU) and possibly one or more I/O unit(s) coupled to one or more memory systems that may contain one or more memory controllers and memory devices. As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry.

Any or all of the components within a memory system or memory subsystem may be coupled internally (e.g. internal component(s) to internal component(s), etc.) or externally (e.g. internal component(s) to components, functions, devices, circuits, chips, packages, etc. external to a memory system or memory subsystem, etc.) via one or more buses, high-speed links, or other coupling means, communication means, signaling means, other means, combination(s) of these, etc.

Any of the buses etc. or all of the buses etc. may use one or more protocols (e.g. command sets, set of commands, set of basic commands, set of packet formats, communication semantics, algorithm for communication, command structure, packet structure, flow and control procedure, data exchange mechanism, etc.). The protocols may include a set of transactions (e.g. packet formats, transaction types, message formats, message structures, packet structures, control packets, data packets, message types, etc.).

A transaction may comprise (but is not limited to) an exchange of one or more pieces of information on a bus. Typically transactions may include (but are not limited to) the following: a request transaction (e.g. request, request packet, etc.) may be for data (e.g. a read request, read command, read packet, read, write request, write command, write packet, write, etc.) or for some control or status information; a response transaction (response, response packet, etc.) is typically a result (e.g. linked to, corresponds to, generated by, etc.) of a request and may return data, status, or other information, etc. The term transaction may be used to describe the exchange (e.g. both request and response) of information, but may also be used to describe the individual parts (e.g. pieces, components, functions, elements, etc.) of an exchange and possibly other elements, components, actions, functions, operations (e.g. packets, signals, wires, fields, flags, information exchange(s), data, control operations, commands, etc.) that may be required (e.g. the request, one or more responses, messages, control signals, flow control, acknowledgements, queries, ACK, NAK, NACK, nonce, handshake, connection, etc.) or a collection of requests and/or responses, etc.

Some requests may not have responses. Thus, for example, a write request may not result in any response. Requests that do not require (e.g. expect, etc.) a response are often referred to as posted requests (e.g. posted write, etc.). Requests that do require (e.g. expect, etc.) a response are often referred to as non-posted requests (e.g. non-posted write, etc.).

Some responses may not have (e.g. contain, carry, etc.) data. Thus, for example, a write response may simply be an acknowledgement (e.g. confirmation, message, etc.) that the write request was successfully performed (e.g. completed, staged, committed, etc.). Sometimes responses are also called completions (e.g. read completion, write completion, etc.) and response and completion may be used interchangeably. In some protocols, where some responses may contain data and some responses may not, the term completion may be reserved for responses with data (or for response without data). Sometimes the presence or absence of data may be made explicit (e.g. response with data, response without data, completion with data, completion without data, non-data completion, etc.).

All command sets typically contain a set of basic information. For example, one set of basic information may be considered to comprise (but may not be limited to): (1) posted transactions (e.g. without completion expected) or nonposted transactions (e.g. completion expected); (2) header information and data information; (3) direction (transmit/request or receive/completion). Thus, the pieces of information in a basic command set would comprise (but not limited to): posted request header (PH), posted request data (PD), non-posted request header (NPH), non-posted request data (NPD), completion header (CPLH), completion data (CPLD). These six pieces of information are used, for example, in the PCI Express protocol.

Bus traffic (e.g. signals, transactions, packets, messages, commands, etc.) may be divided into one or more groups (e.g. classes, traffic classes or types, message classes or types, transaction classes or types, channels, etc.). For example, bus traffic may be divided into isochronous and non-isochronous (e.g. for media, multimedia, real-time traffic, etc.). For example, traffic may be divided into one or more virtual channels (VCs), etc. For example, traffic may be divided into coherent and non-coherent, etc.

FIG. 23-0

Figures 0, 23:
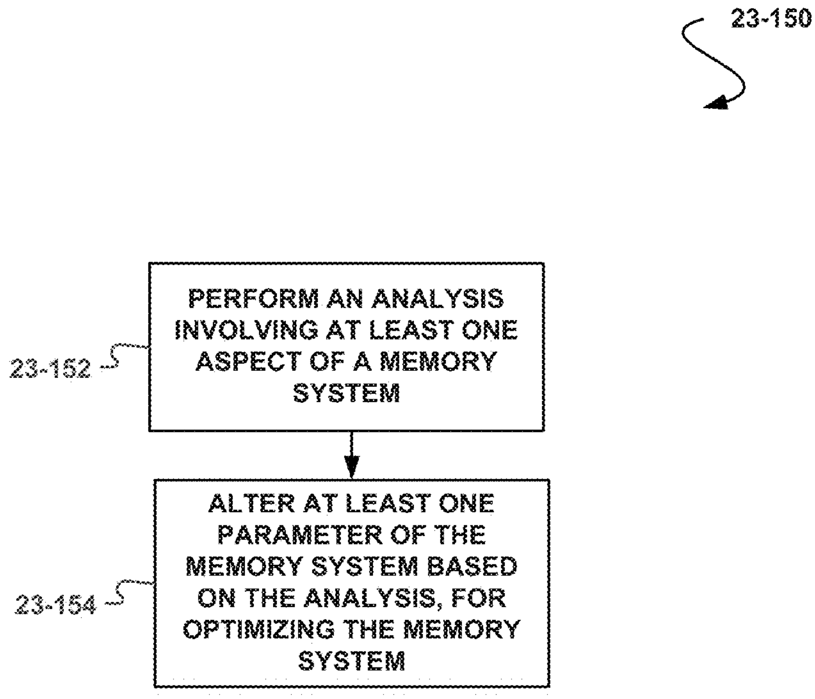
FIG. 23-0 shows a method for altering at least one parameter of a memory system, in accordance with one embodiment.
Figures 1, 23:
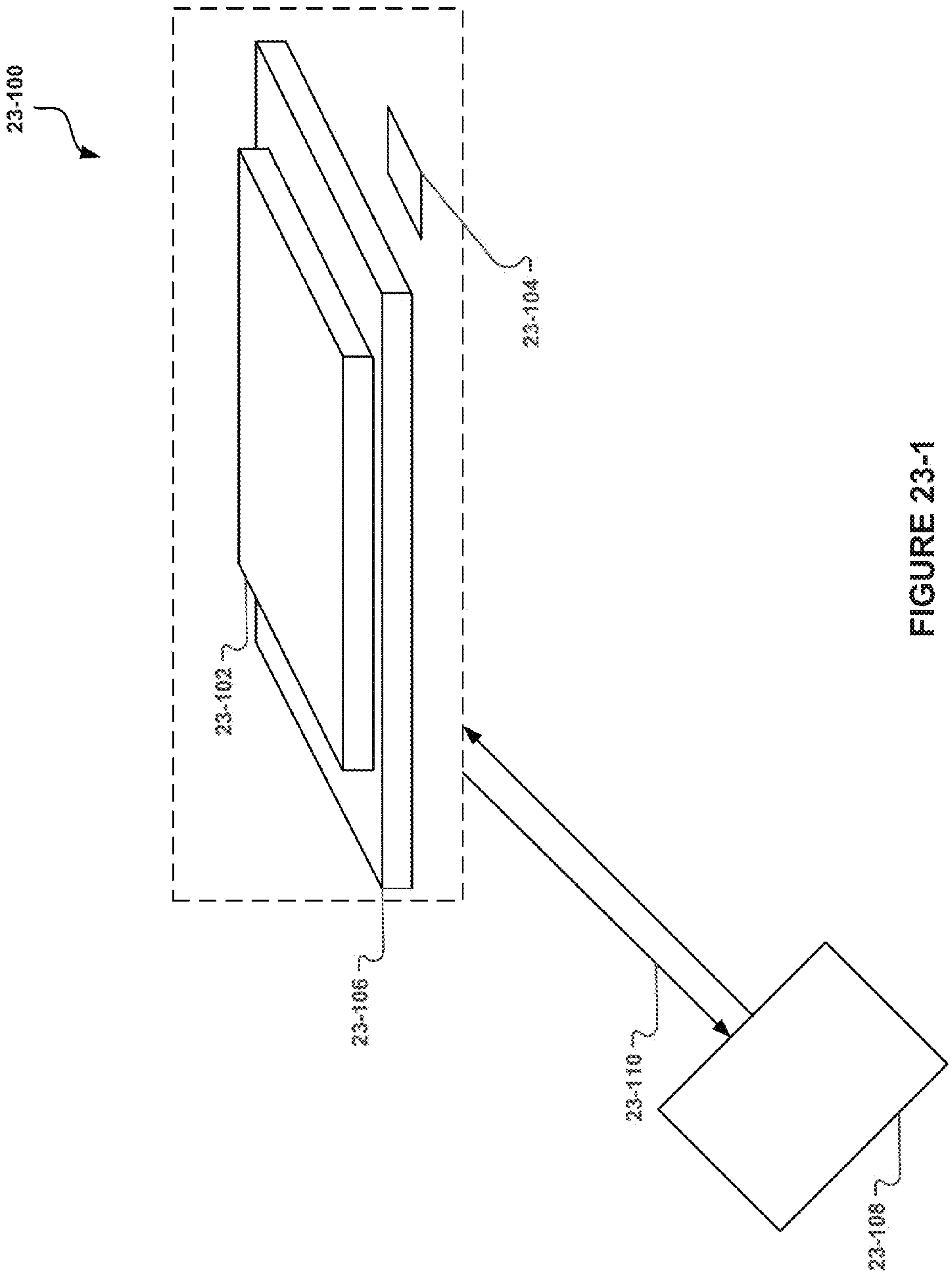
Figures 2, 23:
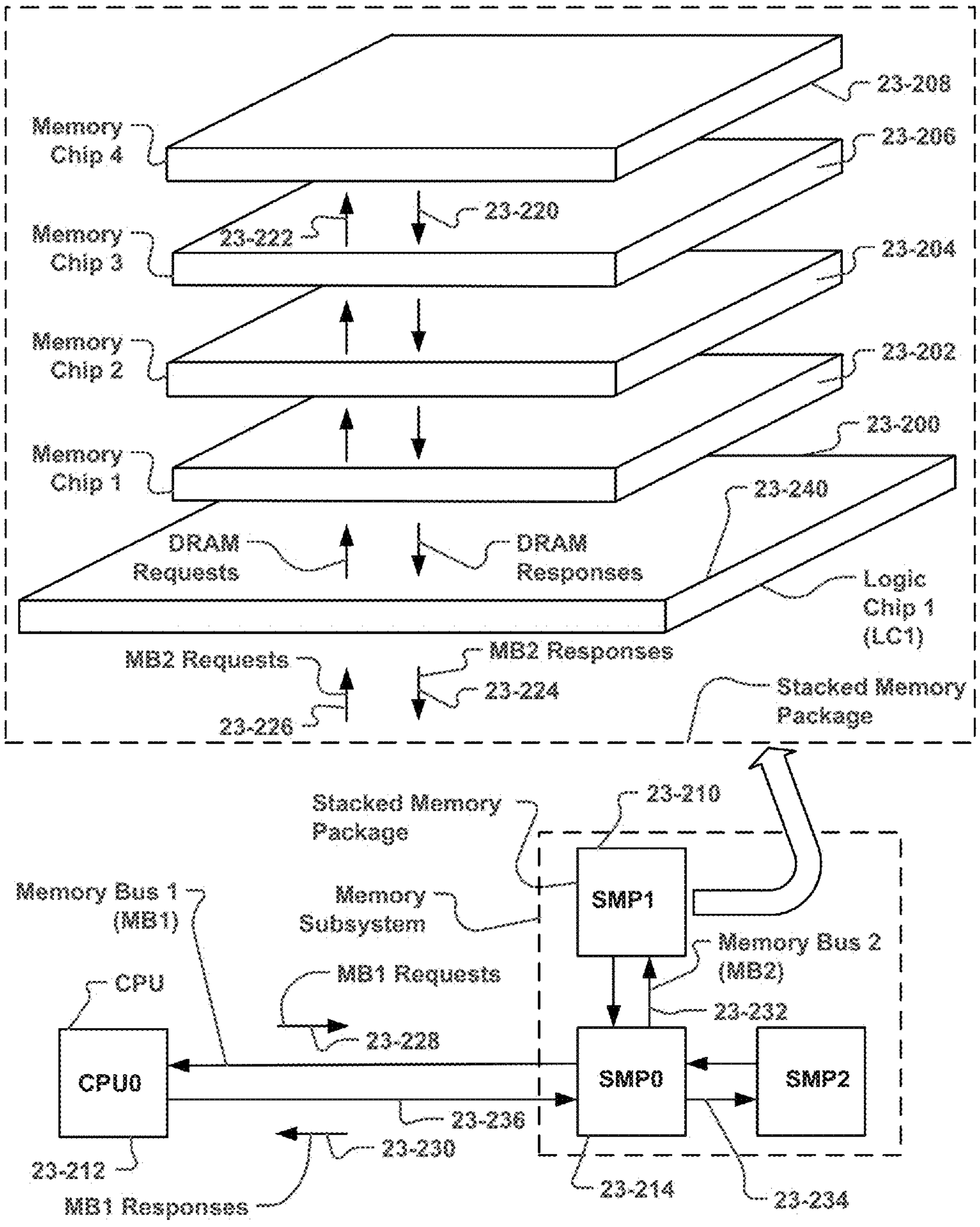
Figures 3, 23:
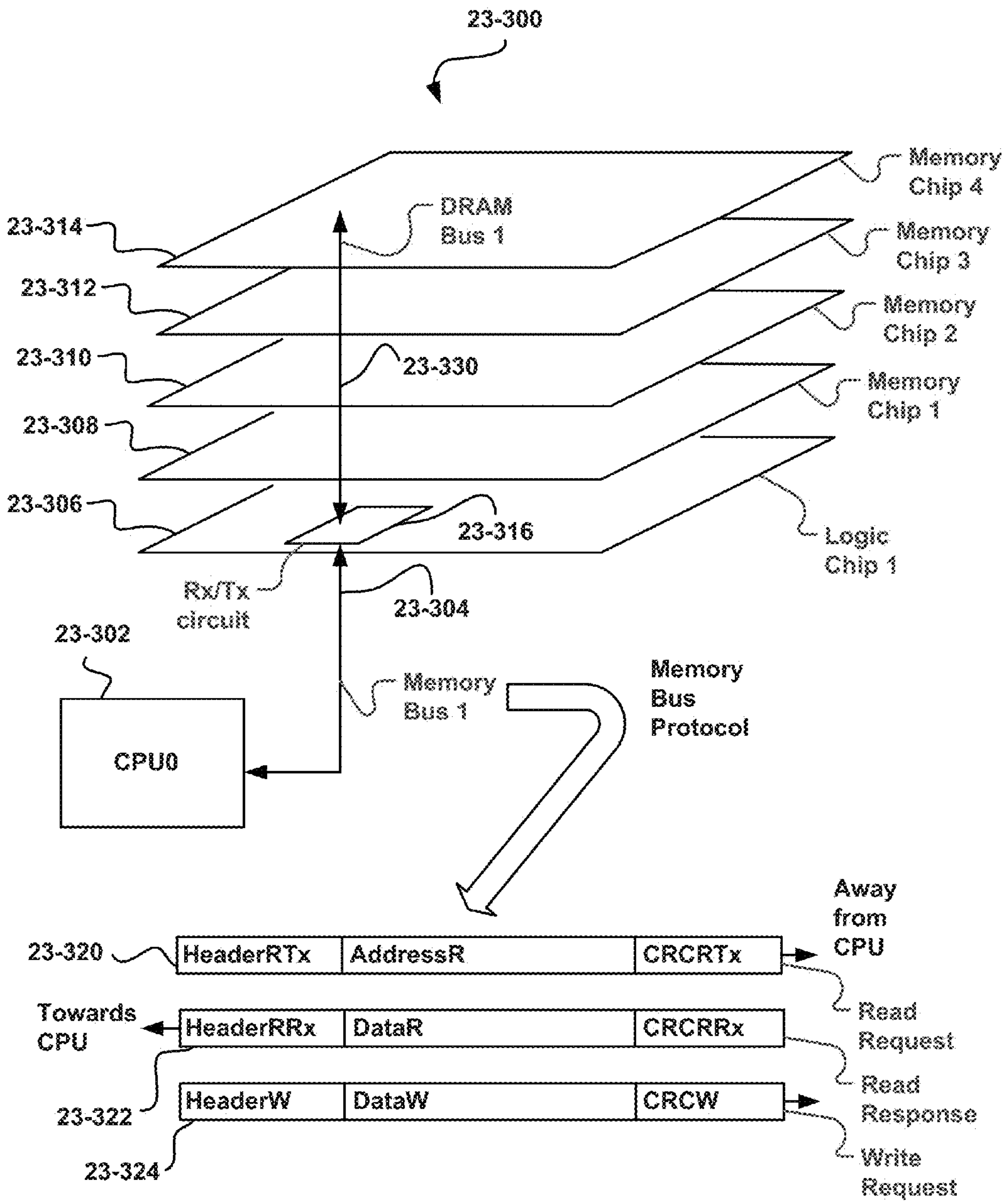
Figures 4, 23:
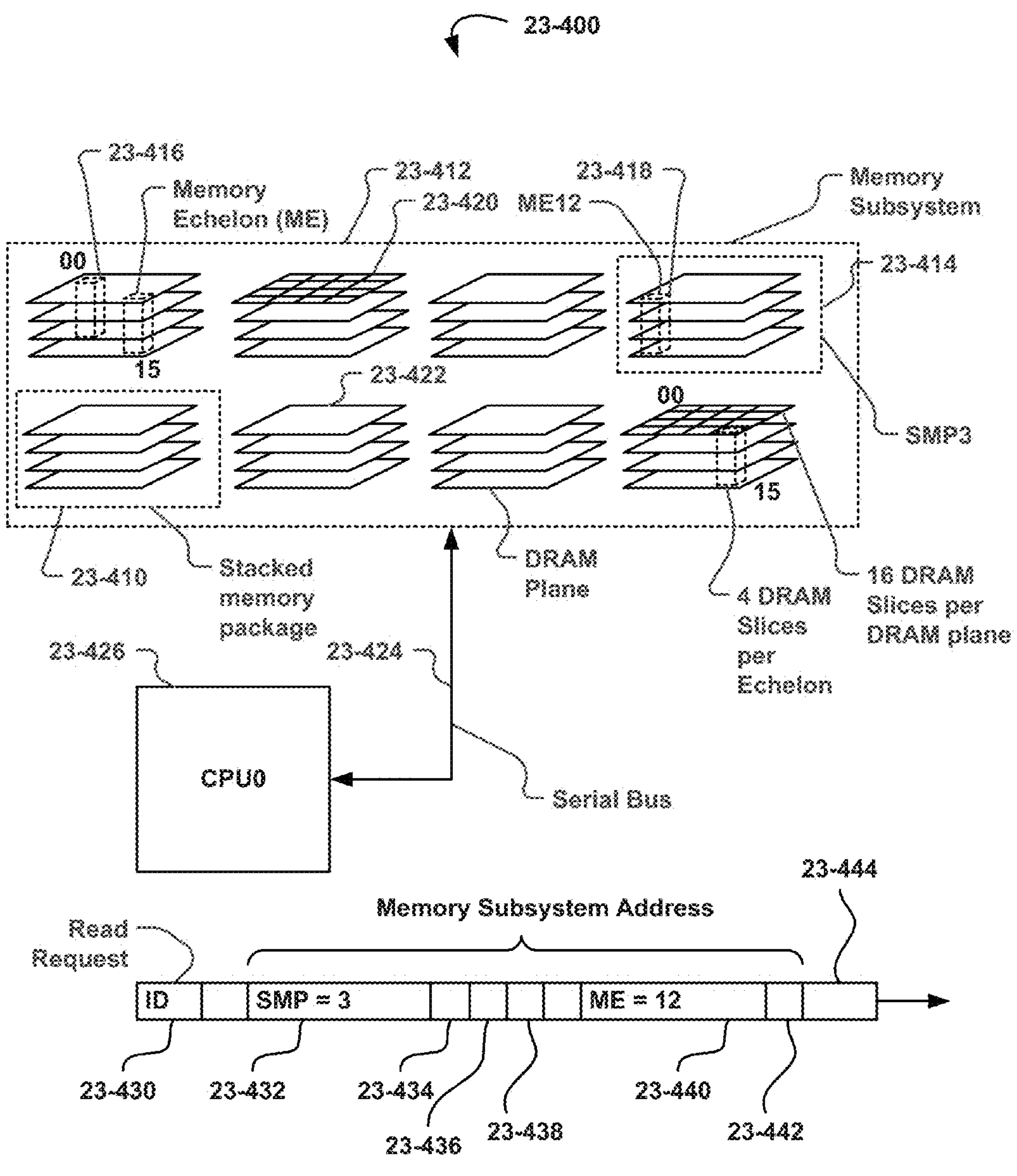
Figures 5, 23:
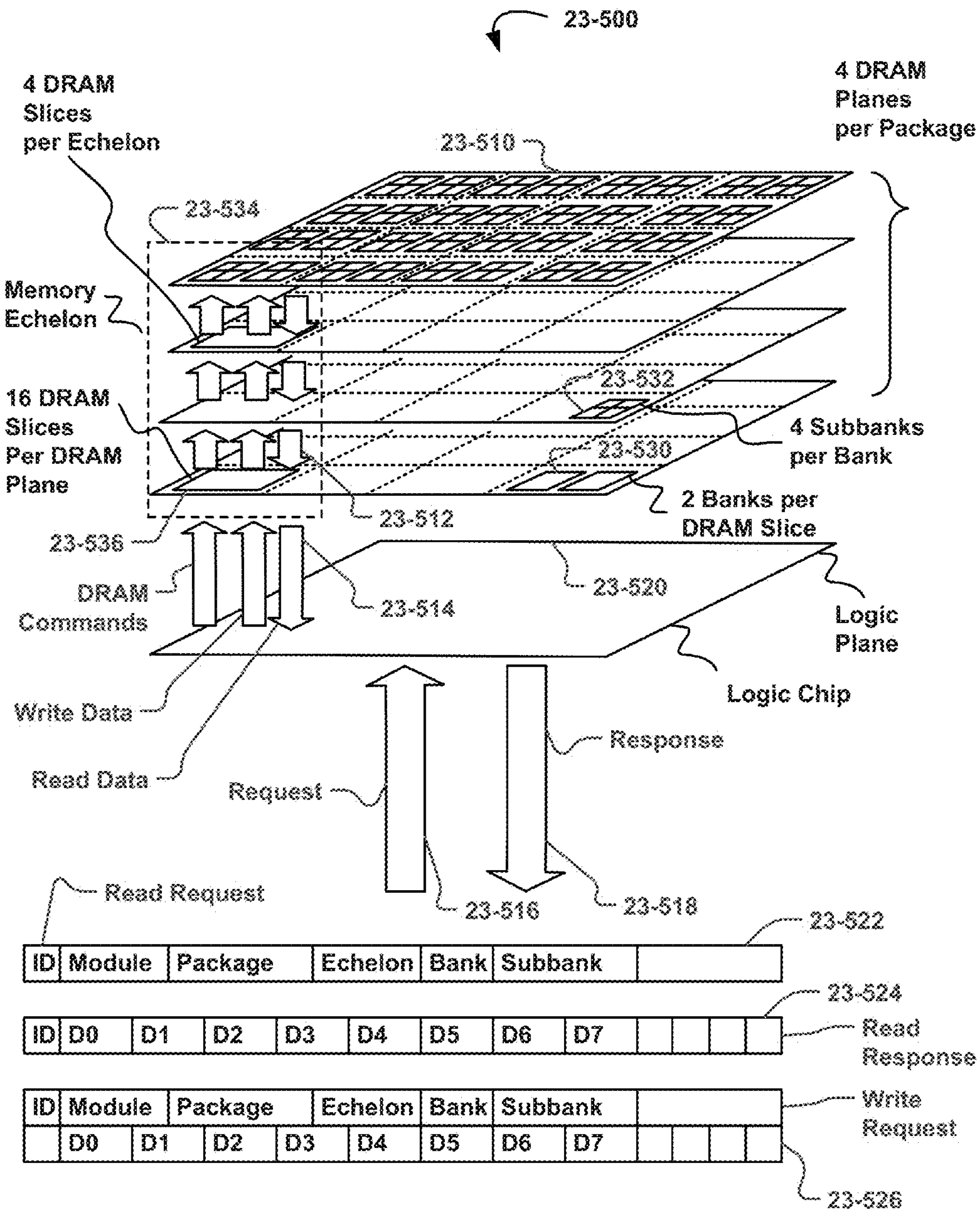

FIG. 23-0 shows a method 23-150 for altering at least one parameter of a memory system, in accordance with one embodiment. As an option, the method 23-150 may be implemented in the context of any subsequent Figure(s). Of course, however, the method 23-150 may be implemented in the context of any desired environment.

It should be noted that a variety of optional architectures, implementations, capabilities, and/or features will now be set forth in the context of a variety of embodiments in connection with a description of FIG. 23-0. Any one or more of such optional architectures, implementations, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, an analysis involving at least one aspect of a memory system is dynamically performed. See operation 23-152. The memory system may include any type of memory system. For example, the memory system may include memory systems described in the context of the embodiments of the following figures, and/or any other type of memory system.

In one embodiment, the memory system may include a first semiconductor platform and a second semiconductor platform stacked with the first semiconductor platform. In another embodiment, the memory system may include a first semiconductor platform including a first memory of a first memory class and a second semiconductor platform stacked with the first semiconductor platform and including a second memory of a second memory class.

Furthermore, in one embodiment, the analysis involving at least one aspect of the memory system may be performed in connection with a start-up of the memory system. For example, in one embodiment, the memory system may be powered up and the analysis may be performed automatically thereafter (e.g. immediately, shortly thereafter, etc.). Of course, in another embodiment, the analysis involving the at least one aspect of the memory system may be performed in a non-dynamic manner. In other words, in one embodiment, dynamically performing the analysis may be optional (e.g. the analysis may be performed statically, the analysis may be initiated manually, etc.).

As another example, in one embodiment, the analysis may be performed dynamically in a first mode of operation and statically in a second mode of operation. Additionally, in one embodiment, the analysis may be performed utilizing software. In another embodiment, the analysis may be performed utilizing hardware including at least one of a device (e.g. processing unit, etc.) in communication with the memory system, the memory system, or a chip separate from a device (e.g. processing unit, etc.) and the memory system.

Further, in one embodiment, the analysis may be predetermined. Additionally, in one embodiment, the analysis may be determined in connection with each of a plurality of instances of the analysis.

Still yet, the analysis may involve any aspect of the memory system. In one embodiment, the at least one aspect may include a tangible aspect. For example, in one embodiment, the at least one aspect may include a memory bus of the memory system. Of course, in various embodiments, the at least one aspect may include any tangible aspect of the memory system.

In another embodiment, the at least one aspect may include an intangible aspect. For example, in one embodiment, the at least one aspect may include a signal detectable in connection with the memory system. Of course, in various embodiments, the at least one aspect may include any intangible aspect of the memory system. Further, it is contemplated that, in one embodiment, the at least one aspect may include both an intangible aspect and a tangible aspect.

As shown further in FIG. 23-0, at least one parameter of the memory system is altered based on the analysis, for optimizing the memory system. See operation 23-154. The parameter may include any parameter associated with the memory system.

In one embodiment, the at least one parameter may be unrelated to the at least one aspect of the memory system. In another embodiment, the at least one parameter may be related to the at least one aspect of the memory system. In various embodiments, the at least one parameter may include at least one of a bus width, a number of lanes used for requests, a number of lanes used for responses, a system parameter, a timing parameter, a timeout parameter, a clock frequency, a frequency setting, a DLL setting, a PLL setting, a bus protocol, a flag, a coding scheme, an error protection scheme, a bus priority, a signal priority, a virtual channel priority, a number of virtual channels, an assignment of virtual channels, an arbitration algorithm, a link width, a number of links, a crossbar configuration, a switch configuration, a PHY parameter, a test algorithm, a test function, a read function, a write function, a control function, a command set, and/or any other parameter.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the analysis of operation 23-152, the altering of operation 23-154, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures/functionality, as desired. Thus, any discussion of such conventional architectures and/or standard features herein should not be interpreted as an intention to exclude such architectures/functionality and/or features from various embodiments disclosed herein, but rather as a disclosure thereof as exemplary optional embodiments with features, operations, functionality, parts, etc. which may or may not be incorporated in the various embodiments disclosed herein.

FIG. 23-1

FIG. 23-1 shows an apparatus 23-100, in accordance with one embodiment. As an option, the apparatus 23-100 may be implemented in the context of FIG. 23-0 and/or any subsequent Figure(s). Of course, however, the apparatus 23-100 may be implemented in the context of any desired environment.

It should be noted that a variety of optional architectures, capabilities, and/or features will now be set forth in the context of a variety of embodiments in connection with a description of FIG. 23-1. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 23-100 includes a first semiconductor platform 23-102 including a first memory. Additionally, the apparatus 23-100 includes a second semiconductor platform 23-106 stacked with the first semiconductor platform 23-102. Such second semiconductor platform 23-106 may include a second memory. As an option, the first memory may be of a first memory class. Additionally, the second memory may be of a second memory class.

In another embodiment, a plurality of stacks may be provided, at least one of which includes the first semiconductor platform 23-102 including a first memory of a first memory class, and at least another one which includes the second semiconductor platform 23-106 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments.

In another embodiment, the apparatus 23-100 may include a physical memory sub-system. In the context of the present description, physical memory refers to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, MRAM, PRAM, etc.), a solid-state disk (SSD) or other disk, magnetic media, and/or any other physical memory that meets the above definition.

Additionally, in various embodiments, the physical memory sub-system may include a monolithic memory circuit, a semiconductor die, a chip, a packaged memory circuit, or any other type of tangible memory circuit. In one embodiment, the apparatus 23-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 23-106. Such connections that are in communication with the first memory and pass through the second semiconductor platform 23-106 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing one or more TSVs.

As another option, the communicative coupling may include a connection via a buffer device. In one embodiment, the buffer device may be part of the apparatus 23-100. In another embodiment, the buffer device may be separate from the apparatus 23-100.

Further, in one embodiment, at least one additional semiconductor platform (not shown) may be stacked with the first semiconductor platform 23-102 and the second semiconductor platform 23-106. In this case, in one embodiment, the additional semiconductor may include a third memory of at least one of the first memory class or the second memory class, and/or any other additional circuitry. In another embodiment, the at least one additional semiconductor may include a third memory of a third memory class.

In one embodiment, the additional semiconductor platform may be positioned between the first semiconductor platform 23-102 and the second semiconductor platform 23-106. In another embodiment, the at least one additional semiconductor platform may be positioned above the first semiconductor platform 23-102 and the second semiconductor platform 23-106. Further, in one embodiment, the additional semiconductor platform may be in communication with at least one of the first semiconductor platform 23-102 and/or the second semiconductor platform 23-102 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 23-102 may be in communication via a buffer. In this case, in one embodiment, the buffer may include a row buffer.

Further, in one embodiment, the apparatus 23-100 may be configured such that the first memory and the second memory are capable of receiving instructions via a single memory bus 23-110. The memory bus 23-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, etc; I/O protocols such as PCI, PCI-E, HyperTransport, InfiniBand, QPI, etc; networking protocols such as Ethernet, TCP/IP, iSCSI, etc; storage protocols such as NFS, SAMBA, SAS, SATA, FC, etc; and other protocols (e.g. wireless, optical, etc.); etc.). Of course, other embodiments are contemplated with multiple memory buses.

In one embodiment, the apparatus 23-100 may include a three-dimensional integrated circuit. In one embodiment, the first semiconductor platform 23-102 and the second semiconductor platform 23-106 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 23-100 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 23-102 and the second semiconductor platform 23-106 together may include a three-dimensional integrated circuit that is a wafer-on-wafer device.

In another embodiment, the apparatus 23-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 23-102 and the second semiconductor platform 23-106 together may include a three-dimensional integrated circuit that is a monolithic device.

In another embodiment, the apparatus 23-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 23-102 and the second semiconductor platform 23-106 together may include a three-dimensional integrated circuit that is a die-on-wafer device.

In yet another embodiment, the apparatus 23-100 may include a three-dimensional integrated circuit that is a die-on-die device. In the context of the present description, a die-on-die device refers to a device including two or more aligned dies in a die-on-die configuration. In one embodiment, the first semiconductor platform 23-102 and the second semiconductor platform 23-106 together may include a three-dimensional integrated circuit that is a die-on-die device.

Additionally, in one embodiment, the apparatus 23-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 23-100 may be configured such that the first memory and the second memory are capable of receiving instructions from a device 23-108 via the single memory bus 23-110. In one embodiment, the device 23-108 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.

In the context of the following description, optional additional circuitry 23-104 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 23-104 is shown generically in connection with the apparatus 23-100, it should be strongly noted that any such additional circuitry 23-104 may be positioned in any components (e.g. the first semiconductor platform 23-102, the second semiconductor platform 23-106, the device 23-108, an unillustrated logic unit or any other unit described herein, a separate unillustrated component that may or may not be stacked with any of the other components illustrated, a combination thereof, etc.).

In another embodiment, the additional circuitry 23-104 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiments, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 23-104 capable of receiving (and/or sending) the data operation request. More illustrative information will be set forth regarding various optional architectures, capabilities, and/or features with which the present embodiment(s) may or may not be implemented during the description of the embodiments shown in subsequent figures. It should be strongly noted that subsequent embodiment information is set forth for illustrative purposes and should not be construed as limiting in any manner, since any of such features may be optionally incorporated with or without the inclusion of other features described.

In yet another embodiment, regions and sub-regions of any of the memory described herein may be arranged to optimize one or more parallel operations in association with the memory.

In still yet another embodiment, an analysis involving at least one aspect of the apparatus 23-100 (e.g. any component(s) thereof, etc.) may be performed, and at least one parameter of the apparatus 23-100 (e.g. any component(s) thereof, etc.) may be altered based on the analysis, for optimizing the apparatus 23-100 and/or any component(s) thereof (e.g. as described in the context of FIG. 23-0, elsewhere hereinafter, etc.). Of course, in various embodiments, the aforementioned aspect(s), parameter(s), etc. may involve any one or more of the components of the apparatus 23-100 described herein or possibly others (e.g. first semiconductor platform 23-102, second semiconductor platform 23-106, device 23-108, optional additional circuitry 23-104, memory bus 23-110, unillustrated software, etc.). Still yet, the aforementioned analysis may involve and/or be performed by any one or more of the components of the apparatus 23-100 described herein or possibly others (e.g. first semiconductor platform 23-102, second semiconductor platform 23-106, device 23-108, optional additional circuitry 23-104, memory bus 23-110, unillustrated software, etc.).

More illustrative information will be set forth regarding various optional architectures, capabilities, and/or features with which the present embodiment(s) may or may not be implemented during the description of the embodiments shown in subsequent figures. It should be strongly noted that subsequent embodiment information is set forth for illustrative purposes and should not be construed as limiting in any manner, since any of such features may be optionally incorporated with or without the inclusion of other features described.

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate with the memory system to allow for any of the foregoing optional architectures, capabilities, and/or features. For that matter, further embodiments are contemplated where a single semiconductor platform (e.g. 23-102, 23-106, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the configuration/operation of the apparatus 23-100, the configuration/operation of the first and second memories, the configuration/operation of the memory bus 23-110, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc. which may or may not be incorporated in the various embodiments disclosed herein.

FIG. 23-2

FIG. 23-2 shows a memory system with multiple stacked memory packages, in accordance with one embodiment. As an option, the system may be implemented in the context of the architecture and environment of the previous figure(s) or any subsequent Figure(s). Of course, however, the system may be implemented in any desired environment.

In FIG. 23-2, the CPU 23-212 may be connected to one or more stacked memory packages (23-210, 23-214, etc.) using one or more memory buses (23-236, 23-234, 23-232, etc.).

In FIG. 23-2, the stacked memory package may comprise one or more memory chips (23-208, 23-206, 23-204, 23-202).

In FIG. 23-2, the stacked memory package may comprise one or more logic chips (23-240).

In FIG. 23-2, the memory chips may be connected using one or more buses (23-222, 23-220, etc.) that may carry (e.g. convey, communicate, transmit, receive, couple, etc.) DRAM request and DRAM responses (in the case that memory chips are DRAM) or other similar memory device signals such as data, command, control, etc. The buses may be separate for command and data or multiplexed (e.g. shared, shared functions, multi-purpose, etc.). The data buses may be unidirectional or bidirectional. The buses may be serial or parallel, etc.

In FIG. 23-2, the logic chip(s) in a stacked memory may be connected to other stacked memory packages and/or CPUs etc. using one or more memory buses. The buses may share a common architecture (e.g. protocol, number of links, etc.) or may be different. For example, memory bus 1 23-236 may be the same, similar, or different to memory bus 2 23-232, etc.

In FIG. 23-2, the logic chip(s) in a stacked memory may translate (e.g. buffer, alter, modify, convert, etc.) the logic signals, protocol, etc. used by one or more memory buses to memory signals. For example, the logic chip 1 23-240 may convert MB2 requests 23-226 and/or MB2 responses 23-224 to/from DRAM requests 23-222 and/or DRAM responses 23-220.

In one embodiment, a single CPU may be connected to a single stacked memory package.

In one embodiment, one or more stacked memory packages may be mounted with (e.g. packaged with, collocated with, bonded with, connected using TSVs, etc.) one or more CPUs.

In one embodiment, one or more CPUs may be connected to one or more stacked memory packages.

In one embodiment, one or more stacked memory packages may be connected together in a memory subsystem network.

In FIG. 23-2, a memory read may be performed by sending (e.g. transmitting from CPU to stacked memory package, etc.) a read request. The read data may be returned in a read response. The read request may be forwarded (e.g. routed, buffered, etc.) between memory packages. The read response may be forwarded between memory packages.

In FIG. 23-2, a memory write may be performed by sending (e.g. transmitting from stacked memory package, etc.) a write request. The write response (e.g. completion, notification, etc.), if any, may originates from the target memory package. The write response may be forwarded between memory packages.

In contrast to current memory system a request and response may be asynchronous (e.g. split, separated, variable latency, etc.).

In FIG. 23-2, the stacked memory package includes a first semiconductor platform. Additionally, the system includes at least one additional semiconductor platform stacked with the first semiconductor platform.

In the context of the present description, a semiconductor platform refers to any platform including one or more substrates of one or more semiconducting material (e.g. silicon, germanium, gallium arsenide, silicon carbide, etc.). Additionally, in various embodiments, the system may include any number of semiconductor platforms (e.g. 2, 3, 4, etc.).

In one embodiment, at least one of the first semiconductor platform or the additional semiconductor platform may include a memory semiconductor platform. The memory semiconductor platform may include any type of memory semiconductor platform (e.g. memory technology, etc.) such as random access memory (RAM) or dynamic random access memory (DRAM), etc.

In one embodiment, as shown in FIG. 23-2, the first semiconductor platform may be a logic chip 23-240 (Logic Chip 1, LC1). In FIG. 23-2, the additional semiconductor platforms are memory chips (Memory Chip 1, Memory Chip 2, Memory Chip 3, Memory Chip 4). In FIG. 23-2, the logic chip may be used to access data stored in one or more portions on the memory chips. In FIG. 23-2, the portions of the memory chips are arranged (e.g. connected, coupled, etc.) so that a group of the portions may be accessed by LC1 as a memory echelon (not shown explicitly in FIG. 23-2, but may be as shown in previous and subsequent Figures in this application and in other applications that are incorporated by reference, see for example, FIG. 23-4).

As used herein the term memory echelon is used to represent (e.g. denote, is defined as, etc.) a grouping of memory circuits. Other terms (e.g. bank, rank, etc.) have been avoided for such a grouping because of possible confusion. A memory echelon may correspond to a bank or rank of a memory device or memory chip (e.g. SDRAM bank, SDRAM rank, DRAM rank, DRAM bank, etc.), but need not (and typically does not). Typically, a memory echelon is composed of portions on different memory die and spans all the memory die in a stacked memory package (stacked die package, stacked package, stacked device, memory stack, stack, etc.), but need not be. For example, in an 8-die stack, one memory echelon (ME1) may comprise portions in dies 1-4 and another memory echelon (ME2) may comprise portions in dies 5-8. Or, for example, one memory echelon (ME1) may comprise portions in dies 1, 3, 5, 7 (e.g. die 1 is on the bottom of the stack, die 8 is the top of the stack, etc.) and another memory echelon ME2 may comprise portions in dies 2, 4, 6, 8, etc. In general there may be any number of memory echelons and any arrangement of memory echelons in a stacked memory package (including fractions of an echelon, where an echelon may span more than one stacked memory package for example). Echelons need not all be the same size (e.g. capacity, storage, number of memory elements, number of memory cells, etc.). For example, one stacked memory package may contain echelons of 1 Mbyte where another stacked memory package may contain echelons of 2 Mbyte, etc. Echelons may also be of different sizes within the same stacked memory package.

Echelon size, configuration and properties may be configured during manufacture, after testing, during packaging and/or assembly, at start-up, or at run time (e.g. during operation, etc.).

In one embodiment, the memory technology (e.g. memory chips, memory devices, embedded memory, etc.) may take any form including, but not limited to, synchronous DRAM (SDRAM), double data rate synchronous DRAM (DDR SDRAM, DDR2 SDRAM, DDR3 SDRAM, DDR4 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), ZRAM (e.g. SOI RAM, Capacitor-less RAM, etc.), Phase Change RAM (PRAM or PCRAM, chalcogenide RAM, etc.), Magnetic RAM (MRAM), Field Write MRAM, Spin Torque Transfer (STT) MRAM, Memristor RAM, Racetrack memory, Millipede memory, Ferroelectric RAM (FeRAM), Resistor RAM (RRAM), Conductive-Bridging RAM (CBRAM), Silicon-Oxide-Nitride-Oxide-Silicon (SONOS) RAM, Twin-Transistor RAM (TTRAM), Thyristor-RAM (T-RAM), combinations of these and/or any other memory technology or similar data storage technology.

In one embodiment, the memory semiconductor platform (e.g. chip, die, dice, IC, device, component, etc.) may include one or more types of non-volatile memory technology (e.g. FeRAM, MRAM, PRAM, etc.) and/or one or more types of volatile memory technology (e.g. SRAM, T-RAM, Z-RAM, TTRAM, etc.).

In one embodiment, the memory semiconductor platform may be a standard (e.g. JEDEC DDR3 SDRAM, etc.) die.

In one embodiment, the memory semiconductor platform may use a standard memory technology (e.g. JEDEC DDR3, JEDEC DDR4, etc.) but included on a non-standard die (e.g. the die is non-standardized, the die is not sold separately as a memory component, etc.).

In one embodiment, the first semiconductor platform may be a logic semiconductor platform (e.g. logic chip, buffer chip, etc.).

In one embodiment, there may be more than one logic semiconductor platform.

In one embodiment, the first semiconductor platform may use a different process technology than the one or more additional semiconductor platforms. For example, the logic semiconductor platform may use a logic technology (e.g. 45 nm, bulk CMOS, etc.) while the memory semiconductor platform(s) may use a DRAM technology (e.g. 22 nm, etc.).

In one embodiment, the memory semiconductor platform may include combinations of a first type of memory technology (e.g. non-volatile memory such as FeRAM, MRAM, and PRAM, etc.) and/or another type of memory technology (e.g. volatile memory such as SRAM, T-RAM, Z-RAM, and TTRAM, etc.).

In one embodiment, the system may include at least one of a three-dimensional integrated circuit, a wafer-on-wafer device, a monolithic device, a die-on-wafer device, a die-on-die device, a three-dimensional package, and a three-dimensional package.

As an option, the memory system of FIG. 23-2 may be implemented in the context of the architecture and environment of FIG. 1B, U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

As an option, the memory system of FIG. 23-2 may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the memory system of FIG. 23-2 may be implemented in the context of any desired environment.

FIG. 23-3

FIG. 23-3 shows a stacked memory package, in accordance with another embodiment. As an option, the system may be implemented in the context of the architecture and environment of any previous and/or subsequent Figure(s). Of course, however, the system may be implemented in any desired environment.

In FIG. 23-3, a CPU (CPU0, 23-302) is connected to the logic chip (Logic Chip 1, LC1, 23-306) via a memory bus (Memory Bus 1, MB1, 23-304). LC1 is coupled to four memory chips [Memory Chip 1 (MC1) 23-308, Memory Chip 2 (MC2) 23-310, Memory Chip 3 (MC3) 23-312, Memory Chip 4 (MC4) 23-314].

In one embodiment, the memory bus MB1 may be a high-speed serial bus.

In FIG. 23-3 the MB1 is shown for simplicity as bidirectional. MB1 may be a multi-lane serial link. MB1 may be comprised of two groups of unidirectional buses. For example, there may be one bus (part of MB1) that transmits data from CPU 1 to LC1 that includes one or more lanes; there may be a second bus (also part of MB1) that transmits data from LC1 to CPU 1 that includes one or more lanes.

A lane is normally used to transmit a bit of information. In some buses a lane may be considered to include both transmit and receive signals (e.g. lane 0 transmit and lane 0 receive, etc.). This is the definition of lane used by the PCI-SIG for PCI Express for example, and the definition that is used here. In some buses (e.g. Intel QPI, etc.) a lane may be considered as just a transmit signal or just a receive signal. In most high-speed serial links data is transmitted using differential signals. Thus, a lane may be considered to consist of 2 wires (one pair, transmit or receive, as in Intel QPI) or 4 wires (2 pairs, transmit and receive, as in PCI Express). As used herein a lane includes 4 wires (2 pairs, transmit and receive).

In FIG. 23-3, LC1 may include one or more receive/transmit circuits (Rx/Tx circuit) 23-316. The Rx/Tx circuits may communicate (e.g. are coupled, etc.) to four portions of the memory chips called a memory echelon.

In FIG. 23-3, MC1, MC2, MC3 and MC4 may be coupled using through-silicon vias (TSVs).

In one embodiment, the portion(s) of a memory chip that form part of an echelon may be a bank (e.g. DRAM bank, etc.).

In one embodiment, there may be any number of memory chip portions in a memory echelon.

In one embodiment, the portion of a memory chip that forms part of an echelon may be a subset of a bank.

In FIG. 23-3, memory bus 1 23-304 may use a memory bus protocol to transmit requests and receive responses to/from one or more stacked memory packages and/or other CPUs, devices, packages, functions, units, circuits, etc. in the memory subsystem or attached to (e.g. coupled to, in communication with, networked to, etc.) the memory subsystem.

In FIG. 23-3, the memory bus protocol may comprise one or more packet formats. In FIG. 23-3 the packet formats may include (but are not limited to): read request 23-320, read response 23-322, write request 23-324. Other packets that may have the same, similar or different formats, may include (but are not limited to): control packets, status packets, configuration packets, completion packets, split response packets, flow control packets, link layer packets, notification packets, identification packets, etc.

In FIG. 23-3, the request packets generally flow away from the CPU (the requester). In FIG. 23-3, the response packets generally flow towards the CPU (the requester). In the case that a stacked memory package is a requestor (e.g. in a peer-peer operation etc.) then request packets flow away from the requester and response packets flow toward the requester. Of course there may be more than one CPU, and thus more than one requester, in the memory system.

In FIG. 23-3, the read request may include (but is not limited to) the following fields (e.g. information, data, content, options, etc.): HeaderRTx, the header field for the read request may contain other subfields (e.g. ID as described below, one or more control fields and/or flags, etc.); AddressR, the read address [which may contain other subfields including, but not limited to, the address of the stacked memory package (or other device, etc.), the memory chip, the echelon, bank, row, column, or other address (e.g. bits, fields, etc.) directed at a portion of a memory chip or device, etc.]; CRCTx, a CRC or other data integrity check field (e.g. ECC, code, group of codes, checksum, etc.).

In FIG. 23-3, the read response may include (but is not limited to) the following fields: HeaderRRx, the header field for the read response may contain other subfields (e.g. ID as described below, one or more control fields and/or flags, etc.); DataR, the read data (which may contain other subfields, etc.); CRCRx, a CRC or other data integrity check field (e.g. ECC, code, group of codes, checksum, etc.).

In FIG. 23-3, the write request may include (but is not limited to) the following fields: HeaderW, the header field for the write request may contain other subfields (e.g. ID as described below, one or more control fields and/or flags, etc.); DataW, the write data (which may contain other subfields, etc.); CRCW, a CRC or other data integrity check field (e.g. ECC, code, group of codes, checksum, combinations of these, etc.).

The CRC fields CRCRTx, CRCRRx, CRCW (or other check fields) are generally the same (e.g. CRCTx, CRCRRx, CRCW are constructed, calculated etc. in the same way) for each packet format (e.g. for a fixed-with CRC calculation, e.g. CRC-32, CRC-24, CRC-4, etc.), but need not be and may be different (e.g. an ECC or checksum field width may depend on packet lengths, etc.). The CRC fields CRCRTx, CRCRRx, CRCW (or other check fields) are generally single codewords but may be composed of one or more codewords, possibly using different codes (e.g. algorithms, polynomials, etc.), etc. The CRC fields CRCRTx, CRCRRx, CRCW (or other check fields) are generally located in a contiguous area in the packet format (e.g. using a contiguous string of bits), but need not be and may be split into more than one field or into more than one packet for example. The CRC fields CRCRTx, CRCRRx, CRCW (or other check fields) are generally computed using one or more fixed algorithms (e.g. polynomials, codes, etc.) but need not be and may be configured or programmed at start-up or at run time for example. In some cases there may be more than one check filed per packet or group of packets. For example, a first check field may be used for each individual packet (or portion of a packet or portions of a packet) and a second running check field may be used to cover a string (e.g. collection, series, or other grouping etc.) of packets. In some cases the CRC fields (or other check fields) may be part of, or considered part of, the header fields, etc. In general the CRC or other check field may be at the end of the packet formats (e.g. in order to aid (e.g. speed up, etc.) computation, etc.), but need not be at the end of the packet.

The sizes of all of the fields are shown diagrammatically in FIG. 23-3 and not intended to represent the actual length of the fields (in bits, bytes, words, etc.). More details of the packets; protocol; sizes and structures as well as functions of the packet fields will be described below and in other and subsequent Figures.

In FIG. 23-3, the requests (read request, write request, other request types and formats not shown, etc.) may include an identification (ID) (e.g. serial number, sequence number, tag, etc.) that may uniquely identify each request. In FIG. 23-3, the response may include an ID that may identify a response as belonging to a request. In FIG. 23-3, for example, each logic chip may be responsible for handling the requests and responses to/from a stacked memory package and storing, generating and checking ID fields. The ID for each response may match the ID for each request (e.g. the ID of a request and a response may be the same, or the ID of request and response may have another known relationship, etc.). In this way the requestor (e.g. CPU, other stacked memory package, etc.) may match responses with requests. In this way the responses may be allowed to be out-of-order (i.e. arrive in a different order than sent, etc.).

For example, the CPU may issue two read requests RQ1 and RQ2. RQ1 may be issued before RQ2 in time. RQ1 may have ID 01. RQ2 may have ID 02. The memory packages may return read data in read responses RR1 and RR2. RR1 may be the read response for RQ1. RR2 may be the read response for RQ2. RR1 may contain ID 01. RR2 may contain ID 02. The read responses may arrive at the CPU in order, that is RR1 arrives before RR2. This is always the case with conventional memory systems. However, in FIG. 23-3, RR2 may arrive at the CPU before RR1, that is to say out-of-order. The CPU may examine the IDs in read responses, for example, RR1 and RR2, in order to determine which responses belong to which requests.

As an option, the stacked memory package of FIG. 23-3 may be implemented in the context of the architecture and environment of FIG. 2, U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

As an option, the stacked memory package of FIG. 23-3 may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the stacked memory package of FIG. 23-3 may be implemented in the context of any desired environment.

FIG. 23-4

FIG. 23-4 shows a memory system using stacked memory packages, in accordance with one embodiment. As an option, the system may be implemented in the context of the architecture and environment of the previous figure or any subsequent Figure(s). Of course, however, the system may be implemented in any desired environment.

In FIG. 23-4, memory subsystem 23-412 may comprise one or more stacked memory packages 23-410 (eight are shown in FIG. 23-4). Each stacked memory package may contain one or more DRAMs or other memory chips (memory devices, memory die, etc.). Generally each memory die may be the same. In general though each DRAM die or other memory die may be the same, similar or different. For example, in a stack of four die, two die may be DRAM and two die may be NAND flash, etc. In some cases to facilitate repair or use redundancy, etc., one or more die may be rotated with respect to the other die. In some cases to facilitate repair or use redundancy etc. one or more die may be programmed differently (e.g. with spare rows, spare columns, spare banks or other memory portions, etc.) with respect to the other die (e.g. so that the die may appear physically identical but may be different electrically, etc.).

In FIG. 23-4, each stacked memory package may be divided (e.g. sliced, apportioned, cut, transected, chopped, virtualized, abstracted, etc.) into one or more portions called echelons.

In FIG. 23-4, several different constructions (e.g. architectures, arrangements, topologies, structure, etc.) for an echelon are possible.

In FIG. 23-4, memory echelon 23-416 is contained in a single stacked memory package and spans (e.g. consists of, comprises, is built from, etc.) all four memory chips in a single stacked memory package. The memory echelon may be considered to be formed from a DRAM slice (or slice from any other type of memory or memory technology) 23-420 on each DRAM plane 23-422. In FIG. 23-4, there are 16 DRAM slices on each DRAM plane (numbered from 00 to 15 in FIG. 23-4). In FIG. 23-4, an echelon thus contains 4 DRAM slices. In FIG. 23-4, each DRAM slice may be subdivided further (e.g. into smaller slices, subslices, banks, subbanks, pages, etc.). Of course any number and arrangement of slices may be used. Thus, for example, any of one or more stacked memory packages may contain 2, 4, 8, 9, 16, 18 (an odd number may correspond to the use of spares or some portions for error checking, etc.) or any number of memory chips (memory devices, chips, die, stacks of chips, stacks, etc.). Thus, for example, any of one or more memory chips may contain 2, 4, 8, 9, 16, 18, or any number of slices. Thus, for example, any of one or more echelons may contain 2, 4, 8, 9, 16, 18, or any number of slices. One or more of the plane (DRAM plane or other memory technology plane), slice, echelon, etc. may be virtual (e.g. abstract, soft, imaginary, configurable, programmable, reconfigurable, etc.). For example, a single DRAM die may be divided into 4 sections, each of which may be considered as (e.g. connected in an architecture as, addressed by the CPU as, configured by the system as, etc.) a DRAM plane. For example, two or more DRAM die may be considered as a single DRAM die, etc. For example, two or more echelons of a first type (themselves an abstract representation) may be considered as an echelon of a second type etc. For example, a virtual pairing of a DRAM die (or portions of a DRAM die) with a NAND flash die (or portions of a NAND flash die) may be useful if the NAND flash die is used to back (e.g. shadow, copy, battery back, checkpoint, etc.) the DRAM contents. For example, the abstract merging of eight DRAM echelons with a ninth DRAM echelon may be useful when the ninth DRAM echelon is used (e.g. transparently to the CPU etc.) to perform an ECC check on data stored in the eight DRAMs etc. For example, the abstract merging of eight DRAM banks with a ninth DRAM bank may be useful when the ninth DRAM bank is used (e.g. transparently to the CPU etc.) as a spare that may be automatically swapped into operation (e.g. by a logic chip in a stacked memory package, etc.) on failure of one DRAM die, for example.

In one embodiment, a first memory echelon may be contained in a one stacked memory package but may span (e.g. be comprised of, consist of, be formed from, etc.) less than the total number of chips in the package (e.g. the first echelon may span two chip in a four-chip package etc.) and second memory echelon is contained in a different stacked memory package (with a similar structure, e.g. spanning two chips, or with a different structure, etc.).

In one embodiment, a first echelon and a second echelon may be joined to form a super-echelon. For example, a first echelon in a first chip package that spans two chips may be joined (merged, added to, etc.) a second echelon in a second stacked memory package. For example, a 2-chip echelon ME1 in stacked memory package 1 may be merged with a 2-chip echelon ME2 in stacked memory package 1 to form a 4-chip super echelon SE3. Of course, the number of chips in ME1 and ME2 need not be the same, but may be. Of course, the types of chips used in ME1 and ME2 need not be the same, but may be. Of course, the chips used in ME1 (or used in ME2) need not be the same, but may be. For example, ME1 and ME2 may use a mix of DRAM and NAND flash memory chips, etc.

In one embodiment, memory super-echelons may contain echelons and/or memory super-echelons [e.g. memory echelons may be nested any number of layers (e.g. tiers, levels, etc.) deep, etc.].

In one embodiment, other virtual elements including memory super-echelons may contain echelons or other parts or portions of different memory types. Thus, for example, a memory echelon or super echelon may be formed from one or more DRAM die with different timing characteristics and/or behavioral characteristics and/or functional characteristics. For example, stacked memory package 1 may comprise DRAM type 1 with an access time or other parameter p1 (e.g. critical timing parameter, performance characteristics, behavior, configuration, data path size, width, etc.) and stacked memory package 2 may comprise DRAM type 2 with parameter p2. A virtual DRAM, virtual stacked memory package, or virtual echelon may be formed from one or more parts of stacked memory package 1 and stacked memory package 2. One or more logic chips in one or both stacked memory packages (acting autonomously, acting in cooperation via peer-peer signaling, acting via system configuration, etc.) may act to make the combination of stacked memory package 1 and stacked memory package 2 appear, for example, as a larger stacked memory package 3 with parameter p3. For example, if p1 and p2 are access times then access time p3 may be emulated (e.g. mimicked, constructed, supported as, configured to, etc.) as the larger of p1 and p2, etc. Of course, any parameter or combination of parameters and/or functional behavior may be so emulated using the functionality of one or more logic chips in one or more stacked memory packages. Of course, the combination of elements e1 and e2 does not have to appear as element e3. For example, one or more stacked memory packages may be merged (combined, joined, virtualized, etc.) so as to emulate (simulate, appear as, etc.) a single, but larger, DRAM die, etc. For example, one or more echelons may be merged to emulate a DIMM, or DIMM rank, etc. For example, one or more slices may be merged to emulate an echelon, etc. Of course, the combination of one or more elements does not have to appear as a single element. Thus, for example, three DRAM die may be merged to emulate two DRAM die (e.g. with one DRAM die being used as an active spare, etc.), etc.

In one embodiment, memory echelons and/or super-echelons may be used to create real or virtual versions of standard structures. For example, a group or groups of memory chip portions may be used to form echelons and/or super-echelons that form (e.g. represent, mimic, behave as, appear as, etc.) a (real or virtual) rank of a conventional DIMM, a bank of a conventional DRAM, a conventional DIMM or group of DIMMs, etc. as shown for example, in FIG. 3 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

In FIG. 23-4, the connections between CPU and stacked memory packages may use a serial bus 23-424. The serial bus may use a packet protocol that includes (but is not limited to) a read request 23-444 with format as shown in FIG. 23-4. Of course, any packet format may be used.

In FIG. 23-4, the read request packet format may include (but is not limited to) an ID field 23-430 that may uniquely identify each request. The ID field may be part of a header field for example, as shown in FIG. 23-3.

In FIG. 23-4, the read request packet format may include (but is not limited to) a memory subsystem address field that may comprise (but is not limited to) the following fields: stacked memory package address 23-432; memory echelon address 23-440. Other fields in the memory subsystem address field (such as 23-434, 23-436, 23-438, 23-442) may be used for other parts or portions (or groups of parts or portions) of the memory subsystem including (but not limited to): ranks, banks, subbanks, die, or other parts or portions (or groups of parts or portions) of memory devices and/or stacked memory packages, etc. For example, in FIG. 23-4, the read request packet may contain a stacked memory package address of 3, thus addressing the read request to stacked memory package 3 23-414. For example, in FIG. 23-4, the read request packet may contain a memory echelon address of 12, thus addressing the read request to memory echelon 12 23-418 within stacked memory package 3, etc.

In one embodiment, the connections between CPU and stacked memory packages may be as shown, for example, in FIG. 23-2. Each stacked memory package may have a logic chip that may connect (e.g. couple, communicate, etc.) with neighboring stacked memory package(s). One or more logic chips may connect to the CPU.

In one embodiment, the connections between CPU and stacked memory packages may be through intermediate buffer chips (buffers, registers, buffer logic, FPGAs, ASICs, etc.).

In one embodiment, the connections between CPU and stacked memory packages may use memory modules (e.g. DIMMs, memory assemblies, memory modules, mezzanine cards, memory subassemblies, etc.), as shown for example, in FIG. 3 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

In one embodiment, the connections between CPU and stacked memory packages may use a substrate (e.g. the CPU and stacked memory packages may use the same package, etc.).

As an option, the memory system using stacked memory packages of FIG. 23-4 may be implemented in the context of the architecture and environment of FIG. 5, U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

As an option, the memory system using stacked memory packages of FIG. 23-4 may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the memory system using stacked memory packages of FIG. 23-4 may be implemented in the context of any desired environment.

FIG. 23-5

FIG. 23-5 shows a stacked memory package, in accordance with another embodiment. As an option, the system of FIG. 23-5 may be implemented in the context of the architecture and environment of the previous Figures and/or any subsequent Figure(s). Of course, however, the system of FIG. 23-5 may be implemented in the context of any desired environment.

In FIG. 23-5, the stacked memory package 23-500 contains four memory chips 23-510. In FIG. 23-5, each memory chip is a DRAM, but any memory technology or mix of memory technologies may be used. For example, one or more memory chips may be DRAM, while one or more memory chips may be NDAND flash, etc. Each memory chip may also contain more than one memory technology. For example, each memory chip may contain DRAM and NAND flash. In FIG. 23-5, each DRAM is a DRAM plane. In general each memory chip may form a memory plane. The memory plane may be constructed in a virtual fashion. For example, more than one memory chip may be used to form a single memory plane. For example, a portion of a memory chip, or portions of a memory chip, or portions of more than one memory chip may be used to form a memory plane.

In FIG. 23-5, a logic chip may be coupled (internal to the stacked memory package) to the stacked memory chips and coupled (external to the stacked memory package) to the rest of the memory system (not shown). Of course, the logic chip may be coupled to the memory chips in any fashion. Of course, the logic chip may be coupled to the memory system in any fashion. In FIG. 23-5, the logic chip may form a logic plane 23-520. More than one logic chip may be used. A logic chip may form more than one logic plane. For example, two groups (e.g. sets, collections, allotments, partitions, etc.) of memory chips may be formed, with each group being coupled to (e.g. connected to, assigned to, controlled by, etc.) a single logic chip and/or logic plane.

In FIG. 23-5, each DRAM may be subdivided into one or more portions. The portions may be slices, banks, subbanks, etc.

In FIG. 23-5, a memory echelon 23-534 may be composed of one or more portions. In FIG. 23-5, a memory echelon may be comprised of one or more portions called DRAM slices 23-536. In FIG. 23-5, a memory echelon is comprised of 4 DRAM slices. Typically the number of slices will be an even number, but any number (including one, or an odd number, etc.) may be used. Typically, there may be one DRAM slice per echelon on each DRAM plane, but any number of slices on any number of planes may be used. The DRAM slices may be aligned (e.g. vertically aligned, in a column within a package, etc.), but need not be aligned in any physical way.

In FIG. 23-5, each memory echelon contains 4 DRAM slices with each DRAM slice located on a single memory chip. Other arrangements of slices may be used. For example, two slices may be located on one memory chip and two slices may be located on another memory chip, etc. Different numbers of slices may be used in different echelons. For example, some echelons may use an odd number of slices with one slice being used for error protection of stored data, while other echelons may use an even number of slices with no error protection. For example, some echelons may use two extra slices to increase error protection, while some echelons may just have one extra slice for error protection, etc.

In FIG. 23-5, each DRAM slice may contain 2 banks 23-530. Typically, the number of banks will be an even number, but any number of banks (including one, or any odd number) may be used.

In FIG. 23-5, each bank may contain 4 subbanks 23-532. Typically, the number of subbanks will be an even number, but any number of subbanks (including one, or any odd number) may be used. Subbanks may be constructed so that one or more operations (e.g. commands, instructions, requests, etc.) may be conducted on one subbank in parallel or partially in parallel, etc. with another subbank in the same bank. For example, a read operation in first subbank of a first bank may be pipelined (e.g. completed partially in parallel, overlapping in time, etc.) with a read or other operation(s) in one or more second subbanks in the first bank. Subbanks do not have to be used. For example, a bank may not contain any subbanks (in which case the number of subbanks could be considered to be zero, or a subbank could be considered to be equivalent to a bank, etc.).

In FIG. 23-5, each memory echelon contains 4 DRAM slices, 8 banks, 32 subbanks. Any number and arrangement of subbanks within banks within slices within echelons may be used.

In FIG. 23-5, each DRAM plane contains 16 DRAM slices, 32 banks, 128 subbanks. Any number and arrangement of subbanks within banks within slices within memory planes may be used.

In FIG. 23-5, each stacked memory package contains 4 DRAM planes, 64 DRAM slices, 512 banks, 2048 subbanks. Any number and arrangement of subbanks within banks within slices within memory packages may be used.

There may be any number and arrangement of DRAM planes, banks, subbanks, slices and echelons. For example, using a stacked memory package with 8 memory chips, 8 memory planes, 32 banks per plane, and 16 subbanks per bank, a stacked memory package may have 8×32×16 addressable subbanks or 4096 subbanks per stacked memory package.

In FIG. 23-5, the logic chip may be coupled to (connected to, linked with, etc.) the rest of the memory system (e.g. other stacked memory packages, CPUs, other connected devices, etc.) using one or more high-speed serial links (not shown in FIG. 23-5, but may be as shown in other Figure(s), for example, see FIG. 23-4). Of course, any form of serial link(s), buses, or other wired, wireless, optical or other coupling or combination of coupling may be used to communicate signals between the logic chip(s) and the rest of the memory system. One or more high-speed serial links (or one or more of other coupling techniques) may contain one or more logical streams (e.g. signals, bus, group of signals, collection of signals, multiplexed signals, packets, etc.). In FIG. 23-5, the logical streams may include (but are not limited to): a request stream 23-516, a response stream 23-518. There may be (and generally will be) other signals (control signals, control packets, termination signals, clocks, strobes, synchronization signals, configuration signals, test signals, enables, power-down signals, etc.) connected to the logic chip(s) that are not shown in FIG. 23-5.

In FIG. 23-5, the logic chip may be coupled to the one or more memory chips using one or more buses 23-514 (e.g. memory buses, DRAM buses, etc.) or other coupling means. For example, one or more of the buses may use through-silicon vias (TSVs). The TSVs may for example, be arranged in one or more arrays that form vertical conducting columns through the memory stack. In FIG. 23-5 the buses may include (but are not limited to): a command bus, a write data bus, a read data bus. The read data bus and write data bus may be separate or may be multiplexed. The command bus may be separate or multiplexed with one or more data buses. In FIG. 23-5 the arrangement of command bus, read data bus, write data bus that is shown may therefore represent the logical connections, but does not necessarily represent the physical implementation (but may do so). Different bus schemes (e.g. circuits, topologies, multiplex schemes, architectures, bus technology, timing, signaling schemes, arbitration, virtual channels, encoding, protocols, etc.) may be used for different memory technologies. If different memory technologies are used within a stacked memory package (either on different die or one the same die) then different bus technologies may be used. In some cases, the same bus technology may be used for different memory technologies, but using a different protocol (e.g. different signaling standard, different timing, different packet formats, etc.). Connection resources (e.g. wires, TSVs, RDL traces, bumps, balls, etc.) and/or bus resources (circuits, drivers, receivers, termination, arbitration circuits, virtual channels, etc.) may be shared, multiplexed, switched, configured, reconfigured, arbitrated, etc. For example, if one or more TSV connections fails, spare connections may be used. For example, if one or more TSV connections on bus 1 fails, then other connections from bus 1 or connections from bus 2 may be switched, swapped, re-routed, etc.

In FIG. 23-5, there are multiple slices per memory plane. Each slice may have multiple banks and subbanks. Each memory plane may have one or more buses that may couple slices in a memory echelon. For example, in one embodiment, each bank may have a command bus and a 16-bit data bus multiplexed between read and write. Thus, for example, in FIG. 23-5 there may be 16 (16 slices)×2 (2 banks per slice)×16-bit (16-bit bus per bank) data buses (e.g. 32×16-bit data bus) and 16×2 (e.g. 32) command buses coupling the logic chip and each memory chip (e.g. in FIG. 23-5 one command bus (one of the 32 command buses), connects the logic chip to four slices on four memory chips, etc.). For example, in one embodiment, each subbank may have a command bus and an 8-bit read data bus and an 8-bit write data bus. Thus, for example, there may be 16 (16 slices)×2 (2 banks per slice)×4 (4 subbanks per bank)×8-bit (8-bit bus per bank) read data buses (e.g. 128×8-bit read data bus), 128×8-bit write data bus, and 128 command buses coupling the logic chip and each memory chip. Of course, any number of buses (read, write, command, control, power, etc.) may be used of any width and type in order to couple and/or communicate and/or connect signals and other information, supplies, resources etc. within a stacked memory package. Buses may be multiplexed, data streams merged etc. at a variety of points. Thus, subbanks may have separate read data buses and write data buses but the banks may use a multiplexed read data bus and write data bus etc. (e.g. data is merged and/or multiplexed between the subbanks and the bank level of hierarchy etc.). Similarly, banks may use separate read data bus and write data bus on each memory die, but the buses connecting die may use multiplexed read data buses and write data buses etc. (e.g. data is merged and/or multiplexed between the die and package level of hierarchy, etc.).

In FIG. 23-5, the request stream may include (but is not limited to) read requests 23-522, write requests 23-526. In FIG. 23-5 the response stream may include (but is not limited to) read responses 23-524. In FIG. 23-5, the request stream and response stream may be packets communicated on one or more serial links or may use a bus, for example. In FIG. 23-5, the request stream and response stream are shown as separate but may use a multiplexed bus, for example. In FIG. 23-5 only a request stream and response stream are shown, but there may be other logical streams (e.g. multiplexed, packetized, etc.) or physical streams (e.g. separate buses or groups of signals). For example, there may be a separate command stream with the request stream and response stream just containing (e.g. coupling, communicating, etc.) data etc.

In FIG. 23-5, the read request may include (but is not limited to) the following fields: ID, identification; a read address field that in turn may include (but is not limited to) module, package, echelon, bank, subbank fields. Other fields (e.g. control fields, error checking, flags, options, etc.) may be (and generally are) present in the read requests. For example, a type of read (e.g. including, but not limited to, read length, etc.) may be included in the read request. For example, the default access size (e.g. read length, write length, etc.) may be a cache line (e.g. 32 bytes, 64 bytes, 128 bytes, etc.). Other read types may include a burst (of 1 cache line, 2 cache lines, 4 cache lines, 8 cache lines, etc.). As one option, a chopped read type may be supported (for 3 cache lines, 5 cache lines, etc.) that may terminate a longer read type. Other flags, options and types may be used in the read requests. For example, when a burst read is performed the order in which the cache lines are returned in the response may be programmed etc. Not all of the fields shown in the read request in FIG. 23-5 need be present. For example, if there are no subbanks used, then the subbank field may be absent (e.g. not present, present but not used, zero or a special value, etc.), or ignored by the receiver, etc.

In FIG. 23-5, the read response may include (but is not limited to) the following fields: ID, identification; a read data field that in turn may include (but is not limited to) data fields (or subfields) D0, D1, D1, D2, D3, D4, D5, D6, D7. Other fields, subfields, flags, options, types etc. may be (and generally are) used in the read responses. Not all of the fields shown in the read response in FIG. 23-5 need be present. Of course, other sizes for each field may be used. Of course, different numbers of fields (e.g. different numbers of data fields and/or data subfields etc. may be used).

In FIG. 23-5, the write request may include (but is not limited to) the following fields: ID, identification; a write address field that in turn may include (but is not limited to) module, package, echelon, bank, subbank fields; a write data field that in turn may include (but is not limited to) data fields (or subfields) D0, D1, D1, D2, D3, D4, D5, D6, D7. Not all of the fields shown in the write request in FIG. 23-5 need be present. Other fields (e.g. control fields, error checking, flags, options, etc.) subfields, etc. may be (and generally are) present in the write requests. For example, a type of write (e.g. including, but not limited to, write length, etc.) may be included in the write request. For example, the default write size may be a cache line (e.g. 32 bytes, 64 bytes, 128 bytes, etc.). Other flags, options and types may be used in the write requests. Not all of the fields in the write request shown in FIG. 23-5 need be present. For example, if there are no subbanks used, then the subbank field may be absent (e.g. not present, present but not used, zero or a special value, etc.), or ignored by the receiver, etc. Of course, other sizes for each field may be used. Of course, different numbers of fields (e.g. different numbers of data fields and/or data subfields etc. may be used).

A CPU with one or more levels of cache usually (e.g. typically, generally, etc.) reads from the memory system in units (e.g. blocks, with granularity, etc.) of one or more cache lines. A typical CPU cache line length may be 64 bytes. For example, in order to read (or write) a 64-byte cache line eight consecutive 8-byte (64-bit) accesses may be required from (from in the case of a read, to in the case of a write) a 64-bit stacked memory package (or 72 bits for a stacked memory package with integrated ECC for example).

In one embodiment, a 64-bit stacked memory package (e.g. a stacked memory package that provides (e.g. supports, supplies, etc.) access in basic units of 64-bits, etc.) may contain 8 (or a multiple of 8) memory chips. Each memory chip may have a width of 8 bits (e.g. "by 8" memory chip; ×8 memory chip; a memory chip that has an on-die read and write IO width of 8 bits; a memory chip that presents 8 bits of data on its DQ, data pins, internal data bus; etc.). As one option, read and write accesses to the memory chips may be burst-oriented. Read and write accesses may start at a selected location (e.g. read address, write address) and continue for a programmed number (e.g. a burst length) or otherwise controlled number (e.g. using external (e.g. external to the memory chip) commands, external signals, register settings on the memory chip and/or logic chip, etc.) of locations in a programmed sequence or otherwise controlled sequence (e.g. using external (e.g. external to the memory chip) commands, external signals, register settings on the memory chip and/or logic chip, etc.). A burst access (e.g. burst mode, burst read, burst write, etc.) may be initiated (e.g. triggered, started, etc.) by a single read request packet (which may translate to a single read command per memory chip accessed) or a single write request packet (which may translate to a single write command per memory chip accessed). The memory chip burst length may, for example, determine (or correspond to, be equal to, be equivalent to, etc.) the number of column locations (e.g. access granularity, etc.) that may be accessed for a given read request (command) or write request (command). The memory chip burst length (e.g. number of consecutive reads, number of consecutive writes) is referred to herein as MCBL. Thus, a single read command issued to a memory chip in a stacked memory package may result in a burst of MCBL reads.

In one embodiment, the burst length(s) supported by the stacked memory package may be different from the memory chip burst length. The stacked memory package burst length (e.g. number of consecutive reads, number of consecutive writes) is referred to herein as SMPBL. Thus a single read request packet may result in a burst of SMPBL reads, as seen for example, by the CPU. The read request may be translated into one or more read commands by the logic chip(s) in a stacked memory package. The translated read commands may then be issued to the memory chips in the stacked memory package. The read commands may, for example, result in burst reads from the memory chips of burst length MCBL. Of course, as an option, the burst length(s) supported by the stacked memory package may be the same as the memory chip burst length(s) (e.g. MCBL=SMPBL, etc.).

In one embodiment, the burst length of each memory chip in a stacked memory package may be a programmable value, and the programmable burst length value may include (but is not limited to) one of the following values: 8 (e.g. a fixed burst length mode, which may be compatible for example, with standard DDR3 SDRAM devices); 4 (e.g. a burst chop mode, in which a burst length of 8 may be interrupted and reduced to a burst length of 4); and/or programmable (e.g. controllable, selectable, switchable, variable, etc.) using external (e.g. external to the memory chip) commands and/or signals and/or register settings (e.g. on the fly burst mode, which may be compatible for example, with standard DDR3 SDRAM devices).

In one embodiment, each memory chip in a stacked memory package may natively support a programmable burst length value (e.g. may support a burst length value of 4, 8, 16, 32, etc.). In this case, the memory chip may support a burst access of length 4, for example, without chopping (e.g. terminating, prematurely ending, wasting, etc.) a longer burst access. The programmable memory chip burst length is referred to herein as PMCBL.

In one embodiment, a stacked memory package may support a programmable burst length value. The programmable memory chip burst length is referred to herein as PSMPBL.

In one embodiment of a stacked memory package, the programmable burst length(s) supported by the stacked memory package may be the same as the programmable memory chip burst length(s) (e.g. PMCBL=PSMPBL, etc.). In this case, the logic chip(s) in a stacked memory package may translate one PSMPBL stacked memory package request to one PMCBL memory chip command (e.g. one command for each memory chip that is required to be accessed to satisfy the request).

In one embodiment of a stacked memory package, the burst length(s) supported by the stacked memory package may be the same as the programmable memory chip burst length(s) (e.g. PMCBL=SMPBL, etc.). In this case, the logic chip(s) in a stacked memory package may translate one SMPBL stacked memory package request to one PMCBL memory chip command (e.g. one command for each memory chip that is required to be accessed to satisfy the request).

In one embodiment of a stacked memory package, the programmable burst length(s) supported by the stacked memory package may be the same as the memory chip burst length(s) (e.g. MCBL=PSMPBL, etc.). In this case the logic chip(s) in a stacked memory package may translate one PSMPBL stacked memory package request to one MCBL memory chip command (e.g. one command for each memory chip that is required to be accessed to satisfy the request).

In one embodiment of a stacked memory package, the programmable burst length(s) supported by the stacked memory package may be different from the programmable memory chip burst length(s) (e.g. PMCBL is not equal to PSMPBL, etc.). In this case, the logic chip(s) in a stacked memory package may translate one or more PSMPBL stacked memory package requests to one or more PMCBL memory chip commands (e.g. there may be more than command for each memory chip that is required to be accessed to satisfy the request).

In one embodiment of a stacked memory package, the burst length(s) supported by the stacked memory package may be different from the memory chip burst length(s) (e.g. MCBL is not equal to SMPBL, etc.). In this case, the logic chip(s) in a stacked memory package may translate one or more SMPBL stacked memory package requests to one or more MCBL memory chip commands (e.g. there may be more than command for each memory chip that is required to be accessed to satisfy the request).

In one embodiment, the logic chip(s) in a stacked memory package may translate (e.g. modify, store and modify, merge, separate, split, create, alter, logically combine, logically operate on, etc.) one or more requests (e.g. read request, write request, message, flow control, status request, configuration request and/or command, other commands embedded in requests (e.g. memory chip and/or logic chip and/or system configuration commands, memory chip mode register or other memory chip and/or logic chip register reads and/or writes, enables and enable signals, controls and control signals, termination values and/or termination controls, IO and/or PHY settings, coding and data protection options and controls, test commands, characterization commands, calibration commands, frequency parameters, burst length mode settings, timing parameters, latency settings, DLL modes and/or settings, power saving commands or command sequences, power saving modes and/or settings, etc.), combinations of these, etc.) directed at one or more logic chip(s) and/or one or more memory chips. For example, the logic chip in a stacked memory package may split a single write request packet into two write commands per accessed memory chip. For example, the logic chip may split a single read request packet into two read commands per accessed memory chip with each read command directed at a different portion of the memory chip (e.g. different banks, different subbanks, etc.). As an option, the logic chip(s) in a first stacked memory package may translate one or more requests directed at a second stacked memory package.

In one embodiment, the logic chip(s) in a stacked memory package may translate one or more responses (e.g. read response, message, flow control, status response, characterization response, etc.). For example, the logic chip may merge two read bursts from a single memory chip into a single read burst. For example, the logic chip may combine mode or other register reads from two or more memory chips. As an option, the logic chip(s) in a first stacked memory package may translate one or more responses from a second stacked memory package.

In one embodiment, a cache line fetch may be initiated by a CPU etc. from a stacked memory package by issuing a read request to the stacked memory package with a read address. For example, the cache line may be 64 bytes in length divided into 8 words of 8 bytes each. Of course, words may be of any size.

In one embodiment, bursts may access (read, write) an aligned block of MCBL (or multiple of MCBL) consecutive words aligned to a multiple of MCBL. For example, assume an 8-word (64 byte) read request to address 008 and assume MCBL equals 8. The stacked memory package may return words 8, 9, 10, 11, 12, 13, 14, 15. As one option, the order of the data (e.g. order of words, order of bytes, order of bits, order of other groupings of bits, etc.) may be programmed. For example, as an option, the order may be programmed to be sequential (e.g. contiguous, such as word order 8, 9, 10, 11, 12, 13, 14, 15) or interleaved (such as word order 13, 12, 15, 14, 9, 8, 11, 10, etc.). As an option, the stacked memory package may allow the critical word of the cache line to be transferred first on a read. When a CPU cache miss occurs the critical word is the word (or fraction, portion, etc.) of the cache line that the CPU requested from the memory system. Of course, BL may be any value(s) and may be programmable. Of course, data may be divided in any level of granularity (e.g. words, doublewords, bytes, etc.) and words, doublewords, etc. may be of any size. As one option, the granularity of data (e.g. words, doublewords, etc.) may be programmable.

In one embodiment, bursts may access (read, write) a block less than or equal to MCBL words that may or may not be aligned to a multiple of MCBL. In this case, the stacked memory package may, for example, use subbanks in order to satisfy the unaligned request.

In one embodiment, bursts may access (read, write) an aligned block of SMPBL (or multiple of SMPBL) consecutive words aligned to a multiple of SMPBL.

In one embodiment, bursts may access (read, write) an aligned block of PSMPBL (or multiple of PSMPBL) consecutive words aligned to a multiple of PSMPBL.

In one embodiment, bursts may access (read, write) an aligned block of PMCBL (or multiple of PMCBL) consecutive words aligned to a multiple of PMCBL.

For example, in one embodiment, if the read data in the response is 64 bytes in length then the response may contain 8 fields D0-D7 that may each be 8 bytes (64 bits) in length. The origin (e.g. source, stored location, read location, address, etc.) of each of D0-D7 (e.g. which memory chip stores which bit) may be flexible and/or configurable (e.g. fixed at the design stage through design configuration options, fixed at manufacture, fixed at test, configured at start-up, configured at run time, programmable, reconfigurable, etc.).

In the examples that follow, a read request may be used as an example to illustrate memory chip access configurations, functionality, etc. but writes, write data, write commands, write requests etc. may be handled in a similar fashion to reads.

In one embodiment, each read from each memory chip may be a series (e.g. set, string, sequence, etc.) of reads (e.g. burst read, etc.) from a sequence of addresses based on the read address in the read request packet, etc. For example, a read request packet may contain a read address 8. Assume SMPBL equals 8 and assume MCBL equals 8. Assume a stacked memory package with 8 memory chips (memory chip 0 to memory chip 7). Assume each memory chip has width 8. Assume a first group of 8 bits from D0 may be read from (e.g. be stored in, originate from, etc.) memory chip 0, a second group of 8 bits from D0 from memory chip 1, a third group of 8 bits from D0 from memory chip 2, and so on. Then a single SMPBL equals 8 read request to memory system address 8 may result in a single MCBL equals 8 read command with read address 8 being issued to memory chip 0 that may then return a first group of 8 bits from D0. Similar read commands (seven of them, making eight in total) may be issued to memory chips 1, 2, 3, 4, 5, 6, 7 resulting in 64 bits of D0 being returned in the first access of the burst, 64 bits of D1 in the second access of the burst, and so on. The complete response may thus contain all 64 bytes (8×8 bytes, 512 bits) of the requested cache line. The groups of bits may be arranged in several fashions. For example, the first group of bits may correspond to D0[0] (e.g. bit 0 of D0), D0[1], D0[2], D0[3], D0[4], D0[5], D0[6], D0[7]; or D0[0], D0[7], D0[15], D0[23], D0[31], D0[39], D0[47], D0[55]; etc.

In one embodiment, the arrangement of bits in the memory chips may be chosen such that the information bits, words or other groups of bits (e.g. bytes, double words, cache lines, etc.) appear in a desired bit order in a write request and/or a read response on the high-speed serial link(s) (or other bus or coupling means used to connect the stacked memory package(s) to the rest of the memory system, etc.). As one option, the bit order may be fixed or programmable. For example, the read response shown in FIG. 23-5 may be transmitted such that the data D0-D7 is striped (e.g. spread, divided, cast, sliced, cut, etc.) across more than one lane of a high-speed serial link or striped across multiple wires on a parallel bus. For example, for signal integrity or other reasons, it may be desired that bits in D0 remain grouped together on a high-speed serial link or a parallel bus. For example, it may be required that the order of bits in one, several, or all of words D0-D7 or other bit groupings be changed (e.g. reversed, interleaved, swizzled, randomized, mirrored, otherwise permuted, etc.) as the response data moves from one bus type (e.g. a parallel on-chip bus) to another bus type (e.g. a high-speed serial link). For example, it may be required to reduce latency (e.g. time to arrive at the receiver, etc.) of one or more of D0-D7 by moving their relative position(s) in the response.

For example, in one embodiment, in a stacked memory package with 4 memory chips (memory chip 0 to memory chip 3), D0[0:7] (e.g. a first group of 8 bits from D0) and D0[8:15] (e.g. a second group of 8 bits from D0) may be read from a first memory chip with D0[0:7] stored in a first bank of a first slice of the first memory chip; D0[7:15] from a second bank of the first slice; etc. Thus, 64 bits may be read from 8 banks (8 bits from each bank) located across four memory chips in each of 8 accesses in a single burst (for 8×64 or 512 bits, 64 bytes in total). As one option, the accesses to each of the banks on a memory chip may be pipelined (e.g. overlap, be perfumed in parallel or a partially parallel manner, etc.).

For example, in one embodiment, in a stacked memory package with 4 memory chips (memory chip 0 to memory chip 3), D0[0:7] and D0[7:15] (e.g. a first group of 8 bits from D0 and a second group of 8 bits from D0) may be read from a first memory chip with D0[0:7] read in a first access to a first bank of a first slice of the first memory chip; D0[8:15] read in a second access to the first bank; etc. Thus, 64 bits may be read from 4 banks (8 bits from each bank in each access) located across four memory chips in each of 16 accesses (32 bits per access) in two bursts of 8 accesses per burst (for 2×8×4×8=16×32=8×64 or 512 bits, 64 bytes in total). As one option, the accesses to each of the banks on a memory chip may be pipelined (e.g. overlap, be perfumed in parallel or a partially parallel manner, etc.).

For example, in one embodiment, in a stacked memory package with MC memory chips (memory chip 0 to memory chip (MC−1)). Each memory chip may have BK banks (numbered 0 to (BK−1)). Each memory chip may have SB subbanks (numbered 0 to SB−1)). Each of the MC memory chips may be N-wide (e.g. each memory access is to N bits). Each memory chip may support a burst access of MCBL. The cache line size (and thus default access size for read and write) may be CL bits (e.g. typically CL=512 for a 64 byte cache line). The bits in CL may be referred to as CL[0:511] with bits thus numbered from 0 to 511. The cache line may be divided into K groups (e.g. G0, G1, G2, G3, . . . , G(K−1)) each of width CL/K bits. A general group member as may be referred to as GK. For example, if K=8, the 64-byte cache line has 8 groups, G0-G7. If K=8, each group GK is 512/8 or 64 bits (8 bytes) wide. The bits in GK may be referred to as GK[0:(CL/K)−1] or GK[0:63] with bits thus numbered from 0 to 63. In general, each group GK may correspond to a single access across a set of memory chips in a burst (e.g. K may be the number of memory chips accessed in a burst). Thus, G0 is the first access to a set of memory chips in a burst, G1 is the second access to the set of memory chips in a burst etc. Each group GK may be further subdivided into L subgroups, which we may refer to as GK.0, GK.1, . . . , GK.(L−1). A general subgroup member may be referred to as GK.L. In general, each subgroup GK.L may correspond to a single access to a single bank or subbank on a memory chip in a burst.

The groups GK and subgroups GK.L may be accessed in (e.g. written to and read from) the memory chips in the stacked memory package in various ways, several examples of which were given above. The groups GK, subgroups GK.L, and bits within groups GK and subgroups GK.L etc. may also be arranged in the write request data fields and read response data fields in various ways while still ensuring that data written to a given address is always returned when read from that same address.

In the examples that follow, a focus may be on showing the access configuration (e.g. access pattern, algorithm, methods, etc.) by describing the read access for two example groups G0.0 (e.g. a first group of bits) and G0.1 (e.g. a second group of bits), with the remaining groups and subgroups following the same described pattern. Writes are handled in a similar fashion to reads.

The simplest configuration is K=MCBL. Thus G0.0, G0.1 etc. may be N-bits wide. In this case, N bits are read from a bank in each accessed memory chip in each of MCBL accesses. Thus, CL bits may be read from CL/(N×MCBL) banks (N bits from each bank in each access).

If CL/(N×MCBL)<MC then the CL/(N×MCBL) banks may be arranged such that (a) CL/(N×MCBL) memory chips are accessed with one bank (or subbank) accessed per memory chip, but not all MC memory chips need be accessed or (b) less than CL/(N×MCBL) memory chips are accessed but more than one bank (or subbank) is accessed on at least one memory chip (but less than BK banks or less than BK×SBK subbanks are accessed on each memory chip).

If CL/(N×MCBL)=MC then the CL/(N×MCBL) banks may be arranged such that (a) exactly one bank (or subbank) is accessed on each of the MC memory chips or (b) less than MC memory chips may be accessed if more than one bank (or subbank) is accessed on at least one memory chip (but less than BK banks or less than BK×SBK subbanks are accessed on each memory chip).

If CL/(N×MCBL)>MC then the CL/(N×MCBL) banks may be located across MC memory chips and more than one bank (or subbank) must be accessed on at least one memory chip (but less than BK banks or less than BK×SBK subbanks are accessed on each memory chip).

For example, in the case CL/(N×MCBL)>MC, G0.0 and G0.1 may be read from a first memory chip with G0.0 read in a first access to a first bank 0 of a first slice of the first memory chip 0; G0.1 read in a second access to the first bank 0; G0.2/G0.3 are read from memory chip 1; etc.

As one option, the accesses to each of the banks on a memory chip when more than one bank is accessed may be pipelined (e.g. overlap, be perfumed in parallel or a partially parallel manner, etc.).

For example, in one embodiment, in a stacked memory package with 4 memory chips (memory chip 0 to memory chip 3), G0.0 and G0.1 (e.g. a first group of 8 bits from G0 and a second group of 8 bits from G0) may be read from a first memory chip with G0.0 stored in a first subbank of a first bank of a first slice of the first memory chip; G0.1 from a second subbank of the first bank; etc. As one option, the accesses to each of the banks and/or subbanks on a memory chip may be pipelined (e.g. overlap, be perfumed in parallel or a partially parallel manner, etc.).

It may now readily be seen that a large set of powerful and flexible access configurations are possible for general values for K and MCBL (e.g. K not equal to MCBL)—where K is generally the number of memory chips accessed in a burst access and MCBL is the burst length—as well as general values for CL (cache line size), MC (number of memory chips in a stacked memory package), BK (the number of banks on each memory chip), SBK (the number of subbanks on each memory chip). This large general set may be divided into a collection of sets and subsets, each with one or more parameters, features or other aspects in common.

Some sets or subsets of the access configurations described above may have special features. For example, in one embodiment, information bits may be arranged across memory chips so that bytes, words, or portions of words or other bit groupings are stored in a single memory chip. Such sets or subsets of access configurations may be useful for example, to save power.

For example, in one embodiment, in a stacked memory package with 8 memory chips (memory chip 0 to memory chip 7), G0 may be read from (e.g. be stored in, originate from, etc.) memory chip 0, G1 from memory chip 1, G2 from memory chip 2, and so on.

For example, in one embodiment, in a stacked memory package with 4 memory chips (memory chip 0 to memory chip 3), G0 may be read from memory chip 0, G1 from memory chip 0, G2 from chip 1, G3 from memory chip 1, and so on.

For example, in one embodiment, in a stacked memory package with 8 memory chips (memory chip 0 to memory chip 7), G0-G7 may be read from a single memory chip or any number of memory chips.

For example, in one embodiment, in a stacked memory package with 8 memory chips (memory chip 0 to memory chip 7), G0-G7 may be read from a single memory chip with G0-G3 stored in a first bank of a first slice and G4-G7 stored in a second bank of the first slice.

For example, in one embodiment, in a stacked memory package with 8 memory chips (memory chip 0 to memory chip 7), G0-G7 may be read from a first memory chip with G0 stored in a first subbank of a first bank of a first slice of the first memory chip; G1 from a second subbank of the first bank; G2 from a third subbank of the first bank; G3 from a fourth subbank of the first bank; G4 from a fifth subbank of a second bank of the first slice; G5 from a sixth subbank of the second bank; G6 from a seventh subbank of the second bank; G7 from an eighth subbank of the second bank; etc.

Thus, in the examples described above, a byte may be stored across 1 memory chip, 4 memory chips, or 8 memory chips, for example, in a stacked memory package. In one embodiment of a stacked memory package, a byte of data (8 bits) may be stored across any number of memory chips in the stacked memory package. The number of chips used to store 8 bits need not be limited to 8. For example, if ECC is integrated into the stacked memory package, 8 bits of data may be stored across 9 memory chips.

Thus, in the examples described above, a word (64 bits) comprising 8 bytes may be stored across 1, 2, 4, 8, 16, 32, or 64 memory chips or any number of memory chips. In one embodiment of a stacked memory package, a word of data (64 bits) may be stored across any number of memory chips in the stacked memory package. For example, 64 bits of data may be stored across 1, 2, 4, 8, 16, 32, or 64 memory chips. For example, if ECC is integrated into the stacked memory package, 64 bits of data (72 bits including an 8-bit ECC code) may be stored across 1, 9, 18, or 36 memory chips.

Thus, in the examples described above, a system unit of information (e.g. cache line, doubleword, word, byte, etc.) may be stored across 1, 2, 4, 8, 16, 32, or 64 memory chips or any number of memory chips. In one embodiment of a stacked memory package, a system unit of information may be stored across any number of memory chips in the stacked memory package. For example, 256 bits of data may be stored across 1, 2, 4, 8, 16, 32, 64, . . . , 256 or any number of memory chips, etc.

In one embodiment, a system unit of information (e.g. cache line, doubleword, word, byte, etc.) may be stored across more than one stacked memory package. For example, a 64-byte cache line may comprise 8 words E0-E7. Four words E0-E3 may be stored in a first stacked memory package SMP0 and four words E3-E7 may be stored in a first stacked memory package SMP1. For example, the access latency (the time to read a word or write a word) of SMP0 may be less than SMP1 (for example, SMP1 may be located at a position in the memory system that electrically further away than SMP0). A CPU may thus choose to store critical words of a cache line or cache lines in SMP0. Of course, the critical word or critical words may not be contained in (e.g. part of, etc.) E0-E3 in which case other arrangements of words (or other portions of a cache line or cache lines) may be appropriately distributed (e.g. assigned, stored, etc.) between SMP0 and SMP1.

Thus, it may be seen from the examples given above that a variety of configurations (e.g. system architectures, system configurations, system topologies, system structures, etc.) may be achieved (e.g. constructed, built, manufactured, programmed, configured, reconfigured, set, etc.) using combinations of subbanks, banks, slices, echelons, other memory chip portion(s), stacked memory packages, portions of stacked memory packages, etc. that may be used in different access (read, write, etc.) configurations (e.g. modes, arrangements, combinations, etc.) to achieve a very flexible and powerful memory system using one or more stacked memory packages.

In one embodiment, different access types (e.g. with the read type or write type embedded in one or more fields in a request, etc.) may be used to denote (e.g. control, signal, perform, etc.) the configuration of one or more access operations. For example, it may be more power efficient to write and then read information stored in a single memory chip, but yet it may be faster to write and then read information stored in multiple memory chips. For example, it may be more power efficient to write and then read information stored in a single bank (or subbank, etc.) of a memory chip, but yet it may be faster to write and then read information stored in multiple banks (or subbanks). Yet still, for example, it may be more power efficient to write and then read information stored in a single echelon of a stacked memory package, but yet it may be faster to write and then read information stored in multiple echelons. By using different read types and write types (e.g. with the corresponding types embedded in the read request and corresponding write request) different read configurations and write configurations may be used (e.g. employed, configured, etc.), including (but not limited to) examples of read configurations and write configurations such as those described above and elsewhere herein. Of course, read configurations and write configurations need not be configurable or reconfigurable. The read configurations and write configurations may be fixed, or a subset of possible read configurations and write configurations fixed (e.g. programmed etc.), at design time (through design options and/or CAD program options and/or other design or designer choices etc.), at manufacturing time (according to demand for example, by fuse or other programming options, using mask or assembly options, etc.); at test time (depending on test results, yield, failure mechanisms, diagnostics, or other results etc.); at start-up (depending on BIOS settings, configuration files, preferences, operating modes, etc.); at run time (depending on use, power, performance required, feedback from measurements, etc.); etc.

Configurations (architectures, structures, functions, topologies, technologies, etc.) including (but not limited to) those described above and elsewhere herein may be flexible (e.g. programmable, configurable, reconfigurable, etc.). Thus, for example, bus (internal or external) widths [or any other system parameter, circuit, function, configuration, memory chip register, logic chip register, timing parameter, timeout parameter, clock frequency or other frequency setting, DLL or PLL setting, bus protocol, flag or option, coding scheme, error protection scheme, bus and/or signal priority, virtual channel priority, number of virtual channels, assignment of virtual channels, arbitration algorithm(s), link width(s), number of links, crossbar or switch configuration, PHY parameter(s), test algorithms, test function(s), read functions, write functions, control functions, command sets, etc.] may be changed, configured, or reconfigured (e.g. at manufacture, testing, start-up, run time, etc.) in order to maximize performance, reduce cost, reduce power, increase reliability, perform testing (at manufacture or during operation), perform calibration (at manufacture or during operation), perform circuit or other characterization (at manufacture or during operation), respond to internal or external system commands (e.g. configuration, reconfiguration, register command(s) and/or setting(s), enable signals, termination and/or other control signals, etc.), maximize production yield, minimize failure rate, recover from failure, or for other system constraints, cost constraints, reliability constraints or other constraints etc.

As an option, the stacked memory package of FIG. 23-5 may be implemented in the context of the architecture and environment of FIG. 9, U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

As an option, the stacked memory package of FIG. 23-5 may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the stacked memory package of FIG. 23-5 may be implemented in the context of any desired environment.

FIG. 23-6A

FIG. 23-6A shows a basic packet format system for a read request, in accordance with another embodiment. As an option, the system may be implemented in the context of the architecture and environment of any previous and/or subsequent Figure(s). Of course, however, the system may be implemented in any desired environment.

In FIG. 23-6A, the basic packet format system 23-600 comprises a read request. The packet format system may also be called a packet structure, command, command structure, and may be part of a protocol structure, protocol architecture, packet architecture, etc.

The read request may be part of a basic packet format system that may include (but is not limited to) two basic commands (e.g. requests, etc.) and a response: read request, write request; read response (or read completion).

A basic packet format system may also be called (or be part of, etc.) a basic command set, basic command structure, basic protocol structure, basic protocol architecture, etc. We focus on one or more basic packet formats and packet format systems below and elsewhere herein in order to focus on the important characteristics of the system that may determine performance, efficiency, etc. Other additional packets (e.g. error handling, control, flow control, messaging, configuration, etc.) that may use additional packet formats are generally present (but need not be present) in a complete set of packet formats (e.g. used to form or be part of a complete protocol, used to form or be part of a complete command set, etc.), but these additional packets typically do not materially affect the principles of operation and functions as described below. For example, the addition of flow control packets may affect the efficiency of information transfer (e.g. by adding additional overhead, etc.), but the additional overhead is usually small and may be relatively constant across different protocols, etc.

In this description the packets, commands and command formats may be simplified (e.g. some fields not shown, field widths reduced, etc.) in order to provide a base level of commands (e.g. with simple formats, with simple commands, etc.). The base level of commands (e.g. base level command set, etc.) allow the description of the basic operation of the system. The base level of commands, packet formats, etc. may provide a minimum level of functionality for system operation. The base level of commands also may allow greater clarity of system explanation. The base level of commands may also provide a base that allows a clear explanation of added features and functionality obtained, for example, by using more complex commands, and/or command sets, and/or packet formats, and/or protocols, etc.

In FIG. 23-6A, the read request packet format has been simplified (e.g. not all fields that may be present are shown, etc.) in order to provide a base level of functionality (e.g. simplest possible packet format, simplest possible command, etc.). The base level of command (e.g. base level packet format, etc.) allows us to describe the basic operation of the read request and/or system. The base level packet format may only provide a minimum level of functionality for system operation. The base level packet format allows clarity of explanation of packet functions and system operation. The base level packet format allows us to more easily explain added features and functionality of more complex read request packet formats for example.

In one embodiment of a stacked memory package, the base level packet format for a read request may be as depicted in FIG. 23-6A with the fields and field widths as shown. As one option, other fields (e.g. control fields, error checking, flags, options, etc.) may be (and generally are) present. As another option, not all of the fields shown need be present. Of course, other sizes for each field may be used. Additionally, different numbers of fields (e.g. different numbers of data fields and/or data subfields etc.) may be used. The definitions and functions of the various fields shown in FIG. 23-6A will be described in association with the description of the protocol model below.

FIG. 23-6A does not show any message or other control packets (e.g. flow control, error message, etc.) that may be associated with a read request and that are generally present (but need not be present) in a complete set of packet formats.

Command sets may typically contain a set of basic information. For example, one set of basic information may be considered to include (but is not limited to): (1) posted transactions (e.g. without a completion and/or response expected) or non-posted transactions (e.g. a completion and/or response is expected); (2) header information and data information; (3) direction (transmit/request or receive/completion). Thus, the pieces of information in a basic command set may comprise (but are not limited to): posted request header (PH), posted request data (PD), non-posted request header (NPH), non-posted request data (NPD), completion header (CPLH), completion data (CPLD). Other forms of the basic information in a command set and/or packet formats are possible. In some cases different terms and terminology may be used. For example, a read request may correspond to a non-posted request (with a read response expected) with NPH and NPD (e.g. a read address); a write request may correspond to a posted request with PH and PD (e.g. write data); a write response may correspond to a completion with CPLH and CPLD (e.g. read data).

In one embodiment of a stacked memory package, the command set may use message (e.g. error messages, status messages, configuration messages, etc.) and control packets (e.g. flow control, credit information, acknowledgement(s), ACKs, negative acknowledgement(s), NAKs, etc.) in addition to the base level command set and packet formats. Control, message and other parts of the command set or packet system may be in-band (e.g. carried with the basic commands and/or basic packets, etc.) or out-of-band (e.g. carried on a separate bus, channel, stream, etc.).

FIG. 23-6A shows one particular base level packet format for a read request. Of course many other variations (e.g. changes, alternatives, modifications, etc.) are possible (e.g. for a base level packet format and for more advanced packet formats possibly built on the base level packet format, etc.) and some of these variations will be described in more detail below and elsewhere herein.

For example, variations in the read request and other packet formats may include (but are not limited to) the following: the header field may be (and typically is) more complex than shown, including sub-fields (e.g. for routing, control, flow control, error handling, etc.); a packet ID or ID (e.g. tag, sequence number, etc.) may be part of the header field or a control field or a separate field; the packet length may be variable (e.g. denoted, marked, controlled by, etc. by a packet length field, etc.); the packet lengths may be one of one or more fixed but different lengths depending on a packet type, etc; the packet format may follow (e.g. adhere to, be part of, be compatible with, be compliant with, be derived from, etc.) an existing standard (e.g. PCI-E (e.g. Gen1, Gen2, Gen3, etc.), QPI, HyperTransport (e.g. HT 3.0 etc.), RapidIO, Interlaken, InfiniBand, Ethernet (e.g. 802.3 etc.), CEI, or other similar protocols with associated command sets, packet formats, etc.); the packet format may be an extension (e.g. superset, modification, etc.) of a standard protocol; the packet format may follow a layered protocol (e.g. IEEE 802.3 etc. with multiple layers (e.g. OSI layers, etc.) and thus have fields within fields (e.g. nested fields, nested protocols (e.g. TCP over IP, etc.), nested packets, etc.); data protection field(s) may have multiple components (e.g. multiple levels, etc. with CRC and/or other protection scheme(s) (e.g. ECC, parity, checksum, running CRC, use other codes or coding schemes, combinations of these, etc.) at the PHY layer, possibly with other protection scheme(s) (e.g. data protection, error detection, error correction, etc.) at one or more of the data layer, link layer, data link layer, transaction layer, network layer, transport layer, higher layer(s), and/or other layer(s), etc.); there may be more packets and commands than described here including (but not limited to): memory read request, memory write request, IO read request, IO write request, configuration read request, configuration write request, message with data, message without data, completion with data, completion without data, etc; the header field(s) may be different and/or modified (e.g. with flags, options, packet types, etc.) for each command/request/response/message type etc; commands may be posted (e.g. without completion expected) or non-posted (e.g. completion expected); packets (e.g. packet classes, types of packets, layers of packets, etc.) may be subdivided (e.g. into data link layer packets (DLLPs) and transaction layer packets (TLPs), etc.); framing etc. information may be added to packets at the PHY layer (and is not shown for example, in FIG. 23-6A); information contained within the packet format may be split (e.g. partitioned, apportioned, distributed, etc.) in different ways (e.g. in different packets, grouped together in different ways etc.); the number and length of fields within each packet may vary (e.g. an address field length may be larger than shown in order to accommodate larger address spaces, etc.).

Note also that FIG. 23-6A defines the format of a read request packet, but does not necessarily completely define the semantics (e.g. protocol semantics, protocol use, etc.) of how they are used. Though formats (e.g. command formats, packet formats, fields, etc.) are relatively easily to define formally (e.g. definitively, in a normalized fashion, etc.), it is harder to formally define semantics. With a simple basic command set, it is possible to define a simple base set of semantics (indeed the semantics may be implicit (e.g. inherent, obvious, etc.) with the base commands such as that shown in FIG. 23-6A, for example). The semantics (e.g. protocol semantics, etc.) may be described using one or more protocol models below and/or using flow diagrams elsewhere herein.

As an option, the basic packet format system of FIG. 23-6A may be implemented in the context of the architecture and environment of FIG. 8, U.S. Provisional Application No. 61/580,300, filed Dec. 26, 2011, titled "SYSTEM, METHOD, AND COMPUTER PROGRAM PRODUCT FOR IMPROVING MEMORY SYSTEMS".

As an option, the basic packet format system of FIG. 23-6A may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the basic packet format system of FIG. 23-6A may be implemented in the context of any desired environment.

FIG. 23-6B

FIG. 23-6B shows a basic packet format system for a read response, in accordance with another embodiment. As an option, the system may be implemented in the context of the architecture and environment of any previous and/or subsequent Figure(s). Of course, however, the system may be implemented in any desired environment.

In FIG. 23-6B, the basic packet format system 23-620 comprises a read response.

The read response may be part of a basic packet format system that may include (but is not limited to) two basic commands (requests) and a response: read request, write request; read response.

In one embodiment of a stacked memory package, the base level packet format for a read request may be as depicted in FIG. 23-6B with fields and field widths as shown. As one option, other fields (e.g. control fields, error checking, flags, options, etc.) may be (and generally are) present. As one option, not all of the fields shown need be present. Of course, other sizes for each field may be used. Of course, different numbers of fields (e.g. different numbers of data fields and/or data subfields etc.) may be used. The definitions and functions of the various fields shown in FIG. 23-6B will be described in association with the description of the protocol model below.

FIG. 23-6B does not show any message or other control packets (e.g. flow control, error message, etc.) that may be associated with a read response and that are generally present (but need not be present) in a complete set of packet formats.

FIG. 23-6B shows one particular base level packet format for a read response. Of course, many other variations (e.g. changes, alternatives, modifications, etc.) are possible (e.g. for a base level packet format and for more advanced packet formats possibly built on the base level packet format, etc.) and some of these variations will be described in more detail below and elsewhere herein.

As an option, the basic packet format system of FIG. 23-6B may be implemented in the context of the architecture and environment of FIG. 8, U.S. Provisional Application No. 61/580,300, filed Dec. 26, 2011, titled "SYSTEM, METHOD, AND COMPUTER PROGRAM PRODUCT FOR IMPROVING MEMORY SYSTEMS".

As an option, the basic packet format system of FIG. 23-6B may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the basic packet format system of FIG. 23-6B may be implemented in the context of any desired environment.

FIG. 23-6C

FIG. 23-6C shows a basic packet format system for a write request, in accordance with another embodiment. As an option, the system may be implemented in the context of the architecture and environment of any previous and/or subsequent Figure(s). Of course, however, the system may be implemented in any desired environment.

In FIG. 23-6C, the basic packet format system 23-640 comprises a write request.

The write request may be part of a basic packet format system that may include (but is not limited to) two basic commands and a response: read request, write request; read response.

In one embodiment of a stacked memory package, the base level packet format for a write request may be as depicted in FIG. 23-6C with fields and field widths as shown. As one option, other fields (e.g. control fields, error checking, flags, options, etc.) may be (and generally are) present. As one option, not all of the fields shown need be present. Of course other sizes for each field may be used. Of course different numbers of fields (e.g. different numbers of data fields and/or data subfields etc.) may be used. The definitions and functions of the various fields shown in FIG. 23-6C will be described in association with the description of the protocol model below.

FIG. 23-6C does not show any message or other control packets (e.g. flow control, error message, etc.) that may be associated with a write request and that are generally present (but need not be present) in a complete set of packet formats.

FIG. 23-6C shows one particular base level packet format for a write request. Of course many other variations (e.g. changes, alternatives, modifications, etc.) are possible (e.g. for a base level packet format and for more advanced packet formats possibly built on the base level packet format, etc.) and some of these variations will be described in more detail below and elsewhere herein.

As an option, the basic packet format system of FIG. 23-6C may be implemented in the context of the architecture and environment of FIG. 8, U.S. Provisional Application No. 61/580,300, filed Dec. 26, 2011, titled "SYSTEM, METHOD, AND COMPUTER PROGRAM PRODUCT FOR IMPROVING MEMORY SYSTEMS".

As an option, the basic packet format system of FIG. 23-6C may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the basic packet format system of FIG. 23-6C may be implemented in the context of any desired environment.

FIG. 23-6D

Figures 6D, 23:
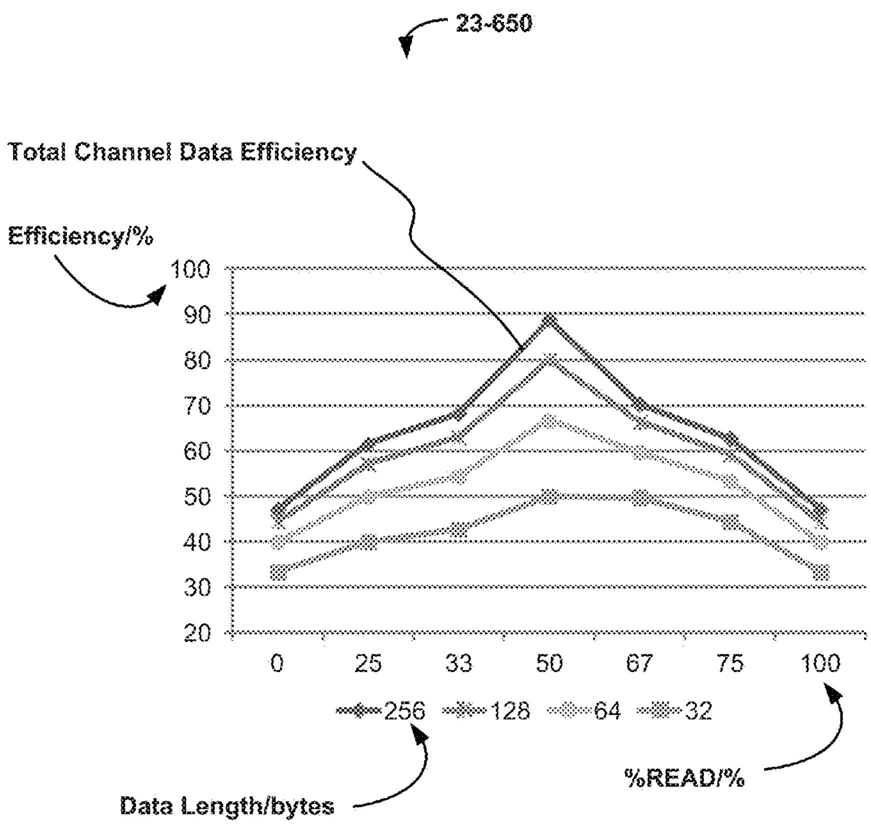
Figures 7, 23:
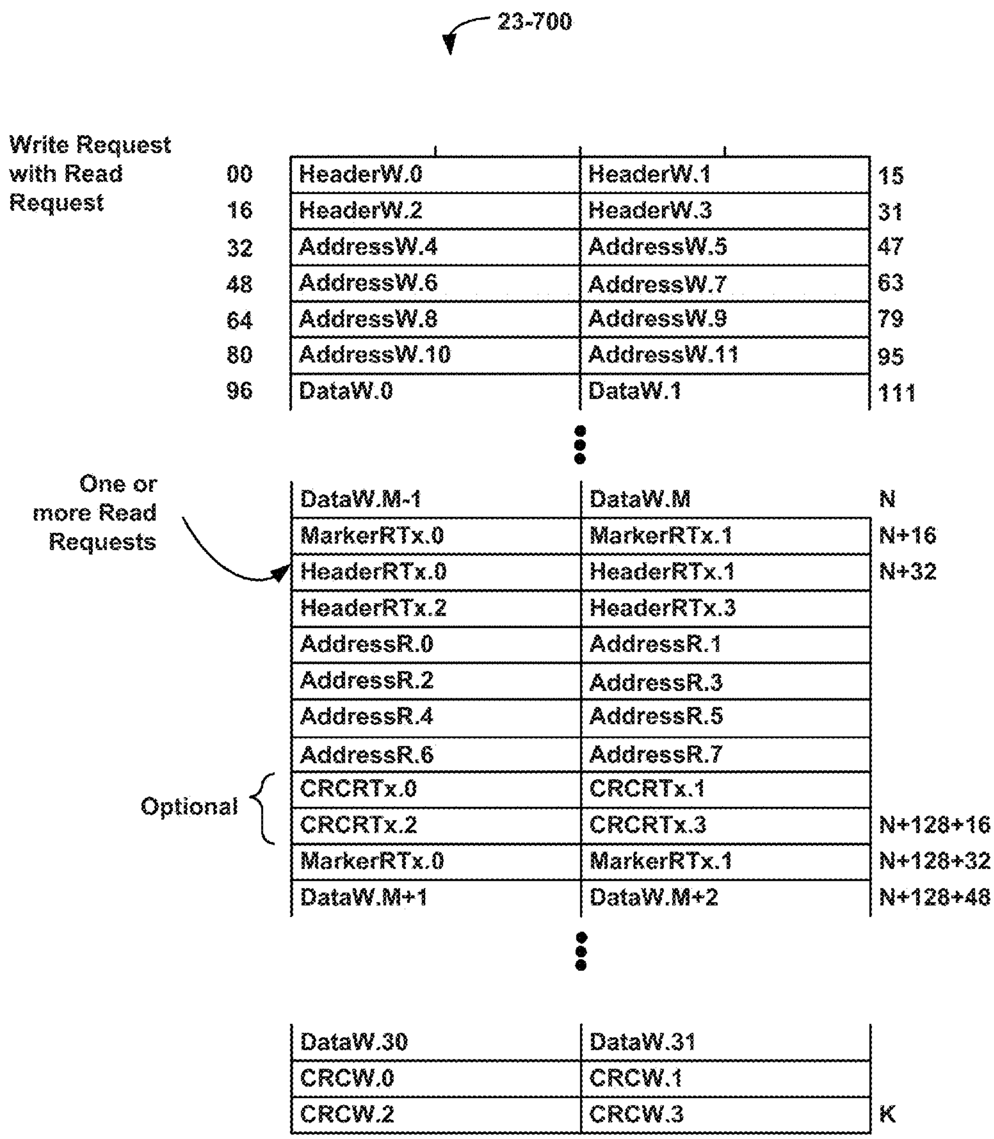

FIG. 23-6D shows a graph of total channel data efficiency for a stacked memory package system, in accordance with another embodiment. As an option, the stacked memory package system may be implemented in the context of the architecture and environment of any previous and/or subsequent Figure(s). Of course, however, the stacked memory package system may be implemented in any desired environment.

In FIG. 23-6C, the total channel data efficiency for a stacked memory package system 23-650 corresponds to a basic protocol (e.g. command set, etc.) that uses the basic packet formats shown in FIG. 23-6A, FIG. 23-6B, and FIG. 23-6C.

Protocol Analysis

In this section using a protocol model a basic protocol is analyzed based on the basic packet formats shown in FIG. 23-6A, FIG. 23-6B, FIG. 23-6C. More than one model may be used for a protocol and there may be more than one protocol. Unique model numbers may be assigned to each model. Thus, for example, model 1 and model 2 may apply to a first protocol; and model 3 may apply to a second protocol; etc. Within each protocol and/or model there may be more than one mode (region, sub-model, etc.) of operation. Models may be used for more than one protocol. Thus, for example, model 1 may be used for protocol 1 and model 1 may be used for protocol 2, etc.

In Model 1 a simple protocol with three packet types and fixed packet lengths is analyzed.

As an example a simple protocol is defined, Protocol 1. Further, the packet structures are defined. There may be three types of packets in Protocol 1: Read Request (RREQ); Read Response (RRSP); Write Request (WREQ). Each of these packet structures may be defined in terms of their components (fields, contents, information, data lengths, options, data structures, etc.). Other packets may be present in Protocol 1 (e.g. flow control packets, message packets, etc.) but may not be necessary (e.g. need to be accounted for, need to be considered, need to be modeled, etc.) in order to model the performance of Protocol 1 using Model 1.

In Protocol 1 and Model 1 it is assumed that a single Read Request generates a single Read Response. In other protocols or in modifications to Protocol 1, multiple read responses may be generated by a single read request.

In Protocol 1 it is assumed that each packet has a header field and a CRC field (e.g. for data protection, for error detection, etc.). The header field and CRC field are considered as part of the overhead. In other protocols or in modifications to Protocol 1, one or more error detection and/or error correction fields of various formats, types etc. and using various codes (e.g. ECC, parity, checksum, running CRC, etc.) may be used.

Read Request (RREQ) Packet Structure

The Read Request (RREQ) packet structure for Model 1 may be as shown in FIG. 23-6A.

Define HeaderRTx as the length of the Read Request Header field.

Define AddressR as the length of the Read Request Address field.

Define CRCRTx as the length of the Read Request CRC field.

In FIG. 23-6A (and FIG. 23-6B, FIG. 23-6C and elsewhere) where there is no risk of confusion we shall use the parameter (e.g. variable, etc.) names to refer to the fields. Thus, for example, HeaderRTx may be used as both the name (e.g. shortened name, abbreviation, acronym, etc.) of the Read Request Header field as well as the name of the parameter (e.g. variable, etc.) that represents the length of the field.

In FIG. 23-6A (and FIG. 23-6B, FIG. 23-6C and elsewhere) the lengths of fields may be measured in bits or bytes (where a byte is generally 8 bits). Where numbers are used alongside the fields, those numbers generally refer to the bit numbers of the beginning and ends of fields (e.g. as shown in FIG. 23-6A, where HeaderRTx.0 begins at bit potion 00 and HeaderRTx.1 ends at bit position 15).

In FIG. 23-6A (and FIG. 23-6B, FIG. 23-6C and elsewhere), the portions of the fields (e.g. subfields, etc.) may be shown using a suffix. Thus, for example, HeaderRTx.0 (e.g. with suffix zero) may correspond to the first 8 bits (e.g. bits 00-07) of the HeaderRTx field, etc. Note that the order of the fields, portions of fields, and subfields etc. (e.g. the order of HeaderRTx.0 and HeaderRTx.1, etc.) and the order of the bits (e.g. the order of bits 00, 01 etc.) may not be as shown when viewed on the bus (or serial link etc.). Thus, for example, bit 07 may be transmitted before bit 00 of a field, etc. Thus, the depictions of headers, fields, etc. in the various packet formats shown herein should be treated as a possible logical representation and not necessarily as the physical representation (or as any one of several possible physical representations of the same information as it passes through components, buses, etc. of the system) though in some cases the logical and physical representation may be the same.

Read Response (RRSP) Packet Structure

The Read Response (RRSP) packet structure for Model 1 may be as shown in FIG. 23-6B.

Define HeaderRRx as the length of the Read Response Header field.

Define DataR as the length of the Read Response Data field.

Define CRCRRx as the length of the Read Response CRC field.

Write Request (WREQ) Packet Structure

The Write Request (WREQ) packet structure for Model 1 may be as shown in FIG. 23-6C.

Define HeaderW as the length of the Write Request Header field.

Define AddressW as the length of the Write Request Address field.

Define DataW as the length of the Write Request Data field.

Define CRCW as the length of the Write Request CRC field.

Various parameters associated with the number of each type of packet are defined.

Packet Number Definitions

Define #RREQ as the number of Read Requests (e.g. per second).

Define #WREQ as the number of Write Requests (e.g. per second).

Define #RRSP as the number of Read Responses (e.g. per second).

Define #TxPacket=#RREQ+#WREQ as the number of transmit (Tx) packets (e.g. per second).

Define #RxPacket=#RRSP as the number of receive (Rx) packets (e.g. per second).

Define %READ=#RREQ/(#RREQ+#WREQ) as the percentage of Read Requests as a fraction of the total number of requests (Read Request plus Write Request).

Define %WRITE as %READ+%WRITE=1, as the percentage of Write Requests as a fraction of the total number of requests (Read Request plus Write Request).

Thus %READ*(#RREQ+#WREQ)=#RREQ.

Thus (%READ*#RREQ)+(%READ*#WREQ)=#RREQ.

Thus (%READ*#WREQ)=#RREQ−(%READ*#RREQ).

Thus #WREQ=#RREQ*((1/%READ)−1) for %READ>0(%WRITE<1).

There is an implied assumption here that %READ>0, which will now be addressed.

Thus #RREQ=#WREQ*(%READ/(1−%READ)) for (1−%READ)>0 or %READ<1(%WRITE>0).

It is possible to derive similar equations for #WREQ and #RREQ in terms of %WRITE. Note that there are two special cases: (1) for %READ=0 (%WRITE=1); (2) %READ=1 (%WRITE=0).

Packet and Field Lengths

Define RREQDL as the Read Request Data length, normally RREQDL=0.

Define RREQOH as the Read Request Overhead, normally RREQOH=HeaderRTx+AddressR+CRCRTx.

Define RREQPL=RREQDL+RREQOH as the Read Request packet length.

Define WREQDL as the Write Request Data length, normally RREQDL=DataW.

Define WREQOH as the Write Request Overhead, normally WREQOH=HeaderW+AddressW+CRCW.

Define WREQPL=WREQDL+WREQOH as the Write Request packet length.

Define RRSPDL as the Read Response Data length, normally RRSPDL=DataR.

Define RRSPOH as the Read Response Overhead, normally RRSPOH=HeaderRRx+CRCRRx.

Define RRSPPL=RRSPDL+RRSPOH as the Read Response packet length.

Various parameters associated with the bandwidth used in each channel by each type of packet and the efficiency of data and information transfer, are defined next.

Bandwidth and Efficiency of Channels

Define BWTX=(#RREQ*RREQPL)+(#WREQ*WREQPL) as write (Tx) channel bandwidth.

Define BWRX=#RRSP*RRSPPL as read (Rx) channel bandwidth.

Define TRDATA=#RRSP*RRSPDL as the total amount of read data (e.g. useful information, etc.) transferred.

Define TWDATA=#WREQ*WREQDL as the total amount of write data transferred.

Define TDATA=TWDATA+TRDATA as the total amount of data transferred.

Define EFF=TDATA/(BWTX+BWRX) as the total channel data efficiency of the communications link, for both transmit and receive channels. We may define EFF1, EFF2, etc. for different modes, regions, etc. of operation.

Note that the total channel data efficiency measures the ratio of data (e.g. read data, write data) transferred to the capability of the channel to transfer data (e.g. including overhead such as CRC information, etc.). In some cases, it may be desired to exclude certain overheads from the definition of bandwidth and define bandwidth in terms of packet data lengths for example, (rather than total packet lengths).

Define the following two regions of channel operation: in region 1 the read channel (Rx) is saturated at BWRX; in region 2 the write channel (Tx) is saturated at BWTX. Next the behavior of region 1 is analyzed, followed by the analysis of the behavior in region 2.

Analysis for Region 1 of Operation

In region 1 the read (Rx) channel is known to be saturated at BWRX. The read channel is occupied (e.g. carries, receives, etc.) only Read Response packets. Thus, the number of Read Responses may be calculated and from that the total channel data efficiency as follows.

EFF=(TWDATA+TRDATA)/(BWTX+BWRX) is known.

Define EFF1=((#WREQ*WREQDL)+(#RRSP*RRSPDL))/(BWTX+BWRX) as region 1 total channel data efficiency.

In region 1, #RRSP=BWRX/RRSPPL because the saturated read channel bandwidth determines the number of Read Response packets.

Thus EFF1=(#WREQ*WREQDL+((BWRX/RRSPPL)*RRSPDL))/(BWTX+BWRX).

#RRSP=#RREQ, the number of read responses is equal to the number of read requests.

Additionally, #WREQ=#RREQ*((1/%READ)−1).

There is an implied assumption here that the write channel is able to carry this number of Write Requests (e.g. that the write channel is not saturated).

Thus, EFF1=(((BWRX/RRSPPL)*((1/%READ)−1)*WREQDL)+

((BWRX/RRSPL)*RRSPDL))/(BWTX+BWRX).

Note this expression for EFF1 is a valid expression for 1>=%READ>0, but it was assumed that the write channel is not saturated.

For %READ=1, the number of Read Responses in the read channel is fixed (the read channel saturated) and the number of Read Requests in the write channel is fixed (the write channel is not saturated). However, as %READ decreases from %READ=1 the number of Write Requests increases, thus increasing use of the write channel. As write channel use increases the number of Read Requests remains fixed (at saturation), but the number of Write Requests increases until the write channel also becomes saturated. This boundary condition is calculated, and thus the region of validity for EFF1, presently. First, there are two special cases.

For the special case %READ=0, EFF1 is meaningless and the expression for EFF1 is not valid, since it has been assumed the read channel is saturated.

For the special case %READ=1, the number of Write Requests is zero. The expression for EFF1 is valid for %READ=1 since it has been assumed the read channel is saturated.

Thus EFF1=((BWRX/RRSPL)*RRSPDL))/(BWTX+BWRX)=

(RRSPDL/RRSPPL)/(BWRX/(BWTX+BWRX) for %READ=1.

Thus, for example, if RRSPDL=RRSPPL (no overhead) and BWTX=BWRX (equal bandwidth on read channel and write channel), then EFF1=50% for %READ=1.

Note that for this special case %READ=1, for example, the read channel is saturated with Read Responses and could be considered 100% efficient (depending on the definition of bandwidth and/or overhead), but the write channel is still being used for Read Requests.

Analysis for Region 2 of Operation

The write (Tx) channel is known to be saturated at BWTX. The write channel is occupied (e.g. carries, receives, etc.) with both Read Request and Write Request packets. The relative number of Read Requests and Write Requests given %READ is known. The number of Read Requests is determined.

We know %READ=#RREQ/(#RREQ+#WREQ)

We know #RRSP=#RREQ, the number of Read Responses is equal to the number of Read Requests.

Thus, %READ*(#RREQ+#WREQ)=#RREQ.

Thus, (%READ*#RREQ)+(%READ*#WREQ)=#RREQ.

Thus, %READ*#WREQ=#RREQ−(%READ*#RREQ).

Thus, #WREQ=(#RREQ−(%READ*#RREQ))/%READ.

There is an implied assumption here that %READ>0.

Thus, #WREQ=(#RREQ/%READ)−#RREQ.

Thus, #WREQ=#RREQ*((1/%READ)−1).

For example, if %READ=0.1, then #WREQ=#RREQ((1/0.1)−1)=

#RREQ*9.

BWTX=(#RREQ*RREQPL)+(#WREQ*WREQPL) is known.

Thus, BWTX=(#RREQ*RREQPL)+(#RREQ((1/%READ)−1)*WREQPL).

Thus, BWTX=#RREQ (RREQPL+((1/%READ)−1)*WREQPL).

Thus, #RREQ=BWTX/(RREQPL+((1/%READ)−1)*WREQPL).

There is an implied assumption here that the read channel is able to carry this number of Read Requests (e.g. that the read channel is not saturated).

Define EFF2=((#WREQ*WREQDL)+(#RRSP*RRSPDL))/(BWTX+

BWRX) as region 2 total channel data efficiency.

#RREQ=BWTX/(RREQPL+(((1/%READ)−1)*WREQPL)) is known.

#WREQ=#RREQ*((1/%READ)−1) is known.

Thus, #WREQ=(BWTX*((1/%READ)−1))/(RREQPL+(((1/%READ)−

1)*WREQPL)).

Thus, EFF2=(#WREQ*WREQDL+(BWTX/(RREQPL+((1

/%READ)−1)*WREQPL)*RRSPDL))/(BWTX+BWRX).

Thus, EFF2=((#WREQ*WREQDL)+(BWTX/(RREQPL+(((1

/%READ)−1)*WREQPL))*RRSPDL))/(BWTX+BWRX).

Thus, EFF2=(((BWTX*((1/%READ)−1))/(RREQPL+(((1

/%READ)−1)*WREQPL))*WREQDL)+(BWTX/(RREQPL+(((1/%READ)−

1)*WREQPL))*RRSPDL))/(BWTX+BWRX).

Note this expression for EFF2 is a valid expression for 1>=%READ>0, but it has been assumed that the read channel is not saturated.

For %READ=0 the number of Read Responses in the read channel is zero (the read channel is not saturated) and the number of Write Requests in the write channel is fixed (the write channel is saturated). However, as %READ increases from %READ=0 the number of Read Requests increases, thus increasing use of the read channel. As read channel use increases the number of Write Requests remains fixed (at saturation), but the number of Read Requests increases until the read channel also becomes saturated. This boundary condition is calculated, and thus the region of validity for EFF2, presently. First, there are two special cases.

For the special case %READ=0, %WRITE=1 and the number of Read Requests and Read Responses is zero. The expression for EFF2 is not valid for %READ=0, because we derived the expression assuming %READ>0.

For the special case %WRITE=1, the write channel is saturated with Write Requests and EFF2=(#WREQ*WREQDL)/(BWTX+BWRX).

For %WRITE=1, #WREQ=BWTX/WREQPL is known since the write channel is saturated and because the saturated write channel bandwidth determines the number of Write Request packets.

Thus, EFF2=(WREQDL/WREQPL)*(BWTX/(BWTX+BWRX))

for %WRITE=1.

This expression is an analogous expression to the saturated read channel case. Thus, for example, if WREQDL=WREQL (no overhead) and BWTX=BWRX (equal bandwidth on read channel and write channel), then EFF2=50%.

For the special case %READ=1, EFF2 is meaningless and the expression for EFF2 is not valid, since it has been assumed the write channel is saturated.

Break Point Analysis

In region 1, it has been assumed the read channel was saturated and #RRSP=#RREQ=BWRX/RRSPL.

In region 2, it has been assumed the write channel was saturated and #RREQ=#RRSP=BWTX/(RREQPL+((1/%READ)−1)*WREQPL).

These two expressions may be set to be equal and the value of %READ that satisfies both equations simultaneously may be defined as the %READ break point (e.g. boundary condition, etc.), defined as %READBP.

Thus, RRSPL=RREQPL+(((1/%READBP)−1)*WREQPL).

Thus, %READBP*RRSPPL=%READBP*RREQPL+((1−%READBP)*WREQPL).

Thus, %READBP*RRSPPL=%READBP*RREQPL+WREQPL−%READBP*WREQPL.

Thus, %READBP*RRSPPL+%READBP*WREQPL−%READBP*RREQPL=WREQPL.

Thus, %READBP=WREQPL/(RRSPPL+WREQPL−RREQPL).

Thus, %READBP=(WREQDL+WREQOH)/(RRSPDL+RRSPOH+WREQDL+WREQOH−RREQDL−RREQOH).

This expression gives us the %READ break point %READBP. Protocol 1 and Model 1 Analysis Summary If %READ>%READBP:

Efficiency EFF1=(((BWRX/(RRSPDL+RRSPOH))*((1/%READ)−1)*WREQDL)+((BWRX/(RRSPDL+RRSPOH))*RRSPDL))/(BWTX+BWRX).

If %READ<%READBP:

Efficiency EFF2=(((BWTX*((1/%READ)−1))/((RREQDL+RREQOH)+(((1/%READ)−1)*(WREQDL+WREQOH)))*WREQDL)+(BWTX/((RREQDL+RREQOH)+(((1/%READ)−1)*(WREQDL+WREQOH)))*RRSPDL))/(BWTX+BWRX).

Model 1 and Protocol 1 Results

Table VI-1 shows a set (e.g. typical set, example set, representative set, etc.) of packet lengths (e.g. RREQPL, WREQPL, RRSPPL) and overhead lengths (e.g. RREQOH, WREQOH, RRSPOH) with data lengths (e.g. WREQDL, RRSPDL) of 32 bytes. For different values of data lengths (e.g. 16, 32, 64, 128, 256 bytes etc.) the Write Request and Read Response overheads (e.g. WREQOH, RRSPOH) may remain fixed. For different values of data lengths the Read Request packet length and the field lengths (e.g. RREQPL, RREQDL, RREQOH) may remain fixed. For different values of data lengths the Write Request and Read Response packet lengths (WREQPL, RRSPPL) may vary according to the data field lengths.

Two values are shown for RREQDL and RREQOH in Table VI-1: the first value corresponds to considering the Read Request data (e.g. the read address etc.) to be separate from the Read Request overhead, and the second value corresponds to considering the Read Request data (the read address) to be part of the Read Request overhead (e.g. in that case RREQDL=0). In Model 1, the results are the same regardless of the view as neither field (RREQDL or RREQOH) contributes data measured in the total channel data efficiency, and the Read Request packet length (RREQPL) is the same in both cases.

TABLE VI-1

Packet and field lengths (bytes) for a data length of 32 bytes.

| RREQ | | WREQ | | RRSP | |
|---|---|---|---|---|---|
| RREQPL | 16 | WREQPL | 48 | RRSPPL | 48 |
| RREQDL | 8/0 | WREQDL | 32 | RRSPDL | 32 |
| RREQOH | 8/16 | WREQOH | 16 | RRSPOH | 16 |

Table VI-2 shows the %READ break point %READBP values for values of data lengths of 256, 128, 64, and 32 bytes (with overhead values as shown in Table VI-1). For example, for a data length of 64 bytes (e.g. WREQDL=RRSPDL=64 bytes, thus equal data field lengths for Read Responses and Write Requests) the %READ break point is %READBP=0.56 or 56%. Thus, for values of %READ>56%, the read channel will be saturated and for values of %READ<56% the write channel will be saturated.

TABLE VI-2

%READ break point %READBP as a function of data length (with other values as shown in Table VI-1)

| Data length (bytes) | %READBP (as a fraction) |
|---|---|
| 256 | 0.52 |
| 128 | 0.53 |
| 64 | 0.56 |
| 32 | 0.60 |

Table VI-3 shows the total channel data efficiency for Model 1 and Protocol 1 (with overhead lengths as shown in Table VI-1). Thus for example, a 50% read-write mix (%READ=50% or 0.5) with a data length of 64 bytes (e.g. WREQDL=RRSPDL=128 bytes, and thus equal data field lengths for Read Responses and Write Requests) corresponds to (e.g. results in, is modeled as, etc.) a total channel data efficiency of 67%.

TABLE VI-3

Model 1/Protocol 1 Total Data Channel Efficiency (percentage) as a function of data length and % READ (with other values as shown in Table VI-1)

| Data Length | % READ (percentage) | | | | | | |
|---|---|---|---|---|---|---|---|
| (bytes) | 0 | 25 | 33 | 50 | 67 | 75 | 100 |
| 256 | 47 | 62 | 68 | 89 | 70 | 63 | 47 |
| 128 | 44 | 57 | 63 | 80 | 66 | 59 | 44 |
| 64 | 40 | 50 | 54 | 67 | 60 | 53 | 40 |
| 32 | 33 | 40 | 43 | 50 | 50 | 44 | 33 |

Note that the values for total channel data efficiency in Table VI-3 are not equal for equal values of %READ and %WRITE, as may be expected since the read and write channels are not symmetric: the write channel is used for both Read Requests and Write Requests, while the read channel is used only for Read Responses. However, it might be expected that the total data channel efficiency would be higher for %WRITE=x% (where 100>x>50) than for %READ=x%, since a higher number of writes may produce a higher total channel data efficiency (because reads require portions of both the Tx channel and the Rx channel and would thus seem to be less efficient). For example, it might be expected that total data channel efficiency for %WRITE=75% be higher than for %READ=75%. In fact the opposite is true. For example, consider the total channel data efficiency for 32 byte data lengths: for %READ=25% or %WRITE=75% (and thus a 3:1 ratio of Write Request to Read Request) the total channel data efficiency is 40%, but for %READ=75% (%WRITE=25%) total channel data efficiency is higher at 44%. To see why this is the case, consider two sets set of model parameter values for %READ=75%, and %WRITE=75%.

First, take the case of 32 byte data lengths and %READ=75% (%WRITE=25%), and calculate the following model parameter values.

The read channel is saturated, so #RRSP=BWRX/RRSPPL. Consider the case BWRX=100 bytes/sec. RRSPPL=48 bytes. Thus #RRSP=2.08/sec. We know #WREQ=#RREQ*((1/%READ)−1) and thus #WREQ=0.69/sec. TRDATA=66.67 bytes/sec. TWDATA=22.22 bytes/sec. TDATA=88.89 bytes/sec.

Second, take again the case of 32 byte data lengths, but now WRITE=75% or %READ=25%, and calculate the same model parameter values.

The write channel is saturated, so #RREQ=BWTX/(RREQPL+((1/%READ)−1)*WREQPL). Consider the case BWTX=100 bytes/sec. WREQPL=48 bytes. Thus #REQ=0.63/sec. #WREQ=#RREQ*((1/%READ)−1) is known and thus #WREQ=1.88/sec. TRDATA=20.00 bytes/sec. TWDATA=60.00 bytes/sec. TDATA=80.00 bytes/sec.

These model parameter values are shown in Table VI-4, explaining this counter-intuitive result.

FIG. 23-6D shows a graph of total channel data efficiency for data lengths of 32, 64, 128, 256 bytes as a function of %READ and using the values of Table VI-1 for the remaining parameters.

The protocol model described above may be used to optimize performance of a memory system using one or more stacked memory packages. In one embodiment, performance may be optimized by changing a static configuration (e.g. configuring the system once at start-up, etc.). In one embodiment, performance may be optimized by dynamically changing configuration (e.g. configuring or reconfiguring the system during run time, etc.). For example, in one embodiment, the logic chip(s) in one or more stacked memory packages may measure traffic (e.g. measure %READ, average packet lengths, average numbers of each type of packet, etc.). As a result of using the model (e.g. calculating %READBP, etc.) the system (e.g. CPU, logic chip, or other agent or agents, etc.) may configure or reconfigure bus (internal or external) widths, high-speed serial links (e.g. number of lanes used for requests, number of lanes used for responses, etc.), or configure or change any other system parameter, circuit, function, configuration, memory chip register, logic chip register, timing parameter, timeout parameter, clock frequency or other frequency setting, DLL or PLL setting, bus protocol, flag or option, coding scheme, error protection scheme, bus and/or signal priority, virtual channel priority, number of virtual channels, assignment of virtual channels, arbitration algorithm(s), link width(s), number of links, crossbar or switch configuration, PHY parameter(s), test algorithms, test function(s), read functions, write functions, control functions, command sets, combinations of these, etc.

For example, in one embodiment, a stacked memory package may have four high-speed serial links, HSL0-HSL3, each with 16 lanes. The initial configuration (e.g. at start-up, boot time, etc.) may assign 8 lanes (where a lane here is used to denote a unidirectional communication path, possibly using a differential pair of wires, etc.) to Tx (write channel) and 8 lanes to Rx (read channel) in each link. During operation it may be determined (e.g. through measurements by the logic chip in a stacked memory package, by monitoring by the CPU, from statistics gathered from one or more memory controllers in the memory system, from a profile of the software running on the host system, from combinations of these, etc.) that a higher total data channel efficiency (or other performance or system metric, etc.) may be obtained by changing lane assignments. For example, HSL0 may be more efficient if assigned 10 lanes for Rx and 6 lanes for Tx, etc. Changes in lane assignment may be made in the same way that lane or other PHY or high-speed serial link failures are handled. For example, one or more lanes used for the Rx channel may be brought to an idle state etc. before being switched to the Tx channel. As one option, 2 Rx lanes used in HSL1 may be switched to HSL0, etc.

Changes in configuration or reconfiguration may be made in order to maximize performance, reduce cost, reduce power, increase reliability, perform testing (at manufacture or during operation), perform calibration (at manufacture or during operation), perform circuit or other characterization (at manufacture or during operation), respond to internal or external system commands (e.g. configuration, reconfiguration, register command(s) and/or setting(s), enable signals, termination and/or other control signals, etc.), maximize production yield, minimize failure rate, recover from failure, or for other system constraints, cost constraints, reliability constraints or other constraints etc.

TABLE VI-4

Model 1/Protocol 1 Parameter Values for %READ = 25% and 75% (with packet length and field parameters as shown in Table VI-1).

| Parameter | %READ = 25% | %READ = 75% | Units |
|---|---|---|---|
| #RREQ | 0.63 | 2.08 | /sec |
| #RRSP | 0.63 | 2.08 | /sec |
| #WREQ | 1.88 | 0.69 | /sec |
| %READ | 0.25 | 0.75 | Fraction (1 = 100%) |
| TDATA | 80.00 | 88.89 | Bytes/sec |
| Ratio of reads/writes | 0.33 | 3.00 | Number |
| #RREQ * RREQDL | 5.00 | 16.67 | Bytes/sec |
| #RREQ * RREQPL | 10.00 | 33.33 | Bytes/sec |
| #RRSP * RRSPDL | 20.00 | 66.67 | Bytes/sec |
| #RRSP * RRSPPL | 30.00 | 100.00 | Bytes/sec |
| #WREQ * WREQDL | 60.00 | 22.22 | Bytes/sec |
| #WREQ * WREQPL | 90.00 | 33.33 | Bytes/sec |
| TRDATA | 20.00 | 66.67 | Bytes/sec |
| TW DATA | 60.00 | 22.22 | Bytes/sec |
| TDATA | 80.00 | 88.89 | Bytes/sec |
| Tx (write) channel packet data | 100.00 (saturated) | 66.67 | Bytes/sec |
| Rx (read) channel packet data | 30.00 | 100.00 (saturated) | Bytes/sec |

FIG. 23-7

FIG. 23-7 shows a basic packet format system for a write request with read request, in accordance with another embodiment. As an option, the system may be implemented in the context of the architecture and environment of any previous and/or subsequent Figure(s). Of course, however, the system may be implemented in any desired environment.

In FIG. 23-7, the basic packet format system 23-700 comprises a write request with read request.

The write request with read request may be part of a basic packet format system that may include (but is not limited to) two basic commands and a response: read request, write request; read response. Thus, in FIG. 23-7, the packet formats do not necessarily correspond 1:1 to commands (e.g. a write request with read request may be considered to comprise a read command and a write command, etc.).

In FIG. 23-7, the format of a read response is not shown, but may be as shown in FIG. 23-6B or similar to that shown in FIG. 23-6B, for example.

In one embodiment of a stacked memory package, the base level packet format for a write request with read request may be as depicted in FIG. 23-7 with fields and field widths as shown. As one option, other fields (e.g. control fields, error checking, flags, options, etc.) may be (and generally are) present. NI one option not all of the fields shown need be present. The definitions and functions of the various fields shown in FIG. 23-7 were described in association with the description of the protocol model above.

FIG. 23-7 does not show any message or other control packets (e.g. flow control, error message, etc.) that may be associated with a write request with read request and that are generally present (but need not be present) in a complete set of packet formats.

FIG. 23-7 shows one particular base level packet format for a write request with read request. Of course many other variations (e.g. changes, alternatives, modifications, etc.) are possible (e.g. for a base level packet format and for more advanced packet formats possibly built on the base level packet format, etc.) and some of these variations are described elsewhere herein.

In FIG. 23-7, a read request may be merged (e.g. added to, embedded with, part of, inserted in, carried with, etc.) a write request to form the write request with read request. In FIG. 23-7 the read request may be inserted in the middle of the write data field DataW. For example, a long write request (e.g. a write request with a long write data field, etc.) may cause an urgent read request to be delayed. By inserting a read request in a write request the latency of the read may be reduced. By inserting a read request in a write request the total channel data efficiency may be increased.

In FIG. 23-7, a single read request is present (e.g. inserted, merged, etc.) in the write request with read request. In one embodiment, any number of read requests may be inserted in the write request with read request.

In one embodiment, the read request structure may always be present in a write request with read request. If the read request is not required (e.g. no reads in the queue, no reads required, etc.) the read request may be null using a special code, flag, signal, or format (e.g. special read address, special flag in the header field, reduced read request data structure, etc.).

In FIG. 23-7 a single read request is present (e.g. inserted, merged, etc.) in the data field DataW of the write request with read request. In one embodiment, the read request may be inserted before the data field DataW. In one embodiment, the read request may be inserted after the data field DataW. In one embodiment, the read request may be inserted anywhere in the write request.

In FIG. 23-7 the write request with read request may contain a header field (e.g. data structure etc.) HeaderW similar to that of the write request shown in FIG. 23-6C. In FIG. 23-7, the write request with read request may contain an address structure AddressW similar to that of the write request shown in FIG. 23-6C. In FIG. 23-7, the write request with read request may contain a read request structure similar to the read request shown in FIG. 23-6A.

In FIG. 23-7 a marker field (e.g. special data structure, special code etc.) MarkerRTx may be used to delineate the read request from the write data. The markers may be inserted at regular (e.g. fixed, pre-defined, etc.) intervals in the data stream and may indicate, for example, whether the information that follows is data (e.g. part of the DataW field, etc.) or another structure, such as a read request, etc. Of course any method may be used to insert read request and/or other data structures into the various packet formats.

In FIG. 23-7, the marker field is shown as 16 bits but may be any length.

In FIG. 23-7, the read request data structure is shown as including the read request CRCRTx field, as shown in FIG. 23-6A. Such a structure may help the receive logic handle the read request embedded in a write request with read request. In one embodiment, the CRCTx field may be omitted from the read request embedded in a write request with read request. In this case for example, the field CRCW may be used to provide data protection for the entire packet including the embedded read request. Such an option may further increase the total data channel efficiency.

In FIG. 23-7, the read request may be inserted in the write request after N−16 bits (e.g. at the N−17 bit position, etc.). A marker MarkerRTx may occupy (e.g. span, fill, etc.) bits N−1 to N+16. The end of the read request may be at bit position N+128+16 (assuming the read request uses the same or similar format to that shown in FIG. 23-6A with overall length of 128 bits for example). The end of the write request with read request may be at bit position K. The value of K may depend on the following: (1) how many 128-bit (or other length etc.) read requests are inserted in the write request with read request; (2) the number of marker fields used and/or required. In one embodiment, makers may be inserted at regular intervals in the data stream (e.g. in the write request with read request and/or other packets). In one embodiment, markers may be used in conjunction with (e.g. in addition to, together with, etc.) packet data length fields (e.g. in a header field, etc.). Thus for example, a final marker may not be necessary if the total length of the packet is known, etc. Of course, any method of creating (e.g. assembling, merging, building, etc.) packets as well as delineating (e.g. determining, calculating, disassembling, parsing, deconstructing, etc.) data structures (e.g. packet structures, field structures, field types, packet types, nested packet and/or data structures, a read request within a write request with read request, etc.) may be used.

As an option, the basic packet format system of FIG. 23-7 may be implemented in the context of the architecture and environment of FIG. 8, U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

As an option, the basic packet format system of FIG. 23-7 may be implemented in the context of the architecture and environment of any previous Figure(s) and/or any subsequent Figure(s). For example, any one or more of such optional architectures, capabilities, and/or features may or may not be used in combination with any other one or more of such optional architectures, capabilities, and/or features disclosed in connection with any previous Figure(s) and/or any subsequent Figure(s). Of course, however, the basic packet format system of FIG. 23-7 may be implemented in the context of any desired environment.

FIG. 23-8

FIG. 23-8 shows a basic packet format system, in accordance with another embodiment. As an option, the system may be implemented in the context of the architecture and environment of any previous and/or subsequent Figure(s). Of course, however, the system may be implemented in any desired environment.

In FIG. 23-8, the basic packet format system 23-800 comprises a read/write request, a read response, a write data request.

The read/write request packet format, read response packet format, write data request packet format may be part of a basic packet format system that may include (but is not limited to) three basic commands: read request, write request; read response. Thus, in FIG. 23-8 the packet formats do not necessarily correspond 1:1 to a command (e.g. a write command may be considered to comprise a part of a read/write request and one or more write data requests, etc.).

In one embodiment of a stacked memory package, the base level packet formats for read/write request, a read response, a write data request may be as depicted in FIG. 23-8 with fields and field widths as shown. As one option, other fields (e.g. control fields, error checking, flags, options, etc.) may be (and generally are) present. As one option, not all of the fields shown need be present. The definitions and functions of the various fields shown in FIG. 23-8 were described in association with the description of the protocol model above. Some modifications in naming have been made in FIG. 23-8 to accommodate differences.

For example, the read/write request may include (but is not limited to) the following fields: HeaderRW (header), AddressRW (address), CRCRW (data check field). The AddressRW field may consist of zero, one or more addresses corresponding to zero, one or more read addresses and zero, one or more addresses corresponding to zero, one or more write addresses. The header field may contain information that allows a receiver to determine which addresses in the AddressRW field correspond to read addresses and which addresses correspond to write addresses for example. In another embodiment, the AddressRW field may contain information in addition to the addresses that allow a receiver to determine which addresses in the AddressRW field correspond to read addresses and which addresses correspond to write addresses for example. Of course, any technique (e.g. flags, options, data fields, packet formats, etc.) may be used to distinguish between portion or portions of a read/write request packet.

In FIG. 23-8, the first read (or write) address is denoted by AddressRW.0.1 to AddressRW.3.1 (e.g. using four bytes or 32 bit addresses). Of course any address length may be used.

In FIG. 23-8, there are two 32-bit addresses shown, but any number may be used. In one embodiment, the number of addresses (e.g. field length of AddressRW) may be fixed. In one embodiment, the number of addresses (e.g. field length of AddressRW) may be variable. In this case, markers may be used (as shown in FIG. 23-7 or similar to that shown in FIG. 23-7 for example) or fields within the header field may be used to contain packet length information (from which the number of addresses, etc. may be determined), etc.

For example, the read response may include (but is not limited to) the following fields: HeaderRRx (header); DataR (read data); CRCRRx (data check field).

For example, the write data request may include (but is not limited to) the following fields: HeaderW (header); DataW (write data); CRCW (data check field). In one embodiment, there may be one write data request for one write request (that is part of a read/write request for example). In one embodiment, there may be more than one write data request for one write request (that is part of a read/write request for example).

In one embodiment, the data check fields CRCW, CRCRRX, CRCW may be the same, but need not be.

In one embodiment, the data check fields (e.g. CRC fields, etc.) may be 8 bits in length or may be any length (e.g. CRC-24, CRC-32, etc.) or may be different lengths, etc.

In one embodiment, there may be more than one data check field used in one or more of the packet formats. For example, there may be a first data check field in each packet (e.g. the same CRC-32 check field in each packet that covers (e.g. protects, etc.) each packet) and a second data check field (e.g. CRC, running CRC, checksum, etc.) that covers a group (e.g. set, collection, series, string, stream, etc.) of packets.

In one embodiment, data check fields may be CRC check fields (including running CRC check fields, etc.) but may also be (e.g. use, employ, etc.) any form of data check, error control coding, data protection code(s), etc. (e.g. data error detection code(s), data error correction code(s), data error detection and correction code(s), ECC, checksum(s), parity code(s), combinations of these, combinations with other codes and/or coding schemes, etc.).

FIG. 23-8 does not show any message or other control packets (e.g. flow control, error message, etc.) that may be associated with a read/write request, a read response, a write data request and that are generally present (but need not be present) in a complete set of packet formats.

FIG. 23-8 shows base level packet formats for a read/write request packet format, read response packet format, write data request packet format. Of course many other variations (e.g. changes, alternatives, modifications, etc.) are possible (e.g. for base level packet formats and for more advanced packet formats possibly built on the base level packet formats, etc.) and some of these variations are described elsewhere herein.

For example, the systems (e.g. packet format, etc.) of FIG. 23-6A, FIG. 23-6B, FIG. 23-6C, FIG. 23-7, FIG. 23-8 may be combined in various ways. For example, a packet system may use a read request (as shown in FIG. 23-6A or similar to that shown in FIG. 23-6A for example), a write request (similar to the read request shown in FIG. 23-6A for example, but altered for write purposes), a read response (as shown in FIG. 23-6B or similar to that shown in FIG. 23-6B for example), a write data request (as shown in FIG. 23-8 or similar to that shown in FIG. 23-8 for example). For example, a packet system may use a read/write request (similar to the write request with read request shown in FIG. 23-7 but without write data for example), a read response (as shown in FIG. 23-6B or similar to that shown in FIG. 23-6B for example), a write data request (as shown in FIG. 23-8 or similar to that shown in FIG. 23-8 for example). Other combinations and permutations of the packet systems described above and elsewhere herein may be used.

As one example, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; U.S. Provisional Application No. 61/581,918, filed Jan. 13, 2012, titled "USER INTERFACE SYSTEM, METHOD, AND COMPUTER PROGRAM PRODUCT"; U.S. Provisional Application No. 61/602,034, filed Feb. 22, 2012, titled "SYSTEM, METHOD, AND COMPUTER PROGRAM PRODUCT FOR IMPROVING MEMORY SYSTEMS"; and U.S. Provisional Application No. 61/608,085, filed Mar. 7, 2012, titled "SYSTEM, METHOD, AND COMPUTER PROGRAM PRODUCT FOR IMPROVING MEMORY SYSTEMS." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section VII

The present section corresponds to U.S. Provisional Application No. 61/647,492, titled "SYSTEM, METHOD, AND COMPUTER PROGRAM PRODUCT FOR CONFIGURING A SYSTEM ASSOCIATED WITH MEMORY," filed May 15, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS," which is incorporated herein by reference in its entirety.

Example embodiments described herein may include computer system(s) with one or more central processor units (CPU) and possibly one or more I/O unit(s) coupled to one or more memory systems that may contain one or more memory controllers and memory devices. As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry.

Any or all of the components within a memory system or memory subsystem may be coupled internally (e.g. internal component(s) to internal component(s), etc.) or externally (e.g. internal component(s) to components, functions, devices, circuits, chips, packages, etc. external to a memory system or memory subsystem, etc.) via one or more buses, high-speed links, or other coupling means, communication means, signaling means, other means, combination(s) of these, etc.

Any of the buses etc. or all of the buses etc. may use one or more protocols (e.g. command sets, set of commands, set of basic commands, set of packet formats, communication semantics, algorithm for communication, command structure, packet structure, flow and control procedure, data exchange mechanism, etc.). The protocols may include a set of transactions (e.g. packet formats, transaction types, message formats, message structures, packet structures, control packets, data packets, message types, etc.).

A transaction may comprise (but is not limited to) an exchange of one or more pieces of information on a bus. Typically transactions may include (but are not limited to) the following: a request transaction (e.g. request, request packet, etc.) may be for data (e.g. a read request, read command, read packet, read, write request, write command, write packet, write, etc.) or for some control or status information; a response transaction (response, response packet, etc.) is typically a result (e.g. linked to, corresponds to, generated by, etc.) of a request and may return data, status, or other information, etc. The term transaction may be used to describe the exchange (e.g. both request and response) of information, but may also be used to describe the individual parts (e.g. pieces, components, functions, elements, etc.) of an exchange and possibly other elements, components, actions, functions, operations (e.g. packets, signals, wires, fields, flags, information exchange(s), data, control operations, commands, etc.) that may be required (e.g. the request, one or more responses, messages, control signals, flow control, acknowledgements, queries, ACK, NAK, NACK, nonce, handshake, connection, etc.) or a collection of requests and/or responses, etc.

Some requests may not have responses. Thus, for example, a write request may not result in any response. Requests that do not require (e.g. expect, etc.) a response are often referred to as posted requests (e.g. posted write, etc.). Requests that do require (e.g. expect, etc.) a response are often referred to as non-posted requests (e.g. non-posted write, etc.).

Some responses may not have (e.g. contain, carry, etc.) data. Thus, for example, a write response may simply be an acknowledgement (e.g. confirmation, message, etc.) that the write request was successfully performed (e.g. completed, staged, committed, etc.). Sometimes responses are also called completions (e.g. read completion, write completion, etc.) and response and completion may be used interchangeably. In some protocols, where some responses may contain data and some responses may not, the term completion may be reserved for responses with data (or for response without data). Sometimes the presence or absence of data may be made explicit (e.g. response with data, response without data, completion with data, completion without data, non-data completion, etc.).

All command sets typically contain a set of basic information. For example, one set of basic information may be considered to comprise (but may not be limited to): (1) posted transactions (e.g. without completion expected) or nonposted transactions (e.g. completion expected); (2) header information and data information; (3) direction (transmit/request or receive/completion). Thus, the pieces of information in a basic command set would comprise (but not limited to): posted request header (PH), posted request data (PD), non-posted request header (NPH), non-posted request data (NPD), completion header (CPLH), completion data (CPLD). These six pieces of information may be used, for example, in the PCI Express protocol.

Bus traffic (e.g. signals, transactions, packets, messages, commands, etc.) may be divided into one or more groups (e.g. classes, traffic classes or types, message classes or types, transaction classes or types, channels, etc.). For example, bus traffic may be divided into isochronous and non-isochronous (e.g. for media, multimedia, real-time traffic, etc.). For example, traffic may be divided into one or more virtual channels (VCs), etc. For example, traffic may be divided into coherent and non-coherent, etc.

There is currently no clear consensus on use (e.g. accepted use, consistent use, standard use, etc.) of terms and definitions for three-dimensional (3D) memory (e.g. stacked memory packages, etc.). The technology of 3D memory (e.g. electrical structure, logical structure, physical structure, etc.) is evolving and thus, terms and definitions related to 3D memory are also evolving. To help clarify this description and avoid confusion some of the issues with terms in current use are described below.

This specification defines a notation (e.g. shorthand, terminology, etc.) for the hierarchical structure of a 3D memory, stacked memory package, etc. The notation, described in more detail in the specification below and with respect to FIG. 24-3, may use a numbering of the smallest elements of interest (e.g. components, macros, circuits, blocks, groups of circuits, etc.) at the lowest level of the hierarchy (e.g. at the bottom of the hierarchy, at the leaf nodes of the hierarchy, etc.). For example, the smallest element of interest in a stacked memory package may be a bank of a SDRAM stacked memory chip. The bank may be 32 Mb, 64 Mb, 128 Mb, 2565 Mb in size, etc. The banks may be numbered 0, 2, 3, . . . , k where k is the total number of banks in the stacked memory package (or memory system, etc.). A group (e.g. pool, matrix, collection, assembly, set, range, etc.), and/or groups as well as groupings of the smallest element may then be defined using the numbering scheme. In a first design for a stacked memory package, for example, there may be 32 banks on each stacked memory chip; these banks may be numbered 0-31 on the first stacked memory chip, for example. In this first design, four banks may make up a bank group, these banks may be numbered 0, 1, 2, 3 for example. In this first design, there may be four stacked memory chips in a stacked memory package. In this first design, for example, an echelon may be defined as a group of banks comprising banks 0, 1, 32, 33, 64, 65, 96, 97. It should be noted that a bank has been used as the smallest element of interest only as an example here in this first design, banks need not be present in all designs. It should be noted that a bank has been used as the smallest element of interest only as an example, any element may be used (e.g. array, subarray, bank, subbank, group of banks, group of subbanks, group of arrays, group of subarrays, other portions(s), group(s) of portion(s), combinations of these, etc.). Thus, in this first design for example, it may be seen that the term echelon may be precisely defined using the numbering scheme and, in this example, may comprise eight banks, with two on each of the four stacked memory chips. Further the physical (e.g. spatial, locations, etc.) of the elements (e.g. banks, etc.) may be defined using the numbering scheme (e.g. element 0 next to element 1 on a first stacked memory chip, element 32 on a second stacked memory chip above element 0 on a first stacked memory chip, etc.). Further the electrical, logical and other properties, relationships, etc. of elements may be similarly may be defined using the numbering scheme.

There are several terms that may be currently used or in current use, etc. to describe parts of a 3D memory system that are not necessarily used consistently. For example, the term tile may sometimes be used to mean a portion of a SDRAM or portion of an SDRAM bank. This specification may avoid the use of the term tile (or tiled, tiling, etc.) in this sense because there is no consensus on the definition of the term tile, and/or there is no consistent use of the term tile, and/or there is conflicting use of the term tile in current use.

The term bank may be usually used (e.g. frequently used, normally used, often used, etc.) to describe a portion of a SDRAM that may operate semi-autonomously (e.g. permits concurrent operation, pipelined operation, parallel operation, etc.). This specification may use the term bank in a manner that is consistent with this usual (e.g. generally accepted, widely used, etc.) definition. This specification and specifications incorporated by reference may, in addition to the term bank, also use the term array to include configurations, designs, embodiments, etc. that may use a bank as the smallest element of interest, but that may also use other elements (e.g. structures, components, blocks, circuits, etc.) as the smallest element of interest. Thus, the term array, in this specification and specifications incorporated by reference, may be used in a more general sense than the term bank in order to include the possibility that an array may be one or more banks (e.g. array may include, but is not limited to banks, etc.). For example, in a second design, a stacked memory chip may use NAND flash technology and an array may be a group of NAND flash memory cells, etc. For example, in a third design, a stacked memory chip may use NAND flash technology and SDRAM technology and an array may be a group of NAND flash memory cells grouped with a bank of an SDRAM, etc. For example, a fourth design may be described using banks (e.g. in order to simplify explanation, etc.), but other designs based on the fourth design may use elements than banks for example, This specification and specifications incorporated by reference may use the term subarray to describe any element that is below (e.g. a part of, a sub-element, etc.) an array in the hierarchy. Thus, for example, in a fifth design, an array (e.g. an array of subarrays, etc.) may be a group of banks (e.g. a bank group, some other collection of banks, etc.) and in this case a subarray may be a bank, etc. It should be noted that both an array and a subarray may have nested hierarchy (e.g. to any depth of hierarchy, any level of hierarchy, etc.). Thus, for example, an array may contain other array(s). Thus, for example, a subarray may contain other subarray(s), etc.

The term partition has recently come to be used to describe a group of banks typically on one stacked memory chip. This specification may avoid the use of the term partition in this sense because there is no consensus on the definition of the term partition, and/or there is no consistent use of the term partition, and/or there is conflicting use of the term partition in current use. For example, there is no definition of how the banks in a partition may be related for example.

The term slice and/or the term vertical slice has recently come to be used to describe a group of banks (e.g. a group of partitions for example, with the term partition used as described above). Some of the specifications incorporated by reference and/or other sections of this specification may use the term slice in a similar, but not necessarily identical, manner. Thus, to avoid any confusion over the use of the term slice, this section of this specification may use the term section to describe a group of portions (e.g. arrays, subarrays, banks, other portions(s), etc.) that are grouped together logically (possibly also electrically and/or physically), possibly on the same stacked memory chip, and that may form part of a larger group across multiple stacked memory chips for example. Thus, the term section may include a slice (e.g. a section may be a slice, etc.) as the term slice may be previously used in specifications incorporated by reference. The term slice previously used in specifications incorporated by reference may be equivalent to the term partition in current use (and used as described above, but recognizing that the term partition may not be consistently defined, etc.). For example, in a fifth design, a stacked memory package may contain four stacked memory chips, each stacked memory chip may contain 16 arrays, each array may contain 2 subarrays. The subarrrays may be numbered from 0-63. In this fifth design, each array may be a section. For example, a section may comprise subarrays 0, 1. In this fifth design a subarray may be a bank, but need not be a bank. In this fifth design the two subarrays in each array need not necessarily be on the same stacked memory chip, but may be.

As an example of why more precise but still flexible definitions may be needed, the following example may be considered. For instance, in this fifth deign, consider a first array comprising a first subarray on a first stacked memory chip that may be coupled to a faulty second subarray on the first stacked memory chip. Thus, for example, a spare third subarray from a second stacked memory chip may be switched into place to replace the second subarray that is faulty. In this case the arrays in a stacked memory package may comprise subarrays on the same stacked memory chip, but may also comprise subarrays from more than one stacked memory chip. It could be considered that in this case the two subarrays (e.g. the first subarray and the third subarray) are logically coupled as if on the same stacked memory chip, but are physically on different stacked memory chips, etc.

The term vault has recently come to be used to describe a group of partitions, but is also sometimes used to describe the combination of partitions with some of a logic chip (or base logic, etc.). This specification may avoid the use of the term vault in this sense because there is no consensus on the definition of the term vault, and/or there is no consistent use of the term vault, and/or there is conflicting use of the term vault in current use.

This specification and specifications incorporated by reference may use the term echelon to describe a group of sections (e.g. groups of arrays, groups of banks, other portions(s), etc.) that are grouped together logically (possibly also grouped together electrically and/or grouped together physically, etc.) possibly on multiple stacked memory chips, for example. The logical access to an echelon may be achieved by the coupling of one or more sections to one or more logic chips, for example. To the system, an echelon may appear (e.g. may be accessed, may be addressed, is organized to appear, etc.) as separate (e.g. virtual, abstracted, etc.) portion(s) of the memory system (e.g. portion(s) of one or more stacked memory packages, etc.), for example. The term echelon, as used in this specification and in specifications incorporated by reference, may be equivalent to the term vault in current use (but the term vault may not be consistently defined, etc.). For example, in a sixth design, a stacked memory package may contain four stacked memory chips, each stacked memory chip may contain 16 arrays, each array may contain 2 subarrays. In this sixth design, a group of four arrays, one array on each stacked memory chip, may be an echelon. In this sixth design, the arrays (rather than subarrays, etc.) may the smallest element of interest and the arrays numbered from 0-63. In this sixth design, an echelon may comprise arrays 0, 1, 16, 17, 32, 33, 48, 49. In this sixth design, array 0 may be next to array 1, and array 16 above array 0, etc. In this sixth design an array may be a section. In this sixth design a subarray may be a bank, but need not be a bank. For example, the term echelon may be illustrated by FIGS. 2, 5, 9, and 11 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS," which is incorporated herein by reference in its entirety.

The term configuration may be used in this specification and specifications incorporated by reference to describe a variant (e.g. modification, change, alteration, etc.) of an embodiment (e.g. an example, a design, an architecture, etc.). For example, a first embodiment may be described in this specification with four stacked memory chips in a stacked memory package. A first configuration of the first embodiment may thus, have four stacked memory chips. A second configuration of the first embodiment may have eight stacked memory chips, for example. In this case, the first configuration and the second configuration may differ in a physical aspect (e.g. attribute, property, parameter, feature, etc.). Configurations may differ in any physical aspect, electrical aspect, logical aspect, and/or other aspect, and/or combinations of these. Configurations may thus, differ in one or more aspects. Configurations may be changed, altered, programmed, reconfigured, modified, specified, etc. at design time, during manufacture, during assembly, at test, at start-up, during operation, and/or at any time, and/or at combinations of these times, etc. Configuration changes, etc. may be permanent and/or non-permanent. For example, even physical aspects may be changed. For example, a stacked memory package may be manufactured with five stacked memory chips with one stacked memory chip as a spare, so that a final product with five memory chips may only use any of the four stacked memory chips (and thus, have multiple programmable configurations, etc.). For example, a stacked memory package with eight stacked memory chips may be sold in two configurations: a first configuration with all eight stacked memory chips enabled and working and a second configuration that has been tested and found to have 1-4 faulty stacked memory chips and thus, sold in a configuration with four stacked memory chips enabled, etc. For example, configurations may correspond to modes of operation. Thus, for example, a first mode of operation may correspond to satisfying 32-byte cache line requests in a 32-bit system with aggregated 32-bit responses from one or more portions of a stacked memory package and a second mode of operation may correspond to satisfying 64-byte cache line requests in a 64-bit system with aggregated 64-bit responses from one or more portions of a stacked memory package. Modes of operation may be configured, reconfigured, programmed, altered, changed, modified, etc. by system command, autonomously by the memory system, semi-autonomously by the memory system, etc. Configuration state, settings, parameters, values, timings, etc. may be stored by fuse, anti-fuse, register settings, design database, solid-state storage (volatile and/or non-volatile), and/or any other permanent or non-permanent storage, and/or any other programming or program means, and/or combinations of these, etc.

FIG. 24-1

Figures 1, 24:
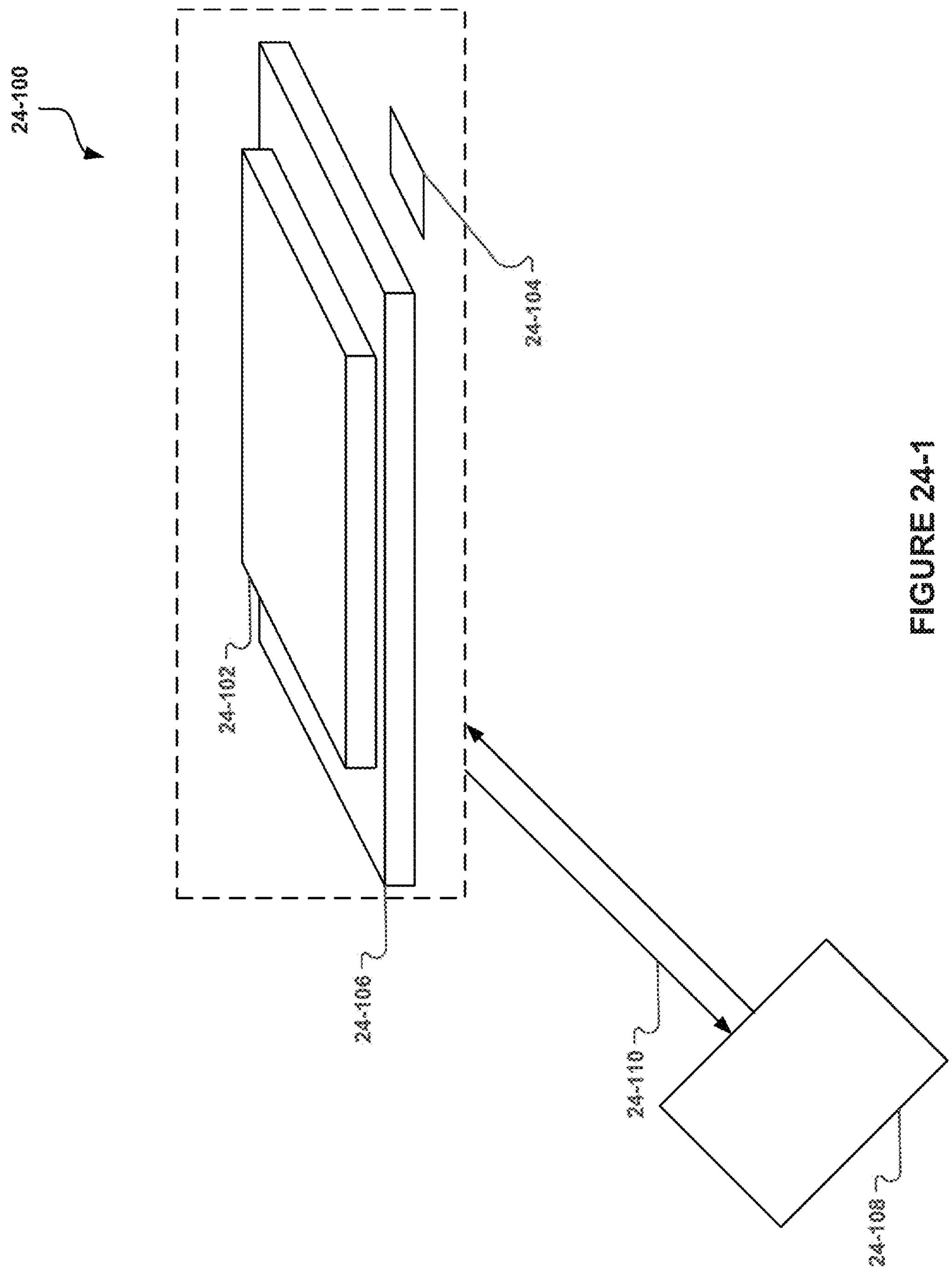
Figures 2, 24:
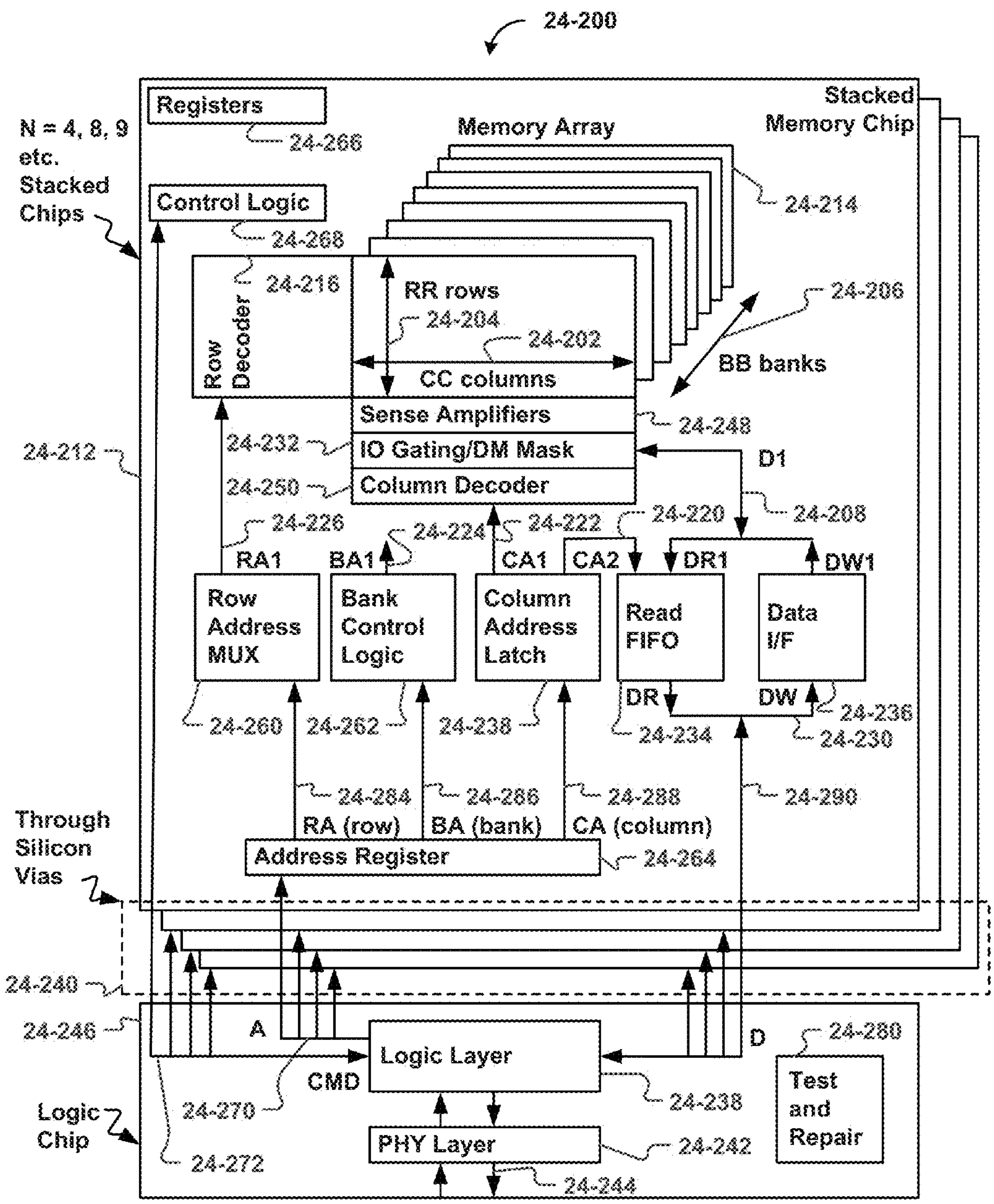
Figures 3, 24:
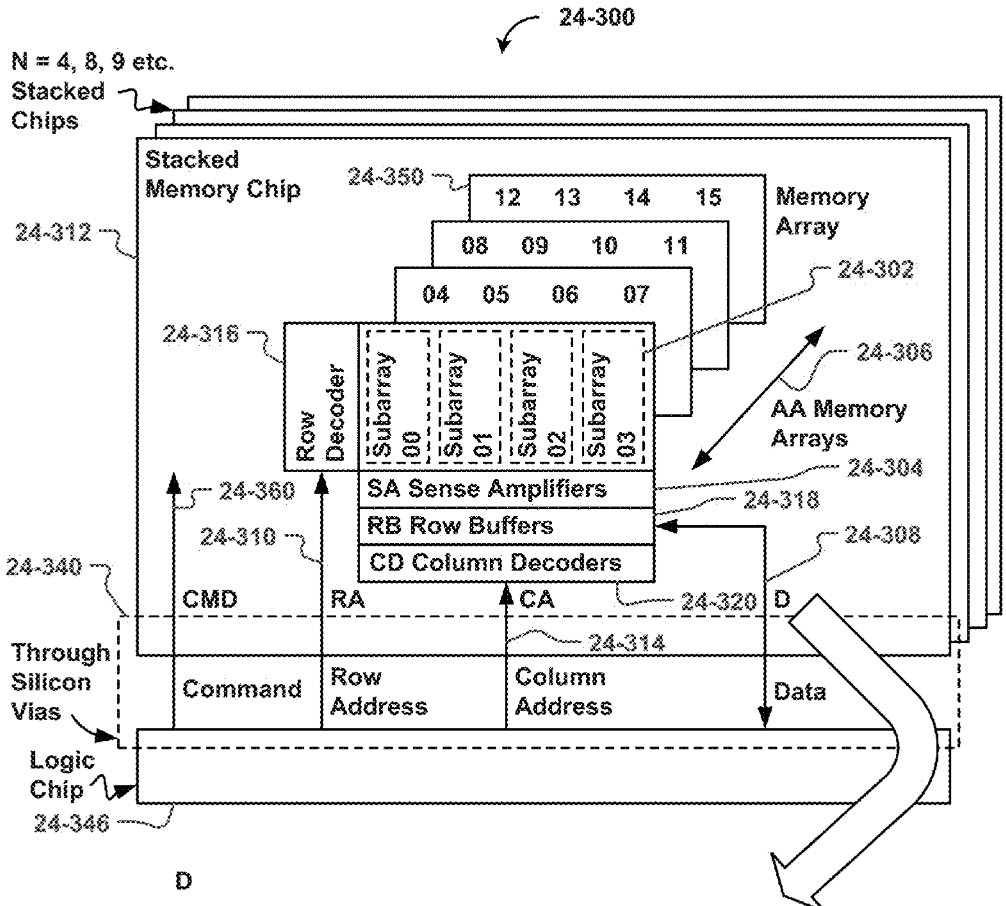
Figures 4, 24:
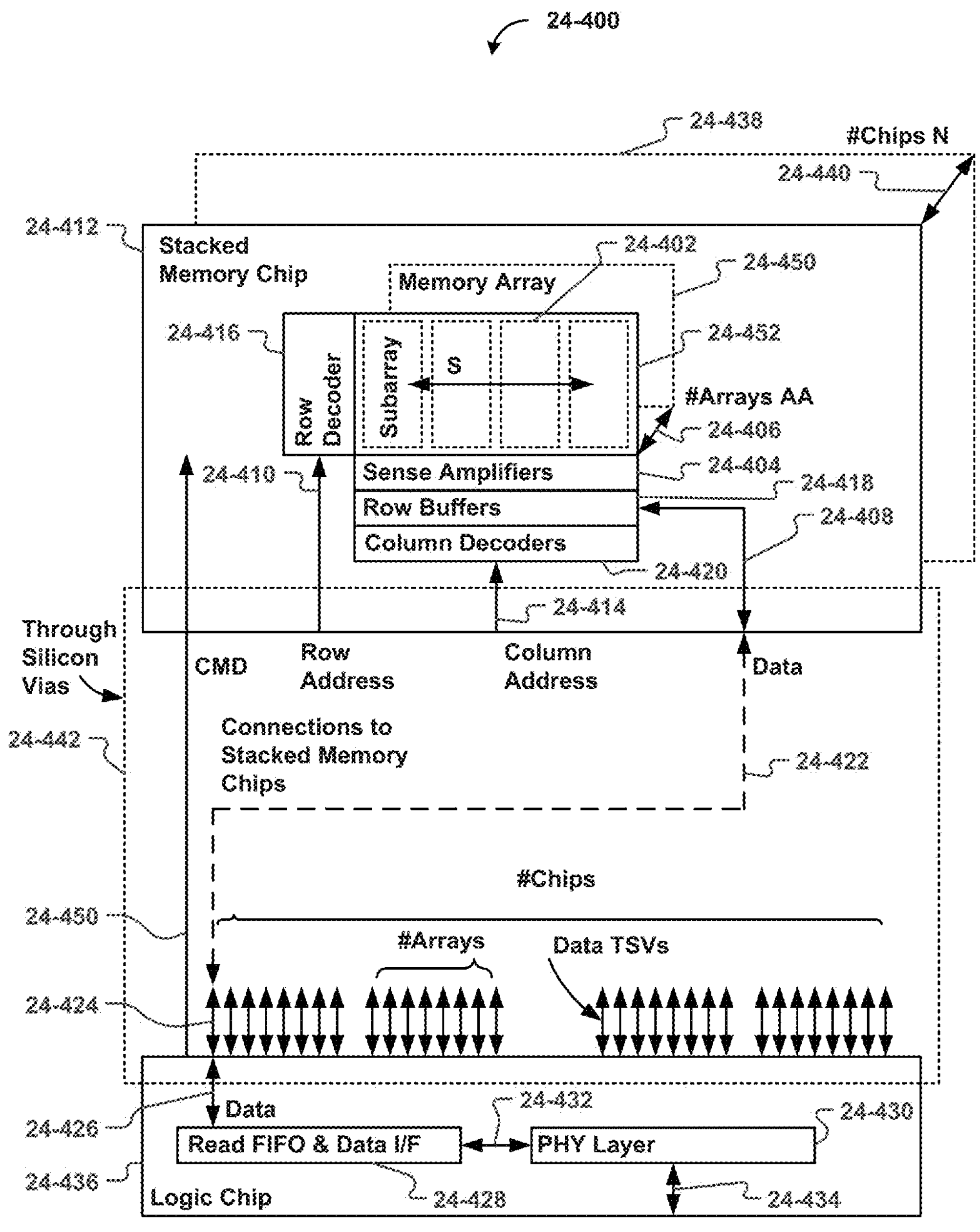
Figures 5, 24:
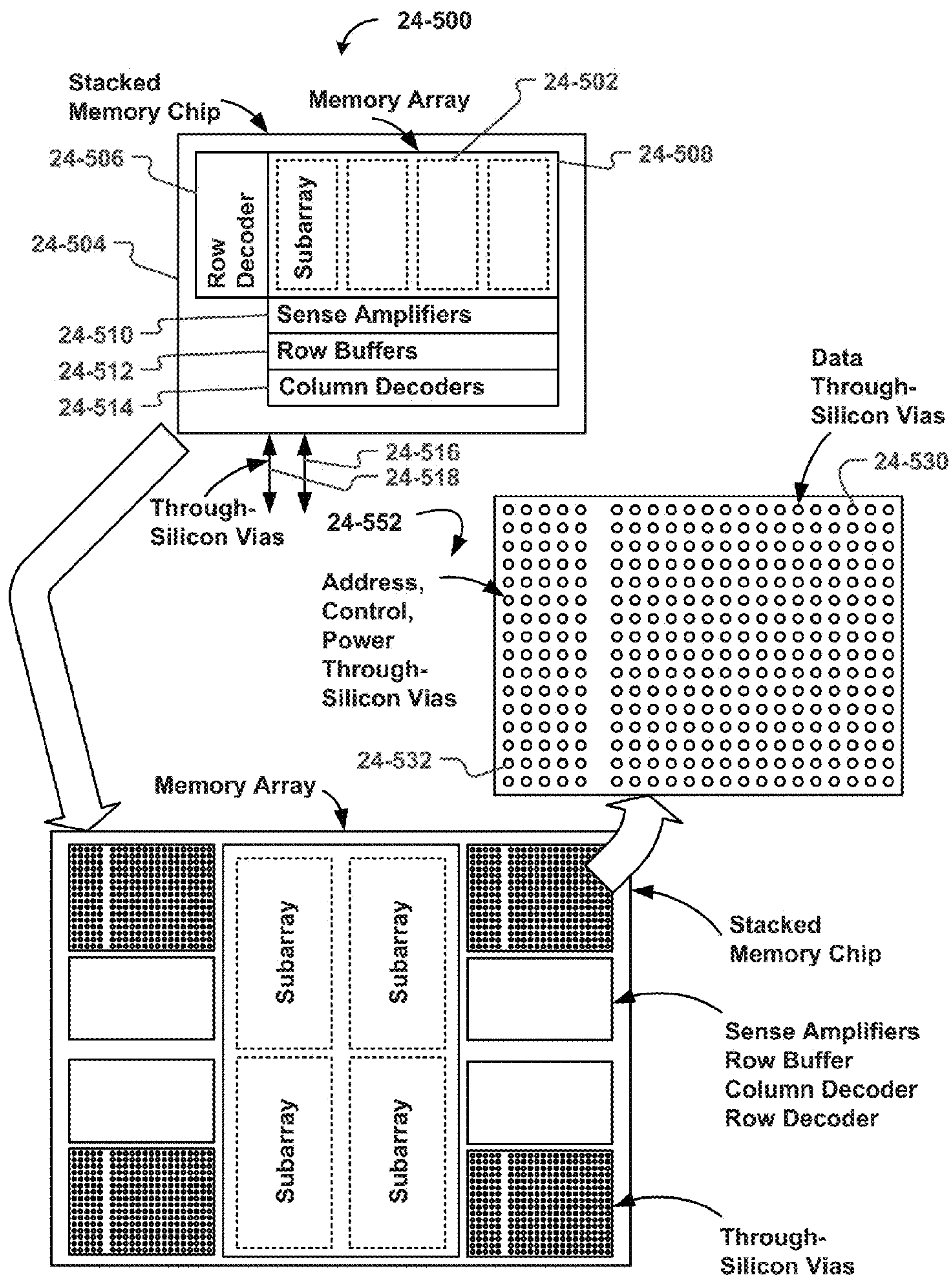
Figures 6, 24:
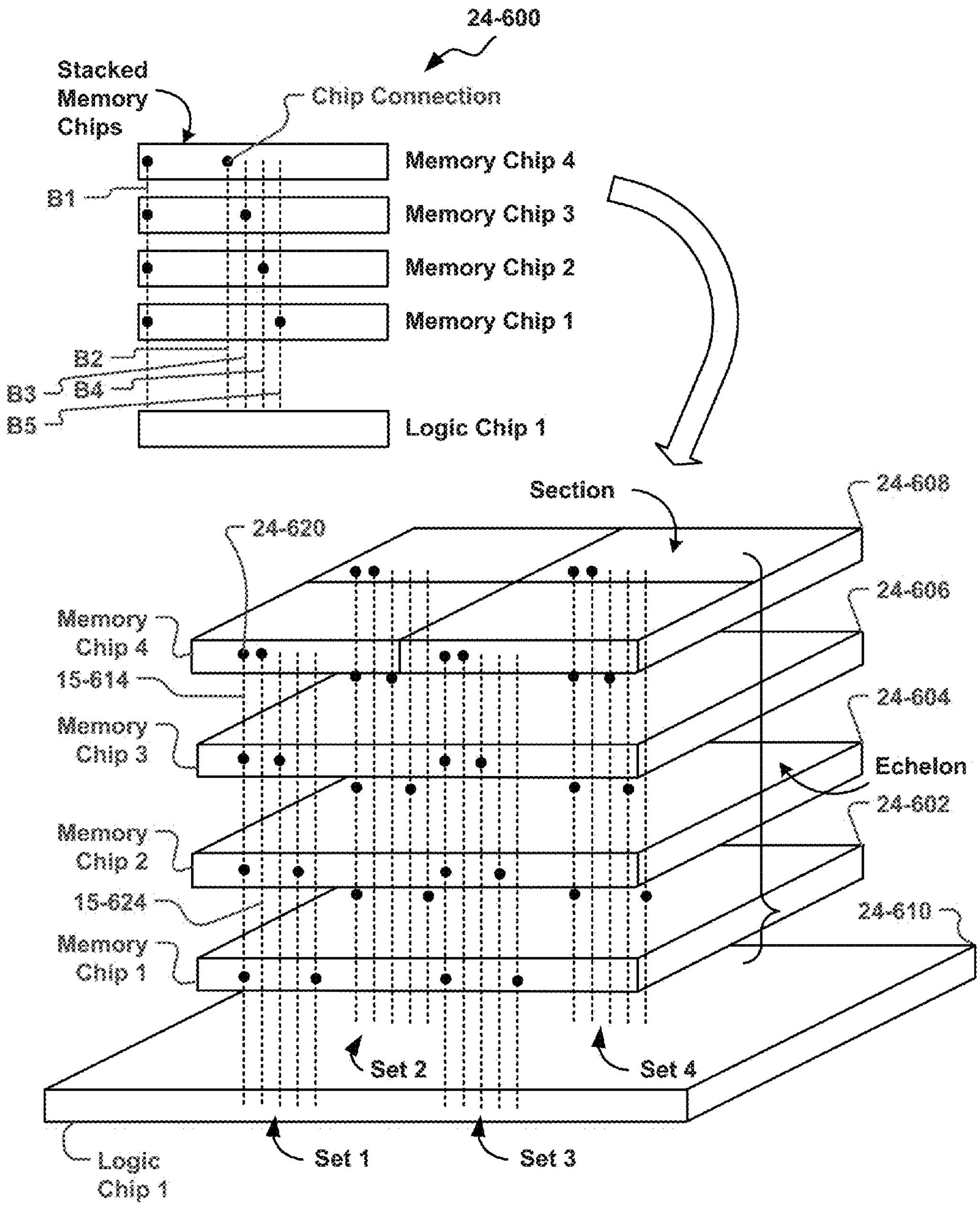

FIG. 24-1 shows an apparatus 24-100, in accordance with one embodiment. As an option, the apparatus 24-100 may be implemented in the context of any subsequent Figure(s). Of course, however, the apparatus 24-100 may be implemented in the context of any desired environment.

It should be noted that a variety of optional architectures, capabilities, and/or features will now be set forth in the context of a variety of embodiments in connection with a description of FIG. 24-1. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 24-100 includes a first semiconductor platform 24-102, which may include a first memory. Additionally, the apparatus 24-100 includes a second semiconductor platform 24-106 stacked with the first semiconductor platform 24-102. In one embodiment, the second semiconductor platform 24-106 may include a second memory. As an option, the first memory may be of a first memory class. Additionally, the second memory may be of a second memory class.

In another embodiment, a plurality of stacks may be provided, at least one of which includes the first semiconductor platform 24-102 including a first memory of a first memory class, and at least another one which includes the second semiconductor platform 24-106 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments.

In another embodiment, the apparatus 24-100 may include a physical memory sub-system. In the context of the present description, physical memory refers to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, MRAM, PRAM, etc.), a solid-state disk (SSD) or other disk, magnetic media, and/or any other physical memory that meets the above definition.

Additionally, in various embodiments, the physical memory sub-system may include a monolithic memory circuit, a semiconductor die, a chip, a packaged memory circuit, or any other type of tangible memory circuit. In one embodiment, the apparatus 24-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 24-106. Such connections that are in communication with the first memory and pass through the second semiconductor platform 24-106 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing one or more TSVs.

As another option, the communicative coupling may include a connection via a buffer device. In one embodiment, the buffer device may be part of the apparatus 24-100. In another embodiment, the buffer device may be separate from the apparatus 24-100.

Further, in one embodiment, at least one additional semiconductor platform (not shown) may be stacked with the first semiconductor platform 24-102 and the second semiconductor platform 24-106. In this case, in one embodiment, the additional semiconductor may include a third memory of at least one of the first memory class or the second memory class, and/or any other additional circuitry. In another embodiment, the at least one additional semiconductor may include a third memory of a third memory class.

In one embodiment, the additional semiconductor platform may be positioned between the first semiconductor platform 24-102 and the second semiconductor platform 24-106. In another embodiment, the at least one additional semiconductor platform may be positioned above the first semiconductor platform 24-102 and the second semiconductor platform 24-106. Further, in one embodiment, the additional semiconductor platform may be in communication with at least one of the first semiconductor platform 24-102 and/or the second semiconductor platform 24-102 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 24-102 may be in communication via a buffer. In this case, in one embodiment, the buffer may include a row buffer.

Further, in one embodiment, the apparatus 24-100 may be configured such that the first memory and the second memory are capable of receiving instructions via a single memory bus 24-110. The memory bus 24-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, etc; I/O protocols such as PCI, PCI-E, HyperTransport, InfiniBand, QPI, etc; networking protocols such as Ethernet, TCP/IP, iSCSI, etc; storage protocols such as NFS, SAMBA, SAS, SATA, FC, etc; and other protocols (e.g. wireless, optical, etc.); etc.). Of course, other embodiments are contemplated with multiple memory buses.

In one embodiment, the apparatus 24-100 may include a three-dimensional integrated circuit. In one embodiment, the first semiconductor platform 24-102 and the second semiconductor platform 24-106 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 24-100 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 24-102 and the second semiconductor platform 24-106 together may include a three-dimensional integrated circuit that is a wafer-on-wafer device.

In another embodiment, the apparatus 24-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 24-102 and the second semiconductor platform 24-106 together may include a three-dimensional integrated circuit that is a monolithic device.

In another embodiment, the apparatus 24-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 24-102 and the second semiconductor platform 24-106 together may include a three-dimensional integrated circuit that is a die-on-wafer device.

In yet another embodiment, the apparatus 24-100 may include a three-dimensional integrated circuit that is a die-on-die device. In the context of the present description, a die-on-die device refers to a device including two or more aligned dies in a die-on-die configuration. In one embodiment, the first semiconductor platform 24-102 and the second semiconductor platform 24-106 together may include a three-dimensional integrated circuit that is a die-on-die device.

Additionally, in one embodiment, the apparatus 24-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 24-100 may be configured such that the first memory and the second memory are capable of receiving instructions from a device 24-108 via the single memory bus 24-110. In one embodiment, the device 24-108 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.

In the context of the following description, optional additional circuitry 24-104 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 24-104 is shown generically in connection with the apparatus 24-100, it should be strongly noted that any such additional circuitry 24-104 may be positioned in any components (e.g. the first semiconductor platform 24-102, the second semiconductor platform 24-106, the device 24-108, an unillustrated logic unit or any other unit described herein, a separate unillustrated component that may or may not be stacked with any of the other components illustrated, a combination thereof, etc.).

In another embodiment, the additional circuitry 24-104 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiments, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 24-104 capable of receiving (and/or sending) the data operation request. More illustrative information will be set forth regarding various optional architectures, capabilities, and/or features with which the present embodiment(s) may or may not be implemented during the description of the embodiments shown in subsequent figures. It should be strongly noted that subsequent embodiment information is set forth for illustrative purposes and should not be construed as limiting in any manner, since any of such features may be optionally incorporated with or without the inclusion of other features described.

In yet another embodiment, regions and sub-regions of any of the memory described herein may be arranged to optimize one or more parallel operations in association with the memory.

In still yet another embodiment, an analysis involving at least one aspect of the apparatus 24-100 (e.g. any component(s) thereof, etc.) may be performed, and at least one parameter of the apparatus 24-100 (e.g. any component(s) thereof, etc.) may be altered based on the analysis, for optimizing the apparatus 24-100 and/or any component(s) thereof (e.g. as described in the context of FIG. 15-0, elsewhere hereinafter, etc.). Of course, in various embodiments, the aforementioned aspect(s), parameter(s), etc. may involve any one or more of the components of the apparatus 24-100 described herein or possibly others (e.g. first semiconductor platform 24-102, second semiconductor platform 24-106, device 24-108, optional additional circuitry 24-104, memory bus 24-110, unillustrated software, etc.). Still yet, the aforementioned analysis may involve and/or be performed by any one or more of the components of the apparatus 24-100 described herein or possibly others (e.g. first semiconductor platform 24-102, second semiconductor platform 24-106, device 24-108, optional additional circuitry 24-104, memory bus 24-110, unillustrated software, etc.).

In one embodiment, the apparatus 24-100 may be operable in at least one configuration that is selectable from a plurality of configurations. Such capability will now be described in greater detail. It should be strongly noted, however, that while such capability is described in the context of apparatus 24-100, such capability (and any other features disclosed herein, for that matter) may be implemented in any desired environment (e.g. without a stacked semiconductor platform, etc.).

In various embodiments, the aforementioned configuration may be for reading data and/or writing data. Further, in one embodiment, the configuration may be selectable at design time (e.g. at design time of the apparatus 24-100, the first semiconductor platform 24-102, the second semiconductor platform 24-104, a system associated with the apparatus 24-100, etc.).

Additionally, in one embodiment, the apparatus 24-100 may be operable such that the configuration is selectable at test time (e.g. at test time of the apparatus 24-100, the first semiconductor platform 24-102, the second semiconductor platform 24-104, a system associated with the apparatus 24-100, etc.). As another option, the apparatus 24-100 may be operable such that the configuration is selectable at manufacture time. In various other embodiments, the apparatus 24-100 may be operable such that the configuration is selectable during operation, during run-time, and/or at start-up.

Further, in one embodiment, the apparatus 24-100 may be operable such that the configuration is dynamically selectable. Additionally, in one embodiment, the apparatus 24-100 may be operable such that the configuration is selectable by a human. In one embodiment, the apparatus 24-100 may be operable such that the configuration is automatically selectable.

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate with the memory system to allow for any of the foregoing optional architectures, capabilities, and/or features. For that matter, further embodiments are contemplated where a single semiconductor platform (e.g. 24-102, 24-106, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

It should be noted that while the embodiments described in this specification and in specifications incorporated by reference may show examples of stacked memory system and improvements to stacked memory systems, the examples described and the improvements described may be generally applicable to a wide range of electrical and/or electronic systems. For example, improvements to signaling, yield, bus structures, test, repair etc. may be applied to the field of memory systems in general as well as systems other than memory systems, etc.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the configuration/operation of the apparatus 24-100, the configuration/operation of the first and/or second semiconductor platforms, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc. which may or may not be incorporated in the various embodiments disclosed herein.

FIG. 24-2

FIG. 24-2 shows a stacked memory package 24-200 comprising a logic chip 24-246 and a plurality of stacked memory chips 24-212, in accordance with another embodiment. In FIG. 24-2 one logic chip is shown, but any number may be used. If more than one logic chip is used then they may be the same or different (for example, one chip may perform logic functions, while one chip may perform high-speed optical IO functions for example). In FIG. 24-2 each of the plurality of stacked memory chips 24-212 may comprise a memory array 24-214 (e.g. DRAM array, etc.). Of course, any type of memory may equally be used (e.g. SDRAM, NAND flash, PCRAM, combinations of these, etc.) in one or more memory arrays on each stacked memory chip. Each stacked memory chip may be the same or different (e.g. one stacked memory chip may be DRAM, another stacked memory chip may be NAND flash, etc.). One or more of the logic chip(s) may also include one or more memory arrays (e.g. embedded DRAM, NAND flash, other non-volatile memory, NVRAM, register files, SRAM, combinations of these, etc). In FIG. 24-2 each of the memory arrays may comprise one or more banks (or other portion(s) of the memory array(s), etc.). For example, the stacked memory chips in FIG. 24-2 may comprise BB banks 24-206. For example, BB may be 2, 4, 8, 16, 32, etc. In one embodiment, the BB banks may be subdivided (e.g. partitioned, divided, grouped, arranged, logically arranged, physically arranged, etc.) into a plurality of bank groups (e.g. 32 banks may be divided into 16 groups of 2 banks, 8 banks may be divided into 2 groups of 4 banks, etc.). The banks may be further subdivided or may not be further subdivided into subbanks and so on (e.g. subbanks may optionally be further divided, etc.). The groups of banks and/or banks within groups may be able to operate in parallel (e.g. one or more operations such as read and/or write may be performed simultaneously, or nearly simultaneously and/or partially overlapped in time, etc.) and/or in a pipelined (e.g. overlapping in time, etc.) fashion, etc. The groups of subbanks and/or subbanks within groups may also be able to operate in parallel and/or pipelined fashion, etc.

In FIG. 24-2 each of the plurality of stacked memory chips 24-212 may comprise a DRAM array with banks, but if a different memory technology (or multiple memory technologies are used) one or more memory array(s) may be subdivided in any fashion (e.g. pages, sectors, rows, columns, volumes, ranks, echelons (as defined herein), sections (as defined herein), NAND flash planes, DRAM planes (as defined herein), other portion(s), other collections(s), other groupings(s), combinations of these, etc.).

In FIG. 24-2 each of the banks may comprise a row decoder 24-216, sense amplifiers 24-248, 10 gating/DM mask logic 24-232, column decoder 24-250. In FIG. 24-2 each bank may comprise RR rows 24-204 (e.g. 8192 rows, 16384 rows, etc.) and CC columns 24-202 (e.g. 8192 columns, 16384 columns, etc.). In FIG. 24-2 each of the plurality of stacked memory chips 24-212 may comprise a DRAM array, but if a different memory technology (or multiple memory technologies are used) one or more memory array(s) may comprise any organization (e.g. arrangement, collection, grouping, replicated array, matrix, tiling, etc.) of memory cell rows and memory cell columns with associated read/write support circuits and/or elements (e.g. word lines, bit lines, digit lines, local lines, global lines, peripheral circuits, wordline drivers, bitline drivers, digitline drivers, IO drivers, other drivers, row decoders, column decoders, other decoders, multiplexers, demultiplexers, bus logic, encoders, masking logic, sense amplifiers, helper flip-flops, local/global circuits, blocks, mats, subarrays, arrays, DLLs, PLLs, refresh circuits, refresh counters, voltage reference circuits, voltage boost circuits, charge pumps, dummy circuit elements, dummy connection elements, etc.).

In FIG. 24-2 each stacked memory chip may be connected (e.g. coupled, etc.) to the logic chip using through-silicon vias (TSVs) 24-240. Of course, any coupling means may be used.

In FIG. 24-2 the logic layer may be coupled (e.g. connected using TSVs, etc.) to the control logic 24-212 via command bus 24-272 of width CMD bits (e.g. width 8 bits, 8 signals, etc.). The command bus may include (but is not limited to) command, control, status, etc. signals such as: CLK, CLK#, CKE, RAS#, CAS#, WE#, CS#, RESET#, ODT, ZQ, CE#, CLE, ALE, WE#, RE#, WP#, R/B#, etc. where the number, types, functions, etc. of signals may depend on the memory technology (e.g. SDRAM, NAND flash, PCRAM, etc.) and/or the generation of technology (e.g. DDR2, DDR3, DDR4, etc.) and/or whether the technology is (or is based on) a standard part (e.g. JEDEC standard, etc.) or a non-standard or derivative memory technology (or combination(s) of technologies, etc.). The command bus may typically couple (e.g. provide, connect, contain, supply, etc.) command inputs to the stacked memory devices (e.g. such as commands, command inputs, command signals, control signals, for SDRAM, etc.) but may also couple status outputs (e.g. such as R/B# from NAND flash, etc.) or may provide commands, control, status, etc. signals to and/or from memory contained on the logic chip(s), etc.

The command bus may carry signals that are coupled to each bank and/or signals coupled to each stacked memory chip. For example, command signals such as CLK, CLK# may be coupled to each stacked memory chip. For example, command signals such as CLK, CLK#, etc. (e.g. chip-level command signals, etc.) may be coupled to each stacked memory chip. For example, command signals such as CAS#, RAS#, etc. (e.g. bank-level command signals, etc.) may be coupled to each bank (or other array, subarray, group of banks, bank group, echelon (as defined herein), section (as defined herein), portion(s) of one or more stacked memory chips, etc.). Some signals associated with data signals such as strobes, masks, etc. may be included in the command bus or in the data bus. Generally high-speed signals associated with data are routed with or at least considered part of the data bus. Thus, it should be noted that, for example, if there are 32 banks in a stacked memory chip, there may be up to 32 copies (e.g. some banks, arrays, subarrays, echelons, sections, etc. may share a command bus, etc.) of the command bus (or portion(s) of the command bus) each of which may be of width up to CMD bits.

Of course, multiple copies of signals, including command signals, may be coupled between the logic chip(s) and stacked memory chips. For example, in one configuration, if there are 32 banks in a stacked memory chip, there may be 32 identical (or nearly identical, etc.) copies (or any number of copies) of the clock signal (e.g. CLK, CLK#, etc.) coupled to each bank.

Of course, multiple versions of signals, including command signals, may be coupled between the logic chip(s) and stacked memory chips. For example, in one configuration, if there are 32 banks in a stacked memory chip, there may be 32 versions (or any number of versions) of the clock signal (e.g. CLK, CLK#, etc.) coupled to each bank. For example, each version of the clock signal may be slightly delayed (e.g. staggered, delayed with respect to each other, clock edges distributed in time, etc.) in order to minimize power spikes (e.g. power supply noise, power distribution noise, etc.). Modification of any signal(s) may be in time (e.g. staggered, delayed by less than a clock cycle, delayed by a multiple of clock cycles, moved within a clock cycle, delayed by a variable or configurable amount, stretched, shortened, otherwise shaped in time, etc.) or signals may be modified by forming logical combinations of signals with other signals, etc.

Of course, some signals in the command bus may apply to (e.g. logically apply to, be logically coupled to, etc.) the stacked memory package. For example, CLK (or versions of CLK, copies of CLK, other clock or clock-related signals, etc.) may apply to the stacked memory package. For example, signals such as (but not limited to) termination control signals, calibration signals, resets, and other similar signals, etc. may apply to the stacked memory package. Of course, some signals in the command bus may apply to (e.g. logically apply to, be logically coupled to, etc.) each stacked memory chip. Of course, some signals in the command bus may apply to (e.g. logically apply to, be logically coupled to, etc.) each bank (or other array, subarray, portion(s) of one or more stacked memory chips, etc.). Of course, some signals in the command bus may apply to (e.g. logically apply to, be logically coupled to, etc.) a group (e.g. collection, arrangement, etc.) of banks (e.g. section, echelon, etc.). Thus, for example, some signals in the command bus may be viewed as belonging to each bank (or other array, subarray, portion(s) of one or more stacked memory chips, etc.), some signals may be viewed as belonging to each stacked memory chip, some signals may be viewed as belonging to each stacked memory package, etc.

Other configurations of the command bus are possible. For example, different portions of the command bus may have different widths and/or bus types (e.g. multiplexed, unidirectional, bidirectional, etc.) and/or use different signaling types (e.g. voltage levels, coding schemes, scrambling, error protection, etc.) and/or signaling schemes (e.g. single-ended, differential, etc.). In one configuration the command bus may be unidirectional. For example, if the stacked memory chips are SDRAM or SDRAM-based, the command bus may consist of signals from the logic chip(s) to the stacked memory chips (e.g. status signals etc. may be sent from the stacked memory chips using another bus, for example, the data bus, in response to register commands etc.). In one configuration the command bus may be bidirectional. For example, if the stacked memory chips are NAND flash or NAND flash-based, the command bus may include signals from the logic chip(s) to the stacked memory chips as well as signals (e.g. status signals such as R/B#, etc.) from the stacked memory chips to the logic chip(s).

Other configurations of bus (e.g. bus topology, coupling technology, bus type, bus technology, etc.) are possible. For example, the command bus or portion(s) of the command bus may be shared between (e.g. coupled to, connected to, carry signals for, be multiplexed between, etc.) one or more banks, etc. Several configurations of bus sharing are possible. In one configuration, a command bus or portion(s) of the command bus may connect (e.g. couple, etc.) to all stacked memory chips in a stacked memory package. For example, the command bus or portion(s) of the command bus may run vertically (e.g. coupled via TSVs, etc.) through a vertical stack of stacked memory chips. In one configuration, a command bus or portion(s) of the command bus may be shared between one or more arrays (e.g. banks, other stacked memory chip portion(s), etc.) in a stacked memory chip, etc. For example, a stacked memory chip may have 32 banks, with 16 copies of the command bus or portion(s) of the command bus and each command bus or portion(s) of the command bus may be connected to two banks on a stacked memory chip. In one configuration, a command bus or portion(s) of the command bus may be shared between one or more arrays (e.g. banks, other portions, etc.) on a stacked memory chip and connect to a subset (e.g. group, collection, echelon, etc.) of the stacked memory chips in a package, etc. For example, a stacked memory package may contain eight stacked memory chips, each stacked memory chip may have 32 banks, with 16 copies of the command bus or portion(s) of the command bus and each command bus or portion(s) of the command bus may be connected to two banks on each of four stacked memory chips. In one configuration, a command bus may be shared between one or more arrays (e.g. banks, other portions, etc.) on a stacked memory chip and connect to all stacked memory chips in a package, etc. For example, a stacked memory package may contain four stacked memory chips, each stacked memory chip may have 32 banks, with 16 copies of the command bus or portion(s) of the command bus and each command bus or portion(s) of the command bus may be connected to two banks on each of the four stacked memory chips. Of course, any number of command bus copies may be used depending on the number (and type, etc.) of stacked memory chips in a stacked memory package, the architecture (e.g. bus sharing, number of banks or other arrays, etc.), and other factors, etc.

Typically each copy of a command bus or portion(s) of the command bus may be of the same width and type. For example, a stacked memory package may contain four stacked memory chips; each stacked memory chip may have 32 banks (e.g. 4×32=128 banks in total); there may be 16 copies of the command bus or portion(s) of the command bus; and each command bus or portion(s) of the command bus may be connected to two banks on each of the four stacked memory chips (e.g. each command bus coupled to 8 banks). If the stacked memory chips are all SDRAM or SDRAM-based and each stacked memory chip is identical, the 16 copies of the command bus or portion(s) of the command bus may all be of the same width and type.

In some configurations each copy of a command bus or portion(s) of the command bus may be of the same logical width and type but different physical construction. For example, a stacked memory package may contain eight stacked memory chips; each stacked memory chip may have 32 banks (e.g. 8×32=256 banks in total); there may be 32 copies of the command bus or portion(s) of the command bus; and each command bus or portion(s) of the command bus may be connected to two banks on each of four stacked memory chips (e.g. each command bus coupled to 8 banks). Thus, each copy of the 32 command bus copies may couple four stacked memory chips of the eight stacked memory chips. Thus, depending on the physical locations of each set of four such coupled stacked memory chips in the stacked memory package each command bus (or set of command bus copies, etc.) may be physically different. For example, a first set of 16 copies of the command bus may couple the bottom four stacked memory chips in the stacked memory package, and a second set of 16 copies of the command bus may couple the top four stacked memory chips in the stacked memory package, In some configurations one or more copies of a command bus or portion(s) of the command bus may have a different logical width and/or different logical type and/or different physical construction. For example, in some configurations, there may be more than one type of command bus or portion(s) of the command bus. For example, in one embodiment, different command bus types, widths, functions may be used if there is more than one memory technology used in a stacked memory package. For example, in one configuration, a first command bus (or plurality of a first command bus type, etc.) may be shared between one or more arrays and/or one or more stacked memory chips of a first technology type and a second command bus (or plurality of a second command bus type, etc.) may be shared between one or more arrays and/or one or more stacked memory chips of a second technology type, etc. Note that depending on the signaling schemes used (single-ended, differential, etc.) the widths of buses (e.g. command bus, data bus, address bus, row address bus, column address bus, etc.) measured in bits (e.g. signals, logical signals, etc.) may not be the same as the width of the buses measured in wires (or other physical coupling methods, etc.). For example, in one embodiment, different command bus types, widths, functions may be used if there are spare circuits, spare resources, repaired circuits, repaired resources, etc. For example, one or more command buses may have extra signals to enable test, repair, sparing, etc.

In FIG. 24-2 the logic layer may be coupled (e.g. connected using TSVs, etc.) to the address register 24-264 via address bus 24-270 of width A bits (e.g. width 17 bits, 17 signals, etc.). The address bus may include (but is not limited to) address signals such as: A0-A13 (e.g. a range of signals, etc.); A[13:0]; BA0-BA2; BA[2:0]; I/O[15:0]; one or more subsets of these signals and/or signal ranges; logical combinations of these signals and/or signal ranges; logical combinations of these signals with other signals and/or signal ranges; etc. The number, types, and functions of signals and/or signal ranges may depend on (but are not limited to) such factors as the memory technology (e.g. SDRAM, NAND flash, PCRAM, etc.) and/or the generation of technology (e.g. DDR2, DDR3, DDR4, etc.) and/or whether the technology is (or is based on) a standard part (e.g. JEDEC standard, etc.) or a non-standard or derivative (e.g. derived from a standard, etc.) memory technology (or combination(s) of technologies, etc.).

The address bus may typically couple (e.g. provide, connect, contain, supply, etc.) address inputs to the stacked memory devices (e.g. such as row address, column address, bank address, other array address, etc. for SDRAM, etc.) but may also provide commands, control, status, etc. signals to and/or from memory contained on the logic chip(s), etc. The address bus or portion(s) of the address bus may or may not include one or more row addresses and/or one or more column addresses and/or other addresses fields, portions, etc. In one embodiment, the address or portion(s) of the address may be provided (e.g. in the command, as part of the command, etc.) in multiplexed form (e.g. row address and column address separately, row address and column address at different times, etc.). In one embodiment, one or more portions of the address may be provided (e.g. in the command, as part of the command, etc.) together (e.g. row address and column address at the same time, etc.). In one embodiment, the address or portion(s) of the address may be demultiplexed (e.g. row address and column address separated, etc.) in the logic chip(s). In one embodiment, the address or portion(s) of the address may be demultiplexed (e.g. row address and column address separated, etc.) in the stacked memory chip(s). In one embodiment, the address may be demultiplexed (e.g. row address and column address separated, etc.) by one or more logic circuits that may be partitioned (e.g. split, divided, etc.) between the logic chip(s) and the stacked memory chip(s). In one embodiment, the address or portion(s) of the address may be provided (e.g. in the command, as part of the command, etc.) separately (e.g. row address and column address at different times, etc.). In one embodiment, the address or portion(s) of the address may be multiplexed (e.g. row address and column address combined, etc.) in the logic chip(s). In one embodiment, the address may be multiplexed (e.g. row address and column address combined, etc.) in the stacked memory chip(s).

Various configurations of multiplexing and/or demultiplexing of row address portion(s), column address portion(s), other address portion(s), etc. may be used, for example, to reduce the number of TSVs used to couple address signals between logic chip(s) and one or more stacked memory chips. For example, the address bus or portion(s) of the address bus may contain a row address or portion(s) of a row address in a first time period and a column address or portion(s) of a column address in a second time period. For example, the address bus or portion(s) of the address bus may contain a row address and a column address in the same time period (e.g. bits representing the row address are changed, driven, stored, etc. at the same time, or nearly the same time, as the bits representing the column address, etc.).

For example, a multiplexed address of 17 bits (e.g. including a multiplexed row address and column address, etc.) may be used to address a stacked memory chip based on 1Gbit SDRAM (e.g. for a×4 or ×8 part, etc.). For example, a demultiplexed address may contain up to 3 bank address bits, 10 column address bits (e.g. including column 0, 1, 2 select), 13 row address bits or 26 bits (e.g. including a separate row address and column address, etc.) may be used to address a stacked memory chip based on 1Gbit SDRAM (e.g. for a×16 part, etc.). For example, a demultiplexed address bus with column address CA0-CA11 (e.g. 12 bits) and row address RA12-RA29 (e.g. 18 bits) or up to 30 bits may be used to address a stacked memory chip based on 4Gbit NAND flash, etc. For example, a multiplexed address bus of eight bits (e.g. I/O[7:0], etc.) may contain column address bits CA0-CA11 (e.g. 12 bits) in time periods 1, 2; and row address bits RA12-RA29 (e.g. 18 bits) in time periods 3, 4, 5 (e.g. 30 bits may be used as a multiplexed address to address a stacked memory chip based on 4Gbit NAND flash, etc.).

The number of bits (e.g. width, number of signals, etc) of an address used in each portion (e.g. field, part, etc.) of the address bus (e.g. row address, column address, bank address, column select, etc.) may depend on (but not limited to) one or more of the following: the size (e.g. capacity, number of memory cells, etc.) of the stacked memory chips; the organization of the stacked memory chips (e.g. number of rows, number of columns, etc.), the size of each bank (or other arrays, subarrays, etc.), the organization of each bank (or other arrays, subarray(s), etc.). Thus, the number of bits in the address bus and/or in the portion(s) of the address bus may be more or less than the numbers given in the above examples depending on the number(s), size(s), configuration(s), etc. of the stacked memory chips, memory arrays, banks, rows, columns, etc.

For example, a 1 Gb (1073741824 bits, 2ˆ30 bits) stacked memory chip with BB=32 (=2ˆ5) banks may have a bank size of 32 Mb (33554432 bits, 2"25 bits). Since 32=2ˆ5 there may be 5 bits less in the address bus required to address a 32 Mb bank than required to address a 1 Gb stacked memory chip. The stacked memory chip may use a multiplexed address of 17 bits (e.g. including a multiplexed row address and column address, etc.), but the banks or other arrays, subarrays, etc. may require fewer address bits. Thus, for example, a 32 Mb bank may require 2ˆ(25−N) address bits if the bank access granularity (e.g. read/write datapath width, etc.) is N bits.

For example, a 128 Mb bank may be organized as 8192 rows×16384 columns. The 16384 columns may be organized as 128×128 bits. The bank organization may thus, be 8192×128×128. The row address may be 13 bits (2ˆ13=8192). The column address may be 10 bits (2ˆ10=1024) allowing a column address to access data to 16-bit granularity. The data may be coupled (e.g. read data and write data) to the bank using a datapath of 128 bits (as part of a row of 16384 data bits corresponding to a 2 kB page size). Thus, 3 bits of the column address (e.g. bits 0, 1, 2) may be used to access a group of 16 bits within the 128 bits (2ˆ3=8, 128/16=8). Thus, 7 bits of the column address (=10−3) may be used to address the bank at 128-bit granularity and 3 bits of the column address used by the read FIFO and data I/F logic, etc. to address 128 bits at 16-bit granularity. The bank access granularity may thus, be 128 bits (N=128).

In one configuration, data may be multiplexed, thus, N bits may be accessed (e.g. read, write) as a burst access of BL (bursts)×N/BL bits (each burst). Thus, for example, the read FIFO and/or data I/F (or logic performing the same, similar, equivalent, etc. functions) may store N bits and N/BL bits may be transferred using the data bus in one data bus time period. If BL=8 for example, 128 bits may be accessed in 8 bursts of 16 bits for a 8192×128×128 bank. If access is required to 16-bit (=N/BL) granularity then a column address of 10 bits may be used. If access is required to 128-bit (e.g. N-bit) granularity then a column address of 7 bits may be used, etc. Of course, any number of column address and row address bits or other address bits etc. may be used to access any size bank (or other array(s), subarray(s), echelon(s), section(s), etc.) at any level of access granularity. Of course, any burst length BL may be used. In one configuration a burst length compatible with a standard SDRAM part may be used (e.g. BL=8 for compatibility with DDR3, DDR4, GDDR5, etc.).

In one configuration, N bits may be accessed in one request (e.g. no burst logic, reduced burst functionality, fixed burst functionality, etc.). Thus, for example, the read FIFO and/or data I/F (or logic performing the same, similar, equivalent, etc. functions) may store N bits and N bits may be transferred using the data bus in one data bus time period. If access is required to N-bit granularity then a column address of log 2 N bits may be used, etc. Thus, for example, if access is required to 128-bit granularity for a 8192×128×128 bank, then a column address of 7 bits may be used, etc. Of course, any number of column address and row address bits or other address bits etc. may be used to access any size bank (or other array(s), subarray(s), echelon(s), section(s), etc.) at any level of granularity.

For example, if N=16 (2^4), a 32 Mb (2^25 bits) bank may require 21 (=25−4) address bits; if N=32 (2^5), a 32 Mb bank may require 20 (=25−5) address bits; if N=64 (2^6), a 32 Mb bank may require 19 (=25−6) address bits; etc. For a 64 Mb bank the number of address bits would be one bit larger; for a 128 Mb bank the number of address bits would be 2 bits larger, etc. For example, in one configuration, a multiplexed address bus of 10 bits (e.g. using a multiplexed row address of 10 bits and multiplexed column address of 10 bits, etc.) may be used to address a 32 Mb bank (or other array, subarray, etc.) of a 1 Gb stacked memory chip with 32 banks and access granularity of 32 bits (N=32). For example, in one configuration, a multiplexed address bus of 10 bits (e.g. using a multiplexed row address of 10 bits and multiplexed column address of 7 bits, etc.) may be used to address a 32 Mb bank (or other array, subarray, etc.) of a 1 Gb stacked memory chip with 32 banks and access granularity of 128 bits (N=32).

In one configuration, the architecture of a stacked memory chip may be based on a standard SDRAM part that may use a prefetch architecture. Thus, for example, a stacked memory chip based on a ×4 SDRAM architecture may prefetch 32 bits (e.g. N=32, etc.); a stacked memory chip based on a ×8 SDRAM architecture may prefetch 64 bits (e.g. N=64, etc.); a stacked memory chip based on a ×16 SDRAM architecture may prefetch 128 bits (e.g. N=128, etc.). Of course, any number of bits may be prefetched. Of course, stacked memory chips may be based on any standard architecture (e.g. GDDR, DDR, other memory technologies, etc.) and/or any generation of architecture (e.g. DDR3, DDR4, GDDR5, etc.) and/or non-standard (e.g. non-JEDEC, etc.) memory technologies and/or memory architectures.

In one embodiment, the bank address may already be effectively demultiplexed (or partially demultiplexed) from the address by using one or more chip select signals. For example, a 1 Gb stacked memory chip with BB=32 banks may use 5 bits (2^5=32) for the bank address. One or more of these bank address bits may be used as one or more chip select signals (or signals with the same, equivalent, similar, etc. functions as chip select signals). For example, the chip select signal(s) may be part of one or more copies of a command bus. The chip select signals (or versions of chip select signals, or copies of chip select signals, etc.) may apply to one or more portions of a stacked memory package (e.g. a stacked memory chip, a group of stacked memory chips, a collection of portion(s) of one or more stacked memory chips, etc.), to one or more portions of a stacked memory chip (e.g. a stacked memory chip, a bank, a group of banks, a collection of portion(s) of one or more banks, etc.), For example, one or more chip select signals may apply to one or more echelons (as defined herein). In this case the chip selects signal(s) may apply to more than one stacked memory chip, for example. For example, one or more chip select signals may apply to one or more sections (as defined herein). In this case the chip selects signal(s) may apply to one stacked memory chip, for example. Of course, the chip select signals do not necessarily have to be derived from address signals or from address signals alone. Of course, the chip select signals may be derived (e.g. logically constructed from one or more signals, etc.), or supplied (e.g. as part of a command, part of a request, etc.), or from combinations of these, or otherwise generated by any means. Of course, any number and/or combination(s) of chip select signals and/or combinations with other signals (e.g. address bits, control signals, etc) may be used with any number of stacked memory chips.

In one configuration, one or more chip select signal(s) may be created (e.g. decoded, formed from one or more address bits, formed from logic signals, etc.) by one or more stacked memory chips. In one configuration, one or more chip select signal(s) may be created (e.g. decoded, formed from one or more address bits, formed from logic signals, etc.) by one or more logic chips. In one configuration one or more chip select signal(s) may be created (e.g. decoded, formed from one or more address bits, formed from logic signals, etc.) by logic partitioned (e.g. split, apportioned, etc.) between one or more logic chips and one or more stacked memory chips.

For example, a 1 Gb stacked memory chip with BB=32 banks may have eight groups of four banks (or 16 groups of two banks, etc.) or any arrangement of banks, subbanks, arrays, subarrays, etc. Thus, even though each stacked memory chip has 32 banks that may require 5 (32=2^5) address bits the portion of the address bus and address coupled to each bank or group of banks may have fewer bits. For example, a 1 Gb stacked memory chip with BB=32 banks and 16 groups of two banks may use a bank address of one bit as part of the address and as part of the address bus, etc. In one configuration, the bank address bit may be buffered by the logic chip and used as a chip select signal. In one configuration, the chip select signal may be part of the command bus. In one configuration the stacked memory chip may receive one or more bank address signals, provided as part of the address bus, and convert some or all of the one or more bank address signals to one or more chip select signals. In one configuration, the number chip select signals used by the stacked memory package and/or stacked memory chips and/or other portion(s) of the stacked memory chips may be different than the number of chip select signals and/or bank address signals received by the logic chip and/or stacked memory chips.

For example, a multiplexed address bus of 12 bits may include a multiplexed row address of 11 bits, a bank address of 1 bit, a column address of 11 bits, etc. The 12-bit multiplex address bus may be used to address a group of two 32 Mb banks (or other arrays, subarrays, etc.) of a 1 Gb stacked memory chip with 32 banks. For example, the row address and bank address may be multiplexed together (12 bits) and the column address multiplexed separately (11 bits). Of course, any multiplexing arrangement for each address portion or address portions may be used, and/or any multiplexed bus widths may be used. Of course, any capacity stacked memory chip may be used. Of course, any size bank (or other array, etc.) may be used.

For example, a multiplexed address bus of up to 14 bits may include a multiplexed row address of up to 11 bits, a bank address of up to 3 bits, a column address of up to 11 bits, etc. and may be used to address a group (e.g. collection, echelon, section, etc.) of eight 32 Mb banks of a 4 Gb stacked memory package with two 32 Mb banks (or other arrays, subarrays, etc.) on each 1 Gb stacked memory chip each with 32 banks. For example, the row address and bank address may be multiplexed together (14 bits) and the column address multiplexed separately (11 bits). Of course, any multiplexing arrangement for each address portion or address portions may be used and/or any multiplexed bus widths may be used. For example, a multiplexed address bus of 13 bits may include a multiplexed row address of 9 bits, a bank address of 3 bits, a column address of 13 bits, etc. Of course, any number of bits may be used in the address and/or address bus and/or in the portion(s) of the address bus depending on the number(s), size(s), configuration(s), etc. of the stacked memory chips, memory arrays, banks, rows, columns, etc.

For example, a demultiplexed address bus carrying up to 3 bank address bits, up to 10 column address bits (e.g. including column 0, 1, 2 select), up to 13 row address bits or up to 26 bits (e.g. including a separate row address and column address, etc.) may be used to address a group of banks on a 1 Gb stacked memory chip. For example, a demultiplexed address bus carrying column address CA0-CA11 (e.g. up to 12 bits) and row address RA12-RA29 (e.g. up to 18 bits) or up to 30 bits may be used to address a group of arrays on a 4Gbit NAND flash stacked memory chip, etc. For example, a multiplexed address bus of up to eight bits (e.g. I/O[7:0], etc.) may carry column address bits CA0-CA11 (e.g. up to 12 bits) in time periods 1, 2; and row address bits RA12-RA29 (e.g. up to 18 bits) in time periods 3, 4, 5 (e.g. up to 30 bits may be used on a multiplexed address bus may be used to address a group of arrays on a 4Gbit NAND flash stacked memory chip, etc.).

It should be noted that the address bus widths are shown for each bank. Thus, for example, in one configuration there may be 32 banks in a stacked memory chip, and thus, there may be up to 32 copies (e.g. there may be less than 32 copies as some banks may share an address bus, etc.) of the address bus each of which may be of width up to A bits. For example, there may be 32 banks on each stacked memory chip and the banks may be divided (e.g. architected, apportioned, logically grouped, etc.) into four groups (e.g. sections, etc.) of eight banks, then there may be four copies of the address bus. For example, there may be 16 groups of two banks on each stacked memory chip, and thus, there may be 16 copies of the address bus; etc. Of course, there may be any number, arrangement, grouping, etc. of address bus copies, size(s) of address bus, groups, banks, stacked memory chips, etc. In one set of configurations (e.g. one or more configurations, etc.), the number of banks, groups, stacked memory chips, sections, echelons, columns, rows, other portion(s) of one or more stacked memory chips, etc. may be an even number, an odd number (e.g. 5, 9, 19, etc.), a non-multiple of 2 (e.g. 10, 18, etc.), or any number in order to provide, for example, spare components to allow for repair and/or replacement, to provide extra space for data protection (e.g. error coding, checkpoint or other copies, etc.).

The address bus may be shared (e.g. an address bus may couple to more than one stacked memory chip, etc.) between each stacked memory chip (as shown in FIG. 24-2). Other configurations, topologies, connections, layout, architecture, etc. of the address bus are possible. For example, different portions of an address bus may have different widths and/or bus types (e.g. multiplexed, unidirectional, bidirectional, etc.) and/or use different signaling types (e.g. voltage levels, coding schemes, scrambling, error protection, etc.) and/or signaling schemes (e.g. single-ended, differential, etc.). In one configuration one or more of the address bus copies may be unidirectional. For example, if the stacked memory chips are SDRAM or SDRAM-based, the address bus may consist of signals from the logic chip(s) to the stacked memory chips (e.g. status signals etc. may be sent from the stacked memory chips using another bus, for example, the data bus, in response to register commands etc.). In one configuration the address bus may be bidirectional, multiplexed, shared, etc. For example, if the stacked memory chips are NAND flash or NAND flash-based, the address bus may be multiplexed with the data bus or portion(s) of the data bus. For example, the address bus may include signals from the logic chip(s) to the stacked memory chips as well as signals from the stacked memory chips to the logic chip(s). For example, spare or repaired cells may be kept on the logic chip and address information may be exchanged between logic chip(s) to/from the stacked memory chips.

The number of copies of address bus 24-270 need not be equal to the number of banks on a stacked memory chip. For example, there may be 32 banks in a stacked memory chip and four stacked memory chips in a stacked memory package (e.g. 128 banks). Each stacked memory chip may contain 16 sections. Each section may thus, contain two banks. Each address bus 24-270 may connect to one section (two banks). There may thus, be 16 copies of the address bus 24-270 on each stacked memory chip and 16 copies of address bus 24-270 in each stacked memory package with each address bus 24-270 connected to eight banks, two in each stacked memory chip.

Other configurations of bus (e.g. bus topology, coupling technology, bus type, bus technology, etc.) are possible. For example, the address bus may be shared between (e.g. coupled to, connected to, carry signals for, be multiplexed between, etc.) one or more banks (or other memory array portion(s), etc.), etc. Several configurations of bus sharing are possible. In one configuration, an address bus may connect (e.g. couple, etc.) to all stacked memory chips in a stacked memory package. In one configuration, an address bus may be shared between one or more arrays (e.g. banks, other stacked memory chip portion(s), etc.) in a stacked memory chip, etc. For example, a stacked memory chip may have 32 banks, with 16 copies of the address bus and each address bus may be connected to two banks (e.g. two banks may share an address bus, etc.). In one configuration, an address bus may be shared between one or more arrays (e.g. banks, other memory array portions, etc.) in a stacked memory chip and connect to a subset (e.g. group, collection, echelon, etc.) of the stacked memory chips in a package, etc. For example, a stacked memory package may contain eight stacked memory chips, each stacked memory chip may have 32 banks, with 16 copies of the address bus and each address bus may be connected to a group (e.g. collection, section (as defined herein), etc.) of two banks on each of four stacked memory chips (e.g. eight banks may share an address bus, etc.). Thus, in this configuration there may be 8 (stacked memory chips)×32 (banks per stacked memory chip)=256 banks with each address bus connected to 2 (bank group)×4 (stacked memory chips)=8 banks and thus, 256/8=32 copies of the address bus. In one configuration, an address bus may be shared between one or more arrays (e.g. banks, other portions, etc.) in a stacked memory chip and connect to all stacked memory chips in a package, etc. For example, a stacked memory package may contain four stacked memory chips, each stacked memory chip may have 32 banks, with 16 copies of the address bus and each address bus may be connected to two banks on each of the four stacked memory chips. Thus, in this configuration there may be 4×32=128 banks with each address bus connected to 2×4=8 banks and thus, 128/8=16 copies of the address bus. Of course, any number of address bus copies and/or any address bus sharing arrangement (e.g. architecture, etc.) may be used depending on (but not limited to) the number (and type, etc.) of stacked memory chips in a stacked memory package, the stacked memory package architecture, the stacked memory chip architecture (e.g. bus sharing, number of banks or other arrays, etc.), and other factors, etc.

Different address bus types, widths, functions may be used if there is more than one memory technology used in a stacked memory package. For example, in one configuration, a first address bus (or plurality of a first address bus type, etc.) may be shared between one or more arrays and/or one or more stacked memory chips of a first technology type and a second address bus (or plurality of a second address bus type, etc.) may be shared between one or more arrays and/or one or more stacked memory chips of a second technology type, etc. Note that depending on the signaling schemes used (single-ended, differential, etc.) the widths of buses (e.g. command bus, data bus, address bus, row address bus, column address bus, etc.) measured in bits (e.g. signals, logical signals, etc.) may not be the same as the width of the buses measured in wires (or other physical coupling methods, etc.).

In some configurations, each copy of an address bus or portion(s) of the address bus may be of the same logical width and type but different physical construction. For example, a stacked memory package may contain eight stacked memory chips; each stacked memory chip may have 32 banks (e.g. 8×32=256 banks in total); there may be 32 copies of the address bus or portion(s) of the address bus; and each address bus or portion(s) of the address bus may be connected to two banks on each of four stacked memory chips (e.g. each command bus coupled to 8 banks). Thus, each copy of the 32 address bus copies may couple four stacked memory chips of the eight stacked memory chips. Thus, depending on the physical locations of each set of four such coupled stacked memory chips in the stacked memory package each address bus (or set of command bus copies, etc.) may be physically different. For example, a first set of 16 copies of the address bus may couple the bottom four stacked memory chips in the stacked memory package, and a second set of 16 copies of the address bus may couple the top four stacked memory chips in the stacked memory package, In FIG. 24-2 the data I/F 24-236 (or other equivalent logic function, etc.) may be coupled (e.g. connected using TSVs, etc.) to the logic layer via data bus 24-290 of width D bits (e.g. width 32 bits, 64 bits, 32 signals, 64 differential signals, 32 differential pairs, etc.) used to carry signals in the write datapath. The data bus 24-290 may include (but is not limited to) write datapath signals such as: DQ0-DQ15 (e.g. a range of signals, etc.), LDQS, UDQS, DQS, LDQS#, UDQS#, DQS#, LDM, UDM, DM, TDQS, DQ[15:0], one or more subsets of these signals and/or signal ranges, logical combinations of these signals and/or signal ranges, logical combinations of these signals with other signals and/or signal ranges, etc. The number, types, and functions of signals and/or signal ranges of the signals in data bus 24-290 may depend on factors including (but not limited to): the size and/or organization of the array addressed, memory technology type, etc.

In one configuration the data bus 24-290 may be bidirectional (as shown in FIG. 24-2). As shown in FIG. 24-2 the write datapath 24-230 (e.g. unidirectional bus connected to the data I/F etc.) width may be DW bits in width, which may be different than the width of the bidirectional data bus 24-290. In one configuration the data bus 24-290 may consist of unidirectional data buses (e.g. separate buses for read datapath and write datapath, etc.).

Note that depending on the signaling schemes used (single-ended, differential, etc.) the widths of buses (e.g. command bus, data bus, address bus, row address bus, column address bus, etc.) measured in bits (e.g. signals, logical signals, etc.) may not be the same as the width of the buses measured in wires (or other physical coupling methods, etc.). For example, a 32-bit data bus may use 64 wires (possibly with 64 TSVs and/or other connections, etc.) to carry 32 signals using differential signaling.

In FIG. 24-2 the read FIFO 24-234 (or other equivalent logic function, etc.) may be coupled (e.g. connected using TSVs, etc.) to the logic layer 24-238 via data bus 24-290 of width D bits (e.g. width 32 bits, 64 bits, 32 signals, 64 differential signals, 32 differential pairs, etc.) used for the read datapath. The data bus 24-290 may include (but is not limited to) read datapath signals such as: DQ0-DQ15 (e.g. a range of signals, etc.), LDQS, UDQS, DQS, LDQS#, UDQS#, DQS#, TDQS, DQ[15:0], one or more subsets of these signals and/or signal ranges, logical combinations of these signals and/or signal ranges, logical combinations of these signals with other signals and/or signal ranges, etc. The number, types, and functions of signals and/or signal ranges of the signals in data bus 24-290 may depend on factors including (but not limited to): the size and/or organization of the array addressed, memory technology type, etc.

As shown in FIG. 24-2 the read datapath (e.g. unidirectional bus connected to the read FIFO etc.) width may be DR bits in width, which may be different than the width of the bidirectional data bus. In one configuration, the data bus may be bidirectional (as shown in FIG. 24-2). In one configuration the data bus may consist of unidirectional data buses (e.g. separate buses for read datapath and write datapath, etc.). Note that depending on the signaling schemes used (single-ended, differential, etc.) the widths of buses and/or datapaths (e.g. command bus, data bus, address bus, row address bus, column address bus, etc.) measured in bits (e.g. signals, logical signals, etc.) may not be the same as the width of the buses measured in wires, differential pairs, differential signals (or other physical coupling methods, etc.). Thus, for example, a 32-bit wide data bus may comprise 64 wires (possibly including 64 TSVs, 64 connections, etc.), consisting of 32 wire pairs, with each wire pair carrying one signal.

In one embodiment, modified versions of signals, including data bus signals, may be coupled between the logic chip(s) and stacked memory chips. For example, data bus signals may be delayed (e.g. slightly delayed, staggered, delayed with respect to each other, data bus signal edges distributed in time, etc.) in order to minimize signal interference, improve signal integrity, reduce data errors, reduce bit-error rate (BER), reduce power spikes (e.g. power supply noise, power distribution noise, etc.), effect combinations of these, etc.

Modification of any signal(s) may be performed in time (e.g. staggered, delayed by less than a clock cycle, delayed by a multiple of clock cycles, moved within a clock cycle, delayed by a variable or configurable amount, stretched, shortened, otherwise shaped in time, etc.) or signals may be modified by forming logical combinations of signals with other signals and/or stored (e.g. registered, etc.) versions of other signals, etc. For example, all data bus signals (e.g. signal transitions, positive and/or negative edge, etc) on a first data bus may be delayed by 100 ps with respect to signal transitions on a second data bus. For example, all data bus signals (e.g. signal transitions, positive and/or negative edge, etc) on a data bus may be delayed by 10 ps with respect to other signal transitions on the data bus.

In one configuration, the nature the signal modification(s) and parameters (amount of delay, etc.) of the signal modification(s) may be programmed at start-up (e.g. using BIOS, etc.), may be fixed at manufacture and/or at test time, may be configurable at run time (e.g. during operation, etc.), or using combinations of these, etc.

In one configuration, the nature the signal modification(s) and parameters (amount of delay, etc.) of the signal modification(s) may be part of a feedback loop (e.g. control loop, control system, etc.) to minimize signal interference, improve signal integrity, reduce data errors, reduce bit-error rate (BER), reduce power spikes (e.g. power supply noise, power distribution noise, etc.), effect combinations of these and/or improve one or more aspects of performance or modify other system parameters, etc. For example, the amount of staggered delay introduced to one or more data signals on one or more data bus copies may be modified (e.g. changed, increased, decreased, modulated, etc.) in order to minimize (for example) measured data errors (e.g. data corruption, flipped bits, burst errors, etc.) due to data bus transmission effects (e.g. signal coupling, cross-coupled noise, etc.) or other related errors, etc. Of course, any system parameter (e.g. error rate, BER, number of correctable errors, uncorrectable errors, bus errors, retrys, voltage margins, timing margins, other margins, eye diagrams, signal eye opening, parity error, system noise, voltage supply noise, bus noise, etc.) may be measured and/or monitored and/or tested. For example, the logic chip(s) may monitor, measure, test, etc. one or more system parameters. For example, one or more stacked memory chips may monitor, measure, test, etc. one or more system parameters. For example, the logic chip(s) and one or more stacked memory chips may cooperate (e.g. functions may be partitioned, etc.) to monitor, measure, test, etc. one or more system parameters.

Other configurations of bus (e.g. bus topology, coupling technology, bus type, bus technology, etc.) are possible. For example, the data bus or portion(s) of the data bus may be shared between (e.g. coupled to, connected to, carry signals for, be multiplexed between, etc.) one or more banks, etc. Several configurations of bus sharing are possible. In one configuration, a data bus or portion(s) of the data bus may connect (e.g. couple, etc.) to all stacked memory chips in a stacked memory package. For example, the data bus or portion(s) of the data bus may run vertically (e.g. coupled via TSVs, etc.) through a vertical stack of stacked memory chips. In one configuration, a data bus or portion(s) of the data bus may be shared between one or more arrays (e.g. banks, other stacked memory chip portion(s), etc.) in a stacked memory chip, etc. For example, a stacked memory chip may have 32 banks, with 16 copies of the data bus or portion(s) of the data bus and each data bus or portion(s) of the data bus may be connected to two banks on a stacked memory chip. In one configuration, a data bus or portion(s) of the data bus may be shared between one or more arrays (e.g. banks, other portions, etc.) on a stacked memory chip and connect to a subset (e.g. group, collection, echelon, etc.) of the stacked memory chips in a package, etc. For example, a stacked memory package may contain eight stacked memory chips, each stacked memory chip may have 32 banks, with 16 copies of the data bus or portion(s) of the data bus and each data bus or portion(s) of the data bus may be connected to two banks on each of four stacked memory chips. In one configuration, a data bus may be shared between one or more arrays (e.g. banks, other portions, etc.) on a stacked memory chip and connect to all stacked memory chips in a package, etc. For example, a stacked memory package may contain four stacked memory chips, each stacked memory chip may have 32 banks, with 16 copies of the data bus or portion(s) of the data bus and each data bus or portion(s) of the data bus may be connected to two banks on each of the four stacked memory chips. Of course, any number of data bus copies may be used depending on the number (and type, etc.) of stacked memory chips in a stacked memory package, the architecture (e.g. bus sharing, number of banks or other arrays, etc.), and other factors, etc.

Typically each copy of a data bus or portion(s) of the data bus may be of the same width and type. For example, a stacked memory package may contain four stacked memory chips; each stacked memory chip may have 32 banks (e.g. 4×32=128 banks in total); there may be 16 copies of the data bus or portion(s) of the data bus; and each data bus or portion(s) of the data bus may be connected to two banks on each of the four stacked memory chips (e.g. each command bus coupled to 8 banks). If the stacked memory chips are all SDRAM or SDRAM-based and each stacked memory chip is identical, the 16 copies of the data bus or portion(s) of the command bus may all be of the same width and type.

In some configurations each copy of a data bus or portion(s) of the data bus may be of the same logical width and type but different physical construction and/or different electrical construction. For example, a stacked memory package may contain eight stacked memory chips; each stacked memory chip may have 32 banks (e.g. 8×32=256 banks in total); there may be 32 copies of the data bus or portion(s) of the data bus; and each data bus or portion(s) of the data bus may be connected to two banks on each of four stacked memory chips (e.g. each data bus coupled to 8 banks). Thus, each copy of the 32 data bus copies may couple four stacked memory chips of the eight stacked memory chips. Thus, depending on the physical locations of each set of four such coupled stacked memory chips in the stacked memory package each data bus (or set of data bus copies, etc.) may be electrically different (e.g. with different electrical signal lengths, different parasitic circuit elements, etc.). For example, a first set of 16 copies of the data bus may couple the bottom four stacked memory chips in the stacked memory package, and a second set of 16 copies of the data bus may couple the top four stacked memory chips in the stacked memory package, In some configurations, one or more copies of a data bus or portion(s) of the data bus may have a different logical width and/or different logical type and/or different physical construction and/or different electrical construction. For example, in some configurations, there may be more than one type of data bus or portion(s) of the data bus. For example, in one embodiment, different data bus types, widths, functions may be used if there is more than one memory technology used in a stacked memory package. For example, in one configuration, a first data bus (or plurality of a first data bus type, etc.) may be shared between one or more arrays and/or one or more stacked memory chips of a first technology type and a second command bus (or plurality of a second data bus type, etc.) may be shared between one or more arrays and/or one or more stacked memory chips of a second technology type, etc. Note that depending on the signaling schemes used (single-ended, differential, etc.) the widths of buses (e.g. command bus, data bus, address bus, row address bus, column address bus, etc.) measured in bits (e.g. signals, logical signals, etc.) may not be the same as the width of the buses measured in wires (or other physical coupling methods, etc.). For example, in one embodiment, different data bus types, widths, functions may be used if coding is used (e.g. error detection, error correction, CRC, parity, etc.). For example, one or more data buses may have one or more extra signals (or sets of signals, etc.) to enable error rate monitoring (e.g. bit error rate, BER, etc.) and/or error detection and/or correction, etc.

Various configurations of multiplexing and/or demultiplexing of the data bus copies may be used. Multiplexing and/or demultiplexing may be used, for example, to reduce the number of TSVs used to couple data signals between logic chip(s) and one or more stacked memory chips. For example, the data bus or portion(s) of the data bus may contain a first portion of data or portion(s) of data in a first time period and a second portion of data or portion(s) of data in a second time period, etc.

The number of bits (e.g. width, number of signals, etc) of data used in each portion (e.g. field, part, etc.) of the data bus (e.g. multiplexed data bus, nonmultiplexed data bus, etc.) may depend on (but not limited to) one or more of the following: the size (e.g. capacity, number of memory cells, etc.) of the stacked memory chips; the organization of the stacked memory chips (e.g. number of rows, number of columns, etc.), the size of each bank (or other subarrays, etc.), the organization of each bank (or other subarray(s), etc.). Thus, the number of bits in the data bus and/or in the portion(s) of the data bus may be more or less than the numbers given in the above examples depending on the number(s), size(s), configuration(s), etc. of the stacked memory chips, memory arrays, banks, rows, columns, etc.

For example, a 4 Gb stacked memory package may contain four 1 Gb stacked memory chips, each 1 Gb stacked memory chip may have BB=32 banks, with 16 copies of a 32-bit (or 8-bit, 16-bit, 64-bit, etc.) data bus, thus, D=32. Each of the 32 banks on a 1 Gb stacked memory chip may be 32 Mb in size. Each data bus may be connected to a group (e.g. collection, section (as defined herein), etc.) of two 32 Mb banks on each of four 1 Gb stacked memory chips. Each data bus may be connected to a group (e.g. collection, echelon (as defined herein), etc.) of eight 32 Mb banks in the stacked memory package. Thus, there may be two banks per section on each stacked memory chip. Thus, there may be four sections per echelon in each stacked memory package, with one section on each stacked memory chip. Thus, there are 128 (=32×4) 32 Mb banks and 16×32-bit data bus copies with each data bus coupled to 8 (=128/16) 32 Mb banks. For example, a 1 Gb stacked memory chip with 32×32 Mb banks may have 16 groups (e.g. sections, etc.) of two 32 Mb banks (or eight groups of four 32 Mb banks, etc.) or any arrangement of banks, subbanks, arrays, subarrays, etc. A 256 Mb echelon may comprise eight 32 Mb banks spread (e.g. divided, partitioned, etc.) across four stacked memory chips, with two 32 Mb banks on each 1 Gb stacked memory chip. There are thus, 16 echelons in the 4 Gb stacked memory package.

Data may be coupled to each data bus in different ways in different configurations. For example, in the above example of a 4 Gb stacked memory package, each 32 Mb bank may be capable of burst length of eight (e.g. BL=8) operation. In one configuration a request (e.g. read request, etc.) may be directed at all of the eight 32 Mb banks in a 256 Mb echelon. A request may result in a first complete burst of 32 bits from a first bank. The data bus may be driven with 32 bits from this first complete burst in a first time period. The request may result in a second complete burst of 32 bits from a second bank. The data bus may be driven with 32 bits from this second complete burst in a second time period. The eight banks in an echelon may together provide 8×32 bits or 32 bytes in eight time periods. In one configuration the data bus may be interleaved. For example, a request may result in a first burst of 8 bits from a first bank. The data bus may be driven with a first set of 8 bits from this first burst in a first time period. The request may result in a second burst of 8 bits from a second bank. The data bus may be driven with a second set of 8 bits from this second burst in the first time period. The eight banks in an echelon may together provide 8×4 bits or 32 bits in a first time period. The eight banks in an echelon may together provide 8×32 bits or 32 bytes in eight time periods with each bank providing 8 bits in each time period.

Other logical data bus use configurations (e.g. topologies, architectures, logical timing, multiplexing, etc.) are possible. In one set of configurations (e.g. one or more configurations, etc.) the bank organization may be less than the width of the data bus. For example, each 32 Mb bank may have an organization that may provide 16 bits (e.g. half the width of a 32-bit data bus). In one configuration the banks in a section, echelon, or other portion(s) of the stacked memory package, etc may be interleaved in different manners. For example, in one configuration, a request may result in a first burst of 16 bits from a first bank in a section. The 32-bit data bus may be driven with a first set of 16 bits from this first burst in a first time period. The request may result in a second burst of 16 bits from a second bank in the section. The 32-bit data bus may be driven with a second set of 16 bits from this second burst in the first time period. The two banks in a section may together provide 2×16 bits or 32 bits in a first time period. The two banks in a section may together provide 8×32 bits or 32 bytes in eight time periods with each bank providing 16 bits to the 32-bit data bus in each time period. In another configuration for example, each 32 Mb bank may have an organization that provides 8 bits (e.g. a quarter of the width of a 32-bit data bus). In one configuration the banks in a section may be interleaved in different manners. For example, in one configuration, a request may result in a first burst of 8 bits from a first bank in a section. The 32-bit data bus may be driven with the first set of 8 bits from the first burst in a first time period. The request may result in a second burst of 8 bits from the first bank in a section. The 32-bit data bus may be driven with the second set of 8 bits from the second burst in the first time period. The request may result in a third burst of 8 bits from a second bank in the section. The 32-bit data bus may be driven with the third burst of 8 bits in the first time period. The request may result in a fourth burst of 8 bits from the second bank in the section. The 32-bit data bus may be driven with the fourth burst of 8 bits in the first time period. The two banks in a section may together provide 4×8 bits or 32 bits in a first time period. The two banks in a section may together provide 4×32 bits or 16 bytes in four time periods with each bank providing 16 bits to the 32-bit data bus in each time period. In some cases a larger response may be required (e.g. to fill a 32-byte in a 32-bit CPU or 32-bit system; to fill a 64-byte cache line in a 64-bit CPU or 64-bit system, etc.). In another configuration for example, each bank (or other array, subarray, section, echelon, other portion(s), etc.) may have an organization that provides more bits than the width of the data bus (e.g. two, four, eight, times, etc. of the width of a 32-bit data bus, 64-bit data bus, 256-bit data bus, etc.). In this case the data may be multiplexed onto the data bus in successive (but not necessarily consecutive, e.g. multiplexing may be interleaved with other data sources, etc.) time periods, etc. Of course, any size and organization of arrays etc. and bus widths etc. may be used.

In one set of configurations (e.g. one or more configurations, etc.) requests from the CPU (or other source, etc.) may be modified, combined, expanded, mapped, etc. to one or more commands directed to (e.g. logically coupled to, intended for, transmitted to, etc.) one or more banks (or other array, subarray, portion(s), sections (as defined herein), echelons (as defined herein), combinations of these, etc.) and/or one or more stacked memory chips. For example, two 16-byte requests on one or more command bus copies may be created from one received request (e.g. a request as transmitted by the CPU or other source, as received by the logic chip(s) and/or stacked memory packages, etc.) in order to provide a 32-byte response, etc. Of course, any size requests and/or number of requests and/or type of requests (e.g. read, write, mode of requests, request modes, etc.), may be created (e.g. generated, modified, etc.) from any number, type, size, etc. of request received by one or more stacked memory packages.

In one set of configurations (e.g. one or more configurations, etc.) the bank organization may be equal to the width of the data bus. For example, each 32 Mb bank may have an organization that may provide 32 bits per access (e.g. equal to the width of the data bus). Data from each bank in a section, echelon, or other portion(s) of the stacked memory package, etc may be interleaved in a first manner. For example, in one configuration, a request may result in a first burst of 32 bits from a first bank in a section. The 32-bit data bus may be driven with a first set of 32 bits from this first burst in a first time period. The request may result in a second burst of 32 bits from a second bank in the section. The 32-bit data bus may be driven with a second set of 32 bits from this second burst in a second time period. The two banks in a section may together provide 16×32 bits or 64 bytes in eight time periods with each bank providing 32 bits in each time period.

In one set of configurations (e.g. one or more configurations, etc.) the bank organization may be equal to the width of the data bus, but bank data may be interleaved on the data bus in a second manner, different from the first manner described above. For example, in one configuration, a request may result in a first burst of 32 bits from a first bank in an echelon, section or other portion(s) of the stacked memory package, etc. The 32-bit data bus may be driven with a first set of 32 bits from this first burst in a first time period. The request may result in a second burst of 32 bits from the first bank in an echelon. The 32-bit data bus may be driven with a second set of 32 bits from this second burst in a second time period. The first bank may provide 8×32 bits or 32 bytes in eight time periods with a single bank providing 32 bits in each time period.

For example, in one configuration, a first request may result in a first burst of 32 bits from a first bank in an echelon, section or other portion(s) of the stacked memory package, etc. The 32-bit data bus may be driven with a first set of 32 bits from this first burst in a first time period. A second request may result in a second burst of 32 bits from a second bank in an echelon. The 32-bit data bus may be driven with a second set of 32 bits from the second burst in a second time period.

In one set of configurations (e.g. one or more configurations, etc.) requests may be interleaved, so that data from each request may be interleaved (e.g. in time, etc.) on the data bus. For example, two banks may be interleaved, with each bank providing data equal to the width of the data bus, in order to provide data from a first bank for a first request in first, third, fifth, seventh time periods and to provide data from a second bank for a second request in second, fourth, sixth, eight time periods. For example, two banks may be interleaved, with each bank providing data equal to half the width of the data bus, in order to provide data from a first bank for a first request in first, second, third, fourth, fifth, sixth, seventh, eighth time periods and to provide data from a second bank for a second request in first, second, third, fourth, fifth, sixth, seventh, eighth time periods. Similarly data from four, eight or any number of banks (or other portions of one or more stacked memory chips, etc.) may be interleaved. Similarly data corresponding to any type, size, number, etc. of requests may be interleaved on one or more data bus copies in any fashion. The number of banks (or other portions of one or more stacked memory chips, etc.) interleaved, the number of request interleaved, the data size(s) interleaved, the order of interleaving, etc. may depend, for example, on the relative frequency of the data bus and the frequency with which the banks (or other portions of one or more stacked memory chips, etc.) may provide data.

Of course, any data bus width may be used. In one set of configurations (e.g. one or more configurations, etc.) the data bus may contain data plus additional bits. Additional bits may be used to improve signal integrity, provide data protection, etc. Thus, for example, 2 bits of error correction, error detection, parity, CRC, signal integrity coding, data bus inversion codes, combinations of these, etc. may be used for every 8 data bits. Thus, in the configurations described above, for example, the data bus width may be 40 bits rather than 32 bits etc. Of course, any number of additional bits with any arrangement, timing, configuration, pattern, number of codes, interleaved codes, etc. may be used. Thus, for example, a first code may be used to generate (e.g. provide, devise, construct, etc.) 1 bit for every 8 data bits and a second code used to generate 2 bits for every 16 data bits, etc. Nested codes (e.g. code 1 within code 2, etc.) may be used to protect data (e.g. code 1 and code 2 both protect data) or may be used to protect data plus other code bits (e.g. code 2 may protect a group of bits that include data and code 1 bits, etc.), etc.

In one configuration redundant (e.g. spare, used for repair, etc.) memory elements (e.g. redundant rows, redundant columns, redundant arrays, redundant subarrays, etc.) may be used for error coding. For example, in one configuration, extra parity (or other data coding, etc.) information (e.g. over and above any other data protection schemes, etc.) may be stored in one or more redundant rows of an array to provide an extra level of global error checking. As the redundant row(s) are needed for repair the parity (or other coding, etc.) protection may be incrementally (e.g. one row at a time, etc.) decreased (e.g. reduced, removed, changed, etc.). Changes may occur at manufacture, at test, or during operation.

In FIG. 24-2 other arrangements (e.g. architectures, partitioning, etc.) of logic are possible. In one configuration, the address register, and/or the data I/F and/or read FIFO and/or column address latch and/or bank control logic and/or row address MUX and/or equivalent logic functions and/or other logic functions may be located (e.g. physically located, logically located, etc.) in the stacked memory chips (as shown in FIG. 24-2). In one configuration, the address register, and/or the data I/F and/or read FIFO and/or column address latch and/or bank control logic and/or row address MUX and/or equivalent logic functions and/or other logic functions may be located in one or more logic chips. In one configuration, the address register, and/or the data I/F and/or read FIFO and/or column address latch and/or bank control logic and/or row address MUX and/or equivalent logic functions and/or other logic functions may be partitioned (e.g. apportioned, logically divided, physically divided, split, etc.) between the stacked memory chips and one or more logic chips. For example, the partitioning may be adjusted (e.g. at design time, configured, reconfigured, programmed, etc.) to minimize the number of TSVs between logic chip(s) and stacked memory chips. For example, the partitioning may be adjusted to make the area of the logic chip(s) and stacked memory chips approximately equal.

In FIG. 24-2 the address register may be connected to the row address MUX 24-260 via row address bus 24-284 of width RA bits (e.g. width 14 bits, carrying 14 signals, etc.). The row address bus may include (but is not limited to) signals such as: A0-A13 (e.g. a range of signals, etc.), A[0:13], RA11-RA29, one or more subsets of these signals and/or signal ranges, logical combinations of these signals and/or signal ranges, logical combinations of these signals with other signals and/or signal ranges, etc. The number, types, and functions of signals and/or signal ranges of the row address bus 24-284 may depend on (but are not limited to) such factors as the memory technology (e.g. SDRAM, NAND flash, PCRAM, etc.) and/or the generation of technology (e.g. DDR2, DDR3, DDR4, etc.) and/or whether the technology is (or is based on) a standard part (e.g. JEDEC standard, etc.) or a non-standard or derivative memory technology (or combination(s) of technologies, etc.). For example, a row address bus of 14 bits (or any number of bits depending on the stacked memory chip type, size, organization, etc.) may be used to address a memory chip based on 1Gbit SDRAM. In one configuration a row address bus of 10, 11 or 12 bits (or any number of bits depending on the bank size and organization, etc.), for example, may be used to address a 32 Mb bank (or other array, subarray, etc.) of a 1 Gb stacked memory chip with 32 banks. For example, a row address bus coupling RA11-RA29 or (29−11+1) or up to 19 bits may be used to address a memory chip based on 4Gbit NAND flash, etc.

In one embodiment, the address or portion(s) of the row address may be demultiplexed (e.g. row address separated, etc.) in the stacked memory chip(s) as shown in FIG. 24-2. In one embodiment, the address or portion(s) of the row address may be demultiplexed (e.g. row address separated, etc.) in the logic chip(s).

Note that depending on the signaling schemes used (single-ended, differential, etc.) the widths of buses (e.g. command bus, data bus, address bus, row address bus, column address bus, etc.) measured in bits (e.g. signals, logical signals, etc.) may not be the same as the width of the buses measured in wires (or other physical coupling methods, etc.).

In FIG. 24-2 the logic layer may be connected to the bank control logic 24-262 via bank address bus 24-286 of width BA bits (e.g. width 3 bits, carry 3 signals, etc.). The bank address bus may include (but is not limited to) signals such as: BA0-BA2 (e.g. a range of signals, etc.), BA[0:2], one or more subsets of these signals and/or signal ranges, logical combinations of these signals and/or signal ranges, logical combinations of these signals with other signals and/or signal ranges, etc. The number, types, and functions of signals and/or signal ranges of the bank address bus 24-286 may depend on (but are not limited to) such factors as the memory technology (e.g. SDRAM, NAND flash, PCRAM, etc.) and/or the generation of technology (e.g. DDR2, DDR3, DDR4, etc.) and/or whether the technology is (or is based on) a standard part (e.g. JEDEC standard, etc.) or a non-standard or derivative memory technology (or combination(s) of technologies, etc.).

In one embodiment, the address or portion(s) of the bank address may be demultiplexed (e.g. bank address separated, etc.) in the stacked memory chip(s) as shown in FIG. 24-2. In one embodiment, the address or portion(s) of the bank address may be demultiplexed (e.g. bank address separated, etc.) in the logic chip(s).

For example, a bank address of 3 bits may be used to address a stacked memory chip based on a 1Gbit SDRAM with 8 banks. For example, a bank address of 5 bits may be used to address a stacked memory chip based on an SDRAM with 32 banks. In one configuration, for example, when using stacked memory chips that do not contain banks or the equivalent of banks, the bank address bus and bank address logic, functions etc. may not be used (e.g. may not be present, etc.). In one configuration, for example, when using stacked memory chips that do not contain banks, but may contain other subarrays or one or more types of subarrays (e.g. arrays, groups, collections, sets, blocks, echelons, sections, etc.) of memory cells etc. the subarrays may be addressed using the bank address bus, a subset of the row address bus and/or column address bus, combinations of these, combinations of one or more of these buses (or subsets, portion(s) of these buses, etc.) with one or more other signals, or similar schemes, etc.

Note that depending on the signaling schemes used (single-ended, differential, etc.) the widths of buses (e.g. command bus, data bus, address bus, row address bus, column address bus, bank address bus, array address bus, etc.) measured in bits (e.g. signals, logical signals, etc.) may not be the same as the width of the buses measured in wires (or other physical coupling methods, etc.).

In FIG. 24-2 the logic layer may be connected to the column address latch 24-238 via column address bus 24-288 of width CA bits (width 8 bits, etc.). The column address bus may include (but is not limited to) signals such as: A0-A13 (e.g. a range of signals, etc.), A[13:0], I/O[15:0], one or more subsets of these signals and/or signal ranges, logical combinations of these signals and/or signal ranges, logical combinations of these signals with other signals and/or signal ranges, etc. The number, types, and functions of signals and/or signal ranges of the column address signals may depend on factors including (but not limited to): the number of columns addressed, the size of the array addressed, memory technology type, etc.

In one embodiment, the address or portion(s) of the column address may be demultiplexed (e.g. column address separated, etc.) in the stacked memory chip(s) as shown in FIG. 24-2. In one embodiment, the address or portion(s) of the address may be demultiplexed (e.g. row address and column address separated, etc.) in the logic chip(s).

Note that depending on the signaling schemes used (single-ended, differential, etc.) the widths of buses (e.g. command bus, data bus, address bus, row address bus, column address bus, etc.) measured in bits (e.g. signals, logical signals, etc.) may not be the same as the width of the buses measured in wires (or other physical coupling methods, etc.).

In FIG. 24-2 the row decoder may be coupled to the row address MUX 24-260 via row address bus 24-284 of width RA1 bits (e.g. 17 bits, etc.).

It should be noted that the bus widths are shown for each bank. Thus, for example, if there are 32 banks in a stacked memory chip, there may be 32 copies of the row address bus 24-284 each of which may be of width up to RA1 bits (e.g. depending on handling of bank address bits as part of the row address, etc.).

The number of copies of row address bus 24-284 need not be equal to the number of banks on a stacked memory chip. For example, there may be 32 banks in a stacked memory chip and four stacked memory chips in a stacked memory package (e.g. 128 banks). Each stacked memory chip may contain 16 sections. Each section may thus, contain two banks. Each row address bus 24-284 may connect to one section (two banks). There may thus, be 16 copies of the row address bus 24-284 on each stacked memory chip and 16 copies of row address bus 24-284 in each stacked memory package with each row address bus 24-284 connected to eight banks, two in each stacked memory chip. For example, the same row address may be applied to each of the two banks, but the first bank may provide a first set of data bits and the second bank may provide a second set of data bits. The shared row address then may provide data access at a granularity equal to the sum of the first sets of bits and the second set of bits. For example, row address bus 24-284 may connect to two 32 Mb banks in a section on a stacked memory chip, each bank may provide 16 bits to form a 32-bit data bus. Thus, the row address bus 24-284 may provide 32-bit access granularity (e.g. at the section level, etc.), etc.

Other configurations of the row address bus are possible. For example, in one or more configurations the row address bus may be split in the logic chip or the stacked memory chips and may comprise a first bus connected to the bank control logic and a second bus connected to the row address MUX. For example, the row address MUX may perform the logical functions equivalent to the bank control logic. For example, in one configuration, a stacked memory chip may contain two banks per section (as defined herein). In this case, one of the row address bits in the row address bus 24-284 may be used as a bank address, etc.

Other configurations of bus topology (e.g. coupling, type, etc.) are possible. For example, the row address bus may be shared between one or more banks, etc. Several configurations of bus sharing are possible. For example, in one configuration, a row address bus may connect to all stacked memory chips in a package. For example, in one configuration, a row address bus may be shared between one or more banks in a stacked memory chip and connect to all stacked memory chips in a package, etc.

In FIG. 24-2 the column decoder 24-250 may be connected to the column address latch 24-238 via column address bus 24-222 of width CA1 bits (e.g. 7 bits etc.). The column address bus 24-222 may include (but is not limited to) signals such as: A0-A13 (e.g. a range of signals, etc.), A[13:0], I/O[15:0], one or more subsets of these signals and/or signal ranges, logical combinations of these signals and/or signal ranges, logical combinations of these signals with other signals and/or signal ranges, etc. The number, types, and functions of signals and/or signal ranges of the signals in column address bus 24-222 may depend on factors including (but not limited to): the number of columns addressed, the size and/or organization of the array addressed, memory technology type, etc. For example, in one or more configurations banks (or other arrays, subarrays, portion(s), etc.) may be grouped (e.g. joined, coalesced, partitioned, otherwise connected, etc.) so that one or more of the buses connecting the logic chip with the stacked memory chips may be shared (e.g. multiplexed, arbitrated, pipelined, etc.). For example, the column address bus 24-222 (and/or other address buses, command buses, data buses, other buses, other signals, etc.) may be shared between one or more banks (e.g. between 2 banks, etc.) on one or more stacked memory chips.

It should be noted that the bus widths are shown for each bank. Thus, for example, if there are 32 banks in a stacked memory chip, there may be up to 32 copies of the column address bus 24-222.

Other configurations of the column address bus 24-222 are possible. For example, the function(s) of the column address latch may be performed by the logic chip or the logic chip in combination with the stacked memory chips, etc. For example, different portions of the column address bus 24-222 may have different widths and/or bus types (e.g. multiplexed, unidirectional, bidirectional, etc.) and/or use different signaling types (e.g. voltage levels, coding schemes, scrambling, error protection, etc.) and/or signaling schemes (e.g. single-ended, differential, etc.). Other configurations of bus topology (e.g. coupling, type, etc.) are possible. For example, the column address bus 24-222 may be shared between one or more banks, etc. Several configurations of bus sharing are possible. In one configuration, a column address bus may connect to all stacked memory chips in a package. In one configuration, a column address bus may be shared between one or more banks in a stacked memory chip and connect to all stacked memory chips in a package, etc.

In FIG. 24-2 column address bus 24-220 of width CA2 bits (e.g. width 3 bits, etc.) may connect the column address latch and the read FIFO. In one configuration, the column address bus 24-220 may connect the column address latch and data I/F (this bus connection is not shown in FIG. 24-2).

Other configurations for column address bus 24-220 are possible. For example, the function(s) of the column address latch may be performed by the logic chip or the logic chip in combination with the stacked memory chips, etc. The column address bus 24-220 may include (but is not limited to) signals such as: A0-A13 (e.g. a range of signals, etc.), A[13:0], I/O[15:0], one or more subsets of these signals and/or signal ranges, logical combinations of these signals and/or signal ranges, logical combinations of these signals with other signals and/or signal ranges, etc. The number, types, and functions of signals and/or signal ranges of the column address signals may depend on factors including (but not limited to): the number of columns addressed, the size of the array addressed, memory technology type, etc. It should be noted that the bus widths are shown for each bank. Thus, for example, if there are 32 banks in a stacked memory chip, there may be up to 32 copies of the column address bus 24-220. Other configurations of bus topology (e.g. coupling, type, etc.) are possible. For example, the column address bus 24-220 may be shared between one or more banks (or arrays, subarrays, other portion(s), etc.), on one or more stacked memory chips, etc. Several configurations of bus sharing are possible. In one configuration, a column address bus may connect to all stacked memory chips in a package. In one configuration, a column address bus may be shared between one or more banks in a stacked memory chip and connect to all stacked memory chips in a package, etc. In one embodiment, the address or portion(s) of the column address that may form column address bus 24-220 may be demultiplexed (e.g. portion(s) of the column address separated, etc.) in the stacked memory chip(s) as shown in FIG. 24-2. In one embodiment, the address or portion(s) of the column address that may form column address bus 24-220 may be demultiplexed (e.g. row address and column address separated, etc.) in the logic chip(s). In one configuration, different portions of the column address bus 24-220 may have different widths and/or bus types (e.g. multiplexed, unidirectional, bidirectional, etc.) and/or use different signaling types (e.g. voltage levels, coding schemes, scrambling, error protection, etc.) and/or signaling schemes (e.g. single-ended, differential, etc.).

In FIG. 24-2 the IO gating/DM mask logic 24-232 (or logic with equivalent, same, similar etc. functions) may be connected to the read FIFO and data I/F logic (or logic with equivalent, same, similar etc. functions) via data bus 24-208 of width D1 bits (e.g. 32 bits, 64 bits, 32 wires, 32 signals, etc).

Other configurations for data bus 24-208 are possible and may depend on the configuration of data bus 24-290 for example. For example, in one configuration, the data bus 24-208 and/or the data bus 24-290 may be multiplexed, unidirectional (e.g. split, separate for read/write paths, etc.), bidirectional (e.g. joined, shared for read/write paths, etc.), combinations of these, and/or otherwise organized, etc. For example, the data bus 24-290 may be split (e.g. in the stacked memory chips and/or the logic chip(s), etc.) to a write bus 24-230 (width DW bits unidirectional) connected to the data I/F (data interface) and a read bus (width DR bits unidirectional) connected to the read FIFO. For example, the data bus 24-208 may be split (e.g. in the stacked memory chips and/or the logic chip(s), etc.) to a write bus (width DW1 bits unidirectional) connected to the data I/F (data interface) and a read bus (width DR1 bits unidirectional) connected to the read FIFO. For example, in one configuration, the width, type, topology, etc. of data bus 24-290 may be the same or different from the width, type, topology, etc. of data bus 24-208. For example, in one configuration, data bus 24-290 may operate at a higher frequency than data bus 24-208. For example, in one configuration, data bus 24-290 may be multiplexed (e.g. time multiplexed, etc.), but data bus 24-208 may not be multiplexed, etc. For example, in one configuration, data bus 24-290 may use differential signaling (e.g. high speed, etc.), but data bus 24-208 may use single-ended signals, etc.

In one configuration the functions of the read FIFO and data I/F may be reduced so that data bus 24-208 and data bus 24-290 are the same or nearly the same. For example, D may be the same as D1 (e.g. data bus 24-208 and data bus 24-290 have the same width, etc.). In one configuration the read FIFO may perform multiplexing of data from data bus 24-208 onto data bus 24-290, etc. In one configuration the data I/F may perform demultiplexing of data from data bus 24-290 onto data bus 24-208, etc.

It should be noted that the bus widths are shown for each bank. Thus, for example, if there are 32 banks in a stacked memory chip, there may be up to 32 copies of the data bus 24-290 and/or up to 32 copies of the data bus 24-208. The number of copies of data bus 24-290 and number of copies of data bus 24-208 may not be the same. For example, there may be 32 banks in a stacked memory chip and four stacked memory chips in a stacked memory package; there may thus, be 32 copies of the data bus 24-208 on each stacked memory chip (4×32=128 copies of data bus 24-208 in each stacked memory package) and 32 copies of data bus 24-290 in each stacked memory package with each data bus 24-290 connected to four banks, one in each stacked memory chip.

Other configurations of data bus (e.g. data bus 24-290, data bus 24-208, etc.) and datapath(s) for read and for write are possible. For example, different portions of the data bus may have different widths and/or bus types (e.g. multiplexed, unidirectional, bidirectional, etc.) and/or use different signaling types (e.g. voltage levels, coding schemes, scrambling, error protection, etc.) and/or signaling schemes (e.g. single-ended, differential, etc.). For example, data bus 24-290 may be different from data bus 24-208, etc. Other configurations of bus topology (e.g. coupling method, bus type, shared bus, private bus, multiplexed bus, nonmultiplexed bus, demultiplexed bus, etc.) are possible. For example, a data bus may be shared between one or more banks (or array(s), subarray(s), other portion(s), etc.) on the same stacked memory chip and/or on one or more stacked memory chips, etc. Several configurations of bus sharing are possible. For example, in one configuration, a data bus may connect to all stacked memory chips in a package. For example, in one configuration, a data bus may be shared between one or more banks (or array(s), subarray(s), other portion(s), etc.) in a stacked memory chip and connect to all stacked memory chips in a stacked memory package, etc.

For example, there may be 32 banks in a stacked memory chip and four stacked memory chips in a stacked memory package. Each stacked memory chip may contain 16 sections. Each section may thus, contain two banks. Each data bus 24-290 may connect to one section (two banks). There may thus, be 32 copies of the data bus 24-208 on each stacked memory chip (4×32=128 copies of data bus 24-208 in each stacked memory package) and 16 copies of data bus 24-290 in each stacked memory package with each data bus 24-290 connected to eight banks, two in each stacked memory chip.

In FIG. 24-2 the logic layer may be connected to the PHY layer 24-242. In FIG. 24-2 the PHY layer 24-242 may transmit and receive data, control signals etc. on one or more high-speed links 24-244 to CPU(s) and possibly other stacked memory packages. In FIG. 24-2 other logic blocks (that may be located, or partially located, in each stacked memory chip as shown in FIG. 24-2 or may be located, or partially located, in the logic chip, etc.) may include (but are not limited to) registers 24-266, test and repair logic 24-280, etc. For example, the registers 24-266 may operate to (e.g. may be controlled to, may function to, etc.) save (e.g. retrieve, store, etc.) settings for each stacked memory chip (e.g. DLL settings, power saving mode(s), termination settings, timing parameters, etc.). Some or all of the registers 24-266 may be located in the logic chip(s). For example, the test and repair logic 24-280 may operate to test one or more memory arrays (on one or more logic chip(s) and/or stacked memory chips, etc.), save (e.g. store in NVRAM, etc.) and report test results, and/or perform repair operations (e.g. blowing or connecting one or more fuses or connections, etc.) and/or configure one or more memory arrays (e.g. insert redundant circuit element(s), insert memory arrays(s) or portion(s) of memory array(s), insert redundant row(s), insert redundant columns(s), insert redundant TSVs, insert redundant buses and/or other connections, remove faulty components, etc.) and/or test, repair, configure, or reconfigure other circuits, circuit elements, circuit blocks, memory array(s), connections, buses, links, components, etc. For example, some of the test logic may be located on the logic chip(s). For example, one or more automatic test pattern generators may be used to perform automatic test pattern generation (ATPG) and generate sequential test patterns and/or random test patterns (e.g. using one or more pattern generation algorithms, using programmed patterns, using patterns loaded from the CPU or other system component, etc.) that may be applied to one or more of the stacked memory chips (or portion(s) of the stacked memory chips, etc.).

The logic, blocks, functions, architecture, connections, buses, signals, etc. of the stacked memory chips and/or logic etc. contained on the logic chip(s) and naming of the functions, blocks, etc. is shown in FIG. 24-2 as is generally used in the high-level architecture of standard memory parts but of course, other alternative architectures, functions, circuits, arrangements, etc. may be used without altering the basic functions and operation of the components as shown and described herein. For example, in one configuration, data masking may not be used. For example, in one configuration, the I/O gating and/or DM mask functions and/or circuit blocks may not be used. For example, in one configuration, the row address MUX and/or bank control logic and/or column address latch and/or read FIFO, and/or data I/F may comprise more than one block, etc. For example, in one configuration, the IO gating function(s) may be combined with the read FIFO block(s) and/or data I/F block(s). For example, in one configuration, the address register function(s) may be merged with one or more of the read FIFO block(s) and/or data I/F block(s) and/or row address MUX block(s), bank control logic block(s), column address latch block(s), etc. For example, in one configuration, registers, register programming (read and write), and/or other register functions may be split between logic chip(s) and stacked memory chip(s), etc. For example, in one configuration, the memory control logic and/or other control functions may be split between logic chip(s) and stacked memory chip(s), etc.

In one embodiment, of a stacked memory package comprising a logic chip and a plurality of stacked memory chips a first-generation stacked memory chip may be based on the architecture of a standard (e.g. using a non-stacked memory package without logic chip, etc.) JEDEC DDR SDRAM memory chip. Such a design may allow the learning and process flow (manufacture, testing, assembly, etc.) of previous standard memory chips to be applied to the design of a stacked memory package with a logic chip such as shown in FIG. 24-2. In some cases, stacked memory packages may take advantage, for example, of increased TSV density, etc. Other figures and accompanying text may describe such embodiments (e.g. designs, architectures, etc.) of stacked memory packages based on features from FIG. 24-2 for example. As TSV density increases, the number of TSV connections between the memory chips and logic chip(s) may increase.

For example, in a JEDEC standard DDR (e.g. DDR, DDR2, DDR3, etc.) SDRAM part (e.g. JEDEC standard memory device, etc.) the number of connections external to each discrete (e.g. non-stacked memory chips, no logic chip, etc.) memory package is limited. For example, a 1Gbit DDR3 SDRAM part in a JEDEC standard FBGA package may have from 78 (8 mm×11.5 mm package) to 96 (9 mm×15.5 mm package) ball connections. In a 78-ball FBGA package for a 1Gbit×8 DDR3 SDRAM part there are: 8 data connections (DQ); 32 power supply and reference connections (VDD, VSS, VDDQ, VSSQ, VREFDQ); 7 unused connections (NC due to wiring restrictions, spares for other organizations); 31 address and control connections. Thus, in an embodiment involving a standard JEDEC DDR3 SDRAM part (referred to below as an SDRAM part, as opposed to the stacked memory package shown for example, in FIG. 24-2) only 8 connections from 78 possible package connections (less than 10%) are available to carry data. Ignoring ECC data correction a typical DIMM used in a computer system may use eight such SDRAM parts to provide 8×8 bits or 64 bits of data. Because of such pin (e.g. signal, connection, etc.) limitations (e.g. limited package connections, etc.) the storage and retrieval of data in a standard DIMM using standard SDRAM parts may be quite wasteful of energy. Not only is the storage and retrieval of data to/from each SDRAM part wasteful (as will be described in more detail below) but the assembly of several SDRAM parts (e.g. discrete memory packages, etc.) on a DIMM (or module, PCB, etc.) increases the size of the memory system components (e.g. DIMMs etc.) and reduces the maximum possible operating frequency, reducing (or limiting, etc.) the performance of a memory system using SDRAM parts in discrete memory packages. One objective of the stacked memory package of FIG. 24-2 and derivative designs (e.g. subsequent generation architectures described herein, etc.) may be to reduce the energy wasted in storing/retrieving data and/or increase the speed (e.g. rate, operating frequency, etc.) of data storage/retrieval.

Energy may be wasted in an embodiment involving a standard SDRAM part because large numbers of data bits are moved (e.g. retrieved, stored, coupled, etc.) from the memory array (e.g. where data is stored) in order to connect to (e.g. provide in a read, receive in a write, etc.) a small number of data bits (e.g. 8 in a standard DIMM, etc.) at the IO (e.g. input/output, external package connections, etc). The explanation that follows uses a standard 1Gbit (e.g. 1073741824 bits) SDRAM part as a reference example. The 1Gbit standard SDRAM part is organized as 128 Mb×8 (e.g. 134217728×8). There are 8 banks in a 1Gbit SDRAM part and thus, each bank stores (e.g. holds, etc.) 134217728 bits. The Ser. No. 13/421,7728 bits stored in each bank are stored as an array of 16384×8192 bits. Each bank is divided into rows and columns. There are 16384 rows and 8192 columns in each bank. Each row thus, stores 8192 bits (8 k bits, 1 kB). A row of data is also called a page (as in memory page), with a memory page corresponding to a unit of memory used by a CPU. A page in a standard SDRAM part may not be equal to a page stored in a standard DIMM (consisting of multiple SDRAM parts) and as used by a CPU. For example, a standard SDRAM part may have a page size of 1 kB (or 2 kB for some capacities and/or data organizations), but a CPU (using these standard SDRAM parts in a memory system in one or more standard DIMMs) may use a page size of 4 kB (or even multiple page sizes). Herein the term page size may typically refer to the page size of a stacked memory chip (which may typically be the row size).

When data is read from an SDRAM part first an ACT (activate) command selects a bank and row address (the selected row). All 8192 data bits (a page of 1 kB) stored in the memory cells in the selected row are transferred from the bank into sense amplifiers. A read command containing a column address selects a 64-bit subset (called column data) of the 8192 bits of data stored in the sense amplifiers. There are 128 subsets of 64-bit column data in a row requiring log(2) 128=7 column address lines. The 64-bit column data is driven through IO gating and DM mask logic to the read latch (or read FIFO) and data MUX. The data MUX selects the required 8 bits of output data from the 64-bit column data requiring a further 3 column address lines. From the data MUX the 8-bit output data are connected to the I/O circuits and output drivers. The process for a write command is similar with 8 bits of input data moving in the opposite direction from the I/O circuits, through the data interface circuit, to the IO gating and DM masking circuit, to the sense amplifiers in order to be stored in a row of 8192 bits.

Thus, a read command requesting 64 data bits from an RDIMM using standard SDRAM parts results in 8192 bits being loaded from each of 9 SDRAM parts (in a rank with 1 SDRAM part used for ECC). Therefore in an RDIMM using standard SDRAM parts a read command results in 64/(8192×9) or about 0.087% of the data bits read from the memory arrays in the SDRAM parts being used as data bits returned to the CPU. We can say that the data efficiency of a standard RDIMM using standard SDRAM parts is 0.087%.

We will define this data efficiency measure as DE1 (both to distinguish DE1 from other measures of data efficiency we may use and to distinguish DE1 from measure of efficiency used elsewhere that may be different in definition).

Data Efficiency DE1=(number of 10 bits)/(number of bits moved to/from memory array).

This low data efficiency DE1 has been a property of standard SDRAM parts and standard DIMMs for several generations, at least through the DDR, DDR2, and DDR3 generations of SDRAM. In a stacked memory package (such as shown in FIG. 24-2), depending primarily on how the buses between memory arrays and the I/O circuits are architected, the data efficiency DE1 may be considerably higher than standard SDRAM parts and standard DIMMs, even approaching 100% in some cases, e.g. over two order of magnitude higher than standard SDRAM parts or standard DIMMs. In the architecture of the stacked memory package illustrated in FIG. 24-2 the data efficiency will be shown to be higher than a standard DIMM, but other stacked memory package architectures (shown elsewhere herein and in other specifications incorporated by reference herein) may be shown to have even higher DE1 data efficiencies than that of the architecture shown in FIG. 24-2. In FIG. 24-2 much of the architecture of the stacked memory chips is left as similar to a standard SDRAM part as possible to illustrate the changes in architecture that may improve the DE1 data efficiency for example.

In FIG. 24-2 the stacked memory package may comprise a single logic chip and four stacked memory chips. Of course, any number of stacked memory chips may be used depending on the limits of stacking technology, cost, size, yield, system requirement(s), manufacturability, etc. In the stacked memory package of FIG. 24-2, in order to both simplify the explanation and compare, contrast, and highlight the differences in architecture and design from an embodiment involving a standard SDRAM part, the sizes and numbers of most of the components (e.g. parts; portions; circuits; array sizes; circuit block sizes; data, control, address and other bus widths; etc.) in each stacked memory chip as far as possible have been kept the same as those corresponding (e.g. equivalent, with same or similar function, etc.) components in the example 1Gbit standard SDRAM part described above. Also in FIG. 24-2, as far as possible the circuit functions, terms, nomenclature, and names etc. used in a standard SDRAM part have also been kept as the same or similar in the stacked memory package, stacked memory chip, and logic chip architectures.

Of course, any size, type, design, number etc. of circuits, circuit blocks, memory cells arrays, buses, etc. may be used in any stacked memory chip in a stacked memory package such as shown in FIG. 24-2. For example, in one embodiment, eight stacked memory chips may be used to emulate (e.g. replicate, approximate, simulate, replace, be equivalent to, etc.) a standard 64-bit wide DIMM (or nine stacked memory chips may be used to emulate an RDIMM with ECC, etc.). For example, additional (e.g. one or more, or portions of one or more, etc.) stacked memory chip capacity may be used to provide one or more (or portions of one or more) spare stacked memory chips. The resulting architecture may be a stacked memory package with a logical capacity of a first number of stacked memory chips, but using a second number (possibly equal or greater than the first number) of physical stacked memory chips.

In FIG. 24-2 a stacked memory chip may contain a memory array (e.g. DRAM array and/or other type of memory etc.) that is similar to the core (e.g. central portion, memory cell array portion, core circuits, memory array circuits, mats, etc.) of, for example, a 1Gbit SDRAM memory device. In FIG. 24-2 the support circuits, control circuits, and I/O circuits (e.g. those circuits and circuit portions that are not memory cells or directly connected to memory cells, etc.) may be located, or partially located, on the logic chip. In FIG. 24-2 the logic chip and stacked memory chips may be connected (e.g. logically connected, coupled, etc.) using through silicon vias (TSVs) or other coupling means.

The partitioning (e.g. separation, division, apportionment, assignment, etc) of logic, logic functions, etc. between the logic chip and stacked memory chips may be made in different ways depending, for example, on factors that may include (but are not limited to) the following: cost, yield, power, size (e.g. memory capacity), space, silicon area, function required, number of TSVs that can be reliably manufactured, TSV size and spacing, packaging restrictions, etc. The numbers and types of connections, including TSV or other connections, may vary with system requirements (e.g. cost, time (as manufacturing and process technology changes and improves, etc.), space, power, reliability, etc.).

In FIG. 24-2 a partitioning (e.g. system architecture, layout, design, etc.) is shown with the read FIFO and/or data interface integrated with (e.g. included with, part of, etc.) the stacked memory chip. In other configurations the read FIFO and/or data interface and/or other components, functions, or portions of components, logical functions etc. may be part of one or more logic chip(s) or partitioned between logic chip(s) and stacked memory chips, etc. In other configurations the read FIFO and/or data interface and/or other components, functions, or portions of components, functions etc. may be combined (e.g. merged, partially combined, partially merged, etc.) and located on one or more logic chip(s), one or more stacked memory chips or partitioned (e.g. divided, etc.) between one or more logic chip(s) and one or more stacked memory chips, etc.

In FIG. 24-2 the width of the data bus between memory array and sense amplifiers on each stacked memory chip may be the same as a 1Gbit standard SDRAM part, or 8192 bits (e.g. the stacked memory chip page size may be 1 kB) for a standard ×8 part. In FIG. 24-2 the width of the data bus between the sense amplifiers and the read FIFO (in the read data path) may be the same as a 1 Gb standard SDRAM part, or 64 bits for a standard ×8 part. In FIG. 24-2 the width of the data bus, for example, between the read FIFO and the I/O circuits (e.g. logic layer and PHY layer), may be 64 bits. Thus, the stacked memory package of FIG. 24-2 may deliver 64 bits of data from a single DRAM array using a row size of 8192 bits. This may correspond to a DE1 data efficiency of 64/8192 or 0.78% (compared to 0.087% DE1 of a standard DIMM, an improvement of almost an order of magnitude). Of course, any data bus widths may be used on the stacked memory chips.

In one embodiment, the access (e.g. data access pattern, request format, etc.) granularity (e.g. the size and number of banks, or other portions of each stacked memory chip, etc.) may be varied. For example, by using a shared data bus and shared address bus the signal TSV count (e.g. number of TSVs assigned to data, etc) may be reduced. In this manner the access granularity may be increased. For example, in an architecture based on that shown in FIG. 24-2, there may be eight stacked memory chips in a stacked memory package, and a memory echelon may comprise one bank (from eight on each stacked memory chip) in each of the eight stacked memory chips. Thus, an echelon may be 8 banks (a DRAM section is thus, a bank in this case). There may thus, be eight memory echelons. By reducing the TSV signal count (e.g. by using shared buses, moving logic from logic chip to stacked memory chips, etc.) we may use extra TSVs to vary the access granularity. For example, we may use a subbank to form the echelon, thus, reducing the echelon size and increasing the number of echelons in the system. If there are two subbanks in a bank, we may double the number of memory echelons, etc.

Other configurations of stacked memory package, of stacked memory chips and of hierarchy are possible. For example, in one configuration a stacked memory package may contain four stacked memory chips. Each stacked memory chip may have a capacity of 1Gbit. Each stacked memory chip may comprise 16 banks. Each of the 16 banks may comprise two subbanks. Thus, each stacked memory chip may comprise 32 subbanks. An echelon may be formed from four subbanks. Each subbank may provide 16 bits (e.g. the DRAM array may use a ×16 organization, etc.). Thus, a burst length 8 access may provide 4 (subbanks)×16 (bits per subbank)×8 (burst length)=64 bytes. Of course, any number of subbanks per echelon may be used. For example, an echelon may include subbanks for error protection. For example, an echelon may contain a first number of banks and/or subbanks but a second number of banks and/or subbanks may respond to a request (e.g. read request, write request, etc.). Thus, not all banks and/or subbanks in an echelon (or other grouping, portions, portions, etc.) may respond to a request. Of course, any number of subbanks may be used to satisfy a request (e.g. read request, write request, etc.). Of course, any number of subbanks per bank may be used (for example, each bank may contain two subbanks that may operate independently, in parallel, or nearly in parallel, in a pipelined fashion, etc.). Of course, banks do not have to be divided into subbanks, banks may merely be operated (e.g. be addressed, function, behave, etc.) as if they were divided. For example, each stacked memory chip may contain 16 banks (or any number, 8, 32, etc.) and banks may be addressed as eight groups of two banks, as four groups of four banks, etc. The division of banks in this manner may be flexible (e.g. fixed at manufacture or programmable at run time, start up, boot time, etc.). The division (e.g. grouping, partitioning, etc.) of banks and/or subbanks as well as the association (e.g. assignment, membership, allocation, etc.) of banks and/or subbanks to one or more echelons and/or one or more sections may be different in various configurations and/or may be programmable. Of course, any number of banks, subbanks, echelons, sections, etc. may be used. Of course, any number of stacked memory chips may be used. For example, an odd number of stacked memory chips may be used to include data protection, etc. Of course, any width (e.g. organization, access granularity, etc.) of DRAM array (e.g. bank, array, subarray, echelon, section, etc.) may be used (e.g. ×4, ×8, ×16, ×32, ×64, ×128, etc.). Of course, any burst length may be used (e.g. burst length four, burst length eight, burst chop mode or modes, etc.).

Manufacturing limits (e.g. yield, practical constraints, etc.) for TSV etch and via fill may determine the TSV size. A TSV process may, in one embodiment, require the silicon substrate (e.g. memory die, etc.) to be thinned to a thickness of 100 micron or less. With a practical TSV aspect ratio (e.g. defined as TSV height:TSV width, with TSV height being the depth of the TSV (e.g. through the silicon) and width being the dimension of both sides of the assumed square TSV as seen from above) of 10:1 or lower, the TSV size may be about 5 microns if the substrate is thinned to about 50 micron. As manufacturing skill, process knowledge etc. improves the size and spacing of TSVs may be reduced and number of TSVs possible in a stacked memory package may be increased. An increased number of TSVs may allow more flexibility in the architecture of both logic chips and stacked memory chips in stacked memory packages. Several different representative architectures for stacked memory packages (some based on that shown in FIG. 24-2) are shown herein and in specifications incorporated by reference herein. Some of these architectures, for example, may exploit increases in the number of TSVs to further increase DE1 data efficiency above that of the architecture shown in FIG. 24-2.

As an option, the stacked memory package of FIG. 24-2 may be implemented in the context of the architecture and environment of the previous Figures and/or any subsequent Figure(s). For example, the stacked memory package of FIG. 24-2 may be implemented in the context of the architecture and environment of FIG. 7 and the accompanying text of U.S. Provisional Application No. 61/602,034, filed Feb. 22, 2012, titled "SYSTEM, METHOD, AND COMPUTER PROGRAM PRODUCT FOR IMPROVING MEMORY SYSTEMS". Of course, however, the stacked memory package of FIG. 24-2 may be implemented in the context of any desired environment.

FIG. 24-3

FIG. 24-3 shows a stacked memory package architecture, in accordance with another embodiment.

In FIG. 24-3 the stacked memory package architecture 24-300 comprises four stacked memory chips 24-312 and one logic chip 24-346. The logic chip and stacked memory chips may be connected via TSVs 24-340. In FIG. 24-3 each of the plurality of stacked memory chips 24-312 may comprise one or more memory arrays 24-350. In FIG. 24-3 each of the memory arrays may comprise one or more subarrays. For example, the stacked memory chips in FIG. 24-3 may comprise eight memory arrays that may comprise four subarrays 24-306. In FIG. 24-3 each memory array contains eight arrays but any number AA of arrays may be used (including extra arrays and/or spare arrays for repair purposes, etc.). In FIG. 24-3 the arrays may be divided into subarrays 24-302. In FIG. 24-3 each arrays may contain four subarrays but any number S of subarrays may be used (including extra subarrays and/or spare subarrays for repair purposes, etc.).

The terms array and subarray may be used to describe the hierarchy of memory blocks within a chip. A memory array (or array) may be any regular shaped (e.g. square, rectangle, collection of regular shapes, etc.) collection (e.g. group, set, etc.) of memory cells and their associated (e.g. peripheral, driver, local, etc.) circuits. A subarray may be part (e.g. one or more portions, etc.) of a memory array. In one configuration the memory arrays may be banks (or equivalent to a standard SDRAM bank, correspond to a bank in a standard SDRAM part, etc.). In one configuration, the memory arrays may be bank groups (or be equivalent to a bank group in a standard SDRAM part, correspond to a bank group in a standard SDRAM part, etc.). In one configuration, subarrays need not be used. In one configuration, the subarrays may be subbanks (e.g. a subarray may comprise a portion of a bank, or portions of a bank, or portions of more than one bank, etc.). In one configuration, the subarrays may be banks themselves. For example, each bank may be a group (e.g. a bank group, etc.) of banks, etc. (e.g. a bank may be a bank group comprising four banks, etc.). Of course, any configuration of banks and/or subarrays and/or subbanks and/or other portion(s) or collection(s) of memory chip(s) (e.g. mats, arrays, blocks, parts, etc.) may be used. Of course, any type of memory technology (e.g. NAND flash, PCRAM, combinations of these, etc.) and/or memory array organization(s) may equally be used for one or more of the memory arrays and/or portion(s) of the memory arrays. The configuration (e.g. partitioning, allocation, connection, grouping, collection, arrangement, logical coupling, physical coupling, assembly, etc.) of the memory portion(s) (e.g. arrays, subarrays, banks, subbanks, mats, blocks, groups, subgroups, circuits, blocks, sectors, planes, pages, ranks, rows, columns, combinations of these, etc.) may be fixed (e.g. at manufacture, at test, at assembly, etc.) or variable (e.g. programmable, configurable, reconfigurable, adjustable, etc.) at start-up, during operation, etc.

Thus, for example, the stacked memory chip in FIG. 24-3 may contain 32 (8×4) subarrays (e.g. banks, subbanks, etc.). The 32 subarrays may be configured in (e.g. viewed in, accessed in, regarded in, appear logically in, etc.) a flexible manner. For example, the 32 subarrays may be configured as 32 individual subarrays, as eight groups of four subarrays, as 16 groups of two subarrays. The subarrays may also be logically viewed as one or more collection(s) of subarrays with possibly different properties than the individual subarrays. For example, the 32 subarrays may be configured as 32 banks, eight bank groups of four banks, 16 bank groups of two banks, etc.

The memory portion(s) (e.g. arrays, subarrays, banks, subbanks, mats, blocks, groups, subgroups, circuits, blocks, sectors, planes, pages, ranks, rows, columns, combinations of these, etc.) may be combined between chips (e.g. physically coupled, logically coupled, etc.) to form additional hierarchy. For example, one or more memory portions may form an echelon, as described elsewhere herein. For example, one or more memory portions may form a section, as described elsewhere herein (e.g. a portion of an echelon, a vertical collection of memory portions in a 3D array, a horizontal collection of memory portions in a 3D array, etc.). For example, one or more memory portions may form a DRAM plane, as described elsewhere herein (e.g. a collection of memory portions on a DRAM chip, etc.).

One or more memory portion(s) (e.g. arrays, subarrays, banks, subbanks, mats, blocks, groups, subgroups, circuits, blocks, sectors, planes, pages, ranks, rows, columns, combinations of these, etc.) of different memory technologies may be combined between chips (e.g. physically coupled, logically coupled, assembled, etc.) to form additional hierarchy. For example, one or more NAND flash planes may be combined with one or more DRAM planes, etc.

In FIG. 24-3 each of the arrays may comprise a row decoder(s) 24-316, sense amplifiers 24-304, row buffers 24-318, column decoder(s) 24-320. In FIG. 24-3 the row decoder is coupled to the row address bus 24-310 of width RA bits. In FIG. 24-3 the column decoders are connected to the column address bus 24-314 of width CA bits. In FIG. 24-3 the row buffers are connected to the logic chip via bus 24-308 of width D bits (e.g. width 256 bits bidirectional, etc.). In FIG. 24-3 the logic chip architecture may be similar to that shown in FIG. 24-2 with the exception that the data bus width and/or address bus widths of the architecture shown in FIG. 24-3 may be different. For example, in FIG. 24-3 the width of bus 24-314 may depend on the number of columns and number of subarrays. For example, if there are no subarrays then the bus width may be the same as a standard SDRAM part (with the same array size or bank size). For example, if there are four subarrays in each array (as shown in FIG. 24-3) then log (base 2) 4 or two extra bits may be added to the address bus. In FIG. 24-3 the width of row address bus 24-310 may depend on the number of rows and may, for example, be the same as a standard SDRAM part (with the same array size or bank size). In FIG. 24-3 the array addressing or bank addressing is not shown explicitly but may be similar to that shown in FIG. 24-2 for example, (and thus, array addressing or bank addressing may be considered to be part of the row address in FIG. 24-3 for example).

In FIG. 24-3 the command bus 24-360 may couple command and other control signals between the logic chip and the stacked memory chips. Other signals may be coupled between the logic chip and the stacked memory chips (e.g. from the logic chip, from the stacked memory chips, to/from the logic chip, etc.) but are not shown in FIG. 24-3.

In FIG. 24-3 the inset 24-370 shows the construction of the data bits on data bus 24-308. Each subarray in each memory array is assigned a unique number in FIG. 24-3. Thus, for example, the first subarray in the first array in the first stacked memory chip may be 00. The second subarray in the first array in the first stacked memory chip may be 01, and so on. In FIG. 24-3 there are four subarrays per memory array, but any number S may be used. In FIG. 24-3 there are four memory arrays per stacked memory chip, but any number of memory arrays AA may be used. In FIG. 24-3 there are four stacked memory chips in the stacked memory chip package, but any number of stacked memory chips N may be used. In FIG. 24-3 the subarrays on the second, third and fourth stacked memory chips are not shown or numbered, but may be numbered in a similar fashion to the subarrays of the first stacked memory chip. For example, the second stacked memory chip may contain subarrays 16-31, the third stacked memory chip may contain subarrays 32-47, the fourth stacked memory chip may contain subarrays 48-63.

In FIG. 24-3 the inset 24-370 shows just one possible organization of the data bus D. In FIG. 24-3 inset 24-370 shows the bits on the data bus at successive time slots. For example, at time slot 0 the data bus is driven with bits from subarrays 00, 01, 02, 03. In one configuration the data bus may be 32 bits wide. In this configuration subarrays may provide 32/4=eight bits each. Thus, each cell in the inset 24-370 may represent four bits. The time multiplexed behavior of the bus represented by inset 24-370 may also be represented by the following bus and time sequence SEQ0:

SEQ0: 00/00/01/01/02/02/03/03/04/04/05/05/06/06/07/07/08/08/09/09/10/10/11/11/12/12/13/13/14/14/15/15

In FIG. 24-3 the inset 24-370 shows this sequence repeated twice. The sequences may be shortened (e.g. abbreviated, etc.) by annotating a sequence with the bank access granularity BAG (e.g. the number of bits provided by each bank) and the data bus width DBW. It should be noted that access granularity (and abbreviation BAG, notation(s) with BAG, etc.) may be to any type of array that is used (e.g. bank, subbank, subarray, echelon (as defined herein), section (as defined herein), etc.). Thus, for example, if BAG=8 bits and DBW=32 bits we may shorten the above sequence to the following sequence SEQ1:

SEQ1: 00/01/02/03/04/05/06/07/08/09/10/11/12/13/14/15 (BAG=8, DBW=32)

It may be deduced from the 16 sequence entries that this sequence corresponds to 16/(32(DBW)/8(BAG))=4 time slots.

Other bus and time sequences are possible that may represent one or more of the following (but not limited to the following) aspects of the data bus use: alternative data bus widths; alternative data bus multiplexing schemes; alternative connections of banks; sections, stacked memory chips to the data bus; alternative access granularity of the banks, etc; and other aspects (e.g. reordering of read requests, write requests, read data, write data, etc.) etc.

For example, in one configuration a bank may provide 32 bits (BAG=32) on a 32-bit bus (DBW=32). One configuration of the data bus may correspond to the following sequence SEQ2:

SEQ2: 00/04/08/12

In this configuration it is now clear from SEQ2 that data from subarrays in different memory arrays has been interleaved.

The number of subarrays S, the number of memory arrays AA, the number of stacked memory chips N may also be used to show how more complex data bus configurations may be achieved.

For example, if S=2, AA=16, N=4, DBW=32, BAG=16 there may be 32 subarrays on each stacked memory chip. The numbering of subarrays may be such that there may be subarrays 0-31 on stacked memory chip 0 (SMC0), subarrays 32-63 on SMC1, 64-95 on SMC2, subarrays 96-127 on SMC3.

One configuration of the data bus for this stacked memory package architecture may correspond to the following sequence SEQ3:

SEQ3: 00/01/04/05/08/09/12/13/00/01/04/05/08/09/12/13

In this sequence SEQ3 subarrays on a first stacked memory chip SMC0 (e.g. in the same section) e.g. subarrays 00 and 01 are interleaved to form the first 32 bits (16 bits from each subarray) in time slot t0. In time slot t1, data from subarrays 04, 05 on a second stacked memory chip are interleaved, and so on. Subarrays 00-13 may form an echelon for example.

Sequences may be repeated to show the burst access behavior of a stacked memory package. Thus, for example, consider the following sequence SEQ4:

SEQ4: 00/01/04/05

This sequence may be repeated eight times as the following sequence SEQ5:

SEQ5: 00/01/04/05/00/01/04/05/00/01/04/05/00/01/04/05/00/01/04/05/00/01/04/05/00/01/04/05/00/01/04/05

This sequence may be represented by the following shortened version SEQ6:

SEQ6: 8*{00/01/04/05}

This sequence SEQ6 may represent a burst access behavior. For example, assume each subarray now provides 16 bits (BAG=16), and DBW=32. The above sequence has 8×4=32 entries, each entry corresponding to BAG or 16 bits and thus, a total of 512 (64 bytes) bits in 16 time slots. Each subarray may provide 8 sets of 16 bits which may represent burst length 8 (BL=8) behavior.

The following sequence SEQ7 using the same configuration (BAG=16, DBW=32) may represent burst chop behavior where the BL=8 access is interrupted after 4 bursts, for example:

SEQ7: 4*{00/01/04/05}

The above sequence SEQ7 may then represent a 32-byte access.

For example, in one configuration, a stacked memory package may operate to provide 64-byte access in response to a 64-byte request (e.g. for a 64-byte cache line in a 64-byte system, etc.) corresponding to one or more banks operating in a normal burst length mode, e.g. using a sequence such as SEQ6. A 32-byte request (e.g. for a 32-byte cache line in a 32-byte system, etc.) may result in the automatic generation (e.g. by the logic chip(s), etc.) of a burst chop memory command (or equivalent command, etc.) that results in a sequence such as SEQ7, etc.

For example, assume each subarray now provides 128 bits (BAG=128), and DBW=32. The following sequence represents data (128 bits) from a first access to a single subarray 00 multiplexed onto the data bus such that 32 bits are transmitted in four consecutive time slots:

SEQ8: 00/00/00/00

The following sequence for the same configuration shows data multiplexed from two subarrays:

SEQ9: 00/01/00/01/00/01/00/01

In SEQ9, two accesses (one to subarray 00, one to subarray 01) are multiplexed in an interleaved fashion such that 256 bits (128 to/from subarray 00 and 128 bits to/from subarray 01) are transmitted in eight consecutive time slots. Of course, any number of time slots may be used. Of course, any number of interleaved data sources may be used (e.g. any number of subarrays, etc.). Of course, any data bus width (DBW) and/or any size bank access granularity (BAG) or access granularity to any other array type(s) may be used.

Obviously other sequences are possible in different configurations that correspond to different interleaving, data packing, data requests, data reordering, data bus widths, data access granularity and other factors, etc.

Having explained the types of data access that may be used, it is now possible to understand the effect of the connections and connection complexity in a stacked memory package, particularly the complexity of the data bus connections as well as that of the command bus, address bus and other connections between logic chip(s) and slacked memory chips. The number of TSVs (or complexity of other coupling means, etc.), for example, may largely depend on the size, type etc. of buses used and/or the manner of their use (e.g. configuration, topology, organization, etc.).

In FIG. 24-3 the number of TSVs that may be used for control, data, and address signals may be approximately the same as architectures based on that shown in FIG. 24-2 for example. As an example of a configuration based on the architecture shown in FIG. 24-2 each of the DRAM arrays may comprise one or more banks, for example, the stacked memory chips may comprise eight banks. Each bank may comprise 16384 rows and 8192 columns. The row decoder may be coupled via a bus of width 17 bits. The column decoder may be connected via a bus of width 7 bits. The read FIFO and data I/F logic may be connected to the logic chip via a bidirectional bus of width 64 bits. Each bank may be connected to one 64-bit data bus. Thus, in this configuration, in FIG. 24-3 the number of TSVs used for data may be 256 (=64×8) for each of the four stacked memory chips, or 4×256=1024 in the stacked memory package. In a stacked memory package with eight stacked memory chips using the architecture of FIG. 24-3, there may thus, be 2048 TSVs for data.

A typical SDRAM die area may be 30 mm^2 (square mm) or 30×10"6 micron^2 (square micron). For example, a typical 1 Gb DD3 SDRAM in a 48 nm process may be 28.6 mm^2. For a 5 micron TSV (e.g. a square TSV 5 microns on each side, etc) it may be possible to locate a TSV in a 20 micron×20 micron square (400 micron^2) pattern (e.g. one TSV per 400 micron^2). A 30 mm^2 die may thus, theoretically support (e.g. may be feasible, may be practical, etc.) up to 30×10^6/400 or 75,000 TSVs. Although the TSV size may not be a fundamental limitation in an architecture such as shown in FIG. 24-3 there may be other factors to consider. For example, using 10,000 TSVs would consume 10^4×(5×5) micron^2 or 2.5×10^6 micron^2 for the TSVs alone. This calculation ignores any keepout areas (e.g. keepout zone (KOZ), keepout area (KOA), etc.) around the TSV where it may not be possible to place active circuits for example. The TSV area of 2.5×10^6 micron^2 would thus, be 2.5/30 or 8.3% of the 30×10^6 micron^2 die area in the above example. When considering (e.g. including, factoring in, etc.) keepout areas and layout inefficiency introduced by the TSVs the die area occupied by TSVs (or associated with, consumed by, etc) may be 20% of the die area, which may be an unacceptably high figure (e.g. due to cost, competitive architectures, yield, package size, etc). The memory cell area of a typical 1 Gb DD3 SDRAM in a 48 nm process may be 0.014 micron^2. Thus, 1Gbit of memory cells (or 1073741824 memory cells excluding overhead for redundancy, spares, etc.) corresponds to Ser. No. 10/737,41824×0.14 or 15032385 micron^2. This memory cell area is 15032385/30×10^6 or almost exactly 50% of a 30×10^6 micron^2 memory die. It may be difficult to place TSVs inside the memory cell arrays (e.g. banks; subbanks if present; subarrays if present; etc). Thus, given the area available to TSVs may be less than 50% of the memory die area, the above analysis of TSV use may still be optimistic.

Thus, considering the above analysis, the architecture of a stacked memory package may depend on (e.g. may be dictated by, may be determined by, etc) factors that may include (but are not limited to) the following: TSV size, TSV keepout area(s), number of TSVs, yield of TSVs, etc. As TSV process technology matures, TSV sizes and keepout areas reduce, and yield of TSVs increase, etc. it may be possible to increase the number of TSVs.

As another example of a configuration based on the architecture shown in FIG. 24-2 a stacked memory package may contain four stacked memory chips. Each stacked memory chip may comprise 32 banks. Each bank may be 32 Mb. A section may comprise two banks. An echelon may comprise four sections, one section on each stacked memory chip. The read FIFO and data I/F logic in each bank on each stacked memory chip may be connected to the logic chip via a bidirectional bus of width 32 bits. Each section (two banks) may be connected to one 32-bit data bus, with two banks in a section thus, sharing one data bus. Each data bus may use differential signaling thus, requiring 64 wires and 64 connections, TSVs, etc. Thus, in this configuration, in FIG. 24-3 the number of TSVs used for data may be 1024 (=32/2 (banks)×32 (bits)×2 (TSVs per bit)) for each of the four stacked memory chips, or 4×1024=4096 in the stacked memory package. This figure may exclude any TSVs used as spares for the data bus, or TSVs used for power and ground connections associated with the data bus and data bus drivers/receivers etc. In a stacked memory package with eight stacked memory chips using the architecture of FIG. 24-3, there may thus, be approximately 10,000 TSVs for data. The size of the command bus and the size of the address bus may depend on several factors including (but not limited to) the following: the size and organization of the memory arrays; the access granularity (the number of bits returned in an access and/or request, e.g. 32, 64, 128, 256 etc.); which commands are per stacked memory package; which commands are per stacked memory chip; which commands are per bank or other array, subarray, etc; whether the address bus is multiplexed or demultiplexed; etc. An estimate based on the architecture shown in FIG. 24-2 may use up to 20 bits for command and multiplexed address (e.g. command (per section), 12 address (per section), etc.). These command/address or C/A signals may use differential signaling. There may thus, be up to 20 (bits)×2 (TSVs per bit)×16 (sections)=640 TSVs for command and address per stacked memory chip. Thus, 640 (TSVs per stacked memory chip)×4 (stacked memory chips)=2560 TSVs per stacked memory package for command and address. Thus, the total TSV count (excluding power, ground, etc.) may be 4096 (data)+2560 (command, address)=6656 TSVs per stacked memory package. Thus, command and address may use approximately 60% of the number of data TSVs. Alternatively command and address may use approximately 40% of the TSVs and data may use approximately 60% of the TSVs (excluding power and ground). There are 1024 TSVs for data per stacked memory chip and 640 TSVs for address and command per stacked memory chip. An estimate for power and ground is one power ground pair for every differential signal pair or 1664 TSVs for power and ground (832 VDD and 832 GND) per stacked memory chip or 3328 VDD and 3328 GND TSVs per stacked memory package. Thus, 7456 TSVs per stacked memory package for VDD and GND. Thus, this configuration may use a total of 6656 (signal)+6656 (power)=13312 TSVs per stacked memory package. This figure excludes TSVs used for spares, repair, redundancy, etc. Table VII-1 shows the example TSV parameters for this example stacked memory package architecture.

TABLE VII-1

Example TSV configuration for a stacked memory package architecture.

| Function | Number of TSVs | Note/Comment |
|---|---|---|
| Data (per section) | 64 | 32 banks per chip<br>2 banks per section<br>32-bit differential data bus |
| Data (per chip) | 1024 | 16 sections per chip |
| Data (per package) | 4096 | 4 chips per package |
| C/A (per section) | 40 | 20 differential C/A signals |
| C/A (per chip) | 640 | |
| C/A (per package) | 2560 | |
| GND (per chip) | 832 | 1 GND per signal pair |
| VDD (per chip) | 832 | 1 VDD per signal pair |
| GND (per package) | 3328 | |
| VDD (per package) | 3328 | |
| Total (per section) | 208 | |
| Total (per chip) | 3328 | |
| Total (per package) | 13312 | |

A configuration using the architecture of FIG. 24-3 with a 256-bit data bus width may have a DE1 data efficiency of 256/8192 or 2.8% if the row width is 8192 bits. In FIG. 24-3 however we may divide the bank into several subarrays. If there are four subarrays in an array (e.g. bank, etc.) then a read command may result in fetching 0.25 (e.g. ¼) of the 8192 bits in an array (e.g. bank, etc.) row, or 2048 bits. Using four subarrays the DE1 data efficiency of the architecture shown in FIG. 24-3 may then be increased (by a factor of four, equal to the number of subarrays) to 256/2048 or 12.5%. A similar scheme to that used with subarrays for the read path may be used with subarrays for the write path making the improved DE1 data efficiency (e.g. relative to standard SDRAM parts) of the architecture shown in FIG. 24-3 equal for both reads and writes.

Of course, different or any numbers of subarrays, arrays, etc. may be used in a stacked memory package architecture based on FIG. 24-3. Of course, different or any data bus widths may be employed in a stacked memory package architecture based on FIG. 24-3. In one embodiment, for example, the subarray row width may be equal to the data path width (from subarray to IO) then DE1 data efficiency may be 100%. For example, in one embodiment, there may be 8 subarrays in a 8192 column array (e.g. bank, etc.) that may match a data bus width of 8192/8 or 1024 bits. If the stacked memory package in such an embodiment can support a data bus width of 1024 (e.g. is technically possible, is cost effective, including TSV yield, etc.), then DE1 data efficiency may be 100%.

The design considerations associated with the architecture illustrated in FIG. 24-3 (with variations in architecture such as those described and discussed above, etc.) may include (but are not limited to) one or more of the following factors: (1) increased numbers of subarrays may decrease the areal efficiency; (2) the use of subarrays may change the design of memory array peripheral circuits (e.g. row and column decoders, IO gating/DM mask logic, sense amplifiers, etc.); (3) large data bus widths may, in one embodiment, require increased numbers of TSVs and thus, may, in one embodiment, reduce yield and decrease die area efficiency; (4) large data bus widths may, in one embodiment, require high-speed serial IO to reduce any added latency of a narrow high-speed link versus a wide parallel bus. In various embodiments, DE1 data efficiency from 0.087% to 100% may be achieved. Thus, as an option, one may or may not choose to move from architectures such as that shown in FIG. 24-2 and FIG. 24-3 to other architectures (e.g. based on those of FIGS. 24-2 and 24-3, etc.) including those that are shown elsewhere herein and in the specifications incorporated herein.

The trend in standard SDRAM design is to increase the number of arrays, subarrays, banks, rows, and columns and to increase the row and/or page size with increasing memory capacity. This trend may drive standard SDRAM parts to the use of subarrays (e.g. divided banks, etc.) and/or groups of subarrays (e.g. groups of banks, groups of subarrays within banks, etc.).

For a stacked memory package, such as shown in FIG. 24-3, and assuming all stacked memory chips have the same structure, then the memory capacity (MC) of the stacked memory package is given by the following expressions. We have kept the terms and nomenclature consistent with a standard SDRAM part (except for the number of stacked chips, which is zero for a standard SDRAM part without stacking).

$$\text{Memory Capacity(MC)}=\text{Stacked Chips}\times\text{Arrays}\times\text{Rows}\times\text{Columns}$$

Stacked Chips=j, where j=4, 8, 16 etc. (j=1 corresponds to a standard SDRAM part)

Arrays=2^k, where k=array address bits

Rows=2^m, where m=row address bits

Columns=2^n×log (base 2) Organization, where n=column address bits

Organization=w, where w=4, 8, 16 (industry standard values for SDRAM parts), 32, 64, 128, 256, 512, etc. (for higher access granularity in stacked memory chip arrays)

For example, for a 1Gbit×8 DDR3 SDRAM: k=3 (e.g. array is equivalent to a bank), m=14, n=10, w=8. MC=1Gbit=1073741824=2^30. Note organization (the term used above to describe data path width in the memory array) may also be used to describe the rows×columns×bits structure of an SDRAM (e.g. a 1Gbit SDRAM may be said to have organization 16 Meg×8×8 banks, etc.), but we have avoided the use of the term bits (or data path width) to denote the ×4, ×8, or ×16 part of organization to avoid any confusion. Note that the use of subarrays or the number of subarrays for example, may not affect the overall memory capacity but may well affect other properties of a stacked memory package, stacked memory chip (or standard SDRAM part that may use subarrays). For example, for the architecture shown in FIG. 24-3 (e.g. with j=4 and other parameters the same as the standard 1Gbit SDRAM part), then memory capacity MC=4Gbit.

An increase in memory capacity may, in one embodiment, require increasing one or more of array (e.g. bank), row, column sizes or number of stacked memory chips. Increasing the column address width (increasing the row length and/or page size) may increase the activation current (e.g. current consumed during an ACT command). Increasing the row address (increasing column height) may increase the refresh overhead (e.g. refresh time, refresh period, etc.) and refresh power. Increasing the bank address (increasing number of banks) increases the power and increases complexity of handling bank access (e.g. tFAW limits access to multiple arrays or banks in a rolling time window, etc.). Thus, difficulties in increasing array (e.g. bank), row or column sizes may drive standard SDRAM parts towards the use of subarrays for example. Increasing the number of stacked memory chips may be primarily limited by yield (e.g. manufacturing yield, etc.). Yield may be primarily limited by yield of the TSV process. A secondary limiting factor may be power dissipation in the small form factor of the stacked memory package.

In one embodiment, subarrays may be used to increase DE1 data efficiency is to increase the data bus width to match the row length and/or page size. A large data bus width may require a large number of TSVs. Of course, other technologies may be used in addition to TSVs or instead of TSVs, etc. For example, optical vias (e.g. using polymer, fluid, transparent vias, etc) or other connection (e.g. wireless, magnetic or other proximity, induction, capacitive, near-field RF, NFC, chemical, nanotube, biological, etc) technologies (e.g. to logically couple and connect signals between stacked memory chips and logic chip(s), etc) may be used in architectures based on FIG. 24-3, for example, or in any other architectures shown herein. Of course, combinations of technologies may be used, for example, using TSVs for power (e.g. VDD, GND, etc) and optical vias for logical signaling, etc.

As an option, the stacked memory package architecture of FIG. 24-3 may be implemented in the context of the architecture and environment of any previous Figure(s) and/or any subsequent Figure(s). For example, the stacked memory package architecture of FIG. 24-3 may be implemented in the context of the architecture and environment of FIG. 8 and the accompanying text of U.S. Provisional Application No. 61/602,034, filed Feb. 22, 2012, titled "SYSTEM, METHOD, AND COMPUTER PROGRAM PRODUCT FOR IMPROVING MEMORY SYSTEMS". Of course, however, the stacked memory package architecture may be implemented in the context of any desired environment.

FIG. 24-4

FIG. 24-4 shows a data IO architecture for a stacked memory package, in accordance with another embodiment.

In FIG. 24-4 the data IO architecture comprises one or more stacked memory chips from the top (of the stack) stacked memory chip 24-412 through to the bottom (of the stack) stacked memory chip 24-438 (in FIG. 24-4 the number of chips is variable, #Chips N 24-440), and one or more logic chips 24-436 (only one logic chip is shown in FIG. 24-4, but any number may be used).

In FIG. 24-4, the logic chip and stacked memory chips may be connected via TSVs 24-442 or other coupling means (e.g. optical, capacitive, near-field RF, etc.). In FIG. 24-4 each of the plurality of stacked memory chips may comprise one or more memory arrays 24-440. In FIG. 24-4 the number of memory arrays may be a variable number, #Arrays AA 24-406.

In one configuration, as shown in FIG. 24-4, the memory arrays may be divided into one or more subarrays 24-402. In FIG. 24-4 each memory array may contain four subarrays, but any number of subarrays S may be used (including extra or spare subarrays for repair purposes, etc.).

In one configuration the subarrays shown in FIG. 24-4 may be banks and the banks grouped (e.g. collected, logically formed, etc.) into one or more bank groups. Thus, for example, a bank group may be thought of as equivalent to a bank in FIG. 24-4, etc. For example, a bank group may be a section (as defined herein). Sections (of banks, of bank groups, or of subarrays, etc.) may be used to form one or more echelons (as defined herein). Subarrays may also be further subdivided (not shown in FIG. 24-4).

Of course, any type of memory technology (e.g. NAND flash, PCRAM, etc.) and/or memory array organization (e.g. partitioning, layout, structure, etc.) may equally be used for any portion(s) of any the memory arrays. In FIG. 24-4 each of the memory arrays may comprise a row decoder 24-416, sense amplifiers 24-404, row buffers 24-418, and column decoders 24-420. In FIG. 24-4 the row decoder may be coupled to the row address bus 24-410. In FIG. 24-4 the column decoder(s) may be connected to the column address bus 24-414. In FIG. 24-4 the row buffer(s) are connected to the logic chip via bus 24-422 (bidirectional, with width that may be varied (e.g. programmed, controlled, etc) or vary by architecture, etc). In FIG. 24-4 the logic chip architecture may be similar to that shown in FIG. 24-2 and in FIG. 24-3 for example, including those portions not shown in FIG. 24-4. In FIG. 24-4 the width of bus 24-414 may depend on the number of columns and number of subarrays. For example, if there are no subarrays then the bus width may be the same as a standard SDRAM part (with the same bank size as a memory array). For example, if there are four subarrays in each memory array (as shown in FIG. 24-4) then log (base 2) 4 or two extra bits may be added to the bus. In FIG. 24-4 the width of bus 24-410 may depend on the number of rows and may, for example, be the same as a standard SDRAM part (with the same bank size as a memory array). In FIG. 24-4 the memory array addressing is not shown explicitly but may be similar to that shown in FIG. 24-2 and in FIG. 24-3 for example, (and memory array addressing may be considered to be part of the row address in FIG. 24-4 for example).

In FIG. 24-4 the connections that may carry data between the stacked memory chips and the logic chip(s) is shown in more detail. In FIG. 24-4 the data bus between each memory array and the logic chip is shown as separate (e.g. each memory array has a dedicated bidirectional data bus, etc).

In FIG. 24-4 the read FIFO and data I/F are shown as part of the logic chip(s), but may be part of the stacked memory chips (as shown in alternative architectures herein, for example, in FIG. 24-2, and in other specification incorporated herein by reference, etc.) or may be split (e.g. partitioned, divided, etc.) between logic chip(s) and stacked memory chips, etc.

In one configuration, as shown in FIG. 24-4, the data to the read FIFO (for reads) and from the data I/F (for writes) may be coupled directly to the row buffers. The data may also be coupled through gating and/or mask logic and/or other logic, as shown for example, in FIG. 24-2.

In one configuration, as shown in FIG. 24-4, the data I/F and read FIFO may be located in the logic chip(s). The data I/F and read FIFO and/or other associated or related logic may also be located in the stacked memory chips, as shown for example, in FIG. 24-2.

In FIG. 24-4 there is a first group of eight data buses per stacked memory chip (e.g. one data bus per memory array). In FIG. 24-4 there are four first groups of data buses per stacked memory package (e.g. four groups of eight data buses or 32 buses). Of course, any number of data buses may be used.

For example, in FIG. 24-4 bus 24-422 may carry 8, 32, 64, 256, 512, or 1024 etc. (e.g. any number) data bits between the logic chip and memory array 24-452. In FIG. 24-4 the array of TSVs dedicated to data is shown as data TSVs 24-424. In FIG. 24-4 the data TSVs may be connected to one or more data buses 24-426 inside the logic chip and coupled to the read FIFO (e.g. on the read path) and data I/F logic (e.g. on the write path) 24-428. The read FIFO and data I/F logic may be coupled to the PHY layer 24-430 via one or more buses 24-432. The PHY layer may be coupled to one or more high-speed serial links 24-434 (or other connections, bus technologies, IO technologies, etc.) that may be operable to be coupled to CPU(s) and/or other stacked memory packages, other devices or components, etc.

As an option, the data IO architecture may be implemented in the context of the architecture and environment of any previous Figure(s) and/or any subsequent Figure(s). For example, the data IO architecture of FIG. 24-4 may be implemented in the context of the architecture and environment of FIG. 9 and the accompanying text of U.S. Provisional Application No. 61/602,034, filed Feb. 22, 2012, titled "SYSTEM, METHOD, AND COMPUTER PROGRAM PRODUCT FOR IMPROVING MEMORY SYSTEMS". Of course, however, the data IO architecture may be implemented in the context of any desired environment.

FIG. 24-5

FIG. 24-5 shows a TSV architecture for a stacked memory chip, in accordance with another embodiment.

In FIG. 24-5 the TSV architecture for a stacked memory chip 24-500 comprises a stacked memory chip 24-504 with one or more arrays of through-silicon vias (TSVs).

FIG. 24-5 includes a detailed view 24-552 of the one or more TSV arrays. For example, in FIG. 24-5 a first array of TSVs may be dedicated for data, TSV array 24-530. For example, in FIG. 24-5 a second array of TSVs may be dedicated for address, control, power (TSV array 24-532). Of course, any number of TSV arrays may be used in the TSV architecture. Of course, any arrangement of TSVs may be used in the TSV architecture (e.g. power TSVs may be interspersed with data TSVs etc.). The arrangements of TSVs shown in FIG. 24-5 have been simplified (e.g. made regular, partitioned separately, shown separately, etc) to the simplify explanation of the TSV architecture. For example, to allow for improved signal integrity (e.g. lower noise, reduced inductance, better return path, etc), in one embodiment, one or more power (e.g. VDD and/or VSS) TSV connections (or VDD and/or VSS connections by other means) may be included in close physical proximity to each signal TSV (e.g. power TSVs and/or other power connections interspersed, intermingled, with signal TSVs etc).

In FIG. 24-5 each stacked memory chip may comprise one or more memory arrays 24-508. Each memory array may comprise one or more subarrays. In FIG. 24-5 only one memory array is shown for clarity and simplicity of explanation, but any number of memory arrays and/or subarrays may be used. In practice multiple memory arrays with multiple subarrays may be used (see for example, the architectures of FIG. 24-2, FIG. 24-3, and FIG. 24-4 that show multiple subarray architectures or multiple bank architectures for the stacked memory chip).

In FIG. 24-5 the memory array and/or bank may comprise one or more basic types of circuits or one or more basic types of circuit areas. A first circuit type or circuit area may correspond to an array of memory cells. Memory cells are typically packed (e.g. placed, layout, etc) in a dense array. A second type of circuit or circuit area may correspond to memory cell support circuits (e.g. peripheral circuits, ancillary circuits, auxiliary circuits, etc.) that act to control or otherwise interact etc. with the memory cells. The support circuits may include (but are not limited to) the following: row decoder, sense amplifiers, row buffers, column decoders, etc.

In FIG. 24-5 the memory array and/or bank may be divided into one or more subarrays 24-502. Each subarray may have one or more dedicated support circuits or may share support circuits with other subarrays. For example, a subarray may have a dedicated row buffer allowing one subarray to be operated (e.g. read performed, write performed, etc) independently of other subarrays.

In FIG. 24-5 connections between the stacked memory chip and the logic chip may be implemented using one or more buses. For example, in FIG. 24-5 bus 24-516 may use TSVs to connect (e.g. couple, transmit, etc) address, control, power through (e.g. using, via, etc) TSV array 24-532. For example, in FIG. 24-5 bus 24-518 may use TSVs to connect data through TSV array 24-530.

In FIG. 24-5 the TSV size may correspond to a round shape (e.g. circular shape, in which case size may be the TSV diameter, etc) or square shape (e.g. size is height and width, etc) as the drawn through-silicon via hole size. In FIG. 24-5 a TSV keepout (or keepout area KOA, keepout zone KOZ, etc) may be larger than the TSV size. The TSV keepout may restrict the type of circuits (e.g. active transistors, metal layers, metal layer vias, passive components, diffusion, polysilicon, other circuit and semiconductor process structures, etc) that may be placed near the TSV. Typically we may assume that nothing else may be placed (e.g. located, drawn in layout, etc) within a certain keepout area KOA around each TSV. In FIG. 24-5 the TSV spacing may restrict the areal density of TSVs (e.g. TSVs per unit area, etc).

In FIG. 24-5 representative (e.g. example, approximate, etc.) numbers of TSVs are shown. For example, in FIG. 24-5 each TSV area contains an array of 16×16=256 data TSVs and an array of 4×16=64 TSVs for address, control and power.

The areas of various circuits and areas of TSV arrays may be calculated using the following expressions.

DMC=Die area for memory cells=MC×MCH×MCH

MC=Memory Capacity (of each stacked memory chip) in bits (number of logically visible memory cells on die e.g. excluding spares etc)

MCH=Memory Cell Height (equal to wordline WL pitch and bitline BL pitch)

MCH×MCH=4×F^2 (2×F×2×F) for a 4F2 memory cell architecture

F=Feature size or process node, e.g. 48 nm, 32 nm, etc.

DSC=Die area for support circuits=DA (Die area)−DMC (Die area for memory cells)

TKA=TSV KOA area=#TSVs×KOA

#TSVS=#Data TSVs+#Other TSVs

#Other TSVS=TSVs for address, control, power, etc.

Table VII-2 shows example TSV data for a stacked memory package architecture. The numbers (e.g. numbers of TSVs, etc.) in Table VII-2 may correspond approximately to those shown in FIG. 24-5. For a configuration with a 1 Gb stacked memory chip with 32 subarrays and two subarrays per section there are 16 data buses and 16 address/command buses or four times the TSV count shown in Table VII-2. Thus, for example, the TSV TKA may be 1.33 mm^2 or approximately 15% of the 1 Gb DMC. These figures represent relative die areas that are closer to the scale shown in FIG. 24-5.

TABLE VII-2

Example TSV data for a stacked memory package architecture.

| Parameter | Value | Note/Comment |
|---|---|---|
| Data TSVs (per subarray) | 64 | 32-bit differential data bus |
| Data TSVs (per chip) | 256 | 4 subarrays per chip |
| C/A TSVs (per subarray) | 40 | 20 differential C/A signals |
| C/A TSVs (per chip) | 160 | |
| GND TSVs (per chip) | 208 | 1 GND per signal pair |
| VDD TSVs (per chip) | 208 | 1 VDD per signal pair |
| Total TSVs (per chip) | 832 | |
| TSV size | 5 micron × 5 micron | 25 micron^2 |
| TSV zone/KOA | 20 micron × 20 micron | 400 micron^2 |
| Total TSV area TKA | 0.33 mm^2 | 832 × 400 micron^2 |
| 1Gb DDR3 SDRAM | 30 mm^2 | 48nm process = F |
| 1Gb DDR3 WL pitch | 100 nm | 2F |
| 1Gb DDR3 BL pitch | 100 nm | 2F |
| 1Gb DDR3 DMC | 10 mm^2 | 10^9 × 100 nm × 100 nm |
| 1Gb DDR3 DSC | 20 mm^2 | 30 − 10 |

As an option, the TSV architecture for a stacked memory chip may be implemented in the context of the architecture and environment of any previous Figure(s) and/or any subsequent Figure(s). For example, the TSV architecture for a stacked memory chip of FIG. 24-5 may be implemented in the context of the architecture and environment of FIG. 10 and the accompanying text of U.S. Provisional Application No. 61/602,034, filed Feb. 22, 2012, titled "SYSTEM, METHOD, AND COMPUTER PROGRAM PRODUCT FOR IMPROVING MEMORY SYSTEMS". Of course, however, the TSV architecture for a stacked memory chip may be implemented in the context of any desired environment.

FIG. 24-6

FIG. 24-6 shows a die connection system, in accordance with another embodiment.

In FIG. 24-6, the die connection system 24-600 may comprise one or more stacked die (e.g. one or more stacked memory chips and one or more logic chips, other silicon die, ICs, etc.). In FIG. 24-6, the one or more die may comprise one or more stacked memory chips and a logic chip, though any number of memory chips and/or logic chips may be used. In FIG. 24-6 the one or more stacked die comprising one or more stacked memory chips and one or more logic chips may be connected (e.g. coupled, etc.) by one or more columns of TSVs (e.g. TSV bus, pillars, path, buses, wires, connectors, etc.) or by using other connection mechanisms and/or coupling means (e.g. optical, proximity, wireless, etc.).

In FIG. 24-6 a bus may be represented by a dashed line. In FIG. 24-6, a solid dot (e.g. connection dot, logical dot, etc.) on a bus (e.g. at the intersection of a bus dashed line and chip, etc.) may represent a connection (e.g. electrical connection, physical connection, signal coupling, signal path, logical path, etc.) from that bus to the logic chip (e.g. to circuits on the logic chip, etc.). Each bus may connect (e.g. logically couple, etc.) two or more chips. In FIG. 24-6, bus B1 24-614 for example, may connect logic chip 1 24-610 to memory chip 3 24-606 and memory chip 4 24-608 (e.g. with the bus passing through memory chip 1 and memory chip 2, but not necessarily connecting to any circuits on memory chip 1 and memory chip 2). Thus, in FIG. 24-6, the connection between bus B1 and memory chip 4 may be represented by connection dot 24-620. In FIG. 24-6, bus B1 may be a shared buses (e.g. may connect the logic chip to more than one memory chip). In FIG. 24-6, buses B2, B3, B4, B5 may be dedicated (e.g. private, non-shared, direct, etc.) buses (e.g. may connect the logic chip to only one memory chip, etc.).

In one embodiment, a bus that connects all memory chips may be fully shared bus. In another embodiment, a bus that connects less than all of the memory chips may be a partially shared bus. In one embodiment, buses (e.g. connecting one or more stacked chips, etc.) may be shared, partially shared, fully shared, dedicated, or combinations of these, etc.

In one embodiment, buses (e.g. data buses (e.g. DQ, DQn, DQ1, etc.), and/or address buses (A1, A2, etc.), and/or command or control buses (e.g. CLK, CKE, CS, etc.), and/or any other signals, bundles of signals, groups of signals, etc. of one or more memory chips may be shared, partially shared, fully shared, dedicated, or combinations of these.

For example, in FIG. 24-6 the stacked memory package may contain four stacked memory chips (e.g. memory chip 1, memory chip 2, memory chip 3, and memory chip 4). In FIG. 24-6, each stacked memory chip may contain four sections. Of course, any number of sections may be used in different configurations. A section may be divided into (e.g. consist of, may comprise, etc.) any number of banks or other arrays, subarrays, portion(s), etc. In FIG. 24-6 each section may be connected to the logic chip(s) by a number of buses and connections (e.g. using TSVs etc.) or sets of buses and connections. In FIG. 24-6 there are four sets of buses and connections, one for each section. There may be other connections (not shown in FIG. 24-6) that connect on a per chip rather than per section basis (e.g. for a per chip connection there is one connection or bus from logic chip to the stacked memory chips rather than four connections that correspond to a per section connection, etc.). For example, in FIG. 24-6 two types of connections using TSVs and buses are shown. In FIG. 24-6 bus 24-614 in connection set 1 may represent a first type of connection. In FIG. 24-6 bus 24-614 may be a shared bus that may, for example, be part of a shared address bus or part of a shared data bus or part of a shared command bus. In FIG. 24-6 bus 24-624 in connection set 1, for example, may represent a dedicated bus that connects logic chip 24-610 to a single section on stacked memory chip 24-606. In FIG. 24-6 bus 24-624 in connection set 1 may represent a second type of connection. In FIG. 24-6 bus 24-624 may be a non-shared bus that may, for example, be part of a non-shared address bus or part of a non-shared data bus or part of a non-shared command bus.

FIG. 24-6 may be a simplified architecture in order to show clearly the bus and connection structures. For example, in one configuration, a stacked memory package architecture may contain four stacked memory chips with each stacked memory chip containing 16 arrays and each array containing two subarrays. For example, there may be one array per section and two subarrays per section. In this configuration there may be a greater number of bus sets and connections than shown in FIG. 24-6. For example, there may be 16 copies of the command bus. For example, each command bus may be connected to one section in each stacked memory chip (e.g. connected to an echelon comprising four sections and eight subarrays). Thus, the command bus may be shared by two subarrays on each stacked memory chip. For example, there may be 16 copies of the command bus. The command bus may use a set of connections (e.g. connections and/or buses, etc.). For example, the command bus may use some connections of the first type described above (e.g. a shared connection, similar to bus 24-614, etc.). For example, clock signals may use (but not necessarily use) a shared connection. For example, the command bus may use some connections of the second type described above (e.g. a dedicated connection, similar to bus 24-624, etc.). For example, chip select signals may use (but not necessarily use) a dedicated connection.

In this configuration, for example, each address bus may be connected to one section in each stacked memory chip (e.g. connected to an echelon comprising four sections and eight subarrays). For example, there may be 16 copies of the address bus. Thus, the address bus may be shared by two subarrays on each stacked memory chip. The address bus may use connections of the first type described above (e.g. a shared connection, similar to bus 24-614, etc.).

In this configuration, for example, each data bus may be connected to one section in each stacked memory chip (e.g. connected to an echelon comprising four sections and eight subarrays). For example, there may be 16 copies of the data bus. Thus, the data bus may be shared by two subarrays on each stacked memory chip. The data bus may use connections of the first type described above (e.g. a shared connection, similar to bus 24-614, etc.).

Of course, any number of buses, bus sets, connection types, bus types, etc. may be used to connect any number of logic chip(s) and stacked memory devices in any fashion (e.g. shared bus, dedicated bus, etc.).

As an option, the die connection system of FIG. 24-6 may be implemented in the context of the architecture and environment of the previous Figures and/or any subsequent Figure(s). For example, the die connection system of FIG. 24-6 may be implemented in the context of the architecture and environment of FIG. 12 as well as the accompanying text of U.S. Provisional Application No. 61/569,107, filed Dec. 9, 2011, titled "SYSTEM, METHOD, AND COMPUTER PROGRAM PRODUCT FOR IMPROVING MEMORY SYSTEMS". Of course, however, the die connection system of FIG. 24-6 may be implemented in the context of any desired environment.

As one example, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, one or more aspects of the various embodiments of the present invention may be designed using computer readable program code for providing and/or facilitating the capabilities of the various embodiments or configurations of embodiments of the present invention.

Additionally, one or more aspects of the various embodiments of the present invention may use computer readable program code for providing and facilitating the capabilities of the various embodiments or configurations of embodiments of the present invention and that may be included as a part of a computer system and/or memory system and/or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; U.S. Provisional Application No. 61/581,918, filed Jan. 13, 2012, titled "USER INTERFACE SYSTEM, METHOD, AND COMPUTER PROGRAM PRODUCT"; U.S. Provisional Application No. 61/602,034, filed Feb. 22, 2012, titled "SYSTEM, METHOD, AND COMPUTER PROGRAM PRODUCT FOR IMPROVING MEMORY SYSTEMS"; U.S. Provisional Application No. 61/608,085, filed Mar. 7, 2012, titled "SYSTEM, METHOD, AND COMPUTER PROGRAM PRODUCT FOR IMPROVING MEMORY SYSTEMS"; U.S. Provisional Application No. 61/635,834, filed Apr. 19, 2012, titled "SYSTEM, METHOD, AND COMPUTER PROGRAM PRODUCT FOR IMPROVING MEMORY SYSTEMS"; U.S. application Ser. No. 13/441,132, filed Apr. 6, 2012, titled "MULTIPLE CLASS MEMORY SYSTEMS"; U.S. application Ser. No. 13/433,283, filed Mar. 28, 2012, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; and U.S. application Ser. No. 13/433,279, filed Mar. 28, 2012, titled "SYSTEM, METHOD, AND COMPUTER PROGRAM PRODUCT FOR UTILIZING IMAGE RECOGNITION TO PERFORM AN ACTION". Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section VIII

The present section corresponds to U.S. Provisional Application No. 61/665,301, titled "SYSTEM, METHOD, AND COMPUTER PROGRAM PRODUCT FOR ROUTING PACKETS OF DATA," filed Jun. 27, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization and/or use of other conventions, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS," and in U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY". Each of the foregoing applications are hereby incorporated by reference in their entirety for all purposes.

Example embodiments described herein may include computer system(s) with one or more central processor units (CPU) and possibly one or more I/O unit(s) coupled to one or more memory systems that may contain one or more memory controllers and memory devices. As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry.

FIG. 25-1

Figures 1, 25:
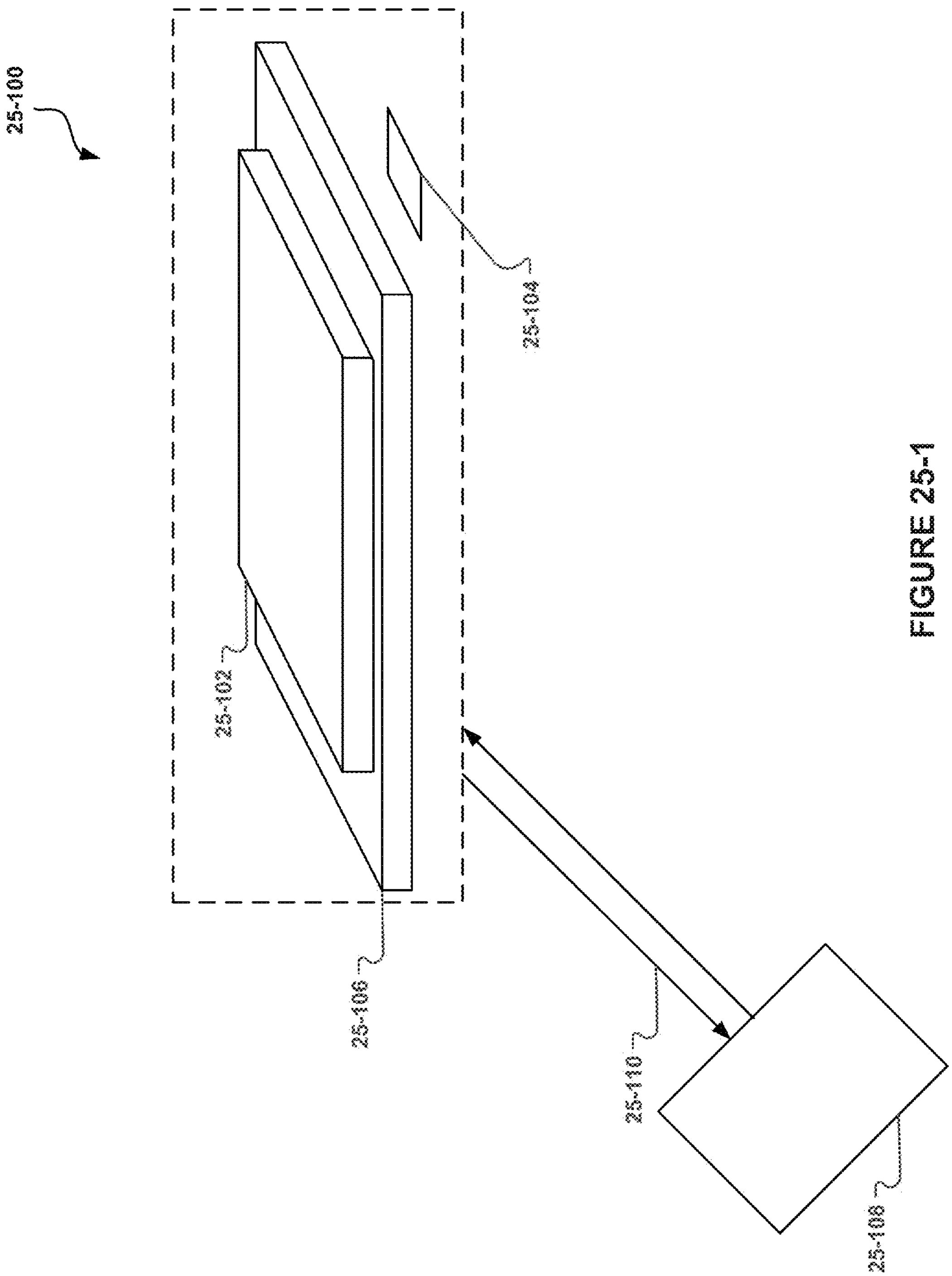
Figures 2, 25:
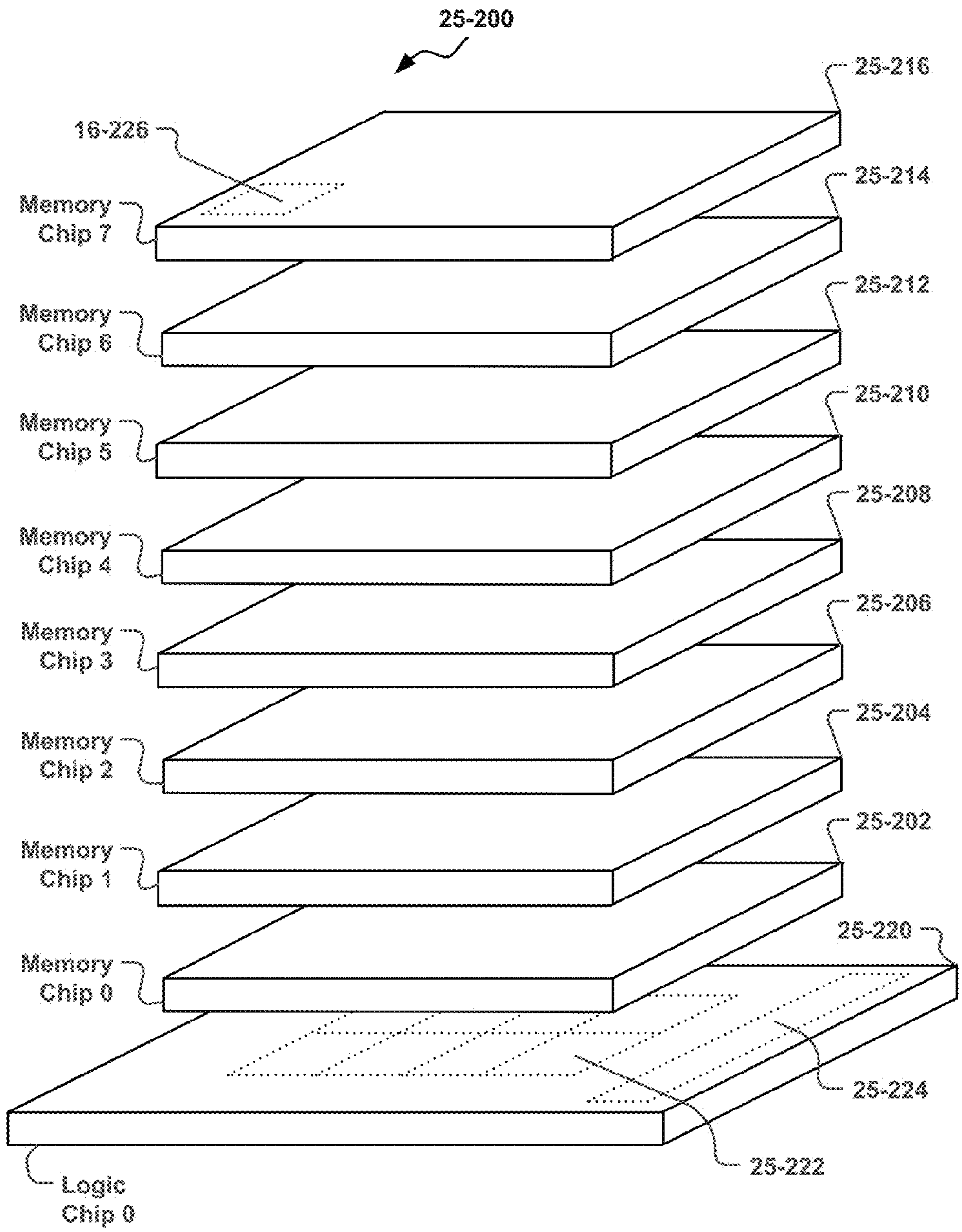
Figures 3, 25:
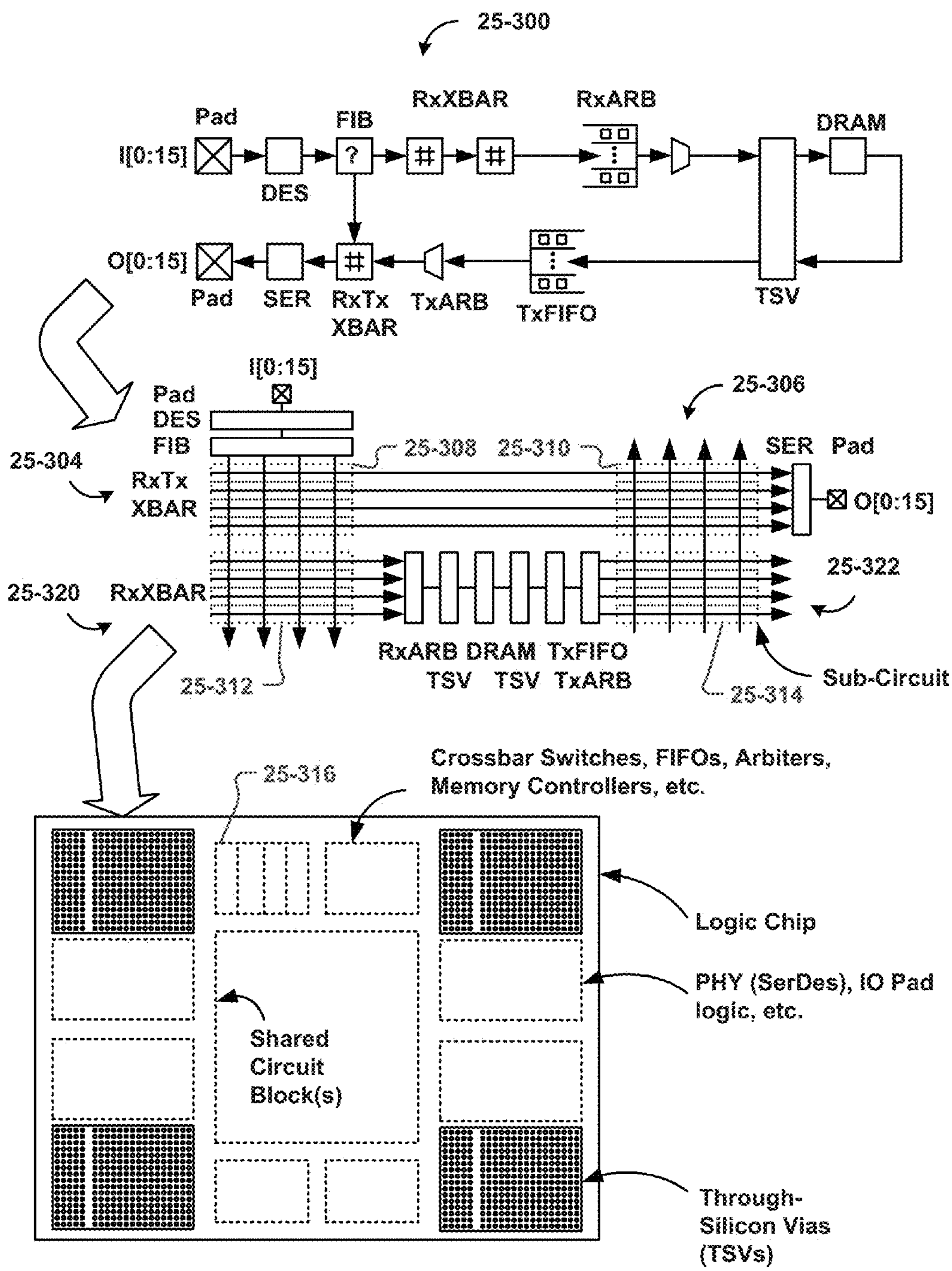
Figures 4, 25:
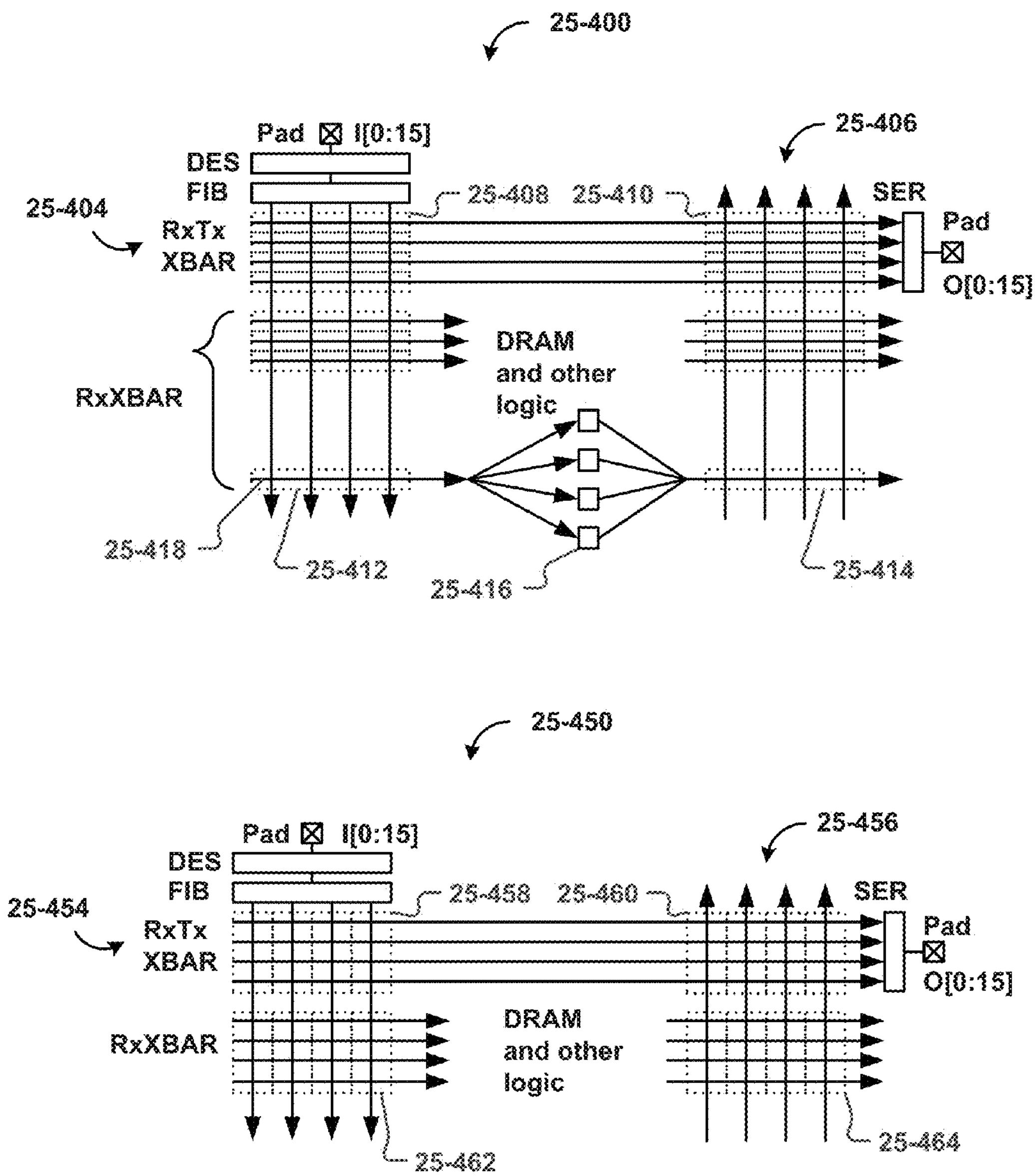
Figures 5, 25:
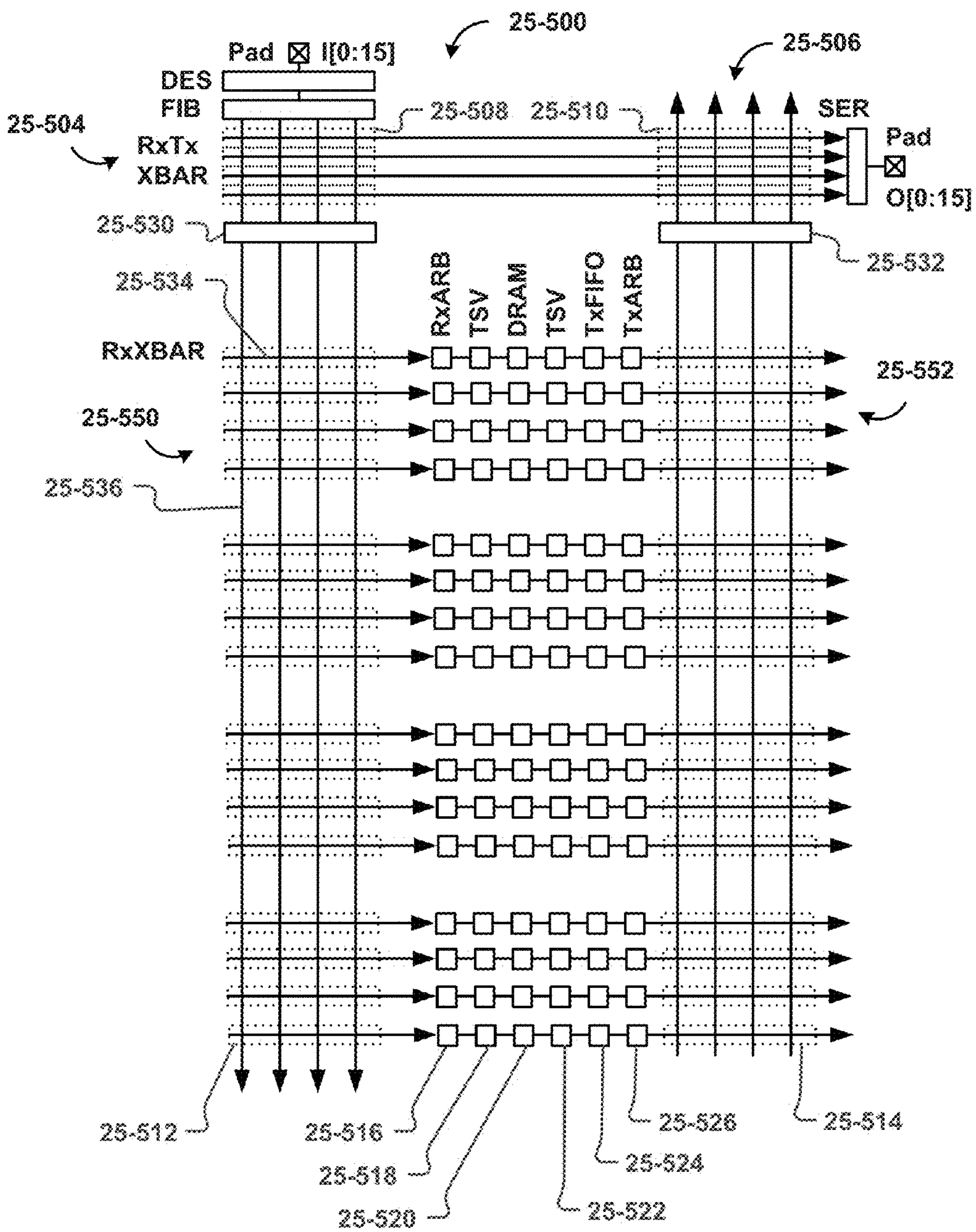
Figures 6, 25:
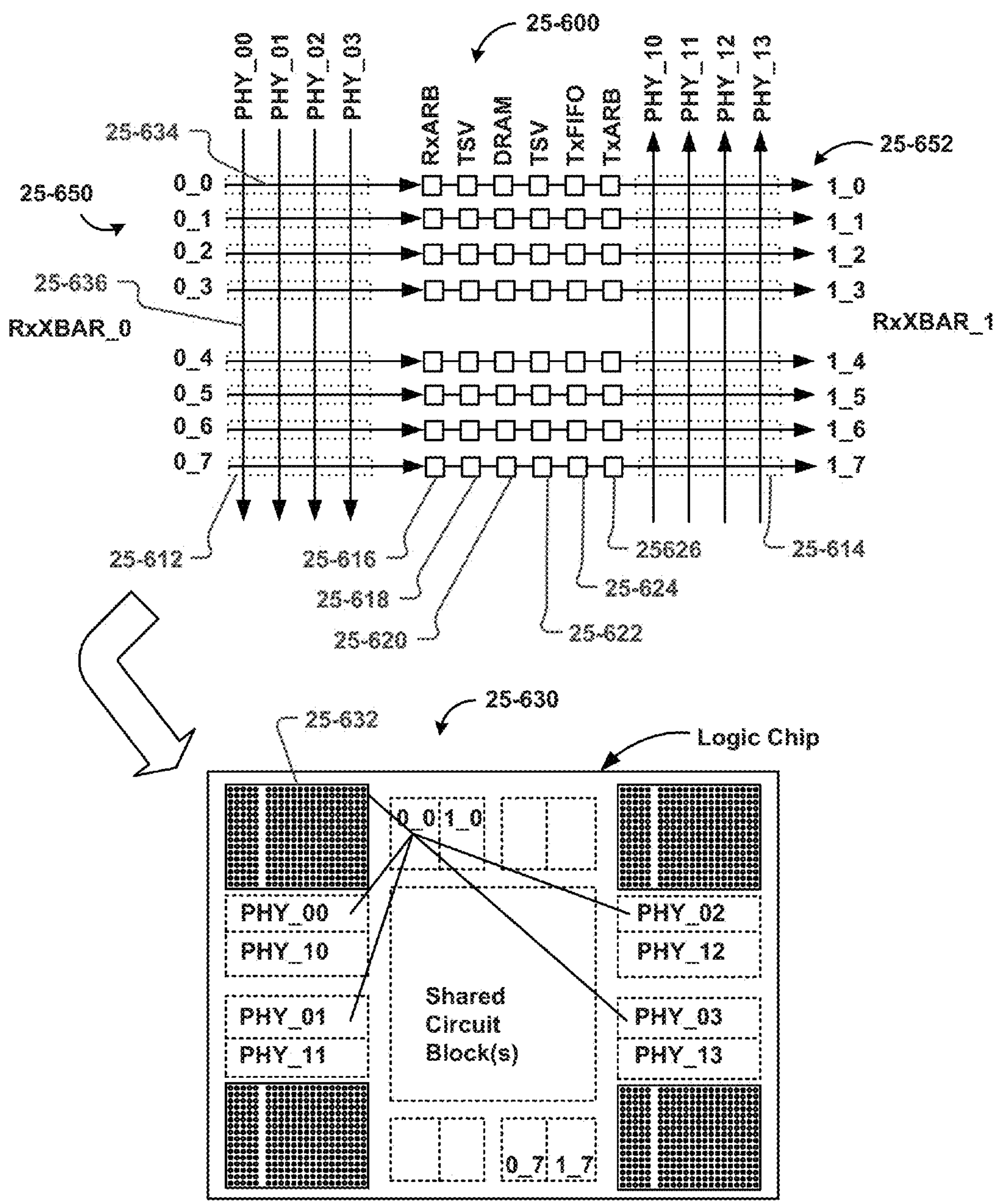
Figures 7, 25:
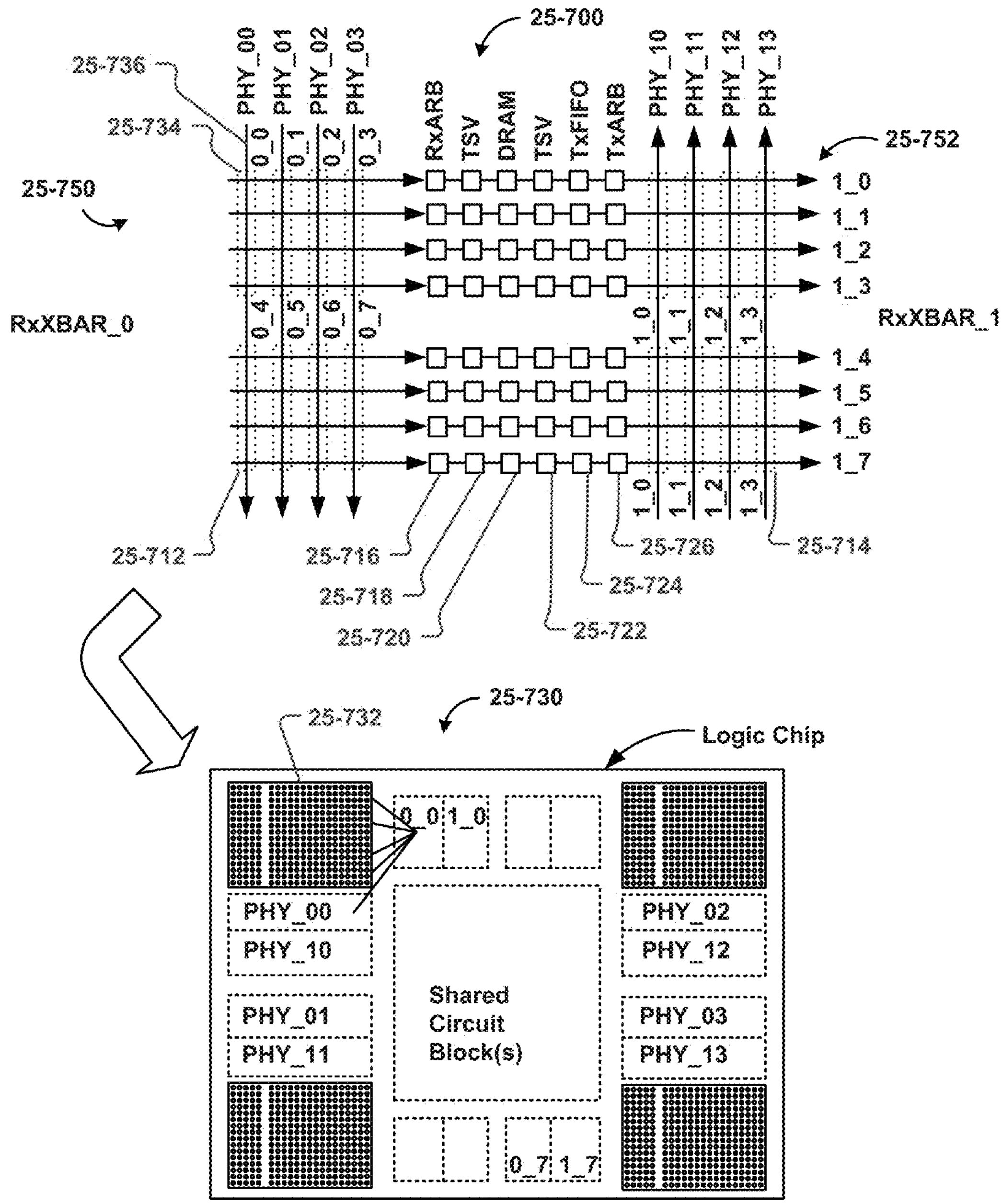
Figures 8, 25:
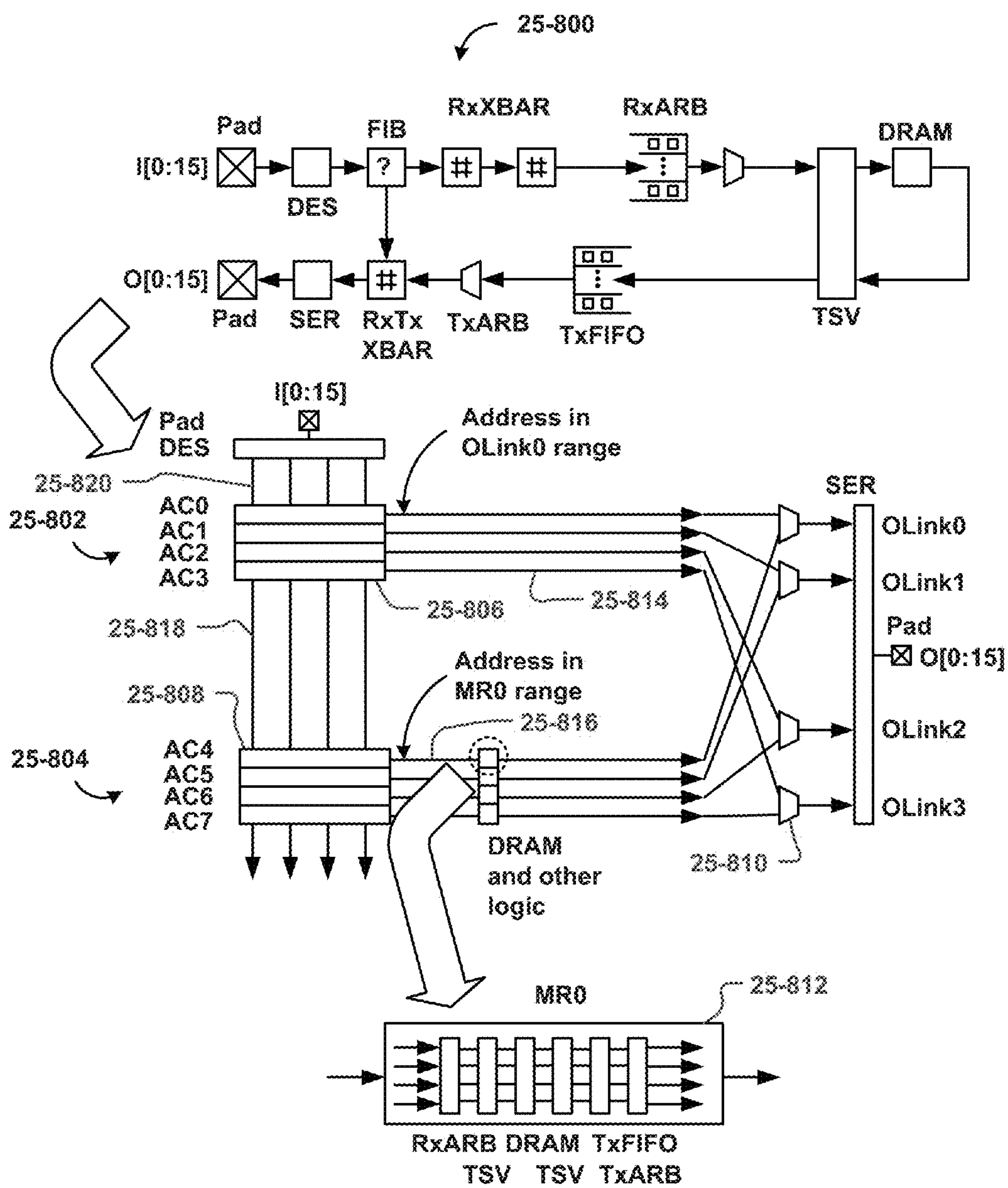
Figures 9, 25:
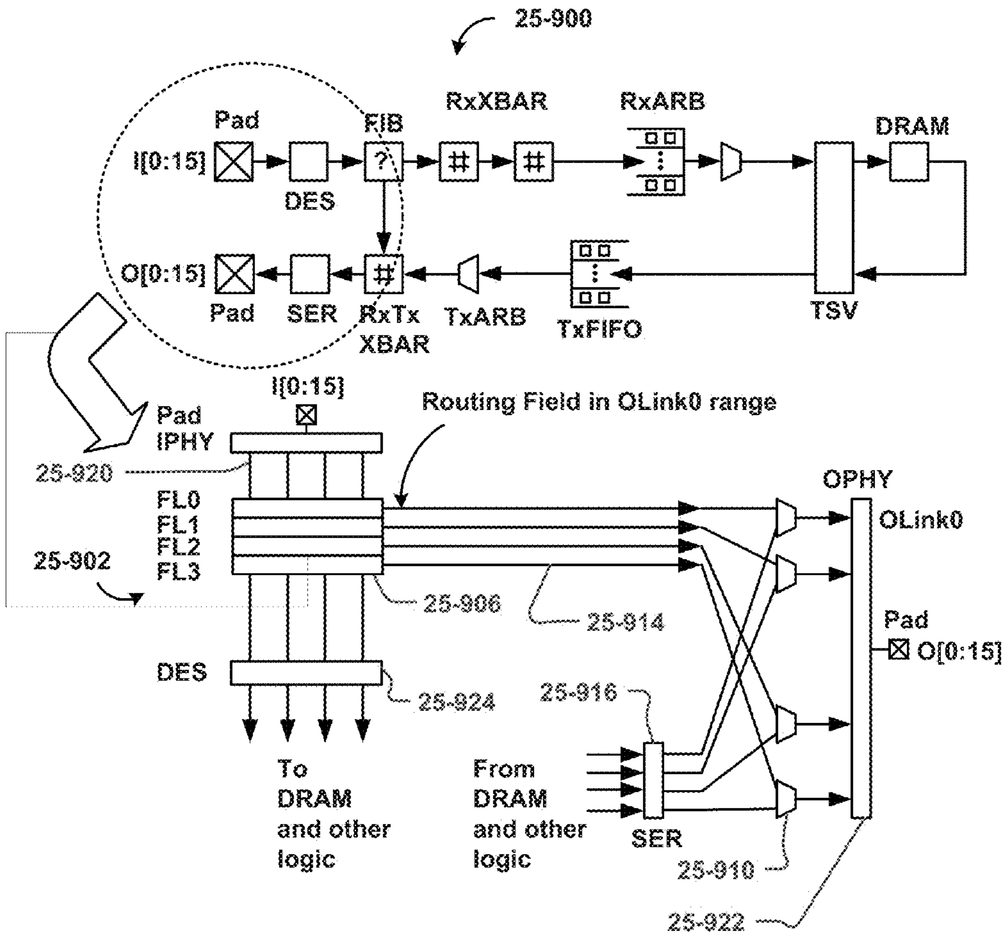

FIG. 25-1 shows an apparatus 25-100, in accordance with one embodiment. As an option, the apparatus 25-100 may be implemented in the context of any subsequent Figure(s). Of course, however, the apparatus 25-100 may be implemented in the context of any desired environment.

It should be noted that a variety of optional architectures, capabilities, and/or features will now be set forth in the context of a variety of embodiments in connection with a description of FIG. 25-1. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 25-100 includes a first semiconductor platform 25-102, which may include a first memory. Additionally, the apparatus 25-100 includes a second semiconductor platform 25-106 stacked with the first semiconductor platform 25-102. In one embodiment, the second semiconductor platform 25-106 may include a second memory. As an option, the first memory may be of a first memory class. Additionally, the second memory may be of a second memory class.

In another embodiment, a plurality of stacks may be provided, at least one of which includes the first semiconductor platform 25-102 including a first memory of a first memory class, and at least another one which includes the second semiconductor platform 25-106 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments.

In another embodiment, the apparatus 25-100 may include a physical memory sub-system. In the context of the present description, physical memory refers to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, SDRAM, eDRAM, embedded DRAM, MRAM, PRAM, etc.), memristor, phase-change memory, FeRAM, PRAM, MRAM, resistive RAM, RRAM, a solid-state disk (SSD) or other disk, magnetic media, and/or any other physical memory and/or memory technology etc. (volatile memory, nonvolatile memory, etc.) that meets the above definition.

Additionally, in various embodiments, the physical memory sub-system may include a monolithic memory circuit, a semiconductor die, a chip, a packaged memory circuit, or any other type of tangible memory circuit, or any intangible grouping of tangible memory circuits, combinations of these, etc. In one embodiment, the apparatus 25-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 25-106. Such connections that are in communication with the first memory and pass through the second semiconductor platform 25-106 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing one or more TSVs.

As another option, the communicative coupling may include a connection via a buffer device. In one embodiment, the buffer device may be part of the apparatus 25-100. In another embodiment, the buffer device may be separate from the apparatus 25-100.

Further, in one embodiment, at least one additional semiconductor platform (not shown) may be stacked with the first semiconductor platform 25-102 and the second semiconductor platform 25-106. In this case, in one embodiment, the additional semiconductor may include a third memory of at least one of the first memory class or the second memory class, and/or any other additional circuitry. In another embodiment, the at least one additional semiconductor may include a third memory of a third memory class.

In one embodiment, the additional semiconductor platform may be positioned between the first semiconductor platform 25-102 and the second semiconductor platform 25-106. In another embodiment, the at least one additional semiconductor platform may be positioned above the first semiconductor platform 25-102 and the second semiconductor platform 25-106. Further, in one embodiment, the additional semiconductor platform may be in communication with at least one of the first semiconductor platform 25-102 and/or the second semiconductor platform 25-102 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 25-102 may be in communication via a buffer. In this case, in one embodiment, the buffer may include a row buffer.

Further, in one embodiment, the apparatus 25-100 may be configured such that the first memory and the second memory are capable of receiving instructions via a single memory bus 25-110. The memory bus 25-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, etc; I/O protocols such as PCI, PCI-E, HyperTransport, InfiniBand, QPI, etc; networking protocols such as Ethernet, TCP/IP, iSCSI, etc; storage protocols such as NFS, SAMBA, SAS, SATA, FC, etc; and other protocols (e.g. wireless, optical, etc.); etc.). Of course, other embodiments are contemplated with multiple memory buses.

In one embodiment, the apparatus 25-100 may include a three-dimensional integrated circuit. In one embodiment, the first semiconductor platform 25-102 and the second semiconductor platform 25-106 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 25-100 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 25-102 and the second semiconductor platform 25-106 together may include a three-dimensional integrated circuit that is a wafer-on-wafer device.

In another embodiment, the apparatus 25-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 25-102 and the second semiconductor platform 25-106 together may include a three-dimensional integrated circuit that is a monolithic device.

In another embodiment, the apparatus 25-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 25-102 and the second semiconductor platform 25-106 together may include a three-dimensional integrated circuit that is a die-on-wafer device.

In yet another embodiment, the apparatus 25-100 may include a three-dimensional integrated circuit that is a die-on-die device. In the context of the present description, a die-on-die device refers to a device including two or more aligned dies in a die-on-die configuration. In one embodiment, the first semiconductor platform 25-102 and the second semiconductor platform 25-106 together may include a three-dimensional integrated circuit that is a die-on-die device.

Additionally, in one embodiment, the apparatus 25-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 25-100 may be configured such that the first memory and the second memory are capable of receiving instructions from a device 25-108 via the single memory bus 25-110. In one embodiment, the device 25-108 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.

In the context of the following description, optional additional circuitry 25-104 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 25-104 is shown generically in connection with the apparatus 25-100, it should be strongly noted that any such additional circuitry 25-104 may be positioned in any components (e.g. the first semiconductor platform 25-102, the second semiconductor platform 25-106, the device 25-108, an unillustrated logic unit or any other unit described herein, a separate unillustrated component that may or may not be stacked with any of the other components illustrated, a combination thereof, etc.).

In another embodiment, the additional circuitry 25-104 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiments, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 25-104 capable of receiving (and/or sending) the data operation request.

In yet another embodiment, memory regions and/or memory sub-regions of any of the memory described herein may be arranged to optimize one or more parallel operations in association with the memory.

Further, in one embodiment, the apparatus 25-100 may include at least one circuit for receiving a plurality of packets and routing at least one of the packets in a manner that avoids processing in connection with at least one of a plurality of processing layers. In one embodiment, the at least one circuit may include a logic circuit. Additionally, in one embodiment, the at least one circuit may be part of at least one of the first semiconductor platform 25-102 or the second semiconductor platform 25-106.

In another embodiment, the at least one circuit may be separate from the first semiconductor platform 25-102 and the second semiconductor platform 25-106. In one embodiment, the at least one circuit may be part of a third semiconductor platform stacked with the first semiconductor platform 25-102 and the second semiconductor platform 25-106.

Still yet, in other embodiments, the at least one circuit may include or be part of any of the components shown in FIG. 25-1. Of course, it further contemplated that, in still other unillustrated embodiments, the at least one circuit may include or be part of any other component (not shown).

Additionally, in one embodiment, the first semiconductor platform 25-102 and the second semiconductor platform 25-106 may each be uniquely identified. In another embodiment, the first semiconductor platform 25-102 and the second semiconductor platform 25-106 may be coupled utilizing a plurality of buses each capable of operating in a plurality of different modes. Further, in one embodiment, the first semiconductor platform and the second semiconductor platform may be coupled utilizing a plurality of buses that are capable of being merged.

In one embodiment, the apparatus 25-100 may be operable such that the at least one packet is routed to at least one of the first semiconductor platform 25-102 or the second semiconductor platform 25-106. In another embodiment, the apparatus 25-100 may be operable such that the at least one packet is routed to both the first semiconductor platform 25-102 and the second semiconductor platform 25-106. In one embodiment, the processing layers may include network processing layers.

Furthermore, in one embodiment, the first semiconductor platform 25-102 and the second semiconductor platform 25-106 may be situated in a single package. In this case, in one embodiment, the apparatus 25-100 may be operable such that the at least one packet is routed to at least one other memory in at least one other package.

Additionally, in one embodiment, the apparatus 25-100 may be operable for identifying information such that the at least one packet is routed based on the information. For example, in one embodiment, the apparatus 25-100 may be operable such that the information is extracted from a header of the at least one packet. In another embodiment, the apparatus 25-100 may be operable such that the information is extracted from a payload of the at least one packet.

Further, in one embodiment, the apparatus 25-100 may be operable such that the information is identified based on one or more characteristics of the at least one packet. For example, in various embodiments, the one or more characteristics may include at least one of a length, a destination, and/or statistics.

In one embodiment, the apparatus 25-100 may be operable such that the processing is avoided by replacing a first process with a second process to thereby avoid the first process. In one embodiment, the apparatus 25-100 may be operable such that the processing is avoided, bypassing processing in connection with at least one of a plurality of processing layers.

Additionally, in one embodiment, the apparatus 25-100 may be operable for utilizing a plurality of virtual channels in connection with the packets. Still yet, in one embodiment, the apparatus 25-100 may be operable for performing an error correction scheme in connection with the packets. In one embodiment, the apparatus 25-100 may be operable for utilizing at least one dynamic bus inversion (DBI) bit for parity purposes. Additionally, in one embodiment, the first memory and the second memory may be each capable of handling a X-bit width and the apparatus 25-100 may be operable for handling a Y-bit width, where X is different than Y.

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate with the memory system to allow for any of the foregoing optional architectures, capabilities, and/or features. For that matter, further embodiments are contemplated where a single semiconductor platform (e.g. 25-102, 25-106, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

It should be noted that while the embodiments described in this specification and in specifications incorporated by reference may show examples of stacked memory system and improvements to stacked memory systems, the examples described and the improvements described may be generally applicable to a wide range of electrical and/or electronic systems. For example, improvements to signaling, yield, bus structures, test, repair etc. may be applied to the field of memory systems in general as well as systems other than memory systems, etc.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the configuration/operation of the apparatus 25-100, the configuration/operation of the first and/or second semiconductor platforms, and/or other optional features have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc. which may or may not be incorporated in the various embodiments disclosed herein.

FIG. 25-2

FIG. 25-2 shows a stacked memory package 25-200, in accordance with one embodiment. As an option, the stacked memory package may be implemented in the context of FIG. 25-1 and/or any other Figure(s). Of course, however, the stacked memory package may be implemented in the context of any desired environment.

In FIG. 25-2, the stacked memory package 25-200 may comprise a logic chip 25-220 and a plurality of stacked memory chips (25-202, 25-204, 25-206, 25-208, 25-210, 25-212, 25-214, 25-216, etc.), in accordance with another embodiment. In FIG. 25-2 one logic chip is shown, but any number may be used. In FIG. 25-2, eight stacked memory chips are shown, but any number may be used. If more than one logic chip is used then they may be the same or different (for example, one chip may perform logic functions, while one chip may perform high-speed optical IO functions for example). In FIG. 25-2, each of the plurality of stacked memory chips may comprise a memory array (e.g. DRAM array, etc.). Of course, any type of memory may equally be used (e.g. SDRAM, NAND flash, PCRAM, combinations of these, etc.) in one or more memory arrays on each stacked memory chip. Each stacked memory chip may be the same or different (e.g. one stacked memory chip may be DRAM, another stacked memory chip may be NAND flash, etc.). One or more of the logic chip(s) may also include one or more memory arrays (e.g. embedded DRAM, NAND flash, other non-volatile memory, NVRAM, register files, SRAM, combinations of these, etc).

In FIG. 25-2, the logic chip(s) may be divided (e.g. partitioned, sectioned, etc.) into one or more first type of circuit blocks 25-222 (e.g. regions, functional areas, circuits, portions of the logic chip(s), etc.). In FIG. 25-2, the first type of circuit blocks may correspond to (e.g. be coupled to, be associated with, be responsible for driving and/or controlling, etc.) one or more memory regions (e.g. parts, portions, etc.) of one or more of the stacked memory chips. The first type of circuit block may be a dedicated circuit block in the sense that the circuit block may be dedicated to one or more memory regions of the stacked memory chip(s). In FIG. 25-2, eight dedicated circuit blocks are shown, but any number of dedicated circuit blocks may be used. Dedicated circuit blocks may, for example, perform such functions as (but not limited to): IO functions, link layer functions, datapath functions, memory controller functions, etc.

In FIG. 25-2, the logic chip(s) may be divided (e.g. partitioned, sectioned, etc.) into one or more second type of circuit blocks 25-224 (e.g. regions, functional areas, circuits, etc.). In FIG. 25-2, the second type of circuit blocks may be shared between groups of one or more memory regions (e.g. parts, portions, etc.) of one or more of the stacked memory chips or other circuits and/or perform shared functions (e.g. functions of the stacked memory package as a whole, functions common to and/or shared with more than one other circuit or block, etc.). The second type of circuit block may be a shared circuit block in the sense that the circuit block is shared between one or more memory regions of the stacked memory chip(s) and/or other components, parts etc. of the stacked memory package or memory system, etc. In FIG. 25-2, one shared circuit block is shown, but any number of shared circuit blocks may be used. Shared circuit blocks may, for example, perform such functions as (but not limited to): test and/or repair functions, nonvolatile memory, configuration functions, register read/write functions and operations, power supply and power regulation functions, initialization and control circuits, calibration circuits, characterization circuits, error detection circuits, error coding circuits, error control and error recovery circuits, status and information control and signaling, clocking and/or clock functions, other memory system functions, etc.

In FIG. 25-2, the stacked memory chip(s) may be divided (e.g. partitioned, sectioned, etc.) into one or more memory regions 25-226. In FIG. 25-2, the memory regions may be banks, subbanks, arrays, subarrays, echelons, pages, sectors, other portion(s) of a memory array, groupings of portion(s) of a memory array (e.g. groups of banks, etc.), combinations of these, etc. Any number, type, combination(s), and arrangement of memory regions from different memory chips and/or types of memory chips (e.g. DRAM, NAND flash, etc.), etc. may be used.

In one embodiment, one or more portions of memory (e.g. embedded DRAM, NVRAM, NAND flash, etc.) that may be present on the one or more logic chip(s) may be grouped with (e.g. associated with, virtually linked to, combined with, coupled to, etc.) one or more memory regions in one or more stacked memory chips. For example, memory on a logic chip may be used to repair faulty memory regions and/or used to perform test functions, characterization functions, repair functions, etc. For example, memory on a logic chip may be used to index, locate, relocate, link, virtually link, etc. memory regions or portion(s) of memory regions. For example, memory on a logic chip may be used to store the address(es) and/or pointer(s), etc. to portion(s) of faulty memory region(s) and/or store information to portion(s) of replacement memory region(s), etc. For example, memory on a logic chip may be used to store test results, characterization results, usage information, error statistics, etc.

In FIG. 25-2, the memory regions may be grouped. Thus there may be groups of groups of memory regions. Thus, for example, if a memory region is a group of banks, there may be one or more groups of groups of banks, etc. For example, if a memory region is a bank, a group of memory regions may be formed from one bank on each stacked memory chip. In one embodiment the dedicated circuits may be dedicated to a group of memory regions. For example, a dedicated circuit block may be dedicated to a group of eight banks, one bank on each of eight stacked memory chips. Any number, type and arrangement of dedicated circuits and memory regions may be used.

In order to illustrate the different possible connections (e.g. modes, couplings, connections, etc.) between block(s) on the logic chip(s) and the stacked memory chip(s), the definition of a notation and the definition of terms associated with the notation is described next. The notation is described in detail in U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY," which is hereby incorporated by reference in its entirety for all purposes. The notation may use a numbering of the smallest elements of interest (e.g. components, macros, circuits, blocks, groups of circuits, etc.) at the lowest level of the hierarchy (e.g. at the bottom of the hierarchy, at the leaf nodes of the hierarchy, etc.). For example, the smallest element of interest in a stacked memory package may be a bank of an SDRAM stacked memory chip. The bank may be 32 Mb, 64 Mb, 128 Mb, 2565 Mb in size, etc. The banks may be numbered 0, 1, 2, 3, . . . , k where k may be the total number of banks in the stacked memory package (or memory system, etc.). A group (e.g. pool, matrix, collection, assembly, set, range, etc.), and/or groups as well as groupings of the smallest element may then be defined using the numbering scheme. In a first design for a stacked memory package, for example, there may be 32 banks on each stacked memory chip; these banks may be numbered 0-31 on the first stacked memory chip, for example. In this first design, four banks may make up a bank group, these banks may be numbered 0, 1, 2, 3 for example. In this first design, there may be four stacked memory chips in a stacked memory package. In this first design, for example, an echelon may be defined as a group of banks comprising banks 0, 1, 32, 33, 64, 65, 96, 97.

It should be noted that a bank has been used as the smallest element of interest only as an example here in this first design, banks need not be present in all designs, embodiments, configurations, etc. It should be noted that a bank has been used as the smallest element of interest only as an example, any element may be used (e.g. array, subarray, bank, subbank, group of banks, group of subbanks, echelons, groups of echelons, group of arrays, group of subarrays, other portions(s), group(s) of portion(s), combinations of these, etc.).

Thus, in this first design for example, it may be seen that the term echelon may be precisely defined using the numbering scheme and, in this example, may comprise eight banks, with two on each of the four stacked memory chips. Further the physical (e.g. spatial, locations, etc.) of the elements (e.g. banks, etc.) may be defined using the numbering scheme (e.g. element 0 next to element 1 on a first stacked memory chip, element 32 on a second stacked memory chip above element 0 on a first stacked memory chip, etc.). Further the electrical, logical and other properties, relationships, etc. of elements may be similarly may be defined using the notation and numbering scheme.

There may be several terms that are currently used or in current use, etc. to describe parts of a 3D memory system that may not necessarily be used consistently and/or have a consistent meaning and/or precise definition. For example, the term tile may sometimes be used to mean a portion of a SDRAM or portion of an SDRAM bank. This specification may avoid the use of the term tile (or tiled, tiling, etc.) in this sense because there is no consensus on the definition of the term tile, and/or there is no consistent use of the term tile, and/or there is conflicting use of the term tile in current use.

The term bank may be usually used (e.g. frequently used, normally used, often used, etc.) to describe a portion of a SDRAM that may operate semi-autonomously (e.g. permits concurrent operation, pipelined operation, parallel operation, etc.). This specification may use the term bank in a manner that is consistent with this usual (e.g. generally accepted, widely used, etc.) definition. This specification and specifications incorporated by reference may, in addition to the term bank, also use the term array to include configurations, designs, embodiments, etc. that may use a bank as the smallest element of interest, but that may also use other elements (e.g. structures, components, blocks, circuits, etc.) as the smallest element of interest. Thus, the term array, in this specification and specifications incorporated by reference, may be used in a more general sense than the term bank in order to include the possibility that an array may be one or more banks (e.g. array may include, but is not limited to banks, etc.). For example, in a second design, a stacked memory chip may use NAND flash technology and an array may be a group of NAND flash memory cells, etc. For example, in a third design, a stacked memory chip may use NAND flash technology and SDRAM technology and an array may be a group of NAND flash memory cells grouped with a bank of an SDRAM, etc. For example, a fourth design may be described using banks (e.g. in order to simplify explanation, etc.), but other designs based on the fourth design may use elements than banks for example, This specification and specifications incorporated by reference may use the term subarray to describe any element that is below (e.g. a part of, a sub-element, etc.) an array in the hierarchy. Thus, for example, in a fifth design, an array (e.g. an array of subarrays, etc.) may be a group of banks (e.g. a bank group, some other collection of banks, etc.) and in this case a subarray may be a bank, etc. It should be noted that both an array and a subarray may have nested hierarchy (e.g. to any depth of hierarchy, any level of hierarchy, etc.). Thus, for example, an array may contain other array(s). Thus, for example, a subarray may contain other subarray(s), etc.

The term partition has recently come to be used to describe a group of banks typically on one stacked memory chip. This specification may avoid the use of the term partition in this sense because there is no consensus on the definition of the term partition, and/or there is no consistent use of the term partition, and/or there is conflicting use of the term partition in current use. For example, there is no definition of how the banks in a partition may be related for example.

The term slice and/or the term vertical slice has recently come to be used to describe a group of banks (e.g. a group of partitions for example, with the term partition used as described above). Some of the specifications incorporated by reference and/or other sections of this specification may use the term slice in a similar, but not necessarily identical, manner. Thus, to avoid any confusion over the use of the term slice, this section of this specification may use the term section to describe a group of portions (e.g. arrays, subarrays, banks, other portions(s), etc.) that may be grouped together logically (possibly also electrically and/or physically), possibly on the same stacked memory chip, and that may form part of a larger group across multiple stacked memory chips for example. Thus, the term section may include a slice (e.g. a section may be a slice, etc.) as the term slice may be previously used in specifications incorporated by reference. The term slice previously used in specifications incorporated by reference may be equivalent to the term partition in current use (and used as described above, but recognizing that the term partition may not be consistently defined, etc.). For example, in a fifth design, a stacked memory package may contain four stacked memory chips, each stacked memory chip may contain 16 arrays, each array may contain 2 subarrays. The subarrrays may be numbered from 0-63. In this fifth design, each array may be a section. For example, a section may comprise subarrays 0, 1. In this fifth design a subarray may be a bank, but need not be a bank. In this fifth design the two subarrays in each array need not necessarily be on the same stacked memory chip, but may be.

As an example of why more precise, but still flexible, definitions may be needed, the following example may be considered. For instance, in this fifth deign, consider a first array comprising a first subarray on a first stacked memory chip that may be coupled to a faulty second subarray on the first stacked memory chip. Thus, for example, a spare third subarray from a second stacked memory chip may be switched into place to replace the second subarray that is faulty. In this case the arrays in a stacked memory package may comprise subarrays on the same stacked memory chip, but may also comprise subarrays from more than one stacked memory chip. It could be considered that in this case the two subarrays (e.g. the first subarray and the third subarray) may be logically coupled as if on the same stacked memory chip, but may be physically on different stacked memory chips, etc.

The term vault has recently come to be used to describe a group of partitions, but is also sometimes used to describe the combination of partitions with some of a logic chip (or base logic, etc.). This specification may avoid the use of the term vault in this sense because there is no consensus on the definition of the term vault, and/or there is no consistent use of the term vault, and/or there is conflicting use of the term vault in current use.

This specification and specifications incorporated by reference may use the term echelon to describe a group of sections (e.g. groups of arrays, groups of banks, other portions(s), etc.) that may be grouped together logically (possibly also grouped together electrically and/or grouped together physically, etc.) possibly on multiple stacked memory chips, for example. The logical access to an echelon may be achieved by the coupling of one or more sections to one or more logic chips, for example. To the system, an echelon may appear (e.g. may be accessed, may be addressed, is organized to appear, etc.) as separate (e.g. virtual, abstracted, intangible, etc.) portion(s) of the memory system (e.g. portion(s) of one or more stacked memory packages, etc.), for example. The term echelon, as used in this specification and in specifications incorporated by reference, may be equivalent to the term vault in current use (but the term vault may not be consistently defined, etc.). For example, in a sixth design, a stacked memory package may contain four stacked memory chips, each stacked memory chip may contain 16 arrays, each array may contain 2 subarrays. In this sixth design, a group of four arrays, one array on each stacked memory chip, may be an echelon. In this sixth design, the arrays (rather than subarrays, etc.) may the smallest element of interest and the arrays numbered from 0-63. In this sixth design, an echelon may comprise arrays 0, 1, 16, 17, 32, 33, 48, 49. In this sixth design, array 0 may be next to array 1, and array 16 above array 0, etc. In this sixth design an array may be a section. In this sixth design a subarray may be a bank, but need not be a bank. For example, the term echelon may be illustrated by FIGS. 2, 5, 9, and 11 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS," which is incorporated herein by reference in its entirety.

The term configuration may be used in this specification and specifications incorporated by reference to describe a variant (e.g. modification, change, alteration, etc.) of an embodiment (e.g. an example, a design, an architecture, etc.). For example, a first embodiment may be described in this specification with four stacked memory chips in a stacked memory package. A first configuration of the first embodiment may thus, have four stacked memory chips. A second configuration of the first embodiment may have eight stacked memory chips, for example. In this case, the first configuration and the second configuration may differ in a physical aspect (e.g. attribute, property, parameter, feature, etc.). Configurations may differ in any physical aspect, electrical aspect, logical aspect, and/or other aspect, and/or combinations of these. Configurations may thus, differ in one or more aspects. Configurations may be changed, altered, programmed, reprogrammed, updated, reconfigured, modified, specified, etc. at design time, during manufacture, during assembly, at test, at start-up, during operation, and/or at any time, and/or at combinations of these times, etc. Configuration changes, etc. may be permanent (e.g. fixed, programmed, etc.) and/or non-permanent (e.g. programmable, configurable, transient, temporary, etc.). For example, even physical aspects may be changed. For example, a stacked memory package may be manufactured with five stacked memory chips with one stacked memory chip as a spare, so that a final product with five memory chips may only use any of the four stacked memory chips (and thus, have multiple programmable configurations, etc.).

For example, a stacked memory package with eight stacked memory chips may be sold in two configurations: a first configuration with all eight stacked memory chips enabled and working and a second configuration that has been tested and found to have 1-4 faulty stacked memory chips and thus, sold in a configuration with four stacked memory chips enabled, etc. For example, configurations may correspond to modes of operation. Thus, for example, a first mode of operation may correspond to satisfying 32-byte cache line requests in a 32-bit system with aggregated 32-bit responses from one or more portions of a stacked memory package and a second mode of operation may correspond to satisfying 64-byte cache line requests in a 64-bit system with aggregated 64-bit responses from one or more portions of a stacked memory package. Modes of operation may be configured, reconfigured, programmed, altered, changed, modified, etc. by system command, autonomously by the memory system, semi-autonomously by the memory system, combinations of these and/or other methods, etc. Configuration state, settings, parameters, values, timings, etc. may be stored by fuse, anti-fuse, register settings, design database, solid-state storage (volatile and/or non-volatile), and/or any other permanent or non-permanent storage, and/or any other programming or program means, and/or combinations of these and/or other means, etc.

Having defined a notation and terms associated with this notation the different possible connections (e.g. modes, couplings, connections, etc.) between block(s) on the logic chip(s) and the stacked memory chip(s) may now be described in more detail. The notation will use the memory region 25-226 of the stacked memory chip(s) as the smallest elements of interest. In order to illustrate the different possible connections a specific example stacked memory package may be used. In this specific example the stacked memory package may contain eight stacked memory chips (e.g. numbered zero through seven, etc.). Each stacked memory chip may contain eight memory regions (e.g. numbered zero through seven, etc.). Thus the notation may be used to describe the 64 memory regions in the stacked memory package as 0-63, with memory regions 0-7 on stacked memory chip 0, memory regions 8-15 stacked memory chip 1, etc. The stacked memory package may contain a single logic chip. The dedicated circuit blocks on the logic chip may be connected in various ways. For example, the logic chip may contain eight dedicated circuit blocks (e.g. numbered zero through seven, etc.). For example, dedicated circuit block 0 may be dedicated to memory regions 0, 8, 16, 24, 32, 40, 48, 56 (e.g. a single memory region on each of eight stacked memory chips). In this example, memory regions 0, 8, 16, 24, 32, 40, 48, 56 may form an echelon or other grouping of memory regions. In another example configuration of the same stacked memory package, the logic chip may contain four dedicated circuit blocks (e.g. numbered zero through three, etc.). For example, dedicated circuit block 0 may be dedicated to memory regions 0, 1, 8, 9, 16, 17, 24, 25, 32, 33, 40, 41, 48, 49, 56, 57 (e.g. two memory regions on each of eight stacked memory chips). For example, memory regions 0 and 1 on memory chip 0 may be a pair of banks, a group of banks, etc. In this example, memory regions 0, 1, 8, 9, 16, 17, 24, 25, 32, 33, 40, 41, 48, 49, 56, 57 may form an echelon or other grouping of memory regions. In another example configuration of the same stacked memory package, the logic chip may contain four dedicated circuit blocks (e.g. numbered zero through three, etc.). For example, dedicated circuit block 0 may be dedicated to memory regions 0, 1, 2, 3, 8, 9, 10, 11, 16, 17, 18, 19, 24, 25, 26, 27 (e.g. four memory regions on each of a subset of four stacked memory chips out of eight total stacked memory chips). In this example, memory regions 0, 1, 2, 3, 8, 9, 10, 11, 16, 17, 18, 19, 24, 25, 26, 27 may form an echelon or other grouping of memory regions. It may now be seen that other arrangements, combinations, organizations, configurations, etc. of memory regions with different connectivity, coupling, etc. to one or more circuit blocks on one or more logic chips may be possible.

In some configurations of stacked memory package there may be more than one type of dedicated circuit block with, for example, different connectivity to (e.g. association with, functionality with, etc.) the memory region(s). Thus, for example, a stacked memory package may contain eight stacked memory chips. Each stacked memory chip may contain 16 memory regions (e.g. banks, pairs of banks, bank groups, etc.). A group of eight memory regions comprising one memory region on each stacked memory chip may form an echelon. The stacked memory package may thus contain 16 echelons, for example.

Each echelon may have a dedicated memory controller and thus there may be 16 dedicated memory controllers. Each memory controller may thus be a dedicated circuit block of a first type and each memory controller may be considered to be dedicated to eight memory regions. The stacked memory package may contain four links (e.g. four buses, high-speed serial connections, etc. to the memory system, etc.). The logic chip may contain one or more serializer/deserializer (SERDES, SerDes, etc.) circuit blocks for each high-speed link. These SerDes circuit blocks may be considered to be dedicated circuit blocks or shared circuit blocks. For example, one or more links and the associated SerDes circuit blocks may be dedicated (e.g. associated with, coupled to, etc.) one or more echelons. In this case, for example, the SerDes circuit blocks may be considered to be dedicated circuit blocks. In this case, for example, the SerDes circuit blocks may not be dedicated to the same number, type, or arrangement of memory regions as other dedicated circuit blocks. Thus in this case, for example, the SerDes circuit blocks may be considered to be a second type of dedicated circuit block. In a different example, configuration or design the links and the associated SerDes circuit blocks may be shared (e.g. associated with, coupled to, etc.) all echelons and/or all memory regions. In this case, for example, the SerDes circuit blocks may be considered to be shared circuit blocks. The stacked memory package may contain one or more switches (e.g. crossbar switches, switching networks, etc.). For example, a first crossbar switch may be used to connect any of four input links to any of four output links. For example, a second crossbar switch may be used to connect any of four input links to any of 16 memory controllers. Each crossbar switch taken as a single circuit block may be considered a shared circuit block. The crossbar switches may be organized hierarchically or otherwise divided (e.g. into one or more sub-circuit blocks, etc.). In this case the divided portion(s) of a shared circuit block may be considered to be dedicated sub-circuit blocks. For example, the first crossbar switch, a shared circuit block, may couple any one of four input links to any one of four output links. The first crossbar switch may thus be considered to comprise a first crossbar matrix of 16 switching circuits. This first crossbar matrix of 16 switching circuits may be divided, for example, into four sub-circuit blocks each sub-circuit block comprising four switching circuits. These first crossbar sub-circuit blocks may be considered dedicated sub-circuit blocks. For example, depending on the division of the first crossbar switch, the first crossbar sub-circuit blocks may be considered as dedicated to a particular input link, or a particular output link. For example, depending on how the links may be dedicated, the first crossbar sub-circuit blocks may or may not be dedicated to memory regions. For example, the second crossbar switch, a shared circuit block, may couple any one of four input links to any one of 16 memory controllers, with each memory controller coupled to an echelon of memory regions. The second crossbar switch may thus be considered to comprise a second crossbar matrix of switching circuits. This second crossbar matrix of switching circuits may be divided, for example, into four sub-circuit blocks. These four second crossbar sub-circuit blocks may be considered dedicated sub-circuit blocks. For example, the second crossbar sub-circuit blocks may be considered as dedicated to a set (e.g. group, collection, etc.) of four memory controllers and thus to a set (e.g. group, collection, etc.) of echelons of memory regions. Thus, in this example, the second crossbar sub-circuit blocks may be considered a dedicated circuit block of a second type since the number of memory regions associated with a dedicated circuit block of a first type and the number of memory regions associated with a dedicated circuit block of a second type may be different. Thus it may be seen that that different types, arrangements, combinations, organizations, configurations, connections, etc. of dedicated circuit blocks and/or shared circuit blocks on one or more logic chips with different connectivity, coupling, etc. to memory regions of one or more stacked memory chips and/or logic chips may be possible. Of course any number and/or type and/or arrangements and/or connections of stacked memory chips, logic chips, memory regions, memory controllers, links, switches, SERDES, etc. may be used.

In FIG. 25-2 each of the memory arrays may comprise one or more banks (or other portion(s) of the memory array(s), etc.). For example, the stacked memory chips in FIG. 25-2 may comprise BB banks. For example, BB may be 2, 4, 8, 16, 32, etc. In one embodiment, the BB banks may be subdivided (e.g. partitioned, divided, grouped, arranged, logically arranged, physically arranged, etc.) into a plurality of bank groups (e.g. 32 banks may be divided into 16 groups of 2 banks, 8 banks may be divided into 2 groups of 4 banks, etc.). The banks may be further subdivided or may not be further subdivided into subbanks and so on (e.g. subbanks may optionally be further divided, etc.). The groups of banks and/or banks within groups may be able to operate in parallel (e.g. one or more operations such as read and/or write may be performed simultaneously, or nearly simultaneously and/or partially overlapped in time, etc.) and/or in a pipelined (e.g. overlapping in time, etc.) fashion, etc. The groups of subbanks and/or subbanks within groups may also be able to operate in parallel and/or pipelined fashion, etc.

In FIG. 25-2 each of the plurality of stacked memory chips may comprise a DRAM array with banks, but if a different memory technology (or multiple memory technologies, etc.) is used, then one or more memory array(s) may be subdivided in any fashion [e.g. pages, sectors, rows, columns, volumes, ranks, echelons (as defined herein), sections (as defined herein), NAND flash planes, DRAM planes (as defined herein), other portion(s), other collections(s), other groupings(s), combinations of these, etc.].

As an option, the stacked memory package of FIG. 25-2 may be implemented in the context of the architecture and environment of the previous Figures and/or any subsequent Figure(s). Of course, however, the stacked memory package of FIG. 25-2 may be implemented in the context of any desired environment.

FIG. 25-3

FIG. 25-3 shows a stacked memory package architecture 25-300, in accordance with one embodiment. As an option, the stacked memory package architecture may be implemented in the context of the previous Figures and/or any other Figure(s). As an option, for example, the stacked memory package architecture of FIG. 25-3 may be implemented in the context of the stacked memory package of FIG. 25-2. In FIG. 25-3, the architecture may be implemented, for example, in the context of FIG. 15 of U.S. Provisional Application No. 61/580,300, filed Dec. 26, 2011, titled "SYSTEM, METHOD, AND COMPUTER PROGRAM PRODUCT FOR IMPROVING MEMORY SYSTEMS." Of course, however, the stacked memory package architecture of FIG. 25-3 may be implemented in the context of any desired environment.

In FIG. 25-3, the die layout (e.g. floorplan, circuit block arrangements, architecture, etc.) of the logic chip may be designed to match (e.g. align, couple, connect, assemble, etc.) with the die layout of the stacked memory chip(s) and/or other logic chip(s). For example, the die layout of the logic chip in FIG. 25-3 may, for example, match the die layout of the stacked memory chip shown in FIG. 15-5 of U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY."

In FIG. 25-3, the logic chip may comprise a number of dedicated circuit blocks and a number of shared circuit blocks. For example, the logic chip may include (but not limited to) one or more of the following circuit blocks: IO pad logic (labeled as Pad in FIG. 25-3); deserializer (labeled as DES in FIG. 25-3), which may be part of the physical (PHY) layer; forwarding information base or routing table etc. (labeled as FIB in FIG. 25-3); receiver crossbar (labeled as RxXBAR in FIG. 25-3), which may be connected to the memory regions via one or more memory controllers, receiver arbitration logic (labeled as RxARB in FIG. 25-3), which may also include logic (e.g. memory control logic and other logic, etc.) associated with the memory regions of the stacked memory chips, the through-silicon via connections (labeled as TSV in FIG. 25-3), which may also include repaired or reconfigured TSV arrays for example, stacked memory chips (labeled as DRAM in FIG. 25-3) and associated memory regions (e.g. banks, echelons, sections, etc.), transmit FIFO (labeled as TxFIFO in FIG. 25-3), which may include other logic (e.g. protocol logic, etc.) to associate memory responses with requests, etc, transmit arbiter (labeled as TxARB in FIG. 25-3), receive/transmit crossbar (labeled as RxTxXBAR in FIG. 25-3), which may be coupled to the high-speed serial links that may connect the stacked memory package to the memory system, for example, serializer (labeled as SER in FIG. 25-3), which may be part of the physical (PHY) layer.

It should be noted that not all circuit elements, circuit components, circuit blocks, logical functions, buses, etc. may be shown explicitly in FIG. 25-3. For example, connections to the DRAM may (and typically will) comprise separate buses for command and data. For example, one or more memory controllers may be considered part of either/both of the circuit blocks labeled RxXBAR and RXARB in FIG. 25-3. Of course many combinations of circuits, buses, etc. may be used to perform the functions logically diagrammed in the DRAM datapath and other parts (e.g. logical functions, circuit blocks, etc.) of FIG. 25-3. For example, the architecture of the DRAM datapaths and DRAM control paths and their functions etc. may be implemented, for example, in the context shown in FIG. 13 and/or FIG. 15, together with the accompanying text, of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In one embodiment the functions of the RxXBAR and RxTxXBAR may be merged, overlapped, shared, and/or otherwise combined, etc. For example, FIG. 25-3 shows one possible architecture for the RxTxXBAR and RxXBAR in which RxTxXBAR may comprise portions (e.g. circuits, partitions, blocks, etc.) 25-304 and 25-306; and RxXBAR may comprise portions 25-320 and 25-322. For example, portion 25-304 (or one or more parts thereof) of RxTxXBAR may be merged with (e.g. constructed in one block with, use common circuits with, etc.) portion 25-320 (or one or more parts thereof) of RxXBAR. For example, portion 25-306 (or one or more parts thereof) of RxTxXBAR may be merged with (e.g. constructed in one block with, use common circuits with, etc.) portion 25-322 (or one or more parts thereof) of RxXBAR. For example, one or more sub-circuit blocks 25-308 in RxTxXBAR may be merged with one or more sub-circuit blocks 25-312 in RxXBAR. In such merged and/or combined and/or otherwise transformed circuits the connectivity of the RxXBAR and/or RxTxXBAR may not be exactly as shown in the block diagram of FIG. 25-3, but the functionality (e.g. logical behavior, logical function(s), etc.) may be the same or essentially the same as shown in the block diagram of FIG. 25-3.

Note that, in FIG. 25-3, RxXBAR portion 25-320 and RxXBAR portion 25-322 may be crossbar switches, crossbar circuits, crossbars, etc. with one type of input and one type of output. For example, the inputs to RxXBAR portion 25-320 may be coupled to one or more input pads, I[0:15]. For example, the outputs from RxXBAR portion 25-320 may be coupled to memory regions (via, for example, RxARB and TSV blocks, etc.). In FIG. 25-3, RxTxXBAR portion 25-304 is a crossbar switch that may be regarded as having one type of input and two types of output. In FIG. 25-3, RxTxXBAR portion 25-306 is a crossbar switch that may be regarded as having two types of input and one type of output. These logical drawings (e.g. topologies, circuit representations, etc.) may represent a more complex type of crossbar circuit structure. For example, in FIG. 25-3, the RxTxXBAR portion 25-304 may have a first type of output (e.g. lines, buses, connections, wires, signals, etc.) to RxXBAR portion 25-320 and a second type of output to RxTxXBAR portion 25-306. Thus, as drawn in FIG. 25-3 for example, the RxTxXBAR portion 25-304 may have four input lines and eight output lines. The switching behavior (e.g. logical behavior, logical function(s), etc.) of RxTxXBAR portion 25-304 may be simpler (e.g. different functionality, etc.) than a 4×8 crossbar, however. For example, the destination of inputs (packets, commands, etc.) to RxTxXBAR portion 25-304 may be known ahead of their connection (e.g. ahead of time, etc.) to the RxTxXBAR crossbar. For example, commands and/or data may be either destined (e.g. targeted, addressed, etc.) to a memory region on the stacked memory package or may be destined to be routed directly to the output link(s) for another part of the memory system. Thus, for example, a pre-stage (e.g. circuit block, logic function, etc.) may route an input immediately to one of the two sets of four output lines. Thus, for example, the RxTxXBAR portion 25-304 may be logically implemented as two 4×4 crossbars driven by such a pre-stage. Similarly in FIG. 25-3, the RxTxXBAR portion 25-306 may have a first type of input from RxTxXBAR portion 25-304 and may have a second type of input from RxXBAR portion 25-320. Thus, as drawn in FIG. 25-3 for example, the RxTxXBAR portion 25-306 may have four output lines and eight input lines. The switching behavior (e.g. logical behavior, logical function(s), etc.) of RxTxXBAR portion 25-306 may be simpler than an 8×4 crossbar, however. For example, commands from the RxTxXBAR may be essentially merged (e.g. combined, aggregated, etc.) with data and other responses etc. from the RxXBAR and routed to the output link(s). Thus, for example, a pre-stage (e.g. circuit block, logic function, etc.) may arbitrate between two sets of four input lines. Thus, for example, the RxTxXBAR portion 25-304 may be logically implemented as a 4×4 crossbar driven by such a pre-stage.

Of course, many combinations of crossbars, crossbar circuits, switching networks, switch fabrics, programmable connections, etc. in combination with, in conjunction with, comprising, etc. arbiters, selectors, MUXes, other logic and/or logic stages, etc. may be used to perform the logical functions and/or other functions that may include crossbar circuits and/or equivalent functions etc. as diagrammed in FIG. 25-3, for example. For example, one or more of the crossbar switches or portions of crossbar circuits (e.g. components, blocks, functions, etc.) illustrated in FIG. 25-3 may be implemented in the context shown in FIG. 6 of U.S. Provisional Application No. 61/580,300, filed Dec. 26, 2011, titled "SYSTEM, METHOD, AND COMPUTER PROGRAM PRODUCT FOR IMPROVING MEMORY SYSTEMS." For example, the connections and/or coupling and/or logical functions of one or more crossbar circuits used to connect to the stacked memory chips (e.g. DRAM), memory controllers, FIFOs, arbiters, and/or other associated logic may be implemented, for example, in the context shown in FIG. 7 of U.S. Provisional Application No. 61/580,300, filed Dec. 26, 2011, titled "SYSTEM, METHOD, AND COMPUTER PROGRAM PRODUCT FOR IMPROVING MEMORY SYSTEMS." Thus, for example, crossbars, crossbar circuits, switches, etc. may be constructed from cascaded (e.g. series connected, parallel connected, series-parallel connected, combinations of these, etc.) switching networks. Thus, for example, crossbar circuits may be blocking, non-blocking, etc. Thus, for example, crossbar circuits may be hierarchical, nested, recursive, etc. Thus, for example, crossbar circuits may contain queues, arbiters, MUXes, FIFOs, virtual queues, virtual channels, priority control, etc. For example, crossbar circuits may be operable to be modified, programmable, reprogrammable, configurable, etc. Thus, for example, crossbar circuits or other programmable connections may be altered at design time, during manufacturing and/or assembly, during or after testing, at system start-up, during or after characterization operations and/or functions, during system operation (e.g. periodically, continuously, etc.), combinations of these times (e.g. at multiple times, etc.), etc. For example, crossbar circuits may be constructed from any switching means including (but not limited to) one or more of the following: CMOS switches, MOS switches, transistor switches, pass gates, MUXes, optical switches, mechanical (e.g. micromechanical, MEMS, etc.) switches, other electrical and/or logical switching means, other circuits/macros/cells, combinations of these and/or other switching means, etc In FIG. 25-3 the crossbar switches and/or crossbar circuits may contain one or more sub-circuits. Thus, for example, the RxTxXBAR may be a shared circuit block with several sub-circuit blocks that may be dedicated circuit blocks. For example, as shown in FIG. 25-3, the RxTxXBAR may be divided into two portions: the first portion 25-304 may switch the input links and the second portion 25-306 may switch the DRAM outputs. For example, as shown in FIG. 25-3, each portion of the RxTxXBAR may be divided into four sub-circuits. Each sub-circuit may be located (e.g. layout placed, floorplanned, etc.) on the logic chip die separately (e.g. distinct from other similar copies of the sub-circuit, etc.). For example, in FIG. 25-3, a first sub-circuit 25-308 may be part of a first portion of the RxTxXBAR. For example, in FIG. 25-3, a second sub-circuit 25-310 may be part of a second portion of the RxTxXBAR. For example, in FIG. 25-3, a third sub-circuit 25-312 may be part of a first portion of the RxXBAR. For example, in FIG. 25-3, a fourth sub-circuit 25-314 may be part of a second portion of the RxXBAR. For example, in FIG. 25-3, the first sub-circuit 25-308, the second sub-circuit 25-310, the third sub-circuit 25-312, and the fourth sub-circuit 25-314 may be located (layout placed, floorplanned, etc.) in a dedicated circuit block 25-316. Of course circuit block 25-316 may contain other logic in addition to the crossbar sub-circuits, etc. In this example, then, the RxXBAR and the RxTxXBAR circuit blocks may be regarded as shared circuit blocks but the RxXBAR sub-circuit blocks and RxTxXBAR sub-circuit blocks (such as the layout 25-316) may be regarded as dedicated (or assigned, allocated, associated with, etc.) a set (e.g. group, collection, etc.) of memory support circuits (e.g. memory controllers, FIFOs, arbiters, datapaths, buses, etc.) as well as a set (e.g. group, echelon, section, etc.) of memory regions on one or more of the stacked memory chips.

In one embodiment the architecture (e.g. circuit design, layout, etc.) of the crossbar switch circuit blocks may be such that the sub-circuits may be simplified and/or optimized (e.g. minimized in area, maximized in speed, minimized in parasitic effects, etc.). For example, in FIG. 25-3 the sub-circuit 25-308, sub-circuit 25-310, sub-circuit 25-312, and sub-circuit 25-314 may all be optimized and similar (e.g. the same, copies, nearly the same, based on the same macro element(s), etc.).

As an option, the stacked memory package architecture of FIG. 25-3 may be implemented in the context of the architecture and environment of the previous Figures and/or any subsequent Figure(s). Of course, however, the stacked memory package architecture of FIG. 25-3 may be implemented in the context of any desired environment.

FIG. 25-4

FIG. 25-4 shows a stacked memory package architecture 25-400, in accordance with one embodiment. As an option, the stacked memory package architecture may be implemented in the context of FIG. 25-4 and/or any other Figure(s). Of course, however, the stacked memory package architecture may be implemented in the context of any desired environment.

In FIG. 25-4 the circuits, components, etc. may function in a manner similar to that described in the context of similar circuits and components in FIG. 25-3. In the architecture 25-400 the RxXBAR may connect (e.g. couple, etc.) to DRAM and other logic 25-416, as shown in FIG. 25-4. The DRAM and other logic shown in FIG. 25-4 may include (but is not limited to) one or more of the following components: RxARB, DRAM, TSV (for example used both to connect the command and write data to the DRAM and to connect the read data from the DRAM as well as other miscellaneous control and other DRAM signals, etc.), TxFIFO, TxARB. Thus, for example, the DRAM and other logic may be as shown in more detail in FIG. 25-3. In FIG. 25-4 the RxXBAR may include one or more horizontal lines 25-418 (e.g. wire, bus, multiplexed bus, switched bus, connection, etc.). Of course the orientation (e.g. horizontal, vertical, etc.) of the horizontal line(s) shown in the logical drawing of FIG. 25-4 may have no logical significance. The lines, buses, connections or other coupling means of any of the crossbar(s) (or any other circuit components, etc.) may be of any spatial orientation, nature, etc. In FIG. 25-4 there may be four copies of the DRAM and other logic coupled to each horizontal line of the RxXBAR. In FIG. 25-4, the DRAM and other logic may represent a group (e.g. set, collection, etc.) of memory regions and the associated logic. For example, the associated logic may include FIFOs, arbiters, memory controllers, etc. For example, a stacked memory package using the architecture of FIG. 25-4 may contain eight stacked memory chips. Each stacked memory chip may contain 16 memory regions. Thus, for example, the stacked memory package may contain a total of 8×16=128 memory regions. The stacked memory package may comprise four links to the external memory system using 16 input pads, I[0:15]. Each link may be coupled to the RxTxXBAR and RxXBAR through the DES and FIB circuit blocks, for example. Each of the four horizontal lines of the RxXBAR may be coupled to four groups of memory regions and associated logic. Thus, for example, there may be 16 groups of memory regions and associated logic. Thus, for example, each of the 16 groups of memory regions and associated logic may include 128/16=8 memory regions. Thus, each memory controller, for example, may control a group containing eight memory regions. The eight memory regions in each group may, for example, form an echelon. Thus in FIG. 25-4 the architecture 25-400 for the RxXBAR may have a horizontal line dedicated to four memory controllers and 32 memory regions. Of course, other arrangements of crossbar circuits, crossbar lines, memory regions, and associated logic may be used.

For example, architecture 25-450 in FIG. 25-4 shows another construction for the crossbar circuits. In the architecture 25-450 of FIG. 25-4 the sub-circuits may be constructed (e.g. formed, wired, architected, connected, coupled, floorplanned, etc.) in a different manner than that shown in FIG. 25-3 and/or in the architecture 25-400 of FIG. 25-4, for example. For example, in the architecture 25-450, the sub-circuit 25-458 of the RxTxBAR may be constructed so that the width direction of the sub-circuit is across multiple memory regions or (in an alternative, equivalent view) the sub-circuit generates one output (e.g. the sub-circuit 25-458 may be a vertical slice of the crossbar in architecture 25-450 and the sub-circuit 25-408 may be a horizontal slice of the crossbar circuit in architecture 25-400). Of course either a horizontal slice sub-circuit construction (e.g. architecture, design, layout, etc.) or a vertical slice sub-circuit construction (e.g. the width or height direction of the sub-circuit, the signals arrayed across the longest part of the sub-circuit, width of the sub-circuit along the input direction or output direction, etc.) may be used for any of the crossbar circuits or portion(s) of the crossbar circuits. For example, the RxTxXBAR may use a horizontal slice sub-circuit construction (as shown for example in architecture 25-400) while the RxXBAR may use a vertical slice sub-circuit construction (as shown for example in architecture 25-450).

The number, size, type, construction, and other features of the sub-circuits of the crossbar circuits (or any other circuit blocks, etc.) may be designed, for example, so that any sub-circuits may be distributed (e.g. sub-circuits placed separately, sub-circuits connected separately, sub-circuits placed locally to associated functions, etc.) on the logic chip(s). The distribution of the sub-circuits may be such as to minimize parasitic delays due to wiring; to allow direct, short, or otherwise optimize connections and/or coupling between logic chip(s) and/or stacked memory chip(s); to minimize die area (e.g. silicon area, circuit area, etc.); to minimize power dissipation; to minimize the difficulty of performing circuit layout (e.g. meet timing constraints, minimize crosstalk and/or other deleterious signal effects, etc.); combinations of these and/or other factors, etc.

As an option, the stacked memory package architecture of FIG. 25-4 may be implemented in the context of the architecture and environment of the previous Figures and/or any subsequent Figure(s). Of course, however, the stacked memory package architecture of FIG. 25-4 may be implemented in the context of any desired environment.

FIG. 25-5

FIG. 25-5 shows a stacked memory package architecture 25-500, in accordance with one embodiment. As an option, the stacked memory package architecture may be implemented in the context of the previous Figures and/or any other Figure(s). Of course, however, the stacked memory package architecture may be implemented in the context of any desired environment.

In FIG. 25-5 the circuits, components, etc. may function in a manner similar to that described in connection with similar circuits and components in FIG. 25-3 and FIG. 25-4. In the architecture 25-500 the RxXBAR may connect to DRAM and other logic, as shown, for example, in FIG. 25-4. The DRAM and other logic shown in FIG. 25-5 may include (but is not limited to) one or more of the following components: RxARB 25-516, DRAM 25-520 (which may be divided into one or more memory regions, etc.), TSV 25-518 (to connect the command and write data to the DRAM), TSV 25-522 (to connect the read data from the DRAM as well as other miscellaneous control and other DRAM signals, etc.), TxFIFO 25-524, TxARB 25-526. The description and functions of the various blocks, including blocks such as memory controllers etc. that may not be shown explicitly in FIG. 25-5, may be similar to that described in the context of FIG. 25-3 and the accompanying text and references.

In FIG. 25-5 the RxXBAR may include one or more horizontal lines 25-534 (e.g. wire, bus, multiplexed bus, switched bus, connection, etc.). Of course the orientation of the horizontal line shown in the logical drawing of FIG. 25-5 may have no logical significance. The lines, buses, connections or other coupling means of any of the crossbar(s) (or any other circuit components, etc.) may be of any spatial orientation, nature, etc. In FIG. 25-5 there may be one copy of the DRAM and other logic coupled to each horizontal line of the RxXBAR. In FIG. 25-5, the DRAM and other logic may represent a group (e.g. set, collection, etc.) of memory regions and the associated logic. For example, a stacked memory package using the architecture of FIG. 25-5 may contain eight stacked memory chips. Each stacked memory chip may contain 16 memory regions. Thus, for example, the stacked memory package may contain a total of 8×16=128 memory regions. The stacked memory package may comprise four links to the external memory system using 16 input pads, I[0:15]. Each link may be coupled to the RxTxXBAR and RxXBAR through the DES and FIB circuit blocks, for example. Each of the 16 horizontal lines of the RxXBAR may be coupled to one group of memory regions and associated logic. Thus, for example, there may be 16 groups of memory regions and associated logic. Thus, for example, each of the 16 groups of memory regions and associated logic may include 128/16=8 memory regions. Thus each memory controller, for example, may control a group containing eight memory regions. The eight memory regions in each group may, for example, form an echelon (as defined herein, etc.). Thus, in FIG. 25-4, the architecture 25-500 for the RxXBAR may have a horizontal line dedicated to one memory controller and 8 memory regions.

The architecture 25-400 for the RxXBAR of FIG. 25-4 may have a horizontal line dedicated to four memory controllers and 32 memory regions and the architecture 25-500 for the RxXBAR of FIG. 25-5 may have a horizontal line dedicated to one memory controller and 8 memory regions. A stacked memory package may contain MR memory regions, and a logic chip may contain MC memory controllers. Thus in different configurations, the RxXBAR, for example, may have HL_RxXBAR horizontal lines and thus may have a horizontal line dedicated to MC/HL_RxXBAR memory controllers and MR/HL_RxXBAR memory regions, where HL_RxXBAR may be any number. Note that, in the architecture shown in FIG. 25-5, HL_RxXBAR is also equal to the number of RxXBAR outputs (given the orientation of the crossbar shown in FIG. 25-5, with horizontal lines corresponding to outputs).

In FIG. 25-5, the RxXBAR may include one or more vertical lines 25-536 (e.g. wire, bus, multiplexed bus, switched bus, connection, etc.). Of course the orientation of the vertical line shown in the logical drawing of FIG. 25-5 may have no logical significance. The lines, buses, connections or other coupling means of any of the crossbar(s) (or any other circuit components, etc.) may be of any spatial orientation, direction, nature, etc.

In FIG. 25-5, the RxXBAR may have four vertical lines (e.g. corresponding to four inputs to the crossbar, etc.) that may correspond to (e.g. coupled to, connected to, etc.) four links (coupled to 16 input pads, I[0:15], for example). In different configurations of the RxXBAR there may be any number of vertical lines and thus any number of crossbar inputs, including a single input. For example, in one embodiment the input requests and/or input commands (read requests, write requests, etc.) may be transmitted in such a fashion that a single request or single command is completely contained on one link of one or more links (e.g. requests may not spread or be distributed over more than one link, etc.). Thus, for example, a stacked memory package with four links may have four request streams (e.g. sets, collections, simultaneous signals, etc.). These four request streams may be combined (e.g. merged, coalesced, aggregated, etc.) into a single stream. The single stream may then be used as a single input to the RxXBAR. Of course any number of links DLNK may be merged (or expanded) to any number of request streams REQSTR. Thus, in an analogous fashion to the horizontal lines of RxXBAR, in different configurations, the RxXBAR, for example, may have VL_RxXBAR vertical lines (which may be equal to REQSTR) and thus may have a vertical line dedicated to MC/VL_RxXBAR memory controllers and MR/VL_RxXBAR memory regions, where VL_RxXBAR may be any number. In one embodiment requests may be spread over more than one link, however the request stream(s) may still be merged or expanded to any number of streams as inputs to the RxXBAR for example.

The above examples illustrated how the number of inputs and number of outputs of the crossbar circuits (or other switching functions, etc.) may be architected so that the number of inputs and/or outputs dedicated to circuit resources such as memory controller and memory regions may be varied. For example, the architecture 25-400 of FIG. 25-4 may be used to achieve a ratio of 1:4 between RxXBAR outputs and memory controllers. For example, the architecture 25-500 of FIG. 25-5 may be used to achieve a ratio of 1:1 between RxXBAR outputs and memory controllers. The memory region notation may be used to illustrate the differences between these two architectures. For example, a stacked memory package may contain 128 (e.g. numbered 0-127) memory regions on eight (e.g. numbered 0-7) stacked memory chips (e.g. 16 memory regions per stacked memory chip). For example, the architecture 25-400 of FIG. 25-4 may have four RxXBAR outputs with each RxXBAR output dedicated to four groups (e.g. numbered 0-3) of eight memory regions (e.g. 32 memory regions), e.g. group 0 may contain memory regions 0, 8, 16, 24, 32, 40, 48, 56 (which may form an echelon, etc.). For example, the architecture 25-500 of FIG. 25-5 may have 16 RxXBAR outputs with each RxXBAR output dedicated to eight memory regions, e.g. memory regions 0, 8, 16, 24, 32, 40, 48, 56 (which may form an echelon, etc.).

The above examples have focused on the RxXBAR function, as shown in FIG. 25-5 for example. Similar alternative designs may be applied to the other crossbar circuits and/or portions of crossbar circuits and/or MUXes and/or switches and/or switching functions on the logic chip(s) in FIG. 25-5 and in other Figures in this specification and specifications incorporated herein by reference. In FIG. 25-5, for example, the number of inputs to RxTxXBAR portion 25-504 may be varied as VL_RxTxXBAR_1; the number of outputs of a first type (with output type and input type used as described in the text accompanying FIG. 25-3 for example) from RxTxXBAR portion 25-504 may be varied as VL_RxTxXBAR_1_1; the number of outputs of a second type from RxTxXBAR portion 25-504 may be varied as HL_RxTxXBAR_1_2; the number of outputs from RxTxXBAR portion 25-506 may be varied as HL_RxTxXBAR_2; the number of inputs of a first type to RxTxXBAR portion 25-506 may be varied as VL_RxTxXBAR_2_1; the number of inputs of a second type to RxTxXBAR portion 25-506 may be varied as HL_RxTxXBAR_2_2; the number of inputs to RxXBAR portion 25-534 may be varied as VL_RxXBAR_1; the number of outputs from RxXBAR portion 25-534 may be varied as HL_RxXBAR_1; the number of inputs to RxXBAR portion 25-552 may be varied as VL_RxXBAR_2; the number of outputs from RxXBAR portion 25-552 may be varied as HL_RxXBAR_2; etc.

For example, in FIG. 25-5, VL_RxTxXBAR_1=4; VL_RxTxXBAR_1_1=4; HL_RxTxXBAR_1_2=4; HL_RxTxXBAR_2=4; VL_RxTxXBAR_2_1=4; HL_RxTxXBAR_2_2=4; VL_RxXBAR_1=4; HL_RxXBAR_1=16; VL_RxXBAR_2=4; and HL_RxXBAR_2=16. Of course, other arrangements of crossbar lines, memory regions, and associated logic may be used.

Note that in FIG. 25-5, for example, VL_RxTxXBAR_1_1 (first type outputs)=VL_RxXBAR_1 (inputs)=4, but that need not be the case. Also, in FIG. 25-5, HL_RxTxXBAR_1_2 (second type outputs)=HL_RxTxXBAR_2_2 (second type inputs); HL_RxXBAR_1 (outputs)= HL_RxXBAR_2 (inputs); VL_RxXBAR_2 (outputs)=VL_RxTxXBAR_2_1 (first type inputs), but that need not be the case. For example, in FIG. 25-5 there may be circuit blocks 25-530 and 25-532 that may merge/expand the command and/or request and/or data streams. Thus, for example, circuit block 25-530 may change VL_RxXBAR_1 to be different from VL_RxTxXBAR_1_1, etc. Thus, for example, circuit block 25-532 may change VL_RxXBAR_2 to be different from VL_RxTxXBAR_2_1, etc. Other circuit blocks (not shown on FIG. 25-5) may change HL_RxTxXBAR_2_2 from HL_RxTxXBAR_1_2 (e.g. number of output links may be different from number of input links, for example).

In one embodiment, circuit blocks may change the format of signals that may be switched (e.g. connected, manipulated, transformed, etc.) in one or more crossbar circuits. For example, in FIG. 25-5, RXTxXBAR portion 25-504 may switch packets (e.g. signals at the PHY layer, for example). Circuit block 25-530 may change the format of RxTXXBAR outputs (e.g. change one or more types of output signal, etc.) from serialized packets to a parallel bus, for example. Thus, for example, in FIG. 25-5, RxXBAR portion 25-550 may switch signals on a parallel bus (e.g. signals above the PHY layer, for example).

In FIG. 25-5 (as well as, for example FIG. 25-3 and FIG. 25-4) the crossbar switches and crossbar circuits may be shown as balanced. The term balanced is used to indicate that the resources (circuits, connections, etc.) may be designed in a symmetric, fair, equal etc. fashion. Thus each link for example is or may be logically similar to other links; each crossbar line is or may be logically similar to other lines of the same type; each DRAM circuit is or may be logically similar to other DRAM circuits of the same type; each memory controller, FIFO, arbiter, etc. is or may be logically similar to circuits of the same type, and so on. This need not be the case. As an example, status requests and associated status responses may correspond to a very small amount of memory system traffic. In some cases, for example, status traffic may generate a burst of traffic at system start-up (e.g. boot time, etc.) but very little traffic at other times. Thus, in one embodiment, status requests and/or status responses may be assigned to a single link. In such an embodiment, configuration, design etc. the need for arbiters, queues, other circuits etc. may be reduced (e.g. eliminated, obviated, decreased, etc.). Such an embodiment may employ an unbalanced architecture, that is an architecture where not all circuit elements, sub-circuits, etc. that perform a similar function may be identical (e.g. are logically identical, are logically similar, are copies, are different instances of the same macro, etc.). An unbalanced architecture may thus include (but is not limited to) an architecture where in a number of circuits that may be otherwise similar or identical, one or more circuits, groups of circuits, circuits acting in combination, programming of circuits, aspects of circuits, etc. may be special (e.g. distinct, different, differing in one or more aspects, having different parameters and/or characteristics, having different logical behavior, performs a different logical function, etc.).

Unbalanced architectures may be used for a number of different reasons. For example, certain output links may be dedicated to certain memory regions (possibly under programmable control, etc.). For example, certain request may have higher priority than others and may be assigned to certain input links and/or logic chip datapath resources and/or certain output links (possibly under programmable control, etc.) and/or other system (e.g. stacked memory package, memory system, etc.) resources. Unbalanced architectures may also be used to handle differences in observed or predicated traffic. For example, more links (input links or output links) and/or circuit resources (logic chip and/or stacked memory chip resources, etc.) may be provided to read traffic than write traffic (or vice versa). For example, one or more paths in one or more of the crossbar switches and associated logic may contain logic for handling virtual traffic. Such an architecture may be constructed, for example, in the context of FIG. 13 of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

For example, in one embodiment one of the vertical paths in the RxTxXBAR in FIG. 25-5 may be designed to handle virtual traffic (e.g. using one or more virtual channels, specifying one or more virtual channels, using priority fields and/or traffic classes, using virtual links, virtual path(s), etc.). In this embodiment, the input commands and/or input requests that use a virtual channel etc. may be steered to (e.g. associated with, directed to, coupled to, connected to, routed to, etc.) a particular path (e.g. links, channels, buses, circuits, function blocks, switches, virtual path(s), combinations of these, etc.).

Of course any number, type, format or structure (e.g. packet, bus, etc.), bus width, encoding, class (e.g. traffic class, virtual channel, virtual path(s), etc.), priorities, etc. of signals may be switched at any point in the architecture using schemes such as those described and illustrated above with respect to the architecture shown in FIG. 25-5 and/or with respect to any of the other architectures shown in other Figures in this application and/or in Figures in other applications incorporated herein by reference along with the accompanying text.

FIG. 25-6

FIG. 25-6 shows a portion of a stacked memory package architecture 25-600, in accordance with one embodiment. As an option, the stacked memory package architecture may be implemented in the context of the previous Figures and/or any other Figure(s). Of course, however, the stacked memory package architecture may be implemented in the context of any desired environment.

In FIG. 25-6, the RxXBAR may be implemented in the context of FIG. 25-5, for example. In FIG. 25-6, the RxXBAR may comprise two portions RxXBAR_0 25-650 and RxXBAR_1 25-652. The portions RxXBAR_0 and RxXBAR_1 may be coupled to DRAM and associated logic, as shown and similar to the corresponding components described for example in FIG. 25-5 and the accompanying text. The DRAM and other logic shown in FIG. 25-6 may include (but is not limited to) one or more of the following components: RxARB 25-616, DRAM 25-620 (which may be divided into one or more memory regions, etc.), TSV 25-618 (to connect the command and write data to the DRAM), TSV 25-622 (to connect the read data from the DRAM as well as other miscellaneous control and other DRAM signals, etc.), TxFIFO 25-624, TxARB 25-626. The description and functions of the various blocks, including blocks such as memory controllers etc. that may not be shown explicitly in FIG. 25-6, may be similar to that described in the context of FIG. 25-3 and the accompanying text and references. Note that in FIG. 25-6 the RxXBAR may be a different size from that shown in FIG. 25-4 for example. Of course the RxXBAR may be of any size and coupled to any number of stacked memory chips, memory regions, memory controllers, other associated logic, etc.

In FIG. 25-6, the RxXBAR_0 may be divided into a number of sub-circuits 25-612. In FIG. 25-6, the RxXBAR_0 sub-circuits may be numbered 0_0, 0_1, 0_2, 0_3, 0_4, 0_5, 0_6, 0_7. In FIG. 25-6, the RxXBAR_1 may be divided into a number of sub-circuits 25-614. In FIG. 25-6, the RxXBAR_1 sub-circuits may be numbered 1_0, 1_1, 1_2, 1_3, 1_4, 1_5, 1_6, 1_7. In FIG. 25-6, there may be four input links connected (directly or indirectly, via logic, etc.) to the inputs of the RxXBAR. In FIG. 25-6, the RxXBAR may have four inputs that may be numbered PHY_00, PHY_01, PHY_02, PHY_03. In FIG. 25-6, there may be four output links connected (directly or indirectly, via logic, etc.) to the outputs of the RxXBAR. In FIG. 25-6, the RxXBAR may have four outputs that may be numbered PHY_10, PHY_11, PHY_12, PHY_13. Of course any number of RxXBAR inputs and outputs may be used.

In FIG. 25-6, the architecture includes an example die layout 25-630 (e.g. floorplan, etc.) for a logic chip containing the RxXBAR and other logic. The die layout of the logic chip in FIG. 25-6 may be implemented in the context of FIG. 25-3 for example. The die layout of the logic chip in FIG. 25-6 may, for example, match the die layout of the stacked memory chip shown in FIG. 15-5 of U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY."

Layout considerations such as power/ground supplies and power distribution noise etc. may restrict and/or otherwise constrain etc. the placement of the IO pads for the high-speed serial links. Thus, for example, in FIG. 25-6 the position of the circuits PHY_00, PHY_01, PHY_02, PHY_03 and PHY_10, PHY_11, PHY_12, PHY_13 may be constrained to the perimeter of the logic chip in the locations shown. Layout considerations for each stacked memory chip and restrictions on the placement and number etc. of TSVs may constrain the placement of sub-circuits 0_0, 0_1, 0_2, 0_3, 0_4, 0_5, 0_6, 0_7 and sub-circuits 1_0, 1_1, 1_2, 1_3, 1_4, 1_5, 1_6, 1_7. In addition since the memory regions may be distributed across each stacked memory chip, in one embodiment it may be preferable (e.g. for performance, etc.) to separate the RxXBAR sub-circuits as shown in the logic chip die layout of FIG. 25-6.

In FIG. 25-6, the connections (e.g. logical connections, wires, buses, groups of signals, etc.) may be as shown (e.g. by lines on the drawing) between sub-circuit 0_0 and TSV array 25-632 (which may provide coupling to the memory regions on one or more stacked memory chips and may correspond, for example, to circuit block 25-620) and between sub-circuit 0_0 and PHY_00, PHY_01, PHY_02, PHY_03. Similar connections may be present (but may not be shown in FIG. 25-6) for all the other sub-circuits (e.g. 0_1 through 0_7 and 1_0 through 1_7).

In FIG. 25-6, the sub-circuits 0_0, 0_1, 0_2, 0_3, 0_4, 0_5, 0_6, 0_7 and sub-circuits 1_0, 1_1, 1_2, 1_3, 1_4, 1_5, 1_6, 1_7 may form horizontal slices of the RxXBAR. Of course, the orientation of the sub-circuits in the logical drawing of FIG. 25-5 may have no logical significance. The choice of sub-circuit shape(s) and/or orientation(s) (e.g. horizontal slice, vertical slice, combination of horizontal slice and vertical slice, mix of horizontal slice and vertical slice, other shapes and/or portion(s), combinations of these, etc.) may optimize the performance of the circuits (e.g. reduce layout parasitic, reduce wiring length, improve maximum operating frequency, reduce coupling parasitic, reduce crosstalk, increase routability, etc.).

FIG. 25-7

FIG. 25-7 shows a portion of a stacked memory package architecture 25-700, in accordance with one embodiment. As an option, the stacked memory package architecture may be implemented in the context of the previous Figures and/or any other Figure(s). Of course, however, the stacked memory package architecture may be implemented in the context of any desired environment.

In FIG. 25-7, the RxXBAR may be implemented in the context of FIG. 25-5, for example. In FIG. 25-7, the RxXBAR may comprise two portions RxXBAR_0 25-750 and RxXBAR_1 25-752. The portions RxXBAR_0 and RxXBAR_1 may be coupled to DRAM and associated logic, as shown and similar to the corresponding components described for example in FIG. 25-5 and the accompanying text. The DRAM and other logic shown in FIG. 25-7 may include (but is not limited to) one or more of the following components: RxARB 25-716, DRAM 25-720 (which may be divided into one or more memory regions, etc.), TSV 25-718 (to connect the command and write data to the DRAM), TSV 25-722 (to connect the read data from the DRAM as well as other miscellaneous control and other DRAM signals, etc.), TxFIFO 25-724, TxARB 25-726. The description and functions of the various blocks, including blocks such as memory controllers etc. that may not be shown explicitly in FIG. 25-7, may be similar to that described in the context of FIG. 25-3 and the accompanying text and references. Note that in FIG. 25-7 the RxXBAR may be a different size from that shown in FIG. 25-4, for example. Of course, the RxXBAR may be of any size and coupled to any number of stacked memory chips, memory regions, memory controllers, other associated logic, etc.

In FIG. 25-7, the RxXBAR_0 may be divided into a number of sub-circuits 25-712. In FIG. 25-7, the RxXBAR_0 sub-circuits may be numbered 0_0, 0_1, 0_2, 0_3, 0_4, 0_5, 0_6, 0_7. In FIG. 25-7, the RxXBAR_1 may be divided into a number of sub-circuits 25-714. In FIG. 25-7, the RxXBAR_1 sub-circuits may be numbered 1_0, 1_1, 1_2, 1_3, 1_4, 1_5, 1_6, 1_7. In FIG. 25-7, there may be four input links connected (directly or indirectly, via logic, etc.) to the inputs of the RxXBAR. In FIG. 25-7, the RxXBAR has four inputs that may be numbered PHY_00, PHY_01, PHY_02, PHY_03. In FIG. 25-7, there may be four output links connected (directly or indirectly, via logic, etc.) to the outputs of the RxXBAR. In FIG. 25-7, the RxXBAR has four outputs that may be numbered PHY_10, PHY_11, PHY_12, PHY_13. Of course, any number of RxXBAR inputs and outputs may be used.

In FIG. 25-7, the architecture includes an example die layout 25-730 (e.g. floorplan, etc.) for a logic chip containing the RxXBAR and other logic. The die layout of the logic chip in FIG. 25-7 may be implemented in the context of FIG. 25-3 for example. The die layout of the logic chip in FIG. 25-7 may, for example, match the die layout of the stacked memory chip shown in FIG. 15-5 of U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY."

Layout considerations such as power/ground supplies and power distribution noise etc. may restrict and/or otherwise constrain etc. the placement of the IO pads for the high-speed serial links. Thus, for example, in FIG. 25-7 the position of the circuits PHY_00, PHY_01, PHY_02, PHY_03 and PHY_10, PHY_11, PHY_12, PHY_13 may be constrained to the perimeter of the logic chip in the locations shown. Layout considerations for each stacked memory chip and restrictions on the placement and number etc. of TSVs may constrain the placement of sub-circuits 0_0, 0_1, 0_2, 0_3, 0_4, 0_5, 0_6, 0_7 and sub-circuits 1_0, 1_1, 1_2, 1_3, 1_4, 1_5, 1_6, 1_7. In addition, since the memory regions may be distributed across each stacked memory chip, in one embodiment it may be preferable (e.g. for performance, etc.) to separate the RxXBAR sub-circuits as shown in the logic chip die layout of FIG. 25-7.

In FIG. 25-7, the connections (e.g. logical connections, wires, buses, groups of signals, etc.) may be as shown (e.g. by lines on the drawing) between sub-circuit 0_0 and TSV array 25-732 (which may provide coupling to the memory regions on one or more stacked memory chips and may correspond, for example, to circuit block 25-720) and between sub-circuit 0_0 and PHY_00, PHY_01, PHY_02, PHY_03. Similar connections may be present (but may not be not shown in FIG. 25-7) for all the other sub-circuits (e.g. 0_1 through 0_7 and 1_0 through 1_7).

In FIG. 25-7, the sub-circuits 0_0, 0_1, 0_2, 0_3, 0_4, 0_5, 0_6, 0_7 and sub-circuits 1_0, 1_1, 1_2, 1_3, 1_4, 1_5, 1_6, 1_7 may form vertical slices of the RxXBAR. Of course, the orientation of the sub-circuits in the logical drawing of FIG. 25-5 may have no logical significance. The choice of sub-circuit shape(s) and/or orientation(s) (e.g. horizontal slice, vertical slice, combination of horizontal slice and vertical slice, mix of horizontal slice and vertical slice, other shapes and/or portion(s), combinations of these, etc.) may optimize the performance of the circuits (e.g. reduce layout parasitic, reduce wiring length, improve maximum operating frequency, reduce coupling parasitic, reduce crosstalk, increase routability, etc.).

In FIG. 25-7, the connections (e.g. wiring, buses, etc.) between sub-circuit 0_0 and TSV array 25-732 may be more optimal in some design metrics (e.g. total net length reduced, etc.) than in FIG. 25-6. In other logic chip die layouts (possibly driven by other stacked memory chip die layouts, etc.) the architecture shown in FIG. 25-6 may provide a more optimal layout for some design metrics. The choice of sub-circuit may then depend on one or more of the following factors (but not limited to the following factors): total wire or bus length, routing complexity, stacked memory chip die layout(s), logic chip die layout(s), timing (e.g. maximum operating frequency, etc.), power, signal integrity (e.g. noise, crosstalk, etc.), combinations of these factors, etc.

FIG. 25-8

FIG. 25-8 shows a stacked memory package architecture 25-800, in accordance with one embodiment. As an option, the stacked memory package architecture may be implemented in the context of the previous Figures and/or any other Figure(s). As an option, the stacked memory package architecture of FIG. 25-8 may be implemented in the context of FIG. 25-3 and/or any other Figure(s). As an option, for example, one or more portions (e.g. circuit blocks, datapath elements, components, logical functions, etc.) of the stacked memory package architecture of FIG. 25-8 may be implemented in the context of FIG. 15 of U.S. Provisional Application No. 61/580,300, filed Dec. 26, 2011, titled "SYSTEM, METHOD, AND COMPUTER PROGRAM PRODUCT FOR IMPROVING MEMORY SYSTEMS." Of course, however, the stacked memory package architecture of FIG. 25-8 may be implemented in the context of any desired environment.

In FIG. 25-8, the logic chip may comprise a number of dedicated circuit blocks and a number of shared circuit blocks. For example, the logic chip may include (but not limited to) one or more of the following circuit blocks: IO pad logic (labeled as Pad in FIG. 25-8); deserializer (labeled as DES in FIG. 25-8), which may be part of the physical (PHY) layer; forwarding information base or routing table etc. (labeled as FIB in FIG. 25-8); receiver crossbar (labeled as RxXBAR in FIG. 25-8), which may be connected to the memory regions via one or more memory controllers, receiver arbitration logic (labeled as RXARB in FIG. 25-8), which may also include memory control logic and other logic associated with the memory regions of the stacked memory chips, the through-silicon via connections (labeled as TSV in FIG. 25-8), which may also include repaired or reconfigured TSV arrays for example, stacked memory chips (labeled as DRAM in FIG. 25-8) and associated memory regions (e.g. banks, echelons, sections, etc.), transmit FIFO (labeled as TxFIFO in FIG. 25-8), which may include other protocol logic to associate memory responses with requests, etc, transmit arbiter (labeled as TxARB in FIG. 25-8), receive/transmit crossbar (labeled as RxTxXBAR in FIG. 25-8), which may be coupled to the high-speed serial links that may connect the stacked memory package to the memory system, for example, serializer (labeled as SER in FIG. 25-8), which may be part of the physical (PHY) layer.

It should be noted that not all circuit elements, circuit components, circuit blocks, logical functions, circuit functions, clocking, buses, etc. may be shown explicitly in FIG. 25-8. For example, connections to the DRAM may (and typically will) comprise separate buses for command and data. For example, one or more memory controllers may be considered part of either/both of the circuit blocks labeled RxXBAR and RxARB in FIG. 25-8. Of course many combinations of circuits, buses, datapath elements, logical blocks, etc. may be used to perform the functions logically diagrammed in the DRAM datapath and other parts (e.g. logical functions, circuit blocks, etc.) of FIG. 25-8. For example, the architecture of the DRAM datapaths and DRAM control paths and their functions etc. may be implemented, for example, in the context shown in FIG. 13 and/or FIG. 15, together with the accompanying text, of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In one embodiment, the functions of the FIB and/or RxXBAR and/or RxTxXBAR may be merged, overlapped, shared, or otherwise combined. For example, FIG. 25-8 shows one embodiment in which the FIB function(s), or portion(s) of the FIB function(s), may be performed by address comparison. In FIG. 25-8, the packet routing functions performed by the FIB (e.g. routing table, routing function, etc.) may be performed, for example, by address comparators 25-802 and 25-804.

For example, in FIG. 25-8, address comparator AC3 may receive (e.g. as an input, etc.) a first address or address field (e.g. from an internal logic chip signal, as an address received by the logic chip in a command and stored on the logic chip, programmed in the logic chip, etc.) and compare the first address field with a second address or address field in a received packet (e.g. read request, write request, other requests and/or responses and/or commands, etc). For example, in FIG. 25-8, address comparator AC3 may receive a request packet containing an address field on (e.g. via, etc.) the link, bus, or other connection means 25-820. If the first address field matches (e.g. truthfully compares to, successfully compares to, meets a defined criteria of comparison, etc.) the second address field, then address comparator AC3 may forward the received packet (e.g. AC3 may forward the received packet signal(s), etc.) to MUX 25-810. In FIG. 25-8, for example, the MUX 25-810 may forward (e.g. drive the signals, pass the signals, etc.) the received packet to the outputs. For example, in FIG. 25-8, the received packet gated by AC3 may be driven to the OLink3 output(s), as shown, on (e.g. via, etc.) the link, bus, or other connection means 25-814. For example, in FIG. 25-8, the OLink3 output(s) may be one of the output links that may connect the stacked memory package to other parts (e.g. one or more CPUs, other stacked memory packages, etc.) of the system and other parts of the memory system. For example, the received packet may be a request from a/the CPU in the system and destined for another stacked memory package. For example, the received packet may be a response from another stacked memory packed destined for a/the CPU in the system, etc. The address matching may be performed by various methods, possibly under programmable control. For example, corresponding to (e.g. working with, appropriate for, etc.) the architecture in FIG. 25-8, received packets may contain a two-bit link address field with possible contents: 00, 01, 10, 11. In FIG. 25-8, for example, the address comparator AC0 may be programmed (e.g. receive as input, be connected to a register or other storage means with fixed or programmable contents, etc.) with link address 00. Similarly, address comparator AC1 may be programmed with link address 01, address comparator AC2 may be programmed with link address 10, address comparator AC3 may be programmed with link address 11. Using the above example, address comparator AC3 may compare the first address (e.g. the programmed link address value of 11, etc.) with the second address, e.g. the link address field in the received packet. If the link address field in the received packet is 11, then the received packet may be driven via MUX to the outputs.

In FIG. 25-8, for example, there may be four link address comparators AC0, AC1, AC2, AC3 that may gate (e.g. select signals, determine the value of driven signals, etc.) signals 25-814 to the outputs. Any number of link address comparators may be used to gate signals to the outputs, depending, for example, on factors such as the number of input links and/or output links.

Of course any length (e.g. number of bits, etc.) of link address field may be used, and the length may depend for example on the number of input links and/or output links. Of course any comparison means or comparison functions may be used. For example, comparison(s) may be made to a range of addresses or ranges of addresses.

In FIG. 25-8, received packets (e.g. requests, commands, etc.) may also be routed to the DRAM (or other memory, etc.) or other destination(s) (e.g. logic chip circuits, logic chip memory, logic chip registers, DRAM registers, other control or storage registers, etc.) in a similar or identical fashion to that described above for packets that may be destined for the stacked memory package outputs. In FIG. 25-8, for example, there may be four memory address comparators AC4, AC5, AC6, AC7 that gate signals 25-816 to the DRAM and other logic. In FIG. 25-8, for example, there may be four address comparators AC4, AC5, AC6, AC7 that gate signals 25-816. Any number of memory address comparators may be used, depending, for example, on factors such as the number memory regions, organization of DRAM and/or memory regions (e.g. number of echelons, etc.).

Of course, any length (e.g. number of bits, etc.) of memory address field may be used, and the length may depend for example on the number, size, type, etc. of stacked memory chips, memory regions, etc.

Of course any comparison means or comparison functions may be used. For example, comparison(s) may be made to a range of addresses or ranges of addresses. For example comparison may be made to high order (e.g. most-significant bits, etc.) of the memory address in a request (e.g. read request, write request, etc.). For example, comparison may be made to a range of memory addresses. For example, comparison may be made to one or more sets of ranges of addresses, etc. For example, special (e.g. pre-programmed, programmable at run-time, fixed by design/protocol/standard, etc.) addresses and/or address field(s) may be used for certain functions (e.g. test commands, register and/or mode programming, status requests, error control, etc.).

In FIG. 25-8, for example, memory address comparator AC4 25-808 may gate requests to addresses in memory region MR0. As shown in FIG. 25-8 for example, memory region MR0 may comprise DRAM and other logic that may consist of four memory controllers and other logic (e.g.

RxARB, TxFIFO, TXARB, etc.). Thus, for example, MR0 may itself comprise of multiple memory regions with addresses and/or address ranges that may or may not be contiguous (e.g. continuous address range, address range without breaks or gaps, etc.).

In one embodiment, the addresses and/or address ranges used for comparison may be virtual. For example, one or more DRAM (e.g. DRAM, DRAM portions, memory chips, memory chip portions, stacked memory chips, stacked memory chip portions, DRAM logic or other memory associated logic, TSV or other connections/buses, etc.) may fail or may be faulty. Thus, possibly as a result, one or more of the memory regions in the stacked memory package may fail and/or may be faulty and/or appear to be faulty, etc. (such failures may occur at any time, e.g. at manufacture, at test, at assembly, at run-time, etc.). In case of such faults or failures and/or apparent faults/failures, etc, the logic chip may act (e.g. autonomously, under system direction, under program control, using microcode, a combination of these, etc.) to repair and/or replace the faulty memory regions. In one embodiment, the logic chip may store (e.g. in NVRAM, in flash memory, in portions of one or more stacked memory chips, combinations of these, etc.) the addresses (or other equivalent database information, links, indexes, pointers, start address and lengths, etc.) of the faulty memory regions. The logic chip may then replace (e.g. assign, re-assign, virtualize, etc.) faulty memory regions with spare memory region(s) and/or other resource(s) (e.g. circuits, connections, buses, TSVs, DRAM, etc.). In this case, the system may be unaware that the address supplied, for example, in a received packet, or the address supplied to perform a comparison etc. is a virtual address. The logic chip may then effectively convert the supplied virtual addresses to the actual addresses of one or more memory regions that may include replaced or repaired etc. memory region(s).

Other operations, functions, algorithms, methods, etc. may be used instead of or in addition to comparison. For example, in one embodiment, a single bit in a received packet may be used (e.g. set, etc.) to indicate whether a received packet is destined for the stacked memory package. For example, a command code, header field, packet format, packet length, etc. in/of a received packet may be used to indicate whether a packet must be forwarded or has reached the intended destination. Of course, any length field or number of fields, etc. may be used.

In one embodiment, such indicators and/or indications may be set by a/the CPU in the system or by the responder (or other originator in the system, etc.). Such indicators and/or indications may be transmitted (e.g. hop-by-hop, forwarded, etc.) through the memory system (e.g. through the network, etc.). For example, the system may (e.g. at start-up, etc.) enumerate (e.g. probe, etc.) the memory system (e.g. stacked memory packages, portions of stacked memory packages, other system components, etc.). Each memory system component (e.g. stacked memory package, portion(s) of stacked memory package(s), CPUs, other components, etc.) may then be assigned a unique identification code (e.g. field, group of bits, binary number, label, marker, tag, etc.). The unique identification or other marker etc. may be sent with a packet. A logic chip in a stacked memory package may thus, for example, make a simple comparison with the identification field assigned to itself, etc.

FIG. 25-9

FIG. 25-9 shows a stacked memory package architecture 25-900, in accordance with one embodiment. As an option, the stacked memory package architecture may be implemented in the context of the previous Figures and/or any other Figure(s). Of course, however, the stacked memory package architecture may be implemented in the context of any desired environment.

In FIG. 25-9, the logic chip may comprise a number of dedicated circuit blocks and a number of shared circuit blocks. For example, the logic chip may include (but not limited to) one or more of the following circuit blocks: IO pad logic (labeled as Pad in FIG. 25-9); deserializer (labeled as DES in FIG. 25-9), which may be part of the physical (PHY) layer; forwarding information base or routing table etc. (labeled as FIB in FIG. 25-9); receiver crossbar (labeled as RxXBAR in FIG. 25-9), which may be connected to the memory regions via one or more memory controllers, receiver arbitration logic (labeled as RXARB in FIG. 25-9), which may also include memory control logic and other logic associated with the memory regions of the stacked memory chips, the through-silicon via connections (labeled as TSV in FIG. 25-9), which may also include repaired or reconfigured TSV arrays for example, stacked memory chips (labeled as DRAM in FIG. 25-9) and associated memory regions (e.g. banks, echelons, sections, etc.), transmit FIFO (labeled as TxFIFO in FIG. 25-9), which may include other protocol logic to associate memory responses with requests, etc, transmit arbiter (labeled as TxARB in FIG. 25-9), receive/transmit crossbar (labeled as RxTxXBAR in FIG. 25-9), which may be coupled to the high-speed serial links that may connect the stacked memory package to the memory system, for example, serializer (labeled as SER in FIG. 25-9), which may be part of the physical (PHY) layer.

It should be noted that not all circuit elements, circuit components, circuit blocks, logical functions, circuit functions, clocking, buses, etc. may be shown explicitly in FIG. 25-9. For example, connections to the DRAM may (and typically will) comprise separate buses for command and data. For example, one or more memory controllers may be considered part of either/both of the circuit blocks labeled RxXBAR and RxARB in FIG. 25-9. Of course many combinations of circuits, buses, datapath elements, logical blocks, etc. may be used to perform the functions logically diagrammed in the DRAM datapath and other parts (e.g. logical functions, circuit blocks, etc.) of FIG. 25-9. For example, the architecture of the DRAM datapaths and DRAM control paths and their functions etc. may be implemented, for example, in the context shown in FIG. 13 and/or FIG. 15, together with the accompanying text, of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In one embodiment, the functions of the FIB and/or DES and/or RxXBAR and/or RxTxXBAR may be merged, overlapped, shared, or otherwise combined. In one embodiment, it may be required to minimize the latency (e.g. delay, routing delay, forwarding delay, etc.) of packets as they may be forwarded through the memory system network that may comprise several stacked memory packages coupled by high-speed serial links, for example. For example, it may be required or desired to minimize the delay between the time a packet that is required (e.g. destined, desired, etc.) to be forwarded (e.g. relayed, etc.) enters (e.g. arrives at the inputs, is received, is input to, etc.) a stacked memory package and the time that the packet exits (e.g. leaves the outputs, is transmitted, is output from, etc.) the stacked memory package. FIG. 25-9 shows one embodiment in which the FIB function(s), or portion(s) of the FIB function(s), for example, may be performed by a field comparison ahead of (e.g. before, preceding, etc.) the deserializer or ahead of a portion of the deserializer. Thus, for example, the latency (e.g. for forwarding packets, etc.) may be reduced. Thus, for example, the power consumption of the stacked memory package and memory system may be reduced (e.g. by eliminating one or more deserialization step(s) and subsequent one or more serialization step(s) of forwarded packets, etc.), etc. In FIG. 25-9, the packet routing functions performed by the FIB (e.g. routing table, routing function, etc.) may be performed, for example, by comparators 25-902.

For example, in FIG. 25-9, comparator FL3 may receive (e.g. as an input, etc.) a first routing field (e.g. from an internal logic chip signal, as a field received by the logic chip in a command and stored on the logic chip, programmed in the logic chip, etc.) and compare the first routing field with a second routing field in a received packet (e.g. read request, write request, other requests and/or responses and/or commands, etc). For example, in FIG. 25-9, comparator FL3 may receive a request packet containing a routing field on (e.g. via, etc.) the link, bus, or other connection means 25-920. If the first routing field matches (e.g. truthfully compares to, successfully compares to, meets a defined criteria of comparison, etc.) the second routing field, then comparator FL3 may forward the received packet (e.g. FL3 may forward the received packet signal(s), etc.) to MUX 25-910. In FIG. 25-9, for example, the MUX 25-910 may forward (e.g. drive the signals, pass the signals, etc.) the received packet to the outputs. For example, in FIG. 25-9, the received packet gated by FL3 may be driven to the OLink3 output(s), as shown, on (e.g. via, etc.) the link, bus, or other connection means 25-914. For example, in FIG. 25-9, the OLink3 output(s) may be one of the output links that may connect the stacked memory package to other parts (e.g. one or more CPUs, other stacked memory packages, etc.) of the system and other parts of the memory system. For example, the received packet may be a request from a/the CPU in the system and destined for another stacked memory package. For example, the received packet may be a response from another stacked memory packed destined for a/the CPU in the system, etc. The routing field matching may be performed by various methods, possibly under programmable control. For example, corresponding to (e.g. working with, appropriate for, etc.) the architecture in FIG. 25-9, received packets may contain a routing field with possible contents: 00, 01, 10, 11. In FIG. 25-9, for example, the comparator FL0 may be programmed (e.g. receive as input, be connected to a register or other storage means with fixed or programmable contents, etc.) with link address 00. Similarly, comparator FL1 may be programmed with 01, comparator FL2 may be programmed with 10, comparator FL3 may be programmed with 11. Using the above example, comparator FL3 may compare the first routing field (e.g. the programmed value of 11, etc.) with the second routing field, e.g. the routing field in the received packet. If the routing field in the received packet is 11, then the received packet may be driven via MUX to the outputs.

In FIG. 25-9, for example, there may be four comparators FL0, FL1, FL2, FL3 that may gate (e.g. select signals, determine the value of driven signals, etc.) signals 25-914 to the outputs. Any number of comparators may be used to gate signals to the outputs, depending, for example, on factors such as the number of input links and/or output links.

Of course, any length (e.g. number of bits, etc.) of routing field may be used, and the length may depend for example on the number of input links and/or output links. Of course any comparison means or comparison functions may be used. For example, comparison(s) may be made to a range (e.g. 1-3, etc.) or to multiple ranges (e.g. 1-3 and 5-7, etc.). Other operations, functions, logical functions, algorithms, methods, etc. may be used instead of or in addition to comparison.

In FIG. 25-9, note that comparators 25-902 may be coupled between (e.g. may be connected between, may be logically located between, etc.) the input PHY (labeled IPHY in FIG. 25-9) and the deserializer 25-924 (labeled DES in FIG. 25-9). In FIG. 25-9, note that comparators 25-902 may drive the output PHY 25-922 (labeled OPHY in FIG. 25-9) directly (e.g. without serialization, etc.). In FIG. 25-9, note that the DRAM and other logic may drive the serializer 25-916 (labeled SER in FIG. 25-9). Other architectures based on FIG. 25-9 may be possible. For example, comparators 25-902 (or other equivalent logic functions or similar logic functions, etc.) may be coupled between portions of the desrializer e.g. some of the deserializer functions or portions of the deserializer and/or associated logical functions and/or operations etc. may be ahead of the comparison or equivalent functions.

As an option, the stacked memory package architecture of FIG. 25-9 may be implemented in the context of the architecture and environment of the previous Figures and/or any subsequent Figure(s). Of course, however, the stacked memory package architecture of FIG. 25-9 may be implemented in the context of any desired environment.

FIG. 25-10A

Figures 10A, 25:
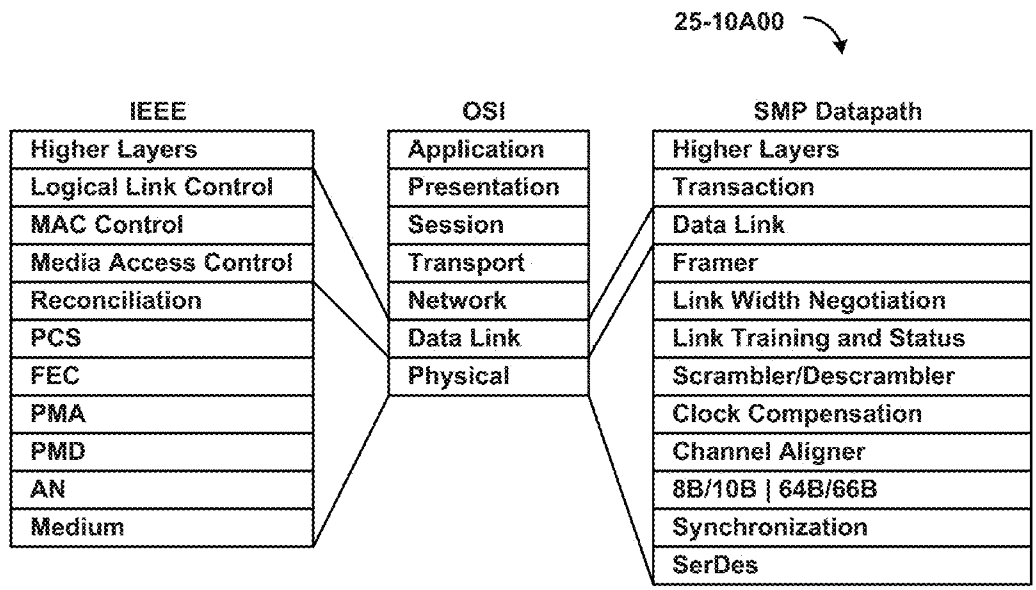

FIG. 25-10A shows a stacked memory package datapath 25-10A00, in accordance with one embodiment. As an option, the stacked memory package datapath may be implemented in the context of the previous Figures and/or any other Figure(s). Of course, however, the stacked memory package datapath may be implemented in the context of any desired environment.

In FIG. 25-10A, the stacked memory package (SMP) datapath may include (but is not limited to) one or more of the following functions, circuit blocks, logical steps, etc: SerDes (serializer/deserializer), synchronization, encoding/decoding (e.g. 8B/10B, 64B/66B, 64B/67B, other DC balance encoding and decoding schemes, etc.), channel aligner, clock compensation, scrambler/descrambler (e.g. scrambler for Tx, descrambler for Rx, etc), link training and status, link width negotiation (and/or lane width, speed, etc. negotiation, etc.), framer, data link (layer(s), e.g. may be multiple blocks, etc.), transaction (layer(s), e.g. may be multiple blocks, etc.), higher layers (e.g. DRAM and other logic, DRAM datapaths, control paths, other logic, etc.). In one embodiment, most or all of the SMP datapath may be contained in one or more logic chips in the stacked memory package.

For example, in FIG. 25-10A, the architecture of the SMP datapath, and/or Rx datapath, and/or Tx datapath, and/or DRAM datapaths, and/or DRAM control paths, and/or the functions contained in the datapaths and/or control paths and/or other logic, etc. may be implemented, for example, in the context shown in FIG. 25-3 of this application and/or FIG. 13 and/or FIG. 15, together with the accompanying text, of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In FIG. 25-10A, the SMP datapath is compared with (e.g. matched to, aligned with, etc.) the International Organization for Standardization (ISO) Open Systems Interconnection (OSI) model and the Institute of Electrical and Electronics Engineers (IEEE) model (e.g. IEEE 802.3 model, etc.). The SMP datapath may include (but is not limited to) one or more of the following OSI functions, layers, or sublayers, etc: application, presentation, session, transport, network, data link, physical. In one embodiment, the logic chip may contain logic in the network, data link, physical OSI layers, for example. The logic chip(s) in a stacked memory package, and thus the SMP datapath, may include (but is not limited to) one or more of the following IEEE functions, layers, or sublayers, etc: logical link control (LLC), MAC control, media access control (MAC), reconciliation, physical coding sublayer (PCS), forward error correction (FEC), physical medium attachment (PMA), physical medium dependent (PMD), auto-negotiation (AN), medium (e.g. cable, copper, optical, twisted-pair, CAT-5, other, etc.). Not all of the IEEE model elements may be relevant to (e.g. present in, used by, correspond to, etc.) the SMP datapath. For example, auto-negotiation (AN) may not be present in all implementations of the SMP datapath. For example, the IEEE model elements present in the SMP datapath may depend on the type of input(s) and/or output(s) that the SMP may use (e.g. optical, 10Gbit Ethernet, SPI, PCIe, etc.). In one embodiment, the logic chip(s) in a stacked memory package, and thus the SMP datapath, may contain logic in all of the IEEE layers shown in FIG. 25-10A, for example. In one embodiment, a first type of logic chip (e.g. CMOS logic chip, etc.) may perform functions from the LLC to PMA layers and a second type of logic chip (e.g. mixed-signal chip, etc.) may perform the PMD layer (e.g. short-haul optical interconnect, multi-mode fiber PHY, etc.).

FIG. 25-10B

Figures 10B, 25:
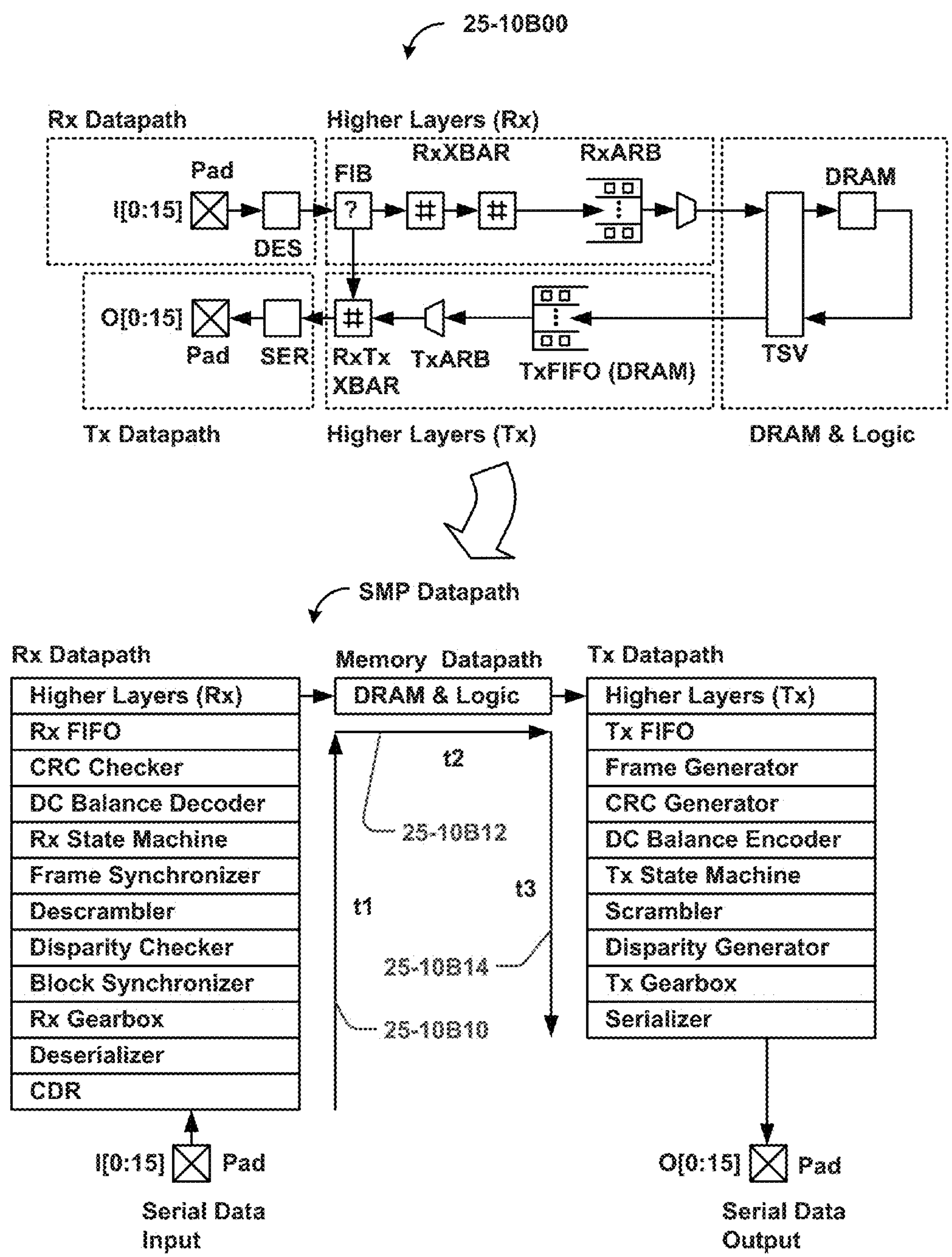

FIG. 25-10B shows a stacked memory package architecture 25-10B00, in accordance with one embodiment. As an option, the stacked memory package architecture may be implemented in the context of the previous Figures and/or any other Figure(s). Of course, however, the stacked memory package architecture may be implemented in the context of any desired environment.

The circuits, components, functions, etc. shown in FIG. 25-10B may function in a manner similar to that described in the context of similar circuits and components in FIG. 25-3, for example.

For example, in FIG. 25-10B, the architecture of the SMP datapath, and/or Rx datapath, and/or Tx datapath, and/or memory datapath, and/or higher layers (Rx), and/or higher layers (Tx), and/or DRAM datapaths, and/or DRAM control paths, and/or the functions contained in the datapaths and/or control paths and/or other logic, etc. may be implemented, for example, in the context shown in FIG. 25-3 of this application and/or FIG. 13 and/or FIG. 15, together with the accompanying text, of US Provisional Application NO. 61/580,300, filed Dec. 26, 2011, titled "SYSTEM, METHOD, AND COMPUTER PROGRAM PRODUCT FOR IMPROVING MEMORY SYSTEMS."

In FIG. 25-10B, the stacked memory package (SMP) Rx datapath may include (but is not limited to) one or more of the following functions, circuit blocks, logical steps, etc: Rx FIFO, CRC checker, DC balance decoder, Rx state machine, frame synchronizer, descrambler, disparity checker, block synchronizer, Rx gearbox, deserializer (e.g. DES, SerDes, etc.), clock and data recovery (CDR), etc.

In FIG. 25-10B, the stacked memory package (SMP) Tx datapath may include (but is not limited to) one or more of the following functions, circuit blocks, logical steps, etc: Tx FIFO (which may be distinct, separate, etc. from the TxFIFO (DRAM) that may be present in the higher layers, as shown in FIG. 25-10B, for example), frame generator, CRC generator, DC balance encoder, Tx state machine, scrambler, disparity generator, Tx gearbox, serializer (e.g. SER, SerDes, etc.), etc.

In FIG. 25-10B, not all the elements (e.g. components, circuits, blocks, etc) in the Rx datapath and/or Tx datapath may be shown explicitly. For example, certain embodiments of stacked memory package may use physical medium or physical media (e.g. optical, copper, wireless, and/or combinations of these and other coupling means, etc.) that may require additional elements, functions, etc. Thus, for example, there may be additional circuits, circuit blocks, functions, operations, etc. for certain embodiments (e.g. protocol functions; wireless functions; optical functions; protocol conversion or other protocol manipulation functions; additional physical layer and/or data links layer functions; additional LLC, MAC, PCS, FEC, PMA, PMD functions; combinations of these; etc).

In FIG. 25-10B, not all the elements (e.g. components, circuits, blocks, etc) in the Rx datapath and/or Tx datapath may be used in all embodiments. For example, not all embodiments may use a disparity function, etc.

In FIG. 25-10B, not all the elements (e.g. components, circuits, blocks, etc) in the Rx datapath and/or Tx datapath may be exactly as shown. As one example, the position (e.g. logical connection, coupling to other blocks, etc.) of the Tx state machine and/or Rx state machine may not be exactly as shown in FIG. 25-10B in all embodiments. For example, the Tx state machine and/or Rx state machine may receive inputs to more than one block and provide outputs to more than one block, etc.

In FIG. 25-10B, not all the elements (e.g. components, circuits, blocks, etc) in the Rx datapath and/or Tx datapath may be connected exactly as shown in all embodiments. For example, one or more of the logical functions, etc. shown in the Rx datapath and/or Tx datapath in FIG. 25-10B may be performed in a parallel (or nearly parallel, etc.) fashion or manner.

In FIG. 25-10B, the elements (e.g. components, circuits, blocks, etc) used in the Rx datapath and/or Tx datapath and/or their functions etc. may depend on the protocol and/or standard (if any) used for the high-speed serial links or other IO coupling means used by the stacked memory package (e.g. SPI, Ethernet, RapidIO, HyperTransport, PICe, Interlaken, etc.).

In FIG. 25-10B, some of the elements (e.g. components, circuits, blocks, etc) in the Rx datapath and/or Tx datapath may be implemented (e.g. used, instantiated, function, etc.) on a per lane basis and some elements may be common to all lanes. For example, the Rx state machine is a common block, etc. For example, one or more of the following may be used on a per lane basis: Rx gearbox, Tx gearbox, CRC checker, CRC generator, scrambler, descrambler, etc.

In FIG. 25-10B, the Rx FIFO in the Rx datapath may perform clock compensation (e.g. in 10GBASE deleting idles or ordered sets and inserting idles, in PCIe compensating for differences between the upstream transmitter and local receiver, or other compensation in other protocols, etc.). In FIG. 25-10B, the Rx FIFO may provide FIFO empty and FIFO full signals to the higher layers (Rx). In some embodiments, the Rx FIFO may use separate FIFO read and FIFO write clocks, and the Rx FIFO may compensate for differences in these clocks. In some embodiments, the Rx FIFO input bus width may be different from the output bus width (e.g. input bus width may be 32 bits, output bus width may be 64 bits, etc.).

In FIG. 25-10B, the CRC checker may calculate a cyclic redundancy check (CRC) using the received data and compares the result to the CRC value (e.g. in the received packet, in a diagnostic word, etc). In some embodiments, the CRC checker may perform additional functions. For example, in Interlaken-based protocols, the CRC-32 checker may also output the lane status message (at bit 33) and link status message (at bit 32) of the diagnostic word. The CRC checker may output a CRC error signal that may be sent to the higher layers (Rx). The CRC checker may use a standard polynomial (e.g. CRC-32, etc.) or non-standard polynomial. The CRC checker may use a fixed or programmable polynomial. Of course, any error protection, error correction, error detection, etc. scheme or schemes (e.g. CRC, other error checking code, hash, etc.) may be used. Such schemes may be fixed, programmable, configurable, etc.

In FIG. 25-10B, the DC balance decoder may implement (e.g. perform, calculate, etc.) 64B/66B decoding, for example (e.g. as specified in Clause 49 of the IEEE802.3-2008 specification, etc.). Of course any standard decoding scheme (e.g. 8B/10B, 64B/67B, etc.) or non-standard decoding scheme, etc. may be used. Such decoding schemes may be fixed, programmable, configurable, etc.

In FIG. 25-10B, the Rx state machine may perform control functions in the Rx logic (e.g. PCS layer, PCS blocks, etc.) to implement link synchronization (e.g. PCIe, etc.) and/or control functions for the Rx datapath logic in general (e.g. monitoring bit-error rate (BER), handling of error conditions, etc.). Error conditions that may be handled by the Rx state machine may include (but are not limited to) one or more of the following: loss of word boundary synchronization, invalid scrambler state, lane alignment failure, CRC error, flow control error, unknown control word, illegal codeword, etc. The Rx state machine may be programmable (e.g. using microcode, etc.).

In FIG. 25-10B, the frame synchronizer may perform frame lock functions (e.g. in Interlaken-based protocols, etc.). For example, the frame synchronizer may implement (e.g. perform, etc.) frame lock by searching for four synchronization control words in four consecutive Interlaken metaframes. After frame synchronization is achieved, the frame synchronizer may monitor the scrambler word in the received metaframes and may signal frame lock loss after three consecutive mismatches or four invalid synchronization words. After frame lock loss, the synchronization algorithm and process may be re-started. The frame synchronizer may signal frame lock status to the higher layers (Rx).

In FIG. 25-10B, the descrambler may operate in one or more modes (e.g. frame synchronous mode for Interlaken-based protocols, self-synchronous mode for IEEE 802.3 protocols, etc.). For example, in frame synchronous mode, the descrambler may uses the scrambler seed from the received scrambler state word once block synchronization is achieved. The descrambler may forward the current descrambler state to the frame synchronizer. For example, in self-synchronous mode the scrambler state may be a function of the received data stream and the scrambler state may be recovered after the number of bits equal to the length of the scrambler (e.g. 58 bits, etc.) are received.

In FIG. 25-10B, the disparity checker may be implemented for some protocols (e.g. Interlaken-based protocols, etc.). For example, in Interlaken-based protocols, the disparity checker may check the framing bit in bit position 66 of the word that may enable the disparity checker to identify whether bits for that word are inverted. Other similar algorithms and/or checked schemes may be used. Such algorithms may be fixed, programmable, configurable, etc.

In FIG. 25-10B, the block synchronizer may initiate and maintain a word boundary lock. The block synchronizer may implement, for example, the flow diagram shown in FIG. 13 of Interlaken Protocol Definition v1.2. For example, using an Interlaken-based protocol, the block synchronizer may search for valid synchronization header bits within the serial data stream. A word boundary lock may be achieved after 64 consecutive legal synchronization patterns are found. After a word boundary lock is achieved, the block synchronizer may monitor and flag invalid synchronization header bits. If 16 or more invalid synchronization header bits are found within 64 consecutive word boundaries, the block synchronizer may signal loss of lock. After word boundary lock loss, the synchronization algorithm and process may be re-started. The block synchronizer may signal word boundary lock status to the higher layers (Rx). The synchronizer and/or synchronization algorithms, schemes, etc. may be programmable, configurable, etc.

In FIG. 25-10B, the Rx gearbox may interface the PMA and PMD/PCS blocks.

In FIG. 25-10B, the deserializer (e.g. DES, SerDes, etc.) may receive serial input data from a buffer in the CDR block using the recovered serial clock (e.g. high-speed clock, etc.) and convert, for example, 8 bits at a time (e.g. using the parallel recovered clock, low-speed clock, etc.) to a parallel bus forwarded to the PCS blocks (e.g. Rx gearbox and above, etc.). The deserializer may deserialize a fixed number, a programmable number, or variable number of bits (e.g. 8, 10, 16, 20, 32, 40, 128, etc.). The deserializer and deserializer functions may be fixed, programmable, configurable, etc.

In FIG. 25-10B, the clock and data recovery (CDR) may recover the clock from the input (e.g. received, etc.) serial data. The CDR outputs may include the serial recovered clock (e.g. high-speed, etc.) and the parallel recovered clock (e.g. low-speed, etc.) that may be used to clock (e.g. as clock inputs for, etc.) one or more receiver blocks (e.g. PMA and PCS blocks, etc.). The CDR or equivalent function(s) may be fixed, programmable, configurable, etc.

In FIG. 25-10B, the Tx FIFO in the Tx datapath may implement an interface between the higher layers (Tx) and the transmitter datapath blocks (e.g. PCS layer blocks, etc.). In some embodiments, the Tx FIFO may use separate FIFO read and FIFO write clocks, and the Tx FIFO may compensate for differences in these clocks. In some embodiments, the Tx FIFO input bus width may be different from the output bus width (e.g. input bus width may be 64 bits, output bus width may be 32 bits, etc.). The Tx FIFO or equivalent function(s) may be fixed, programmable, configurable, etc.

In FIG. 25-10B, the frame generator (e.g. framer, etc.) may perform one or more functions to map the transmit data stream to one or more frames. For example, in Interlaken-based protocols, the frame generator may map the transmit data stream to metaframes. The metaframe length may be programmable from 5 to a maximum value of 8191, 8-byte (64-bit) words. The frame generator may generate the required skip words with every metaframe following the scrambler state word in order to perform clock rate compensation. The frame generator may generate additional skip words based on the Tx FIFO state (e.g. capacity, etc.). The frame synchronizer may forward the skip words it receives in order other blocks may maintain multi-lane deskew alignment. The frame generator, framer, etc. and/or frame generation algorithms, schemes, etc. may be programmable, configurable, etc.

In FIG. 25-10B, the CRC generator may calculate (e.g. generate, output, etc.) a cyclic redundancy check (CRC) using the transmit data. The data fields, range of data, data words, block size, etc. of the transmit data used to calculate the CRC may be fixed or programmable. The polynomial used to calculate the CRC may be standard (e.g. CRC-32, etc.) or non-standard. For example, the CRC-32 generator may calculate the CRC for a metaframe. In some cases the CRC may be inserted in a special word. For example, the CRC may be added to the diagnostic word of a metaframe in an Interlaken-based protocol. The CRC generator, other error code generators, etc. and/or error code generation algorithms, schemes, etc. may be programmable, configurable, etc.

In FIG. 25-10B, the DC balance encoder may be, for example, a standard (e.g. IEEE standard, ISO standard, etc.) 64B/66B encoder that may receive a 64-bit data input stream from the Tx FIFO and may output a 66-bit encoded data output stream. The 66-bit encoded data output stream may contain two overhead synchronization header bits (e.g. preambles, etc.) that the receiver PCS blocks may use (e.g. for block synchronization, bit-error rate (BER) monitoring, etc.). The 64B/66B encoding may also perform one or more other functions (e.g. create sufficient edge transitions in the serial data stream for the Rx clock data recovery (CDR) circuit block to maintain lock (e.g. achieve clock recovery, maintain phase lock, etc.) on the input serial data, reduce noise (e.g. EMI, etc.), delineate (e.g. mark, etc.) word boundaries, etc.). Other encoding schemes (standard, non-standard, etc.) may also be used by the DC balance encoder. Such encoding schemes may be programmable and/or configurable.

In FIG. 25-10B, the Tx state machine may perform control functions in the Tx logic (e.g. PCS layer, PCS blocks, etc.) and/or control functions for the Tx datapath logic in general (e.g. handling of error conditions, etc.). The Tx state machine may be programmable (e.g. using micro-code, etc.).

In FIG. 25-10B, the scrambler may function to reduce noise (e.g. EMI, etc.) by reducing (e.g. eliminating, shortening, etc.) long sequences of zeros or ones and other of data pattern repetition in the data stream. The scrambler may operate in one or more modes (e.g. frame synchronous mode for Interlaken-based protocols, self-synchronous mode for IEEE 802.3 protocols, etc.). The scrambler may use a fixed or programmable polynomial (e.g.) x^58+x^39+1 for Interlaken-based protocols, etc.). The scrambler, and/or other equivalent function(s), etc. and/or scrambling algorithms, schemes, etc. may be programmable, configurable, etc.

In FIG. 25-10B, the disparity generator may be implemented for some protocols (e.g. Interlaken-based protocols, etc.). For example, in Interlaken-based protocols, the disparity generator may invert the sense of bits in each transmitted word to maintain a running disparity within a fixed bound (e.g. ±96 bit for Interlaken-based protocols, etc.). The disparity generator outputs a framing bit in bit position 66 of the word that may enable the disparity checker to identify whether bits for that word are inverted. The disparity generator, and/or other equivalent function(s), etc. and/or disparity algorithms, schemes, etc. may be programmable, configurable, etc.

In FIG. 25-10B, the Tx gearbox may interface the PMA and PMD/PCS blocks.

In FIG. 25-10B, the serializer may convert the input low-speed parallel transmit data stream from the Tx dapath logic (e.g. PCS layer, etc.) to high-speed serial data output. The serializer may send the high-speed serial data output to the IO transmitter buffer (not shown in FIG. 25-10B). The serializer may support a fixed, a programmable number, or a variable serialization factor (e.g. 8, 10, 16, 20, 32, 40, 128, etc.). In some embodiments, the serializer may be programmed to send LSB first or MSB first. In some embodiments, the serializer may be programmed to perform polarity inversion (e.g. allowing differential signals on a link to be swapped, etc.). In some embodiments, the serializer may be programmed to perform bit reversal (e.g. MSB to LSB, 8-bit swizzle, etc.). The serializer and serializer functions may be fixed, programmable, configurable, etc. and may be linked (e.g. matched with, complement, invert, etc.) the deserializer and deserializer functions.

In FIG. 25-10B, the Rx datapath latency 25-10B10 (e.g. time delay, packet delay, etc.) may be t1 (e.g. delay of all blocks in the signal path from the input pads to the Rx FIFO output). In FIG. 25-10B, the DRAM and other logic latency 25-10B12 may be t2 (e.g. delay of all blocks in the signal path from the Rx FIFO output to the Tx FIFO input). In FIG. 25-10B, the Tx datapath latency 25-10B14 may be t3 (e.g. delay of all blocks in the signal path from the Tx FIFO input to the output pads).

In FIG. 25-10B, the architecture of the Rx datapath and/or Tx datapath may conform to (e.g. adhere to, follow, obey, etc.) standard high-speed models (e.g. OSI model, IEEE model, etc.). For example, the architecture of the Rx datapath and Tx datapath may follow the models shown in the context of FIG. 25-10A for example. Thus, embodiments that may be based on the architecture of FIG. 25-10B, for example, may be implemented (e.g. utilize, employ, etc.) standard solutions (e.g. off-the-shelf libraries, standard IP blocks, third-party IP, standard macros, library functions, circuit block generators, etc.) for implementations (e.g. ASIC, FPGA, custom IC, other integrated circuit(s), combinations of these, etc.) of one or more logic chips in the stacked memory package, etc.

FIG. 25-10C

Figures 10C, 25:
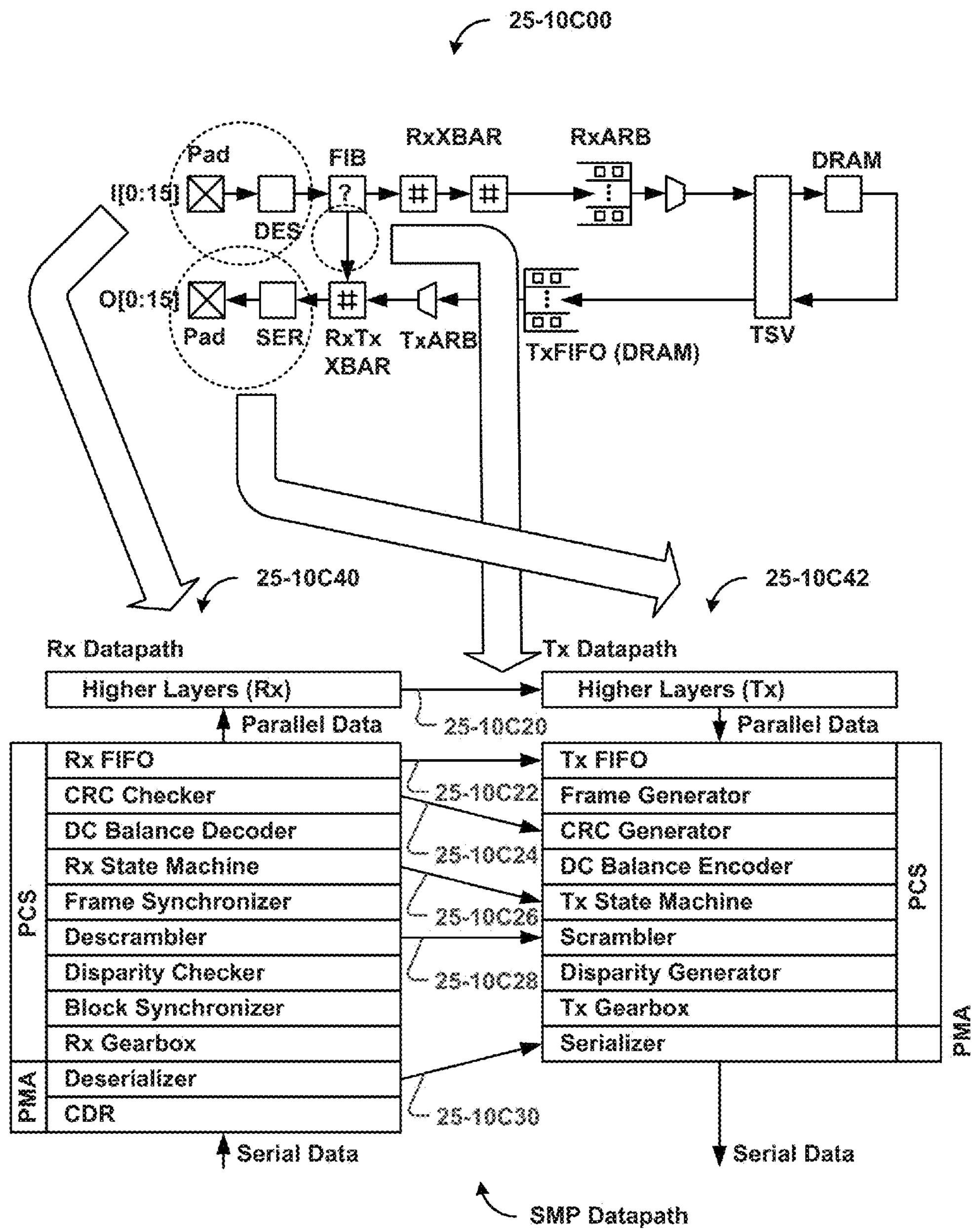

FIG. 25-10C shows a stacked memory package architecture 25-10C00, in accordance with one embodiment. As an option, the stacked memory package architecture may be implemented in the context of the previous Figures and/or any other Figure(s). Of course, however, the stacked memory package architecture may be implemented in the context of any desired environment.

The circuits, components, functions, etc. shown in FIG. 25-10C may function in a manner similar to that described in the context of similar circuits and components in FIG. 25-3 and/or FIG. 25-10B, for example.

For example, in FIG. 25-10C, the architecture of the SMP datapath 25-10C00, and/or Rx datapath 25-10C40, and/or Tx datapath 25-10C42, and/or higher layers (Rx), and/or higher layers (Tx), and/or DRAM datapaths, and/or DRAM control paths, and/or the functions contained in the datapaths and/or control paths and/or other logic, etc. may be implemented, for example, in the context shown in FIG. 25-3 of this application and/or FIG. 13 and/or FIG. 15, together with the accompanying text, of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In FIG. 25-10C, the function of the FIB block may be to route (e.g. forward, etc.) packets (e.g. requests, responses, etc.) that are not destined for the stacked memory package to the output circuits. In a memory system it may be critical to reduce the latency of the memory system response. Thus, it may be desired, for example, to reduce the latency required for a stacked memory package to forward a packet not destined for itself. Thus, it may be desired, for example, to minimize the latency (e.g. signal delay, timing delay, etc.) of the logical path in FIG. 25-10C from the input pads (labeled I[0:15] in FIG. 25-10C), through the deserializer (labeled DES in FIG. 25-10C), through the forwarding information base or routing table (labeled FIB in FIG. 25-10C), through the RxTx crossbar (labeled RxTxXBAR in FIG. 25-10C), through the serializer (labeled SER in FIG. 25-10C), to the output pads (labeled O[0:15] in FIG. 25-10C).

In FIG. 25-10C, the packet forwarding latency may typically comprise the following components: (1) the Rx datapath latency (measured from input pad to Rx FIFO output); (2) the latency (e.g. delay) of the logic path or portion of the logic path 25-10C20 that may implement the FIB and RxTxXBAR function(s) (e.g. possibly as part of the higher layers (Rx) and/or higher layers (Tx) blocks shown in FIG. 25-10C; (3) the Tx datapath latency (measured from the input of the TX FIFO to the output pads).

In one embodiment, the packet forwarding latency may be reduced by introducing one or more paths between the Rx datapath and Tx datapath. These paths may be fast paths, short circuits, short cuts, bypasses, cut throughs, etc.

For example, in one embodiment a fast path 25-10C22 may be implemented between the Rx FIFO and Tx FIFO. The fast path logic may detect a packet that is destined to be forwarded (as described in the context of FIG. 8 and/or FIG. 9, for example) and inject the packet data into the Tx datapath. The fast path logic may also match clock domains between the Rx datapath and Tx datapath.

For example, in one embodiment a fast path 25-10C24 may be implemented between the CRC checker and the CRC generator. The fast path logic may also match clock domains between the Rx datapath and Tx datapath.

In one embodiment a fast path 25-10C26 may be implemented between the Rx state machine and Tx state machine. The fast path logic may also match clock domains between the Rx datapath and Tx datapath.

In one embodiment a fast path 25-10C24 may be implemented between the descrambler and scrambler. The fast path logic may also match clock domains between the Rx datapath and Tx datapath.

In one embodiment a fast path 25-10C24 may be implemented between the deserializer and serializer. The fast path logic may also match clock domains between the Rx datapath and Tx datapath.

The implementation of a fast path may depend on the latency required. For example, the latencies of the various circuit blocks, functions, etc. in the Rx datapath and Tx datapath may be measured (e.g. at design time, etc.) and the optimum location of one or more fast paths may be decided based on trade-offs such as (but not limited to): die area, power, complexity, testing, yield, cost, etc.

The implementation of a fast path may depend on the protocol used. For example, the use of a standard protocol (e.g. SPI, HyperTransport, PCIe, QPI, Interlaken, etc.) or a non-standard protocol based on a standard protocol, etc. may impose limitations (e.g. restrictions, boundary conditions, requirements, etc.) on the location of the fast path and/or logic required to implement the fast path. For example, some of the fast paths may bypass the CRC checker and CRC generator. Both CRC checker and CRC generator may be bypassed if the CRC is calculated over the packet to be forwarded. For example, packets may be fixed in length and a multiple of the CRC payload. For example, packets may be padded to a multiple of the CRC payload, etc. For example, if the CRC generator function in the Tx datapath cannot be bypassed, the CRC generator in the Tx datapath may still be bypassed, for example, by implementing a separate (e.g. second, possibly faster) CRC generator circuit block dedicated to the fast path and to forwarded packets.

Of course, other fast paths may be implemented in a similar fashion.

Of course, more than one fast path may be implemented. In one embodiment, for example, one or more fast paths may be enabled (e.g. selected, etc.) under programmable control.

FIG. 25-10D

Figures 10D, 25:
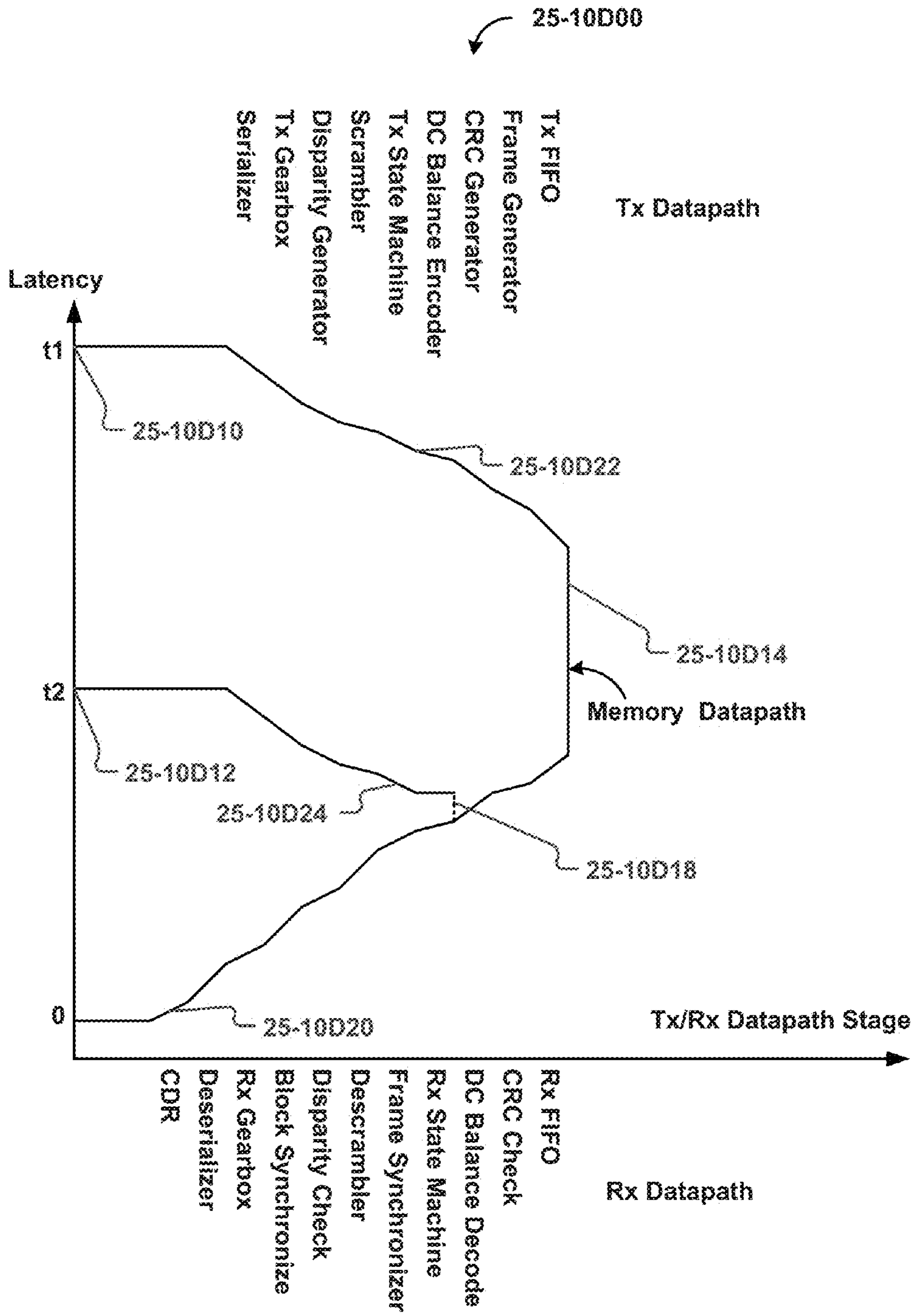
Figures 11, 25:
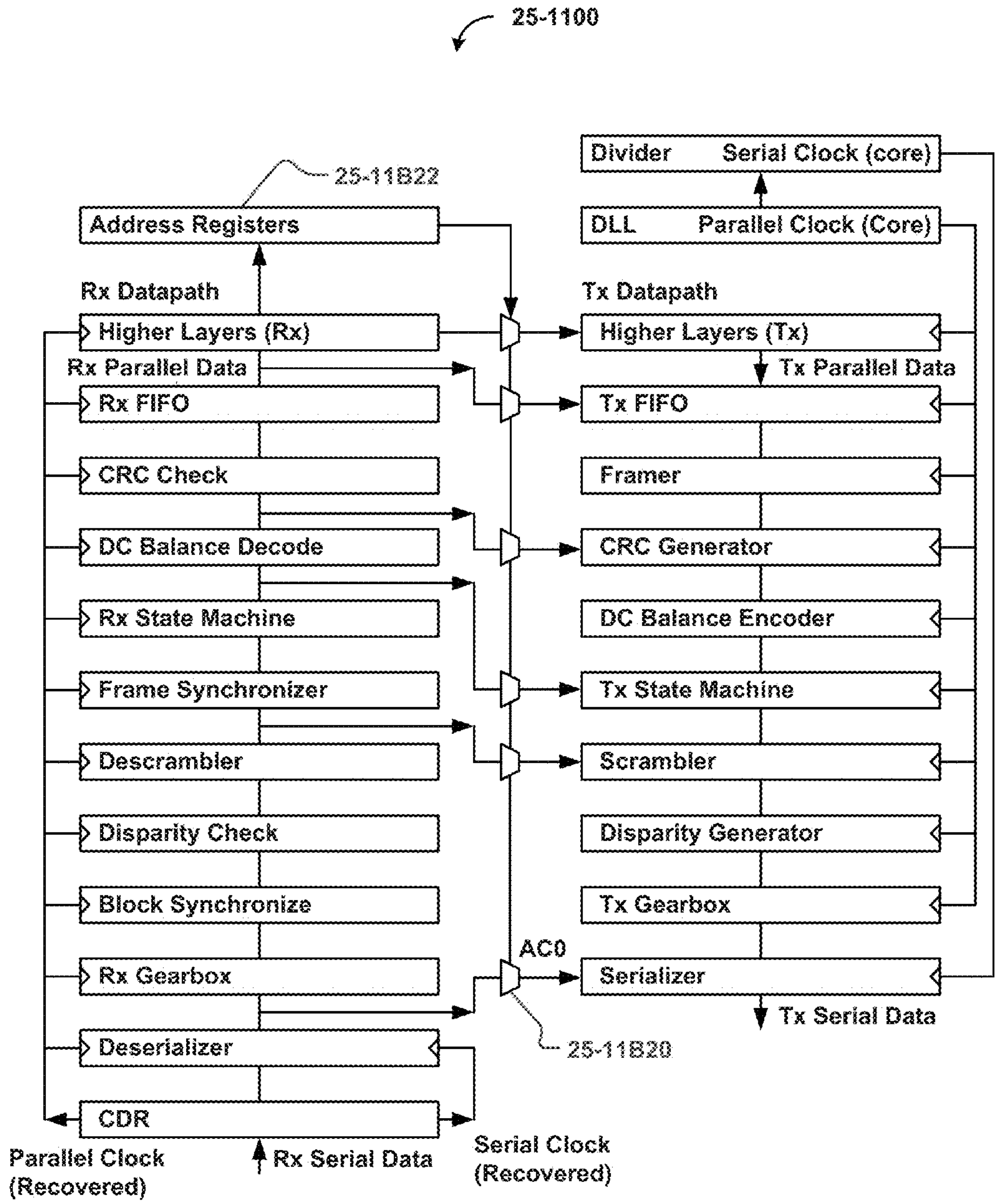
Figures 12, 25:
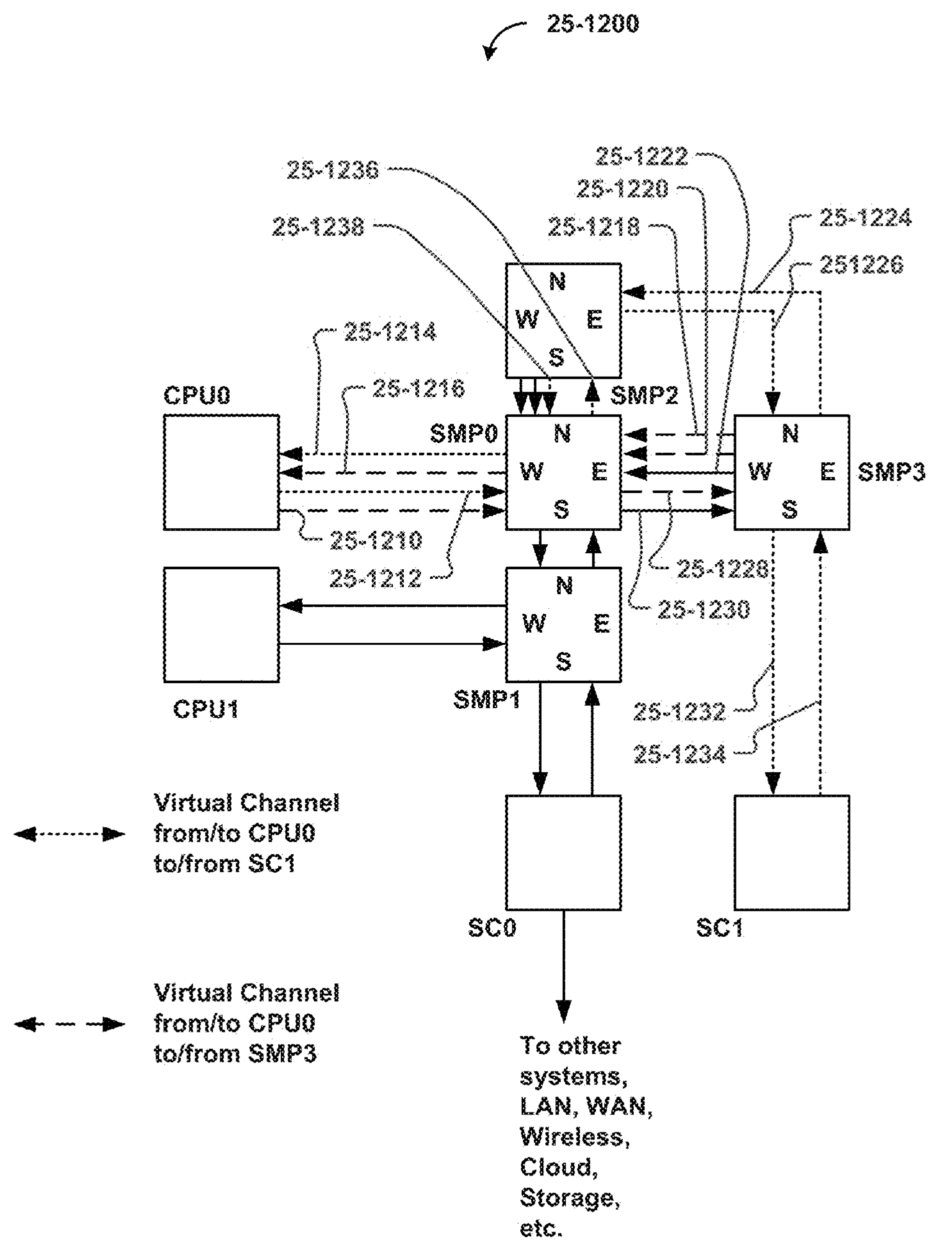
Figures 13, 25:
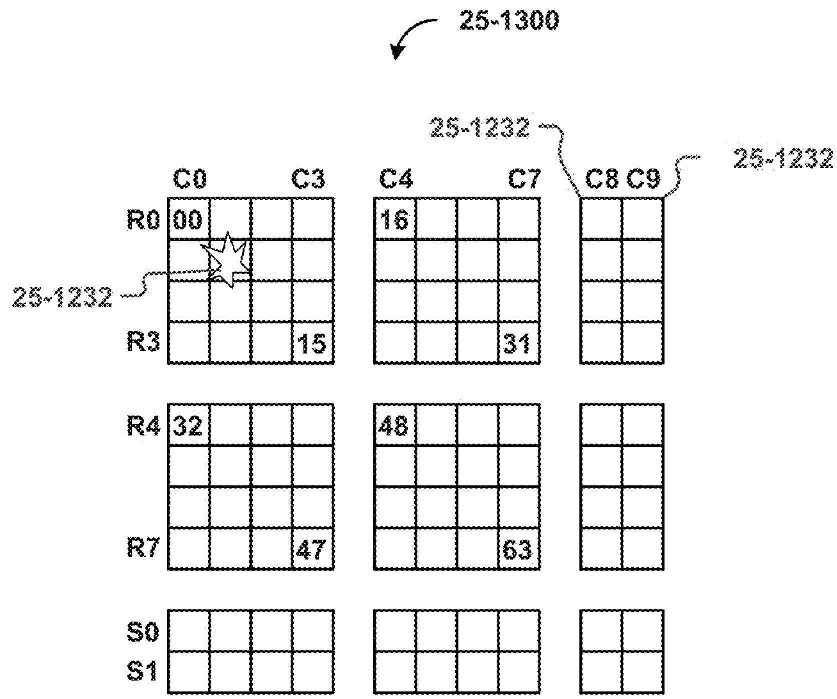
Figures 14, 25:
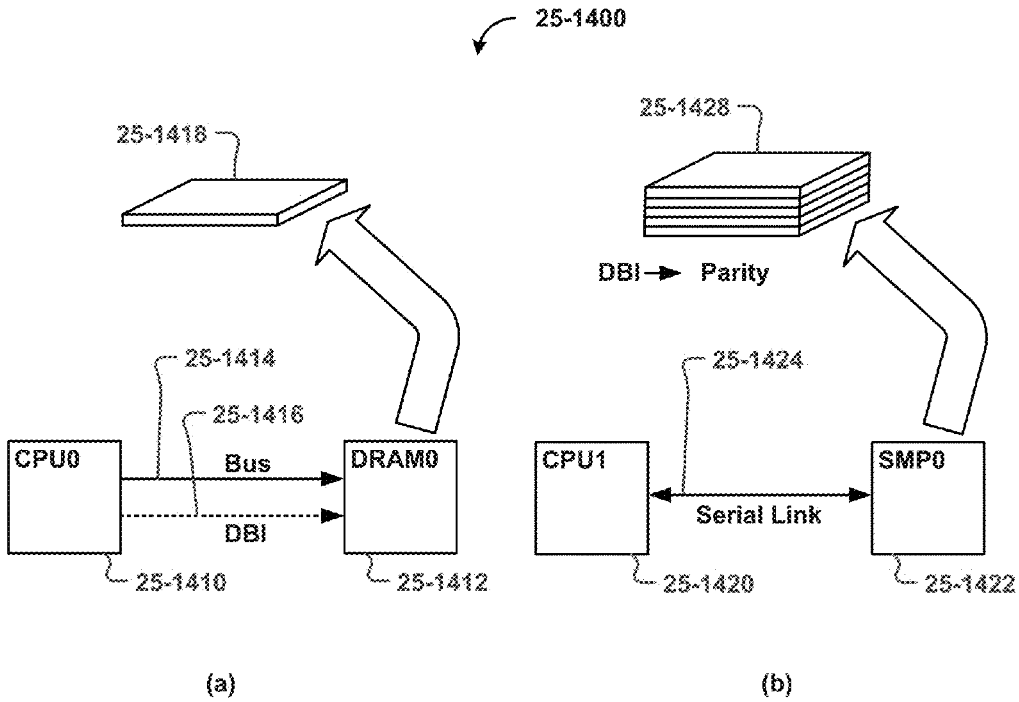
Figures 15, 25:
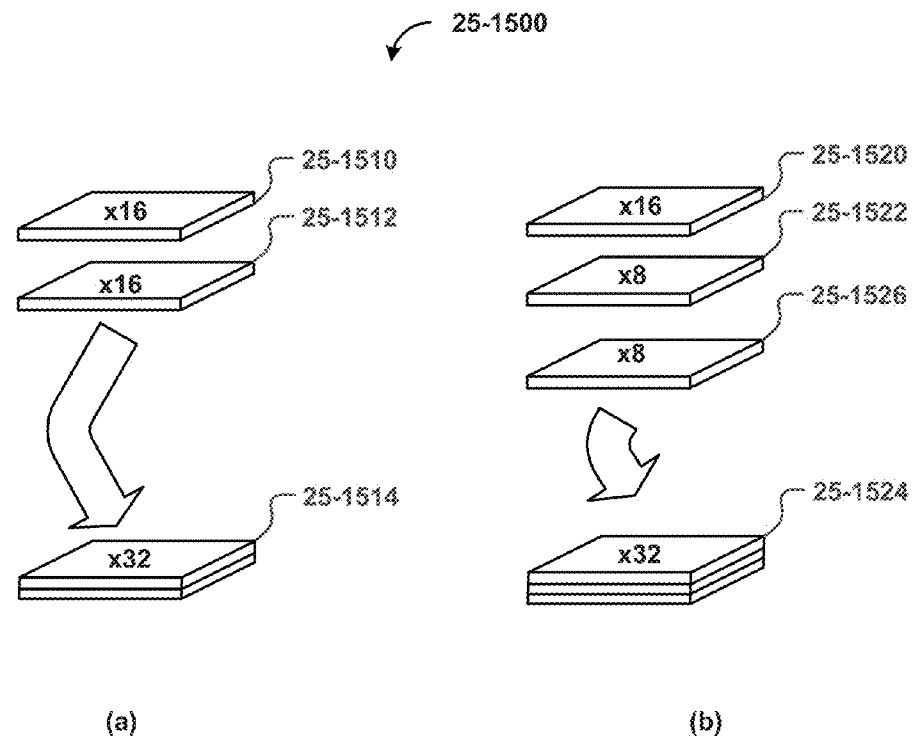
Figures 16, 25:
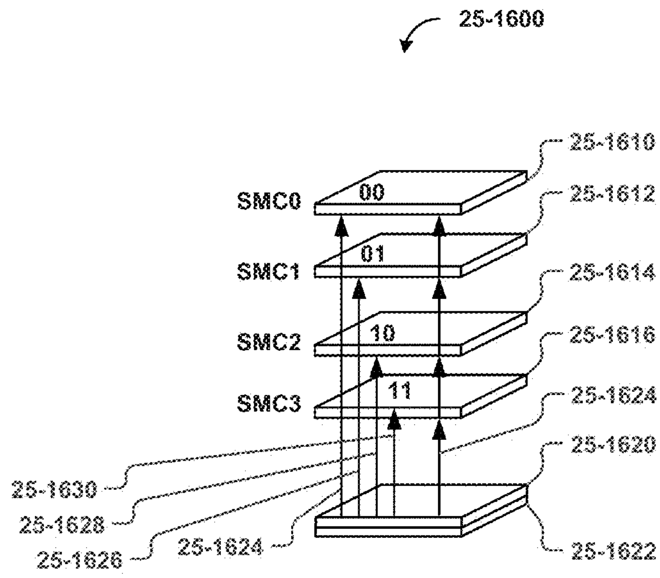
Figures 17, 25:
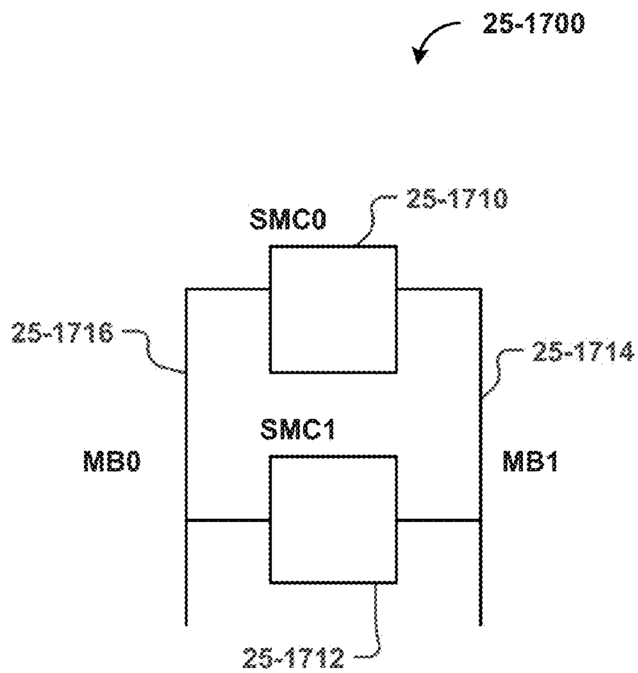
Figures 18, 25:
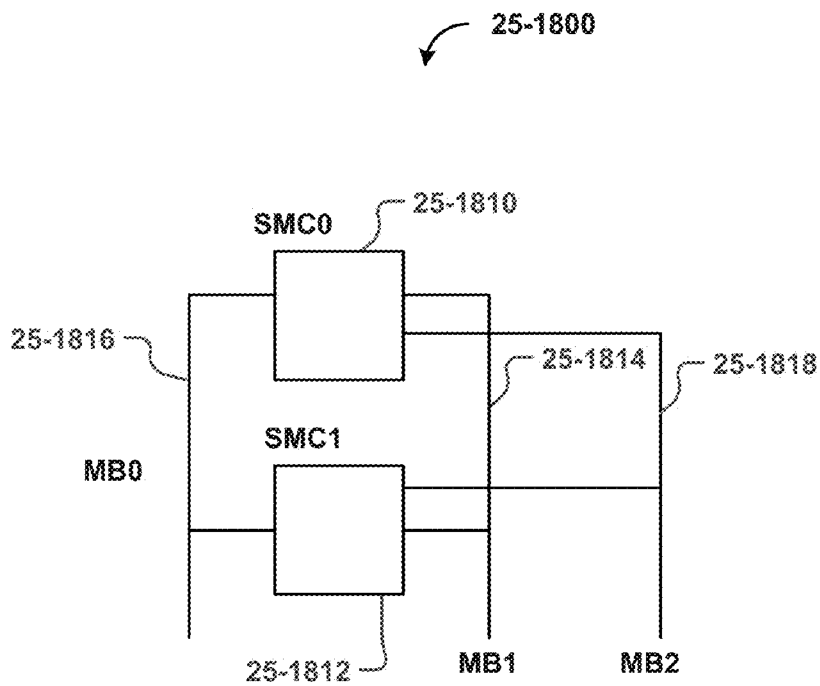

FIG. 25-10D shows a latency chart for a stacked memory package 25-10D00, in accordance with one embodiment. As an option, the latency chart for a stacked memory package may be implemented in the context of the previous Figures and/or any other Figure(s). Of course, however, the latency chart for a stacked memory package may be implemented in the context of any desired environment.

The chart of FIG. 25-10D may apply, for example, in the context of the stacked memory package architecture of FIG. 25-10C. The chart or graph shows the cumulative latency (e.g. timing delay, etc.) of packets, packet signals, etc. as a function of the circuit block position. For example the total latency of a stacked memory package from input pad to output pad may be t1, as shown in FIG. 25-10D by label 25-10D10. The latency t1 may be the sum of three parts: (1) the latency of the Rx datapath (as shown by curve portion or path 25-10D20); (2) the latency of the memory datapath (as shown by straight line 25-10D14); (3) the latency of the Tx datapath (as shown by curve portion or path 25-10D22). The latency properties of a fast path may be easily discerned from such a chart. For example, the latency of fast path 25-10C26 in FIG. 25-10C may be t2, as shown in FIG. 25-10D by label 25-10D12. The latency t2 may be the sum of the following parts: (1) the latency of a portion of the Rx datapath from input pad (e.g. including CDR) up to and including the Rx state machine (as shown by a part of curve portion or path 25-10D20); (2) the latency of any fast path logic e.g. timing adjustment between clock domains, etc. as shown by the dashed line 25-10D18); (3) the latency of a portion of the Tx datapath from the input of the Tx state machine to output pad (e.g. including serializer) and as shown by curve portion or path 25-10D24.

Use of charts such as that shown in FIG. 25-10D00 may allow the design of the SMP datapath and fast paths. In particular the use of such charts may allow the design of fast paths that may eliminate circuit blocks that have large latency (e.g. the Rx FIFO in the Rx datapath and/or Tx FIFO in the Tx datapath). The use of such charts may allow the design of fast paths that may eliminate circuit blocks that have large variations in latency (e.g. the Rx FIFO in the Rx datapath and/or Tx FIFO in the Tx datapath).

As an option, the latency chart for a stacked memory package of FIG. 25-10D may be implemented in the context of the architecture and environment of the previous Figures and/or any subsequent Figure(s). Of course, however, the latency chart for a stacked memory package of FIG. 25-10D may be implemented in the context of any desired environment.

FIG. 25-11

FIG. 25-11 shows a stacked memory package datapath 25-1100, in accordance with one embodiment. As an option, the stacked memory package datapath may be implemented in the context of the previous Figures and/or any other Figure(s). Of course, however, the stacked memory package datapath may be implemented in the context of any desired environment.

For example, in FIG. 25-11, the architecture of the SMP datapath, and/or Rx datapath, and/or Tx datapath, and/or DRAM datapaths, and/or DRAM control paths, and/or the functions contained in the datapaths and/or control paths and/or other logic, etc. may be implemented, for example, in the context shown in FIG. 25-3 and/or FIG. 25-10C of this application and/or FIG. 13 and/or FIG. 15, together with the accompanying text, of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

FIG. 25-11 shows the architecture for a stacked memory package datapath including fast paths. In FIG. 25-11 circuit blocks 25-11B20 may gate the fast paths. For example, circuit block AC0 may function as an address comparator, as described in the context of FIG. 25-8, for example. Address registers 25-11 B22 may provide an address to be matched (e.g. compared, etc.). The address registers may be loaded via the Rx datapath, for example, under program control. In one embodiment, the address comparator may also adjust (e.g. re-time, compensate for, etc.) timing between clock domains. For example, in FIG. 25-11, the Rx datapath may be driven by the low-speed (e.g. parallel, etc.) recovered clock and the high-speed recovered serial clock; the Tx datapath may be driven by the core parallel clock and core serial clock.

FIG. 25-12

FIG. 25-12 shows a memory system using virtual channels 25-1200, in accordance with one embodiment. As an option, the memory system may be implemented in the context of the previous Figures and/or any other Figure(s). Of course, however, the memory system may be implemented in the context of any desired environment.

For example, in FIG. 25-12, the memory system etc. may be implemented, for example, in the context shown in FIG. 16, together with the accompanying text, of U.S. Provisional Application No. 61/569,107, filed Dec. 9, 2011, titled "SYSTEM, METHOD, AND COMPUTER PROGRAM PRODUCT FOR IMPROVING MEMORY SYSTEMS".

In FIG. 25-12, the stacked memory packages and other memory system components etc. may be connected (e.g. linked, coupled, etc.) using one or more virtual channels. A virtual channel, for example, may allows more than one channel to be transmitted (e.g. connected, coupled, etc.) on a link. For example, in FIG. 25-21 two example virtual channels are shown. In FIG. 25-12 a first virtual channel may connect CPU0 with system component SC1. The first virtual channel may comprise the following segments (e.g. lanes, links, connections, buses, combinations of these and/or other connection means, etc.): (1) link 25-1212, (2) link 25-1236, (3) link 25-1226, (4) link 25-1232 (e.g. all outbound to the memory system), (5) link 25-1234, (6) link 25-1224, (7) link 25-1238, (8) link 25-1214 (e.g. all inbound from the memory system). Each link may comprise multiple lanes. Each link may have different numbers of lanes. The second virtual channel may comprise the following segments (e.g. lanes, links, connections, buses, combinations of these and/or other connection means, etc.): (1) link 25-1210, (2) link 25-1228 (e.g. all outbound to the memory system), (3) links 25-1218 and 25-1220, (4) link 25-1216 (e.g. all inbound from the memory system). Note that the second virtual channel may have one segment with two links.

Note that, although not shown in FIG. 25-12 for clarity, any link or set (e.g. group, etc.) of links may contain (e.g. carry, hold, etc.) more than one virtual channel. Each virtual channel may connect (e.g. couple, etc.) different endpoints, etc. Of course any number, type, arrangement of channels, virtual channels, virtual path(s), virtual links, virtual lanes, virtual circuit(s), etc. may be used.

In one embodiment, the number of links and/or the number of lanes in a link and/or the number of virtual channels used to connect system components may be fixed or varied (e.g. programmable at any time, etc.). For example, traffic in the memory system may be asymmetric with more read traffic than write traffic. Thus, for example, the connection between SMP3 and SMP0 (e.g. carrying read traffic, etc.) in the second virtual channel may be programmed to comprise two links, etc.

In one embodiment, the protocol used for one or more high-speed serial links may support virtual channels. For example, the number of the virtual channel may be contained in a field as part of a packet header, part of a control word, etc. In one embodiment the virtual channel may be used to create one or more fast paths, as described, for example, in the context of FIG. 25-10C and/or FIG. 25-11. The virtual channel number, for example, may be used as an address field and compared with a programmed address field, as described in the context of FIG. 25-8 and/or FIG. 25-11, for example.

As an option, the memory system of FIG. 25-12 may be implemented in the context of the architecture and environment of the previous Figures and/or any subsequent Figure(s). Of course, however, the memory system of FIG. 25-12 may be implemented in the context of any desired environment.

FIG. 25-13

FIG. 25-13 shows a memory error correction scheme 25-1300, in accordance with one embodiment. As an option, the memory error correction scheme may be implemented in the context of FIG. 25-13 and/or any other Figure(s). Of course, however, the memory error correction scheme may be implemented in the context of any desired environment including any type (e.g. technology, etc.) of memory.

For example, in FIG. 25-13, the memory error correction scheme may be implemented, for example, in the context shown in FIG. 4, together with the accompanying text, of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In FIG. 25-13, a first memory region may comprise cells 0-63 organized in columns C0-C7 and rows R0-R7, as shown. The first memory region may have one or more associated spare (e.g. redundant, etc.) second memory regions. In FIG. 13, for example, the one or more spare second memory regions may be organized, for example, as columns C8, C9 and rows S0, S1. Any number, organization, size of spare second memory regions may be used. In one embodiment, the spare second memory regions may be part of the same bank as the first memory regions and may share the same support logic (e.g. sense amplifiers, row decoders, column decoders, etc.) as the first memory regions. In one embodiment, the spare second memory regions may be part of the same bank as the first memory regions and may have some or all of the support logic (e.g. sense amplifiers, row decoders, column decoders, etc.) may be dedicated and separate from (e.g. distinct from, capable of operating separately from, capable of operating in parallel with, etc.) the first memory regions.

In one embodiment, for example, the spare regions may be used for flexible and/or programmable error protection. In one embodiment, one or more of the spare second memory regions may be used to store one or more error correction codes. For example, column C8 may be used for parity (e.g. over data stored in a row, columns C0-C3, etc.). Parity may be odd or even, etc. For example, column C9 may be used for parity (e.g. over C4-C7, etc.). Other schemes may be used. For example, C8 may be used for parity for odd columns and C9 for even columns, etc. For example columns C8, C9 may be used to store an ECC code (e.g. SECDED, etc.) for columns C0-C7, etc. Any codes and/or coding schemes may be used (e.g. parity, CRC, ECC, SECDED, LDPC, Hamming, Reed-Solomon, hash functions, combinations of these and other schemes, etc.) depending on the size and organization of the memory region(s) to be protected, the error protection required (e.g. strength of protection, correction capabilities, detection capabilities, complexity, etc.) and spare memory region(s) available (e.g. number of regions, size of regions, organization of regions, etc.).

For example, when R1 is read with data in columns C0-C7 and error code(s) in C8-C9 an error may occur in cell 05, as shown in FIG. 25-13. This error may be detected by the error code information in columns C8 and/or C9.

More than one error correction scheme may be used to increase error protection. For example, in one embodiment, the spare second memory regions may be organized into more than one error correction regions. For example, in FIG. 25-13, spare rows S0, S1 may be used to store parity information over columns C0-C9. For example, the cell in the first column of row S0 may store parity information for column C0, rows R0-R3. For example, the cell in the first column of row S1 may store parity information for column C0, rows R4-R7. The error code information in rows S0-S1 may be updated each time a row R0-R7 is accessed. The error code information update may occur using a simple XOR if the error codes are based on parity, etc. The updates may occur at the same time (or at nearly the same time, pipelined, etc.) as the accesses to rows R0-R7 depending on the nature and amount of support logic (e.g. sense amplifiers, row decoders, column decoders, etc.) used by rows R0-R7 and rows S0-S1, etc. For example, when more than one error occurs in a row, the error code information in C8, C9 may fail (e.g. be unable to detect and/or correct the errors, etc.). In this case, error codes in rows S0-S1 may be read and errors corrected with the additional error coding information from row S0 and/or S1. Of course, any error coding scheme (e.g. codes, error detection scheme, error correction scheme, etc.) may be used with any number, size, organization of the more than one error correction regions.

In one embodiment, the error protection scheme may be dynamic. For example, in FIG. 25-13, at an initial first time (e.g. at start-up, etc.) the error protection scheme may be as described above with columns C8, C9 providing parity coverage for rows R0-R7 and rows S0, S1 providing parity coverage for columns C0-C9. At a later second time, for example, a portion of a memory region may fail. For example, row R1 may fail (or reach a programmed error threshold, etc.) and may need to be replaced with a spare row. For example, spare row S0 may be used to replace faulty row R1, etc. At a later third time, the error scheme may now be changed. For example, spare row S1 may now be used as parity for rows R0, R2-R7, S0 (e.g. S0 has replaced faulty row R1). In one embodiment, a similar or identical scheme to that just described may be used to alter error protection schemes as a result of faulty memory regions or portion(s) of faulty memory regions detected and/or replaced at manufacture time, assembly time, during or after test, etc. In one embodiment, periodic characterization and/or testing and/or scrubbing, etc. during run time may result in a dynamic change in error protection schemes, etc.

In one embodiment, spare memory regions may be temporarily used to increase the error coverage of a memory region in which one or more memory errors have occurred, or a (possibly programmable) threshold, etc. of memory errors have occurred, etc. For example, error coding may be increased from a first level of parity coverage of a memory region to include a second level of coverage e.g. ECC coverage or other more effective (e.g. more effective than parity, etc.) coverage of the memory region (e.g. with coding by row, by column, by combinations of both, by other region shapes, etc.). The logic chip, for example, may scan (e.g. either autonomously or under system and/or program control, etc.) the affected memory region (e.g. the memory region where the error(s) have occurred, etc.) and create the error codes for the higher (e.g. second, third, etc.) level of error coverage. After scanning is complete a repair and/or replacement step etc. may be scheduled to cause the affected memory to be copied to a spare or redundant area, for example (with operations performed either autonomously by the logic chip, for example, or under system and/or program control, etc.). In any scheme, the locations of the affected memory regions and replacement memory regions may, for example, be stored by the logic chip (e.g. using indexes, tables, indexed tables, linked lists, etc. stored in non-volatile memory, etc.).

The use of redundant or spare memory regions may be extended to provide error coverage of columns in addition to rows. The use of redundant or spare memory regions may be further extended to cover groups of columns in addition to groups of rows. In this way the occurrence of errors may be quickly determined, since this check is performed for every read. However errors occur relatively infrequently in normal operation. Thus, there it may be possible to take a much longer time to determine the exact location (number of errors, cells in error, etc.) and nature of the error(s) using combinations (e.g. nested, etc.) of error coding and error codes stored in one or more redundant memory regions. For example, if the memory uses a split request and response protocol then the responses for accesses with errors that take longer to correct may simply be delayed with respect to accesses with no errors and/or accesses with errors that may be corrected quickly (e.g. on the fly, etc.).

In one embodiment, the types of codes, arrangement of spare memory regions, locations of codes, length of codes, etc. may be fixed or programmable (e.g. at design time, at manufacture, at test, at start-up, during operation, etc.).

FIG. 25-14

FIG. 25-14 shows a stacked memory package using DBI bit for parity 25-1400, in accordance with one embodiment. As an option, the stacked memory package using DBI bit for parity may be implemented in the context of the previous Figures and/or any other Figure(s). Of course, however, the stacked memory package using DBI bit for parity may be implemented in the context of any desired environment.

In FIG. 25-14*a*, a DRAM chip (e.g. die, etc.) 25-1412 may be connected to CPU 25-1410 using a bus 25-1414 with a dynamic bus inversion (DBI) capability with DBI information carried on a signal line 25-1416. The DBI bit may protect one or more data buses or portions of one or more buses (e.g. reduce noise, etc.).

In FIG. 25-14*b*, a stacked memory package 25-1422 may use one or more DRAM die based on (e.g. designed from the same database, derived from, etc.) the DRAM die design shown in FIG. 25-14*a*. The stacked memory package SMP0 may be connected to CPU 25-1420 using one or more serial links 25-1424. The serial links may not require a separate DBI signal line. The DRAM die used in the stacked memory package may use the resources (e.g. extra signal line, wiring, circuit space, etc.) for parity or other error protection information etc. that may be more suited to the stacked memory package environment, etc.

FIG. 25-15

FIG. 25-15 shows a method of stacked memory package manufacture 25-1500, in accordance with one embodiment. As an option, the method of stacked memory package manufacture may be implemented in the context of the previous Figures and/or any other Figure(s). Of course, however, the method of stacked memory package manufacture may be implemented in the context of any desired environment.

In FIG. 25-15*a*, the stacked memory package 25-1514 may be capable of providing 32 bits in some manner of access (e.g. an echelon may be 32 bits in width etc.). In FIG. 25-15*a*, the stacked memory package may be manufactured from two stacked memory chips each of which may be capable of providing 16 bits, etc. In FIG. 25-15*a*, a logic chip in the stacked memory package (not shown explicitly in FIG. 25-15*a*) may, for example, perform some or all of the functions necessary to aggregate (or otherwise combine, etc.) outputs from stacked memory chip 25-1510 and stacked memory chip 25-1512 so that stacked memory package 25-1514 may be capable of providing 32 bits in some manner of access.

In FIG. 25-15*b*, the stacked memory package 25-1524 may be capable of providing 32 bits in some manner of access (e.g. an echelon may be 32 bits in width etc.). In FIG. 25-15*b*, the stacked memory package may be manufactured from three stacked memory chips as shown. A first type of stacked memory chip may be capable of providing 16 bits, etc. A second type of stacked memory chip may be capable of providing 8 bits, etc. In FIG. 25-15*b*, the stacked memory package may be manufactured from one stacked memory chip of the first type and two stacked memory chips of the second type, as shown. In FIG. 25-15*b*, a logic chip in the stacked memory package (not shown explicitly in FIG. 25-15*b*) may, for example, perform some or all of the functions necessary to aggregate (or otherwise combine, etc.) outputs from stacked memory chip 25-1520, stacked memory chip 25-1522, and stacked memory chip 25-1526 so that stacked memory package 25-1524 may be capable of providing 32 bits in some manner of access.

For example, the yield (e.g. during manufacture, test, etc.) of the stacked memory chips of the first type may be such that some chips may be faulty or appear to be faulty (e.g. due to faulty connections, etc.). Some of these faulty chips may be converted (e.g. by programming, etc.) so that they may appear as stacked memory chips of the second type. Thus, for example, there may be cost savings in assembling such converted chips for use in a stacked memory package.

Thus, in one embodiment, of a first type of stacked memory chip, the stacked memory chip may be operable to be converted to a second type of stacked memory chip.

In one embodiment, the conversion operation may be as shown in FIG. 25-15*b* in order to convert a chip with an access of one number of bits to an access with a different number of bits.

In one embodiment, a conversion operation may convert any aspect or aspects of stacked memory chip appearance, operation, function, behavior, parameter, etc. For example, one or more resource that allow operation of circuits in parallel (and thus faster e.g. pipelined etc.) may be faulty (e.g. after test, etc.). In this case, the conversion operation may switch out the faulty circuit(s) and the conversion may result in a slightly slower, but still functional part, etc.

Thus, for example, in one embodiment of a stacked memory package, one or more of the stacked memory chips may be converted stacked memory chips.

The conversion of one or more aspects (e.g. chip appearance, operation, function, behavior, parameter, etc.) may involve aspects that may be tangible (e.g. concrete, etc.) and/or aspects that may be intangible (e.g. abstract, virtual, etc.). For example, a conversion may allow two portions (e.g. first portion and second portion) of a memory chip to function (e.g. appear, etc.) as a single portion (e.g. third portion) of a memory chip. For example, the first portion and the second portion may appear as tangible aspects while the third portion may appear as an intangible (e.g. virtual, abstract, etc.) aspect.

Such conversion may also operate at the chip level. For example, a stacked memory chip may have three memory regions that may be designed to operate in the manner of a first memory function, e.g. to provide 16 bits. Thus, for example, the three memory regions may provide 16 bits from each of three memory regions. During manufacture, etc. a first memory region may be tested and found faulty. During manufacture, etc. the second and third memory regions may be tested and found to be working correctly. For example, the first memory region may be found capable of providing only 8 bits. In one embodiment, one or more memory regions may be converted so as to provide a working, but possibly potentially less capable, finished part. For example, the first memory region (e.g. the faulty memory region) may be converted to operate in the manner of a second memory function, e.g. to provide 8 bits. For example, the second memory region (e.g. working) may be converted to operate in the manner of a second memory function, e.g. to provide 8 bits. The converted part, for example, may now provide (or appear to provide, etc.) 16 bits from two memory regions e.g. 16 bits from the (working) third memory region and 8 bits from the (converted, originally faulty) first memory region aggregated with 8 bits from the (converted, originally working) second memory region. The aggregation may be performed, for example, on the memory chip and/or on a logic chip in a stacked memory package, etc. Of course any such conversion scheme may be used to convert any aspect of the memory chip behavior (e.g. circuit block connections, timing parameters, functional behavior, error coding schemes, test and/or characterization modes, monitoring systems, power states and/or power-saving behavior/modes, memory configurations, memory organizations, mode and/or register settings, clock settings, spare memory regions and/or other spare or redundant structures, bus structures, IO circuit functions, register settings, etc.) so that one or more aspects of a memory chip behavior may be converted from the behavior of a first type of memory chip to the behavior of a second type of memory chip.

In one embodiment of a stacked memory package, the behavior of the stacked memory package may be converted. For example, the behavior of the stacked memory package may be converted by converting one or more stacked memory chips. For example, the behavior of the stacked memory package may be converted by converting one or more logic chips in the stacked memory package. Any aspect of the logic chip behavior may be converted (e.g. circuit block connections, circuit operation and/or modes of operation, timing parameters, functional behavior, error coding schemes, test and/or characterization modes, monitoring systems, power states and/or power-saving behavior/modes, memory configurations, memory organizations, content of on-chip memory (e.g. embedded DRAM, SRAM, NVRAM, etc.), internal program code, firmware, bus structures, bus functions, bus priorities, IO circuit functions, IO termination schemes, IO characterization patterns, serial link and lane structures and/or configurations, clocking, error handling, error masking, error reporting, error signaling, mode registers, register settings, etc.). For example, the behavior of the stacked memory package may be converted by converting one or more logic chips in the stacked memory package and one or more stacked memory chips in the stacked memory package. Any aspect of the combination of logic chip(s) with one or more stacked memory chips may be converted (e.g. TSV connections, other chip to chip coupling means, circuit block connections, timing parameters, functional behavior, error coding schemes, test and/or characterization modes, monitoring systems, power states and/or power-saving behavior/modes, power-supply voltage modes, memory configurations, memory organizations, bus structures, IO circuit functions, register settings, etc.).

In one embodiment, the conversion of a part (e.g. stacked memory package, stacked memory chip, logic chip, combinations of these, etc.) may happen at manufacture or test time. Such conversion may effectively increase the yield of parts and/or reduce manufacturing costs, for example. In one embodiment, the conversion may be permanent (e.g. by blowing fuses, etc.). In one embodiment, the conversion may require information on the conversion to be stored and applied to the part(s), combinations of parts, etc. at a later time. The storage of conversion information may be in software supplied with the part, for example, and loaded at run time (e.g. system boot, etc.).

In one embodiment, the conversion(s) of part(s) may occur at run time. For example, one or more portions of one or more parts may fail at run time. The failure(s) may be detected (e.g. by the CPU, by a logic chip in a stacked memory package, by an error signal or other error indication originating from one or more memory chips, from an error signal from the stacked memory package, from combinations of these and/or other indications, etc.). As a result of the failure detection one or more conversions of one or more parts may be initiated, scheduled (e.g. for future events such as system re-start, etc.), recommended (e.g. to the CPU and/or user, system supervisor, etc.), or other restorative, corrective, preventative, precautionary, etc. actions performed, etc. For example, as a result of failure(s) or indications of impending failure(s) the conversion of one or more parts in the memory system may put the memory system in an altered but still operative mode (e.g. limp home mode, degraded mode, basic mode, subset mode, emergency mode, shut down mode, etc.). Such a mode may allow the system to fail gracefully, or provide time for the system to be shut down gracefully and repaired, etc.

As one example, one or more links of a stacked memory package may fail in operation during run-time. The failures may be detected (as described above, for example) and a conversion scheduled. For example, the scheduled conversion may replace one or more links. For example, the scheduled conversion may reconfigure the memory system network or trigger (e.g. initiate, program, recommend, etc.) a reconfiguration of the memory system network. The memory system network may comprise multiple nodes (e.g. CPUs, stacked memory packages, other system components, etc.). The memory system reconfiguration may remove nodes (e.g. disable one or more functions in a logic chip in a stacked memory package, etc.), alter nodes (e.g. initiate and/or command a conversion or other operation to be performed on one or more stacked memory packages, etc.), change routing (e.g. modify the FIB behavior, otherwise modify the routing behavior, etc), or make other memory system network topology and/or function changes, etc. For example, the scheduled conversion may reconfigure the connection containing the failed links to use fewer links.

As another example, one or more memory cells in a stacked memory package may fail in operation during run time. The failures may cause a flood of error messages that may threaten to overwhelm the system. The logic chip in the stacked memory package may decide (e.g. under internal program control triggered by monitoring the error messages, under system and/or CPU command, etc.) to effect a conversion and suspend or otherwise change error message behavior. For example, the logic chip may suspend error messages (e.g. temporarily, periodically, permanently, etc.). The temporary, periodic, and/or permanent cessation of error messages may allow, for example, a CPU to recover and possibly make a decision (possibly in cooperation with the logic chip, etc.) on the next course of action. The logic chip may perform a series of operations in addition to the conversion operation(s). In the above example, the logic chip may also schedule a repair and/or replacement operation (which may or may not be treated as a conversion operation, etc.) for the faulty memory region(s), etc. In the above example, the logic chip may also schedule a second conversion (e.g. more than one conversion may be performed, conversions may be related, etc.). For example, the logic chip may schedule a second conversion in order to change the error protection scheme for the faulty memory region(s), etc.

In one embodiment, the decision(s) to schedule conversion(s), the scheduling of conversion(s), the decision(s) on the nature, number, type, etc. of conversion(s) may be performed, for example, by one or more logic chips in one or more stacked memory packages and/or by one or more CPUs connected (e.g. coupled directly or indirectly, local or remote, etc.) to the memory system, or by combinations of these, etc. For example, the stacked memory package may contain a logic chip with an embedded CPU (or equivalent state machine, etc.) and program code and/or microcode and/or firmware, etc. (e.g. stored in SRAM, embedded DRAM, NVRAM, stacked memory chips, combinations of these, etc.). The logic chip may thus be capable of performing conversion operations autonomously (e.g. under its own control, etc.) or semi-autonomously. For example, the logic chip in a stacked memory package may operate to perform conversions in cooperation with other system components, e.g. one or more CPUs, other logic chips, combinations of these, with inputs (e.g. commands, signals, data, etc.) from these components, etc.

FIG. 25-16

FIG. 25-16 shows a system for stacked memory chip identification 25-1600, in accordance with one embodiment. As an option, the system for stacked memory chip identification may be implemented in the context of the previous Figures and/or any other Figure(s). Of course, however, the system for stacked memory chip identification may be implemented in the context of any desired environment.

For example, in FIG. 25-16, the system for stacked memory chip identification may be implemented, for example, in the context shown in FIG. 12 and/or FIG. 13, together with the accompanying text, of U.S. Provisional Application No. 61/569,107, filed Dec. 9, 2011, titled "SYSTEM, METHOD, AND COMPUTER PROGRAM PRODUCT FOR IMPROVING MEMORY SYSTEMS".

In a stacked memory package, it may be required for all stacked memory chips to be identical (e.g. use the same manufacturing masks, etc.). In that case it may be difficult for an attached logic chip to address each, apparently identical, stacked memory chip independently (e.g.

uniquely, etc.). The challenge amounts to finding a way to uniquely identify (e.g. label, mark, etc.) each identical stacked memory chip. In FIG. 25-16, there may be four stacked memory chips, SMC0 25-1610, SMC1 25-1612, SMC2 25-1614, SMC3 25-1616. Of course, any number of stacked memory chips may be used. In FIG. 25-16, there may be two logic chips, 25-1620, 25-1622. Of course, any number of logic chips may be used. In one embodiment, one or more of the logic chips in a stacked memory package may be operable to imprint a unique label on one or more of the stacked memory chips in the stacked memory package. In FIG. 25-16, the logic chips may be connected (e.g. coupled, etc.) to the stacked memory chips using four separate buses: 25-1624, 25-1626, 25-1628, 25-1630 e.g. one separate bus for each stacked memory chip. The four separate buses may be constructed (e.g. designed, etc.) using, for example, TSV connections in the context, for example, of Bus 2 in FIG. 13 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS." In FIG. 25-16, the logic chips may be connected to the stacked memory chips using one common (e.g. shared, etc.) bus 25-1624.

In one embodiment, a logic chip may, at a first time, forward a unique code (e.g. label, binary number, tag, etc.) to one or more (e.g. including all) stacked memory chips. The stacked memory chip may store the unique label in a register, etc. At a later, second time, a logic chip may send a command to one or more (e.g. including all) of the stacked memory chips on the shared bus. The command may for example, contain the label 01 in a label field in the command. A stacked memory chip may compare the label field in the command with its own unique label. In one embodiment, only the stacked memory chip whose label matches the label in the command may respond to the command. For example, in FIG. 25-16 only stacked memory chip SMC1 with a unique label of 01 may respond to a command with label 01.

Of course, there may be (and typically will be) many buses equivalent to the shared bus (e.g. many copies of the shared bus). Each stacked memory chip may use its unique label to identify commands on each shared bus. Although separate buses may be used for each command, it may be require less area and fewer TSV connections to use a shared bus. Thus the use of a system for stacked memory chip identification may save TSV connections, save die area and thus increase yield, reduce costs, etc.

In one embodiment, the system for stacked memory chip identification just described may be used for a portion or for portions of one or more stacked memory chips. For example, each portion (e.g. an echelon, part of an echelon, etc.) or a group of portions (e.g. on one or more stacked memory chips, etc.) may have a unique identification.

In one embodiment, the system for stacked memory chip identification just described may be used with one or more buses that may be contained (e.g. designed, used, etc.) on a stacked memory chip and/or logic chip(s). For example, one or more buses may couple (e.g. connect, communicate with, etc.) one or more portions (e.g. an echelon, part of an echelon, parts of an echelon, other parts or portions or groups of portions of one or more stacked memory chips, combinations of these, etc.) of one or more stacked memory chips and/or parts or portions or groups of portions of one or more logic chips, etc. The buses may be used, for example, to form a network or networks on one or more logic chip(s) and/or stacked memory chip(s). The identification system may be used to provide unique labels for one or more of these portions of one or more stacked memory chips, and/or one or more logic chips, etc.

In one embodiment, the system for stacked memory chip identification just described may be extended to encompass more complex bus operations. For example, in one embodiment, chips may be imprinted with more than one label. For example: SMC0 may have a label of a first type of 00, a label of a second type 0; SMC1 may have a label of a first type of 01, a label of a second type 0; SMC2 may have a label of a first type of 10, a label of a second type 1; SMC3 may have a label of a first type of 11, a label of a second type 1. A logic chip may send a command on a first shared bus with a label of the first type and, for example, only one stacked memory chip may respond to the command. A logic chip may send a command on a second shared bus with a label of the second type and, for example, two stacked memory chips may respond to the command. Other similar schemes may be used. For example, a logic chip may send a command on a first shared bus with a label of the first type and flag(s) in the command set that may direct the stacked memory chips to treat one or more of the label fields as don't care bit(s). Thus, for example, only one stacked memory chip may respond to the command (no don't care bits), two stacked memory chip may respond to the command (one don't care bit), four stacked memory chip may respond to the command (two don't care bits).

In one embodiment, buses in a stacked memory package may be switched from separate to multi-way shared by using labels. Thus for example, a bus connecting a logic chip to four stacked memory chips may operate in one of several bus modes: (1) as a shared bus connecting a logic chip to all four stacked memory chips, (2) as a two shared buses connecting any two sets of two stacked memory chips (e.g. 4×3/2=6 sets), (3) as three buses with two separate buses connecting the logic chip to one stacked memory chip and one shared bus connecting the logic chip to two stacked memory chips, (4) combinations of these and/or other modes, configurations, etc.

These bus modes (e.g. configurations, functions, etc.) may be used, for example, to configure (e.g. modes, width, speed, priority, other functions and/or logical behavior, etc.) address buses, command buses, data buses, other buses or bus types on the logic chip(s) and/or stacked memory chip(s), and/or buses between logic chip(s) and stacked memory chip(s). Bus modes may be configured at start-up (e.g. boot time) or configured at run time (e.g. during operation, etc.). For example, an address bus, and/or command bus, and/or data bus may be switched from separate to shared during operation, etc.

Thus, for example, such bus modes, bus mode configuration methods, and systems for stacked memory chip identification as described above may be used to switch between configurations shown in the context of FIG. 13 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

FIG. 25-17

FIG. 25-17 shows a memory bus mode configuration system 25-1700, in accordance with one embodiment. As an option, the memory bus mode configuration system may be implemented in the context of the previous Figures and/or any other Figure(s). Of course, however, the memory bus mode configuration system may be implemented in the context of any desired environment.

For example, in FIG. 25-17, the memory bus mode configuration system may be implemented in the context shown in FIG. 25-16 of this application and/or FIG. 12 and/or FIG. 13, together with the accompanying text, of U.S. Provisional Application No. 61/569,107, filed Dec. 9, 2011, titled "SYSTEM, METHOD, AND COMPUTER PROGRAM PRODUCT FOR IMPROVING MEMORY SYSTEMS".

In FIG. 25-17, memory chip SMC0 25-1710 and memory chip SMC1 25-1712 may be stacked memory chips, parts or portions of stacked memory chips, groups of portions of stacked memory chips (e.g. echelons, etc.), combinations of these and/or other parts or portions of one or more stacked memory chips, or other memory chips, etc. In FIG. 25-17, memory chip SMC0 25-1710 and memory chip SMC1 25-1712 may be parts or portions of a single stacked memory chip (e.g. SMC0 and SMC1 may be on the same stacked memory chip, etc.) or other memory chip, etc. For example, SMC0 and SMC1 may be banks, parts of a bank, subarrays, parts of an echelon, combinations of these and/or other parts or portions of a stacked memory chip, other memory chip, etc.

In FIG. 25-17, memory chip SMC0 25-1710 and memory chip SMC1 25-1712 may be coupled by two buses: memory bus MB0 25-1716 and memory bus MB1 25-1714. For example MB0 may be a data bus. For example, MB1 may be a command and address bus (e.g. command and address multiplexed onto one bus, etc.). In one embodiment, it may be desired to switch one or more memory buses between shared and separate modes of operation. In FIG. 25-17, there are two memory chips, but any number of memory chips may be used. In FIG. 25-17, there are two buses, but any number of buses may be used.

For example, in a first configuration, it may be required to operate MB0 as a shared data bus (e.g. as if both SMC0 and SMC1 shared one data bus, etc.). In this first configuration it may be required that MB1 operate as a shared command/address bus (e.g. as if both SMC0 and SMC1 shared one command/address bus, etc.).

For example, in a second configuration, it may be required to operate MB0 as a shared data bus (e.g. as if both SMC0 and SMC1 shared one data bus, etc.). In this second configuration it may be required that MB1 operate as a separate command/address bus (e.g. as if both SMC0 and SMC1 have a dedicated separate command/address bus, etc.).

For example, in a third configuration, it may be required to operate MB0 as a separate data bus (e.g. as if both SMC0 and SMC1 have a dedicated separate data bus, etc.). In this third configuration it may be required that MB1 operate as a shared command/address bus (e.g. as if both SMC0 and SMC1 shared one command/address bus, etc.).

For example, in a fourth configuration, it may be required to operate MB0 as a separate data bus (e.g. as if both SMC0 and SMC1 have a dedicated separate data bus, etc.). In this fourth configuration it may be required that MB1 operate as a separate command/address bus (e.g. as if both SMC0 and SMC1 have a dedicated separate command/address bus, etc.).

Of course, such configurations as just described may be used together, configurations may be switched (e.g. programmable, etc.), more than one configuration may be used on one or more buses at the same time, etc. Configurations may be applied to multiple buses. For example, SMC0 and SMC1 may have one, two, three, or any number of buses which may be configured (e.g. switched, programmed etc.) in any number of configurations or combination(s) of configurations, etc. Of course, any number of memory chips may be coupled by any number of programmable buses.

Using the bus modes, bus mode configuration methods, and systems for stacked memory chip identification as described above in the context of FIG. 25-16, the buses may be configured (possibly dynamically, e.g. at run-time, etc.) to be any of the four configurations described. Of course, in general, one or more buses may be programmed (e.g. configured, etc.) to any number of possible configuration modes, etc.

Of course, any number of buses and/or any number of memory chips may be used. Of course, separated command buses and address buses (e.g. distinct, demultiplexed command bus and address bus(es), etc.) may be used (e.g. including possibly separate buses for row address, column address, bank address, other address, etc.).

FIG. 25-18

FIG. 25-18 shows a memory bus merging system 25-1800, in accordance with one embodiment. As an option, the memory bus merging system may be implemented in the context of the previous Figures and/or any other Figure(s). Of course, however, the memory bus merging system may be implemented in the context of any desired environment.

For example, in FIG. 25-18, the memory bus merging system may be implemented in the context shown in FIG. 13 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS" and/or FIG. 14 of U.S. Provisional Application No. 61/602,034, filed Feb. 22, 2012, titled "SYSTEM, METHOD, AND COMPUTER PROGRAM PRODUCT FOR IMPROVING MEMORY SYSTEMS."

In FIG. 25-17, memory chip SMC0 25-1810 and memory chip SMC1 25-1812 may be stacked memory chips, parts or portions of stacked memory chips, groups of portions of stacked memory chips (e.g. echelons, etc.), combinations of these and/or other parts or portions of one or more stacked memory chips, or other memory chips, etc. In FIG. 25-17, memory chip SMC0 25-1810 and memory chip SMC1 25-1812 may be parts or portions of a single stacked memory chip (e.g. SMC0 and SMC1 may be on the same stacked memory chip, etc.) or other memory chip, etc. For example, SMC0 and SMC1 may be banks, parts of a bank, subarrays, parts of an echelon, combinations of these and/or other parts or portions of a stacked memory chip, or other memory chip, etc.

In FIG. 25-18, memory chip SMC0 25-1810 and memory chip SMC1 25-1812 may be coupled by three buses: memory bus MB0 25-1816, memory bus MB1 25-1814, memory bus MB2 25-1818. For example, MB0 may be a command/address bus. For example MB1 and MB2 may be data buses. In one embodiment, it may be desired to switch one or more data buses between shared and separate modes of operation. For example, it may be required to merge two or more buses to a single bus. For example, it may be required to split one bus to one or more separate buses. Thus, for example, in FIG. 25-18, in a first configuration it may be required to operate MB1 as a separate 64-bit data bus and MB2 as a separate 64-bit data bus. Thus, for example, in FIG. 25-18, in a second configuration it may be required to operate MB1 and MB2 as a shared 128-bit data bus. Using the bus modes, bus mode configuration methods, and systems for stacked memory chip identification as described above in the context of FIG. 25-16, the buses may be configured (possibly dynamically, e.g. at run-time, etc.) to be either of the two configurations.

Of course, any number of buses may be merged and/or split in any fashion or combinations (e.g. two buses merged to one, one bus split to two, four buses merged to three, three buses split to nine, combinations of merge(s) and/or split(s), etc.). Of course, any number of memory chips may be coupled by any number of buses.

As an option, the memory bus merging system of FIG. 25-18 may be implemented in the context of the architecture and environment of the previous Figures and/or any subsequent Figure(s). Of course, however, the memory bus merging system of FIG. 25-18 may be implemented in the context of any desired environment.

As one example, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, one or more aspects of the various embodiments of the present invention may be designed using computer readable program code for providing and/or facilitating the capabilities of the various embodiments or configurations of embodiments of the present invention.

Additionally, one or more aspects of the various embodiments of the present invention may use computer readable program code for providing and facilitating the capabilities of the various embodiments or configurations of embodiments of the present invention and that may be included as a part of a computer system and/or memory system and/or sold separately.

Additionally, at least one program storage device readable by a machine, tangibly embodying at least one program of instructions executable by the machine to perform the capabilities of the various embodiments of the present invention can be provided.

The diagrams depicted herein are examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; U.S. Provisional Application No. 61/581,918, filed Jan. 13, 2012, titled "USER INTERFACE SYSTEM, METHOD, AND COMPUTER PROGRAM PRODUCT"; U.S. Provisional Application No. 61/602,034, filed Feb. 22, 2012, titled "SYSTEM, METHOD, AND COMPUTER PROGRAM PRODUCT FOR IMPROVING MEMORY SYSTEMS"; U.S. Provisional Application No. 61/608,085, filed Mar. 7, 2012, titled "SYSTEM, METHOD, AND COMPUTER PROGRAM PRODUCT FOR IMPROVING MEMORY SYSTEMS"; U.S. Provisional Application No. 61/635,834, filed Apr. 19, 2012, titled "SYSTEM, METHOD, AND COMPUTER PROGRAM PRODUCT FOR IMPROVING MEMORY SYSTEMS"; U.S. application Ser. No. 13/441,132, filed Apr. 6, 2012, titled "MULTIPLE CLASS MEMORY SYSTEMS"; U.S. application Ser. No. 13/433,283, filed Mar. 28, 2012, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; and U.S. application Ser. No. 13/433,279, filed Mar. 28, 2012, titled "SYSTEM, METHOD, AND COMPUTER PROGRAM PRODUCT FOR UTILIZING IMAGE RECOGNITION TO PERFORM AN ACTION"; and U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section IX

The present section corresponds to U.S. Provisional Application No. 61/673,192, titled "SYSTEM, METHOD, AND COMPUTER PROGRAM PRODUCT FOR REDUCING A LATENCY ASSOCIATED WITH A MEMORY SYSTEM," filed Jul. 18, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization and/or use of other conventions, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS," and in U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY". Each of the foregoing applications are hereby incorporated by reference in their entirety for all purposes.

Example embodiments described herein may include computer system(s) with one or more central processor units (CPU) and possibly one or more I/O unit(s) coupled to one or more memory systems that may contain one or more memory controllers and memory devices. As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry.

FIG. 26-1

FIG. 26-1 shows an apparatus 26-100, in accordance with one embodiment. As an option, the apparatus 26-100 may be implemented in the context of any subsequent Figure(s). Of course, however, the apparatus 26-100 may be implemented in the context of any desired environment.

It should be noted that a variety of optional architectures, capabilities, and/or features will now be set forth in the context of a variety of embodiments in connection with a description of FIG. 26-1. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 26-100 includes a first semiconductor platform 26-102, which may include a first memory. Additionally, the apparatus 26-100 includes a second semiconductor platform 26-106 stacked with the first semiconductor platform 26-102. In one embodiment, the second semiconductor platform 26-106 may include a second memory. As an option, the first memory may be of a first memory class. Additionally, the second memory may be of a second memory class.

In another embodiment, a plurality of stacks may be provided, at least one of which includes the first semiconductor platform 26-102 including a first memory of a first memory class, and at least another one which includes the second semiconductor platform 26-106 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments.

In another embodiment, the apparatus 26-100 may include a physical memory sub-system. In the context of the present description, physical memory may refer to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, SDRAM, eDRAM, embedded DRAM, MRAM, PRAM, etc.), memristor, phase-change memory, FeRAM, PRAM, MRAM, resistive RAM, RRAM, a solid-state disk (SSD) or other disk, magnetic media, and/or any other physical memory and/or memory technology etc. (volatile memory, nonvolatile memory, etc.) that meets the above definition.

Additionally, in various embodiments, the physical memory sub-system may include a monolithic memory circuit, a semiconductor die, a chip, a packaged memory circuit, or any other type of tangible memory circuit, or any intangible grouping of tangible memory circuits, combinations of these, etc. In one embodiment, the apparatus 26-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 26-106. Such connections that are in communication with the first memory and pass through the second semiconductor platform 26-106 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing one or more TSVs.

As another option, the communicative coupling may include a connection via a buffer device. In one embodiment, the buffer device may be part of the apparatus 26-100. In another embodiment, the buffer device may be separate from the apparatus 26-100.

Further, in one embodiment, at least one additional semiconductor platform (not shown) may be stacked with the first semiconductor platform 26-102 and the second semiconductor platform 26-106. In this case, in one embodiment, the additional semiconductor may include a third memory of at least one of the first memory class or the second memory class, and/or any other additional circuitry. In another embodiment, the at least one additional semiconductor may include a third memory of a third memory class.

In one embodiment, the additional semiconductor platform may be positioned between the first semiconductor platform 26-102 and the second semiconductor platform 26-106. In another embodiment, the at least one additional semiconductor platform may be positioned above the first semiconductor platform 26-102 and the second semiconductor platform 26-106. Further, in one embodiment, the additional semiconductor platform may be in communication with at least one of the first semiconductor platform 26-102 and/or the second semiconductor platform 26-102 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 26-102 may be in communication via a buffer. In this case, in one embodiment, the buffer may include a row buffer.

Further, in one embodiment, the apparatus 26-100 may be configured such that the first memory and the second memory are capable of receiving instructions via a single memory bus 26-110. The memory bus 26-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, etc; I/O protocols such as PCI, PCI-E, HyperTransport, InfiniBand, QPI, etc; networking protocols such as Ethernet, TCP/IP, iSCSI, etc; storage protocols such as NFS, SAMBA, SAS, SATA, FC, etc; and other protocols (e.g. wireless, optical, etc.); etc.). Of course, other embodiments are contemplated with multiple memory buses.

In one embodiment, the apparatus 26-100 may include a three-dimensional integrated circuit. In one embodiment, the first semiconductor platform 26-102 and the second semiconductor platform 26-106 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 26-100 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 26-102 and the second semiconductor platform 26-106 together may include a three-dimensional integrated circuit that is a wafer-on-wafer device.

In another embodiment, the apparatus 26-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 26-102 and the second semiconductor platform 26-106 together may include a three-dimensional integrated circuit that is a monolithic device.

In another embodiment, the apparatus 26-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 26-102 and the second semiconductor platform 26-106 together may include a three-dimensional integrated circuit that is a die-on-wafer device.

In yet another embodiment, the apparatus 26-100 may include a three-dimensional integrated circuit that is a die-on-die device. In the context of the present description, a die-on-die device refers to a device including two or more aligned dies in a die-on-die configuration. In one embodiment, the first semiconductor platform 26-102 and the second semiconductor platform 26-106 together may include a three-dimensional integrated circuit that is a die-on-die device.

Additionally, in one embodiment, the apparatus 26-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 26-100 may be configured such that the first memory and the second memory are capable of receiving instructions from a device 26-108 via the single memory bus 26-110. In one embodiment, the device 26-108 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.

In the context of the following description, optional additional circuitry 26-104 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 26-104 is shown generically in connection with the apparatus 26-100, it should be strongly noted that any such additional circuitry 26-104 may be positioned in any components (e.g. the first semiconductor platform 26-102, the second semiconductor platform 26-106, the device 26-108, an unillustrated logic unit or any other unit described herein, a separate unillustrated component that may or may not be stacked with any of the other components illustrated, a combination thereof, etc.).

In another embodiment, the additional circuitry 26-104 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiments, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 26-104 capable of receiving (and/or sending) the data operation request. More illustrative information will be set forth regarding various optional architectures, capabilities, and/or features with which the present embodiment(s) may or may not be implemented during the description of the embodiments shown in subsequent figures. It should be strongly noted that subsequent embodiment information is set forth for illustrative purposes and should not be construed as limiting in any manner, since any of such features may be optionally incorporated with or without the inclusion of other features described.

In yet another embodiment, memory regions and/or memory sub-regions of any of the memory described herein may be arranged to optimize one or more parallel operations in association with the memory.

Further, in one embodiment, the apparatus 26-100 may include at least one circuit operable for reducing a latency in communication associated with the apparatus. For example, in one embodiment, the additional circuitry 26-104 may include the at least one circuit operable for reducing the latency. In other possible embodiments, the at least one circuit operable for reducing the latency may reside in any one or more of the components shown in FIG. 26-1 (e.g. 26-102, 26-104, 26-106, 26-108 and/or another unillustrated component, etc.).

Thus, in different embodiments, the at least one circuit may be part of a semiconductor platform, or another platform. In another embodiment, the at least one circuit may be part of at least one of the first semiconductor platform 26-102 or the second semiconductor platform 26-106. In another embodiment, the at least one circuit may be separate from the first semiconductor platform 26-102 and the second semiconductor platform 26-106. In one embodiment, the at least one circuit may be part of a third semiconductor platform stacked with the first semiconductor platform 26-102 and the second semiconductor platform 26-106. Still yet, in one embodiment, the at least one circuit may include a logic circuit, or any type of circuit, for that matter.

In one embodiment, the aforementioned communication may be between the apparatus 26-100 and a processing unit. In another embodiment, the communication may be between the abovementioned at least one circuit and another device such as device 26-108 (e.g. a processing unit, etc.). In another embodiment, the communication may be between the first semiconductor platform 26-102 and the second semiconductor platform 26-106. In still another embodiment, the communication may be between the aforementioned first memory and the second memory associated with the platforms. In yet another embodiment, the communication may be between the at least one circuit and at least one of the first memory or the second memory. Further, in one embodiment, the communication may include communication between a plurality of items (e.g. the circuit, memories, processing unit(s), semiconductor platforms, any combination of the above, etc.).

In various embodiments, the latency in communication may include a variety of latencies. For example, in one embodiment, the latency reduction may include any latency reduction such that latency is less than or equal to 10 nano-seconds. For example, in various embodiments, the at least one circuit may operable for reducing the latency in communication associated with the apparatus to less than 9 nano-seconds, 8 nano-seconds, 7 nano-seconds, 6 nano-seconds, 5 nano-seconds, 4 nano-seconds, 3 nano-seconds, 2 nano-seconds, or 1 nano-second, or any value, for that matter.

In still other embodiments, latency may be reduced to less than a first latency associated with the first memory and/or a second latency associated with the second memory (e.g. or combination thereof, i.e. lesser/greater of the two, etc.). For that matter, such reduction can be applied to a latency associated with any of the components shown in FIG. 26-1 (e.g. 26-102, 26-104, 26-106, 26-108 and/or another unillustrated component, etc.).

Of course, in various embodiments, the latency in communication associated with the apparatus may be reduced in any desired manner. Just by way of example, the latency reduction may be accomplished in connection with any data, any data path, and/or any memory component (or any component, for that matter). In different embodiments, for instance, latency reduction may be accomplished using data path organization, data organization, and/or memory component organization, etc. Various examples of such latency-reducing data path organization, data organization, memory component organization, and/or other latency-reducing techniques will be set forth during the description of FIGS. 26-2, 3, 4, 5, 6, 7, 8, 9, etc. which may or may not be used singularly and/or in combination with those disclosed and/or with others. Even still, any of the latency-reducing techniques disclosed herein may be implemented in any desired layer (e.g. physical, data link, network, transport, session, presentation, application, etc.). Further, in one embodiment, any of the latency-reducing techniques disclosed herein may be implemented in a lowest (or lowest one, two, or three, etc.) layer(s), as desired.

Still yet, in one embodiment, a configurable system is contemplated that may be automatically/dynamically and/or manually configurable at any time (e.g. at design time, at manufacture, at test, at start-up, during operation, etc.) to incorporate, enable, activate, exhibit, and/or include, etc. (singularly and/or in combination) any of the latency-reducing techniques disclosed herein (and/or others). In other embodiments, a more static (or completely static, i.e. unconfigurable, etc.) system is contemplated which may more permanently incorporate, include, exhibit, etc. any one or more of any of the latency-reducing features and/or methods disclosed herein (and/or others). Such increased static nature may be accomplished to any extent/degree (e.g. complete, partial, etc.) and in any desired manner (e.g. hardwiring, pre-configuration, temporary and/or permanent locking of functionality, etc.) and at any time (e.g. at design time, at manufacture, at test, at start-up, during operation, etc.).

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate with the memory system to allow for any of the foregoing optional architectures, capabilities, and/or features. For that matter, further embodiments are contemplated where a single semiconductor platform (e.g. 26-102, 26-106, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

It should be noted that while the embodiments described in this specification and in specifications incorporated by reference may show examples of stacked memory system and improvements to stacked memory systems, the examples described and the improvements described may be generally applicable to a wide range of electrical and/or electronic systems. For example, improvements to signaling, yield, bus structures, test, repair etc. may be applied to the field of memory systems in general as well as systems other than memory systems, etc.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the configuration/operation of the apparatus 26-100, the configuration/operation of the first and/or second semiconductor platforms, and/or other optional features (e.g. optional latency reduction techniques, etc.) have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc., which may or may not be incorporated in the various embodiments disclosed herein.

FIG. 26-2

FIG. 26-2 shows a memory system network 26-200, in accordance with one embodiment. As an option, the memory system network may be implemented in the context of the previous Figure and/or any subsequent Figure(s). Of course, however, the memory system network may be implemented in the context of any desired environment.

In one embodiment, the memory system network of FIG. 26-2 may be implemented, for example, in the context of FIG. 1B of U.S. Provisional Application No. 61/569,107, filed Dec. 9, 2011, titled "SYSTEM, METHOD, AND COMPUTER PROGRAM PRODUCT FOR IMPROVING MEMORY SYSTEMS".

In another embodiment, the memory system network of FIG. 26-2 may be implemented, for example, in the context of FIG. 6 of U.S. Provisional Application No. 61/585,640, filed Jan. 31, 2012, titled "SYSTEM, METHOD, AND COMPUTER PROGRAM PRODUCT FOR IMPROVING MEMORY SYSTEMS".

For example, one embodiment of a memory system network may use Intel QuickPath Interconnect (QPI). Of course any interconnect system and/or interconnect scheme and/or interconnect protocol, etc. may be used. The use of Intel QPI as an example interconnect scheme is not intended to limit the scope of the description, but rather to clarify explanation by use of a concrete, well-known example. For example, HyperTransport and/or other interconnect schemes may provide similar functions to Intel QPI, etc.

An interconnect link may include one or more lanes. A lane is normally used to transmit a bit of information. In some buses, protocols, standard, etc. a lane may be considered to include both transmit and receive signals (e.g. lane 0 transmit and lane 0 receive, etc.). This is the definition of lane used by the PCI-SIG for PCI Express for example and the definition that is generally used herein and in applications incorporated by reference. In some buses (e.g. Intel QPI, etc.) a lane may be considered as just a transmit signal or just a receive signal. In most high-speed serial links data is transmitted using differential signals. Thus, a lane may be considered to consist of two wires (one pair, transmit or receive, as in Intel QPI) or four wires (two pairs, transmit and receive, as in PCI Express). As used herein, a lane may generally include four wires (two pairs, transmit and receive, for differential signals). In order to refer to a Tx pair (differential signals) or Tx wire (single-ended signals), for example, the terms Tx lane, transmit lane(s), may be used, etc. The terms Tx link and Rx link may also be used to avoid confusion.

For example, Intel QPI may have 20 lanes per link, with one link in each direction, with four quadrants of five lanes in each link. Thus, Intel QPI uses the term link to represent a Tx link or an Rx link. Intel QPI uses the term link pair to represent a Tx link and an Rx link.

The link layer may include network packets (e.g. packets, fragments of packets, etc.) that may be divided (e.g. broken, separated, fragmented, split, chunked, etc.) into pieces called a flit (flow control digit, flow unit, flow control unit). For example, Intel QPI may use an 80-bit flit, with 64 bits of data, 8 bits of error detection, 8 bits for link layer header.

The physical layer (e.g. groups of analog and digital transmission bits, etc.) may include pieces of flits called a phit (physical digit, physical unit, physical layer unit, physical flow control digit). For example, Intel QPI may use a 20-bit phit transmitted on 20 lanes of a link with one flit containing four phits.

A flit may include one or more phits. Flits and phits may be the same size, but they need not be.

For example, Intel QPI may use an 80-bit flit that may be transferred in two clock cycles (four 20 bit transfers, two per clock). For example, a two-link 20-lane Intel QPI may transfer eight bytes per clock cycle, four in each direction. For example, the data rate of Intel QPI may thus be: 3.2 GHz (clock)×2 bits/Hz (double data rate)×20 (QPI link width)×(64/80) (data bits/flit bits)×2 (bidirectional links)/8 (bits/byte)=25.6 GB/s. Any interconnect scheme, system, method, etc. may be used with phits and/or fits of any size (e.g. fixed size or variable size, etc.) and/or using any other organization of data in the physical layer and/or link layer and/or other layer(s) in the interconnect scheme.

In FIG. 26-2, the memory system network may include one or more CPUs 26-232; one or more stacked memory packages 26-226, 26-228, 26-230; coupled by one or more links 26-222, 26-234, 26-224. Each link may carry a Tx stream 26-210 and an Rx stream 26-212. Each link may consist of one or more lanes. Each stacked memory package may contain one or more logic chips and one or more stacked memory chips.

Several terms may be used to describe packet and/or information flow in networks and in a memory system network. In a fully-buffered DIMM (FB-DIMM) network, for example, packets from a CPU towards the memory subsystem may be carried in southbound lanes and packets from a memory subsystem towards the CPU may be carried in northbound lanes. Packets that arrive at a stacked memory package may be input packets and the inputs may be described as ingress ports, etc. Packets that leave a stacked memory package may be output packets and the outputs may be described as egress ports, etc. If one or more CPUs in the memory system are defined to be the sources of commands, etc. then packets that flow away from the source (e.g. away from a CPU and towards the memory subsystem) may flow in the downstream direction and packets that flow towards the source (e.g. towards a CPU and away from the memory subsystem) may flow in the upstream direction. The CPUs and stacked memory packages (and/or other system components, etc.) may form sources and sinks of packets in a memory system network. Sources and sink may be connected by links. Each link may have link controllers, also variously called link interfaces, interface controllers, network interfaces, etc. Each link may be considered to include a Tx link and an Rx link (to clarify any confusion over whether a link is unidirectional or bidirectional, etc.). Each link may thus have a Tx link controller and an Rx link controller. A Tx link controller may also be called a master controller, and an Rx link controller may also be called a slave controller (also slave, target controller, or target). System components in a memory network may form nodes with each node containing sources and sinks. Packets may be transmitted from a source node and be forwarded and/or routed by intermediate nodes as they travel along links (e.g. hops, hop-by-hop, etc.) between nodes to a destination node.

In one embodiment, one or more packets, or other logical containers of data and/or information may be interleaved (defined herein as packet interleaving). Interleaving may be performed in upstream directions, downstream directions, or both.

In one embodiment, one or more commands and/or command information may be interleaved (defined herein as command interleaving). Interleaving may be performed in the upstream direction, downstream direction, or both. For the purposes of defining command interleaving, etc. herein, commands and command information may include one or more of the following (but not limited to the following): read requests, write requests, posted commands and/or requests, non-posted commands and/or requests, responses (with or without data), completions (with or without data), messages, status requests, combinations of these and/or other commands used within a memory system, etc. For example, commands may include test commands, characterization commands, register set, mode register set, raw commands (e.g. commands in the native SDRAM format, etc.), commands from stacked memory chip to other system components, combinations of these, flow control, or any command, etc.

In one embodiment, one or more packets, or other logical containers of data and/or information may be interleaved (packet interleaving) and/or one or more commands and/or command information may be interleaved (command interleaving). Packet interleaving and/or command interleaving may be performed in upstream directions, downstream directions, or both.

For example, FIG. 26-2 shows a link between CPU0 and SMP0 that may carry downstream serial data in a Tx stream 26-210 and upstream serial data in an Rx stream 26-212. In FIG. 26-2, there may be four representations of data carried in these continuous serial streams (streams): stream 1A 26-214, stream 2A 26-216, stream 1B 26-218, stream 2B 26-220. In FIG. 26-2, only part (e.g. a portion, section, excerpt, etc.) of the data in these continuous serial streams may be shown. Data, commands, packets, etc. may be interleaved (e.g. in a stream, flow, channel, etc.) in any manner. For example, in one embodiment, C1 in stream 1A may represent two flits, while C1 in stream 1B may represent one flit (e.g. stream 1B may be interleaved at the flit level, etc.). For example, in one embodiment, R1 in stream 2A may represent two flits, while R1 in stream 2B may represent one flit (e.g. stream 2B may be interleaved at the flit level, etc.). In one embodiment, C1 in stream 1A may be the same length as R1 in stream 2A, but the lengths of C1 and R1, etc. may be different. In one embodiment, C1 in stream 1A may be the same length as C2, but the lengths of C1, C2, C3, C4, etc. may be different. In one embodiment, the lengths of C1, C2, C3, C4, etc. and/or R1, R2, R3, R4, etc. may be programmable (e.g. configured at design time, at manufacture, at test, at start-up, during operation, etc.). In one embodiment, the relationships (e.g. ratios, function, etc.) of the lengths of C1 to C2, C2 to C3, etc. and/or R1 to R2, R2 to R3, etc. may be programmable (e.g. configured at design time, at manufacture, at test, at start-up, during operation, etc.). In one embodiment, the relationships (e.g. ratios, function, etc.) of the lengths of C1 to R1, C2 to R2, etc., may be programmable (e.g. configured at design time, at manufacture, at test, at start-up, during operation, etc.). Of course, any number of flits may be used in interleaving. Interleaved commands, packets etc. may be any number of flits in length. Flits may be any length. Packets, commands, data, etc., need not be interleaved at the flit level.

In one embodiment, stream 1A may represent a stream with non-interleaved packet, non-interleaved command/response. Thus, for example:

C1=READ1, C2=WRITE1, C3=READ2, C4=WRITE2

In one embodiment, stream 1A may represent a stream with non-interleaved packet, interleaved command/response. Thus, for example:

C1=READ1, C2=WRITE1.1, C3=READ2, C4=WRITE1.2

In FIG. 26-2, stream 2A may be similarly composed for responses (e.g. with non-interleaved packet, non-interleaved command/response; with non-interleaved packet, interleaved command/response; etc.). In one embodiment, the number of bits, etc. used for each interleaved command may be fixed or programmable (e.g. configured at design time, at manufacture, at test, at start-up, during operation, etc.). For example, in a first configuration, a write command may fit in C2 and C4 (e.g. be contained in, have the same number of bits as, etc.). For example, in a second configuration, a write command may fit in C2, C4, C6, C8, etc. For example, in a third configuration, a read command may fit in C1, C2 or, in fourth third configuration may fit in C1, C5, C9, C13, and so on.

In one embodiment, stream 1B may represent a stream with interleaved packet and non-interleaved command/response. Thus, for example:

C1=READ1.1, C2=WRITE1.1, C3=READ2.1, C4=WRITE2.1

C5=READ1.2, C6=WRITE1.2, C7=READ2.2, C8=WRITE2.2

In one embodiment, stream 1B may represent a stream with interleaved packet and interleaved command/response. Thus, for example:

C1=READ1.1, C2=WRITE1.1.1, C3=READ2.1, C4=WRITE1.2.1

C5=READ1.2, C6=WRITE1.1.2, C7=READ2.2, C8=WRITE1.2.2

In FIG. 26-2, stream 2B may be similarly composed for responses (e.g. with interleaved packet and non-interleaved command/response; with interleaved packet and interleaved command/response; etc.).

In one embodiment, packet interleaving and/or command interleaving may be performed at different protocol layers (or level, sublayer, etc.). For example, packet interleaving may be performed at a first protocol layer. For example, command interleaving may be performed at a second protocol layer. In one embodiment, packet interleaving may be performed in such a manner that packet interleaving may be transparent (e.g. invisible, irrelevant, unseen, etc.) at the second protocol layer used by command interleaving. In one embodiment, packet interleaving and/or command interleaving may be performed at one or more programmable protocol layers (e.g. configured at design time, at manufacture, at test, at start-up, during operation, etc.).

In one embodiment, packet interleaving and/or command interleaving may be used to allow commands etc. to be reordered, prioritized, otherwise modified, etc. Thus, for example, the following stream may be received at an ingress port of a stacked memory package:

C1=READ1.1, C2=WRITE1.1.1, C3=READ2.1, C4=WRITE1.2.1

C5=READ1.2, C6=WRITE1.1.2, C7=READ2.2, C8=WRITE1.2.2

In this case, write 1.1 may not be executed (e.g. processed, performed, completed, etc.) until C6 is received (e.g. because write 1.1 comprises write 1.1.1 and write 1.1.2, etc.). Suppose, for example, the system, user, CPU, etc. wishes to prioritize write 1.1, then the commands may be reordered as follows:

C1=READ1.1, C2=WRITE1.1.1, C3=WRITE1.1.2, C4=WRITE1.2.1

C5=READ1.2, C6=READ2.1, C7=READ2.2, C8=WRITE1.2.2

In this case, write 1.1 may now be executed after C2 is received (e.g. with less latency, less delay, earlier in time, etc.). The commands may be reordered at the source (e.g. by the CPU, etc.). This may allow the sink (e.g. target, etc.) to simplify processing of commands and/or prioritization of commands, etc. The commands may also be reordered at a sink. Here the term sink may refer to an intermediate node (e.g. a node that may forward the packet, etc. to the final target destination, final sink, etc. For example, an intermediate node in the network may reorder the commands. For example, the final destination may reorder the commands.

Of course any data, packet, information, etc. may be reordered. For the purposes of defining reordering, etc.

herein, the term command reordering may include reordering of one or more of the following (but not limited to the following): read requests, write requests, posted commands and/or requests, non-posted commands and/or requests, responses (with or without data), completions (with or without data), messages, status requests, combinations of these and/or other commands used within a memory system, etc. For example, command reordering may include the reordering of test commands, characterization commands, register set, mode register set, raw commands (e.g. commands in the native SDRAM format, etc.), commands from stacked memory chip to other system components, combinations of these, flow control, or any command, etc.

Thus, in one embodiment, command reordering (as defined herein) may be performed by a source and/or sink.

In one embodiment, interleaving (e.g. packet interleaving as defined herein, command interleaving as defined herein, other forms of data interleaving, etc.) may be used to adjust, change, modify, configure, etc. one or more aspects of memory system performance, one or more memory system parameters, one or more aspects of memory system behavior, etc.

In one embodiment, interleaving (e.g. packet interleaving as defined herein, command interleaving as defined herein, other forms of data interleaving, etc.) may be configured so that the memory system, memory subsystem, part or portions of the memory system, one or more stacked memory packages, part or portions of one or more stacked memory packages, one or more logic chips in a stacked memory package, part or portions of one or more logic chips in a stacked memory package, combinations of these, etc, may operate in one or more interleave modes (or interleaving modes).

For example, in one embodiment, one or more interleave modes (as defined above herein) may be used possibly in conjunction with (e.g. optionally, configured with, together with, etc.) one or more other modes of operations and/or configurations etc. described in this application and in applications incorporated by reference. For example, one or more interleave modes may be used in conjunction with conversion and/or one or more configurations and/or one or more bus modes as described in the context of U.S. Provisional Application No. 61/665,301, filed Jun. 27, 2012, titled "SYSTEM, METHOD, AND COMPUTER PROGRAM PRODUCT FOR ROUTING PACKETS OF DATA," which is incorporated herein by reference in its entirety. As another example, one or more interleave modes may be used in conjunction with one or more memory subsystem modes as described in the context of U.S. Provisional Application No. 61/608,085, filed Mar. 7, 2012, titled "SYSTEM, METHOD, AND COMPUTER PROGRAM PRODUCT FOR IMPROVING MEMORY SYSTEMS." As another example, one or more interleave modes may be used in conjunction with one or more modes of connection as described in the context of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In one embodiment, operation in one or more interleave modes (as defined above herein) and/or other modes (where other modes may include those modes, configurations, etc., described explicitly above herein, but may not be limited to those modes) may be used to alter, modify, change, etc. one or aspects of operation, one or more behaviors, one or more system parameters, etc.

In one embodiment, operation in one or more interleave modes and/or other modes may reduce the required size of one or more memory system buffers (receive buffers, transmit buffers, etc.). For example, one or more interleaving modes and/or other modes may be configured (at design time, at manufacture, at test, at start-up, during operation, etc.) to minimize the size of one or more buffers. For example, one or more interleaving modes may be configured (at design time, at manufacture, at test, at start-up, during operation, etc.) to match one or more buffer size(s) (e.g. buffer sizes, space, storage, etc. available due to other system configuration operations, due to design, due to manufacturing yield, due to test results, as a result of traffic measurement during operation, as a result of flow control information, as a result of buffer full/nearly full/overflow signals etc., as a result of other buffer or system monitoring activity, etc.).

In one embodiment, operating in one or more interleave modes and/or other modes may reduce the latency of one or more operations (e.g. read, write, other command, etc.). For example, one or more interleaving modes and/or other modes may be configured (at design time, at manufacture, at test, at start-up, during operation, etc.) to minimize the latency of one or more commands or other operations. For example, one or more interleaving modes may be configured (at design time, at manufacture, at test, at start-up, during operation, etc.) to match, achieve, meet, etc. one or more latency parameters and/or other timing parameter(s), etc. For example, timing parameters may be set due to such factors as design, manufacturing yield, test results, traffic measurement during operation, flow control information, other system monitoring activity, cost, etc.

In one embodiment, operating in one or more interleave modes and/or other modes may affect the need for packet reassembly and/or other reassembly functions (defined herein as reassembly) at one or more sinks. For example, by operating or configuring operation in one or more interleave modes and/or other modes, reassembly may not be required. Thus, for example, one or more interleaving modes may be configured (at design time, at manufacture, at test, at start-up, during operation, etc.) to minimize reassembly requirements, eliminate the need for reassembly, minimize latency due to reassembly, etc. For example, the functionality of reassembly logic or logic associated with reassembly etc. may be affected by such factors as design, manufacturing yield, test results, traffic measurement during operation, flow control information, other system monitoring activity, cost, etc.

In one embodiment, operating in one or more interleave modes and/or other modes may affect the calculation of error codes and error coding operations (e.g. coding, decoding, error detection, error correction, CRC calculation, etc.). For example, by operating and/or configuring operation in one or more interleave modes and/or other modes, CRC calculation may be simpler, faster, etc. For example, in some interleave modes, error coding, error detection, error correction, or other coding and/or related calculations may be simpler, faster, etc. For example, the requirements for error coding, error correction, error detection, etc. as well as the requirements for the logic or logic associated with coding and/or decoding etc. may be affected by such factors as cost, design, manufacturing yield, manufacturing test results, error and error rate measurement(s) during operation, product requirements (e.g. end use, high reliability, etc.), error and/or fault and/or failure information, operational test and self-test results, characterization results, error and/or other system monitoring activity, etc.

In one embodiment, operating in one or more interleave modes and/or other modes may affect clocks, synchronization and/or other clock domain crossing, etc. For example, by operating and/or configuring operation in one or more interleave modes and/or other modes, clocking may be simpler, faster, etc. For example, the requirements for clocking, etc. as well as the requirements for the logic or logic associated with clocking etc. may be affected by such factors as cost, design, manufacturing yield, manufacturing test results, error and error rate measurement(s) during operation, product requirements (e.g. end use, high reliability, etc.), error and/or fault and/or failure information, operational test and self-test results, characterization results, error and/or other system monitoring activity, etc.

In one embodiment, operating in one or more interleave modes and/or other modes may affect the use of buses, bus arbiters, bus priority, bus multiplexing, etc. For example, by operating and/or configuring operation in one or more interleave modes and/or other modes, buses may be increased in width, decreased in width, reconfigured, multiplexed, clocked faster, etc. For example, the requirements for buses, etc. as well as the requirements for the logic or logic associated with buses, etc. may be affected by such factors as cost, design, manufacturing yield, manufacturing test results, error and error rate measurement(s) during operation, bus traffic analysis, bus utilization, bus flow control signals, product requirements (e.g. end use, speed of operation, etc.), error and/or fault and/or failure information, operational test and self-test results on buses and/or other system and subsystem circuits and/or components, bus and/or other characterization results, bus error and/or other system monitoring activity, etc.

In one embodiment, operating in one or more interleave modes and/or other modes may affect the use of one or more switches, crossbars etc on one or more logic chips in a stacked memory package. For example, by operating and/or configuring operation in one or more interleave modes and/or other modes, crossbars may be increased in width, decreased in width, reconfigured, clocked faster, etc. For example, by operating and/or configuring operation in one or more interleave modes and/or other modes, crossbars may be enabled or disabled, etc. For example, by operating and/or configuring operation in one or more interleave modes and/or other modes, crossbars may used to route packets and/or other information between protocol layers, etc. For example, by operating and/or configuring operation in one or more interleave modes and/or other modes, crossbars may be enabled, disabled, configured, reconfigured, programmed, etc. in order to route and/or forward packets, etc. For example, the requirements for switches, switch arrays, switch fabrics, MUX arrays, crossbars, etc. as well as the requirements for the logic or logic associated with such switch circuits, etc. may be affected by such factors as design, cost, manufacturing yield, manufacturing test results, error and error rate measurement(s) during operation, bus traffic analysis, bus utilization, bus flow control signals, product requirements (e.g. end use, speed of operation, etc.), error and/or fault and/or failure information, operational test and self-test results on switches and/or other system and subsystem circuits and/or components, characterization results, error and/or other system monitoring activity, etc.

In one embodiment, operating in one or more interleave modes and/or other modes may affect the memory access (e.g. read bus connectivity, write bus connectivity, command bus connectivity, address bus connectivity, control signal connectivity, register functions, coupling to one or more stacked memory chips, logical connection to stacked memory chips and/or associated logic, memory bus architecture(s), combinations of these and/or other factors, etc.) to one or more stacked memory chips or other memory (e.g. one or more memory classes, memory on a logic chip, combinations of these and other memory structures, etc.) in a stacked memory package. For example, by operating and/or configuring operation in one or more interleave modes and/or other modes, memory access may be increased in width (e.g. two stacked memory chips accessed per command, increase in number of bits accessed per stacked memory chip, and/or other changes in memory access(es), access modes, access operations, access commands, memory bus configuration(s), combinations of these, etc.), decreased in width, reconfigured, clocked faster, combinations of these and/or other changes, medications etc. For example, by operating and/or configuring operation in one or more interleave modes, bus interleaving, bus multiplexing, bus demultiplexing, bus width, bus frequency, combinations of these and/or other bus parameters, etc. may be enabled, disabled, modified, reconfigured, etc. For example, the requirements for memory access etc. as well as the requirements for the logic or logic associated with memory access, etc. may be affected by such factors as design, cost, manufacturing yield, manufacturing test results, error and error rate measurement(s) during operation, memory access analysis, memory access patterns, read/write profiling, read/write traffic mix(es), memory utilization(s), flow control signals, buffer utilization, buffer capacity, product requirements (e.g. end use, memory capacity required, speed of operation, etc.), error and/or fault and/or failure information, operational test and self-test results on switches and/or other system and subsystem circuits and/or components, system characterization results, error and/or other system monitoring activity, etc.

In one embodiment, operating in one or more interleave modes and/or other modes may affect the use of on-chip (logic chip and/or stacked memory chip) and/or die-to-die bus interconnect multiplexing, TSV arrays, and/or other through wafer interconnect (TWI), etc. For example, by operating and/or configuring operation in one or more interleave modes and/or other modes, buses, TSV arrays, and/or other interconnect structures, and/or other connectivity structures, circuits, functions, etc. may be configured, reconfigured, enabled, disabled, ganged, paired, bypassed, swapped, clocked faster, clocked slower, etc. For example, the requirements for buses, TSV arrays, etc. as well as the requirements for the logic or logic associated with buses, TSV arrays, etc. may be affected by such factors as design, cost, manufacturing yield, manufacturing test results, error and error rate measurement(s) during operation, interconnect traffic analysis, interconnect utilization, product requirements (e.g. end use, stacked memory package capacity, cost, speed of operation, etc.), interconnect error and/or fault and/or failure information, operational test and self-test results on buses and/or other system and subsystem interconnect and/or other components, bus and/or other characterization results, interconnect characterization results characterization results, bus error and/or other system monitoring activity, etc.

In one embodiment, operating in one or more interleave modes and/or other modes may affect the power consumption of the memory system, memory subsystem, memory subsystem components, etc. For example, by operating and/or configuring operation in one or more interleave modes and/or other modes, buses, high-speed serial links, high-speed serial link channels, high-speed serial link virtual channels, high-speed serial link traffic classes, other high-speed serial link parameters, other circuit components, etc.

may be configured, reconfigured, multiplexed, demultiplexed, rearranged, paired, ganged, separated, enabled, disabled, one or more channels bonded, clocked faster, clocked slower, clock sources changed, capacity and/or bandwidth changed, etc. For example, the requirements for the number of lanes in a high-speed serial link, the number of links between system components (e.g. between CPU and one or more stacked memory packages, between one or more stacked memory packages between CPU and/or stacked memory packages and other system components, etc.), etc. as well as the requirements for the logic or logic associated with buses, serial links, etc. may be affected by such factors as design, manufacturing yield, manufacturing test results, error and error rate measurement(s) during operation, memory system network traffic analysis, memory system network utilization, product requirements (e.g. end use, memory system capacity, memory system bandwidth, memory system latency, stacked memory package capacity, cost, speed of operation, etc.), memory network error and/or fault and/or failure information, operational test and self-test results on buses and/or other system and subsystem networks and/or other components, link and/or other characterization results, network characterization results, lane characterization results, link error and/or other system monitoring activity, etc.

In one embodiment, operating in one or more interleave modes and/or other modes may affect the connectivity of one or more datapaths in a stacked memory package, etc. For example, by operating and/or configuring operation in one or more interleave modes and/or other modes, alternative paths (e.g. short cuts, bypass paths, short-circuit paths, combinations of these and/or other paths, etc.) in one or more datapaths (e.g. Rx datapath, Tx datapath, and/or circuits, datapaths connected to these, etc.) may be configured, reconfigured, rearranged, enabled, disabled, clocked faster, clocked slower, clock sources changed, width changed, capacity changed, bandwidth changed, multiplexing changed, error protection changed, coding changed, etc. For example, the requirements for the datapaths, etc. as well as the requirements for the logic or logic associated with datapaths, etc. may be affected by such factors as design, manufacturing yield, manufacturing test results, error and error rate measurement(s) during operation, memory system network traffic analysis, memory system network utilization, product requirements (e.g. end use, memory system capacity, memory system bandwidth, memory system latency, stacked memory package capacity, cost, speed of operation, etc.), memory network error and/or fault and/or failure information, operational test and self-test results on buses and/or other system and subsystem networks and/or other components, link and/or other characterization results, network characterization results, lane characterization results, link error and/or other system monitoring activity, etc.

In one embodiment, packet interleaving may be performed by any means and/or method, process, algorithm, function, combinations of these, etc. in which one or more packets may be segmented, split, chopped, fragmented, broken, chunked, combinations of these, and/or otherwise manipulated in size, etc.

In one embodiment, packet interleaving may be performed on fixed length packets and/or variable length packets.

In one embodiment, command interleaving may be performed by any means and/or method, process, algorithm, function, etc. in which one or more commands (e.g. commands, requests, responses, completions, etc.) may be segmented, split, chopped, fragmented, broken, chunked, or otherwise manipulated in size, etc.

In one embodiment, command interleaving may be performed on commands that may be contained in fixed length packets and/or variable length packets.

In one embodiment, command interleaving may be performed on fixed length commands and/or variable length commands.

In one embodiment, packets may contain a complete command and/or one or more commands.

In one embodiment, packets and/or commands may be interleaved logically. For example a write may be split into a multi-part write with one or more reads or other command inserted into one or more parts of the write at the packet level, etc.

In one embodiment, one or more modes (as defined herein) may be used on different links, on different lanes, on different Rx links and/or lanes, on different Tx links and/or lanes, etc.

In one embodiment, modes, configurations, conversions, etc may be static (e.g. fixed, etc.) or dynamic (e.g. programmable at design time, at manufacture, at test, at start-up, during operation, etc.).

In one embodiment, a flit or logical equivalent, etc. may contain one or more routing headers, and/or other routing, forwarding, etc. information (e.g. data fields, flags, tags, ID, addresses, etc.). For example, the routing information may allow routing and/or forwarding and/or broadcasting and/or repeating of packets, packet information, etc. at the data link layer (e.g. in the receiver datapath, in the SerDes, etc.).

In one embodiment, a phit or logical equivalent, etc. may contain one or more routing headers, and/or other routing, forwarding, etc. information (e.g. bit data, special characters, special symbols, bit sequences, etc.). For example, this bit data may allow routing and/or forwarding and/or broadcasting and/or repeating of packets, packet information, etc. at the physical layer (e.g. at the PHY, at the receiver, etc.).

In one embodiment, a packet or logical equivalent, etc. may contain one or more special routing headers, and/or other routing, forwarding, etc. information. For example, the special routing header may contain custom fields, framing symbols, bit sequences, etc. that allow fast packet inspection, routing decisions, crossbar functions, etc. to be performed on the logic chip of a stacked memory package.

In one embodiment, a flit, or logical equivalent, etc, may be changed in size in different configurations and/or modes. In one embodiment, a phit, or logical equivalent, etc, may be changed in size in different configurations and/or modes.

In one embodiment, one or more packets, commands, requests, responses, completions, etc. may be segmented (e.g. divided, etc.). In one embodiment, one or more packets, commands, requests, responses, completions, etc. may be segmented at a fixed size (e.g. length). In one embodiment, one or more packets, commands, requests, responses, completions, etc. may be segmented at a variable and/or programmable size (e.g. length).

In one embodiment, the reordering, interleaving, segmenting, etc. of commands, requests, responses, completions, packets, etc. may involve changing, modifying, deleting, inserting, creating or otherwise altering, modifying, etc. one or more commands, requests etc. and/or one or more responses, completions, etc. (e.g. changing, altering, creating, modifying, transforming, etc. one or more fields, information, data, ID, addresses, flags, sequence numbers, tags, formats, lengths, and/or other content, etc.).

In one embodiment, one or more packets, commands, requests, responses, completions, etc. may be nested (e.g. in a hierarchical structure, in a recursive manner, etc.) or otherwise combined, arranged, etc. For example, one or more packets, commands, requests, responses, completions, etc. may be included in one or more one or more packets, commands, requests, responses, completions, etc. In one embodiment, packets and/or commands etc. may be nested and segmented (at a fixed or variable size). Thus, for example, in one embodiment, physical layer information may be encapsulated (e.g. contained, held, inserted, etc.) into the data link layer, or transaction layer, etc. Of course, information from any layer may be encapsulated (e.g. via nesting, etc.) in any other layer. Such encapsulation etc. may be used, for example, to reduce the latency of routing packets and/or forwarding packets and/or performing other logical operations etc. on packets by one or more logic chips in a stacked memory package.

FIG. 26-3

FIG. 26-3 shows a data transmission scheme 26-300, in accordance with one embodiment. As an option, the data transmission scheme may be implemented in the context of the previous Figures and/or any subsequent Figure(s). Of course, however, the data transmission scheme may be implemented in the context of any desired environment.

In FIG. 26-3, the data transmission scheme may be implemented, for example, in the context of FIG. 1B of U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

In another embodiment, the data transmission scheme may be implemented, for example, in the context of FIG. 6 of U.S. Provisional Application No. 61/585,640, filed Jan. 31, 2012, titled "SYSTEM, METHOD, AND COMPUTER PROGRAM PRODUCT FOR IMPROVING MEMORY SYSTEMS."

A memory system may comprise one or more CPUs, one or more stacked memory packages and/or other system components. The one or more CPUs, one or more stacked memory packages and/or other system components may use one or more data transmission schemes to couple, communicate, etc. information (e.g. packets, etc.). The one or more data transmission schemes may add latency to communication. The memory system may require latency to be controlled. The one or more data transmission schemes may require information to be buffered (e.g. using one or more Rx buffers, one or more Tx buffers, etc.) in the one or more CPUs, one or more stacked memory packages and/or other system components. Large buffers may add latency and/or cost to the memory system. Thus, latency and buffer architecture, for example, may be controlled by design of one or more data transmission schemes in the memory system. In one embodiment, the one or more data transmission schemes may be flexible, and/or configurable, and/or programmable, etc.

In FIG. 26-3, a matrix (e.g. group, collection, stream, section, arrangement, etc.) of data may be transmitted one or more connections 26-314, 26-316, 26-318, 26-320. In one embodiment, the one or more connections may be links, lanes, virtual lanes, channels, virtual channels, traffic classes, combinations of these and/or other buses, interconnect, connections, etc.

In FIG. 26-3, the matrix of data may contain one or more data cells 26-312. In FIG. 26-3, the data cells may correspond to a bit. In one embodiment, a data cell may be a bit, a byte, 8 bytes, or any length or size (e.g. a collection of bits, a bit vector, a matrix of bits, etc.). In one embodiment, a data cell may be fixed in size (e.g. length, width, number of bits, etc.) or a data cell may be variable in size, shape, form, etc.

In FIG. 26-3, the link cells 26-322 may correspond to one or more bits. In one embodiment, a link cell may correspond to (e.g. be the same as, be equal to, have a one-to-one correspondence with, etc.) a data cell. In one embodiment, one or more data cells may be mapped to one or more links cells, etc.

A cell (e.g. data cell and/or link cell etc.) may be any section, grouping, collection, packet, vector, matrix, matrix row(s), matrix column(s), arrangement, etc. of data, information, bits, symbols, group(s) of symbols, part(s) of symbols, characters, part(s) of character(s), group(s) of characters, flits, part(s) of flits, group(s) of flits, phits, part(s) of phits, group(s) of phits, combinations of these, etc. Cells may be distinct (e.g. may be non-overlapping), contiguous (e.g. cells may be adjacent, cell boundaries touch, etc.), non-contiguous (e.g. bits in cells may be dispersed, etc.), overlapping (e.g. one or more data bits may belong to one or more cells, etc.), combinations of these, and/or organized, shaped, formed in any manner (e.g. with respect to timing, bus location, multiplexing order, cell boundaries, etc.), etc.

In FIG. 26-3, a link cell may be a phit (e.g. may correspond to a phit, etc.).

In one embodiment, a flit may be multiple of 8 bytes or any length. In one embodiment, a phit may be multiple of 8 bytes or any length. In one embodiment, a flit may be multiple of a phit and/or any length. In one embodiment, one or more or all phits may contain one or more of a first kind of CRC and/or error code. In one embodiment, one or more or all flits may contain one or more of a second kind of CRC and/or other error code. For example, phits may contain a CRC-24 code and a rolling CRC code (e.g. these CRC codes may be appended to data to form the phit etc.) and flits may contain a CRC-32 code, etc.

In one embodiment, one or more data cells may contain one or more CRC and/or other error codes. For example, not all data may be CRC protected (e.g. some data is protected, some data is not protected). For example, one or more data cells may be protected by a hash code, hash function, perfect hash function, injective hash function, cryptographic hash function, rolling hash function, MD5 hash, combinations of these and/or any other code or functions, etc. Thus, for example, data protection at the data level may be separate from and/or used in conjunction with etc. data protection at other levels (e.g. phits, flits, etc.).

In one embodiment, one or more link cells may contain one or more CRC or other error codes. Thus, for example, data protection at the link level may be separate from and/or used in conjunction with etc. data protection at other levels.

In one embodiment, one or more error codes may be rolling error codes, rolling CRCs, function(s) of previously coded data, etc.

In one embodiment, a link cell may be flit, a packet, a command (e.g. command, response, request, completion, other logical container of data and/or information, etc.). In one embodiment, a link cell may be fixed in length (e.g. number of bits). In one embodiment, a link cell may be variable in length, size, shape, etc. and/or link cell properties may be programmable (e.g. configured at design time, at manufacture, at test, at start-up, during operation, etc.).

In one embodiment, a packet may be composed of one or more link cells. In one embodiment, the organization (e.g. ordering, makeup, structure, contents, etc.) of link cells may be fixed. In one embodiment, the organization (e.g. ordering, makeup, structure, contents, etc.) of link cells may be fixed may be variable and/or may be programmable (e.g. configured at design time, at manufacture, at test, at start-up, during operation, etc.). For example, the organization of link cells may depend on faults and/or failures in the memory system, power modes or power consumption of the memory system, bandwidth requirements, etc.

In one embodiment, the data cell may be different (e.g. in organization, timing, layout, shape, order, framing, multiplexing, etc.) from link cell. For example, the boundaries between data cells and/or groups of data cells may be fixed or variable while the link cells are fixed in organization. For example, the boundaries between link cells and/or groups of link cells may be fixed or variable while the data cells are fixed in organization, etc.

In one embodiment, the properties of links cells and/or data cells (e.g. boundaries, organization, sizes, lengths, etc.) may depend on (e.g. may be configured with, may be programmed for, etc.) one or more modes of operation of the memory system. For example link cells and/or data cells may be configured according to the use of one or more virtual channels, one or more virtual links, one or more modes, etc.

In one embodiment, the properties of links cells and/or data cells may be configured separately for Rx and Tx links, and/or Rx and Tx lanes, etc.

In one embodiment, one or more links cells may be mapped (e.g. correspond to, inserted in, copied to, forwarded to, etc.) one or more data cells using either a fixed or one or more variable (e.g. programmable, etc.) mapping schemes.

For example, in FIG. 26-3, data cells A, B, C, D may map to (e.g. may be inserted into, may correspond to, etc.) link cells E, F, G, H, as shown.

For example, in FIG. 26-3, data cells A, B, C, D may map to link cells H, G, F, E, as shown.

For example, in FIG. 26-3, data cell A may map to link cells E, F, G, H (e.g. a data cell may map to more than one link cell, etc.).

For example, in FIG. 26-3, data cell A may map to link cells E, F (e.g. data cells and/or link cells may be interleaved, etc.).

In one embodiment, one or more links cells may be arranged (e.g. data cells mapped to link cells such that, link cells reorganized, link cells shifted, null or other special link cells inserted, etc.) to align data (e.g. a header, marker, delimiter, framing symbol, character, bit sequence, and/or other information, etc.) with a particular connection (e.g. lane, link, etc.), and/or to align data in some other manner, or fashion, etc.

For example, in FIG. 26-3, data cells A, B, C, D may map to link cell E (e.g. more than one data cell may map to a link cell).

For example, in FIG. 26-3, data cells A, B, C, D may map to link cells E, F (e.g. data cells and/or link cells may be interleaved in any fashion, etc.).

For example, in FIG. 26-3, data cells K, L, M, N may map to link cells 0, P, Q, R (e.g. a contiguous group of more than one data cells may map to one connection, etc.).

For example, in FIG. 26-3, data cells K, L, M, N may map to link cells 0, P (e.g. one or more contiguous groups of more than one data cells may map to one or more link cells in one or more connections, etc.).

For example, in FIG. 26-3, data cells S, T, U, V may map to link cells W, X, Y, Z.

For example, in FIG. 26-3, data cells S, T, U, V may map to link cells W, Y, X, Z.

Thus it may now be seen that by altering, configuring, modifying etc. the size and/or organization etc. of data cells and/or link cells, as well as the mapping(s) of data cells to link cells, the properties (e.g. including bit location, bit alignment, etc.) of the data stream(s) transmitted on one or more connections (e.g. links, lanes, etc.) may be controlled. For purposes of simplifying explanation herein, this control may be defined as data organization. Data organization may be performed on data, commands (e.g. requests, responses, completions, etc.), and/or any other information that is to be transmitted (e.g. flow control, control words, frames, metaframes, status, framing symbols, other characters and/or symbols, bit sequences, combinations of these, etc.). Data organization may be used, for example, to simplify the design of one or more datapaths on one or more logic chip used in a stacked memory package. For example, the routing and/or forwarding of packets may be improved (e.g. circuits simplified, operations simplified, routing speed increased, forwarding latency reduced, and/or other performance metrics improved, etc.).

In one embodiment, data to be organized (e.g. a data cell A, etc.) may be a command (e.g. command, request, response, completion, etc.) or part or portions of a command.

In one embodiment, a group of data to be organized (e.g. data cells A, B, C, D, etc.) may be a command and/or multi-part command, etc.

In one embodiment, a command to be organized may comprise a group of data cells of any size (e.g. data cells 000-007, etc.).

In one embodiment, a command to be organized may comprise more than one group of data cells (e.g. data cells 000-007 and 016-023, etc.).

In one embodiment, data to be organized (e.g. a data cell A, etc.) may comprise packets and/or commands and/or parts or portions of packets and/or commands.

For example, a packet to be organized may comprise data cells 000-007 with a command 1 in data cells 000-003 and a command 2 in data cells 004-007

For example, packet 1 may comprise data cells 000-007, packet 2 may comprise data cells 008-015 with command 1 consisting of packet 1 and packet 2.

Of course, packets and/or commands may be of any size and located anywhere in one or more data matrices, possibly in one or more parts, portions, and/or groups, and possibly in any location(s) in the data matrices.

In one embodiment, link cells E, F, G, H may form a phit. In one embodiment, link cells E, F, G, H may form a flit. In one embodiment, link cells 0, P, Q, R may form a phit. In one embodiment, link cells 0, P, Q, R may form a flit. In one embodiment, link cells W, X may form a phit. In one embodiment, link cells W, X may form a flit. In one embodiment, link cells W, Y may form a phit. In one embodiment, link cells W, Y may form a flit. In one embodiment, link cells W, X, Y, Z may form a phit. In one embodiment, link cells W, X, Y, Z may form a flit.

In one embodiment, phits and/or flits may be spread (e.g. distributed, striped, etc.) across on or more lanes in a link (e.g. as in Intel QPI, etc.). In one embodiment, phits and/or flits may be spread (e.g. distributed, striped, etc.) across on or more links. In one embodiment, phits and/or flits may be spread (e.g. distributed, striped, etc.) across on or more links and one or more lanes in each link.

In one embodiment, one or more link cells and/or data cells may be inserted in one or more streams as part of data organization. For example, error codes, control words, flow control data and/or information, frame headers, markers, delimiters, control characters, control symbols, framing characters and/or symbols, bit sequences, metaframe headers, combinations of these and other data and/or information, etc. may be inserted into one or more streams.

FIG. 26-4

FIG. 26-4 shows a receiver (Rx) datapath 26-400, in accordance with one embodiment. As an option, the Rx datapath may be implemented in the context of the previous Figures and/or any subsequent Figure(s). Of course, however, the Rx datapath may be implemented in the context of any desired environment.

In one embodiment, the Rx datapath may be part of the logic on a logic chip that is part of a stacked memory package, for example. A logic chip may contain one or more Rx datapaths. The following description may cover the elements, components, circuit blocks (also circuits, blocks, macros, cells, macrocells, library cells, functional blocks, etc.), functions, etc. of the Rx datapath, but may also apply to the Tx datapath. A more detailed description of the Tx datapath follows the description of the Rx datapath. The detailed descriptions of the Rx datapath above, here and below (and the following description of the Tx datapath) may also apply to other Figures in this application and in applications incorporated herein by reference.

In one embodiment, the Rx datapath (and/or Tx datapath) may implement one or more functions of a layered protocol. A layered protocol may include a transaction layer, a data link layer, and a physical layer. A memory system may use one or more stacked memory packages that may be coupled using a network (e.g. using high-speed serial links, etc.) that may use one or more protocols (e.g. protocol standards, interconnect fabrics, interconnect systems, etc.) and/or one or more layered protocols. Protocols may include one or more of the following (but not limited to the following) protocols, standards, or systems: PCI Express, RapidIO, SPI4.2, Intel QPI, HyperTransport, Interlaken, Infiniband, SerialLite, Ethernet (copper, optical, etc.), versions of these protocols/standards/systems, other protocols/standards/systems (e.g. using wired, wireless, optical, proximity, magnetic, induction, etc. technology), protocols based on these and/or combinations of these standards or systems, etc.

In one embodiment, the Rx datapath (and/or Tx datapath) may follow (e.g. use, employ, meet, adhere to, etc.) a standard protocol, and/or be derived from (e.g. with modifications, etc.) a standard protocol, and/or be a subset of a standard protocol, and/or use one or more non-standard protocols, and/or use a custom protocol, combinations of these, etc. In some embodiments, a memory system using stacked memory packages may use more than one protocol and/or version(s) of protocol(s), etc. (e.g. PCI Express 1.0 and PCI Express 2.0, etc.). In this case, one or more components and/or resources (e.g. one or more logic chips, one or more CPUs, combinations of these and/or other system components, etc.) in the memory system may convert (e.g. translate, bridge, join, etc.) between protocols (e.g. different protocols, different versions of protocols, different standards, different versions of standards, different systems, different versions of systems, etc.).

In one embodiment, the Rx datapath (and/or Tx datapath) e.g. signals, functions, packet formats, etc. may follow any protocol. In the following description examples may be given that use, for example, the PCI Express protocol to illustrate the functions (e.g. behavior, logical behavior, etc.) and/or other characteristics of one or more circuit blocks and/or interaction(s) between circuit blocks. Other protocols, standards, and/or systems may of course equally be used. In some cases, certain functions may have different behavior in different protocols. In some cases, certain functions may be absent in different protocols. In some cases, the interaction of functions may be different in different protocols. In some cases, the packets, etc. (e.g. packet fields, packet formats, packet types, packet functions, etc.) and/or signals, etc. may be different in different protocols. The following description is by way of example only and no limitations should be understood by the use of a specific protocol that may be used to clarify explanations.

For example, the PCI Express (PCIe, also PCI-E, etc.) protocol is a layered protocol. The PCI Express physical layer (PHY, etc.) specification may be divided (e.g. separated, split, portioned, etc.) into two layers, with a first layer corresponding to (e.g. including, describing, defining, etc.) electrical specifications and a second layer corresponding to logical specifications. The logical layer may be further divided into sublayers that may include, for example, a media access control (MAC) sublayer and a physical coding sublayer (PCS) (which may be part of the IEEE specifications but which may not be part of the PCIe specifications, for example). One or more standards or specifications (e.g. Intel PHY Interface for PCI Express (PIPE), etc.) may define the partitioning and the interface between the MAC sublayer and PCS and the physical media attachment (PMA) sublayer, including the SerDes and other analog/digital circuits. A standard or specification may or may not define (e.g. specify, dictate, address, regulate, etc.) the interface between the PCS and PMA sublayer. Thus, for example, the Rx datapath (and/or Tx datapath) may follow a number of different standards and/or specifications.

In FIG. 26-4, not all of the functions and/or blocks may be present in all implementations. Not all functions and blocks that may be present in some implementations may be shown in FIG. 26-4. FIG. 26-4 may represent the digital timing aspects (e.g. clock structure, clock crossings, number of clocked stages, critical timing paths, blocks/circuits/functions with longest latency, etc.) of the Rx datapath and may not show the detail of all circuits, blocks, and/or functions in each stage, for example. For example, not all of the analog and/or digital clock and data recovery (CDR) circuits in one or more SerDes, etc. may be shown in FIG. 26-4. FIG. 26-4 may represent, for example, the key timing elements (e.g. circuits, components, etc.) for an Rx datapath that may be used for the serial attach (e.g. via one or more high-speed serial links, etc.) of a variety of memory subsystems. For example, not all of the switching (e.g. crossbar etc.) functions e.g. for a stacked memory package, etc may be shown in FIG. 26-4. For example, there may be a crossbar (e.g. Rx crossbar, RxTx crossbar, MUXes, and/or other circuit blocks, structures, etc.) in the Rx datapath. For example, in one or more embodiments the switch delay(s) and/or or switching delay(s) of the crossbar(s) etc. may not be a key component in the latency of the Rx datapath (e.g. may not contribute significantly/materially to the critical path, etc.). However, for example, in one or more embodiments the switch delay(s) and/or or switching delay(s) of the crossbar(s) etc. may be a key component in the latency of the Rx datapath (e.g. may contribute significantly/materially to the critical path, etc.). Thus, for example, some components may be shown in some Figures that may show (e.g. illustrate, explain, describe, etc.) a datapath or portion(s) of a datapath etc. from one view, perspective, or focus (e.g. timing, etc.), but those same elements may not be shown in another Figure (even though they may be present) that may show a datapath or portion(s) of a datapath etc. from a different view, perspective, or focus (e.g. architecture, etc.).

For the same reason, or for similar reasons, other datapath functions may not be shown in FIG. 26-4 and/or in other Figures, for example. For example, the switch functions, switch fabric, etc. may be merged into one or more stages of the Rx datapath and thus not require a dedicated combinational logic stage, etc. For example, some circuits and/or functions may not be part of critical logic path(s) (e.g. may be off the main datapath, etc.) of the Rx datapath and thus not part of a combinational logic stage on the Rx datapath, etc.

More detail of each circuit block and/or function shown in the Rx datapath of FIG. 26-4 is given below. More detail of each circuit block and/or function that may be associated (e.g. part of, coupled to, connected to, operating in conjunction with, etc.) each circuit block and/or function shown in the Rx datapath of FIG. 26-4 is also given below. Still, for purposes of clarity of explanation, not all the details of each and every circuit block and/or function in the Rx datapath or associated with the Rx datapath (or other datapath, etc.) may be shown in all Figures herein or described here or in conjunction with the Figures, but it should be understood that those details of circuit blocks and/or functions, for example, that may be omitted or abbreviated, etc. may be standard functions and/or understood to be present and/or well known in the art of datapath, transceiver (e.g. receiver and transmitter, etc.), etc. design and/or shown elsewhere in Figures herein and/or described elsewhere in this application and/or described in applications incorporated herein by reference.

In one embodiment, the Rx datapath may use clocked combinational logic (e.g. combinational logic separated by clocked elements, components, etc. such as flip-flops, latches, and/or registers, etc. and/or clocking elements, components, etc. such as DLLs, PLLs, etc. Alternatives circuits, circuit styles, design styles, etc. may be used (e.g. alternative logic styles, logic families, circuit cells, clocking styles, etc.). For example, the Rx datapath (and/or Tx datapath, etc.) may be asynchronous (e.g. without clocking) or use asynchronous logic (e.g. use a mix of clocked combinational logic with asynchronous logic, etc.) or may use or include asynchronous design styles, etc. Thus the Rx datapath (and/or Tx datapath, etc.) may use different circuit implementations, but may maintain the same, similar, or largely the same functions, behavior, etc. as shown, for example, in FIG. 26-4 and/or other Figures.

In FIG. 26-4, the Rx datapath may include one or more of the following circuit blocks and/or functions: input pads and associated logic 26-410, which may be part of the pad macros and/or pad cells and/or near pad logic, etc; symbol aligner 26-412; DC balance decoder 26-414, e.g. 8B/10B decoder, etc; synchronizer Rx1 26-416; lane deskew and descrambler 26-418; data aligner 26-420; unframer (also deframer) 26-422.

In one embodiment, the symbol aligner, DC balance decoder, synchronizer, lane deskew, descrambler, unframer and/or other functional blocks and/or sub-blocks etc. may be part of the physical layer, and/or may be part of pad macros (e.g. cells, partitions of cells, etc.) and/or near-pad logic (NPL), etc. In one embodiment, for example, these circuit blocks and/or functions may be part of one or more SerDes circuit blocks.

In one embodiment, the receiver portion(s) of the pad macro(s) (e.g. input pad macros, input pad cells, NPL, SerDes, etc.) may contain one or more circuit blocks including one or more of the following (but not limited to the following) circuit blocks and/or functions: symbol aligner, DC balance decoder, synchronizer, lane deskew, descrambler, unframer (and/or other blocks and functions, etc.). In one embodiment, the receiver portion(s) of the pad macro(s) may perform one or more of (but not limited to) the following functions: (1) configure (e.g. program, control, set, etc.) one or more of the input pad analog and/or digital parameters, characteristics, electrical functions, analog functions, logical functions, etc. (e.g. single-ended, differential, small-signal impedance, input termination, common-mode voltage, AC/DC coupling, power levels, bias currents, timing, etc.); (2) perform monitoring and detection (e.g. beacon, etc.) and/or other idle management functions (e.g. idle management, etc.); (3) receive the serial data (e.g. acquire and maintain bit lock, perform data recovery, etc.) comprising pseudosymbols (raw symbol groups, e.g. a symbol boundary may be between any of the bits in a pseudosymbol, etc.) and the symbol clock (e.g. parallel Rx clock, 250 MHz for PCI Express 1.0 8-bit, etc.) from the clock recovery block(s) (e.g. CDR in the pad macros, etc.) and convert the serial data to parallel (e.g. 10-bit, etc.) pseudosymbols; (4) perform symbol alignment detection (e.g. acquire and maintain symbol lock, etc.) (e.g. during the training sequences using a hysteresis algorithm, etc.) and convert pseudosymbols to aligned (e.g. valid, decoded, timed, etc.) symbols; (5) perform per-lane functions (e.g. per-lane training state functions, detect, polling, etc); (6) detect and correct the lane polarity inversion (e.g. lane polarity inversion, etc.); (7) perform clock compensation and/or deskew etc. (e.g. lane-to-lane de-skew, clock tolerance compensation, etc.) (e.g. using elastic buffer, SKP insertion, etc.); (8) synchronize the symbols from the generated (e.g. extracted, recovered, etc.) clock domain (e.g. symbol clock) to a core clock domain, if any (e.g. IP macro clock, etc.); (9) perform receiver detection and/or other link status, test, probe, characterization, maintenance, etc. functions; (10) perform loopback functions (e.g. for testing, for cut-through latency reduction, etc.); (11) perform DC balance decoding (e.g. 8b/10b decoding, 64b/66b decoding, 64b/67b decoding, 128/130 decoding, one or more other decoding functions, combinations of these, etc.) and/or other signal integrity, link quality, BER reduction functions etc; (12) unscramble the data (e.g. using a fixed polynomial, programmable polynomial, configurable polynomial, other configurable function(s), etc.) and/or otherwise decode and/or unscramble data with one or more (e.g. in serial, nested, in parallel, combinations of these, etc.) coding layers, etc; (13) perform link power management (e.g. active link state power management and/or other power management functions, etc.) and/or other link management functions, etc; (13) remove the physical layer framing symbols and/or other marker(s), delimiter(s), etc. (e.g. frame character(s), frame codes, K-codes, STP, SDP, END, EDB, etc.); (14) identify (e.g. classify, mark, separate, de-MUX, etc.) the packet type e.g. using the start symbol or other means, etc. (e.g. start character, STP for TLP, SDP for DLLP, etc.); (15) separate (e.g. extract, de-MUX, decode, split, etc.) the transaction layer packets (e.g. TLP, etc.) to TLP fields (e.g. sequence number, LCRC, etc.); (16) separate the data layer packets (e.g. DLLP, etc.) and/or other packets (e.g. control, flow control, diagnostic, etc.) to fields, etc; (17) perform other physical layer functions, logical operations, etc.

The term symbol may be used to represent the output of a DC balance encoder. The term character may be used to represent the input of the DC balance encoder. For example, the input to an 8b/10b (also 8B/10B) encoder may be an 8-bit character. For example, the output of an 8b/10b (also 8B/10B) encoder may be an 10-bit symbol. In general characters and symbols may be any width. If there is no DC balance encoder or DC balance decoder then the terms symbol and character may be used interchangeably. These terms are not always used consistently. For example, some special symbols (e.g. framing symbols, control symbols, etc.) are sometimes also called characters (e.g. framing characters, control characters, etc.).

In FIG. 26-4, the Rx datapath may include CRC checker 26-424: In one embodiment, the CRC checker block may be part of the data link layer. The CRC checker may perform CRC checks (e.g. match transmitted CRC with CRC calculated by the CRC checker, etc.) on packets (e.g. TLPs, DLLPs, etc.) and send validated (e.g. CRC matches, CRC valid, etc.) packets to the Rx transaction layer and/or other layers. The CRC checker may forward (e.g. send, signal, transmit, etc.) the result(s) of the CRC check to the Tx data link layer and/or other layers. The CRC checker may forward one or more fields from the packet (e.g. the sequence number of the packet, etc.) to the Tx data link layer or other layers (e.g. to enable transmission of Ack/Nak DLLPs, etc.). A packet that fails the CRC check (e.g. CRC mismatch, other error, etc.) may be discarded (e.g. dropped, deleted, removed, ignored, etc.). The CRC checker and/or associated logic may further (e.g. in addition to PHY layer classification, etc.) classify (e.g. identify, separate, de-MUX, etc.) valid packets and/or forward information, fields, data, etc. (e.g. Ack/Nak DLLP information may be identified and forwarded to the Tx data link layer etc, InitFC/UpdateFC DLLP flow control information may be identified and forwarded to the Tx transaction layer etc, PM (power management) DLLP information may sent to one or more layers, etc.).

In FIG. 26-4, the Rx datapath may include flow control Rx block 26-426. In one embodiment, the flow control Rx block may be part of the data link layer. The flow control Rx block may track (e.g. control, monitor, calculate, store and/or modify, update, increment, decrement, maintain timers, maintain/tack timeouts, etc.) the flow control (FC) data (e.g. FC credits, tokens, FC information, timers, etc.) available to the transmitter (Tx) and Tx datapath circuit blocks and/or other circuit blocks and/or other layers, etc. This flow control data may be forwarded to other blocks in the Rx data link layer and/or other layers. The flow control data, signals, and/or other credit information may be communicated (e.g. transferred, transmitted, shared, exchanged, updated, forwarded, signaled, etc.) across one or more links and/or by other means (e.g. in-band, using packets, out of band, using signals, XON/XOFF, token exchange, credit exchange, combinations of these, etc.). The flow control data, signals, and/or other flow control information (e.g. credit, credit limits, overflow, underflow, error information, flags, counters, indicators, quotas, status information, resource availability, full/empty signals, watermark/nearly empty/nearly full signals, idle, vacant, unused, inactive, busy, timers, timeouts, other FC signals, FC packets or portion(s) of packets, combinations of these, etc.) may be forwarded to the Tx transaction layer and/or other layer(s) for further processing and/or transmission and/or scheduling of transmission and/or other communication of FC information (e.g. transmission of UpdateFC DLLP etc. by the Tx data link layer, etc.).

In FIG. 26-4, the Rx datapath may include synchronizer Rx2 block 26-428. In one embodiment, the synchronizer Rx2 block may, if present, be part of the data link layer and may synchronize data from the clock used by the Rx datapath physical layer and/or Rx datapath data link layer to the clock used by the Rx datapath transaction layer. For example, the Rx datapath physical layer may use a first Rx clock frequency, e.g. a 250 MHz symbol clock; the Rx datapath data link layer (which may be part of an IP block, a third-party IP provided block, etc.) may use a second Rx clock frequency and a different clock (e.g. 400 MHz, etc.); the Rx datapath transaction layer (e.g. part of the memory controller logic etc. in a logic chip in a stacked memory package, etc.) may use a third Rx clock frequency, e.g. 500 MHz, etc. In this case, the synchronizer Rx2 block may synchronize from the second Rx clock frequency domain to the third Rx clock frequency domain. For example, the Rx datapath physical layer, the Rx datapath data link layer, the Rx datapath transaction layer may all use a first Rx clock frequency (e.g. a common Rx symbol clock, 250 MHz, 1 GHz, etc.). In this case, for example, the synchronizer Rx2 block may not be required.

In one embodiment, one or more datapaths may share a common clock (e.g. forwarded clock, distributed clock, clock(s) derived from a forwarded/distributed clock, etc.). For example, the Rx datapath and Tx datapath may share a common clock. In this case, the synchronizer Rx1 block and/or the synchronizer Rx2 block may not be required in the Rx datapath, for example.

In one embodiment, a datapath may change bus widths at one or more points in the datapath. For example, deserialization (e.g. byte deserialization, etc.) may be used to convert a first number of bits clocked at a first frequency to a second number of bits clocked at a second frequency, where the second number of bits may be an integer multiple of the first number of bits and the first frequency may be the same integer multiple of the second frequency. For example, deserialization in the Rx datapath may convert 8 bits clocked at 500 MHz (e.g. bandwidth of 4 Gb/s) to 16 bits clocked at 250 MHz (e.g. bandwidth of 4 Gb/s), etc.

In one embodiment, a gearbox, in a datapath etc, may be used to convert a first number of bits clocked at a first frequency to a second number of bits clocked at a second frequency, where the second number of bits may be a common fraction (e.g. a vulgar fraction, a fraction a/b where a and b are integers, etc.) of the first number of bits and the first frequency may be the same common fraction of the second frequency. For example, a gearbox may be used to rate match (e.g. for 64b/66b encoding etc.), etc. For example, a 66:64 receive gearbox may transform a 66-bit word at 156.25 MHz to a 64-bit word at 161.1328 MHz. For example, a gearbox may be used to step down (or step up) the bit rate. For example, a 40-bit word (e.g. datapath width, bus width, etc.) may be stepped up (e.g. increased, widened, etc.) to a 60-bit word and the bit rate stepped down (e.g. decreased, reduced, etc.) in frequency (e.g. output frequency/input frequency=40/60, reduced by a factor of ⅔, etc.).

In one embodiment, one or more synchronizers may be used to perform change of data format (e.g. bit rate, data rate, data width, bus width, signal rate, clock domain, clock frequency, etc.) using a clock domain crossing (CDC) method, asynchronous clock crossing, synchronous clock crossing, bus synchronizer, pulse synchronizer, serialization method, deserialization method, gearbox, gearbox function, etc.

Note that the block symbols and/or circuit symbols (e.g. the shapes, rectangles, logic symbols, lines and other shapes in the drawing, etc.) shown in FIG. 26-4 for the synchronizers (e.g. synchronizer Rx1, synchronizer Rx2) may not represent the exact circuits used to perform the function(s).

In one embodiment, one or more synchronizers may be used in a datapath etc. to perform one or more asynchronous clock domain crossings (e.g. from a first clock frequency to a second clock frequency, etc.). The one or more synchronizers may include one (or more than one) flip-flop clocked at the first frequency and one or more flip-flops clocked at a second frequency (e.g. to reduce metastability, etc.). Thus, in this case, the circuit symbols shown in FIG. 26-4 and/or other Figures may be a reasonably good (e.g. fair, true, like, etc.) representation of the circuits used for a synchronizer. However, more complex circuits may be used for a synchronizer and/or to perform the function(s) of clock domain crossing (e.g. using handshake signals, using NRZ signals, using pulse synchronizers, using FIFOs, using combinations of these, etc.). For example, more complex synchronization may be required for a bus, etc. For example, an NRZ (non-return-to-zero) or NRZ-based (e.g. using one or more NRZ signals, etc.) synchronizer may be used as a component (e.g. building block, part, piece, etc.) of a pulse synchronizer and/or bus synchronizer. For example, an NRZ synchronizer may be used to build a pulse synchronizer (e.g. synchronizer cells, macros, circuit provided by CAD tool vendors such as Synopsys DW_pulse_sync dual-clock-pulse synchronizer, Synopsys DW_pulseack_sync synchronizer, other synchronizer function(s), etc.). For example, an NRZ synchronizer may be used to build a bus synchronizer (e.g. Synopsys DW_data_sync, etc.).

In one embodiment, one or more synchronizers may be used to perform one or more synchronous clock domain crossings. For example a gearbox may perform a synchronous clock domain crossing using a serialization method, deserialization method, etc. For example, a synchronous clock domain crossing (e.g. gearbox, serializer, deserializer, byte serializer, byte deserializer, combinations of these and/or other similar functions, etc.) may be used instead of, together with, in place of, or at the same location as synchronizer Rx1 block, synchronizer Rx2 block, etc. For example, a synchronous clock domain crossing may be used instead of, together with, in place of, or at any location that a synchronizer block, etc. may be shown or at any location that a synchronizer block, etc. may be used (but not necessarily shown).

For example, a gearbox may be used to cross from a 500 MHz clock to a 1 GHz clock, where the 500 MHz clock and 1 GHz may be synchronized (e.g. the 500 MHz clock may be derived from the 1 GHz clock by a divider, etc.). In this case the gearbox may be a simple FIFO structure etc.

Therefore, it should be carefully noted and it should be understood that any circuit symbols used for the synchronizers, flip-flops and/or other functions, etc. in FIG. 26-4, and/or other Figures in this application and other applications incorporated by reference, for example, may represent (e.g. may stand for, may be a placeholder for, may be replaced by, may reflect, etc.) the function(s) performed and may not necessarily represent the circuit implementation(s). Simply put then, a symbol that may look like three flip-flops may represent a variety of clock synchronization or other clocking and/or timing functions, for example.

Note that the position (e.g. logical location, physical location, logical connectivity, etc.) of one or more synchronizers may be different from that shown in FIG. 26-4 or in other Figures. For example, the synchronizer Rx2 block may be located before the Rx buffers (as shown in FIG. 26-4) or after the Rx buffers, etc. Thus, clock domain crossing, timing correction, synchronization, etc. may occur anywhere in a datapath.

Note that the number(s) and type(s) of the synchronizers may be different from that shown in FIG. 26-4 or other Figures. For example, the synchronizer Rx1 block and/or synchronizer Rx2 block may be (e.g. may represent, may signify, etc.) any type of synchronization and/or clocking element, etc (e.g. a flip-flop, a collection of flip-flops, a synchronous clock crossing, a byte deserializer, a gearbox, a rate matching FIFO, bit slip, etc.). For example, the synchronizer Rx1 block may not be required, etc. For example, one or more synchronization functions and/or clocking functions, etc. may be combined with one or more other logical functions, circuit blocks, etc.

In FIG. 26-4, the Rx datapath may include Rx buffers 26-430, memory controller 26-432.

In one embodiment, the Rx buffers and/or memory controller may be, or considered to be, part of the transaction layer. There may be multiple memory controllers. For example, a logic chip in a stacked memory package may contain 4, 8, 18, 32, 64 or any number of memory controllers (including spare and/or redundant copies, etc.).

In one embodiment, the Rx buffers (and/or Tx buffers in the Tx datapath, for example) may be part of the memory controller and/or integrated with the memory controller, and/or one or more Rx buffers may be shared by one or more memory controllers, etc. In one embodiment, the Rx buffers (and/or Tx buffers in the Tx datapath) may be part (e.g. formed from portion(s), regions, etc.) of one or more stacked memory chips, or may be part of memory (e.g. NVRAM, SRAM, embedded DRAM, register files, multiport RAM, FIFOs, combinations of these, etc.) on one or more logic chips in a stacked memory package, or may be formed from combinations of these, etc. In one embodiment, the Rx buffers (and/or Tx buffers in the Tx datapath, for example) may form a first memory class (even if formed from combinations of memory types and/or technologies, etc.), while the memory regions in one or more stacked memory chips in a stacked memory package may form a second memory class (with memory class as defined herein including one or more specifications incorporated by reference).

For example, in one embodiment, one or more or all or parts of the Rx buffers and one or more or all or parts of the Tx buffers and/or one or more or all or parts of other buffers may be combined. In one embodiment, the buffers (e.g. Rx buffers and/or Tx buffers and/or other buffers, other memory, storage, etc.) may consist of one or more large buffers (e.g. embedded DRAM, multiport SRAM or other RAM, register file(s), etc.). In one embodiment, the buffers (e.g. in the Rx datapath, etc.) may consist of one or more buffers (e.g. storage, memory, etc.), possibly different types of buffer (e.g. LIFO, FIFO, register file, random access, multiport access, complex data structures, etc.), and possibly comprising different types of construction and/or technology (e.g. registers, flip-flops, SRAM, NVRAM, scratchpad memory, portions of the memory chips in a stacked memory package, groups of other memory and/or storage elements, combinations of these, etc.). Different regions (e.g. areas, structures, arrays, portions, parts, pieces, etc.) of one or more buffers may be dedicated to different functions (e.g. different traffic classes, traffic types, virtual channels, etc.).

In one embodiment, the buffers (e.g. in the Rx datapath, etc.) may be configured (e.g. at design time, manufacturing time, at test, at start-up, during operation, etc.) to buffer packets, packet data, packet fields, data derived from packets and/or other packet information, one or more channels, one or more virtual channels, one or more traffic classes, one or more data streams, one or more packet types, one or more command types, one or more request types, read commands, write commands, write data, error codes (e.g. CRC, etc.), tables, control data and/or commands, pointers, handles, pointers to pointers, linked lists, indexes, tags, counters, flags, data statistics, command statistics, error statistics, addresses, other tabular and/or data fields, etc. For example, one or more buffers (or parts of buffers, etc.) may be allocated to one or more of the following: posted transactions, header (PH), posted transactions, data (PD), non-posted transactions, header (NPH), non-posted transactions, data (NPD), completion transactions, header (CPLH), completion transactions, data (CPLD). Other similar and/or additional allocation, segregation, assignment, etc. of traffic, data, packets, etc. is possible. For example, isochronous traffic may be separated (e.g. physically, virtually, etc.) from non-isochronous traffic, in the Rx datapath (and/or Tx datapath), etc.

For example, data (e.g. packets, packet data, packet fields, data derived from packets and/or other packet information, etc.) may have an associated tag, index, pointer, field, etc. that denotes, indicates, or otherwise marks the type (e.g. class, channel, etc.) of data traffic (e.g. isochronous, real time, high priority, low priority, etc.). For example, a data tag, index, pointer, field, etc. may be stored in one or more buffers (Rx buffers, Tx buffers, other buffers, etc.) or in memory or other storage (e.g. flip-flops, latches, registers, etc.) associated with one or more buffers. For example, a data tag, index, pointer, field, etc. may be used to adjust the priority, order, etc. with which associated data in one or more buffers is processed, handled, or otherwise manipulated, etc.

In one embodiment, different regions of one or more buffers (e.g. in the Rx datapath, etc.) may be dedicated to different functions (e.g. different traffic classes, etc.). For example, the buffers may be used to buffer packets (e.g. flow control, other control, status, read data, write data, request, response, command packets, etc.) and/or portions of packets (e.g. header, one or more fields, CRC, digest, markers, other packet data, etc.), packet data, packet fields, data derived from packets and/or other packet information, read commands, write commands, write data, error codes (e.g. CRC, etc.), tables, control data and/or commands, pointers, handles, pointers to pointers, linked lists, indexes, tags, counters, flags, data statistics, command statistics, error statistics, addresses, other tabular and/or data fields, etc.

In one embodiment, the buffers (e.g. in the Rx datapath, etc.) may have associated control logic and/or other logic and/or functions (e.g. port management, arbitration logic, empty/full counters, read/write pointers, error handling, error detection, error correction, etc.).

In one embodiment, the memory controller(s) may be connected to core logic (e.g. to the logic chip core of one or more logic chips in a stacked memory package, etc.). The memory controller(s) may be coupled (e.g. coupled via TSVs and/or other through wafer interconnect means etc. in a stacked memory package, etc.) to one or more memory portions. A memory portion may be a memory chip or portions of a memory chip or groups of portions of one or more memory chips (e.g. memory regions, etc.). For example, a memory controller may be coupled to one or more memory chips in a stacked memory package. For example, a memory controller may be coupled to one or more memory regions (e.g. banks, echelons, etc.) in one or more memory chips in a stacked memory package. The memory controller(s) may be located on one or more logic chip(s) in a stacked memory package. The function(s) of the memory controller(s) and/or buffers may be split (e.g. partitioned, shared, etc.) between the logic chip(s) and one or more memory chips in a stacked memory package.

In one embodiment, the memory controller(s) may reorder commands, requests, responses, completions, packets or otherwise modify commands, requests, packets, responses, completions, etc. For example, in one embodiment, one or more memory controllers may modify the order of execution of commands and/or other requests, signals, etc. in the Rx datapath that may be directed at one or more stacked memory chips or portions of stacked memory chips (e.g. banks, groups of banks, echelons, etc.). For example, in one embodiment, one or more memory controllers may modify commands and/or other requests, signals, etc. in the Rx datapath that may be directed at one or more stacked memory chips or portions of stacked memory chips (e.g. banks, groups of banks, echelons, etc.). In one embodiment, the memory controller(s) may reorder commands, requests, packets or otherwise modify commands, requests, packets, in the Rx datapath and reorder or otherwise modify responses and/or completions etc. in the Tx datapath.

For example, a memory controller may modify the order of read requests and/or write requests and/or other requests/commands/responses, etc. For example, a memory controller may modify, create, alter, change, insert, delete, merge, transform, etc. read requests and/or write requests and/or other requests/commands/responses/completions, etc.

In one or more embodiments there may be more than one memory controller (and this may generally be the case). For example a stacked memory package may have 2, 4, 8, 16, 32, 64 or any number of memory controllers. Reordering and/or other modification of packets, commands, requests, responses, completions, etc. may occur using logic, buffers, functions, etc. within (e.g. integrated with, part of, etc.) each memory controller; using logic, buffers, functions, etc. between (e.g. outside, external to, associated with, coupled to, connected with, etc.) memory controllers; or a combination of these, etc.

For example, a stacked memory package or other memory system component, etc. may receive packets P1, P2, P3, P4 The packets may be sent and received in the order P1 first, then P2, then P3, and P4 last. There may be four memory controllers M1, M2, M3, M4. Packets P1 and P2 may be processed by M1 (e.g. P1 may contain a command, read request etc., addressed to one or more memory regions controlled by M1, etc.). Packet P3 may be processed by M2. Packet P4 may be processed by M3. In one embodiment, M1 may reorder P1 and P2 so that any command, request, etc. in P1 is processed before P2. M1 and M2 may reorder P2 and P3 so that P3 is processed before P2 (and/or P1 before P2, for example). M2 and M3 may reorder P3 and P4 so that P4 is processed before P3, etc.

For example, a stacked memory package or other memory system component, etc. may receive packets P1, P2, P3, P4 The packets may be sent and received in the order P1 first, then P2, then P3, and P4 last. There may be four memory controllers M1, M2, M3, M4. Packet P2 may contain a read command that requires reads using M1 and M2. Packet P1 may be processed by M1 (e.g. P1 may contain a read request addressed to one or more memory regions controlled by M1, etc.). Packets P1 may be processed by M1 (e.g. P1 may contain a read request addressed to one or more memory regions controlled by M2, etc.). The responses from M1 and M2 may be combined (possibly requiring reordering) to generate a single response packet P5. Combining, for example, may be performed by logic in M1, logic in M2, logic in both M1 and M2, logic outside M1 and M2, combinations of these, etc.

In one embodiment, a memory controller and/or a group of memory controllers (possibly with other circuit blocks and/or functions, etc.) may perform such operations (e.g. reordering, modification, alteration, combinations of these, etc.) on requests and/or commands and/or responses and/or completions etc. (e.g. on packets, groups of packets, sequences of packets, portion(s) of packets, data field(s) within packet(s), data structures containing one or more packets and/or portion(s) of packets, on data derived from packets, etc.), to effect (e.g. implement, perform, execute, allow, permit, enable, etc.) one or more of the following (but not limited to the following): reduce and/or eliminate conflicts (e.g. between banks, memory regions, groups of memory regions, groups of banks, etc.), reduce peak and/or average and/or averaged (e.g. over a fixed time period, etc.) power consumption, avoid collisions between requests/commands and refresh, reduce and/or avoid collisions between requests/commands and data (e.g. on buses, etc.), avoid collisions between requests/commands and/or between requests/commands and other operations, increase performance, minimize latency, avoid the filling of one or more buffers and/or over-commitment of one or more resources etc., maximize one or more throughput and/or bandwidth metrics, maximize bus utilization, maximize memory page (e.g. SDRAM row, etc.) utilization, avoid head of line blocking, avoid stalling of pipelines, allow and/or increase the use of pipelines and pipelined structures, allow and/or increase the use of parallel and/or nearly parallel and/or simultaneous and/or nearly simultaneous etc. operations (e.g. in datapaths, etc.), allow or increase the use of one or more power-down or other power-saving modes of operation (e.g. precharge power down, active power down, deep power down, etc.), allow bus sharing by reordering commands to reduce or eliminate bus contention or bus collision(s) (e.g. failure to meet protocol constraints, improve timing margins, etc.), etc., perform and/or enable retry or replay or other similar commands, allow and/or enable faster or otherwise special access to critical words (e.g. in one or more CPU cache lines, etc.), provide or enable use of masked bit or masked byte or other similar data operations, provide or enable use of read/modify/write (RMW) or other similar data operations, provide and/or enable error correction and/or error detection, provide and/or enable memory mirror operations, provide and/or enable memory scrubbing operations, provide and/or enable memory sparing operations, provide and/or enable memory initialization operations, provide and/or enable memory checkpoint operations, provide and/or enable database in memory operations, allow command coalescing and/or other similar command and/or request and/or response and/or completion operations (e.g. write combining, response combining, etc.), allow command splitting and/or other similar command and/or request and/or response and/or completion operations (e.g. to allow responses to meet maximum protocol payload limits, etc.), operate in one or more modes of reordering (e.g. reorder reads only, reorder writes only, reorder reads and writes, reorder responses only, reorder commands/request/responses within one or more virtual channels etc., reorder commands/request/responses between (e.g. across, etc.) one or more virtual channels etc., reorder commands and/or requests and/or responses and/or completions within one or more address ranges, reorder commands and/or requests and/or responses and/or completions within one or more memory classes, combinations of these and/or other modes, etc.), permit and/or optimize and/or otherwise enhance memory refresh operations, satisfy timing constraints (e.g. bus turnaround times, etc.) and/or timing windows (e.g. tFAW, etc.) and/or other timing parameters etc., increase timing margins (analog and/or digital), increase reliability (e.g. by reducing write amplification, reducing pattern sensitivity, etc.), work around manufacturing faults and/or logic faults (e.g. errata, bugs, etc.) and/or failed connections/circuits etc., provide or enable use of QoS or other service metrics, provide or enable reordering according to virtual channel and/or traffic class priorities etc, maintain or adhere to command and/or request and/or response and/or completion ordering (e.g. for PCIe ordering rules, HyperTransport ordering rules, other ordering rules/standards, etc.), allow fence and/or memory barrier and/or other similar operations, maintain memory coherence, perform atomic memory operations, respond to system commands and/or other instructions for reordering, perform or enable the performance of test operations and/or test commands to reorder (e.g. by internal or external command, etc.), reduce or enable the reduction of signal interference and/or noise, reduce or enable the reduction of bit error rates (BER), reduce or enable the reduction of power supply noise, reduce or enable the reduction of current spikes (e.g. magnitude, rise time, fall time, number, etc.), reduce or enable the reduction of peak currents, reduce or enable the reduction of average currents, reduce or enable the reduction of refresh current, reduce or enable the reduction of refresh energy, spread out or enable the spreading of energy required for access (e.g. read and/or write, etc.) and/or refresh and/or other operations in time, switch or enable the switching between one or more modes or configurations (e.g. reduced power mode, highest speed mode, etc.), increase or otherwise enhance or enable security (e.g. through memory translation and protection tables or other similar schemes, etc.), perform and/or enable virtual memory and/or virtual memory management operations, perform and/or enable operations on one or more classes of memory (with memory class as defined herein including specifications incorporated by reference), combinations of these and/or other factors, etc.

In one embodiment, the ordering and/or reordering and/or modification of commands, requests, responses, completions etc. may be performed by reordering, rearranging, resequencing, retiming (e.g. adjusting transmission times, etc.), and/or otherwise modifying packets, portions of packets (e.g. packet headers, tags, ID, addresses, fields, formats, sequence numbers, etc.), modifying the timing of packets and/or packet processing (e.g. within one or more pipelines, within one or more parallel operations, etc.), the order of packets, the arrangements of packets and/or packet contents, etc. in one or more data structures. The data structures may be held in registers, register files, buffers (e.g. Rx buffers, logic chip memory, etc.) and/or the memory controllers, and/or stacked memory chips, etc. The modification (e.g. reordering, etc.) of data structures may be performed by manipulating data buffers (e.g. Rx data buffers, etc.) and/or lists, linked lists, indexes, pointers, tables, handles, etc. associated with the data structures. For example, a read pointer, next pointer, other pointers, index, priority, traffic class, virtual channel, etc. may be shuffled, changed, exchanged, shifted, updated, swapped, incremented, decremented, linked, sorted, etc. such that the order, priority, and/or other manner that commands, packets, requests etc. are processed, handled, etc. is modified, altered, etc.

In one embodiment, the memory controller(s) may insert (e.g. existing and/or new) commands, requests, packets or otherwise create and/or delete and/or modify commands, requests, responses, packets, etc. For example, copying (of data, other packet contents, etc.) may be performed from one memory class to another via insertion of commands. For example, successive write commands to the same, similar, adjacent, etc. location may be combined. For example, successive write commands to the same, location may allow one or more commands to be deleted. For example, commands may be modified to allow the appearance of one or more virtual memory regions. For example, a read to a single virtual memory region may be translated to two (or more)

reads to multiple real (e.g. physical) memory regions, etc. The insertion, deletion, creation and/or modification etc. of commands, requests, responses, completions, etc. may be transparent (e.g. invisible to the CPU, system, etc.) or may be performed under explicit system (e.g. CPU, OS, user configuration, BIOS, etc.) control. The insertion and/or modification of commands, requests, responses, completions, etc. may be performed by one or more logic chips in a stacked memory package, for example. The modification (e.g. command insertion, command deletion, command splitting, response combining, etc.) may be performed by logic and/or manipulating data buffers and/or request/response buffers and/or lists, indexes, pointers, etc. associated with the data structures in the data buffers and/or request/response buffers.

In one embodiment, one or more circuit blocks and/or functions in one or more datapath(s) may insert (e.g. existing and/or new) packets at the transaction layer and/or data link layer etc. or otherwise create and/or delete and/or modify packets, etc. For example, a stacked memory package may appear to the system as one or more virtual components. Thus, for example, a single circuit block in a datapath may appear to the system as if it were two virtual circuit blocks. Thus, for example, a single circuit block may generate two data link layer packets (e.g. DLLPs, etc.) as if it were two separate circuit blocks, etc. Thus, for example, a single circuit block may generate two responses or modify a single response to two responses, etc. to a status request command (e.g. may cause generation of two status response messages and/or packets, etc.), etc. Of course, any number of changes, modifications, etc. may be made to packets, packet contents, other information, etc. by any number of circuit blocks and/or functions in order to support (e.g. implement, etc.) one or more virtual components, devices, structures, circuit blocks, etc.

In one embodiment, the Rx datapath may include receiver clocking functions with one or more Rx clocks. There may be one or more DLLs in the pad macros (e.g. in the pad area, in the near-pad logic, in the SerDes, etc.) that may extract the Rx bit clock (e.g. 2.5 GHz, etc.) from the input serial data stream for each lane of a link. The Rx bit clock (e.g. first Rx clock domain) may be divided (e.g. by 10, etc.) to create a second Rx clock domain, the Rx parallel clock (symbol clock, recovered symbol clock, Rx symbol clock, etc.). The first Rx clock domain (bit clock) and second Rx clock domain (symbol clock) may be closely related (and typically in phase, derived from the same DLL, etc.) and thus may be regarded as a single clock domain. Thus, for example in FIG. 26-4, the clocking elements (e.g. flip-flops, registers, etc.) driven by the symbol clock (e.g. driven by the second Rx clock, in the second Rx clock domain, etc.), such as register 26-410, are marked "1". The received symbols may be synchronized to a third Rx clock domain (e.g. of an IP block or macro that may comprise, for example, the data link layer and/or transaction layer, etc.) by one or more synchronizers (e.g. FIFOs, etc.) that may also be located in the pad macros or near-pad logic. The third Rx clock domain, if present, may be a different frequency than the Rx symbol clock (second Rx clock domain), e.g. to allow the synchronizing FIFOs to have minimum depth and/or low latency, etc. In FIG. 26-4, the clocking elements (e.g. flip-flops, registers, etc.) driven by the third Rx clock are marked "2". The transaction layer and/or higher layer may use a fourth Rx clock domain. In FIG. 26-4, the clocking elements (e.g. flip-flops, registers, etc.) driven by the fourth Rx clock are marked "3".

In one embodiment, the Rx datapath (and/or Tx datapath) may be compatible with PCI Express 1.0, for example. Thus, the clock frequencies and characteristics for the Rx datapath may, for example, be as follows. The Rx bit clock frequency for PCI Express 1.0 may be 2.5 GHz (recovered clock, serial clock), and thus Rx bit clock period=1/2.5 GHz=0.4 ns. The clock C1 may be the Rx symbol clock (parallel clock) with fC1=Rx bit clock frequency/10=250 MHz (used by the PHY layer), but may have other values, and thus the Rx symbol clock period may be tC1=1/250 MHz=4 ns. The clock C2 may be the third Rx clock domain (if present) and, for example, fC2=312.5 MHz, but may have other values, and thus the C2 clock period may be tC2=1/312.5 MHz=3.2 ns. For example, C2 may be the clock present in an IP core or macro (e.g. third-party IP offering, etc.) implementation of part(s) of the Rx datapath, etc. The clock C3 may be the fourth Rx clock domain (if present) and, for example, fC3=500 MHz, but may have other values, and thus the C3 clock period may be tC3=1/500 MHz=2 ns. For example, C3 may be the core clock etc. (e.g. used by a logic chip in a stacked memory package, etc.). In FIG. 26-4, using this example clocking scheme with these example clock frequencies and clock periods, the Rx latency may thus be 3×tC1+7×tC2+3×tC3=3×4 ns+7×3.2 ns+3×2 ns=12 ns+22.4 ns+6 ns=40.4 ns. A PCIe 2.0 implementation or PCIe 2.0-based implementation of the Rx datapath may thus approach ½ of this value of 40.4 ns, e.g. about 20 ns. A PCIe 3.0 implementation or PCIe 3.0-based implementation of the Rx datapath may thus approach ¼ of this value of 40.4 ns, e.g. about 10 ns. The Rx latency of Rx datapaths based on different protocols (e.g. alternative protocols, modified protocols, different versions of protocols, etc.) may be estimated by summing the latencies of blocks (e.g. block with the same or similar functions, etc.) that are used. For example, an Rx datapath based on Interlaken technology, etc. may have a similar latency (allowing for any clock frequency differences, etc.). Note that an Rx datapath based on Interlaken or other technology, for example, may be similar to that shown in FIG. 26-4, but may not necessarily have exactly the same blocks and/or the same functions as shown in FIG. 26-4.

In FIG. 26-4, note that a component (e.g. portion, fraction, etc.) of the Rx latency may be contributed by one or more synchronizers in the Rx datapath. Implementations that may use one clock (e.g. symbol clock, etc.) for the Rx datapath or that may use two clocks (e.g. symbol clock and core clock, etc.) may have different latency, for example.

In FIG. 26-4, the latency of alternative paths (e.g. short-circuit paths, short cuts, cut through paths, bypass paths, etc.) may be similarly estimated. Thus, for example, a protocol datapath may implement a short-cut for input packets that are not destined for the logic chip in a stacked memory package, but may be required to be forwarded. For example, a short-cut in the Rx datapath of FIG. 26-4 may branch after the symbol aligner and forward data, packets, other information, etc. to the Tx datapath. In that case, using FIG. 26-4, the latency of the portion of the short-cut path that is in the Rx path may be estimated to be one clock cycle (e.g. 4 ns with an Rx symbol clock of 250 MHz, etc.). Such timing calculations may only give timing estimates because, with clocks approaching or exceeding 1 GHz for example, it may be difficult to achieve a latency of 1/1 GHz or 1 ns in any Tx datapath stage that involves pads, board routing, or cross-chip (e.g. across die, etc.) or other long routing paths.

FIG. 26-5

FIG. 26-5 shows a transmitter (Tx) datapath 26-500, in accordance with one embodiment. As an option, the Tx datapath may be implemented in the context of the previous Figures and/or any subsequent Figure(s). Of course, however, the Tx datapath may be implemented in the context of any desired environment.

In one embodiment, the Tx datapath may be part of the logic on a logic chip that is part of a stacked memory package, for example. A logic chip may contain one or more Tx datapaths. In one embodiment, the Tx datapath may implement one or more functions of the receive path of a layered protocol. A layered protocol may consist of a transaction layer, a data link layer, and a physical layer. A memory system may use one or more stacked memory packages coupled using one or more protocols (e.g. protocol standards, fabrics, interconnect, etc.) and/or one or more layered protocols. Protocols may include one or more of the following (but not limited to the following) protocols: PCI Express, RapidIO, SPI4.2, QPI, HyperTransport, Interlaken, Infiniband, SerialLite, Ethernet (copper, optical, etc.), versions of these protocols, other protocols (e.g. using wired, wireless, optical, proximity, magnetic, induction, etc. technology), combinations of these, etc. In FIG. 26-5, the Tx datapath may follow (e.g. use, employ, meet, adhere to, etc.) a standard protocol, and/or be derived from (e.g. with modifications, using features from, using a subset from, using a version of, etc.) a standard protocol, and/or be a subset of a standard protocol, and/or use one or more non-standard protocols, and/or use a custom protocol, combinations of these, etc. In some embodiments, a memory system using stacked memory packages may use more than one protocol and/or version(s) of protocol(s), etc. (e.g. PCI Express 1.0 and PCI Express 2.0, DDR3 and DDR4, etc.). In this case, one or more components and/or resources (e.g. one or more logic chips, one or more CPUs, combinations of these and/or other system components, etc.) in the memory system may convert (e.g. translate, bridge, join, etc.) between protocols (e.g. different versions of protocols, different protocols, different standards, different standard versions, etc.). For example, conversion may be between DDR3 and DDR4. Conversion may be performed anywhere in the memory system including the Tx datapath and/or Rx datapath, for example.

In one embodiment, the Tx datapath may follow any protocol. In the following description, one or more examples may be given that may use, for example, the PCI Express protocol to illustrate the functions (e.g. behavior, logical behavior, etc.) and/or other characteristics of each circuit block and/or interaction(s) between circuit blocks. Other protocols may of course equally be used. In some cases, certain functions may have different behavior in different protocols. In some cases, certain functions may be absent in different protocols. In some cases, the interaction of functions may be different in different protocols. In some cases, the packets, etc. (e.g. packet fields, packet formats, packet types, packet functions, etc.) may be different in different protocols. The following description is thus by way of example only and no limitations should be understood by the use of a specific protocol that may be used to clarify explanations, etc.

For example, the PCI Express (PCIe, also PCI-E, etc.) protocol is a layered protocol. The PCI Express physical layer (PHY, etc.) specification may be divided (e.g. separated, split, portioned, etc.) into two layers, corresponding to electrical specifications and logical specifications. The PCIe logical layer may be further divided into sublayers that may include, for example, a media access control (MAC) sublayer and a physical coding sublayer (PCS) (which may be part of the IEEE specifications but which may not be part of the PCIe specifications, for example). The Intel PHY Interface for PCI Express (PIPE), for example, defines the partitioning and the interface between the MAC sub-layer and PCS and the physical media attachment (PMA) sublayer, including the SerDes and other analog/digital circuits, but does not address (e.g. specify, dictate, define, regulate, etc.) the interface between the PCS and PMA sublayer. Thus, for example, the Tx datapath may follow a number of different standards and/or specifications.

Not all of the functions and/or blocks shown in FIG. 26-5 may be present in all implementations. Not all functions and blocks that may be present in some implementations may be shown in FIG. 26-5. FIG. 26-5 may, for example, represent the digital timing aspects (e.g. clock structure, clock crossings, number of clocked stages, critical timing paths, blocks/circuits/functions with longest latency, etc.) of the Tx datapath and may not show the detail of all circuits, blocks, and/or functions in each stage, for example. For example, not all of the output pad driver, serializer (e.g. SerDes, etc.), Tx crossbar, switching, switch fabric, etc. circuit blocks, and/or functions etc may be shown in FIG. 26-5. For example, some circuit blocks and/or functions may be merged into one or more stages of the Tx datapath and thus not require a dedicated combinational logic stage, etc. For example, some circuit blocks and/or functions may not be part of critical logic paths (e.g. may be off the main datapath, etc.) of the Tx datapath and thus not part of a combinational logic stage on the Tx datapath, etc. More detail of each circuit block and/or function in the Tx datapath of FIG. 26-5 is given below. More detail of each circuit block and/or function that may be associated (e.g. part of, coupled to, connected to, operating in conjunction with, etc.) each circuit block and/or function shown in the Tx datapath of FIG. 26-5 is also given below. Still, not all detail of each circuit block and/or function in the Tx datapath or associated with the Tx datapath may be described here for purposes of clarity of explanation, but it should be understood that those details of circuit blocks and/or functions, for example, that may be omitted or abbreviated etc. may be standard functions and/or understood to be present and/or well known in the art of datapath, transceiver (e.g. receiver and transmitter, etc.), etc. design and/or described elsewhere herein and/or described in applications incorporated herein by reference.

In one embodiment, the Tx datapath may use clocked combinational logic (e.g. combinational logic separated by clocked elements, components, etc. such as flip-flops, latches, and/or registers, etc. and/or clocking elements, components, etc. such as DLLs, PLLs, etc. Alternatives circuits (e.g. alternative logic styles, logic families, circuit cells, clocking styles, etc.) may be used. For example the Tx datapath may be asynchronous (e.g. without clocking) or use asynchronous logic (e.g. mix of clocked combinational logic with asynchronous logic, etc.). Thus the Tx datapath may use different circuit implementations but maintain the same, similar, or largely the same functions, behavior, etc. as shown in FIG. 26-5.

In FIG. 26-5, the Tx datapath may include: memory controller 26-510.

In one embodiment, the memory controller may be, or considered to be, part of the transaction layer. There may be multiple memory controllers. For example, a logic chip in a stacked memory package may contain 4, 8, 18, 32, 64, or any number of memory controllers (including spare copies and/or redundant copies and/or copies used for other purposes, etc.).

In one embodiment, the Tx buffers (and/or Rx buffers in the Rx datapath, for example) may be part of the memory controller and/or integrated with the memory controller, and/or be shared by one or more memory controllers, etc. The buffers (e.g. Rx buffers and/or Tx buffers, other buffers, storage, etc.) may include one or more large buffers (e.g. embedded DRAM, multiport SRAM or other RAM, register file, etc.). The buffers (e.g. in the Tx datapath, etc.) may include one or more buffers (e.g. storage, memory, etc.) possibly of different types or technology (e.g. registers, flip-flops, SRAM, NVRAM, scratchpad memory, portions of the memory chips in a stacked memory package, groups of other memory and/or storage elements, combinations of these, etc.). Different regions of one or more buffers may be dedicated to different functions (e.g. different traffic classes, virtual channels, etc.).

In one embodiment, the buffers may be configured (e.g. at design time, manufacturing time, at test, at start-up, during operation, etc.) to buffer packets, packet data, packet fields, data derived from packets and/or other packet information, one or more channels, one or more virtual channels, one or more traffic classes, one or more data streams, one or more packet types, one or more command types, one or more request types, read commands, write commands, write data, error codes (e.g. CRC, etc.), tables, control data and/or commands, pointers, handles, pointers to pointers, linked lists, indexes, tags, counters, flags, data statistics, command statistics, error statistics, addresses, other tabular and/or data fields, etc. For example, one or more buffers may be allocated to one or more of the following: posted transactions, header (PH), posted transactions, data (PD), non-posted transactions, header (NPH), non-posted transactions, data (NPD), completion transactions, header (CPLH), completion transactions, data (CPLD). Other similar allocation, segregation, assignment, etc. of traffic, data, packets, etc. is possible.

In one embodiment, different regions of one or more buffers may be dedicated to different functions (e.g. different traffic classes, etc.). For example, the buffers may be used to buffer packets (e.g. flow control, other control, status, read data, write data, request, response, command packets, etc.) and/or portions of packets (e.g. header, one or more fields, CRC, digest, markers, other packet data, etc.), packet data, packet fields, data derived from packets and/or other packet information, read commands, write commands, write data, error codes (e.g. CRC, etc.), tables, control data and/or commands, pointers, handles, pointers to pointers, linked lists, indexes, tags, counters, flags, data statistics, command statistics, error statistics, addresses, other tabular and/or data fields, combinations of these, etc.

In one embodiment, the buffers may have associated control logic and/or other logic and/or other functions (e.g. port management, arbitration logic, empty/full counters, read/write pointers, error handling, error detection, error correction, etc.).

In one embodiment, the memory controller(s) may be connected to core logic (e.g. to the logic chip core of one or more logic chips in a stacked memory package, etc.). The memory controller(s) may be coupled (e.g. coupled via TSVs in a stacked memory package, etc.) to one or more memory portions. A memory portion may be a memory chip or portions of a memory chip or groups of portions of one or more memory chips (e.g. memory regions, etc.). For example, a memory controller may be coupled to one or more memory chips in a stacked memory package. For example, a memory controller may be coupled to one or more memory regions (e.g. banks, echelons, etc.) in one or more memory chips in a stacked memory package. The memory controller(s) may be located on one or more logic chip(s) in a stacked memory package. The function(s) of the memory controller(s) may be split (e.g. partitioned, shared, etc.) between the logic chip(s) and one or more memory chips in a stacked memory package.

In FIG. 26-5, the Tx datapath may include: tag lookup 26-514, response header generator 26-516. In one embodiment, the tag lookup circuit block and response header generator may be part of the transaction layer. The tag lookup circuit block and response header generator may provide an interface to core logic (e.g. logic chip core of one or more logic chips in a stacked memory package, etc.).

In one embodiment, the tag lookup block may perform the function of tracking (e.g. using a tag field, etc.) non-posted requests (e.g. reads, requests expecting a response/completion, etc.). For example, HyperTransport may use the combination of a 5-bit UnitID field and/or a 5-bit SrcTag field to identify (e.g. track, mark, index, etc.) non-posted requests and associate (e.g. link, match, etc.) the completions with their requests. For example, PCIe may use a 16-bit Requester ID field and/or a 5-bit Tag field to identify non-posted requests and associate the completions with their requests. PCIe may also provide support for an extended tag field and phantom functions that may be used to extend tracking (e.g. to a greater number of outstanding requests, etc.).

In one embodiment, the response header generator may generate the response packets (e.g. completions for reads, etc.). The response header generator may also generate, construct, create, assemble, etc. other packets for transmission (e.g. transaction layer packets, flow control packets, TLP, DLLP, etc.). The response header generator may receive information, data, signals, etc. (e.g. descriptors, header, sequence number, CRC, other fields or portions of fields, etc.) from the transaction layer and/or other circuit blocks and/or other layers, etc. The response header generator may also send one or more packets and/or other data etc. to a retry buffer, replay buffer, and/or other storage location(s). If packets are lost, corrupted and/or other error(s) occur, etc. the system may perform a retry operation and/or replay operation, issue a retry command or equivalent (e.g. error message, error signal, error flag, Nak, etc.), and/or initiate a retry mode, etc. In a retry mode, for example, the response header generator may read one or more packets from the retry buffer. In a retry mode, the response header generator may then generate one or more transmit packets (possibly including header, any additional fields, CRC, etc.). The retry buffer may store packets until they are acknowledged. After acknowledgment (e.g. Ack DLLP reception, etc.) the retry buffer may discard one or more acknowledged packets. In one embodiment, the response header generator may use pre-formed, pre-calculated information, etc. for the header and/or other parts or portions of the response and/or completion packets, etc.

In FIG. 26-5, the Tx datapath may include: Tx buffers 26-518, synchronizer Tx1 26-520, flow control Tx 26-522. In FIG. 26-5, the Tx buffers, synchronizer Tx1, flow control Tx may be part of the transaction layer.

In one embodiment, the Tx buffers may be part of the memory controller (e.g. logically and/or physically, etc.) or part or portions of the Tx buffers may be part of the memory controller(s) and/or integrated with the memory controller, etc. The Tx buffers may consist of one large buffer (e.g. embedded DRAM, multiport SRAM or other RAM, register file, etc.). The Tx buffers may include one or more buffers (e.g. storage, memory, etc.) possibly of different types or technology or different memory classes (e.g. registers, flip-flops, SRAM, NVRAM, scratchpad memory, portions of the memory chips in a stacked memory package, groups of other memory and/or storage elements, combinations of these, etc.). The Tx buffers may be configured to buffer one or more channels, one or more virtual channels, one or more traffic classes, different data streams, different packet types, different command types, different request types, etc. For example, one or more Tx buffers may be allocated to one or more of the following: posted transactions, header (PH), posted transactions, data (PD), non-posted transactions, header (NPH), non-posted transactions, data (NPD), completion transactions, header (CPLH), completion transactions, data (CPLD). Other similar allocation, segregation, assignment, etc. of traffic, data, packets, etc. is possible. Different regions of one or more Tx buffers may be dedicated to different functions (e.g. different traffic classes, etc.). For example, the Tx buffers may be used to buffer packets and/or portions of packets, packet data, packet fields, data derived from packets and/or other packet information, read commands, write commands, write data, error codes (e.g. CRC, etc.), tables, control data and/or commands, pointers, handles, pointers to pointers, linked lists, indexes, tags, counters, flags, data statistics, command statistics, error statistics, addresses, other tabular and/or data fields, etc. The Tx buffers may have associated control logic and/or other logic and/or functions (e.g. port management, arbitration logic, empty/full counters, read/write pointers, error handling, error detection, error correction, etc.).

In FIG. 26-5, the Tx datapath may include: synchronizer Tx1 26-520.

In one embodiment, the synchronizer Tx1 block may, if present, be part of the data link layer and may synchronize data from the clock used by the Tx datapath transaction layer to the clock used by the Tx datapath physical layer and/or Tx datapath data link layer. For example, the Tx datapath physical layer may use a first Tx clock frequency, e.g. a 250 MHz symbol clock; the Tx datapath data link layer (which may be part of an IP block, a third-party IP provided block, etc.) may use a second Rx clock frequency and a different clock (e.g. 400 MHz, etc.); the Tx datapath transaction layer (e.g. part of the memory controller logic etc. in a logic chip in a stacked memory package, etc.) may use a third Tx clock frequency, e.g. 500 MHz, etc. In this case, the synchronizer Tx1 block may synchronize from the third Rx clock frequency domain to the second Tx clock frequency domain. For example, the Tx datapath physical layer, the Tx datapath data link layer, the Tx datapath transaction layer may all use a first Tx clock frequency (e.g. a common Tx symbol clock, 250 MHz, 1 GHz, etc.). In this case, the synchronizer Tx1 block may not be required.

In one embodiment, the Rx datapath and Tx datapath may share a common clock (e.g. forwarded clock, distributed clock, clock(s) derived from a forwarded/distributed clock, etc.). In this case, the synchronizer Tx1 block and/or the synchronizer Tx2 block may not be required.

In one embodiment, a datapath may change bus widths at one or more points in the datapath. For example, serialization (e.g. byte serialization, etc.) may be used to convert a first number of bits clocked at a first frequency to a second number of bits clocked at a second frequency, where the first number of bits may be an integer multiple of the second number of bits and the second frequency may be the same integer multiple of the first frequency. For example, serialization in the Tx datapath may convert 16 bits clocked at 250 MHz (e.g. bandwidth of 4 Gb/s) to 8 bits clocked at 500 MHz (e.g. bandwidth of 4 Gb/s), etc.

In one embodiment, a gearbox may be used to convert a first number of bits clocked at a first frequency to a second number of bits clocked at a second frequency, where the second number of bits may be a common fraction (e.g. a vulgar fraction, a fraction a/b where a and b are integers, etc.) of the first number of bits and the first frequency may be the same common fraction of the second frequency. For example, a gearbox in the Tx datapath of FIG. 26-5 may be used to rate match (e.g. for 64b/66b encoding etc.), etc. For example, a 64:66 transmit gearbox may transform a 64-bit word at 161.1328 MHz to a 66-bit word at 156.25 MHz. For example, a gearbox in the Tx datapath of FIG. 26-5 may be used to step up (or step down) the bit rate. For example, using a gearbox, a 60-bit word may be stepped down to a 40-bit word and the bit rate stepped up in frequency (e.g. output frequency/input frequency=60/40, increased by 3/2, etc.).

In one embodiment, one or more synchronizers may be used to perform change of data format (e.g. bit rate, data rate, data width, bus width, signal rate, clock domain, clock frequency, etc.) using a clock domain crossing (CDC) method, asynchronous clock crossing, synchronous clock crossing, bus synchronizer, pulse synchronizer, serialization method, deserialization method, gearbox function, etc.

Note that the block symbols and/or circuit symbols (e.g. the shapes, rectangles, logic symbols, lines and other shapes in the drawing, etc.) shown in FIG. 26-5 for the synchronizers (e.g. synchronizer Tx1, synchronizer Tx2) may not represent the exact circuits used to perform the function(s).

In one embodiment, one or more synchronizers may be used to perform one or more asynchronous clock domain crossings (e.g. from a first clock frequency to a second clock frequency, etc.). The one or more synchronizers may include one (or more than one) flip-flop clocked at the first frequency and one or more flip-flops clocked at a second frequency (e.g. to reduce metastability, etc.). Thus, in this case, the circuit symbols shown in FIG. 26-5 may be a reasonably good (e.g. fair, true, like, etc.) representation of the circuits used for a synchronizer. However, more complex circuits may be used for a synchronizer and/or to perform the function(s) of clock domain crossing (e.g. using handshake signals, using NRZ signals, using pulse synchronizers, using FIFOs, using combinations of these, etc.). For example, more complex synchronization may be required for a bus, etc. For example, an NRZ (non-return-to-zero) or NRZ-based (e.g. using one or more NRZ signals, etc.) synchronizer may be used as a component (e.g. building block, part, piece, etc.) of a pulse synchronizer and/or bus synchronizer. For example, an NRZ synchronizer may be used to build a pulse synchronizer (e.g. Synopsys DW_pulse_sync dual-clock-pulse synchronizer, Synopsys DW_pulseack_sync synchronizer, etc.). For example, an NRZ synchronizer may be used to build a bus synchronizer (e.g. Synopsys DW_data_sync, etc.).

In one embodiment, one or more synchronizers may be used to perform one or more synchronous clock domain crossings. For example a gearbox may perform a synchronous clock domain crossing using a serialization method, deserialization method, etc. For example, a synchronous clock domain crossing (e.g. gearbox, serializer, deserializer, byte serializer, byte deserializer, or other similar function, etc.) may be used instead of, or in place of, or at the same location as synchronizer Tx1 block, synchronizer Tx2 block, etc. For example, a synchronous clock domain crossing may be used instead of, or in place of, or at any location as a synchronizer block, etc. may be used.

In FIG. 26-5, for example, a gearbox may be used to cross from a 500 MHz clock to a 1 GHz clock, where the 500 MHz clock and 1 GHz may be synchronized (e.g. the 500 MHz may be derived from the 1 GHz clock by a divider, etc.). In this case the gearbox may be a simple FIFO structure etc.

Therefore, it should be carefully noted and it should be understood that any circuit symbols used for the synchronizers, flip-flops and/or other functions, etc. in FIG. 26-5, for example, may represent (e.g. may stand for, may be a placeholder for, may be replaced by, may reflect, etc.) the function performed and may not necessarily represent the circuit implementation(s).

Note that the position (e.g. logical location, physical location, logical connectivity, etc.) of the synchronizers may be different from that shown in FIG. 26-5. For example, the synchronizer Tx2 block may be located after the Tx crossbar (as shown in FIG. 26-5) or before the Tx crossbar, etc.

Note that the number(s) and type(s) of the synchronizers may be different from that shown in FIG. 26-5. For example, the synchronizer Tx1 block and/or synchronizer Tx2 block may be (e.g. may represent, may signify, etc.) a synchronous clock crossing, a byte deserializer, etc. For example, the synchronizer Tx1 block may not be required, etc.

In one embodiment, the flow control Tx block may perform one or more of the following (but not limited to the following) functions: (1) receive packets from the Tx buffers and send them to Tx data link layer; (2) receive flow control information from Rx data link layer (e.g. the flow control Rx block, etc.) and/or other circuit blocks and/or layers, etc; (3) update flow control information and forward the flow control information to Tx buffers and/or other circuit blocks and/or other layers, etc; (4) forward signals, data, information, etc. to the Tx data link layer to generate and/or transmit etc. flow control information (e.g. InitFC or UpdateFC DLLPs, etc.) based on the credit information from Rx datapath, etc.

In one embodiment, the flow control data may be forwarded to other blocks in the Tx data link layer and/or other layers. The flow control data, signals, and/or other credit information may be communicated (e.g. transferred, transmitted, shared, exchanged, updated, forwarded, signaled, etc.) across one or more links and/or by other means (e.g. in-band, out of band, combinations of these, etc.).

In FIG. 26-5, the Tx datapath may include: CRC generator 26-524. In one embodiment, the CRC generator may be part of the data link layer.

In one embodiment, the CRC generator may receive packets from the Tx transaction layer and may add and/or modify data, information, packet contents, etc. or otherwise format packets etc. (e.g. assign and/or add sequence numbers, calculate and/or add a CRC field, etc.). The CRC generator may queue or cause queuing (e.g. by forwarding signals, etc.) of the formatted packets (e.g. in a transmit buffer, etc.).

In one embodiment, other logic in the Tx data link layer (not necessarily shown in FIG. 26-5 for clarity) may perform one or more of the following (but not limited to the following) functions: (1) insert (e.g. write, insert pointer, update list, update index, etc.) and remove (e.g. read, remove pointer, update list, update index, etc.) packets and/or packet data etc. in/from one or more transmit buffers or other data structures (e.g. using an SRAM, eDRAM, register file(s), other memory, etc.); (2) receive and process packet acknowledgement signals, information, and/or packets (e.g. Ack/Nak, etc.) from the Rx data link layer and/or other layer(s); (3) manage the transmit buffer(s) (e.g. free space in the transmit buffer(s), schedule packet retransmission(s), etc.); (4) track transmitted packets (e.g. elapsed time, timeouts, timers, etc.); (5) schedule retransmission(s) (e.g. on a timeout, error, etc.); (6) receive and process packet information and/or other data (e.g. sequence number, error check codes, etc.) from the Rx data link layer and/or other layers; (7) generate acknowledgements (e.g. positive acknowledgement, negative acknowledgement, Ack/Nak DLLPs, etc.); (8) monitor (e.g. track, store, etc.) and report link and/or other status based on information, data, signals, etc. received from the physical layer and/or Rx data link layer and/or other layers; (9) initialize the virtual channel (e.g. VC0, VC1, etc.) and/or other flow control; (10) generate DLLPs (e.g. UpdateFC, etc.) based on information, data, signals, etc. received from the Tx transaction layer and/or other layers; (11) generate power and/or power management information, data, signals, packets, etc. (e.g. PM DLLPs, etc.); (12) arbitrate (e.g. prioritize, order, etc.) between the different packet types (e.g. TLP, DLLP, etc.); (13) forward packets to the physical layer; (14) maintain link and/or other status information; (15) control (e.g. direct, signal, etc.) the link management and/or other functions of the physical layer; (16) perform other data link layer functions, etc.

In FIG. 26-5, the Tx datapath may include: frame aligner 26-526, Tx crossbar 26-528, synchronizer Tx2 26-530, scrambler and DC balance encoder 26-532. In one embodiment, the frame aligner, Tx crossbar, synchronizer Tx2, scrambler and DC balance encoder may be part of the physical layer. One or more of these functions may not be present in all implementations. For example, the Tx crossbar may not be present in all implementations.

In one embodiment, the frame aligner and/or associated logic etc. may format (e.g. assemble and/or join from pieces/parts/portions, create fields, align fields, shift fields, adjust data/information/headers/fields, otherwise modify and form, etc.) one or more packets or packet types, etc. The frame aligner and/or associated logic etc. may add (e.g. insert, prepend, append, place, etc.) one or more symbols or one or more groups of symbols (e.g. K-codes, K28.2, K27.7, K29.7, STP, SDB, END, EDB, framing characters, skip ordered sets, IDLE symbols, idle and/or null characters, null data, markers, delimiters, combinations of these and/or other characters and/or symbols, etc.). The frame aligner and/or associated logic etc. may align and/or otherwise adjust, modify, form, etc. packets depending on factors such as the protocol, configuration, negotiated link width (e.g. depending on number of lanes, assign correct STP/SDB or other marker, place correct STP/SDB or other marker, allowing for byte striping, etc.), other factors, etc.

In one embodiment, the Tx crossbar and/or associated logic etc. may perform one or more switching functions. For example, the Tx crossbar may allow data from any memory region to be transmitted on any link or lane. The Tx crossbar may be constructed from one or more switches (e.g. pass gates, pass transistors, etc.), one or more MUXes (e.g. combinational logic cells, groups of cells, special-purpose logic cells, logic array, etc.), combinations of these, etc. The Tx crossbar may include multiple sub-arrays (e.g. subcircuits, hierarchical circuits, regions, areas, circuits, cells, macros, logic arrays, logic areas, die areas, etc.). Splitting the Tx crossbar into subarrays may make die layout easier, may result in increased performance, etc. For example, one or more crossbar subarrays may be assigned to (e.g. associated with, coupled to, physically located near to, proximate to, in close physical proximity to, etc.) one or more memory controllers. For example, crossbar subarray(s) may be assigned (e.g. located near, etc.) to the SerDes, etc.

In one embodiment, the Tx crossbar and/or associated logic etc. may be combined with (e.g. integrated with, coupled with, connected with, etc.) one or more other crossbars, switching functions, switch fabrics, MUXes, etc.

in the Tx datapath and/or Rx datapath. For example, the Tx crossbar may perform the functions of an RxTx crossbar as shown in the context of one or more other Figures and accompanying text in this application and/or in applications incorporated by reference. For example, the Tx crossbar and one or more crossbars and/or switching functions (not shown in FIG. 26-5) may be combined to form an RxTx crossbar as shown in the context of other Figures in this application and/or applications incorporated by reference. For example, the Tx crossbar (or RxTx crossbar, etc.) may operate in conjunction with an Rx crossbar (e.g. perform logical functions equivalent to combinations of switches and/or switching functions and/or switching circuit blocks and/or switch fabrics shown in other Figures, etc.). Thus, the representation and/or location (e.g. within the Tx datapath, etc.) of the Tx crossbar in FIG. 26-5 should not be regarded as limiting in any way.

In one embodiment, the Tx crossbar (e.g. in a stacked memory package, etc.) may include the ability (e.g. may function, may perform, be operable, etc.) to connect (e.g. couple, join, logically connect, etc.) one or more memory controllers (#M memory controllers) to one or more links (#LK links). Each link may have one or more lanes (#LA lanes). In one embodiment, a single memory controller may be connected to a single link. Thus, for example, there may be eight memory controllers (#M=8) and four links (#LK=4) each with two lanes (#LA=2). Thus, the Tx crossbar may connect any four memory controllers to any four links, with one link per memory controller. In one embodiment the Tx crossbar may be able to connect more than one memory controller to a link. For example, the Tx crossbar may be able to connect a memory controller to a lane, etc. For example, using the configuration #M=8, #LK=4, #LA=2, the Tx crossbar may be able to connect eight memory controllers to eight lanes. Thus, each link may couple two memory controllers to an external memory system, etc. In one embodiment, the Tx crossbar may be able to couple a first number of lanes and/or links to a first memory controller and a second number of lanes and/or links to a second memory controller. For example, using the configuration #M=8, #LK=4, #LA=2, the Tx crossbar may connect a first memory controller to a single lane, a second memory controller to two lanes (e.g. two lanes in one link, two lanes in two links, etc.), a third memory controller to three lanes (e.g. with two lanes in a first link and one lane in a second link, with three lanes in three links, etc.), a fourth memory controller to four lanes (e.g. four lanes in two links, four lanes in four links, etc.) and so on.

In one embodiment, the Tx crossbar may be physically and/or logically located at different locations in the Tx datapath. For example, the Tx datapath may have different logic widths (e.g. bus widths, etc.) at different points. Thus, for example, the Tx datapath may operate at different frequencies at different points etc. For example, the Tx datapath physical layer may use a first Tx clock frequency, e.g. a 250 MHz symbol clock; the Tx datapath data link layer may use a second Tx clock frequency and a different clock (e.g. 400 MHz, etc.); the Tx datapath transaction layer (e.g. memory controller logic etc.) may use a third Tx clock frequency, e.g. 500 MHz, etc. In one embodiment, it may be preferable to locate the Tx crossbar functions at different points in the Tx datapath according to any frequency limits etc. of the switches, logic cells, etc. For example, the Tx crossbar may be located after the memory controller, etc.

In one embodiment, the synchronizer Tx2 and/or associated logic etc. may perform similar functions to the synchronizer Tx1.

In one embodiment, the scrambler (e.g. randomizer, additive scrambler, synchronous scrambler, self-synchronous scrambler, etc.) and/or associated logic etc. may perform data scrambling and/or other data operations according to a fixed or programmable (e.g. configurable, at design time, at manufacture, at test, at start-up, during operation, etc.) polynomial and/or other algorithm (e.g. PRBS, LFSR, etc.), process, combination of these, etc. The scrambler may operate in conjunction with the descrambler in the Rx datapath. The scrambler in the transmitter of a link and/or lane may operate in conjunction with the descrambler in the receiver of the link and/or lane (e.g. by exchange of synchronization data, synchronization words, and/or other scrambler state information, etc.).

In one embodiment, the DC balance encoder and/or associated logic etc. may perform encoding (e.g. 8b/10b encoding, 64b/66b encoding, 128b/130b, 64b/67b, etc.) according to a fixed or programmable (e.g. configurable, at design time, at manufacture, at test, at start-up, during operation, etc.) coding scheme or other algorithm, method, process, etc.

In one embodiment, other logic in the physical layer of the Tx datapath (not necessarily shown in FIG. 26-5 for clarity) may perform one or more of the following (but not limited to the following) functions: (1) perform link management (e.g. with inputs from the data link layer and/or Rx datapath physical layer, etc.); (2) perform loopback function(s) (e.g. generate PRBS test patterns, operate as loopback master, etc.); perform power management (e.g. active link state power management, etc.); (3) assemble transaction layer packets (e.g. insert sequence number and/or insert LCRC, etc.); (4) assemble flow control packets (e.g. DLLP, etc.); (5) forward packets to the pad macros and/or near pad logic; (6) perform other physical layer functions, etc.

In FIG. 26-5, the Tx datapath may include: output pads and associated logic 26-534 which may be part of the pad macros and/or pad cells and/or near pad logic, etc.

In one embodiment, the transmitter portion(s) of the pad macro(s) (e.g. output pad macros, output pad cells, NPL, etc.) may contain one or more circuit blocks and may perform one or more of (but not limited to) the following functions: (1) control (e.g. program, configure, etc.) the pad driver and/or other IO characteristics (e.g. driving characteristics, output enable functions, driving impedance, slew rate, PVT controls, emphasis, de-emphasis, equalization, filtering, etc.); (2) receive data (e.g. 10-bit symbols, etc.) from the Tx datapath physical layer; (3) synchronize and/or align (e.g. serialize, etc.) data (e.g. symbols, etc.) to the transmit bit clock; (4) forward data to the pad drivers; (4) other transmit functions and/or pad driver functions, etc.

In one embodiment, the Tx datapath may include transmitter clocking functions with one or more Tx clocks. There may be one or more DLLs in the pad macros (e.g. in the pad area, in the near-pad logic, etc.) that may generate the bit clock for each lane (e.g. 2.5 GHz, etc.). This Tx bit clock (e.g. first Tx clock domain) may be divided (e.g. by 10, etc.) to create a second Tx clock domain, the Tx parallel clock (symbol clock, Tx symbol clock, etc.). The first Tx clock domain (bit clock) and second Tx clock domain (symbol clock) are closely related (and typically in phase, derived from the same DLL, etc.) and thus may be regarded as a single clock domain. Thus, in FIG. 26-5, the clocking elements (e.g. flip-flops, registers, etc.) driven by the symbol clock (e.g. driven by the second Tx clock, in the second Tx clock domain, etc.), such as register 26-512, are marked “1”. The transmitted data may cross (e.g. be passed, be transferred, etc.) from a third Tx clock domain (e.g. of an IP block or macro that may comprise, for example, the data link layer and/or transaction layer, etc.) to the second Tx clock domain through one or more synchronizers (e.g. FIFOs, etc.) that may be located in the pad macros or near-pad logic. In FIG. 26-5, the clocking elements (e.g. flip-flops, registers, etc.) driven by the third Rx clock are marked “2”. The transaction layer and/or higher layer may use a fourth Tx clock domain. In FIG. 26-5, the clocking elements (e.g. flip-flops, registers, etc.) driven by the fourth Tx clock are marked “3”.

In one embodiment, the Tx datapath may be compatible with PCI Express 1.0, for example. Thus, the clock frequencies and characteristics may, for example, be as follows. The Tx bit clock frequency for PCI Express 1.0 may be 2.5 GHz (serial clock), and thus Tx bit clock period=1/2.5 GHz=0.4 ns. The clock C1 may be the Rx symbol clock (parallel clock) with fC1=Tx bit clock frequency/10=250 MHz (used by the PHY layer), but may have other values, and thus the Tx symbol clock period may be tC1=1/250 MHz=4 ns. The clock C2 may be the third Tx clock domain (if present) and, for example, fC2=312.5 MHz, but may have other values, and thus the C2 clock period may be tC2=1/312.5 MHz=3.2 ns. For example, C2 may be the clock present in an IP core or macro (e.g. third-party IP offering, etc.) implementation of part(s) of the Tx datapath, etc. The clock C3 may be the fourth Tx clock domain (if present) and, for example, fC3=500 MHz, but may have other values, and thus the C3 clock period may be tC3=1/500 MHz=2 ns. For example, C3 may be the core clock etc. (e.g. used by a logic chip in a stacked memory package, etc.). In FIG. 26-5, using this example clocking scheme with these example clock frequencies and clock periods, the Tx latency may thus be 3×tC1+6×tC2+4×tC3=3×4 ns+6×3.2 ns+4×2 ns=12 ns+19.8 ns+8 ns=39.8 ns. A PCIe 2.0 implementation or PCIe 2.0-based implementation of the Rx datapath may thus approach ½ of this value of 39.8 ns, e.g. about 20 ns. A PCIe 3.0 implementation or PCIe 3.0-based implementation of the Rx datapath may thus approach ¼ of this value of 39.8 ns, e.g. about 10 ns. The Rx latency of Rx datapaths based on different protocols (e.g. alternative protocols, modified protocols, different versions of protocols, etc.) may be estimated by summing the latencies of blocks (e.g. block with the same or similar functions, etc.) that are used. For example, an Rx datapath based on Interlaken technology, etc. may have a similar latency (allowing for any clock frequency differences, etc.). Note that an Rx datapath based on Interlaken or other technology, for example, may be similar to that shown in FIG. 26-5, but may not necessarily have exactly the same blocks and/or the same functions as shown in FIG. 26-5.

In FIG. 26-5, note that a component (e.g. portion, fraction, etc.) of the Tx latency may be contributed by one or more synchronizers in the Tx datapath. Implementations that may use one clock (e.g. symbol clock, etc.) for the Tx datapath or that may use two clocks (e.g. symbol clock and core clock, etc.) may have different latency, for example.

In FIG. 26-5, the latency of alternative paths (e.g. short-circuit paths, short cuts, cut through paths, bypass paths, etc.) may be similarly estimated. Thus, for example, a protocol datapath may implement a short-cut for input packets that are not destined for the logic chip in a stacked memory package, but may be required to be forwarded. For example, a short-cut in the Tx datapath of FIG. 26-5 may inject data, packets, other information, etc. (e.g. from a short-cut in the Rx datapath, etc.) before the scrambler and DC balance encoder. In that case, using FIG. 26-5, the latency of the portion of the short-cut path that is in the Tx path may be estimated to be one clock cycle (e.g. 4 ns with a Tx symbol clock of 250 MHz, etc.). Such timing calculations may only give timing estimates because, with clocks approaching or exceeding 1 GHz for example, it may be difficult to achieve a latency of 1/1 GHz or 1 ns in any Tx datapath stage that involves pads, board routing, or cross-chip (e.g. across die, etc.) or other long routing paths.

Certain elements, circuit blocks, and/or functions etc. of the Tx datapath of FIG. 26-5 may be similar to one or more elements, circuit blocks, and/or functions etc. of the Rx datapath of FIG. 26-4. While features etc. of elements, circuit blocks, functions, etc. may have been described with reference to the Tx datapath of FIG. 26-5 it should be recognized that such features etc. may equally apply to the Rx datapath of FIG. 26-4. Equally while features etc. of elements, circuit blocks, functions, etc. may have been described with reference to the Rx datapath of FIG. 26-4 it should be recognized that such features etc. may equally apply to the Tx datapath of FIG. 26-5. Thus, for example, one or more features described that may apply to the Rx buffers may be applied to the Tx buffers (and vice versa), etc.

As an option, the Tx datapath of FIG. 26-5 may be implemented in the context of the architecture and environment of the previous Figures and/or any subsequent Figure(s). Of course, however, the Tx datapath of FIG. 26-5 may be implemented in the context of any desired environment.

Table 17-1 shows transceiver parameters for transceivers using the 10GBASE-R, Interlaken, PCIe 1.0, PCIe 2.0, PCIe 3.0, XAUI protocols/standards. The parameters may correspond to IP (e.g. cores, cells, macros, etc.) available from third-party IP providers, including FPGA cores and macros, etc. The parameters focus on the PCS layer and may correspond, for example, to the Rx datapaths and Tx datapaths shown previous Figures in this application and in applications incorporated by reference, including, for example, FIG. 16-10B and/or FIG. 16-10C of U.S. Provisional Application No. 61/665,301, filed Jun. 27, 2012, titled “SYSTEM, METHOD, AND COMPUTER PROGRAM PRODUCT FOR ROUTING PACKETS OF DATA.” The Rx latency parameters shown in Table 17-1 may be an indication of the latency to be expected in similar implementations of the Rx datapath shown in FIG. 26-4, for example, when measured from the input pads to the output of the Rx buffers. Similarly, the Tx latency parameters shown in Table 17-1 may be an indication of the latency to be expected in similar implementations of the Tx datapath shown in FIG. 26-5, for example, when measured from input to the Tx buffers to the output pads. For example, from Table 17-1, the PCIe 2.0 implementation of the PCS portion of the Rx datapath may have a latency of 14-15 symbol clocks. With a symbol clock of 500 MHz and clock period of 2 ns, this may correspond to an Rx datapath latency of 28-30 ns, which is in line with the estimate given in the context of FIG. 26-4.

TABLE 17-1

Transceiver parameters.

| Transceiver | 10G-BASE-R | Interlaken | PCIe 1.0 | PCI3 2.0 | PCIe 3.0 | XAUI | Unit |
|---|---|---|---|---|---|---|---|
| Lane data rate | 10.3125 | 3.125-14.1 | 2.5 | 5 | 8 | 3.125 | Gbps |
| Channels | 0 | 1-24 | 1-8 (11) | 1-8 (11) | 1-8 (11) | 4 | Number |
| PCS-PMA interface | 40 | 40 | 10 | 10 | 32 | 10 | Bits |
| Gear box | 66:40 | 67:40 | (6) | (6) | Y | (6) | Ratio |
| Block Synchronizer | Y | Y | (7) | (7) | Y | (7) | Y/N |
| Disparity generator/checker | Y (1) | Y (2) | N | N | N | N | Y/N |
| Scrambler/Descrambler | Y | Y | N | N | Y | N | Y/N |
| DC balance encoder/decoder | 64/66 | 64/67 (3) | 8/10 | 8/10 | 128/130 | 8/10 | Bits/coded bits |
| BER monitor | Y | N | N | N | N | N | Y/N |
| CRC32 generator/checker | N | Y | Y | Y | Y | N | Y/N |
| Frame generator, Synchronizer (8) | N | Y | N | N | N | N | Y/N |
| RX FIFO | Y (4) | Y | Y (5) | Y (5) | Y (5) | Y | Y/N |
| TX FIFO | Y (5) | Y | Y (5) | Y (5) | Y (5) | Y | Y/N |
| Tx PCS latency (9) | 8-12 | 7-28 | 4-5 | 4-5 | 1-3 | — | Symbol clock cycles |
| Rx PCS latency (10) | 15-34 | 14-21 | 14-22 | 14-15 | 6-8 | — | Symbol clock cycles |
| Core/XCVR interface | 16/8 | 64/1 | 16 | 16 | 64-256 | 16 | Data/control bits |
| Core/XCVR interface | 156.25 | 78.125-352.5 | 250 | 250 | 125-250 | 156.25 | MHz |

Notes:
(1) Self-synchronous mode
(2) Frame synchronous mode
(3) Interlaken is a special case
(4) Clock compensation mode
(5) Phase compensation mode
(6) Rate match FIFO
(7) Word aligner, K28.5
(8) Interlaken is a special case
(9) From PCS Tx FIFO input to PMA serializer input
(10) From PMA deserializer output to PCS Rx FIFO output
(11) 1-8 virtual channels (VCs), 1-8 traffic classes (TCs)

FIG. 26-6

FIG. 26-6 shows a receiver datapath 26-600, in accordance with one embodiment. As an option, the Rx datapath may be implemented in the context of the previous Figures and/or any subsequent Figure(s). Of course, however, the Rx datapath may be implemented in the context of any desired environment.

In one embodiment, the Rx datapath may be part of the logic on a logic chip that is part of a stacked memory package, for example. A logic chip may contain one or more Rx datapaths.

In FIG. 26-6, the Rx datapath may include one or more of the following (but not limited to the following) circuit blocks and/or functions: input pads and associated logic 26-610, which may be part of the pad macros and/or pad cells and/or near pad logic, etc; symbol aligner 26-612; DC balance decoder 26-614, e.g. 8B/10B decoder, etc; lane deskew and descrambler 26-618; data aligner 26-620; unframer (also deframer) 26-622; CRC checker 26-624; flow control Rx block 26-626; Rx buffers 26-630; memory controller 26-632; Tx crossbar 26-638; clocked elements 26-610, 26-640, 26-636; data buses 26-644, 26-642, 26-646.

In FIG. 26-6, not all of the functions and/or blocks may be present in all implementations. Not all functions and blocks that may be present in some implementations may be shown in FIG. 26-6.

In FIG. 26-6, the circuit blocks and functions may be the same, or similar, to the circuit blocks and functions described in the context of other Figures and accompanying text in this application and/or other Figures and accompanying text of applications incorporated by reference.

FIG. 26-6 may represent the key timing elements (e.g. circuits, components, etc.) for an Rx datapath that may be used for the serial attach (e.g. via one or more high-speed serial links, etc.) of a variety of memory sub-systems. Thus, not all detail of each block and/or function in the Rx datapath or associated with the Rx datapath may be described here, but it should be understood that those details of blocks and/or functions, for example, that may be omitted or abbreviated etc. may be standard functions and/or understood to be present and/or well known in the art of datapath, transceiver (e.g. receiver and transmitter, etc.), etc. design and/or described elsewhere herein and/or described in applications incorporated herein by reference.

In one embodiment, there may be additional switching functions used to selectively or otherwise couple the input pads to one or more memory controllers. For example, in one embodiment, the memory controller circuit block(s) may include an Rx crossbar (e.g. switch, MUX functions, combinations of these, etc.) in order to selectively couple one or more input pads and/or one or more Rx datapaths to one or more memory controller circuit blocks. In one embodiment, the switching function(s) may be part of (e.g. merged with, integrated with, associated with, coupled to, connected with, etc.) one or more of the Rx buffers.

In one embodiment, all clocked elements (such as flip-flops, registers, latches, etc.) may use a single clock. For example, the Rx datapath may use the extracted symbol clock.

In FIG. 26-6, for example, the clocking scheme may use the following clock frequencies and clock periods: fC1=250 MHz, tC1=4 ns. In FIG. 26-6, using this example clocking scheme with these example clock frequencies and clock periods, the Rx latency (e.g. from inputs pads to memory controller) may thus be 8×tC1=8×4 ns=32 ns, for example.

Of course, any number of clocks may be used. Of course the clocks may have any relationship. For example, one or more parts of a datapath may be asynchronous and one or more parts of a datapath may be synchronous, etc.

In one embodiment, some datapath stages may be retimed, e.g. may be moved off the critical path and/or bypassed and/or pipelined, etc. This retiming, moving, reordering, rearrangement, re-architecture, parallelization, pipelining, bypassing, etc. of circuit blocks and/or functions may improve performance (e.g. decrease the datapath latency, etc.). Thus, for example, one or more circuit blocks and/or functions may perform functions, operations, switching, logic, in a parallel (e.g. at the same time, simultaneously, nearly the same time, parallel manner, etc.) and/or pipelined manner.

In one embodiment, the CRC checker may be moved off the critical path. For example, in FIG. 26-6, the CRC checker may branch from the main datapath using bus 26-644. In FIG. 26-6 the flow control Rx block and the CRC checker may then perform functions in parallel. For example, in FIG. 26-6, the logic delays and routing delays required to implement the functions of the flow control Rx block and associated logic may require more time (e.g. have a larger latency, etc.) than the logic delays and routing delays required to implement the functions of the CRC checker block and associated logic. Thus the Rx datapath critical path (which may determine the Rx datapath latency) may contain the flow control Rx block, but not the CRC checker. Of course, any circuit block and/or function may be similarly retimed.

In one embodiment, one or more architectural changes (e.g. to circuit blocks, to logic functions, to clocking, to protocol, to data fields, to data structures, etc.) may be made to accomplish retiming. For example, in FIG. 26-6, it may be desired to inform (e.g. signal, flag, etc.) one or more circuit blocks of events that have occurred in one or more parallel functions and/or operations. For example, a circuit block and/or function may forward one or more signals to one or more blocks and/or otherwise inform or signal one or more blocks to change (e.g. modify, alter, program, etc.) the function of, behavior of, etc. any, possibly parallel, functions and/or operations, etc. that may be in progress (or to be completed, or already completed, etc.) on data, information, etc. in or associated with packets in the datapath. Such change(s) may involve any change of function (e.g. stop, rewind, modify, mark, delete, discard, drop, cancel, nullify, etc.). Thus, for example, one or more packets, the packet pipeline, portions of the datapath, etc. may be modified using signals (e.g. halt, stop, drop, skip, bypass, forward, etc.) and/or by inserting (e.g. injecting, adding modifying, etc.) information, symbols, characters, codes, data, fields (e.g. null/special field values, symbols/characters, etc.), or other means, etc. Such modification(s) may be result in any modification in behavior, logical behavior, logical path, logical function, result(s), output(s), state(s), etc. (e.g. killed, halted, reset, changed, modified, short-circuited, bypassed, etc.).

In one embodiment, the CRC checker may forward signals to one or more blocks to change any functions that may be in progress or already completed on packets that may fail a CRC check. For example, a stomped CRC may be added to (e.g. stomped CRC inserted in, CRC modified in, etc.) a packet, where a stomped CRC may be a modified (e.g. inverted, etc.) CRC that is guaranteed to fail a later CRC check, etc. and thus may mark the packet as bad (e.g. in error, with bad data, with bad content, invalid, with invalid data, not to be transmitted, not to be further processed, to be dropped, etc.) as the packet or other information, etc. may flow through the datapath(s) etc. For example, in FIG. 26-6, the CRC checker may use bus 26-642 to signal, forward, otherwise convey, couple, communicate etc. data, packets, signals, fields, other information, data, packets etc. to the Rx buffers and/or other circuit blocks and/or functions.

In one embodiment, circuit blocks and/or functions may use one or more methods and/or means to signal status and/or mark, or otherwise identify packets, packet information, packet data, other data and/or information, etc. The identification may be used (e.g. employed, signaled, marked, injected, inserted, etc.) at one or more protocol layers (e.g. physical layer, data link layer, transaction layer, etc.) and/or levels. Such identification may be used to allow one or more circuit blocks to operate in a parallel mode, pipelined mode, retimed mode, etc. For example, a special framing character (e.g. EDB) may be used to mark bad packets, etc. For example, a special bit, special field (e.g. poison data, etc.), or other means may be used to mark and/or otherwise identify a packet that contains bad data, with bad content, etc. (e.g. as a result of a logic error, a datapath error, other fault/failure, etc.).

In one embodiment, one or more circuit blocks and/or functions may operate on packets, data, other information etc. in parallel, pipelined, retimed, and/or other modes and the separate results assembled, joined, aggregated, etc. Of course, any combination of signals and special fields, flags, bit values, etc. may be used to allow one or more circuit blocks and/or functions to operate in parallel and/or cooperate and/or operate in conjunction and/or operate in a pipelined manner and/or otherwise operate in a retimed fashion in the datapath.

In one embodiment, retiming may include the use of one or more special paths (e.g. bypass, short-cut, cut through, short-circuit, etc.).

For example, in one embodiment, one or more circuit blocks and/or functions in a datapath (e.g. the Rx and/or Tx datapath, etc.) may be retimed where retiming may include one or more of the following forms (e.g. modes, configurations, etc.) of operation: bypass, pipeline, parallel, short-cut, short-circuit, combinations of these, etc.

For example, in one embodiment, one or more circuit blocks and/or functions in a datapath (e.g. the Rx and/or Tx datapath, etc.) may be retimed, reconfigured, etc. under programmable control. For example, the logical paths, functions, operations, behavior, etc. of one or more datapaths and/or associated logic, etc. may be determined at design time, manufacture, test, at start-up, during operation, or combinations of these, etc.

For example, in the Rx datapath of FIG. 26-6, the clocked element 26-640, the Tx crossbar 26-638, the clocked element, output pads and associated logic 26-636 may be considered part of an accompanying Tx datapath (e.g. the Rx datapath and Tx datapath may be logically and physically coupled, connected at this point, etc.). For example, packets that arrive at the input pads may be required to be forwarded. Thus, for example, instead of passing through the entire Rx datapath one or more short-cuts, cut throughs, bypass paths, etc. may be used. For example, it may be determined that a packet is to be forwarded after one or more of the unframer block functions are completed (e.g. by inspection of a header, inspection of other field, etc.). In this case, one or more packets (or data associated with packets, packet information, data fields, headers, other fields, packet contents, etc.) may be sent (e.g. forwarded, transferred, etc.) from the output of the framer to the Tx datapath via a short-cut using bus 26-646, etc.

Of course, any point or points (e.g. positions, locations, logical point(s), physical point(s), electrical point(s), etc.) in the datapath (e.g. Rx datapath and/or Tx datapath, etc.) and/or datapath logic (e.g. to/from a bus or part of a bus, in the datapath logic, in associated logic and/or memory etc, combinations of these, etc.) may be used to branch and/or join for a short-cut path, bypass path, cut through path, parallel path, pipeline path, or otherwise retimed or modified path, etc.

In one embodiment, the clocking structure or one or more clocks in a datapath may be modified to allow retiming of the datapath, etc. For example, the clocking structure or one or more clocks in the Rx datapath and/or Tx datapath may be modified to allow retiming of the Rx datapath and/or Tx datapath, etc. For example, in FIG. 26-6, the clocking structure may be modified to use a single synchronous clock in all, or nearly all, of the Rx datapath and Tx datapath. Thus, for example, the input pads and associated logic 26-610 may use the same clock as output pads and associated logic 26-636. For example, in one embodiment, the Rx datapath clock (e.g. recovered Rx bit clock, Rx symbol clock, clocks derived from these and/or other Rx datapath clocks, etc.) may also be used to clock the Tx datapath or portions of the Tx datapath and/or associated logic, etc.

In one embodiment, a timing source (e.g. clock, etc.) may be used in either synchronous memory systems (e.g. master clock, etc.), source synchronous memory systems (e.g. separate clock forwarded by transmitter with data, etc.), clock forwarded memory systems (e.g. with DLL or other circuits etc. at the receiver to adjust any sampling clock delay, etc.), embedded clock memory systems (e.g. clock forwarded with data, etc.). For example, in embedded clock memory systems, buffers (e.g. elastic buffers, etc.) and/or other means (e.g. inserted spacer symbols, bit slip, rate match FIFOs, etc.) and/or other methods may be used to compensate for differences between transmitted clock and the clock at the receiver, etc. For example, a network (e.g. memory subsystem, network of memory devices using high-speed serial links, memory system with one or more stacked memory packages using serial links, etc.) may be operated in a synchronous manner by means of measuring link delays, and/or clock offsets, and/or other timing differences, delays, offsets, etc. and synchronizing multiple distributed clock reference sources across the network.

In one embodiment, one or more circuit blocks and/or functions in a datapath (e.g. Tx datapath, Rx datapath, etc.) may be bypassed (e.g. short-circuited, disabled, shortened, etc.). For example, a memory system may comprise one or more stacked memory chips, one or more logic chips, and one or more CPUs etc. in close physical proximity (and thus in close electrical proximity minimizing electrical load, interference, crosstalk, noise, etc.). For example, the CPUs and/or logic chips and/or stacked memory chips may be located in a single package, on a single substrate (e.g. using multi-chip packaging, MCP, etc.). In this case, and/or for other system design or considerations etc, various circuit blocks, functions, protocol features, etc. may not be required. For example, in one embodiment, the DC balance decoder in the Rx datapath of one or more (or all) links may be bypassed, possibly under programmable control. In this case, the corresponding (e.g. paired, Rx/Tx pair, etc.) DC balance encoders in the Tx datapath of the transmitters in the links may also be bypassed, etc. Bypassing one or more circuit blocks and/or datapath functions and/or short-circuiting, disabling, enabling, switching, programming, reprogramming, configuring, etc. one or more circuit blocks and/or datapath functions may, for example, allow latency reduction (e.g. the Rx datapath latency, and/or Tx datapath latency, and/or path latency, short-cut latency, short-circuit path latency, etc. within the Rx datapath and/or Tx datapath and/or associated logic, etc.) and/or change (e.g. improvement, reduction, increase, configuration, etc.) of other memory system and/or memory subsystem parameters (e.g. cost, power, speed, delay, determinism of timing, adjustment of timing, frequency of operation, reliability of operation, combinations of these and/or other metrics, parameters, etc.), possibly under programmable control.

FIG. 26-7

FIG. 26-7 shows a transmitter datapath 26-700, in accordance with one embodiment. As an option, the Tx datapath may be implemented in the context of the previous Figures and/or any subsequent Figure(s). Of course, however, the Tx datapath may be implemented in the context of any desired environment.

In FIG. 26-7, the Tx datapath may be part of the logic on a logic chip that is part of a stacked memory package, for example. A logic chip may contain one or more Rx datapaths.

In FIG. 26-7, the Tx datapath may include one or more of the following (but not limited to the following) circuit blocks and/or functions: memory controller 26-710, tag lookup 26-714, response header generator 26-716, flow control Tx 26-722, CRC generator 26-724, frame aligner 26-726, Tx crossbar 26-728, scrambler and DC balance encoder 26-732. One or more of these functions may not be present in all implementations. For example, the Tx crossbar may not be present in all implementations or may be logically located in a different place in the datapath, outside the datapath, etc. Not all functions and blocks that may be present in some implementations may be shown in FIG. 26-7. For example, one or more Tx buffers may be part of the memory controller(s), etc.

In one embodiment, all clocked elements (such as flip-flops, registers, latches, etc.) may use a single clock. For example, the Tx datapath may use the Rx symbol clock. The techniques employed to use a single clock in part or parts or all of the Tx datapath may be the same or similar to the techniques described in the context of FIG. 26-6, for example.

In FIG. 26-7, for example, the clocking scheme may use the following clock frequencies and clock periods: fC1=250 MHz, tC1=4 ns. In FIG. 26-7, using this example clocking scheme with these example clock frequencies and clock periods, the Tx latency (e.g. from logic chip to output pads) may thus be 8×tC1=8×4 ns=32 ns, for example.

Of course, any number of clocks may be used. Of course the clocks may have any relationship. For example, one or more parts of a datapath may be asynchronous and one or more parts of a datapath may be synchronous, etc.

In one embodiment, the same or similar techniques and/or methods and/or means to improve, modify, change datapath performance etc. to those described in the context of previous Figures, including Figures in applications incorporated by reference, and the text accompanying these Figures, may be used in conjunction with the Tx datapath of FIG. 26-7. For example, in one embodiment, some datapath stages may be retimed. For example, in one embodiment, one or more architectural changes (e.g. to circuit blocks, to logic functions, to clocking, to protocol, to data fields, to data structures, etc.) may be made to accomplish retiming. For example, in one embodiment, one or more circuit blocks and/or functions in the Rx and/or Tx datapath may be retimed where retiming may include one or more of the following forms (e.g. modes, configurations, etc.) of operation: bypass, pipeline, parallel, short-cut, short-circuit, combinations of these, etc. For example, in one embodiment, various blocks may use one or more methods and/or means to signal status and/or mark, or otherwise identify packets, packet information, packet data, other data and/or information, etc. For example, in one embodiment, one or more circuit blocks and/or functions may operate on packets, data, other information etc. in parallel, pipelined, retimed, and/or other modes and the separate results assembled, joined, aggregated, etc. For example, in one embodiment, one or more circuit blocks and/or functions in the Rx and/or Tx datapath may be retimed, reconfigured, etc. under programmable control. For example, in one embodiment, the clocking structure or one or more clocks in the Rx datapath and/or Tx datapath may be modified to allow retiming of the Rx datapath and/or Tx datapath, etc. For example, in one embodiment, one or more circuit blocks and/or functions in a datapath may be bypassed (e.g. short-circuited, disabled, shortened, etc.).

It should be noted that features, properties, construction, architecture, etc. of the datapaths described in the context of previous and/or subsequent Figures, including Figures in applications incorporated by reference, and the text accompanying these Figures may, in some cases, be applied equally to the Tx datapath and the Rx datapath, for example. For example, certain elements, circuit blocks, and/or functions etc. of the Tx datapath may be similar to one or more elements, circuit blocks, and/or functions etc. of the Rx datapath. While features etc. of elements, circuit blocks, functions, etc. may have been described with reference to the Tx datapath it should be recognized that such features etc. may equally apply to the Rx datapath. Equally while features etc. of elements, circuit blocks, functions, etc. may have been described with reference to the Rx datapath it should be recognized that such features etc. may equally apply to the Tx datapath. Thus, for example, one or more features described that may apply to the Rx buffers may be applied to the Tx buffers (and vice versa), etc.

FIG. 26-8

FIG. 26-8 shows a stacked memory package datapath 26-800, in accordance with one embodiment. As an option, the stacked memory package datapath may be implemented in the context of the previous Figures and/or any subsequent Figure(s). Of course, however, the stacked memory package datapath may be implemented in the context of any desired environment.

In one embodiment, the stacked memory package datapath may contain one or more datapaths. For example, in one embodiment, the stacked memory package datapath may contain one or more Rx datapaths and one or more Tx datapaths. For example, in FIG. 26-8, the stacked memory package datapath may contain Rx datapath 26-802 and Tx datapath 26-804. In one embodiment, one or more parts (e.g. portions, sections, etc.) of the stacked memory package datapath may be contained on a logic chip, CPU, etc.

In FIG. 26-8, the Rx datapath may include circuit blocks A-K.

In FIG. 26-8, the Rx datapath may include one or more of the following (but not limited to the following) circuit blocks and/or functions: block A 26-810, which may be part of the pad macros and/or pad cells and/or near pad logic, etc; block B 26-812; block C 26-814; block D 26-818; block E 26-820; block F 26-822; block G 26-824; block H 26-826; block I 26-834; block J 26-830; block K 26-832.

For example, in one embodiment, block A may be the input pads, input receivers, deserializer, and associated logic; block B may a symbol aligner; block C may be a DC balance decoder, e.g. 8B/10B decoder, etc; block D may be lane deskew and descrambler; block E may be a data aligner; block F may be an unframer (also deframer); block G may be a CRC checker; block H may be a flow control Rx block; block I may be an Rx crossbar; block J may be one or more Rx buffers; block K may be an Rx routing block.

In one embodiment, the stacked memory package datapath may contain one or more memory controllers. For example, in FIG. 26-8, the stacked memory package datapath may include one or more memory controllers M 26-840. In some embodiments, the memory controllers may be regarded as part of the Rx datapath and/or part of the Tx datapath.

In one embodiment, the stacked memory package datapath may contain one or more stacked memory chips. For example, in FIG. 26-8, the stacked memory package datapath may include one or more stacked memory chips N 26-842. The one or more stacked memory chips may be connected to the one or more memory controllers using TSVs or other forms of through-wafer interconnect etc. In some embodiments, the stacked memory chips may be regarded as part of the Rx datapath and/or part of the Tx datapath.

In FIG. 26-8, the Tx datapath may include circuit blocks O-W.

In FIG. 26-8, the Tx datapath may include one or more of the following (but not limited to the following) circuit blocks and/or functions: block 0 26-850; block P 26-852; block Q 26-854; block R 26-856; block S 26-858; block T 26-860; block U 26-862; block V 26-864; block W 26-866.

For example, in one embodiment, block 0 may be one or more TX buffers; block P may be a Tx crossbar; block Q may be a tag lookup block; block R may be a response header generator; block S may be a flow control Tx block; block T may be a CRC generator; block U may be a frame aligner; block V may be a scrambler and DC balance encoder; block W may contain serializer, output drivers, output pads and associated logic, etc.

One or more of the circuit blocks and/or functions that may be shown in FIG. 26-8 may not be present in all implementations or may be logically located in a different place in the stacked memory package datapath, outside the stacked memory package datapath, etc. Not all functions and blocks that may be present in some implementations may be exactly as shown in FIG. 26-8. For example, one or more Tx buffers and/or one or more Rx buffers may be part of the memory controller(s), etc. The clocked elements and/or clocking elements that may be present in the stacked memory package datapath may not be shown in FIG. 26-8. The stacked memory package datapath may, for example, contain one or more clocked circuit blocks, synchronizers, DLLs, PLLs, etc.

In one embodiment, the stacked memory package datapath may contain one or more short-circuit paths. In one embodiment, the stacked memory package datapath may contain one or more cut through paths. In one embodiment, the stacked memory package datapath may contain one or more bypass paths. In one embodiment, the stacked memory package datapath may contain one or more parallel paths.

For example, in one embodiment, one or more circuit blocks and/or functions may be bypassed, rewired, rearranged, by using switching means and/or other configuration means, etc. For example, in FIG. 26-8 block B may be bypassed and/or removed from the datapath (e.g. logically short-circuited, disabled, excluded from the datapath, etc.) by closing switch 26-880 (or by other equivalent logical means, etc.) and opening switch 26-882 (or by other equivalent logical means, etc.). In the same, or similar, fashion (e.g. logical manner, etc.) circuit blocks and/or functions C, D, E, F, G, H, R, S, T, U, V may be bypassed or disabled. Of course, any number of circuit blocks and/or functions may be bypassed.

For example, in one embodiment, one or more circuit blocks, memory chips, and/or functions or portions thereof (e.g. memory regions, memory classes, banks, groups of banks, echelons, etc.) may be enabled and/or disabled by using switching means and/or other configuration means, etc. For example, in FIG. 26-8, block B may be enabled (e.g. logically included, inserted in the datapath, etc.) by opening switch 26-880 (or by other equivalent logical means, etc.) and closing switch 26-882 (or by other equivalent logical means, etc.). In the same, or similar, fashion (e.g. logical manner, etc.) circuit blocks and/or functions C, D, E, F, G, H, R, S, T, U, V may be enabled and/or inserted into the datapath. Of course, any number of circuit blocks, memory chips, and/or functions or portions thereof may be enabled and/or disabled. Of course, one or more parts of a circuit block, memory chips, and/or functions or portions thereof (e.g. in a datapath, connect to a datapath, etc.) may be bypassed, enabled, disabled, and/or otherwise configured for operation, etc.

For example, in one embodiment, one or more circuit blocks, memory chips, and/or functions or portions thereof may be connected in parallel and/or parallel paths enabled/disabled and/or parallel operation enabled/disabled, etc. by using switching means and/or other configuration means, etc. For example, in FIG. 26-8, block H and block G in the Rx datapath may be configured to operate in a parallel manner (e.g. at the same time, with operations overlapping in time, at nearly the same time, etc.). For example, block G may be a CRC checker. For example, block H may be a flow control Rx block. The functions of block G and block H may be such that their operations may be overlapped, etc. For example, a CRC may be computed and if a failure occurs (e.g. bad CRC, etc.) signals may be generated that kill, stall, halt, otherwise modify, etc. later stages of the datapath, etc. For example, in FIG. 26-8, block S and block T in the Tx datapath may be configured to operate in a parallel manner (e.g. at the same time, with operations overlapping in time, at nearly the same time, etc.). For example, block S may be a flow control Tx block and block T may be a CRC generator. The functions of block S and block T may be such that their operations may be overlapped (e.g. operate in parallel, etc.), or the functions of block S and block T may be such that the functions may be modified to operate in parallel, etc. Of course, any number of circuit blocks, memory chips, and/or functions or portions thereof may be configured to operate in parallel, etc. For example, in FIG. 26-8, block F might be configured to operate in parallel with blocks D and E (using additional paths and switches that are not shown in FIG. 26-8 for clarity, but similar to those paths and switches that are shown, for example). In order for block F to operate in parallel with block D and/or block E etc. it may be required to alter, modify, change, configure etc. one or more of blocks D, E, F and/or other circuit blocks and/or functions.

Thus, in one embodiment, one or more functions of one or more circuit blocks, memory chips, portions thereof, etc. may be modified (possibly under program control) in order to enable and/or disable the parallel operation of one or more circuit blocks, memory chips, and/or functions or portions thereof.

In one embodiment, a disabled circuit block, memory chip, and/or function or portions thereof may be powered off or be switched to a lower power mode, or otherwise configured to be in one or more different operating modes (e.g. reduced power mode, sleep mode, wait or other state(s), paused, reset mode, self refresh mode, power down mode(s), etc.). In one embodiment, a disabled circuit block, memory chip, and/or function or portions thereof may be configured to be in one or more standby operating modes (e.g. in standby state(s), with circuits gated off, with power/voltages/currents reduced, ready to be enabled quickly, etc.). Similarly, in one embodiment, an enabled circuit block, memory chip, and/or function or portions thereof may be powered on or be switched to a higher power mode, or otherwise configured to be in one or more different operating modes (e.g. fast mode, start mode, reset mode, etc.). In one embodiment, an enabled circuit block, memory chip and/or function or portions thereof may be configured to be in one or more normal operating modes (e.g. with power on, with correct initial state(s), synchronized, etc.).

In one embodiment, the stacked memory package datapath may be programmable. For example, one or more circuit blocks and/or functions in the stacked memory package datapath may be reordered (e.g. the order of connection in a datapath changed, the orders of functions performed changed, etc.). Thus, for example, the order of circuit blocks and/or functions that may perform descrambling and DC balance decoding in the Rx datapath may be reversed (e.g. swapped, interchanged, resequenced, retimed, timing altered, etc.). For example, in FIG. 26-8, the stacked memory package datapath may be programmed in a first configuration so that block C may contain a DC balance decoder and block D may contain a descrambler. For example, in FIG. 26-8, the stacked memory package datapath may be programmed in a second configuration so that block C may contain a descrambler and block D may contain a DC balance decoder. The programming of the first configuration and second configuration may be performed (e.g. by using switches, alternative paths, etc.) in an exactly analogous fashion (e.g. manner, method, etc.) to that described above, e.g. using switching means and/or other configuration means, etc. The programming, switching, configuration, reconfiguration, rearrangement, changed connectivity, etc. may be performed at one or more of the following (but not limited to the following) times: design time, at manufacture, at test, at start-up, during operation, combinations of these times, etc.

In one embodiment, the stacked memory package architecture may be programmable. Thus, for example, more than one datapath, circuit block, and/or function may be programmed, altered, changed, modified, configured, etc. Thus, for example, the clocking structure, clocked elements, clocking elements, etc. may be programmed, altered, changed, modified, configured, etc.

For example, if the order of descrambling and DC balance decoding in the Rx datapath is reversed, then the order of scrambling and DC balance encoding in the Tx datapath may also be reversed (e.g. to match, to correspond, as a pair, etc.).

For example, if a clocking scheme in the Rx datapath is changed, reconfigured, etc. (e.g. a clock crossing inserted) then the Tx datapath may be re-architected (e.g. architecture changed, circuit structure changed, functionality altered, etc.) in order to correspond (e.g. a synchronizer may be inserted in the Tx datapath, if a clock crossing was inserted in the Rx datapath, etc.).

Of course, any circuit blocks, functions, or portions thereof or groups of circuit blocks, functions, or portions thereof may be similarly programmed, configured, altered, modified, changed, connected, reconnected, disconnected, enabled, disabled, rearranged, arranged, coupled, decoupled, inserted, removed, skipped, bypassed, joined, separated, omitted, etc.

In one embodiment, the control of programming the stacked memory package architecture may be performed using the contents of one or more packets or other information/data/signals associated with one or more packets, etc. For example, a packet that must be forwarded may contain content that causes or contributes to cause (e.g. triggers, etc.) one or more alternative paths, etc. to be activated. The trigger content may be a packet data field or fields, command fields, packet header, packet type, packet frame character or symbol, other framing character or symbol, sequence or sequences of characters and/or symbols, one or more packet sequences, status word, metaframe content, frame content, control word, inter-packet symbol of character, inverted field, flag, K-code, sequence of K-codes, sequences of K-codes, combinations of these and/or other packet, symbol, character property or properties, etc.

In one embodiment, a stacked memory package may contain 2, 4, 8, 16, or any number #SMC of stacked memory chips. In one embodiment, the stacked memory chips may be divided into one or more groups of memory regions (e.g. echelons, ranks, groups of banks, groups of arrays, groups of subarrays, etc.). In one embodiment, there may be the same number of memory regions on each stacked memory chip. For example, each stacked memory chip may contain 4, 8, 16, 32, or any number of #MR memory regions (including an odd number of memory regions, possibly including spares, and/or regions for error correction, etc.). The stacked memory package may thus contain #SMC×#MR memory regions. An echelon or other grouping, ensemble, collection etc. of memory regions may contain 16, 32, 64, 128, or any number #MRG of grouped memory regions. In one embodiment, there may be the same number of memory regions in each group of memory regions. Thus, a stacked memory package may contain 2, 4, 8, 16, or any number #SMC×#MR/#MRG of grouped memory regions, groups of memory regions. In one embodiment, there may be one memory controller assigned to (e.g. associated with, connected to, coupled to, in control of, etc.) each group of memory regions. Thus, there may be #SMC×#MR/#MRG memory controllers. For example, in a stacked memory package with eight stacked memory chips (#SMC=8), there may be 16 memory regions associated with each memory region group (#MRG=16) and 64 memory regions per stacked memory chip (#MR=64). There may thus be 8×64/16=32 memory controllers per stacked memory package in this example configuration. Of course, any number of stacked memory chips, memory regions, and memory controllers may be used. Thus, each stacked memory chip may contain 4, 8, 16, 32, or any number of #MX memory controllers (including an odd number of memory controllers, possibly including spares, and/or memory controllers for error correction, test, reliability, characterization, etc.).

In one embodiment, a stacked memory package may contain 2, 4, 8, 16, or any number #LK of links. Thus, for example, a stacked memory package may have four links (#LK=4). Each link may have 2, 4, 8 or any number #LA of lanes. Thus, for example, a link may have two lanes (#LK=2). In one embodiment, there may be a Rx datapath per link. Thus, for example, in FIG. 26-8, if #LK=4 there may be four copies of blocks A, B, C, etc. In one embodiment, there may be a Tx datapath per link. Thus, for example, in FIG. 26-8, if #LK=4 there may be four copies of blocks U, V, W, etc. Note the number of memory controllers #MX is not necessarily equal (and generally may not be equal) to the number of links #LK. Thus, for example, in FIG. 26-8, if #MX=32 there may be four copies of block M etc. Thus, it may be seen that, in FIG. 26-8, the number of block(s) M in the stacked memory package datapath, for example, may not be equal to the number of blocks A, B, C, etc. (e.g. in the Rx datapath) or blocks U, V, W, etc. (e.g. in the Tx datapath). The selective connection (e.g. programmable connection, coupling, mating, joining, etc.) of one or more parts, portions, components, blocks, etc. of the Rx datapath with one or more block(s) M may be performed by one or more crossbar functions in the Rx datapath (e.g. block I may perform a crossbar function, for example, in the Rx datapath of FIG. 26-8). Thus, for example, an Rx crossbar in the position of block I in FIG. 26-8 may connect #LK=4 copies of the Rx datapath (blocks A to G/H) to #MX=32 copies of block M. Similarly, the selective connection of the Tx datapath with block(s) M may be performed by one or more crossbar functions in the Tx datapath (e.g. block P for example in the Tx datapath of FIG. 26-8). Thus, for example, a Tx crossbar in the position of block P in FIG. 26-8 may join #LK=4 copies of the Tx datapath (blocks R to W) to #MX=32 copies of block M. Of course other arrangements (e.g. implementations, architectures, structural compositions and/or structural decompositions, formations, etc.) of Tx crossbar and/or Rx crossbar (e.g. formed as an Rx crossbar and/or RxTx crossbar and/or Tx crossbar, etc.) are possible and may be implemented in the context of previous Figures in this specification and other specifications incorporated by reference, along with accompanying text, for example.

It should be noted carefully that not all blocks in the datapaths may have the same number of copies. For example, there may be #LK=4 copies of blocks A-G/H but one copy of an Rx buffer block (but possibly with more than one buffer, etc.). For example, there may be #LK=4 copies of blocks A-G/H but one copy of an Rx crossbar. For example, there may be #LK=4 copies of blocks A-G/H but one copy of an Rx routing block. For example, there may be #LK=4 copies of blocks R-W but one copy of a tag lookup block. For example, there may be #LK=4 copies of blocks R-W but one copy of a Tx crossbar. For example, there may be #LK=4 copies of blocks R-W but one copy of a Tx buffer block (but possibly with more than one buffer).

In one embodiment, there may be different numbers of memory regions on each stacked memory chip. In one embodiment, there may be different numbers of memory regions in each group of memory regions. In one embodiment, there may be more than one memory controller assigned to each group of memory regions. In one embodiment, there may be more than one group of memory regions assigned to each memory controller. In one embodiment, the number of groups of memory regions assigned to each memory controller may not be the same for every memory controller. For example, there may be spare or redundant memory controllers and/or memory regions and/or groups of memory regions. For example, there may be more than one type (e.g. technology, etc.) of stacked memory chip. For example, there may be more than one type (e.g. technology, etc.) of memory region grouping. For any of these reasons and/or other reasons (e.g. design constraints, technology constraints, power constraints, cost constraints, performance requirements, etc.) the number of groups of memory regions assigned to each memory controller and/or number of memory controllers assigned to each group of memory regions may not be the same for every memory controller.

Thus, for example, in one embodiment there may be asymmetry (e.g. unbalanced structure, different connectivity, etc.) between the Rx datapath, memory controllers, stacked memory chips, and Tx datapath. For example, the number of lanes in the Rx datapath may not be equal to the number of lanes in the Tx datapath. For example, the number of copies of circuit blocks in the Rx datapath may not be equal to the number of copies in the Tx datapath. These different configurations may be set (e.g. programmed, configured, etc.) at design time, at manufacture, at test, at start-up, during operation, etc. For example, the number of Tx lanes and/or Rx lanes in a link may be varied according to memory system traffic, etc. For example, the number of circuit blocks and/or functions and/or connectivity of one or more circuit blocks etc. in a datapath may be varied according to memory system traffic, etc.

In one embodiment, the stacked memory package may contain one or more stacked memory package datapaths. In this case, the stacked memory package datapath may be associated with a link, for example. Thus, in this case, the number of stacked memory package datapaths may be equal to the number of links, but may be different than the number of memory controllers, etc.

In one embodiment, the stacked memory package may contain one stacked memory package datapath. The stacked memory datapath may contain one or more Rx datapaths and one or more Tx datapaths. In this case, one or more Rx datapaths and one or more Tx datapaths may be associated with a memory controller, for example. Thus, in this case, the number of Rx datapaths and Tx datapaths may be equal to the number of memory controllers, etc.

Of course, the number of logical copies of a block in a stacked memory package datapath may be different from the number of physical copies of a block in a stacked memory package datapath. For example, there may be one Rx crossbar (or other switch, switching function, switch fabric, etc.) or equivalent structure(s), etc. in a stacked memory package datapath. This one Rx crossbar may be a single logical copy of a logical function. However, for various reasons (e.g. speed, performance, power, ease of layout, design verification, yield, manufacture, test, repair, redundancy, etc.) the single logical copy of the Rx crossbar may be constructed (e.g. in layout, on a silicon die, etc.) as one or more copies or assembled from one or pieces (e.g. portions, subcells, subarrays, etc.) of a smaller physical block or blocks or group of blocks, macros, cells, etc. These parts, portions, pieces etc. of the logical block may be located in different physical locations. Thus it may be seen that the number of logical copies of any circuit blocks and/or functions in a stacked memory package datapath may be different from the number of physical copies.

In one embodiment, the stacked memory package datapath or portions thereof may contain one or more alternative paths and/or functions.

For example, in FIG. 26-8, circuit block X 26-868; circuit block Y 26-870, circuit block Z 26-872 may provide one or more alternative paths.

In one embodiment, the stacked memory package datapath may contain one or more alternative path at the PHY level. For example, in one embodiment, one or more forwarded packets may use an alternative path. For example, in one embodiment, packets may be broadcast.

For example, in FIG. 26-8, circuit block X may provide a short-cut alternative path between the Rx datapath and the Tx datapath e.g. for forwarded packets, etc. For example, circuit block X may couple the receiver output (e.g. output of the input differential pair, etc.) to the input of one or more pad drivers. In this manner packets may be broadcast through the memory system using one or more short-cuts as a repeater function, for example. In one embodiment, connections (e.g. short-cuts, etc.) may be made from the inputs of each link to the outputs of all links (e.g. on a lane basis, one link broadcast too many links for all links, etc.). In one embodiment, connections (e.g. short-cuts, etc.) may be made from the inputs of each link to the outputs of a subset of links (e.g. one link broadcast to one link, two links broadcast to one link, one link broadcast to two links, etc.). Thus, for example, a packet P may arrive on link 1, a packet Q may arrive on link 2, a packet R may arrive on link 3, a packet S may arrive on link4. There may be four output links 5, 6, 7, 8. One or more of the following (but not limited to the following) example configurations may be implemented, programmed, selected, etc: (1) P may be repeated on link 5; 6, 7, 8 (e.g. one link broadcast to many links for all links); (2) P and Q may be repeated on link 5, 6, 7, 8 (e.g. with timing adjustment if necessary if the arrival of P and Q overlap, etc.) (3) P may be repeated on links 5, 6 (e.g. one link broadcast to two links) and Q may be repeated on links 7, 8 (e.g. one link broadcast to two links, possibly without need for timing adjustment if the arrival of P and Q overlap, etc.); (4) P and Q may be repeated on link 5 or link 7 (two links broadcast to one link) and/or R and S may be repeated on link 6 or link 8; (5) combinations of these and/or other similar configurations, etc.

In one embodiment, circuit block X and/or the output pad drivers may be controlled (e.g. gated, enabled, OE controlled, etc.) in order to correctly insert and/or correctly align, re-align, etc. (e.g. with respect to bit clock, etc.) the repeated packets (e.g. forwarded packets, short-cut packets, etc.). In one embodiment, there may be separate copies of circuit block X, possibly capable of independent timing control/adjustment/etc. for each link capable or repeating packets, etc. Circuit block X may perform any necessary timing adjustment, alignment, delay, and/or other function etc. required (e.g. clock domain crossing, jitter control, phase slip, bit slip, analog delay, buffering, signal shaping/modification, emphasis, de-emphasis, modulation, amplification, attenuation, etc.) or may simply be a direct interconnection between circuit blocks, etc.

In one embodiment, alternative paths, short-cuts, etc. may be applied to skip, bypass, short-circuit, short cut, disable, exclude, omit, go around, look ahead, circumvent, combinations of these, etc. one or more circuit blocks and/or functions or portions thereof in one or more datapaths. For example, short-cuts may be applied to skip, bypass, etc. one or more circuit blocks etc. in the Rx datapath. For example, short-cuts may be applied to skip, bypass, etc. one or more circuit blocks etc. in the Tx datapath. For example, packets, data, other information etc. may bypass the physical layer or portions thereof in the Rx datapath. For example, packets etc. may bypass the data link layer or portions thereof in the Rx datapath. For example, packets etc. may bypass the transaction layer or portions thereof in the Rx datapath. For example, packets etc. may bypass the physical layer or portions thereof in the Tx datapath. For example, packets etc. may bypass the data link layer or portions thereof in the Tx datapath. For example, packets etc. may bypass the transaction layer or portions thereof in the Tx datapath. For example, packets etc. may bypass one or more layers or portions thereof in the Tx datapath and/or Rx datapath.

In one embodiment, alternative paths, short-cuts, etc. may be applied to skip, bypass, etc. one or more circuit blocks in one or more datapaths in order to forward packets from the Rx datapath to the Tx datapath. For example, packets, data, other information etc. may bypass the physical layer or portions thereof in the Rx datapath and Tx datapath. For example, packets etc. may bypass the data link layer or portions thereof in the Rx datapath and Tx datapath. For example, packets etc. may bypass the transaction layer or portions thereof in the Rx datapath and Tx datapath.

In one embodiment, alternative paths, short-cuts, etc. may be applied to skip, bypass, etc. one or more protocol layers in one or more datapaths in order to forward packets from the Rx datapath to the Tx datapath. For example, packets, data, other information etc. may bypass the transaction layer or portions thereof in the Rx datapath and by pass the transaction layer and the data link layer in the Tx datapath. For example, packets etc. may bypass the data link layer or portions thereof in the Rx datapath and Tx datapath.

For example, in FIG. 26-8, circuit block Y may provide an alternative path between Rx datapath and the Tx datapath. For example, circuit block Y may provide an alternative path between the output of circuit block C in the Rx datapath and the input of circuit block V in the Tx datapath. For example, circuit block C may be a DC balance decoder, e.g. 8B/10B decoder, etc. For example, circuit block V may be a DC balance encoder. In this case, the scrambler and descrambler functions may be bypassed, etc. For example, the descrambler may be circuit block D in the Rx datapath, the scrambler may be circuit block U in the Tx datapath (or the scrambler may be in the included circuit block V, but the scrambler may be independently disabled from the DC balance encoder in block V, etc.). In this manner the alternative path including circuit block Y may enable DC balance encode/decode, but disable scrambling. Thus, for example, packets that are to be forwarded may pass through the DC balance decoder, have header (e.g. command packet type, etc.), data fields (e.g. destination memory address, stacked memory chip address, etc.), or other routing information inspected, decoded, parsed, checked, etc. Depending on this inspection packets may be identified, marked, etc. for forwarding and may be passed through circuit block Y, for example, to the Tx datapath. Circuit block Y may perform any necessary timing adjustment required (e.g. clock domain crossing, packet modification, etc.) or may simply be a direct logical interconnection between circuit blocks, etc. Of course, such alternative paths may be located at any positions within the Rx datapath and/or Tx datapath.

In one embodiment, alternative paths, short-cuts, etc. may be applied to skip, bypass, etc. one or more memory controllers, stacked memory chips, other logic associated with stacked memory chips, etc.

For example, in FIG. 26-8, circuit block Z may provide an alternative path based on a short-cut routing function. For example, circuit block K may be an Rx routing block. In one embodiment, one or more circuit blocks and/or functions may inspect incoming packets, commands, requests etc. and determine that the packet is to be forwarded. Thus, for example, circuit block K may inspect incoming packets, commands, requests, etc. and determine that one or more packets etc. are to be routed directly to the Tx datapath, and thus bypass, for example, memory controller(s) M. Thus circuit block K may forward the packet(s) through circuit block Z on an alternative path. Circuit block Z may perform any necessary timing adjustment required (e.g. any clock domain crossing, packet modification, etc.) or may simply be a direct logical interconnection between circuit blocks, etc.

In one embodiment, the stacked memory chips and/or other memory, storage etc. may be used for packet buffering and/or other storage functions. For example, a part or portion of one or more stacked memory chips and/or memory located on one or more logic chips in a stacked memory package may be used to buffer packets. For example, packets that are to be forwarded may be stored in one or more stacked memory chips and/or memory located on one or more logic chips before being forwarded, etc. In this case, one or more short-cuts or one or more alternative paths may be used to bypass one or more of the circuit blocks and/or functions in or associated with the memory controllers, Rx buffers, Tx buffers, and/or other circuit blocks, functions, etc. Of course, any packets, packet data, packet information, data related to packets (e.g. headers, portions of headers, data, data fields, flags, tags, sequence numbers, ID, indexes, pointers, addresses, address ranges, tables, arrays, data structures, priority, virtual channel information, traffic class information, status data, register contents, control data, timestamps, error codes, error data, failure data, error syndromes, coding tables, configuration data, test data, characterization data, commands, operations, instructions, program code, etc.) may be stored in any memory region. Such storage may use one or more alternative paths.

FIG. 26-9

FIG. 26-9 shows a stacked memory package datapath 26-900, in accordance with one embodiment. As an option, the stacked memory package datapath may be implemented in the context of the previous Figures and/or any subsequent Figure(s). Of course, however, the stacked memory package datapath may be implemented in the context of any desired environment.

In one embodiment, the stacked memory package datapath may contain one or more datapaths. For example, in one embodiment, the stacked memory package datapath may contain one or more Rx datapaths and one or more Tx datapaths. For example, in FIG. 26-9, the stacked memory package datapath may contain Rx datapath 26-902 and Tx datapath 26-904. In one embodiment, one or more parts (e.g. portions, sections, etc.) of the stacked memory package datapath may be contained on a logic chip, CPU, etc.

In FIG. 26-9, the Rx datapath may include circuit blocks A-K.

In FIG. 26-9, the Rx datapath may include one or more of the following (but not limited to the following) circuit blocks and/or functions: block A 26-910, which may be part of the pad macros and/or pad cells and/or near pad logic, etc; block B 26-912; block C 26-914; block D 26-918; block E 26-920; block F 26-922; block G 26-924; block H 26-926; block I 26-934; block J 26-930; block K 26-932.

For example, in one embodiment, block A may be the input pads, input receivers, deserializer, and associated logic; block B may a symbol aligner; block C may be a DC balance decoder, e.g. 8B/10B decoder, etc; block D may be lane deskew and descrambler; block E may be a data aligner; block F may be an unframer (also deframer); block G may be a CRC checker; block H may be a flow control Rx block. In one embodiment, the number of Rx datapath blocks in one or more portions, parts of the Rx datapath may correspond to the number of Rx links used to connect a stacked memory package in a memory system. For example, the Rx datapath of FIG. 26-9 may correspond to a stacked memory chip with four high-speed serial links. This, in FIG. 26-9, the Rx datapath may contain four copies of these circuit blocks (e.g. blocks A-G), but any number may be used.

For example, in one embodiment, block I may be an Rx crossbar; block J may be one or more Rx buffers; block K may be an Rx router block. In one embodiment there may be one copy of blocks I-K in the Rx datapath, but any number may be used. Of course the number of physical circuit blocks used to construct blocks I-K may be different than the logical number of blocks I-K. Thus, for example, even though there may be one Rx crossbar in an Rx datapath, the Rx crossbar may be split into one or more physical circuit blocks, circuit macros, circuit arrays, switch arrays, arrays of MUXes, etc.

In one embodiment, the stacked memory package datapath may contain one or more memory controllers. For example, in FIG. 26-9, the stacked memory package datapath may include one or more memory controllers M 26-940. The memory controllers may be regarded as part of the Rx datapath and/or part of the Tx datapath.

In one embodiment, the number of memory controllers in one or more portions, parts of the Rx datapath and/or part of the Tx datapath may depend on (e.g. be related to, be a function of, etc.) the number of memory regions in a stacked memory package. For example, a stacked memory package may have eight stacked memory chips with 64 memory regions. Each memory controller may control 16 memory regions. Thus, in FIG. 26-9, the Rx datapath may contain four copies of the memory controller (e.g. block M), but any number may be used.

In one embodiment, the stacked memory package datapath may contain one or more stacked memory chips. For example, in FIG. 26-9, the stacked memory package datapath may include one or more stacked memory chips N 26-942. The one or more stacked memory chips may be connected to the one or more memory controllers using TSVs or other forms of through-wafer interconnect (TWI), etc.

In FIG. 26-9, the Tx datapath may include one or more copies of circuit blocks O-W.

In FIG. 26-9, the Tx datapath may include one or more of the following (but not limited to the following) circuit blocks and/or functions: block 0 26-950; block P 26-952.

For example, in one embodiment, block 0 may be one or more Tx buffers; block P may be a Tx crossbar. In one embodiment, there may be one Tx crossbar in the Tx datapath, but any number may be used.

In FIG. 26-9, the Tx datapath may include one or more of the following (but not limited to the following) circuit blocks and/or functions: block Q 26-954; block R 26-956; block S 26-958; block T 26-960; block U 26-962; block V 26-964; block W 26-966.

For example, in one embodiment, block Q may be a tag lookup block; block R may be a response header generator; block S may be a flow control Tx block; block T may be a CRC generator; block U may be a frame aligner; block V may be a scrambler and DC balance encoder; block W may contain serializer, output drivers, output pads and associated logic, etc.

In one embodiment, the number of Tx datapath blocks in one or more portions, parts of the Tx datapath may correspond to the number of Tx links used to connect a stacked memory package in a memory system. For example, the Tx datapath of FIG. 26-9 may correspond to a stacked memory chip with four high-speed serial links. This, in FIG. 26-9, the Tx datapath may contain four copies of these circuit blocks (e.g. blocks Q-W), but any number may be used.

In one embodiment, the number of Tx links may be different from the number of Rx links.

In one embodiment, the number of circuit blocks may depend on the number of links. Thus, for example, if a stacked memory package has two Rx links there may be two copies of circuit blocks A-G. Thus, for example, if the same stacked memory package has eight Tx links there may be eight copies of circuit blocks Q-W.

In one embodiment, the frequency of circuit block operation may depend on the number of links. Thus, for example, if a stacked memory package has two Rx links there may be four copies of circuit blocks A-G that operate at a clock frequency F1. If, for example, the same stacked memory package has eight Tx links there may be four copies of circuit blocks Q-W that operate at a frequency F2. In order to equalize throughput, for example, F2 may be four times F11.

In one embodiment, the number of enabled circuit blocks may depend on the number of links. Thus, for example, if a stacked memory package has two Rx links there may be four copies of circuit blocks A-G, but only two copies of blocks A-G may be enabled. If, for example, the same stacked memory package has four Tx links there may be four copies of circuit blocks Q-W that are all enabled.

One or more of the circuit blocks and/or functions that may be shown in FIG. 26-9 may not be present in all implementations or may be logically located in a different place in the stacked memory package datapath, outside the stacked memory package datapath, etc. Not all functions and blocks that may be present in some implementations may be exactly as shown in FIG. 26-9. For example, one or more Tx buffers and/or one or more Rx buffers may be part of the memory controller(s), etc. The clocked elements and/or clocking elements that may be present in the stacked memory package datapath may not be shown in FIG. 26-9. The stacked memory package datapath may, for example, contain one or more clocked circuit blocks, synchronizers, DLLs, PLLs, etc.

In one embodiment, one or more circuit blocks and/or functions may provide one or more short-cuts.

For example, in FIG. 26-9, block X 26-968 may provide one or more short-cuts (e.g. from Rx datapath to Tx datapath, between one or more blocks in the Rx datapath, between one or more blocks in the Tx datapath, etc.). In one embodiment, block X may link an output from one block A to four inputs of block W. Thus four outputs may be linked to four inputs using a total of 16 connections (e.g. each block A output connects to four block W inputs). In one embodiment, block X may link an output from one block A to one input of block W. Thus, four outputs may be linked to four inputs using a total of four connections (e.g. each block A output connects to a different block W input). In one embodiment, block X may link the outputs from each block A to one input of block W. Thus four outputs may be linked to one input using a total of four connections (e.g. each block A output connects to a one block W input). In one embodiment, block X may perform a crossbar and/or broadcast function. Thus, for example, any output of any blocks A (1-4) may be connected (e.g. coupled, etc.) to any number (1-4) of inputs of any blocks W. In one embodiment, the connection and/or switching functions of the short-cuts may be programmable. For example, block X may be configured, programmed, reconfigured etc. at various times (e.g. at design time, at manufacture, at test, at start-up, during operation, etc.). Programming may be performed by the system (e.g. CPU, OS, user, etc.), by one or more logic chips in a memory system, by combinations of these, etc. Of course, a block performing these and/or similar short-cut functions may be placed at any point in the datapath. Of course, any number of blocks performing similar functions may be used.

For example, block X may perform a short-cut at the physical (e.g. PHY, SerDes, etc.) level and bridge, repeat, retransmit, forward, etc. packets between one or more input links and one or more output links.

For example, block Y 26-970 may perform a similar function to block X. In one embodiment short-cuts may be made across protocol layers. For example, in FIG. 26-9, blocks A-B may be part of the physical layer, blocks C-D may be part of the data link layer, blocks U-W may be part of the physical layer, etc. Thus, for example, block Y may extract (e.g. branch, forward, etc.) one or packets, packet contents, etc. from the data link layer of the Rx datapath and inject (e.g. forward, connect, insert, etc.) packets, packet contents, etc. into the physical layer of the Tx datapath. Block Y may also perform switching and/or crossbar and/or programmable connection functions as described above for block X, for example. Block Y may also perform additional logic functions to enable packets to cross protocol layers. The additional logic functions may, for example, include (but are not limited to): re-timing or other clocking functions, protocol functions that are required but are bypassed by the short-cut (e.g. scrambling or descrambling, DC balance encode or DC balance decode, CRC check or CRC generation, etc.), routing (e.g. connection based on packet contents, framing information, data in one or more control words, other data in one or more serial streams, etc.), combinations of these and/or other logic functions, etc.

For example, block Z 26-972 may perform a similar function to block X and/or block Y. In one embodiment, short-cuts may be made for routing, testing, loopback, programming, configuration, etc. For example, in FIG. 26-9 block Z may provide a short-cut from the Rx datapath to the Tx datapath. For example, in FIG. 26-9, block K may be an Rx router block. For example, circuit block K and/or other circuit blocks may inspect incoming packets, commands, requests, control words, metaframes, virtual channels, traffic classes, framing characters and/or symbols, packet contents, serial data stream contents, etc. (e.g. packets, data, information in the Rx datapath, etc.) and determine that a packet and/or other data, information, etc. is to be forwarded. Thus, for example, circuit block K and/or other circuit blocks may inspect incoming packets PN, etc. and determine that one or more packets PX etc. are to be routed directly (e.g. forwarded, sent, connected, coupled, etc.) to the Tx datapath (e.g. via circuit block K, etc.), and thus bypass, for example, memory controller(s) M. For example, the forwarded packets PX may be required to be forwarded to another stacked memory package. For example, the forwarded packets PX may contain a command to configure or otherwise change, modify, affect, etc. one or more circuit blocks and/or functions in the Tx datapath. For example, the forwarded packets PX may be part of a test stream or test command, etc. For example, the forwarded packets PX may be part of a loopback test, etc.

It should be noted that, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, one or more aspects of the various embodiments of the present invention may be designed using computer readable program code for providing and/or facilitating the capabilities of the various embodiments or configurations of embodiments of the present invention.

Additionally, one or more aspects of the various embodiments of the present invention may use computer readable program code for providing and facilitating the capabilities of the various embodiments or configurations of embodiments of the present invention and that may be included as a part of a computer system and/or memory system and/or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; U.S. Provisional Application No. 61/581,918, filed Jan. 13, 2012, titled "USER INTERFACE SYSTEM, METHOD, AND COMPUTER PROGRAM PRODUCT"; U.S. Provisional Application No. 61/602,034, filed Feb. 22, 2012, titled "SYSTEM, METHOD, AND COMPUTER PROGRAM PRODUCT FOR IMPROVING MEMORY SYSTEMS"; U.S. Provisional Application No. 61/608,085, filed Mar. 7, 2012, titled "SYSTEM, METHOD, AND COMPUTER PROGRAM PRODUCT FOR IMPROVING MEMORY SYSTEMS"; U.S. Provisional Application No. 61/635,834, filed Apr. 19, 2012, titled "SYSTEM, METHOD, AND COMPUTER PROGRAM PRODUCT FOR IMPROVING MEMORY SYSTEMS"; U.S. application Ser. No. 13/441, 132, filed Apr. 6, 2012, titled "MULTIPLE CLASS MEMORY SYSTEMS"; U.S. application Ser. No. 13/433, 283, filed Mar. 28, 2012, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; and U.S. application Ser. No. 13/433,279, filed Mar. 28, 2012, titled "SYSTEM, METHOD, AND COMPUTER PROGRAM PRODUCT FOR UTILIZING IMAGE RECOGNITION TO PERFORM AN ACTION"; U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY"; and U.S. Provisional Application No. 61/665, 301, filed Jun. 27, 2012, titled "SYSTEM, METHOD, AND COMPUTER PROGRAM PRODUCT FOR ROUTING PACKETS OF DATA". Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section X

The present section corresponds to U.S. Provisional Application No. 61/679,720, titled "SYSTEM, METHOD, AND COMPUTER PROGRAM PRODUCT FOR PROVIDING CONFIGURABLE COMMUNICATION PATHS TO MEMORY PORTIONS DURING OPERATION," filed Aug. 4, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization and/or use of other conventions, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS," and in U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY". Each of the foregoing applications are hereby incorporated by reference in their entirety for all purposes.

Example embodiments described herein may include computer system(s) with one or more central processor units (CPU) and possibly one or more I/O unit(s) coupled to one or more memory systems that may contain one or more memory controllers and memory devices. As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry.

FIG. 27-1A

FIG. 27-1A shows an apparatus 27-1A00, in accordance with one embodiment. As an option, the apparatus 27-1A00 may be implemented in the context of any subsequent Figure(s). Of course, however, the apparatus 27-1A00 may be implemented in the context of any desired environment.

It should be noted that a variety of optional architectures, capabilities, and/or features will now be set forth in the context of a variety of embodiments in connection with a description of FIG. 27-1A. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 27-1A00 may include a first semiconductor platform 27-1A02, which may include a first memory. In one embodiment, the first semiconductor platform 27-1A02 may include a first memory with a plurality of first memory portions (not shown). Additionally, in one embodiment, the apparatus 27-1A00 may include a network including a plurality of connections in communication with the first semiconductor platform 27-1A102 for providing configurable communication paths to the first memory portions during operation.

Further, in one embodiment, the apparatus 27-1A00 may include a second semiconductor platform 27-1A06 stacked with the first semiconductor platform 27-1A02. In one embodiment, the second semiconductor platform 27-1A06 may include a second memory. As an option, the first memory may be of a first memory class. Additionally, the second memory may be of a second memory class. It should be noted that although FIG. 27-1A shows two semiconductor platforms, in various other embodiments, one (or multiple) semiconductor platform may be present (e.g. only the first semiconductor platform 27-1A02, etc.).

In another embodiment, a plurality of stacks may be provided, at least one of which includes the first semiconductor platform 27-1A02 including a first memory of a first memory class, and at least another one which includes the second semiconductor platform 27-1A06 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments.

In another embodiment, the apparatus 27-1A00 may include a physical memory sub-system. In the context of the present description, physical memory may refer to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, SDRAM, eDRAM, embedded DRAM, MRAM, PRAM, etc.), memristor, phase-change memory, FeRAM, PRAM, MRAM, resistive RAM, RRAM, a solid-state disk (SSD) or other disk, magnetic media, and/or any other physical memory and/or memory technology etc. (volatile memory, nonvolatile memory, etc.) that meets the above definition.

Additionally, in various embodiments, the physical memory sub-system may include a monolithic memory circuit, a semiconductor die, a chip, a packaged memory circuit, or any other type of tangible memory circuit, or any intangible grouping of tangible memory circuits, combinations of these, etc. In one embodiment, the apparatus 27-1A00 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 27-1A06. Such connections that are in communication with the first memory and pass through the second semiconductor platform 27-1A06 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing one or more TSVs.

As another option, the communicative coupling may include a connection via a buffer device. In one embodiment, the buffer device may be part of the apparatus 27-1A00. In another embodiment, the buffer device may be separate from the apparatus 27-1A00.

Further, in one embodiment, at least one additional semiconductor platform (not shown) may be stacked with the first semiconductor platform 27-1A02 and the second semiconductor platform 27-1A06. In this case, in one embodiment, the additional semiconductor may include a third memory of at least one of the first memory class or the second memory class, and/or any other additional circuitry. In another embodiment, the at least one additional semiconductor may include a third memory of a third memory class.

In one embodiment, the additional semiconductor platform may be positioned between the first semiconductor platform 27-1A02 and the second semiconductor platform 27-1A06. In another embodiment, the at least one additional semiconductor platform may be positioned above the first semiconductor platform 27-1A02 and the second semiconductor platform 27-1A06. Further, in one embodiment, the additional semiconductor platform may be in communication with at least one of the first semiconductor platform 27-1A02 and/or the second semiconductor platform 27-1A02 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 27-1A02 may be in communication via a buffer. In this case, in one embodiment, the buffer may include a row buffer.

Further, in one embodiment, the apparatus 27-1A00 may be configured such that the first memory and the second memory are capable of receiving instructions via a single memory bus 27-1A10. The memory bus 27-1A10 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, combinations of these, etc; I/O protocols such as PCI, PCI-E, HyperTransport, InfiniBand, QPI, etc; networking protocols such as Ethernet, TCP/IP, iSCSI, combinations of these, etc; storage protocols such as NFS, SAMBA, SAS, SATA, FC, etc; combinations of these and/or other protocols (e.g. wireless, optical, etc.); etc.). Of course, other embodiments are contemplated with multiple memory buses.

In one embodiment, the apparatus 27-1A00 may include a three-dimensional integrated circuit. In one embodiment, the first semiconductor platform 27-1A02 and the second semiconductor platform 27-1A06 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 27-1A00 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 27-1A02 and the second semiconductor platform 27-1A06 together may include a three-dimensional integrated circuit that is a wafer-on-wafer device.

In another embodiment, the apparatus 27-1A00 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 27-1A02 and the second semiconductor platform 27-1A06 together may include a three-dimensional integrated circuit that is a monolithic device.

In another embodiment, the apparatus 27-1A00 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 27-1A02 and the second semiconductor platform 27-1A06 together may include a three-dimensional integrated circuit that is a die-on-wafer device.

In yet another embodiment, the apparatus 27-1A00 may include a three-dimensional integrated circuit that is a die-on-die device. In the context of the present description, a die-on-die device refers to a device including two or more aligned dies in a die-on-die configuration. In one embodiment, the first semiconductor platform 27-1A02 and the second semiconductor platform 27-1A06 together may include a three-dimensional integrated circuit that is a die-on-die device.

Additionally, in one embodiment, the apparatus 27-1A00 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 27-1A00 may be configured such that the first memory and the second memory are capable of receiving instructions from a device 27-1A08 via the single memory bus 27-1A10. In one embodiment, the device 27-1A08 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.

In the context of the following description, optional additional circuitry 27-1A04 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 27-1A04 is shown generically in connection with the apparatus 27-1A00, it should be strongly noted that any such additional circuitry 27-1A04 may be positioned in any components (e.g. the first semiconductor platform 27-1A02, the second semiconductor platform 27-1A06, the device 27-1A08, an unillustrated logic unit or any other unit described herein, a separate unillustrated component that may or may not be stacked with any of the other components illustrated, a combination thereof, etc.).

In another embodiment, the additional circuitry 27-1A04 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiments, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 27-1A04 capable of receiving (and/or sending) the data operation request. More illustrative information will be set forth regarding various optional architectures, capabilities, and/or features with which the present embodiment(s) may or may not be implemented during the description of the embodiments shown in subsequent figures. It should be strongly noted that subsequent embodiment information is set forth for illustrative purposes and should not be construed as limiting in any manner, since any of such features may be optionally incorporated with or without the inclusion of other features described.

In yet another embodiment, memory regions and/or memory sub-regions of any of the memory described herein may be arranged to optimize one or more parallel operations in association with the memory.

In one embodiment, the first semiconductor platform 27-1A02 may not be stacked with another platform (e.g. the second semiconductor platform 27-1A06, etc.). As mentioned previously, in one embodiment, the apparatus 27-1A00 may include the first semiconductor platform 27-1A02, which may include a first memory with a plurality of first memory portions. Additionally, in one embodiment, the apparatus 27-1A00 may include a network including a plurality of connections in communication with the first semiconductor platform 27-1A02 for providing configurable communication paths to the first memory portions during operation. Of course, in one embodiment, the first semiconductor platform 27-1A02 may be stacked with one or more other semiconductor platforms and include the network including a plurality of connections in communication with the first semiconductor platform 27-1A02 for providing configurable communication paths to the first memory portions during operation.

In one embodiment, the apparatus 27-1A00 may be operable to receive at least one packet to be written to at least one of the plurality of first memory portions, and the plurality of connections may be capable of providing a plurality of different communications paths for the at least one packet to the at least one first memory portion. Additionally, in one embodiment, the apparatus 27-1A00 may be operable to receive at least one packet to be read from at least one of the plurality of first memory portions, and the plurality of connections may be capable of providing a plurality of different communications paths for the at least one packet from the at least one first memory portion.

In various embodiments, the network may include an interconnect network and/or a memory network. Additionally, in one embodiment, the network may include a plurality of through-silicon vias. Further, in one embodiment, the network may include one or more switched multibuses. In this case, in one embodiment, the one or more switched multibuses may be operable to incorporate a delay with respect to data being communicated utilizing the network. In another embodiment, the one or more switched multibuses may be operable to incorporate a delay with respect to data being communicated utilizing the network, for enabling data interleaving.

In one embodiment, the plurality of connections may be further in communication with at least one logic circuit for providing configurable communication paths between the first memory portions and the at least one logic circuit. In another embodiment, the plurality of connections may be further in communication with at least one processor for providing configurable communication paths between the first memory portions and the at least one processor.

Further, in one embodiment, the second semiconductor platform 27-1A06 may include a second memory with a plurality of second memory portions, where the second semiconductor platform 27-1A06 is in communication with the plurality of connections such that configurable communication paths are provided to the second memory portions during operation. In one embodiment, the plurality of connections may be operable for providing configurable communication paths between the first memory portions and the second memory portions during operation.

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate with the memory system to allow for any of the foregoing optional architectures, capabilities, and/or features. For that matter, further embodiments are contemplated where a single semiconductor platform (e.g. 27-1A02, 27-1A06, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

It should be noted that while the embodiments described in this specification and in specifications incorporated by reference may show examples of stacked memory system and improvements to stacked memory systems, the examples described and the improvements described may be generally applicable to a wide range of electrical and/or electronic systems. For example, improvements to signaling, yield, bus structures, test, repair etc. may be applied to the field of memory systems in general as well as systems other than memory systems, etc.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the configuration/operation of the apparatus 27-1A00, the configuration/operation of the first and/or second semiconductor platforms, the configurable communication paths provided to the first memory portions during operation, and/or other optional features (e.g. optional latency reduction techniques, etc.) have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc., which may or may not be incorporated in the various embodiments disclosed herein.

FIG. 27-1B

FIG. 27-1B shows a physical view of a stacked memory package 27-1B00, in accordance with one embodiment. As an option, the stacked memory package may be implemented in the context of the previous Figure(s) and/or any subsequent Figure(s). Of course, however, the stacked memory package may be implemented in the context of any desired environment.

In FIG. 27-1B, the stacked memory package may include one or more stacked memory chips, 27-1B14, 27-1B16, 27-1B18, 27-1B20. In FIG. 27-1B, four stacked memory chips are shown, but any number of stacked memory chips may be used.

In FIG. 27-1B, the stacked memory package may include one or more logic chips 27-1 B22. In FIG. 27-1B, one logic chip is shown, but any number of logic chips may be used. For example, in one embodiment of a stacked memory package, two logic chips may be used. For example, in one embodiment, a first logic chip may be located at the bottom of a stack of stacked memory chips and a second logic chip may be located at the top of the stack of stacked memory chips. In one embodiment, for example, the first logic chip may interface electrical signals to/from a memory system and the second logic chip may interface optical signals to/from the memory system. Any arrangement of the any number of logic chips and any number of stacked memory chips may be used.

In FIG. 27-1B, one or more interconnect structures 27-1B10 (e.g. using TSV, TWI, through-wafer interconnect, coupling, buses, combinations of these and/or other interconnect means, etc.) may couple one or more stacked memory chips and one or more logic chips. It should be noted that although one or more TSV arrays or other interconnect structures coupling one or more memory portions may be represented in FIG. 27-1B by a single dashed line (for example the line representing interconnect structure 27-1B10) the interconnects structure may include tens, hundreds, thousands, etc. of components that may include (but are not limited to) one or more of the following: conducting (e.g. metal, other conductor, etc.) traces (on the one or more stacked memory chips and logic chips), metal or other vias (on and/or through the silicon or other die), TSVs (e.g. through stacked memory chips and logic chips, other TWI, etc.), combinations of these and/or other interconnect means (e.g. electrical, optical, etc.) etc.

In FIG. 27-1B, the stacked memory chips may include one or more memory portions 27-1B12 (e.g. banks, bank groups, sections, echelons, combinations of these and/or other groups, collections, sets, etc.). In FIG. 27-1B, eight memory portions per stacked memory chip are shown, but any number of memory portions per stacked memory chip may be used. Each stacked memory chip may include a different number (and/or size, type, etc.) of memory portions, and/or different groups, groupings, etc.

In FIG. 27-1B, the logic chip(s) may include one or more areas of common logic 27-1B24 (e.g. circuit blocks, circuit functions, macros, etc.) that may be considered to not be directly associated with (e.g. partitioned with, assigned to, etc.) with the memory portions. For example, some of the input pads, some of the output pads, clocking logic, etc. may be considered as shared and/or common to all or a collection of groups of memory portions, etc. In FIG. 27-1B, one common logic area is shown, but any number, type, shape, size, function(s), of common logic area may be used.

In FIG. 27-1B, the logic chip(s) may include one or more areas of logic 27-1B28 that may be considered as associated with (e.g. coupled to, logically grouped with, etc.) a group of memory portions. For example, a logic area 18-1B28 may include a memory controller that is partitioned with an echelon that may include a number of sections, with each section including one or more memory portions. In FIG. 27-1B, eight areas of logic 27-1B28 are shown, but any number may be used.

In FIG. 27-1B, the physical view of the stacked memory package shown may represent one possible construction e.g. as an example, etc. A stacked memory package may use any construction to assemble one or more stacked memory chips and one or more logic chips.

In FIG. 27-1B, the physical view of the stacked memory package shown may represent one embodiment in which one logic area 27-1B28 may correspond to one group of memory portions 27-1B12 (e.g. a vertically stacked group of sections forming an echelon as defined herein, etc.) connected by one interconnect structure (which may be a TSV array, or multiple TSV arrays, etc.). Such an arrangement of a stacked memory package may be characterized (e.g. referenced as, denoted by, named as, referred to, etc.) as a one-to-one-to-one arrangement or one-to-one-to-one stacked memory package architecture. In this case one-to-one-to-one may refer to one logic area coupled to one TSV interconnect structure coupled to one group of memory portions, for example.

In one embodiment, the coupling (e.g. logic coupling, grouping, association, etc.) of the logic areas on the logic chips with the memory portions on the stacked memory chips using the interconnect structures may not correspond to a one-to-one-to-one architecture. As an example, in one embodiment, more than one interconnect structure may be used to couple a logic area on the logic chips with the memory portions on the stacked memory chips. Such an arrangement may be used, for example, to provide redundancy or spare capacity. Such an arrangement may be used, for example, to provide better matching of memory traffic to interconnect resources (avoiding buses that are frequently idle, wasting power and space for example). Other and further examples of architectures that may not be one-to-one-to-one and their uses may be described in one or more of the Figure(s) herein and/or Figure(s) in specifications incorporated by reference. Examples of architectures that may not be one-to-one-to-one may include architectures for which the physical view may be different or have different characteristics from the logical view. Other examples of architectures that may not be one-to-one-to-one may include architectures for which there is an abstract view. Examples of a logical view of a stacked memory package and examples of an abstract view of a stacked memory may be described in one or more of the Figure(s) herein and/or in specification incorporated by reference. For example, FIG. 27-1C may show an example of a logical view and FIG. 27-1D may show an example of an abstract view.

FIG. 27-1C

FIG. 27-1C shows a logical view of a stacked memory package 27-1C00, in accordance with one embodiment. As an option, the stacked memory package may be implemented in the context of the previous Figure(s) and/or any subsequent Figure(s). Of course, however, the stacked memory package may be implemented in the context of any desired environment.

In FIG. 27-1C the logical view may be considered shown as flat (e.g. not divided, not partitioned between chips, etc.). In one embodiment, the logical view may be implemented as one or more stacked memory chips and one or more logic chips, as shown, for example, in the physical view of FIG. 27-1B. However, the logical view (e.g. architecture, electrical schematic, etc.) need not be implemented using any one fixed physical implementation. For example, the logical view of FIG. 27-1C may be implemented on a single die, on multiple die, on multiple carriers, etc. Thus, for example, in the description that follows, the elements (e.g. components, circuits, function blocks, etc.) of FIG. 27-1C may be considered part of a stacked memory package, but may be located on a stacked memory chip and/or a logic chip, and/or in another manner, etc. depending on the physical implementation, etc.

In FIG. 27-1C, the stacked memory package may include input logic 27-1C10. The input logic may be located on one or more logic chips, for example. The input logic may include input pads, pad logic, and near-pad logic, other PHY and/or data link layer logic, etc. There may be other logic (e.g. PHY layer logic, data link layer logic, etc.), between the RxTxXBAR and RxXBAR for example, that may not be shown in FIG. 27-1C.

In FIG. 27-1C, the stacked memory package may include one or more buses 27-1C12 that may act to couple the input pads to one or more output pads (e.g. to forward, transmit, convey, connect, couple, etc. packets, data, information, signals, etc. received at the input pads to the output logic, output pads, etc.). Thus, for example, bus 27-1C12 may act to enable the forwarding of received packets, data, other information, etc. For example, there may be P+1 input pads I[0:P] that may be divided into one or more links and/or other interconnect channels, etc. For example, there may be Q+1 output pads O[0:Q] that may be divided into one or more links and/or other interconnect channels, etc. For example, a stacked memory package may have four high-speed serial input links, where each serial link may include one or more lanes. Thus, for example, each serial link may include 2, 4, 8, 16, 32, 64 or more pairs of signals, or any number of signals or signal pairs. Thus, for example, a stacked memory package that may have four high-speed serial input links may have 32 input signals, with 32 input pads (for high-speed signals, there may be other input pads used for other signals, etc.) and, in this case, P=31.

Note that bus 27-1C12 may be single wire, a signal pair, or any other form of logical and/or electrical coupling. The bus 27-1C12 may be part of a crossbar, such as the RxTxXBAR shown in FIG. 27-1C (and/or as shown in other similar figures herein and/or in other applications incorporated by reference), or part of other switching function(s), e.g. a de-MUX array, a MUX array, etc. As described herein and/or in other specifications incorporated by reference, the RxTxXBAR function may be implemented as and/or function as a short-circuit, short cut, cut through, etc. between the Rx datapath and Tx datapath or the RxTxXBAR function may be implemented as part of, and/or merged with, the RxXBAR and/or TxXBAR switching functions (the RxXBAR and TxXBAR of FIG. 27-1C may be similar to RXXBAR_0 and RxXBAR_1 shown in other Figures, for example).

In one embodiment, the number of copies of bus 27-1C12 may be related to (and may be equal to) the number of signal output pairs. For example, a stacked memory package that may have four high-speed serial output links may have 32 output signals, with 32 output pads (for high-speed signals, there may be other output pads used for other signals, etc.) and, in this case, Q=31. In this case, for example, there may be 16 copies of bus 27-1C12. However, any number of copies of bus 27-1C12 may be used.

Note that the number of input links needs not equal the number of output links, but they may be equal. Thus, for example, in one embodiment not all input pads and/or input links may be operable to connect to all output pads and/or output links. Thus, for example, in one embodiment one or more input pads, input lanes, input links, etc. may not be operable to connect to one or more output pads, output lanes, output links. For example, some input links may not be capable of being forwarded to the outputs at all, etc. For example, there may be more input links than output links, etc. The number of input links and number of output links may be different because of faults, by design, due to power limitations, bandwidth constraints, memory traffic constraints or memory traffic patterns, memory system topology, etc. Note also that the number of lanes (e.g. signal pairs) need not be equal for all of the links, but they may be equal. Although in general a lane may include one signal pair for transmit and one signal pair for receive, this need not be the case. For example, an input link may include eight signal pairs while an output link may include four signal pairs, etc.

In one embodiment, the RxTxXBAR may be omitted or otherwise logically absent (e.g. disabled by configuration, etc.). In this case, packets may be forwarded through the RxXBAR and TxXBAR and/or by other means, for example. A forwarding path may be implemented, for example, in the context shown in FIG. 17-9 in U.S. Provisional Application No. 61/673,192, filed Jul. 18, 2012, titled "SYSTEM, METHOD, AND COMPUTER PROGRAM PRODUCT FOR REDUCING A LATENCY ASSOCIATED WITH A MEMORY SYSTEM." Such an implementation of a forwarding path etc. may be used, for example, in a memory system with a single stacked memory package or in a memory system where packet forwarding may not be required.

In one embodiment, the function(s) and/or implementation of the RxTxXBAR crossbar circuits etc. may be simplified from that described above and/or elsewhere herein or in specifications incorporated by reference. For example, the latency of packet forwarding may be reduced by simplifying the functions of the RxTxXBAR. In one embodiment, packets to be forwarded may be received on a subset, group, set (e.g. zero, one or more, or all) of the input links (e.g. on one link, on two links, etc.). In one embodiment, the input links used for packets to be forwarded may be programmable (e.g. configured, programmed, set, etc. at design time, manufacture, test, assembly, start-up, during operation, combinations of these and/or at other times, etc.).

In one embodiment, one or more packets to be forwarded may be forwarded on a subset, group, set (e.g. zero, one or more, or all) of the output links (e.g. one link, two links, etc.).

In one embodiment, the output links used (e.g. eligible, capable of being used, capable of being connected, etc.) for packets to be forwarded may be programmable (e.g. configured, programmed, set, etc. at design time, manufacture, test, assembly, start-up, during operation, combinations of these and/or at other times, etc.). For example, if one input link and one output link are used to forward packets, the RxTxXBAR functions may be simplified (e.g. one or more circuits, functions, connections eliminated etc.) and the latency of packet forwarding, as well as the latency of the Rx datapaths and Tx datapaths in other links, may be reduced.

In FIG. 27-1C, the stacked memory package may include output logic 27-1C14. For example, the output logic may include data link layer functions, PHY layer functions, output pad drivers, outputs pads, etc.

In FIG. 27-1C, the stacked memory package may include one or more buses 27-1C36 that may couple the memory portions and/or associated logic (e.g. transmit FIFOs, etc.) to the TxXBAR crossbar switch.

In FIG. 27-1C, the stacked memory package may include one or more buses 27-1C16 that may couple the TxXBAR crossbar to the RxTxXBAR crossbar and thus may act to couple a memory portion (and thus, for example, data from a memory portion) to one or more output pads.

In FIG. 27-1C, the stacked memory package may include one or more buses 27-1C18 that may couple, for example, the RxTxXBAR crossbar to the RxXBAR crossbar.

In FIG. 27-1C, the stacked memory package may include one or more buses 27-1C20 that may couple, for example, the RxXBAR crossbar to the memory portions.

In FIG. 27-1C, the stacked memory package may include one or more circuit blocks 27-1C34. In one embodiment, the circuit block 27-1C34 may include part (or all) of the Rx datapath function(s), one or more memory controllers, one or more memory portions, part (or all) of the Tx datapath as well as other associated logic, etc. For example, a stacked memory package may include four input links, and may include four stacked memory chips, and each stacked memory chip may include eight memory portions (such as shown in FIG. 27-1B). In this case, there may be four copies of circuit block 27-1 C34.

In FIG. 27-1C, the stacked memory package may include one or more circuit blocks 27-1C34 that may include one or more circuit blocks 27-1C22. For example, a stacked memory package may include four input links, may include four stacked memory chips, and each stacked memory chip may include eight memory portions (such as shown in FIG. 27-1B, for example). In this case, there may be four copies of circuit block 27-1C34 and each circuit block 27-1C34 may include two copies of circuit block 27-1C22 (thus there may be a total of eight copies of circuit block 27-1C22, one for each group of four memory portions, etc.). In one embodiment, the circuit block 27-1C22 may include part of the Rx datapath function(s), one or more memory controllers, one or more memory portions, part of the Tx datapath as well as other associated logic, etc.

In FIG. 27-1C, the stacked memory package may include one or more circuit blocks 27-1C24. In one embodiment, the circuit block 27-1C24 may include interconnect means (e.g. interconnect network(s), bus(es), etc.) to couple (or act to couple, operate to couple, etc.) one or more logic chips to one or more stacked memory chips. For example, one or more circuit blocks 27-1C26 may be located on one or more logic chips and one or more circuit blocks 27-1C28 may be located on one or more stacked memory chips. The one or more circuit blocks 27-1C24 may thus act to couple (e.g. actively connect, passively connect, etc.) circuit block(s) 27-1C26 and circuit block(s) 27-1C28. For example, circuit block 27-1C24 may include an array (e.g. one or more, groups of one or more, arrays, matrix, etc.) of TSVs that may run vertically to couple logic on one or more logic chips to memory portions on one or more stacked memory chips. For example, circuit block 27-1C24 may act to couple write data, addresses, control signals, commands/requests, register writes, etc. from one or more logic chips to one or more stacked memory chips. In one embodiment, the circuit block 27-1C24 may include logic to insert (or remove) spare and/or redundant interconnects, alter the architecture of buses and TSV array(s), etc.

In FIG. 27-1C, the stacked memory package may include one or more circuit blocks 27-1C26. In one embodiment, the circuit block 27-1C26 may include part of the Rx datapath. For example, circuit block 27-1C26 may include (but is not limited to) PHY layer logic, data link layer logic, FIFOs (e.g. Rx FIFO, etc as shown in other Figures herein and/or in applications incorporated by reference), arbiters (e.g. RxARB, etc. as shown in other Figures herein and/or in applications incorporated by reference), other buffers (e.g. for write data, write commands/requests, other commands/requests, etc.), state machine logic, command ordering logic, priority control, combinations of these with other logic functions, etc.

In FIG. 27-1C, the stacked memory package may include one or more circuit blocks 27-1C28. In one embodiment, the circuit block 27-1C28 may include (but is not limited to) one or more memory portions e.g. bank, bank group, section (as defined herein), echelon (as defined herein), rank, combinations of these and/or other groups or groupings, etc.

In FIG. 27-1C, the stacked memory package may include one or more circuit blocks 27-1C30. In one embodiment, the circuit block 27-1C30 may include part(s) of the Tx datapath. In one embodiment, the 27-1C30 may include (but is not limited to) data link layer logic, PHY layer logic, transmit buffers, read buffers, arbitration logic, priority logic, TxFIFO, etc. (as may be shown in other Figures herein and/or in applications incorporated by reference), TxARB (as may be shown in other Figures herein and/or in applications incorporated by reference), combinations of these and/or other logic functions, etc.

In FIG. 27-1C, the stacked memory package may include one or more circuit blocks 27-1C32. In one embodiment, the circuit block 27-1C32 may include interconnect means to couple one or more stacked memory chips to one or more logic chips. For example, circuit block 27-1C28 may be located on one or more logic chips and circuit block 27-1C30 may be located on one or more stacked memory chips. The circuit block 27-1C32 may thus act to couple (e.g. actively connect, passively connect, etc.) circuit block 27-1C28 and circuit block 27-1C30. For example, circuit block 27-1C32 may include an array (e.g. one or more, groups of one or more, arrays, matrix, etc.) of TSVs (e.g. a TSV array, etc.) that may run vertically (e.g. through a stack of stacked memory chips, etc.) to couple memory portions on one or more stacked memory chips to logic that may be located on one or more logic chips. For example, circuit block 27-1C32 may act to couple read data, control signals, completions/responses, status messages, etc. from one or more stacked memory chips to one or more logic chips. In one embodiment, the circuit block 27-1 C32 may include logic to insert (or remove, or otherwise configure, etc.) spare and/or redundant interconnects, alter the architecture of buses and TSV array(s), etc.

FIG. 27-1D

FIG. 27-1D shows an abstract view of a stacked memory package 27-1D00, in accordance with one embodiment. As an option, the stacked memory package may be implemented in the context of the previous Figure(s) and/or any subsequent Figure(s). Of course, however, the stacked memory package may be implemented in the context of any desired environment.

In FIG. 27-1D, the stacked memory package may include one or more first groups of memory portions 27-1D10 (or sets of groups, collections of groups, etc.) and/or associated memory support circuits (e.g. clocking functions, DLL, PLL, power related functions, register storage, I/O buses, buffers, etc.), memory logic, etc. In FIG. 27-1D, the first group may include all the memory portions in a stacked memory package. Any grouping, arrangement, or collection etc. of memory portions may be used for the one or more first groups of memory portions. For example, the group of memory portions 27-1D10 may include all memory portions in a memory system (e.g. memory portions in more than one stacked memory package, etc.). For example, a group of memory portions 27-1D10 may include all memory portions in a memory class (as defined herein and/or in one or more specifications incorporated by reference). For example, a group of memory portions 27-1D10 may include a subset of memory portions in a stacked memory package. The subset of memory portions in a stacked memory package may correspond to (e.g. include, encompass, etc.) the memory portions on a stacked memory chip, the memory portions on one or more portions of a stacked memory chip, the memory portions on one or more stacked memory chips (e.g. an echelon, a section, groups of these, etc.), combinations of these and/or the memory portions on any other carrier, assembly, platform, etc.

In FIG. 27-1D, the stacked memory package may include a second group of memory portions 27-1D14. For example, the stacked memory package may include a group of memory portions on one or more stacked memory chips. Thus, in this case, the second group of memory portions 27-1D14 may correspond to a stacked memory chip. The grouping of memory portions in FIG. 27-1D may correspond to the memory portions contained on a stacked memory chip, or portion(s) of one or more stacked memory chips, however any grouping (e.g. collection, set, etc.) may be used.

In FIG. 27-1D, the stacked memory package may include one or more memory portions 27-1D12. The memory portions may be a bank, bank group (e.g. group, set, collection of banks), echelon (as defined herein and/or in specifications incorporated by reference), section (as defined herein and/or in specifications incorporated by reference), rank, combinations of these and/or any other grouping of memory portions etc. In one embodiment, the one or more memory portions 27-1D12 may be interconnected to form one or more memory networks. More details of the memory networks, and/or the memory network interconnections, and/or coupling between stacked memory chips, etc. may be described herein and/or in specifications incorporated herein by reference and the accompanying text. For example, FIG. 27-2 may show a stacked memory chip interconnect network that may be used, for example, in the context of FIG. 27-1D. Any memory network and/or interconnect scheme (e.g. e.g. between memory portions, between stacked memory chips, etc.) that may be shown in previous Figure(s) and/or subsequent Figure(s) and/or Figure(s) in specifications incorporated herein by reference may equally be used or adapted for use in the context of FIG. 27-1D.

In FIG. 27-1D, the stacked memory package may include one or more buses 27-1D16. For example, bus 27-1D16 may include one or more control signals (e.g. clock, strobe, etc.) and/or other signals, etc.

In FIG. 27-1D, the stacked memory package may include one or more buses 27-1D18. For example, bus 27-1D18 may include one or more address signals (e.g. column address, row address, bank address, other address, etc.).

In FIG. 27-1D, the stacked memory package may include one or more buses 27-1 D20. For example, bus 27-1 D20 may include one or more data buses (e.g. write data, etc.).

In FIG. 27-1D, the stacked memory package may include one or more buses 27-1 D22. For example, bus 27-1 D22 may include one or more data buses (e.g. read data, etc.).

In one embodiment, bus 27-1D20 and/or bus 27-1D22 may be a bi-directional bus.

In FIG. 27-1D, the stacked memory package may include one or more interconnect networks 27-1 D24. In one embodiment, the interconnect networks 27-1D24 may include interconnect means (e.g. network(s) of connections, bus(es), signals, combinations of these and/or other coupling means, etc.) to couple (or act to couple, etc.) one or more logic chips to one or more stacked memory chips. For example, one or more circuit blocks may be located on one or more logic chips and one or more circuit blocks may be located on one or more stacked memory chips. The one or more interconnect networks 27-1D24 may thus act to couple (e.g. actively connect, passively connect, etc.) circuit block(s). For example, interconnect networks 27-1D24 may include an array (e.g. one or more, groups of one or more, arrays, matrix, etc.) of TSVs that may run vertically to couple logic on one or more logic chips to memory portions on one or more stacked memory chips. For example, interconnect networks 27-1D24 may act to couple write data, addresses, control signals, commands/requests, register writes, register reads, read data, responses/completions, status messages, test data, error data, and/or other information, etc. to/from one or more logic chips to/from one or more stacked memory chips. In one embodiment, the interconnect networks 27-1D24 may also include logic to insert (or remove or otherwise configure, etc.) spare and/or redundant interconnects, alter the architecture of buses and TSV array(s), etc.

In FIG. 27-1D, the stacked memory package may include one or more buses 27-1D26. For example, bus 27-1D26 may include one or more control signals (e.g. clock, strobe, etc.) and/or other signals, etc. In one embodiment, bus 27-1D26 may correspond to (e.g. be coupled to, may contain the same signals as, may contain similar information to, etc.) bus 27-1D16.

In FIG. 27-1D, the stacked memory package may include one or more buses 27-1D28. For example, bus 27-1D28 may include one or more address signals (e.g. column address, row address, bank address, other address information and/or data, etc.). In one embodiment, bus 27-1 D28 may correspond to (e.g. be coupled to, may contain the same signals as, may contain similar information to, etc.) bus 27-1D18.

In FIG. 27-1D, the stacked memory package may include one or more buses 27-1 D30. For example, bus 27-1 D30 may include one or more data buses (e.g. write data, etc.). In one embodiment, bus 27-1D30 may correspond to (e.g. be coupled to, may contain the same signals as, may contain similar information to, etc.) bus 27-1 D20.

In FIG. 27-1D, the stacked memory package may include one or more buses 27-1 D32. For example, bus 27-1 D32 may include one or more data buses (e.g. read data, etc.). In one embodiment, bus 27-1D30 and/or bus 27-1D32 may be a bi-directional bus. In one embodiment, bus 27-1D32 may correspond to (e.g. be coupled to, may contain the same signals as, may contain similar information to, etc.) bus 27-1 D22.

In FIG. 27-1D, buses 27-1D16, 27-1D18, 27-1D20, 27-1D32 may be different (e.g. in width, capacity, frequency, multiplexing, coding, organization, technology, combinations of these and/or one or more other bus properties, parameters, aspects, etc.) from other corresponding (e.g. connected, derived, coupled, logically equivalent etc.) buses. For example, bus 27-1D16 may be different from corresponding bus 27-1D26. For example, bus 27-1D18 may be different from corresponding bus 27-1D28. For example, bus 27-1D20 may be different from corresponding bus 27-1D30. For example, bus 27-1D32 may be different from corresponding bus 27-1 D22.

In FIG. 27-1D, the stacked memory package may include one or more buses 27-1D36. For example, bus 27-1D36 may include one or more control signals (e.g. clock, strobe, etc.) and/or other signals, etc. In one embodiment, bus 27-1D36 may correspond to (e.g. be coupled to, may contain the same signals as, may contain similar information to, etc.) bus 27-1 D26.

In FIG. 27-1D, the stacked memory package may include one or more buses 27-1D38. For example, bus 27-1D38 may include one or more address signals (e.g. column address, row address, bank address, other address, etc.). In one embodiment, bus 27-1D38 may correspond to (e.g. be coupled to, may contain the same signals as, may contain similar information to, etc.) bus 27-1D28.

In FIG. 27-1D, the stacked memory package may include one or more buses 27-1 D40. For example, bus 27-1 D40 may include one or more data buses (e.g. write data, etc.). In one embodiment, bus 27-1D40 may correspond to (e.g. be coupled to, may contain the same signals as, may contain similar information to, etc.) bus 27-1 D30.

In FIG. 27-1D, the stacked memory package may include one or more buses 27-1 D42. For example, bus 27-1 D42 may include one or more data buses (e.g. read data, etc.). In one embodiment, bus 27-1D40 and/or bus 27-1D42 may be a bi-directional bus. In one embodiment, bus 27-1D42 may correspond to (e.g. be coupled to, may contain the same signals as, may contain similar information to, etc.) bus 27-1 D32.

In FIG. 27-1D, buses 27-1D26, 27-1D28, 27-1D30, 27-1D42 may be different from other corresponding buses (as defined above). For example, bus 27-1D26 may be different from corresponding bus 27-1D36. For example, bus 27-1D28 may be different from corresponding bus 27-1D38. For example, bus 27-1D30 may be different from corresponding bus 27-1D40. For example, bus 27-1 D42 may be different from corresponding bus 27-1 D32.

In FIG. 27-1D, the stacked memory package may include one or logic chips 27-1D34. In one embodiment the logic chip(s) 27-1D34 may be implemented on one or more die that are separate from the stacked memory chips, however other physical implementations are possible. For example, the logic functions implemented by logic chips 27-1 D34 may be implemented on one or more stacked memory chips. For example, the logic functions implemented by logic chips 27-1D34 may be implemented on (e.g. with, on the same die as, etc.) one or more CPUs and/or on ICs, chips, die, etc. containing one or more CPUs. For example, the logic functions implemented by logic chips 27-1D34 and/or the functions of one or more stacked memory chips may be integrated on one or more die and/or in other architectures, assemblies, structures, in any technology, manner, fashion, etc. For example, the logic chips 27-1D34 may include one or more of the logic functions in the Rx datapath(s) and/or Tx datapath(s) described in Figures herein (with accompanying text) and/or Figures and accompanying text in specifications incorporated by reference.

In FIG. 27-1D, the stacked memory package may include one or more logic paths 27-1D44. For example, the logic paths 27-1D44 may include one or more of the logic functions in the Rx datapath(s) and/or Tx datapath(s) described in Figures herein (with accompanying text) and/or Figures and accompanying text in specifications incorporated by reference. For example, the logic paths 27-1D44 may include one or more of the logic functions in the PHY layer and/or data link layer and/or higher layers described in Figures herein (with accompanying text) and/or Figures and accompanying text in specifications incorporated by reference.

In FIG. 27-1D, the stacked memory package may include one or more I/O functions 27-1D46. For example, the I/O functions 27-1D46 may include one or more of the logic functions in the Rx datapath(s) and/or Tx datapath(s) described in Figures herein (with accompanying text) and/or Figures and accompanying text in specifications incorporated by reference. For example, the I/O functions 27-1D46 may include one or more of the logic functions in the PHY layer (e.g. serializer, deserializer, SerDes, etc.) described in Figures herein (with accompanying text) and/or Figures and accompanying text in specifications incorporated by reference.

In FIG. 27-1D, the stacked memory package may include one or more input links 27-1D48. For example, the input links may include one or more high-speed serial links, etc.

In FIG. 27-1D, the stacked memory package may include one or more output links 27-1D50. For example, the output links may include one or more high-speed serial links, etc.

In FIG. 27-1D, the stacked memory package may include one or more memory chip logic functions 27-1 D52. In one embodiment, the memory chip logic functions 27-1D52 may act to distribute (e.g. connect, logically couple, etc.) signals to/from the logic chip(s) to/from the memory portions. For example, the memory chip logic functions 27-1D52 may perform (e.g. function, implement, etc.) bus multiplexing, bus demultiplexing, bus merging, bus splitting, combinations of these and/or or other bus and/or data operations, etc. Examples of these bus operations and their function may be described in more detail herein, including details provided in subsequent Figures and accompanying text below. In one embodiment, the memory chip logic functions 27-1D52 may be distributed among the memory portions (e.g. there may be separate memory chip logic functions, logic blocks, circuits, etc. for each memory portion, etc.). In one embodiment, the memory chip logic functions 27-1D52 may be located one or more stacked memory chips. In one embodiment, the memory chip logic functions 27-1D52 may be located one or more logic chips. In one embodiment, the memory chip logic functions 27-1D52 may be distributed between one or more logic chips and one or more stacked memory chips.

In FIG. 27-1D, an abstract view may be used to represent a number of different memory system architectures and/or views of memory system architectures. For example, in a first abstract view, the first groups of memory portions 27-1D10 may include (e.g. represent, signify, encompass, etc.) those memory portions in a stacked memory package. For example, in a second abstract view, the first groups of memory portions 27-1 D10 may include those memory portions in all stacked memory packages and/or all memory portions in a memory system (e.g. in one or more stacked memory packages, etc.).

FIG. 27-2

FIG. 27-2 shows a stacked memory chip interconnect network 27-200, in accordance with one embodiment. As an option, the stacked memory chip interconnect network may be implemented in the context of the previous Figure(s) and/or any subsequent Figure(s). Of course, however, the stacked memory chip interconnect network may be implemented in the context of any desired environment.

In FIG. 27-2, the stacked memory chip interconnect network (or memory interconnect network, memory network, network, etc.) may include one or memory portions 27-210, 27-212, 27-214, 27-216, 27-218, 27-220, 27-222, 27-224, 27-226. In FIG. 27-2, there may be nine memory portions, but any number may be used. In one embodiment (for example as shown in FIG. 27-2), the one or more memory portions may be located on a first stacked memory chip. In one embodiment, the one or more memory portions may be located in a first group of one or more stacked memory chips.

In FIG. 27-2, the one or more memory portions may be interconnected (e.g. connected, coupled, linked, form a network, etc.) by one or more interconnect techniques (e.g. a single bus between two or more memory portions, multiple buses between two or more memory portions, buses and/or groups of signals between two or more memory portions, using interconnect paths, combinations of these and/or other interconnections, etc.).

In FIG. 27-2, bus 27-234 may be one or more input buses to memory portion 27-210 and bus 27-230 may be one or more input buses to memory portion 27-212. For example, bus 27-234 (as well as bus 27-230 and other similar buses that connect memory portions, as shown in FIG. 27-2) may include an address bus and/or control bus (e.g. including clock, strobe, other control signals, etc.) and/or data bus (e.g. including write data). For example, bus 27-234 may include a bidirectional data bus (e.g. including read data and write data, etc.).

In FIG. 27-2, bus 27-234 and bus 27-230 may be demultiplexed from (e.g. split from, sourced by, connected with, coupled to, logically associated with, etc.) bus 27-232. In one embodiment (for example as shown in FIG. 27-2), bus 27-232 may be connected (e.g. coupled, logically connected to, electrically connected to, combinations of these, etc.) a second group of one or more stacked memory chips.

In FIG. 27-2, bus 27-240 may be one or more output buses from memory portion 27-210 and bus 27-236 may be one or more output buses from memory portion 27-212. In FIG. 27-2, bus 27-240 and bus 27-236 may be multiplexed from (e.g. merged to, joined to, form the sources of, connected with, coupled to, logically associated with, etc.) bus 27-238. In one embodiment (for example as shown in FIG. 27-2), bus 27-238 may be connected (e.g. coupled, logically connected to, electrically connected to, etc.) a second group of one or more stacked memory chips.

Thus, for example, in FIG. 27-2 buses such as 27-234, 27-230, 27-240, 27-236 etc. (there may be 48 such buses as shown in FIG. 27-2) may form a memory network on a single stacked memory chip.

Thus, for example, in FIG. 27-2 buses such as 27-232, 27-238, etc. (there are 24 such buses as shown in FIG. 27-2) may form a memory network or part of a memory network between two or more stacked memory chips and/or between one or more stacked memory chips and one or more logic chips. For example, buses such as 27-232, 27-238, etc. may use TSVs, through-wafer interconnect, or other means of connection and/or coupling.

The following description may focus on (e.g. concentrate on, use as example(s), etc.) one or more buses from the group comprising 27-234, 27-230, 27-240, and/or 27-236 and/or focus on one or more buses from the group comprising 27-232 and/or 27-238. It should be understood that the explanations provided herein using particular buses by way of example and/or similar explanations provided in specifications incorporated by reference and/or any descriptions of methods, schemes, algorithms, architectures, arrangements, etc. may equally apply to any (including all) of the interconnect, networks, connections, buses, etc. shown, for example, in FIG. 27-2 and/or any other Figures herein.

The following description may focus on multiplexing one or more buses. Thus, for example, the traffic carried on two buses may be multiplexed onto a single bus. Equally, however, traffic from a single bus may be demultiplexed into two buses. It should be understood that the explanations provided herein and/or provided in specifications incorporated by reference and/or any descriptions of methods, schemes, algorithms, architectures, arrangements, etc. may equally apply to any multiplexing, demultiplexing, splitting, joining, aggregation, etc. of data between any number of buses.

In one embodiment, the memory portions may include any part, parts, grouping of parts, etc. of a stacked memory chip. In one embodiment, the memory portions may be any part, parts, grouping of parts, etc. of one or more groups of one or more stacked memory chips. For example, the memory portions may include one or more banks, bank groups, sections (as defined herein and/or as defined in specifications incorporated by reference), echelons (as defined herein and/or as defined in specifications incorporated by reference), combinations of these, etc.

For example, bus demultiplexing, bus multiplexing, bus merging, bus splitting, etc. methods, systems, architectures, etc. may be implemented, for example, in the context shown in FIG. 13 of U.S. Provisional Application No. 61/569,107, filed Dec. 9, 2011, titled "SYSTEM, METHOD, AND COMPUTER PROGRAM PRODUCT FOR IMPROVING MEMORY SYSTEMS" and/or FIG. 14 of U.S. Provisional Application No. 61/602,034, filed Feb. 22, 2012, titled "SYSTEM, METHOD, AND COMPUTER PROGRAM PRODUCT FOR IMPROVING MEMORY SYSTEMS" and/or FIG. 16-1800 of U.S. Provisional Application No. 61/665,301, filed Jun. 27, 2012, titled "SYSTEM, METHOD, AND COMPUTER PROGRAM PRODUCT FOR ROUTING PACKETS OF DATA".

In one embodiment, demultiplexing between bus 27-232 and buses 27-230 and 27-234 may be performed in time. For example, in a first time period t1 bus 27-232 may carry (e.g. couple, connect, transmit, etc.) data (e.g. a bit, group of bits, etc.) for (e.g. intended for, coupled to, etc.) bus 27-230. For example, in a second time period t2 bus 27-232 may carry data for bus 27-234. For example, in one embodiment, buses 27-232, 27-230 and 27-234 may each be 32 bits wide and bus 27-232 may operate at a different frequency than buses 27-230 and 27-234. For example, bus 27-232 may operate at twice the frequency of buses 27-230 and 27-234. In one embodiment, t1 may equal t2 and the buses may be time-division multiplexed. In one embodiment, t1 may be different from t2. In one embodiment, the buses may be idle for one or more periods of time. In one embodiment, t1 and/or t2 may be varied (e.g. programmed, configured, etc.). For example, the capacities of the buses may be adjusted by varying t1 and/or t2. Adjustment of t1, t2, idle time, and/or other time periods, bus parameters, bus properties etc. may be performed at design time, manufacture, test, start-up, during operation, etc.

In one embodiment, demultiplexing between bus 27-232 and buses 27-230 and 27-234 may use a split bus. Thus, for example, bus 27-232 may be a 128-bit bus and buses 27-230, 27-234 may be 64-bit buses. In this case, for example, bus 27-232 may be split into two 64-bits buses.

In one embodiment, multiplexing between bus 27-238 and buses 27-240 and 27-236 may be performed in time. For example, in a first time period t3 bus 27-238 may carry (e.g. couple, connect, transmit, etc.) data (e.g. a bit, group of bits, etc.) from (e.g. derived from, coupled to, etc.) bus 27-240. For example, in a second time period t4 bus 27-238 may carry data for bus 27-236.

In one embodiment, multiplexing between bus 27-238 and buses 27-240 and 27-236 may use a merged bus. Thus, for example, bus 27-238 may be a 128-bit bus and buses 27-240, 27-236 may be 64-bit buses. In this example, bus 27-238 may be merged from two 64-bits buses.

In one embodiment, bus 27-232 may be 8, 16, 32, 64, 128, 256, 512 bits or any width. For example, bus 27-232 may include error coding bits. For example, bus 27-232 may be 72 bits wide with 64 bits of data and eight error coding bits (e.g. parity, ECC, combinations of these and/or other coding techniques, etc.), but any number of error coding bits may be used.

In one embodiment, bus 27-234 may be 8, 16, 32, 64, 128, 256, 512 bits or any width. Note that buses that connect or couple to each other do not necessarily have to be the same width or capacity. For example, circuits that may couple one or more buses may act to smooth (or otherwise alter, etc.) traffic peak bandwidths, data rates etc. Thus (as an example), the bandwidth required for an input bus to handle an expected input peak data rate may not be the same as the bandwidth required for an output bus coupled to the input bus. Thus, for example, any buses may be any width (or bandwidth, frequency, capacity, etc.) including buses that are coupled or connected to each other.

In one embodiment, buses 27-230 and 27-234 may be the same size as bus 27-232. Thus, for example in one embodiment, bus 27-230 may be switched to couple all bits of bus 27-230 to bus 27-232 when bus 27-232 may be required; similarly bus 27-234 may be switched to couple all bits of bus 27-234 to bus 27-232 when bus 27-234 may be required.

Additionally, in one embodiment, bus 27-232 may operate at a higher frequency than bus 27-230 and bus 27-234 and may allow both bus 27-230 and bus 27-234 to operate at the same time.

In one embodiment, the capacities of one or more buses to be multiplexed (e.g. buses to be joined, etc.) may be adjusted. In one embodiment, the capacities of one or more de-multiplexed buses (e.g. split buses, etc.) may be adjusted. In one embodiment, the capacity of a bus to be de-multiplexed (e.g. bus to be split, etc.) may be adjusted. In one embodiment, the capacity of a multiplexed bus (e.g. joined bus, etc.) may be adjusted.

For example, in one embodiment, buses 27-230 and 27-234 may be half the size (e.g. width, capacity, etc.) of bus 27-232 and thus may allow both bus 27-230 and bus 27-234 to operate at the same time.

In one embodiment, the capacities of buses 27-230 and 27-234 may be same as the capacity of bus 27-232. Thus, for example, if buses 27-230 and 27-234 are required to operate at the same time, bus 27-232 may be programmed (e.g. at design time, at manufacture, at test, at start-up, during operation, etc.) to run at a higher frequency than bus 27-230 and/or bus 27-234.

In one embodiment, the capacity (e.g. bandwidth, bus size, bus frequency, number of bits that can be carried, etc.) of buses 27-230 and 27-234 may be different. Thus, in one embodiment, the buses 27-230 and 27-234 may be required to operate at the same time, and thus the capacity (e.g. width, and/or frequency, and/or coding, etc.) of buses 27-230 and/or 27-234 (and/or 27-232) may be adjusted (e.g. in a fixed, variable, programmable, etc. manner) so that bus 27-230 and bus 27-234 may be capable of carrying the traffic carried by bus 27-232 (e.g. are not over-subscribed, are not over-run, are not saturated, etc.).

In one embodiment, the sum of the capacities of buses 27-230 and 27-234 may be same as the capacity of bus 27-232. In this case, the capacity of bus 27-232 may be matched to the capacities of buses 27-230 and 27-234.

In one embodiment, the sum of capacities of buses 27-230 and 27-234 may be greater than the capacity of bus 27-232. In this case, the capacity of bus 27-232 may be mismatched to the capacities of buses 27-230 and 27-234. In this case, buses 27-230 and 27-234 may be able to carry the traffic carried by bus 27-232 without saturating.

In one embodiment, the sum of capacities of buses 27-230 and 27-234 may be less than the capacity of bus 27-232. In this case, the capacity of bus 27-232 may be mismatched to the capacities of buses 27-230 and 27-234. In this case, buses 27-230 and 27-234 may not be able to carry the traffic carried by bus 27-232 without saturating. In this case, one or more techniques may be used to adjust the traffic on and/or regulate the capacity of bus 27-232. For example, a priority scheme may be used to hold off (e.g. delay, temporarily store, wait, halt, buffer, divert, re-route, pause, alter priority of, etc.) traffic intended for either bus 27-230 and/or bus 27-234.

In one embodiment, there may be more than one bus 27-232, e.g. separate for control and/or address and/or data. For example, bus 27-232 may include 64 bits of data, and/or 8 bits of ECC, and/or A address bits (where the A address bits may be further divided into column address(es) and/or row address(es) and/or bank address(es), etc.), and/or C control bits (e.g. clock, strobe, etc.).

The above examples were applied with respect to buses 27-230, 27-234 (e.g. split buses, etc.) and bus 27-232 (e.g. bus to be split, etc.). Similar examples may be applied with respect to buses 27-236, 27-240 (e.g. buses to be joined, etc.) and bus 27-238 (e.g. joined bus, etc.).

In one embodiment, one or more parts of one or more buses may be multiplexed. In one embodiment, one or more parts of one or more buses may not be multiplexed. Thus, for example, bus 27-232 may include bus D1 that may include 64 bits of data; bus D2 that may include 8 bits of ECC; bus A1 that may include A address bits (where the A address bits may be further divided into column address(es) and/or row address(es) and/or bank address(es), other address information, etc.); bus C1 that may include C control bits (e.g. clock, strobe, etc.) and/or other signals. In this case, bus D1 and bus D2 may be multiplexed with corresponding buses (e.g. buses split from, buses derived from, etc.) 27-230 and 27-232, but for example, buses A1 and/or C1 may not be multiplexed. For example, bus 27-232 may carry two sets of data: one set to be written to memory portion 27-210 and one set to be written to memory portion 27-212; and address information (carried on part or all of bus A1) and/or control information (carried on part or all of bus C1) may be the same for both memory portions 27-210 and 27-212.

In one embodiment, one or more buses may be multiplexed. In one embodiment, one or more buses may not be multiplexed. Thus, for example, bus 27-232 may be multiplexed (e.g. divided, split, etc.), while bus 27-238 may not be multiplexed.

In one embodiment, one or more buses may be multiplexed using different methods. Thus, for example, bus 27-232 may be multiplexed (e.g. divided, split, etc.), by time-division, etc. while bus 27-238 may not be multiplexed.

In one embodiment, the tiling, arrangement, architecture, etc. of buses may be different than that shown in FIG. 27-2. For example, the number of input buses to a memory portion (such as 27-234) may be different from the number of output buses from a memory portion (such as 27-240). For example, the capacity of input buses to a memory portion (such as 27-234) may be different from the capacity of output buses from a memory portion (such as 27-240).

In one embodiment, the interconnect pattern of buses may be different than that shown in FIG. 27-2. For example, buses may not connect to nearest neighbors. For example, bus 27-230 etc. may connect to memory portion 27-214 etc. (e.g. skipping memory portion 27-212, connecting every other memory portion, connecting in a checkerboard pattern, combinations of these and/or other interconnect patterns, etc.). Any interconnect pattern may be used to achieve optimization of one or more memory system parameters (e.g. maximize speed, maximize manufacturing yield, minimize power, facilitate routing, maximize throughput, maximize bandwidth, combinations of these and other factors, parameters, metrics, etc.).

In one embodiment, each memory portion 27-210 may connect to N neighbors. For example, in FIG. 27-2, memory portions connect to either 2, 3 or 4 neighbors. However, extra buses may be added (e.g. 2 buses added to memory portion 27-210, etc.), so that each memory portion may connect to four neighbors. In this case, memory access and memory traffic may be made more regular, for example.

In one embodiment, the connectivity of one or more memory portions 27-210 may differ. For example, in FIG. 27-2, memory portions connect to either 2, 3 or 4 neighbors. In this case, routing and/or TSV placement etc. may be made more regular, symmetric, etc. for example.

Connectivity (e.g. architecture of the network, wiring of buses, etc.) of the memory portions may be achieved by one of several methods. For example, in one embodiment, eight copies of memory portions 27-210 may be logically arranged as the corners (e.g. vertices, etc.) of a cube with each corner connected to (or associated with, etc.) three neighbors, etc.

In one embodiment, the logical arrangements of M copies of memory portion 27-210 may be regular. For example, one or more groups of memory portions may be arranged in one or more copies of a matrix and/or other pattern. For example, one or more groups of memory portions may be tessellated (e.g. in a two-dimensional plane with a repeating structure, etc.).

In one embodiment, for example arrangements of M copies of memory portion 27-210 may form a square (M=2), hypercube (M=8), combinations of these and/or other shapes, forms, etc.

In one embodiment, the arrangements of M copies of memory portion 27-210 may form the vertices of one or more n-cubes, measure polytopes, hypercubes, hyperrectangles, orthotopes, cross-polytopes, simplices, demihypercubes, tessaract, any regular or semiregular polytope (e.g. with a 1-skeleton, etc.), combinations of these and/or other graphs. Such arrangements may be used, for example, to allow the matching of bus bandwidths, increase the memory access bandwidth performance characteristics, improve the power consumption characteristics of the memory (e.g. reduce pJ/bit, reduce power per bit accessed, etc.), allow for failure and/or defects in one or more buses and/or TSV and/or other interconnect structure(s), provide redundant and/or spare interconnect capacity, provide redundant and/or spare memory capacity, increase the interconnect density and/or efficiency, combinations of these and/or other factors, parameters, metrics, etc.

For example, in one embodiment, M copies of memory portion 27-210 may be arranged in a honeycomb or other regular array, pattern, matrix, regular and/or irregular combinations of patterns, combinations of these and/or other pattern(s), etc. to allow construction of an interconnection network using one or more TSV arrays. This and/or similar architectures may be used, for example, in the context shown in FIG. 2A and/or FIG. 2B of U.S. Provisional Application No. 61/608,085, filed Mar. 7, 2012, titled “SYSTEM, METHOD, AND COMPUTER PROGRAM PRODUCT FOR IMPROVING MEMORY SYSTEMS”. The placement of memory portions and/or buses in a triangular, square, hexagonal or other special pattern or any shape may, for example, allow for spare or redundant TSVs or other interconnect resources etc. to be used without disrupting or substantially affecting the electrical and/or logical characteristics of the memory system (e.g. stacked memory chip, stacked memory package, combinations of these, etc.).

It should be noted that the physical arrangement (e.g. appearance, placement, layout, etc.) of memory portions and/or bus structures and/or other interconnect resources etc. may be distinct (e.g. separate, different, etc.) to the logical appearance, arrangement, etc. For example, a square physical arrangement, square array, etc. of memory portions may be equivalent to (e.g. correspond to, appear as, etc.) a logical honeycomb, etc. For example, a logical arrangement of memory portions as a hypercube may correspond to a flat two-dimensional physical arrangement, etc. For example, the physical arrangement (e.g. stacking, layering, etc.) of one or more planes of memory portions (e.g. die, chips, stacked memory chips, etc.) may correspond to a different logical structure (e.g. two-dimensional, three-dimensional, multi-dimensional, etc.). For example, the physical arrangement of one or more stacked memory packages may correspond to a different logical structure (e.g. two-dimensional, three-dimensional, multi-dimensional, etc.).

In one embodiment, one or more arrangements of one or more memory portions may be used. For example, a first group (or set of groups, etc.) of memory portions may be logically arranged and/or physically arranged to achieve higher speed and/or set of first system parameters, while a second group (or set of groups, etc.) of memory portions may be logically arranged and/or physically arranged to achieve lower power and/or set of second system parameters. For example, different arrangements of memory portions may form one or more classes of memory (e.g. as defined herein and/or in specifications incorporated by reference). Any number of groups may be used. The groups may be located on the same memory chip and/or different memory chips and/or different memory packages, etc.

In one embodiment, one or more arrangements of buses may be used. For example, a first group (or set of groups, etc.) of memory portions may use more buses and/or bus resources to achieve higher speed and/or set of first system parameters, while a second group (or set of groups, etc.) of memory portions may use fewer buses and/or bus resources and/or different bus properties etc. to achieve lower power and/or set of second system parameters. For example, different arrangements of buses with one or more groups of memory portions may form one or more classes of memory (e.g. as defined herein and/or in specifications incorporated by reference, etc.).

In one embodiment, one or more arrangements of memory portions and one or more arrangements of buses may be used. For example, a first group of memory portions may form a honeycomb with a first arrangement of buses and a second group of memory portions may form a square matrix with a second arrangement of buses. For example, the first group (or set of groups, etc.) of memory portions may be designed to achieve higher speed and/or set of first system parameters, while the second group of memory portions may be designed to achieve lower power and/or set of second system parameters. For example, the first group (or set of groups, etc.) of memory portions may form a first class of memory (e.g. as defined herein and/or in specifications incorporated by reference) and the second group (or set of groups, etc.) of memory portions may form a second class of memory. For example, the second group (or set of groups, etc.) of memory portions may form spare or redundant interconnect and/or memory resources for the first group of memory portions, etc.

In one embodiment, more than two buses may be multiplexed. Thus, for example, in FIG. 27-2 bus 27-232 is multiplexed to two buses: bus 27-230 and bus 27-234. Any number of buses may be multiplexed. Thus for example, bus 27-232 may be multiplexed to 2, 3, 4 or any number of buses.

In one embodiment, a variable number of buses may be multiplexed. Thus, for example, bus 27-232 may be operable to be multiplexed to three buses (e.g. capable of connecting to memory portions 27-212, 27-216, 27-218, etc.). In a first mode (e.g. configuration, etc.) bus 27-232 may be multiplexed to two buses (e.g. connected to memory portions 27-212, 27-216). In a second mode (e.g. configuration, etc.) bus 27-232 may be multiplexed to three buses (e.g. connected to memory portions 27-212, 27-216, 27-218, etc.). For example, configurations may be varied to change memory system speed, power, etc. In one embodiment, configurations may be changed at design time, manufacture, test, assembly, start-up, during operation, or combinations of these, etc.

In one embodiment, one or more buses may be multiplexed in a hierarchical fashion. For example, bus 27-232 may be multiplexed with buses from other stacked memory chips. For example, bus 27-232 may be multiplexed with bus 27-242, etc.

In one embodiment, one or more buses may be aggregated (e.g. joined, added, etc.) in a hierarchical fashion. For example, bus 27-240 may be aggregated with buses from other stacked memory chips.

In one embodiment, one or more buses may be multiplexed and/or aggregated with other buses. For example, bus 27-232 may be multiplexed and/or aggregated with buses from other stacked memory chips. For example, a hierarchical network of interconnect and/or buses may be designed to minimize the number of TSVs required in a stacked memory package. For example, a first set and/or group of buses may be aggregated to form a second set and/or group of buses. The number of electrical connections required to transmit the second set and/or group may be less than the number of electrical connections required to transmit the first set and/or group. The second set and/or group may thus require less TSVs, through-wafer interconnect (TWI), or other interconnect resources. Reducing the number of TSVs etc. may increase the yield, reduce the cost, increase the performance etc. of a stacked memory package.

In one embodiment, the connections between one or more stacked memory chips may form a shape (e.g. form, frame, network, etc.) and/or shapes with further dimensions, Thus, for example, a first stacked memory chip with one or more arrangements of memory portions may be arranged with one or more second stacked memory chips. For example, a stacked memory chip with a square matrix of memory portions may be arranged with one or more other stacked memory chips to form a cube or cubic arrangement, etc.

In one embodiment, parts, portions, groups of parts, groups of portions of resources may be redundant and/or spare. For example, a first arrangement of memory portions and/or buses on a first stacked memory chip may be grouped with (e.g. partitioned with, logically assembled with, etc.) a second arrangement of memory portions and/or buses on one or more second stacked memory chips to form one or more redundant and/or spare resources. The redundant and/or spare resources may be used (e.g. switched into operation, switched out of operation, used to replace faulty circuits, used to increase reliability, etc.) at design time, manufacture, test, assembly, start-up, during operation, or combinations of these, etc.

In one embodiment, there may be additional logic associated with (e.g. distributed with, coupled to, etc.) each memory portion to perform bus operations (e.g. multiplexing, demultiplexing, merging, joining, splitting, aggregation, combinations of these and/or other operations, etc.). In one embodiment, one or more memory chip logic functions, as shown for example in FIG. 27-1D, may be used.

Thus the stacked memory chip interconnect network of FIG. 27-2 may form an example of a portion or part of the abstract view of a stacked memory package as shown, for example, in FIG. 27-1D.

An abstract view, such as that shown in FIG. 27-1D for example, may be used to design, analyze and/or improve etc. memory system performance including the performance of a memory network. For example, a memory network may contain N memory portions coupled by L links to a memory system. In one extreme, all memory system traffic may be 100% reads directed at a single memory portion. In this case, a simple network structure (for example, a one-to-one-to-one architecture as defined herein) may waste or under-utilize one or more resources. For example, in this case, a stacked memory package may use only one of L links, etc. For example, in this case, if the stacked memory package uses separate buses for read data and write data, then the write data buses may be unused, etc. Other extremes of memory system traffic patterns may include 100% writes or 100% random reads to all memory addresses for example. An abstract view may help improve the utilization of resources. For example, in a one-to-one-to-one architecture memory may be arranged in groups of addresses (e.g. with a group of contiguous memory addresses corresponding to one memory portion, etc.) and that memory portion may be coupled to (e.g. connected to, allocated to, associated with, having access to, etc.) a single read/write data bus. An abstract view and a particular implementation of an abstract view may, for example, eliminate the restriction of one bus per memory portion (and thus depart from a one-to-one-to-one architecture for example).

In one embodiment, different abstract views may represent one or more different physical configurations (e.g. implemented configurations, modes, architectures, memory networks, interconnect networks, bus configurations, combinations of these, etc.). These different physical configurations may be programmed under user and/or system control. For example, different memory system traffic patterns may be recognized or pre-defined, or otherwise determined. For example, the system may be programmed or optimized for 100% read traffic. In this case, for example, a bi-directional read/write data bus may be configured to be read only (e.g. bus turnaround eliminated, simplified, bypassed, etc.). For example, the system may be programmed or optimized for 75% read traffic/25% write traffic. In this case, for example, a bi-directional read/write data bus may be optimized to allow 75% of the bus bandwidth for reads and 25% of the bus bandwidth for writes. In the same example, an abstract view may alternatively (or in addition) allow 75% of the available buses (with possibly more than one bus per memory portion) to be allocated (e.g. assigned, dedicated, optimized, tailored, etc.) for reads and 25% allocated to writes, etc. In one embodiment, one or more resources (e.g. software, hardware, firmware, user controls and/or settings, combinations of these, etc.) some or all of which that may be included in the CPU(s), and/or memory system, and/or stacked memory packages (e.g. one or more functions on one or more logic chips and/or memory chips, etc.) may characterize, measure, or otherwise determine traffic patterns, usage patterns, memory system characteristics, combinations of these and/or other system parameters, metrics, etc. In one embodiment, as a result of such measurement or other input and/or directive for example, one or more physical configurations may be used (e.g. loaded, applied, programmed, etc.).

An abstract view (e.g. programmed in software, used at design time, used at any time, etc.) may be used to perform and/or aid, help, etc. to perform changes in physical configurations. For example, an abstract view and/or model(s) derived from an abstract view etc. may be used to calculate bandwidths, steer signals and/or data, calculate priority of one or more signals and/or data on buses and/or data in buffers etc, to match memory network and/or interconnect network topologies etc. to memory traffic patterns etc, to perform repair operations (e.g. insert spare resources, replace faulty resources, etc.), to increase yield (e.g. by repairing or replacing manufacturing defects etc.), to reduce power (e.g. by shutting off unnecessary resources, etc.), reduce the number of interconnect resources required (e.g. the number of TSVs or other TWI structures, etc.), increase efficiency (e.g. decrease the access energy/bit, etc.), combinations of these and/or other system factors, metrics, parameters, etc.

Note that an abstract view may also be (e.g. may have, may correspond to, may represent, etc.) a physical implementation and/or that an abstract view may be different from a physical view and/or logical view. For example, the abstract view (or an implementation of the abstract view) shown in FIG. 27-1D, for example, may be different from the physical view of the architecture shown in FIG. 1B and/or different from the logical view shown in FIG. 1C. Note that each abstract view of an architecture may also have its own logical view (or multiple logical views) and/or its own physical view (or multiple physical views).

FIG. 27-3

FIG. 27-3 shows a stacked memory package architecture 27-300, in accordance with one embodiment. As an option, the stacked memory package architecture may be implemented in the context of the previous Figure and/or any subsequent Figure(s). Of course, however, the stacked memory package architecture may be implemented in the context of any desired environment.

In FIG. 27-3, the stacked memory package architecture may include one or more first groups of memory portions 27-320 (or sets of groups, collections of groups, etc.) and/or associated memory support circuits (e.g. clocking functions, DLL, PLL, etc.), memory logic, etc. For example, the first groups of memory portions 27-320 may correspond to the first groups of memory portions in FIG. 27-1D. For example, the first group of memory portions 27-320 may correspond to the memory portions in a stacked memory package.

In FIG. 27-3, the stacked memory package architecture may include one or more second groups of memory portions 27-314, 27-318, and 27-322. For example, a second group of memory portions 27-314 etc. may be included on one or more stacked memory chips, etc. For example, a second group of memory portions 27-314 etc. may correspond to the memory portions in a stacked memory chip. For example, the second groups of memory portions 27-314 etc. may correspond to the second groups of memory portions in FIG. 27-1D.

In FIG. 27-3, the group of memory portions 27-314 and the group of memory portions 27-318 may be coupled by an interconnect network 27-316. For example, the group of memory portions 27-314 may be a first stacked memory chip and the group of memory portions 27-318 may be a second stacked memory chip. In this case, the interconnect network 27-316 may include one or more arrays of TSVs or other interconnect method, etc.

In FIG. 27-3, the group of memory portions 27-314 may include a networked collection (e.g. set, group, etc.) of memory portions 27-312. The memory portions 27-312 may include one or more banks, bank groups, sections, echelons, combinations of these and/or or other grouping(s) of memory portions, etc.

In FIG. 27-3, the memory portions 27-312 may be coupled by interconnect 27-310. For example, interconnect 27-310 may include (but is not limited to) data bus(es) (e.g. write data bus(es), read data bus(es), multiplexed read/write data bus(es), bi-directional read/write data bus(es), etc.), address bus(es) (e.g. column address, row address, bank address, multiplexed address, other address information, etc.), control bus(es) and/or control signals (e.g. clock(s), strobe(s), etc.), combinations of these (e.g. time multiplexed, other multiplexed buses, etc.) and/or other bus information and/or signals, etc.

In FIG. 27-3, the memory portions 27-312 and/or interconnect 27-310 may be coupled to interconnect 27-316. For example, one or more buses included in interconnect 27-310 may be multiplexed/demultiplexed to/from interconnect 27-316. For example, interconnect 27-310 may be implemented in the context, for example, of FIG. 27-2 and/or other Figures herein and/or Figure(s) in specifications incorporated by reference with accompanying text.

In FIG. 27-3, the memory portions 27-312 are shown as logically interconnected in a cube. For example, in FIG. 27-3, there may be eight memory portions connected by 12 copies of interconnect 27-310. Note that in FIG. 27-3, each memory portion 27-312 may be associated with exactly three neighbors (e.g. three other memory portions, etc.). As shown in FIG. 27-2, for example, each memory portion may not be electrically coupled to a neighbor (e.g. electrically connected or capable of being electrically connected). Rather each memory portion may share a multiplexed bus with a neighbor, etc. For example, in FIG. 27-3, interconnect 27-310 may be shared between memory portion 27-312 and memory portion 27-328; interconnect 27-324 may be shared between memory portion 27-312 and memory portion 27-330; interconnect 27-326 may be shared between memory portion 27-312 and memory portion 27-332; etc.

Note that FIG. 27-3 may simplify the interconnections and connectivity, for example, between logic chip, memory controllers, TSVs, memory portions, etc. in order to clarify explanations. The details of interconnect structures between memory portions may be as shown, for example, in FIG. 27-2 and/or other Figure(s) herein and/or in Figure(s) in specifications incorporated by reference and accompanying text.

For example, in FIG. 27-3, interconnect 27-310 may correspond to the multiple interconnect buses between two memory portions in FIG. 27-2, for example. Thus, for example, in FIG. 27-3, interconnect 27-310 etc. may include one or more data buses (read data bus, write data bus, read/write data bus, combinations of these, etc.), address bus(es), control bus(es), etc.). In FIG. 27-3, interconnect 27-310 etc. may be coupled to interconnect 27-316, as shown, for example, in FIG. 27-2.

Thus, in one embodiment, one or more memory controllers may be coupled to a memory portion by more than one path. Thus, in one embodiment, a memory controller may be coupled to one or more memory portions by more than one path.

For example, in one embodiment, a first memory controller M1 may be coupled to interconnect 27-310; a second memory controller M2 may be coupled to interconnect 27-324; a third memory controller M3 may be coupled to interconnect 27-326. Thus, for example, memory controller M1 may be coupled to memory portion 27-312 and/or memory portion 27-328. In this example, M1 may read/write to two memory portions in a combined, aggregated fashion, etc. and/or read/write to two memory portions independently. Also, in this example, memory portion 27-312 may be coupled to three memory controllers (M1, M2, M3), any of which may perform data read/write operations, register read/write operations, other operations, etc. Thus, in this example, one memory controller may be coupled to two memory portions (on a stacked memory chip). Thus, in this example, one memory portion (on a stacked memory chip) may be coupled to three memory controllers. In this example, there may be eight memory portions (for example in a stacked memory chip), and there may be 12 memory controllers. In one embodiment of a stacked memory package there may be 2, 4, 8, or any number of stacked memory chips. Thus, for example, in this case, a memory controller on a logic chip may be connected to (or be capable of being connected to) two memory portions on each of the stacked memory chips (the stacked memory chip being selected by a chip select, CS, or other similar signal for example).

Such architectures as those based on FIG. 27-3 may provide a more abstract view (e.g. more flexible view, more powerful architectural view, etc.) of the connections and connectivity between system (e.g. CPU, etc.) and the memory (e.g. memory portions) via high-speed serial links, memory controllers, and TSV interconnect.

For example, the capability to connect a single memory controller to multiple memory portions may allow more data to be retrieved by a single request. For example, two banks capable of a 32 bit access (e.g. 32-bit read, 32-bit write) each may be ganged (e.g. data combined, data aggregated, etc.) to provide a 64-bit access, etc.

For example, the ability to connect one or more memory controllers to one or more memory portions may provide redundancy and/or improve reliability. For example, multiple memory controllers may be operable to be connected to any single memory portion to provide redundancy and/or improve reliability.

For example, the ability to connect memory controllers to memory portions through multiple paths (e.g. logical connections, etc.) may improve bandwidth, efficiency, power, etc. For example, 100% efficiency may be considered to be the situation in which all buses (e.g. interconnect paths, etc.) connecting the memory controllers and memory portions are 100% utilized. With a one-to-one connection between memory controllers and memory portions, this situation may be hard to realize. In addition it may be required that each connection between memory controller and memory portion must be capable of handling the full bandwidth of the memory portion. In FIG. 27-3, for example, there may be 12 interconnect paths for eight memory portions. Each interconnect path may thus be capable of handling 8/12 or ⅔ of the memory portion bandwidth. However, each memory portion may be capable of being connected to three interconnect paths. If connected to all three interconnect paths, each that may have ⅔ memory portion bandwidth, the peak interconnect bandwidth capability may be 3*⅔ or twice the memory portion bandwidth. Thus, for example, the interconnect scheme and architecture of FIG. 27-3 may be more efficient and more adaptable to statistical variation in memory traffic (e.g. bandwidth demands, etc.).

In one embodiment, each of eight memory portions may have a dedicated (e.g. not shared, not multiplexed, not demultiplexed, etc.) interconnect 27-310, and in this case there may be eight copies of interconnect 27-310. Such an embodiment may form a baseline or reference implementation in which there is a one-to-one connection between, for example, memory controllers and memory portions.

In FIG. 27-3, the eight memory portions may be connected logically as a cube with each memory portion having (e.g. owning, associated with, coupled to, etc.) three sets of interconnect, such as interconnect 27-310. In FIG. 27-3 there thus may be 12 copies of interconnect 27-310. The addition of bus sharing may thus be considered to increase the interconnect by a factor of 12/8 relative to the baseline or reference example above. The addition of bus sharing may thus be considered to add a 50% overhead (calculated as a percentage equal to 12/8−1). Other arrangements are possible. For example, eight memory portions may be connected using 10 interconnect paths e.g. four memory portions use or share three interconnect paths and four memory portions may use or share two interconnect paths, etc. Such an arrangement may be easier to route (e.g. layout, place, etc.) for example. In this case the overhead may be considered equal to 25% etc.

Thus, using an abstract view such as that described herein and using designs based, for example, on FIG. 27-3 may allow the design of stacked memory packages and memory systems with improved bandwidth, efficiency, lower power, greater reliability, added redundancy, and/or other improvements, etc. at a potential cost of adding interconnect overhead that may be varied according to the system gains required and/or desired. In fact, since interconnect and other overhead must be added in any case to account, for example, for loss of TSVs (e.g. due to defects etc.) during manufacture, architectures such as shown in FIG. 27-3 may actually be a more effective use of the spare interconnect that may need to be added to achieve a satisfactory yield, etc.

The architecture of FIG. 27-3 and accompanying examples and embodiments described above are examples of architectures that may be based on FIG. 27-3. For example, eight memory portions are shown as being grouped in FIG. 27-3 (e.g. in a stacked memory chip, etc.), but any number may be used. Other grouping and/or other arrangements of memory portions may be used e.g. groups may be arranged within a stacked memory chip (e.g. one or more groups per stacked memory chip, etc.), groups may form (or be formed from, etc.) one or more memory classes (as defined herein and/or in specifications incorporated by reference and accompanying text), groups may span more than one stacked memory chip, groups may span more than one stacked memory package, groups may be formed from one or more sections (as defined herein and/or in specifications incorporated by reference and accompanying text), groups may be formed from one or more echelons (as defined herein and/or in specifications incorporated by reference and accompanying text), sections may be formed from one or more memory portions, echelons may be formed from one or more memory portions, etc. Different interconnect architectures may be used e.g. cubes, hypercubes, other graphs, combinations of these and/or other networks, structures, etc. as described herein and/or with reference to FIG. 27-2, for example.

FIG. 27-4

FIG. 27-4 shows a stacked memory package architecture 27-400, in accordance with one embodiment. As an option, the stacked memory package architecture may be implemented in the context of the previous Figure and/or any subsequent Figure(s). Of course, however, stacked memory package architecture may be implemented in the context of any desired environment.

In FIG. 27-4, the stacked memory package architecture may include input pads and near-pad logic 27-410 (labeled A). In FIG. 27-4, four copies of the input pads and near-pad logic 27-410 are shown, but any number may be used. The input pads and near-pad logic 27-410 may convert one or more high-speed serial links to one or more internal data buses. For example, each copy of input pads and near-pad logic 27-410 may receive packets, data, etc. on 2, 4, 8, 16 or any number of input lanes that may be part of one or more high-speed serial links.

In FIG. 27-4, the stacked memory package architecture may include other PHY and/or data link layer logic 27-412 (labeled B). In FIG. 27-4, four copies of PHY and/or data link layer logic 27-412 may be shown, but any number may be used.

In FIG. 27-4, the stacked memory package architecture may include one or more copies of bus 27-452. The bus 27-452 may couple input pads and near-pad logic 27-410 to other PHY and/or data link layer logic 27-412. The bus 27-452 may be 16, 32, 64, 128, 256, 512 or any number of bits wide (and may also include error coding, parity, bus inversion signals, other signal integrity coding, combinations of these, for example).

In FIG. 27-4, the stacked memory package architecture may include one or more copies of bus 27-414. The bus 27-414 may be part of the Rx datapath, for example. The bus 27-414 may be part of a short-cut, cut through, short circuit etc. that may allow packets, etc. to be forwarded from the input pads and near-pad logic 27-410 to the outputs. The bus 27-414 may or may not use the same format, technology, width, frequency, etc. as bus 27-452 (though the bus 27-414 is shown branching from bus 27-452 for simplicity of representation in FIG. 27-4). For example, bus 27-414 may convey raw packet information from input circuits to output circuits (e.g. to reduce the latency of packet forwarding, etc.).

Note that bus 27-414 (and associated logic, etc.) may not be present in all implementations. For example, a short-circuit path may be included at one or more different locations (e.g. different from the branch point of bus 27-414 shown in FIG. 27-4) between the Rx datapath and the Tx datapath. For example, a short-circuit path may not be included (e.g. not present, disconnected, disabled, disabled by configuration, etc.).

In FIG. 27-4, the stacked memory package architecture may include one or more copies of crossbar logic 27-416 (labeled C). One or more copies of crossbar logic 27-416 may form part(s) of a switching network, crossbar, or other equivalent function. For example, the switching network may be equivalent to the RxXBAR crossbar and/or RxXBAR_0 crossbar and/or other similar functions that may be shown in previous and/or subsequent Figure(s) herein and/or Figure(s) in specifications incorporated by reference and described in the accompanying text.

In FIG. 27-4, the stacked memory package architecture may include one or more copies of bus 27-454. The bus 27-454 may be part of the Rx datapath, for example. The bus 27-454 may or may not use the same format, technology, width, frequency, etc. as bus 27-452, For example, one or more circuits or logic functions in the PHY and/or data link layer logic 27-412 may convert the data representation (e.g. bus type, bus coding, bus width, bus frequency, etc.) of bus 27-452 to a different bus representation for bus 27-454.

In FIG. 27-4, the stacked memory package architecture may include one or more copies of crossbar logic 27-422 (labeled D). One or more copies of crossbar logic 27-416 and/or crossbar logic 27-422 may form part(s) of a switching network, crossbar, or other equivalent function. For example, the switching network may be equivalent to the RxXBAR crossbar and/or RxXBAR_0 crossbar functions shown in other Figure(s) herein and/or Figure(s) in specifications incorporated by reference and accompanying text. For example, the combination of the functions of crossbar logic 27-416 and/or crossbar logic 27-422 may allow any input link to be coupled to any memory controller. In one embodiment, the crossbar logic 27-422 may include part of the RxXBAR functions and/or RxXBAR_0 functions and/or similar functions that may be shown in previous and/or subsequent Figure(s) herein and/or Figure(s) in specifications incorporated by reference and described in the accompanying text. For example, the crossbar logic 27-422 may include one or more MUX functions that may take as inputs (e.g. inputs may be coupled to, be connected to, etc.) one or more copies of the bus 27-420 and/or one or more copies of the bus 27-432.

In one embodiment, the crossbar logic 27-422 may include part of the Rx datapath (e.g. may include one or more circuits, logic functions, etc. of the Rx datapath, etc.).

In FIG. 27-4, the stacked memory package architecture may include one or more copies of bus 27-420. In FIG. 27-4, four copies of bus 27-420 may be shown as coupled to a single copy of crossbar logic 27-416, but any number may be used. In one embodiment, bus 27-420 may simply be one or more copies of bus 27-454, etc. In one embodiment, bus 27-420 may use a different representation than bus 27-454, etc. The exact nature (e.g. width, number of copies, etc.) of bus 27-420 may differ (and may differ from the representation shown or implied in FIG. 27-4) depending on the circuit implementation of the crossbar function(s), for example. Examples of such circuit implementations (e.g. crossbar circuits, switching networks, etc.) may be shown in other Figure(s) herein and/or Figure(s) in specifications incorporated by reference and accompanying text.

In FIG. 27-4, the stacked memory package architecture may include one or more copies of bus 27-432. In one embodiment, bus 27-432 may simply be one or more copies of bus 27-420, representing, for example, multiple inputs to a MUX, etc. The MUX function(s) may be part of crossbar logic 27-422, for example. The exact nature (e.g. width, number of copies, etc.) of bus 27-432 may differ (and may differ from the representation shown or implied in FIG. 27-4) depending on the circuit implementation of the crossbar function(s), for example. Examples of such circuit implementations may be shown in other Figure(s) herein and/or Figure(s) in specifications incorporated by reference and accompanying text.

In FIG. 27-4, the stacked memory package architecture may include one or more copies of memory controller 27-456 (label E). In FIG. 27-4, four copies of memory controller 27-456 may be shown, but any number may be used (e.g. 4, 8, 16, 32, 64, 128, etc.). In FIG. 27-4, there may be a one-to-one correspondence between memory controllers and memory portions (e.g. there may be one memory controller for each memory portion on a stacked memory chip, etc.) but any number of copies of memory controller 27-456 may be used for each memory portion on a stacked memory chip. Thus, (for example) 8, 10, 12, etc. memory controllers may be used for stacked memory chips that may contain 8 memory portions (and thus the number of memory controllers used for each memory portion on a stacked memory chip is not necessarily an integer). Examples of architectures that do not use a one-to-one structure may be shown in other Figure(s) herein and/or Figure(s) in specifications incorporated by reference and accompanying text.

In one embodiment, circuit blocks and/or logic functions, which may be part of crossbar logic 27-422 and/or part of memory controllers 27-456 for example, may alter, modify, split, aggregate, insert data, insert information, in the data carried by bus 27-432 and/or bus 27-426. For example, bus 27-432 may carry data in packet format (e.g. a simple command packet, etc.), and logic may insert one or more data fields to identify one or more commands and/or perform other logic functions on the data contained on bus 27-432, etc. For example, bus 27-458 may carry data in one or more buses (e.g. one or more of: a write bus, a bi-directional read/write bus, a multiplexed bus, a shared bus, etc.), and logic may insert one or more data fields to identify one or more commands and/or perform other logic functions on the data contained on bus 27-432, 27-436, etc. For example, logic that is part of the memory controller may multiplex data onto one or more buses 27-458. For example, logic that is part of the memory controller may encode data to one or more command packets that may be carried on one or more buses 27-458, etc. Data fields encoded (e.g. inserted, contained, etc.) in one or more buses and/or in one or more command packets may be used by logic to demultiplex buses and/or route, forward, steer or otherwise direct packets. In one embodiment, the demultiplexing logic may be included on one or more stacked memory chips. In one embodiment, the demultiplexing logic may be associated with (e.g. co-located with, coupled to, connected to, etc.) one or more memory portions. In one embodiment, the command packet routing logic may be included on one or more stacked memory chips. In one embodiment, the command packet routing logic may be associated with (e.g. co-located with, coupled to, connected to, etc.) one or more memory portions.

In FIG. 27-4, the stacked memory package architecture may include one or more copies of bus 27-426. The bus 27-426 may or may not use the same format, technology, width, frequency, etc. as bus 27-432, In FIG. 27-4, the stacked memory package architecture may include one or more copies of bus 27-458. The bus 27-458 may or may not use the same format, technology, width, frequency, etc. as bus 27-426. For example, bus 27-458 may include one or more memory buses. For example, in one embodiment, bus 27-458 may include one or more data buses (e.g. write data bus, etc.), address bus(es) (e.g. column address, row address, multiplexed address, bank address, other address information, etc.), control bus (es) (e.g. clock(s), strobe(s), etc.), and/or other memory-related information, data, control, etc. For example, in one embodiment, bus 27-458 may include one or more TSV arrays to connect the memory controllers to the memory portions.

In one embodiment, bus 27-426 may include (e.g. contain, carry, maintain, transfer, transmit, etc.) data (e.g. information in general as opposed to just read data or write data, etc.) held in packet format e.g. packets may contain one or more address field(s), data field(s) (write data), command/request field(s), other data/flag/control/information field(s), etc. while bus 27-458 may contain similar information demultiplexed (e.g. separated, split, etc.) into one or more buses and control signals, etc.

In one embodiment, bus 27-458, may maintain data in a packet format or partially in packet format, etc. For example, write data may be multiplexed with address data and/or with command/request information and/or with other control information etc. In this case, data (e.g. write commands/requests, etc.) may be transferred from one or more logic chips to one or more stacked memory chips in a packet format (e.g. across, via, using one or more TSV arrays, etc.). In one embodiment, such packets may be simple command packets, for example. In this case, for example, packet demultiplexing (which may include tasks such as removing address and/or command fields, etc.) may be performed on one or more stacked memory chips. In this case, there may be logic functions, circuits etc. associated with (e.g. connected to, coupled to, assigned to, etc.) each memory portion that may perform demultiplexing etc. In one embodiment, packets may contain any or all of the following (but not limited to the following): data (e.g. read data, write data, etc.), address (e.g. column address, row address, bank address, other address information, etc.), command and/or request and/or response and/or completion information (e.g. read command, write command, etc.), other data and/or address and/or command and/or control information, combinations of these, etc.

In one embodiment, logic functions associated with one or more memory portions may be capable of forwarding and/or routing and/or steering etc. command packets and/or other packets. The ability to steer, forward, route or otherwise direct command packets and/or other packets etc. may be employed in the case there is more than one path to a memory portion (for example in architectures where there may not be a one-to-one correspondence between memory controllers and memory portions, etc.). For example, the ability to steer command packets may be as simple as choosing one of two alternative paths. For example, memory controller MC1 may be connected to two memory portions, MP1 and MP2. In this case, a bus B0 may connect the memory controller MC1 on a logic chip to a stacked memory chip containing MP1 and MP2. On the stacked memory chip bus B0 may split (e.g. demultiplex, etc.) to buses B1 and B2. Bus B1 may connect to memory portion MP1 and bus B2 may connect to memory portion MP2, for example. Memory controller MC1 may transmit a write command packet P0 with destination memory portion MP2. Logic associated with MP1 and/or MP2 may be capable of steering and/or demultiplexing the packet P0 from bus B1 and forwarding the packet (or part of the packet etc.) to MP2 via bus B2. Similarly read data may be directed (e.g. using read response packets, etc.) from memory portions on a stacked memory chip across multiplexed buses to one or more logic chips (e.g. to read buffers, read FIFOs, etc.).

In FIG. 27-4, the stacked memory package architecture may include one or more memory portions 27-428 (label M). In FIG. 27-4, 16 copies of memory portion 27-428 may be shown, but any number may be used. In FIG. 27-4, memory portions are arranged in a 4×4 matrix, but any arrangement of memory portions may be used. For example, in FIG. 27-4, memory portions may be arranged such that there may be four memory portions on each of four stacked memory chips. In one embodiment, each stacked memory chip may be selected (e.g. using a chip select signal, CS, other signal(s), etc.) so that one memory controller may be coupled to one memory portion on each stacked memory chip (e.g. one-to-one correspondence, one-to-one structure, etc.). Examples of architectures that use a one-to-one structure and that do not use a one-to-one structure may be shown in other Figure(s) herein and/or Figure(s) in specifications incorporated by reference and accompanying text. The memory portions may be banks, bank groups, sections, echelons, groups of memory portions, combinations of these and/or any other grouping of memory, etc.

In FIG. 27-4, the stacked memory package architecture may include one or more copies of bus 27-430. In one embodiment, bus 27-430 may include one or more data buses (e.g. read data bus, etc.). In one embodiment bus 27-430 or part of bus 27-430 may be a bi-directional data bus (e.g. read/write bus, etc.). In this case, part of bus 27-430 may also be considered part of bus 27-458, etc. Thus the representation of circuits, buses, and/or connectivity shown in FIG. 27-4, including bus 27-430, should be interpreted with respect to (e.g. with consideration of, in the light of, etc.) the function(s) of the components and/or architecture etc. and may not necessarily represent the exact connections that may be used, the manner that connections may be made, the exact connectivity that may be employed in all implementations, etc.

In FIG. 27-4, the stacked memory package architecture may include one or more copies of crossbar logic 27-434 (labeled O). One or more copies of crossbar logic 27-434 may form part(s) of a switching network, crossbar, or other equivalent function. For example, the switching network may be equivalent to the RxXBAR crossbar and/or RxXBAR_1 crossbar and/or TxXBAR crossbar and/or other similar functions that may be shown in previous and/or subsequent Figure(s) herein and/or Figure(s) in specifications incorporated by reference and described in the accompanying text.

In FIG. 27-4, the stacked memory package architecture may include one or more copies of bus 27-436. The bus 27-436 may be part of the Tx datapath, for example. The bus 27-436 may or may not use the same format, technology, width, frequency, etc. as bus 27-430, For example, one or more circuits or logic functions in the crossbar logic 27-434 may convert the data representation(s) (e.g. bus type, bus coding, bus width, bus frequency, etc.) of bus 27-430 to a different bus representation for bus 27-436.

In FIG. 27-4, four copies of bus 27-436 may be shown as coupled to a single copy of crossbar logic 27-434, but any number may be used. In one embodiment, bus 27-436 may simply be one or more copies of bus 27-430, etc.

In one embodiment, bus 27-436 may use one or more different representations than bus 27-430, etc. The exact nature (e.g. width, number of copies, etc.) of bus 27-436 may differ (and may differ from the representation shown or implied in FIG. 27-4) depending on the circuit implementation of the crossbar function(s), for example. Examples of such circuit implementations (e.g. crossbar circuits, switching networks, etc.) may be shown in other Figure(s) herein and/or Figure(s) in specifications incorporated by reference and accompanying text.

In one embodiment, bus 27-436 may include one or more memory buses. For example, in one embodiment, bus 27-436 may include one or more data buses (e.g. read data bus, etc.) and/or other memory-related information, data, control, etc. For example, in one embodiment, bus 27-436 may include (e.g. use, employ, be connected via, be coupled to, etc.) one or more TSV arrays to connect the memory portions to one or more logic functions in the Tx datapath, etc.

In one embodiment, bus 27-430 and/or 27-436 may include one or more data buses (e.g. read data bus(es), etc.). For example, each bus 27-430 and/or 27-436 may contain 1, 2, 4 or any number of read data buses that are separate, multiplexed together, or combinations of these, etc. and/or other bus(es) and/or control signals (that may also be viewed as a bus, or part of one or more buses, etc.).

In one embodiment bus 27-430 or part of bus 27-430 may be a bi-directional data bus (e.g. read/write bus, etc.). In this case, part of bus 27-436 may also be considered part of bus 27-430, etc. For example, bus 27-436 may be the read part of the read/write bus 27-430 (if bus 27-430 is a bi-directional bus). Thus the representation of circuits, buses, and/or connectivity shown in FIG. 27-4, including bus 27-436, should be interpreted with respect to (e.g. with consideration of, in the light of, etc.) the function(s) of the components, circuits, buses, and/or architecture etc. and may not necessarily represent the exact connections used, the manner that connections are made, the exact connectivity employed in all implementations, etc.

In one embodiment, bus 27-430 may include data (e.g. information in general as opposed to just read data or write data, etc.) held in packet format e.g. packets may contain one or more address field(s), data field(s) (e.g. read data), completion/response field(s), other data/flag/control/information/tag/ID field(s), etc. while bus 27-436 may contain similar information demultiplexed (e.g. separated, split, etc.) into one or more buses and control signals, etc.

In one embodiment, bus 27-430 may include data (e.g. information in general as opposed to just read data or write data, etc.) held in packet format e.g. packets may contain one or more address field(s), data field(s) (e.g. read data), completion/response field(s), other data/flag/control/information/tag/ID field(s), etc. and bus 27-436 may contain similar packet-encoded information (possibly in a different format or formats), etc.

In one embodiment, circuit blocks and/or logic functions, which may be part of crossbar logic 27-434 for example, may alter, modify, split, aggregate, insert data, insert information, in the data carried by bus 27-430. For example, bus 27-430 may carry data in packet format (e.g. a simple response packet, etc.), and logic may insert a tag, ID or other data fields to identify one or more responses (e.g. associate a response with a request, etc.) and/or perform other logic functions on the data contained on bus 27-430, etc. For example, bus 27-430 may carry data in one or more buses (e.g. one or more of: a read bus, a bi-directional read/write bus, a multiplexed bus, a shared bus, etc.), and logic may insert a tag, ID or other data fields to identify one or more responses (e.g. associate a response with a request, etc.) and/or perform other logic functions on the data contained on bus 27-430, etc.

In one embodiment, bus 27-430 may include data from more than one memory portion (e.g. data from more than one memory portion may be multiplexed onto one or more copies of bus 27-430, etc.). In this case, logic (e.g. in crossbar logic 27-434, etc.) may demultiplex data (e.g. split, separate, etc.) to one or more copies of bus 27-436, for example.

In FIG. 27-4, the stacked memory package architecture may include one or more copies of bus 27-438. In one embodiment, bus 27-438 may simply be one or more copies of bus 27-436, representing, for example, multiple inputs to a MUX, etc. The MUX function(s) may be part of Tx datapath logic 27-440, for example. The exact nature (e.g. width, number of copies, etc.) of bus 27-438 may differ (and may differ from the representation shown or implied in FIG. 27-4) depending on the circuit implementation of the crossbar function(s), for example. Examples of such circuit implementations may be shown in other Figure(s) herein and/or Figure(s) in specifications incorporated by reference and accompanying text.

In FIG. 27-4, the stacked memory package architecture may include one or more copies of Tx datapath logic 27-440 (label P). In one embodiment, the Tx datapath logic 27-440 may include part of the PHY layer functions and/or part (or all) of the data link layer functions of the Tx datapath. In one embodiment, the Tx datapath logic 27-440 may include part of the TxXBAR functions and/or RxXBAR functions and/or RxXBAR_1 functions and/or other similar functions that may be shown in previous and/or subsequent Figure(s) herein and/or Figure(s) in specifications incorporated by reference and described in the accompanying text. For example, the Tx datapath logic 27-440 may include one or more MUX functions that may take as inputs one or more copies of the bus 27-436 and/or one or more copies of the bus 27-438.

In FIG. 27-4, the stacked memory package architecture may include one or more copies of crossbar logic 27-442 (label Q). One or more copies of crossbar logic 27-442 may form part(s) of a switching network, crossbar, or other equivalent function. For example, the switching network may be equivalent to the RxTxXBAR crossbar and/or other similar functions that may be shown in previous and/or subsequent Figure(s) herein and/or Figure(s) in specifications incorporated by reference and described in the accompanying text.

In FIG. 27-4, the stacked memory package architecture may include one or more copies of output logic 27-444 (label R). One or more copies of output logic 27-444 and/or parts of Tx datapath logic 27-440 and/or crossbar logic 27-442 may form part(s) of a switching network, crossbar, or other equivalent function. For example, the switching network may be equivalent to the RxTxXBAR crossbar functions shown in other Figure(s) herein and/or Figure(s) in specifications incorporated by reference and accompanying text. For example, the combination of the functions of output logic 27-444 and/or parts of Tx datapath logic 27-440 and/or crossbar logic 27-442 may allow the output of one or more memory portions (e.g. response(s), completion(s), etc.) to be coupled to any output link. In one embodiment, the part(s) of the output logic 27-444 and/or parts of Tx datapath logic 27-440 and/or crossbar logic 27-442 may include part of the RxTxXBAR functions that may be shown in previous and/or subsequent Figure(s) herein and/or Figure(s) in specifications incorporated by reference and described in the accompanying text. For example, part(s) of the output logic 27-444 may include one or more MUX functions that may take as inputs (e.g. inputs may be coupled to, be connected to, etc.) one or more copies of the bus 27-448 and/or one or more copies of the bus 27-446 and/or one or more copies of the bus 27-450.

In FIG. 27-4, the stacked memory package architecture may include one or more copies of bus 27-446. In one embodiment, bus 27-446 may simply be one or more copies of bus 27-448, representing, for example, multiple inputs to a MUX, etc. The MUX function(s) may be part of output logic 27-444, for example. The exact nature (e.g. width, number of copies, etc.) of bus 27-446 may differ (and may differ from the representation shown or implied in FIG. 27-4) depending on the circuit implementation of the crossbar function(s), for example. Examples of such circuit implementations may be shown in other Figure(s) herein and/or Figure(s) in specifications incorporated by reference and accompanying text.

In FIG. 27-4, the stacked memory package architecture may include one or more copies of bus 27-448. In one embodiment, the bus 27-448 may be considered part of the Tx datapath, for example, and may use the clocking, bus width, etc. used by bus 27-450. In this case, crossbar logic 27-442 may perform one or more bus conversion functions, for example. In one embodiment, the bus 27-448 may be considered part of the Rx datapath, for example, and may use the clocking, bus width, etc. used by bus 27-414. In this case, part(s) of output logic 27-444 may perform one or more bus conversion functions, for example.

In one embodiment, the bus 27-448 may or may not use the same format, technology, width, frequency, etc. as bus 27-414, For example, one or more circuits or logic functions in the crossbar logic 27-442 may convert the packets, packet formats, packet contents, data representation(s) (e.g. bus type, bus coding, bus width, bus frequency, timing, symbols, etc.) of bus 27-414 to a different bus representation for bus 27-448.

In FIG. 27-4, the stacked memory package architecture may include one or more copies of bus 27-450. In one embodiment, the bus 27-450 may or may not use the same format, technology, width, frequency, etc. as bus 27-438, For example, one or more circuits or logic functions in the Tx datapath logic 27-440 may convert the packets, packet formats, packet contents, data representation(s) (e.g. bus type, bus coding, bus width, bus frequency, timing, symbols, etc.) of bus 27-438 to a different bus representation for bus 27-450.

In one embodiment, part of output logic 27-444 may MUX a copy of bus 27-450 with one or more copies of bus 27-446 where bus 27-446 may in turn represent one or more copies of bus 27-448. In this case, bus 27-450 and bus 27-446 may use the same bus representation.

In one embodiment, bus 27-450 and bus 27-446 may use a different bus representation and/or different data representation, etc. Thus, the representation of circuits, buses, and/or connectivity shown in FIG. 27-4, including bus 27-450 and/or bus 27-446 and/or bus 27-448, should be interpreted with respect to (e.g. with consideration of, in the light of, etc.) the function(s) of the components and/or architecture etc. and may not necessarily represent the exact connections used, the manner that connections are made, the exact connectivity employed in all implementations, etc.

FIG. 27-5

FIG. 27-5 shows a stacked memory package architecture 27-500, in accordance with one embodiment. As an option, the stacked memory package architecture may be implemented in the context of the previous Figure(s) and/or any subsequent Figure(s). Of course, however, the stacked memory package architecture may be implemented in the context of any desired environment.

For example, as an option, the receive datapath the receive datapath shown in FIG. 27-5 may be implemented in the context of FIG. 27-4.

In FIG. 27-5, the stacked memory package architecture may include one or more copies of input logic 27-510 (label IPAD).

In FIG. 27-5, the stacked memory package architecture may include one or more copies of deserializer 27-512 (label DES).

In FIG. 27-5, the stacked memory package architecture may include one or more copies of the forwarding information base 27-514 (label FIB) e.g. forwarding table, etc.

In FIG. 27-5, the stacked memory package architecture may include one or more copies of the receive crossbar 27-516 (label RxXBAR).

In FIG. 27-5, the stacked memory package architecture may include one or more copies of the receive FIFO 27-520 (label RxFIFO) e.g. first-in first-out buffer.

In FIG. 27-5, the stacked memory package architecture may include one or more copies of receive arbiter 27-522 (label RxARB).

In FIG. 27-5, the stacked memory package architecture may include one or more copies of interconnect array 27-524 (label TSV).

In FIG. 27-5, the stacked memory package architecture may include one or more copies of bus 27-542. The bus 27-542 may couple one or more memory portions to one or more parts of the Rx datapath including, for example, parts of one or more memory controllers that may be part of, associated with, include, etc. circuit blocks RxFIFO and/or RxARB and/or other buffers, queues, state machine, and control logic (e.g. priority control, response tracking logic, etc.) and/or other logic functions, etc.

In FIG. 27-5, the stacked memory package architecture may include one or more copies of memory portions 27-526 (label DRAM).

In FIG. 27-5, the stacked memory package architecture may include one or more copies of bus 27-528. The bus 27-542 may couple one or more memory portions to one or more parts of the Tx datapath, including, for example, parts one or more memory controllers that may be part of, associated with, include, etc. circuit blocks TxFIFO and/or TxARB and/or other buffers, queues, state machine, and control logic (e.g. response tracking logic, response generation logic, etc.) and/or other logic functions, etc.

In FIG. 27-5, the stacked memory package architecture may include one or more copies of transmit FIFO 27-530 (label TxFIFO).

In FIG. 27-5, the stacked memory package architecture may include one or more copies of transmit arbiter 27-532 (label TxARB).

In FIG. 27-5, the stacked memory package architecture may include one or more copies of transmit crossbar 27-534 (label TxXBAR).

In FIG. 27-5, the stacked memory package architecture may include one or more copies of receive/transmit crossbar 27-536 (label RxTxXBAR).

In FIG. 27-5, the stacked memory package architecture may include one or more copies of serializer 27-538 (label SER).

In FIG. 27-5, the stacked memory package architecture may include one or more copies of output logic 27-540 (label OPAD).

FIG. 27-6

FIG. 27-6 shows a receive datapath 27-600, in accordance with one embodiment. As an option, the receive datapath may be implemented in the context of the previous Figure(s) and/or any subsequent Figure(s). Of course, however, the receive datapath may be implemented in the context of any desired environment.

For example, as an option, the receive datapath shown in FIG. 27-6 may form part of a short-cut path, short-circuit path, cut-through path, etc. For example, the receive datapath may allow one or more packets and/or information contained in one or more packets to be forwarded from one or more inputs to one or more outputs.

For example, as an option, the receive datapath shown in FIG. 27-6 may be implemented in the context of FIG. 27-5. In this case, the receive datapath of FIG. 27-6 may form part of the stacked memory package architecture shown in FIG. 27-5, for example.

For example, as an option, the receive datapath shown in FIG. 27-6 may be implemented in the context of FIG. 27-4. In this case, the receive datapath of FIG. 27-6 may form part of the stacked memory package architecture shown in FIG. 27-4. For example, one or more of the circuit blocks, logic functions, etc. of FIG. 27-6 may correspond (e.g. be similar, be the same, perform similar functions, etc.) as the corresponding (e.g. with same position in the datapath, with the same label, etc.) circuit blocks and/or logic functions in FIG. 27-4. Thus FIG. 27-6 may provide more details of the implementation of an example architecture of part(s) of the architecture of FIG. 27-4, for example In FIG. 27-6, the receive datapath may include one or more copies of input logic 27-610 (label A). The input logic may include input pads and near-pad logic, for example. In FIG. 27-6, four copies of the input logic 27-610 are shown, but any number may be used. The input logic 27-610 may convert one or more high-speed serial links to one or more internal data buses. For example, each copy of input logic 27-610 may receive packets, data, etc. on 2, 4, 8, 16 or any number of input lanes that may be part of one or more high-speed serial links.

In FIG. 27-6, the receive datapath may include one or more copies of PHY and/or data link layer logic 27-612 (label B). In FIG. 27-6, four copies of PHY and/or data link layer logic 27-412 may be shown, but any number may be used.

In FIG. 27-6, the receive datapath may include one or more copies of crossbar logic 27-642 (label Q). One or more copies of crossbar logic 27-642 may form part(s) of a switching network, crossbar, or other equivalent function. For example, the switching network may be equivalent to the RxTxXBAR crossbar and/or other similar functions that may be shown in FIG. 27-4, and/or other previous Figure(s) and/or subsequent Figure(s) herein and/or Figure(s) in specifications incorporated by reference and described in the accompanying text.

In FIG. 27-6, the receive datapath may include one or more copies of bus 27-652. The bus 27-652 may couple input logic 27-610 to other PHY and/or data link layer logic 27-612. The bus 27-652 may be 16, 32, 64, 128, 256, 512 or any number of bits wide (and may also include error coding, parity, bus inversion signals, other signal integrity coding, combinations of these, for example).

In FIG. 27-6, the receive datapath may include one or more copies of bus 27-614. The bus 27-614 may be part of the Rx datapath, for example. The bus 27-614 may be part of a short-cut, cut through, short circuit etc. that may allow packets, etc. to be forwarded from the input logic 27-610 to the outputs. The bus 27-614 may or may not use the same format, technology, width, frequency, etc. as bus 27-652 (though the bus 27-614 is shown branching from bus 27-652 for simplicity of representation in FIG. 27-6). For example, bus 27-614 may convey raw packet information from input circuits to output circuits (e.g. to reduce the latency of packet forwarding, etc.). For example, input logic 27-610 may generate different bus representations for bus 27-614 and bus 27-652.

In FIG. 27-6, the receive datapath may include one or more copies of bus 27-648. For example, in FIG. 27-6, four copies of bus 27-648 are shown for each copy of crossbar logic 27-642, but any number may be used (e.g. different numbers of bus 27-648 may be used for each copy of crossbar logic 27-642, etc.). In one embodiment, the bus 27-648 may be considered part of the Tx datapath, for example, and may use the clocking, bus width, etc. used by bus 27-650. In this case, crossbar logic 27-642 may perform one or more bus conversion functions, for example. In one embodiment, the bus 27-648 may be considered part of the Rx datapath, for example, and may use the clocking, bus width, etc. used by bus 27-614. In this case, part(s) of output logic 27-644 may perform one or more bus conversion functions, for example. In one embodiment, the bus 27-648 may or may not use the same format, technology, width, frequency, etc. as bus 27-614. For example, one or more circuits or logic functions in the crossbar logic 27-642 may convert packets, packet formats, packet contents, data representation(s) (e.g. bus type, bus coding, bus width, bus frequency, timing, symbols, etc.) that may be present on bus 27-614 to a different bus representation for bus 27-648.

In FIG. 27-6, the receive datapath may include one or more copies of bus 27-650. In one embodiment, one or more circuits or logic functions in the Tx datapath logic 27-640 may convert packets, packet formats, packet contents, data representation(s) (e.g. bus type, bus coding, bus width, bus frequency, timing, symbols, etc.) to the bus representation used by bus 27-650.

In FIG. 27-6, the receive datapath may include one or more copies of bus 27-646. In one embodiment, bus 27-646 may include one or more copies of bus 27-448. For example, in FIG. 27-6, bus 27-646 may represent the collection (e.g. bundle, set, group, etc.) of outputs (e.g. buses, signals, wires, etc.) from crossbar logic 27-642.

In FIG. 27-6, the receive datapath may include one or more copies of Tx datapath logic 27-640 (label P). In one embodiment, the Tx datapath logic 27-640 may include part of the PHY layer functions and/or part (or all) of the data link layer functions of the Tx datapath. In one embodiment, the Tx datapath logic 27-640 may include part of the TxXBAR functions and/or RxXBAR functions and/or RxXBAR_1 functions and/or other similar functions that may be shown in FIG. 27-4 and/or other previous Figure(s) and/or subsequent Figure(s) herein and/or Figure(s) in specifications incorporated by reference and described in the accompanying text.

In FIG. 27-6, the receive datapath may include one or more copies of output logic 27-644 (label R). One or more copies of output logic 27-644 and/or parts of Tx datapath logic 27-640 and/or crossbar logic 27-642 may form part(s) of a switching network, crossbar, or other equivalent function. For example, the switching network may be equivalent to the RxTxXBAR crossbar functions shown in FIG. 27-4 and/or other Figure(s) herein and/or Figure(s) in specifications incorporated by reference and accompanying text. For example, the combination of the functions of output logic 27-644 and/or parts of Tx datapath logic 27-640 and/or crossbar logic 27-642 may allow the output of one or more memory portions (e.g. response(s), completion(s), etc.) to be coupled to any output link. In one embodiment, the part(s) of the output logic 27-644 and/or parts of Tx datapath logic 27-640 and/or crossbar logic 27-642 may include part of the RxTxXBAR functions that may be shown in previous and/or subsequent Figure(s) herein and/or Figure(s) in specifications incorporated by reference and described in the accompanying text. For example, part(s) of the output logic 27-644 may include one or more MUX functions that may take as inputs (e.g. inputs may be coupled to, be connected to, etc.) one or more copies of the bus 27-646 and/or one or more copies of the bus 27-650. For example, the output logic 27-644 may include a 2:1 MUX function that may take as inputs one copy of bus 27-646 and one copy of bus 27-650.

In FIG. 27-6, the receive datapath may include one or more copies of de-MUX 27-660. In one embodiment, de-MUX 27-660 may be part of the crossbar logic 27-642. In one embodiment, the de-MUX circuit may take one input and connect (e.g. selectively couple, switch, etc.) the input (e.g. bus, signal, group of signals, etc.) to one of four outputs (e.g. de-MUX width is four). Thus, for example the function of the de-MUX circuit may be a 1:4 de-MUX, and the width of the de-MUX function may be four, etc. Any width of de-MUX may be used. In one embodiment the width of the de-MUX may be the same as the number of output links. In one embodiment the width of the de-MUX may different from the number of output links. In one embodiment, the number of copies of de-MUX 27-660 (e.g. included in one copy of crossbar logic 27-642, etc.) may correspond to the width (e.g. number of signals, number of wires, number of demultiplexed signals, etc.) of bus 27-614.

In FIG. 27-6, the receive datapath may include one or more copies of switch circuit 27-662. In one embodiment, switch circuit 27-662 may be part of de-MUX 27-660. In one embodiment, switch circuit 27-662 may include one or more MOS transistors, but any switches (e.g. pass gates, CMOS devices, buffers, combinations of these and/or other switching functions, etc.) may be used. In one embodiment, the control signals of switch circuit 27-662 (e.g. signals labeled 1, 2, 3, 4 in FIG. 27-6) may be driven by information contained in one or more input packets (e.g. address field(s), tags, routing bits, flags, combinations of these and/or other data, information, fields, tables, pointers, etc.). For example, data may be extracted from field(s) in one or more input packets and compared to information in a FIB and/or other table(s) stored in one or more logic chips. Such an implementation may use the context of the FIB and crossbar functions shown in the architecture of FIG. 27-5 and/or using similar architectures that may be shown in other previous Figure(s) and/or subsequent Figure(s) herein and/or Figure(s) in specifications incorporated by reference and described in the accompanying text. For example, in one embodiment, input X to switch circuit 27-662 may be one signal (e.g. one wire, one connection, one logical connection, one demultiplexed signal, etc.) from bus 27-614. For example, in one embodiment, output A from switch circuit 27-662 may be (e.g. correspond to, be coupled to, etc.) one signal (e.g. one wire, one connection, one logical connection, one demultiplexed signal, etc.) of a first copy of bus 27-648; output B may correspond to a signal on a second copy of bus 27-648; output C may correspond to a signal on a third copy of bus 27-648; output D may correspond to a signal on a fourth copy of bus 27-648; etc. Thus, for example, a stacked memory package may include four input links and four output links (as shown for example in FIG. 27-6). In this case, for example, each signal on bus 27-614 may require (e.g. use, employ, etc.) one copy of a 1:4 de-MUX; thus four copies of bus 27-614 (one for each input link) may require four copies of a 1:4 de-MUX; thus 16 switches (e.g. transistors, pass gates, etc.) may be required to form a 4×4 crossbar function that may connect one signal (e.g. one bit position, etc.) from the set of input links to the set of output links. If the width of each bus 27-614 is B bits then, for example, 16B switches may be required (if differential signals are switched, two signals per bit, a factor of two must also be accounted for).

FIG. 27-7

FIG. 27-7 shows a receive datapath 27-700, in accordance with one embodiment. As an option, the receive datapath may be implemented in the context of the previous Figure(s) and/or any subsequent Figure(s). Of course, however, the receive datapath may be implemented in the context of any desired environment.

For example, as an option, the receive datapath shown in FIG. 27-7 may form part of a short-cut path, short-circuit path, cut-through path, etc. For example, the receive datapath may allow one or more packets and/or information contained in one or more packets to be forwarded from one or more inputs to one or more outputs.

For example, as an option, the receive datapath shown in FIG. 27-7 may be implemented in the context of FIG. 27-5. In this case, the receive datapath of FIG. 27-7 may form part of the stacked memory package architecture shown in FIG. 27-5, for example.

For example, as an option, the receive datapath shown in FIG. 27-7 may be implemented in the context of FIG. 27-4. In this case, the receive datapath of FIG. 27-7 may form part of the stacked memory package architecture shown in FIG. 27-4. For example, one or more of the circuit blocks, logic functions, etc. of FIG. 27-7 may correspond (e.g. be similar, be the same, perform similar functions, etc.) as the corresponding (e.g. with same position in the datapath, with the same label, etc.) circuit blocks and/or logic functions in FIG. 27-4. Thus FIG. 27-7 may provide more details of the implementation of an example architecture of part(s) of the architecture of FIG. 27-4, for example In FIG. 27-7, the receive datapath may include one or more copies of input logic 27-710 (label A). The input logic may include input pads and near-pad logic, for example. In FIG. 27-7, four copies of the input logic 27-610 are shown, but any number may be used. The input logic 27-710 may convert one or more high-speed serial links to one or more internal data buses. For example, each copy of input logic 27-710 may receive packets, data, etc. on 2, 4, 8, 16 or any number of input lanes that may be part of one or more high-speed serial links.

In FIG. 27-7, the receive datapath may include one or more copies of PHY and/or data link layer logic 27-712 (label B). In FIG. 27-7, four copies of PHY and/or data link layer logic 27-712 may be shown, but any number may be used.

In FIG. 27-7, the receive datapath may include one or more copies of crossbar logic 187 (label Q). One or more copies of crossbar logic 27-742 may form part(s) of a switching network, crossbar, or other equivalent function. For example, the switching network may be equivalent to the RxTxXBAR crossbar and/or other similar functions that may be shown in FIG. 27-4, and/or other previous Figure(s) and/or subsequent Figure(s) herein and/or Figure(s) in specifications incorporated by reference and described in the accompanying text.

In FIG. 27-7, the receive datapath may include one or more copies of bus 27-752. The bus 27-752 may couple input logic 27-710 to other PHY and/or data link layer logic 27-712. The bus 27-752 may be 16, 32, 64, 128, 256, 512 or any number of bits wide (and may also include error coding, parity, bus inversion signals, other signal integrity coding, combinations of these, for example).

In FIG. 27-7, the receive datapath may include one or more copies of bus 27-714. The bus 27-714 may be part of the Rx datapath, for example. The bus 27-714 may be part of a short-cut, cut through, short circuit etc. that may allow packets, etc. to be forwarded from the input logic 27-710 to the outputs. For example, in FIG. 27-7, four copies of bus 27-714 are shown for each copy of crossbar logic 27-742, but any number may be used (e.g. different numbers of bus 27-714 may be used for each copy of crossbar logic 27-742, etc.). The bus 27-714 may or may not use the same format, technology, width, frequency, etc. as bus 27-752 (though the bus 27-714 is shown branching from bus 27-752 for simplicity of representation in FIG. 27-7). For example, bus 27-714 may convey raw packet information from input circuits to output circuits (e.g. to reduce the latency of packet forwarding, etc.). For example, input logic 27-710 may generate different bus representations for bus 27-714 and bus 27-752.

In FIG. 27-7, the receive datapath may include one or more copies of bus 27-748. In one embodiment, the bus 27-748 may be considered part of the Tx datapath, for example, and may use the clocking, bus width, etc. used by bus 27-750. In this case, crossbar logic 27-742 may perform one or more bus conversion functions, for example. In one embodiment, the bus 27-748 may be considered part of the Rx datapath, for example, and may use the clocking, bus width, etc. used by bus 27-714. In this case, part(s) of output logic 27-744 may perform one or more bus conversion functions, for example. In one embodiment, the bus 27-748 may or may not use the same format, technology, width, frequency, etc. as bus 27-714, For example, one or more circuits or logic functions in the crossbar logic 27-742 may convert packets, packet formats, packet contents, data representation(s) (e.g. bus type, bus coding, bus width, bus frequency, timing, symbols, etc.) that may be present on bus 27-714 to a different bus representation for bus 27-748.

In FIG. 27-7, the receive datapath may include one or more copies of bus 27-750. In one embodiment, one or more circuits or logic functions in the Tx datapath logic 27-740 may convert packets, packet formats, packet contents, data representation(s) (e.g. bus type, bus coding, bus width, bus frequency, timing, symbols, etc.) to the bus representation used by bus 27-750.

In FIG. 27-7, the receive datapath may include one or more copies of bus 27-746. In one embodiment, bus 27-746 may include one or more copies of bus 27-748. For example, in FIG. 27-7, bus 27-746 may be a copy of bus 27-748.

In FIG. 27-7, the receive datapath may include one or more copies of Tx datapath logic 27-740 (label P). In one embodiment, the Tx datapath logic 27-740 may include part of the PHY layer functions and/or part (or all) of the data link layer functions of the Tx datapath. In one embodiment, the Tx datapath logic 27-740 may include part of the TxXBAR functions and/or RxXBAR functions and/or RxXBAR_1 functions and/or other similar functions that may be shown in FIG. 27-4 and/or other previous Figure(s) and/or subsequent Figure(s) herein and/or Figure(s) in specifications incorporated by reference and described in the accompanying text.

In FIG. 27-7, the receive datapath may include one or more copies of output logic 27-744 (label R). One or more copies of output logic 27-744 and/or parts of Tx datapath logic 27-740 and/or crossbar logic 27-742 may form part(s) of a switching network, crossbar, or other equivalent function. For example, the switching network may be equivalent to the RxTxXBAR crossbar functions shown in FIG. 27-4 and/or other Figure(s) herein and/or Figure(s) in specifications incorporated by reference and accompanying text. For example, the combination of the functions of output logic 27-744 and/or parts of Tx datapath logic 27-740 and/or crossbar logic 27-742 may allow the output of one or more memory portions (e.g. response(s), completion(s), etc.) to be coupled to any output link. In one embodiment, the part(s) of the output logic 27-744 and/or parts of Tx datapath logic 27-740 and/or crossbar logic 27-742 may include part of the RxTxXBAR functions that may be shown in previous and/or subsequent Figure(s) herein and/or Figure(s) in specifications incorporated by reference and described in the accompanying text. For example, part(s) of the output logic 27-744 may include one or more MUX functions that may take as inputs (e.g. inputs may be coupled to, be connected to, etc.) one or more copies of the bus 27-746 and/or one or more copies of the bus 27-750. For example, the output logic 27-744 may include a 2:1 MUX function that may take as inputs one copy of bus 27-746 and one copy of bus 27-750.

In FIG. 27-7, the receive datapath may include one or more copies of MUX 27-760. In one embodiment, MUX 27-760 may be part of the crossbar logic 27-742. In one embodiment, the MUX circuit may take four inputs and connect (e.g. selectively couple, switch, etc.) one input (e.g. bus, signal, group of signals, etc.) to the output (e.g. MUX width is four). Thus, for example the function of the MUX circuit may be a 4:1 MUX, and the width of the MUX function may be four, etc. Any width of MUX may be used. In one embodiment, the width of the MUX may be the same as the number of input links. In one embodiment, the width of the MUX may different from the number of input links. In one embodiment, the number of copies of MUX 27-760 (e.g. included in one copy of crossbar logic 27-742, etc.) may correspond to the number of output links.

In FIG. 27-7, the receive datapath may include one or more copies of switch circuit 27-762. In one embodiment, of switch circuit 27-762 may be part of MUX 27-760. In one embodiment switch circuit 27-762 may be formed from one or more MOS transistors, but any switches (e.g. pass gates, CMOS devices, buffers, combinations of these and/or other switching functions, etc.) may be used. In one embodiment, the control signals of switch circuit 27-762 (e.g. signals labeled 1, 2, 3, 4 in FIG. 27-6) may be driven by information contained in one or more input packets (e.g. address field(s), tags, routing bits, flags, combinations of these and/or other data, information, fields, tables, pointers, etc.). For example, data may be extracted from field(s) in one or more input packets and compared to information in a FIB and/or other table(s) stored in one or more logic chips. Such an implementation may use the context of the FIB and crossbar functions shown in the architecture of FIG. 27-5 and/or using similar architectures that may be shown in other previous Figure(s) and/or subsequent Figure(s) herein and/or Figure(s) in specifications incorporated by reference and described in the accompanying text. For example, in one embodiment, input A to switch circuit 27-762 may be one signal (e.g. one wire, one connection, one logical connection, one demultiplexed signal, etc.) from a first copy of bus 27-714; input B may correspond to a signal on a second copy of bus 27-714; input C may correspond to a signal on a third copy of bus 27-6714; input D may correspond to a signal on a fourth copy of bus 27-714; etc.

For example, in one embodiment, output X from switch circuit 27-762 may be (e.g. correspond to, be coupled to, etc.) one signal (e.g. one wire, one connection, one logical connection, one demultiplexed signal, etc.) of a first copy of bus 27-748. Thus, for example, a stacked memory package may include four input links and four output links (as shown for example in FIG. 27-7). In this case, for example, each signal on bus 27-714 may require (e.g. use, employ, etc.) one copy of a 4:1 MUX; thus four sets of four copies of bus 27-614 (four for each of four input links) may require four copies of a 4:1 MUX; thus 16 switches (e.g. transistors, pass gates, etc.) may be required to form a 4×4 crossbar function that may connect one signal (e.g. one bit position, etc.) from the set of input links to the set of output links. If the width of each bus 27-714 is B bits, for example, 16B switches may be required (if differential signals are switched, two signals per bit, a factor of two must also be accounted for).

FIG. 27-8

FIG. 27-8 shows a receive datapath 27-800, in accordance with one embodiment. As an option, the receive datapath may be implemented in the context of the previous Figure(s) and/or any subsequent Figure(s). Of course, however, the receive datapath may be implemented in the context of any desired environment.

For example, as an option, the receive datapath shown in FIG. 27-8 may form part of a crossbar, switch, etc. For example, the receive datapath may allow one or more packets and/or information contained in one or more packets to be forwarded from one or more input links to one or more memory controllers.

For example, as an option, the receive datapath shown in FIG. 27-8 may be implemented in the context of FIG. 27-5. In this case, the receive datapath of FIG. 27-8 may form part of the stacked memory package architecture shown in FIG. 27-5, for example.

For example, as an option, the receive datapath shown in FIG. 27-8 may be implemented in the context of FIG. 27-4. In this case, the receive datapath of FIG. 27-8 may form part of the stacked memory package architecture shown in FIG. 27-4. For example, one or more of the circuit blocks, logic functions, etc. of FIG. 27-8 may correspond (e.g. be similar, be the same, perform similar functions, etc.) as the corresponding (e.g. with same position in the datapath, with the same label, etc.) circuit blocks and/or logic functions in FIG. 27-4. Thus, FIG. 27-8 may provide more details of the implementation of an example architecture of part(s) of the architecture of FIG. 27-4, for example.

In FIG. 27-8, the receive datapath may include other PHY and/or data link layer logic 27-812 (labeled B). In FIG. 27-8, four copies of PHY and/or data link layer logic 27-812 may be shown, but any number may be used.

In FIG. 27-8, the receive datapath may include one or more copies of crossbar logic 27-816 (labeled C). One or more copies of crossbar logic 27-816 may form part(s) of a switching network, crossbar, or other equivalent function. For example, the switching network may be equivalent to the RxXBAR crossbar and/or RxXBAR_0 crossbar and/or other similar functions that may be shown in previous and/or subsequent Figure(s) herein and/or Figure(s) in specifications incorporated by reference and described in the accompanying text.

In FIG. 27-8, the receive datapath may include one or more copies of crossbar logic 27-822 (labeled D). One or more copies of crossbar logic 27-816 and/or crossbar logic 27-822 may form part(s) of a switching network, crossbar, or other equivalent function. For example, the switching network may be equivalent to the RxXBAR crossbar and/or RxXBAR_0 crossbar functions shown in other Figure(s) herein and/or Figure(s) in specifications incorporated by reference and accompanying text. For example, the combination of the functions of crossbar logic 27-816 and/or crossbar logic 27-822 may allow any input link to be coupled to any memory controller. In one embodiment, the crossbar logic 27-822 may include part of the RxXBAR functions and/or RxXBAR_0 functions and/or similar functions that may be shown in previous and/or subsequent Figure(s) herein and/or Figure(s) in specifications incorporated by reference and described in the accompanying text.

In one embodiment, the crossbar logic 27-822 may include part of the Rx datapath (e.g. may include one or more circuits, logic functions, etc. of the Rx datapath, etc.).

In FIG. 27-8, the receive datapath may include one or more copies of bus 27-820. In FIG. 27-8, four copies of bus 27-820 may be shown as coupled to a single copy of crossbar logic 27-816, but any number may be used. In one embodiment, crossbar logic 27-816 may generate the bus representation used by bus 27-820. The exact nature (e.g. width, number of copies, etc.) of bus 27-820 may differ (and may differ from the representation shown or implied in FIG. 27-8) depending on the circuit implementation of the crossbar function(s), for example. Examples of such circuit implementations (e.g. crossbar circuits, switching networks, etc.) may be shown in other Figure(s) herein and/or Figure(s) in specifications incorporated by reference and accompanying text.

In FIG. 27-8, the receive datapath may include one or more copies of bus 27-832. In one embodiment, bus 27-832 may simply be one or more copies of bus 27-820. The exact nature (e.g. width, number of copies, etc.) of bus 27-832 may differ (and may differ from the representation shown or implied in FIG. 27-8) depending on the circuit implementation of the crossbar function(s), for example. Examples of such circuit implementations may be shown in other Figure(s) herein and/or Figure(s) in specifications incorporated by reference and accompanying text.

In one embodiment, as shown for example in FIG. 27-8, bus 27-832 may represent the collection (e.g. bundle, set, group, etc.) of outputs (e.g. buses, signals, wires, etc.) from crossbar logic 27-816.

In FIG. 27-8, the receive datapath may include one or more copies of de-MUX 27-860. In one embodiment, de-MUX 27-860 may be part of the crossbar logic 27-816. In one embodiment, the de-MUX circuit may take one input and connect (e.g. selectively couple, switch, etc.) the input (e.g. bus, signal, group of signals, etc.) to one of four outputs (e.g. de-MUX width is four). Thus, for example the function of the de-MUX circuit may be a 1:4 de-MUX, and the width of the de-MUX function may be four, etc. Any width of de-MUX may be used. In one embodiment, the width of the de-MUX may be the same as the number of memory controllers. In one embodiment, the width of the de-MUX may different from the number of memory controllers.

In FIG. 27-8, the receive datapath may include one or more copies of switch circuit 27-862. In one embodiment, switch circuit 27-862 may be part of de-MUX 27-860. In one embodiment, switch circuit 27-862 may include one or more MOS transistors, but any switches (e.g. pass gates, CMOS devices, buffers, combinations of these and/or other switching functions, etc.) may be used. In one embodiment, the control signals of switch circuit 27-862 may be driven by information contained in one or more input packets (e.g. address field(s), tags, routing bits, flags, combinations of these and/or other data, information, fields, tables, pointers, etc.). In one embodiment, switch circuit 27-862 and/or de-MUX 27-860 may be implemented in the context of FIG. 27-6, for example.

In one embodiment, data may be extracted from field(s) in one or more input packets and compared to information in table(s) stored in one or more logic chips. In one embodiment, a stacked memory package may include four input links and four memory controllers (corresponding to the architecture shown, for example, in FIG. 27-8). In this case, for example, four copies of a 1:4 de-MUX and thus 16 switches (e.g. transistors, pass gates, etc.) may be required to form a 4×4 crossbar function that may connect one signal (e.g. one bit position, etc.) from the set of input links to the set of memory controllers. If the width of each bus 27-820 is B bits then, for example, 16B switches may be required (if differential signals are switched, two signals per bit, a factor of two must also be accounted for).

FIG. 27-9

FIG. 27-9 shows a receive datapath 27-900, in accordance with one embodiment. As an option, the receive datapath may be implemented in the context of the previous Figure(s) and/or any subsequent Figure(s). Of course, however, the receive datapath may be implemented in the context of any desired environment.

For example, as an option, the receive datapath shown in FIG. 27-9 may form part of a crossbar, switch, etc. For example, the receive datapath may allow one or more packets and/or information contained in one or more packets to be forwarded from one or more input links to one or more memory controllers.

For example, as an option, the receive datapath shown in FIG. 27-9 may be implemented in the context of FIG. 27-5. In this case, the receive datapath of FIG. 27-9 may form part of the stacked memory package architecture shown in FIG. 27-5, for example.

For example, as an option, the receive datapath shown in FIG. 27-9 may be implemented in the context of FIG. 27-4. In this case, the receive datapath of FIG. 27-9 may form part of the stacked memory package architecture shown in FIG. 27-4. For example, one or more of the circuit blocks, logic functions, etc. of FIG. 27-9 may correspond (e.g. be similar, be the same, perform similar functions, etc.) as the corresponding (e.g. with same position in the datapath, with the same label, etc.) circuit blocks and/or logic functions in FIG. 27-4. Thus, FIG. 27-9 may provide more details of the implementation of an example architecture of part(s) of the architecture of FIG. 27-4, for example In FIG. 27-9, the receive datapath may include other PHY and/or data link layer logic 27-912 (labeled B). In FIG. 27-9, four copies of PHY and/or data link layer logic 27-812 may be shown, but any number may be used.

In FIG. 27-9, the receive datapath may include one or more copies of crossbar logic 27-916 (labeled C). One or more copies of crossbar logic 27-916 may form part(s) of a switching network, crossbar, or other equivalent function. For example, the switching network may be equivalent to the RxXBAR crossbar and/or RxXBAR_0 crossbar and/or other similar functions that may be shown in previous and/or subsequent Figure(s) herein and/or Figure(s) in specifications incorporated by reference and described in the accompanying text.

In FIG. 27-9, the receive datapath may include one or more copies of crossbar logic 27-922 (labeled D). One or more copies of crossbar logic 27-916 and/or crossbar logic 27-922 may form part(s) of a switching network, crossbar, or other equivalent function. For example, the switching network may be equivalent to the RxXBAR crossbar and/or RxXBAR_0 crossbar functions shown in other Figure(s) herein and/or Figure(s) in specifications incorporated by reference and accompanying text. For example, the combination of the functions of crossbar logic 27-916 and/or crossbar logic 27-922 may allow any input link to be coupled to any memory controller. In one embodiment, the crossbar logic 27-922 may include part of the RxXBAR functions and/or RxXBAR_0 functions and/or similar functions that may be shown in previous and/or subsequent Figure(s) herein and/or Figure(s) in specifications incorporated by reference and described in the accompanying text.

In one embodiment, the crossbar logic 27-922 may include part of the Rx datapath (e.g. may include one or more circuits, logic functions, etc. of the Rx datapath, etc.).

In FIG. 27-9, the receive datapath may include one or more copies of bus 27-920. In FIG. 27-9, four copies of bus 27-920 may be shown as coupled to a single copy of crossbar logic 27-916, but any number may be used. In one embodiment, PHY and/or data link layer logic 27-912 may generate the bus representation used by bus 27-920. The exact nature (e.g. width, number of copies, etc.) of bus 27-920 may differ (and may differ from the representation shown or implied in FIG. 27-9) depending on the circuit implementation of the crossbar function(s), for example. Examples of such circuit implementations (e.g. crossbar circuits, switching networks, etc.) may be shown in other Figure(s) herein and/or Figure(s) in specifications incorporated by reference and accompanying text.

In FIG. 27-9, the receive datapath may include one or more copies of bus 27-932. In one embodiment, bus 27-932 may simply be one or more copies of bus 27-920. In one embodiment, crossbar logic 27-916 may generate the bus representation used by bus 27-932. The exact nature (e.g. width, number of copies, etc.) of bus 27-932 may differ (and may differ from the representation shown or implied in FIG. 27-9) depending on the circuit implementation of the crossbar function(s), for example. Examples of such circuit implementations may be shown in other Figure(s) herein and/or Figure(s) in specifications incorporated by reference and accompanying text.

In FIG. 27-9, the receive datapath may include one or more copies of MUX 27-960. In one embodiment, MUX 27-960 may be part of the crossbar logic 27-916. In one embodiment, the MUX circuit may take four inputs and connect (e.g. selectively couple, switch, etc.) one input (e.g. bus, signal, group of signals, etc.) to the output (e.g. MUX width is four). Thus, for example the function of the MUX circuit may be a 4:1 MUX, and the width of the MUX function may be four, etc. Any width of MUX may be used. In one embodiment the width of the MUX may be the same as the number of input links. In one embodiment the width of the de-MUX may different from the number of input links.

In FIG. 27-9, the receive datapath may include one or more copies of switch circuit 27-962. In one embodiment, switch circuit 27-962 may be part of MUX 27-960. In one embodiment, switch circuit 27-962 may include one or more MOS transistors, but any switches (e.g. pass gates, CMOS devices, buffers, combinations of these and/or other switching functions, etc.) may be used. In one embodiment, the control signals of switch circuit 27-962 may be driven by information contained in one or more input packets (e.g. address field(s), tags, routing bits, flags, combinations of these and/or other data, information, fields, tables, pointers, etc.). For example, switch circuit 27-962 and/or MUX 27-960 may be implemented in the context of FIG. 27-7, for example.

In one embodiment, data may be extracted from field(s) in one or more input packets and compared to information in table(s) stored in one or more logic chips. In one embodiment, a stacked memory package may include four input links and four memory controllers (corresponding to the architecture shown, for example, in FIG. 27-9). In this case, for example, four copies of a 4:1 MUX and thus 16 switches (e.g. transistors, pass gates, etc.) may be required to form a 4×4 crossbar function that may connect one signal (e.g. one bit position, etc.) from the set of input links to the set of memory controllers. If the width of each bus 27-920 is B bits then, for example, 16B switches may be required (if differential signals are switched, two signals per bit, a factor of two must also be accounted for).

FIG. 27-10

FIG. 27-10 shows a receive datapath 27-1000, in accordance with one embodiment. As an option, the receive datapath may be implemented in the context of the previous Figure(s) and/or any subsequent Figure(s). Of course, however, the receive datapath may be implemented in the context of any desired environment.

For example, as an option, the receive datapath shown in FIG. 27-10 may form part of a crossbar, switch, etc. For example, the receive datapath may allow one or more packets and/or information contained in one or more packets to be forwarded from one or more memory portions to one or more parts of a Tx datapath.

For example, as an option, the receive datapath shown in FIG. 27-10 may be implemented in the context of FIG. 27-5. In this case, the receive datapath of FIG. 27-10 may form part of the stacked memory package architecture shown in FIG. 27-5, for example.

For example, as an option, the receive datapath shown in FIG. 27-10 may be implemented in the context of FIG. 27-4. In this case, the receive datapath of FIG. 27-10 may form part of the stacked memory package architecture shown in FIG. 27-4. For example, one or more of the circuit blocks, logic functions, etc. of FIG. 27-10 may correspond (e.g. be similar, be the same, perform similar functions, etc.) as the corresponding (e.g. with same position in the datapath, with the same label, etc.) circuit blocks and/or logic functions in FIG. 27-4. Thus FIG. 27-10 may provide more details of the implementation of an example architecture of part(s) of the architecture of FIG. 27-4, for example.

In FIG. 27-10, the receive datapath may include one or more memory portions 27-1028 (label M). In FIG. 27-10, only a subset or representative number of memory portion 27-1028 may be shown, and in general any number may be used and any arrangement of memory portions may be used. For example, in FIG. 27-10, memory portions may be arranged such that there may be four memory portions on each stacked memory chip. In one embodiment, each stacked memory chip may be selected (e.g. using a chip select signal, CS, other signal(s), etc.) so that one memory controller may be coupled to one memory portion on each stacked memory chip (e.g. one-to-one correspondence, one-to-one structure, etc.). Examples of architectures that use a one-to-one structure and that do not use a one-to-one structure may be shown in other Figure(s) herein and/or Figure(s) in specifications incorporated by reference and accompanying text. The memory portions may be banks, bank groups, sections, echelons, groups of memory portions, combinations of these and/or any other grouping of memory, etc.

In FIG. 27-10, the receive datapath may include one or more copies of bus 27-1030. In one embodiment, bus 27-1030 may include one or more data buses (e.g. read data bus, etc.). In one embodiment, bus 27-1030 or part of bus 27-1030 may be a bi-directional data bus (e.g. read/write bus, etc.). In this case, part of bus 27-1030 may also be considered part of one or more other buses, etc. Thus, the representation of circuits, buses, and/or connectivity shown in FIG. 27-10, including bus 27-1030, should be interpreted with respect to (e.g. with consideration of, in the light of, etc.) the function(s) of the components and/or architecture etc. and may not necessarily represent the exact connections used, the manner that connections are made, the exact connectivity employed in all implementations, etc.

In FIG. 27-10, the receive datapath may include one or more copies of crossbar logic 27-1034 (labeled O). One or more copies of crossbar logic 27-1034 may form part(s) of a switching network, crossbar, or other equivalent function. For example, the switching network may be equivalent to the RxXBAR crossbar and/or RxXBAR_1 crossbar and/or TxXBAR crossbar and/or other similar functions that may be shown in previous and/or subsequent Figure(s) herein and/or Figure(s) in specifications incorporated by reference and described in the accompanying text.

In FIG. 27-10, the receive datapath may include one or more copies of bus 27-1036. The bus 27-1036 may be part of the Tx datapath, for example. The bus 27-1036 may or may not use the same format, technology, width, frequency, etc. as bus 27-1030, For example, one or more circuits or logic functions in the crossbar logic 27-1034 may convert the data representation(s) (e.g. bus type, bus coding, bus width, bus frequency, etc.) of bus 27-1030 to a different bus representation for bus 27-1036.

In FIG. 27-10, four copies of bus 27-1036 may be shown as coupled to a single copy of crossbar logic 27-1034, but any number may be used.

In one embodiment, bus 27-1036 may use one or more different representations than bus 27-1030, etc. The exact nature (e.g. width, number of copies, etc.) of bus 27-1036 may differ (and may differ from the representation shown or implied in FIG. 27-10) depending on the circuit implementation of the crossbar function(s), for example. Examples of such circuit implementations (e.g. crossbar circuits, switching networks, etc.) may be shown in other Figure(s) herein and/or Figure(s) in specifications incorporated by reference and accompanying text.

In one embodiment, bus 27-1036 may include one or more memory buses. For example, in one embodiment, bus 27-1036 may include one or more data buses (e.g. read data bus, etc.) and/or other memory-related information, data, control, etc. For example, in one embodiment, bus 27-1036 may include (e.g. use, employ, be connected via, be coupled to, etc.) one or more TSV arrays to connect the memory portions to one or more logic functions in the Tx datapath, etc.

In one embodiment, bus 27-1030 and/or 27-1036 may include one or more data buses (e.g. read data bus(es), etc.). For example, each bus 27-1030 and/or 27-1036 may contain 1, 2, 4 or any number of read data buses that are separate, multiplexed together, or combinations of these, etc. and/or other bus(es) and/or control signals (that may also be viewed as a bus, or part of one or more buses, etc.).

In one embodiment, bus 27-1030 or part of bus 27-1030 may be a bi-directional data bus (e.g. read/write bus, etc.). In this case, part of bus 27-1036 may also be considered part of bus 27-1030, etc. For example, bus 27-1036 may be the read part of the read/write bus 27-1030 (if bus 27-1030 is a bi-directional bus). Thus, the representation of circuits, buses, and/or connectivity shown in FIG. 27-10, including bus 27-1036, should be interpreted with respect to (e.g. with consideration of, in the light of, etc.) the function(s) of the components, circuits, buses, and/or architecture etc. and may not necessarily represent the exact connections used, the manner that connections are made, the exact connectivity employed in all implementations, etc.

In one embodiment, bus 27-1030 may include data (e.g. information in general as opposed to just read data or write data, etc.) held in packet format e.g. packets may contain one or more address field(s), data field(s) (e.g. read data), completion/response field(s), other data/flag/control/information/tag/ID field(s), etc. while bus 27-1036 may contain similar information demultiplexed (e.g. separated, split, etc.) into one or more buses and control signals, etc.

In one embodiment, bus 27-1030 may include data (e.g. information in general as opposed to just read data or write data, etc.) held in packet format e.g. packets may contain one or more address field(s), data field(s) (e.g. read data), completion/response field(s), other data/flag/control/information/tag/ID field(s), etc. and bus 27-1036 may contain similar packet-encoded information (possibly in a different format or formats), etc.

In one embodiment, circuit blocks and/or logic functions, which may be part of crossbar logic 27-1034 for example, may alter, modify, split, aggregate, insert data, insert information, in the data carried by bus 27-1030. For example, bus 27-1030 may carry data in packet format (e.g. a simple response packet, etc.), and logic may insert a tag, ID or other data fields to identify one or more responses (e.g. associate a response with a request, etc.) and/or perform other logic functions on the data contained on bus 27-1030, etc. For example, bus 27-1030 may carry data in one or more buses (e.g. one or more of: a read bus, a bi-directional read/write bus, a multiplexed bus, a shared bus, etc.), and logic may insert a tag, ID or other data fields to identify one or more responses (e.g. associate a response with a request, etc.) and/or perform other logic functions on the data contained on bus 27-1030, etc.

In one embodiment, bus 27-1030 may include data from more than one memory portion (e.g. data from more than one memory portion may be multiplexed onto one or more copies of bus 27-1030, etc.). In this case, logic (e.g. in crossbar logic 27-1034, etc.) may demultiplex data (e.g. split, separate, etc.) to one or more copies of bus 27-1036, for example.

In FIG. 27-10, the stacked memory package architecture may include one or more copies of bus 27-1038. In one embodiment, bus 27-1038 may simply be one or more copies of bus 27-1036. The exact nature (e.g. width, number of copies, etc.) of bus 27-1038 may differ (and may differ from the representation shown or implied in FIG. 27-10) depending on the circuit implementation of the crossbar function(s), for example. Examples of such circuit implementations may be shown in other Figure(s) herein and/or Figure(s) in specifications incorporated by reference and accompanying text.

In FIG. 27-10, the stacked memory package architecture may include one or more copies of Tx datapath logic 27-1040 (label P). In one embodiment, the Tx datapath logic 27-1040 may include part of the PHY layer functions and/or part (or all) of the data link layer functions of the Tx datapath. In one embodiment, the Tx datapath logic 27-1040 may include part of the TxXBAR functions and/or RxXBAR functions and/or RxXBAR_1 functions and/or other similar functions that may be shown in previous and/or subsequent Figure(s) herein and/or Figure(s) in specifications incorporated by reference and described in the accompanying text.

In FIG. 27-10, the receive datapath may include one or more copies of de-MUX 27-1060. In one embodiment, de-MUX 27-1060 may be part of the crossbar logic 27-1034. In one embodiment, the de-MUX circuit may take one input and connect (e.g. selectively couple, switch, etc.) the input (e.g. bus, signal, group of signals, etc.) to one of four outputs (e.g. de-MUX width is four). Thus, for example, the function of the de-MUX circuit may be a 1:4 de-MUX, and the width of the de-MUX function may be four, etc. Any width of de-MUX may be used. In one embodiment, the width of the de-MUX may be the same as the number of Tx datapaths. In one embodiment, the width of the de-MUX may different from the number of Tx datapaths.

In FIG. 27-10, the receive datapath may include one or more copies of switch circuit 27-1062. In one embodiment, switch circuit 27-1062 may be part of de-MUX 27-1060. In one embodiment, switch circuit 27-1062 may include one or more MOS transistors, but any switches (e.g. pass gates, CMOS devices, buffers, combinations of these and/or other switching functions, etc.) may be used. In one embodiment, the control signals of switch circuit 27-1062 may be driven by information contained in one or more input packets (e.g. address field(s), tags, routing bits, flags, combinations of these and/or other data, information, fields, tables, pointers, etc.) and/or priority, arbitration circuits, combinations of these and/or other Tx datapath circuits and/or Tx datapath logic functions, etc. In one embodiment, switch circuit 27-1062 and/or de-MUX 27-1060 may be implemented in the context of FIG. 27-6, for example.

In one embodiment, data may be extracted from field(s) in one or more input packets and compared to information in table(s) stored in one or more logic chips. In one embodiment, a stacked memory package may include four input links and four memory controllers (corresponding to the architecture shown, for example, in FIG. 27-10). In this case, for example, four copies of a 1:4 de-MUX and thus 16 switches (e.g. transistors, pass gates, etc.) may be required to form a 4×4 crossbar function that may connect one signal (e.g. one bit position, etc.) from the set of input links to the set of memory controllers. If the width of each bus 27-1030 is B bits then, for example, 16B switches may be required.

FIG. 27-11

FIG. 27-11 shows a transmit datapath 27-1100, in accordance with one embodiment. As an option, the receive datapath may be implemented in the context of the previous Figure(s) and/or any subsequent Figure(s). Of course, however, the receive datapath may be implemented in the context of any desired environment.

For example, as an option, the transmit datapath shown in FIG. 27-11 may form part of a crossbar, switch, etc. For example, the receive datapath may allow one or more packets and/or information contained in one or more packets to be forwarded from one or more memory portions to one or more parts of a Tx datapath.

For example, as an option, the transmit datapath shown in FIG. 27-11 may be implemented in the context of FIG. 27-5. In this case, the receive datapath of FIG. 27-11 may form part of the stacked memory package architecture shown in FIG. 27-5, for example.

For example, as an option, the transmit datapath shown in FIG. 27-11 may be implemented in the context of FIG. 27-4. In this case, the transmit datapath of FIG. 27-11 may form part of the stacked memory package architecture shown in FIG. 27-4. For example, one or more of the circuit blocks, logic functions, etc. of FIG. 27-11 may correspond (e.g. be similar, be the same, perform similar functions, etc.) as the corresponding (e.g. with same position in the datapath, with the same label, etc.) circuit blocks and/or logic functions in FIG. 27-4. Thus FIG. 27-11 may provide more details of the implementation of an example architecture of part(s) of the architecture of FIG. 27-4, for example.

In FIG. 27-11, the transmit datapath may include one or more memory portions 27-1128 (label M). In FIG. 27-11, only a subset or representative number of memory portion 27-1128 may be shown, and in general any number may be used and any arrangement of memory portions may be used. For example, in FIG. 27-11, memory portions may be arranged such that there may be four memory portions on each stacked memory chip. In one embodiment, each stacked memory chip may be selected (e.g. using a chip select signal, CS, other signal(s), etc.) so that one memory controller may be coupled to one memory portion on each stacked memory chip (e.g. one-to-one correspondence, one-to-one structure, etc.). Examples of architectures that use a one-to-one structure and that do not use a one-to-one structure may be shown in other Figure(s) herein and/or Figure(s) in specifications incorporated by reference and accompanying text. The memory portions may be banks, bank groups, sections, echelons, groups of memory portions, combinations of these and/or any other grouping of memory, etc.

In FIG. 27-11, the transmit datapath may include one or more copies of bus 27-1130. In one embodiment, bus 27-1130 may include one or more data buses (e.g. read data bus, etc.). In one embodiment, bus 27-1130 or part of bus 27-1130 may be a bi-directional data bus (e.g. read/write bus, etc.). In this case, part of bus 27-1130 may also be considered part of one or more other buses, etc. Thus, the representation of circuits, buses, and/or connectivity shown in FIG. 27-11, including bus 27-1130, should be interpreted with respect to (e.g. with consideration of, in the light of, etc.) the function(s) of the components and/or architecture etc. and may not necessarily represent the exact connections used, the manner that connections are made, the exact connectivity employed in all implementations, etc.

In FIG. 27-11, the transmit datapath may include one or more copies of crossbar logic 27-1134 (labeled O). One or more copies of crossbar logic 27-1134 may form part(s) of a switching network, crossbar, or other equivalent function. For example, the switching network may be equivalent to the RxXBAR crossbar and/or RxXBAR_1 crossbar and/or TxXBAR crossbar and/or other similar functions that may be shown in previous and/or subsequent Figure(s) herein and/or Figure(s) in specifications incorporated by reference and described in the accompanying text.

In FIG. 27-11, the transmit datapath may include one or more copies of bus 27-1136. The bus 27-1136 may be part of the Tx datapath, for example. The bus 27-1136 may or may not use the same format, technology, width, frequency, etc. as bus 27-1130, For example, one or more circuits or logic functions in the crossbar logic 27-1134 may convert the data representation(s) (e.g. bus type, bus coding, bus width, bus frequency, etc.) of bus 27-1130 to a different bus representation for bus 27-1136.

In FIG. 27-11, four copies of bus 27-1136 may be shown as coupled to a single copy of crossbar logic 27-1134, but any number may be used.

In one embodiment, bus 27-1136 may use one or more different representations than bus 27-130, etc. The exact nature (e.g. width, number of copies, etc.) of bus 27-1136 may differ (and may differ from the representation shown or implied in FIG. 27-11) depending on the circuit implementation of the crossbar function(s), for example. Examples of such circuit implementations (e.g. crossbar circuits, switching networks, etc.) may be shown in other Figure(s) herein and/or Figure(s) in specifications incorporated by reference and accompanying text.

In one embodiment, bus 27-1136 may include one or more memory buses. For example, in one embodiment, bus 27-1136 may include one or more data buses (e.g. read data bus, etc.) and/or other memory-related information, data, control, etc. For example, in one embodiment, bus 27-1136 may include (e.g. use, employ, be connected via, be coupled to, etc.) one or more TSV arrays to connect the memory portions to one or more logic functions in the Tx datapath, etc.

In one embodiment, bus 27-1130 and/or 27-1136 may include one or more data buses (e.g. read data bus(es), etc.). For example, each bus 27-1130 and/or 27-1136 may contain 1, 2, 4 or any number of read data buses that are separate, multiplexed together, or combinations of these, etc. and/or other bus(es) and/or control signals (that may also be viewed as a bus, or part of one or more buses, etc.).

In one embodiment bus 27-1130 or part of bus 27-1130 may be a bi-directional data bus (e.g. read/write bus, etc.). In this case, part of bus 27-1136 may also be considered part of bus 27-1130, etc. For example, bus 27-1036 may be the read part of the read/write bus 27-1030 (if bus 27-1130 is a bi-directional bus). Thus, the representation of circuits, buses, and/or connectivity shown in FIG. 27-11, including bus 27-1136, should be interpreted with respect to (e.g. with consideration of, in the light of, etc.) the function(s) of the components, circuits, buses, and/or architecture etc. and may not necessarily represent the exact connections used, the manner that connections are made, the exact connectivity employed in all implementations, etc.

In one embodiment, bus 27-1130 may include data (e.g. information in general as opposed to just read data or write data, etc.) held in packet format e.g. packets may contain one or more address field(s), data field(s) (e.g. read data), completion/response field(s), other data/flag/control/information/tag/ID field(s), etc. while bus 27-1136 may contain similar information demultiplexed (e.g. separated, split, etc.) into one or more buses and control signals, etc.

In one embodiment, bus 27-1130 may include data (e.g. information in general as opposed to just read data or write data, etc.) held in packet format e.g. packets may contain one or more address field(s), data field(s) (e.g. read data), completion/response field(s), other data/flag/control/information/tag/ID field(s), etc. and bus 27-1136 may contain similar packet-encoded information (possibly in a different format or formats), etc.

In one embodiment, circuit blocks and/or logic functions, which may be part of crossbar logic 27-1134 for example, may alter, modify, split, aggregate, insert data, insert information, in the data carried by bus 27-1130. For example, bus 27-1130 may carry data in packet format (e.g. a simple response packet, etc.), and logic may insert a tag, ID or other data fields to identify one or more responses (e.g. associate a response with a request, etc.) and/or perform other logic functions on the data contained on bus 27-1130, etc. For example, bus 27-1130 may carry data in one or more buses (e.g. one or more of: a read bus, a bi-directional read/write bus, a multiplexed bus, a shared bus, etc.), and logic may insert a tag, ID or other data fields to identify one or more responses (e.g. associate a response with a request, etc.) and/or perform other logic functions on the data contained on bus 27-1130, etc.

In one embodiment, bus 27-1130 may include data from more than one memory portion (e.g. data from more than one memory portion may be multiplexed onto one or more copies of bus 27-1130, etc.). In this case, logic (e.g. in crossbar logic 27-1134, etc.) may demultiplex data (e.g. split, separate, etc.) to one or more copies of bus 27-1136, for example.

In FIG. 27-11, the transmit datapath may include one or more copies of bus 27-1138. In one embodiment, bus 27-1138 may simply be one or more copies of bus 27-1136. For example, in FIG. 27-11, bus 27-1138 may correspond to a copy of bus 27-1136. The exact nature (e.g. width, number of copies, etc.) of bus 27-1138 may differ (and may differ from the representation shown or implied in FIG. 27-11) depending on the circuit implementation of the crossbar function(s), for example. Examples of such circuit implementations may be shown in other Figure(s) herein and/or Figure(s) in specifications incorporated by reference and accompanying text.

In FIG. 27-11, the transmit datapath may include one or more copies of Tx datapath logic 27-1140 (label P). In one embodiment, the Tx datapath logic 27-1140 may include part of the PHY layer functions and/or part (or all) of the data link layer functions of the Tx datapath. In one embodiment, the Tx datapath logic 27-1140 may include part of the TxXBAR functions and/or RxXBAR functions and/or RxXBAR_1 functions and/or other similar functions that may be shown in previous and/or subsequent Figure(s) herein and/or Figure(s) in specifications incorporated by reference and described in the accompanying text.

In FIG. 27-11, the transmit datapath may include one or more copies of MUX 27-1160. In one embodiment, MUX 27-1160 may be part of the crossbar logic 27-1134. In one embodiment, the MUX circuit may take four inputs and connect (e.g. selectively couple, switch, etc.) one input (e.g. bus, signal, group of signals, etc.) to the output (e.g. MUX width is four). Thus, for example, the function of the MUX circuit may be a 4:1 MUX, and the width of the MUX function may be four, etc. Any width of MUX may be used. In one embodiment, the width of the MUX may be the same as the number of memory controllers and/or memory portions per stacked memory chip. In one embodiment, the width of the MUX may different from the number of number of memory controllers and/or different from the number of memory portions per stacked memory chip.

In FIG. 27-11, the transmit datapath may include one or more copies of switch circuit 27-1162. In one embodiment, switch circuit 27-1162 may be part of MUX 27-1160. In one embodiment, switch circuit 27-1162 may include one or more MOS transistors, but any switches (e.g. pass gates, CMOS devices, buffers, combinations of these and/or other switching functions, etc.) may be used. In one embodiment, the control signals of switch circuit 27-1162 may be driven by information contained in one or more input packets (e.g. address field(s), tags, routing bits, flags, combinations of these and/or other data, information, fields, tables, pointers, etc.) and/or priority, arbitration circuits, combinations of these and/or other Tx datapath circuits and/or Tx datapath logic functions, etc. In one embodiment, switch circuit 27-1162 and/or MUX 27-1160 may be implemented in the context of FIG. 27-6, for example.

In one embodiment, data may be extracted from field(s) in one or more input packets and compared to information in table(s) stored in one or more logic chips. In one embodiment, a stacked memory package may include four input links and four memory controllers (corresponding to the architecture shown, for example, in FIG. 27-11). In this case, for example, four copies of a 4:1 MUX and thus 16 switches (e.g. transistors, pass gates, etc.) may be required to form a 4×4 crossbar function that may connect one signal (e.g. one bit position, etc.) from the set of input links to the set of memory controllers. If the width of each bus 27-1130 is B bits then, for example, 16B switches may be required.

FIG. 27-12

FIG. 27-12 shows a memory chip interconnect network 27-1200, in accordance with one embodiment. As an option, the memory system network may be implemented in the context of the previous Figure(s) and/or any subsequent Figure(s). Of course, however, the stacked memory chip interconnect network may be implemented in the context of any desired environment.

For example, the memory chip interconnect network may be implemented in the context of FIG. 27-2. For example, the explanations, descriptions, etc. accompanying FIG. 27-2 including (but not limited to): interconnection, buses, multiplexing, demultiplexing, bus splitting, bus aggregation, bus joining, bus coupling, use of TSVs, and/or other methods, algorithms, functions, etc. may equally apply (e.g. may be employed, may be incorporated in whole or part, may be combined with, etc.) to the architecture of memory networks based, for example, on FIG. 27-12. Also, references to other Figures and/or other specifications incorporated by reference in the context of FIG. 27-2 may equally apply to the architecture of memory networks based, for example, on FIG. 27-12.

In FIG. 27-12, the memory chip interconnect network may include one or more copies of memory portions 27-1210 (e.g. 27-1212, 27-1214, 27-1216, 27-1218, 27-1220, 27-1222, 27-1224, 27-1226, etc.). In FIG. 27-12, there may be nine memory portions, but any number may be used.

In one embodiment, as shown in FIG. 27-12, a first group of buses such as 27-1234, 27-1230, 27-1240, 27-1236 etc. (there are 48 such buses of a first type, as shown in FIG. 27-12) may form part of a network on a single stacked memory chip.

In one embodiment, as shown in FIG. 27-12, buses such as 27-1232, 27-1238, etc. (there are 24 such buses of a second type, as shown in FIG. 27-12) may form a network or part of a network between two or more stacked memory chips and/or between one or more stacked memory chips and one or more logic chips.

In one embodiment, as shown in FIG. 27-12, a second group of buses such as 27-1250, 27-1252, 27-1254, 27-1256, 27-1268, 27-1260, 27-1262, 27-1264 etc. (there are 24+24=48 such buses, 24 of a first type and 24 of a second type, as shown in FIG. 27-12) may form part of a network on a single stacked memory chip. For example, in FIG. 27-12, the combination of the first group of buses and the second group of buses may create a network in which each memory portion is connected to eight buses. Thus nine memory portions may be connected to 9×8=72 buses of the first type. Each of these buses may be connected to a bus of the second type but 48 buses of the first type may share a bus of the second type.

FIG. 27-13

FIG. 27-13 shows a memory chip interconnect network 27-1300, in accordance with one embodiment. As an option, the memory system network may be implemented in the context of the previous Figure(s) and/or any subsequent Figure(s). Of course, however, the stacked memory chip interconnect network may be implemented in the context of any desired environment.

For example, the memory chip interconnect network may be implemented in the context of FIG. 27-2 and/or FIG. 27-12. For example, the explanations, descriptions, etc. accompanying FIG. 27-2 and/or FIG. 27-12 including (but not limited to): interconnection, buses, multiplexing, demultiplexing, bus splitting, bus aggregation, bus joining, bus coupling, use of TSVs, and/or other methods, algorithms, functions, combinations of these, etc. may equally apply (e.g. may be employed, may be incorporated in whole or in one or more parts, may be combined with, etc.) to the architecture of memory networks based, for example, on FIG. 27-13. Also, references to other Figures and/or other specifications incorporated by reference in the context of FIG. 27-2 may equally apply to the architecture of memory networks based, for example, on FIG. 27-13.

In FIG. 27-13, the memory chip interconnect network may include one or more copies of memory portions 27-1310 (e.g. 27-1312, 27-1314, 27-1316, 27-1318, 27-1320, 27-1322, 27-1324, 27-1326, etc.). In FIG. 27-13, there may be nine memory portions, but any number may be used.

In FIG. 27-13, the memory chip interconnect network may include one or more copies of buses 27-1330, 27-1332, 27-1334, 27-1336.

For example, bus 27-1330 may be a read bus. For example, bus 27-1332 may be a write bus. For example, bus 27-1334 may be an address bus. For example, bus 27-1336 may be a control bus (and/or collection of control signals, etc.).

In one embodiment, bus 27-1330 and 27-1332 may be combined, aggregated, multiplexed be a read/write data bus, a bi-directional read/write data bus, etc.

In one embodiment, the architectures, ideas, construction, networks, methods, embodiments, examples, etc. of FIG. 27-2 and/or FIG. 27-12 and/or FIG. 27-13 may be combined (in whole or in one or more parts, etc.). For example, a single input bus, as shown in FIG. 27-2 for example, may represent three input buses as shown in FIG. 27-13, for example. For example, the technique or method of adding extra buses to allow each memory portion to have the same number of buses (as shown in FIG. 27-12 for example) may be applied to FIG. 27-2 or any similar network. In fact, the ideas of FIG. 27-2 and/or FIG. 27-12 and/or FIG. 27-13 may be equally applied to any networks and/or architectures presented in the context of any previous Figure(s) and/or any subsequent Figure(s) and/or any Figure(s) in specifications incorporated by reference and accompanying text.

FIG. 27-14

FIG. 27-14 shows a memory chip interconnect network 27-1400, in accordance with one embodiment. As an option, the memory system network may be implemented in the context of the previous Figure(s) and/or any subsequent Figure(s). Of course, however, the stacked memory chip interconnect network may be implemented in the context of any desired environment.

For example, the memory chip interconnect network may be implemented in the context of FIG. 27-2 and/or FIG. 27-12 and/or FIG. 27-13. For example, the explanations, descriptions, etc. accompanying FIG. 27-2 and/or FIG. 27-12 and/or FIG. 27-13 including (but not limited to): interconnection, buses, multiplexing, demultiplexing, bus splitting, bus aggregation, bus joining, bus coupling, use of TSVs, and/or other methods, algorithms, functions, etc. may equally apply (e.g. may be employed, may be incorporated in whole or in one or more parts, may be combined with, etc.) to the architecture of memory networks based, for example, on FIG. 27-14. Also, references to other Figures and/or other specifications incorporated by reference in the context of FIG. 27-2 may equally apply to the architecture of memory networks based, for example, on FIG. 27-14.

In FIG. 27-14, the memory chip interconnect network may include one or more copies of memory portions 27-1410 (e.g. 27-1412, 27-1416, 27-1418, etc.). In FIG. 27-14, there may be four memory portions, but any number may be used. The memory portions may be located on the same memory chip and/or different memory chips, etc.

In FIG. 27-14, the memory chip interconnect network may include one or more copies of buses: 27-1430, 27-1432, 27-1434, 27-1436, 27-1440, 27-1442, 27-1444, 27-1446, 27-1448, 27-1450, 27-452.

In one embodiment, buses 27-1446, 27-1448, 27-1450 may be read buses. In one embodiment, bus 27-1446 may be joined (e.g. multiplexed, aggregated, etc.) from buses 27-1448, 27-1450.

In one embodiment, buses 27-1440, 27-1438, 27-1452 may be write buses. In one embodiment, buses 27-1438, 27-1452 may be split (e.g. demultiplexed, etc.) from bus 27-1440.

In one embodiment, buses 27-1436, 27-1434, 27-1444 may be address buses. In one embodiment, buses 27-1434, 27-1444 may be split (e.g. demultiplexed, etc.) from bus 27-1436.

In one embodiment, buses 27-1432, 27-1430, 27-1442 may be control buses (and/or collections of control signals, etc.). In one embodiment, buses 27-1430, 27-1442 may be split (e.g. demultiplexed, etc.) from bus 27-1432.

In one embodiment, buses 27-1446, 27-1448, 27-1450 and buses 27-1440, 27-1438, 27-1452 may be combined, aggregated, multiplexed be a read/write data bus, a bi-directional read/write data bus, etc. For example, all these buses may be bi-directional. For example, only buses 27-1446 and 27-1440 may be bi-directional with the others being unidirectional, etc. Other permutations and combinations of bi-directional and unidirectional buses are possible to allow optimization of bandwith, speed (bus frequency etc.), etc. with trade-offs that may include, for example: routing space, routing density, power, combinations of these, etc.

In one embodiment, the architectures, ideas, construction, networks, methods, embodiments, examples, etc. of FIG. 27-2 and/or FIG. 27-12 and/or FIG. 27-13 and/or FIG. 27-14 may be combined (in whole or in one or more parts, etc.). In fact, the ideas of FIG. 27-2 and/or FIG. 27-12 and/or FIG. 27-13 and/or FIG. 27-14 may be equally applied to any networks and/or architectures presented in the context of any previous Figure(s) and/or any subsequent Figure(s) and/or any Figure(s) in specifications incorporated by reference and accompanying text.

FIG. 27-15

FIG. 27-15 shows a memory chip interconnect network 27-1500, in accordance with one embodiment. As an option, the memory system network may be implemented in the context of the previous Figure(s) and/or any subsequent Figure(s). Of course, however, the stacked memory chip interconnect network may be implemented in the context of any desired environment.

For example, the memory chip interconnect network may be implemented in the context of FIG. 27-2 and/or FIG. 27-12 and/or FIG. 27-13 and/or FIG. 27-14. For example, the explanations, descriptions, etc. accompanying FIG. 27-2 and/or FIG. 27-12 and/or FIG. 27-13 and/or FIG. 27-14 including (but not limited to): interconnection, buses, multiplexing, demultiplexing, bus splitting, bus aggregation, bus joining, bus coupling, use of TSVs, and/or other methods, algorithms, functions, etc. may equally apply (e.g. may be employed, may be incorporated in whole or part, may be combined with, etc.) to the architecture of memory networks based, for example, on FIG. 27-15. Also, references to other Figures and/or other specifications incorporated by reference in the context of FIG. 27-2 may equally apply to the architecture of memory networks based, for example, on FIG. 27-15.

In FIG. 27-15, the memory chip interconnect network may include one or more copies of memory portions 27-1510. In FIG. 27-15, there may be two memory portions MP1, MP2; but any number may be used (e.g. 4, 8, 16, 32, 64, 128, or any number including spare or redundant copies, for example). The memory portions may be located on the same memory chip and/or different memory chips.

In FIG. 27-15, the memory chip interconnect network may include one or more copies of buses: 27-1514, 27-1516, 27-1522, 27-1532, 27-1528, 27-1530, 27-1534, 27-1536, 27-1538, 27-1540.

In FIG. 27-15, the memory chip interconnect network may include one or more copies of switches: 27-1518, 27-1520, 27-1524, and 27-1526. In one embodiment, switches 27-1520 and 27-1524 may be switched so that bits may be steered to/from memory portion MP1 and memory portion MP2. For example, switches 27-1520 and 27-1524 may be switched at a frequency (e.g. defined herein as the switching frequency, etc.) comparable to the data rate so that successive bits may be steered alternately either to (e.g. for writes, etc.) or from (e.g. for reads, etc.) memory portion MP1 and memory portion MP2. Any switching frequency may be used (including zero, for static operation, etc.). In one embodiment, MP1 and MP2 may be located on the same stacked memory chip. In one embodiment, MP1 and MP2 may be located on different stacked memory chips. In one embodiment, the switching frequency may be chosen so that eight bit periods (e.g. defined herein as the merge width, etc.) are steered to/from MP1 followed by eight bit periods steered to/from MP2, etc. Any merge width may be used (e.g. 1, 2, 4, 8, 16, 32, etc.). Any bus widths may be used. For example, the width of bus 27-1522 may be 16 bits; the width of bus 27-1514, 27-1528 may be 16 bits. Thus, in this example, all bus widths are equal, but this need not be the case. For a first period of time t1, switch 27-1520 may be closed (e.g. conducting, etc.) and switch 27-1524 may be open (e.g. non-conducting, etc.). The merge width of bus 27-1522 may be four. During time period t1, 4×16=64 bits may be transferred (e.g. connected, coupled, transmitted, etc.) to MP1 (e.g. for a read, etc.). For a second period of time t2, switch 27-1520 may be open and switch 27-1524 may be closed. During time period t2, 4×16=64 bits may be transferred (e.g. connected, coupled, transmitted, etc.) to MP2 (e.g. for a read, etc.).

In one embodiment, switches may be MOS transistors (e.g. n-channel, p-channel, etc.), pass gates, or any type of switched coupling device, etc. In one embodiment, one or more MUXes may be used to multiplex (e.g. split, divide, etc.) one or more buses. In one embodiment, one or more de-MUXes may be used to de-multiplex (e.g. join, aggregate, etc.) buses.

In one embodiment, buses 27-1514, 27-1522, 27-1528 may be (e.g. form, operate as, capable of operating as, etc.) a bi-directional read/write data bus. In one embodiment, bus 27-1522 may be joined (e.g. multiplexed, aggregated, etc.) from buses 27-1514, 27-1528 for reads (e.g. buses used in a first direction, etc.); and buses 27-1514, 27-1528 may be split (e.g. demultiplexed, etc.) from bus 27-1522 for writes (e.g. buses used in a second direction, etc.). The buses 27-1514, 27-1522, 27-1528 may form a group of buses in which one or more buses may be switched and/or one or more buses may be split and/or merged (e.g. defined herein as a switched multibus, etc.).

For example, one or more switched multibus structures may be used to reduce the number of TSVs required to couple one or more stacked memory chips to one or more logic chips in a stacked memory package. For example, one or more switched multibus structures may be used to introduce redundancy and/or add spare structures (e.g. spare circuits, spare interconnect, spare TSV connections, spare buses, etc.) to one or more stacked memory chips and/or one or more logic chips in a stacked memory package. For example, one or more switched multibus structures may be used to increase the efficiency (e.g. bandwidth available per total number of connections, etc.) of interconnect structure(s) (e.g. TSV arrays, TWI structures, other interconnect, etc.) that may be used couple one or more stacked memory chips to one or more logic chips in a stacked memory package.

In one embodiment of a switched multibus, there may be more than one merge width. For example, each of the split buses in a switched multibus may have a different width. Using the above example, for a first period of time t1, switch 27-1520 may be closed (e.g. conducting, etc.) and switch 27-1524 may be open (e.g. non-conducting, etc.). The merge width of bus 27-1514 may be four. During time period t1, 4×16=64 bits may be transferred (e.g. connected, coupled, transmitted, etc.) to MP1 (e.g. for a read, etc.). For a second period of time t2, switch 27-1520 may be open and switch 27-1524 may be closed. The merge width of bus 27-1528 may be two. During time period t2, 2×16=32 bits may be transferred (e.g. connected, coupled, transmitted, etc.) to MP2 (e.g. for a read, etc.).

In one embodiment of a switched multibus, there may be more than one switching frequency. For example, each switch in a switched multibus may operate a different frequency.

In one embodiment of a switched multibus, there may be one or more idle periods. Using the above example, there may be a time period t3 in which both switches are open, for example (e.g. switch 27-1520 may be open and switch 27-1524 may be open). In one embodiment, one or more selector circuits may be used to multiplex (e.g. split, divide, etc.) one or more buses. In one embodiment, one or more de-selector circuits may be used to de-multiplex (e.g. join, aggregate, etc.) buses. Note that normally a MUX circuit may select one input that is connected to the output. For example, a 2:1 MUX may have two inputs A, B; and one output X. Normally one input (either A or B) is always connected to the output X. Thus, for example, if it is required that switch 27-1520 may be open and switch 27-1524 may be open, a conventional 2:1 MUX may not be capable of performing the required function. In this case a selector circuit that is capable, for example, of disconnecting all inputs from the output may be used. Similarly a de-selector circuit may be used when it may be required to perform a demultiplexing function with the capability of disconnecting all outputs from the input. It should be noted that selector circuits and de-selector circuits (with functions as defined herein) may be used in place of MUX and de-MUX circuits and/or equivalent functions in any architecture described herein (e.g. in any previous Figures or subsequent Figures) and/or in any other specification incorporated by reference that may use, for example, a MUX and/or de-MUX circuit and/or equivalent functions.

In one embodiment, the merge widths of a switched multibus may be variable (e.g. configurable, etc.) and may be changed at design time, manufacture, test, assembly, start-up, during operation, combinations of these, etc.

In one embodiment, the bus widths of a switched multibus may be variable (e.g. configurable, etc.) and may be changed at design time, manufacture, test, assembly, start-up, during operation, combinations of these, etc.

In one embodiment, the switching frequencies of a switched multibus may be variable (e.g. configurable, etc.) and may be changed at design time, manufacture, test, assembly, start-up, during operation, combinations of these, etc.

In one embodiment one or more switched multibuses may be used. For example, in FIG. 27-15, buses 27-1514, 27-1522, 27-1528 may form a first switched multibus MB1; and buses 27-1516, 27-1530, 27-1532 may form a second switched multibus MB2. In one embodiment MB1 and MB2 may both be used to carry data (e.g. read data, write data, etc.). Any number of switched multibuses may be used (e.g. 1, 2, 4, etc. copies of a switched multibus may be used, etc.).

In one embodiment, buses 27-1534, 27-1538 may be address buses. In one embodiment, buses 27-1534, 27-1538 may be the same (e.g. identical copies of the same bus, etc.). In one embodiment, buses 27-1534, 27-1538 may be different (e.g. separate copies of an address or other bus, etc.).

In one embodiment, buses 27-1536, 27-1540 may be control buses (and/or collections of control signals, etc.). In one embodiment, buses 27-1536, 27-1540 may be the same (e.g. identical copies of the same bus, etc.). In one embodiment, buses 27-1536, 27-1540 may be different (e.g. separate copies of a control or other bus, etc.).

In one embodiment, buses 27-1534, 27-1538 and/or buses 27-1536, 27-1540 may be combined, aggregated, multiplexed, switched multibus, bi-directional bus, etc. Other permutations and combinations of buses, types of buses, connections of buses, etc. may be possible to allow optimization of bandwidth, speed (bus frequency etc.), etc. with trade-offs that may include, for example: routing space, routing density, power, etc.

In one embodiment, the architectures, ideas, construction, networks, methods, embodiments, examples, etc. of FIG. 27-2 and/or FIG. 27-12 and/or FIG. 27-13 and/or FIG. 27-14 may be combined (in whole or in one or more parts, etc.). In fact, the ideas of FIG. 27-2 and/or FIG. 27-12 and/or FIG. 27-13 and/or FIG. 27-14 may be equally applied to any networks and/or architectures presented in the context of any previous Figure(s) and/or any subsequent Figure(s) and/or any Figure(s) in specifications incorporated by reference and accompanying text.

FIG. 27-16

FIG. 27-16 shows a memory chip interconnect network 27-1600, in accordance with one embodiment. As an option, the memory system network may be implemented in the context of the previous Figure(s) and/or any subsequent Figure(s). Of course, however, the stacked memory chip interconnect network may be implemented in the context of any desired environment.

For example, the memory chip interconnect network may be implemented in the context of FIG. 27-2 and/or one or more of FIGS. 27-12, 27-13, 27-14, 27-15. For example, the explanations, descriptions, etc. accompanying FIG. 27-2 and/or one or more of FIGS. 27-12,27-13, 27-14, 27-15 including (but not limited to): interconnection, buses, multiplexing, demultiplexing, bus splitting, bus aggregation, bus joining, bus coupling, use of TSVs, and/or other methods, algorithms, functions, etc. may equally apply (e.g. may be employed, may be incorporated in whole or part, may be combined with, etc.) to the architecture of memory networks based, for example, on FIG. 27-16. Also, references to other Figures and/or other specifications incorporated by reference in the context of FIG. 27-2 may equally apply to the architecture of memory networks based, for example, on FIG. 27-16.

In FIG. 27-16, the memory chip interconnect network may include one or more copies of memory portions 27-1610. In FIG. 27-16, there may be two memory portions MP1, MP2; but any number may be used. The memory portions may be located on the same memory chip and/or different memory chips.

In FIG. 27-16, the memory chip interconnect network may include one or more copies of buses: 27-1640, 27-1642, 27-1644, 27-1646, 27-1648, and 27-1650.

In FIG. 27-16, one or more of the buses may be a switched multibus. For example, in one embodiment, buses 27-1640, 27-1642 may be switched multibuses that are bi-directional and carry read/write data. For example, in one embodiment, buses 27-1640, 27-1642 may be similar to buses shown in the context of FIG. 27-5. For example, in one embodiment, buses 27-1640, 27-1642 may be switched multibuses that are unidirectional and carry read/write data (e.g. bus 27-1640 may carry read data and bus 27-1642 may carry write data, etc.). For example, in one embodiment, buses 27-1644, 27-1648 may be switched multibuses that are unidirectional and carry address data. In one embodiment, buses 27-1644, 27-1648 may be identical (or identical copies, etc.) or similar and carry the same address information (or nearly the same address information). For example, in one embodiment, there may be one or more bits of an address bus that control the switches in one or more multibuses etc.

In one embodiment, switching control(s) (e.g. of a switched multibus, select signals, deselect signals, MUX inputs, de-MUX inputs, etc.) may be contained (e.g. included, incorporated within, a part of, a field included within, coded within, etc.) any bus or buses (e.g. as one or more bits, patterns, flags, indicators, controls, etc.) and/or may be (e.g. use, employ, etc.) one or more separate (e.g. separate from a bus, etc.) control signal(s) etc. (and/or combinations of these methods, etc.). For example, in one embodiment, information used as switching controls may be embedded (e.g. added to, included with, etc.) one or more address fields in one or more address buses. For example, in one embodiment, information used as switching controls may be embedded (e.g. added to, included with, etc.) one or more data fields (e.g. read data, write data, other data information, etc.) in one or more data buses. For example, in one embodiment, information used as switching controls may be embedded (e.g. added to, included with, etc.) one or more control buses.

In FIG. 27-16, in one embodiment, buses 27-1640, 27-1642 may be switched multibuses that may carry data (e.g. read/write data, etc.) and there may be thus two copies of switched data multibuses per memory portion. Any number of switched data multibuses per memory portion may be used (e.g. 1, 2, 3, 4, etc.).

In FIG. 27-16, in one embodiment, buses 27-1640, 27-1642 may be switched multibuses that may carry data (e.g. read/write data, etc.); buses 27-1644, 27-1648 may be switched multibuses that are joined to carry address information; buses 27-1646, 27-1650 may be switched multibuses that are joined to carry control information. Thus in this example, there may be four switched multibuses per memory portion (e.g. coupled to a memory portion, connected to a memory portion, etc.) carrying data, address, control information and/or other information, data, etc. In FIG. 27-16, in one embodiment, buses 27-1640, 27-1642 may be switched multibuses that may carry data (e.g. read/write data, etc.); buses 27-1644, 27-1648 may be separate buses that may carry address information; buses 27-1646, 27-1650 may be separate buses that may carry control information. Thus, in this example, there may be two copies of switched data multibuses per memory portion. Any number of switched data multibuses (e.g. unidirectional, bi-directional, etc.) per memory portion may be used (e.g. 1, 2, 3, 4, etc.). Any number of switched multibuses (e.g. for data, address, control, etc.) per memory portion may be used (e.g. 1, 2, 3, 4, etc.). Any number of buses that are not switched multibuses (e.g. for data, address, control, etc.) per memory portion may be used (e.g. 1, 2, 3, 4, etc.). Thus, it may be seen that any number and/or types etc. of buses, switched multibuses, etc. may be used in various combinations to carry data (e.g. read data, write data, etc.), address information, control information, and/or other information such that the number of buses of various types coupled to each memory portion may be any number.

Note that not all memory portions need have the same type, number, configuration, parameters, etc. of buses, multibuses, etc. For example, memory portions in different positions on a stacked memory chip (e.g. at the edge and/or corners of an array, for example) may have different bus arrangements, configurations, connections, connectivity, bandwidth, capacity, width, frequencies, etc. For example, memory portions on different stacked memory chips in a stacked memory package may have different bus arrangements, configurations, etc. For example, memory portions on stacked memory chips in different stacked memory package may have different bus arrangements, configurations, etc.

Note that in FIG. 27-16, for example, a switched multibus may have a switching frequency of zero (or switched at a much lower frequency than the data rate, or be operated in a static mode or nearly static fashion, etc.). Thus, for example, bus 27-1644 (or any similar bus, etc.) may have a low or zero switching frequency. In this case, for example, bus 27-1644 may perform in a similar manner to a conventional bus. For example, in one mode or configuration, buses 27-1644 and 27-1648 may be aggregated to form a switched multibus (e.g. as a control bus, or address bus, etc. possibly with one or more bus delays, etc.). For example, in a different mode or configuration, buses 27-1644 and 27-1648 may be separate (e.g. distinct, not joined, etc.) with low or zero switching frequency, to form two independent or nearly independent buses (e.g. control buses, address buses, etc. possibly with one or more bus delays, etc.).

In FIG. 27-16, one or more of the buses may be a switched multibus and/or use (e.g. employ, contain, etc.) variable timing. For example, in one embodiment, buses 27-1644, 27-1648 may carry the same address information but with different timing (e.g. one bus may be a delayed version of the other bus, etc.). For example, in one embodiment, buses 27-1646, 27-1650 may carry the same control information but with different timing (e.g. one bus may be a delayed version of the other bus, etc.). In one embodiment, the timing (e.g. inserted delays, included delays, programmed delays, etc.) of the buses may be adjusted (e.g. may be variable, may be configured, etc.) so that, for example, read data (or write data) may be interleaved (e.g. time multiplexed, etc.) on one or more data buses (e.g. a bi-directional read/write bus(es), unidirectional read bus(es) and unidirectional write bus(es), unidirectional and/or bi-directional switched multibus(es), combinations of these, etc.). Note that the bus delay(s) (e.g. inserted delays, included delays, programmed delays, etc.) may be independent of the switching frequency or switching frequencies of the buses. In one embodiment bus timing (e.g. delays in one or more split buses and/or joined buses, etc.) may be changed, altered, configured, programmed, etc. at design time, manufacture, test, assembly, start-up, during operation, combinations of these, etc.

In one embodiment, bus and/or other signal timing may be varied by the use of circuit delay means. For example a DLL or other timing control circuit may be used to introduce delays into buses, bus signals, etc. In one embodiment bus and/or other signal timing may be varied by the use of interconnect delay means. For example, the different delay properties of different TSV structures and/or other TWI, bus lengths, bus geometries, wire lengths, wire delays, interconnect delays, connections, interconnect, interposer, coupling means, combinations of these, etc. may be used to introduce delays, adjust delays, compensate for delays, match delays, combinations of these effects, etc. for buses, bus signals, other signals, etc. In one embodiment, bus and/or other signal timing may be varied by the use of circuit delay means and interconnect delay means. For example, circuits may measure or otherwise determine the delay properties of one or more interconnect structures and then adjust, alter, change, configure or otherwise modify etc. one or more circuit delays to change the timing of one or more buses, bus signals, and/or other signals, etc. For example, circuits may adjust one or more delays to allow (e.g. permit, enable, etc.) bus turnarounds and/or adjust (e.g. reduce, increase, alter, etc.) bus turnaround times, align data with one or more strobes, or otherwise introduce delays and/or relative delays to align or otherwise adjust the timing of one or more signals, etc. Delay modification may be performed at design time, manufacture, test, assembly, start-up, during operation, combinations of these times, etc.

In one embodiment, the switching frequencies of one or buses in a switched multibus may be varied to achieve (e.g. create, assemble, perform as, function as, etc.) a variable rate bus or variable bandwidth bus. For example, two buses, A and B, may be multiplexed to bus C in a switched multibus. Bus C, for example, may have a bandwidth of BWC or 1 bit per second. For example, if bus C is switched between bus A and bus B at a rate of 1/BWC or once per second (e.g. 1 Hz) then bus A and bus B may both occupy (e.g. use, require, etc.) a bandwidth of 0.5 Hz. By adjusting the switching frequencies of bus A and of bus B independently, the bandwidth occupied by bus A (BWA) and bandwidth occupied by bus B (BWB) may both be varied independently with the condition that BWA+BWB is less than or equal to BWC. The frequencies, bandwidths, rates, etc. used in this example are used by way of example, as any frequencies etc. may be used. Switching frequencies, bandwidths, etc. may depend on the data frequency, clock frequency, etc. and typically, in a stacked memory package for example, frequencies (e.g. switching, data, clock, etc.) may be 1 MHz or greater or 1 GHz or greater.

If the frequency of signals on bus A and bus B (e.g. data rate, etc.) are much greater than the switching frequencies of a switched multibus, then the bandwidth of buses in a switched multibus may be varied continuously or nearly continuously. If the switching frequencies are related to the signal frequencies, then the bandwidths may be adjusted in steps (e.g. multiples of a fixed figure, number, etc.). For example, the switches may be connected in the sequence AAABAAAB . . . (and so on in the same repetitive pattern) e.g. bus A may be multiplexed for three time periods (with one time period equal to t1, a multiple of the bit length, bit period, bit width, pulse width, etc.), followed by bus B multiplexed for one time period (e.g. time of t1) etc. In this case, bus A may occupy a bandwidth of 0.75×BWC and bus B may occupy a bandwidth of 0.25×BWC. For example t1 may represent a time period of (e.g. corresponding to, equal to, etc.) 16 bits (e.g. 16 bit periods, bit widths, etc.). For example t1 may represent a time period of (e.g. corresponding to, equal to, etc.) 16 bits (e.g. 16 bit periods, bit widths, etc.). In one embodiment, one or more idle periods may be used. For example, the switches may be connected in the sequence AAIBAAIB . . . e.g. bus A may be multiplexed for two time periods (with one time period equal to t1), followed by an idle period (switches open, non-conducting, etc.) equal to t1, followed by bus B multiplexed for time t1, etc. In this case bus A may occupy a bandwidth of 0.5×BWC and B may occupy a bandwidth of 0.25×BWC.

In one embodiment, the switching pattern of switches in a switched multibus may be controlled. In one embodiment switching patterns may be controlled, changed, altered, configured, programmed, etc. at design time, manufacture, test, assembly, start-up, during operation, combinations of these, etc.

In one embodiment, the bandwidth(s) of one or more switched multibuses (e.g. the switched multibus bandwidth and/or bandwidths of the multiplexed buses that form the switched multibus, etc.) may be adjusted. The variable bandwidth (e.g. variable rate, etc.) switched multibuses may couple information (e.g. read data, write data, read/write data, address, control, combinations of these and/or other signals, etc.) to/from one or more memory portions.

In one embodiment, one or more switched multibuses may be used in a hierarchy (e.g. in a hierarchical fashion, hierarchical manner, hierarchical architecture, nested architecture, etc.). For example, in one embodiment, bus A1 and B1 may be multiplexed to a first switched multibus C1; and bus A2 and B2 may be multiplexed to a second switched multibus C2. In one embodiment, buses C1 and C2 may be further multiplexed to a third switched multibus D1. In one embodiment, bus A1, A2, B1, B2 may be switched independently (e.g. switching frequencies adjusted separately, etc.) in order to adjust the bandwidth allocation of A1, A2, B1, B2; and/or bus C1, C2 may be switched independently in order to adjust the bandwidth allocation of C1, C2. In this manner, bandwidth allocation may be adjusted hierarchically (e.g. by adjusting C1, C2 at one level and/or adjusting A1, A2, B1, B2 at a second, lower, level, etc.). Such a method of bandwidth adjustment may offer more flexibility and/or allow better programming control over bandwidth, for example, in a stacked memory chip, stacked memory package, memory system, etc. For example, bandwidths may be adjusted according to defined, measured, or otherwise determined memory system traffic profiles (e.g. 100% read traffic, 100% write traffic, random traffic, traffic concentrated in one or more memory address ranges, etc.).

In one embodiment, bandwidth may be programmed (e.g. moved, adjusted, altered, programmed, configured, regulated, etc.) in a memory network. For example, a memory network may use one or more switched multibuses to couple data to/from one or more memory portions. For example, a memory portion N may be located in a network of memory portions. The network of memory portions may also include memory portion N−1 and memory portion N+1. The memory portion N may be connected to two switched multibuses, MB(N−1) and MB(N+1). The switched multibus MB(N−1) may multiplex data to/from memory portion N−1 and memory portion N. The switched multibus MB(N+1) may multiplex data to/from memory portion N+1 and memory portion N. Memory portion N−1 may switch MB(N−1) at a frequency f(N−1)MB(N−1); memory portion N may switch MB(N−1) at a frequency f(N)MB(N−1); memory portion N may switch MB(N+1) at a frequency f(N)MB(N+1); memory portion N+1 may switch MB(N+1) at a frequency f(N+1)MB(N+1). Thus by adjusting one or more of the switching frequencies: f(N−1)MB(N−1); f(N) MB(N−1); f(N)MB(N+1); f(N+1)MB(N+1); the bandwidth, for example, used by memory portion N may be adjusted, etc. In one embodiment, changing the properties of one or more switched multibuses may allow bandwidth to be moved, for example. Any number of memory portions, switched multibuses (possibly hierarchical, etc.), switching frequencies, idle periods, memory networks, etc. may be used in any combination with any arrangement, etc. of memory portions and/or memory networks (e.g. located on one memory chip and/or multiple memory chips and/or multiple packages, etc.).

In one embodiment, for example, bandwidth may be programmed to adjust the bandwidth used, occupied, granted to, allocated to, etc. one or more memory classes (as defined herein and/or in specifications incorporated by reference). For example, programmable bandwidth may be used to adjust the bandwidth used, occupied, granted to, allocated to, etc. one or more groups of memory portions. For example one or more groups of memory portions may be formed by grouping one or more types of memory portions (e.g. different technology, different network types, different network architectures, different abstract views, different memory chips, different memory packages, etc.).

In one embodiment, any of the described memory network attributes, memory network parameters, memory network architecture, bus connections, bus parameters, switched multibus parameters, bus attributes, switching frequencies, switching patterns, idle times, bus configurations, bus bandwidths, bus capacities, bandwidth allocations, bus functions, bus timing, bus delays, bus directions, combinations of these and/or other memory portion attributes, memory network functions, bus attributes and/or functions, etc. may be controlled, changed, altered, configured, programmed, modified, etc. at design time, manufacture, test, assembly, start-up, during operation, combinations of these times and/or any other times, etc.

In one embodiment, the architectures, ideas, construction, networks, methods, embodiments, examples, etc. of FIG. 27-2 and/or one or more of FIGS. 27-12, 27-13, 27-14, 27-15 may be combined (in whole or in one or more parts, etc.). In fact, the ideas of FIG. 27-2 and/or FIG. 27-12 and/or one or more of FIGS. 27-12, 27-13, 27-14, 27-15 may be equally applied to any networks and/or architectures presented in the context of any previous Figure(s) and/or any subsequent Figure(s) and/or any Figure(s) in specifications incorporated by reference and accompanying text.

It should be noted that, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, one or more aspects of the various embodiments of the present invention may be designed using computer readable program code for providing and/or facilitating the capabilities of the various embodiments or configurations of embodiments of the present invention.

Additionally, one or more aspects of the various embodiments of the present invention may use computer readable program code for providing and facilitating the capabilities of the various embodiments or configurations of embodiments of the present invention and that may be included as a part of a computer system and/or memory system and/or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; U.S. Provisional Application No. 61/581,918, filed Jan. 13, 2012, titled "USER INTERFACE SYSTEM, METHOD, AND COMPUTER PROGRAM PRODUCT"; U.S. Provisional Application No. 61/602,034, filed Feb. 22, 2012, titled "SYSTEM, METHOD, AND COMPUTER PROGRAM PRODUCT FOR IMPROVING MEMORY SYSTEMS"; U.S. Provisional Application No. 61/608,085, filed Mar. 7, 2012, titled "SYSTEM, METHOD, AND COMPUTER PROGRAM PRODUCT FOR IMPROVING MEMORY SYSTEMS"; U.S. Provisional Application No. 61/635,834, filed Apr. 19, 2012, titled "SYSTEM, METHOD, AND COMPUTER PROGRAM PRODUCT FOR IMPROVING MEMORY SYSTEMS"; U.S. application Ser. No. 13/441,132, filed Apr. 6, 2012, titled "MULTIPLE CLASS MEMORY SYSTEMS"; U.S. application Ser. No. 13/433,283, filed Mar. 28, 2012, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. application Ser. No. 13/433,279, filed Mar. 28, 2012, titled "SYSTEM, METHOD, AND COMPUTER PROGRAM PRODUCT FOR UTILIZING IMAGE RECOGNITION TO PERFORM AN ACTION"; U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY"; U.S. Provisional Application No. 61/665,301, filed Jun. 27, 2012, titled "SYSTEM, METHOD, AND COMPUTER PROGRAM PRODUCT FOR ROUTING PACKETS OF DATA", and U.S. Provisional Application No. 61/673,192, filed Jul. 18, 2012, titled "SYSTEM, METHOD, AND COMPUTER PROGRAM PRODUCT FOR REDUCING A LATENCY ASSOCIATED WITH A MEMORY SYSTEM." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section XI

The present section corresponds to U.S. Provisional Application No. 61/698,690, titled "SYSTEM, METHOD, AND COMPUTER PROGRAM PRODUCT FOR TRANSFORMING A PLURALITY OF COMMANDS OR PACKETS IN CONNECTION WITH AT LEAST ONE MEMORY," filed Sep. 9, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization and/or use of other conventions, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS," and in U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY." Each of the foregoing applications are hereby incorporated by reference in their entirety for all purposes.

Example embodiments described herein may include computer system(s) with one or more central processor units (CPU) and possibly one or more I/O unit(s) coupled to one or more memory systems that may contain one or more memory controllers and memory devices. As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry.

FIG. 28-1

FIG. 28-1 shows an apparatus 28-100, in accordance with one embodiment. As an option, the apparatus 28-100 may be implemented in the context of any subsequent Figure(s). Of course, however, the apparatus 28-100 may be implemented in the context of any desired environment.

It should be noted that a variety of optional architectures, capabilities, and/or features will now be set forth in the context of a variety of embodiments in connection with a description of FIG. 28-1. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 28-100 includes a first semiconductor platform 28-102, which may include a first memory. Additionally, in one embodiment, the apparatus 28-100 may include a second semiconductor platform 28-106 stacked with the first semiconductor platform 28-102. In one embodiment, the second semiconductor platform 28-106 may include a second memory. As an option, the first memory may be of a first memory class. Additionally, the second memory may be of a second memory class. Of course, in one embodiment, the apparatus 28-100 may include multiple semiconductor platforms stacked with the first semiconductor platform 28-102 or no other semiconductor platforms stacked with the first semiconductor platform.

In another embodiment, a plurality of stacks may be provided, at least one of which includes the first semiconductor platform 28-102 including a first memory of a first memory class, and at least another one which includes the second semiconductor platform 28-106 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments.

In another embodiment, the apparatus 28-100 may include a physical memory sub-system. In the context of the present description, physical memory may refer to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, SDRAM, eDRAM, embedded DRAM, MRAM, PRAM, etc.), memristor, phase-change memory, FeRAM, PRAM, MRAM, resistive RAM, RRAM, a solid-state disk (SSD) or other disk, magnetic media, and/or any other physical memory and/or memory technology etc. (volatile memory, nonvolatile memory, etc.) that meets the above definition.

Additionally, in various embodiments, the physical memory sub-system may include a monolithic memory circuit, a semiconductor die, a chip, a packaged memory circuit, or any other type of tangible memory circuit, or any intangible grouping of tangible memory circuits, combinations of these, etc. In one embodiment, the apparatus 28-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 28-106. Such connections that are in communication with the first memory and pass through the second semiconductor platform 28-106 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing one or more TSVs.

As another option, the communicative coupling may include a connection via a buffer device. In one embodiment, the buffer device may be part of the apparatus 28-100. In another embodiment, the buffer device may be separate from the apparatus 28-100.

Further, in one embodiment, at least one additional semiconductor platform (not shown) may be stacked with the first semiconductor platform 28-102 and the second semiconductor platform 28-106. In this case, in one embodiment, the additional semiconductor may include a third memory of at least one of the first memory class or the second memory class, and/or any other additional circuitry. In another embodiment, the at least one additional semiconductor may include a third memory of a third memory class.

In one embodiment, the additional semiconductor platform may be positioned between the first semiconductor platform 28-102 and the second semiconductor platform 28-106. In another embodiment, the at least one additional semiconductor platform may be positioned above the first semiconductor platform 28-102 and the second semiconductor platform 28-106. Further, in one embodiment, the additional semiconductor platform may be in communication with at least one of the first semiconductor platform 28-102 and/or the second semiconductor platform 28-102 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 28-102 may be in communication via a buffer. In this case, in one embodiment, the buffer may include a row buffer.

Further, in one embodiment, the apparatus 28-100 may be configured such that the first memory and the second memory are capable of receiving instructions via a single memory bus 28-110. The memory bus 28-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, combinations of these, etc; I/O protocols such as PCI, PCI-E, HyperTransport, InfiniBand, QPI, etc; networking protocols such as Ethernet, TCP/IP, iSCSI, combinations of these, etc; storage protocols such as NFS, SAMBA, SAS, SATA, FC, etc; combinations of these and/or other protocols (e.g. wireless, optical, etc.); etc.). Of course, other embodiments are contemplated with multiple memory buses.

In one embodiment, the apparatus 28-100 may include a three-dimensional integrated circuit. In one embodiment, the first semiconductor platform 28-102 and the second semiconductor platform 28-106 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 28-100 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 28-102 and the second semiconductor platform 28-106 together may include a three-dimensional integrated circuit that is a wafer-on-wafer device.

In another embodiment, the apparatus 28-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 28-102 and the second semiconductor platform 28-106 together may include a three-dimensional integrated circuit that is a monolithic device.

In another embodiment, the apparatus 28-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 28-102 and the second semiconductor platform 28-106 together may include a three-dimensional integrated circuit that is a die-on-wafer device.

In yet another embodiment, the apparatus 28-100 may include a three-dimensional integrated circuit that is a die-on-die device. In the context of the present description, a die-on-die device refers to a device including two or more aligned dies in a die-on-die configuration. In one embodiment, the first semiconductor platform 28-102 and the second semiconductor platform 28-106 together may include a three-dimensional integrated circuit that is a die-on-die device.

Additionally, in one embodiment, the apparatus 28-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 28-100 may be configured such that the first memory and the second memory are capable of receiving instructions from a device 28-108 via the single memory bus 28-110. In one embodiment, the device 28-108 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.

In the context of the following description, optional additional circuitry 28-104 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 28-104 is shown generically in connection with the apparatus 28-100, it should be strongly noted that any such additional circuitry 28-104 may be positioned in any components (e.g. the first semiconductor platform 28-102, the second semiconductor platform 28-106, the device 28-108, an unillustrated logic unit or any other unit described herein, a separate unillustrated component that may or may not be stacked with any of the other components illustrated, a combination thereof, etc.).

In another embodiment, the additional circuitry 28-104 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiments, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 28-104 capable of receiving (and/or sending) the data operation request. More illustrative information will be set forth regarding various optional architectures, capabilities, and/or features with which the present embodiment(s) may or may not be implemented during the description of the embodiments shown in subsequent figures. It should be strongly noted that subsequent embodiment information is set forth for illustrative purposes and should not be construed as limiting in any manner, since any of such features may be optionally incorporated with or without the inclusion of other features described.

In yet another embodiment, memory regions and/or memory sub-regions of any of the memory described herein may be arranged to optimize one or more parallel operations in association with the memory.

Further, in one embodiment, the apparatus 28-100 may include at least one circuit for transforming a plurality of commands or packets, or portions thereof, in connection with at least one of the first memory or the second memory. In various embodiments, the packets may include any type of information and the commands may include any type of command. Furthermore, in various embodiments, the transforming may include any type of act to transform packets and/or commands.

For example, in one embodiment, the apparatus 28-100 may be operable such that the transforming includes re-ordering. In another embodiment, the apparatus 28-100 may be operable such that the transforming includes batching. In another embodiment, the apparatus 28-100 may be operable such that the transforming includes marking.

In another embodiment, the apparatus 28-100 may be operable such that the transforming includes combining. In another embodiment, the apparatus 28-100 may be operable such that the transforming includes splitting. In another embodiment, the apparatus 28-100 may be operable such that the transforming includes modifying. In another embodiment, the apparatus 28-100 may be operable such that the transforming includes inserting. In yet another embodiment, the apparatus 28-100 may be operable such that the transforming includes deleting.

In various embodiments, the apparatus 28-100 may be operable such that the commands are transformed, the portion of the commands are transformed, the packets are transformed, and/or the portion of the packets are transformed.

In one embodiment, the at least one circuit may be distributed among a plurality of semiconductor platforms. For example, in one embodiment, the plurality of semiconductor platforms in which the at least one circuit is distributed may include at least one of the first semiconductor platform 28-102 or the second platform 28-106. In one embodiment, the at least one circuit may be part of at least one of the first semiconductor platform 28-102 or the second semiconductor platform 28-106. In another embodiment, the at least one circuit may be separate from the first semiconductor platform 28-102 and the second semiconductor platform 28-106. Further, in one embodiment, the at least one circuit may be part of a third semiconductor platform stacked with the first semiconductor platform 28-102 and the second semiconductor platform 28-106. Still yet, in one embodiment, the at least one circuit may include a logic circuit.

In one embodiment, the apparatus 28-100 may include i number of logic areas coupled to j number of interconnect structures coupled to k memory portions of at least one of the first memory or the second memory. In this case, i, j, and k may each be non-zero real numbers. Furthermore, in one embodiment, the memory portions may be hierarchically structured.

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate with the memory system to allow for any of the foregoing optional architectures, capabilities, and/or features. For that matter, further embodiments are contemplated where a single semiconductor platform (e.g. 28-102, 28-106, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

It should be noted that while the embodiments described in this specification and in specifications incorporated by reference may show examples of stacked memory system and improvements to stacked memory systems, the examples described and the improvements described may be generally applicable to a wide range of electrical and/or electronic systems. For example, improvements to signaling, yield, bus structures, test, repair etc. may be applied to the field of memory systems in general as well as systems other than memory systems, etc.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the configuration/operation of the apparatus 28-100, the configuration/operation of the first and/or second semiconductor platforms, and/or other optional features (e.g. transforming the plurality of commands or packets in connection with at least one of the first memory or the second memory, etc.) have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc., which may or may not be incorporated in the various embodiments disclosed herein.

FIG. 28-2

FIG. 28-2 shows a stacked memory package 28-200, in accordance with one embodiment. As an option, the stacked memory package may be implemented in the context of the previous Figure(s) and/or any subsequent Figure(s). Of course, however, the stacked memory package may be implemented in the context of any desired environment.

In FIG. 28-2, the stacked memory package may include one or more first groups of memory portions 28-210 (or sets of groups, collections of groups, etc.) and/or associated memory support circuits (e.g. clocking functions, DLL, PLL, power related functions, register storage, I/O buses, buffers, etc.), memory logic, etc. In FIG. 28-2, the first group may include all the memory portions in a stacked memory package. Any grouping, arrangement, or collection etc. of memory portions may be used for the one or more first groups of memory portions. For example, the group of memory portions 28-210 may include all memory portions in a memory system (e.g. memory portions in more than one stacked memory package, etc.). For example, a group of memory portions 28-210 may include all memory portions in a memory class (as defined herein and/or in one or more specifications incorporated by reference). For example, a group of memory portions 28-210 may include a subset of memory portions in a stacked memory package. The subset of memory portions in a stacked memory package may correspond to (e.g. include, encompass, etc.) the memory portions on a stacked memory chip, the memory portions on one or more portions of a stacked memory chip, the memory portions on one or more stacked memory chips (e.g. an echelon, a section, groups of these, etc.), combinations of these and/or the memory portions on any other carrier, assembly, platform, etc.

In FIG. 28-2, the stacked memory package may include a second group of memory portions 28-214. For example, the stacked memory package may include a group of memory portions on one or more stacked memory chips. Thus, in this case, the second group of memory portions 28-214 may correspond to a stacked memory chip. The grouping of memory portions in FIG. 28-2 may correspond to the memory portions contained on a stacked memory chip, or portion(s) of one or more stacked memory chips, however any grouping (e.g. collection, set, etc.) may be used.

In FIG. 28-2, the stacked memory package may include one or more memory portions 28-212. The memory portions may be a bank, bank group (e.g. group, set, collection of banks), echelon (as defined herein and/or in specifications incorporated by reference), section (as defined herein and/or in specifications incorporated by reference), rank, combinations of these and/or any other grouping of memory portions etc. In one embodiment, the one or more memory portions 28-212 may be interconnected to form one or more memory networks. More details of the memory networks, and/or the memory network interconnections, and/or coupling between stacked memory chips, etc. may be described herein and/or in specifications incorporated herein by reference and the accompanying text. Any memory network and/or interconnect scheme (e.g. e.g. between memory portions, between stacked memory chips, etc.) that may be shown in previous Figure(s) and/or subsequent Figure(s) and/or Figure(s) in specifications incorporated herein by reference may equally be used or adapted for use in the context of FIG. 28-2.

In FIG. 28-2, the stacked memory package may include one or more buses 28-216. For example, bus 28-216 may include one or more control signals (e.g. clock, strobe, etc.) and/or other signals, etc.

In FIG. 28-2, the stacked memory package may include one or more buses 28-218. For example, bus 28-218 may include one or more address signals (e.g. column address, row address, bank address, other address, etc.).

In FIG. 28-2, the stacked memory package may include one or more buses 28-220. For example, bus 28-220 may include one or more data buses (e.g. write data, etc.).

In FIG. 28-2, the stacked memory package may include one or more buses 28-222. For example, bus 28-222 may include one or more data buses (e.g. read data, etc.).

In one embodiment, bus 28-220 and/or bus 28-222 and/or other buses, etc. may be a bi-directional bus.

In one embodiment, the stacked memory package may include other buses and/or signals, bundles of signals, collections of signals, etc. For example, different memory technologies (e.g. DRAM, NAND flash, PCM, etc.) may use different arrangements of data, control, address, and/or other buses and signals, etc.

In FIG. 28-2, the stacked memory package may include one or more memory chip logic functions 28-252. In one embodiment, the memory chip logic functions 28-252 may act to distribute (e.g. connect, logically couple, etc.) signals to/from the logic chip(s) to/from the memory portions. For example, the memory chip logic functions 28-252 may perform (e.g. function, implement, etc.) bus multiplexing, bus demultiplexing, bus merging, bus splitting, combinations of these and/or or other bus and/or data operations, etc. Examples of these bus operations and their function may be described in more detail herein, including details provided in other Figures and accompanying text and/or in Figure(s) in one or more specifications incorporated by reference. In one embodiment, the memory chip logic functions 28-252 may be distributed among the memory portions (e.g. there may be separate memory chip logic functions, logic blocks, circuits, etc. for each memory portion, etc.). In one embodiment, the memory chip logic functions 28-252 may be located one or more stacked memory chips. In one embodiment, the memory chip logic functions 28-252 may be located one or more logic chips. In one embodiment, the memory chip logic functions 28-252 may be distributed between one or more logic chips and one or more stacked memory chips.

In FIG. 28-2, the stacked memory package may include one or more interconnect networks 28-224. In one embodiment, the interconnect networks 28-224 may include interconnect means (e.g. network(s) of connections, bus(es), signals, combinations of these and/or other coupling means, etc.) to couple (or act to couple, etc.) one or more logic chips to one or more stacked memory chips. For example, one or more circuit blocks may be located on one or more logic chips and one or more circuit blocks may be located on one or more stacked memory chips. The one or more interconnect networks 28-224 may thus act to couple (e.g. actively connect, passively connect, optically connect, etc.) circuit block(s). For example, interconnect networks 28-224 may include an array (e.g. one or more, groups of one or more, arrays, matrix, etc.) of TSVs that may run vertically to couple logic on one or more logic chips to memory portions on one or more stacked memory chips. For example, interconnect networks 28-224 may act to couple write data, addresses, control signals, commands/requests, register writes, register reads, read data, responses/completions, status messages, test data, error data, and/or other information, etc. to/from one or more logic chips to/from one or more stacked memory chips. In one embodiment, the interconnect networks 28-224 may also include logic to insert (or remove or otherwise configure, etc.) spare and/or redundant interconnects, alter the architecture of buses and TSV array(s), etc.

In FIG. 28-2, the abstract view of a stacked memory package, etc. may be used to represent a number of different memory system architectures and/or views of memory system architectures. For example, in a first abstract view, the first groups of memory portions 28-210 may include (e.g. represent, signify, encompass, etc.) those memory portions in a stacked memory package. For example, in a second abstract view, the first groups of memory portions 28-210 may include those memory portions in all stacked memory packages and/or all memory portions in a memory system (e.g. in one or more stacked memory packages, etc.).

In FIG. 28-2, one or more groups of second group of memory portions 28-214 may be formed (e.g. logically separated, grouped, connected, designated, etc.) as a logical group (or virtual group, collection, etc.). For example, there may be two logical groups (e.g. A and B) of memory portions 28-214 physically located on a single stacked memory chip. For example each logical group (e.g. A and B) of memory portions 28-214 may contain 8 memory portions 28-212. The logical grouping may be achieved by a number of means that may be described below and in the context of one or more Figure(s) below.

In one embodiment, for example, buses may be multiplexed so that connections to a logic al group (e.g. A or B) may be made through (e.g. via, using, etc.) a multiplexed bus. Thus, for example, in a first time period one or more memory portions in logical group A may be accessed (e.g. read, write, etc.); and in a second time period one or more memory portions in logical group B may be accessed (e.g. read, write, etc.). Bus etc. may be performed by any multiplexing and/or similar techniques that may include, but are not limited to, techniques described herein (including specifications incorporated by reference).

In one embodiment, for example, one or more commands (e.g. read commands, write commands, etc.) may be reordered (e.g. by address, etc.) so that in a first time period one or more memory portions in logical group A may be accessed (e.g. read, write, etc.); and in a second time period one or more memory portions in logical group B may be accessed (e.g. read, write, etc.).

FIG. 28-3

FIG. 28-3 shows a physical view of a stacked memory package 28-300, in accordance with one embodiment. As an option, the stacked memory package may be implemented in the context of the previous Figure(s) and/or any subsequent Figure(s). For example, the stacked memory package may be implemented in the context of FIG. 18-1B of U.S. Provisional Application No. 61/679,720, filed Aug. 4, 2012, titled "SYSTEM, METHOD, AND COMPUTER PROGRAM PRODUCT FOR PROVIDING CONFIGURABLE COMMUNICATION PATHS TO MEMORY PORTIONS DURING OPERATION" and/or may use (e.g. may employ, may be combined with, etc.) one or more of the techniques described in the context of FIG. 18-1B of U.S. Provisional Application No. 61/679,720, filed Aug. 4, 2012, titled "SYSTEM, METHOD, AND COMPUTER PROGRAM PRODUCT FOR PROVIDING CONFIGURABLE COMMUNICATION PATHS TO MEMORY PORTIONS DURING OPERATION." Of course, however, the stacked memory package may be implemented in the context of any desired environment.

In FIG. 28-3, the stacked memory package may include one or more stacked memory chips, 28-314, 28-316, 28-318, and 28-320. In FIG. 28-3, four stacked memory chips are shown, but any number of stacked memory chips may be used.

In FIG. 28-3, the stacked memory package may include one or more logic chips 28-322. In FIG. 28-3, one logic chip is shown, but any number of logic chips may be used. For example, in one embodiment of a stacked memory package, two logic chips may be used. For example, in one embodiment, a first logic chip may be located at the bottom of a stack of stacked memory chips and a second logic chip may be located at the top of the stack of stacked memory chips. In one embodiment, for example, the first logic chip may interface electrical signals to/from a memory system and the second logic chip may interface optical signals to/from the memory system. Any arrangement of the any number of logic chips and any number of stacked memory chips may be used.

In FIG. 28-3, one or more interconnect structures 28-310 (e.g. using TSV, TWI, through-wafer interconnect, coupling, buses, combinations of these and/or other interconnect means, etc.) may couple one or more stacked memory chips and one or more logic chips. It should be noted that although one or more TSV arrays or other interconnect structures coupling one or more memory portions may be represented in FIG. 28-3 by a single dashed line (for example the line representing interconnect structure 28-310) the interconnects structure may consist of tens, hundreds, thousands, etc. of components that may include (but are not limited to) one or more of the following: conducting (e.g. metal, other conductor, etc.) traces (on the one or more stacked memory chips and logic chips), metal or other vias (on and/or through the silicon or other die), TSVs (e.g. through stacked memory chips and logic chips, other TWI, etc.), combinations of these and/or other interconnect means (e.g. electrical, optical, etc.) etc.

In FIG. 28-3, four interconnect structures 28-310 may be shown, but any number may be used. In one embodiment, spare or redundant interconnect structures may be used, for example as described elsewhere herein and/or in specifications incorporated by reference. Spare, redundant, extra, etc. structures, resources, etc. may be a part of one or more of interconnect structures 28-310 and/or may form extra copies of interconnect structures 28-310, etc.

In FIG. 28-3, the stacked memory chips may include one or more memory portions 28-312 (e.g. banks, bank groups, sections, echelons, combinations of these and/or other groups, collections, sets, etc.). In FIG. 28-3, eight memory portions per stacked memory chip are shown, but any number of memory portions per stacked memory chip may be used. Each stacked memory chip may include a different number (and/or size, type, etc.) of memory portions, and/or different groups and/or groupings of memory portions, etc.

In FIG. 28-3, the logic chip(s) may include one or more areas of common logic 28-324 (e.g. circuit blocks, circuit functions, macros, etc.) that may be considered to not be directly associated with (e.g. partitioned with, assigned to, etc.) with the memory portions. For example, some of the input pads, some of the output pads, clocking logic, etc. may be considered as shared and/or common to all or a collection of groups of memory portions, etc. In FIG. 28-3, one common logic area is shown, but any number, type, shape, size, function(s), of common logic area(s), etc. may be used.

In FIG. 28-3, the logic chip(s) may include one or more areas of logic 28-326 that may be considered as associated with (e.g. coupled to, logically grouped with, etc.) a group of memory portions. For example, a logic area 28-326 may include a memory controller that is partitioned with an echelon that may consist of a number of sections, with each section including one or more memory portions. In FIG. 28-3, four logic areas 28-326 may be shown, but any number of logic areas, etc. may be used.

In FIG. 28-3, the physical view of the stacked memory package shown may represent one possible construction e.g. as an example, etc. A stacked memory package may use any construction to assemble one or more stacked memory chips and one or more logic chips, other chip(s), die(s), CPU(s), etc.

In FIG. 28-3, in one embodiment, the stacked memory package shown may be constructed (e.g. designed, architected, etc.) so that one logic area 28-326 may correspond to one group of memory portions 28-312 (e.g. a vertically stacked group of sections forming an echelon as defined herein, etc.) connected by one interconnect structure (which may be a TSV array, or multiple TSV arrays, etc.). Such an arrangement of a stacked memory package may be characterized (e.g. referenced as, denoted by, named as, referred to, etc.) as a one-to-one-to-one arrangement or one-to-one-to-one stacked memory package architecture. In this case, one-to-one-to-one may refer to one logic area coupled to one TSV interconnect structure coupled to one group of memory portions, for example.

In one embodiment, the coupling (e.g. logic coupling, grouping, association, etc.) of the logic areas 28-326 on the logic chips with the memory portions 28-312 on the stacked memory chips using the interconnect structures 28-310 may not correspond to a one-to-one-to-one architecture.

The architecture of a stacked memory chip may be described as i:j:k, where i:j:k may refer to i logic areas 28-326 that may be coupled to j TSV interconnect structures 28-310 that may be coupled to k memory portions 28-312 and/or groups of memory portions 28-312, for example.

For example, in one embodiment, more than one interconnect structure may be used to couple a logic area on the logic chips with the memory portions on the stacked memory chips. Such an arrangement may be used, for example, to provide redundancy or spare capacity. Such an arrangement may be used, for example, to provide better matching of memory traffic to interconnect resources (avoiding buses that are frequently idle, wasting power and space for example). In this case, the stacked memory package may use an i:j:k architecture where j>i, for example. For example, the stacked memory package may be a 1:1.2:1 architecture, where, in this case, a 20% redundancy, spare capacity, etc. of interconnect structures 28-310 may be used.

For example, as shown in FIG. 28-3, in one embodiment, one interconnect structure 28-310 may connect to (e.g. correspond to, be associated with, logically couple to, etc.) more than one memory portions 28-312. For example, in FIG. 28-3, four interconnect structures 28-310 may couple to eight memory portions 28-312 (on each stacked memory chip). In this case, the stacked memory package may use an i:j:k architecture where k>j, for example. For example, the stacked memory package may be a 1:1:2 architecture, where, in this case, there may be two memory portions or groups of memory portions (on each stacked memory chip) associated with each interconnect structure.

Note that the numbers of logic areas, interconnect structures, memory portions do not necessarily determine the architecture. For example, in FIG. 28-3, there may be four logic areas, four interconnect structures, 32 memory portions, but the architecture may be 1:1:2, etc.

Other, similar, different, further, derivative, etc. examples of architectures that may not be one-to-one-to-one (e.g. 2:1:1, 1:2:1, 1:1:2, etc.) and their uses may be described in one or more of the Figure(s) herein and/or Figure(s) in specifications incorporated by reference.

FIG. 28-4

FIG. 28-4 shows a stacked memory package architecture 28-400, in accordance with one embodiment. As an option, the stacked memory package architecture may be implemented in the context of the previous Figure(s) and/or any subsequent Figure(s). Of course, however, the stacked memory package architecture may be implemented in the context of any desired environment.

In FIG. 28-4, the stacked memory package may include one or more first groups of memory portions 28-410, etc. In FIG. 28-4, the memory portions, groups, components, etc. including the one or more first groups of memory portions 28-410 may be similar to those shown, for example, in FIG. 28-2.

In FIG. 28-4, the stacked memory package may include one or more second groups of memory portions 28-414. In FIG. 28-4, the memory portions, groups, components, etc. including the one or more second groups of memory portions 28-414 may be similar to those shown, for example, in FIG. 28-2.

In FIG. 28-4, the stacked memory package may include one or more memory portions 28-412. In FIG. 28-4, the memory portions, groups, components, etc. including the one or more memory portions 28-412 may be similar to those shown, for example, in FIG. 28-2.

In FIG. 28-4, the stacked memory package may include one or more buses 28-416, 28-418, 28-420, 28-422. In FIG. 28-4, the buses, etc. including the buses 28-416, 28-418, 28-420, 28-422 may be similar to those shown, for example, in FIG. 28-2.

In FIG. 28-4, the stacked memory package may include one or more memory chip logic functions 28-452. In FIG. 28-4, the one or more memory chip logic functions 28-452 may be similar to those shown, for example, in FIG. 28-2.

In FIG. 28-4, the stacked memory package may include a portion of an Rx datapath 28-472. As an option, the Rx datapath 28-472 may be implemented in the context of the previous Figure(s) and/or any subsequent Figure(s) and/or Figure(s) included in one or more specifications incorporated by reference. In FIG. 28-4, the portion of an Rx datapath 28-472 may include (but is not limited to): RxFIFO 28-462, RxARB 28-460. In FIG. 28-4, the RxFIFO 28-462 may include one or more copies of FIFO structure 28-474. In FIG. 28-4, FIFO structure 28-474 may include, for example, two lists (e.g. linked lists, register structures, tabular storage, etc.). For example, the two lists may include FIFO A and FIFO B. In FIG. 28-4, the RxFIFO 28-462 may store (e.g. maintain, capture, operate on, etc.) one or more commands (e.g. write commands, read commands, other requests, etc.) 28-470. The commands 28-470 may include one or more fields that may include (but are not limited to) the following fields: CMD (e.g. command, read, write, other request, etc.); ADDR (e.g. address field, other address information, etc.); TAG (e.g. identifying sequence number, command ID, etc.); DATA (e.g. write data for write commands, etc.).

Note that the term command (also commands, transactions, etc.) may be used in this specification and/or other specifications incorporated by reference to encompass (e.g. include, contain, describe, etc.) all types of commands (e.g.

as in command structure, command set, etc.), which may include, for example, the number, type, format, lengths, structure, etc. of responses, completions, messages, status, probes, etc. or may be used to indicate a read command or write command (or read/write request, etc.) as opposed (e.g. in comparison with, separate from, etc.) a read/write response, or read/write completion, etc. A specific memory technology (e.g. DRAM, NAND flash, PCM, etc.) may have (e.g. use, define, etc.) additional commands in a command set in addition to and/or as part of basic read and write commands. For example, SDRAM memory technology may use NOP (no command, no operation, etc.), activate, precharge, precharge all, various forms of read command or various types of read command (e.g. burst read, read with auto precharge, etc.), various write commands (e.g. burst write, write with auto precharge, etc.), auto refresh, load mode register, etc.

Note also that these technology specific commands (e.g. raw commands, test commands, etc.) may themselves form a command set. Thus, it may be possible to have a first command set, such as a technology-specific command set for SDRAM (e.g. NOP, precharge, activate, read, write, etc.), contained within a second command set, such as a set of packet formats used in a memory system network, for example.

Note also that the term command set may be used, for example, to describe the protocol, packet formats, fields, lengths, etc. of packets and/or other methods (e.g. using signals, buses, etc.) of carrying (e.g. conveying, coupling, transmitting, etc.) one or more commands, responses, requests, completions, messages, probes, status, etc. The command packets (e.g. in a network command set, network protocol, etc.) may contain codes, bits, fields, etc. that represent (e.g. stand for, encode, convey, etc.) one or more commands (e.g. commands, responses, requests, completions, messages, probes, status, etc.). For example, different bit patterns in a command field of a packet may represent a read request, write request, read completion, write completion (e.g. for non-posted writes, etc.), status, probe, technology specific command (e.g. activate, precharge, read, write, etc. for SDRAM, etc.), combinations of these and/or any other commands, etc.

Note further that command packets, in a memory system network for example, may include one or more commands from a technology-specific command set or that may be translated to one or more commands from a technology-specific command set. For example, a read command packet may contain instructions (or be translated to instructions, contain codes that result in, etc.) to issue an SDRAM precharge command. For example, a 64-byte read command packet may be translated (e.g. by one or more logic chips in a stacked memory package, etc.) to a group of commands. For example the group of commands may include one or more precharge commands, one or more activate commands, and (for example) eight 64-bit read commands to one or more memory regions in one or more stacked memory chips, etc. Note that a command packet may not always be translated to the same group of commands. For example, a read command packet may not always require a precharge command, etc.

The distinction between these slightly different interpretations, uses, etc. of the term command(s) may typically be inferred from the context. Where there may be ambiguity the context may be made clearer or guidance may be given, for example, by listing commands or examples of commands (e.g. read commands, write commands, etc.). Note that commands may not necessarily be limited to read commands and/or write commands (and/or read/write requests and/or any other commands, messages, probes, etc.). Note that the use of the term command herein should not be interpreted to imply that, for example, requests or completions are excluded or that any type, form, etc. of command is excluded. For example, in one embodiment, a read command issued by a CPU to a stacked memory package may be translated, transformed, etc. to one or more technology specific read commands that may be issued to one or more (possibly different) memory technologies in one or more stacked memory chips. Any command may be issued etc. by any system component etc. in this fashion. For example, in one embodiment, one or more read commands issued by a CPU to a stacked memory package may correspond to one or more technology specific read commands that may be issued to one or more (possibly different) memory technologies in one or more stacked memory chips. For example, a CPU may issue one or more native, raw, etc. SDRAM commands and/or one or more native, raw etc. NAND flash commands, etc. Any native, raw, technology specific, etc. command may be issued etc. by any system component etc. in this fashion and/or similar fashion, manner, etc.

Note that once the use and meaning of the term command(s) has been established and/or guidance to the meaning of the term command(s) has been provided in a particular context herein any definition or clarification, etc. may not be repeated each time the term is used in that same or similar context.

In FIG. 28-4, the lists etc. in FIFO structure 28-474 may contain information from (e.g. extracted from, copied from, stored, etc.) one or more commands (e.g. read commands, write commands, etc.). For example, FIFO A may store commands (or information associated with commands) that have odd addresses; and FIFO B may store commands or information associated with commands that have even addresses. In FIG. 28-4, memory portions 28-414 may be separated (e.g. collected, grouped, etc.) into two memory sets, groups, etc: one memory set labeled A and one memory set labeled B. For example, memory portions labeled A may correspond to (e.g. be associated with, etc.) memory portions with odd addresses and memory portions labeled B may correspond to memory portions with even addresses. Any technique of separation, any address bit(s) position(s), etc. may be used (e.g. separation is not limited to even and odd addresses, etc.). Any physical grouping may be used (e.g. groups, memory sets, etc. A and B may be on the same chip, on different chips, combinations of these and/or other groupings, etc.).

In FIG. 28-4, there may be two lists etc. in FIFO structure 28-474, but any number of lists may be used. In FIG. 28-4, there may be four entries for each FIFO, but any number may be used. In FIG. 28-4, the FIFO structure 28-474 may contain addresses, commands, portions of commands, pointers, linked lists, tabular data, and/or any other data, fields, information, flags, bits, etc. to maintain, control, store, operate on, etc. one or more commands etc.

In one embodiment, the RxARB and/or other control logic, etc. may order the execution (or schedule execution, etc.) of one or more commands stored (or otherwise maintained, etc.) in the FIFO structure(s). For example, the RxARB may cause the commands associated with (e.g. stored in, pointed to, maintained by, etc.) FIFO A to be executed (e.g. in cooperation, in conjunction with, etc. one or more memory controllers etc.) in a first time period, time slot, etc; and the commands associated with FIFO B to be executed in a second time period, time slot, etc.

For example, in FIG. 28-4, such use of the FIFO structure(s) may have the effect of (e.g. permit, allow, enable, etc.), for example, executing commands associated with memory portions 28-414 labeled A in a first time period and executing commands associated with memory portions 28-414 labeled B in a second time period. Such a design, architecture, etc. may be useful, for example, in controlling power dissipation, signal integrity, etc.

The effect of command reordering may thus be to segregate, separate, partition, etc. a group of memory portions (e.g. in a memory system, in a stacked memory package, in a stacked memory chip, in combinations of these, etc.) into one or more memory classes (as defined herein), memory sets, collections of memory portions, sets of memory portions, partitions, combinations of these and/or other groups, etc. Thus, for example, the effect of command reordering may be to provide an abstract view of the memory portions. For example, in this case, the memory system may act as (e.g. appear as, behave as, have an aspect of, etc.) one large physical assembly (e.g. structure, etc.) of memory portions. The abstract view in this case may be thus be one large memory structure, etc. The effect of command reordering in this case may be to have the memory structure be separated into two memory structures (e.g. virtual structures, etc.) each operating in a different time period (e.g. the logical view, etc.). Thus, for example, power dissipation properties, metrics, etc. of the memory structure may be reduced, improved, controlled, etc. relative to a memory structure without command reordering. In addition, for example, the location(s) of power dissipation may be controlled (e.g. density, hot spots, etc.). For example, if memory portion sets (memory sets) A and B are on the same stacked memory chip, then the power dissipation, power dissipation density, hot spots, etc. of each stacked memory chip may be reduced. For example, if memory sets A and B are on different memory chips then the power dissipation (e.g. power dissipation density, location(s) of power dissipation, timing of power dissipated, etc.) in a stack of stacked memory chips may be controlled, etc.

FIG. 28-5

FIG. 28-5 shows a stacked memory package architecture 28-500, in accordance with one embodiment. As an option, the stacked memory package architecture may be implemented in the context of the previous Figure(s) and/or any subsequent Figure(s). Of course, however, the stacked memory package architecture may be implemented in the context of any desired environment.

For example, the stacked memory package architecture may be implemented in the context of and/or used in combination with (e.g. parts or portions may be used together with, etc.) FIG. 18-12 of U.S. Provisional Application No. 61/679,720, filed Aug. 4, 2012, titled "SYSTEM, METHOD, AND COMPUTER PROGRAM PRODUCT FOR PROVIDING CONFIGURABLE COMMUNICATION PATHS TO MEMORY PORTIONS DURING OPERATION" and/or may use (e.g. may employ, may be combined with, etc.) one or more of the techniques described in the context of FIG. 18-12 of U.S. Provisional Application No. 61/679,720, filed Aug. 4, 2012, titled "SYSTEM, METHOD, AND COMPUTER PROGRAM PRODUCT FOR PROVIDING CONFIGURABLE COMMUNICATION PATHS TO MEMORY PORTIONS DURING OPERATION."

In FIG. 28-5, the memory chip interconnect network may include one or more copies of memory portions 28-510 (e.g. 28-512, 28-514, 28-516, 28-518, 28-520, 28-522, 28-524, 28-526, etc.). In FIG. 28-5, there may be nine memory portions, but any number may be used.

In one embodiment, as shown in FIG. 28-5, a first group of buses such 28-530, etc. (there may be 48 such buses of a first type, as shown in FIG. 28-5) may form part of a network on a single stacked memory chip.

In one embodiment, as shown in FIG. 28-5, buses such as 28-532, etc. (there may be 24 such buses of a second type, as shown in FIG. 28-5) may form a network or part of a network between two or more stacked memory chips and/or between one or more stacked memory chips and one or more logic chips.

In one embodiment, as shown in FIG. 28-5, a second group of buses such as 28-554, 28-556, etc. (there may be 24+24=48 such buses, 24 of a first type and 24 of a second type, as shown in FIG. 28-5) may form part of a network on a single stacked memory chip. For example, in FIG. 28-5, the combination of the first group of buses and the second group of buses may create a network in which each memory portion is connected to eight buses. Thus nine memory portions may be connected to 9×8=72 buses of the first type. Each of these buses may be connected to a bus of the second type but 48 buses of the first type may share a bus of the second type.

In FIG. 28-5, the memory portions, groups, components, buses, connections, network, etc. may be similar to those shown, for example, in FIG. 18-12 of U.S. Provisional Application No. 61/679,720, filed Aug. 4, 2012, titled "SYSTEM, METHOD, AND COMPUTER PROGRAM PRODUCT FOR PROVIDING CONFIGURABLE COMMUNICATION PATHS TO MEMORY PORTIONS DURING OPERATION."

In FIG. 28-5, the memory portions may be separated (e.g. collected, grouped, etc.) into two memory sets, groups, etc: one memory set labeled A (e.g. memory portion 28-510, etc.) and one memory set labeled B (e.g. memory portion 28-512, etc.). For example, memory portions labeled A may correspond to (e.g. be associated with, etc.) memory portions with odd addresses and memory portions labeled B may correspond to memory portions with even addresses. Any technique of separation, any address bit(s) position(s), etc. may be used. Any physical grouping may be used (e.g. groups, memory sets, sets, etc. A and B may be on the same chip, on different chips, combinations of these, etc.).

In FIG. 28-5, commands (e.g. read commands, write commands, etc.) may be executed on (e.g. issued to, directed to, etc.) one or more memory portions from (e.g. with source, selected from, etc.) one or more FIFO structures 28-574. For example, the FIFO structure 28-574 may be implemented in the context of FIG. 28-4. In FIG. 28-5, for example, commands with odd addresses may be executed on memory portions labeled A, and commands with even addresses may be executed on memory portions labeled B. This may have the effect of spreading power dissipation for example.

In one embodiment, the commands in FIFO A may be issued (e.g. executed, etc.) at a first time period, time slot, etc; and the commands from FIFO B may be issued (e.g. executed, etc.) at a second time period, time slot, etc.

In one embodiment, the commands in FIFO A and FIFO B may be issued (e.g. executed, etc.) at a the same time period, same time slot, etc.

In one embodiment, the FIFO structures may not be strictly first-in first-out. For example, commands stored in the FIFOs may have traffic class information, virtual channel information, memory class information, combinations of these and/or or other priority information, etc. Thus the FIFO structure may be a list of commands that may be executed in an order other than strict first-in first-out, etc.

In one embodiment, the times (e.g. time period, time slot, etc.) that commands in FIFO A and/or FIFO B may be issued (e.g. executed, etc.) may be programmable (e.g. at design time, at manufacture, at assembly, at test, at start-up, during operation, at combinations of these times, etc.). For example, in a high-power, high-performance mode, commands may be issued from FIFO A and FIFO B at the same time. For example, in a low power mode, commands may be issued from FIFO A in a first time slot and commands may be issued from FIFO B in a second time slot, etc.

In one embodiment, the order that commands in FIFO A and/or FIFO B may be issued (e.g. executed, performed, completed, etc.) may be programmable (e.g. at design time, at manufacture, at assembly, at test, at start-up, during operation, at combinations of these times, etc.).

In FIG. 28-5, there may be two memory sets (e.g. A and B) of memory portions, but any number of memory sets may be used. In FIG. 28-5, there may be two FIFOs, but any number of FIFOs may be used (e.g. the number of FIFOs may be different from the number of memory sets of memory portions, etc.).

In one embodiment, the memory portions in memory set A and the memory portions in memory set B may be physically located on the same stacked memory chip. In one embodiment, the memory portions in memory set A and the memory portions in memory set B may be physically located on different stacked memory chips.

In one embodiment, the command bus, address bus, data bus, etc. may be shared between memory set A and memory set B. Thus, for example, commands with odd addresses may be executed on memory portions labeled A (e.g. memory portion 28-510, etc.) using buses such as 28-532 in a first time slot; and commands with even addresses may be executed on memory portions labeled B (e.g. memory portion 28-512, etc.) using the same buses (e.g. 28-532, etc.) in a second time slot.

In one embodiment, the buses such as bus 28-532 and bus 28-530 may operate at different frequencies. Thus, for example, commands, address, data, etc. may be placed on buses such as 28-532 for both memory sets A and B at a first frequency; and commands, address, data, etc. may be driven onto buses 28-530 at a second frequency. In one embodiment, for example, the second frequency may be half the first frequency. In this case, the execution of commands on memory set A may be alternated (e.g. interleaved, etc.) with the execution of commands on memory set B. Any number of memory sets may be used. Any number of multiplexed buses per memory portion may be used. Any arrangement of buses (e.g. multiplexed, non-multiplexed, etc.) may be used.

In one embodiment, one or more (including all) commands in a FIFO may be executed (e.g. performed, issued, etc.) at one time. For example, there may be FIFOs for each memory controller, for a memory address range (which may correspond to a part or one or more portions of a stacked memory chip, one or more banks on a stacked memory chip, part of portions of a bank of a stacked memory chip, a group of memory portions on a stacked memory chip, combinations of these and/or other collections, sets, groups of memory portions, etc.). For example, the FIFO contents may be sorted, arranged, collected, etc. according to one or more sections, echelons, and/or other groups of memory portions. For example, commands in a FIFO may be sorted, collected, prioritized, batched, etc. One or more commands may be executed when a threshold or other parameter, setting etc. is reached. For example, commands may be executed when a number (e.g. threshold setting, etc.) of commands that may access the same page, row, etc. of a memory portion are present in a FIFO.

In one embodiment, one or more (including all) commands in a FIFO may be executed when the FIFO is full. For example, commands may be accumulated, stored, queued, etc. (e.g. in one or more FIFOs, etc.) and may be executed, issued, performed, transmitted, etc. when one or more criteria (such as one or more commands accessing the same page, row, etc. are met, etc.). If the one or more criteria are not met, but the FIFO is full, then one or more commands may be executed according to an algorithm. For example, one or more commands may be executed in order (e.g. oldest first, first in FIF first, highest priority in FIFO first, etc.).

In one embodiment, one or more (including all) commands in a FIFO may be executed before the FIFO is full. For example, in one embodiment, the normal behavior of execution (e.g. issuing of one or more commands, etc.) may be to wait until the FIFO is full to allow commands to be combined, etc. In one embodiment, commands may be issued as soon as sufficient commands are present in the FIFO to make an efficient access. For example, if two commands are present in the FIFO to adjacent addresses (e.g. contiguous addresses, etc.), a rule may be programmed, configured, etc. that these commands are always executed as soon as that determination is made, etc.

In one embodiment, there may be FIFOs for a fixed or programmable number (e.g. group, collection, memory set, set, etc.) of memory portions. For example, the number of FIFOs may be equal to the number of memory controllers which may be equal to the number of echelons, etc. Any number of FIFOs, memory controllers, memory portions, groups of memory portions, etc. may be used.

In one embodiment, commands may be staged. For example, in one embodiment, part or parts of one or more commands in FIFO A may be executed in a first time slot t1, and part(s) of one or more commands in FIFO B may be executed in a second time slot t2, etc. This may allow some of the command execution (e.g. parts of a command pipeline, etc.) to be overlapped for one or memory sets, etc.

In one embodiment, commands may be sorted within a FIFO. For example, reads and writes may be sorted. For example, this may allow groups and sub-groups of commands to be scheduled, arranged, ordered, batched, staged, etc.

In one embodiment, commands may be ordered with (e.g. based on, sorted with, etc.) more than one field. For example, commands may be ordered by TAG (e.g. sequence number, etc.) at a first level with ADDR (e.g. address, etc.) at a second level. Any number of levels may be used. Any fields (e.g. from command, etc.) and/or other information, etc. may be used. The fields and/or algorithms used for command sorting, ordering, etc. may be fixed or programmable. Programming and/or configuration of fields and/or algorithms used for command sorting, etc. may be programmed and/or configured, changed etc. at design time, at manufacture, at test, at assembly, at start-up, during operation, at combinations of these times and/or at any time, etc.

FIG. 28-6

FIG. 28-6 shows a stacked memory package architecture 28-600, in accordance with one embodiment. As an option, the stacked memory package architecture may be implemented in the context of the previous Figure(s) and/or any subsequent Figure(s). Of course, however, the stacked memory package architecture may be implemented in the context of any desired environment.

In FIG. 28-6 the stacked memory package architecture 28-600 may include four stacked memory chips 28-612 and one logic chip 28-626. Any number N of stacked memory chips and any number of logic chips may be used. The logic chips and stacked memory chips may be connected (e.g. coupled, interconnected, etc.) using one or more TSVs 28-610 (e.g. TSV arrays, collection of TSVS, group(s) of TSVs, other TWI, etc.). In FIG. 28-6, the TSVs, TSV arrays, etc. may be represented by a single dashed line that may represent tens, hundreds, thousands, etc. of vias, metal lines, interconnect structures, combinations of these, etc. that may act to couple one or more logic chips with one or more stacked memory chips in a stacked memory package, etc.

In FIG. 28-6 each of the plurality of stacked memory chips may include one or more memory portions (e.g. memory arrays, groups of memory devices, etc.) 28-614. For example, in FIG. 28-6, a single stacked memory chip may contain a memory array that contains 8 memory portions, each of which may contain memory elements, memory devices, memory cells, other circuits, etc. In FIG. 28-6 each of the memory arrays and/or memory portions may include one or more memory subarrays (e.g. groups, collections, sets, of memory devices, memory cells, etc.). In FIG. 28-6, each stacked memory chip and/or memory array may contain eight memory portions, but any number AA of memory portions, memory arrays etc. may be used (including extra memory arrays, memory portions, etc. and/or spare memory arrays, memory portions, etc. for repair purposes, etc.). In FIG. 28-6 each memory array, memory portion, etc. may contain any number S of memory subarrays (including extra, redundant, spare, etc. memory subarrays and/or spare memory subarrays for repair purposes, etc.).

For example, as an option, the stacked memory package architecture 28-600 may be implemented in the context of FIG. 15-2 and/or FIG. 15-3 of U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY." For example, the buses, bus design, bus architectures, bus structures, bus functions, multiplexing, etc. of the stacked memory package architecture 28-600 may be implemented in the context of FIG. 15-2 and/or FIG. 15-3 of U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY." For example, the explanations, descriptions, etc. accompanying FIG. 15-2 and/or FIG. 15-3 of U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY" including (but not limited to): interconnection, buses, multiplexing, demultiplexing, bus splitting, bus aggregation, bus joining, bus coupling, use of TSVs, and/or other algorithms, functions, behaviors, etc. may equally apply to (e.g. may be employed with, may be incorporated in whole or part with, may be combined with, etc.) the architecture of the stacked memory package architecture 28-600.

This specification and specifications incorporated by reference may employ a notation (e.g. shorthand, terminology, etc.) for the structure (e.g. hierarchy, architecture, connections, etc.) of a 3D memory, stacked memory package, etc. The notation may use a numbering of the smallest elements of interest (e.g. components, macros, circuits, blocks, groups of circuits, etc.) at the lowest level of the hierarchy (e.g. at the bottom of the hierarchy, at the leaf nodes of the hierarchy, etc.). A group (e.g. pool, matrix, collection, assembly, set, range, etc.), and/or groups as well as groupings of the smallest element may then be defined using the numbering scheme. Further the electrical, logical and other properties, relationships, etc. of elements may be similarly may be defined using the numbering scheme.

For example, memory portions may be numbered. The memory portions may be numbered 0, 2, 3, . . . , AA where AA (as defined herein and/or in one or more specifications incorporated by reference) may be the total number of memory portions (or memory arrays, etc.) in the stacked memory package (or memory system, etc.). For example, the smallest element of interest, at the hierarchical level of memory portions, in a stacked memory package may be a bank of a SDRAM stacked memory chip. The bank may be 32 Mb, 64 Mb, 128 Mb, 2565 Mb in size, etc. For example, in FIG. 28-6, the memory portions may be numbered 0-31 (or 00-31, etc.).

For example, TSVs and TSV arrays may be numbered. For example, the smallest element of interest, at the hierarchical level of interconnect structures, in a stacked memory package may be a TSV array that may contain data, address, command, etc. information. The TSV arrays may be numbered 0, 2, 3, . . . , TT where TT is the total number of TSV arrays in the stacked memory package (or memory system, etc.). For example, in FIG. 28-6, the TSV arrays may be numbered 0-3 (or 00-03, etc.).

For example, logic areas may be numbered. For example, the smallest element of interest, at the logic level of one or more logic chips, in a stacked memory package may be a logic area of a logic chip. The logic areas may be numbered 0, 2, 3, . . . , LL where LL is the total number of logic areas on the logic chips in the stacked memory package (or memory system, etc.). For example, in FIG. 28-6, the logic areas may be numbered 0-3 (or 00-03, etc.).

In a first design for a stacked memory package, based on FIG. 28-6 for example, the memory portion may correspond to a bank. In FIG. 28-6, for example, there may be 8 banks (e.g. memory portions, etc.) on each of 4 stacked memory chips (e.g. AA=8, N=4, etc.). The banks may be numbered 0-7 on the first stacked memory chip, for example and similarly sequentially numbered for the other stacked memory chips, as may be shown in FIG. 28-6. In this first design, four banks may make up a bank group, and these banks may be numbered 0, 1, 2, 3, for example. In this first design, there may be four stacked memory chips in a stacked memory package. In this first design, for example, an echelon may be defined as a group of banks comprising banks 0, 8, 16, 24.

It should be noted that a bank has been used as the smallest element of interest only as an example here in this first design. For example, banks need not be present in all designs. For example, the memory portions may not be banks. For example, each memory portion may include more than one bank (e.g. a memory portion may contain two banks, four banks, eight banks, or any number, etc.). In this case, the number of banks on a stacked memory chip may be BB. For example, if there are two banks per memory portion, with eight memory portions on each stacked memory chip, then AA=8 and BB=16. In this case, for example in FIG. 28-6, an echelon may be defined as a group of memory portions (e.g. 0, 8, 16, 24, etc.) that may contain 8, 16, 32 banks, etc.

It should thus be noted that a bank has been used as a memory portion and as the smallest element of interest only as an example, any element at any level of hierarchy may be used (e.g. array, subarray, bank, subbank, group of banks, group of subbanks, group of arrays, group of subarrays, other memory portions(s), group(s) of memory portion(s), other portions(s), group(s) of portion(s), combinations of these, etc.).

The terms array and subarray may be used to describe the hierarchy of memory blocks within a chip. A memory array (or array) may be any shaped (e.g. regular shape, square, rectangle, other shape, collection of shapes, etc.) collection (e.g. group, set, etc.) of memory cells and possibly include their associated (e.g. peripheral, driver, local, etc.) circuits. A memory subarray (also just subarray) may be part (e.g. one or more portions, etc.) of a memory array. In one configuration the memory arrays may be banks (or equivalent to a standard SDRAM bank, correspond to a bank in a standard SDRAM part, etc.). In one configuration, the memory arrays may be bank groups (or be equivalent to a bank group in a standard SDRAM part, correspond to a bank group in a standard SDRAM part, etc.). In one configuration, subarrays need not be used. In one configuration, the subarrays may be subbanks (e.g. a subarray may comprise a portion of a bank, or portions of a bank, or portions of more than one bank, etc.). In one configuration, the subarrays may be banks themselves. For example, each bank may be a group (e.g. a bank group, etc.) of banks, etc. (e.g. a bank may be a bank group comprising four banks, etc.). Any configuration of banks and/or subarrays and/or subbanks and/or other memory portion(s) and/or other portion(s) and/or collection(s) of memory chip(s) (e.g. mats, arrays, blocks, parts, etc.) may be used. Any type of memory technology (e.g. NAND flash, PCRAM, PCM, combinations of these and/or other memory technologies, etc.) and/or memory array organization(s) may equally be used for one or more of the memory arrays and/or portion(s) of the memory arrays. The configuration (e.g. portioning, partitioning, allocation, connection, grouping, collection, arrangement, logical coupling, physical coupling, assembly, etc.) of the memory portion(s) (e.g. arrays, subarrays, banks, subbanks, mats, blocks, groups, subgroups, circuits, blocks, sectors, planes, pages, ranks, rows, columns, combinations of these and/or other collections, sets, groups, etc.) may be fixed (e.g. at design, during manufacture, at test, at assembly, combinations of these, etc.) or variable (e.g. programmable, configurable, reconfigurable, adjustable, combinations of these, etc.) at design, manufacture, test, assembly, start-up, during operation, combinations of these, etc.

For example, the stacked memory package in FIG. 28-6 may contain 32 (e.g. AA=8, N=4, 32=8×4, etc.) memory portions (e.g. banks, subbanks, etc.). Any number, arrangement, configuration, connection, interconnection, etc. of memory portions may be used. The 32 memory portions may be configured in (e.g. viewed in, accessed in, regarded in, appear logically in, etc.) a flexible manner. For example, the 32 memory portions may be configured as 32 individual memory portions, as eight groups of four memory portions, as 16 groups of two memory portions. The memory portions may also be logically viewed as one or more collection(s) of memory portions with possibly different properties than the individual memory portions. For example, the 32 memory portions may be configured as 32 banks, eight bank groups of four banks, 16 bank groups of two banks, etc. Similarly if each memory portion contains more than one bank, any organization of banks, bank groups, etc. may be used. For example, if each memory portion contains two banks, then 64 banks may be arranged as 32 bank groups of two banks, etc. Any number of memory portions may be used. For example, the memory portions may be configured as one or more sections (as defined herein and/or in one or more specifications incorporated by reference). For example, the memory portions may be configured as one or more echelons (as defined herein and/or in one or more specifications incorporated by reference). For example, the memory portions may be configured as one or more memory classes (as defined herein and/or in one or more specifications incorporated by reference). For example, the memory portions may be configured as one or more ranks, planes, pages, sectors, combinations of these and/or any other grouping, collections, sets, etc. of memory portions. The configuration of memory portions may be fixed or may be programmable. The programming may be performed at design time, at manufacture, at test, at assembly, at start-up, during operation, at combinations of these times, and/or any other time, etc.

The memory portion(s) (e.g. arrays, subarrays, banks, subbanks, mats, blocks, groups, subgroups, circuits, blocks, sectors, planes, pages, ranks, rows, columns, combinations of these, etc.) may be combined between chips (e.g. physically coupled, logically coupled, etc.) to form additional hierarchy. For example, one or more memory portions may form an echelon, as described elsewhere herein and/or in specifications incorporated by reference. For example, one or more memory portions may form a section, as described elsewhere herein and/or in specifications incorporated by reference (e.g. a portion of an echelon, a vertical or other collection of memory portions in a 3D array, a horizontal or other collection of memory portions in a 3D array, etc.). For example, one or more memory portions may form a DRAM plane or other memory plane, as described elsewhere herein and/or in specifications incorporated by reference (e.g. a collection of memory portions on a DRAM chip, etc.).

One or more memory portion(s) (e.g. arrays, subarrays, banks, subbanks, mats, blocks, groups, subgroups, circuits, blocks, sectors, planes, pages, ranks, rows, columns, combinations of these, etc.) of different memory technologies may be combined between chips, between parts of chips, etc. (e.g. physically coupled, logically coupled, assembled, combinations of these, etc.) to form additional hierarchy and/or structure, etc. For example, one or more NAND flash planes may be combined with one or more DRAM planes, etc.

For example, the stacked memory package in FIG. 28-6 may contain four (e.g. TT=4, etc.) TSV arrays (e.g. collections of TSV interconnect structures, combinations of metal traces, vias, TSV and/or other TWI, etc.). Any number, arrangement, configuration, connection, interconnection, etc. of TSVs, TSV arrays, and/or other interconnect structures, etc. may be used. Note the TSV array may include wires, traces, lines, conductors, connectors, vias, pillars, posts, plugs, paths, etc. as well as TSV and/or other TWI structures. The four TSV arrays may be configured in (e.g. viewed in, accessed in, regarded in, appear logically in, etc.) a flexible manner. For example, the four TSV arrays may be constructed (e.g. programmed, configured, etc.) from a pool, collection, set, etc. of interconnect resources to account for failures, defects, etc. For example, one or more TSVs, TSV arrays, parts or portions of TSV arrays, and/or other TWI structures and/or other interconnection resources (e.g. circuits, transistors, vias, wires, pillars, plugs, conductor paths, metal traces, lines, conductors, combinations of these and/or other interconnection structures, etc.) may fail during manufacture, test, operation, etc. and be replaced by one or more spare, redundant, pool members, interconnect resources, etc. In one embodiment, the functions (e.g. coupling functions, etc.) of the TSV arrays may be performed by electrical (e.g. metal conductor, etc.) and/or optical and/or other coupling techniques, etc.

In FIG. 28-6, the one or more TSV arrays may include one or more data buses. Any organization, width, technology, multiplexing, type (e.g. unidirectional, bidirectional, etc.), etc. may be used for the data buses. In FIG. 28-6, one or more TSV arrays may include (e.g. logically include, electrically consist of, form, carry, etc.) one or more command buses. Any organization, width, technology, multiplexing, type (e.g. unidirectional, bidirectional, etc.), etc. may be used for the command buses. In FIG. 28-6, one or more TSV arrays may include one or more address buses. Any organization, width, technology, multiplexing, type (e.g. unidirectional, bidirectional, etc.), etc. may be used for the address buses. In one embodiment, the command and address bus may be multiplexed (e.g. time multiplexed, etc.).

For example, one possible organization for the data bus DB (e.g. one copy of the data bus, etc.) may be a parallel bus. For example, a 16-bit wide or 32-bit wide bus may be used, but any bit width DBW (as defined herein and/or in one or more specifications incorporated by reference) may be used (e.g. 4, 8, 16, 32, 64, 128, 256, 512, 1024, etc.). The bit widths may be fixed or programmable. The number of bits provided by each memory portion may also be fixed or programmable. For example, the memory portions may be banks or a group of banks (e.g. 2, 4, 8, 16, etc.). For example, the number of bits provided by each bank may be equal to the bank access granularity BAG (as defined herein and/or in specifications incorporated by reference). It should be noted that access granularity (and abbreviation BAG, notation(s) with BAG, etc.) may apply to any type of array that is used (e.g. bank, subbank, subarray, echelon (as defined herein and/or in specifications incorporated by reference), section (as defined herein and/or in specifications incorporated by reference), combinations of these and/or any other memory portions, memory classes, etc.). It should be noted that data bus width (and abbreviation DBW, notation(s) with DBW, etc.) may apply to any data bus and that DBW may be different for different data buses (e.g. different copies of data buses, data buses connected to different parts or portions of a stacked memory chip, different parts of the data bus architecture, etc.). For example, the data bus width connected to a bank on a stacked memory chip may be different from the data bus width connected to a logic area on a logic chip. Thus, for example, the data bus width between logic chip and stacked memory chips may be D (as defined herein and/or in one or more specifications incorporated by reference). Thus for example, the data bus width at the input of the data I/F etc. (e.g. on the write datapath, etc) may be DW (as defined herein and/or in one or more specifications incorporated by reference). Thus for example, the data bus width at the output of the data I/F etc. (e.g. on the write datapath, etc) may be DW1 (as defined herein and/or in one or more specifications incorporated by reference). Thus for example, the data bus width at the output of the read FIFO etc. (e.g. on the read datapath, etc) may be DR (as defined herein and/or in one or more specifications incorporated by reference). Thus for example, the data bus width at the input of the read FIFO etc. (e.g. on the read datapath, etc) may be DR1 (as defined herein and/or in one or more specifications incorporated by reference). Thus for example, the data bus width at the input of the IO gating logic etc. (e.g. on the read/write datapath at or close to the sense amplifiers, etc) may be D1 (as defined herein and/or in one or more specifications incorporated by reference). Depending on the stacked memory package architecture, the TSV arrays may carry data information at any point in the datapath. For example, the TSV arrays may carry information between the read FIFOs and/or data I/F and memory portions, between the PHY layer (and/or associated logic) and the read FIFO and/or data I/F, etc. Thus, for example, the position (e.g. electrical location, etc.) of the TSV arrays may depend on the location (e.g. architecture, design, etc.) of such circuit blocks, functions, etc. as the read FIFO and/or data I/F. For example, the read FIFOs and/or data I/F may be located on the logic chips, on the stacked memory chips, or distributed between the logic chips and stacked memory chips, etc. Thus, for example, depending on the architecture of the logic and the connections between logic chips and the stacked memory chips (e.g. depending on the partitioning of logic between logic chips and/or stacked memory chips, and/or multiplexing of buses, etc.) the data buses included in the TSV arrays may be of width DBW, D, (DR+DW), (DR1+DW1), or any width.

For example, one possible organization for the address bus AB (e.g. one copy of the address bus, etc.) may be a parallel bus. For example, a 16-bit wide address bus may be used, but any bit width ABW may be used (e.g. 4, 5, 6, 7, 8, 9, 10, 11, 12, 13, 14, 15, 16, etc.). The bit widths may be fixed or programmable. Programming may be performed at any time, etc. The address bus widths may depend on the size of the memory portion and the number of bits provided by each memory portion. For example, a memory portion may be a bank of size AS bits, with BAG=16. In this case, if AS=1024 bits, for example, ABW may be equal to log(2) [AS/BAG]=log(2) 64=8 bits, etc. It should be noted that address bus width (and abbreviation ABW, notation(s) with ABW, etc.) may apply to any address bus and that ABW may be different for different address buses (e.g. different copies of address buses, address buses connected to different parts or portions of a stacked memory chip, different parts of the address bus architecture, etc.). For example, the address bus width connected to a bank on a stacked memory chip may be different from the address bus width connected to a logic area on a logic chip. For example, the address bus may be split at various points in the address path. For example, part of the address bus may be used as a bank address. For example, part of the address bus may be used as a row address. For example, part of the address bus may be used as a column address. Thus, for example, the address bus width between logic chips and stacked memory chips in a stacked memory package may be A (as defined herein and/or in one or more specifications incorporated by reference). Thus, for example, the address bus width between address register etc. and row address MUX etc. may be RA (as defined herein and/or in one or more specifications incorporated by reference). Thus, for example, the address bus width between address register etc. and bank control logic etc. may be BA (as defined herein and/or in one or more specifications incorporated by reference). Thus, for example, the address bus width between address register etc. and column address latch etc. may be CA (as defined herein and/or in one or more specifications incorporated by reference). Thus, for example, the address bus width between row address MUX etc. and row decoder etc. may be RA1 (as defined herein and/or in one or more specifications incorporated by reference). Thus, for example, the address bus width between bank control logic etc. and bank etc. may be BA1 (as defined herein and/or in one or more specifications incorporated by reference). Thus, for example, the address bus width between column address latch etc. and column decoder etc. may be CA1 (as defined herein and/or in one or more specifications incorporated by reference). Thus, for example, the address bus width between column address latch etc. and read FIFO etc. may be CA2 (as defined herein and/or in one or more specifications incorporated by reference). Thus, depending on the architecture of the connections between logic chips and the stacked memory chips (e.g. depending on the partitioning of logic between logic chips and/or stacked memory chips, and/or multiplexing of buses, etc.) the address buses included in the TSV arrays may be, for example, of width A, (RA+BA+CA), or any width.

For example, one possible organization for the command bus CB (e.g. one copy of the command bus, etc.) may be a parallel bus. For example a 16-bit wide command bus may be used, but any bit width CBW may be used (e.g. 4, 5, 6, 7, etc.). The bit widths may be fixed or programmable. The command bus widths may depend on the size of the memory portion, and/or the type of memory portion (e.g. bank, group of banks, other memory portion, etc.), and/or the number of bits provided by each memory portion, combinations of these and other factors, etc. Thus, depending on the architecture of the connections between logic chips and the stacked memory chips (e.g. depending on the partitioning of logic between logic chips and/or stacked memory chips, and/or multiplexing of buses, etc.) the command buses included in the TSV arrays may be of any width.

In one embodiment, one or more of the data and/or command and/or address buses may include error coding. Error coding may include one or more error codes (e.g. fields, extra bits, extra information, combinations of these and/or other error coding information, etc.). Thus, for example, data buses may be 18 bits in width with 16 bits of data and 2 bits of error coding, or may be 36 bits in width with 4 bits of error coding, but any width of data and any widths of error coding may be used. Similarly, address and/or command buses and/or other groups, collections, bundles, sets of signals, etc. may use any width to carry information and/or carry error coding or similar error protection information, etc.

The stacked memory package in FIG. 28-6 may contain four (e.g. LL=4, etc.) logic areas (e.g. collections of circuits, memory controllers, groups of memory controllers, combinations of these and/or other circuits, etc.). Any number, arrangement, configuration, connection, interconnection, etc. of logic areas and/or other circuits, etc. may be used. The four logic areas may be configured in (e.g. viewed in, accessed in, regarded in, appear logically in, etc.) a flexible manner. For example, the four logic areas may be constructed (e.g. programmed, configured, etc.) from a pool, collection, set, etc. of circuit resources to account for failures, defects, different modes of operation, etc. For example, one or more logic areas (e.g. circuits, transistors, vias, metal traces, conductors, combinations of these and/or other circuits and/or interconnection structures, etc.) and/or other components, etc. may fail during manufacture, test, operation, etc. and be replaced by one or more spare circuit, component, and/or interconnect elements, redundant elements, members of one or more pools of resources, interconnect resources, combinations of these and/or other resources, etc.

A sequence (as defined herein and/or in one or more specifications incorporated by reference) may show (e.g. illustrate, demonstrate, etc.) the bits on, for example, the data bus at successive time slots. For example, in one design of a stacked memory package there may be four stacked memory chips (N=4); four memory arrays with four banks (e.g. a subarray, etc.) in each memory array. Any number of banks, subarrays, etc. S (e.g. within a memory portion, etc.) may be used. In this case, a memory portion may be considered to be a memory array or a subarray. Since the subarray (e.g. bank, etc.) may be the smallest element of interest in this case, the memory portion may be considered to correspond to a bank. Thus, in this case, there may be 16 banks (e.g. memory portions, subarrays) per stacked memory chip. Thus, in this case, the number of memory portions (AA=16) may be considered equal to the number of banks (BB=16). There may thus, in this case, be 64 banks in a stacked memory package.

In one configuration the data bus may be 32 bits wide (DBW=32). In one configuration subarrays may provide 32/4=eight bits each (BAG=8). For example, at time slot 0 the data bus may be driven with bits from banks (e.g. memory portions, subarrays, etc.) 00, 01, 02, 03. The behavior of the data bus 0 may be represented by sequence SEQ1A:

SEQ1A: 00/01/02/03/04/05/06/07/08/09/10/11/12/13/14/15 (BAG=8, DBW=32).

SEQ1A may, for example, correspond to 16/(32 (DBW)/8 (BAG))=4 time slots.

For example, in one configuration BAG=32 and DBW=32 and the data bus behavior may correspond to the following sequence SEQ2A:

SEQ2A: 00/04/08/12; BAG=32 and DBW=32.

In SEQ2A data from banks (e.g. memory portions, subarrays, etc.) possibly in different memory arrays may thus be interleaved.

The number of subarrays S, the number of memory arrays AA, the number of stacked memory chips N may be any number. For example, if S=2, AA=16, N=4, DBW=32, BAG=16 there may be 32 subarrays on each stacked memory chip (SMC). For example, subarrays 0-31 may be located on stacked memory chip 0 (SMC0), subarrays 32-63 on SMC1, 64-95 on SMC2, subarrays 96-127 on SMC3. For example, in this case, one configuration of the data bus behavior may correspond to sequence SEQ3A:

SEQ3A: 00/01/32/33/64/65/96/97/00/01/32/33/64/65/96/97; DBW=32, BAG=16.

In sequence SEQ3A data from subarrays (e.g. subarrays 00 and 01, etc.) on SMC0 (e.g. possibly in the same section, as defined herein and/or in one or more specifications incorporated by reference) may be interleaved to form the first 32 bits (e.g. 16 bits from each subarray, etc.) in time slot t0. In time slot t1, data from subarrays 32, 33 (e.g. on SMC1, etc.) may be interleaved, and so on. For example, subarrays 00, 01, 32, 33, 64, 65, 96, 97 may form an echelon (as defined herein and/or in one or more specifications incorporated by reference).

For example, in one configuration BAG=128, DBW=32. In this case, data (128 bits) from an access (e.g. to subarray 00) may be multiplexed onto the data bus such that 32 bits are transmitted in each of four consecutive time slots and the data bus behavior may correspond to sequence SEQ9A:

SEQ9A: 00/01/00/01/00/01/00/01; BAG=128, DBW=32.

In SEQ9A, two accesses (e.g. one to subarray 00, one to subarray 01) may be multiplexed (e.g. in an interleaved fashion, etc.) such that 256 bits (e.g. 128 bits to/from subarray 00 and 128 bits to/from subarray 01, etc.) may be transmitted, for example, in eight consecutive time slots. Any number of time slots may be used. The time slots need not be consecutive. Any number of interleaved data sources may be used (e.g. any number of subarrays, etc.). Any data bus width (DBW) and/or any size bank access granularity (BAG) or access granularity to any other array type(s) (e.g. subarray, bank, memory portion, section, echelon, combinations of these, etc.) may be used.

In FIG. 28-6, commands (e.g. write commands, read commands, other requests, etc.) may be re-ordered, prioritized, selected, or otherwise manipulated, changed, altered, etc. to modify the behavior of one or more buses. For example, commands may be ordered so that access may be alternated between one or more groups of memory portions. For example, in FIG. 28-6 memory portions 0, 2, 4, . . . 30 (e.g. even numbered memory portions) may form a first memory set (or set, collection, etc.) A. For example, in FIG. 28-6 memory portions 1, 3, 5, . . . 31 (e.g. odd numbered memory portions) may form a second memory set B. For example, commands may be ordered so that only memory portions from memory set A may be accessed in a first time period and only memory portions from memory set B may be accessed in a second time period. For example, commands may be ordered by address e.g. commands with address x1xxx may be directed to memory set A and commands with address x0xxx may be directed to memory set B, where x in these addresses may be binary 0 or 1 (e.g. don't care, etc.). Any address lengths may be used. Any bit pattern(s) in any address(es) may be used to direct one or more commands to one or more memory sets, etc. Commands may be ordered by any technique on any basis (e.g. command content, type, etc.). For example, commands may be sorted by read/write, by read length, by write length, by type of command (e.g. masked write, write with completion, etc.), by address, by memory class (as defined herein and/or in one or more specifications incorporated by reference), by tag, by priority, by data content, by other command field(s) and/or information, by timestamp, by combinations of these and/or any other data and/or information associated with and/or included in one or more commands, requests, etc.

In different configurations, modes, operating modes, etc. other groupings (e.g. formations of sets, collections, etc.) of memory portions are possible. For example, memory sets may be constructed so that the memory portions form one or more physical patterns (e.g. regular patterns, shapes, other arrangements, etc.). For example, in order to reduce power consumption, signal interference, power supply noise, and/or other signal integrity problems etc. a checkerboard pattern (e.g. looking like a checkerboard, looking like a chess board, etc.) of access may be programmed. For example, in FIG. 28-6, a checkerboard pattern may be formed on the memory chip that may include memory portions 0-7. For example, memory portions 0, 2, 5, 7 may form black regions (e.g. a first memory set of memory portions, etc.) of a checkerboard pattern; and memory portions 1, 3, 4, 6 may form white regions (e.g. a second memory set, etc.) of a checkerboard pattern. Thus, memory portions 0, 2, 5, 7 may form a memory set C and memory portions 1, 3, 4, 6 may form a memory set D. In one configuration, for example, access may be restricted to memory set C in a first time period and be restricted to memory set D in a second time period. Use of a checkerboard or other pattern of memory portions may reduce interference between adjacent memory portions, for example. Any pattern may be used to form one or more memory sets of memory portions. Patterns may be used to form memory sets for any reason (e.g. signal integrity, power supply noise, latency control, command prioritization, refresh control, timing, protocol, combinations of these and/or other memory system metrics, etc.)

Memory sets of memory portions (e.g. sets) may be formed in any manner. Memory sets may be formed by design and/or programmed. Memory sets may be fixed and/or flexible. Programming (e.g. formation, etc.) of one or more memory sets may be performed at design time, manufacture, assembly, test, start-up, during operation, at combinations of these times and/or at any time, etc. Patterns used to form one or more memory sets and thus memory set membership, etc. may also be programmed at any time.

For example, commands may be ordered so that access to memory portions may be programmed differently for different types of access. For example, different memory sets may be used for reads than for writes. For example, different memory sets may be used for reads/writes than for other commands and/or requests. For example, different memory sets may be used for refresh than for other commands and/or requests.

Combinations of memory sets may be used (e.g. sets of sets, sets of groups, collections of sets, etc.). Thus, for example, memory sets A and B (as described above, for example) may be used for a first function (e.g. write command, other requests type, etc.) and memory sets C and D (as described above, for example) may be used for a second function (e.g. refresh, other command, etc.), etc.

The members of each memory set may be programmed (e.g. by user, by the system, by OS, by BIOS, by software, by firmware, by combinations of these and/or other techniques, etc.). For example, memory set membership may be programmed using one or more commands directed at a stacked memory package and stored on one or more logic chips. Memory set membership may be programmed (or re-programmed, modified, altered, etc.) by any techniques. Memory set membership may be stored (e.g. in one or more tables, lists, databases, dictionaries, etc.) in one or more volatile or non-volatile memories (e.g. DRAM, SRAM, NVRAM, NAND flash, registers, combinations of these and/or other storage components, etc.) in one or more stacked memory packages in a memory system. For example, memory set membership may be stored in NVRAM on one or more logic chips. For example, memory set membership may be stored in DRAM on one or more stacked memory chips. For example, memory set membership may be stored in a combination of NVRAM on one or more logic chips and DRAM on one or more stacked memory chips.

Memory sets may be formed (e.g. constructed, assembled, etc.) across (e.g. within, including, etc.) a stacked memory chip and/or across multiple stacked memory chips, and/or across portions of one or more stacked memory chips, and/or across one or more stacked memory packages, etc. For example, a checkerboard pattern may be formed across an entire stacked memory package. For example, in FIG. 28-6, memory portions 0, 2, 5, 7, 9, 11, 12, 14, 16, 18, 21, 23, 25, 27, 28, 30 may form black regions of a checkerboard pattern; and memory portions 1, 3, 4, 6, 8, 10, 13, 15, 17, 19, 20, 22, 24, 26, 29, 31 may form white regions of a checkerboard pattern.

Any number of memory portions may be divided into any number of memory sets. Thus, a stacked memory package may contain 2, 4, 8, etc. or an odd number etc. of memory sets. Memory sets may include one or more memory portions that are spare, redundant, members of one or more pools of resources, etc.

Memory sets may be formed (e.g. constructed, assembled, etc.) from groups of memory portions. For example, a memory set may be formed from a collection of pairs of memory portions. For example, in FIG. 28-6, pairs of memory portions may include: (0,1), (2,3), (4, 5), (6, 7), (8, 9), . . . , (30, 31), where the notation (0, 1), for example, may denote (e.g. represent, etc.) that memory portions 0, 1 may form a pair. In this case, a pair of memory portions may provide data for one access, for example. In this case, for example, data from more than one pair may be aggregated to provide data for one access. For example, a read access may aggregate data from pairs (0, 1), (8, 9), (16, 17), (24, 25). In this case, pairs (0, 1), (8, 9), (16, 17), (24, 25), may form an echelon, for example. Other patterns may be used. For example, pairs (0, 1), (12, 13), (16, 17), (28, 29) may form an echelon, etc. Any number of memory portions may be used to form groups, including pairs (e.g. two memory portions, etc.), triplets (e.g. three memory portions), or any tuple, ordered list, number, etc. of memory portions. Any organization (e.g. arrangement, shapes, patterns, etc.) of sets, memory sets, groups, etc. may be used. For example, a first memory class (as defined herein and/or in one or more specifications incorporated by reference) may use a first set, collection, grouping, etc. and a second memory class may use a second set, collection, grouping, etc.

Other sequences (e.g. bus and/or time sequences, etc.) may represent one or more of the following (but not limited to the following) aspects of the data bus use: alternative data bus widths; alternative data bus multiplexing schemes; alternative connections of banks; sections, echelons, memory portions, stacked memory chips to the data bus; alternative access granularity of the banks, etc; and other aspects (e.g. reordering of read requests, write requests, read data, write data, etc.) etc. Other sequences are possible in different configurations that may correspond to different interleaving, data packing, data requests, data reordering, data bus widths, data access granularity and other factors, etc.

Sequences may be used to describe the functions (e.g. behavior, results, architecture, design, aspects, views, etc.) of memory system access. Sequences may be used to describe the effect of the connections and connection architecture in a stacked memory package, particularly the architecture of the data bus connections as well as that of the command bus, address bus and/or other connections between logic chip(s) and slacked memory chips, for example. The number of TSVs, TSV arrays, etc. (or architecture of other coupling structures, etc.), for example, may depend on the size, type etc. of buses used and/or the manner of their use (e.g. configuration, topology, organization, etc.).

For example, as an option, the stacked memory package architecture 28-600 may be implemented in the context of FIG. 17-2 of U.S. Provisional Application No. 61/673,192, filed Jul. 18, 2012, titled "SYSTEM, METHOD, AND COMPUTER PROGRAM PRODUCT FOR REDUCING A LATENCY ASSOCIATED WITH A MEMORY SYSTEM." For example, the packet structures, interleaving, command interleaving, packet interleaving, packet reordering, packet ordering, command ordering, command reordering, etc. of the stacked memory package architecture 28-600 may be implemented in the context of FIG. 17-2 of U.S. Provisional Application No. 61/673,192, filed Jul. 18, 2012, titled "SYSTEM, METHOD, AND COMPUTER PROGRAM PRODUCT FOR REDUCING A LATENCY ASSOCIATED WITH A MEMORY SYSTEM." For example, the explanations, descriptions, etc. accompanying FIG. 17-2 of U.S. Provisional Application No. 61/673,192, filed Jul. 18, 2012, titled "SYSTEM, METHOD, AND COMPUTER PROGRAM PRODUCT FOR REDUCING A LATENCY ASSOCIATED WITH A MEMORY SYSTEM" including (but not limited to): streams, packet structures, cells, link cells, containers, ordering, packet contents, and/or other algorithms, functions, behaviors, etc. may equally apply to (e.g. may be employed with, may be incorporated in whole or part with, may be combined with, etc.) the architecture of the stacked memory package architecture 28-600.

For example, in one embodiment, one or more packets, or other logical containers (e.g. bit sequences, phits, flits, etc.) of data and/or information may be interleaved (e.g. packet interleaving, as defined herein and/or in one or more specifications incorporated by reference). Interleaving may be performed, for example, in upstream directions, downstream directions, or both. Packet interleaving may be performed, for example, by transmission of a sequence (e.g. series, etc.) of packet fragments (e.g. pieces, parts, etc.). For example, a packet may have a structure with one or more fields (e.g. containing header(s), data, information, error codes, control fields, and/or other bit sequences, etc.). A packet fragment may be a part, piece, etc. of a packet that may not, for example, include all fields of a packet. For example, not all packet fragments transmitted in an interleaved fashion may include a header field and/or a complete header field, etc. In one embodiment, a packet fragment may include a whole packet. For example, a particular packet may be the same size as fixed packet fragments and thus fragment exactly to a packet, etc.

In one embodiment, packet fragments may be assembled, reassembled, etc. by using one or more known properties of the packet fragmentation process. For example, in one embodiment, packets may be fragmented (e.g. split, cut, separated, etc.) on known boundaries, by fixed length (e.g. measured in bits, symbols, words, flits, phits, etc.), or at other known points (e.g. using fields, markers, symbols, etc.). For example, in one embodiment, one or more packets may be fragmented and one or more packet fragments may be marked, delimited, framed, etc. by one or more known markers (e.g. symbols, bit patterns, etc.) and/or one or more known points in time (e.g. flit boundaries, phit boundaries, other transmission and/or framing times, etc.). In one embodiment, the packet fragmentation process and/or packet reassembly process may be fixed. In one embodiment, the packet fragmentation process and/or packet reassembly process may be programmable and/or configurable, etc. Programming and/or configuration of the packet fragmentation process and/or packet reassembly process may be performed at design time, manufacture, assembly, test, start-up, during operation, combinations of these times and/or at any time, etc.

In one embodiment, one or more commands and/or command information etc. may be interleaved (e.g. command interleaving, as defined herein and/or in one or more specifications incorporated by reference). Command interleaving may be performed in the upstream direction, downstream direction, or both. Commands, command information, etc. may include one or more of the following (but not limited to the following): read requests, write requests, posted commands and/or requests, non-posted commands and/or requests, responses (with or without data), completions (with or without data), messages, status requests, probes, combinations of these and/or other commands used within a memory system, etc. For example, commands may include test commands, characterization commands, register set, mode register set, raw commands (e.g. commands in the native SDRAM format, etc.), commands from stacked memory chip to other system components, combinations of these, flow control, programming commands, configuration commands, combinations of these and/or any other command, request, etc. In one embodiment, command interleaving may use entire packets (e.g. unfragmented packets, complete packets, etc.).

In one embodiment, one or more packets, or other logical containers of data and/or information may be interleaved (packet interleaving) and/or one or more commands and/or command information may be interleaved (command interleaving). Packet interleaving and/or command interleaving may be performed in upstream directions, downstream directions, or both.

For example, a stream may carry (e.g. include, contain, etc.) data, information, etc. from two channels CH1, CH2 (e.g. virtual channels, traffic classes, etc.). Any number of channels may be used. Each channel may carry a sequence of commands (e.g. read/write commands, requests, responses, completions, messages, status, probes, combinations of these and/or other similar packet structures, command structures, etc.). For example, channel CH1 may carry commands CH1.CMD1, CH1.CMD2, CH1.CMD3, . . . where command CH1.CMD2 follows command CH1.CMD1, and so on. This sequence may be shortened to CH1.1, CH1.2, CH1.3, . . . or further to 1.1, 1.2, 1.3, . . .

For example, the following sequence may represent part of a stream that may be transmitted on a link (e.g. high-speed serial interface, etc.) with channel interleaving: CH1.1, CH2.1, CH1.2, CH2.2, CH1.3, CH2.3, CH1.4, CH2.4, . . . or 1.1, 2.1, 1.2, 2.2, 1.3, 2.3, 1.4, 2.4, . . . .

Typically channel interleaving may always be performed, but need not be in some circumstances (e.g. testing, characterization, urgent data, recovery from failure, etc.). In some cases, there may be only one channel, in which case channel interleaving may not be used, etc. Note that the transmission may occur by splitting the sequence (e.g. data to be transmitted, etc.) across one or more lanes.

For example, the following sequence may represent part of a stream with packet interleaving: CH1.1.PF1, CH2.1.PF1, CH1.1.PF2, CH2.1.PF2, CH1.2.PF1, CH2.2.PF1, CH1.2.PF2, CH2.2.PF2, . . . .

In this sequence, for example, CH1.1.PF1 may represent the first packet fragment (e.g. PF1, etc.) of command CH1.1, and so on. Where there is no ambiguity, this sequence may be shortened, for example, to: CH1.1.1, CH2.1.1, CH1.1.2, CH2.1.2, CH1.2.1, CH2.2.1, CH1.2.2, CH2.2.2, . . . or further to 1.1.1, 2.1.1, 1.1.2, 2.1.2, 1.2.1, 2.2.1, 1.2.2, 2.2.2, . . . .

Note that, in this case, CH1.1.PF1 may be one or more packets, packet fragments, phits, flits, combinations of these and/or any other parts of packets, etc. For example, Table XI-1 may illustrate the difference between a stream with no interleaving and a stream with packet interleaving.

TABLE XI-1

| No interleaving | Packet interleaving | Channel 1 CMD | Channel 2 CMD |
|---|---|---|---|
| 1.1 | 1.1.1 | 1 | |
| 2.1 | 2.1.1 | | 1 |
| 1.2 | 1.1.2 | 1 | |
| 2.2 | 2.1.2 | | 1 |
| . . . | 1.2.1 | 2 | |
| | 2.2.1 | | 2 |
| | 1.2.2 | 2 | |
| | 2.2.2 | | 2 |
| | . . . | . . . | . . . . |

For example, the following sequence may represent part of a stream with command interleaving: CH1.1.CF1, CH2.1, CH1.1.CF2, CH2.2, CH1.2, CH2.3, CH1.3, . . . .

In this sequence, for example, CH1.1.CF1 may represent the first part, fragment, etc. (e.g. CF1, etc.) of command CH1.1, and so on. Where there is no ambiguity, this sequence may be shortened, for example, to: CH1.1.1, CH2.1, CH1.1.2, CH2.2, CH1.2, CH2.3, CH1.3, . . . or further to 1.1.1, 2.1, 1.1.2, 2.2, 1.2, 2.3, 1.3, . . . .

Note in this case CH1.1.CF1 etc. may be complete packets (e.g. unfragmented packets, whole packets, etc.).

For example, Table XI-2 may illustrate the difference between a stream with no interleaving and a stream with command interleaving.

TABLE XI-2

| No interleaving | Command interleaving | Channel 1 CMD | Channel 2 CMD |
|---|---|---|---|
| 1.1 | 1.1.1 | 1 | |
| 2.1 | 2.1 | | 1 |
| 1.2 | 1.1.2 | 1 | |
| 2.2 | 2.2 | | 2 |
| 1.3 | 1.2 | 2 | |
| 2.3 | 2.3 | | 3 |
| . . . | 1.3 | 3 | |
| | . . . | . . . | . . . |

For example, the following sequence may represent part of a stream with packet interleaving and command interleaving: CH1.1.CF1.PF1, CH2.1.PF1, CH1.1.CF1.PF2, CH2.1.PF2, . . . .

Where there is no ambiguity, this sequence may be shortened, for example, to: CH1.1.1.1, CH2.1.1, CH1.1.1.2, CH2.1.2, . . . or further to 1.1.1.1, 2.1.1, 1.1.1.2, 2.1.2, . . . .

For example, Table XI-3 may illustrate the difference between a stream with no interleaving and a stream with packet interleaving and command interleaving.

TABLE XI-3

| No interleaving | Packet interleaving | Packet and command interleaving | Channel 1 CMD | Channel 2 CMD |
|---|---|---|---|---|
| 1.1 | 1.1.1 | 1.1.1 | 1 | |
| 2.1 | 2.1.1 | 2.1.1 | | 1 |
| 1.2 | 1.1.2 | 1.2.1 | 2 | |
| 2.2 | 2.1.2 | 2.2.1 | | 2 |
| . . . | 1.2.1 | 1.1.2 | 1 | |
| | 2.2.1 | 2.1.2 | | 1 |
| | 1.2.2 | 1.2.2 | 2 | |
| | 2.2.2 | 2.2.2 | | 2 |
| | . . . | . . . | . . . | . . . |

Note that reordering of packet fragments may achieve similar results to packet interleaving and/or command interleaving. Similarly the choice of scheduling algorithm for transmission (e.g. by channel, by command, by packet, by priority, by combinations of these, etc.) may also result in similar sequences to that obtained by, for example, to packet interleaving and/or command interleaving. For example, the following sequence may represent a stream with packet interleaving and command interleaving: CH1.1.PF1, CH2.1.PF1, CH1.2.PF1, CH2.2.PF1, CH1.1.PF2, CH2.1.PF2, CH1.2.PF2, CH2.2.PF2, . . . or CH1.1.1, CH2.1.1, CH1.2.1, CH2.2.1, CH1.1.2, CH2.1.2, CH1.2.2, CH2.2.2, . . . or 1.1.1, 2.1.1, 1.2.1, 2.2.1, 1.1.2, 2.1.2, 1.2.2, 2.2.2, . . . .

For example, Table XI-4 may illustrate the difference between packet interleaving and packet interleaving with reordering (and packet interleaving with command interleaving, etc.).

TABLE XI-4

| Original packet # | Packet interleaving | Packet interleaving with reordering | Reordered packet # |
|---|---|---|---|
| 1 | 1.1.1 | 1.1.1 | 1 |
| 2 | 2.1.1 | 2.1.1 | 2 |
| 3 | 1.1.2 | 1.2.1 | 5 |
| 4 | 2.1.2 | 2.2.1 | 6 |
| 5 | 1.2.1 | 1.1.2 | 3 |
| 6 | 2.2.1 | 2.1.2 | 4 |
| 7 | 1.2.2 | 1.2.2 | 7 |
| 8 | 2.2.2 | 2.2.2 | 8 |
| . . . | . . . | . . . | . . . |

Note that in Table XI-4 the sequence corresponding to packet interleaving with reordering (which may also correspond to a sequence with packet interleaving and command interleaving, etc.) may, for example, allow processing, execution, etc. of more than one command in a channel to overlap. Other similar enhancements, improvements, etc. in execution, scheduling, processing, etc. may be made as a result of interleaving and/or reordering.

Note that the difference between packet interleaving and command interleaving, for example, may include a difference in the protocol layer (e.g. level, etc.) at which interleaving is performed. For example, in one embodiment, packet interleaving may be performed at the physical layer. For example, in one embodiment, command interleaving may be performed at the data link layer. Since the physical layer may be below the data link layer, packet interleaving may be (e.g. performed, logically placed, etc.) below (e.g. within, hierarchically lower, etc.) command interleaving. Thus, the notation CH.CMD.CFx.PFy or CH.CMD.x.y or x.y may represent command fragment x, packet fragment y of a command, for example. The notation CH.CMD.z may refer to command fragment z and/or packet fragment z where both command interleaving and packet interleaving may apply, for example.

Note that priority (e.g. arbitration etc. by traffic class, memory class, etc.) may also affect the order of a sequence. Thus, for example, there may be two channels, A and B, in a stream where channel A may have higher priority than channel B. For example, the example command sequence A1, B1, A2, B2, A3, B3, A4, B4, . . . (where A1 etc. are commands) may be re-ordered as a result of priority. For example, the following sequence: A1, A2, A3, B1, B2, A4, . . . may represent the stream with no interleaving and with priority. Such reordering (e.g. prioritization, arbitration, etc.) may be performed in the Rx datapath (e.g. for read/write commands, requests, messages, control, etc.) and/or the Tx datapath (e.g. for responses, completions, messages, control, etc.) and/or other logic in a stacked memory package, for example. Such reordering (e.g. prioritization, etc.) may be used to implement features related to memory classes (as defined herein and/or in one or more specifications incorporated by reference); perform, enable, implement, etc. one or more virtual channels (e.g. real-time traffic, isochronous traffic, etc.); improve latency; reduce congestion; eliminate blocking (e.g. head of line blocking, etc.); to implement combinations of these and/or other features, functions, etc. of a stacked memory package.

In one embodiment, the functions (e.g. algorithms, behaviors, processes, etc.) of command interleaving, packet interleaving, prioritization, etc. may be combined. In one embodiment, the functions of command interleaving, packet interleaving, prioritization, etc. may be fixed and/or programmable. Programming of the functions of command interleaving, packet interleaving, prioritization, etc. may be performed at design time, manufacture, assembly, test, start-up, during operation, at combinations of these times and/or at any time, etc.

For example, a link (e.g. between a CPU and stacked memory package, etc.) may carry downstream serial data in a Tx stream and upstream serial data in an Rx stream. Data, commands, packets, etc. may be interleaved (e.g. in a stream, flow, channel, etc.) in any manner. Information (e.g. data, fields, etc. contained in commands, responses, etc.) may be represented as contained in one or more of a series of containers (e.g. logical containers, bit sequences, sequences of symbols, groups of symbols, groups of bits, bit patterns, combinations of these, etc.) C1, C2, C3, . . . etc. For example, in one embodiment, containers may represent any number of flits. For example, in one embodiment, containers may represent any number of packets of variable and/or fixed length, etc. Containers may be any division of the bandwidth of one or more links (e.g. divided by bit times, numbers of symbols, packet lengths, flits, phits, combinations of these and/or other techniques of division, etc.). In one embodiment, the lengths of containers C1, C2, C3, C4, etc. may be different. In one embodiment, the lengths of containers C1, C2, C3, C4, etc. may be programmable (e.g. configured at design time, at manufacture, at test, at start-up, during operation, etc.). In one embodiment, the relationships (e.g. ratios, function, etc.) of the lengths of containers C1 to C2, C2 to C3, etc. may be programmable (e.g. configured at design time, at manufacture, at test, at start-up, during operation, etc.). In one embodiment, the lengths of containers C1, C2, C3, etc. in the Tx stream (e.g. downstream, commands, etc.) may be different from the Rx stream (e.g. upstream, responses, etc.), etc. Any number of flits may be used in interleaving. Interleaved commands, packets etc. may be any number of flits in length. Flits may be any length. Packets, commands, data, etc., need not be interleaved at the flit level.

In one embodiment, a stream may include non-interleaved packet, non-interleaved command/response:

C1=READ1, C2=WRITE1, C3=READ2, C4=WRITE2

READ1, READ2, WRITE1, WRITE2 may be separate commands. In this case, in one embodiment, the commands may be performed in order (e.g. READ1, WRITE1, READ2, WRITE2 etc. or containers C1, C2, C3, C4, . . . ) on all memory portions without sorting, ordering, etc. (e.g. in or with equal priority, without priority, without ordering, without use of memory sets, etc.).

In one embodiment, commands may be sorted, ordered, re-ordered, prioritized, grouped, or otherwise arranged etc. (e.g. by address, other command field(s), etc.) and performed on (e.g. issued to, completed by, applied to, directed to, etc.) one or more memory sets of memory portions according to one or more algorithms.

For example, memory portions divided into two memory sets A, B by address and commands may be sorted according to address. For example, in the above stream, command READ1 may correspond to (e.g. have an address that corresponds, belongs to, is assigned to, is associated with, etc.) memory set A. Command READ2 may correspond to memory set A. Command WRITE1 may correspond to memory set B. Command WRITE2 may correspond to memory set B. In this case the commands may be executed in the order READ1, READ2, WRITE 1, WRITE 2. For example, in one embodiment, commands READ1 and READ2 may be performed in a first time slot (possibly in conjunction with other commands that correspond to memory set A) and commands WRITE1 and WRITE2 may be performed in a second time slot (possibly in conjunction with other commands that correspond to memory set B), etc. A time slot may be any length of time (e.g. more than one clock period, etc.). For example, a time slot may contain enough time (e.g. number of clocks, etc.) to allow a command (e.g. request, etc.) to be performed. In one embodiment, time slots may be fixed and/or variable and/or programmable. For example, in one embodiment, a switched, shared, multiplexed, etc. bus may require a certain time at the beginning and/or the end of a time slot and/or command to allow for bus turnaround, protocol requirements, to avoid bus contention, combinations of these factors and/or other timing requirements, factors, restrictions, etc. The width (e.g. length in time, etc.) of one or more time slots may be programmed and/or configured, changed etc. at design time, at manufacture, at test, at assembly, at start-up, during operation, at combinations of these times and/or at any time, etc. The width of one or more time slots may be dependent, for example, on current command(s), and/or past command(s) and/or future commands(s), combinations of these and/or other state (e.g. stored information, saved information, etc.), history, data, etc.

In one embodiment, combinations of rules, restrictions, algorithms, etc. may be used to determine (e.g. decide, perform, etc.) ordering. For example, using the above example stream again, command WRITE1 and command WRITE2 may correspond to the same memory set and be directed at the same address (or otherwise conflict, clash, etc.). In this case, command WRITE2 may be delayed, deferred, etc. with respect to command WRITE1. For example, using the above example stream again, command WRITE1 and command READ2 may be directed at the same memory set and the same address (or otherwise conflict, etc.). In this case, for example, the order (e.g. timing, completion, etc.) of read and write commands may be required to be preserved. In this case, for example, command READ2 may be delayed, deferred, timing maintained, etc. with respect to command WRITE1.

In one embodiment, one or more buses may be switched, shared, multiplexed etc. in combination with the use of one or more memory sets of memory portions. For example, in FIG. 28-6, one or more data buses and/or command buses and/or address buses in TSV array 0 may be switched or otherwise shared etc. between memory portions 0, 4, 8, 12, 16, 20, 24, 28. For example, a first group of memory portions 0, 8, 16, 24 may belong to a first memory set A (note that memory set A may possibly contain other additional memory portions, etc.) and a second group of memory portions 4, 12, 20, 28 may belong to a second memory set B. For example, groups of memory portions such as 0, 8, 16, 24, may form an echelon, etc. Commands may be ordered, for example, so that memory set A may be accessed in a first time slot (T1) and memory set B accessed in a second time slot (T2). Thus, in this case, in one embodiment for example, a switched data bus (e.g. that may connect, couple etc. to either memory portion 0 or connect to memory portion 4) may be used to connect to memory portion 0 in T1 and connect to memory portion 4 in T2, etc. In one embodiment for example a shared and switched data bus (e.g. that may connect or couple in a shared fashion to memory portions 0, or 8, or 16, or 24; or connect or couple in a shared fashion to memory portions 4, or 12, or 0, or 28) may be used to connect to one of memory portions 0, 8, 16, 24 in T1 and to connect to one of memory portions 4, 12, 20, 28 in T2, etc. Other similar arrangements, architectures, designs, etc. of memory portions, data buses and/or other buses, switched and/or shared buses, multiplexed buses, connection mechanisms, etc. may be used.

In one embodiment, a stream may include non-interleaved packet, interleaved command/response:

C1=READ1, C2=WRITE1.1, C3=READ2, C4=WRITE1.2

In this stream, READ1, READ2, WRITE1, WRITE2 may be separate commands, for example.

In one embodiment, command WRITE1.1 and command WRITE1.2 may be two parts (e.g. fragments, pieces, parts, etc.) of command WRITE1 that may, for example, be interleaved commands. Command READ2 may be considered interleaved between commands WRITE1.1 and WRITE1.2, etc.

In one embodiment, commands WRITE1.1, READ2, WRITE1.2 may be three separate commands. For example, each command WRITE1.1, READ2, WRITE1.2 may have a header, one or more error protection fields (e.g. CRC, checksum, etc.), etc. In one embodiment, commands WRITE1.1, READ2, WRITE1.2 may correspond to three packets. In one embodiment, commands WRITE1.1, READ2, WRITE1.2 may correspond to more than three packets. For example, a long write command (e.g. a command with large data payload, etc.), such as command WRITE1, may be split (e.g. fragmented, apportioned, cut, etc.) into several fragments, parts, pieces, etc. to allow reads, such as command READ2, or other commands to be inserted into a stream. In one embodiment, the fragments may occupy (e.g. be carried by, may use, etc.) one or more packets. In one embodiment, a packet may carry one or more command fragments.

In one embodiment, commands WRITE1.1 and WRITE1.2 may be two parts of command WRITE1, a multi-part command, that may carry one or more embedded (e.g. inserted, nested, contained, etc.) commands, such as command READ2. For example, a command (e.g. a long write command, a command with large data payload, etc.), such as command WRITE1, may be divided (e.g. into one or more pieces, parts etc. of equal or different lengths, etc.) to allow other commands, such as command READ2 for example, or other information (e.g. status, control information, control words, control signals, combinations of these and/or other commands and/or command related information, etc.) to be inserted into a multi-part command. In one embodiment, the multi-part command may occupy (e.g. be carried by, may use, etc.) one or more packets. In one embodiment, a packet may carry one or more multi-part commands.

In one embodiment, a command may contain multiple commands. For example, a write with reads command WRITEREADS may contain a write command with one or more embedded read commands. Such a command (a multi-command command, a jumbo command, super command, etc.) may be used, for example, to logically inject, insert, etc. one or more read commands into a long write command. For example, a command WRITEREADS may be similar or identical in format (e.g. bit sequence, appearance, fields, etc.) to a sequence such as command sequence WRITE1.1, READ2, WRITE1.2, or command sequence WRITE1.1, READ1, READ2, WRITE1.2, etc. Similarly, a long read response may also contain one or more write completions for one or more non-posted write commands, etc. Any number, type, combination, etc. of commands (e.g. commands, responses, requests, completions, control options, control words, status, etc.) may be embedded in a multi-command command. The formats, behavior, contents, types, etc. of multi-command commands may be fixed and/or programmable. The formats, behavior, contents, types, etc. of multi-command commands may be programmed and/or configured, changed etc. at design time, at manufacture, at test, at assembly, at start-up, during operation, at combinations of these times and/or at any time, etc.

In one embodiment, commands may be structured (e.g. formatted, designed, constructed, configured, etc.) to improve memory system performance. For example, a multi-command write command (jumbo command, super command, compound command, etc.) may be structured as follows: WRITE1.1, WRITE1.2, WRITE1.3, WRITE1.4, WRITE1.5, WRITE1.6, WRITE1.7, WRITE1.8, WRITE1.9, WRITE1.10, WRITE1.11, WRITE1.12. In one embodiment, WRITE1.1-WRITE1.12 may be formed from (or included in, etc.) one or more packets, separate commands, parts of commands, form a multi-command command, etc. For example, in one embodiment, WRITE1.1-WRITE1.12 may be packet fragments, etc. For example, WRITE1.1-WRITE1.4 may include four write commands (e.g. with four addresses, for example). In one embodiment, WRITE1.1-WRITE1.4 may be included in one packet. In one embodiment, WRITE1.1-WRITE1.4 may be included in multiple packets. For example, WRITE1.5-WRITE1.12 may contain write data. For example WRITE1.5 and WRITE1.9 may contain data corresponding to the write command included in WRITE1.1, etc. In this manner, multiple write commands may be batched (e.g. collected, batched, grouped, aggregated, coalesced, clumped, glued, etc.). For example, a packet or packets etc. including one or more of WRITE1.1-WRITE1.4 may be transmitted ahead of WRITE1.5-WRITE1.12, separately from WRITE1.5-WRITE1.12, interleaved with other packets and/or commands, etc. For example, a packet or packets etc. including one or more of WRITE1.5-WRITE1.12 may be interleaved with other packets and/or commands, etc. Such batching and/or other structuring, etc. of write commands and/or other commands, requests, completions, responses, messages, etc. may improve scheduling of operations (e.g. writes and other operations such as reads, refresh, etc.). For example, one or more memory controllers may schedule pipeline operations, accesses, etc. (e.g. for future time intervals, future time slots, operations on different memory sets, etc.) upon receiving one or more of WRITE1.1-WRITE1.4. Any structure of batched commands, etc. may be used. Any commands may be structured, batched, etc. For example, read responses may be structured (e.g. batched, etc.) in a similar manner. Any number, type, format, length, etc. of commands may be structured (e.g. batched, etc.). The formats, behavior, contents, types, etc. of structured (e.g. batched, etc.) commands may be fixed and/or programmable. For example, in one embodiment batched commands may contain a single ID or tag. For example, in one embodiment batched commands may contain an ID or tag for each command. For example, in one embodiment batched commands may contain an ID, tag, etc. for the batched command (e.g. a compound tag, compound ID, etc.) and an ID or tag for each command. The formats, behavior, contents, types, etc. of structured (e.g. batched, etc.) commands may be programmed and/or configured, changed etc. at design time, at manufacture, at test, at assembly, at start-up, during operation, at combinations of these times and/or at any time, etc.

Such command interleaving, command nesting, command structuring, etc. may be used to control ordering, re-ordering, etc. For example, a group of commands (e.g. writes, etc.) may be batched (e.g. logically stuck together, logically glued together, otherwise combined, etc.) together to assure (or enable, permit, allow, guarantee, etc.) one or more (or all) commands may be executed together (e.g. as one or more atomic commands, etc.). Note that typically a compound command may be viewed as a command that may contain one or more commands, while typically an atomic command may not contain more than one command. However, in one embodiment, a group of commands that are batched together or otherwise structured, etc. may be treated (e.g. parsed, stored, prioritized, executed, completed, etc.) as if the group of commands were an atomic command.

For example, in one embodiment, a group of commands (e.g. writes, etc.) may be batched together to assure all commands may be reversed (e.g. undone, rolled back, etc.) together (e.g. as one, as an atomic process, etc.). For example, a group of commands (e.g. one or more writes followed by one or more reads, one or more reads followed by one or more writes, sequences of reads and/or writes, etc.) may be batched together to assure one or more commands in the group of commands may be executed together in order (e.g. write always precedes read, read always precedes write, etc.).

Such command interleaving, command nesting, command structuring, etc. may be used, for example, in database or similar applications where it may be required to ensure one or more transactions (e.g. financial trades, data transfer, snapshot, roll back, back-up, retry, etc.) are executed and the one or more transactions may include one or more commands. Such command interleaving, command nesting, command structuring, etc. may be used, for example, in applications where data integrity is required in the event of system failure or other failure. For example, one or more logs (e.g. of transactions performed, etc.) may be used to recover, reconstruct, rollback, retry, undo, delete, etc. one or more transactions where the transactions may include, for example, one or more commands.

In one embodiment, for example, the stacked memory package may determine that a first set (e.g. sequence, collection, series, group, etc.) of one or more commands may have failed and/or other failure preventing execution of one or more commands may have occurred. In this case, in one embodiment for example, the stacked memory package may issue one or more error messages, responses, completions, status reports, etc. In this case, in one embodiment for example, the stacked memory package may retry, replay, repeat, etc. a second set of one or more commands associated with the failure. The second set of commands (e.g. retry commands, etc.) may be the same as the first set of commands (e.g. original commands, etc.) or may be a superset of the first set (e.g. include the first set, etc.) or may be different (e.g. calculated, composed, etc. to have a desired retry effect, etc.). For example, commands may be reordered to attempt to work around a problem (e.g. signal integrity, etc.). The second set of commands, e.g. including one or more retried commands, etc, may be structured, batched, reordered, otherwise modified, changed, altered, etc, for example. In one embodiment, the tags, ID, sequence numbers, other data, fields, etc. of the original command(s) may be saved, stored, etc. In one embodiment, the tags, ID, sequence numbers, other data, fields, etc. of the original command(s) (e.g. first set of commands, etc.) may be restored, copied, inserted, etc. in one or more of the retried command(s) (e.g. second set of commands, etc.), and/or in other commands, requests, etc. In one embodiment, the tags, ID, sequence numbers, other data, fields, etc. of the original command(s) (e.g. first set of commands, etc.) may be restored, copied, inserted, etc. in one or more completions, responses, etc. of the retried command(s) (e.g. second set of commands, etc.), and/or in other commands, requests, responses, completions, etc. In one embodiment, the tags, ID, sequence numbers, other data, fields, etc. of the original command(s) may be restored, copied, inserted, changed, altered, modified, etc. into one or more completions, responses, etc. that may correspond to one or more of the original commands, etc. In this manner, in one embodiment, the CPU (or other command source, etc.) may be unaware that a command retry or command retries may have occurred. In this manner, in one embodiment, the CPU etc. may be able to proceed with knowledge (e.g. via notification, error message, status messages, one or more flags in responses, etc.) that one or more retries and/or error(s) and/or failure(s), etc. may have occurred but the CPU and system etc. may able to proceed as if the command responses, completions, etc. were generated without retries, etc. In one embodiment, the stacked memory package may issue one or more error messages and the CPU may replay, retry, repeat, etc. one or more commands in a different order. In one embodiment, the stacked memory package may issue one or more error messages and the CPU may replay, retry, repeat, etc. one or more commands in a different order by using one or more batched commands, for example. In one embodiment, the CPU may replay, retry, repeat, etc. one or more commands and mark one or more commands as being associated with replay, retry, etc. The stacked memory package may recognize such marked commands and handle retry commands, replay commands, etc. in a different, or otherwise programmed or defined fashion, manner, etc. For example, the stacked memory package may reorder retry commands using a different algorithm, may prioritize retry commands using a different algorithm, or otherwise execute retry commands, etc. in a different, programmed manner, etc. The algorithms, etc. for the handling of retry commands or otherwise marked, etc. commands may be fixed, programmed, configured, etc. The programming may be performed at design time, manufacture, assembly, test, start-up, during operation, at combinations of these times and/or any other time, etc.

Such command interleaving, command nesting, command structuring, etc. may be used, for example, to simulate, emulate and/or otherwise mimic the function, etc. of commands and/or create one or more virtual commands, etc. For example, a structured (e.g. batched, etc.) command containing a posted write and a read to the same address may simulate a non-posted write, etc. For example, a structured, batched, etc. command that may include two 64-byte read commands to the same address may simulate a 128-byte read command, etc. For example, a sequence of read commands that may be associated with access to a first set of data (e.g. an audio track of a multimedia database, etc.) may be batched and/or otherwise structured, etc. with read commands that may be associated with a second set of possibly related data (e.g. the video track of a multimedia database, etc.). For example, a sequence, series, collection, set, etc. of commands may be batched to emulate a test-and-set command. A test-and-set command may correspond, for example, to a CPU instruction used to write to a memory location and return the old value of the memory location as a single atomic (e.g. non-interruptible, etc.) operation. Other instructions, operations, commands, functions, behavior, etc. may be emulated using the same techniques, in a similar manner, etc. Any type, number, combination, etc. of commands may be batched, structured, etc. in this manner and/or similar manners, etc.

Such command interleaving, command nesting, command structuring, etc. may be used, for example, in combination with logical operations, etc. that may be performed by one or more logic chips and/or other logic, etc. in a stacked memory package. For example, one or more commands may be structured (e.g. batched, etc.) to emulate the behavior of a compare-and-swap (also CAS) command. A compare-and-swap command may correspond, for example, to a CPU compare-and-swap instruction or similar instruction(s), etc. that may correspond to one or more atomic instructions used, for example, in multithreaded execution, etc. in order to implement synchronization, etc. A compare-and-swap command may, for example, compare the contents of a target memory location to a field in the compare-and-swap command and if they are equal, may update the target memory location. An atomic command or series of atomic commands, etc. may guarantee that a first update of one or more memory locations may be based on known state (e.g. up to date information, etc.). For example, the target memory location may have been already altered, etc. by a second update performed by another thread, process, command, etc. In the case of a second update, the first update may not be performed. The result of the compare-and-swap command may, for example, be a completion that may indicate the update status of the target memory location(s). In one embodiment, the combination of a compare-and-swap command with a completion may be, emulate, etc. a compare-and-set command. In one embodiment, a response may return the contents read from the memory location (e.g. not the updated value that may be written to the memory location). A similar technique may be used to emulate, simulate, etc. one or more other similar instructions, commands, behaviors, etc. (e.g. a compare and exchange instruction, double compare and swap, single compare double swap, etc.). Such commands and/or command manipulation and/or command construction techniques and/or command interleaving, command nesting, command structuring, etc., may be used for example to implement synchronization primitives, mutexes, semaphores, locks, spinlocks, atomic instructions, combinations of these and/or other similar instructions, instructions with similar functions and/or behavior and/or semantics, signaling schemes, etc. Such techniques may be used, for example, in memory systems for (e.g. used by, that are part of, etc.) multiprocessor systems, etc.

Such command interleaving, command nesting, command structuring, etc. may be used, for example, to construct, simulate, emulate and/or otherwise mimic, perform, execute, etc. one or more operations that may be used to implement one or more transactional memory semantics (e.g. behaviors, appearances, aspects, functions, etc.) or parts of one or more transactional memory semantics. For example, transactional memory may be used in concurrent programming to allow a group of load and store instructions to be executed in an atomic manner. For example, command structuring, batching, etc. may be used to implement commands, functions, behaviors, etc. that may be used and/or required to support (e.g. implement, emulate, simulate, execute, perform, enable, etc.) one or more of the following (but not limited to the following); hardware lock elision (HLE), instruction prefixes (e.g. XACQUIRE, XRELEASE, etc.), nested instructions and/or transactions (e.g. using XBEGIN, XEND, XABORT, etc.), restricted transactional memory (RTM) semantics and/or instructions, transaction read-sets (RS), transaction write-sets (WS), strong isolation, commit operations, abort operations, combinations of these and/or other instruction primitives, prefixes, hints, functions, behaviors, etc.

Such command interleaving, command nesting, command structuring, etc. may be used, for example, to simulate, emulate and/or otherwise mimic and/or augment, supplement, etc. the function, behavior, properties, etc. of one or more virtual channels, memory classes, prioritized channels, combinations of these and/or other memory traffic aggregation, separation, classification techniques, etc. For example, one or more commands (e.g. read commands, write commands, etc.) may be structured, batched, etc. to control the bandwidth to be dedicated to a particular function, channel, memory region, etc. for a period of time, etc. For example, one or more commands (e.g. read responses, etc.) may be structured, batched, etc. to control performance (e.g. stuttering, delay variation, synchronization, latency, bandwidth, etc.) for memory operations such as multimedia playback (e.g. an audio track, video track, movie, etc.) for a period of time, etc. For example, one or more commands (e.g. read/write commands, read responses, etc.) may be structured, batched, etc. to emulate, simulate, etc. real-time operation, real-time control, performance monitoring, system test, etc. For example, one or more commands (e.g. read/write commands, read responses, etc.) may be structured, batched, etc. to ensure, simulate, emulate, etc. synchronized operation, behavior, etc.

Such command interleaving, command nesting, command structuring, etc. may be used, for example, to improve the efficiency of memory system operation, For example, one or more commands (e.g. read commands, write commands) may be structured, batched, etc. so that one or more stacked memory chips may perform operations (e.g. read operations, write operations, refresh operations, other operations, etc.) more efficiently and/or otherwise improve performance, etc. For example, one or more read commands may be structured, batched, etc. so that a large fraction of a DRAM row (e.g. a complete page, half a page, etc.) may be read at one time. For example, one or more commands may be batched so that a complete DRAM row (e.g. page, etc.) may be accessed at one time. For example, one or more read commands may be structured, batched, etc. so that one or more memory operations, commands, functions, etc. may be pipelined, performed in parallel or nearly in parallel, performed synchronously or nearly synchronously, etc. For example, one or more commands may be structured, batched etc. to control the performance of one or more buses, multiplexed buses, shared buses, etc. used by one or more logic chips and/or one or more stacked memory chips, etc. For example, one or more commands may be batched or otherwise structured to reduce or eliminate bus turnaround times and/or control other bus timing parameters, etc.

In one embodiment, memory commands, operations and/or sub-operations such as precharge, refresh or parts of refresh, activate, etc. may be optimized by structuring, batching etc. one or more commands, etc. In one embodiment, commands may be batched and/or otherwise structured by the CPU and/or other part of the memory system. In one embodiment, commands may be batched and/or otherwise structured by one or more stacked memory packages. For example, the Rx datapath on one or more logic chips of a stacked memory datapath may batch or otherwise structure, modify, alter etc. one or more read commands and/or batch etc. one or more write commands, etc. For example, in one embodiment the CPU or other part of the memory system may embed one or more hints, tags, guides, flags, and/or other information, marks, data fields, etc. as instruction(s), guidance, etc. to perform command structuring, batching, etc. and/or for execution of command structuring, etc. For example, the CPU may mark (e.g. include field(s), flags, data, information, etc.) one or more commands in a stream as candidates for structuring (e.g. batching, etc.) and/or as instructions to batch one or more commands, etc and/or as instructions to handle one or more commands in a different and/or programmed manner, and/or as information to be used in command structuring, etc. For example, the CPU may mark one or more commands in a stream as candidates for reordering and/or as instructions to reorder one or more commands, etc and/or as the order in which a group, collection, set, etc. of commands may, should, must, etc. be executed, and/or convey other instructions, information, data, etc. to the Rx datapath or other logic, etc.

Such command interleaving, command nesting, command structuring, etc. may be applied to responses, messages, probes, etc. and/or any other information carried by (e.g. transmitted by, conveyed by, etc.) one or more packets, commands, combinations of these and/or similar structures, etc. For example, one or more batched write commands, read commands, etc. may result in one or more batched responses, completions, etc. (e.g. the number of batched responses may be equal to the number of batched commands, but need not be equal, etc.). A batched read response, for example, may allow the CPU or other part of the system to improve latency, bandwidth, efficiency, combinations of these and/or other memory system metrics. For example, one or more write completions (e.g. for non-posted writes, etc.) and/or one or more status or other messages, control words, etc. may be batched with one or more read responses, other completions, etc.

Such command interleaving, command nesting, command structuring, etc. may be used to control, direct, steer, guide, etc. the behavior of one or more caches, stores, buffers, lists, tables, stores, etc. in the memory system (e.g. caches etc. in one or more CPUs, in one or more stacked memory packages, and/or in other system components, etc.). For example, the CPU or other system component etc. may mark (e.g. by setting one or more flags, fields, etc.) one or more commands, requests, completions, responses, probes, messages, etc. to indicate that data (e.g. payload data, other information, etc.) may be cached to improve system performance. For example, a system component (e.g. CPU, stacked memory package, etc.) may batch, structure, etc. one or more commands with the knowledge (e.g. implicit, explicit, etc.) that the grouping of one or more commands may guide, steer or otherwise direct one or more cache algorithms, caches, cache logic, buffer stores, arbitration logic, lookahead logic, prefetch logic, and/or cause, direct, steer, guide, etc. other logic and/or logical processes etc. to cache and/or otherwise perform caching operation(s) (e.g. clear cache, delete cache entry, insert cache entry, rearrange cache entries, update cache(s), combinations of these and/or other cache operations, etc.) and/or or similar operations (e.g. prioritize data, update use indexes, update statistics and/or other metrics, update frequently used or hot data information, update hot data counters and/or other hot data information, update cold data counters and/or other cold data information, combinations of these and/or other operations, etc.) on data and/or cache(s), etc. that may improve one or more aspects, parameters, metrics, etc. of system performance.

Such techniques, functions, behavior, etc. related to command interleaving, command nesting, command structuring, etc. may be used in combination. For example, a CPU may mark a series, collection, set, etc. (e.g. contiguous or non-contiguous, etc.) of commands as belonging to a batch, group, set, etc. The stacked memory package may then batch one or more responses. For example, the CPU may mark a series of nonposted writes as a batch and the stacked memory package may issue a single completion response.

Any number, type, order, etc. of commands, requests, responses, completions etc. may be used with any combinations of techniques, etc. Any combinations of command interleaving, command nesting, command structuring, etc. may be used. Such combinations of techniques and their uses (e.g. function(s), behavior(s), semantic(s), etc.) may be fixed and/or programmable. The formats, behavior, functions, contents, types, etc. of combinations of command interleaving, command nesting, command structuring, etc. may be programmed and/or configured, changed, etc. at design time, at manufacture, at test, at assembly, at start-up, during operation, at combinations of these times and/or at any time, etc.

In one embodiment, the CPU may mark and/or identify one or more commands and/or insert information in one or more commands etc. that may be interpreted, used, employed, etc. by one or more stacked memory packages for the purposes of command interleaving, command nesting, command structuring, combinations of these and/or other operations, etc. For example, a CPU may issue (e.g. send, transmit, etc.) command A with address ADDR1 followed by command B with ADDR2. The CPU may store copies of one or more transmitted command fields, including, for example, addresses. The CPU may compare commands issued in a sequence. For example, the CPU may compare command A and command B and determine that the relationship between ADDR1 and ADDR2 is such that command A and command B may be candidates for command structuring, etc. (e.g. batching, etc.). For example, ADDR1 may be equal to ADDR2, or ADDR1 may be in the same page, row, etc. as ADDR2, etc. Since command A may already have been transmitted, the CPU may mark command B as a candidate for one or more operations to be performed in one or more stacked memory packages. Marking (of a command, etc.) may include setting a flag (e.g. bit field, etc.), and/or including the tag(s) of commands that may be candidates for possible operations, and/or any other technique to mark, identify, include information, data, fields, etc. The stacked memory package may then receive command A at a first time t1 and command B at as second, (e.g. later, etc.) time t2. One or more logic chips in a stacked memory package may contain Rx datapath logic that may process command A and command B in order. Commands may be processed in a pipelined fashion, for example. When the Rx datapath processes marked command B, the datapath logic may then perform, for example, one or more operations on command A and command B. For example, the datapath logic may identify command A as being a candidate for combined operations with command B. In one embodiment, identification may be performed, for example, by comparing addresses of commands in the pipelines (e.g. using marked command B as a hint that one or more commands in the pipeline may be candidates for combined operations, etc.). In one embodiment, identification may be performed, for example, by using one or more tags or other ID fields, etc. that may be included in command B. For example, command B may include the tag, ID, etc. of command A. Any form of identification of combined commands, etc. may be used. After being identified, command A may be delayed and combined (e.g. batched, etc.) with command B. Any form, type, set, order, etc. of combined operation(s) may be performed. For example command A and/or command B may be changed, modified, altered, deleted, reversed, undone, combined, merged, reordered, etc. In this manner, etc. the processing, execution, ordering, prioritization, etc. of one or more commands may be performed in a cooperative, combined, joint, etc. fashion between the CPU (or other command sources, etc.) and one or more stacked memory packages (or other command sinks, etc.). For example, depending on the depth of the pipelines in the CPU and the stacked memory packages, information included in the commands by the source may help the sink identify commands that are to be processed in various ways that may not be possible without marking, etc. For example, the depth of the command pipeline etc. in the CPU may be D1 and the depth of the pipeline etc. in the stacked memory package may be D2, then the use of marking, etc. may allow optimizations to be performed as if the depth of the pipeline in the stacked memory package was D1+D2, etc.

Such command interleaving, command nesting, command structuring, etc. may reduce the latency of reads during long writes, for example. Such command interleaving, command nesting, command structuring, etc. may help, for example, to improve latency, scheduling, bandwidth, efficiency, and/or other memory system performance metrics etc and/or reduce or prevent artifacts (e.g. behavior, etc.) such as stuttering (e.g. long delays, random pauses, random delays, large delay variations compared to average latency, etc.) or other performance degradation, signal integrity issues, power supply noise, etc. Commands, responses, completions, status, control, messages, and/or other data, information, etc. may be included in a similar fashion with (e.g. inserted in, interleaved with, batched with, etc.) read responses, other responses, completions, messages, probes, etc. for example, and with similar benefits, etc.

Such command interleaving, command nesting, command structuring, etc. may result in the reordering, rearrangement, etc. of one or more command streams, for example. Thus, using one or more of the above cases as examples, a first stream of interleaved commands (e.g. containing, including etc. one or more command fragments, etc.) may be rearranged, ordered, prioritized, mapped, transformed, changed, altered, and/or otherwise modified, etc. to form a second stream of interleaved commands.

Such command interleaving, command nesting, command structuring, etc. may be performed, executed at one or more points, levels, parts, etc. of a memory system. For example, in one embodiment, command interleaving, command nesting, command structuring, etc. may be performed on the packets, etc. carried (e.g. transmitted, coupled, etc.) between CPU(s), stacked memory package(s), other system component(s), etc. For example, in one embodiment, command interleaving, command nesting, command structuring, etc. may be performed on the commands, etc. carried between one or more logic chips and one or more stacked memory chips in a stacked memory package. For example, command interleaving, command nesting, command structuring, etc. may be performed at the level of raw, native etc. SDRAM commands, etc. In one embodiment, packets (e.g. command packets, read requests, write requests, etc.) may be coupled between one or more logic chips and one or more stacked memory chips. In this case, for example, one or more memory portions and/or groups of memory portions on one or more stacked memory chips may form a packet-switched network. In this case, for example, command interleaving, command nesting, command structuring, etc. and/or other operations on one or more command streams may be performed on one or more stacked memory chips.

In one embodiment, the number of bits, packets, symbols, flits, phits, etc. used for one or more interleaved commands may be fixed or programmable (e.g. configured at design time, at manufacture, at test, at start-up, during operation, at combinations of these times and/or any time, etc.). For example, in a first configuration, a write command may fit in containers C2 and C4 (e.g. be contained in, have the same number of bits as, etc.). For example, in a second configuration, a write command may fit in containers C2, C4, C6, C8, etc. For example, in a third configuration, a read command may fit in containers C1, C2 or, in fourth third configuration may fit in containers C1, C5, C9, C13, and so on.

In one embodiment, one or more interleaved commands may be rearranged to form a stream of complete (e.g. non-interleaved, etc.) commands. The non-interleaved commands may be performed on (e.g. issued to, completed by, applied to, directed to, etc.) one or more memory sets of memory portions according to one or more algorithms. Thus, for example, in the above example stream command WRITE1.1 may be delayed, deferred, etc. and combined (e.g. merged, aggregated, reassembled, etc.) with command WRITE1.2 before execution of the combined command WRITE1. In one embodiment, a command, such as WRITE1 for example, may correspond to more than one memory set. In this case, the command, such as WRITE1 for example, may then be split to be performed on 2, 4, or any number of memory sets.

In one embodiment, a first stream of interleaved commands may be rearranged to form a second stream of interleaved commands. The interleaved commands may be performed on (e.g. issued to, completed by, applied to, directed to, etc.) one or more memory sets of memory portions according to one or more algorithms, processes, etc. For example, memory portions may be divided into two memory sets (e.g. A, B) e.g. by address and/or other metrics, etc. In the above example stream, WRITE1.1 may correspond to (e.g. be directed to, etc.) to memory set A, for example, and WRITE 1.2 may correspond to memory set B. In this case, in one embodiment, a first command fragment, such as WRITE1.1, may, for example, be performed (e.g. executed, completed, scheduled, etc.) in a first time slot (T1) and a second command fragment, such as WRITE1.2, may be performed in a second time slot (T2), etc. In one embodiment, command fragments may be rearranged (e.g. reordered, rescheduled, prioritized, retimed, etc.). For example, commands may be moved, retimed, etc. to fit in with (e.g. match, align, comply with, adhere to, etc.) timing restrictions, timing patterns, protocol constraints, conflicts (e.g. bank conflicts, etc.), timing windows, activate windows, other timing and/or other parameters, etc. of one or more memory sets. For example, a first command WRITE1.1 may arrive too late to be scheduled for memory set A in time slot T1 (or may otherwise be conflicted, be ineligible, etc. for scheduling e.g. due to refresh, other operations, timing restrictions, activate windows, timing windows, other restrictions, bank conflicts, other conflicts, combinations of these, etc.). In this case, for example, command WRITE1.1 may be delayed, deferred, etc. to a later time slot T2, or otherwise modified to avoid restrictions, etc. The commands, behaviors, etc. in this example are used for illustration purposes; and any commands (e.g. requests, responses, messages, probes, etc.), combinations of commands etc. may be used. The command delay may be any length of time, any number of time slots, any number of clock periods, any fractional multiple of clock period(s), etc. The delay may be fixed or programmable. Programming and/or configuration of command delays may be programmed and/or configured, changed etc. at design time, at manufacture, at test, at assembly, at start-up, during operation, at combinations of these times and/or at any time, etc. For example, in one embodiment, command delays may be performed by one or more pipeline stages in logic associated with one or more memory controllers on one or more logic chips in a stacked memory package, in logic associated with one or more stacked memory chips, in logic distributed between one or more logic chips and one or more stacked memory chips, and/or performed in combinations of these with other logic, etc. For example, delays may be inserted, increased, reduced, etc. by adding, inserting, deleting, removing, bypassing, etc. one or more pipeline stages and/or increasing the delay of one or more pipeline stages and/or reordering, retiming, etc. the commands in one or more pipeline stages, etc. In such a fashion, one or more signals, commands, etc. may be delayed, advanced, retimed, etc. with respect to one another, etc. One or more commands may be modified to avoid such restrictions in any manner, fashion, etc. including, but not limited to, altering of the command timing, etc.

For example, in one embodiment, WRITE1.2 may be performed in a first time slot (T1) and WRITE1.1 may be performed in a second time slot (T2) (e.g. where T2 follows, is later than, etc. T1). For example, the order of command execution and/or allocation of commands to time slots, etc. may depend on the timing (e.g. relative to command timing, etc.) of time slots and their allocation to one or more memory sets.

Thus, using one or more of the above cases as examples, a first stream of interleaved commands (e.g. containing, including etc. one or more command fragments, etc.) may be rearranged, ordered, prioritized, mapped, transformed, changed, altered, and/or otherwise modified, etc. to form a second stream of interleaved commands. In one embodiment, the commands in the first stream of commands may be the same as the commands in the second stream of commands. In one embodiment, the one or more commands in the second stream of commands may be modified, altered, transformed, etc. from one or more of the commands in the first stream of commands.

In one embodiment the translation etc. of a first command stream to a second command stream may be fixed e.g. a given sequence of commands in a first command stream may always be translated to the same sequence of commands in a second command stream. In one embodiment the translation etc. of a first command stream may be state dependent and/or otherwise variable, e.g. a given sequence of commands in a first command stream may not always be translated to the same sequence of commands in a second command stream. For example, a first read command in a first command stream may be translated to include a precharge command, whereas a second read command (which may be identical to the first read command) in the first command stream may not require a precharge command, etc. In one embodiment the translation etc. of a first command stream may be programmable, configurable, etc. The programming etc. of the translation etc. may be performed at design time, manufacture, assembly, test, start-up, during operation, at combinations of these and/or any other times, etc.

In one embodiment, a command fragment, such as WRITE1.1 for example, may correspond to more than one memory set. In this case, for example, the command fragment(s) may be split and performed (e.g. executed, etc.) on one or more memory sets in one or more time slots, possibly in any order, etc. Thus, for example, WRITE1.1 may be split to WRITE1.1.A (e.g. corresponding to memory set A, etc.) and WRITE1.1.B (e.g. corresponding to memory set B, etc.). In this case, in one embodiment, a first split command fragment, such as WRITE1.1.A, may be performed in a first time slot (T1) and a second split command fragment, such as WRITE1.1.B, may be performed in a second time slot (T2), etc. In one embodiment, whole commands may be split. In one embodiment, split commands, split command fragments, etc. may be rearranged. For example, in one embodiment, depending on the timing of time slots and their allocation to one or more memory sets for example, WRITE1.1.B may be performed in a first time slot (T1) and WRITE1.1.A may be performed in a second time slot (T2) (e.g. where T2 follows, is later than, etc. T1).

Thus, in one embodiment, commands may be performed (e.g. executed, completed, initiated, etc.) in more than one part at more than one time as one or more split commands. For example, a first part of a command may be performed at a first time and a second part of a command may be performed at a second time, etc. Note that a split command and/or split command execution (e.g. function, behavior, etc.) may be different from pipelined execution of commands for example, where commands may be divided into one or more phases (e.g. phases may be parts of a command that are executed sequentially in time to form an entire command, for example). Note also that split commands may still be executed in a pipelined fashion (e.g. manner, mode, etc.).

In one embodiment, a stream may include interleaved packet and non-interleaved command/response:

C1=READ1.1, C2=WRITE1.1, C3=READ2.1, C4=WRITE2.1

C5=READ1.2, C6=WRITE1.2, C7=READ2.2, C8=WRITE2.2

In this stream, READ1, READ2, WRITE1, WRITE2 may be separate commands. In one embodiment, READ1.1 and READ1.2 may be two parts (e.g. fragments, pieces, etc.) of READ1 that may be interleaved packets, etc. In one embodiment, WRITE1.1 and WRITE1.2 may be two parts (e.g. fragments, pieces, etc.) of WRITE1 that may be interleaved packets, etc. Interleaving packets, may allow, for example, the buffers, tables, scoreboards, FIFOs, etc. required to store packets and/or commands and/or related, associated information, etc. to be reduced in size. Interleaving packets, may allow, for example, a reduction in latency in the Rx datapath and/or Tx datapath of a stacked memory package and/or a reduction in latency of the memory system. The size(s) of the parts, fragments, pieces, etc. may be fixed and/or programmable.

For example, in one embodiment, a stream may include interleaved packet and interleaved command/response:

C1=READ1.1, C2=WRITE1.1.1, C3=READ2.1, C4=WRITE1.2.1

C5=READ1.2, C6=WRITE1.1.2, C7=READ2.2, C8=WRITE1.2.2

In this stream, READ1, READ2, WRITE1, WRITE2 may be separate commands. In one embodiment, READ1.1, READ1.2, etc. may represent two parts (e.g. fragments, pieces, etc.) of READ1 that may be interleaved packets, interleaved commands, etc. In one embodiment, WRITE1.1.1, WRITE1.1.2, etc. may represent two parts (e.g. fragments, pieces, etc.) of WRITE1.1 (e.g. an interleaved command, etc.) that may be interleaved packets, etc.

In one embodiment, packet interleaving and/or command interleaving may be performed at different protocol layers (or levels, sublayers, etc.). For example, packet interleaving may be performed at a first protocol layer. For example, command interleaving may be performed at a second protocol layer. In one embodiment, packet interleaving may be performed in such a manner that packet interleaving may be transparent (e.g. invisible, irrelevant, unseen, etc.) at the second protocol layer used by command interleaving. In one embodiment, packet interleaving and/or command interleaving may be performed at one or more programmable protocol layers (e.g. configured at design time, at manufacture, at test, at start-up, during operation, etc.).

In one embodiment, packet interleaving and/or command interleaving may be used to allow commands etc. to be reordered, prioritized, otherwise modified, etc. Thus, for example, the following stream may be received at an ingress port of a stacked memory package:

C1=READ1.1, C2=WRITE1.1.1, C3=READ2.1, C4=WRITE1.2.1

C5=READ1.2, C6=WRITE1.1.2, C7=READ2.2, C8=WRITE1.2.2

In this stream, READ1, READ2, WRITE1, WRITE2 may be separate commands. In one embodiment, READ1.1, READ1.2, etc. may represent two parts (e.g. fragments, pieces, etc.) of READ1 that may be interleaved packets, interleaved commands, etc. In one embodiment, WRITE1.1.1, WRITE1.1.2, etc. may represent two parts (e.g. fragments, pieces, etc.) of WRITE1.1 (e.g. an interleaved command, etc.) that may be interleaved packets, etc. In this case, WRITE1.1 may not be executed (e.g. processed, performed, completed, etc.) until C6 is received (e.g. because WRITE1.1 may include WRITE1.1.1 and WRITE1.1.2, etc.). Suppose, for example, the system, user, CPU, etc. wishes to prioritize WRITE1.1, then the commands may be reordered as follows:

C1=READ1.1, C2=WRITE1.1.1, C3 (was C4)=WRITE1.1.2, C4=WRITE1.2.1

C5=READ1.2, C6 (was C2)=READ2.1, C7=READ2.2, C8=WRITE1.2.2

In this case, WRITE1.1 may now be executed after container C3 is received instead of after container C4 was received (e.g. with less latency, less delay, earlier in time, etc.). In one embodiment, the commands may be reordered at the source (e.g. by the CPU, etc.). This may allow the sink (e.g. target, destination, etc.) to simplify processing of commands and/or prioritization of commands, etc. In one embodiment, the commands may be reordered at a sink. Here the term sink may refer to an intermediate node (e.g. a node that may forward the packet, etc. to the final target destination, final sink, etc. For example, an intermediate node in the network may reorder the commands. For example, the final destination may reorder the commands. In one embodiment, the commands may be reordered at the source and/or sink, possibly with source and sink operating cooperatively, etc. In one embodiment, the commands may be reordered by using an appropriate transmission algorithm (e.g. for writes in the CPU, for reads in the stacked memory package or other system component, etc.).

In one embodiment, any command, request, completion, response, command fragment, command part, data, packet, packet fragment, phit, flit, information, etc. may be reordered. Reordering may occur at any point (e.g. using any logic, using any combination of logic in one or more system components, at any protocol level or layer, etc.) in the memory system. Command, etc., reordering may include (but is not limited to) the reordering, rescheduling, retiming, rearrangement (possibly with modification, alteration, changes, etc.) of one or more of the following (but not limited to the following): read requests, write requests, posted commands and/or requests, non-posted commands and/or requests, responses (with or without data), completions (with or without data), messages, status requests, probes, combinations of these and/or other commands etc. used within a memory system, etc. For example, command reordering may include the reordering of test commands, characterization commands, register set, mode register set, raw commands (e.g. commands in the native SDRAM format, etc.), commands from stacked memory chip to other system components, combinations of these, flow control, or any command, etc.

Thus, in one embodiment, command reordering (as defined herein and/or in one or more specifications incorporated by reference) may be performed by a source and/or sink.

In one embodiment, interleaving (e.g. packet interleaving as defined herein and/or in one or more specifications incorporated by reference, and/or command interleaving as defined herein and/or in one or more specifications incorporated by reference, other forms of data interleaving, etc.) may be used to adjust, change, modify, alter, program, configure, etc. one or more aspects (e.g. behaviors, functions, parameters, metrics, views, etc.) of memory system performance (e.g. speed, bandwidth, latency, power, ranges of these and/or other parameters, variations of these and/or other parameters, etc.), one or more memory system parameters (e.g. timing, protocol adherence, etc.), one or more aspects of memory system behavior (e.g. adherence to a protocol, command set, physical view, logical view, abstract view, etc.), combinations of these and/or other memory system aspects, etc.

In one embodiment, interleaving (e.g. packet interleaving as defined herein and/or in one or more specifications incorporated by reference, command interleaving as defined herein and/or in one or more specifications incorporated by reference, other forms of data interleaving, etc.) may be configured, programmed, etc. so that the memory system, memory subsystem, part or portions of the memory system, one or more stacked memory packages, part or portions of one or more stacked memory packages, one or more logic chips in a stacked memory package, part or portions of one or more logic chips in a stacked memory package, combinations of these, etc, may operate in one or more interleave modes (or interleaving modes).

For example, in one embodiment, one or more interleave modes (as defined herein and/or in one or more specifications incorporated by reference) may be used possibly in conjunction with and/or in combination with (e.g. optionally, configured with, together with, etc.) one or more other modes of operations and/or configurations etc. described in this application and/or in one or more specifications incorporated by reference. For example, one or more interleave modes may be used in conjunction with conversion and/or one or more configurations and/or one or more bus modes, as may be described, for example, in the context of U.S. Provisional Application No. 61/665,301, filed Jun. 27, 2012, titled "SYSTEM, METHOD, AND COMPUTER PROGRAM PRODUCT FOR ROUTING PACKETS OF DATA," which is incorporated herein by reference in its entirety. As another example, one or more interleave modes may be used in conjunction with and/or in combination with one or more memory subsystem modes as may be described, for example, in the context of U.S. Provisional Application No. 61/608,085, filed Mar. 7, 2012, titled "SYSTEM, METHOD, AND COMPUTER PROGRAM PRODUCT FOR IMPROVING MEMORY SYSTEMS." As an example, one or more interleave modes may be used in conjunction with one or more modes of connection as described, for example, in the context of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

In one embodiment, operation in one or more interleave modes (as defined above herein and/or in one or more specifications incorporated by reference) and/or other modes (where other modes may include those modes, configurations, etc., described explicitly above herein and/or in one or more specifications incorporated by reference, but may not be limited to those modes) may be used to alter, modify, change, etc. one or aspects of operation, one or more behaviors, one or more system parameters, metrics, etc.

For example, command interleaving, command nesting, command structuring, etc. may be performed by logic in stacked memory package (e.g. in the RX datapath of one or more logic chips in a stacked memory package, by one or more memory controllers, etc.) in the context of FIG. 17-4 of U.S. Provisional Application No. 61/673,192, filed Jul. 18, 2012, titled "SYSTEM, METHOD, AND COMPUTER PROGRAM PRODUCT FOR REDUCING A LATENCY ASSOCIATED WITH A MEMORY SYSTEM."

For example, a memory controller may modify the order of read requests and/or write requests and/or other requests/commands/responses, probes, messages, etc. For example, a memory controller may modify, create, alter, change, insert, delete, merge, transform, etc. read requests and/or write requests and/or other requests, commands, responses, completions, and/or other commands, probes, messages, etc.

In one or more embodiments there may be more than one memory controller (and this may generally be the case). In one embodiment, a stacked memory package may have 2, 4, 8, 16, 32, 64 or any number of memory controllers including, for example, an odd number of memory controllers that may include one or more spare, redundant, etc. memory controllers or memory controller components. Reordering and/or other modification of packets, commands, requests, responses, completions, probes, messages, etc. may occur using logic, buffers, functions, FIFOs, tables, linked lists, combinations of these and/or other storage, etc. within (e.g. integrated with, part of, etc.) each memory controller; using logic, buffers, functions, storage, etc. between (e.g. outside, external to, associated with, coupled to, connected with, etc.) memory controllers; or a combination of these and/or other logic functions, circuits, etc.

For example, a stacked memory package or other memory system component, etc. may receive packets P1, P2, P3, P4 The packets may be sent and received in the order P1 first, then P2, then P3, and P4 last. There may be four memory controllers M1, M2, M3, and M4. Packets P1 and P2 may be processed by M1 (e.g. P1 may contain a command, read request etc., addressed to one or more memory regions controlled by M1, etc.). Packet P3 may be processed by M2. Packet P4 may be processed by M3. In one embodiment, M1 may reorder P1 and P2 so that any command, request, etc. in P1 is processed before P2. M1 and M2 may reorder P2 and P3 so that P3 is processed before P2 (and/or P1 before P2, for example). M2 and M3 may reorder P3 and P4 so that P4 is processed before P3, etc.

For example, a stacked memory package or other memory system component, etc. may receive packets P1, P2, P3, P4 The packets may be sent and received in the order P1 first, then P2, then P3, and P4 last. There may be four memory controllers M1, M2, M3, and M4. Packet P2 may contain a read command that requires reads using M1 and M2. Packet P1 may be processed by M1 (e.g. P1 may contain a read request addressed to one or more memory regions controlled by M1, etc.). Packets P1 may be processed by M1 (e.g. P1 may contain a read request addressed to one or more memory regions controlled by M2, etc.). The responses from M1 and M2 may be combined (possibly requiring reordering) to generate a single response packet P5. Combining, for example, may be performed by logic in M1, logic in M2, logic in both M1 and M2, logic outside M1 and M2, combinations of these, etc.

In one embodiment, a memory controller and/or a group of memory controllers (possibly with other circuit blocks and/or functions, etc.) may perform such operations (e.g. reordering, modification, alteration, batching, scheduling, combinations of these, etc.) on requests and/or commands and/or responses and/or completions etc. (e.g. on packets, groups of packets, sequences of packets, portion(s) of packets, data field(s) within packet(s), data structures containing one or more packets and/or portion(s) of packets, on data derived from packets, etc.), to effect (e.g. implement, perform, execute, allow, permit, enable, etc.) one or more of the following (but not limited to the following): reduce and/or eliminate conflicts (e.g. between banks, memory regions, groups of memory regions, groups of banks, etc.), reduce peak and/or average and/or averaged (e.g. over a fixed time period, etc.) power consumption, avoid collisions between requests/commands and refresh, reduce and/or avoid collisions between requests/commands and data (e.g. on buses, etc.), avoid collisions between requests/commands and/or between requests/commands and other operations, increase performance, minimize latency, avoid the filling of one or more buffers and/or over-commitment of one or more resources etc., maximize one or more throughput and/or bandwidth metrics, maximize bus utilization, maximize memory page (e.g. SDRAM row, etc.) utilization, avoid head of line blocking, avoid stalling of pipelines, allow and/or increase the use of pipelines and pipelined structures, allow and/or increase the use of parallel and/or nearly parallel and/or simultaneous and/or nearly simultaneous etc. operations (e.g. in datapaths, etc.), allow or increase the use of one or more power-down or other power-saving modes of operation (e.g. precharge power down, active power down, deep power down, etc.), allow bus sharing by reordering commands to reduce or eliminate bus contention or bus collision(s) (e.g. failure to meet protocol constraints, improve timing margins, etc.), etc., perform and/or enable retry or replay or other similar commands, allow and/or enable faster or otherwise special access to critical words (e.g. in one or more CPU cache lines, etc.), provide or enable use of masked bit or masked byte or other similar data operations, provide or enable use of read/modify/write (RMW) or other similar data operations, provide and/or enable error correction and/or error detection, provide and/or enable memory mirror operations, provide and/or enable memory scrubbing operations, provide and/or enable memory sparing operations, provide and/or enable memory initialization operations, provide and/or enable memory checkpoint operations, provide and/or enable database in memory operations, allow command coalescing and/or other similar command and/or request and/or response and/or completion operations (e.g. write combining, response combining, etc.), allow command splitting and/or other similar command and/or request and/or response and/or completion operations (e.g. to allow responses to meet maximum protocol payload limits, etc.), operate in one or more modes of reordering (e.g. reorder reads only, reorder writes only, reorder reads and writes, reorder responses only, reorder commands/request/responses within one or more virtual channels etc., reorder commands/request/responses between (e.g. across, etc.) one or more virtual channels etc., reorder commands and/or requests and/or responses and/or completions within one or more address ranges, reorder commands and/or requests and/or responses and/or completions and/or probes, etc. within one or more memory classes, combinations of these and/or other modes, etc.), permit and/or optimize and/or otherwise enhance memory refresh operations, satisfy timing constraints (e.g. bus turnaround times, etc.) and/or timing windows (e.g. tFAW, etc.) and/or other timing parameters etc., increase timing margins (analog and/or digital), increase reliability (e.g. by reducing write amplification, reducing pattern sensitivity, etc.), work around manufacturing faults and/or logic faults (e.g. errata, bugs, etc.) and/or failed connections/circuits etc., provide or enable use of QoS or other service metrics, provide or enable reordering according to virtual channel and/or traffic class priorities etc, maintain or adhere to command and/or request and/or response and/or completion ordering (e.g. for PCIe ordering rules, HyperTransport ordering rules, other ordering rules/standards, etc.), allow fence and/or memory barrier and/or other similar operations, maintain memory coherence, perform atomic memory operations, respond to system commands and/or other instructions for reordering, perform or enable the performance of test operations and/or test commands to reorder (e.g. by internal or external command, etc.), reduce or enable the reduction of signal interference and/or noise, reduce or enable the reduction of bit error rates (BER), reduce or enable the reduction of power supply noise, reduce or enable the reduction of current spikes (e.g. magnitude, rise time, fall time, number, etc.), reduce or enable the reduction of peak currents, reduce or enable the reduction of average currents, reduce or enable the reduction of refresh current, reduce or enable the reduction of refresh energy, spread out or enable the spreading of energy required for access (e.g. read and/or write, etc.) and/or refresh and/or other operations in time, switch or enable the switching between one or more modes or configurations (e.g. reduced power mode, highest speed mode, etc.), increase or otherwise enhance or enable security (e.g. through memory translation and protection tables or other similar schemes, etc.), perform and/or enable virtual memory and/or virtual memory management operations, perform and/or enable operations on one or more classes of memory (with memory class as defined herein including specifications incorporated by reference), combinations of these and/or other factors, etc.

In one embodiment, the scheduling, batching, ordering, reordering, arrangement, prioritization, arbitration, etc. and/or modification of commands, requests, responses, completions etc. may be performed by reordering, rearranging, resequencing, retiming (e.g. adjusting transmission times, etc.), and/or otherwise modifying packets, portions of packets (e.g. packet headers, tags, ID, addresses, fields, formats, sequence numbers, etc.), modifying the timing of packets and/or packet processing (e.g. within one or more pipelines, within one or more parallel operations, etc.), the order of packets, the arrangements of packets and/or packet contents, etc. in one or more data structures. The data structures may be held in registers, register files, FIFOs, RAM, SRAM, dual-port RAM, multi-port RAM, buffers (e.g. Rx buffers, logic chip memory, etc.) and/or the memory controllers, and/or stacked memory chips, etc. The modification (e.g. reordering, etc.) of data structures may be performed by manipulating data buffers (e.g. Rx data buffers, etc.) and/or lists, linked lists, indexes, pointers, tables, handles, etc. associated with the data structures. For example, a read pointer, next pointer, other pointers, index, priority, traffic class, virtual channel, etc. may be shuffled, changed, exchanged, shifted, updated, swapped, incremented, decremented, linked, sorted, etc. such that the order, priority, and/or other manner that commands, packets, requests etc. are processed, handled, etc. is modified, altered, etc.

In one embodiment, the memory controller(s) may insert (e.g. existing and/or new) commands, requests, packets or otherwise create and/or delete and/or modify commands, requests, responses, packets, etc. For example, copying (of data, other packet contents, etc.) may be performed from one memory class to another via insertion of commands. For example, successive write commands to the same, similar, adjacent, etc. location(s) may be combined. For example, successive write commands to the same and/or related locations may allow one or more commands to be deleted. For example, commands may be modified to allow the appearance of one or more virtual memory regions. For example, a read to a single virtual memory region may be translated to two (or more) reads to multiple real (e.g. physical) memory regions, etc. The insertion, deletion, creation and/or modification etc. of commands, requests, responses, completions, etc. may be transparent (e.g. invisible to the CPU, system, etc.) or may be performed under explicit system (e.g. CPU, OS, user configuration, BIOS, etc.) control. The insertion and/or modification of commands, requests, responses, completions, etc. may be performed by one or more logic chips in a stacked memory package, for example. The modification (e.g. command insertion, command deletion, command splitting, response combining, etc.) may be performed by logic and/or manipulating data buffers and/or request/response buffers and/or lists, indexes, pointers, etc. associated with the data structures in the data buffers and/or request/response buffers.

In one embodiment, one or more circuit blocks and/or functions in one or more datapath(s) may insert (e.g. existing and/or new) packets at the transaction layer and/or data link layer etc. or otherwise create and/or delete and/or modify packets, etc. In one embodiment, one or more circuit blocks and/or functions in one or more datapath(s) may insert (e.g. existing and/or new) commands, requests, responses, completions, messages, probes, etc. at the transaction layer and/or data link layer etc. or otherwise create and/or delete and/or modify packets and/or commands, etc. For example, a stacked memory package may appear to the system as one or more virtual components. Thus, for example, a single circuit block in a datapath may appear to the system as if it were two virtual circuit blocks. Thus, for example, a single circuit block may generate two data link layer packets (e.g. DLLPs, etc.) as if it were two separate circuit blocks, etc. Thus, for example, a single circuit block may generate two responses or modify a single response to two responses, etc. to a status request command (e.g. may cause generation of two status response messages and/or packets, etc.), etc. Of course, any number of changes, modifications, etc. may be made to packets, packet contents, other information, etc. by any number of circuit blocks and/or functions in order to support (e.g. implement, etc.) one or more virtual components, devices, structures, circuit blocks, etc.

For example, command interleaving, command nesting, command structuring, command reordering, etc. may be performed by logic in stacked memory package (e.g. in the RX datapath of one or more logic chips in a stacked memory package, by one or more memory controllers, etc.) in the context of FIG. 7 of U.S. Provisional Application No. 61/585,640, filed Jan. 31, 2012, titled “SYSTEM, METHOD, AND COMPUTER PROGRAM PRODUCT FOR IMPROVING MEMORY SYSTEMS.”

For example, one or more functions in the memory system (e.g. in the memory subsystem, in one or more logic chips of a stacked memory package, in a hub device, in one or more system buffer chips, in one of more stacked memory chips, in combinations of these and/or other logic, etc.) may include data, control, write and/or read buffers (e.g. registers, FIFOs, LIFOs, lists, tables, combinations of these and/or other storage, etc), data and/or control arbitration, command reordering, command retiming, one or more levels of memory cache, local pre-fetch logic, data encryption and/or decryption, data compression and/or decompression, data packing functions, protocol (e.g. command, data, format, etc.) translation, protocol checking, channel prioritization control, link-layer functions (e.g. coding, encoding, scrambling, decoding, etc.), link and/or channel characterization, command prioritization logic, voltage and/or level translation, error detection and/or correction circuitry, RAS features and functions, RAS control functions, repair circuits, data scrubbing, test circuits, self-test circuits and functions, diagnostic functions, debug functions, local power management circuitry and/or reporting, power-down functions, hot-plug functions, operational and/or status registers, initialization circuitry, reset functions, voltage control and/or monitoring, clock frequency control, link speed control, link width control, link direction control, link topology control, link error rate control, instruction format control, instruction decode, bandwidth control (e.g. virtual channel control, credit control, score boarding, etc.), performance monitoring and/or control, one or more co-processors, arithmetic functions, macro functions, software assist functions, move/copy functions, pointer arithmetic functions, counter (e.g. increment, decrement, etc.) circuits, programmable functions, data manipulation (e.g. graphics, etc.), search engine(s), virus detection, access control, security functions, memory and cache coherence functions (e.g. MESI, MOESI, MESIF, directory-assisted snooping (DAS), etc.), other functions that may have previously resided in (or been associated with etc.) other memory subsystems and/or other systems and/or components (e.g. CPU, GPU, FPGA, buffer chips, etc.), combinations of these, etc. By placing one or more functions local (e.g. electrically close, logically close, physically close, within, etc.) to the memory subsystem, added performance may be obtained as related to the specific function, often while making use of unused circuits or making more efficient use of circuits within the subsystem.

For example, one or more command streams may be reordered so that commands from threads, processes, etc. may be grouped together and/or related, gathered, collected, etc. in a specific, programmed, configured, etc. sequence. Such command stream reordering, etc. may make accesses to memory addresses that are closer together (e.g. from a single thread, from a single process, etc.) be grouped together and thus decrease contention and increase access speed, for example. For example, the resources accessed by one or more commands in a command stream may correspond to portions of the stacked memory chips (e.g. echelons, banks, ranks, subbanks, etc.).

Any resource in the memory system may be used (e.g. tracked, allocated, mapped, etc.). For example, different regions (e.g. portions, parts, etc.) of the stacked memory package may be in various sleep or other states (e.g. power managed, powered off, powered down, low-power, low frequency, etc.). For example, if requests (e.g. commands, transactions, etc.) that require access to one or more memory regions are grouped together it may be possible to keep one or more memory regions in powered down states for longer periods of time etc. in order to save power etc.

In one embodiment, the modification(s) to the command stream(s) may involve, require, etc. tracking, monitoring, etc. more than one resource, parameter, function, behavior, etc. For example commands may be ordered depending on the CPU thread, virtual channel (VC) used, and memory region required, combinations of these and/or other factors, etc.

In one embodiment, the resources and/or constraints and/or other limits, restrictions, parameters, statistics, metrics, etc. that may be tracked, monitored, etc. may include (but are not limited to): command types (e.g. reads, writes, requests, completions, messages, probes, etc.); high-speed serial links (e.g. number, type, speed, capacity, etc.); link capacity; traffic priority; traffic class; memory class (as defined herein and/or in one or more specifications incorporated by reference); power (e.g. battery power, power limits, etc.); timing constraints (e.g. latency, time-outs, etc.); logic chip IO resources; CPU IO and/or other resources; stacked memory package spare circuits; memory regions in the memory subsystem; flow control resources; buffers; crossbars; queues; virtual channels; virtual output channels; priority encoders; arbitration circuits; other logic chip circuits and/or resources; CPU cache(s); logic chip cache(s); local cache; remote cache; IO devices and/or their components; scratch-pad memory; different types of memory in the memory subsystem; stacked memory packages; combinations of these and/or other resources, constraints, limits, etc.

In one embodiment, the command stream modification etc. may include (but is not limited to) the following: reordering of one or more commands, merging of one or more commands, splitting one or more commands, interleaving one or more commands of a first set of commands with one or more commands of a second set of commands; modifying one or more commands (e.g. changing one or more fields, data, information, addresses, etc.); creating one or more commands; retiming of one or more commands; inserting one or more commands; deleting one or more commands, repeating one or more commands, mapping and/or otherwise transforming a first set of one or more command streams into a second set of one or more commands streams, combinations of these and/or other command related operations, etc.

For example, command interleaving, command nesting, command structuring, command reordering, etc. may be performed by logic in stacked memory package (e.g. in the Rx datapath of one or more logic chips in a stacked memory package, by one or more memory controllers, etc.) in the context of U.S. Provisional Application No. 61/580,300, filed Dec. 26, 2011, titled "SYSTEM, METHOD, AND COMPUTER PROGRAM PRODUCT FOR IMPROVING MEMORY SYSTEMS."

For example, in one embodiment, the logic chip may reorder commands and/or otherwise structure commands etc. to perform and/or enable power management. For example, commands may be reordered, grouped, etc. in order to minimize power on/power off or other power state changes of various system components. For example, in one embodiment, the logic chip may reorder commands and/or otherwise structure commands etc. to perform and/or enable subbank access and/or other access techniques. For example, commands may be split so that commands that access one or more subbanks or equivalent structures may be overlapped, pipelined, staged, etc. For example, in one embodiment, the logic chip may reorder commands and/or otherwise structure commands etc. to reduce contention, conflicts, blocking, etc. in one or more crossbar and/or other switching structures. In one embodiment, command reordering etc. may be performed in combination with address mapping (as defined herein and/or in one or more specifications incorporated by reference). In one embodiment, command reordering etc. may be performed in combination with address expansion (as defined herein and/or in one or more specifications incorporated by reference). In one embodiment, command reordering etc. may be performed in combination with address elevation (as defined herein and/or in one or more specifications incorporated by reference).

For example, command interleaving, command nesting, command structuring, command reordering, etc. may be performed by logic in stacked memory package (e.g. in the Rx datapath of one or more logic chips in a stacked memory package, by one or more memory controllers, etc.) in the context of U.S. Provisional Application No. 61/569,107, filed Dec. 9, 2011, titled "SYSTEM, METHOD, AND COMPUTER PROGRAM PRODUCT FOR IMPROVING MEMORY SYSTEMS."

For example, in one embodiment, the logic chip may contain one or more reorder and replay buffers and/or other similar logic functions, etc. For example, in one embodiment, a logic chip may contain logic and/or storage (e.g. memory, registers, etc.) to perform reordering of packets, commands, requests etc. For example, the logic chip may receive a read request with ID 1 for memory address 0x010 followed later in time by a read request with ID 2 for memory address 0x020. The logic chip may include one or more memory controllers. The memory controller may know that memory address 0x020 is busy (e.g. because it has scheduled, issued, etc. access to that address, associated row, corresponding page, etc.) or that know it may otherwise be faster (or more efficient, etc.) to reorder or otherwise reschedule the request and, for example, perform request ID 2 before request ID 1 (e.g. out of order, etc.). The memory controller may then form a completion with the requested data from request ID 2 and memory address 0x020 before it forms a completion with data from request ID 1 and memory address 0x010. The requestor (e.g. request source, etc.) may receive the completions out of order. For example, the requestor may receive completion with ID 2 before it receives the completion with ID 1. The requestor may associate completions with requests using (e.g. by matching, comparing, etc.), for example, the ID fields of completions and requests. Any sequence number, tag, ID, combinations of these and/or similar identifying fields, data, information, etc. may be used.

It should be noted that, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, one or more aspects of the various embodiments of the present invention may be designed using computer readable program code for providing and/or facilitating the capabilities of the various embodiments or configurations of embodiments of the present invention.

Additionally, one or more aspects of the various embodiments of the present invention may use computer readable program code for providing and facilitating the capabilities of the various embodiments or configurations of embodiments of the present invention and that may be included as a part of a computer system and/or memory system and/or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; U.S. Provisional Application No. 61/581,918, filed Jan. 13, 2012, titled "USER INTERFACE SYSTEM, METHOD, AND COMPUTER PROGRAM PRODUCT"; U.S. Provisional Application No. 61/602,034, filed Feb. 22, 2012, titled "SYSTEM, METHOD, AND COMPUTER PROGRAM PRODUCT FOR IMPROVING MEMORY SYSTEMS"; U.S. Provisional Application No. 61/608,085, filed Mar. 7, 2012, titled "SYSTEM, METHOD, AND COMPUTER PROGRAM PRODUCT FOR IMPROVING MEMORY SYSTEMS"; U.S. Provisional Application No. 61/635,834, filed Apr. 19, 2012, titled "SYSTEM, METHOD, AND COMPUTER PROGRAM PRODUCT FOR IMPROVING MEMORY SYSTEMS"; U.S. application Ser. No. 13/441,132, filed Apr. 6, 2012, titled "MULTIPLE CLASS MEMORY SYSTEMS"; U.S. application Ser. No. 13/433,283, filed Mar. 28, 2012, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. application Ser. No. 13/433,279, filed Mar. 28, 2012, titled "SYSTEM, METHOD, AND COMPUTER PROGRAM PRODUCT FOR UTILIZING IMAGE RECOGNITION TO PERFORM AN ACTION"; U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY"; U.S. Provisional Application No. 61/665,301, filed Jun. 27, 2012, titled "SYSTEM, METHOD, AND COMPUTER PROGRAM PRODUCT FOR ROUTING PACKETS OF DATA", U.S. Provisional Application No. 61/673,192, filed Jul. 19, 2012, titled "SYSTEM, METHOD, AND COMPUTER PROGRAM PRODUCT FOR REDUCING A LATENCY ASSOCIATED WITH A MEMORY SYSTEM," and U.S. Provisional Application No. 61/679,720, filed Aug. 4, 2012, titled "SYSTEM, METHOD, AND COMPUTER PROGRAM PRODUCT FOR PROVIDING CONFIGURABLE COMMUNICATION PATHS TO MEMORY PORTIONS DURING OPERATION." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Section XII

The present section corresponds to U.S. Provisional Application No. 61/714,154, titled "SYSTEM, METHOD, AND COMPUTER PROGRAM PRODUCT FOR CONTROLLING A REFRESH ASSOCIATED WITH A MEMORY," filed Oct. 15, 2012, which is incorporated by reference in its entirety for all purposes. If any definitions (e.g. figure reference signs, specialized terms, examples, data, information, etc.) from any related material (e.g. parent application, other related application, material incorporated by reference, material cited, extrinsic reference, other sections, etc.) conflict with this section for any purpose (e.g. prosecution, claim support, claim interpretation, claim construction, etc.), then the definitions in this section shall apply.

Glossary and Conventions

Terms that are special to the field of the various embodiments of the invention or specific to this description may, in some circumstances, be defined in this description. Further, the first use of such terms (which may include the definition of that term) may be highlighted in italics just for the convenience of the reader. Similarly, some terms may be capitalized, again just for the convenience of the reader. It should be noted that such use of italics and/or capitalization and/or use of other conventions, by itself, should not be construed as somehow limiting such terms: beyond any given definition, and/or to any specific embodiments disclosed herein, etc.

More information on the Glossary and Conventions may be found in U.S. Provisional Application No. 61/585,640, filed Jan. 31, 2012, titled "SYSTEM, METHOD, AND COMPUTER PROGRAM PRODUCT FOR IMPROVING MEMORY SYSTEMS," and in U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY." Each of the foregoing applications are hereby incorporated by reference in their entirety for all purposes.

Example embodiments described herein may include computer system(s) with one or more central processor units (CPU) and possibly one or more I/O unit(s) coupled to one or more memory systems that may contain one or more memory controllers and memory devices. As used herein, the term memory subsystem refers to, but is not limited to: one or more memory devices; one or more memory devices and associated interface and/or timing/control circuitry; and/or one or more memory devices in conjunction with memory buffer(s), register(s), hub device(s), other intermediate device(s) or circuit(s), and/or switch(es). The term memory subsystem may also refer to one or more memory devices, in addition to any associated interface and/or timing/control circuitry and/or memory buffer(s), register(s), hub device(s) or switch(es), assembled into substrate(s), package(s), carrier(s), card(s), module(s) or related assembly, which may also include connector(s) or similar means of electrically attaching the memory subsystem with other circuitry.

Example embodiments described herein may include one or more systems, techniques, algorithms, etc. to perform refresh in a memory system. Memory chips may be refreshed at a regular interval to prevent data loss. The use, meaning, etc. of terms refresh commands, refresh operations, and refresh signals may be slightly different in the context of their use, for example, with respect to a stacked memory package (e.g. using SDRAM and/or other memory technology, etc.) relative to (as compared to, etc.) their use with respect to, for example, a standard SDRAM part. For example, one or more refresh commands (e.g. command types, types of refresh command, etc.) may be applied to the pins of a part as signals. In this case, for example, commands may be defined by the states (high H, low L) of external pins CS#, RAS#, CAS#, WE#, CKE at the rising edges of one or more periods (cycles) of the clock CK, CK#. For example, a refresh command (or function) may correspond to CKE=H (previous and next cycle); CS#, RAS#, CAS#=L; WE#=H. Other refresh commands may include self refresh entry and self refresh exit, for example. In some SDRAM, the external pins CKE, CK, CK# may form inputs to the control logic. For example, in some SDRAM, external pins CS#, RAS#, CAS#, WE# may form inputs to the command decode logic, which may be part of the control logic. Further, in some SDRAM, the control logic and/or command decode logic may generate one or more signals that may control the refresh operations of the part. Additionally, in some SDRAM, refresh may be used during operation and may be issued each time a refresh operation is required. Still yet, in some SDRAM, the address of the row and bank to be refreshed may be generated by an internal refresh controller and internal refresh counter, which may provide the address of the bank and row to be refreshed. The use and meaning of terms including refresh commands, refresh operations, and refresh signals in the context of, for example, a stacked memory package (e.g. possibly without external pins CS#, RAS#, CAS#, WE#, CKE, etc.) may be different from that of a standard part and may be further defined, clarified, expanded, etc, in one or more of the embodiments described herein.

The timing (e.g. timing parameters, timing restrictions, relative timing, etc.) of refresh commands, refresh operations, refresh signals, other refresh properties, behaviors, functions, etc. may be different in the context of their use, for example, with respect to a stacked memory package (e.g. using SDRAM and/or other memory technology, etc.) relative to (as compared to, etc.) their use with respect to, for example, a standard SDRAM part. For example, SDRAM may require a refresh period of 64 ms (e.g. a static refresh period, a maximum refresh period, etc.). In some cases, the static refresh period as well as other refresh related parameters may be functions of temperature. For example, one or more values, parameters, timing parameters, etc. may change for case temperature tCASE greater than 95 degrees Celsius, etc. For example, SDRAM with 8 k rows (=8*1024=8192 rows) may require a row refresh interval (e.g. refresh interval, refresh cycle, tREFI, refresh-to-activate period, refresh command period, etc.) of approximately 7.8 microseconds (=64 ms/8 k). The time taken to perform a refresh operation may be tRFC, etc. with minimum value tRFC(MIN) etc. For example, a refresh period may start when the refresh command is registered and may end after the minimum refresh cycle time e.g. tRFC(MIN) later. Typical values of tRFC(MIN) may vary from 50 ns to 500 ns. For example, some SDRAM may require a refresh operation (a refresh cycle) at an interval (e.g. tREFI, etc.) that may average 7.8 microseconds (maximum) when the case temperature is less than or equal to 85 degrees C. or 3.9 microseconds (when the case temperature is less than or equal to 95 degrees C.). For example, tRFC(MIN) may be a function of the SDRAM size. As another example, tRFC may be 28 clocks (105 ns) for 512 Mb parts, 34 clocks (127.5 ns) for 1 Mb parts, 52 clocks (195 ns) for 2 Gb parts, 330 ns for 4 Gb parts, etc. As another example, tRFC may be 110 ns for 1 Gb parts, 160 ns for 2 Gb parts, 260 ns for 4 Gb parts, 350 ns for 8 Gb parts, etc. For example, tRFC(MIN) for next-generation SDRAM may be higher than for current or previous generation SDRAM. The timing, timing parameters, etc. of a standard SDRAM part (e.g. DDR, DDR2, DDR3, DDR4, etc.) may be specified with respect to external pins. For example, the timing of refresh command(s), refresh operations, refresh signals and the relevant, related, pertinent, etc. timing parameters, including, for example, tRFC(MIN), tREFI, static refresh period, etc. may be specified, determined, measured, etc. with respect to the signals at the external pins of the part. The timing (e.g. timing parameters, timing restrictions, relative timing, etc.) of refresh commands, refresh operations, refresh signals, other refresh properties, behaviors, functions, etc. in the context of, for example, a stacked memory package (e.g. possibly without externally visible tRFC (MIN), tREFI, etc.) may be different from that of a standard part and may be further defined, clarified, expanded, etc, in one or more of the embodiments described herein.

FIG. 29-1

FIG. 29-1 shows an apparatus 29-100 for controlling a refresh associated with a memory, in accordance with one embodiment. As an option, the apparatus 29-100 may be implemented in the context of any subsequent Figure(s). Of course, however, the apparatus 29-100 may be implemented in the context of any desired environment.

It should be noted that a variety of optional architectures, capabilities, and/or features will now be set forth in the context of a variety of embodiments in connection with a description of FIG. 29-1. Any one or more of such optional architectures, capabilities, and/or features may or may not be used in combination with any other one or more of such described optional architectures, capabilities, and/or features. Of course, embodiments are contemplated where any one or more of such optional architectures, capabilities, and/or features may be used alone without any of the other optional architectures, capabilities, and/or features.

As shown, in one embodiment, the apparatus 29-100 includes a first semiconductor platform 29-102, which may include a first memory. Additionally, in one embodiment, the apparatus 29-100 may include a second semiconductor platform 29-106 stacked with the first semiconductor platform 29-102. In one embodiment, the second semiconductor platform 29-106 may include a second memory. As an option, the first memory may be of a first memory class. Additionally, in one embodiment, the second memory may be of a second memory class. Of course, in one embodiment, the apparatus 29-100 may include multiple semiconductor platforms stacked with the first semiconductor platform 29-102 or no other semiconductor platforms stacked with the first semiconductor platform.

In another embodiment, a plurality of stacks may be provided, at least one of which includes the first semiconductor platform 29-102 including a first memory of a first memory class, and at least another one which includes the second semiconductor platform 29-106 including a second memory of a second memory class. Just by way of example, memories of different classes may be stacked with other components in separate stacks, in accordance with one embodiment. To this end, any of the components described above (and hereinafter) may be arranged in any desired stacked relationship (in any combination) in one or more stacks, in various possible embodiments. Furthermore, in one embodiment, the components or platforms may be configured in a non-stacked manner. Furthermore, in one embodiment, the components or platforms may not be physically touching or physically joined. For example, one or more components or platforms may be coupled optically, and/or by other remote coupling techniques (e.g. wireless, near-field communication, inductive, combinations of these and/or other remote coupling, etc.).

In another embodiment, the apparatus 29-100 may include a physical memory sub-system. In the context of the present description, physical memory may refer to any memory including physical objects or memory components. For example, in one embodiment, the physical memory may include semiconductor memory cells. Furthermore, in various embodiments, the physical memory may include, but is not limited to, flash memory (e.g. NOR flash, NAND flash, etc.), random access memory (e.g. RAM, SRAM, DRAM, SDRAM, eDRAM, embedded DRAM, MRAM, PRAM, etc.), memristor, phase-change memory, FeRAM, PRAM, MRAM, resistive RAM, RRAM, a solid-state disk (SSD) or other disk, magnetic media, combinations of these and/or any other physical memory and/or memory technology etc. (volatile memory, nonvolatile memory, etc.) that meets the above definition.

Additionally, in various embodiments, the physical memory sub-system may include a monolithic memory circuit, a semiconductor die, a chip, a packaged memory circuit, or any other type of tangible memory circuit, or any intangible grouping of tangible memory circuits, combinations of these, etc. In one embodiment, the apparatus 29-100 or associated physical memory sub-system may take the form of a dynamic random access memory (DRAM) circuit. Such DRAM may take any form including, but not limited to, synchronous DRAM (SDRAM), double data rate synchronous DRAM (DDR SDRAM, DDR2 SDRAM, DDR3 SDRAM, etc.), graphics double data rate DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data out DRAM (EDO DRAM), burst EDO RAM (BEDO DRAM), multibank DRAM (MDRAM), synchronous graphics RAM (SCRAM), combinations of these and/or any other DRAM or similar memory technology.

In the context of the present description, a memory class may refer to any memory classification of a memory technology. For example, in various embodiments, the memory class may include, but is not limited to, a flash memory class, a RAM memory class, an SSD memory class, a magnetic media class, and/or any other class of memory in which a type of memory may be classified. Still yet, it should be noted that the memory classification of memory technology may further include a usage classification of memory, where such usage may include, but is not limited power usage, bandwidth usage, speed usage, etc. In embodiments where the memory class includes a usage classification, physical aspects of memories may or may not be identical.

In the one embodiment, the first memory class may include non-volatile memory (e.g. FeRAM, MRAM, and PRAM, etc.), and the second memory class may include volatile memory (e.g. SRAM, DRAM, T-RAM, Z-RAM, and TTRAM, etc.). In another embodiment, one of the first memory or the second memory may include RAM (e.g. DRAM, SRAM, etc.) and the other one of the first memory or the second memory may include NAND flash. In another embodiment, one of the first memory or the second memory may include RAM (e.g. DRAM, SRAM, etc.) and the other one of the first memory or the second memory may include NOR flash. Of course, in various embodiments, any number (e.g. 2, 3, 4, 5, 6, 7, 8, 9, or more, etc.) of combinations of memory classes may be utilized.

In one embodiment, there may be connections (not shown) that are in communication with the first memory and pass through the second semiconductor platform 29-106. Such connections that are in communication with the first memory and pass through the second semiconductor platform 29-106 may be formed utilizing through-silicon via (TSV) technology. Additionally, in one embodiment, the connections may be communicatively coupled to the second memory.

For example, in one embodiment, the second memory may be communicatively coupled to the first memory. In the context of the present description, being communicatively coupled refers to being coupled in any way that functions to allow any type of signal (e.g. a data signal, an electric signal, etc.) to be communicated between the communicatively coupled items. In one embodiment, the second memory may be communicatively coupled to the first memory via direct contact (e.g. a direct connection, etc.) between the two memories. Of course, being communicatively coupled may also refer to indirect connections, connections with intermediate connections therebetween, etc. In another embodiment, the second memory may be communicatively coupled to the first memory via a bus. In one embodiment, the second memory may be communicatively coupled to the first memory utilizing one or more TSVs.

As another option, the communicative coupling may include a connection via a buffer device. In one embodiment, the buffer device may be part of the apparatus 29-100. In another embodiment, the buffer device may be separate from the apparatus 29-100.

Further, in one embodiment, at least one additional semiconductor platform (not shown) may be stacked with the first semiconductor platform 29-102 and the second semiconductor platform 29-106. In this case, in one embodiment, the additional semiconductor may include a third memory of at least one of the first memory class or the second memory class, and/or any other additional circuitry. In another embodiment, the at least one additional semiconductor may include a third memory of a third memory class.

In one embodiment, the additional semiconductor platform may be positioned between the first semiconductor platform 29-102 and the second semiconductor platform 29-106. In another embodiment, the at least one additional semiconductor platform may be positioned above the first semiconductor platform 29-102 and the second semiconductor platform 29-106. Further, in one embodiment, the additional semiconductor platform may be in communication with at least one of the first semiconductor platform 29-102 and/or the second semiconductor platform 29-102 utilizing wire bond technology.

Additionally, in one embodiment, the additional semiconductor platform may include additional circuitry in the form of a logic circuit. In this case, in one embodiment, the logic circuit may be in communication with at least one of the first memory or the second memory. In one embodiment, at least one of the first memory or the second memory may include a plurality of sub-arrays in communication via shared data bus.

Furthermore, in one embodiment, the logic circuit may be in communication with at least one of the first memory or the second memory utilizing TSV technology. In one embodiment, the logic circuit and the first memory of the first semiconductor platform 29-102 may be in communication via a buffer. In this case, in one embodiment, the buffer may include a row buffer.

Further, in one embodiment, the apparatus 29-100 may be configured such that the first memory and the second memory are capable of receiving instructions via a single memory bus 29-110. The memory bus 29-110 may include any type of memory bus. Additionally, the memory bus may be associated with a variety of protocols (e.g. memory protocols such as JEDEC DDR2, JEDEC DDR3, JEDEC DDR4, SLDRAM, RDRAM, LPDRAM, LPDDR, combinations of these, etc; I/O protocols such as PCI, PCI-E, HyperTransport, InfiniBand, QPI, etc; networking protocols such as Ethernet, TCP/IP, iSCSI, combinations of these, etc; storage protocols such as NFS, SAMBA, SAS, SATA, FC, etc; combinations of these and/or other protocols (e.g. wireless, optical, inductive, NFC, etc.); etc.). Of course, other embodiments are contemplated with multiple memory buses.

In one embodiment, the apparatus 29-100 may include a three-dimensional integrated circuit. In one embodiment, the first semiconductor platform 29-102 and the second semiconductor platform 29-106 together may include a three-dimensional integrated circuit. In the context of the present description, a three-dimensional integrated circuit refers to any integrated circuit comprised of stacked wafers and/or dies (e.g. silicon wafers and/or dies, etc.), which are interconnected vertically and are capable of behaving as a single device.

For example, in one embodiment, the apparatus 29-100 may include a three-dimensional integrated circuit that is a wafer-on-wafer device. In this case, a first wafer of the wafer-on-wafer device may include the first memory of the first memory class, and a second wafer of the wafer-on-wafer device may include the second memory of the second memory class.

In the context of the present description, a wafer-on-wafer device refers to any device including two or more semiconductor wafers that are communicatively coupled in a wafer-on-wafer configuration. In one embodiment, the wafer-on-wafer device may include a device that is constructed utilizing two or more semiconductor wafers, which are aligned, bonded, and possibly cut in to at least one three-dimensional integrated circuit. In this case, vertical connections (e.g. TSVs, etc.) may be built into the wafers before bonding or created in the stack after bonding. In one embodiment, the first semiconductor platform 29-102 and the second semiconductor platform 29-106 together may include a three-dimensional integrated circuit that is a wafer-on-wafer device.

In another embodiment, the apparatus 29-100 may include a three-dimensional integrated circuit that is a monolithic device. In the context of the present description, a monolithic device refers to any device that includes at least one layer built on a single semiconductor wafer, communicatively coupled, and in the form of a three-dimensional integrated circuit. In one embodiment, the first semiconductor platform 29-102 and the second semiconductor platform 29-106 together may include a three-dimensional integrated circuit that is a monolithic device.

In another embodiment, the apparatus 29-100 may include a three-dimensional integrated circuit that is a die-on-wafer device. In the context of the present description, a die-on-wafer device refers to any device including one or more dies positioned on a wafer. In one embodiment, the die-on-wafer device may be formed by dicing a first wafer into singular dies, then aligning and bonding the dies onto die sites of a second wafer. In one embodiment, the first semiconductor platform 29-102 and the second semiconductor platform 29-106 together may include a three-dimensional integrated circuit that is a die-on-wafer device.

In yet another embodiment, the apparatus 29-100 may include a three-dimensional integrated circuit that is a die-on-die device. In the context of the present description, a die-on-die device refers to a device including two or more aligned dies in a die-on-die configuration. In one embodiment, the first semiconductor platform 29-102 and the second semiconductor platform 29-106 together may include a three-dimensional integrated circuit that is a die-on-die device.

Additionally, in one embodiment, the apparatus 29-100 may include a three-dimensional package. For example, the three-dimensional package may include a system in package (SiP) or chip stack MCM. In one embodiment, the first semiconductor platform and the second semiconductor platform are housed in a three-dimensional package.

In one embodiment, the apparatus 29-100 may be configured such that the first memory and the second memory are capable of receiving instructions from a device 29-108 via the single memory bus 29-110. In one embodiment, the device 29-108 may include one or more components from the following list (but not limited to the following list): a central processing unit (CPU); a memory controller, a chipset, a memory management unit (MMU); a virtual memory manager (VMM); a page table, a table lookaside buffer (TLB); one or more levels of cache (e.g. L1, L2, L3, etc.); a core unit; an uncore unit; etc.

In the context of the following description, optional additional circuitry 29-104 (which may include one or more circuitries each adapted to carry out one or more of the features, capabilities, etc. described herein) may or may not be included to cause, implement, etc. any of the optional architectures, features, capabilities, etc. disclosed herein. While such additional circuitry 29-104 is shown generically in connection with the apparatus 29-100, it should be strongly noted that any such additional circuitry 29-104 may be positioned in any components (e.g. the first semiconductor platform 29-102, the second semiconductor platform 29-106, the device 29-108, an unillustrated logic unit or any other unit described herein, a separate unillustrated component that may or may not be stacked with any of the other components illustrated, a combination thereof, etc.).

In another embodiment, the additional circuitry 29-104 may or may not be capable of receiving (and/or sending) a data operation request and an associated a field value. In the context of the present description, the data operation request may include a data write request, a data read request, a data processing request and/or any other request that involves data. Still yet the field value may include any value (e.g. one or more bits, protocol signal, any indicator, etc.) capable of being recognized in association with a field that is affiliated with memory class selection. In various embodiments, the field value may or may not be included with the data operation request and/or data associated with the data operation request. In response to the data operation request, at least one of a plurality of memory classes may be selected, based on the field value. In the context of the present description, such selection may include any operation or act that results in use of at least one particular memory class based on (e.g. dictated by, resulting from, etc.) the field value. In another embodiment, a data structure embodied on a non-transitory readable medium may be provided with a data operation request command structure including a field value that is operable to prompt selection of at least one of a plurality of memory classes, based on the field value. As an option, the foregoing data structure may or may not be employed in connection with the aforementioned additional circuitry 29-104 capable of receiving (and/or sending) the data operation request.

In yet another embodiment, at least one circuit (e.g. the additional circuitry 29-104 and/or another circuit, etc.) may be provided that is separate from a processing unit and may be operable for controlling a refresh of at least one of the first memory or the second memory. In one embodiment, the at least one circuit may be operable for controlling the refresh via a plurality of refresh commands. In this case, in one embodiment, the plurality of refresh commands may be staggered.

In various embodiments, the at least one circuit that is be operable for controlling a refresh of at least one of the first memory or the second memory may include a variety of devices, components, and/or functionality. For example, in one embodiment, the at least one circuit may include a logic circuit. In another embodiment, the at least one circuit may be part of at least one of the first semiconductor platform 29-102 or the second semiconductor platform 29-106. In another embodiment, the at least one circuit may be separate from the first semiconductor platform 29-102 and the second semiconductor platform 29-106. In another embodiment, the at least one circuit may be part of a third semiconductor platform stacked with the first semiconductor platform 29-102 and the second semiconductor platform 29-106.

Further, in one embodiment, the plurality of refresh commands may be a function of memory access commands. Additionally, in one embodiment, the plurality of refresh commands may be a function of at least one temperature (e.g. the temperature of the first memory or a portion thereof, the temperature of the second memory or a portion thereof, etc.).

Further, in one embodiment, the at least one circuit may be operable such that a power is controlled in connection with the refresh (e.g. a power associated with the first memory or a portion thereof, a power associated with the second memory or a portion thereof, a powered associated with a memory controller, a power associated with a logic circuit, the at least one circuit, etc.). In another embodiment, the at least one circuit may be operable such that a state is controlled in connection with the refresh. For example, in one embodiment, a state of the first memory or the second memory may be controlled in connection with the refresh. In another embodiment, the at least one circuit may be operable such that the state includes a state of the at least one circuit. In another embodiment, the at least one circuit may be operable such that the state includes a refresh state. In one embodiment, the at least one circuit may be operable such that the state includes a power state.

Furthermore, the refresh may be controlled utilizing a variety of techniques. For example, in one embodiment, the at least one circuit may be operable for controlling the refresh via a plurality of refresh modes. In another embodiment, the at least one circuit may be operable for controlling the refresh by controlling a refresh interval. In another embodiment, the at least one circuit may be operable for controlling the refresh via at least one timer. Additionally, in one embodiment, the at least one circuit may be operable for controlling the refresh of the first memory and the second memory.

As set forth earlier, any one or more of the foregoing optional architectures, capabilities, and/or features may or may not be used in combination with any other one or more of such optional architectures, capabilities, and/or features. Still yet, any one or more of the foregoing optional architectures, capabilities, and/or features may be implemented utilizing any desired apparatus, method, and program product (e.g. computer program product, etc.) embodied on a non-transitory readable medium (e.g. computer readable medium, etc.). Such program product may include software instructions, hardware instructions, embedded instructions, and/or any other instructions, and may be used in the context of any of the components (e.g. platforms, processing unit, MMU, VMM, TLB, etc.) disclosed herein, as well as semiconductor manufacturing/design equipment, as applicable.

Even still, while embodiments are described where any one or more of the foregoing optional architectures, capabilities, and/or features may or may not be incorporated into a memory system, additional embodiments are contemplated where a processing unit (e.g. CPU, GPU, etc.) is provided in combination with or in isolation of the memory system, where such processing unit is operable to cooperate with such memory system to accommodate, cause, prompt and/or otherwise cooperate, coordinate, etc. with the memory system to allow for any of the foregoing optional architectures, capabilities, and/or features. For that matter, further embodiments are contemplated where a single semiconductor platform (e.g. 29-102, 29-106, etc.) is provided in combination with or in isolation of any of the other components disclosed herein, where such single semiconductor platform is operable to cooperate with such other components disclosed herein at some point in a manufacturing, assembly, OEM, distribution process, etc., to accommodate, cause, prompt and/or otherwise cooperate with one or more of the other components to allow for any of the foregoing optional architectures, capabilities, and/or features. To this end, any description herein of receiving, processing, operating on, reacting to, etc. signals, data, etc. may easily be replaced and/or supplemented with descriptions of sending, prompting/causing, etc. signals, data, etc. to address any desired cause and/or effect relationship among the various components disclosed herein.

It should be noted that while the embodiments described in this specification and in specifications incorporated by reference may show examples of stacked memory system and improvements to stacked memory systems, the examples described and the improvements described may be generally applicable to a wide range of memory systems and/or electrical systems and/or electronic systems. For example, improvements to signaling, yield, bus structures, test, repair etc. may be applied to the field of memory systems in general as well as systems other than memory systems, etc. Furthermore, it should be noted that the embodiments/technology/functionality described herein are not limited to being implemented in the context of stacked memory packages. For examples, in one embodiment, the embodiments/technology/functionality described herein may be implemented in the context of non-stacked systems, non-stacked memory systems, etc. For example, in one embodiment, memory chips and/or other components may be physically grouped together using one or more assemblies and/or assembly techniques other than stacking. For example, in one embodiment, memory chips and/or other components may be electrically coupled using techniques other than stacking. Any technique that groups together (e.g. electrically and/or physically, etc.) one or more memory components and/or other components may be used.

More illustrative information will now be set forth regarding various optional architectures, capabilities, and/or features with which the foregoing techniques discussed in the context of any of the Figure(s) may or may not be implemented, per the desires of the user. For instance, various optional examples and/or options associated with the configuration/operation of the apparatus 29-100, the configuration/operation of the first and/or second semiconductor platforms, and/or other optional features (e.g. transforming the plurality of commands or packets in connection with at least one of the first memory or the second memory, etc.) have been and will be set forth in the context of a variety of possible embodiments. It should be strongly noted that such information is set forth for illustrative purposes and should not be construed as limiting in any manner. Any of such features may be optionally incorporated with or without the inclusion of other features described.

It should be noted that any embodiment disclosed herein may or may not incorporate, at least in part, various standard features of conventional architectures, as desired. Thus, any discussion of such conventional architectures and/or standard features herein should not be interpreted as an intention to exclude such architectures and/or features from various embodiments disclosed herein, but rather as a disclosure thereof as exemplary optional embodiments with features, operations, functionality, parts, etc., which may or may not be incorporated in the various embodiments disclosed herein.

FIG. 29-2

FIG. 29-2 shows a refresh system for a stacked memory package 29-200, in accordance with one embodiment. As an option, the stacked memory package may be implemented in the context of the previous Figure(s) and/or any subsequent Figure(s). Of course, however, the stacked memory package may be implemented in the context of any desired environment.

For example, the refresh system for a stacked memory package may be implemented in the context of FIG. 19 of U.S. Provisional Application No. 61/585,640, filed Jan. 31, 2012, titled "SYSTEM, METHOD, AND COMPUTER PROGRAM PRODUCT FOR IMPROVING MEMORY SYSTEMS."

In FIG. 29-2 the refresh system for a stacked memory package 29-200 may include one or more stacked memory packages 29-212 in a memory system. The stacked memory packages may be packaged, assembled, constructed, linked, joined, built, processed, manufactured, etc. in any way. For example, the stacked memory packages may be assembled, manufactured, constructed, etc. on a motherboard, PCB, planar, board, substrate, etc. with other components. For example, the stacked memory packages may be assembled etc. on a module (e.g. multi-chip module, MCM, other module, assembly, structure, combinations of these and/or other modules or the like, etc.). The memory system may include one or more other system components (not shown in FIG. 29-2). More than one memory system may be used in a system (e.g. in a datacenter server, etc.).

In FIG. 29-2, the one or more stacked memory packages 29-212 in a memory system may be coupled to one or more CPUs 29-210. The stacked memory packages may be coupled, connected, interconnected, etc. to one or more CPUs and/or other system components in any way.

In FIG. 29-2, the one or more stacked memory packages 29-212 in a memory system may include one or more stacked memory chips. The one or more stacked memory chips may include one or more of the following (but are not limited to the following): one or more memory die, one or more semiconductor platforms, one or more memory platforms, and/or other memory, storage, etc. die, modules, assemblies, structures, constructions, platforms, stages, frames, etc. The one or more stacked memory chips need not be physically stacked (e.g. vertically arranged, etc.) and may be assembled, arranged, constructed, joined, linked, connected, coupled, etc. in one or more stacks, assemblies, montages, matrix, arrays, clusters, honeycombs, crystals, towers, pyramids, blocks, cells, piles, heaps, clumps, combinations of these and/or similar regular structures and/or irregular structures, etc.

In FIG. 29-2, the one or more stacked memory packages 29-212 in a memory system may include one or more logic chips 29-214. The one or more logic chips may include one or more of the following (but are not limited to the following): digital logic chips, ASICs, FPGAs, ASSPs, analog chips, optical chips, wireless chips, buffers, mixed analog-digital chips, networking chips, combinations of these and/or other chips, die, substrates, modules, etc.

In FIG. 29-2, the refresh system for a stacked memory package may include one or more circuits 29-216 in one or more stacked memory packages that may be operable to refresh data stored in one or more stacked memory chips and/or other storage/memory etc.

In FIG. 29-2 the refresh system for a stacked memory package may include a logic chip in a stacked memory package that may include one or more of each of the following circuit blocks and/or functions (but not limited to the following): PHY and data layer, command decode, message encode, refresh engine, refresh region table, data engine, etc. Any number of logic chips and/or other chips, etc. may be used. Not all of the circuit blocks and/or functions shown in FIG. 29-2 need be present. One or more of the circuit blocks and/or functions shown in FIG. 29-2 may be implemented by different techniques. For example, a refresh region table may be implemented by using a single storage component (e.g. NAND flash, SRAM, etc.) or combinations of components (e.g. registers, register files, memory arrays, DRAM, NAND flash, SRAM, multiport memory, scratchpad memory, combinations of these and/or other memory components, circuits, blocks, etc.). Similarly, any circuit, function, etc. shown in FIG. 29-2 may be implemented by different components, groups of components, different circuits, groups of circuits, combinations of these and/or other circuits, components, blocks, functions, etc. One or more of the circuit blocks and/or functions shown in FIG. 29-2 may be distributed. For example, the functions of one or more refresh engines may be distributed between one or more logic chips and one or more memory chips. Similarly, other circuits and functions that may be shown in FIG. 29-2 may be distributed between, for example, one or more of the following (but not limited to the following): one or more CPUs, one or more logic chips, one or more memory chips, one or more other system components, etc. The refresh system for a stacked memory package may include components, functions, blocks, etc. that may not all be shown in FIG. 29-2. For example, a refresh engine may include one or more of the following (but not limited to the following): counters, decrementers, incrementers, incrementer/decrementer, encoders, decoders, MUXes, de-MUXes, buffers, stacks, arbiters, selecters, random logic, priority encoders, tables, lists, lookup tables, registers, controllers, microcontrollers, processors, logic engines, CPUs, ALUs, state machines, adders, subtracters, scoreboards, buses, combinations of these and/or other logic functions, circuits, blocks, etc. Similarly, any circuit, function, etc. shown in FIG. 29-2 may include other logic functions, circuits, blocks, etc. The circuits and functions that may be shown in FIG. 29-2 may be linked, coupled, connected, joined, interconnected, etc. by other logic functions, circuits, blocks, etc. that may not be shown.

One or more aspects, features, functions, properties, techniques, algorithms, etc. of the refresh system for a stacked memory package may be applied in other contexts, applications, systems, constructions, assemblies, products, etc. One or more aspects, features, functions, properties, techniques, algorithms, etc. of the refresh system for a stacked memory package may be adapted, modified, combined, altered, configured, programmed, etc. for specialized use e.g. mobile electronic devices, portable electronic systems, miniaturized systems, low-power systems, data servers, enterprise servers and/or data appliances, etc. For example, one or more of the logic chips and/or stacked memory chips and/or CPUs may be located on the same die. For example, one or more die may contain any combinations of the following (but not limited to the following): one or more logic chips (possibly of different types, ASICs, FPGAs, ASSPs, combinations of these and/or other logic chips, etc.), one or more stacked memory chips (possibly using different technologies, a mix of one or more technologies, etc.), one or more CPUs (possibly of different types, multi-core CPUs, heterogeneous array(s) of CPUs, homogeneous array(s) of CPUs, combinations of these and/or other chips (e.g. analog chips, optical chips, buffers, mixed analog-digital chips, networking chips, etc.), processors, controllers, CPUs, etc.), combinations of these and/or other chips, die, substrates, etc. For example, one or more of the logic chips and/or stacked memory chips and/or CPUs and/or other chips, die, etc. may be located in, on, within, etc. the same package, assembly, module, board, planar, combinations of these and/or other physical, electrical, electronic, etc. structures, etc. For example, one or more aspects, features, functions, properties, techniques, algorithms, behaviors, etc. of the refresh system for a stacked memory package may be distributed between one or more of the logic chips and/or one or more of the stacked memory chips and/or one or more of the CPUs and/or other system components, chips, die, structures, modules, assemblies, etc. Thus, for example, all or part(s) of the one or more logic chips may be separate or integrated with all or part(s) of the one or more memory chips. Thus, for example, all or part(s) of the one or more logic chips may be separate or integrated with all or part(s) of the one or more CPUs. Thus, for example, any part(s) (including all) of the logic chips, CPUs, memory chips may be separate or integrated in any manner.

In one embodiment, the logic chip in a stacked memory package may be operable to refresh memory data.

In one embodiment, the logic chip in a stacked memory package may be operable to receive one or more refresh commands. In one embodiment, the logic chip in a stacked memory package may be operable to perform one or more refresh operations. In one embodiment, the logic chip in a stacked memory package may be operable to generate one or more refresh signals.

In a stacked memory package, a refresh command may be received, for example, via one or more high-speed links as a packet, via SMBus, or via other communication techniques, etc. In this case, for example, the nature, appearance, etc. of the command packet etc. may be different from the nature, appearance, etc. of a command applied (e.g. via one or more signals applied to one or more external pins) to a standard SDRAM part. For example, a refresh command may appear in a packet as a field code, command code, flag, etc. For example a command corresponding to a refresh command may be indicated by a command field of "01" (by way of example only). The refresh command packet, which may be referred to as an external refresh command (e.g. external to the stacked memory package, etc.), may be converted, transformed, translated, etc. to another form of refresh command, which may be referred to as an internal refresh command (e.g. internal to the stacked memory package, etc.). For example, the refresh command packet may result in creation, scheduling, execution, performance of, etc. one or more of the following (but not limited to the following): refresh functions, refresh operations, refresh signals, etc. In some case, the command packet may result in the generation of signals, operations, etc. that may be equivalent to the signals, operations, etc. generated in a standard part, but this is not necessarily the case. The use of the terms command, refresh command, etc. may generally be inferred from the context of their use. In general, the use of the terms command, refresh command etc, as used in this specification, may refer to the command as received, for example, in a packet (e.g. external command, etc.) or generated for example, by one or more logic chips, etc. (e.g. internal command, etc.) In this specification, the use of the term refresh operations, etc. may refer to the result of a refresh command (internal or external).

In one embodiment, the logic chip may be operable to transmit and/or receive commands (including refresh commands, initialization commands, calibration commands, memory access commands, system messages, etc.), instructions, data (e.g. sensor readings, temperatures of system components, etc.), information, signals (e.g. reset, etc.) etc. using one or more channels. The channels may include for example one or more of the following (but not limited to the following): SMBus, I2C bus, high-speed serial links, parallel bus, serial bus, sideband bus, combinations and/or groups of these and/or other buses, etc. For example, the main communication channels between memory system components may use high-speed serial links, but an SMBus etc. may be used for initialization (e.g. to provide initialization code at start-up, SPD data, boot code, calibration data, initialization commands, register settings, etc.), during operation (e.g. to exchange measurement data, error statistics, sensor readings, operating statistics, traffic statistics, error signals, test requests, test results, etc.), or combinations of these times, or at any time (e.g. manufacture, test, assembly, etc.).

In one embodiment, the logic chip in a stacked memory package may include one or more refresh engines (e.g. circuits, functions, blocks, etc.). For example, a logic chip may include one or more memory controllers and each memory controller may contain a refresh engine. For example, a logic chip may include one or more memory controllers and each memory controller may contain a portion of the refresh engine or one or more refresh engines, etc. In one embodiment, the refresh engine(s) may be responsible for (e.g. may implement, may perform, may control, etc.) some or all of the memory refresh operations, etc. In one embodiment, one or more refresh engine(s) may act (e.g. operate, function, execute, behave, run, etc.) cooperatively, in a coordinated fashion, etc. and be responsible for some or all of the memory refresh operations, etc. In one embodiment, one or more refresh engine(s) may be responsible for one or more operations, functions, measurements, etc. in addition to refresh operations, functions, etc.

In one embodiment, one or more circuits, functions, blocks, etc. of the refresh system may be programmed. In one embodiment, for example, the refresh engine(s) may be programmed (e.g. controlled, directed, configured, enabled, managed, etc.) by the CPU(s) and/or other memory system component(s). In one embodiment, for example, the refresh engine(s), data engine(s), other flexible circuit block, function, etc. may include one or more controllers, microcontrollers, and/or logic controlled by software, firmware, code, microcode, instructions, combinations of these, etc. In one embodiment, for example, a first set of one or more refresh engines may be programmed etc. by a second set of one or more refresh engines and/or other system components, parts, blocks, circuits, functions, etc.

In one embodiment, the logic chip in a stacked memory package may include one or more data engines (e.g. circuits, functions, blocks, etc.). For example, a data engine may be responsible for handling read data, write data, other data, etc.

In one embodiment, the data engine(s) and/or other system parts, components, etc. may be operable to measure refresh related data, acquire information, etc. For example, the data engine(s) etc. may measure retention times (e.g. memory data retention times, etc.). Memory data retention may be measured, for example, using one or more dummy cells, using one or more spare cells, combinations of these and/or other circuits, etc. and/or measured as part of one or more refresh operations, and/or using other techniques, etc. Memory data retention times and/or any other data, parameters, information, etc. may be measured, captured, acquired, etc. at any time. Data retention times may be stored, for example, in one or more memory components, parts, circuits, etc. For example, data retention times may be stored in non-volatile memory on a logic chip.

In one embodiment, the measurement of retention times and/or other refresh data, information, etc. may be used to control the refresh system and/or parts of the refresh system and/or other components of the memory system. In one embodiment, for example, the measurement of retention times and/or other refresh data, other information, etc. may be used to control one or more functions of the refresh engine(s).

In one embodiment, retention times and/or other refresh data, other information, etc. may be measured or otherwise provided to one or more refresh engines by one or more system components, parts, circuits, etc.

In one embodiment, one or more parameters, features, behaviors, algorithms, etc. of a refresh engine may be controlled by (e.g. varied with, set by, determined by, a function of, derived from, etc.) the measured, acquired, or otherwise provided data, information, etc. For example, in one embodiment, the refresh period (e.g. refresh interval, etc.) used by, for example, a refresh engine may be controlled by the measured retention time(s) of one or more portions of one or more stacked memory chips.

In one embodiment, the refresh system may selectively refresh one or more areas of one or more stacked memory chips. In one embodiment, for example, the refresh engine(s) may refresh only areas (e.g. portions, parts, etc.) of one or more stacked memory chips that are in use (e.g. that have been accessed, that contain stored data, etc.).

In one embodiment, the refresh system may selectively refresh one or more areas of one or more stacked memory chips according to the content of one or more areas of one or more stacked memory chips. In one embodiment, for example, the refresh engine(s) may not refresh one or more areas of one or more stacked memory chips that contain fixed values.

In one embodiment, one or more circuits, functions, etc. of the refresh system may be programmed to refresh one or more areas of one or more stacked memory chips. In one embodiment, for example, the refresh engine(s) may be programmed to refresh one or more areas of one or more stacked memory chips.

In one embodiment, one or more circuits, functions, etc. of the refresh system and/or other system components may generate, create, measure, calculate, etc. refresh information and/or information related to refresh, etc. For example, the refresh engine(s) may generate, create, measure, calculate, etc. refresh information and/or information related to refresh, etc.

In one embodiment, the refresh information may include (but is not limited to) refresh period, refresh interval, refresh schedule, status, state, other parameters, values, combinations of these and/or other data, information, measurements, statistics, etc. For example, in one embodiment, information may be provided for one or more areas of one or more stacked memory chips, the intended refresh target(s) (e.g. for the next N refresh operations, etc.), information about the current timing and/or state of one or more refresh algorithms, and/or other information, etc. In a memory system using one or more stacked memory packages connected by a packet network it may not be necessary to convey exact and/or precise timing information (e.g. as part of the refresh schedule, etc.). For example, information on the refresh schedule(s) or state(s) of the refresh algorithm(s) may provide sufficient hints and/or direction to the CPU that may improve performance, etc.

Alternative configurations, architectures, circuit and/or function partitioning for the refresh system for a stacked memory package are possible. For example, the functions of the refresh engine(s) may be split (e.g. divided, separated, spread, distributed, apportioned, etc.) between the CPU and/or logic chip and/or one or more stacked memory chips and/or other system component(s). For example, the functions of the data engine(s) may be split between the CPU and/or logic chip and/or one or more stacked memory chips. For example, the functions of the refresh region table(s) may be split between the CPU and/or logic chip and/or one or more stacked memory chips.

In one embodiment, one or more refresh functions may be split, for example, between one or more logic chips and one or more memory chips. For example, one or more internal refresh commands may be generated by one or more logic chips that may generate one or more refresh signals. One or more (e.g. a subset, etc.) of the one or more refresh signals may be applied to one or more memory chips (e.g. not all generated refresh signals necessarily are necessarily coupled to every memory chip, but may be, etc.). The refresh signal subset may cause one or more circuits etc. on a memory chip to perform one or more refresh operations. For example, a refresh counter on a memory chip may provide a row address and/or bank address for the rows to be refreshed under the control of the refresh signal subset. Thus, refresh commands, refresh operations etc. may be a result of circuits, functions, etc. split, divided etc. between, for example, one or more parts of a stacked memory package.

In one embodiment, the CPUs and/or other system components may adjust, configure, control, direct, change, alter, modify, adapt, etc. one or more refresh properties (e.g. timing of refresh commands and/or refresh operations, frequency of refresh commands and/or refresh operations, staggering of refresh commands and/or refresh operations, spacing of refresh commands and/or refresh operations, refresh period, refresh frequency, refresh interval, refresh schedule, refresh algorithm(s), refresh behavior, combinations of these and/or other properties, etc.) based, for example, on information received from one or more refresh engines and/or other circuit blocks, functions, etc.

In one embodiment, for example, the refresh system for a stacked memory package may be operable to refresh memory data by using (e.g. employing, executing, performing, implementing, operating in, etc.) one or more refresh modes (e.g. algorithms, configurations, architectures, functions, behaviors, etc.). Different (e.g. alternative, etc.) refresh modes etc. are possible and the following descriptions may provide examples of several different refresh modes.

In one embodiment, for example, the refresh system for a stacked memory package may be operable to refresh data by using an external refresh mode. For example, in an external refresh mode, the refresh operations, algorithms, functions, etc. may be at least partially controlled by one or more components external to (e.g. logically separate from, etc.) the stacked memory package. For example, in an external refresh mode, the stacked memory package may be dependent or partly dependent on external influence (e.g. inputs, packets, commands, messages, signals, combinations of these, etc.) to perform one or more refresh operations. For example, in an external refresh mode, one or more logic chips may receive external refresh commands, commands including refresh instructions, commands including one or more refresh operations, combinations of these and/or other commands, instructions, messages, etc. related to refresh operations, etc. For example, the logic chip may receive external refresh commands etc. from one or more CPUs and/or other system components in a memory system. The logic chip may decode, interpret, disassemble, parse, translate, adapt, transform, process, etc. one or more external refresh commands etc. and initiate, create, generate, assemble, execute, issue, convey, send, transmit, etc. one or more internal refresh operations (e.g. using signals, using commands, using combinations of these and/or other techniques to initiate, control, create etc. one or more refresh operations, etc.) that may be directed at (e.g. conveyed to, issued to, transmitted to, sent to, etc.) one or more memory chips and/or parts of one or more memory chips (e.g. including parts, portions, etc. of one or more memory chips, etc.). For example, a single external refresh command may translate to multiple internal refresh operations, etc.

In one embodiment, the refresh system for a stacked memory package may be operable to refresh data by using an external refresh mode with direct input. For example, in an external refresh mode with direct input, one or more logic chips may receive refresh commands that contain raw (e.g. DRAM native, native command, etc.) refresh instructions (e.g. refresh, self-refresh, partial array self-refresh, etc.). The raw instructions may form direct input, for example, to the refresh system for a stacked memory package. The raw instructions may, for example, follow a standard (e.g. JEDEC SDRAM standard, mobile DRAM standard, etc.) or may follow a manufacturer specification, or may be unique to a stacked memory package, etc. One or more of the raw instructions may, for example, be encoded in packet form. For example, a refresh instruction may be encoded as a specified bit pattern (e.g. "01", etc.) in a command field (e.g. code field, etc.), possibly with flags, options, etc. Any bit patterns may be used. The command fields, code fields, flags, options, etc. may be any width and hold (e.g. contain, etc.) any values, etc. A direct input (e.g. refresh command, raw instruction, etc.) may contain any command, instruction, information, data, fields, flags, operation code, options, microcode, etc.

In one embodiment, the refresh system for a stacked memory package may be operable to refresh data by using an external refresh mode with indirect input. For example, in an external refresh mode with indirect input, one or more logic chips may receive refresh commands that contain indirect refresh instructions. The indirect refresh instructions may, for example, form indirect input to the refresh system for a stacked memory package. For example, an indirect refresh instruction may cause one or more logic chips to issue refresh operations for a specified period of time, etc. The specified time may, for example, be included in the indirect refresh instruction or specified (e.g. programmed, configured, etc.) by loading a register, etc. For example, an indirect refresh instruction may be translated, transformed, etc. by one or more refresh engines on one or more logic chips to one or more internal refresh operations, etc. An indirect input (e.g. refresh instruction, etc.) may contain any information, data, etc.

In one embodiment, the refresh system for a stacked memory package may be operable to refresh data by using an internal refresh mode. For example, in an internal refresh mode the refresh operations, algorithms, functions, etc. may be largely contained in (e.g. completely contained in, mostly contained in, centered on, etc.) the stacked memory package. For example, in an internal refresh mode, the refresh operations, algorithms, functions, etc. may be mostly or completely controlled by one or more components internal to (e.g. logically a part of, etc.) a stacked memory package. For example, in an internal refresh mode, the stacked memory package may be independent or nearly independent of external inputs etc. in performing one or more refresh operations. For example, one or more refresh engines in one or more logic chips may be responsible for creating, directing, controlling, etc. internal refresh operations possibly with some input provided from external refresh commands. For example, in an internal refresh mode, one or more logic chips may be responsible for creating, controlling, directing, etc. refresh operations. For example, one or more refresh engines in one or more logic chips may be responsible for creating, directing, controlling, etc. internal refresh operations independently of any external input commands.

In one embodiment, the refresh system for a stacked memory package may be operable to refresh data in an internal refresh mode with indirect input. For example, in an internal refresh mode with indirect input, one or more logic chips may receive refresh commands that may contain refresh information that may be used by one or more logic chips to control, modify, etc. the behavior of the internal refresh system. For example, a CPU may inform one or more logic chips in a stacked memory package of temperature data, etc. using one or more refresh commands and/or messages. The temperature data may be used, for example, by one or more refresh engines in one or more logic chips to control, for example, the refresh frequency. Any data, information, signals, etc. may be used, for example, as indirect inputs.

In one embodiment, the refresh system may operate in one or more serial refresh modes and/or parallel refresh modes. For example, one or more banks may be refreshed in parallel (e.g. at the same time, at nearly the same time, in a staggered times, at offset times, at closely spaced times, etc.). Any parts, portions, combinations of parts, portions, etc. of one or more memory regions may be refreshed in a parallel manner. For example, one or more cells, rows, mats, sections, echelons, groups of these and/or other memory regions, classes, etc. may be refreshed in a parallel manner. For example, one or more banks may be refreshed in a serial manner (e.g. at spaced times, one after another, etc.). Any parts, portions, combinations of parts, portions, etc. of one or more memory regions may be refreshed in a serial manner. For example, one or more cells, rows, mats, sections, echelons, groups of these and/or other memory regions, classes, etc. may be refreshed in a serial manner.

In one embodiment, combinations of one or more serial refresh modes and/or one or more parallel refresh modes may be employed in a nested (e.g. hierarchical, recursive, etc.) fashion, etc. For example, a first set of one or more echelons may be refreshed in parallel or series with a second set of one or more echelons and one or more sections included in the first set of one or more echelons may be refreshed in series or in parallel, etc. Control of the parts, portions, etc. using series and/or parallel refresh operations and/or other modes and/or the timing (e.g. spacing, staggering, etc.) of the series and/or parallel refresh operations and/or other refresh operations at one or more levels of hierarchy may be used, for example, to control power draw. For example, power draw may be made relatively constant by increasing refresh operations with reduced memory access traffic and decreasing refresh operations with increased memory access traffic.

In one embodiment, combinations of one or more serial refresh modes and/or one or more parallel refresh modes may be used with one or more of the following modes: internal refresh mode, internal refresh mode with direct input, internal refresh mode with indirect input, external refresh mode, external refresh mode with direct input, external refresh mode with indirect input, and/or other modes, configurations, etc.

In one embodiment, the one or more serial refresh modes and/or parallel refresh modes and/or other refresh modes etc. may be programmed, configured, controlled, etc. For example, the parts, portions, etc. to be refreshed may be controlled. For example, the timing of the refresh operations for different parts, portions, etc. may be controlled, etc.

In one embodiment, the one or more serial refresh modes and/or parallel refresh modes and/or other modes etc. may be programmed, configured, controlled, etc. and may depend on the use of spare cells, banks, rows, columns, sections, echelons, chips, etc. For example, if a spare row etc. is switched into use (e.g. at manufacture, assembly, test, start-up, during operation, at any time, etc.) a different timing, spacing, staggering, sequence, mode, combinations of these and/or other refresh properties and/or other memory system aspects, behaviors, features, properties, metrics, parameters, etc. may be programmed etc.

Various combinations and permutations of refresh mode(s) are possible. Thus, for example, one or more parts, portions, sections, etc. of the refresh algorithms, methods, modes, etc. described above may be performed internally (e.g. by one or more logic chips, by one or more refresh engines, by one or more stacked memory chips, by combinations of these and/or other circuits, functions, etc.) and one or more parts may be performed externally (e.g. by CPU command, by commands and/or instructions and/or information etc. from other system components, by combinations of these and/or other circuits, functions, components, signals, data, information, etc.). Thus, for example, one or more parts, portions, sections, etc. of the refresh algorithms, methods, modes, etc. described above may be controlled (e.g. directed, managed, enabled, configured, programmed, etc.) or partly controlled by direct input and one or more parts may be controlled etc. by indirect input.

The refresh modes and/or other techniques etc. described herein may be adapted, modified, combined, merged, etc. For example, in one embodiment the stacked memory packages in a memory system may be operated in an internal refresh mode. In this case, for example, each stacked memory package may internally generate refresh commands and/or refresh operations. Each stacked memory chip may optionally provide some external input to other stacked memory chips on the status, progress, timing, state, etc. of refresh operations, activities, etc. For example, a stacked memory chip may optionally use inputs from other stacked memory chips and/or other system components to allow refresh and/or other operations to be coordinated, to be controlled, to act cooperatively, etc. For example, a first set of one or more stacked memory chips may use one or more inputs from a second set of one or more stacked memory chips to allow refresh and/or other operations to be timed such that one or more system metrics may be optimized, etc. For example, one or more stacked memory chips may use one or more inputs to allow (e.g. permit, enable, etc.) refresh and/or other operations to be timed such that current draw, current peaks, are minimized, etc. Thus, in this case, for example, one or more stacked memory packages may be operated in an internal refresh mode but possibly with some external input. As another example, a refresh engine may optionally use inputs from other refresh engines and/or other system components to allow refresh and/or other operations to be coordinated, to be controlled, to act cooperatively, etc. For example, a first set of one or more refresh engines may use one or more inputs from a second set of one or more refresh engines to allow refresh and/or other operations to be timed such that one or more system metrics may be optimized, etc. For example, one or more refresh engines may use one or more inputs to allow (e.g. permit, enable, etc.) refresh and/or other operations to be timed such that current draw, current peaks, are minimized, etc. Thus, in this case, for example, one or more refresh engines may be operated in an internal refresh mode but possibly with some external input.

In one embodiment, the functions, behaviors, algorithms, implementation, execution, operation, etc. of one or more serial refresh modes and/or parallel refresh modes and/or other refresh modes etc. may be split between one or more refresh engines and/or one or more other refresh circuits, logic functions, logic blocks, etc. For example, a logic chip in a stacked memory package may contain one refresh engine for each memory controller and may contain one memory controller for each echelon (or other memory part(s), memory portion(s), memory region(s), etc.). For example, the refresh engine may operate relatively independently (e.g. autonomously, semi-autonomously, etc.) for each echelon (e.g. with little external input, no external input, etc.). For example, the other refresh circuits, logic functions, logic blocks, etc. may be common to all memory chips etc. For example, the other refresh circuits, logic functions, logic blocks, etc. may operate by providing input to the one or more refresh engines and/or controlling the one or more refresh engines (e.g. in a static manner using register settings, in a dynamic manner using control signals, etc.). For example, the other refresh circuits, logic functions, logic blocks, etc. may be controlled with external inputs (e.g. direct, indirect, etc.) and/or may operate relatively independently (e.g. autonomously, semi-autonomously, etc.).

Other such adaptations, modifications, variants, combinations, etc. of the techniques described herein and similar to the example described are possible. Thus, it should be noted that any categorizations, terms, definitions, classifications, explanations, architectures, algorithms, operation, etc. (e.g. of refresh modes, etc.) should not be regarded as absolute (e.g. without exception, deviation, etc.), or as limiting (in scope, coverage, etc.), etc. but rather as part of a methodology to clarify this description and explanations herein.

In one embodiment, one or more system components may exchange refresh related data and/or any other data, information, status, state, operation progress, failures, errors, actions, sensor readings, test patterns, readings, signals, indicators, test results, measurements, to allow refresh operations, behavior, functions, aspects, features, algorithms, combinations of these and/or other operations, behavior, functions, aspects, features, algorithms, combinations of these to be coordinated, to be managed, programmed, altered, modified, controlled, to act cooperatively, etc. For example, in one embodiment, one or more system components may exchange refresh related data and/or any other data, information, status, state, operation progress, failures, errors, actions, sensor readings, test patterns, readings, signals, indicators, test results, measurements, etc. For example, in one embodiment, the refresh engine(s) may inform the CPUs of refresh related data and/or other data, information, status, etc. and/or the CPUs may inform the refresh engine(s) of refresh related data and/or other data, information, status, etc. For example, in FIG. 29-2, the CPU and/or other system component etc. may send one or more commands, messages, etc. to one or more stacked memory packages. In FIG. 29-2, for example, the PHY and data layer circuit block(s) may provide one or more fields (e.g. command code, command field, address(es), message field(s), other packet data and/or information, etc.) to the command decode circuit block. In FIG. 29-2, the command decode circuit block may be operable to control (e.g. program, provide parameters to, direct, operate, etc.) one or more refresh engines. In FIG. 29-2, the command decode circuit block may be operable to control (e.g. program, provide parameters to, direct, operate, etc.) one or more refresh region tables. In FIG. 29-2, the command decode circuit block may be operable to control (e.g. program, provide parameters to, direct, operate, etc.) one or more data engines.

For example, in FIG. 29-2, one or more data engines may write to and read from one or more areas of one or more stacked memory chips. For example, by varying the time between writing data and reading data (or by other programmed measurement techniques, etc.) the data engines may discover (e.g. measure, calculate, infer, determine, etc.) the data retention time, refresh requirements, refresh properties, and/or other properties, metrics, parameters, sensitivities, margins, etc. (e.g. error behavior, timing, voltage sensitivity, S/N ratios, voltage droop, ground bounce, eye diagrams, etc.) of the memory cells and/or other circuits, components, devices, etc. in the one or more areas of one or more stacked memory chips. The data engine may provide (e.g. supply, send, etc.) such data retention time and/or other information, data, measurements, etc. to one or more refresh engines, for example. For example, the one or more refresh engines and/or other circuits, functions, etc. may vary their function(s), perform function(s) (e.g. initiate refresh, perform refresh operations, reset counters, initialize counters, etc.), alter or modify behavior [e.g. refresh period, refresh frequency, refresh count, refresh algorithm, refresh algorithm parameter(s), refresh initialization, refresh counting, areas of memory to be refreshed, order of memory areas refreshed, refresh priority, refresh timing, type of refresh (e.g. self-refresh, etc.), combinations of these and/or other circuit functions, behaviors, properties, etc.] according to the supplied (e.g. measured, calculated, determined, provided, etc.) data retention time and/or other information, data, measurements, etc.

In one embodiment, measured information and/or other data etc. (e.g. error behavior, voltage sensitivity, etc.) may be supplied to (e.g. sent to, passed to, provided to, transmitted to, conveyed to, etc.) other circuits and/or circuit blocks and/or functions of one or more logic chips of one or more stacked memory packages.

In one embodiment, measured information and/or other data etc. (e.g. error behavior, voltage sensitivity, etc.) may be obtained from (e.g. received from, passed by, provided by, transmitted from, conveyed from, etc.) other circuits and/or circuit blocks and/or functions of one or more logic chips of one or more stacked memory packages.

For example, in FIG. 29-2, the logic chip(s) may track which parts or portions of the stacked memory chips may be in use (e.g. by using the data engine and/or refresh engine and/or other components (which may not be shown in FIG. 29-2, etc.), or combinations of these, etc.). For example the logic chip(s) etc. may track which portions of the stacked memory chips may contain all zeros or all ones. This information may be stored for example in one or more refresh region tables and/or other data structures, registers, SRAM, etc. Thus, for example, regions of the stacked memory chips that store all zero's may not be refreshed as frequently as other regions or may not need to be refreshed at all.

For example, in one embodiment, the logic chip may be operable (e.g. under CPU command, etc.) to write fixed values (e.g. zero or one) to one or more memory regions. In this way, for example, one or more regions of memory may be initialized, zero'ed out, etc. Initialization may be performed at start-up, at reset, during operation, at combinations of these times and/or at any time(s). This information, command history, operation history, initialization history, tracking data, and/or any other recorded data, etc. may be stored, for example, in refresh region table(s) and/or other storage, etc. In one embodiment, the refresh region table(s) or parts of the refresh region table(s) may be stored in one or more areas of non-volatile memory (e.g. NAND flash, etc.) on one or more logic chips. Thus, for example, the refresh region table(s) etc. may record the fact that memory region M1 spanning addresses 0x0000_0000_0000 (e.g. a hexadecimal address) through 0x0001_0000_0000 was zero'ed, initialized, etc. by CPU command. For example, the refresh region table(s) etc. may additionally record the fact that one or more addresses within memory region M1 have not subsequently been written, modified, changed, etc. For example, the refresh region table(s) etc. may additionally record the fact that one or more addresses within memory region M1 have subsequently been written. Any number of records with information on any number type, form, etc. of memory regions may be stored, kept, managed, maintained, etc. in any manner (e.g. using tables, CAM, lists, linked lists, tree structures, data structures, logs, log files, combinations of these, etc.). The records and/or information may be used, for example, to alter the refresh behavior for one or more regions of memory. For example, a memory region may not be refreshed. Any number, size, type, class (as defined herein and/or in one or more specification included by reference), etc. of memory region(s) may be used (e.g. tracked, managed, monitored, etc.). Any manner of refresh operation optimization (e.g. elimination of extraneous refresh operations, reduction in refresh operations, etc.) may be performed as a result of tracking, monitoring, recording, logging, etc.

In one embodiment, the refresh region table(s) or parts of the refresh region table(s) and/or copies of the refresh region table(s) may be used to alter, modify, etc. memory access behavior(s). For example, a read access to an area of zero'ed out memory may be intercepted and a read completion of all zero's may be generated. For example, information or a copy of the information in one or more refresh region table(s) and/or other data structures may be used, for example, in one or more look-up tables (LUTs). In one embodiment, one or more LUTs may be stored, kept, maintained, managed, etc. on one or more logic chips and/or one or more memory chips. Any data structure(s) and/or circuits etc. may be used to record tracking data etc. (e.g. LUTs, CAMs, lists, linked lists, tables, SRAM, combinations of these and/or other storage structures, etc.).

For example, in FIG. 29-2, the logic chip may track [e.g. by using the command decode circuit block, data engine and/or refresh engine and/or other components (not shown in FIG. 29-2, etc.), or combinations of these, etc.] which parts or portions of the stacked memory chips have a certain importance, priority, etc. (e.g. which data streams are using which virtual channels(s), by virtue of special command codes, etc.). This information may be stored, for example, in refresh region table(s) and/or other data structures, etc. Thus, for example, regions of the stacked memory chips that store information that may be important (e.g. indicated by the CPU as important, use high priority VCs, etc.) may be refreshed more often or in a different manner than other regions, etc. Thus, for example, regions of the stacked memory chips that are less important (e.g. correspond to video data that may not suffer from data corruption, etc.) may be refreshed less often, may be refreshed in a different manner, etc.

In one embodiment, memory data may be divided into one or more regions, memory classes (as defined herein and/or in one or more specifications incorporated by reference), and/or other classifications, etc. that may include data that may be discarded, may be only used temporarily, may only be used or required once (e.g. to be copied, for example, to a video buffer, etc.), may be reloaded quickly if lost and/or erased, may be reloaded if not refreshed when required, and/or otherwise has a limited life or may be treated (for example with respect to refresh, etc.) differently. This type of data may occur, for example, in mobile devices etc. Thus, one or more of the embodiments described herein and/or in specifications incorporated by reference may be applied to a mobile device or similar object (e.g. consumer devices, phones, phone systems, cell phones, internet phones, remote communication devices, wireless devices, music players, video players, cameras, social interaction devices, radios, TVs, watches, personal communication devices, electronic wallets, smart credit cards, electronic money, smart jewelry, smart pens, personal computers, tablets, laptop computers, scanner, printer, computers, web servers, file servers, embedded systems, electronic glasses, displays, projectors, computer appliances, kitchen appliances, home control appliances, home control systems, industrial control systems, lighting control, solar system control, engine control, navigation control, sensor system, network device, router, switch, TiVO, AppleTV, GoogleTV, set-top box, cable box, modem, cable modem, PC, tablet, media box, streaming device, entertainment center, car entertainment systems, GPS device, automobile system, ATM, vending machine, point of sale device, barcode scanner, RFID device, sensor device, mote, sales terminal, toy, gaming system, information appliance, kiosk, sales display, camera, video camera, music device, storage device, back-up devices, exercise machine, medical device, robot, electronic jewelry, wearable computing device, handheld device, electronic clothing, combinations of these and/or other devices and the like, etc.).

In one embodiment, the refresh region table(s) or parts of the refresh region table(s) and/or copies of the refresh region table(s) may be used to alter, modify, etc. one or more memory behavior(s). For example, one or more logic chips may track which parts or portions of the stacked memory chips belong to which memory classes (as defined herein and/or in one or more specification included by reference), to which VCs, and/or which parts or portions may be marked, separated, special, different, unique, etc. in some aspect, manner, etc. In one embodiment, the memory system may alter etc. one or more memory behaviors of the memory classes etc. For example, the altered, modified, etc. memory behaviors may include (but are not limited to) one or more of the following: data scrubbing, memory sparing, data mirroring, data protection, error function, retry algorithm, etc.

In one embodiment, the refresh properties, behavior(s), algorithms, aspects, etc. may be altered, modified, changed, programmed, configured, etc. Any criteria may be used to alter the refresh properties (e.g. refresh period, refresh regions, refresh timing, refresh order, refresh priority, etc.). For example, criteria may include (but are not limited to) one or more of the following: power; temperature; timing; sleep states; signal integrity; combinations of these and other criteria; etc.

In one embodiment, one or more refresh properties etc. may be programmed by the CPU or other system components (e.g. by using commands, data fields, messages, instructions, etc.). For example, one or more refresh properties may be decided (e.g. controlled, managed, determined, calculated, etc.) by the refresh engine and/or data engine and/or other logic chip circuit blocks(s), etc.

In one embodiment, a CPU and/or other system component etc. may program one or more regions of stacked memory chips and/or their refresh properties by sending one or more commands (e.g. including messages, requests, code, microcode, etc.) to one or more stacked memory packages. The command decode circuit block may thus, for example, load (e.g. store, update, program, etc.) one or more refresh region tables and/or other data structures, data storage areas, circuits, functions, tables, lists, memory, SRAM, CAM, LUTs, etc. Thus, for example, one or more circuits, functions, etc. described herein may be implemented by one or more of the following (but not limited to the following): microcontroller, controller, CPU, combinations of these, etc. For example, one or more refresh engines, data engines, etc. may be implemented using a microcontroller programmed at start-up using microcode loaded over an SMBus. For example, any update, configuration, programming, mode selection, etc. that may be applied to any techniques described herein may thus be made by loading, modification, execution of code, microcode, combinations of these and/or other firmware, software, techniques, etc.

In one embodiment, a refresh engine and/or other system component may signal (e.g. using one or more messages, etc.), the CPU(s) and/or other system components etc. For example, the refresh engine may signal (e.g. convey, transmit, send, etc.) status, state, data, information, progress, success, failure, etc. of one or more refresh operations and/or other related data, information, etc. to the CPU(s) and/or other system components etc.

In one embodiment, refresh timing may be adjusted. For example, one or more CPUs and/or other system components may adjust, change, modify, alter, control, manage, etc. refresh schedules, scheduling, timing, etc. of one or more refresh signals, refresh operations, etc. based on information received. For example, information may be received from one or more logic chips on one or more stacked memory packages. For example, in FIG. 29-2, the refresh engine may signal, pass, send, convey, transmit etc. information including (but not limited to) one or more of the following: refresh state, refresh target(s), refresh algorithm, refresh parameters, refresh properties (e.g. refresh period, refresh priority, retention time, refresh timing, refresh targets, combinations of these and/or other information etc.), etc. For example, the refresh engine may signal information to a message encode circuit block etc. For example, in FIG. 29-2, the message encode block may encapsulate (e.g. insert, place, locate, encode, etc.) information into one or more messages (e.g. responses, completions, etc.) and send these to the PHY and data layer block(s) for transmission (e.g. to the CPU, to other system components, etc.).

In one embodiment, the refresh engine and/or other components, circuit blocks etc. of the logic chip may monitor, track, control etc. [e.g. by using the command decode circuit block, data engine and/or refresh engine and/or other components (which may not be shown in FIG. 29-2, etc.), or combinations of these components, etc.] which parts or portions of the stacked memory chips may be scheduled to be refreshed, being refreshed, involved in refresh, etc. In one embodiment, one or more circuit blocks etc. of the logic chip may monitor, track, store, control, manage, maintain, etc. which parts or portions of the stacked memory chips may be scheduled to be accessed, being accessed, have been accessed, involved in refresh, combinations of these and/or other status, etc.

In one embodiment, one or more circuit blocks etc. of a logic chip etc. may cause one or more operations to be delayed, postponed, reordered, rescheduled, and/or otherwise changed, modified, merged, separated, deleted, created, duplicated, etc. For example, one or more operations may be delayed etc. due to one or more refresh operations in progress. For example, one or more operations may be delayed etc. due to one or more refresh operations scheduled for future times. For example, the operations to be delayed etc. may include one or more of the following (but not limited to the following): memory access operations (e.g. read, write, register read, register write, reset, retry, combinations of these and/or other access and/or similar operations, etc.) or sub-operations (e.g. precharge, activate, refresh, power down, combinations of these and/or other sub-operations and/or similar operations, etc.) and/or other similar operations that may access one or more parts or portions of one or more memory chips etc. Refresh operations may include self-refresh, row refresh, refresh, partial refresh, PASR, partial array self refresh, and/or other refresh operations, etc. combinations of these and/or other similar refresh and refresh-related operations, etc.

In one embodiment, a logic chip etc. may inform the CPU of a delayed memory operation and/or other operation, sub-operation, etc. using a message etc.

In a stacked memory package etc, the refresh period may be any value (e.g. 32 ms, 64 ms, or any value, etc.). In a stacked memory package etc, the refresh interval may be any value (e.g. 7.8 microseconds, 7.8125 microseconds, 3.9 microseconds, or any value, etc.).

In one embodiment, the refresh engine(s) etc. may refresh one or more memory chips or parts, portions etc. of one or more memory chips more frequently than necessary, required, specified, etc. Thus, for example, in one embodiment one or more refresh engines etc. may refresh twice as often than necessary, required, specified, etc. For example, in one embodiment, a refresh interval of 7.8 microseconds may be required, but the stacked memory chip may use a refresh interval of 7.8/2=3.9 microseconds (the effective refresh interval). The extra refresh operations may allow, for example, rescheduling of refresh operations to avoid contention between refresh operations and memory access operations (refresh contention). Any value of refresh interval may be used (e.g. the refresh interval does not need to be a multiple or sub-multiple of 7.8 microseconds etc.). Any value of effective refresh interval may be used (e.g. the effective refresh interval does not need to be a multiple or sub-multiple of 7.8 microseconds or an integer sub-multiple of the refresh interval, etc.).

In one embodiment, the refresh engine etc. may refresh one or more memory chips or parts, portions etc. of one or more memory chips more frequently than necessary etc. and defer, delay, insert, create, change, alter, modify, cancel, postpone, reschedule, etc. one or more refresh operations. For example, in the event that an access operation is scheduled etc. during or nearly at the same time as etc. a refresh operation the refresh operation may be cancelled, re-scheduled, etc. Thus, for example, at t1 a first refresh operation O1 may be performed on row R1. At time t2 an access operation O2 may be scheduled for row R1. At time t3 a refresh operation O3 may be scheduled for row R1. The time period t3-t1 may be less than the static refresh period, for example. At time t4 a refresh operation O4 may be scheduled for row R1. Time t2 may be just before or nearly at time t3 and thus the access operation O2 at t2 and refresh operation O3 at t3 may be in contention. The refresh engine may, for example, cancel the refresh operation O3 at t3 in order to perform O2. The row R1 will be refreshed at t4, within specification. In this case the refresh interval may be derived from the static refresh period/2 for example (e.g. the effective static refresh period may be equal to static refresh period/2, etc.). Any refresh interval and/or static refresh period and/or effective static refresh period may be used. For example, the logic engine may use a refresh interval derived from the static refresh period/k, where k may be any integer or non-integer greater than 1. For example, the logic engine may use a refresh interval derived from the static refresh period*n, where n may be any integer or non-integer greater than 1. Such refresh scheduling may reduce, for example, refresh contention that may occur when a stacked memory chip is unable to immediately perform an access operation (such as read, write, etc.) due to one or more refresh operations. Any refresh scheduling algorithm, function, etc. may be used to determine refresh interval and the time(s) etc. of refresh operations etc. Any value of refresh interval and/or effective static refresh period may be used (e.g. the memory chips may not have a standard static refresh period, etc.).

In one embodiment, the refresh engine etc. may refresh one or more memory chips or parts, portions, echelons, sections, classes (with the terms echelon, class, section as defined herein and/or in one or more specifications incorporated by reference), etc. of one or more memory chips in a different manner, fashion, with different behavior, etc. For example, one part, portion etc. of one or more memory chips may be refreshed at a higher rate than another part, portion etc. For example, one part, portion, etc. of one or more memory chips may be refreshed at a higher rate in order to reduce refresh contention etc. For example, a first part, portion etc. of one or more memory chips may be (e.g. use, form, etc.) a first class of memory (as defined herein and/or in one or more applications incorporated by reference, etc.) that may require, use, employ, etc. a first type of refresh operation and a second part, portion etc. of one or more memory chips may be a second class of memory that may require, use, employ, etc. a second type of refresh operation. These aspects of refresh behavior etc. are given by way of example. Any aspect of refresh behavior, function, algorithm, etc. may be altered, modified, changed, programmed, configured, etc. according to any division, separation, allocation, assignment, marking, etc. of one or more memory regions.

In one embodiment, the refresh engine etc. may reschedule the refresh, refresh operations, etc. of one or more memory chips or parts, portions etc. of one or more memory chips etc. Thus, for example, in one embodiment, at t1 a first refresh operation O1 may be performed on row R1. Thus, for example, at t2 a second refresh operation O2 may be scheduled for row R2. Thus, for example, at t3 a third refresh operation O3 may be scheduled for row R3. Thus, for example, at t4 a fourth refresh operation O4 may be scheduled for row R4. The refresh cycle may be equal to t2-t1, for example. At time t5, at the same time as or close to t2, an access operation O5 may be scheduled for row R2. The refresh engine may, for example, perform the refresh operation O2 (e.g. on row R2) at t3 instead of t2 in order to perform the access operation O5. The refresh engine may, for example, then perform the refresh operation O3 (e.g. on row R3) at t4 instead of t3 in order to perform the access operation O5. Subsequent refresh operations (e.g. on R4 etc.) may be similarly delayed. Assume, for example, the required refresh interval may be 7.8 microseconds. In this case, for example, in one embodiment refresh intervals may be spaced at 7.7 microseconds instead of 7.8 microseconds in order to allow refresh operations to be rescheduled. In this case, for example, 7.8-7.7=0.1 microseconds may be saved each cycle. Thus, after 80 cycles, for example, 8 microseconds (80*0.1 microseconds) may be saved (e.g. accumulated, set aside, etc.) and any subsequent refresh operation may be delayed for one cycle (since 8 microseconds>7.8 microseconds).

Such refresh operation delays may be inserted once in any period of 80 cycles. This algorithm is presented by way of example. Any values (e.g. times, etc.) of refresh interval may be used for refresh rescheduling (e.g. not limited to 7.8 microseconds, etc.). Any refresh interval spacing may be used for refresh rescheduling (e.g. not limited to 7.7 microseconds, etc.). Any scheme, technique, algorithm or combinations of these may be used that may save, accumulate, defer, create, allocate, apportion, distribute, set aside, etc. time(s) for rescheduling, reordering, etc. Any refresh rescheduling algorithm and/or combinations of algorithms may be used for refresh rescheduling. Any parts, portions etc. of one or more memory chips etc. including one or more memory classes etc. (as defined herein and/or in one or more applications incorporated by reference, etc.) may be used (e.g. as targets, etc.) for refresh rescheduling, reordering, etc.

In one embodiment, the timings of the algorithm and technique described above may be varied. For example, the refresh interval spacing may be reduced (e.g. by a programmed amount, etc.) each time a refresh contention event occurs.

In one embodiment, the refresh engine etc. may use one or more refresh timers (or timers) as part of circuits, functions, etc. to track, control, manage, direct, initiate, etc. one or more refresh operations. In one embodiment, a refresh timer may be a counter and thus may be referred to, referenced as, designated as, etc. a refresh counter (also just counter) but a refresh timer may be separate, for example, from a refresh counter A refresh counter may, for example, be used to provide (e.g. generate, etc.) the address of a row, bank, etc. to be refreshed. For example, a refresh timer may be used to track, monitor, control etc. the time until a refresh operation is required, scheduled, etc. For example, each part, portion, etc. and/or group(s) of part(s) of one or more memory chips to be refreshed may be assigned to one or more refresh timers. The part or portion etc. of the one or more memory chips to be refreshed may be part(s) or portion(s) (including all) of one or more of the following (but not limited to the following): a row, block, bank, echelon (as defined herein and/or in one or more specifications incorporated by reference), section (as defined herein and/or in one or more specifications incorporated by reference), memory set (as defined herein and/or in one or more specifications incorporated by reference), memory class (as defined herein and/or in one or more specifications incorporated by reference), combinations and/or groups of these, and/or groups, sets, collections, etc. of any other part(s) or portion(s) of a memory chip, memory array, memory component, other memory, etc., including memory parts or portions as defined herein and/or in one or more specifications incorporated by reference. For example, if each part or portion etc. to be refreshed is required to be refreshed every T1 microseconds a refresh timer may count from T1 microseconds down to zero, at which time the part or portion may be refreshed or scheduled to be refreshed, etc. Any refresh interval(s) may be used (e.g. fixed value, temperature dependent values, different intervals for different part(s), any time interval(s), etc.). Any form of refresh timer and/or refresh timing (or refresh counting, etc.) may be used. For example, a refresh timer may count up or down. For example, a refresh timer may count up (or down) in any increment (e.g. in microseconds, in multiples of a clock period, using a divided clock, etc.). Refresh timers may be of any width (e.g. 2, 3, 4, 8 bits, etc.) and may be configurable, programmable, etc.

In one embodiment, refresh timers may be assigned to parts or portions of one or more memory chips, memory regions, groups of memory regions, etc. to be refreshed and/or to groups, sets, collections, etc. of memory part(s) and/or portion(s) to be refreshed. For example, a refresh timer may be associated with (e.g. used by, used for, responsible for, provided for, initiate refresh for, etc.) a row or group of rows (e.g. a row refresh timer). For example, a refresh timer may be associated with a bank or group of banks. For example, a refresh timer may be associated with one or more sections (as defined herein and/or in one or more specifications incorporated by reference).

In one embodiment, one or more refresh timers, counters, etc. may be used in a hierarchical, nested, etc. fashion. Thus, for example, a first set of one or more refresh timers may be associated with one or more banks and a second set of one or more refresh timers may be associated with one or more rows within the one or more banks.

In one embodiment, one or more refresh timers may be used with one or more refresh counters in any fashion, hierarchical structure or architecture, nested structure or architecture, combination, manner, etc. Refresh counters may, for example, provide one or more addresses (e.g. row address and/or bank address, other addresses, etc.). Thus, for example, a first set of one or more refresh timers may be associated with one or more sections (as defined herein and/or in one or more specifications incorporated by reference) and a second set of one or more refresh timers may be associated with one or more banks within each of the one or more sections, and one or more refresh counters may be associated with one or more rows within each of the one or more banks. Refresh timers and/or refresh counters may be shared (e.g. used in common, etc.) across banks, rows, other memory parts, portions, etc. Thus, for example, a refresh counter may provide (e.g. supply, send, transmit, convey, couple, etc.) a row address to more than one bank etc. to be refreshed, but one or more refresh timers and/or the use of other timing techniques may cause the rows etc. in the banks to be refreshed at different times or slightly different times, etc.

In one embodiment, the refresh engine etc. may use one or more refresh timers to track the refresh operations and use rescheduling in the event of refresh contention, etc. For example, a part P1 of a memory chip etc. may require a refresh operation every T1 seconds. A refresh timer C1 for part P1 may count down from T2 to zero where T2 may be less than or equal T1. When the C1 refresh timer reaches zero, the part P1 may be scheduled for refresh subject, for example, to other memory access operations that, for example, may be in the command pipeline (and thus visible, known, etc. to the refresh engine etc.). The interval (e.g. time value, etc.) T1 may have any value. The interval T2 may have any value and may have any value with respect to T1. In this way, for example, refresh operations may be scheduled in such a way as to avoid and/or reduce contention with other memory access operations. Any number of refresh timers may be used. There may be more than one part or portion of a memory region assigned to (e.g. associated with, etc.) a refresh timer, etc. For example, a refresh timer may be assigned to one or more rows, a group of rows, one or more banks, group(s) of banks, one or more sections (as defined herein and/or in one or more specifications incorporated by reference), groups of sections (as defined herein and/or in one or more specifications incorporated by reference), one or more echelons (as defined herein and/or in one or more specifications incorporated by reference), groups of echelons (as defined herein and/or in one or more specifications incorporated by reference), combinations of these and/or any part(s), portion(s), group(s), etc. of memory.

In one embodiment, one or more refresh timers may be reset on completion of a memory access operation. For example, a refresh timer for a row or group of rows etc. may be reset after a read command, write command, etc. is executed, completed, etc.

In one embodiment, the refresh engine etc. may perform more than one refresh operation per refresh interval. For example, refresh operations may be performed on multiple banks, rows, sections (as defined herein and/or in one or more specifications incorporated by reference), echelons (as defined herein and/or in one or more specifications incorporated by reference), etc. at the same time or nearly the same time. For example, refresh operations may be performed on one or more sections (as defined herein and/or in one or more applications incorporated by reference, etc.) at the same time or nearly the same time. Any group, collection, etc. of parts or portions of one or more memory regions, memory chips, etc. may be refreshed in this manner, fashion, etc.

In one embodiment, the refresh engine etc. may perform one or more staggered refresh operations. For example, two refresh operations may be performed (e.g. executed, issued, etc.) in a staggered manner e.g. at nearly the same time, at closely spaced intervals, at controlled intervals, etc. For example, one or more refresh timers, counters etc. controlling refresh may be initialized, incremented (or decremented), etc. in a staggered fashion. Staggered refresh operations may be used, for example, to control power consumption and/or peak current draw, improve signal integrity, reduce error rates, etc. For example, the refresh current profile (e.g. a graph of supply current drawn during refresh versus time, etc.) of an individual (e.g. single, etc.) refresh operation may be triangular in shape (e.g. the graph may form a triangle, rise linearly from zero to a peak and fall linearly back to zero, etc.) and spaced over 10 ns (e.g. concentrated in a period of 10 ns, etc.). By spacing, staggering, separating, spreading, dividing, etc. two or more refresh operations (e.g. on separate memory chips, on the same memory chip, etc.) by 5 ns (or of the order of 5 ns accounting for other component delays, circuit delays, parasitic delays, interconnect delays, etc.) in time one or more refresh current profiles may be averaged, smeared, coalesced, etc. The average refresh current profile or aggregate refresh current profile (e.g. sum of two or more refresh operations, etc.) may thus be lower (e.g. smaller in maximum value, etc.) and/or more nearly constant than, for example, if the refresh operations were performed at the same time or spread out (comparatively) further in time (by a period, delay, spacing etc. larger than 10 ns, for example). Similarly, the refresh current profile of an individual refresh operation may be rectangular and may be spaced over 10 ns (e.g. concentrated in a period of 10 ns, etc.). By spacing, staggering, etc. two or more such refresh operations by 10 ns (or on the order of 10 ns) the aggregate refresh current profile may be similarly averaged. Refresh current profiles may take any shape, form, etc. Refresh current profiles may be approximated by any shape, form, etc. Refresh current profiles may have any number of peaks, pulses, spikes, etc. The refresh current profile of a refresh operation (e.g. individual refresh operation) and/or set of refresh operations may be measured and the amount, nature, type, etc. (e.g. optimum amount, etc.) of staggering, spacing, etc. of refresh operations may be determined. Measurement of current profile(s) may be performed at design time, manufacture, test, assembly, start-up, during operation, at combinations of these times and/or at any time. The staggering of refresh operations may be fixed, variable, configurable, programmable, etc. The configuration, programming, control, etc. of refresh staggering may be performed at design time, manufacture, test, assembly, start-up, during operation, at combinations of these times and/or at any time. The configuration, programming, control, etc. of refresh staggering may be performed using software, hardware, firmware, combinations of these and/or other techniques. The configuration, programming, control, etc. of refresh staggering may be performed by CPU (e.g. via commands, messages, etc.), OS, BIOS, user, other system components, combinations of these and/or other techniques, etc.

In one embodiment, more than one type of staggering, spacing etc. of refresh operations may be used. For example, in order to reduce current spikes in a local region where several refresh events may occur a relatively small stagger time may be used. For example, assume a first refresh operation results in a triangular current pulse of 10 ns. Assume four of these first refresh operations are to be performed as a second refresh operation. A first stagger time of 5 ns may be applied to the four refresh operations (e.g. three spaces of 5 ns between four pulses) so that the combined pulse may last, for example, for 4*10 ns−3*5 ns=25 ns. Assume that two of the second refresh operations are to be performed. A second, relatively larger, stagger time of, for example, 20 ns may then be applied between the first and second of the second refresh operations.

In one embodiment, nested and/or hierarchical staggering, spacing etc. of refresh operations may be used. Thus, for example, a stacked memory package may include four memory chips, each with 16 sections, each section including two banks, each bank including 16 k rows, with an echelon including eight banks, with two banks on each chip. In this case, for example, refresh may be performed by staggering refresh commands applied, directed, etc. to rows by space S1, to banks by space S2, to sections by space S3, to echelons by space S4, etc. where S1, S2, S3, S4 may all be different (but need not be different) times, etc.

In one embodiment, the staggering, spacing, distribution, separation, etc. of refresh operations may be a function of memory region location. For example, the spacing (e.g. in time, etc.) of refresh operations directed at one or more memory regions on separate memory chips may be set to a first value (e.g. time value, etc.) and the spacing of refresh operations directed at one or more memory regions on the same memory chip may be set to a second value.

In one embodiment, refresh intervals may be different for different memory regions and adjusted, rescheduled, retimed, etc. to avoid, reduce, manage, control, etc. refresh overlap. For example, two echelons (or any other memory regions, etc.) may be refreshed at different intervals. Suppose, for example, echelon E1 may be refreshed at an interval of 4 microseconds and echelon E2 may be refreshed at an interval of 5 microseconds. In one embodiment, refresh may be scheduled for E1 as follows: 0, 4, 8, 12, 16, 20, . . . microseconds and refresh may be scheduled for E2 at 0, 5, 10, 15, 20, . . . microseconds. At 0 microseconds and at 20, 40, . . . etc. microseconds refresh for E1 and E2 may occur at the same time (e.g. overlap, etc.). This overlap may cause high peak power draw, for example. In one embodiment, it may be required that no overlap of less than 1 microsecond is required. If refresh is spaced or staggered overlap may still occur. Thus for example refresh may be scheduled for E1 as follows: 0, 4, 8, 12, 16, 20, 24, 28, 32, 36, . . . microseconds and refresh may be scheduled for E2 at 1, 6, 11, 16, 21, 26, 31, 36, 41, 46, 51, 56 . . . microseconds. Thus, for example, with no adjustment etc. an overlap may still occur at 16, 36, . . . microseconds. In one embodiment, adjustments may be made to avoid overlap by less than one microsecond. For example, refresh may be scheduled for E1 as in the following list: 0 4 8 12 16(X) 15 19 23 27 31 35(X) 34 38 42 46 50 . . . microseconds and refresh may be scheduled for E2 as in the following list: 1 6 11 16 21 26 31(X) 30 35 40 45 50(X) 49 . . . microseconds. In these lists, for example, 16(X) 15 means that an overlap may be detected between E1 and E2 and a refresh (e.g. scheduled at 16 microseconds) is rescheduled to an earlier time (e.g. at 15 microseconds). Rescheduling may be performed by the use of tables, lists, score boarding, etc. In one embodiment, overlapping refresh operations may be adjusted by bringing a scheduled refresh operation forward in time. In one embodiment, overlapping refresh operations may be adjusted by delaying a scheduled refresh operation in time. In this case, in one embodiment, refresh intervals may be scheduled at less than the required refresh interval in order to be able to delay one or more refresh operations, for example. In one embodiment, overlapping refresh operations may be adjusted by adjusting a selected scheduled refresh operation in time with selection of the refresh operation performed in an arbitration scheme. For example, refresh operations to be rescheduled may be selected in a round-robin fashion, etc. Any technique(s), algorithms, etc. for retiming, rescheduling, reordering, adjusting in time, etc. of one or more refresh operations etc. may be used. Any technique(s), algorithms, etc. for arbitration between refresh operations to be retimed etc. may be used. Any number of memory regions may be refreshed with adjustment(s) in this manner. For example, a stacked memory package may contain 4, 8, 16 or any number of echelons (or other memory regions, etc.) that may be refreshed with refresh timing adjustments performed between echelons as described.

In one embodiment, the refresh engine etc. may perform refresh operations on a group, groups, set(s), collection(s), etc. of possibly related memory part(s) and/or portion(s). For example, refresh may be performed on a set of memory portions that form a section (as defined herein and/or in specifications incorporated by reference). For example, refresh may be performed on a set of memory portions that form an echelon (as defined herein and/or in specifications incorporated by reference). For example, refresh may be performed on a set of memory portions that form a memory set (as defined herein and/or in one or more specifications incorporated by reference). For example, refresh may be performed on a set of memory portions that form a memory class (as defined herein and/or in one or more specifications incorporated by reference). The grouping of memory part(s) and/or portion(s) may be on the same memory chip, different memory chips, or both (e.g. a group of portions on the same chip and one or more groups of one or more portions on different chips, etc.).

In one embodiment, the refresh engine etc. may perform different refresh operations depending on (e.g. as a function of, etc.) the group, groups, set(s), collection(s), etc. of possibly related memory part(s) and/or portion(s) to be refreshed. For example, the refresh engine(s) may adjust command and/or operation type, spacing, ordering, etc. (e.g. in time, etc.) depending on the location of the memory regions to be refreshed.

In one embodiment, the refresh engine etc. may perform refresh operations one a group, set, collection, etc. of related memory part(s) and/or portion(s) in a staggered and/or otherwise controlled manner. For example, there may be four memory portions in a section (as defined herein and/or in one or more specifications incorporated by reference). The four portions may be P1, P2, P3, P4. Refresh of P1-P4 may be scheduled (e.g. using refresh timers, counters, etc.) so that the refresh operation issued to P4 is slightly later than that issued to P3, which may be slightly later than to P2, which may be slightly later than to P1, etc. Other orders of scheduling may be used (e.g. P1 first, P3 second, P2 third, P4 fourth, etc.). The amount of staggering may be any time and may be programmable and/or otherwise variable etc. Staggering refresh operations in this manner may improve signal integrity, for example, by reducing peak current during refresh etc. The size, number, and/or nature (e.g. type, etc.) of the memory portions to be refreshed may be fixed, variable and/or programmable. For example, memory portions may be rows, banks, echelons, sections, memory sets, memory classes, memory chips, combinations of these and/or any part(s) or portion(s) of a stacked memory chip and/or one or more stacked memory chips, and/or other memory, etc. The number of portions, refresh techniques, etc. described are by way of example only and may be simplified (e.g. in numbers, etc.) to improve clarity of explanation. Any number of memory portions may be grouped and refreshed in any manner (e.g. 2, 3, 4, 8, or any number of memory portions etc.).

In one embodiment, the refresh engine etc. may stagger refresh operations using one or more controlled delays. For example, refresh operations may be conveyed (e.g. passed, forwarded, transmitted, etc.) to one or more memory chips using one or more refresh control signals. Refresh operations may be staggered, for example, by delaying one or more of these refresh control signals. For example, in one embodiment, one or more of the one or more refresh control signals may be delayed by one or more controlled delays in order to delay the execution of the refresh operation. The delays may be implemented (e.g. introduced, effected, caused, etc.) using any techniques. For example, the delays may be implemented using active delay lines, circuits, structures, components, etc. (e.g. using transistors, active devices, etc.) and/or using passive delay lines, circuits, structures, components, etc. (e.g. using resistors, capacitors, inductors, etc.). The delays may be controlled (e.g. set, configured, programmed, etc.) by any techniques. For example, the delays may be caused by one or more analog delay lines and/or digital delay lines and/or other similar signal delay techniques, etc. The delay values, settings, properties, etc. of the delay lines etc. may be controlled by one or more delay control inputs and/or delay control signals. For example, the delay control inputs etc. may include one or more digital inputs. For example the digital inputs may include one or more signals and/or a set of signals (e.g. a bus, a digital word, etc.). One or more sets of one or more digital inputs may thus, for example, be used to control refresh staggering in a set (e.g. collection, group, etc.) of one or more refresh operations. Thus, for example, a digital input, digital code, digital word, etc. of "101" may correspond to (e.g. represent, set, configure, control, effect, etc.) a delay of 5 ns while a code of "110" may correspond to a delay of 6 ns, etc. Any codes of any width may be used. Any code value may represent any value of delay (e.g. the value of the code does not necessarily need to equal the value of the delay, etc.). Any delays (e.g. delay values, etc.) and delay increments (e.g. steps in delay values between codes, etc.) may be used. In one embodiment, the digital inputs may be generated, for example, by one or more logic chips. In one embodiment, the digital inputs may be direct inputs, for example, in command packets and/or message packets directed to one or more logic chips. For example, a command packet may include the digital delay code of "101" that may cause a delay to be set to 5 ns, etc. In one embodiment, the digital inputs may be indirect inputs, for example, in command packets and/or message packets directed to one or more logic chips. For example, delays of refresh control signals, related signals, etc. may be measured at design, manufacture, test, assembly, start-up, during operation, at combinations of these times and/or at any time. These measurements may be used, for example, to calculate, calibrate, tune etc. delays to be provided (e.g. implemented, etc.) in the delay of one or more refresh control signals. For example the code "101" in a command packet may cause an additional delay of 5 ns to be added to (e.g. inserted in, effected by, etc.) a signal line, etc. The values and codes described are used by way of example and may be simplified here in order to clarify explanation. Any codes, widths of codes, and/or values may be used. One or more delays, delay properties, delay values, delay lines, combinations of these and/or other delay related behaviors, functions, properties, parameters, etc. may be configured, programmed, tuned, calibrated, recalibrated, adjusted, altered, modified, inserted, removed, included, bypassed, etc. at design, manufacture, test, assembly, start-up, during operation, at combinations of these times and/or at any time.

In one embodiment, one or more staggered refresh operations and/or properties, algorithms, behaviors, functions, etc. of refresh operations may be controlled by calibration. Thus, for example, a memory system may perform, manage, control, program, configure, etc. calibration of staggered refresh. For example, a logic chip may cause one or more refresh operations to be executed (e.g. performed, issued, etc.) at start-up. The delays, spacing, staggering, etc. properties of refresh operations to one or more parts etc. of one or more memory regions may then be adjusted. For example, spacing, staggering, distribution, etc. of one or more refresh operations may be adjusted (e.g. by adjusting one or more delays, etc.) to minimize the maximum current draw of the one or more refresh operations. Other metrics etc. may be used (e.g. minimum dI/dt or current spike measurements on one or more supply lines, minimum voltage spikes and/or noise on one or more voltage supplies, minimum ground bounce, minimum crosstalk, other measurements, combinations of these including weighted combinations of multiple measurements and/or metrics, etc.).

The functions, equations, models, etc. used to calculate delay settings etc. from measurements may be fixed or programmable. Programming of functions, equations, models, etc. may be made at any time (e.g. at design, manufacture, assembly, test, start-up, during operation, by command, etc.). Metrics, measurements, etc. may be fixed or variable (e.g. configurable, programmable, etc.). Metrics etc. may be calculated etc and/or measurements made etc. at any time (e.g. at design, manufacture, assembly, test, start-up, during operation, etc.). Settings (e.g. delay values, optimum settings, etc.) for staggered refresh etc. may be stored (e.g. in non-volatile memory etc. in one or more logic chips, etc.). Other similar techniques may be used in various combinations with various modifications etc. For example, in one embodiment, a CPU may issue a command, message etc. for a stacked memory package to perform calibration of staggered refresh. The command may be issued, for example, at start-up and/or during operation. For example, in one embodiment, calibration of staggered refresh may be initiated and performed by one or more logic chips. Any such described calibration techniques or similar calibration techniques may thus be used to control, manage, configure, set, etc. one or more staggered refresh operations. Thus, for example, calibration of staggered refresh may be static and/or dynamic. For example, in one embodiment, static calibration may allow staggered refresh properties etc. to be changed according to fixed table(s) or model(s) etc. For example, in one embodiment, dynamic calibration may allow staggered refresh properties etc. to be changed during operation e.g. at regular and/or other specified intervals, on external command, on specific and/or programmed events (such as temperature change, voltage change, change(s) exceeding a programmed threshold(s), other system parameter change(s), other triggers and/or events, combinations of measurements, sensor readings, etc.), or at combinations of these times and/or any time, etc. In one embodiment, a memory system may employ both static calibration and dynamic calibration. For example, certain properties etc. may be changed on a static basis (for example, a lookup of total memory size in a stacked memory package e.g. read from BIOS at start-up or from internal non-volatile storage, etc.). For example, certain properties etc. may be changed on a dynamic basis (for example, change in temperature, system configuration or modes, etc.).

In one embodiment, the refresh engine etc. may perform refresh operations in conjunction with (e.g. combined with, in addition to, in concert with, etc.) other memory access operations. For example, in one embodiment, a refresh operation may be performed on a row etc. in conjunction with (e.g. in parallel with, partially overlapped in time with, nearly parallel with, pipelined with, etc.) a read operation. For example, in one embodiment, a refresh operation that may result in contention with a memory access may be omitted because the memory access may perform the same function, similar function, equivalent function etc. as a refresh operation.

In one embodiment, the refresh engine etc. may reschedule refresh operations as a function of memory access operations. For example, the refresh engine etc. may reschedule a refresh operation to a row that has been accessed. Since an access operation may performs the same function or an equivalent function as a refresh operation, any pending refresh operation may be rescheduled to a time up to the static refresh period later than the access operation. For example, in one embodiment, one or more refresh timers (e.g. row refresh timers, timers associated with other memory parts or portions, etc.), refresh counters, and/or other timers, counters, etc. may be initialized on completion of a memory access.

In one embodiment, the refresh engine etc. may reschedule a refresh and/or one or more refresh operations, etc. of one or more memory chips or parts, portions etc. of one or more memory chips etc. so that, for example, the average number and/or other measure, metric, etc. of refresh operations over a time period meets a specified value and/or falls in (e.g. meets, is within, etc.) a specified range, etc. For example, the refresh engine etc. may re-schedule the refresh, refresh operations, etc. of one or more memory chips or parts, portions etc. of one or more memory chips etc. so that the average number of refresh operations over a period of 62.4 microseconds (=7.8*8) is eight, etc. For example, the refresh engine etc. may re-schedule the refresh, refresh operations, etc. of one or more memory chips or parts, portions etc. of one or more memory chips etc. so that nine refresh operations should be asserted at least once every 70.3 microseconds (7.8125*9), etc. Any number of refresh operations may be used to calculate the average. Any period(s) of time may be used to calculate the average or other measures, metrics, etc. For example, the refresh engine etc. may re-schedule the refresh, refresh operations, etc. of one or more memory chips or parts, portions etc. of one or more memory chips etc. so that the average number of refresh operations over a period of T microseconds is N, where T and N may be any value, etc. Any method of calculating the average may be used. Any statistic (mean, standard deviation, maximum, minimum, mode, median, range(s), min-max, max-min, combinations of these, etc.) or combinations of other statistics, measures, metrics, values, ranges, etc. may be used instead of or in addition to an average. For example, the refresh engine may calculate the maximum refresh interval over a period of time, number of refresh operations performed, etc.

In one embodiment, the refresh engine etc. may insert, modify, change, etc. the refresh, refresh operations, etc. of one or more memory chips or parts, portions etc. of one or more memory chips etc. For example, the refresh engine etc. may change a single refresh command (e.g. received from a CPU, etc.) to one or more internal refresh commands, refresh operations, etc. In one embodiment, the refresh engine etc. may insert, modify, change, etc. the refresh and/or one or more refresh operations, etc. of one or more memory chips or parts, portions etc. of one or more memory chips etc. by inserting commands and/or operations etc. and/or modifying commands, operations, etc. For example, the refresh engine etc. may insert a precharge all command after a refresh operation, etc. Any commands, sub-commands, command sequences, combinations of commands, operations, etc. may be inserted, deleted, modified, changed, altered, etc.

In one embodiment, the refresh engine etc. may interleave, alternate etc. the refresh, refresh operations, etc. between two or more memory chips or parts, portions etc. of one or more memory chips etc. For example, the refresh engine etc. may refresh part P1 of memory chip M1 while part P2 of M1 is being accessed and refresh part P2 while part P1 is being accessed etc. For example part P1 and part P2 may provide data (e.g. in an interleaved, merged, aggregated, etc. fashion) for a single access etc. Refresh interleaving may be performed in any fashion with any number of access operations etc. Refresh operations may be overlapped or partially overlapped (e.g. completed in parallel, pipelined, completed nearly in parallel, etc.) with access operations (e.g. read, write, etc.) and/or other operations etc.

In one embodiment, the refresh engine etc. may perform one or more refresh operations, etc. between (e.g. across, etc.) two or more memory chips or parts, portions etc. of one or more memory chips etc. that may form part of a group, set, etc. For example, a read or other access may correspond to access of a first memory region (e.g. part, portion, etc.) M1 that may itself include two memory regions, a second memory region R1 and a third memory region R2. In one embodiment, for example, refresh may be performed on R1 separately from R2. Thus, a memory access to M1 may be performed at the same time or approximately the same time or appear to occur at the same time as a refresh operation on M1. For example, a memory read to M1 may include a first read operation directed to R1 at a first time t1 and a second read operation directed to R2 at a second time t2. For example, a refresh operation to M1 may include a first refresh operation directed to R2 at the first time t1 (or nearly at the first time) and a second refresh operation directed to R1 at a second time t2 (or nearly at the second time). Any number of parts etc. may form a group etc. In one embodiment, for example in a high-reliability system, the scheme described may be optionally disabled, etc.

In one embodiment, the refresh engine etc. may perform one or more refresh operations, etc. between (e.g. across, etc.) two or more memory chips or parts, portions etc. of one or more memory chips etc. that may form part of a group, set, etc. that may form an array. For example, a group, set etc. of memory regions may form a RAID array, storage array, and/or other structured array. For example, multiple bits of data may be stored with redundant information in a RAID array. For example, two bits of data (e.g. D1, D2) may be stored using three bits of storage (e.g. S1, S2, S3) where the third storage bit may be a parity bit, etc. (e.g. S3=D1

XOR D2, where XOR may represent the exclusive-OR operation). In one embodiment, for example, refresh operations may be performed on each area of the RAID array at different times. Thus, for example, the memory area containing S1 may be refreshed at a first time, while the memory area containing S2 may be refreshed at a second time, and the memory area containing S3 may be refreshed at a third time, Thus, for example, a memory access may be guaranteed to retrieve at least two bits of data even if a part of the RAID array is being refreshed (refresh contention occurs). Access to two bits of data from the three bits in the RAID array may be sufficient to complete the memory access (e.g. any 2 from 3 bits may allow read data to be reconstructed, calculated, determined, etc.). In one embodiment, the access to the address suffering from refresh contention may be deferred, delayed, rescheduled, etc. The simple RAID array scheme described is used by way of example and for clarity of explanation. Any form, type, etc. of grouping may be used (e.g. any form of RAID array, data protection array, storage array, etc.). Any arrangement, algorithm, sequence, timing, etc. of refresh operations and/or access (e.g. read, write, etc.) operations within a group, groups, array(s), memory area(s), etc. may be used. For example, in one embodiment, all data including check bits, codes, etc. may be stored on one or more stacked memory chips. For example, in one embodiment, data may be stored on one or more stacked memory chips while one or more codes, check bits, hashes, etc. may be stored in non-volatile storage (e.g. NAND flash, etc.) on one or more logic chips, etc. For example, part or parts of a memory system may use memory mirroring (e.g. copies of data, etc.). For example data may be stored as D1 and a mirrored copy M1. In this case, data D1 may be refreshed at a different time from the mirrored data M1. Thus a memory access may be guaranteed to complete to D1 if M1 is being refreshed and to complete to M1 if D1 is being refreshed (e.g. refresh contention occurs, etc.). In one embodiment, the access to the address suffering from refresh contention may be deferred, delayed, rescheduled, etc. In one embodiment, a journal entry (e.g. target memory address(es) D1 and/or M1 stored on a list etc.) may be made (e.g. in non-volatile memory in one or more logic chips, etc.) that may allow, for example, correct mirroring to be restored after a refresh contention occurs and/or after a failure immediately after contention. Implementation of this or similar schemes may be configurable. In one embodiment, for example in a high-reliability system, the contention avoidance scheme described may be optionally disabled, etc.

Any form, type, nature, etc. of coding (e.g. parity, ECC, SECDED or similar codes, LDPC, erasure codes, Reed Solomon codes, block codes, cyclic codes, CRC, check sums, hash codes, combinations of these and/or other coding schemes, algorithms, etc.) or level (e.g. levels of hierarchy, nesting, recursion, depth, complexity, etc.) of coding for data storage may be used.

In one embodiment, the adjustment of refresh schedules etc, programming of refresh properties etc, tracking etc, refresh engine functions and/or behavior etc, refresh rescheduling etc, combinations of these and/or any other refresh behaviors, commands, functions, parameters, circuits, etc. may depend, for example, on the temperature of one or more parts, portions etc. of one or more memory chips and/or other components etc. including one or more memory classes etc. (as defined herein and/or in one or more applications incorporated by reference, etc.). For example, the refresh interval tREFI or any other memory parameter, timing parameter, circuit behavior, signal timing, etc. may be changed, adjusted, modified, calculated, determined, etc. based on the temperature of one or more parts, portions etc. of one or more memory chips and/or other components etc. The memory parameter to be changed etc. may be a standard parameter (e.g. the same or similar to a parameter of a standard part) or may be unique, for example, to a stacked memory package.

In one embodiment, for example, the changing, adjustment, calculation, determination, etc. of the refresh interval etc. may be continuous. Thus, for example, the refresh interval may be varied (e.g. continuously, in a linear fashion, in small steps, incrementally, etc.) between 3.9 microseconds at 95 degrees Celsius and 7.8 microseconds at 85 degrees Celsius. Thus, for example, at a temperature of 90 degrees Celsius the refresh interval may be set, adjusted, changed, determined etc. to be 3.9+3.9/2=3.9+1.95=5.85 microseconds etc. The simple values, functions, etc. described are used by way of example. Any function of any type and complexity with any number and types of input variables etc. may be used to calculate, determine, set, program, control, manage, etc. the refresh interval(s). Any settings, limits, etc. for the refresh interval(s) may be used. Any increment, step, etc. of refresh interval(s) may be used. For example, in one embodiment, the temperatures of multiple components, parts of components, etc. may be averaged or otherwise used to calculate one or more refresh intervals, etc. In one embodiment, temperatures and/or other parameters may be measured (e.g. sensed, detected, etc.) directly (e.g. using temperature sensor(s), etc.) and/or indirectly (e.g. using retention time, using other circuit parameters, other supplied data, etc.) and/or obtained, read, acquired, obtained, supplied, etc. by other means (e.g. via SMBus, via I2C, sideband bus, combinations of these and/or other sources, buses, links, etc.).

In one embodiment, the adjustment of refresh schedules etc, programming of refresh properties etc, tracking etc, refresh engine functions and/or behavior etc, refresh rescheduling etc, combinations of these and/or any other refresh behaviors, commands, functions, parameters, etc. may depend on one or more parameters, metrics, behaviors, characteristics, etc. of one or more parts, portions etc. of one or more memory chips etc. including one or more memory classes etc. (as defined herein and/or in one or more applications incorporated by reference, etc.). For example, the adjustment of refresh schedules etc, programming of refresh properties etc, tracking etc, refresh engine functions and/or behavior etc, refresh rescheduling etc, combinations of these and/or any other refresh behaviors, commands, functions, parameters, etc. may depend on the speed bin, timing characterization, test and/or other measurements, system activity, traffic patterns, memory system access patterns, memory system latency, latency or delay of memory system access, latency and/or other properties of one or more memory circuits, voltage supply, current draw, resistance of reference resistors and/or properties of other reference parts or reference components, speed characteristics, power draw, power characterization, mode(s) of operation, timing parameters, combinations of these and/or other system metrics, parameters, signals, register settings, commands, messages, etc. For example, the refresh engine etc. may omit, cancel, delete, remove, etc. refresh operations to one or more unused, uninitialized, unaccessed, etc. areas of memory, etc. For example, the refresh engine etc. may increase refresh operations (e.g. refresh more frequently, etc.) to one or more classes of memory (as defined herein and/or in one or more applications incorporated by reference, etc.) e.g. used for important data, hot data, etc. For example, the refresh engine etc. may increase refresh operations (e.g. refresh more frequently, etc.) to one or more areas of memory that have increased error levels (e.g. due to reduced retention time, due to reduced voltage supply, due to decreased signal integrity, due to reduced margin(s), due to elevated temperature, and/or due to combinations of these and other factors, etc.), increased error rates (e.g. with respect to time, etc.), increased error count (e.g. total error count, etc.), etc. For example, the refresh engine etc. may increase refresh operations to one or more areas of memory that are designated as high-reliability regions, etc. For example, the refresh engine etc. may increase refresh operations to one or more rows, banks, sections, echelons, etc. of memory that exhibit higher error counts than average, etc. For example, the refresh engine etc. may increase refresh operations to one or more rows, banks, etc. of memory that are adjacent (e.g. electrically, physically, functionally, etc.) to one or more memory areas, regions, etc. that exhibit higher error counts than average, etc.

In one embodiment, the refresh engine etc. may adjust, set, schedule the refresh, refresh operations, etc. of one or more memory chips or parts, portions etc. of one or more memory chips etc. according to a table, database, list etc. The table etc. may include one or more of the following pieces of information (but not limited to the following): retention times, refresh intervals, refresh parameters, combinations of these and/or other parameters, data, measurements, etc. For example, the logic chip and/or other system components etc. may measure, calculate, check etc. retention times and/or other related, similar, other parameters, metrics, readings, data, etc. at test, start-up, during operation, etc. For example, retention times etc. may be measured at manufacture, test, assembly, combinations of these times and/or any time etc. For example, retention times etc. may be loaded, stored, programmed, etc. at manufacture, test, assembly, at start-up, during operation, at combinations of these times and/or any time etc. The retention times and/or other related parameters, data, information, etc. may be stored in the memory system. For example, retention time information may be stored in one or more tables, data structures, databases etc. that may be kept in memory (e.g. NAND flash, non-volatile memory, memory, etc.) in the logic chip and/or in spare areas of one or more memory chips and/or in one or more memory structures in the memory system, etc.

In one embodiment, such adjustment of refresh schedules etc, programming of refresh properties etc, tracking etc, refresh engine functions and/or behavior etc, refresh rescheduling etc, refresh modes, combinations of these and/or any other refresh behaviors, commands, functions, parameters, properties, values, timing, frequency, algorithms, etc. may be configured and/or programmable etc. Such configuration, programming etc. may be performed at design time, manufacture, assembly, test, at start-up, during operation, combinations of these times and/or at any time, etc. Such configuration, programming etc. may be performed by the CPU, by the user, by OS, by firmware, by software, by hardware, by CPU command(s), by message(s), by register commands, by writing registers, by setting registers, by command flags and/or fields, autonomously or semi-autonomously by the memory system and/or components of the memory system, by combinations of these and/or other means, etc.

In one embodiment, options and features described herein related to refresh and/or other operations, behaviors, functions, etc. may be optionally disabled, bypassed, altered, etc. For example in a high-reliability system, it may be desired to disable certain options, reduce the functionality of certain algorithms, reduce the complexity of certain operations (and thus susceptibility to failure, etc.), etc. Such high-reliability modes, configurations, options, etc. may be applied to an entire memory system or applied to parts or portions of the memory system. For example, in one embodiment, one or more memory classes (as defined herein and/or in one or more applications incorporated by reference, etc.) may be designated, assigned, allocated, etc. as one or more high-reliability memory regions. Addresses, records, data, information, lists, properties, features, etc. of the high-reliability memory regions and/or other designated memory regions may be kept, for example, in tables, lists, data structures (e.g. in one or more refresh region tables, LUTs, etc.). Access etc. to these designated memory regions may be controlled via (e.g. using, etc.) these tables etc. such that, for example, any access to a high-reliability region uses (e.g. employs, etc.) a programmed selection from one or more high-reliability modes of operation, etc.

In one embodiment, the refresh system for a stacked memory package may be responsible for (e.g. manage, control, participate in, etc.) one or more functions that are related to refresh. For example, the refresh system for a stacked memory package may also be responsible for (e.g. control, direct, manage, etc.) power state or other state(s) of one or more logic chips and/or memory chips. For example, operating in one or more modes, the refresh system may receive commands, instructions etc. to place (e.g. direct, manage, etc.) one or more components (e.g. memory chips, logic chips, combinations of these and/or other system components etc.) in a power state or other state (e.g. target state). The target state may be one of the following (but not limited to the following) states: active state, power down state, power-down entry state, power down exit state, sleep state, precharge power-down entry state, precharge power-down exit state, precharge power-down (fast exit) entry state, precharge power-down (fast exit) exit state, precharge power-down (slow exit) entry state, precharge power-down (slow exit) exit state, active power down entry state, active power down exit state, DLL off state, maintain power down state, idle state, self refresh entry state, self refresh exit state, etc.

A state input (e.g. command, instructions, etc.) to the refresh system for a stacked memory package may be a direct input or indirect input. For example, a direct input may simulate the behavior of CKE (e.g. clock enable, etc.) in a standard SDRAM. For example, one or more input command packets and/or message packets may correspond to (e.g. simulate, mimic, etc.) registering CKE at one or more consecutive clock edges in a standard SDRAM part. In this case, a logic chip for example, may convert the command packet(s) to one or more signals and/or otherwise generate one or more signals. For example, the one or more signals may be equivalent to CKE being received in a standard part. The one or more signals may be applied (e.g. asserted, transmitted, conveyed, etc.) to one or more memory chips and/or logic chips and/or other components to cause, for example, one or more changes in state. For example, logic chips may be operable to operate in one or more power states. For example, a logic chip may have two power down states, PD1 and PD2. Any number of power states may be used. For example, a change to the active power down state may cause one or more memory chips to enter the active power down state and one or more logic chips to enter PD1. For example, a change to the precharge power down state may cause one or more memory chips to enter the precharge power down state and one or more logic chips to enter PD2. For example, an indirect input may correspond to (e.g. be controlled by, by extracted from, etc.) a packet with a command field, code, flag(s), etc. For example, a command, message, etc. packet may contain a field that may correspond to a state, state change command, etc.

In one embodiment, a state input (direct input or indirect input) may allow one or more memory chips to be placed in any target state. For example one or more memory chips may be placed in any of the following (but not limited to the following) states: power on, reset procedure, initialization, MPS/MPR write leveling, self refresh, ZQ calibration, idle, refreshing, active power down, activating, precharge power down, bank active, writing, reading, precharging, etc. Thus, for example, a command to place one or more memory chips and/or logic chips in the reset procedure (or state corresponding to reset procedure, etc.) may cause a reset, etc. Target states may include states corresponding to (or similar to, etc.) states of a standard memory part (e.g. SDRAM part, etc.) and/or may include other states including (but not limited to): hidden states, test states (including self tests, etc.), debug states, calibration states (e.g. leveling, termination, etc.), reset states (e.g. hard reset, soft reset, warm reset, cold reset, etc.), retry states, stop states (e.g. with data retention, etc.), diagnostic states (including JTAG, etc.), single-step states, measurement states, initialization states, equalization states, firmware and/or microcode update states, etc. For example, one or more target states may be unique to a stacked memory package.

In one embodiment, a state input (direct input or indirect input) may allow one or more logic chips and/or other system components etc. to be placed in any state. For example, one or more logic chips may include one or more power states in which power may be reduced (e.g. by turning off one or more circuits, placing one or more circuits in power down modes, placing the PHY and/or other circuits in one or more power down modes, etc.). In various embodiments, any state may be used, e.g. as a target state, and target states may not necessarily be limited to power states. For example, one or more logic chips may be placed in a high-performance state, or low-latency state, etc.

In one embodiment, one or more coded state inputs (direct input or indirect input) may allow one or more logic chips and/or one or more memory chips to be placed in any state(s). For example, a code "01" in a command may cause a logic chip to be placed in a power down state and all memory chips to be placed in active power down state, etc. Alternatively a code "1" in a first command field and a code "0" in a second command field may cause a logic chip to be placed in a power down state and all memory chips to be placed in active power down state, etc. Any codes, fields, flags, etc. may be used. Any number of codes, fields, flags, etc. may be used. Any width (e.g. size, bits, etc.) of codes, fields, flags, etc. may be used. For example, a code "011" in a first command field (e.g. width 3) and a code "0" in a second command field (e.g. width 1) may cause all PHYs in a logic chip to be placed in a deep power down state (e.g. L1 or equivalent to L1 state in PCIe, etc.) and all memory chips to be placed in active power down state, etc. For example, a code "111" in a first command field and a code "0" in a second command field may cause all PHYs in a logic chip to be placed in a power down state (e.g. L0s or equivalent to L0s state in PCIe, etc.) and all memory chips to be placed in active power down state, etc. For example, a code "01011111" in a first command field and a code "0" in a second command field may cause two PHYs in a logic chip to be placed in a power down state (e.g. L0s or equivalent to L0s state in PCIe, etc.), two PHYs in a logic chip to be placed in an active state and all memory chips to be placed in active power down state, etc. Any number of commands may be used. For example, in one embodiment, a first command (e.g. command type or field "00", etc.) may be used to control state etc. of one or more memory chips and a second command (e.g. command type or field "01", etc.) may be used to control state etc. of one or more logic chips. For example, in one embodiment, a single command may be used to control state of memory chips, logic chips, and/or other system components. For example, in one embodiment, a first set (e.g. group, collection, stream, etc.) of one or more commands may be used to control state of memory chips and a second set of one or more, commands may be used to control state of logic chips. For example, in one embodiment, a first set (e.g. group, collection, stream, etc.) of one or more commands that may include one or more special command codes may be used to control state of one or more components (e.g. logic chips, memory chips, stacked memory packages, etc.) in a memory system. For example, a command with code "000" may cause all components (e.g. stacked memory packages, other system components, etc.) to enter a power down or other state.

In one embodiment, a state input (direct input or indirect input) may allow one or more system components or one or more parts of one or more system components etc. to be placed in a combined state. A combined state may group, collect, associate, etc. one or more parameters, modes, configurations, settings, flags, options, values, etc. For example, combined state "001" may correspond to a collection etc. of settings etc. that correspond to (e.g. result in, configure, set, etc.) a high-performance memory system, while combined state "000" may correspond to a collection etc. of settings etc. that correspond to (e.g. result in, configure, set, etc.) a low-power memory system. For example, combined state "001" may switch (e.g. configure, control, program, etc.) buses in the stacked memory package to operate at a higher frequency, PHYs in the logic chip to operate at a higher current, etc. Thus, for example, one or more commands, messages etc. may be used to place one or more components (e.g. one or more stacked memory packages, one or more logic chips, one or more memory chips, parts of these, combinations of these, and/or any other parts, components, circuits, etc.) and/or the entire memory system in a known state. Such a combined command may be used, for example, to quickly and simply change component states and/or system states. For example, combined states "000" and "001" may be configured at start-up, e.g. by CPU, OS, BIOS or combinations of these, etc. For example, during operation, a single command may be used to switch between combined state "000" and "001", for example. Combined states may include any number of states of any number of components. For example, combined state "000" may include (e.g. combine, etc.) state "01" of a logic chip and state "11" of the memory chips in a stacked memory package. Combined states may be applied to (e.g. programmed to, transmitted to, targeted at, etc.) all stacked memory packages in a memory system or a subset (including one). Combined states may also include one or more other system components.

In one embodiment, combined states may be configured. Such configuration, programming etc. of one or more combined states may be performed at design time, manufacture, assembly, test, at start-up, during operation, combinations of these times and/or at any time, etc. Such configuration, programming etc. of one or more combined states may be performed by the CPU, by the user, by OS, by firmware, by software, by hardware, by CPU command(s), by message(s), by register commands, by writing registers, by setting registers, by command flags and/or fields, autonomously or semi-autonomously by the memory system and/or components of the memory system, by combinations of these and/or other means, etc.

As an option, the refresh system for a stacked memory package may be implemented in the context of the architecture and environment of any previous Figure(s) and/or any subsequent Figure(s). Of course, however, the refresh system for a stacked memory package may be implemented in the context of any desired environment.

It should be noted that, one or more aspects of the various embodiments of the present invention may be included in an article of manufacture (e.g. one or more computer program products) having, for instance, computer usable media. The media has embodied therein, for instance, computer readable program code for providing and facilitating the capabilities of the various embodiments of the present invention. The article of manufacture can be included as a part of a computer system or sold separately.

Additionally, one or more aspects of the various embodiments of the present invention may be designed using computer readable program code for providing and/or facilitating the capabilities of the various embodiments or configurations of embodiments of the present invention.

Additionally, one or more aspects of the various embodiments of the present invention may use computer readable program code for providing and facilitating the capabilities of the various embodiments or configurations of embodiments of the present invention and that may be included as a part of a computer system and/or memory system and/or sold separately.

Additionally, at least one program storage device readable by a machine, tangibly embodying at least one program of instructions executable by the machine to perform the capabilities of the various embodiments of the present invention can be provided.

The diagrams depicted herein are just examples. There may be many variations to these diagrams or the steps (or operations) described therein without departing from the spirit of the various embodiments of the invention. For instance, the steps may be performed in a differing order, or steps may be added, deleted or modified. All of these variations are considered a part of the claimed invention.

In various optional embodiments, the features, capabilities, techniques, and/or technology, etc. of the memory and/or storage devices, networks, mobile devices, peripherals, hardware, and/or software, etc. disclosed in the following applications may or may not be incorporated into any of the embodiments disclosed herein: U.S. Provisional Application No. 61/472,558, filed Apr. 6, 2011, titled "Multiple class memory systems"; U.S. Provisional Application No. 61/502,100, filed Jun. 28, 2011, titled "SYSTEM, METHOD, AND COMPUTER PROGRAM PRODUCT FOR IMPROVING MEMORY SYSTEMS"; U.S. Provisional Application No. 61/515,835, filed Aug. 5, 2011, titled "STORAGE SYSTEMS"; U.S. Provisional Application No. 61/566,577, filed Dec. 2, 2011, titled "IMPROVED MOBILE DEVICES"; U.S. Provisional Application No. 61/470,336, filed Mar. 31, 2011, titled "SYSTEM, METHOD, AND COMPUTER PROGRAM PRODUCT FOR UTILIZING IMAGE RECOGNITION TO PERFORM AN ACTION"; U.S. Provisional Application No. 61/470,391, filed Mar. 31, 2011, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. Provisional Application No. 61/569,213, filed Dec. 9, 2011, titled "SYSTEM, METHOD, AND COMPUTER PROGRAM PRODUCT FOR MODIFYING CONTENT"; U.S. Provisional Application No. 61/569,107, filed Dec. 9, 2011, titled "SYSTEM, METHOD, AND COMPUTER PROGRAM PRODUCT FOR IMPROVING MEMORY SYSTEMS"; U.S. Provisional Application No. 61/580,300, filed Dec. 26, 2011, titled "SYSTEM, METHOD, AND COMPUTER PROGRAM PRODUCT FOR IMPROVING MEMORY SYSTEMS"; U.S. Provisional Application No. 61/585,640, filed Jan. 31, 2012, titled "SYSTEM, METHOD, AND COMPUTER PROGRAM PRODUCT FOR IMPROVING MEMORY SYSTEMS"; U.S. Provisional Application No. 61/581,918, filed Jan. 13, 2012, titled "USER INTERFACE SYSTEM, METHOD, AND COMPUTER PROGRAM PRODUCT"; U.S. Provisional Application No. 61/602,034, filed Feb. 22, 2012, titled "SYSTEM, METHOD, AND COMPUTER PROGRAM PRODUCT FOR IMPROVING MEMORY SYSTEMS"; U.S. Provisional Application No. 61/608,085, filed Mar. 7, 2012, titled "SYSTEM, METHOD, AND COMPUTER PROGRAM PRODUCT FOR IMPROVING MEMORY SYSTEMS"; U.S. Provisional Application No. 61/635,834, filed Apr. 19, 2012, titled "SYSTEM, METHOD, AND COMPUTER PROGRAM PRODUCT FOR IMPROVING MEMORY SYSTEMS"; U.S. application Ser. No. 13/441,132, filed Apr. 6, 2012, titled "MULTIPLE CLASS MEMORY SYSTEMS"; U.S. application Ser. No. 13/433,283, filed Mar. 28, 2012, titled "SYSTEM, METHOD, AND COMPUTER PROGRAM PRODUCT FOR ENABLING A PERIPHERAL DEVICE TO UTILIZE FUNCTIONALITY ASSOCIATED WITH A MOBILE DEVICE"; U.S. application Ser. No. 13/433,279, filed Mar. 28, 2012, titled "SYSTEM, METHOD, AND COMPUTER PROGRAM PRODUCT FOR UTILIZING IMAGE RECOGNITION TO PERFORM AN ACTION"; U.S. Provisional Application No. 61/647,492, filed May 15, 2012, titled "SYSTEM, METHOD, AND COMPUTER PROGRAM PRODUCT FOR CONFIGURING A SYSTEM ASSOCIATED WITH MEMORY"; U.S. Provisional Application No. 61/665,301, filed Jun. 27, 2012, titled "SYSTEM, METHOD, AND COMPUTER PROGRAM PRODUCT FOR ROUTING PACKETS OF DATA"; U.S. Provisional Application No. 61/673,192, filed Jul. 19, 2012, titled "SYSTEM, METHOD, AND COMPUTER PROGRAM PRODUCT FOR REDUCING A LATENCY ASSOCIATED WITH A MEMORY SYSTEM"; U.S. Provisional Application No. 61/679,720, filed Aug. 4, 2012, titled "SYSTEM, METHOD, AND COMPUTER PROGRAM PRODUCT FOR PROVIDING CONFIGURABLE COMMUNICATION PATHS TO MEMORY PORTIONS DURING OPERATION"; U.S. Provisional Application No. 61/698,690, filed Sep. 9, 2012, titled "SYSTEM, METHOD, AND COMPUTER PROGRAM PRODUCT FOR TRANSFORMING A PLURALITY OF COMMANDS OR PACKETS IN CONNECTION WITH AT LEAST ONE MEMORY"; U.S. Provisional Application No. 61/712,762, filed Oct. 11, 2012, titled "SYSTEM, METHOD, AND COMPUTER PROGRAM PRODUCT FOR LINKING DEVICES FOR COORDINATED OPERATION," and U.S. patent application Ser. No. 13/690,781, filed Nov. 30, 2012, titled "IMPROVED MOBILE DEVICES." Each of the foregoing applications are hereby incorporated by reference in their entirety for all purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:

a first semiconductor platform including a first memory;

a second semiconductor platform including a second memory; and at least one circuit in electrical communication with at least one of the first semiconductor platform or the second semiconductor platform for transforming a plurality of commands or packets, or a portion thereof, in connection with at least one of the first memory or the second memory, by:

transforming a first memory command or packet, or a portion thereof, such that the first memory command or packet, or the portion thereof, is processed by the first memory of the first semiconductor platform and the first memory command or packet, or the portion thereof, avoids processing, at least in part, by the second memory of the second semiconductor platform; and transforming a second memory command or packet, or a portion thereof, such that the second memory command or packet, or the portion thereof, avoids processing, at least in part, by the first memory of the first semiconductor platform and the second memory command or packet, or the portion thereof, is processed by the second memory of the second semiconductor platform.

2. The apparatus of claim 1, wherein the apparatus is operable such that the transforming includes re-ordering.

3. The apparatus of claim 1, wherein the apparatus is operable such that the transforming includes combining.

4. The apparatus of claim 1, wherein the apparatus is operable such that the transforming includes splitting.

5. The apparatus of claim 1, wherein the apparatus is operable such that the transforming includes modifying.

6. The apparatus of claim 1, wherein the second semiconductor platform is stacked with the first semiconductor platform.

7. A method, comprising:

transforming a first memory command or packet, or a portion thereof, such that the first memory command or packet, or the portion thereof, is processed by a first memory of a first semiconductor platform and the first memory command or packet, or the portion thereof, avoids processing, at least in part, by a second memory of a second semiconductor platform; and transforming a second memory command or packet, or a portion thereof, such that the second memory command or packet, or the portion thereof, avoids processing, at least in part, by the first memory of the first semiconductor platform and the second memory command or packet, or the portion thereof, is processed by the second memory of the second semiconductor platform.

8. The method of claim 7, wherein the transforming includes re-ordering.

9. The method of claim 7, wherein the transforming includes combining.

10. The method of claim 7, wherein the transforming includes splitting.

11. The method of claim 7, wherein the transforming includes modifying.

12. The method of claim 7, wherein the second semiconductor platform is stacked with the first semiconductor platform.

13. A computer program product embodied on a non-transitory computer readable medium, comprising:

code for working with at least one circuit to transform a first memory command or packet, or a portion thereof, such that the first memory command or packet, or the portion thereof, is processed by a first memory of a first semiconductor platform and the first memory command or packet, or the portion thereof, avoids processing, at least in part, by a second memory of a second semiconductor platform; and code for working with the at least one circuit to transform a second memory command or packet, or a portion thereof, such that the second memory command or packet, or the portion thereof, avoids processing, at least in part, by the first memory of the first semiconductor platform and the second memory command or packet, or the portion thereof, is processed by the second memory of the second semiconductor platform.

14. The computer program of claim 13, wherein the computer program product is operable such that the transforming includes re-ordering.

15. The computer program of claim 13, wherein the computer program product is operable such that the transforming includes combining.

16. The computer program of claim 13, wherein the computer program product is operable such that the transforming includes splitting.

17. The computer program of claim 13, wherein the computer program product is operable such that the transforming includes modifying.

18. The computer program of claim 13, wherein the second semiconductor platform is stacked with the first semiconductor platform.

19. An apparatus, comprising:

a first semiconductor platform including a first memory;

a second semiconductor platform including a second memory;

means for transforming a first memory command or packet, or a portion thereof, such that the first memory command or packet, or the portion thereof, is processed by the first memory of the first semiconductor platform and the first memory command or packet, or the portion thereof, avoids processing, at least in part, by the second memory of the second semiconductor platform; and means for transforming a second memory command or packet, or a portion thereof, such that the second memory command or packet, or the portion thereof, avoids processing, at least in part, by the first memory of the first semiconductor platform and the second memory command or packet, or the portion thereof, is processed by the second memory of the second semiconductor platform.

* * * * *